US007135726B2

(12) United States Patent
Endoh et al.

(10) Patent No.: US 7,135,726 B2
(45) Date of Patent: Nov. 14, 2006

(54) SEMICONDUCTOR MEMORY AND ITS PRODUCTION PROCESS

(75) Inventors: Tetsuo Endoh, Natori (JP); Fujio Masuoka, 2-33-18, Higashikatsuyama, Aoba-ku, Sendai-shi, Miyagi (JP) 981-0923; Takuji Tanigami, Fukuyama (JP); Takashi Yokoyama, Sendai (JP); Noboru Takeuchi, Sendai (JP)

(73) Assignees: Fujio Masuoka, Miyagi (JP); Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/925,952

(22) Filed: Aug. 10, 2001

(65) Prior Publication Data

US 2002/0036308 A1 Mar. 28, 2002

(30) Foreign Application Priority Data

Aug. 11, 2000 (JP) ............................ 2000-286162

(51) Int. Cl.
*H01L 27/108* (2006.01)
*H01L 29/94* (2006.01)

(52) U.S. Cl. ..................... 257/296; 257/302; 257/303; 257/316; 257/330

(58) Field of Classification Search ................ 257/296, 257/298, 311, 302, 303, 316, 330; 438/242, 438/266

See application file for complete search history.

(56) References Cited

U.S. PATENT DOCUMENTS

| | | | | |
|---|---|---|---|---|
| 4,434,433 | A * | 2/1984 | Nishizawa | 257/264 |
| 5,386,132 | A | 1/1995 | Wong | |
| 5,929,477 | A | 7/1999 | McAllister Burns, Jr. et al. | |
| 5,990,509 | A * | 11/1999 | Burn, Jr. et al. | 257/296 |
| 6,107,670 | A * | 8/2000 | Masuda | 257/510 |
| 6,114,767 | A | 9/2000 | Nagai et al. | |
| 6,387,757 | B1 | 5/2002 | Chu et al. | |
| 6,433,382 | B1 | 8/2002 | Orlowski et al. | |
| 6,483,136 | B1 * | 11/2002 | Yoshiba et al. | 257/295 |
| 6,501,125 | B1 * | 12/2002 | Kobayashi | 257/317 |
| 6,593,231 | B1 | 7/2003 | Endoh et al. | |
| 6,727,544 | B1 | 4/2004 | Endoh et al. | |
| 6,750,110 | B1 * | 6/2004 | Derderian | 438/381 |
| 6,870,215 | B1 | 3/2005 | Endoh et al. | |
| 2002/0036308 | A1 | 3/2002 | Endoh et al. | |
| 2002/0195668 | A1 | 12/2002 | Endoh et al. | |
| 2004/0238879 | A1 | 12/2004 | Endoh et al. | |

FOREIGN PATENT DOCUMENTS

| | | |
|---|---|---|
| EP | 0 924 766 | 6/1999 |
| JP | 04-079369 | 3/1992 |
| JP | 07-235649 | 9/1995 |

OTHER PUBLICATIONS

European Search Report dated Nov. 21. 2005.

* cited by examiner

*Primary Examiner*—Jerome Jackson
*Assistant Examiner*—Joseph Nguyen
(74) *Attorney, Agent, or Firm*—Nixon & Vanderhye P.C.

(57) ABSTRACT

A semiconductor memory comprises: a fist conductivity type semiconductor substrate and one or more memory cells constituted of an island-like semiconductor layer, a charge storage layer and a control gate, the charge storage layer and the control gate being formed to entirely or partially encircle a sidewall of the island-like semiconductor layer, wherein at least one of said one or more memory cells is electrically insulated from the semiconductor substrate.

38 Claims, 782 Drawing Sheets

SEMICONDUCTOR MEMORY AND ITS PRODUCTION PROCESS

CROSS-REFERENCE TO RELATED APPLICATION

This application is related to Japanese Patent Application No. 2000-286162 filed on 11, Aug. 2000, whose priority is claimed under 35 USC § 119, the disclosure of which is incorporated by reference in its entirety.

BACKGROUND OF THE INVENTION

1. Field of the Invention

The present invention relates to a semiconductor memory and its production process, and more particularly, the invention relates to a semiconductor memory provided with a memory transistor having a charge storage layer and a control gate, and its production process.

2. Description of Related Art

As a memory cell of an EEPROM, is known a device of a MOS transistor structure having a charge storage layer and a control gate in a gate portion, in which an electric charge is injected into and released from the charge storage layer by use of a tunnel current. In this memory cell, data "0" and "1" is stored as changes in a threshold voltage by the state of the charge in the charge storage layer. For example, in the case of an n-channel memory cell using a floating gate as the charge storage layer, when a source/drain diffusion layer and a substrate are grounded and a high positive voltage is applied to the control gate, electrons are injected from the substrate into the floating gate by a tunnel current. This injection of electrons shifts the threshold voltage of the memory cell toward positive. When the control gate is grounded and a high positive voltage is applied to the source/drain diffusion layer or the substrate, electrons are released from the floating gate to the substrate by the tunnel current. This release of electrons shifts the threshold voltage of the memory cell toward negative.

In the above-described operation, a relationship of capacity coupling between the floating gate and the control gate with capacity coupling between the floating agate and the substrate plays an important role in effective injection and release of electrons, i.e., effective writing and erasure. That is, the larger the capacity between the floating gate and the control gate, the more effectively the potential of the control gate can be transmitted to the floating gate and the easier the writing and erasure become.

With recent development in semiconductor technology, especially, in micro-patterning techniques, the size reduction and the capacity increase of memory cells of EEPROM are rapidly progressing. Accordingly, it is an important how large capacity can be ensured between the floating gate and the control gate.

For increasing the capacity between the floating gate and the control gate, it is necessary to thin a gate insulating film therebetween, to increase the dielectric constant of the gate insulating film or to enlarge an area where the floating gate opposes the control gate.

However, the thinning of the gate insulating film is limited in view of reliability of memory cells. For increasing the dielectric constant of the gate insulating film, a silicon nitride film is used as the gate insulating film instead of a silicon oxide film. This is also questionable in view of reliability and is not practical. Therefore, in order to ensure a sufficient capacity between the floating gate and the control gate, it is necessary to set a sufficient overlap area therebetween. This is, however, contradictory to the size reduction of memory cells and the capacity increase of EEPROM.

In an EEPROM disclosed by Japanese Patent No.2877462, memory transistors are formed by use of sidewalls of a plurality of pillar-form semiconductor layers arranged in matrix on a semiconductor substrate, the pillar-form semiconductor layers being separated by trenches in a lattice form. A memory transistor is composed of a drain diffusion layer formed on the top of a pillar-form semiconductor layer, a common source diffusion layer formed at the bottom of the trenches, and a charge storage layer and a control gate which are around all the periphery of the sidewall of the pillar-form semiconductor layer. The control gates are provided continuously for a plurality of pillar-form semiconductor layers lined in one direction so as to form a control gate line, and a bit line is connected to drain diffusion layers of a plurality of memory transistors lined in a direction crossing the control gate line. The charge storage layer and the control gate are formed in a lower part of the pillar-form semiconductor layer. This construction can prevent a problem in a one transistor/one cell structure, that is, if a memory cell is over-erased (a reading potential is 0 V and the threshold is negative), a cell current flows in the memory cell even if it is not selected.

With this construction, a sufficiently large capacity can be ensured between the charge storage layer and the control gate with a small area occupied. The drain regions of the memory cells connected to the bit lines are formed on the top of the pillar-form semiconductor layers and completely insulated from each other by the trenches. A device isolation region can further be decreased and the memory cells are reduced in size. Accordingly, it is possible to obtain a mass-storage EEPROM with memory cells which provide excellent writing and erasing efficiency.

The prior-art EEPROM is explained with reference to figures. FIG. 800 is a plan view of a prior-art EEPROM, and FIGS. 801(*a*) and 801(*b*) are sectional views taken on lines A–A' and B–B', respectively, in FIG. 800.

In FIG. 800, pillar-form silicon semiconductor layers 2 are columnar, that is, the top thereof is circular. However, the shape of the pillar-form silicon semiconductor layers need not be columnar. In the plan view of FIG. 800, selection gate lines formed by continuing gate electrodes of selection gate transistors are not shown for avoiding complexity of the figure.

In the prior art, is used a P-type silicon substrate 1, on which a plurality of pillar-form P-type silicon layers 2 are arranged in matrix. The pillar-form P-type silicon layers 2 are separated by trenches 3 in a lattice form and functions as memory cell regions. Drain diffusion layers 10 are formed on the top of the silicon layers 2, common source diffusion layers 9 are formed at the bottom of the trenches 3, and oxide films 4 are buried at the bottom of the trenches 3. Floating gates 6 are formed in a lower part of the silicon layers 2 with intervention of tunnel oxide films 5 so as to surround the silicon layers 2. Outside the floating gates 6, control gates 8 are formed with intervention of interlayer insulating films 7. Thus memory transistors are formed. Here, as shown in FIGS. 800 and 801(*b*), the control gates 8 are provided continuously for a plurality of memory cells in one direction so as to form control gate lines (CG1, CG2, . . . ). Gate electrodes 32 are provided around an upper part of the silicon layers 2 with intervention of gate oxides films 31 to form the selection gate transistors, like the memory transistors. The gate electrodes 32 of the selection gate transistors, like the control gates 8 of the memory cells, are provided continuously in the same direction as that of the control gates 8 of the memory cells so as to form selection gate lines, i.e., word lines WL (WL1, WL2, . . . ).

Thus, the memory transistors and the selection gate transistors are buried in the trenches in a stacked state. The control gate lines leave end portions as contact portions 14 on the surface of silicon layers, and the selection gate lines leaves contact portions 15 on silicon layers on an end opposite to the contact portions 14 of the control gates. Al wires 13 and 16 to be control gate lines CG and the word lines WL, respectively, are contacted to the contact portion 14 and 15, respectively. At the bottom of the trenches 3, common source diffusion layers 9 of the memory cells are formed, and on the top of the silicon layers 2, drain diffusion layers 10 are formed for every memory cell. The resulting substrate with the thus formed memory cells is covered with a CVD oxide film 11, where contact holes are opened. Al wires 12 are provided which are to be bit lines BL which connects the drain diffusion layers 10 of memory cells lined in a direction crossing the word lines WL. When patterning is carried out for the control gate lines, a mask is formed of PEP on pillar-form silicon layers at an end of a cell array to leave, on the surface of the silicon layers, the contact portions 14 of a polysilicon film which connect with the control gate lines. To the contact portions 14, the Al wires 13 which are to be control gate lines are contacted by Al films formed simultaneously with the bit lines BL.

A production process for obtaining the structure shown in FIG. 801(*a*) is explained with reference to FIGS. 801(*a*) to 805(*g*). A P-type silicon layer 2 with a low impurity concentration is epitaxially grown on a P-type silicon substrate 1 with a high impurity concentration to give a wafer. A mask layer 21 is deposited on the wafer and a photoresist pattern 22 is formed by a known PEP process. The mask layer 21 is etched using the photoresist pattern 22 (see FIG. 802(*a*)).

The silicon layer 2 is etched by a reactive ion etching method using the resulting mask layer 21 to form trenches 3 in a lattice form which reach the substrate. Thereby the silicon layer 21 is separated into a plurality of pillar-form islands. A silicon oxide film 23 is deposited by a CVD method and anisotropically etched to remain on the sidewalls of the pillar-form silicon layers 2. By implantation of N-type impurity ions, drain diffusion layers 10 are formed on the top of the pillar-form silicon layers 2 and common source diffusion layers 9 are formed at the bottom of the trenches (see FIG. 802(*b*)).

The oxide films 23 around the pillar-form silicon layers 2 are etched away by isotropic etching. Channel ion implantation is carried out on the sidewalls of the pillar-form silicon layers 2 by use of a slant ion implantation as required. Instead of the channel ion implantation, an oxide film containing boron may be deposited by a CVD method with a view to utilizing diffusion of boron from the oxide film. A silicon oxide film 4 is deposited by a CVD method and isotropically etched to be buried at the bottom of trenches 3. Tunnel oxide films 5 are formed to a thickness of about 10 nm around the silicon layers 2 by thermal oxidation. A first-layer polysilicon film 5 is deposited and anisotropically etched to remain on lower sidewalls of the pillar-form silicon layers 2 as floating gates 6 around the silicon layers 2 (see FIG. 803(*c*)).

Interlayer insulating films 7 are formed on the surface of the floating gates 5 formed around the pillar-form silicon layers 2. The interlayer insulating films 7 are formed of an ONO film, for example. The ONO film is formed by oxidizing the surface of the floating gate 6 by a predetermined thickness, depositing a silicon nitride film by a plasma-CVD method and then thermal-oxidizing the surface of the silicon nitride film. A second-layer polysilicon film is deposited and anisotropically etched to form control gates 8 on lower parts of the pillar-form silicon layers 2 (see FIG. 803(*d*)). At this time, the control gates 8 are formed as control gate lines continuous in a longitudinal direction in FIG. 800 without need to perform a masking process by previously setting intervals between the pillar-form silicon layers 2 in the longitudinal direction at a predetermined value or less. Unnecessary parts of the interlayer insulating films 7 and underlying tunnel oxide films 2 are etched away. A silicon oxide film 111 is deposited by a CVD method and etched halfway down the trenches 3, that is, to a depth such that the floating gates 6 and control gates 8 of the memory cells are buried and hidden (see FIG. 804(*e*)).

A gate oxide film 31 is formed to a thickness of about 20 nm on exposed upper parts of the pillar-form silicon layers 2 by thermal oxidation. A third-layer polysilicon film is deposited and anisotropically etched to form gate electrodes 32 of MOS transistors (see FIG. 804(*f*)). The gate electrodes 32 are patterned to be continuous in the same direction as the control gate lines run, and form selection gate lines. The selection gate lines can be formed continuously in self-alignment, but this is more difficult than the control gates 8 of the memory cells. For, the selection gate transistors are single-layer gates while the memory transistors are two-layered gates, and therefore, the intervals between adjacent selection gates are wider than the intervals between the control gates. Accordingly, in order to ensure that the gate electrodes 32 are continuous, the gate electrodes may be formed in a two-layer polysilicon structure, a first polysilicon film may be patterned to remain only in locations to connect the gate electrodes by use of a masking process, and a second polysilicon film may be left on the sidewalls.

Masks for etching the polysilicon films are so formed that contact portions 14 and 15 of the control gate lines and the selection gate lines are formed on the top of the pillar-form silicon layers at different ends. A silicon oxide film 112 is deposited by a CVD method and, as required, is flattened. Contact holes are opened. An Al film is deposited and patterned to form Al wires 12 to be bit lines BL, Al wires 13 to be control gate lines CG and Al wires 16 to be word lines WL at the same time (see FIG. 805(*g*)).

FIG. 806(*a*) schematically shows a sectional structure of a major part of one memory cell of the prior-art EEPROM, and FIG. 806(*b*) shows an equivalent circuit of the memory cell. The operation of the prior-art EEPROM is briefly explained with reference to FIGS. 806(*a*) to 806(*b*).

For writing by use of injection of hot carriers, a sufficiently high positive potential is applied to a selected word line WL, and positive potentials are applied to a selected control gate line CG and a selected bit line BL. Thereby, a positive potential is transmitted to the drain of a memory transistor Qc to let a channel current flow in the memory transistor Qc and inject hot carriers. Thereby, the threshold of the memory cell is shifted toward positive. For erasure, 0 V is applied to a selected control gate CG and high positive potentials are applied to the word line WL and the bit line BL to release electrons from the floating gate to the drain. For erasing all the memory cells, a high positive potential may be applied to the common sources to release electrons to the sources. Thereby, the thresholds of the memory cells are shifted toward negative. For reading, the selection gate transistor is rendered ON by the word line WL and the reading potential is applied to the control gate line CG. The judgement of a “0” or a “1” is made from the presence or absence of a current.

In the case where an FN tunneling is utilized for injecting electrons, high potentials are applied to a selected control gate line CG and a selected word line WL and 0 V is applied to a selected bit line BL to inject electrons from the substrate to the floating gate.

This prior art provides an EEPROM which does not mis-operate even in an over-erased state thanks to the presence of the selection gate transistors.

The prior-art EEPROM does not have diffusion layers between the selection gate transistors Qs and the memory transistors Qc as shown in FIG. 806(*a*). For, it is hard to form the diffusion layers selectively on the sidewalls of the pillar-form silicon layers. Therefore, in the structure shown in FIGS. 801(*a*) and 801(*b*), desirably, separation oxide films between the gates of the memory transistors and the gates of the selection gate transistors are as thin as possible. In the case of utilizing the injection of hot electrons, in particular, the separation oxide films need to be about 30 to 40 nm thick for allowing a sufficient "H" level potential to be transmitted to the drain of a memory transistor. Such fine intervals cannot be practically made only by burying the oxide films by the CVD method as described above in the production process. Accordingly, desirably, the oxide films are buried in such a manner that the floating gates 6 and the control gates 8 are exposed, and thin oxide films are formed on exposed parts of the floating gates 6 and the control gates 8 simultaneously with the formation of the gate oxide films for the selection gate transistors.

Further, according to the prior art, since the pillar-form silicon layers are arranged with the bottom of the lattice-form trenches forming an isolation region and the memory cells are constructed to have the floating gates formed to surround the pillar-form silicon layers, it is possible to obtain a highly integrated EEPROM in which the area occupied by the memory cells are small. Furthermore, although the memory cells occupy a small area, the capacity between the floating gates and the control gates can be ensured to be sufficiently large.

According to the prior art, the control gates of the memory cells are formed to be continuous in one direction without using a mask. This is possible, however, only when the pillar-form silicon layers are arranged at intervals different between a longitudinal direction and a lateral direction. That is, by setting the intervals between adjacent pillar-form silicon layers in a word line direction to be smaller than the intervals between adjacent pillar-form silicon layers in a bit line direction, it is possible to obtain control gate lines that are separated in the bit line direction and are continuous in the word line direction automatically without using a mask.

In contrast, when the pillar-form silicon layers are arranged at the same intervals both in the longitudinal direction and in the lateral direction, a PEP process is required. More particularly, the second-layer polysilicon film is deposited thick, and through the PEP process to form a mask, the second-layer polysilicon film is selectively etched to remain in locations to be continuous as control gate lines. The third-layer polysilicon film is deposited and etched to remain on the sidewalls as described regarding the production process of the prior art. Even in the case where the pillar-form silicon layers are arranged at intervals different between the longitudinal direction and the lateral direction, the continuous control gate lines cannot be automatically formed depending upon the intervals of the pillar-form silicon layers. In this case, the mask process by the PEP process as described above can be used for forming the control gate lines continuous in one direction.

Although the memory cells of the prior art as described above are of a floating gate structure, the charge storage layers do not necessarily have the floating gate structure and may have a structure such that the storage of a charge is realized by a trap in a laminated insulating film, e.g., a MNOS structure.

FIG. 807 is a sectional view of a prior-art memory with memory cells of the MNOS structure, corresponding to FIG. 801(*a*). A laminated insulating film 24 functioning as the charge storage layer is of a laminated structure of a tunnel oxide film and a silicon nitride film, or of a tunnel oxide film, a silicon nitride film and further an oxide film formed on the silicon nitride film.

FIG. 808 is a sectional view of a prior-art memory in which the memory transistors and the selection gate transistors of the above-described prior art are exchanged, i.e., the selection gate transistors are formed in the lower parts of the pillar-form silicon layers 2 and the memory transistors are formed in the upper parts of the pillar-form silicon layers 2. FIG. 808 corresponds to FIG. 801(*a*). This structure in which the selection gate transistors are provided on a common source side can apply to the case where the injection of hot electrons is used for writing.

FIG. 809 shows a prior-art memory in which a plurality of memory cells are formed on one pillar-form silicon layer. Like numbers denote like components in the above-described prior-art memories and the explanation thereof is omitted.

In this memory, a selection gate transistor Qs1 is formed in the lowermost part of a pillar-form silicon layer 2, three memory transistors Qc1, Qc2 and Qc3 are laid above the selection gate transistor Qs1, and another selection gate transistor Qs2 is formed above. This structure can be obtained basically by repeating the aforesaid production process.

As described above, the prior-art techniques can provide highly integrated EEPROMs whose control gates and charge storage layers have a sufficient capacity therebetween and whose memory cells occupy a decreased area, by constructing the memory cells using memory transistors having the charge storage layers and the control gates by use of the sidewalls of the pillar-form semiconductor layers separated by the lattice-form trenches.

However, if a plurality of memory cells are connected in series on one pillar-form semiconductor layer and the thresholds of the memory cells are supposed to be the same, significant changes take place in the thresholds of memory cells at both ends of the memory cells connected in series owing to a back-bias effect of the substrate in a reading operation. In the reading operation, the reading potential is applied to the control gate lines CG and the "0" or "1" is judged from the presence of a current. For this reason, the number of memory cells connected in series is limited in view of the performance of memories. Therefore, the production of mass-storage memories is difficult to realize.

The problem that the thresholds of memory cells are changed owing to a back-bias effect is true not only of the case where a plurality of memory cells are connected in series on one pillar-form semiconductor layer but also of the case where one memory cell is formed on one pillar-form semiconductor, depending upon variations in the back-bias effect of the substrate in an inplanar direction.

In the prior art memory, an impurity diffusion layer is not formed between memory cells on the same pillar-form semiconductor layer. However, it is preferable that an impurity diffusion layer is formed therebetween.

Furthermore, in the prior-art memories, the charge storage layers and the control gates are formed in self-alignment with the pillar-form semiconductor layers. Taking mass storage of the cell array into consideration, the pillar-form semiconductor layers are preferably formed at the minimum photoetching dimension.

In the case where the floating gates are used as the charge storage layers, the capacity coupling between the floating gates and the control gates and between the floating gates and the substrate is determined by the area of the outer periphery of the pillar-form semiconductor layers, the area of the outer periphery of the floating gate, the thickness of the tunnel oxide films insulating the floating gates from the pillar-form semiconductor layers and the thickness of the interlayer insulating films insulating the floating gates form the control gates. In the prior-art memories, the charge storage layers and the control gates are formed to surround the pillar-form semiconductor layers by utilizing the sidewalls of the pillar-form semiconductor layers in order that the capacity between the charge storage layers and the control gates is ensured to be sufficiently large. However, in the case where the pillar-form semiconductor layers are formed at the minimum photoetching dimension and the thickness of the tunnel oxide films and that of the interlayer insulating film are fixed, the capacity between the charge storage layers and the control gates is determined simply by the area of the outer periphery of the floating gates, that is, the thickness of the floating gates. Therefore, it is difficult to increase the capacity between the charge storage layers and the control gates without increasing the area occupied by the memory cells. In other words, it is difficult to increase the ratio of the capacity between the floating gates and the control gates to the capacity between the floating gates and the pillar-form semiconductor layers without increasing the area occupied by the memory cells.

Further, if transistors are formed in a direction vertical to the substrate stage by stage, there occur variations in characteristics of the memory cells owing to differences in the properties of the tunnel oxide films and differences in the profile of diffusion layers. Such differences are generated by thermal histories different stage by stage.

SUMMARY OF THE INVENTION

The present invention has been made in view of the above-mentioned problems. An object of the invention is to provide a semiconductor memory and a production process therefor, in which the degree of integration of the memory is improved by reducing the back-bias effect in a semiconductor memory having charge storage layers and control gates, capacity between the floating gates and the control gates is increased without increasing the occupied area and variations in the characteristics of memory cells are suppressed.

The present invention provides a semiconductor memory comprising:

a fist conductivity type semiconductor substrate and one or more memory cells constituted of an island-like semiconductor layer, a charge storage layer and a control gate, the charge storage layer and the control gate being formed to entirely or partially encircle a sidewall of the island-like semiconductor layer, wherein at least one of said one or more memory cells is electrically insulated from the semiconductor substrate.

The present invention also provides a process for producing a semiconductor memory having at least one memory cell constituted of an island-like semiconductor layer, a charge storage layer and a control gate, the charge storage layer and the control gate being formed to entirely or partially encircle a sidewall of the island-like semiconductor layer, the process comprising the steps of:

forming at least one island-like semiconductor layer on a semiconductor substrate;

forming an insulating film and a first conductive film over a surface of the island-like semiconductor layer;

forming sidewall spacers of an insulating film separated in a vertical direction on the first conductive film located on a sidewall of the island-like semiconductor layer;

separating the first conductive film using the sidewall spacers as a mask;

introducing an impurity in self-alignment with respect to the separated first conductive films; and forming an interlayer insulating film and a second conductive film on the first conductive films.

The present invention further provides a process for producing a semiconductor memory having at least one memory cell constituted of an island-like semiconductor layer, a charge storage layer and a control gate, the charge storage layer and the control gate being formed to entirely or partially encircle a sidewall of the island-like semiconductor layer, the process comprising the steps of:

forming at least one island-like semiconductor layer on a semiconductor substrate;

forming a charge storage layer of a laminated insulating film and a first conductive film over a surface of the island-like semiconductor layer;

forming sidewall spacers of an insulating film separated in a vertical direction on the first conductive film located on a sidewall of the island-like semiconductor layer;

separating the first conductive film using the sidewall spacers as a mask; and introducing an impurity in self-alignment with respect to the separated first conductive films.

The present invention also provides a process for producing a semiconductor memory having at least one memory cell constituted of an island-like semiconductor layer, a charge storage layer and a control gate, the charge storage layer and the control gate being formed to entirely or partially encircle a sidewall of the island-like semiconductor layer, the process comprising the steps of:

forming at least one island-like semiconductor layer on a semiconductor substrate;

introducing an impurity partially in the island-like semiconductor layer;

forming an insulating film and a first conductive film over a surface of the island-like semiconductor layer;

forming sidewall spacers of an insulating film separated in a vertical direction on the first conductive film located on a sidewall of the island-like semiconductor layer; and separating the first conductive film using the sidewall spacers as a mask.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 678 is a sectional view (taken on line I2–I2' in FIG. 61) illustrating a production step of Production Example 23 for producing a semiconductor memory in accordance with the present invention;

FIG. 679 is a sectional view (taken on line I3–I3' in FIG. 61) illustrating a production step of Production Example 23 for producing a semiconductor memory in accordance with the present invention;

FIG. 680 is a sectional view (taken on line I4–I4' in FIG. 61) illustrating a production step of Production Example 23 for producing a semiconductor memory in accordance with the present invention;

FIG. 681 is a sectional view (taken on line I5–I5' in FIG. 61) illustrating a production step of Production Example 23 for producing a semiconductor memory in accordance with the present invention;

FIG. 682 is a sectional view (taken on line H–H' in FIG. 60 or 61) illustrating a production step of Production Example 23 for producing a semiconductor memory in accordance with the present invention;

FIG. 683 is a sectional view (taken on line I1–I1' in FIG. 60 or 61) illustrating a production step of Production Example 23 for producing a semiconductor memory in accordance with the present invention;

FIG. 684 is a sectional view (taken on line I2–I2' in FIG. 60 or 61) illustrating a production step of Production Example 23 for producing a semiconductor memory in accordance with the present invention;

FIG. 685 is a sectional view (taken on line I3–I3' in FIG. 60 or 61) illustrating a production step of Production Example 23 for producing a semiconductor memory in accordance with the present invention;

FIG. 686 is a sectional view (taken on line I4–I4' in FIG. 60 or 61) illustrating a production step of Production Example 23 for producing a semiconductor memory in accordance with the present invention;

FIG. 687 is a sectional view (taken on line I5–I5' in FIG. 60 or 61) illustrating a production step of Production Example 23 for producing a semiconductor memory in accordance with the present invention;

FIG. 688 is a sectional view (taken on line H–H' in FIG. 60 or 61) illustrating a production step of Production Example 23 for producing a semiconductor memory in accordance with the present invention;

FIG. 689 is a sectional view (taken on line I1–I1' in FIG. 60 or 61) illustrating a production step of Production Example 23 for producing a semiconductor memory in accordance with the present invention;

Figure 68:
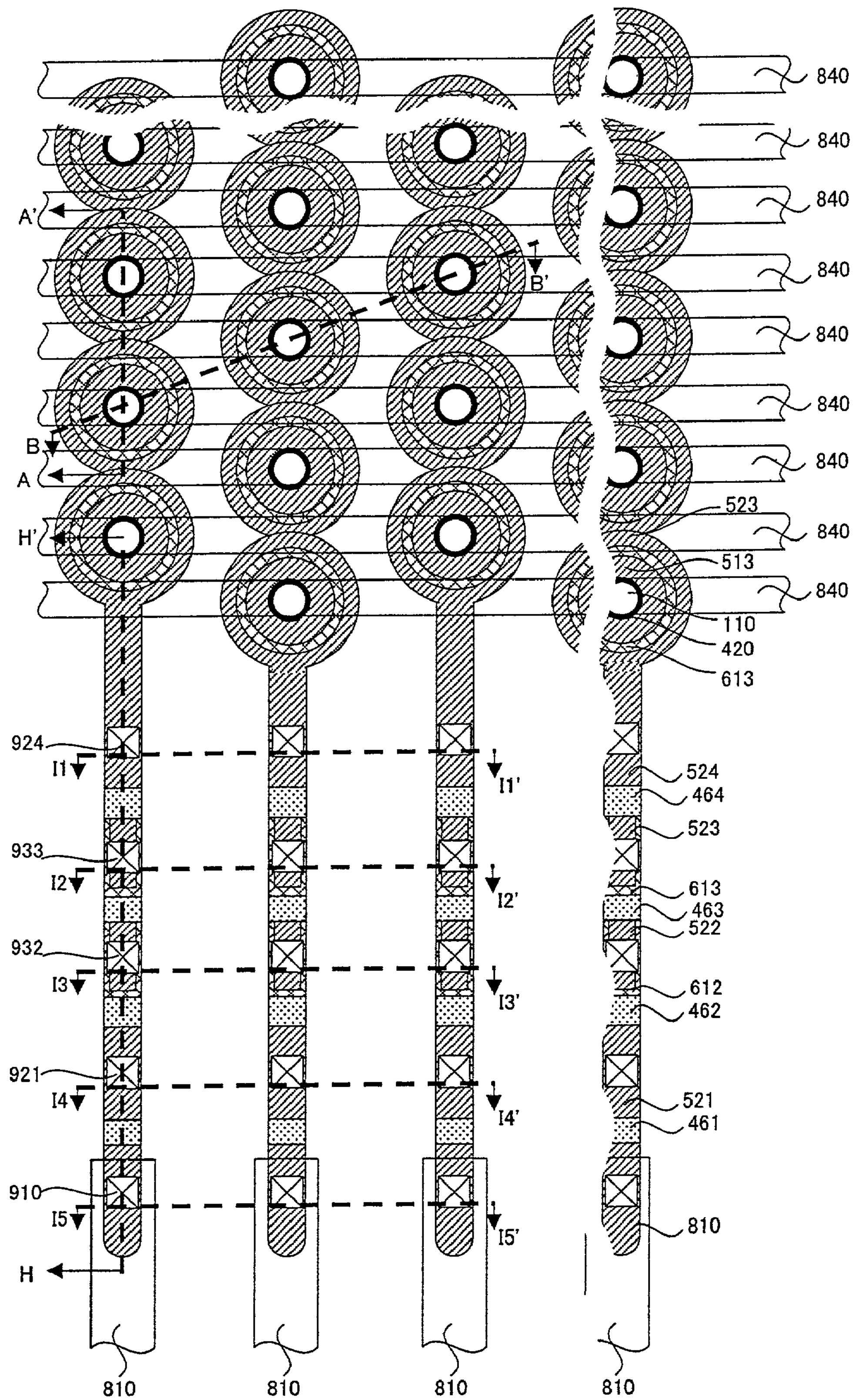
FIG. 68 to FIG. 72 are plan views illustrating other memory cell arrays of EEPROMs having floating gates as charge storage layers in accordance with the present invention.
Figure 690:
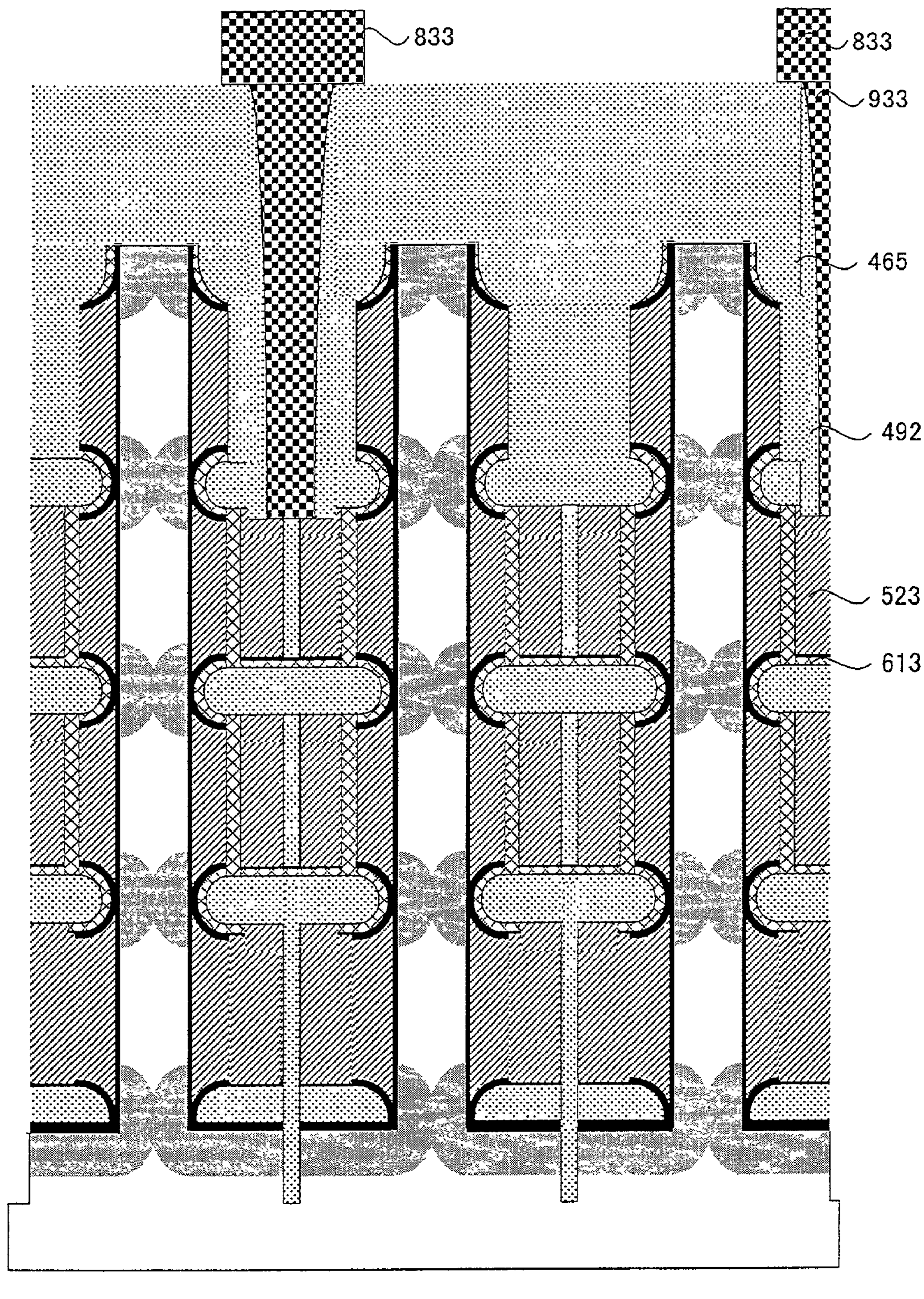
Figure 691:
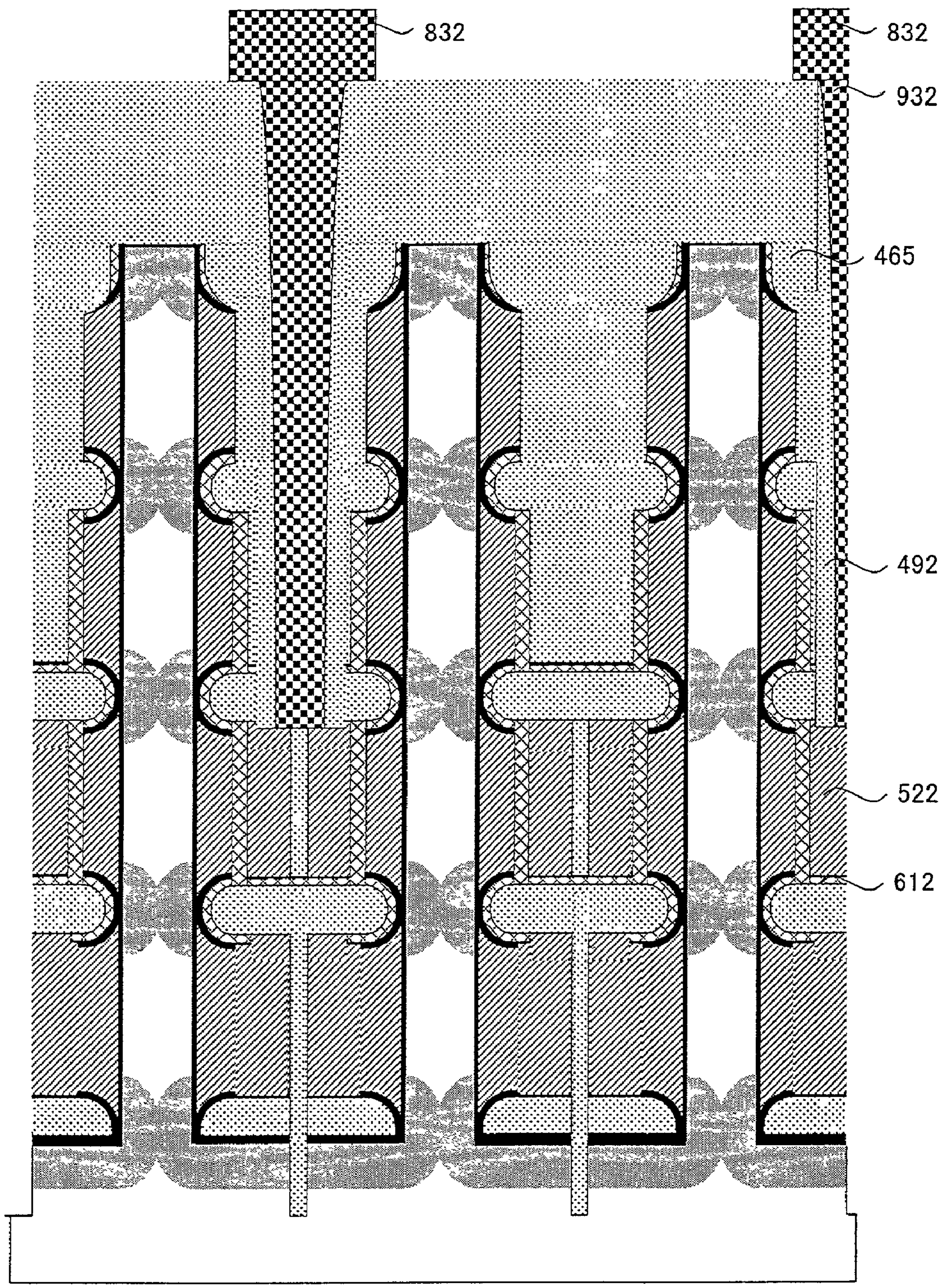
Figure 692:
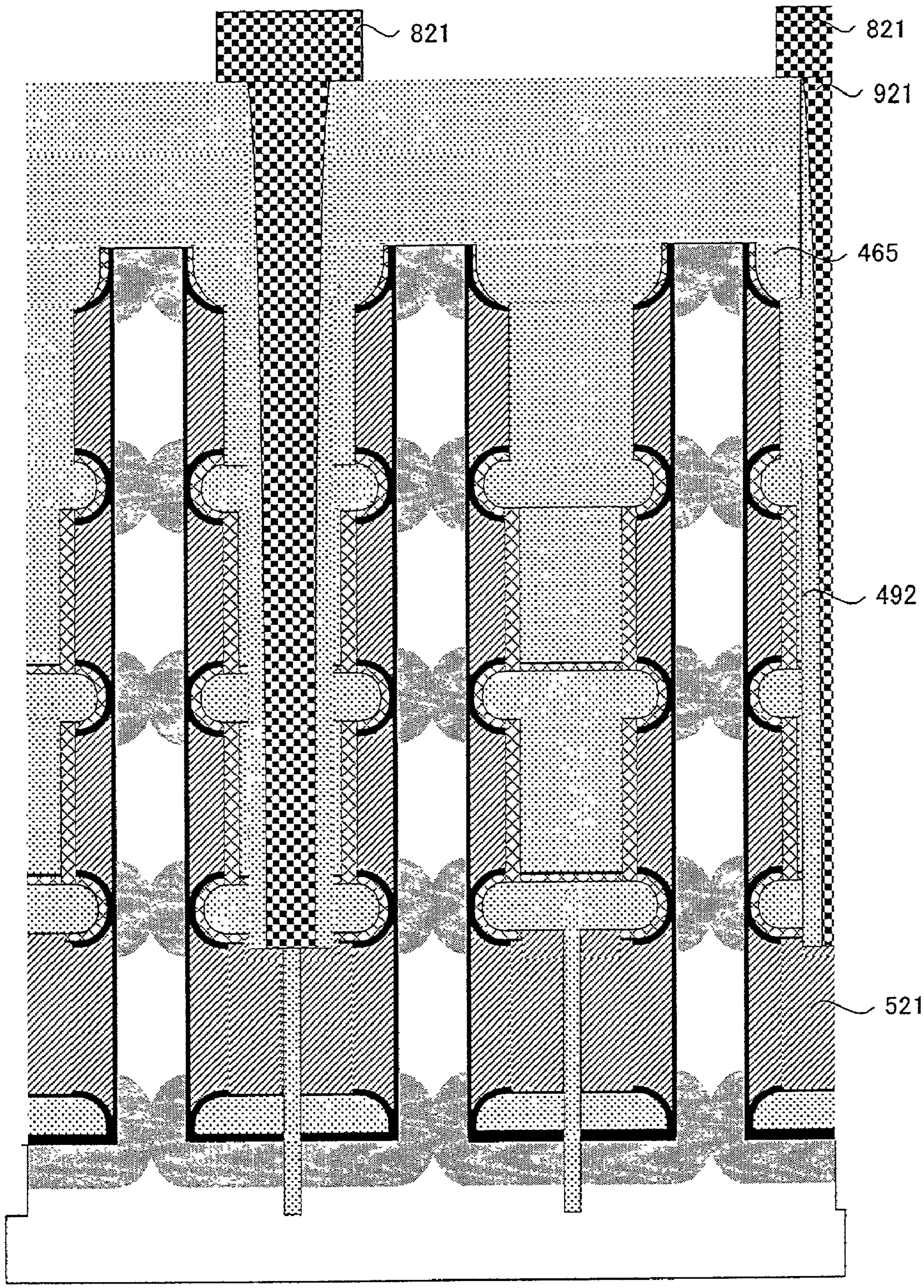
Figure 693:
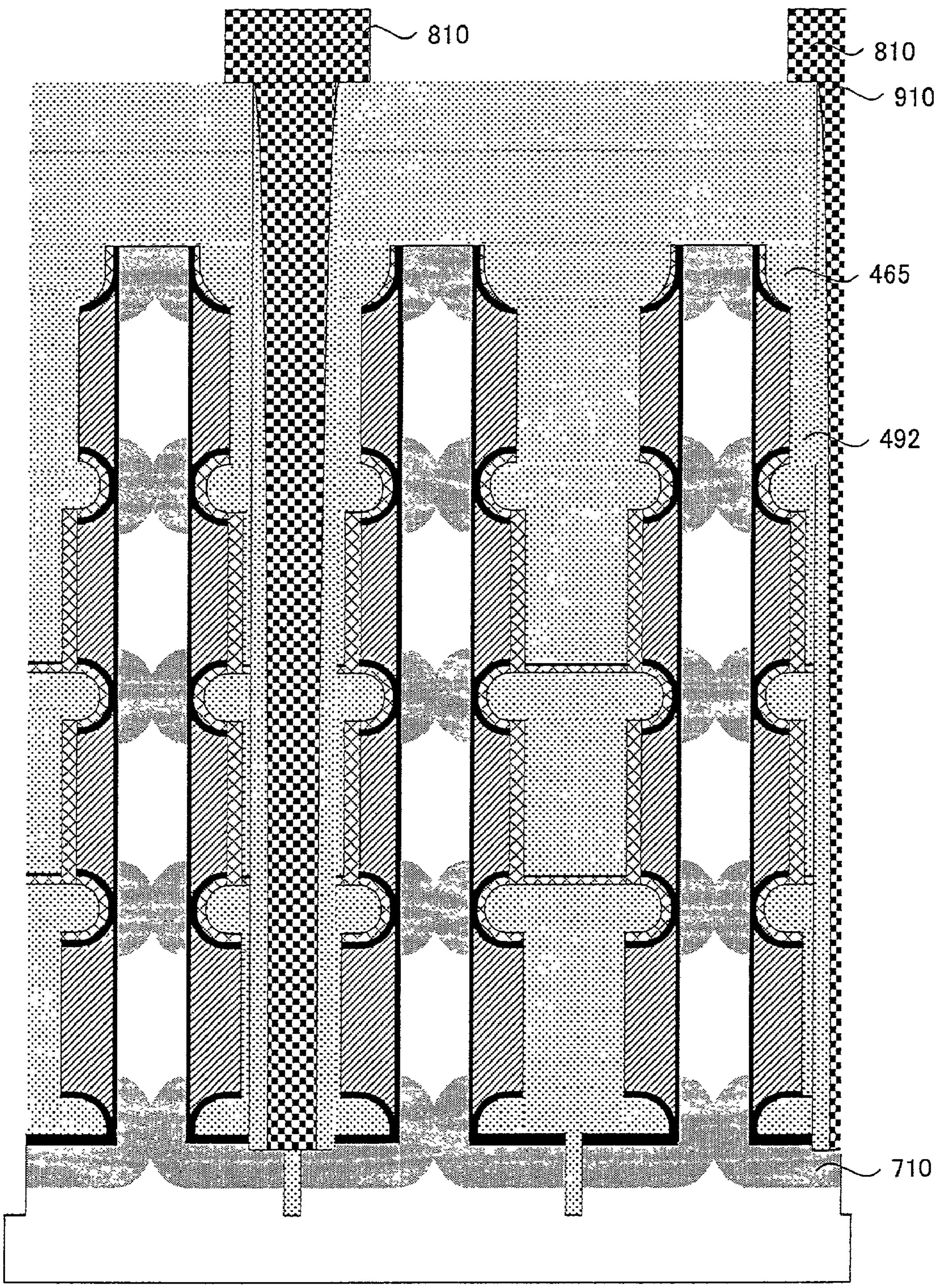
Figure 694:
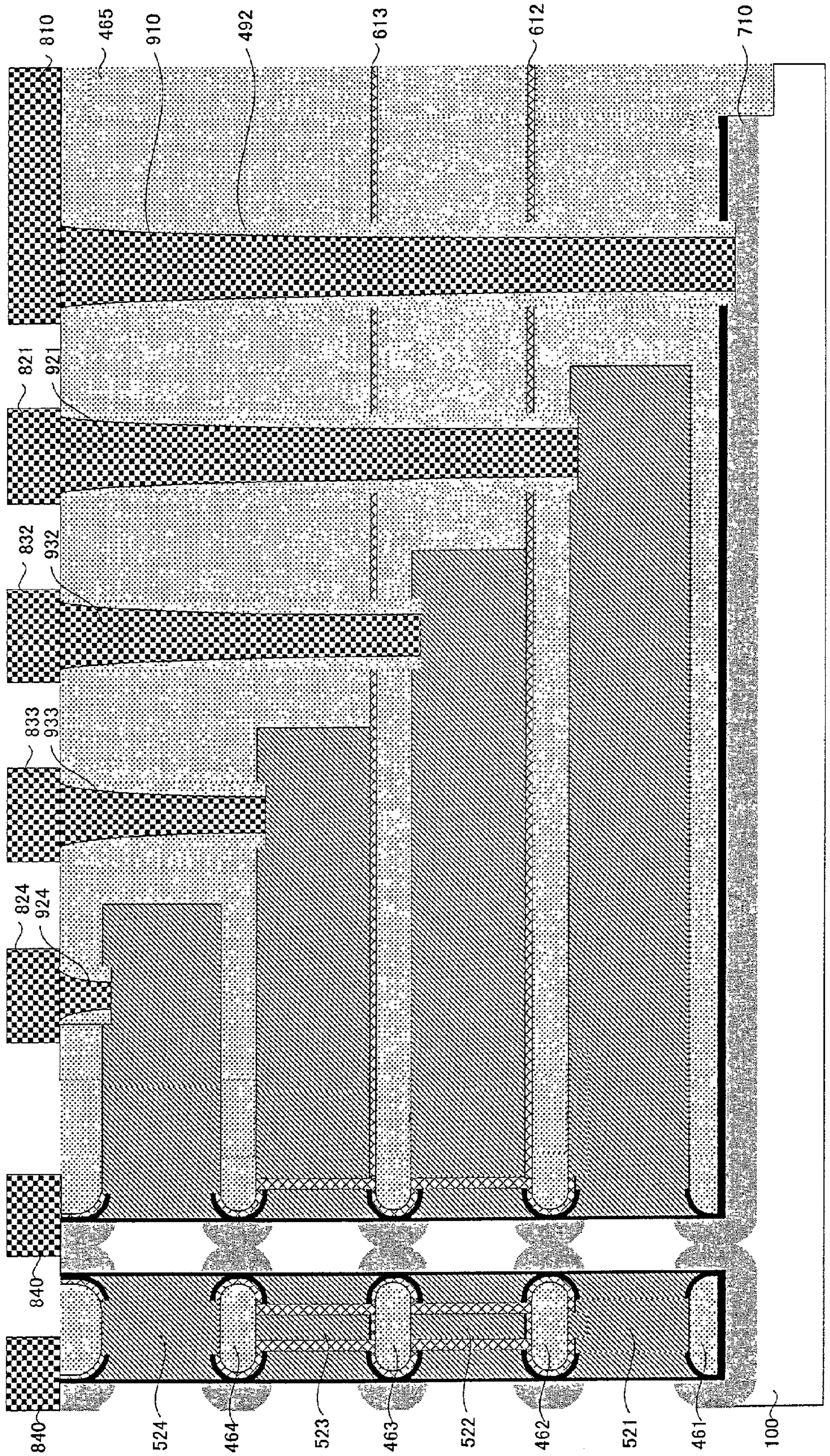
Figure 695:
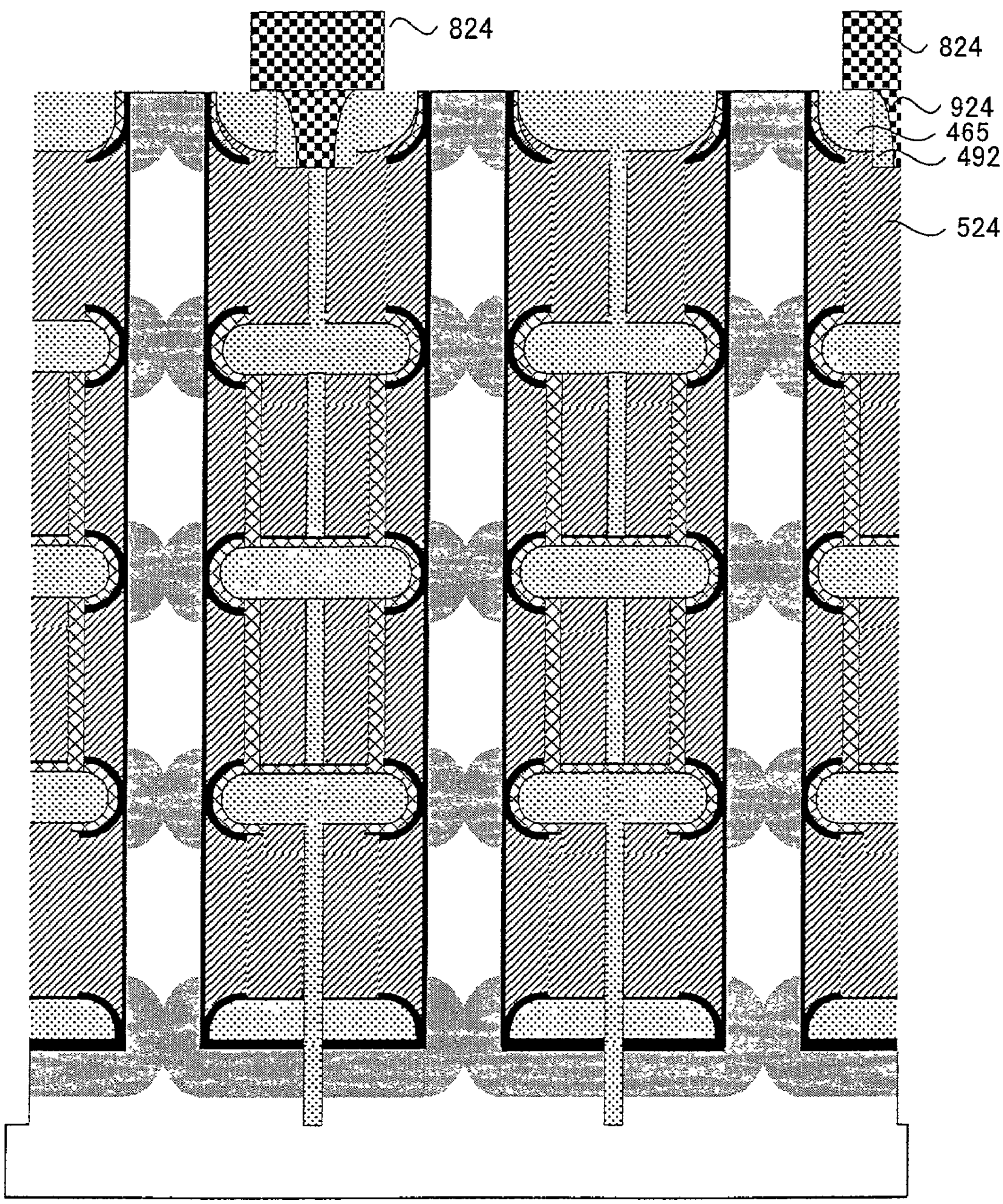
Figure 696:
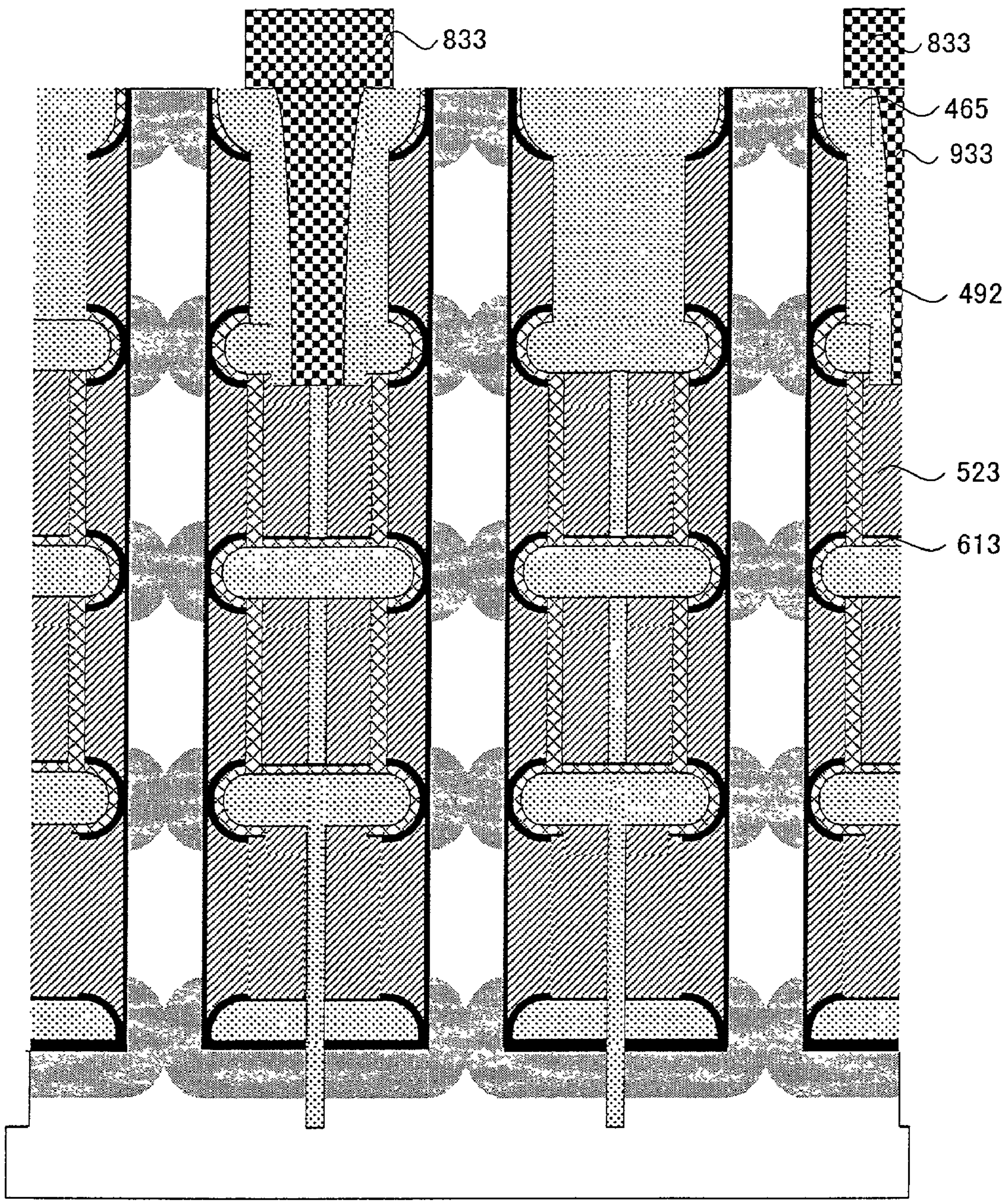
Figure 697:
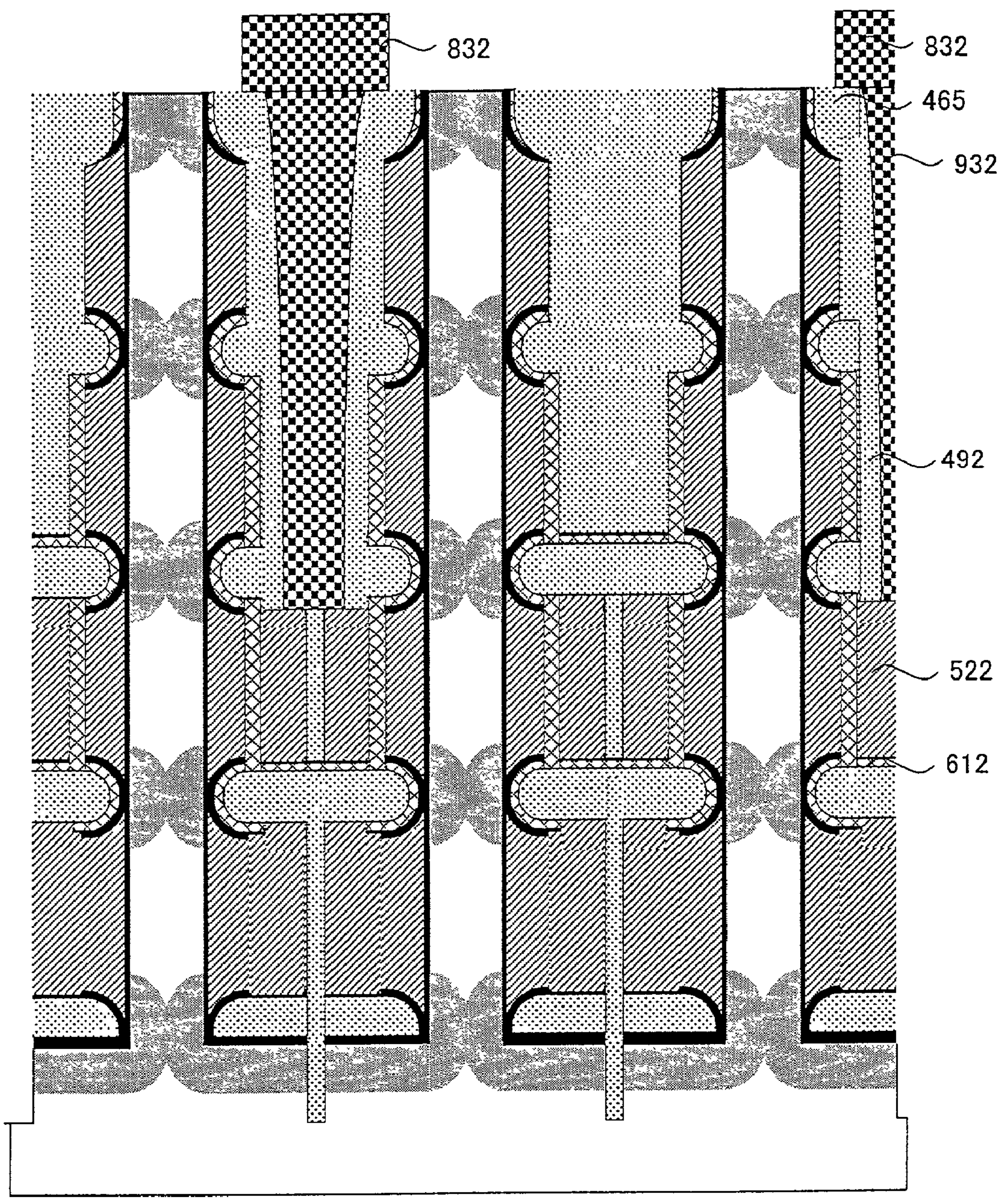
Figure 698:
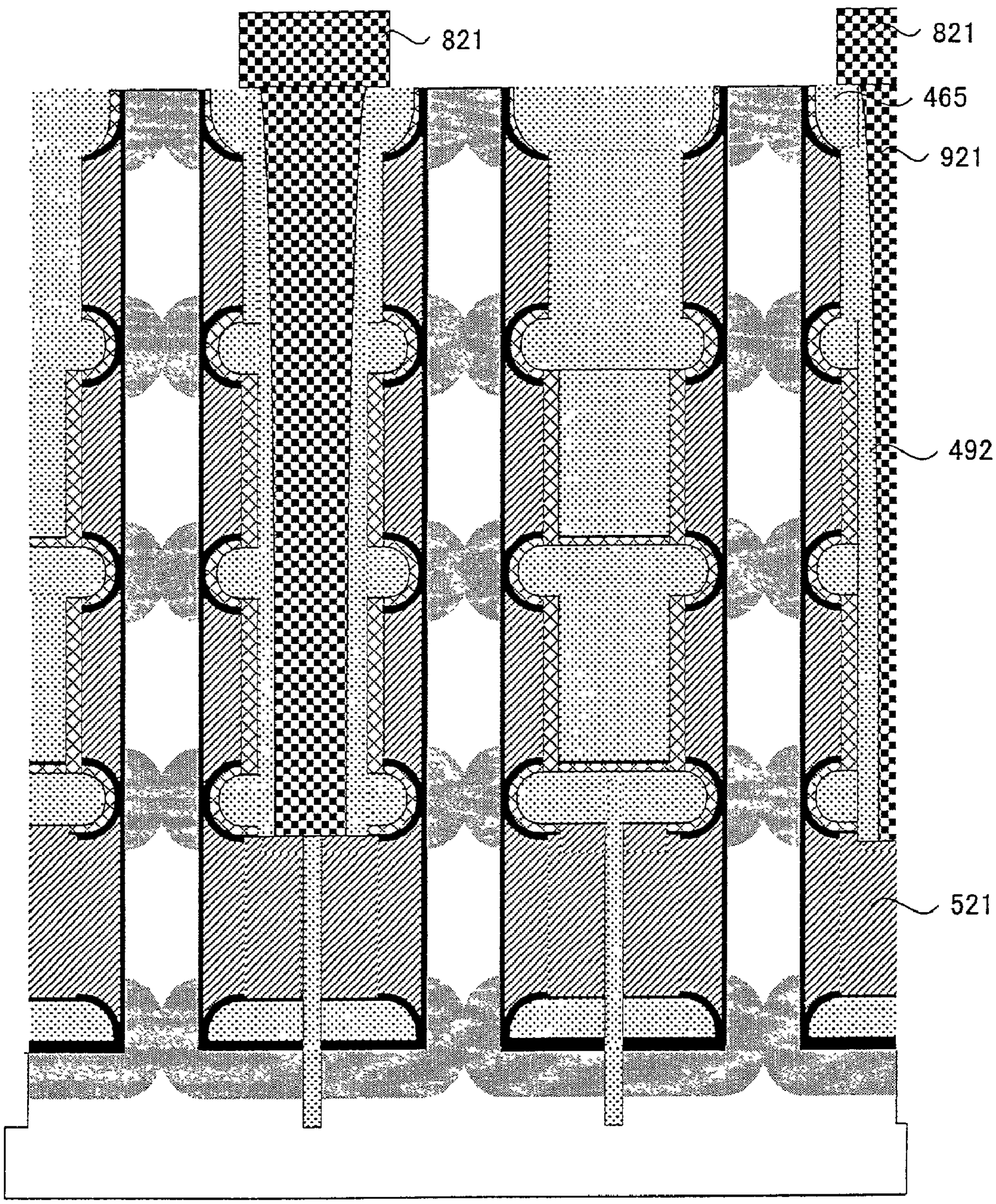
Figure 699:
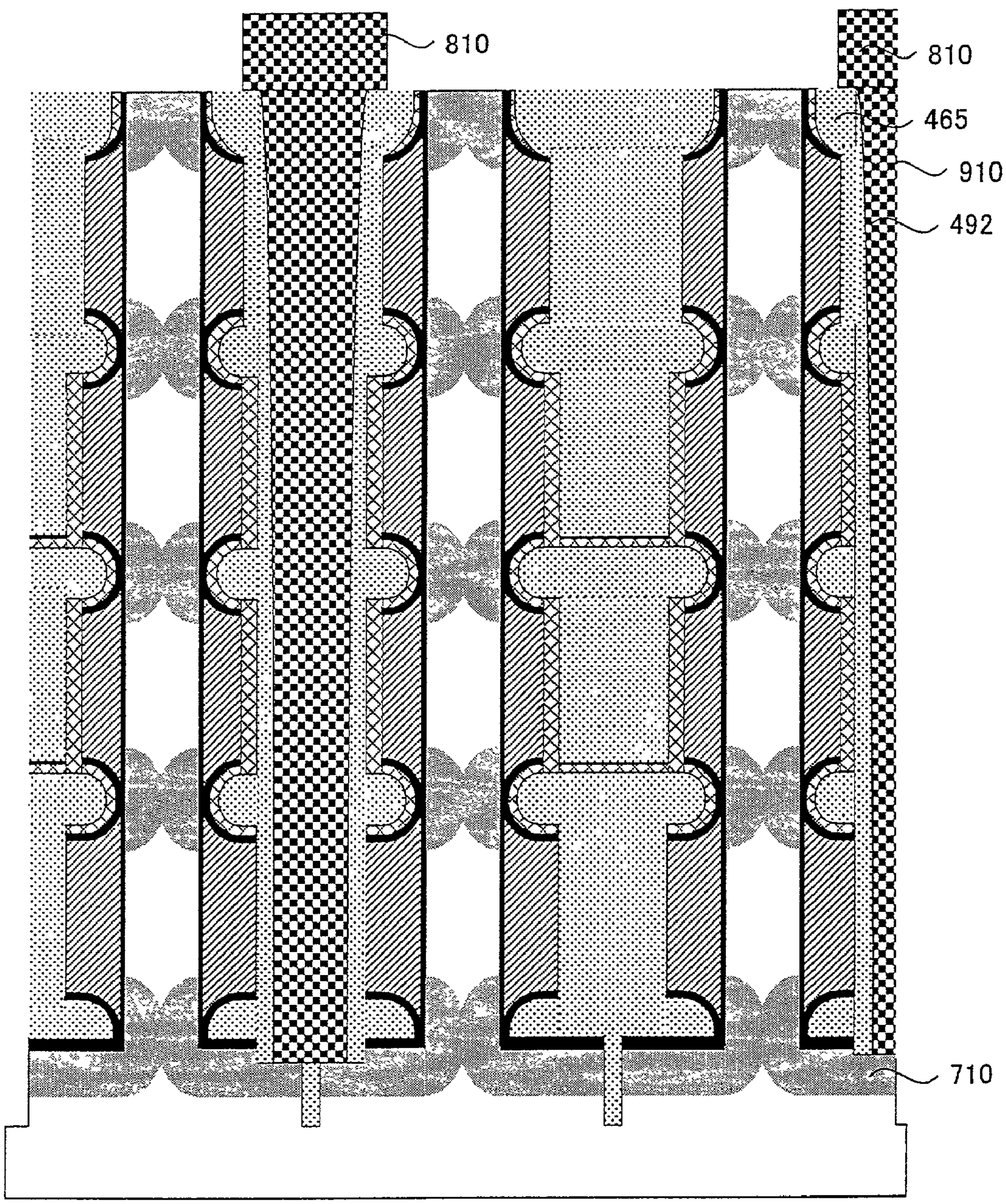
Figure 700:
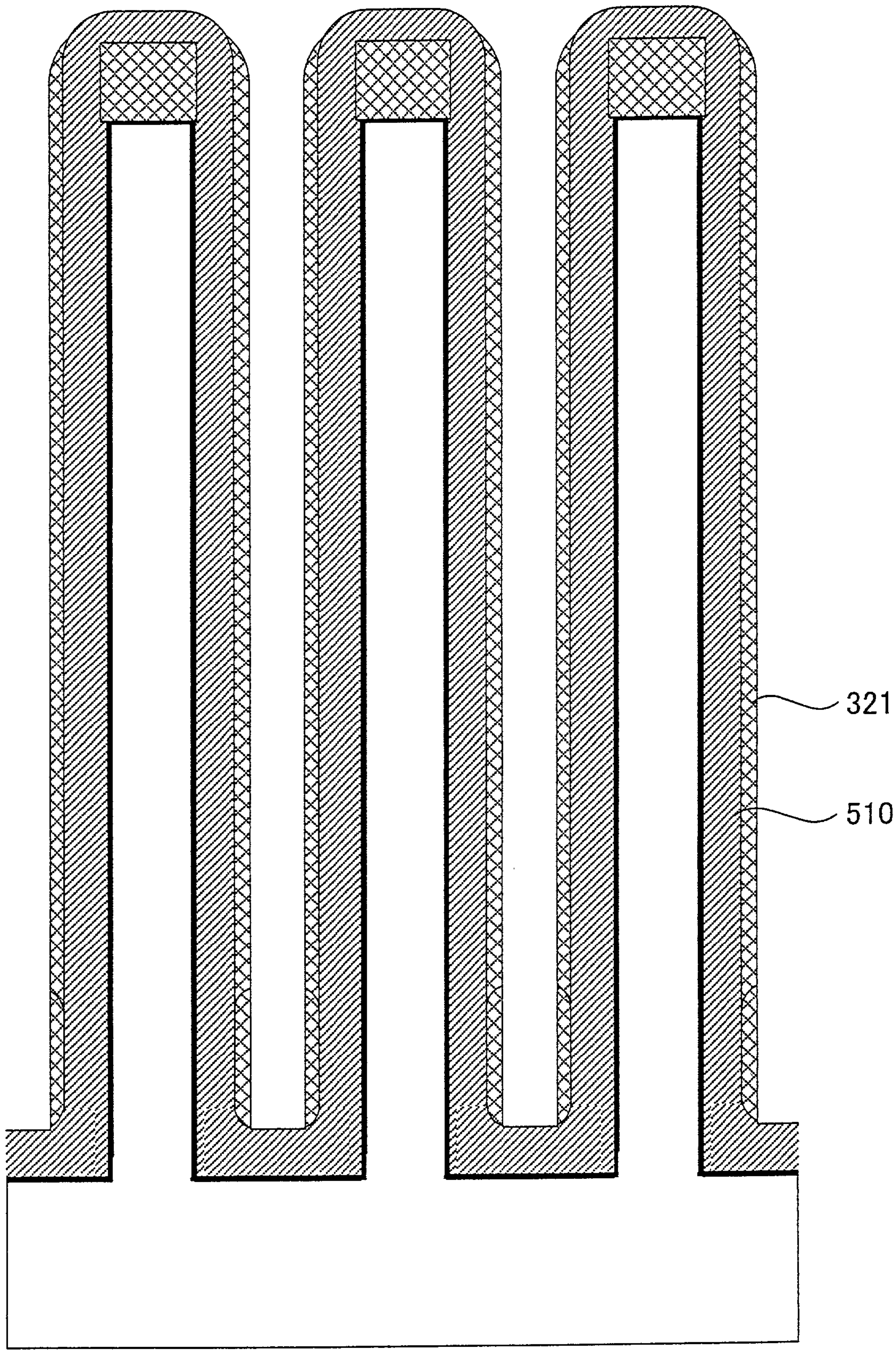
Figure 728:
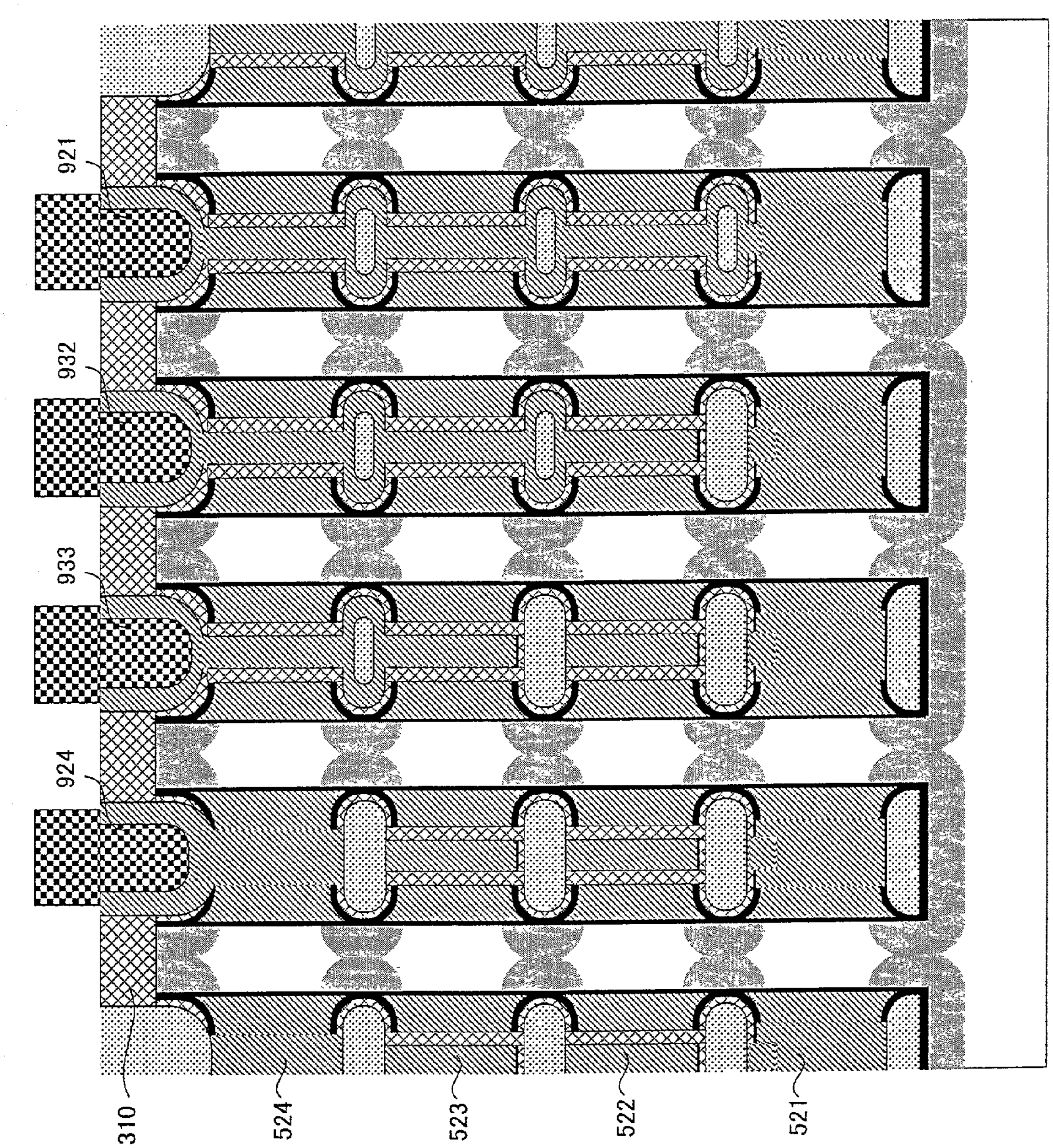
Figure 729:
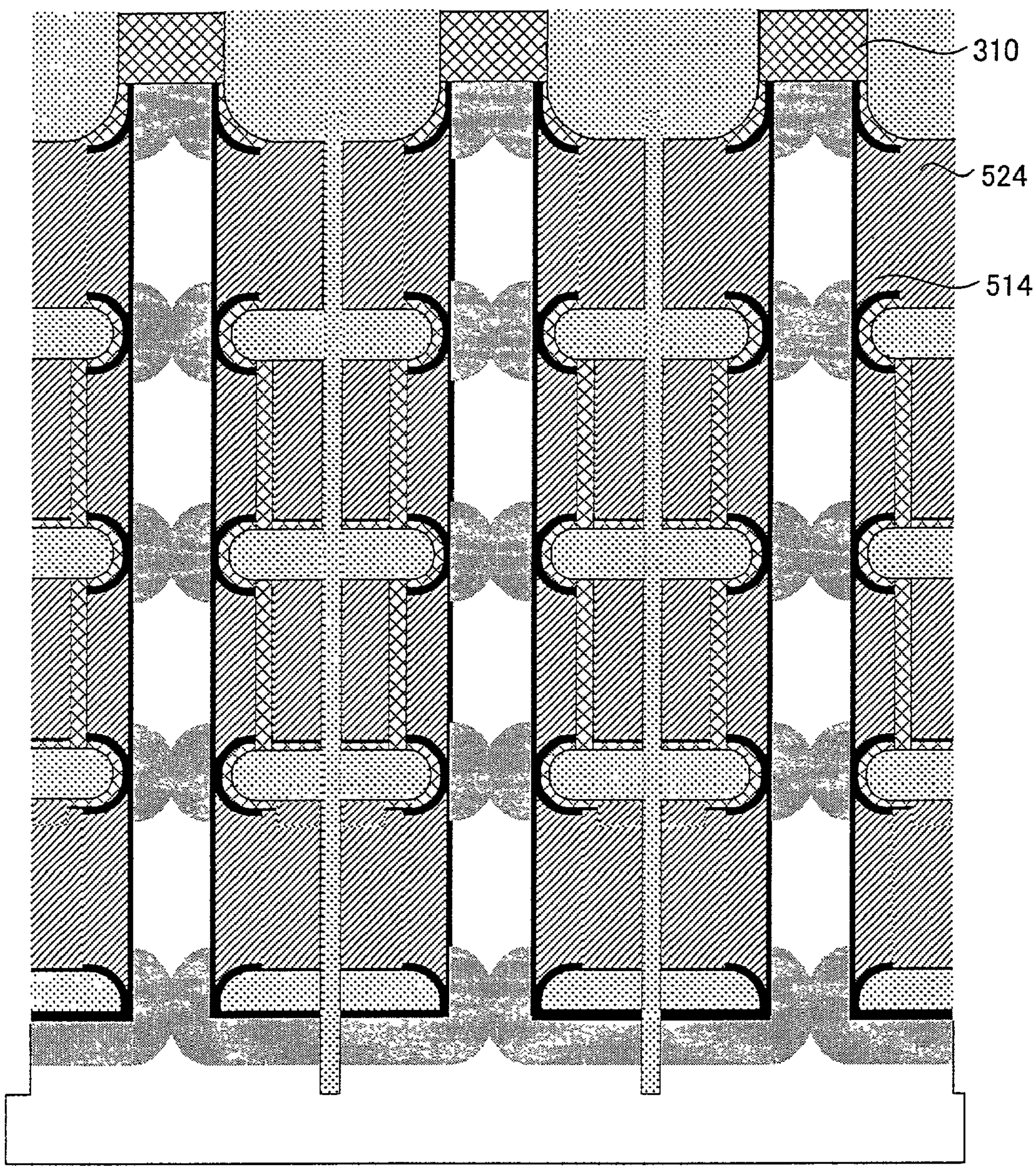
Figure 730:
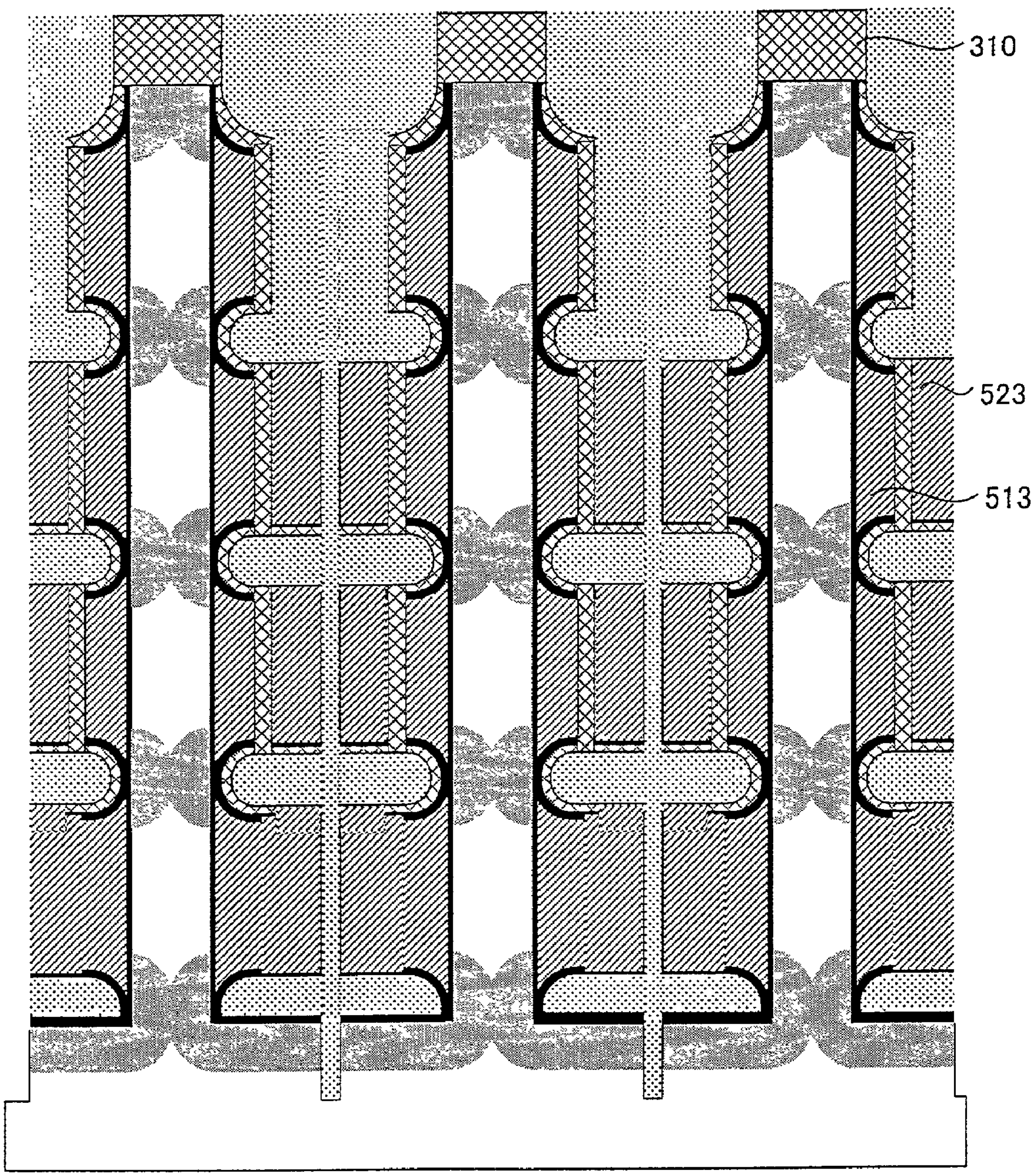
Figure 731:
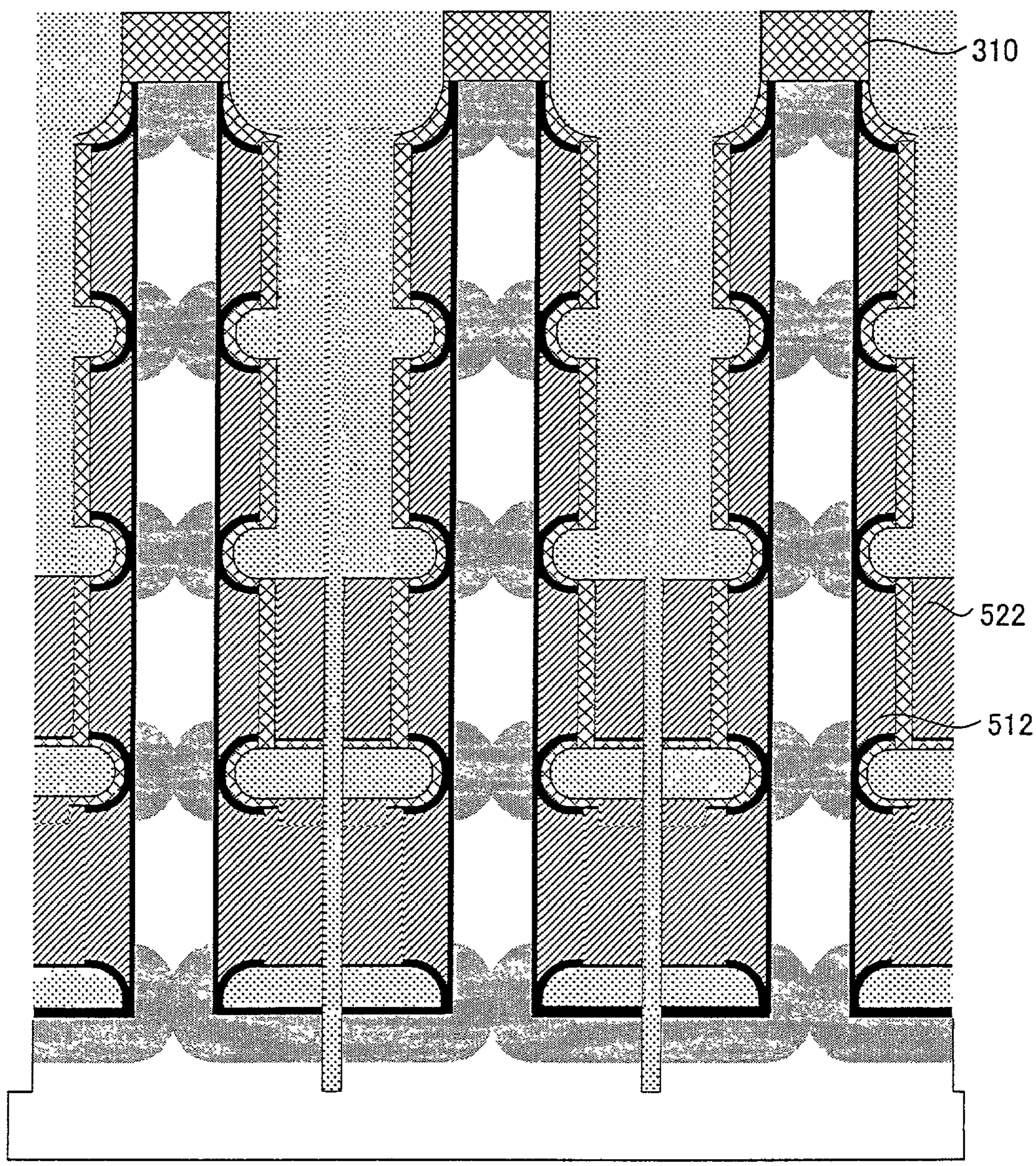
Figure 732:
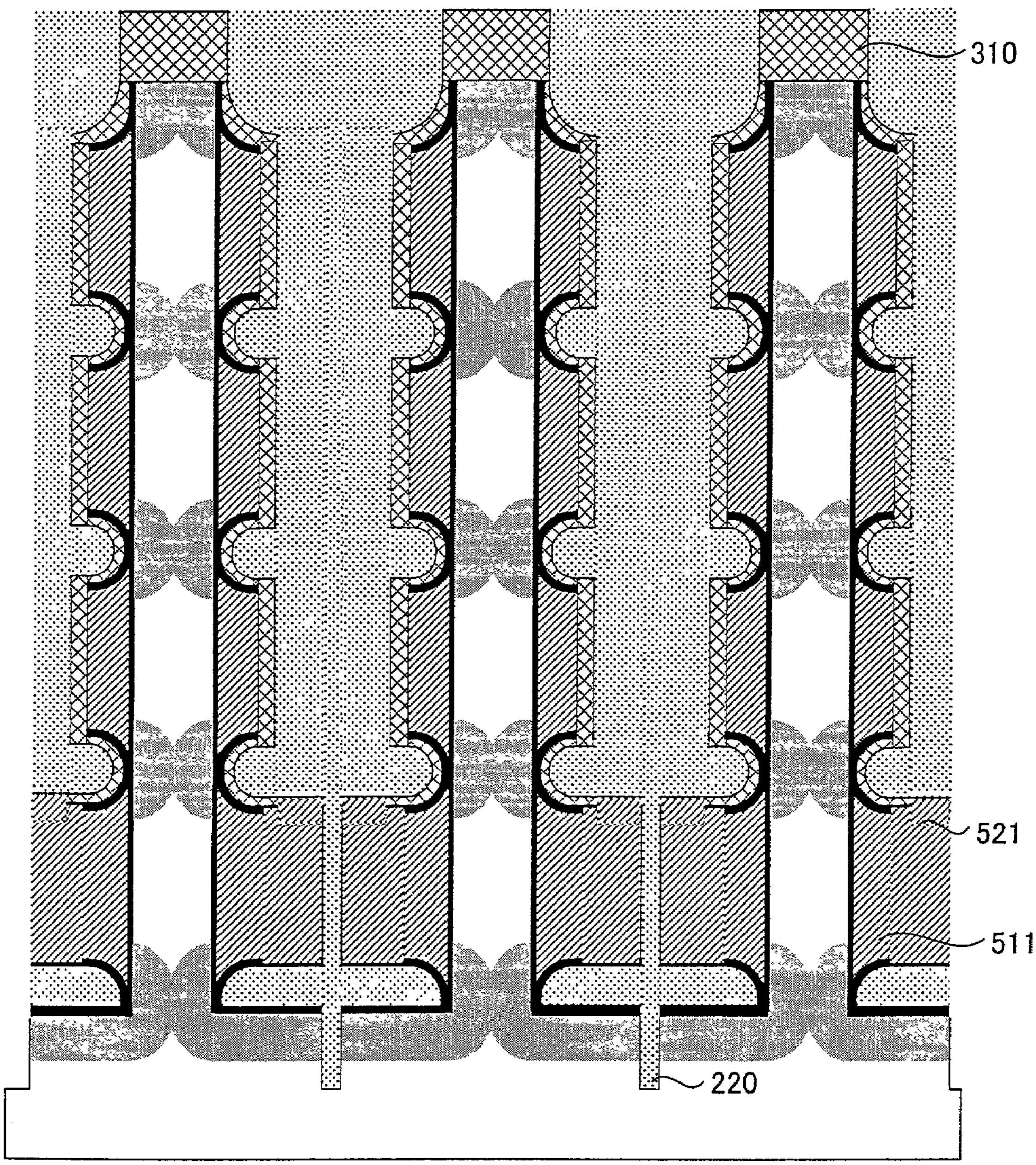
Figure 733:
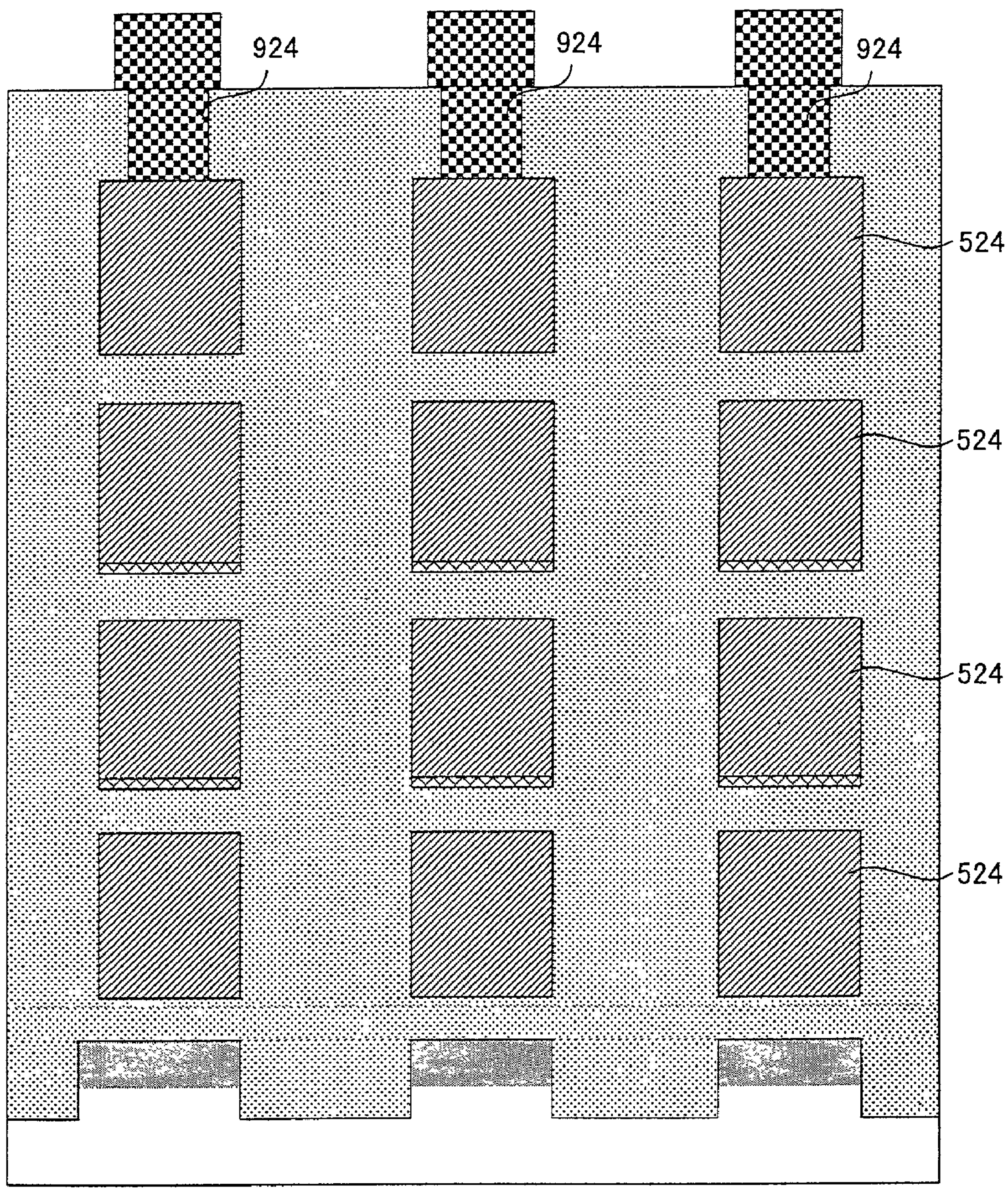
Figure 734:
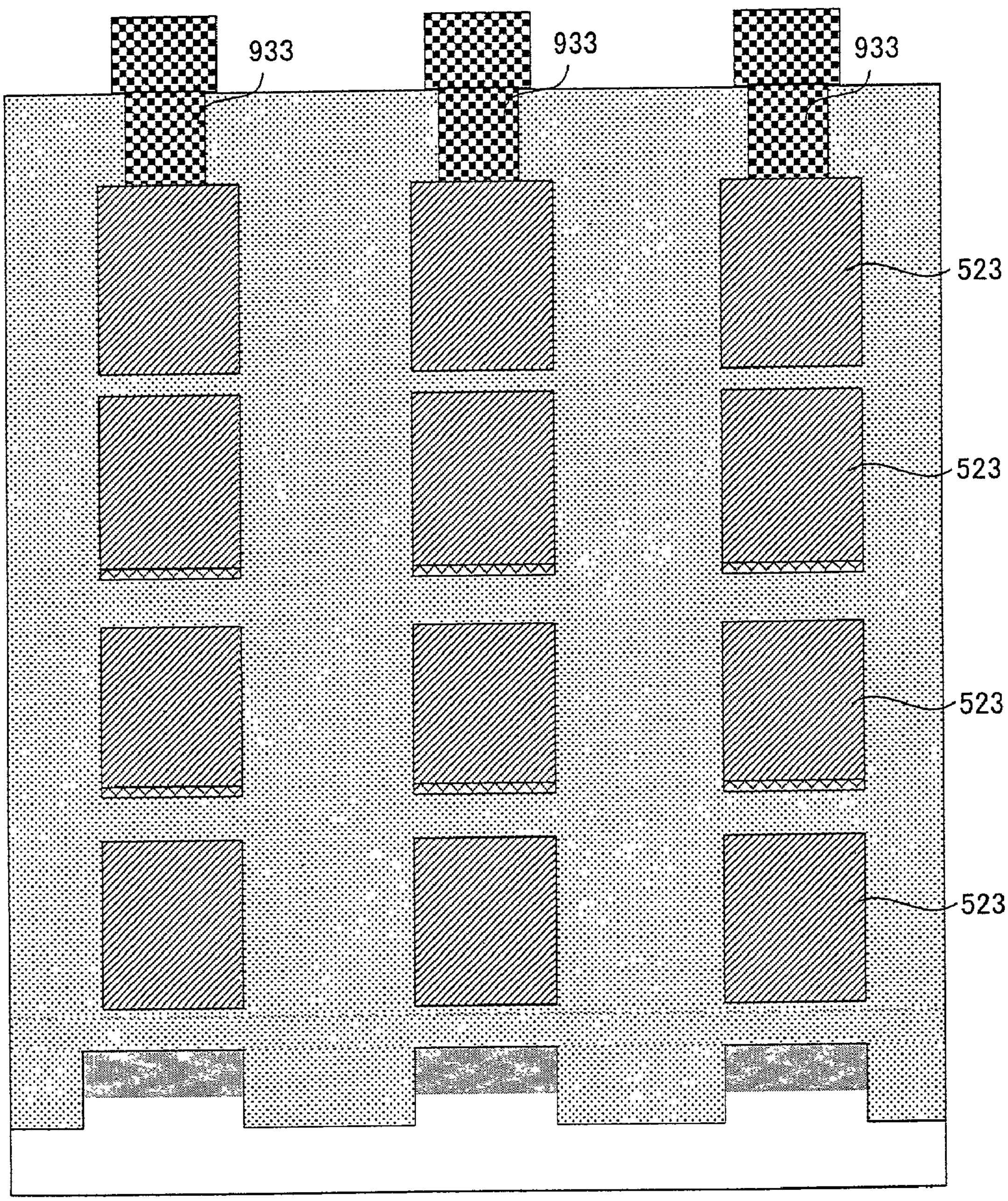
Figure 735:
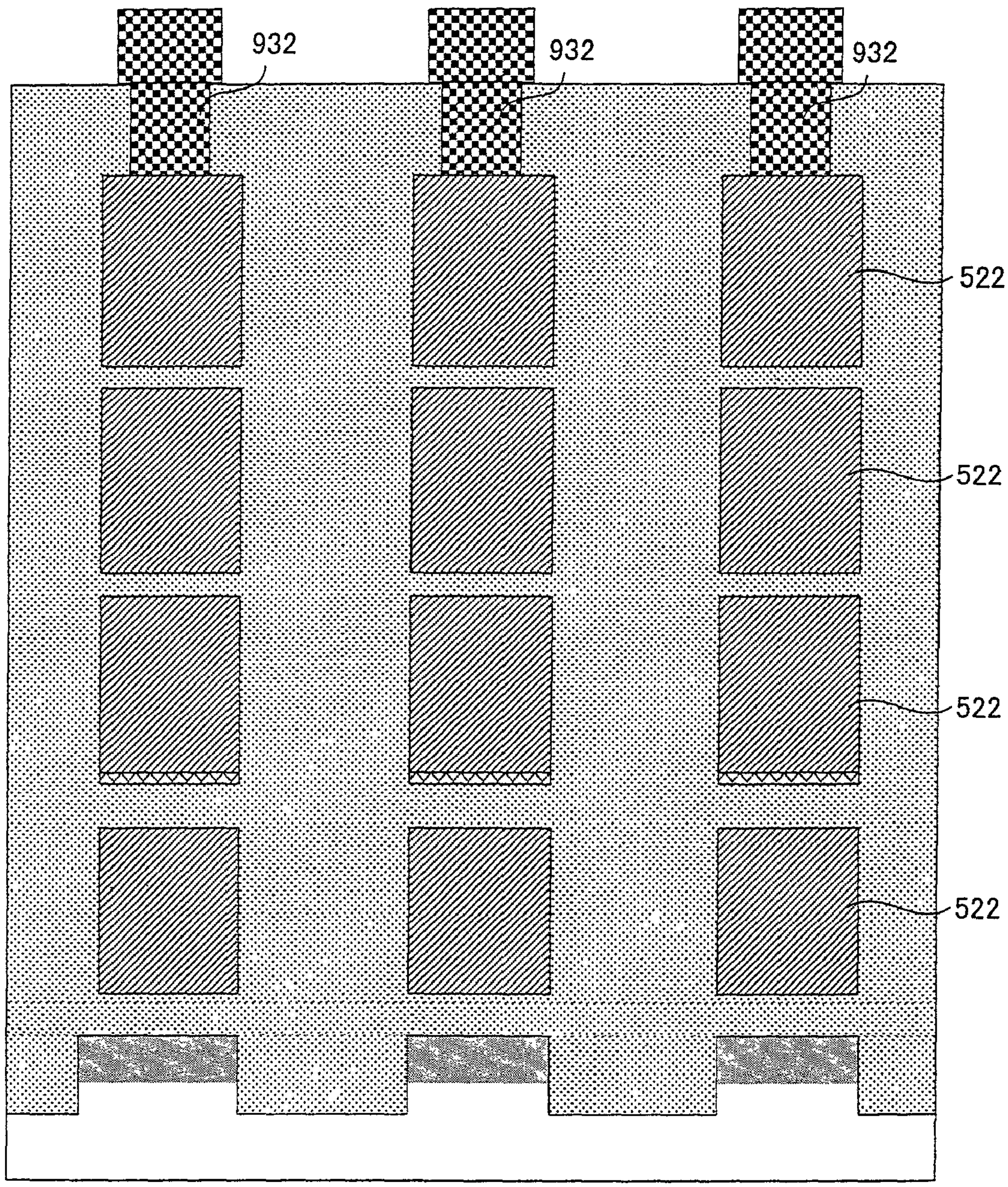
Figure 736:
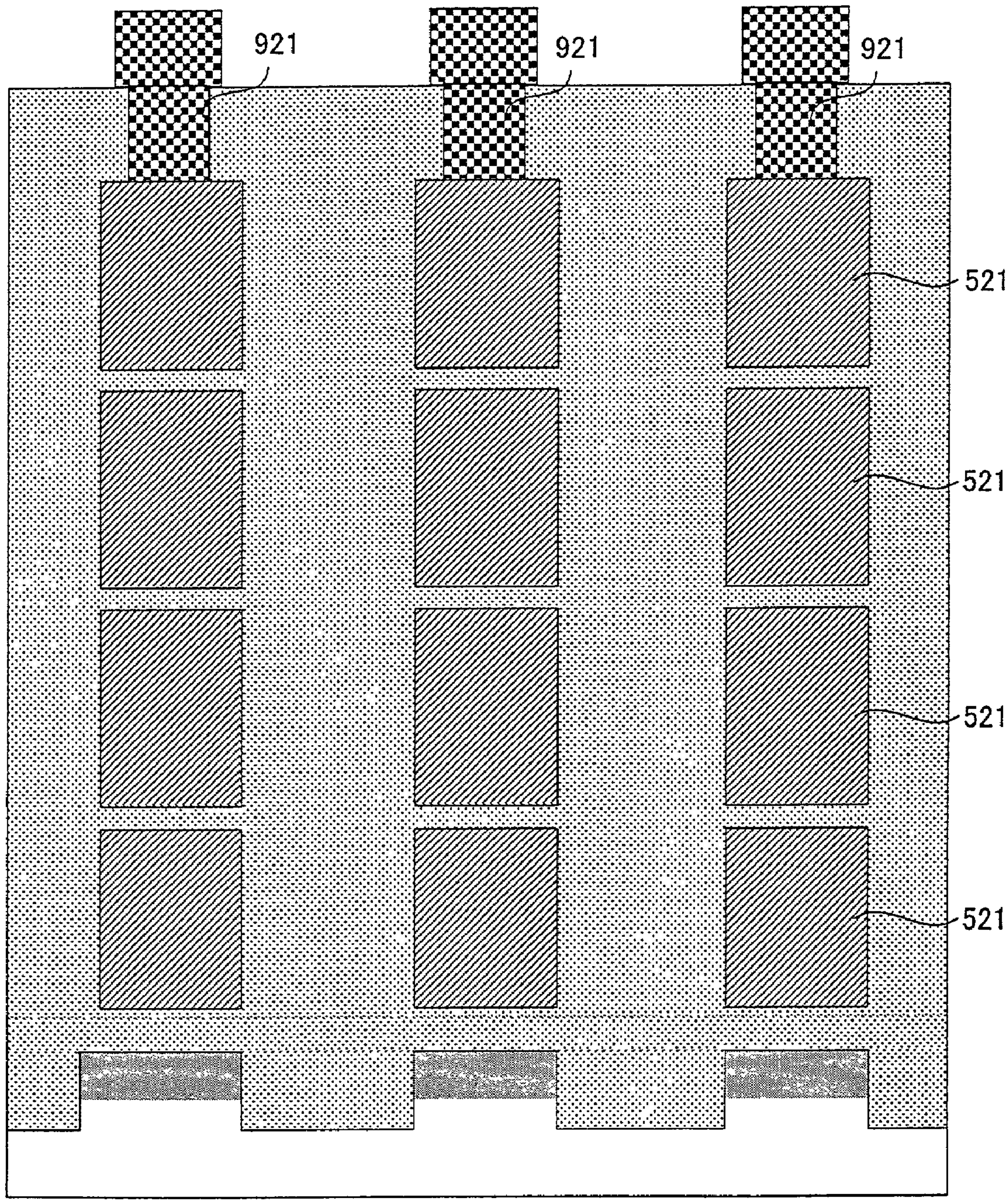
Figure 737:
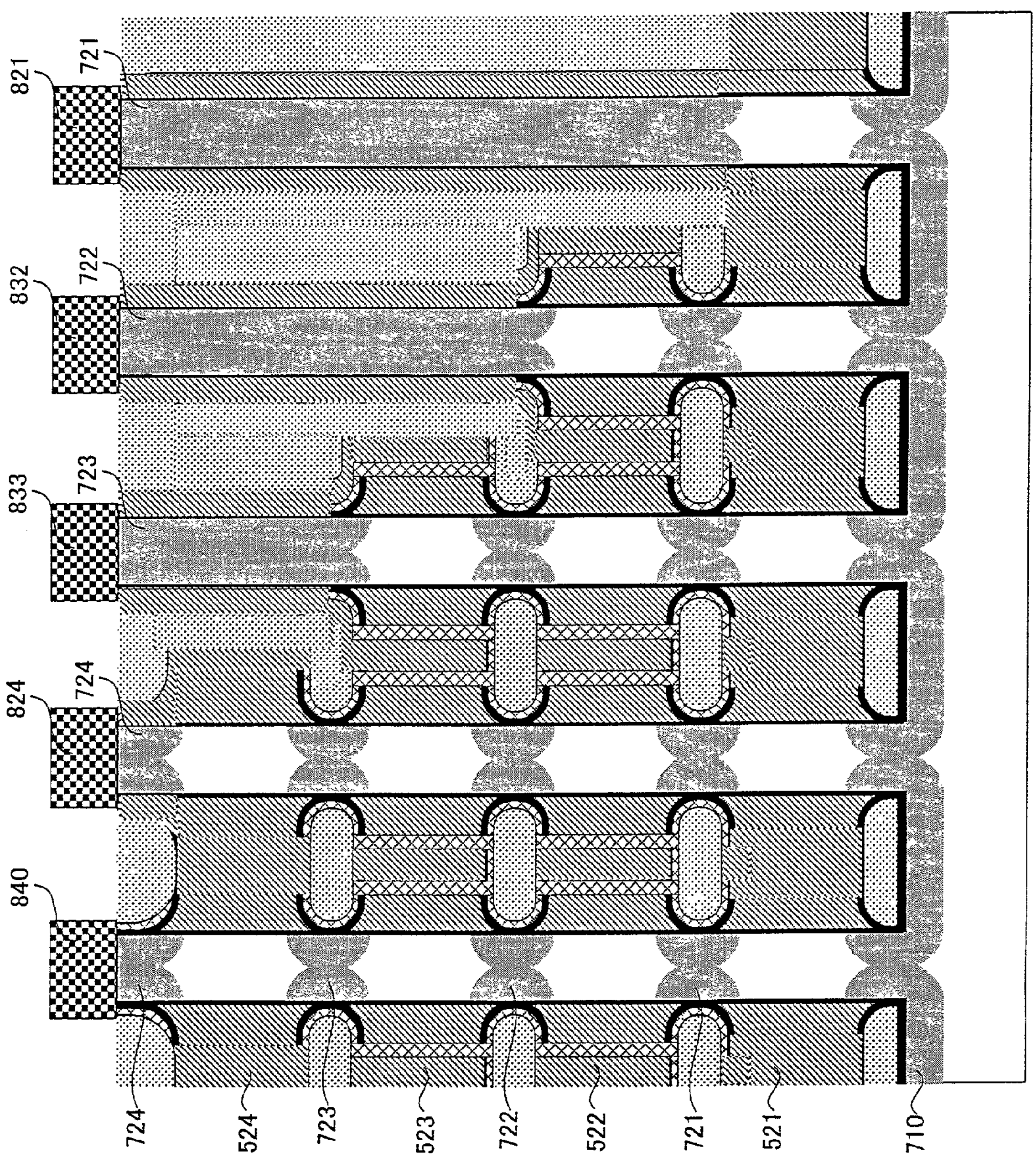
Figure 738:
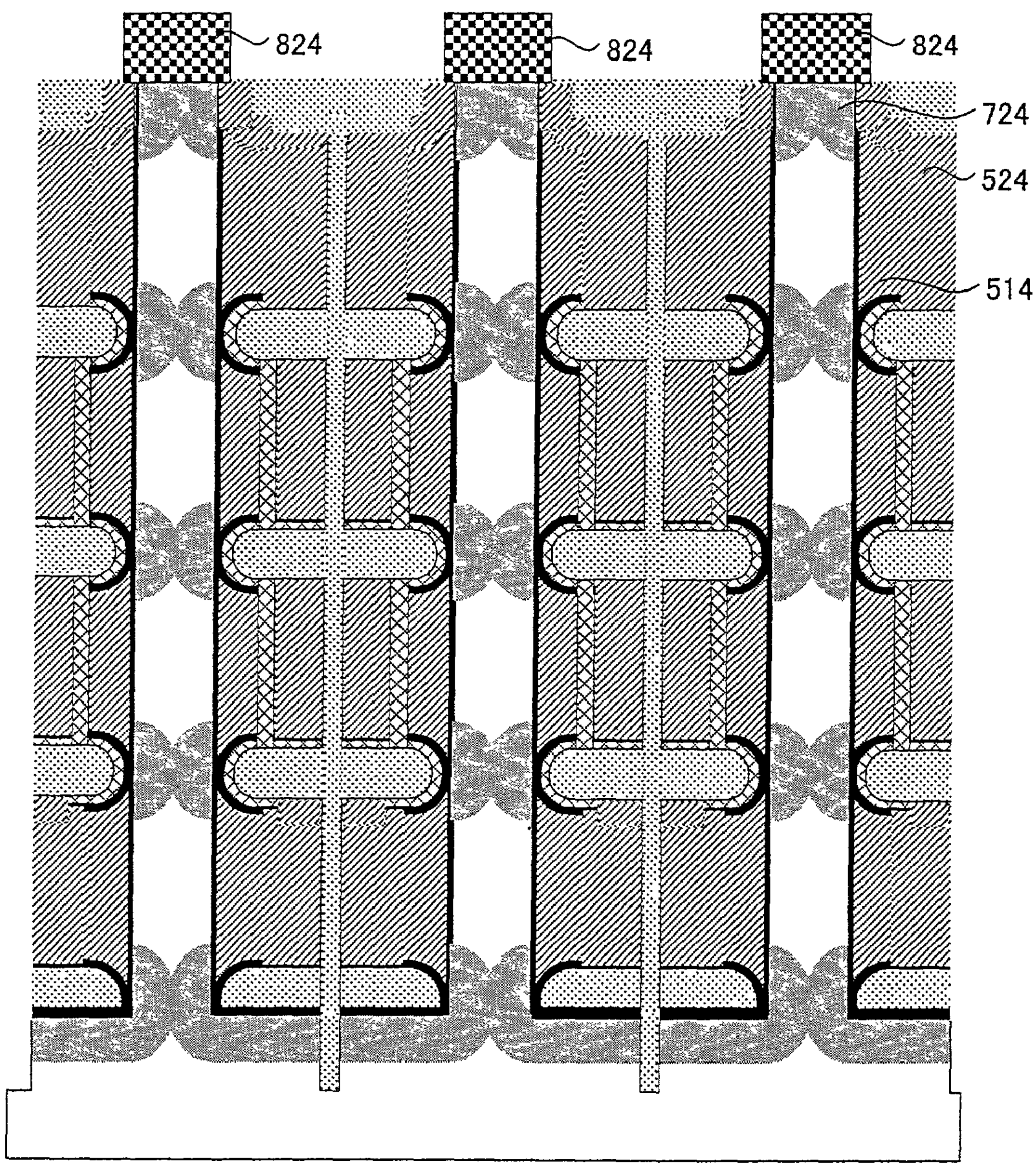
Figure 739:
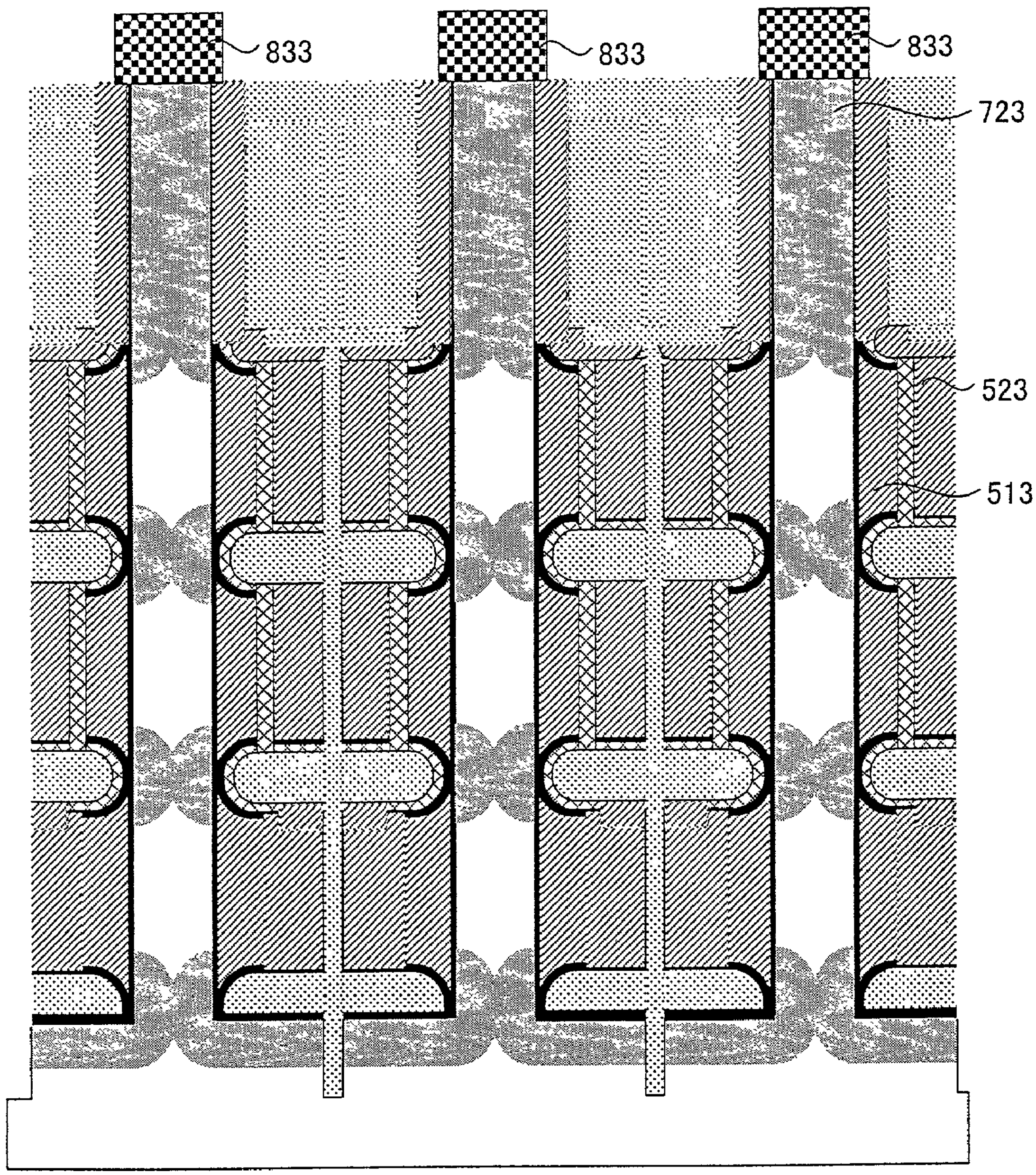
Figure 740:
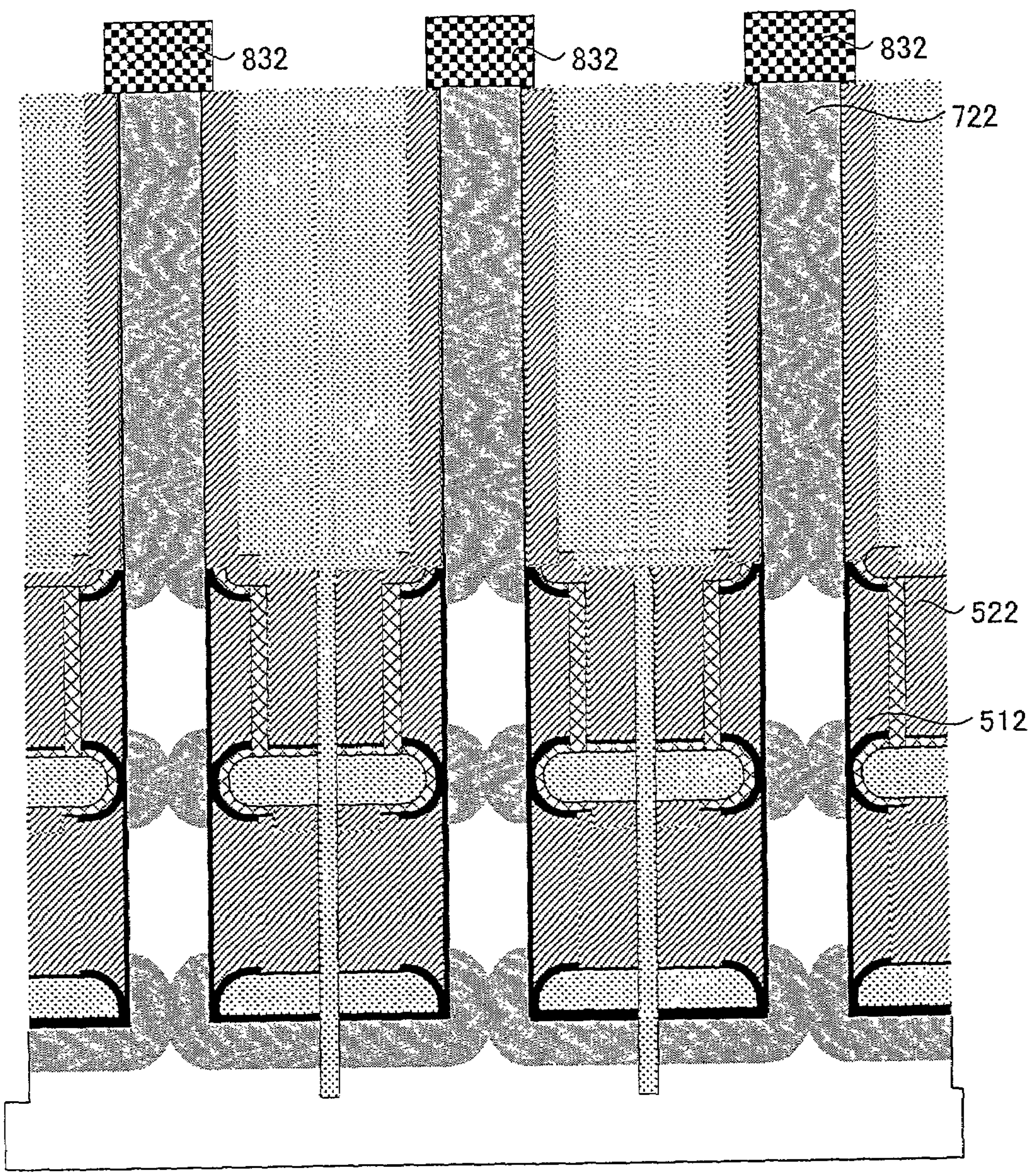
Figure 741:
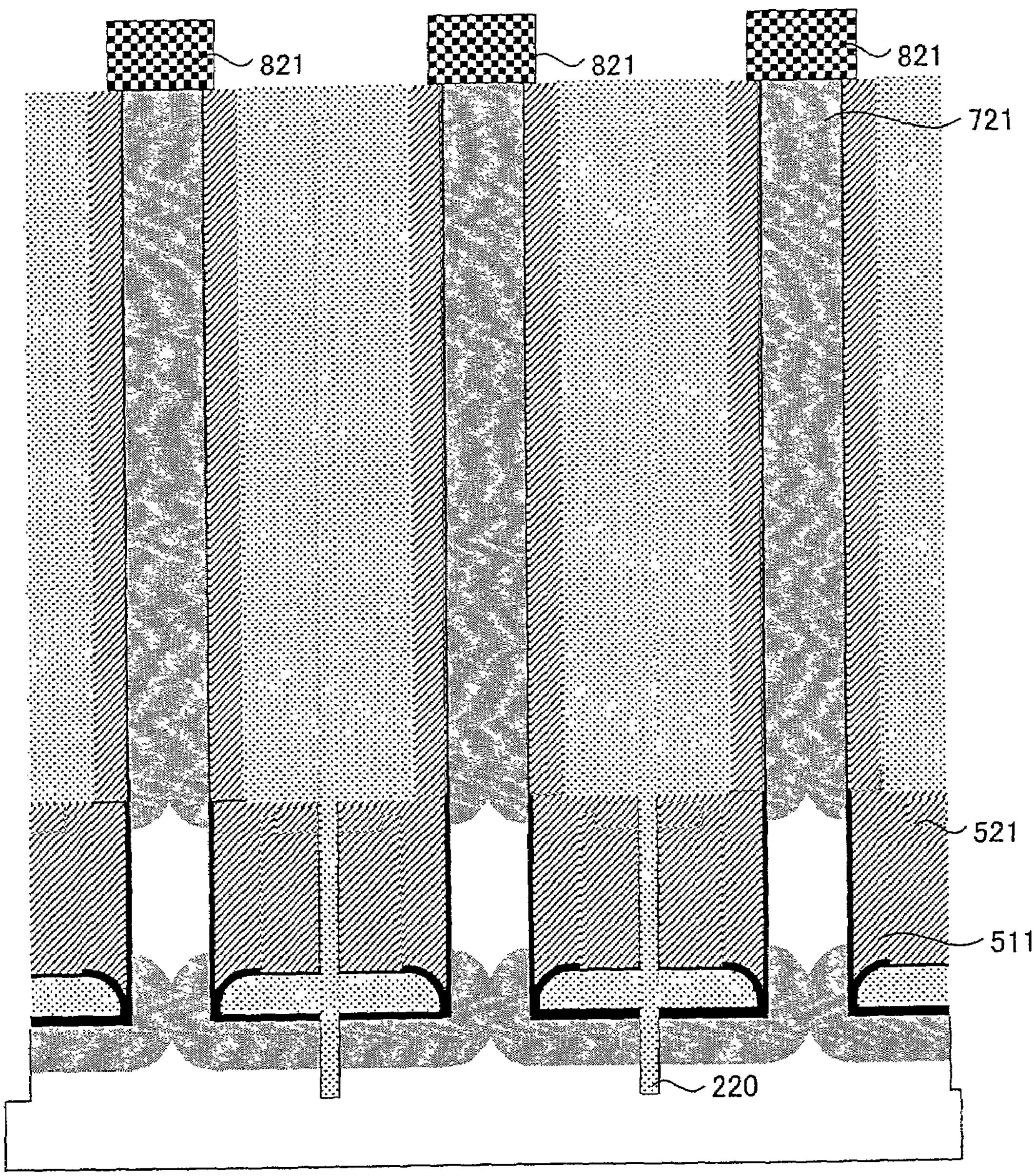
Figure 742:
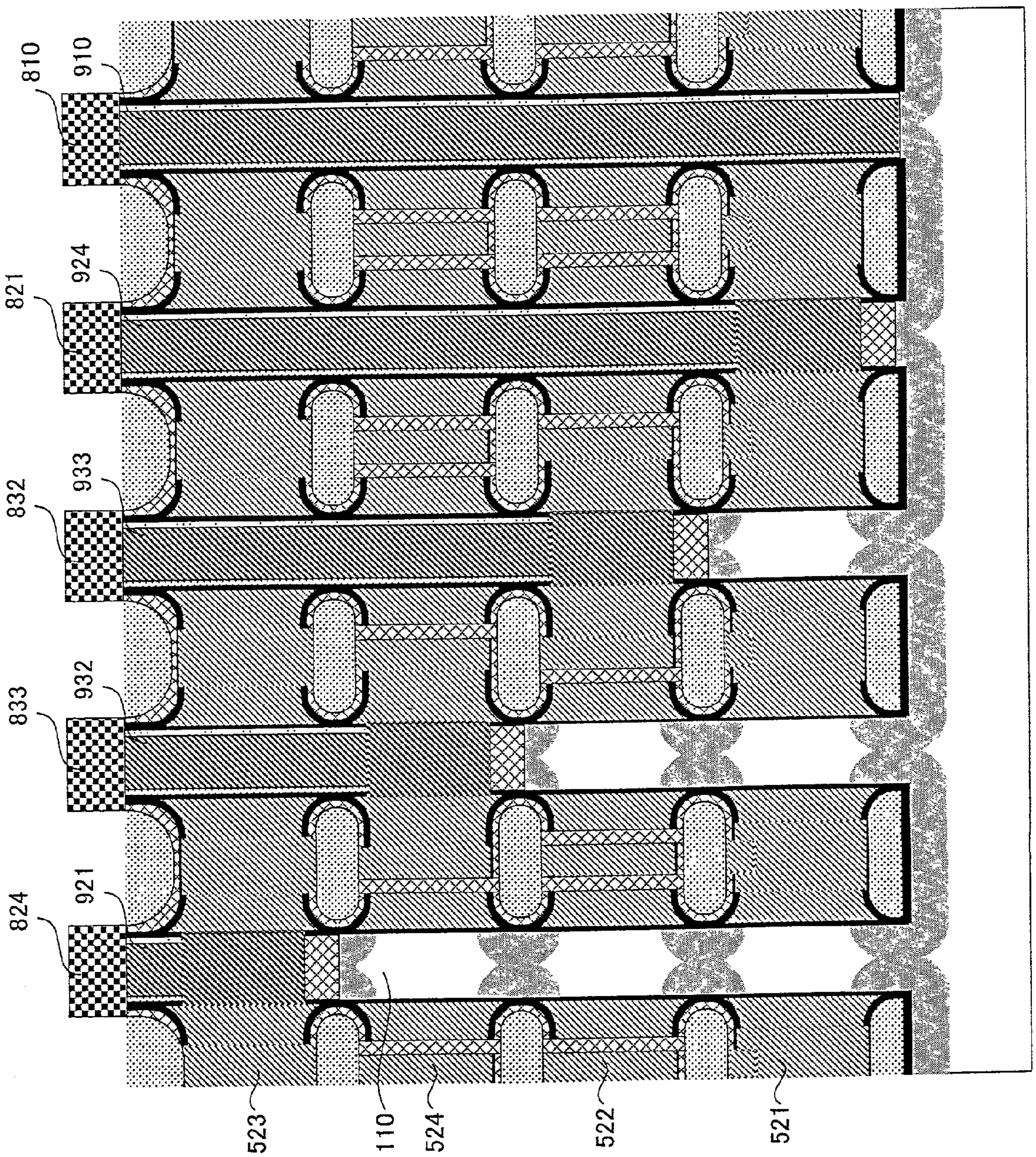
Figure 743:
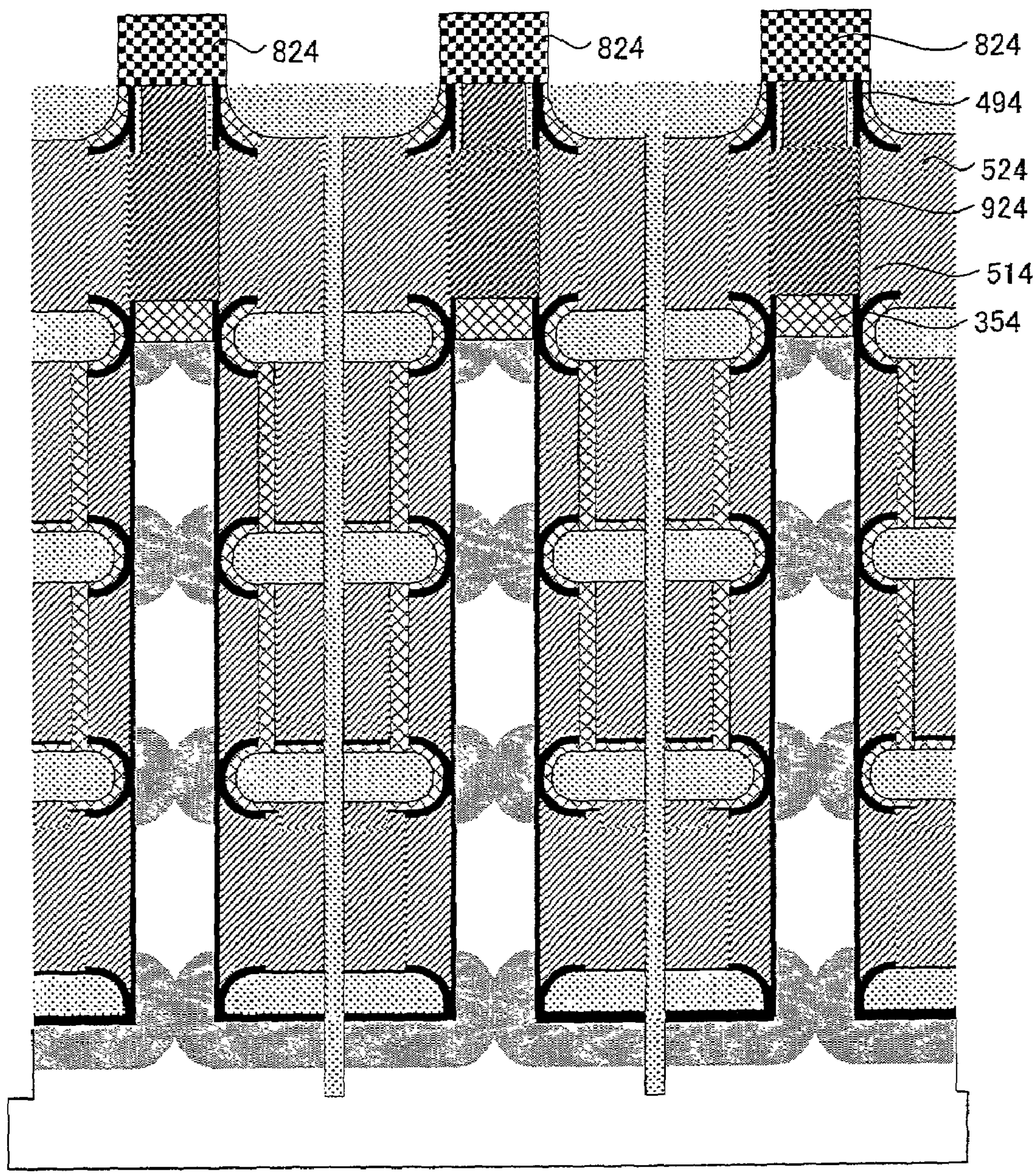
Figure 744:
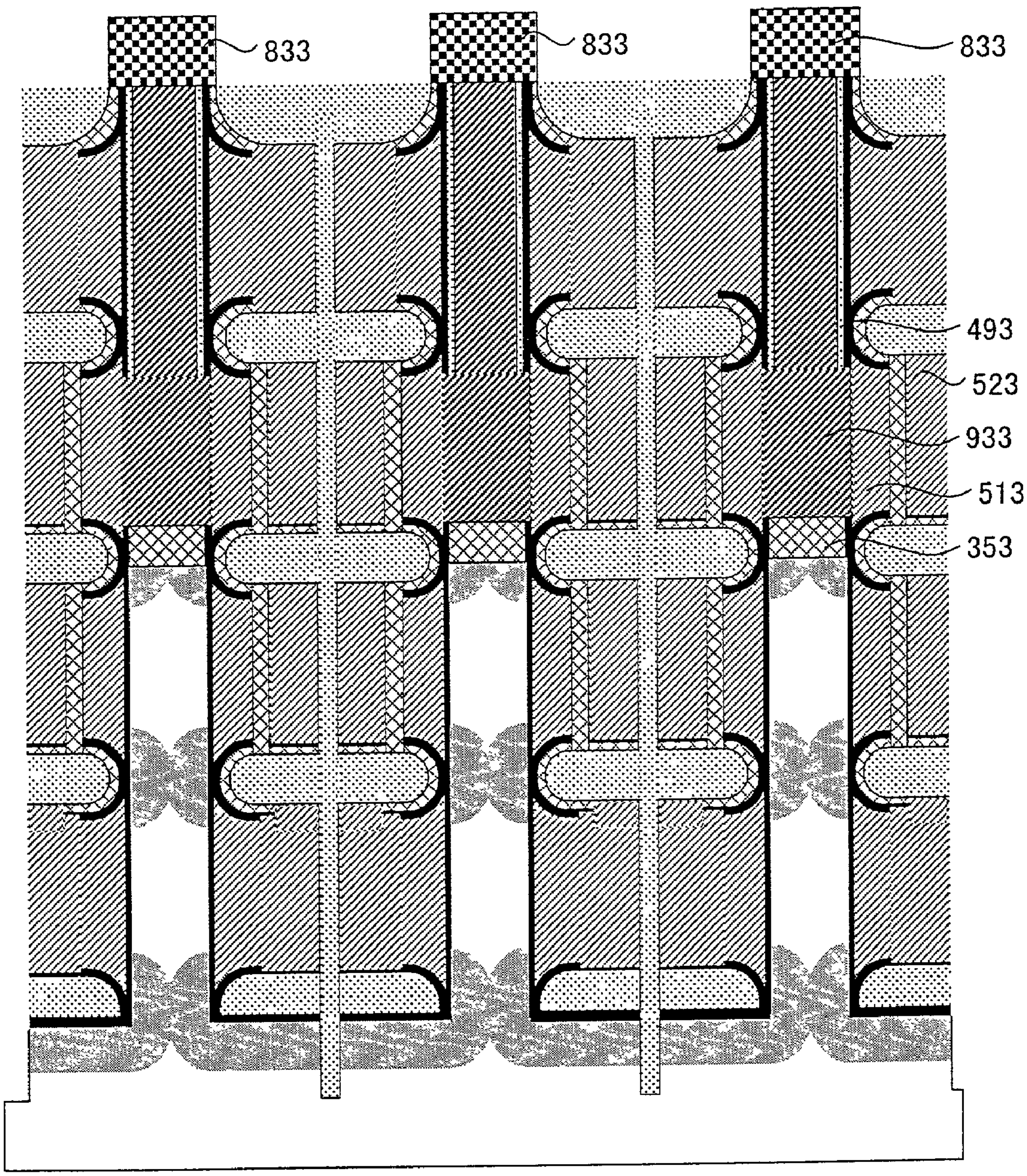
Figure 745:
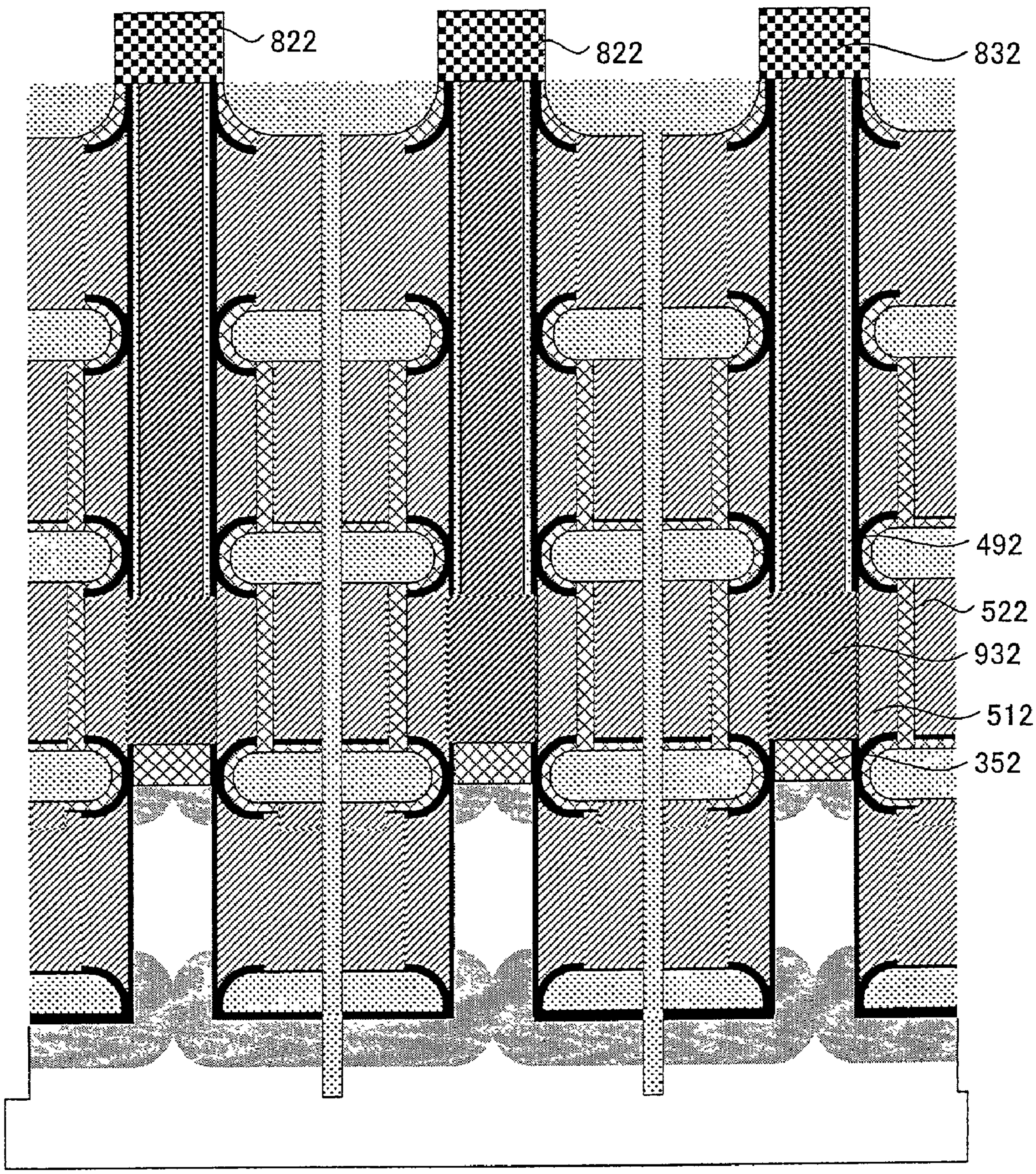
Figure 746:
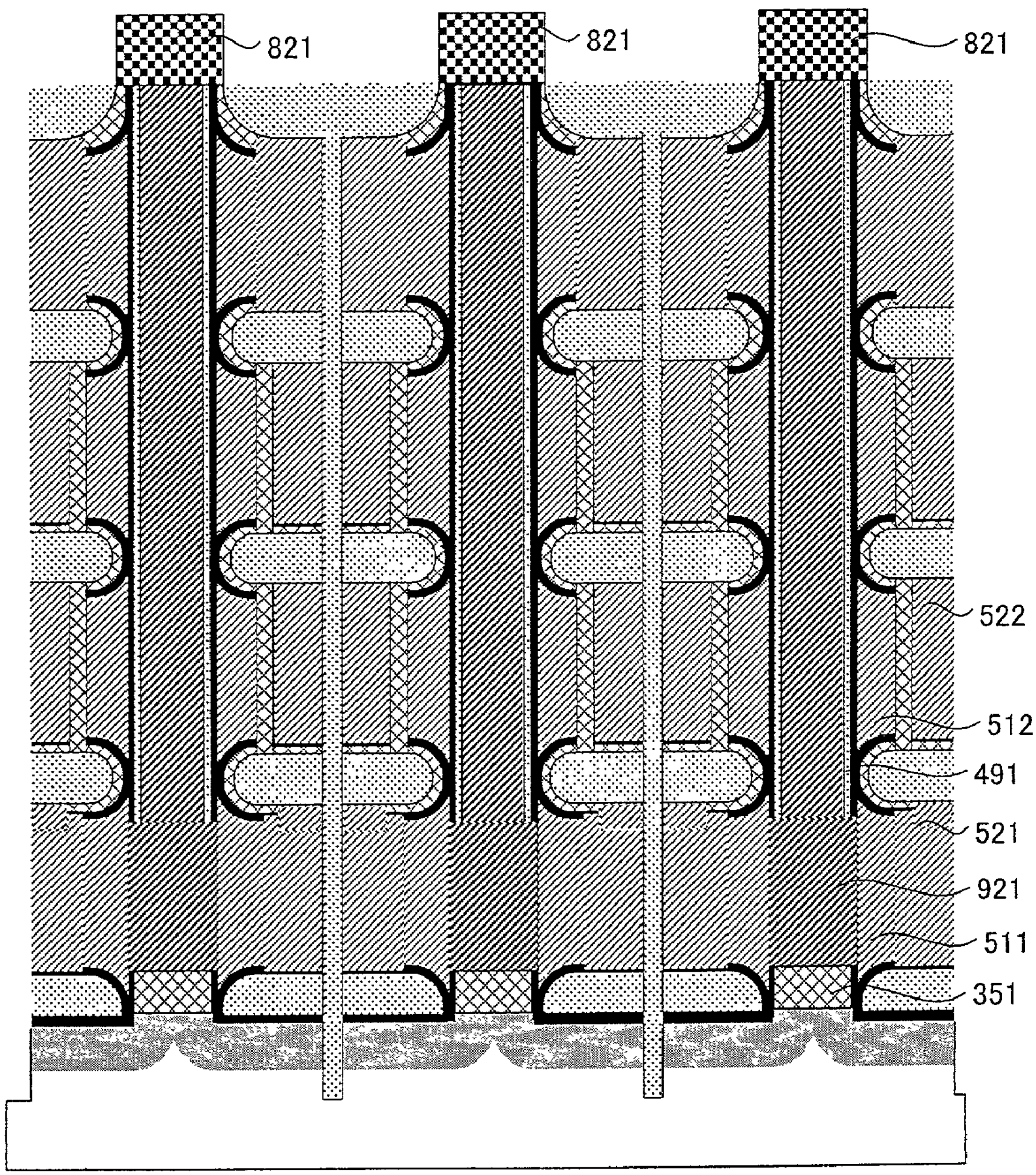
Figure 747:
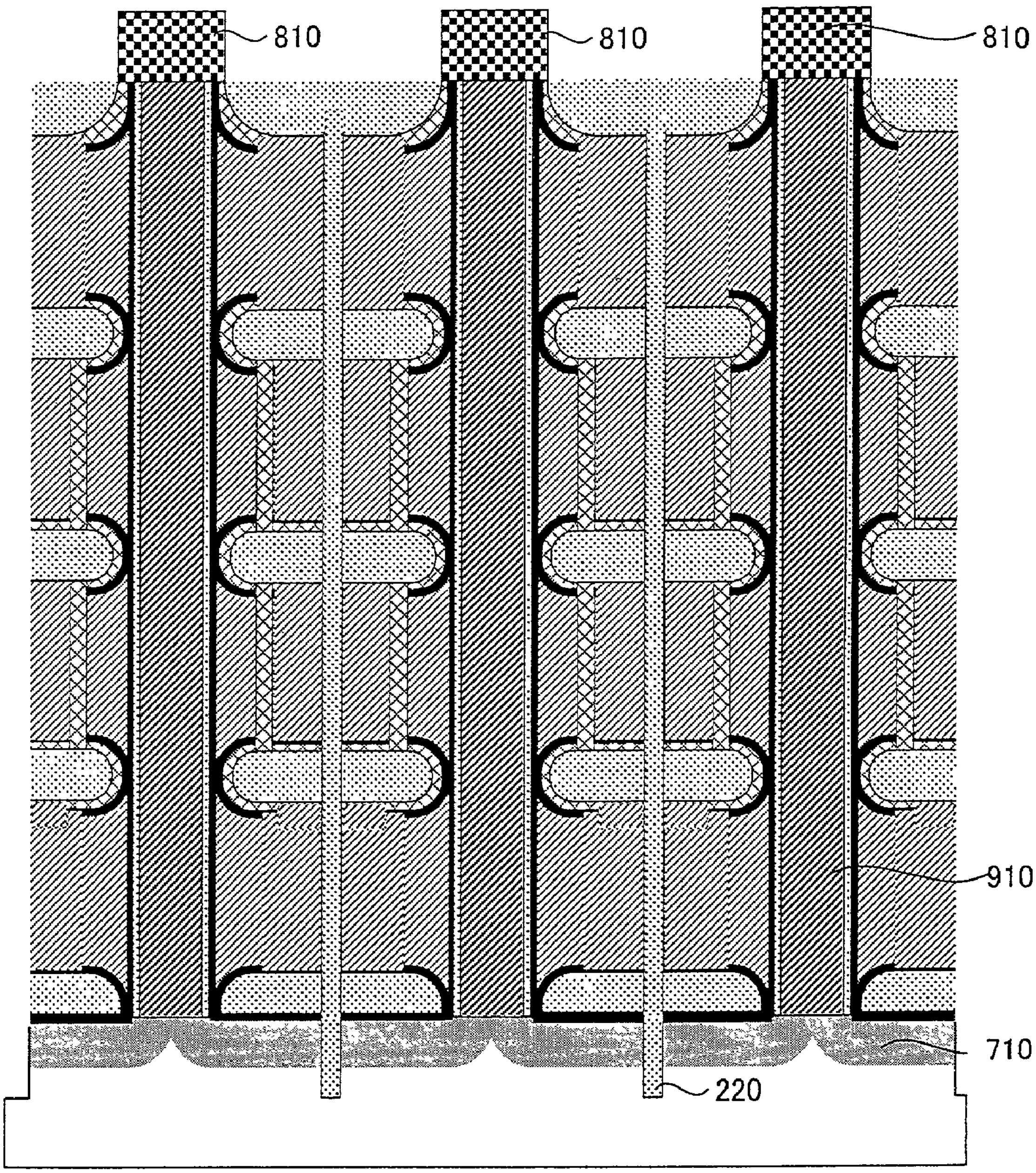
Figure 748:
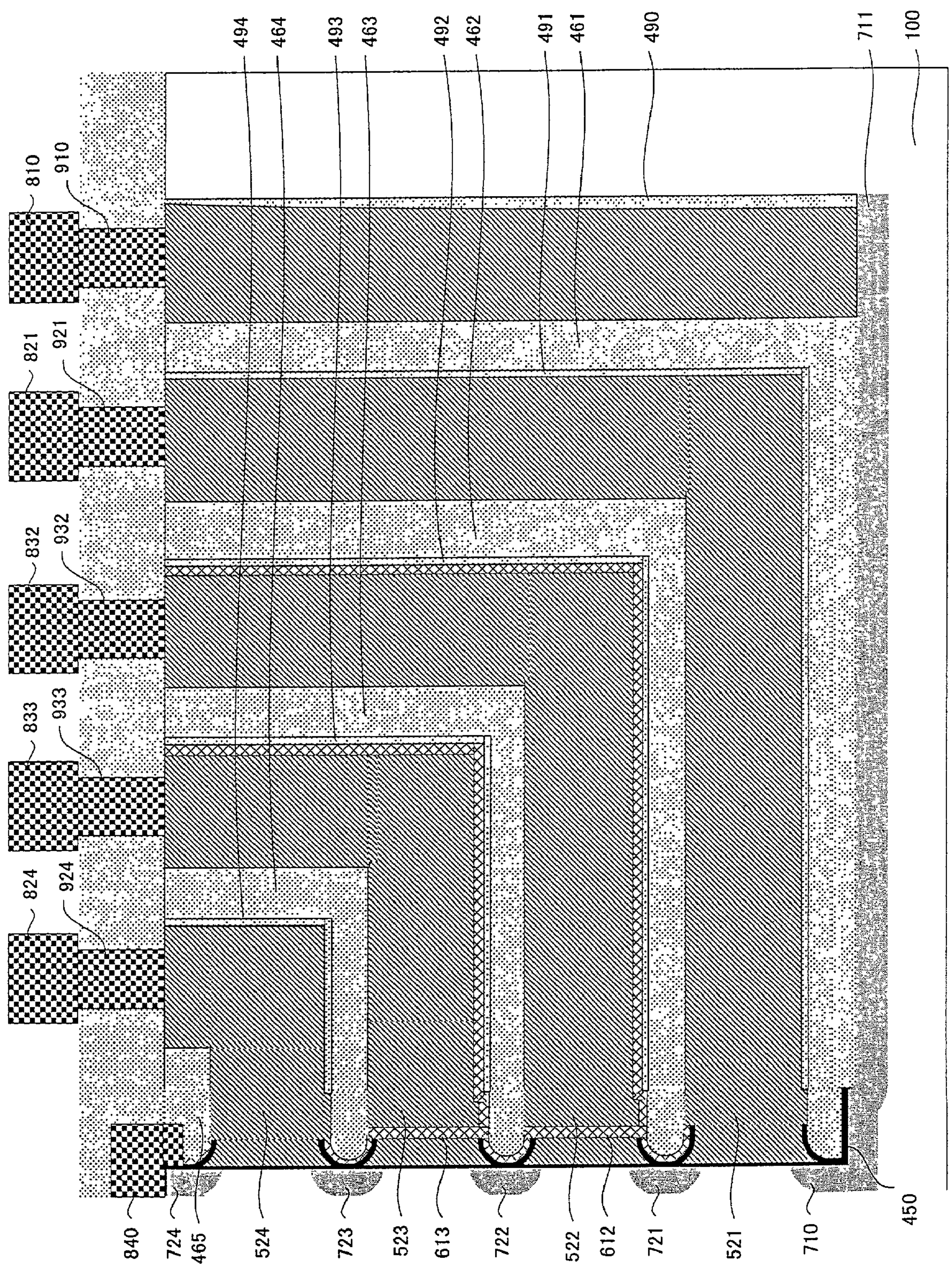
Figure 749:
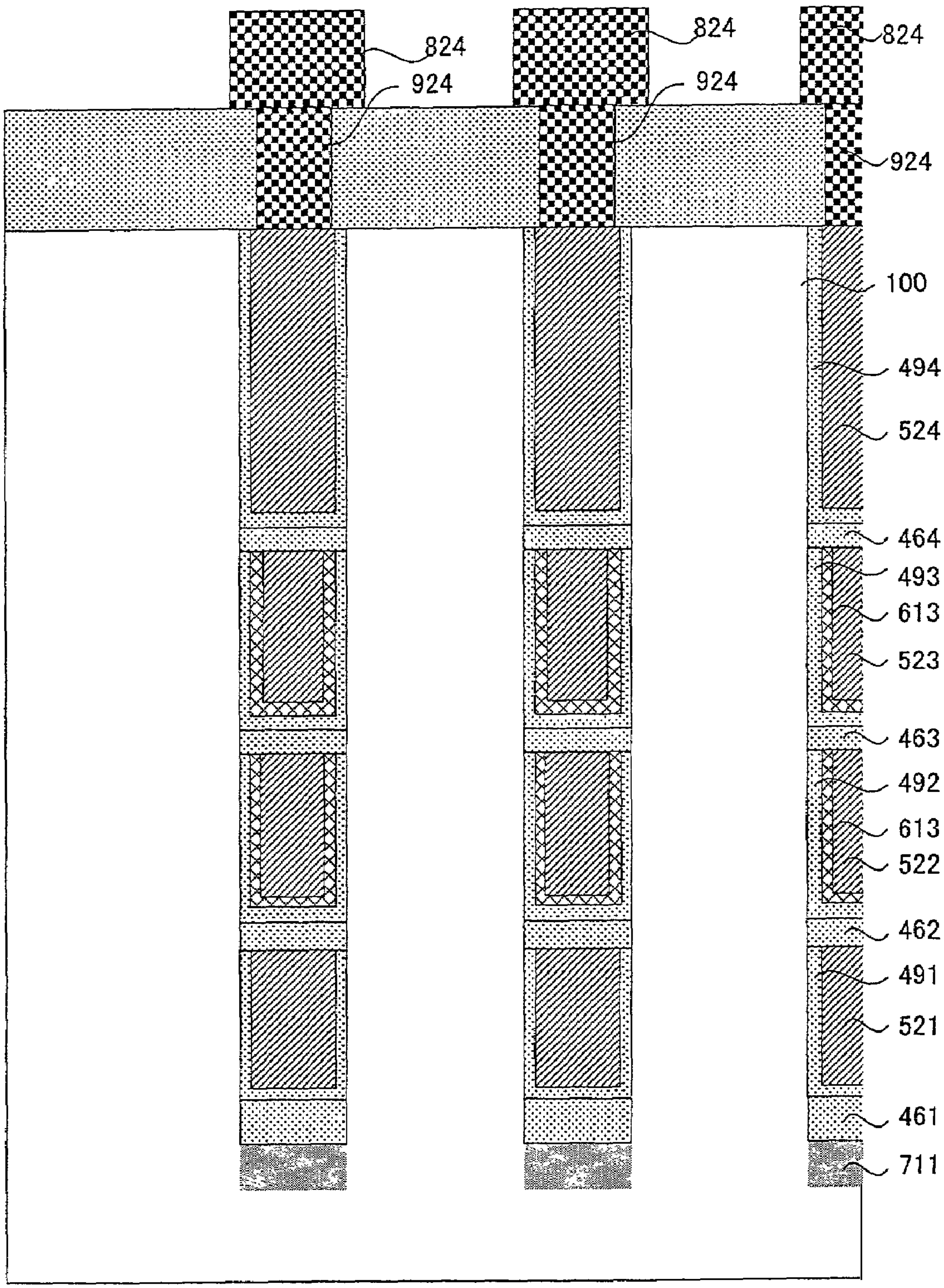
Figure 750:
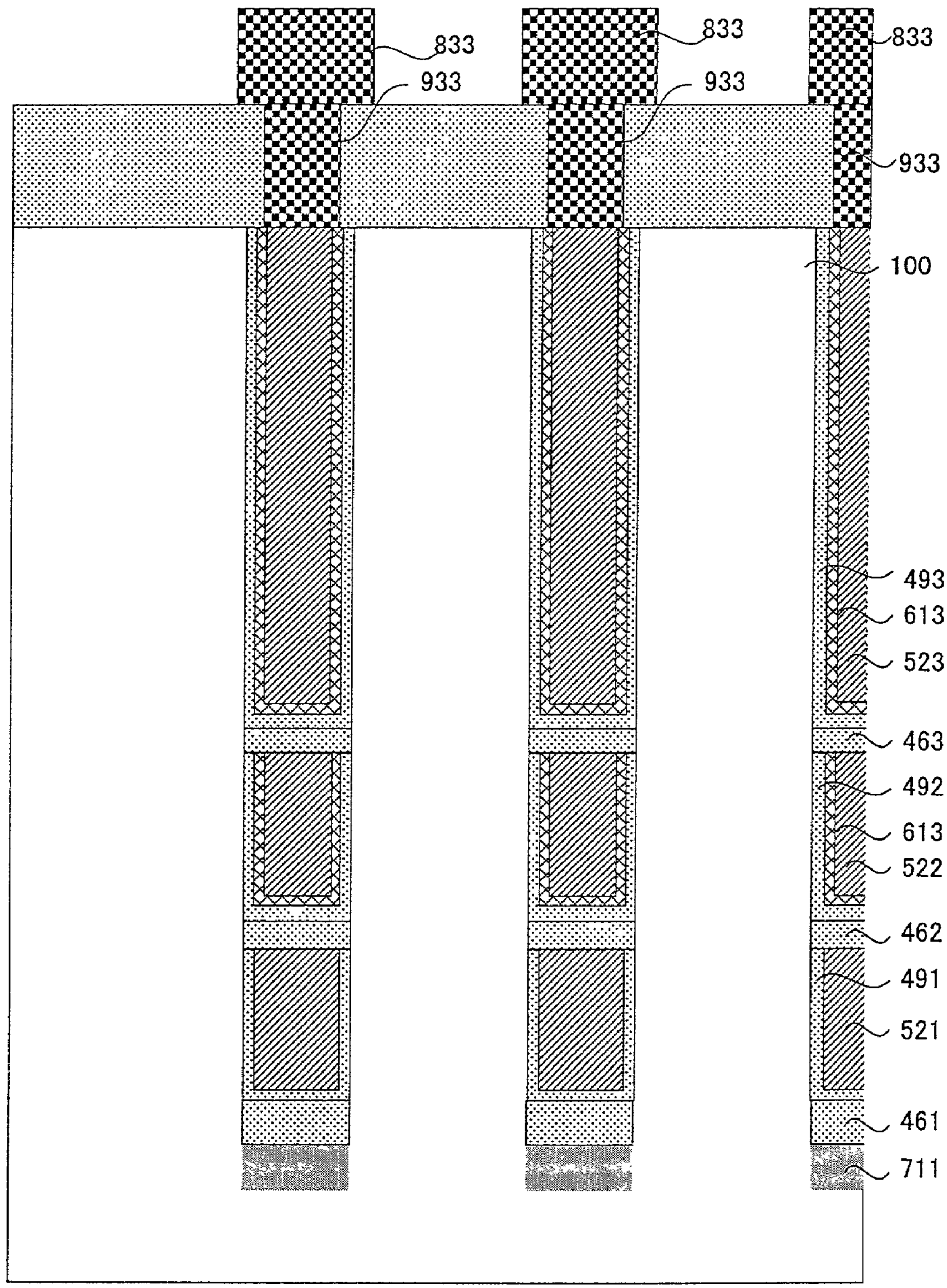
Figure 751:
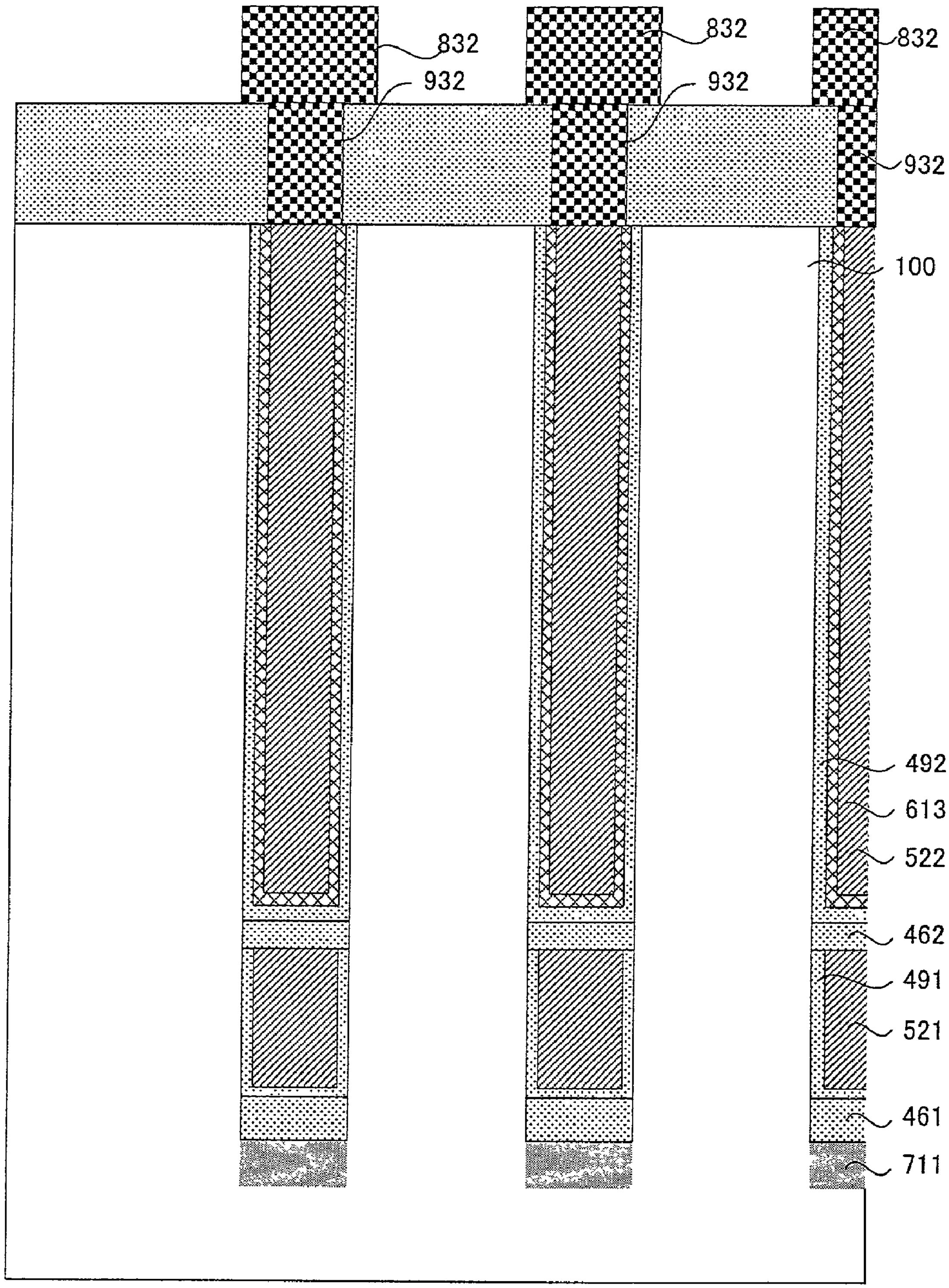
Figure 752:
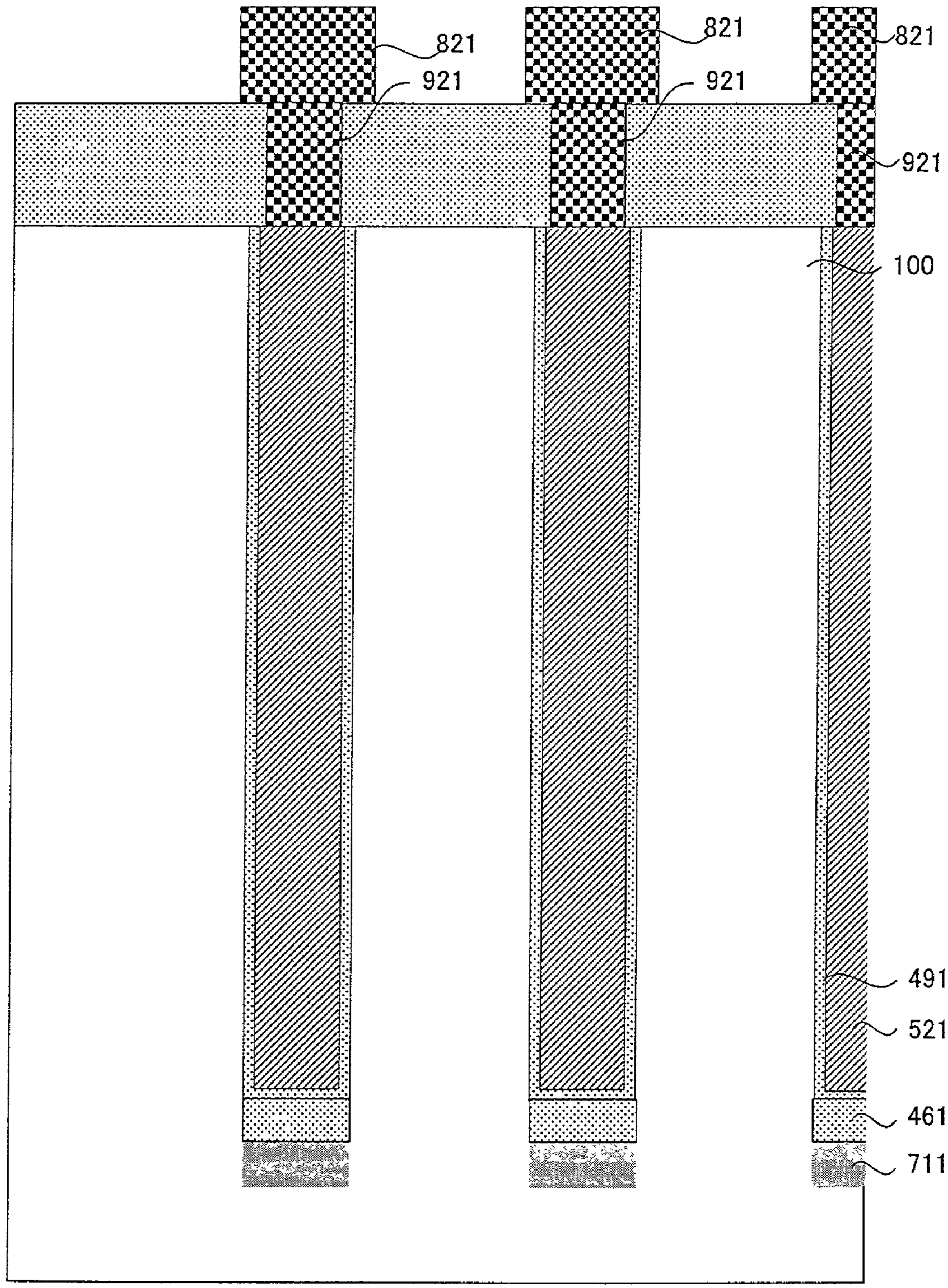
Figure 753:
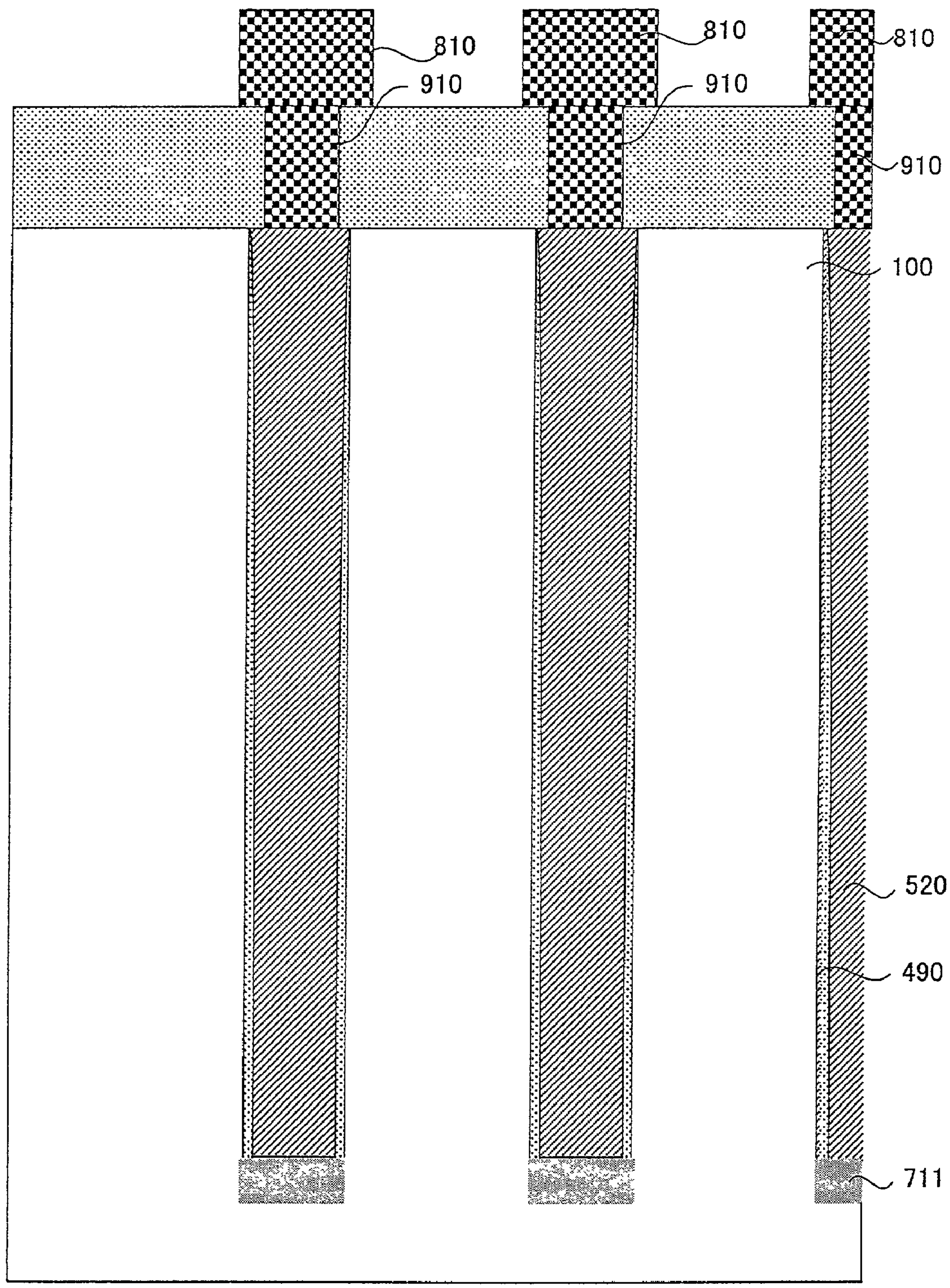
Figure 754:
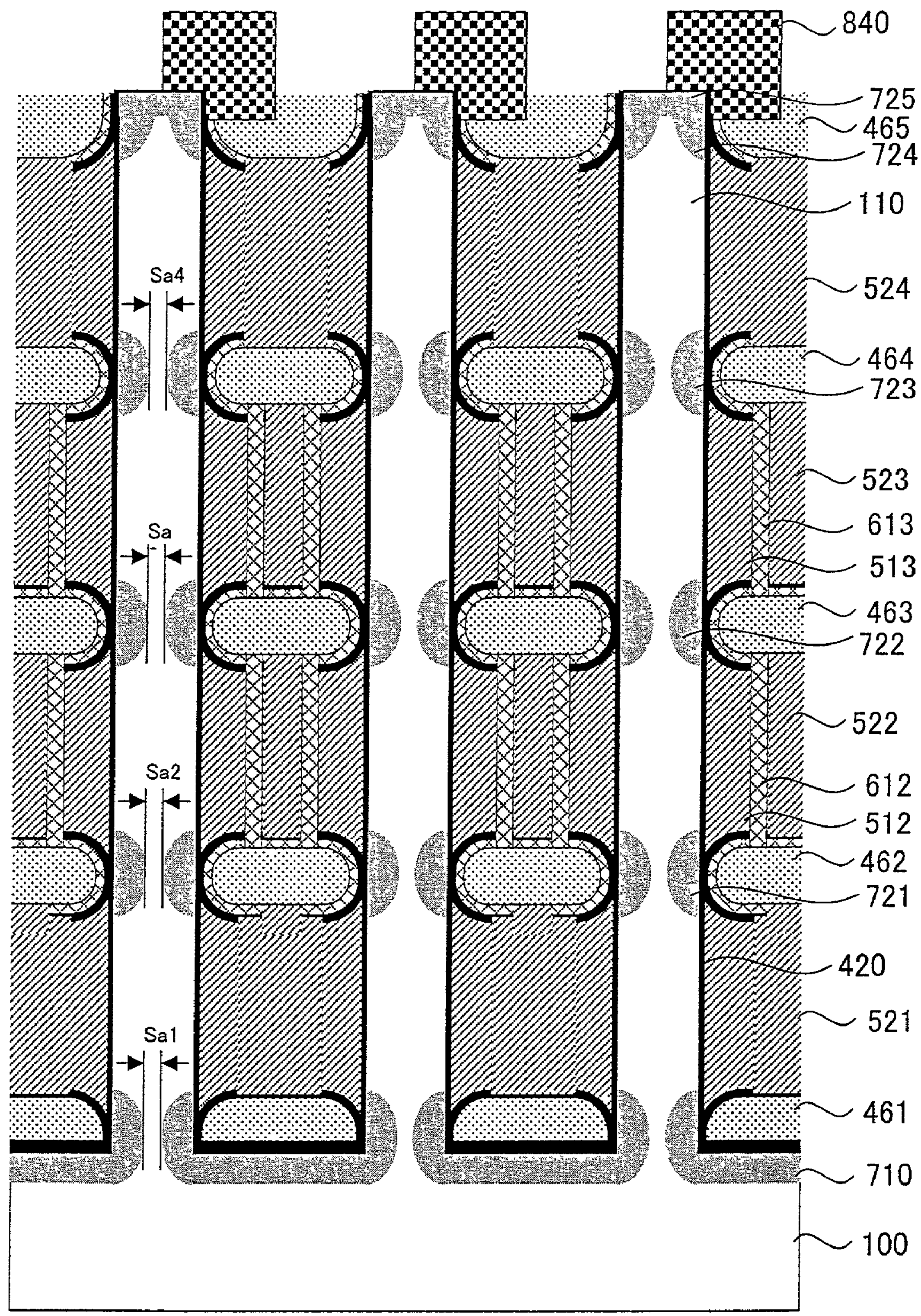
Figure 755:
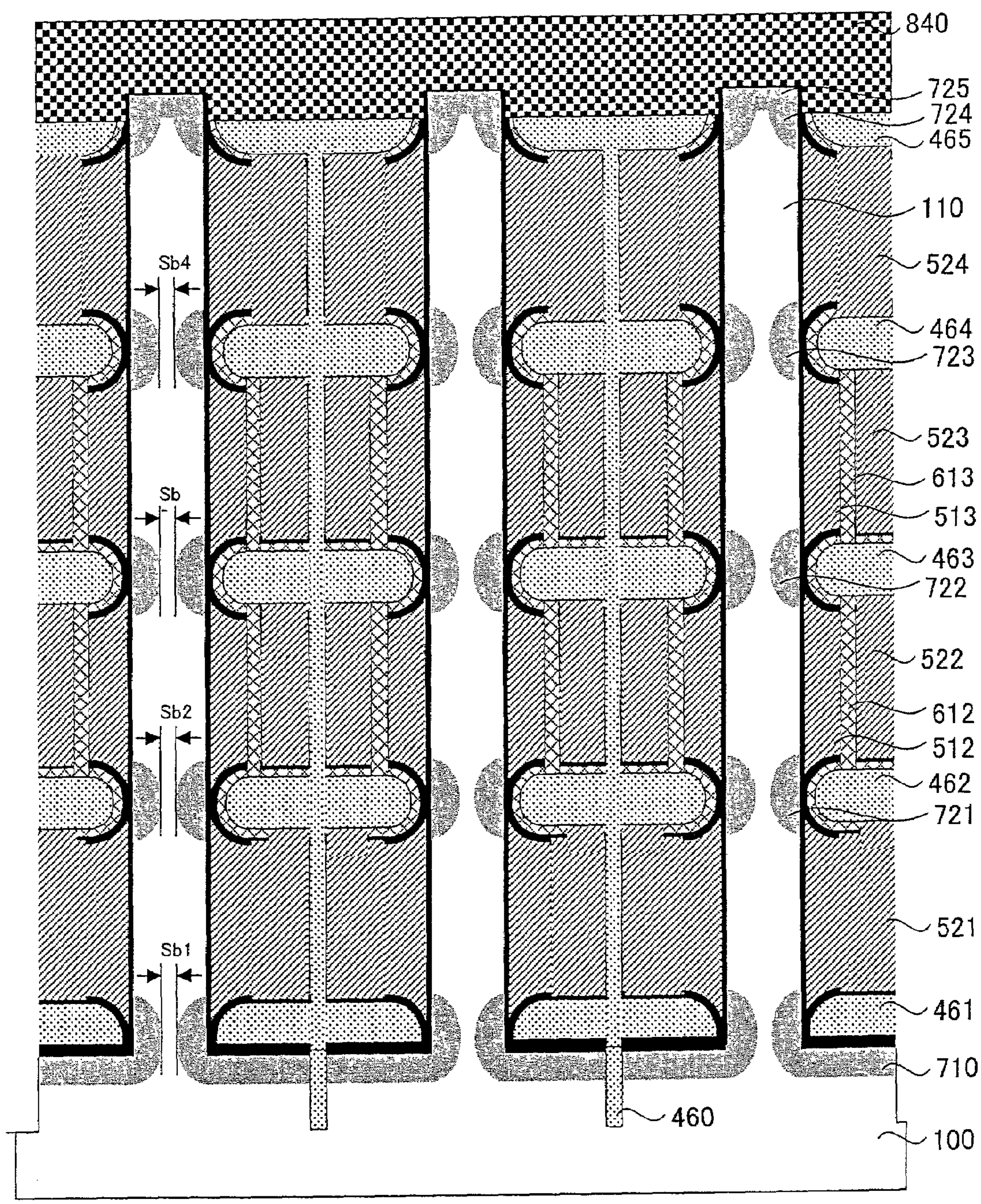
Figure 774:
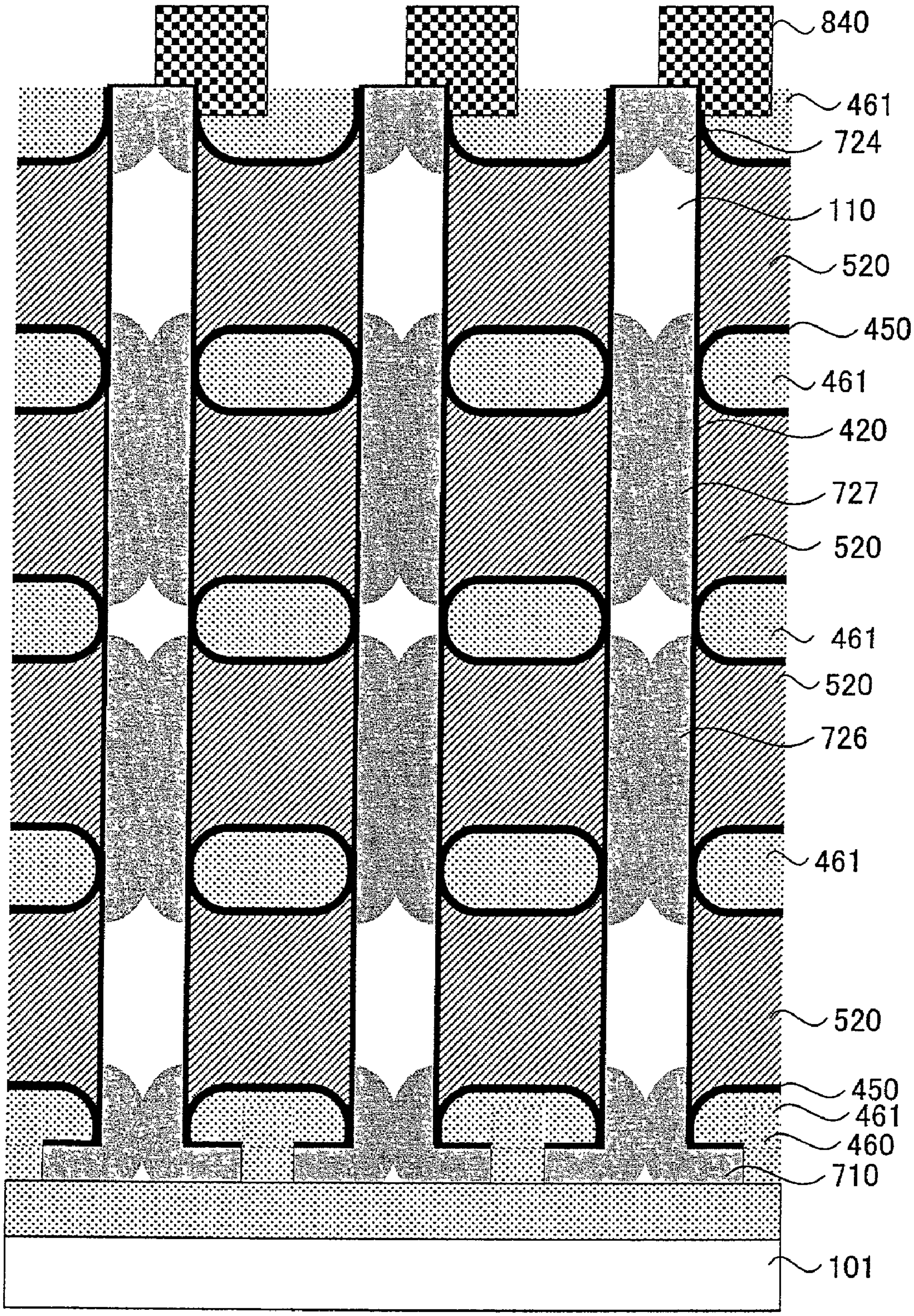
Figure 775:
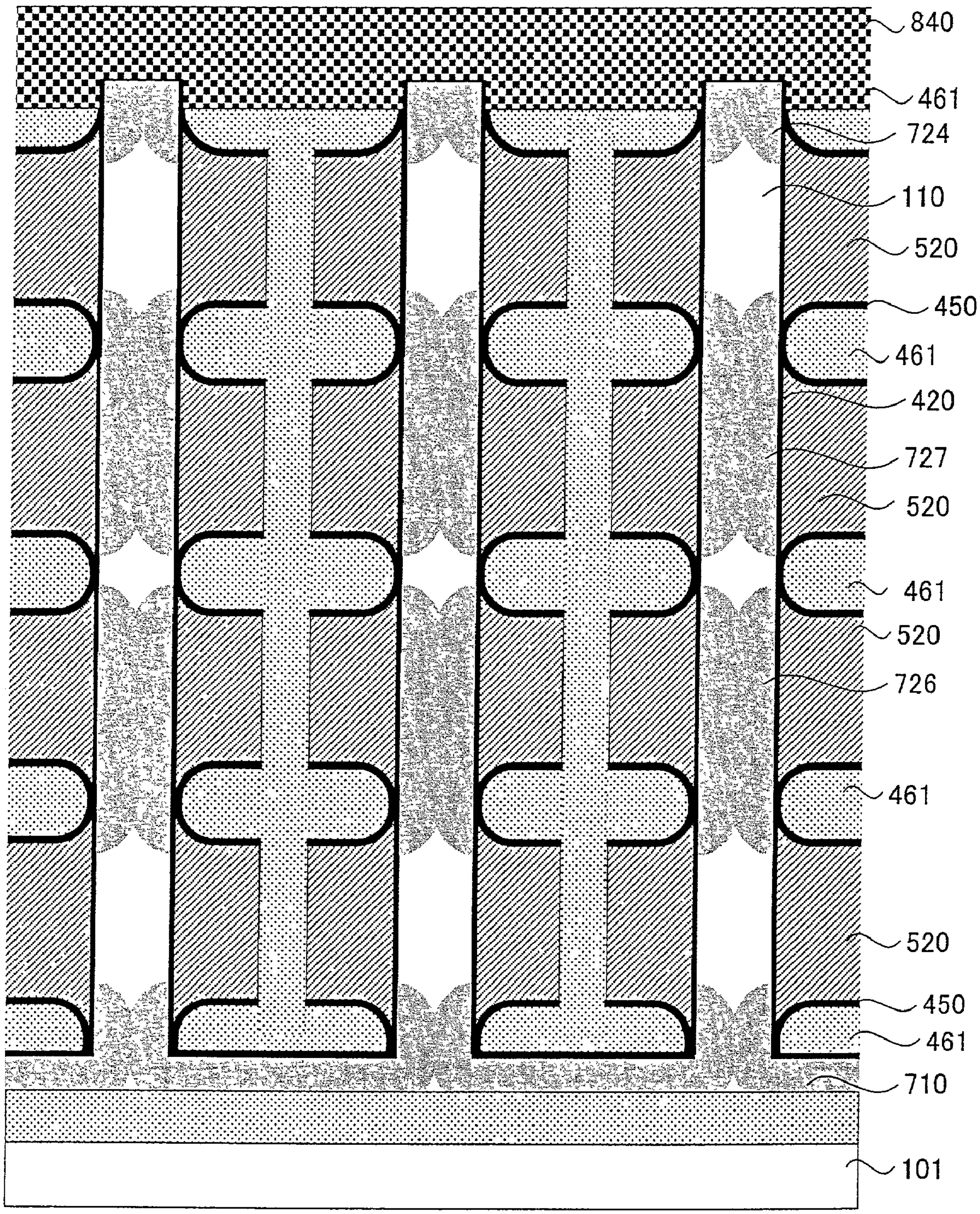
Figure 776:
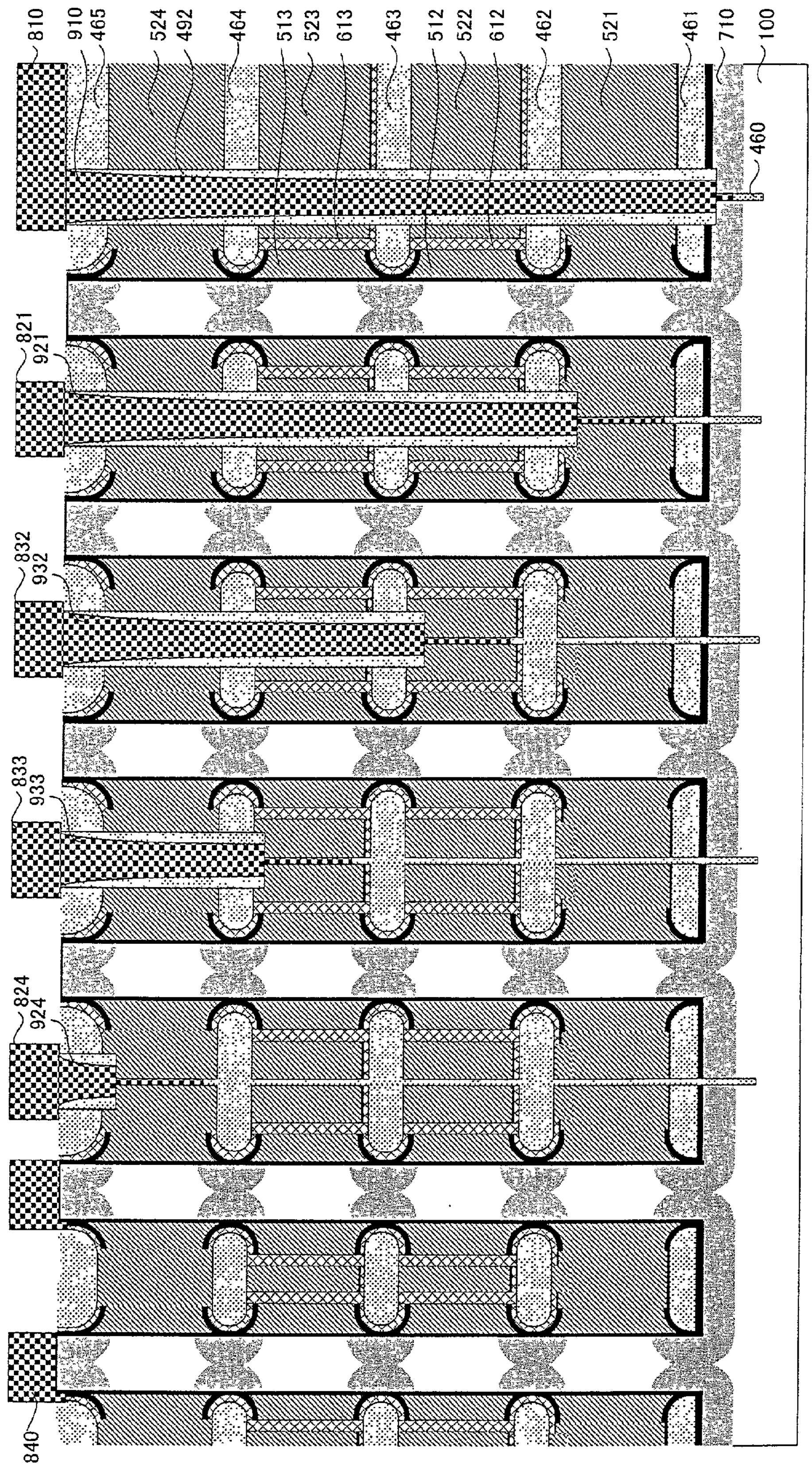
Figure 777:
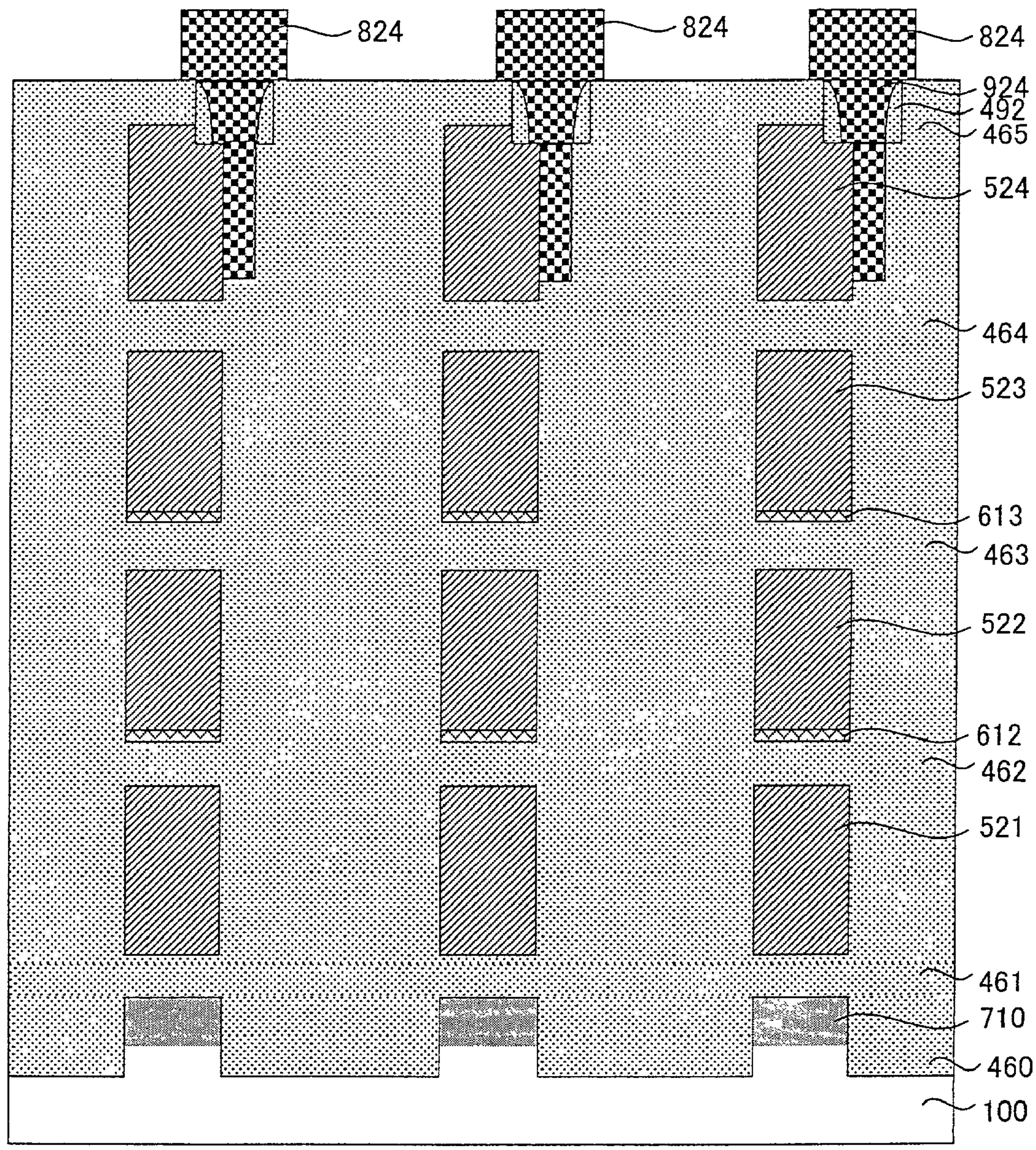
Figure 778:
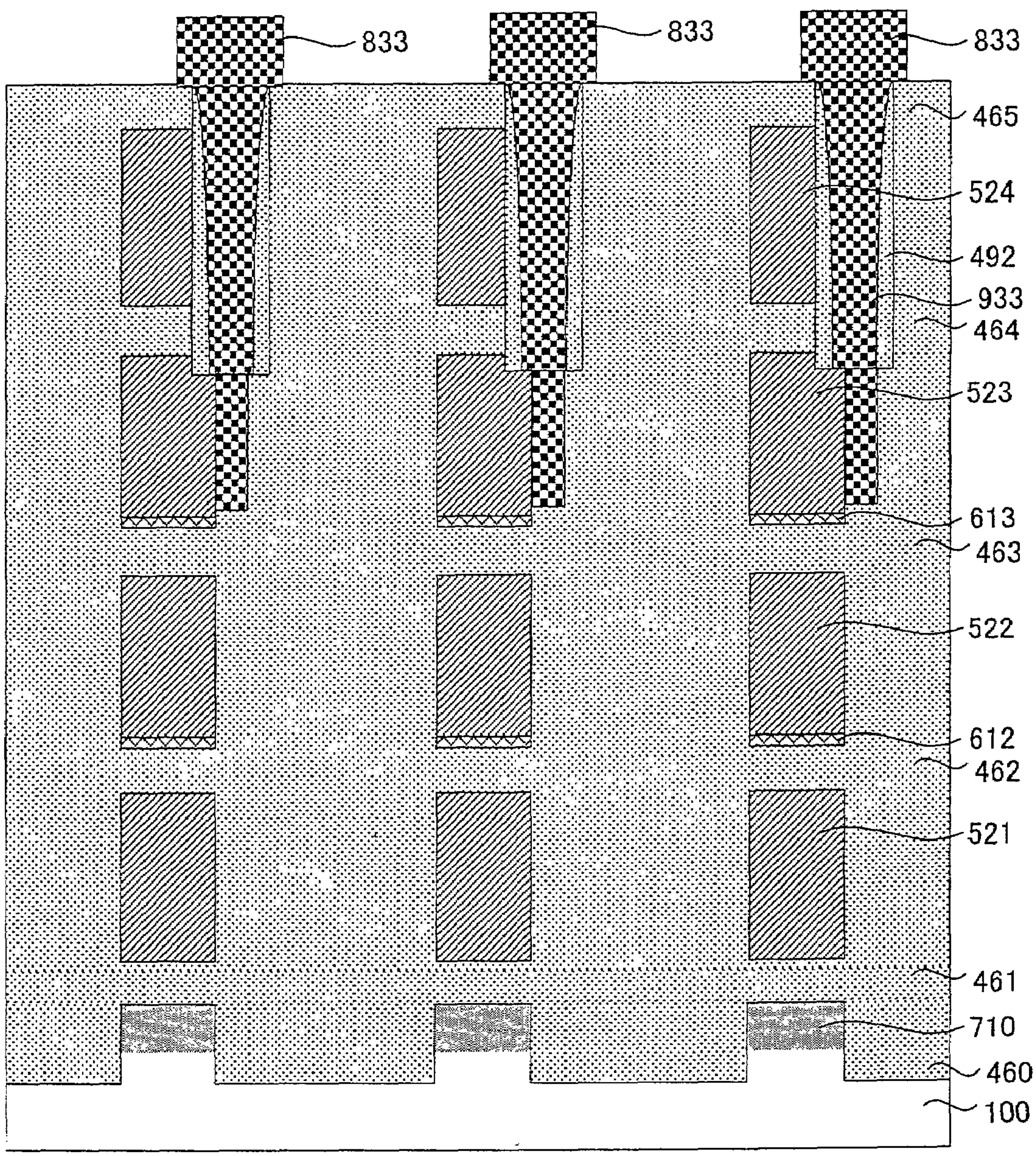
Figure 779:
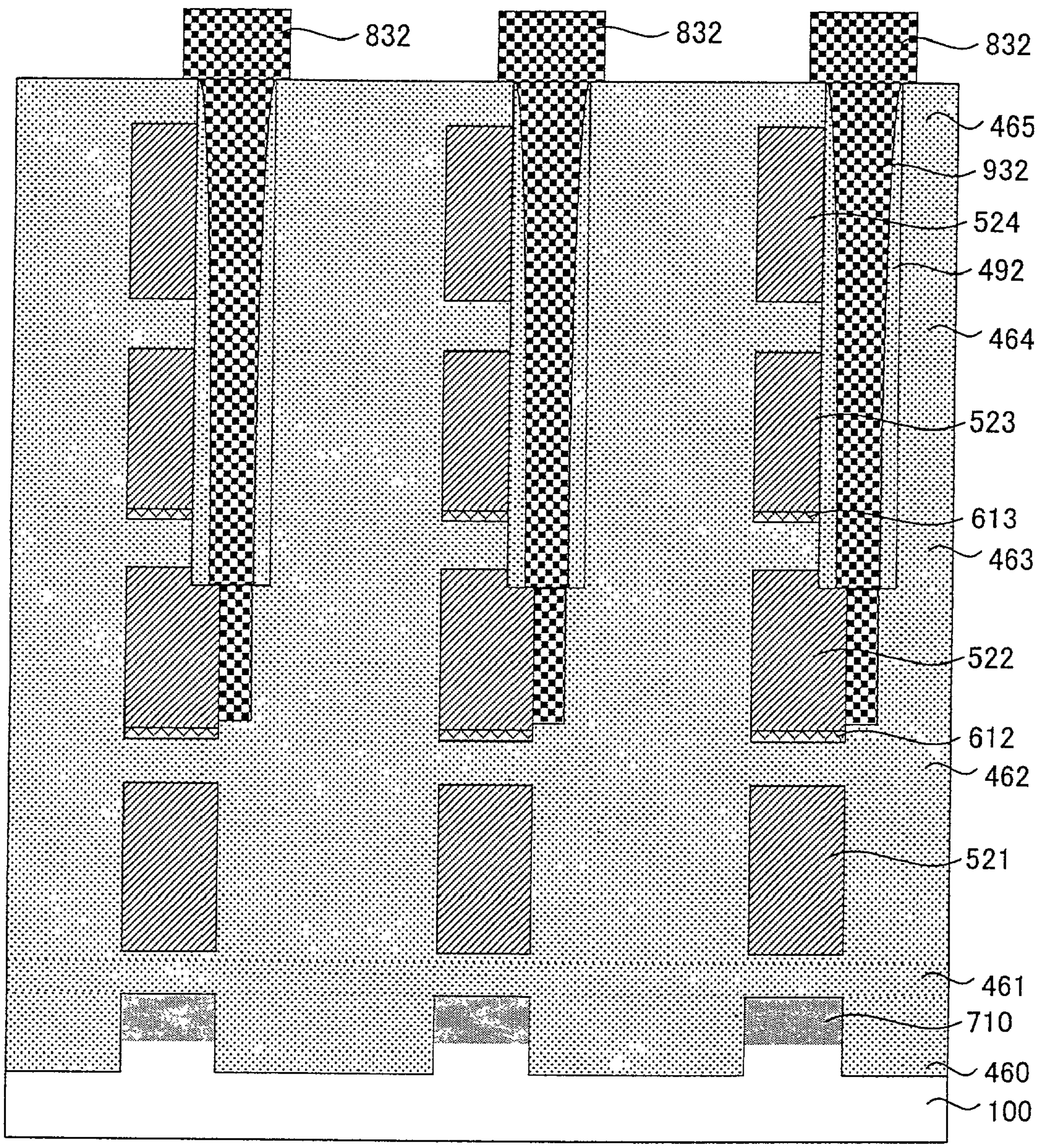
Figure 780:
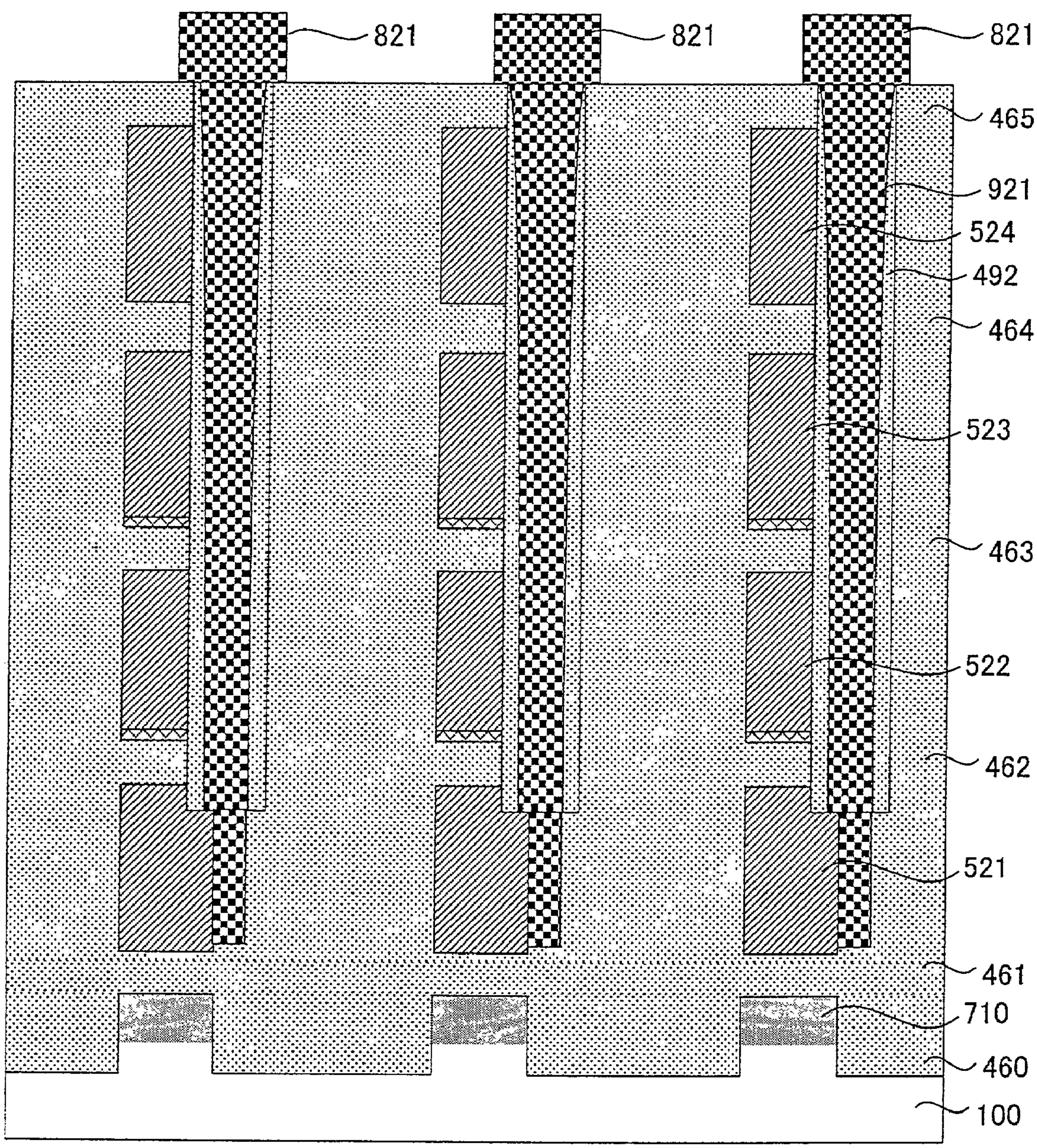
Figure 781:
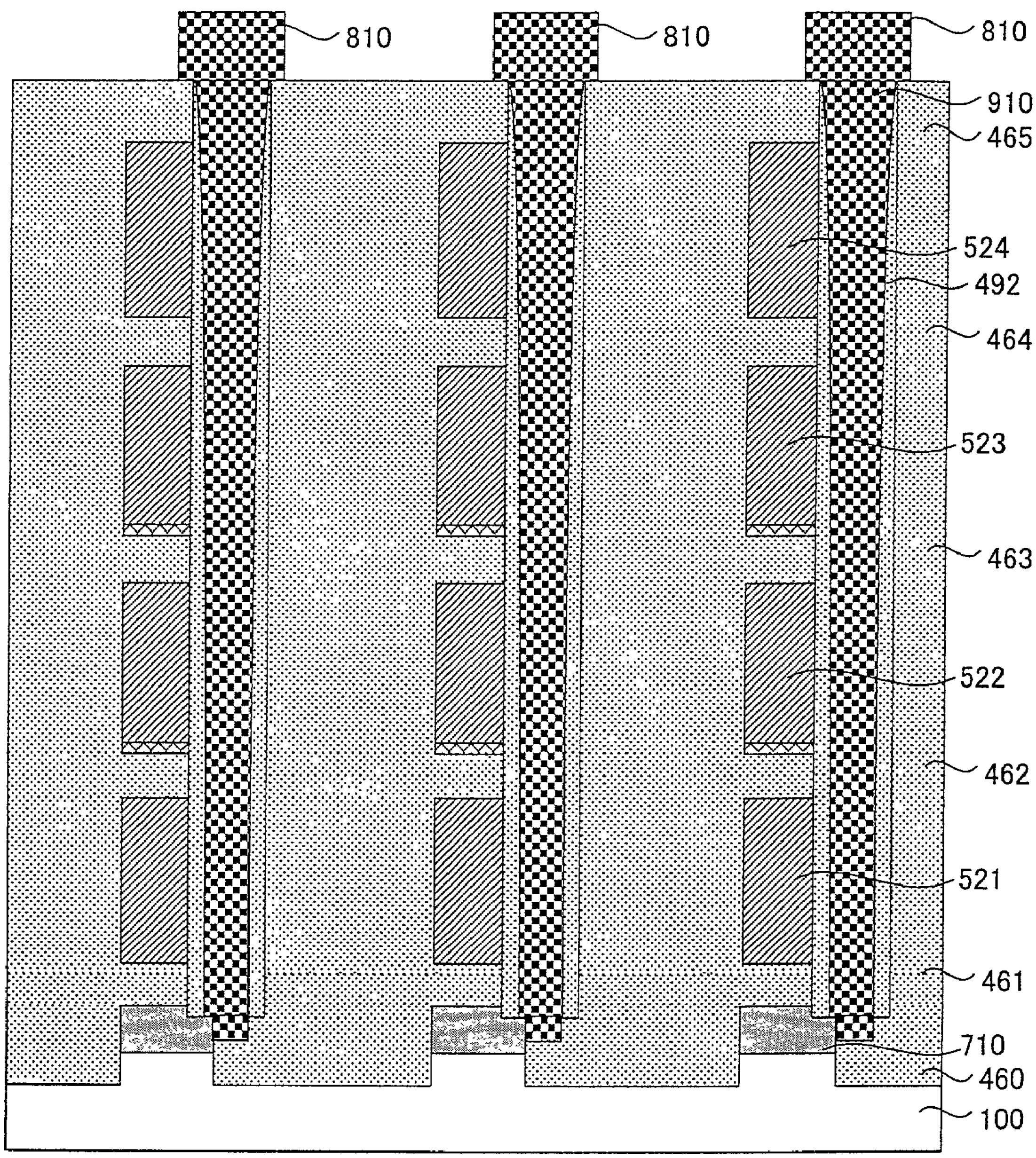
Figure 782:
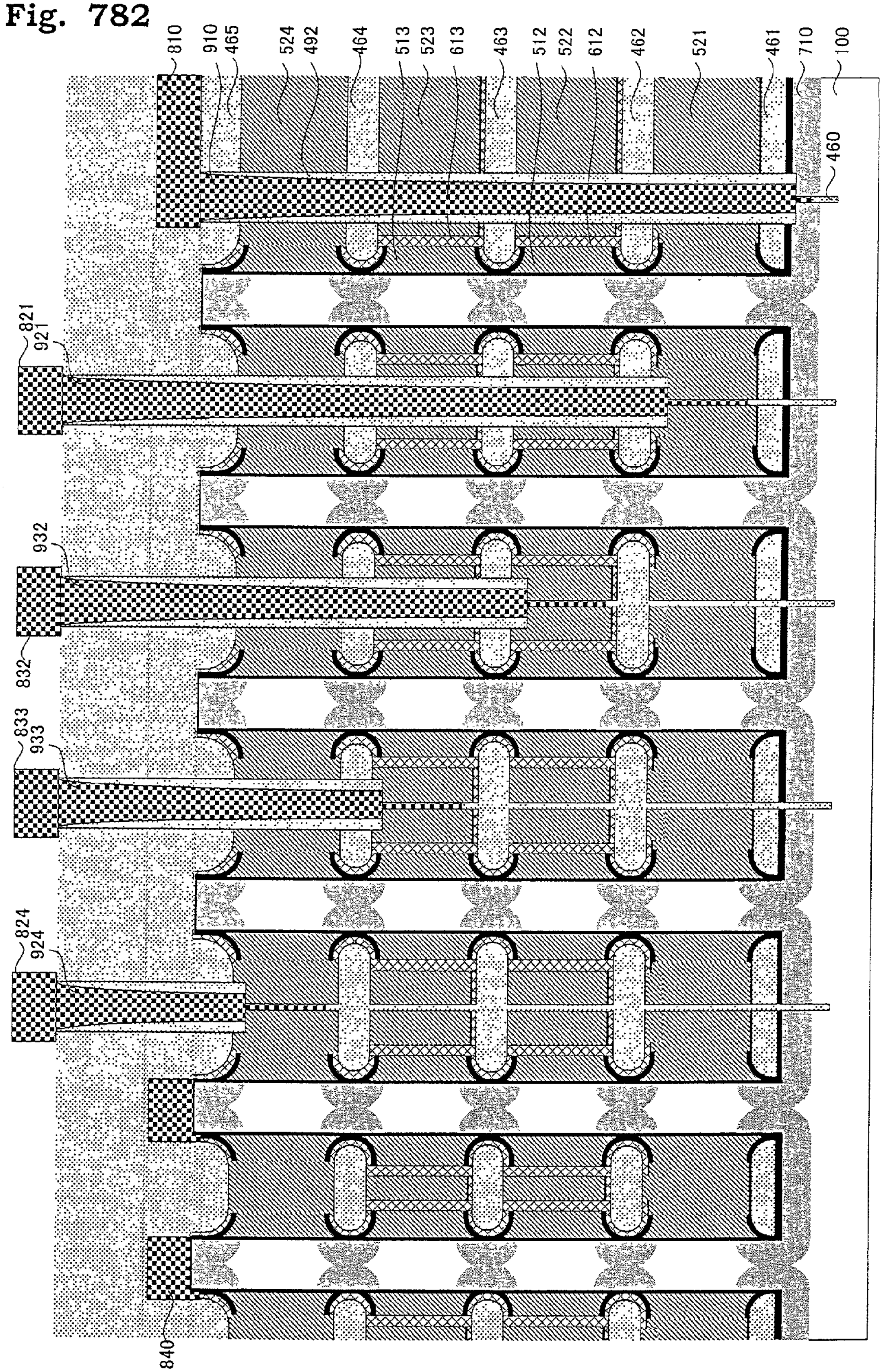
Figure 783:
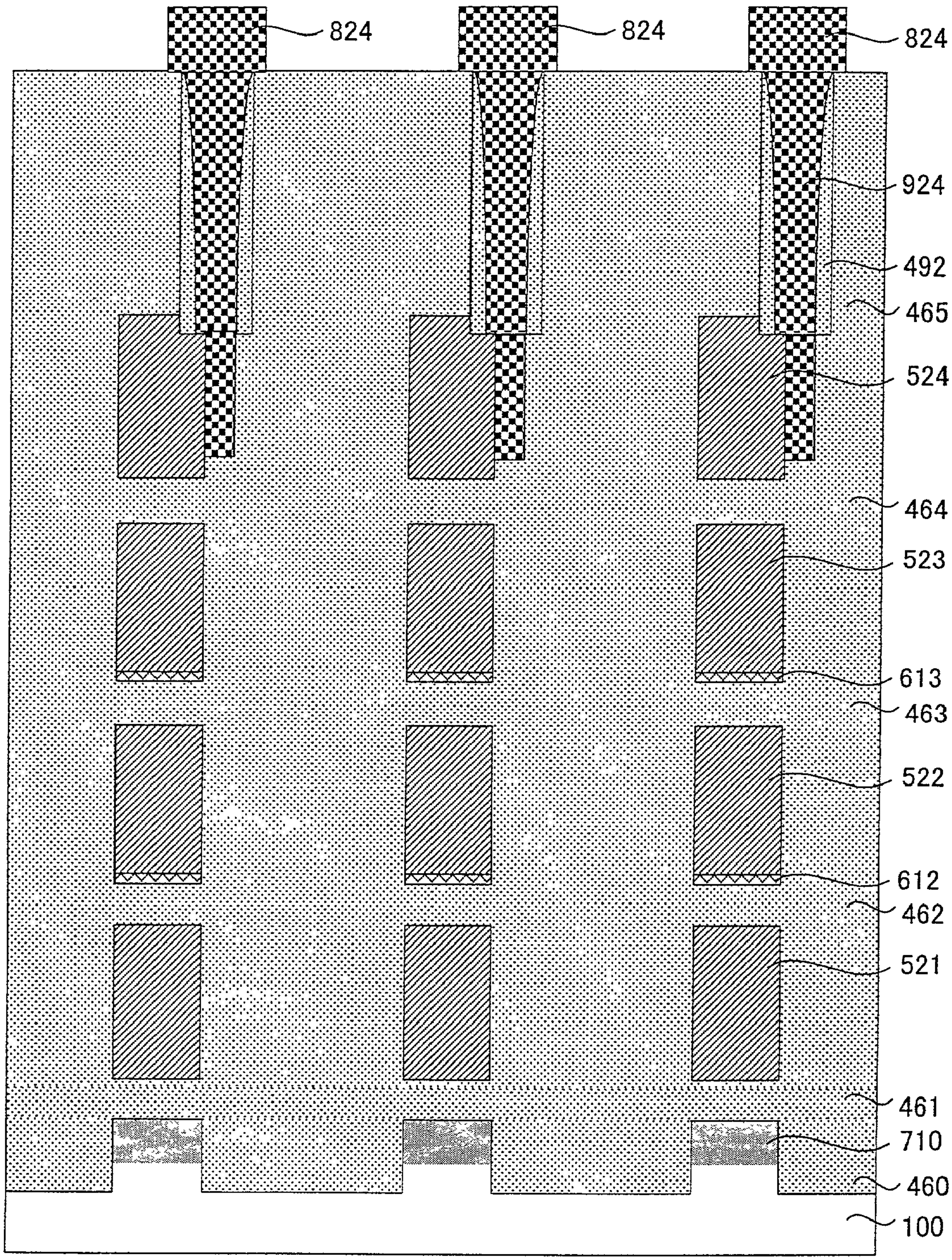
Figure 784:
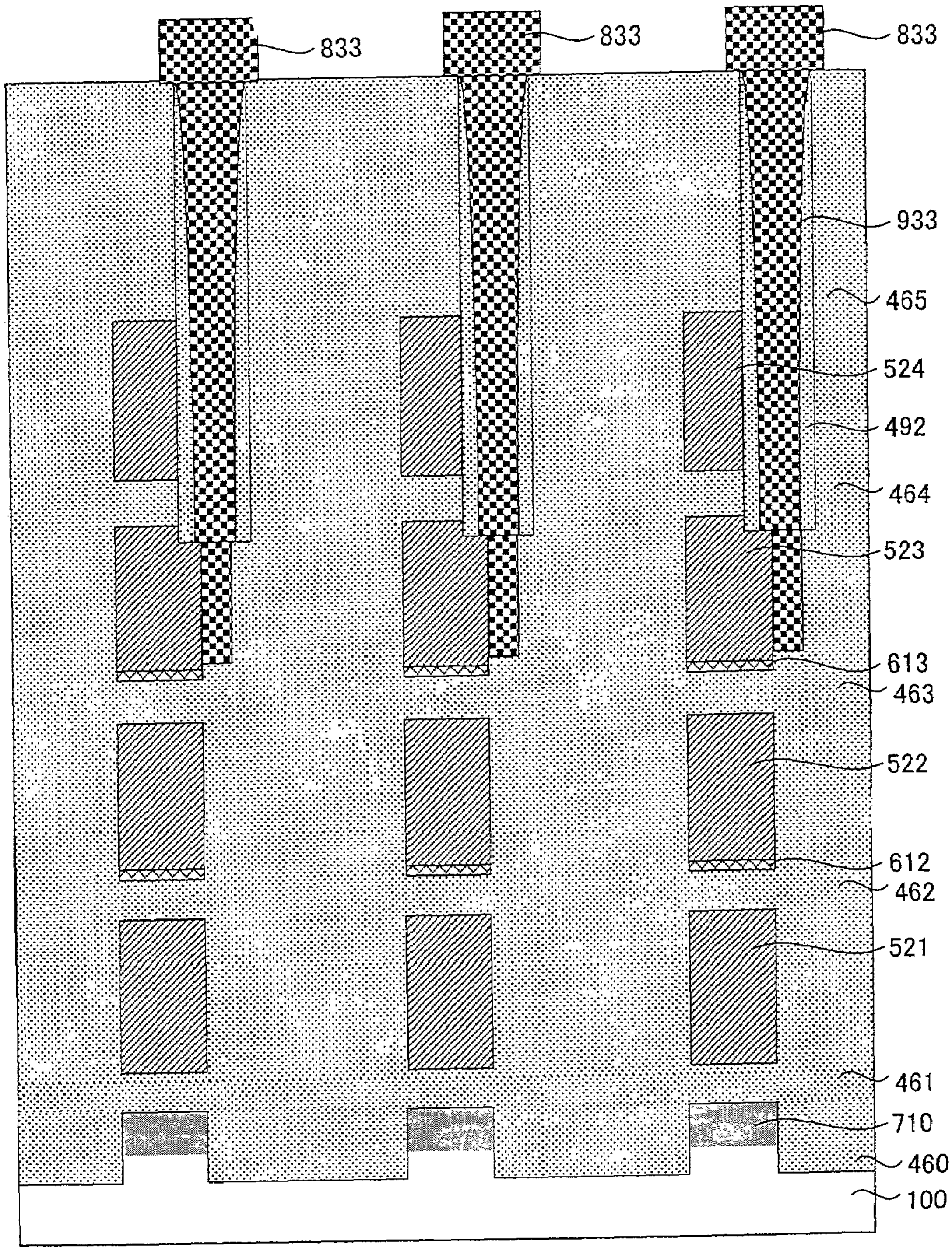
Figure 785:
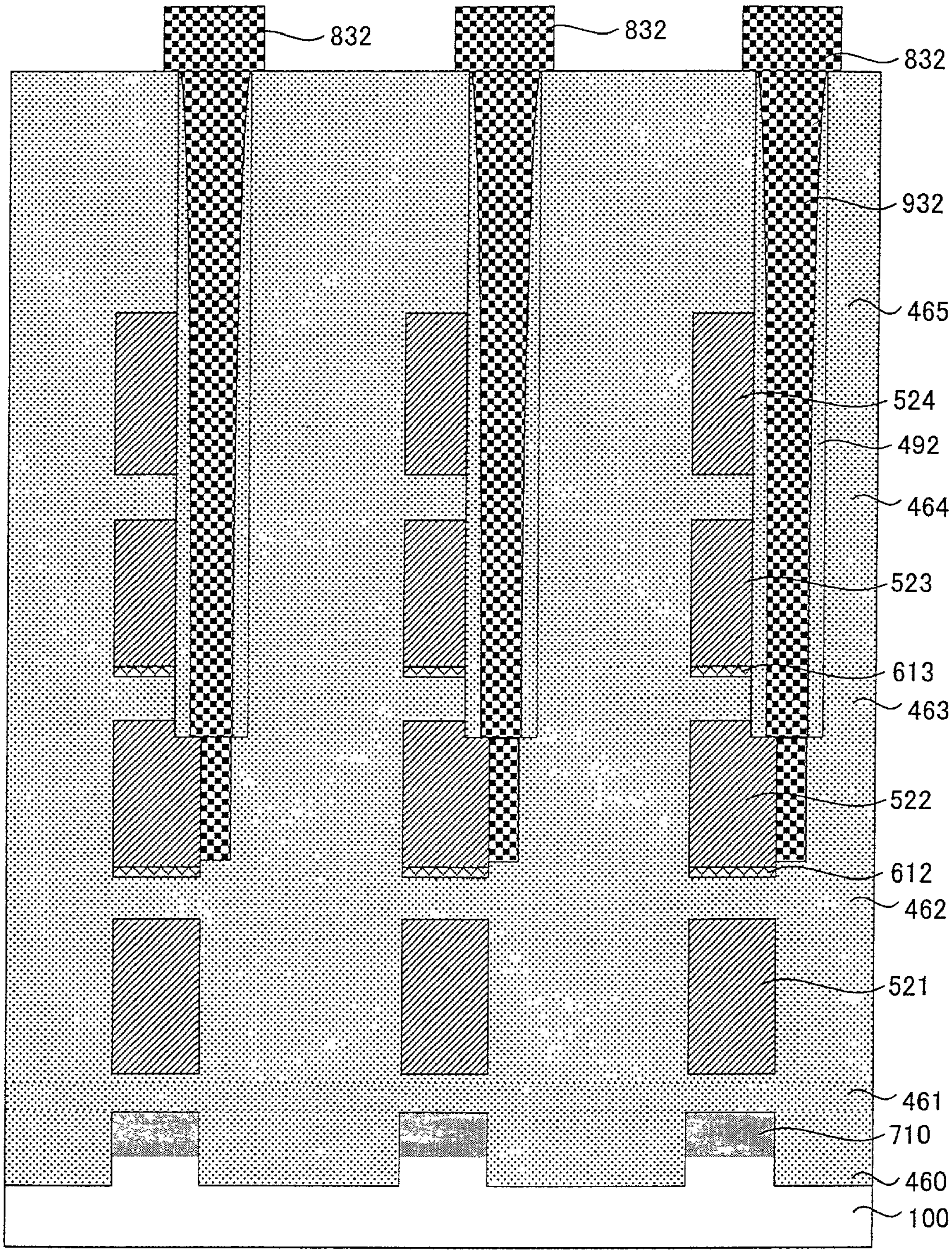
Figure 786:
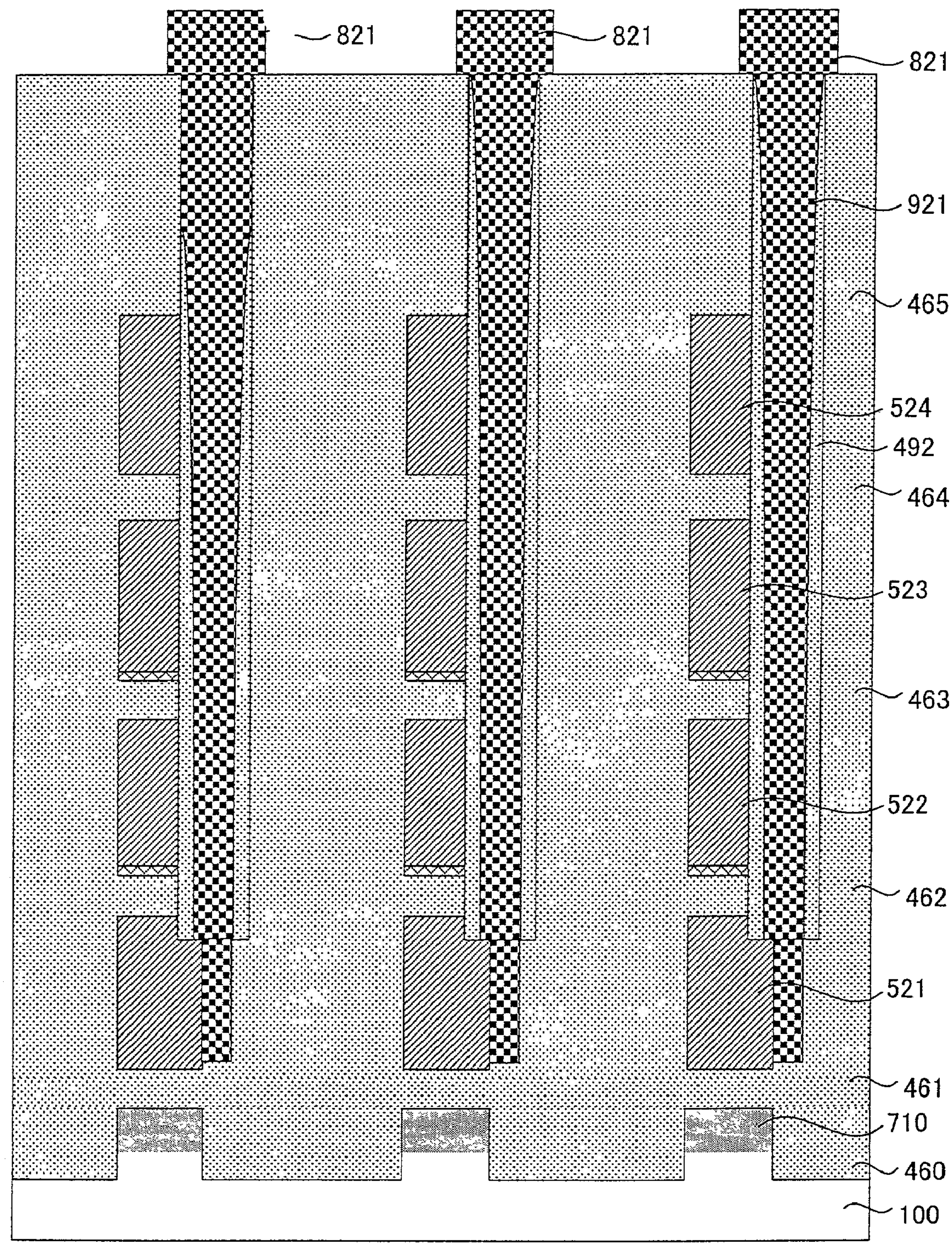
Figure 787:
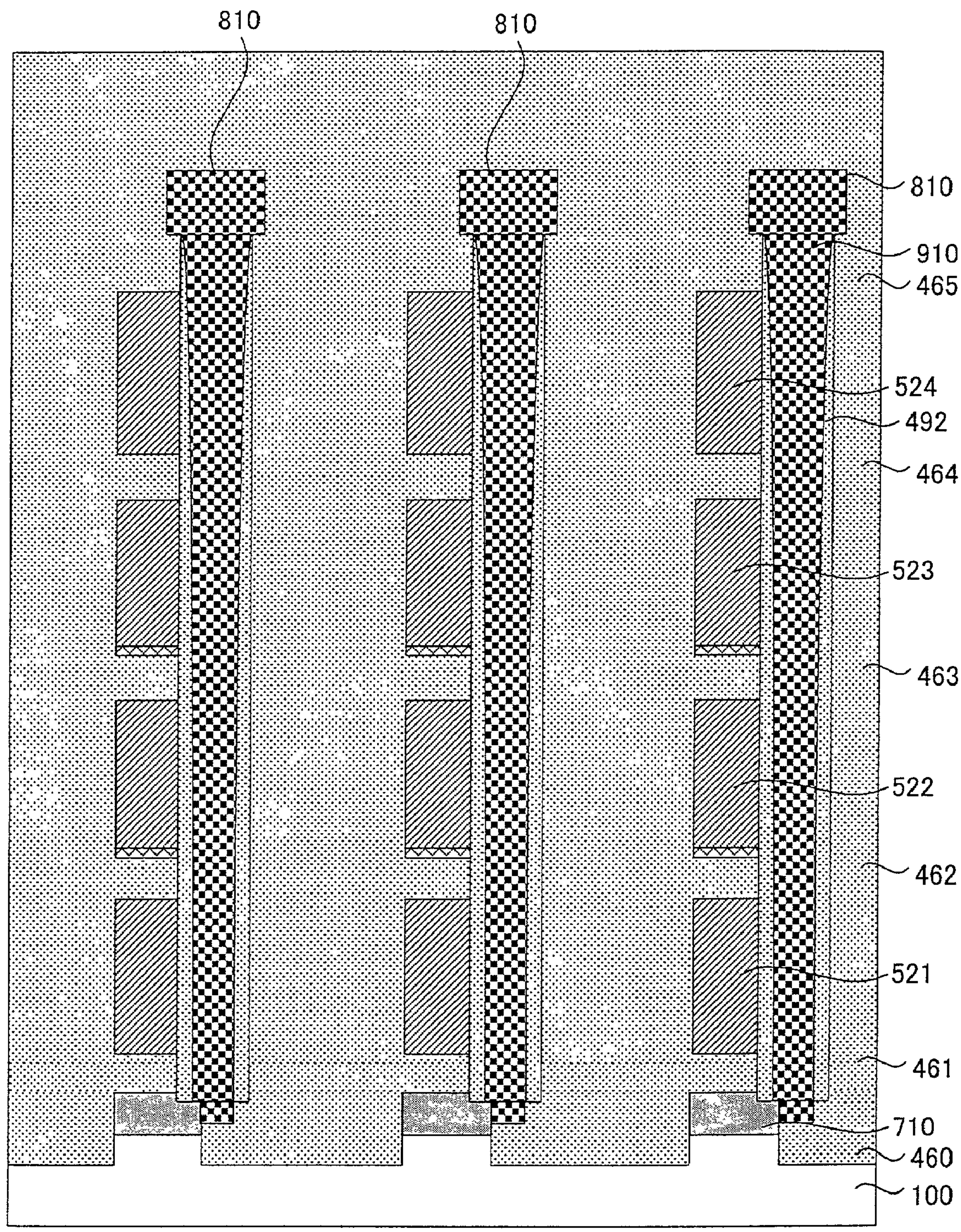
Figure 788:
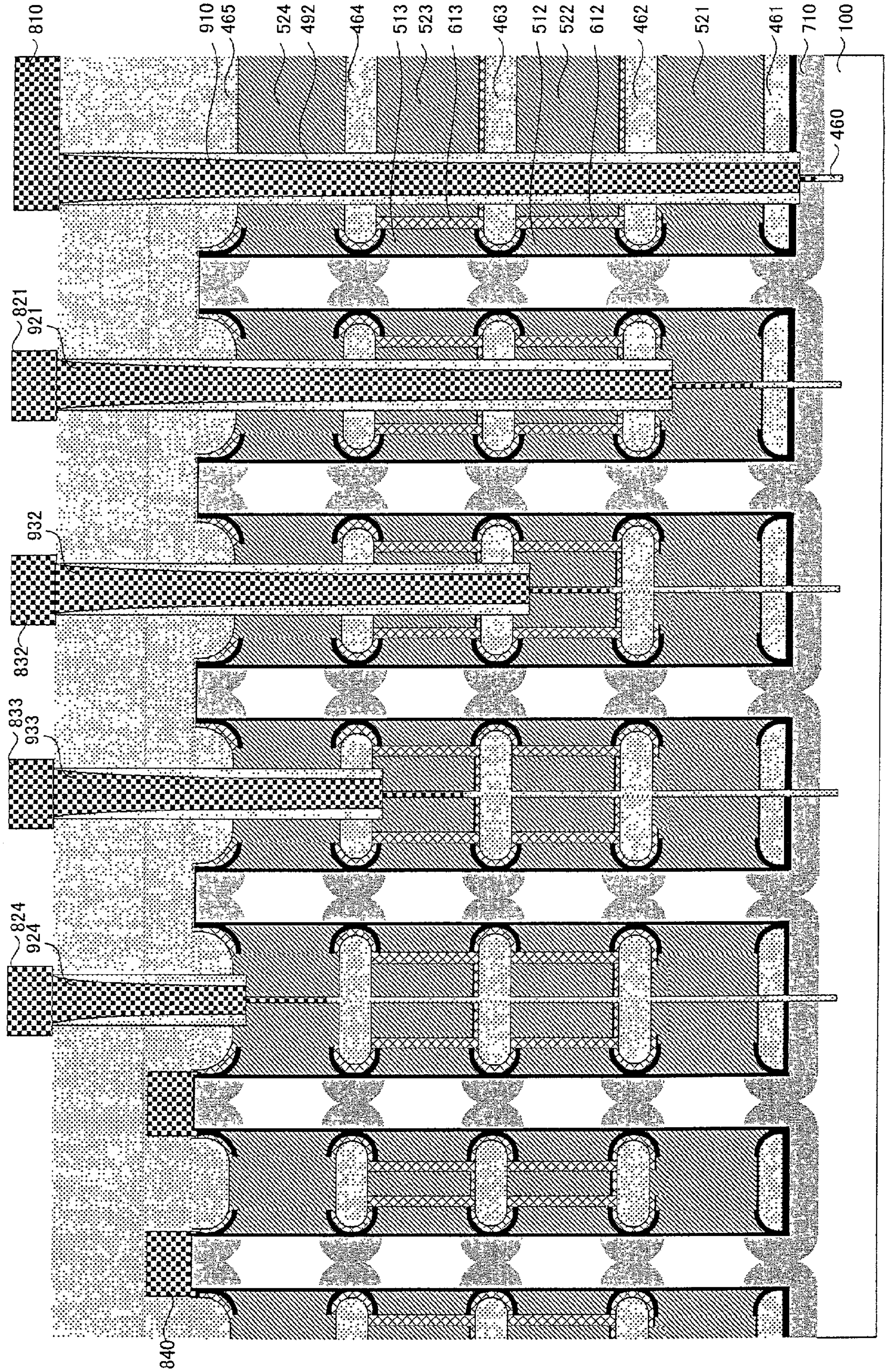
Figure 789:
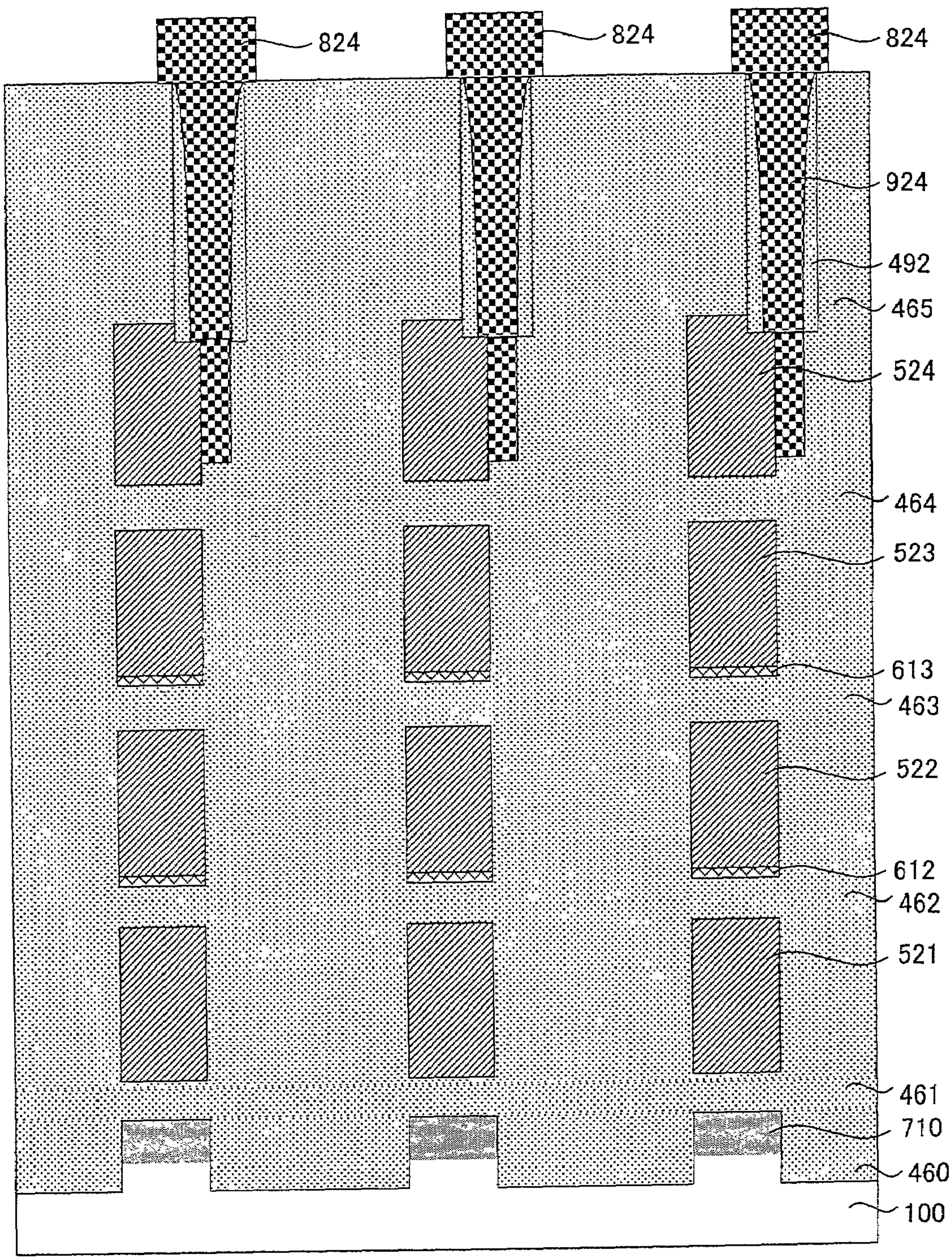
Figure 790:
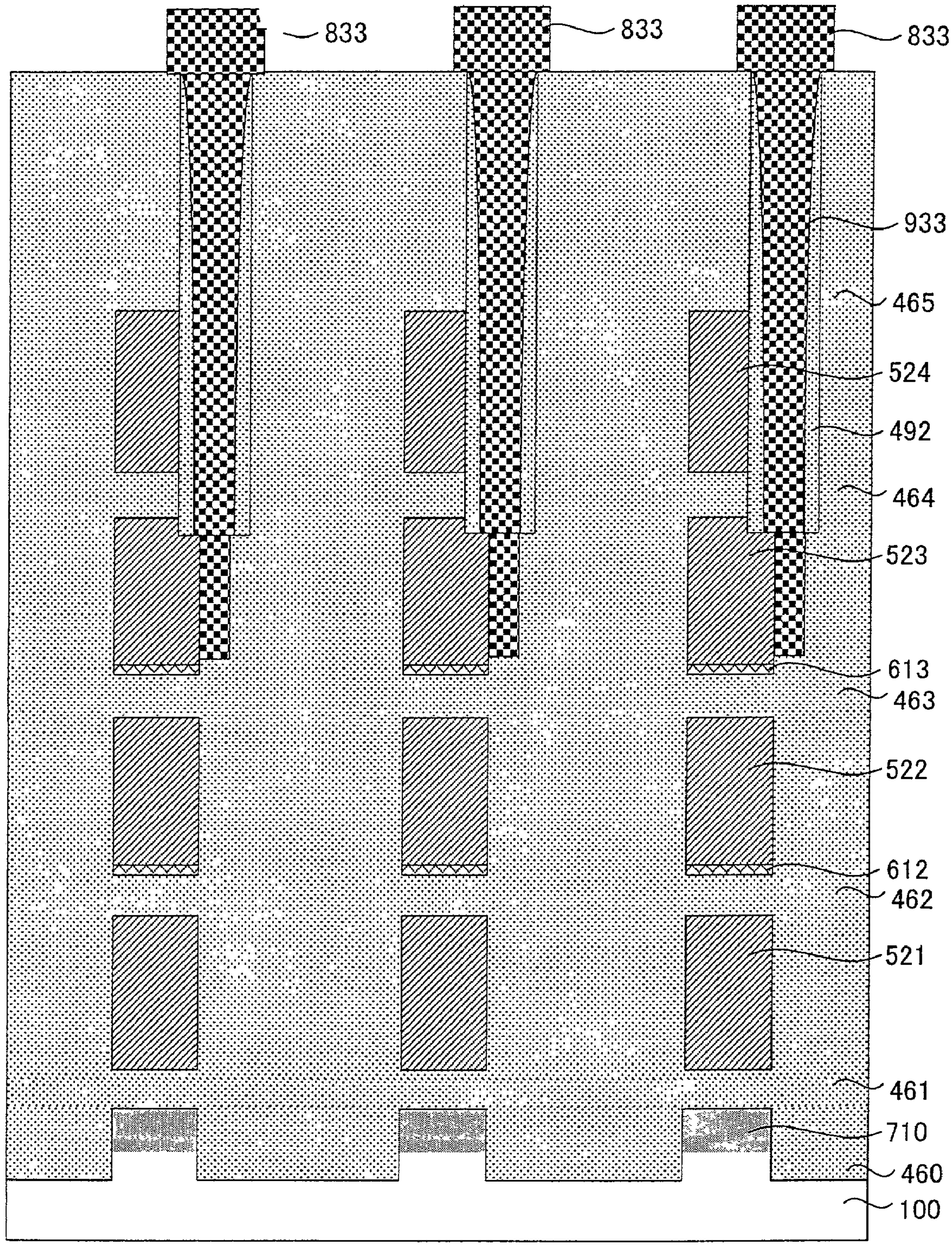
Figure 791:
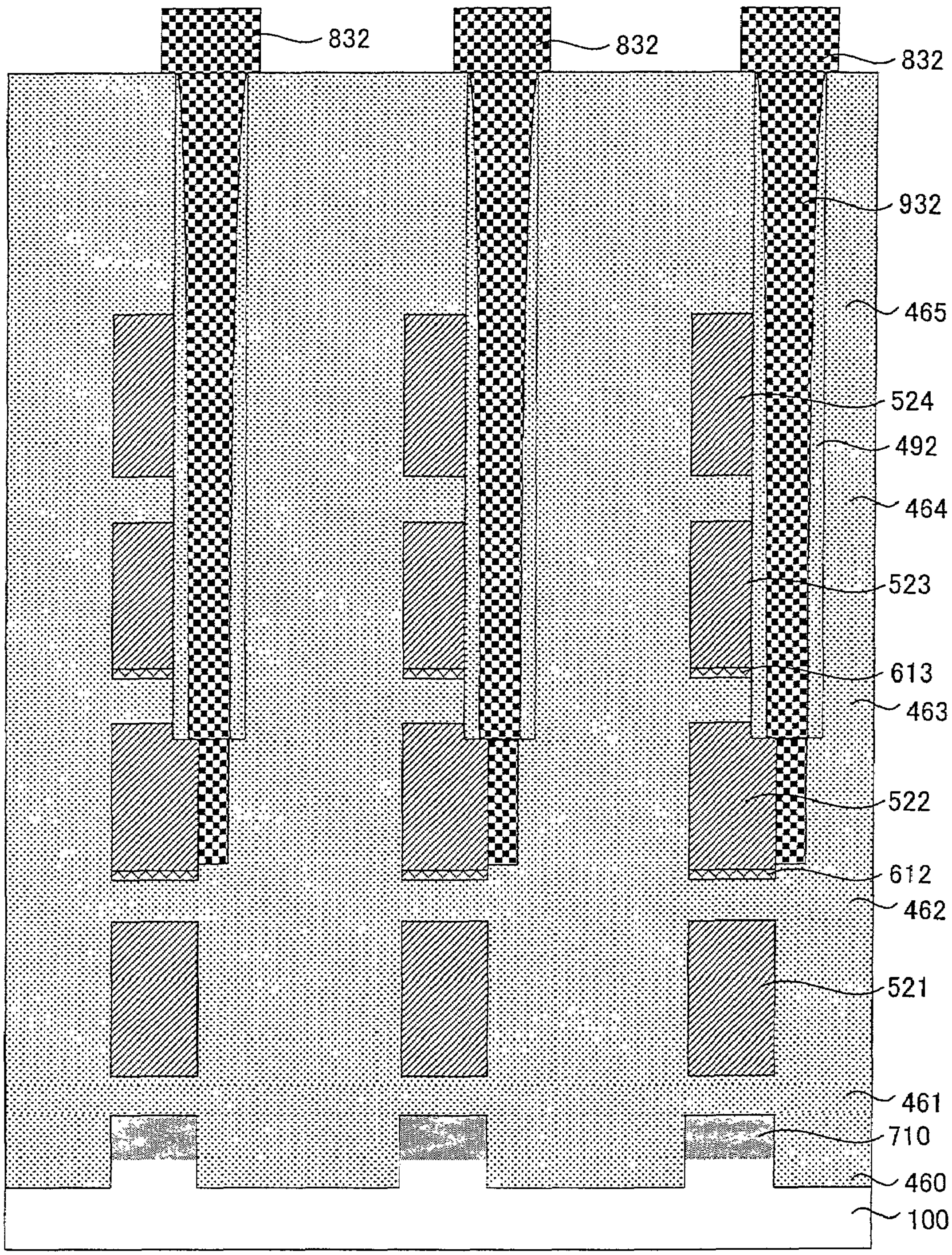
Figure 792:
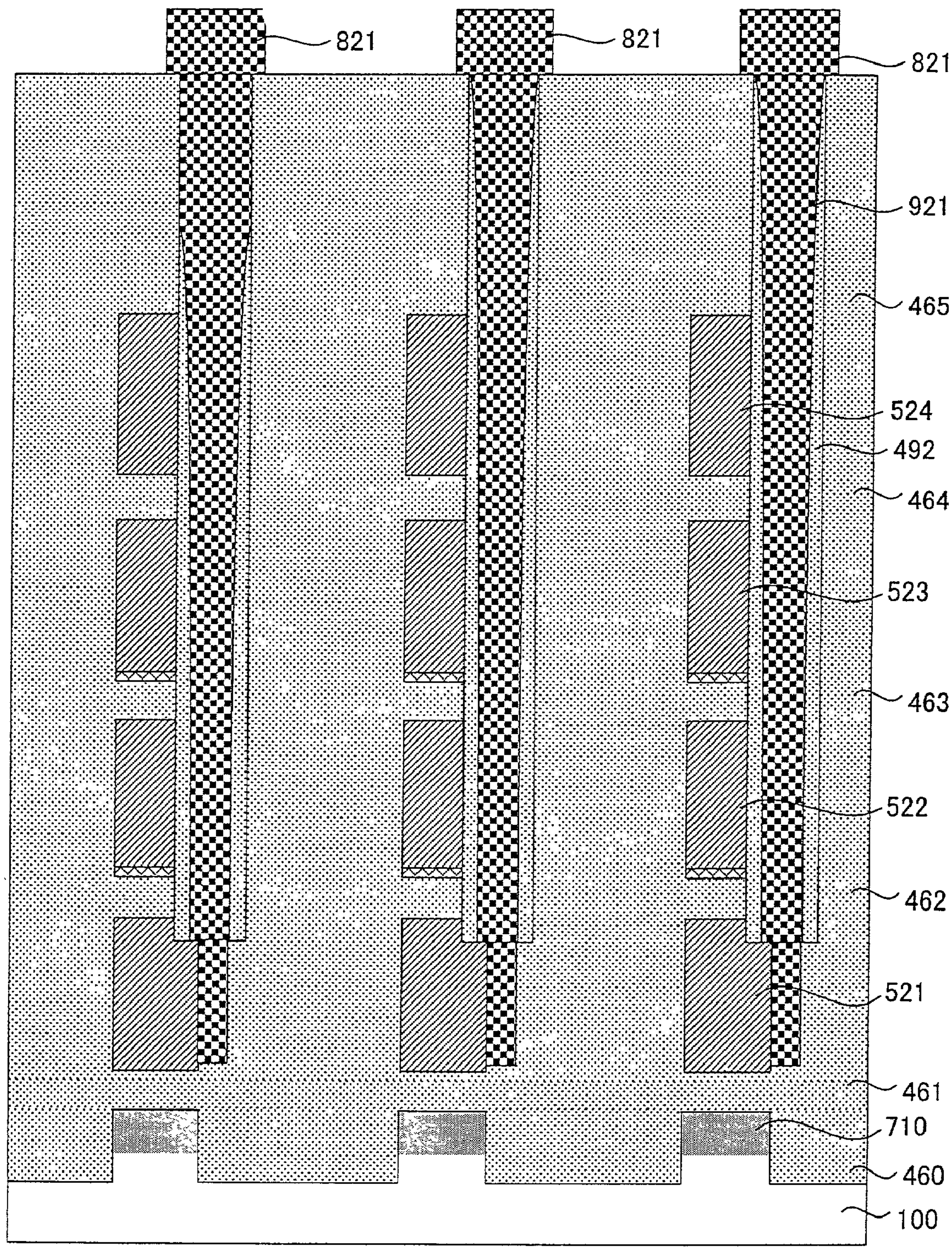
Figure 793:
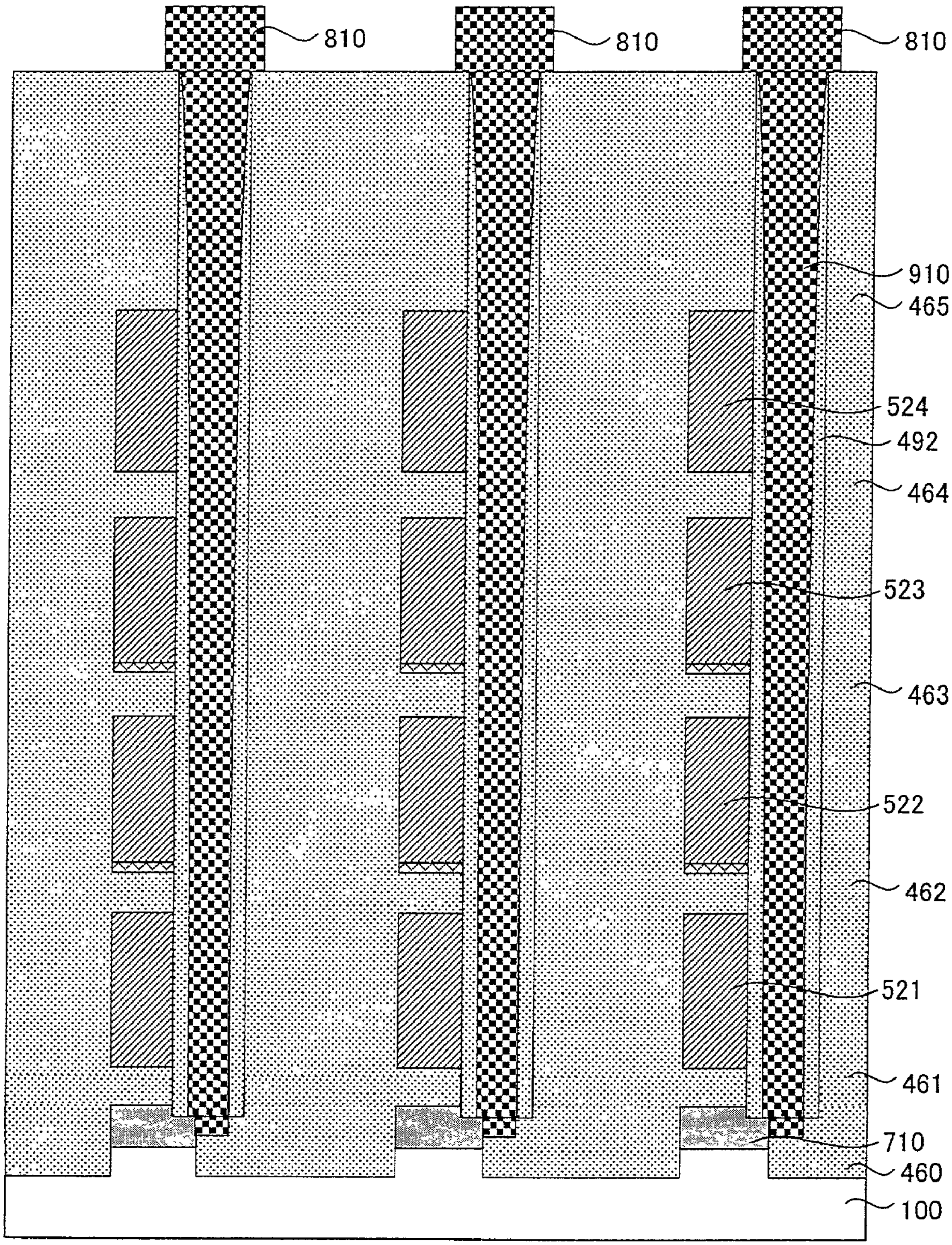
Figure 794:
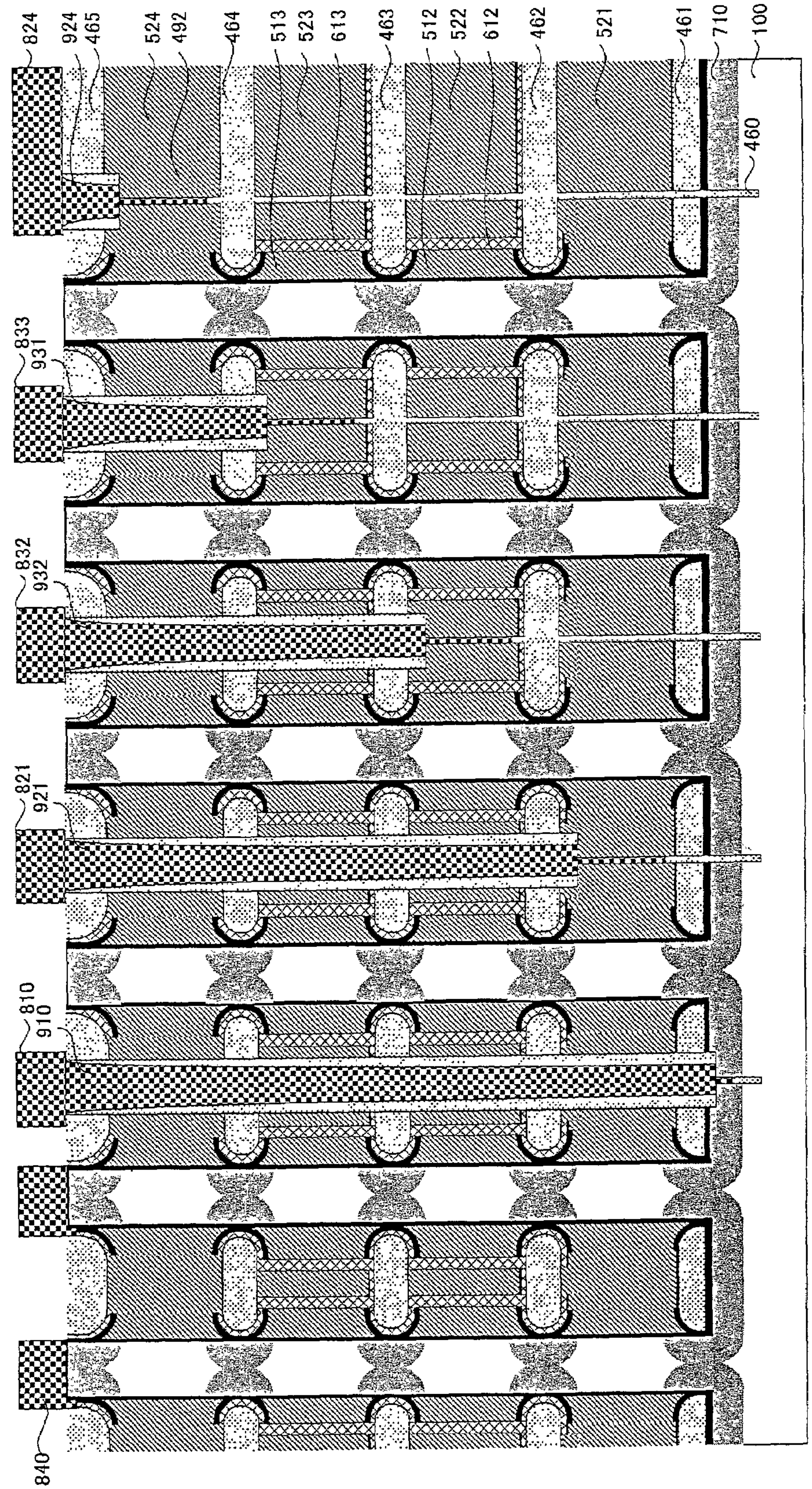
Figure 795:
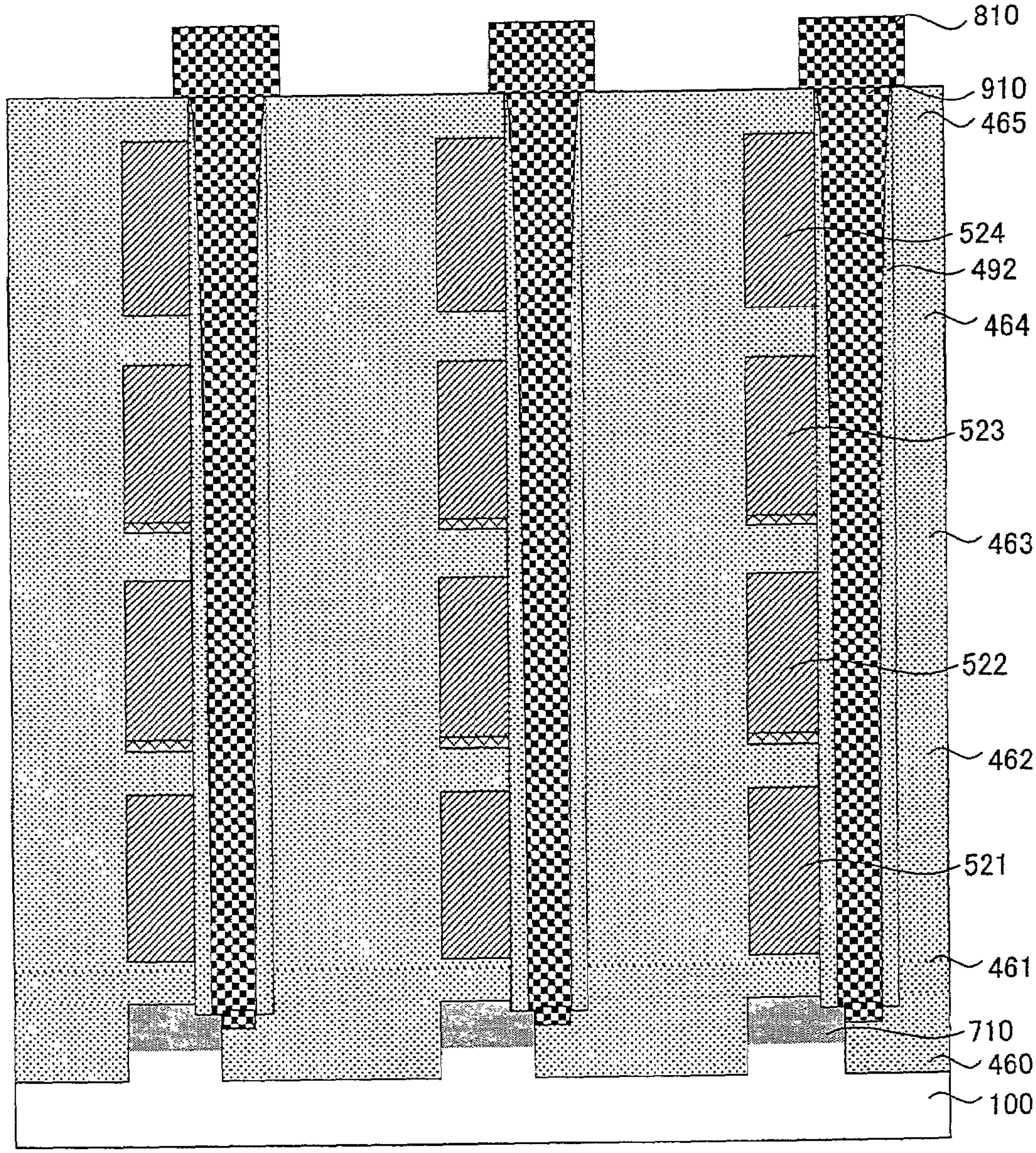
Figure 796:
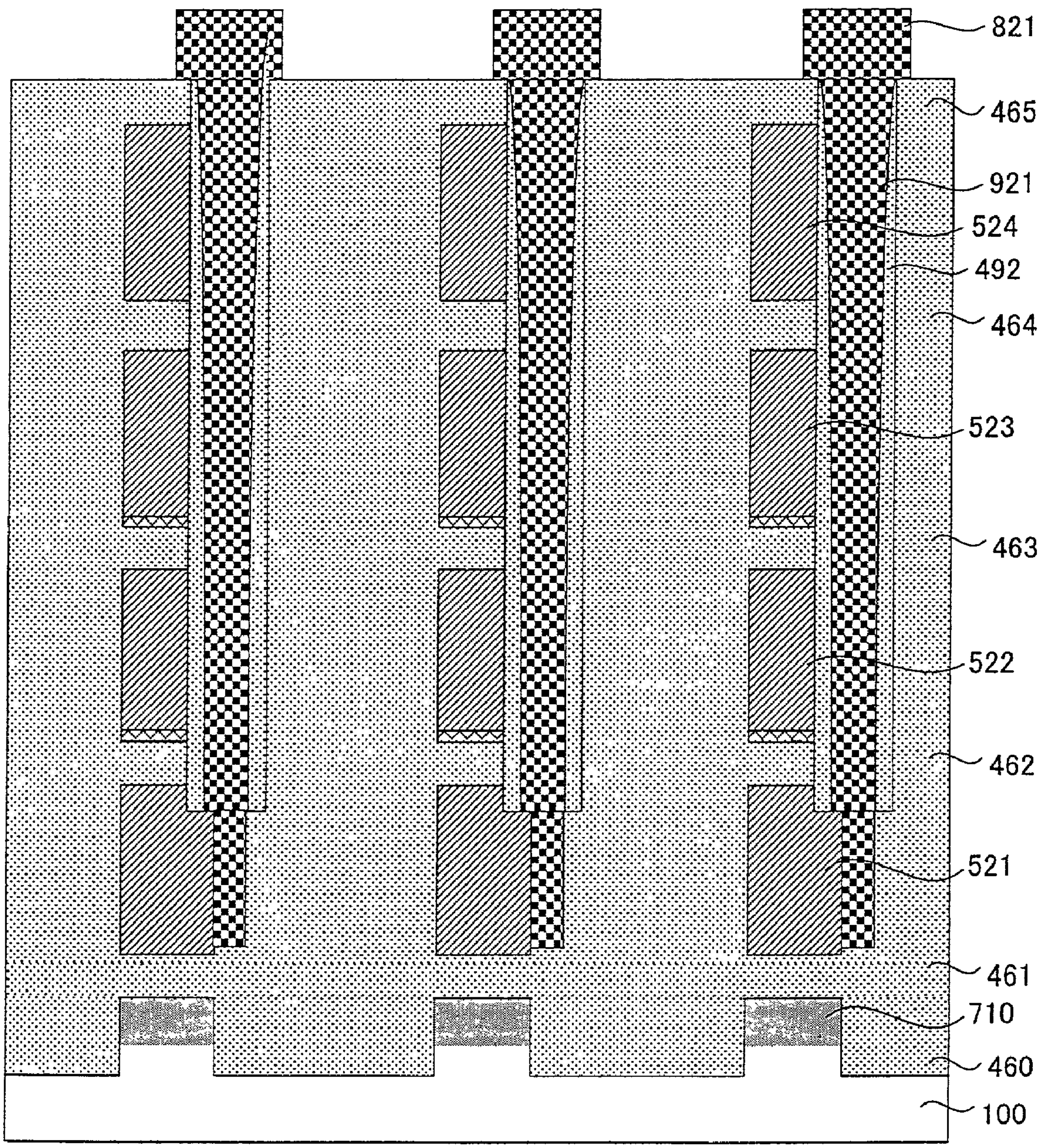
Figure 797:
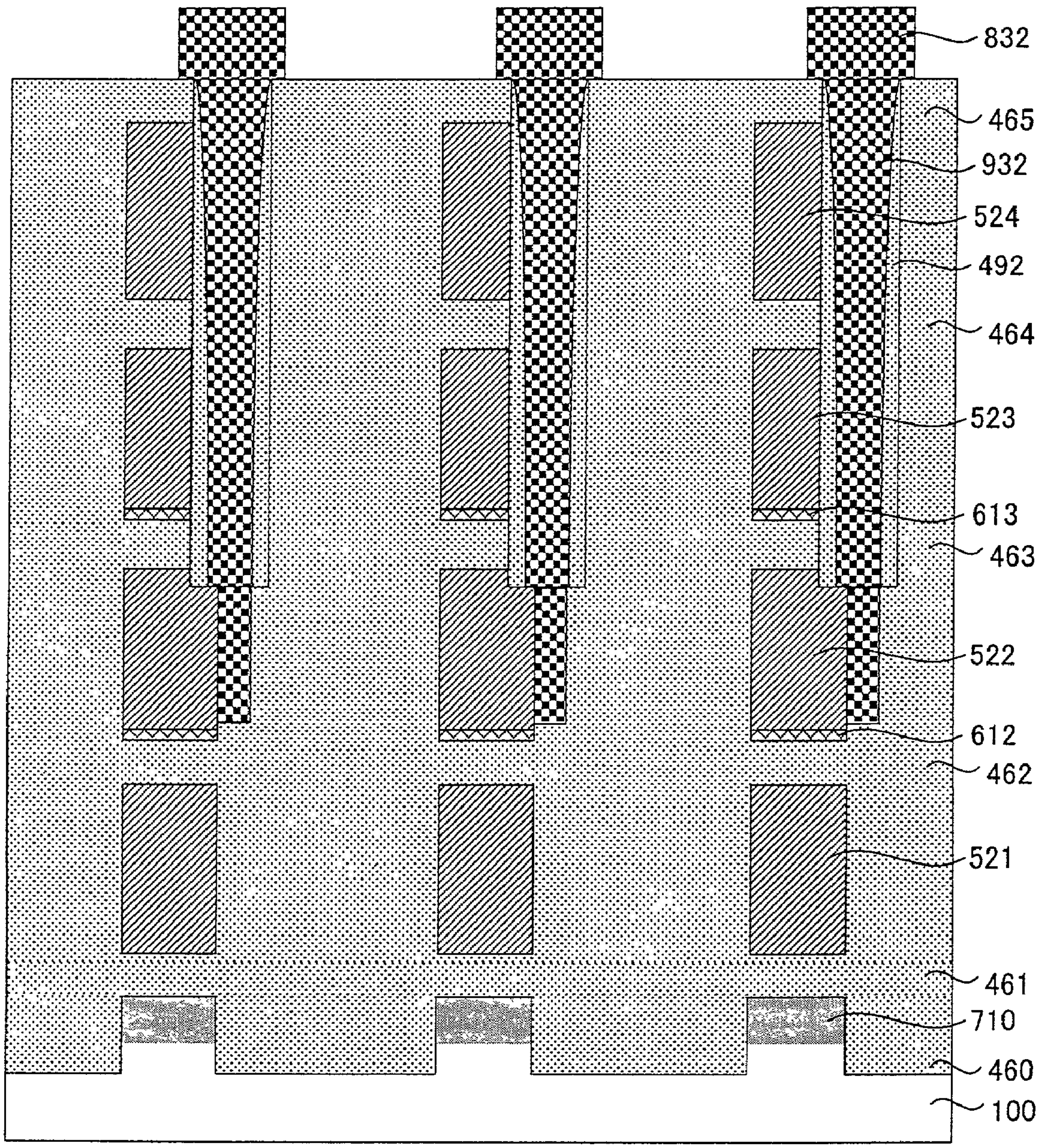
Figure 798:
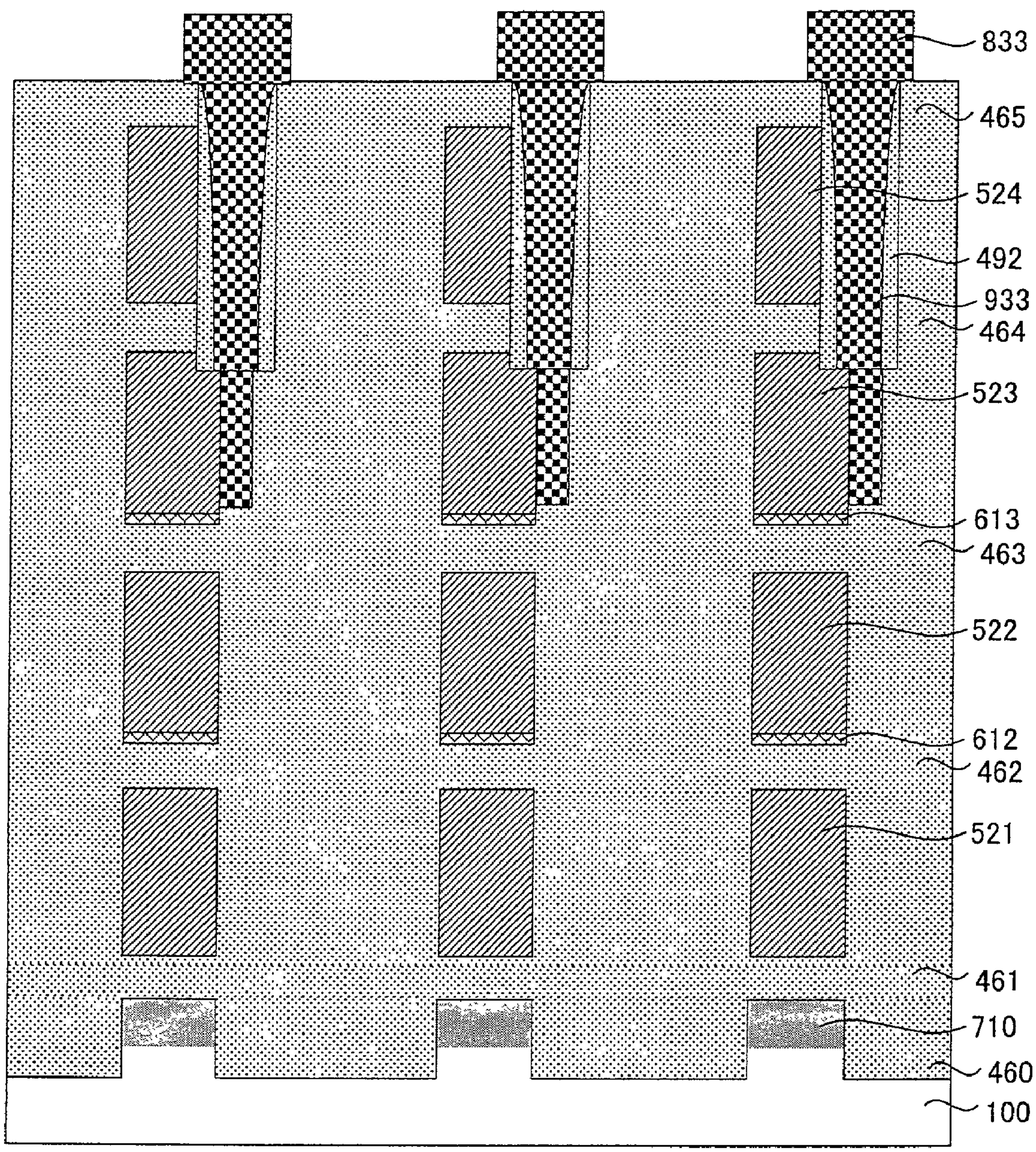
Figure 799:
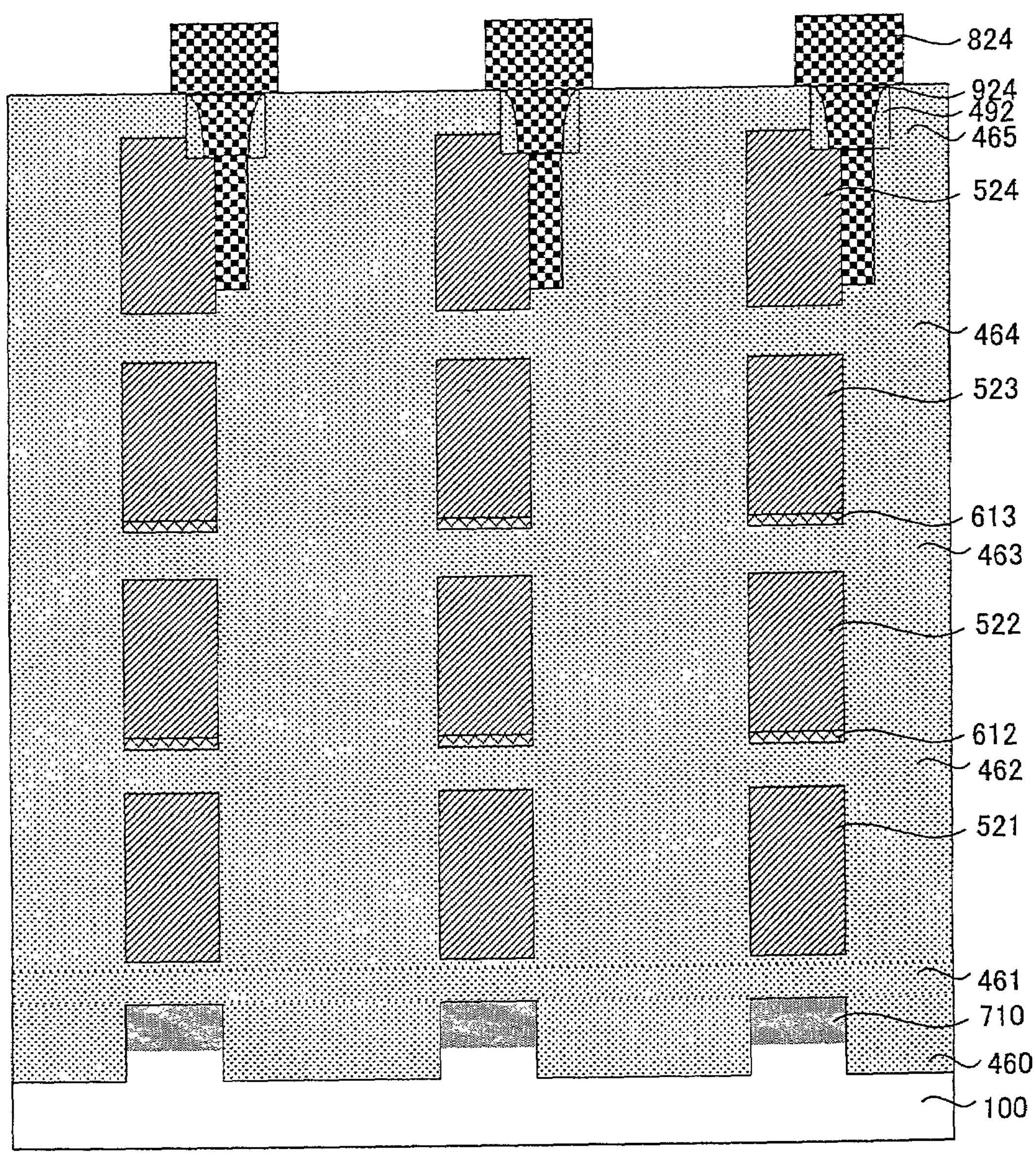
Figure 800:
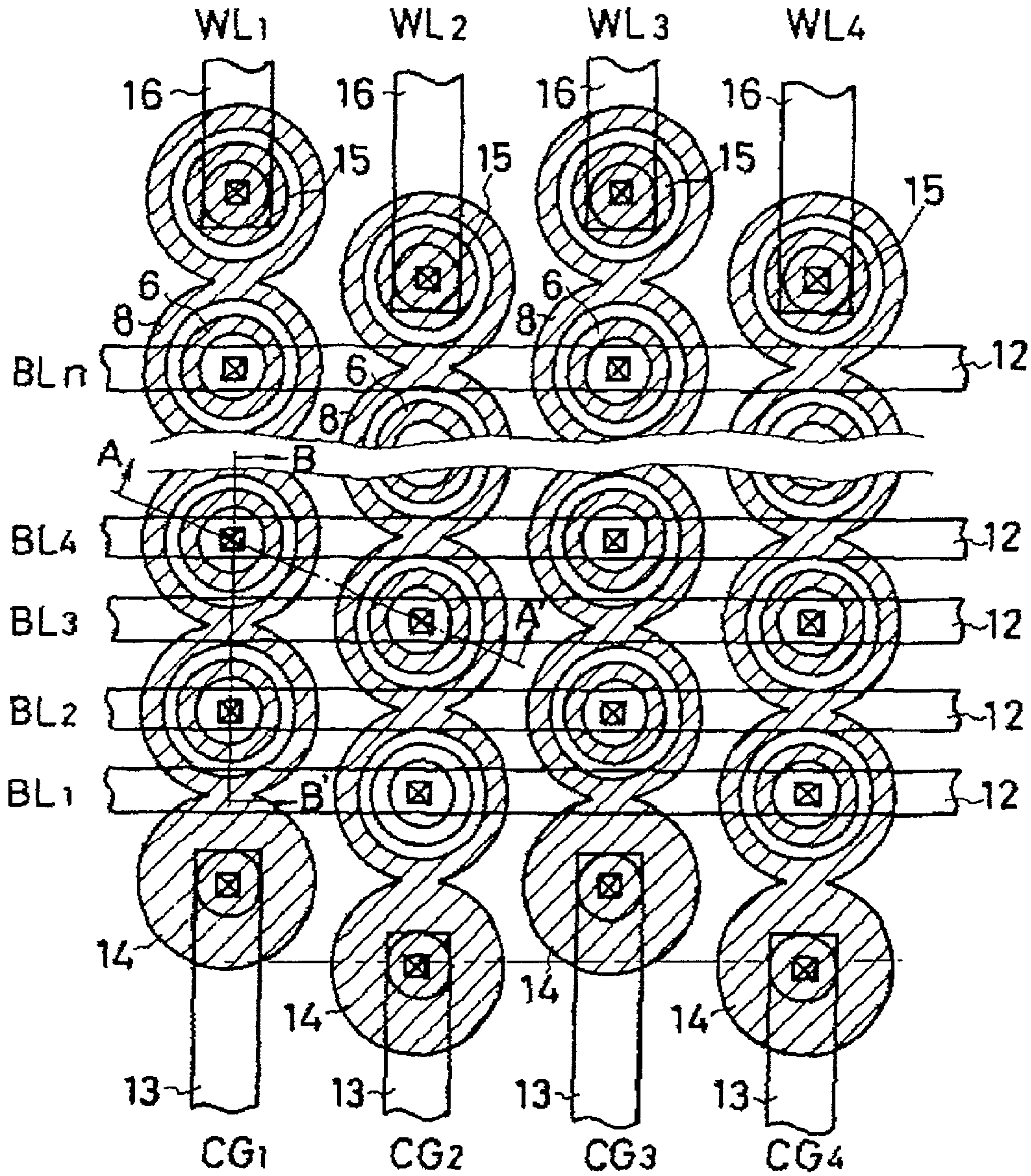
Figure 801:
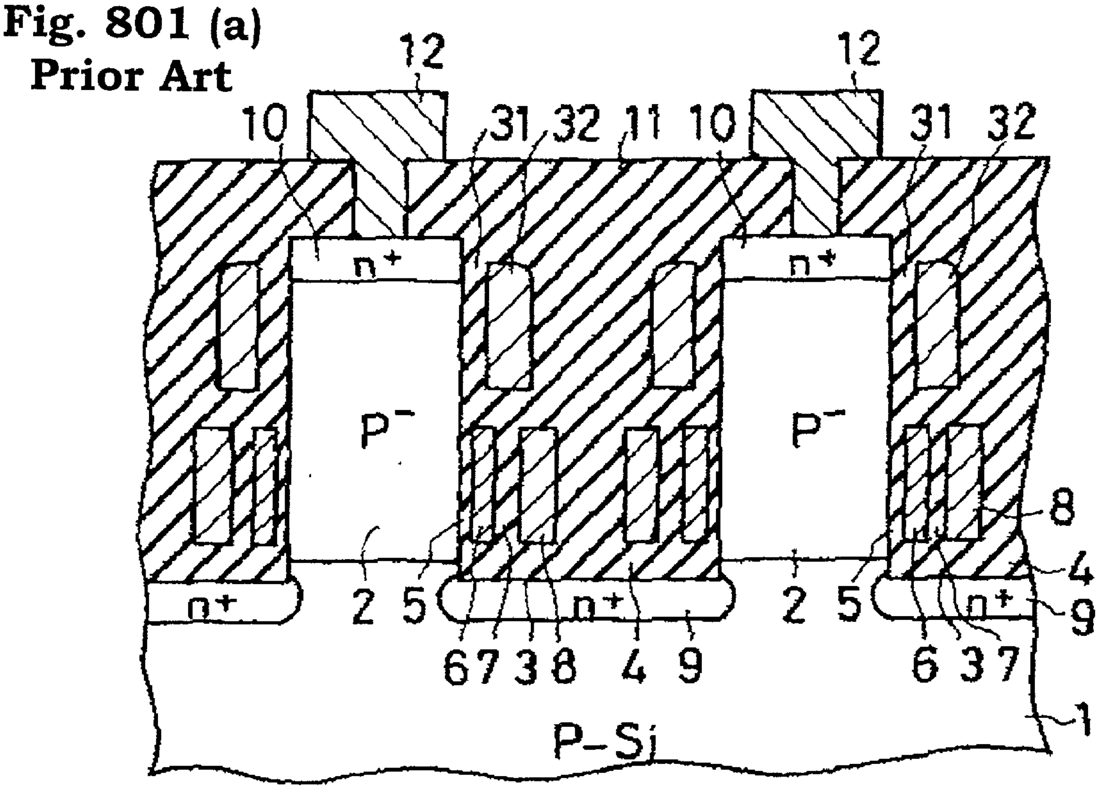
Figure 801:
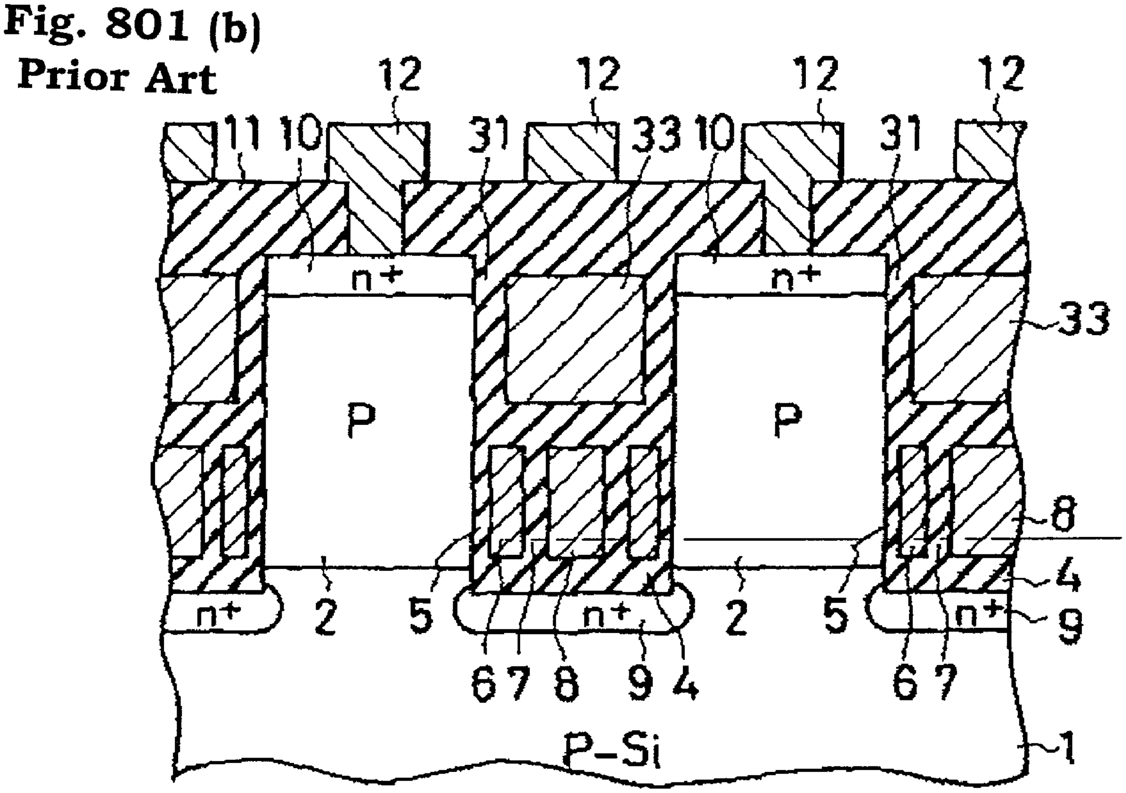
Figure 802:
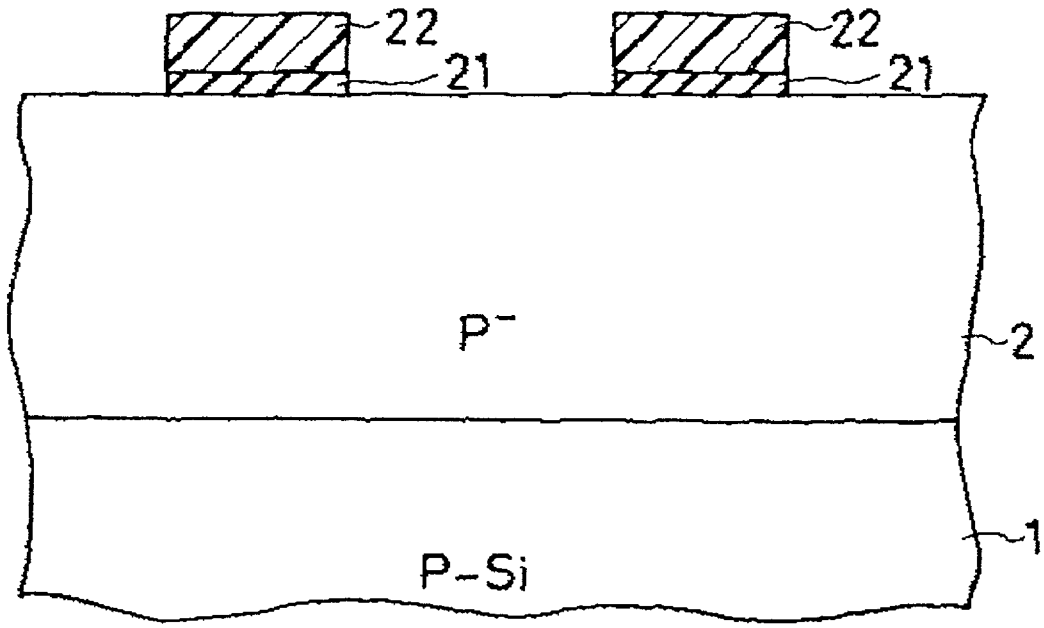
Figure 802:
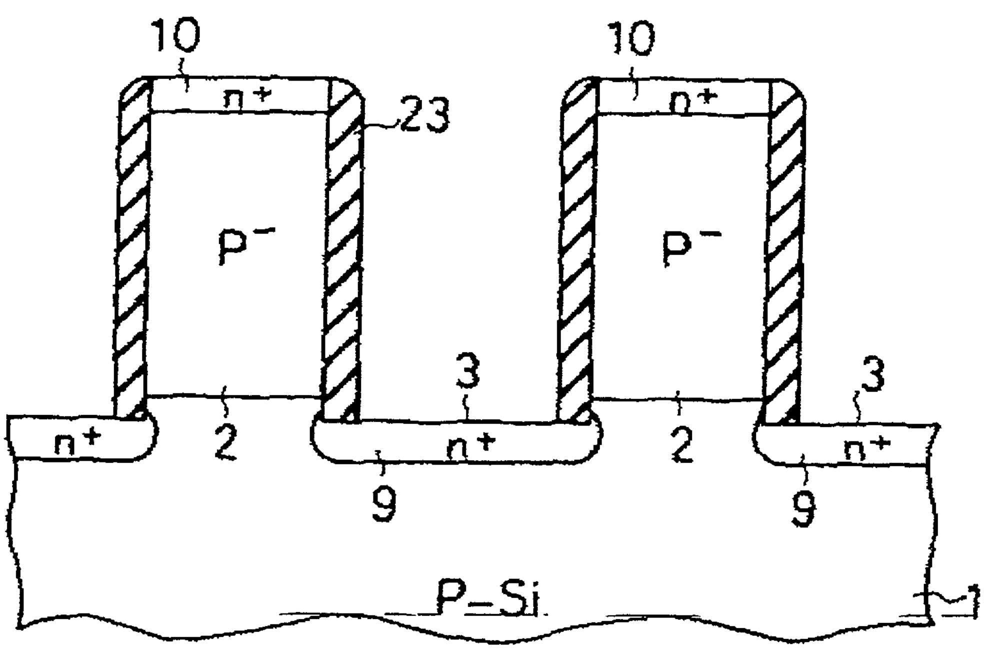
Figure 803:
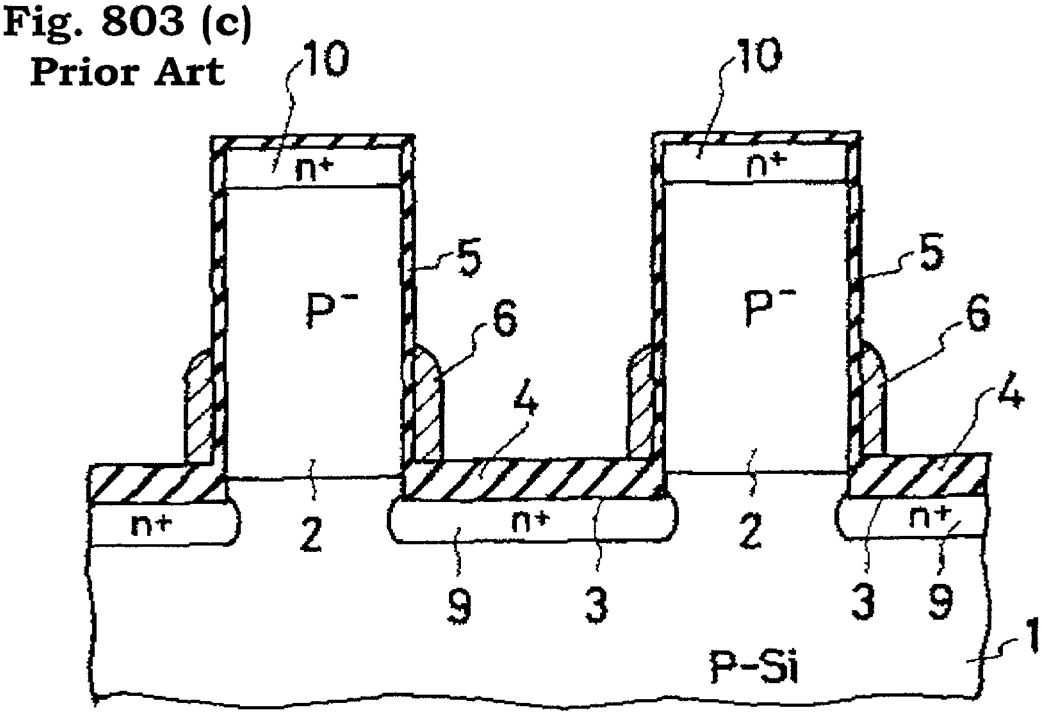
Figure 803:
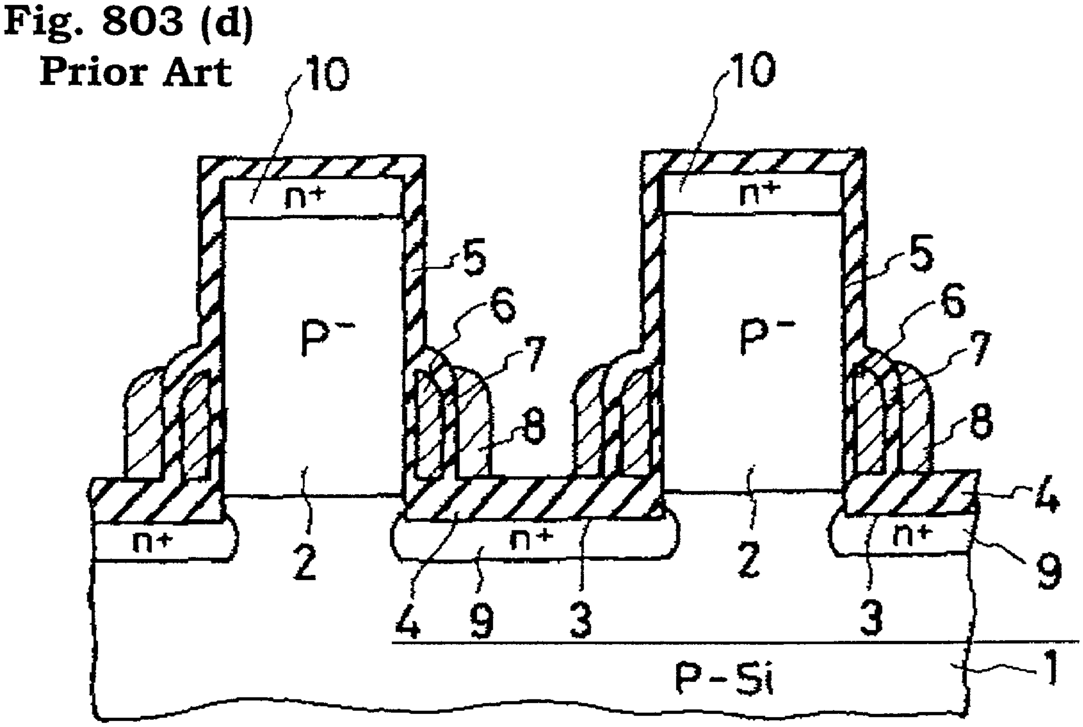
Figure 804:
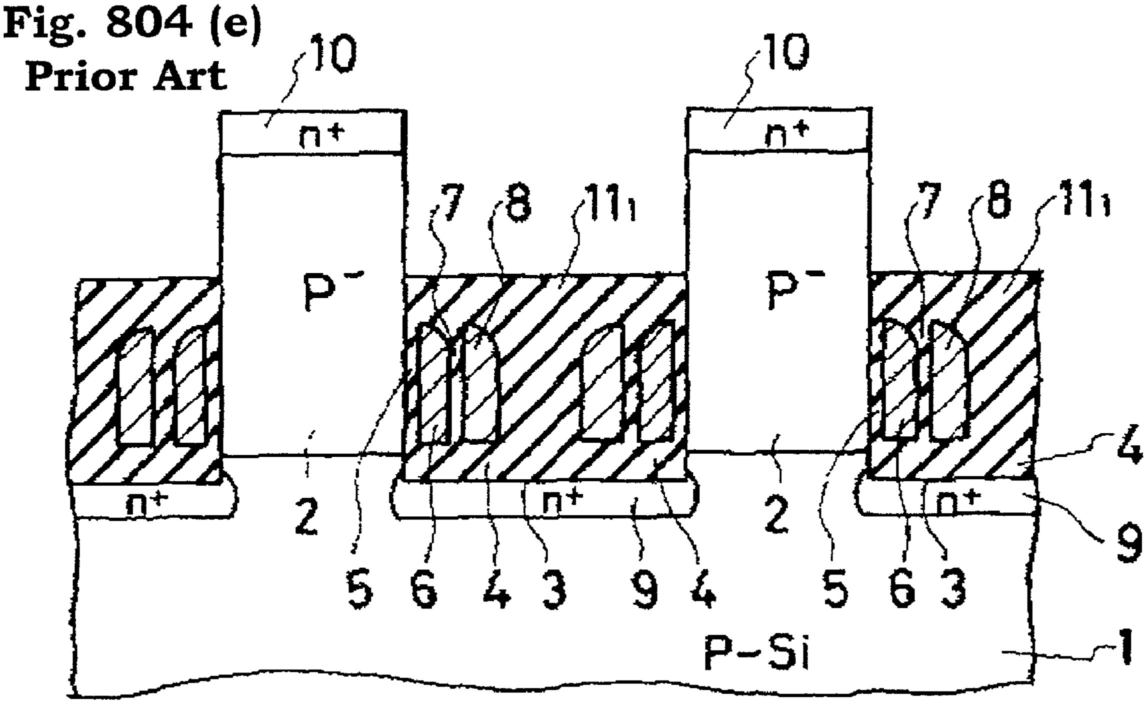
Figure 804:
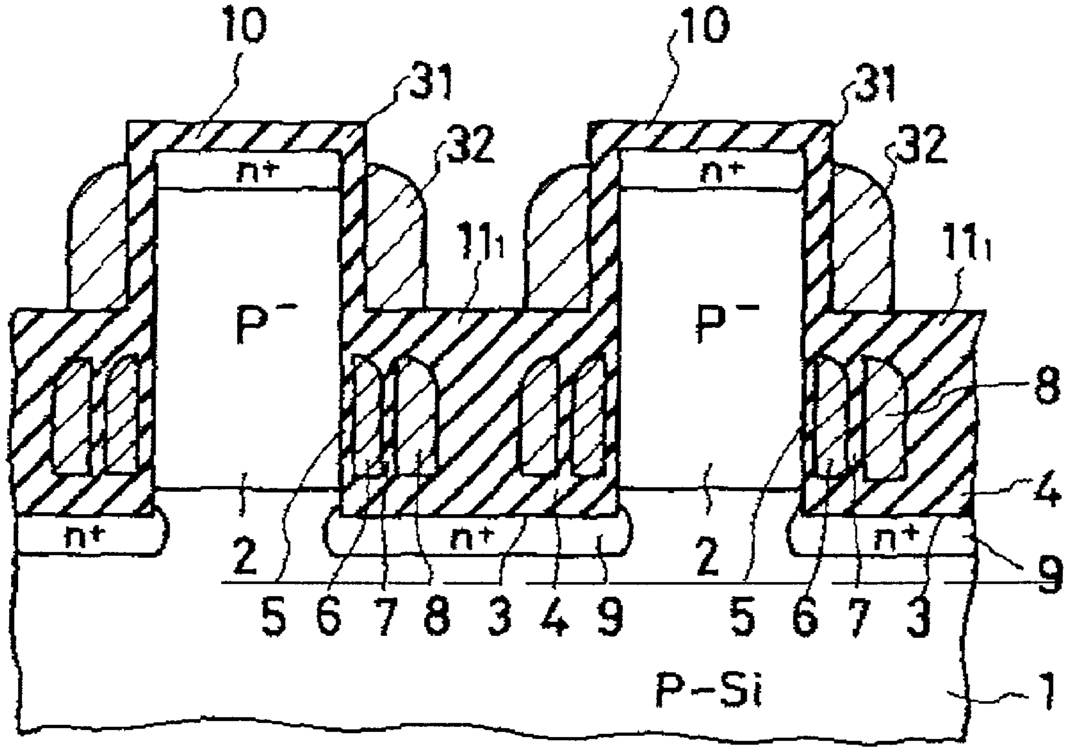
Figure 805:
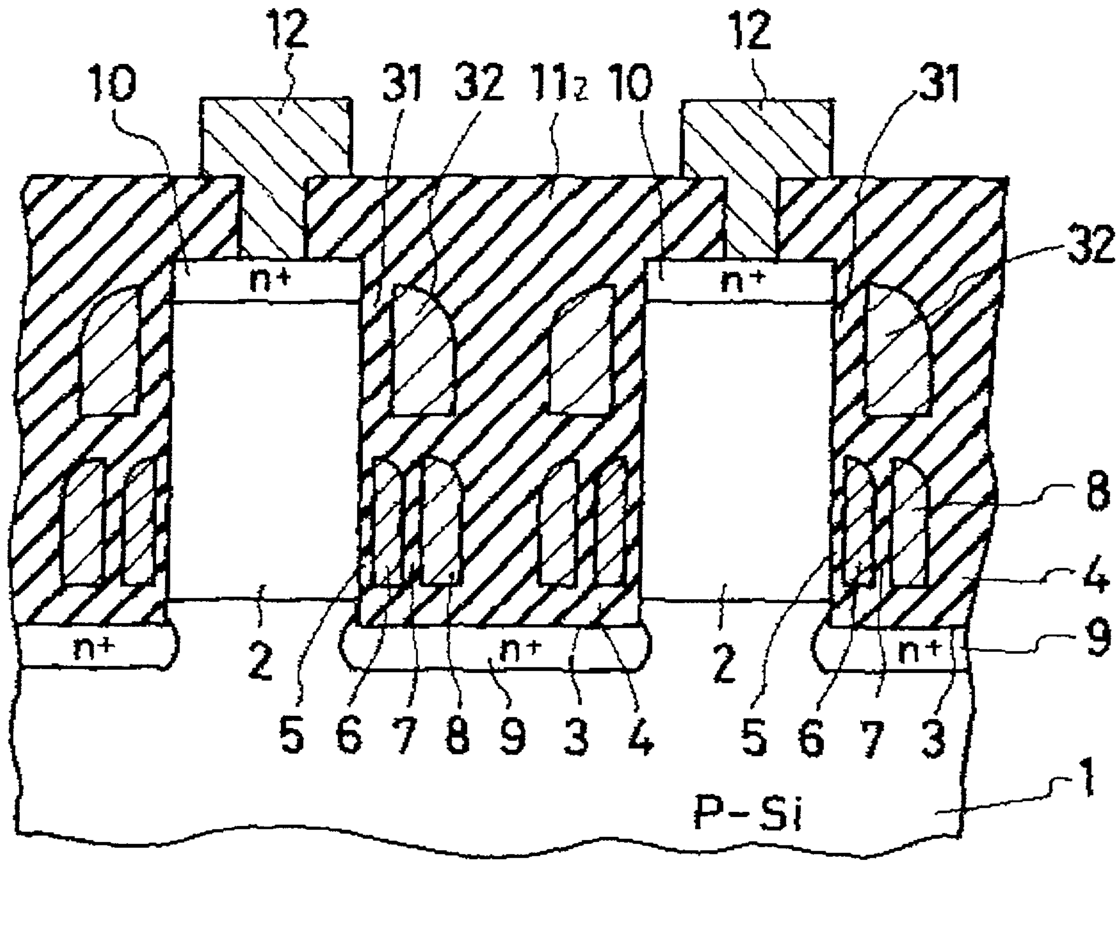
Figure 806:
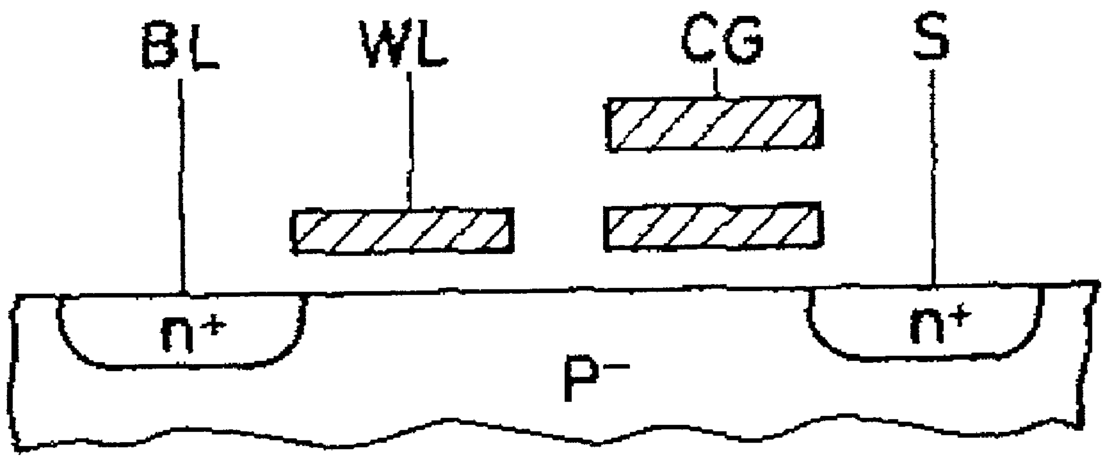
Figure 806:
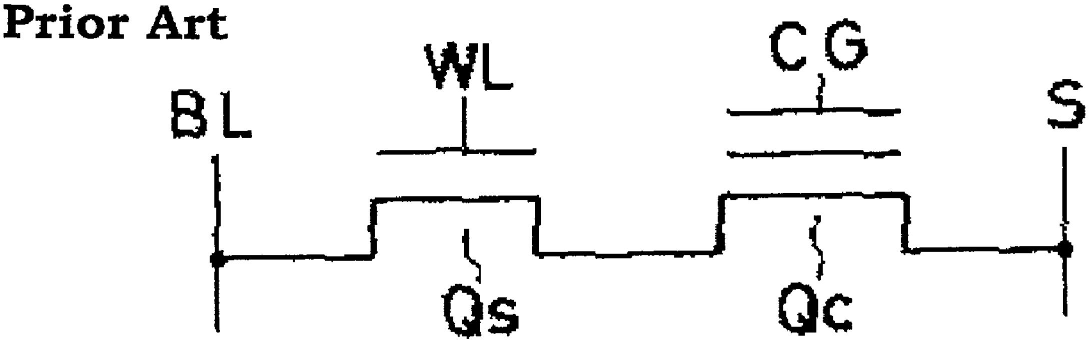
Figure 807:
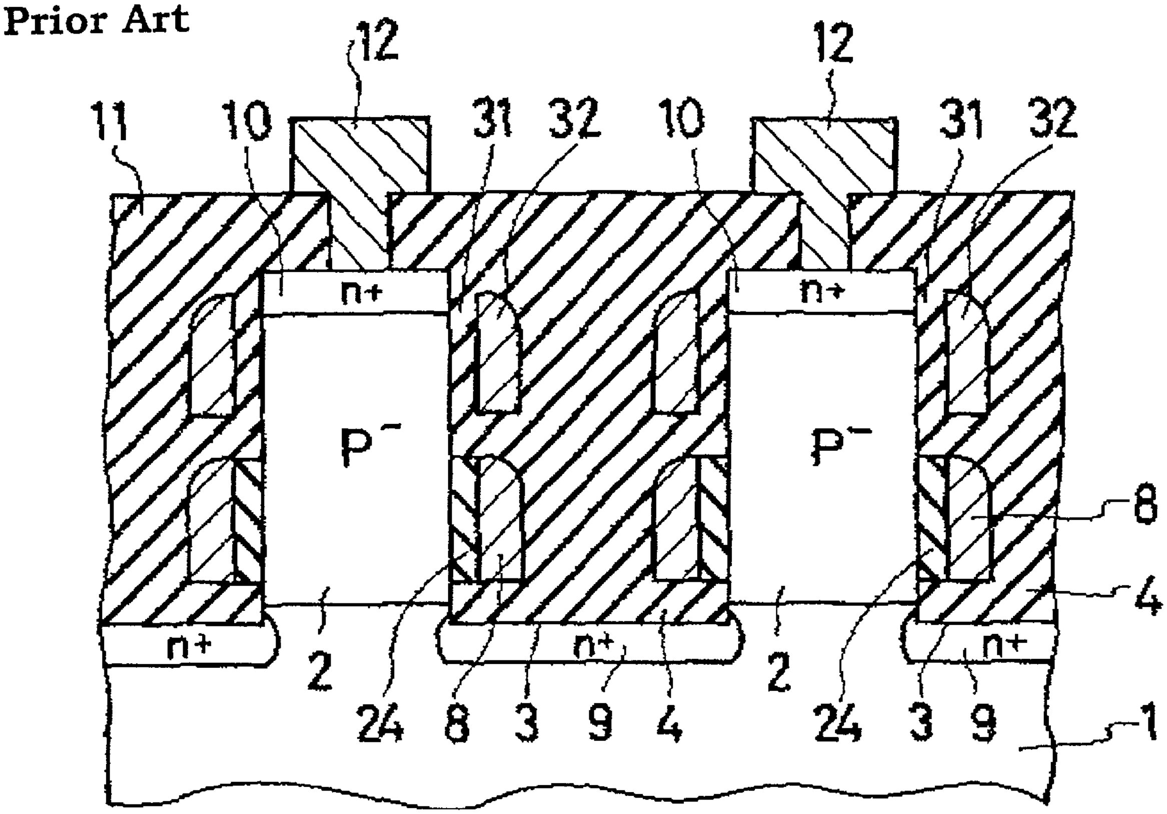
Figure 808:
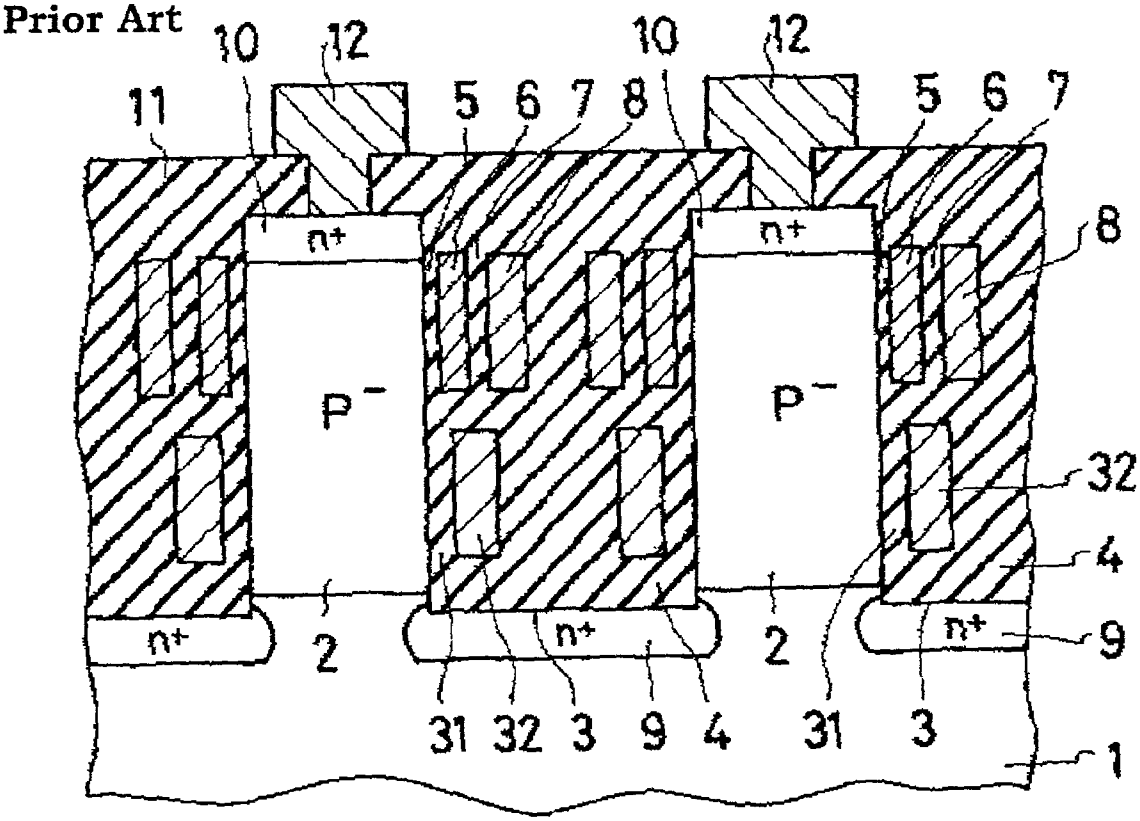
Figure 809:
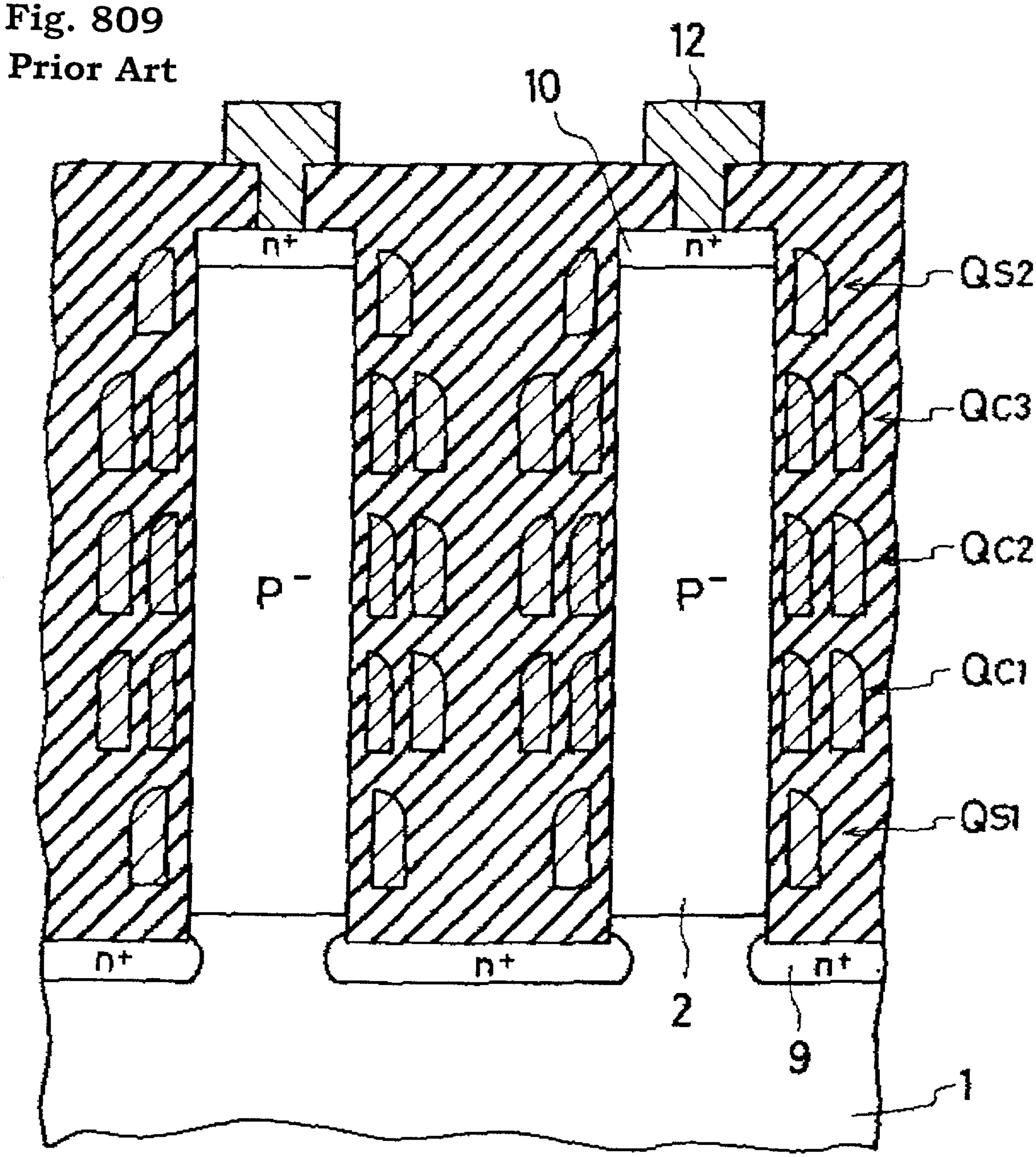

FIG. 690 is a sectional view (taken on line I2–I2' in FIG. 60 or 61) illustrating a production step of Production Example 23 for producing a semiconductor memory in accordance with the present invention;

FIG. 691 is a sectional view (taken on line I3–I3' in FIG. 60 or 61) illustrating a production step of Production Example 23 for producing a semiconductor memory in accordance with the present invention;

FIG. 692 is a sectional view (taken on line I4–I4' in FIG. 60 or 61) illustrating a production step of Production Example 23 for producing a semiconductor memory in accordance with the present invention;

FIG. 693 is a sectional view (taken on line I5–I5' in FIG. 60 or 61) illustrating a production step of Production Example 23 for producing a semiconductor memory in accordance with the present invention;

FIG. 694 is a sectional view (taken on line H–H' in FIG. 60 or 61) illustrating a production step of Production Example 23 for producing a semiconductor memory in accordance with the present invention;

FIG. 695 is a sectional view (taken on line I1–I1' in FIG. 60 or 61) illustrating a production step of Production Example 23 for producing a semiconductor memory in accordance with the present invention;

FIG. 696 is a sectional view (taken on line I2–I2' in FIG. 60 or 61) illustrating a production step of Production Example 23 for producing a semiconductor memory in accordance with the present invention;

FIG. 697 is a sectional view (taken on line I3–I3' in FIG. 60 or 61) illustrating a production step of Production Example 23 for producing a semiconductor memory in accordance with the present invention;

FIG. 698 is a sectional view (taken on line I4–I4' in FIG. 60 or 61) illustrating a production step of Production Example 23 for producing a semiconductor memory in accordance with the present invention;

FIG. 699 is a sectional view (taken on line I5–I5' in FIG. 60 or 61) illustrating a production step of Production Example 23 for producing a semiconductor memory in accordance with the present invention;

FIG. 700 to FIG. 706 are sectional views (taken on line A–A' in FIG. 1) illustrating production steps of Production Example 24 for producing a semiconductor memory in accordance with the present invention;

FIG. 707 to FIG. 713 are sectional views (taken on line B–B' in FIG. 1) illustrating production steps of Production Example 24 for producing a semiconductor memory in accordance with the present invention;

FIG. 714 to FIG. 720 are sectional views (taken on line A–A' in FIG. 64) illustrating production steps of Production Example 25 for producing a semiconductor memory in accordance with the present invention;

FIG. 721 to FIG. 727 are sectional views (taken on line B–B' in FIG. 64) illustrating production steps of Production Example 25 for producing a semiconductor memory in accordance with the present invention;

FIG. 728 is a sectional view (taken on line H–H' in FIG. 70) illustrating a production step of Production Example 26 for producing a semiconductor memory in accordance with the present invention;

FIG. 729 is a sectional view (taken on line I1–I1' in FIG. 70) illustrating a production step of Production Example 26 for producing a semiconductor memory in accordance with the present invention;

FIG. 730 is a sectional view (taken on line I2–I2' in FIG. 70) illustrating a production step of Production Example 26 for producing a semiconductor memory in accordance with the present invention;

FIG. 731 is a sectional view (taken on line I3–I3' in FIG. 70) illustrating a production step of Production Example 26 for producing a semiconductor memory in accordance with the present invention;

FIG. 732 is a sectional view (taken on line I4–I4' in FIG. 70) illustrating a production step of Production Example 26 for producing a semiconductor memory in accordance with the present invention;

FIG. 733 is a sectional view (taken on line J1–J1' in FIG. 70) illustrating a production step of Production Example 26 for producing a semiconductor memory in accordance with the present invention;

FIG. 734 is a sectional view (taken on line J2–J2' in FIG. 70) illustrating a production step of Production Example 26 for producing a semiconductor memory in accordance with the present invention;

FIG. 735 is a sectional view (taken on line J3–J3' in FIG. 70) illustrating a production step of Production Example 26 for producing a semiconductor memory in accordance with the present invention;

FIG. 736 is a sectional view (taken on line J4–J4' in FIG. 70) illustrating a production step of Production Example 26 for producing a semiconductor memory in accordance with the present invention;

FIG. 737 is a sectional view (taken on line H–H' in FIG. 71) illustrating a production step of Production Example 27 for producing a semiconductor memory in accordance with the present invention;

FIG. 738 is a sectional view (taken on line I1–I1' in FIG. 71) illustrating a production step of Production Example 27 for producing a semiconductor memory in accordance with the present invention;

FIG. 739 is a sectional view (taken on line I2–I2' in FIG. 71) illustrating a production step of Production Example 27 for producing a semiconductor memory in accordance with the present invention;

FIG. 740 is a sectional view (taken on line I3–I3' in FIG. 71) illustrating a production step of Production Example 27 for producing a semiconductor memory in accordance with the present invention;

FIG. 741 is a sectional view (taken on line I4–I4' in FIG. 71) illustrating a production step of Production Example 27 for producing a semiconductor memory in accordance with the present invention;

FIG. 742 is a sectional view (taken on line H–H' in FIG. 72) illustrating a production step of Production Example 28 for producing a semiconductor memory in accordance with the present invention;

FIG. 743 is a sectional view (taken on line I1–I1' in FIG. 72) illustrating a production step of Production Example 28 for producing a semiconductor memory in accordance with the present invention;

FIG. 744 is a sectional view (taken on line I2–I2' in FIG. 72) illustrating a production step of Production Example 28 for producing a semiconductor memory in accordance with the present invention;

FIG. 745 is a sectional view (taken on line I3–I3' in FIG. 72) illustrating a production step of Production Example 28 for producing a semiconductor memory in accordance with the present invention;

FIG. 746 is a sectional view (taken on line I4–I4' in FIG. 72) illustrating a production step of Production Example 28 for producing a semiconductor memory in accordance with the present invention;

FIG. 747 is a sectional view (taken on line I5–I5' in FIG. 72) illustrating a production step of Production Example 28 for producing a semiconductor memory in accordance with the present invention;

FIG. 748 is a sectional view (taken on line H–H' in FIG. 74) illustrating a production step of Production Example 29 for producing a semiconductor memory in accordance with the present invention;

FIG. 749 to FIG. 753 are sectional views (shifted in parallel in a H–H' direction within a lead-out portion of a wiring layer in a sectional view taken on line I–I' in FIG. 68) illustrating production steps of Production Example 29 for producing a semiconductor memory in accordance with the present invention;

FIG. 754 is a sectional view (taken on line A–A' in FIG. 1) illustrating a production step of Production Example 30 for producing a semiconductor memory in accordance with the present invention;

FIG. 755 is a sectional view (taken on line B–B' in FIG. 1) illustrating a production step of Production Example 30 for producing a semiconductor memory in accordance with the present invention;

FIG. 756 to FIG. 764 are sectional views (taken on line A–A' in FIG. 66) illustrating production steps of Production Example 31 for producing a semiconductor memory in accordance with the present invention;

FIG. 765 to FIG. 773 are sectional views (taken on line B–B' in FIG. 66) illustrating production steps of Production Example 31 for producing a semiconductor memory in accordance with the present invention;

FIG. 774 is a sectional view (taken on line A–A' in FIG. 66) illustrating a production step of Production Example 31 for producing a semiconductor memory in accordance with the present invention;

FIG. 775 is a sectional view (taken on line B–B' in FIG. 66) illustrating a production step of Production Example 31 for producing a semiconductor memory in accordance with the present invention;

FIG. 776 is a sectional view (taken on line H–H' in FIG. 62) illustrating a production step of Production Example 32 for producing a semiconductor memory in accordance with the present invention;

FIG. 777 is a sectional view (taken on line I1–I1' in FIG. 62) illustrating a production step of Production Example 32 for producing a semiconductor memory in accordance with the present invention;

FIG. 778 is a sectional view (taken on line I2–I2' in FIG. 62) illustrating a production step of Production Example 32 for producing a semiconductor memory in accordance with the present invention;

FIG. 779 is a sectional view (taken on line I3–I3' in FIG. 62) illustrating a production step of Production Example 32 for producing a semiconductor memory in accordance with the present invention;

FIG. 780 is a sectional view (taken on line I4–I4' in FIG. 62) illustrating a production step of Production Example 32 for producing a semiconductor memory in accordance with the present invention;

FIG. 781 is a sectional view (taken on line I5–I5' in FIG. 62) illustrating a production step of Production Example 32 for producing a semiconductor memory in accordance with the present invention;

FIG. 782 is a sectional view (taken on line H–H' in FIG. 62) illustrating a production step of Production Example 32 for producing a semiconductor memory in accordance with the present invention;

FIG. 783 is a sectional view (taken on line I1–I1' in FIG. 62) illustrating a production step of Production Example 32 for producing a semiconductor memory in accordance with the present invention;

FIG. 784 is a sectional view (taken on line I2–I2' in FIG. 62) illustrating a production step of Production Example 32 for producing a semiconductor memory in accordance with the present invention;

FIG. 785 is a sectional view (taken on line I3–I3' in FIG. 62) illustrating a production step of Production Example 32 for producing a semiconductor memory in accordance with the present invention;

FIG. 786 is a sectional view (taken on line I4–I4' in FIG. 62) illustrating a production step of Production Example 32 for producing a semiconductor memory in accordance with the present invention;

FIG. 787 is a sectional view (taken on line I5–I5' in FIG. 62) illustrating a production step of Production Example 32 for producing a semiconductor memory in accordance with the present invention;

FIG. 788 is a sectional view (taken on line H–H' in FIG. 62) illustrating a production step of Production Example 32 for producing a semiconductor memory in accordance with the present invention;

FIG. 789 is a sectional view (taken on line I1–I1' in FIG. 62) illustrating a production step of Production Example 32 for producing a semiconductor memory in accordance with the present invention;

FIG. 790 is a sectional view (taken on line I2–I2' in FIG. 62) illustrating a production step of Production Example 32 for producing a semiconductor memory in accordance with the present invention;

FIG. 791 is a sectional view (taken on line I3–I3' in FIG. 62) illustrating a production step of Production Example 32 for producing a semiconductor memory in accordance with the present invention;

FIG. 792 is a sectional view (taken on line I4–I4' in FIG. 62) illustrating a production step of Production Example 32 for producing a semiconductor memory in accordance with the present invention;

FIG. 793 is a sectional view (taken on line I5–I5' in FIG. 62) illustrating a production step of Production Example 32 for producing a semiconductor memory in accordance with the present invention;

FIG. 794 is a sectional view (taken on line H–H' in FIG. 62) illustrating a production step of Production Example 32 for producing a semiconductor memory in accordance with the present invention;

FIG. 795 is a sectional view (taken on line I1–I1' in FIG. 62) illustrating a production step of Production Example 32 for producing a semiconductor memory in accordance with the present invention;

FIG. 796 is a sectional view (taken on line I2–I2' in FIG. 62) illustrating a production step of Production Example 32 for producing a semiconductor memory in accordance with the present invention;

FIG. 797 is a sectional view (taken on line I3–I3' in FIG. 62) illustrating a production step of Production Example 32 for producing a semiconductor memory in accordance with the present invention;

FIG. 798 is a sectional view (taken on line I4–I4' in FIG. 62) illustrating a production step of Production Example 32 for producing a semiconductor memory in accordance with the present invention;

FIG. 799 is a sectional view (taken on line I5–I5' in FIG. 62) illustrating a production step of Production Example 32 for producing a semiconductor memory in accordance with the present invention;

FIG. 800 is a plan view illustrating a prior-art EEPROM;

FIG. 801 shows sectional views taken on line A–A' and line B–B' in FIG. 800;

FIG. 802 to FIG. 805 are sectional views illustrating production steps for producing a prior-art EEPROM;

FIG. 806 shows a plan view illustrating a prior-art EEPROM and a corresponding equivalent circuit;

FIG. 807 is a sectional view of a conventional memory cell of an NMOS structure;

FIG. 808 is a sectional view of another prior-art memory cell of the NMOS structure; and FIG. 809 is a sectional view of a semiconductor device having a plurality of memory cells on one pillar-form silicon layer.

DESCRIPTION OF THE PREFERRED EMBODIMENTS

The semiconductor memory of the present invention mainly has a first conductivity type semiconductor substrate and one or more memory cells. The memory cell is constituted of an island-like semiconductor layer, at least one charge storage layer and at least one control gate (a third electrode). The charge storage layer and the control gate is formed around a sidewall of the island-like semiconductor layer. At least one of said one or more memory cells is electrically insulated from the semiconductor substrate.

That "at least one of said one or more memory cells is electrically insulated from the semiconductor substrate" means that the island-like semiconductor layer is electrically insulated from the semiconductor substrate. If two or more memory cells are formed in one island-like semiconductor layer, memory cells are electrically insulated and thereby a memory cell/memory cells above an insulating site is/are electrically insulated from the semiconductor substrate. If a selection gate (memory gate) is formed below the memory cell(s), a selection transistor composed of the selection gate is electrically insulated from the semiconductor substrate or the selection transistor is electrically insulated from a memory cell and thereby a memory cell/memory cells above an insulating site is/are electrically insulated from the semiconductor substrate. It is preferably in particular that the selection transistor is formed between the semiconductor substrate and the island-like semiconductor layer or below the memory cell(s) and the selection transistor is electrically insulated from the semiconductor substrate.

Electric insulation may be made, for example, by forming a second conductivity type impurity diffusion layer over a region to be insulated, by forming the second conductivity type impurity diffusion layer in part of the region to be insulated and utilizing a depletion layer at a junction of the second conductivity type impurity diffusion layer, or by providing a distance not allowing electric conduction and achieving electric insulation as a result. The semiconductor substrate may be electrically insulated from the memory cell(s) or the selection transistor by an insulating film of $SiO_2$ or the like. In the case where a plurality of memory cells are formed in one island-like semiconductor layer and selection transistors are optionally formed above or below the memory cells, the electric insulation may be formed between optional memory cells and/or a selection transistor and a memory cell.

The charge storage layer and the control gate may be formed all around the sidewall of the island-like semiconductor layer or on a part of the sidewall.

Only one memory cell or two or more memory cells may be formed on one island-like semiconductor layer. If three or more memory cells are formed, a selection gate is preferably formed below or above the memory cells to form a selection transistor together with the island-like semiconductor layer.

Hereinafter, are explained constructions in which a plurality of, for example, two memory cells are arranged in series on one island-like semiconductor layer, island-like semiconductor layers are arranged in matrix and selection transistors are disposed below and above the memory cells. A gate electrode of the selection transistor below the memory cells is represented as a second electrode and a gate electrode of the selection transistor above the memory cells is represented as a fifth electrode. A tunnel insulating film is represented as a third insulating film, a sidewall spacer is represented as a fourth insulating film, and a gate insulating film which is a part of the selection transistor is represented as a thirteenth insulating film.

In the above-mentioned semiconductor memory, an impurity diffusion layer for reading the state of a charge stored in the memory cells is formed as a source or drain (first wiring) of the memory cells in the island-like semiconductor layer. This impurity diffusion layer electrically insulates the island-like semiconductor layer from the semiconductor substrate. Control gates formed in a plurality of island-like semiconductor layers are arranged continuously in one direction to form a control gate line (third wiring). Another impurity diffusion layer is formed as a source or drain of the memory cells in the island-like semiconductor layer and a plurality of such impurity diffusion layers in a direction crossing the control gate line are electrically connected to form a bit line (fourth wiring).

Although the control gate line and the bit line orthogonal to the control gate may be in any three-dimensional directions, are explained hereinafter constructions in which the lines are formed in directions horizontal to the semiconductor substrate.

Embodiments of Memory Cell Arrays as Shown in Plan Views

Figure 1:
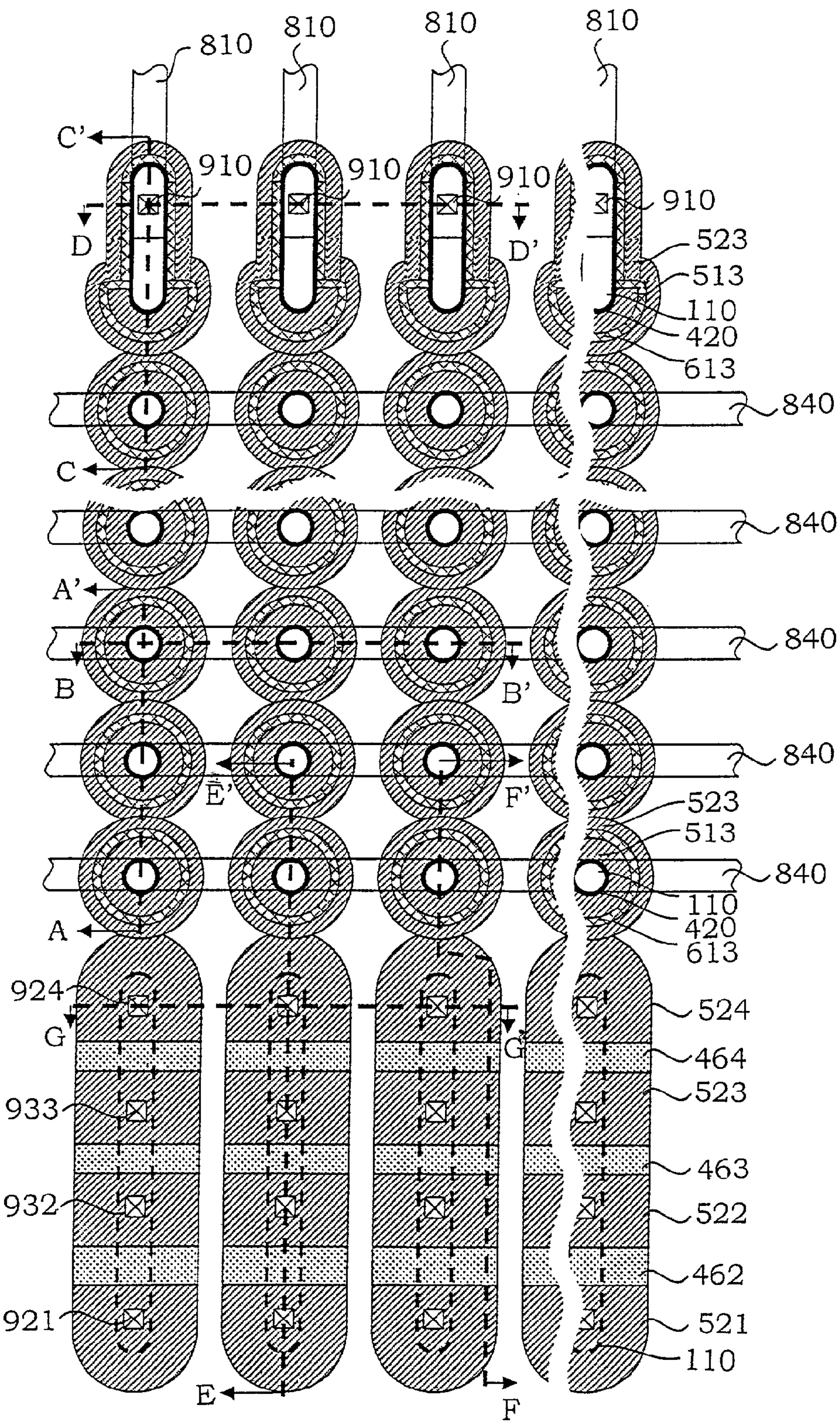
FIG. 1 is a plan view illustrating a memory cell array of an EEPROM having floating gates as charge storage layers in accordance with the present invention.
Figure 65:
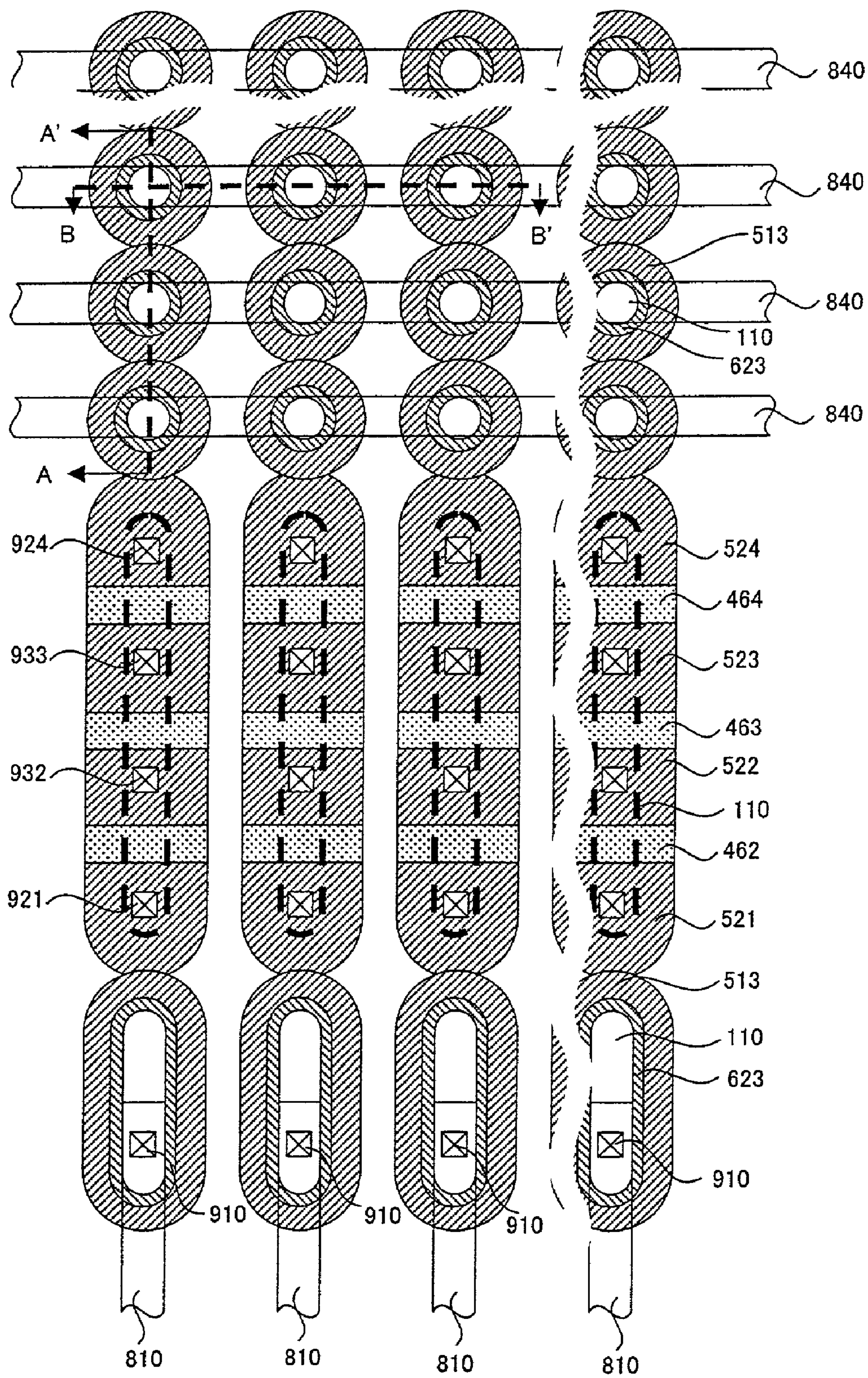
FIG. 65 is a plan view illustrating a memory cell array of a MONOS structure having laminated insulating films as charge storage layers in accordance with the present invention.
Figure 66:
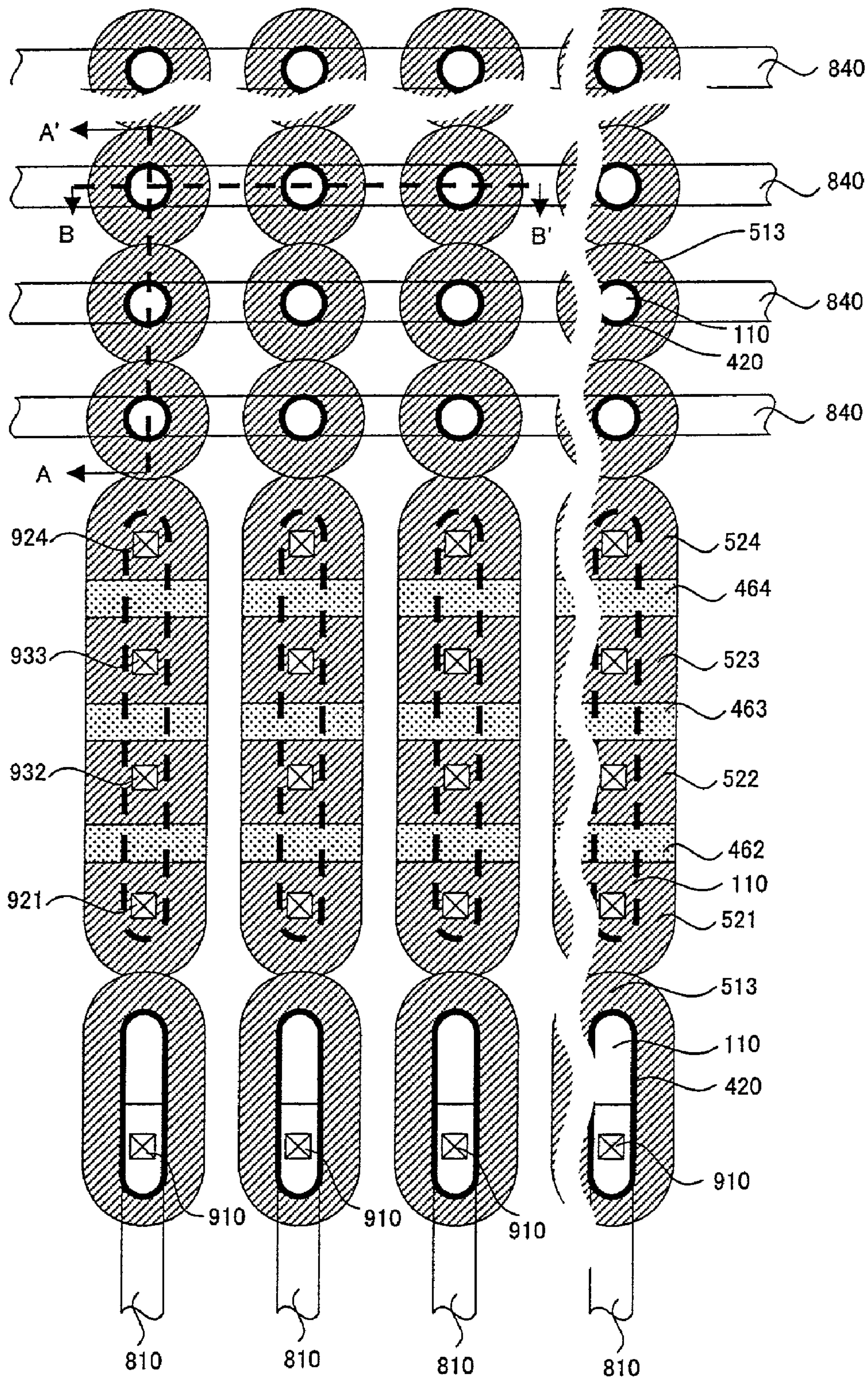
FIG. 66 is a plan view illustrating a memory cell array of a DRAM structure having MIS capacitors as charge storage layers in accordance with the present invention.
Figure 67:
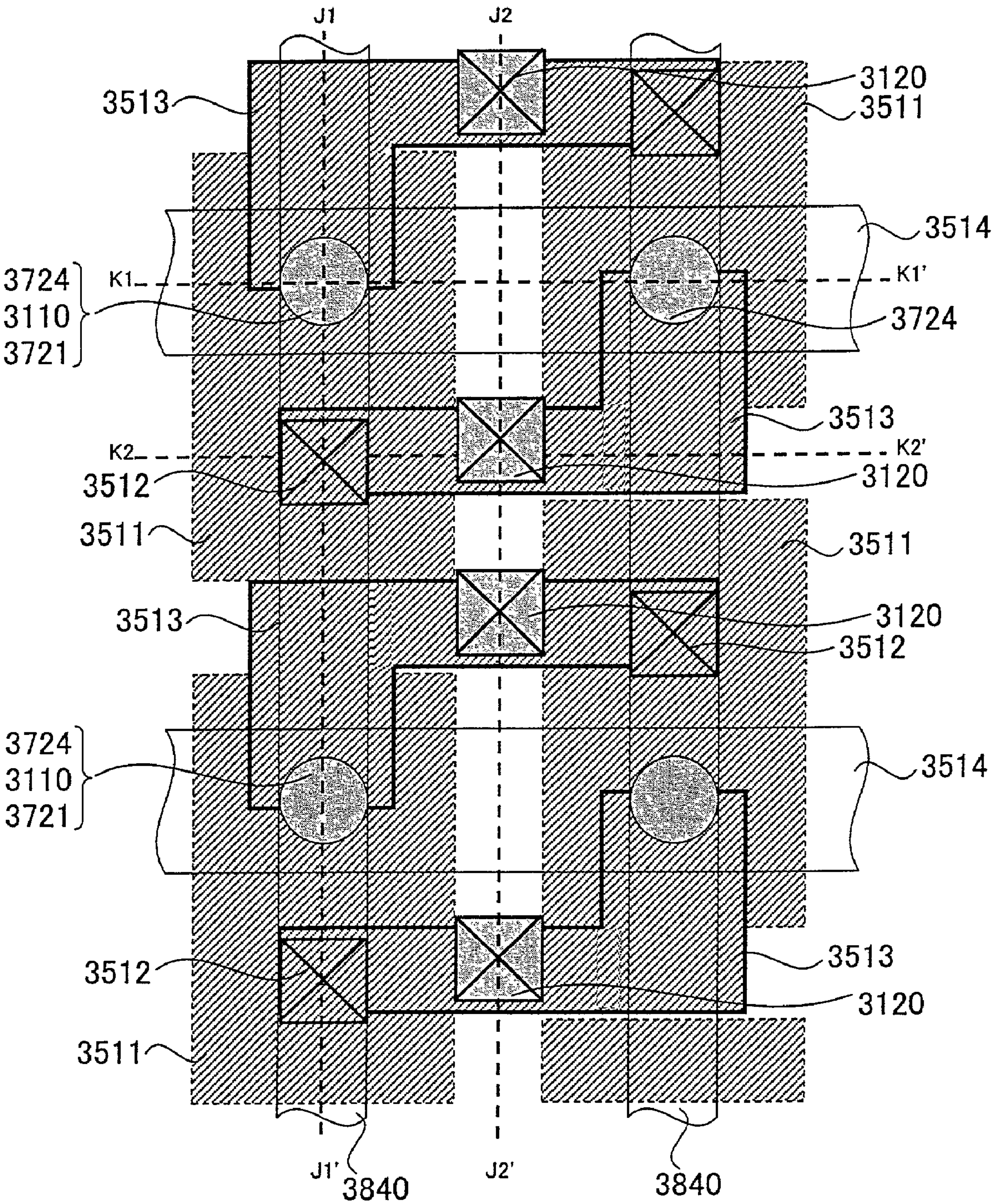
FIG. 67 is a plan view illustrating a memory cell array of a SRAM structure having MIS transistors as charge storage layers in accordance with the present invention.

The memory cell array in the semiconductor memory of the present invention is described with reference to plan views shown in FIG. 1 to FIG. 72. FIGS. 1 to 64 and FIGS. 68 to 72 illustrate examples of EEPROM memory cell arrays having floating gates as charge storage layers. FIG. 65 illustrates a memory cell array of MONOS structure having laminated insulating films as charge storage layers, FIG. 66 illustrates a memory cell array of DRAM structure having MIS capacitors as charge storage layers, and FIG. 67 illustrates a memory cell array of SRAM structure having MIS transistors as charge storage layers. These figures also illustrate layouts of second or fifth wiring as gate electrodes for selecting memory cells (referred to as "selection gates" hereinafter), third wiring as control gates, fourth wiring as bit lines and first wiring as source lines. Selection gate transistors are not shown for avoiding complexity.

First, explanation is given of the EEPROM memory cell arrays having floating gates as charge storage layers.

In FIG. 1, island-like semiconductor layers in a columnar form for constituting memory cells are arranged to be located at intersections where a group of parallel lines and another group of parallel lines cross at right angles. First, second, third and fourth wiring layers for selecting and controlling the memory cells are disposed in parallel to the surface of the substrate.

By changing intervals between island-like semiconductor layers between an A–A' direction which crosses fourth wiring layers 840 and a B–B' direction which is parallel to the fourth wiring layers 840, second conductive films which act as the control gates of the memory cells are formed continuously in one direction, in the A–A' direction in FIG. 1, to be the third wiring layers. Likewise, second conductive films which act as the gates of the selection gate transistors are formed continuously in one direction to be the second wiring layers.

A terminal for electrically connecting with the first wiring layer disposed on a substrate side of island-like semiconductor layers is provided, for example, at an A' side end of a row of memory cells connected in the A–A' direction in FIG. 1, and terminals for electrically connecting with the second and third wiring layers are provided at an A side end of the row of memory cells connected in the A–A' direction in FIG. 1. The fourth wiring layers 840 disposed on a side of the island-like semiconductor layers opposite to the substrate are electrically connected to the island-like semiconductor layers in the columnar form for constituting memory cells. In FIG. 1, the fourth wiring layers 840 are formed in the direction crossing the second and third wiring layers.

The terminals for electrically connecting with the first wiring layers are formed of island-like semiconductor layers, and the terminals for electrically connecting with the second and third wiring layers are formed of second conductive films covering the island-like semiconductor layers, respectively. The terminals for electrically connecting with the first, second and third wiring layers are connected to first contacts 910, second contacts 921 and 924 and third contacts 932, respectively. In FIG. 1, the first wiring layers 810 are lead out onto the top of the semiconductor memory via the first contacts.

The island-like semiconductor layers in the columnar form for constituting the memory cells may be not only in the form of a column but also in the form of a prism, a polygonalar prism or the like. In the case where they are patterned in columns, it is possible to avoid occurrence of local field concentration on the surface of active regions and have an easy electrical control.

The arrangement of the island-like semiconductor layers in the columnar form is not particularly limited to that shown in FIG. 1 but may be any arrangement so long as the above-mentioned positional relationship and electric connection between the wiring layers are realized.

The island-like semiconductor layers connected to the first contacts 910 are all located at the A' side ends of the memory cells connected in the A–A' direction in FIG. 1. However, they may be located entirely or partially located on the A side ends or may be located at any of the island-like semiconductor layers constituting the memory cells connected in the A–A' direction. The island-like semiconductor layers covered with the second conductive films connected to the second contacts 921 and 924 and the third contacts 932 may be located at the ends where the first contacts 910 are not disposed, may be located adjacently to the island-like semiconductor layers connected to the first contacts 910 at the ends where the first contacts 910 are disposed, and may be located at any of the island-like semiconductor layers constituting the memory cells connected in the A–A' direction. The second contacts 921 and 924 and the third contacts 932 may be located at different places. The width and shape of the first wiring layers 810 and the fourth wiring layers 840 are not particularly limited so long as a desired wiring can be obtained.

In the case where the first wiring layers, which are disposed on the substrate side of the island-like semiconductor layers, are formed in self-alignment with the second and third wiring layers formed of the second conductive films, the island-like semiconductor layers which act as the terminals for electrically connecting with the first wiring layers are electrically insulated from the second and third wiring layers but contact the second and third wiring layers with intervention of insulating films. In FIG. 1, for example, first conductive films are formed partially on the sidewalls of the island-like semiconductor layers connected to the first contacts 910 with intervention of insulating films. The first conductive films are located to face the island-like semiconductor layers for constituting the memory cells. The second conductive films are formed on the first conductive films with intervention of insulating films. The second conductive films are connected to the second and third wiring layers formed continuously in the A–A' direction. At this time, the shape of the first and the second conductive films is not particularly limited.

The first conductive films on the sidewalls of the island-like semiconductor layers which act as the terminals for electrically connecting with the first wiring layers may be removed by setting the distance from said island-like semiconductor layers to the first conductive films on the island-like semiconductor layers for constituting the memory cells, for example, to be two or less times larger than the thickness of the second conductive films. In FIG. 1, the second and third contacts are formed on the second wiring layers 821 and 824 and the third wiring layers 832 which are formed to cover the top of the island-like semiconductor layers. However, the shape of the second and third wiring layers is not particularly limited so long as their connection is realized. FIG. 1 also shows lines for sectional views to be used for explaining examples of production processes, i.e., A–A' line, B–B' line, C–C' line, D–D' line, E–E' line and F–F' line.

Figure 2:
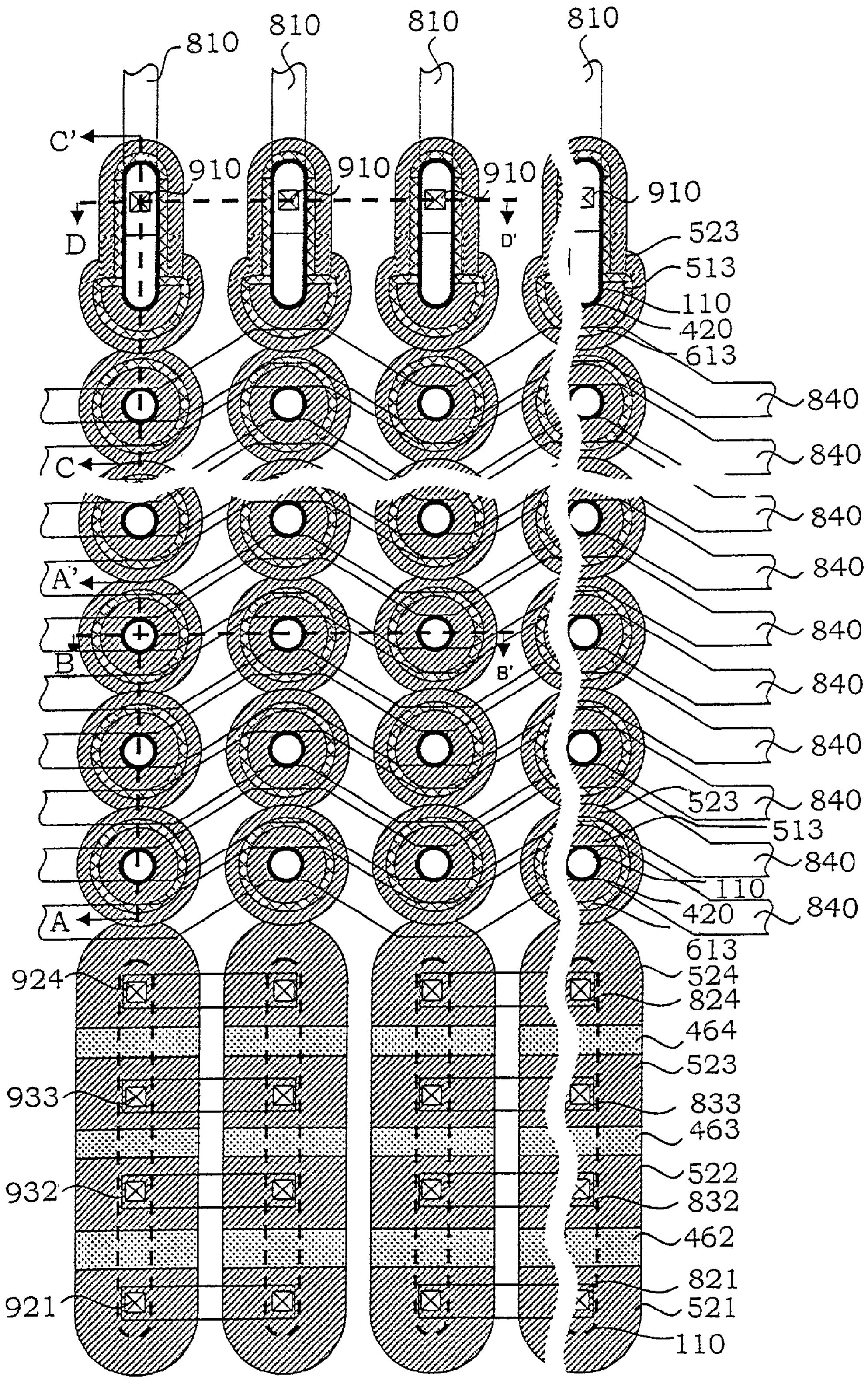
FIG. 2 to FIG. 64 are plan views illustrating other memory cell arrays of EEPROMs having floating gates as charge storage layers in accordance with the present invention.

In FIG. 2, in contrast to FIG. 1, the fourth wiring layers 840 are so arranged that adjacent island-like semiconductor layers in the B–B' direction are not connected to the same fourth wiring layer. In this case, two contacts adjacent in the B–B' direction may be connected, for example, by metal wiring. More particularly, adjacent contacts 924 are connected by the second wiring layer 824, and likewise, adjacent contacts 921, 932 and 933 are connected with the second wiring layer 821, the third wiring layer 832 and the third wiring layer 833, respectively. The contacts 910 may also be connected in the same manner. Alternatively, contacts may be formed to connect, for example, adjacent second conductive films together instead of connecting contacts by wiring layers.

Figure 3:
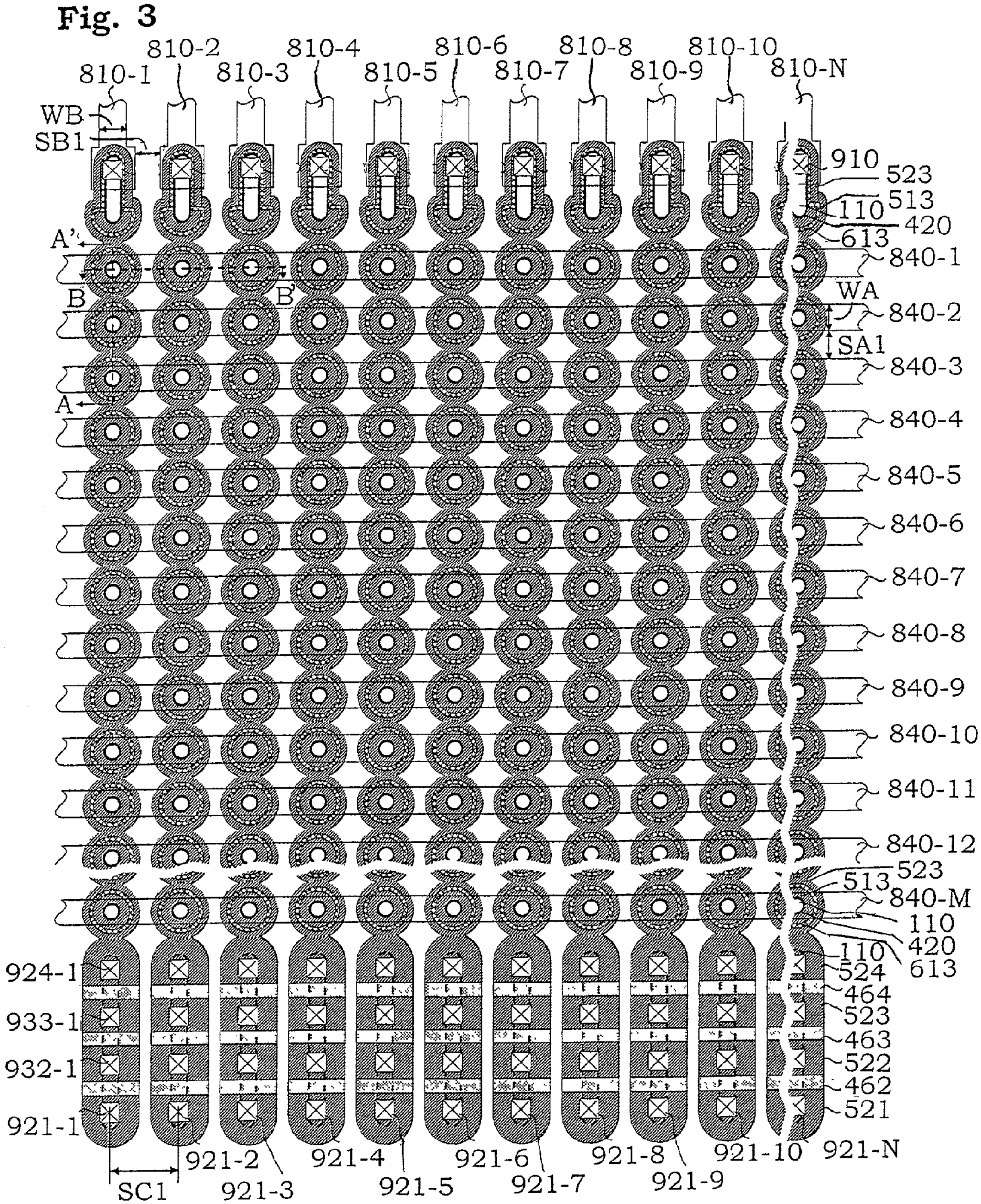

In FIG. 3, in contrast to FIG. 1, the connection relationship between the island-like semiconductor layers 110 and the wiring layers is shown over an extended range so that it is shown that M×N island-like semiconductor layers 110 (M and N are positive integers) are disposed. FIG. 3 shows width WB of the first wiring layers 810-1 to 810-N, width WA of the fourth wiring layer 840-1 to 840-N, the narrowest one SB1 of the intervals between the first wiring layers and the narrowest one SA1 of the intervals between the fourth wiring layers.

FIG. 3 shows a distance SC1 between 921-1 and 921-2 as an interval between second contacts.

Figure 560:
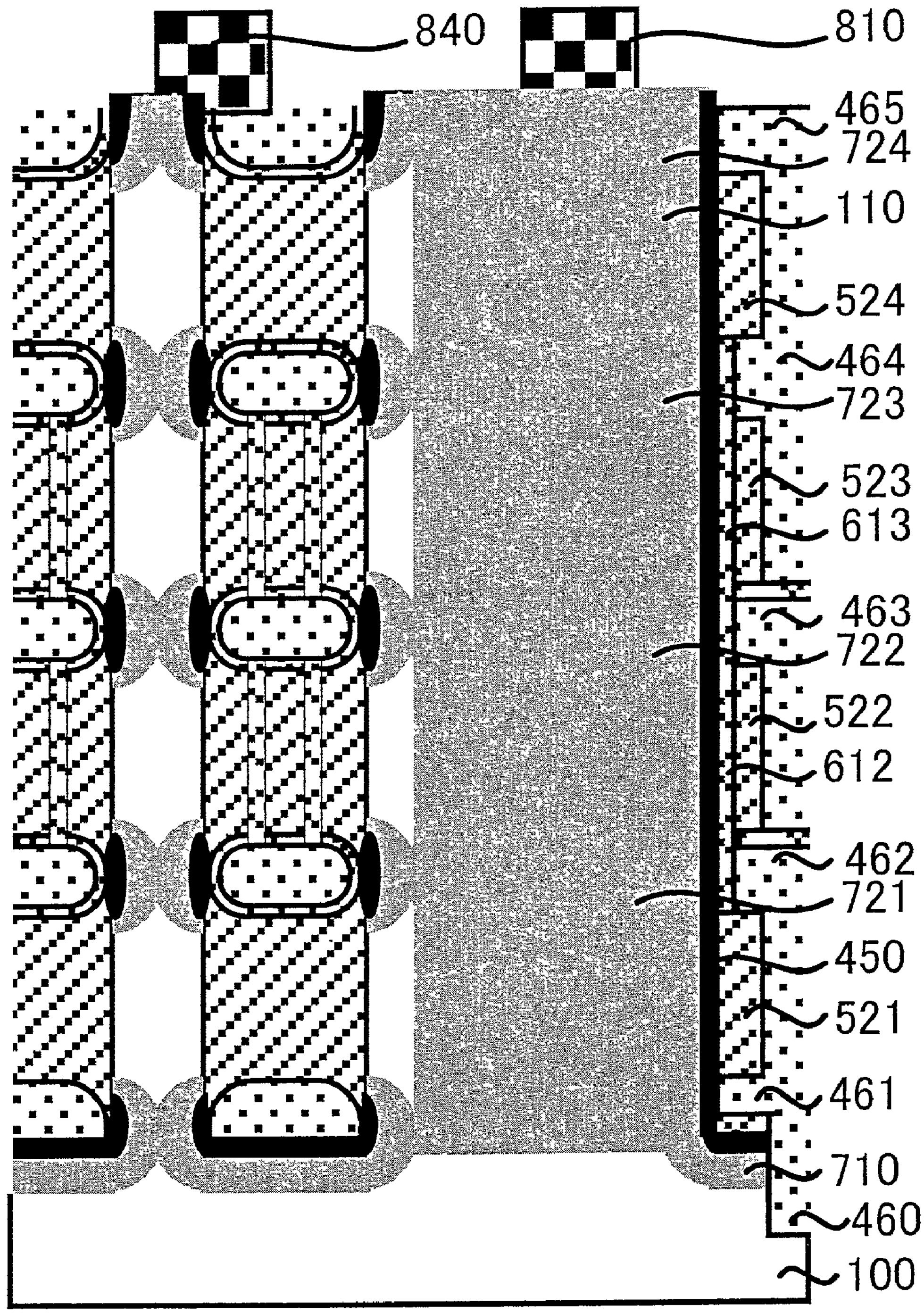
Figure 583:
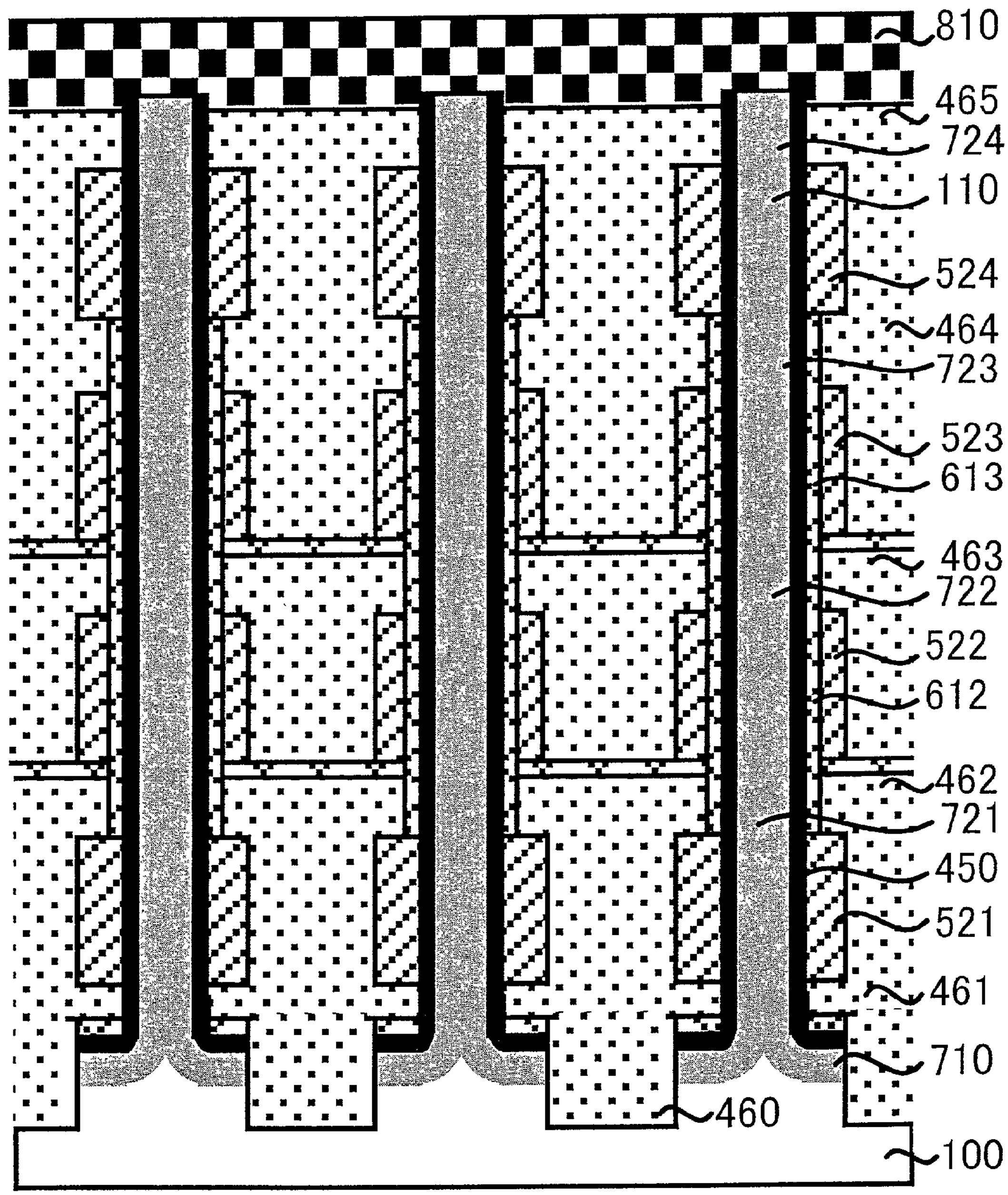
Figure 658:
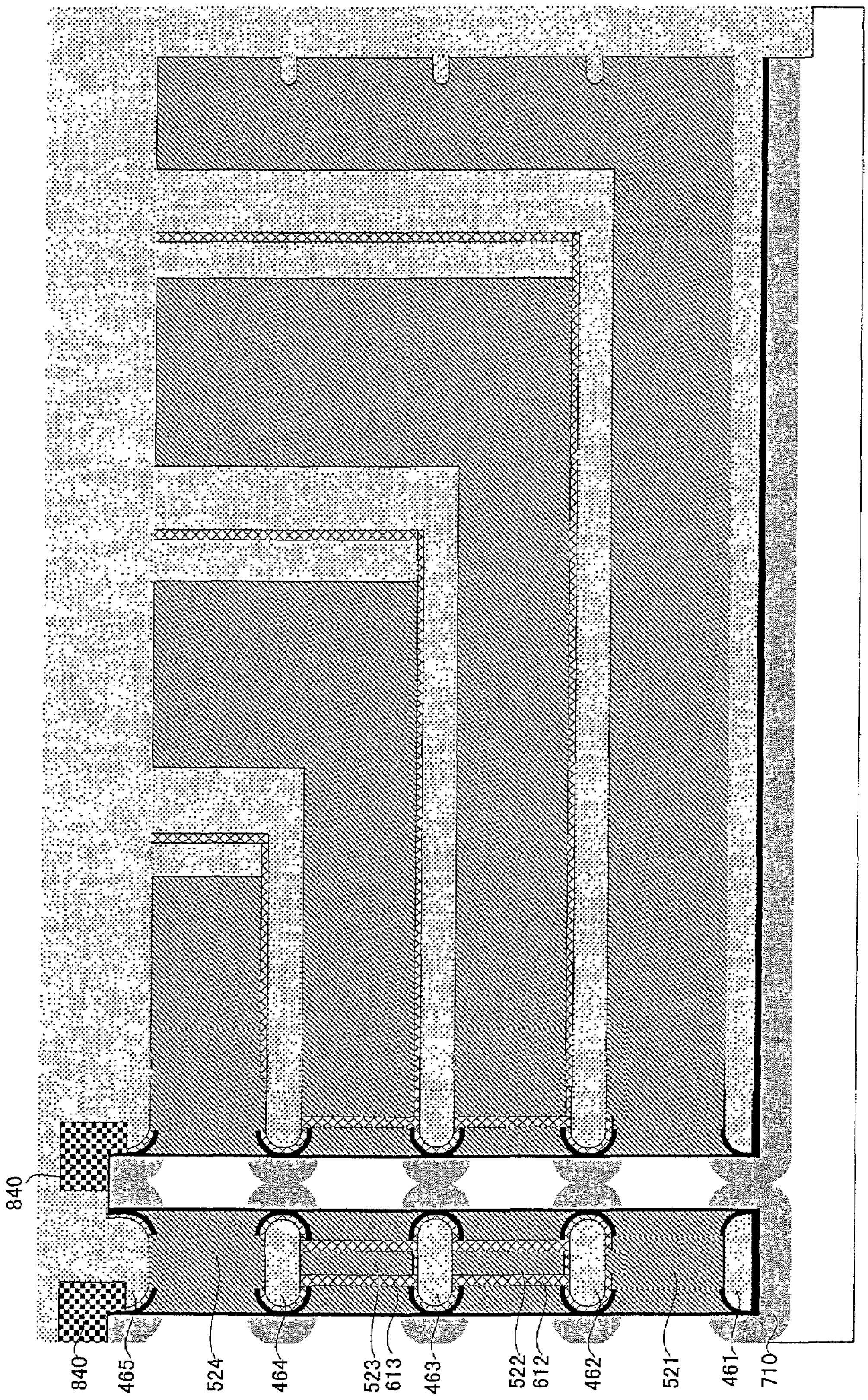
Figure 659:
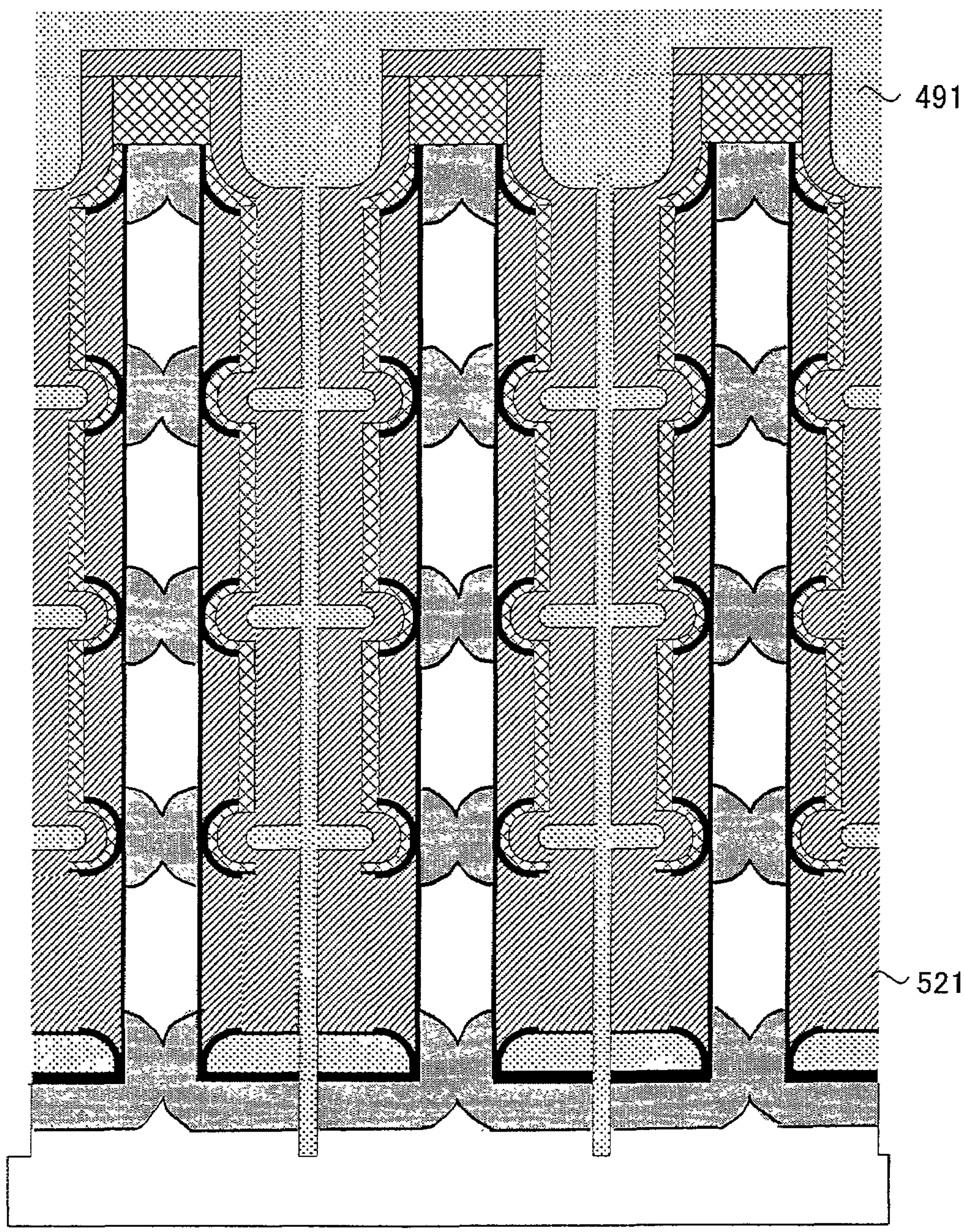
FIG. 659 to FIG. 669 are sectional views (taken on line G–G' in FIG. 1) illustrating production steps of Production Example 22 for producing a semiconductor memory in accordance with the present invention.
Figure 669:
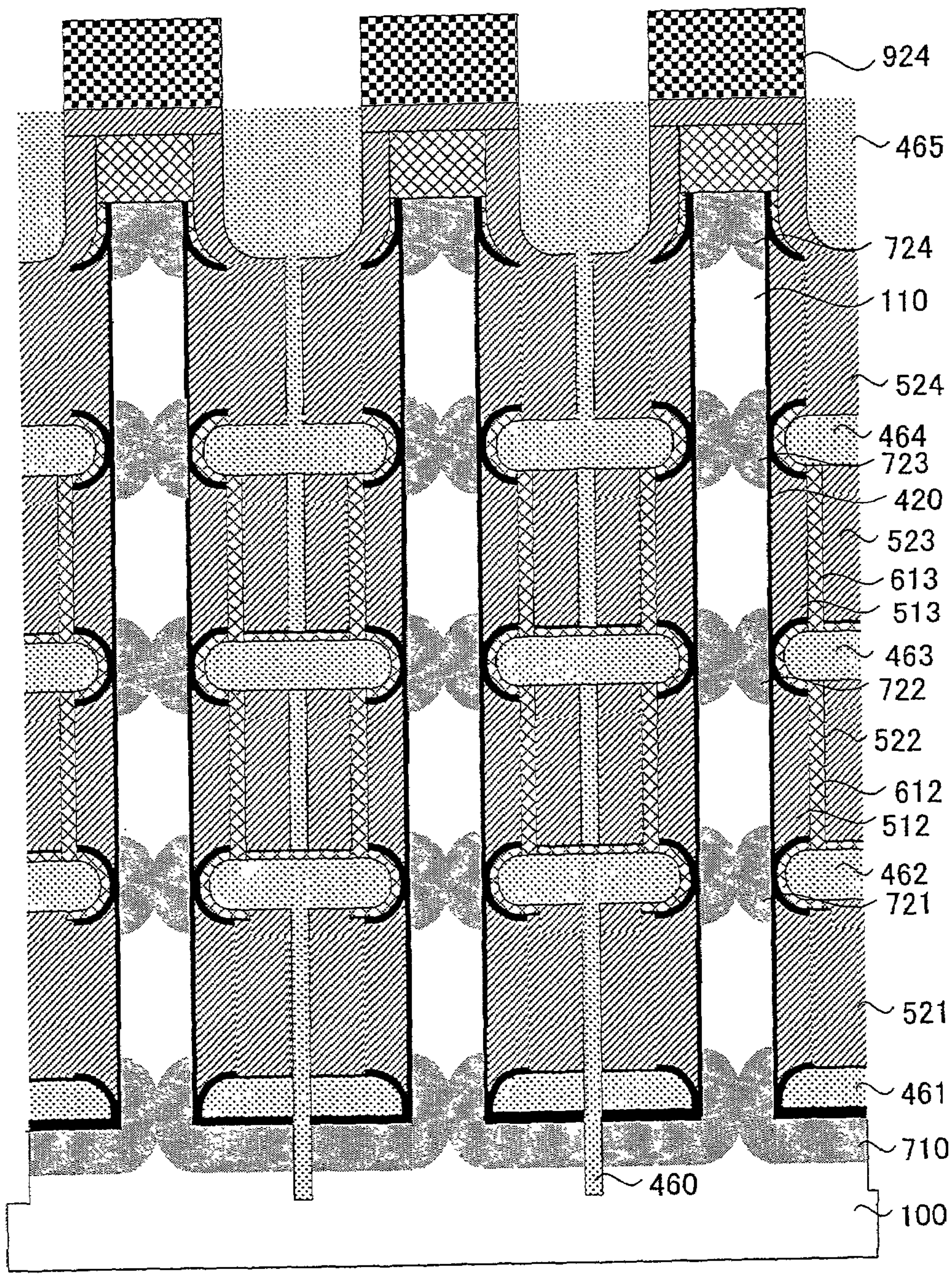
Figure 670:
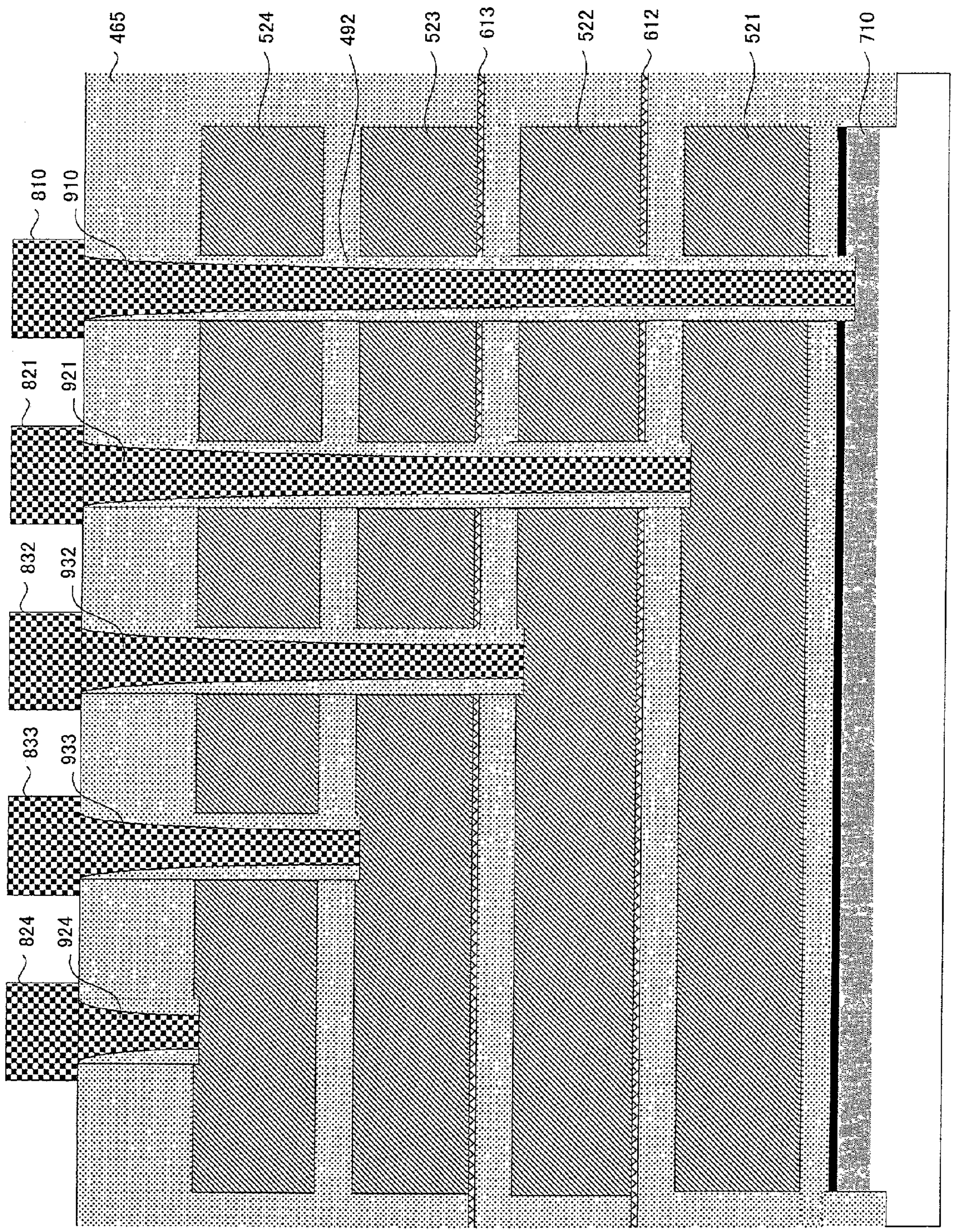
FIG. 670 is a sectional view (taken on line H–H' in FIG. 60) illustrating a production step of Production Example 23 for producing a semiconductor memory in accordance with the present invention.
Figure 671:
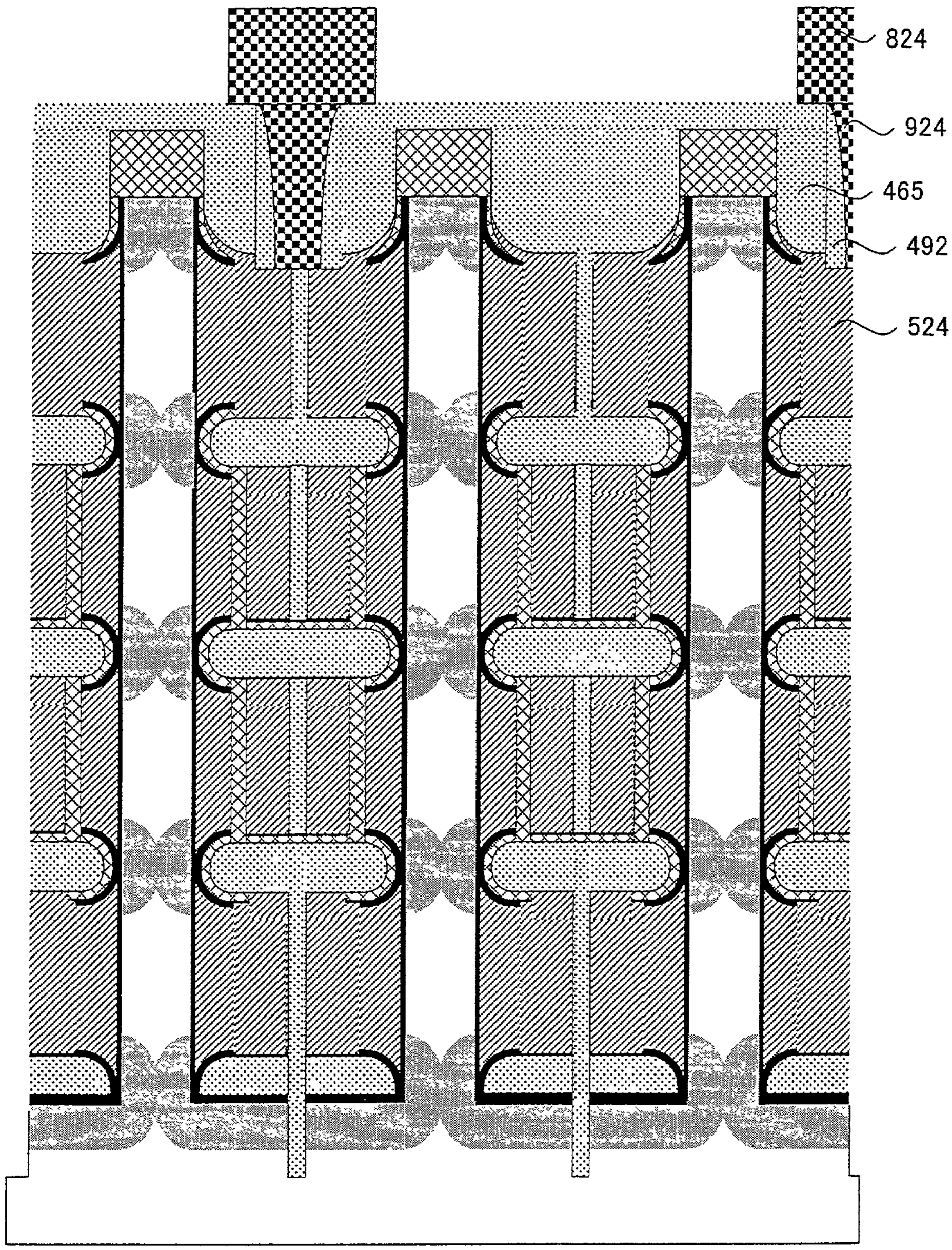
FIG. 671 is a sectional view (taken on line I1–I1' in FIG. 60) illustrating a production step of Production Example 23 for producing a semiconductor memory in accordance with the present invention.
Figure 672:
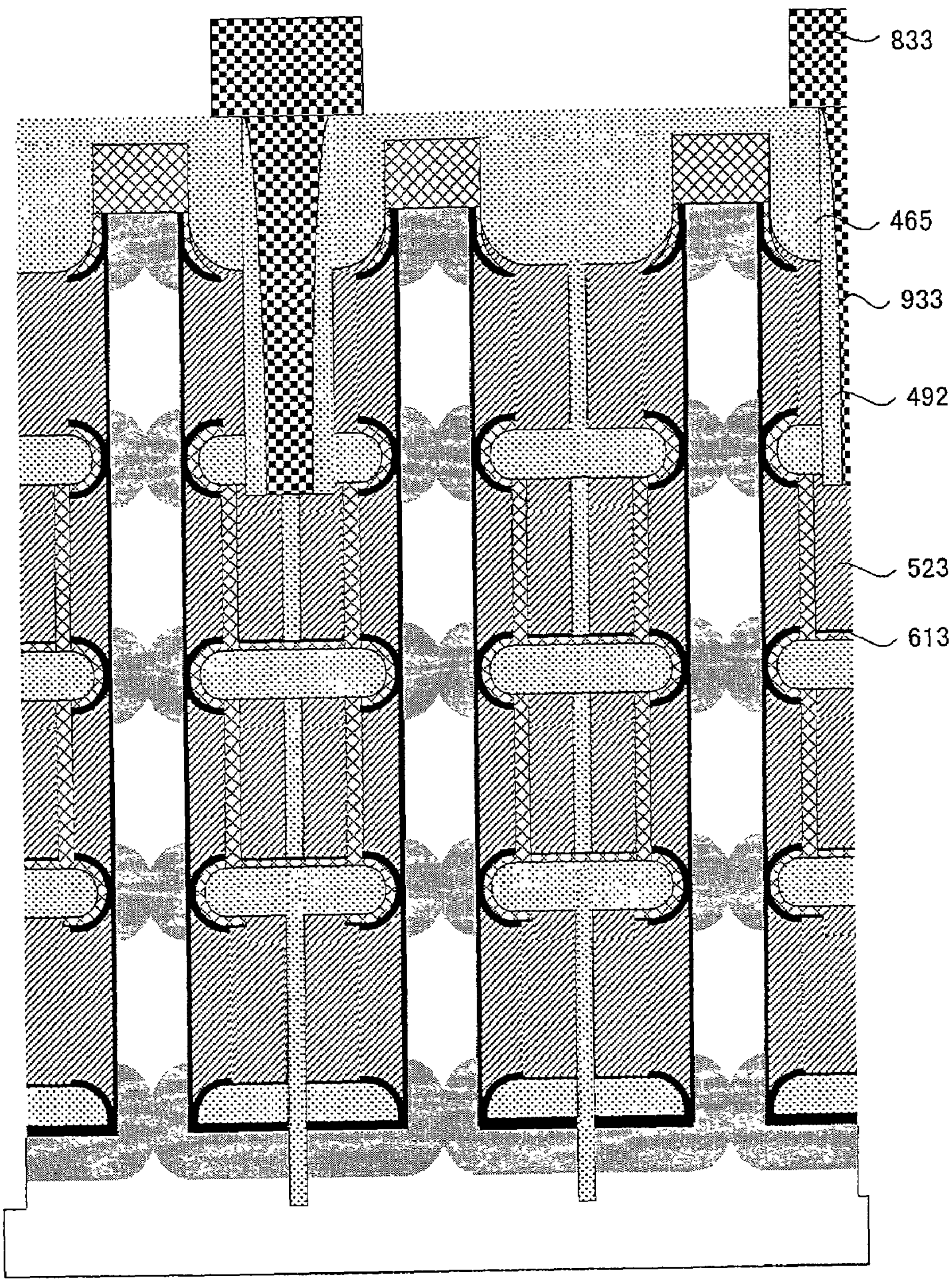
FIG. 672 is a sectional view (taken on line I2–I2' in FIG. 60) illustrating a production step of Production Example 23 for producing a semiconductor memory in accordance with the present invention.
Figure 673:
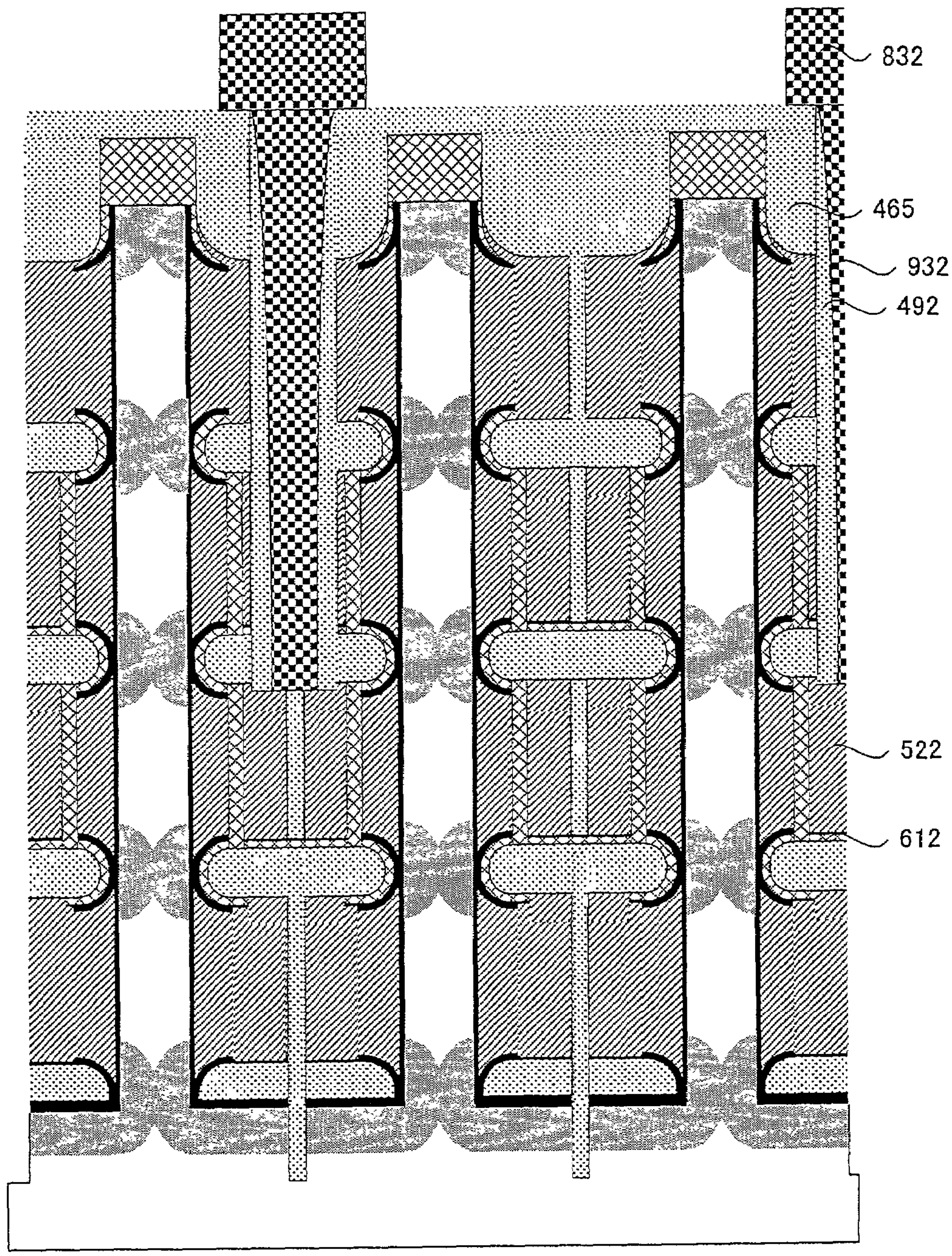
FIG. 673 is a sectional view (taken on line I3–I3' in FIG. 60) illustrating a production step of Production Example 23 for producing a semiconductor memory in accordance with the present invention.
Figure 674:
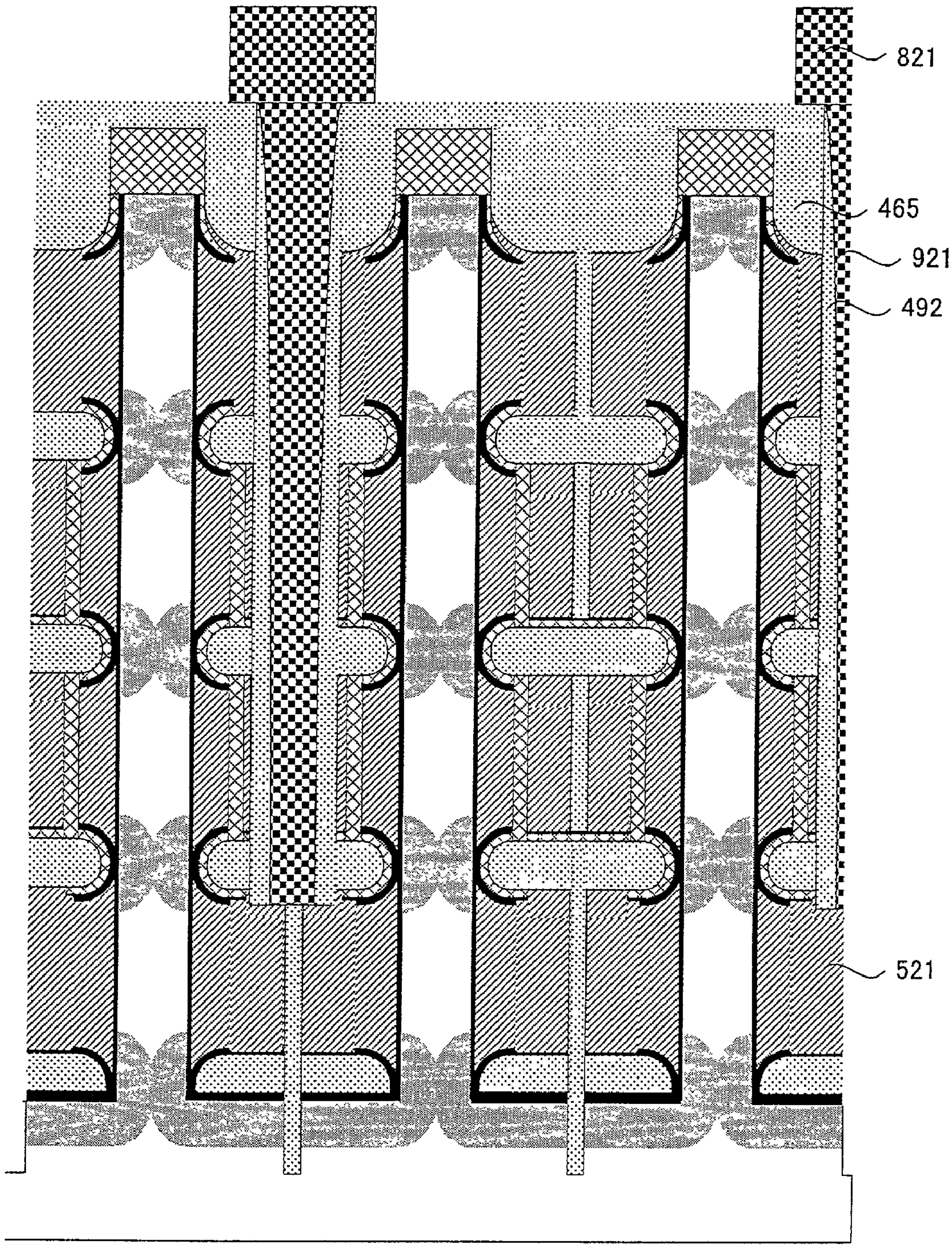
FIG. 674 is a sectional view (taken on line I4–I4' in FIG. 60) illustrating a production step of Production Example 23 for producing a semiconductor memory in accordance with the present invention.
Figure 675:
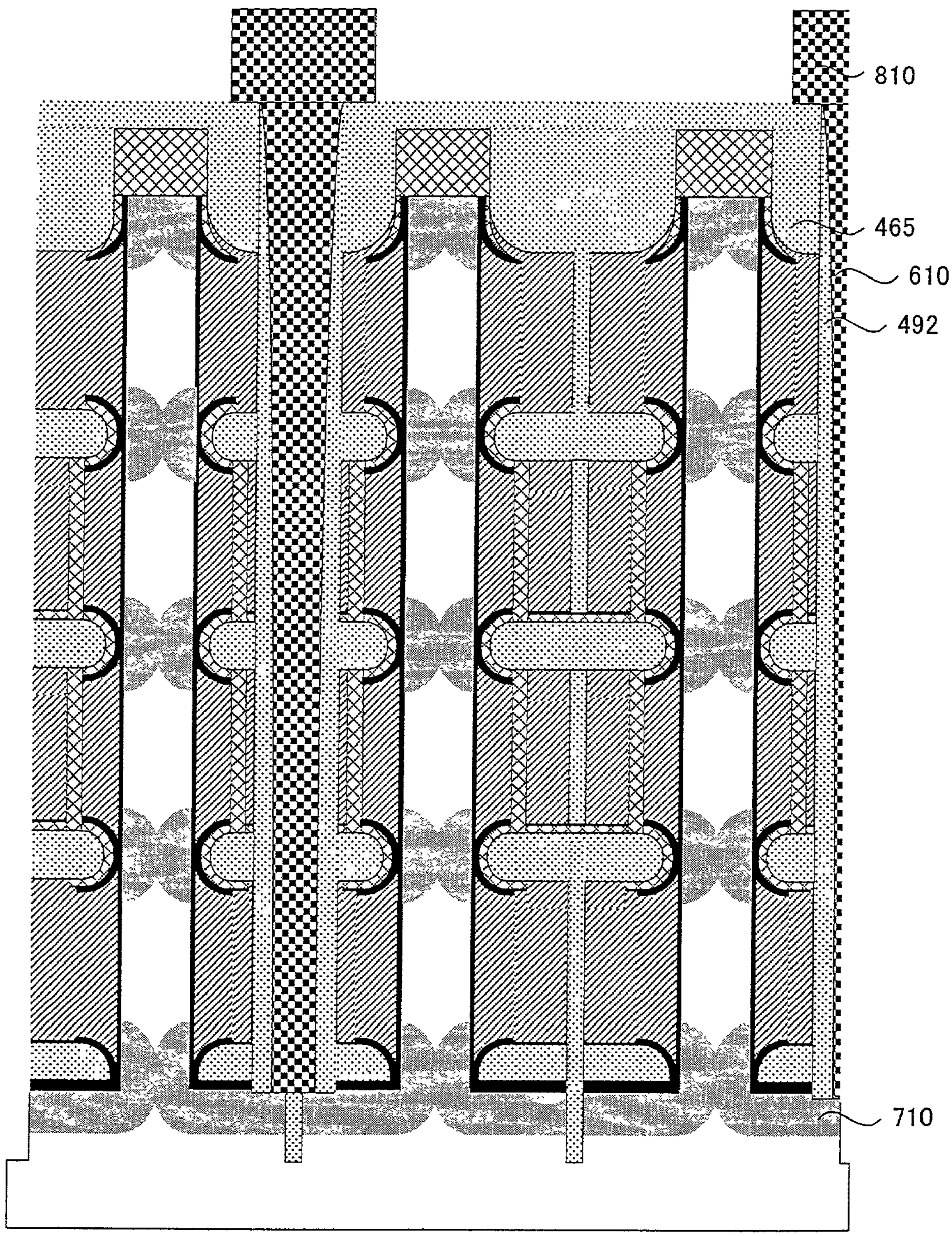
FIG. 675 is a sectional view (taken on line I5–I5' in FIG. 60) illustrating a production step of Production Example 23 for producing a semiconductor memory in accordance with the present invention.
Figure 676:
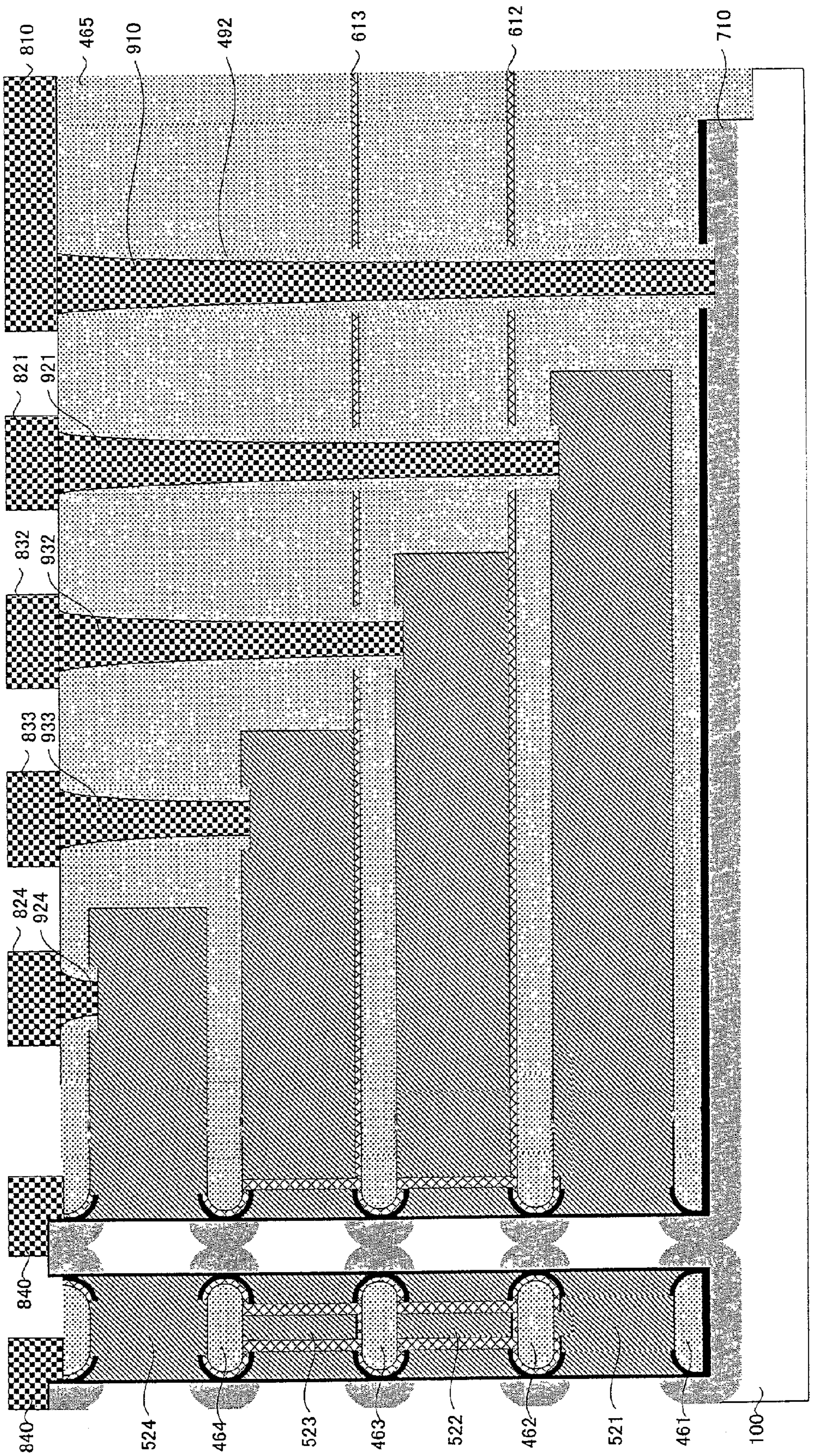
FIG. 676 is a sectional view (taken on line H–H' in FIG. 61) illustrating a production step of Production Example 23 for producing a semiconductor memory in accordance with the present invention.
Figure 677:
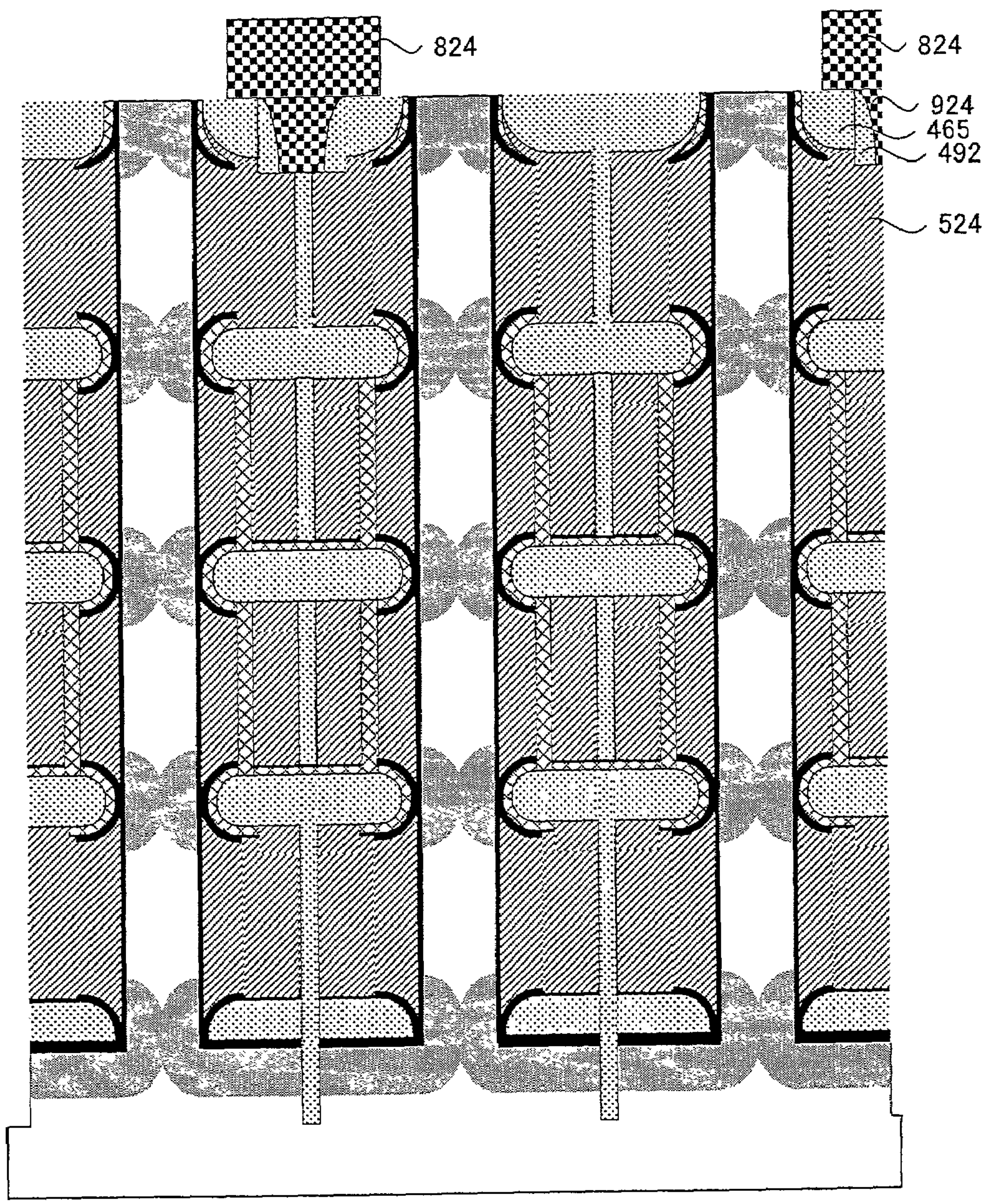
FIG. 677 is a sectional view (taken on line I1–I1' in FIG. 61) illustrating a production step of Production Example 23 for producing a semiconductor memory in accordance with the present invention.
Figure 678:
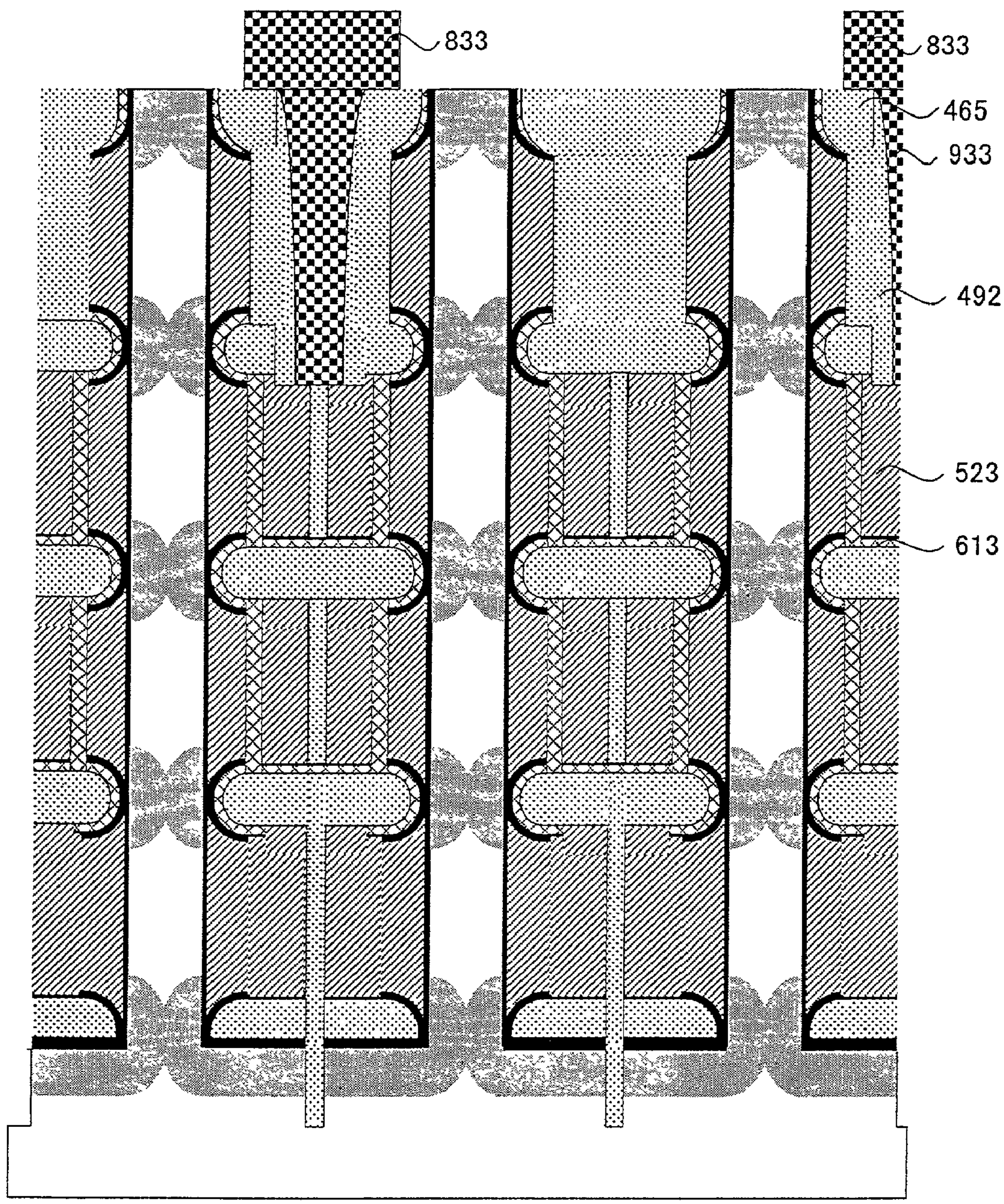
Figure 679:
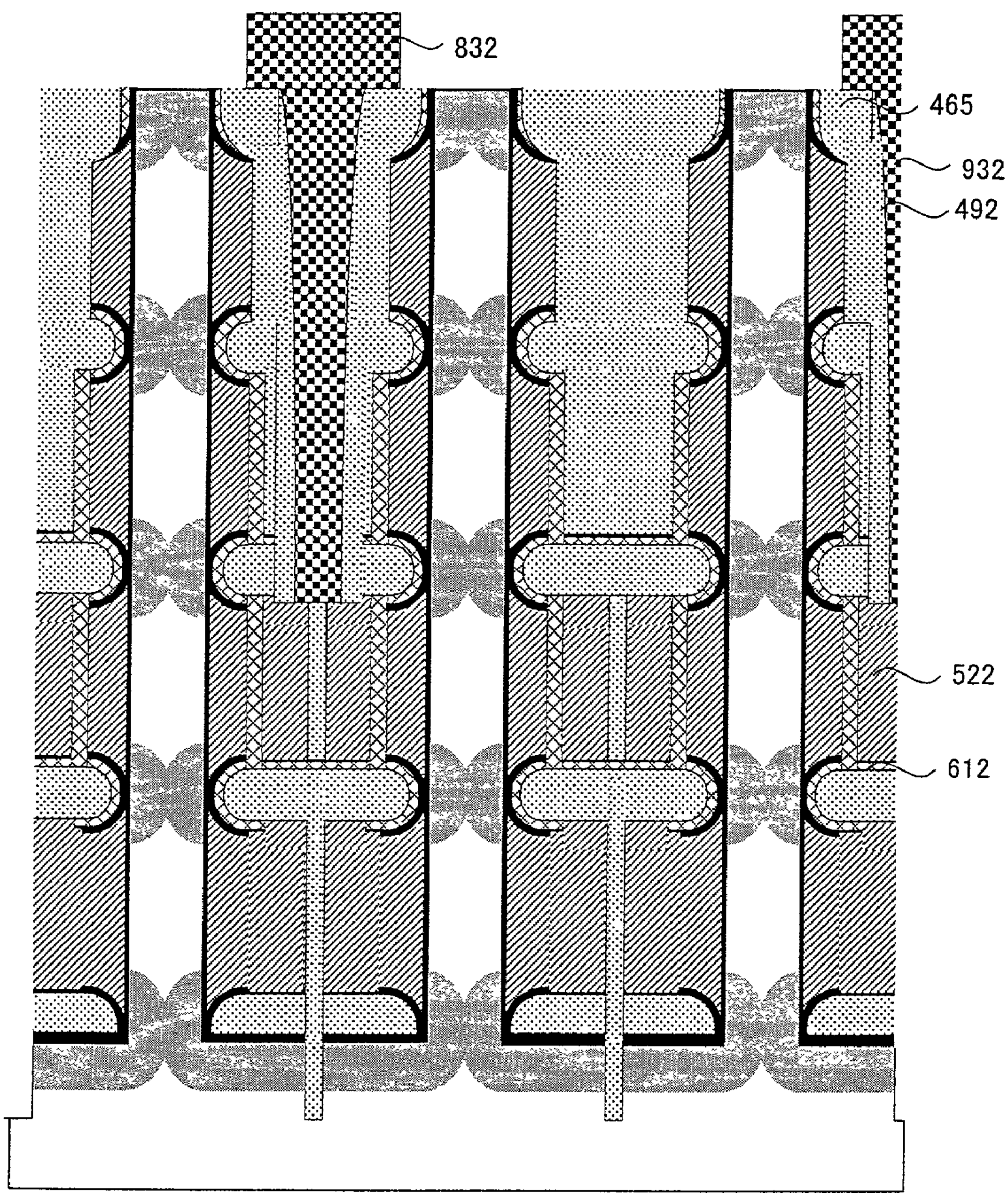
Figure 680:
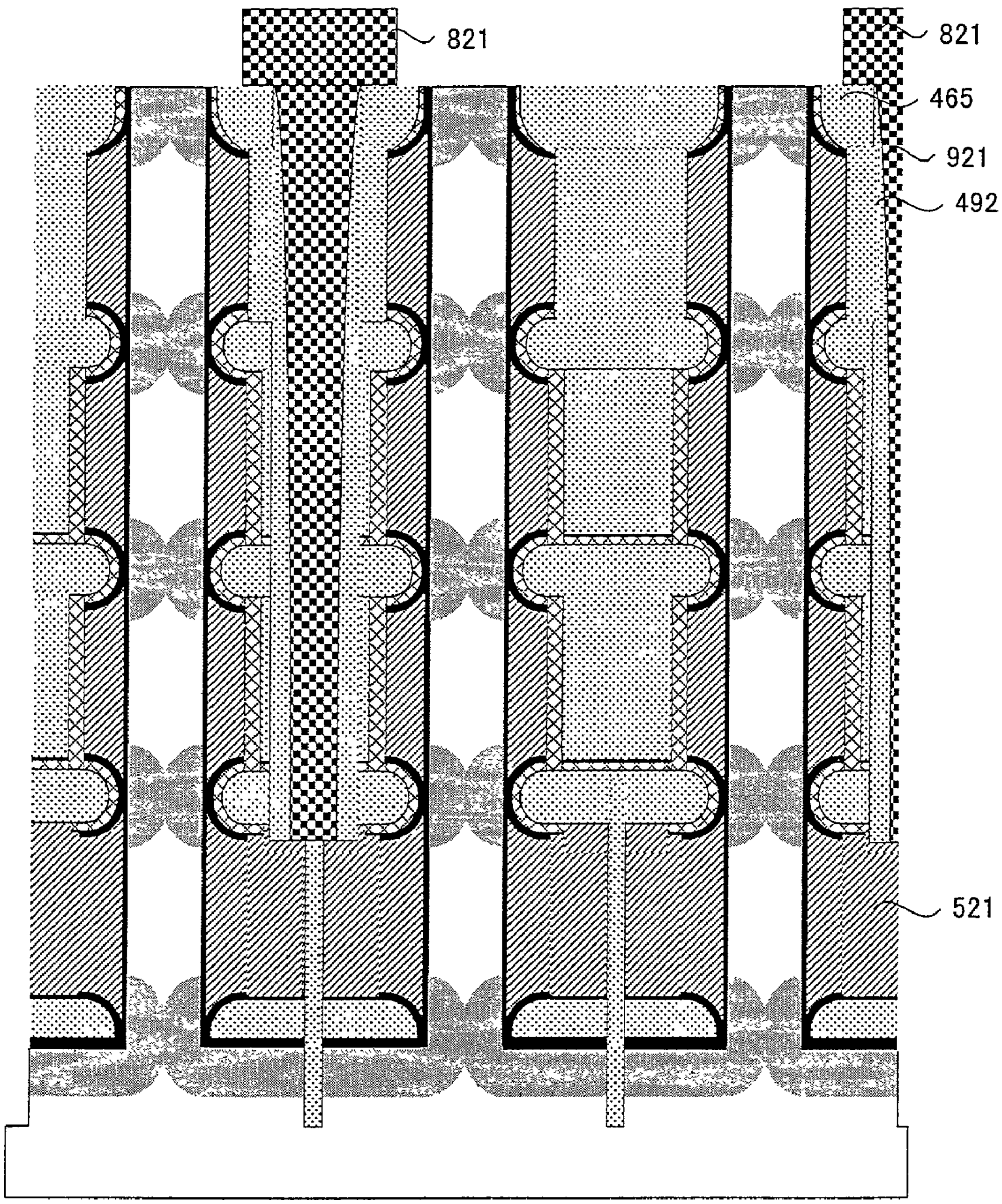
Figure 681:
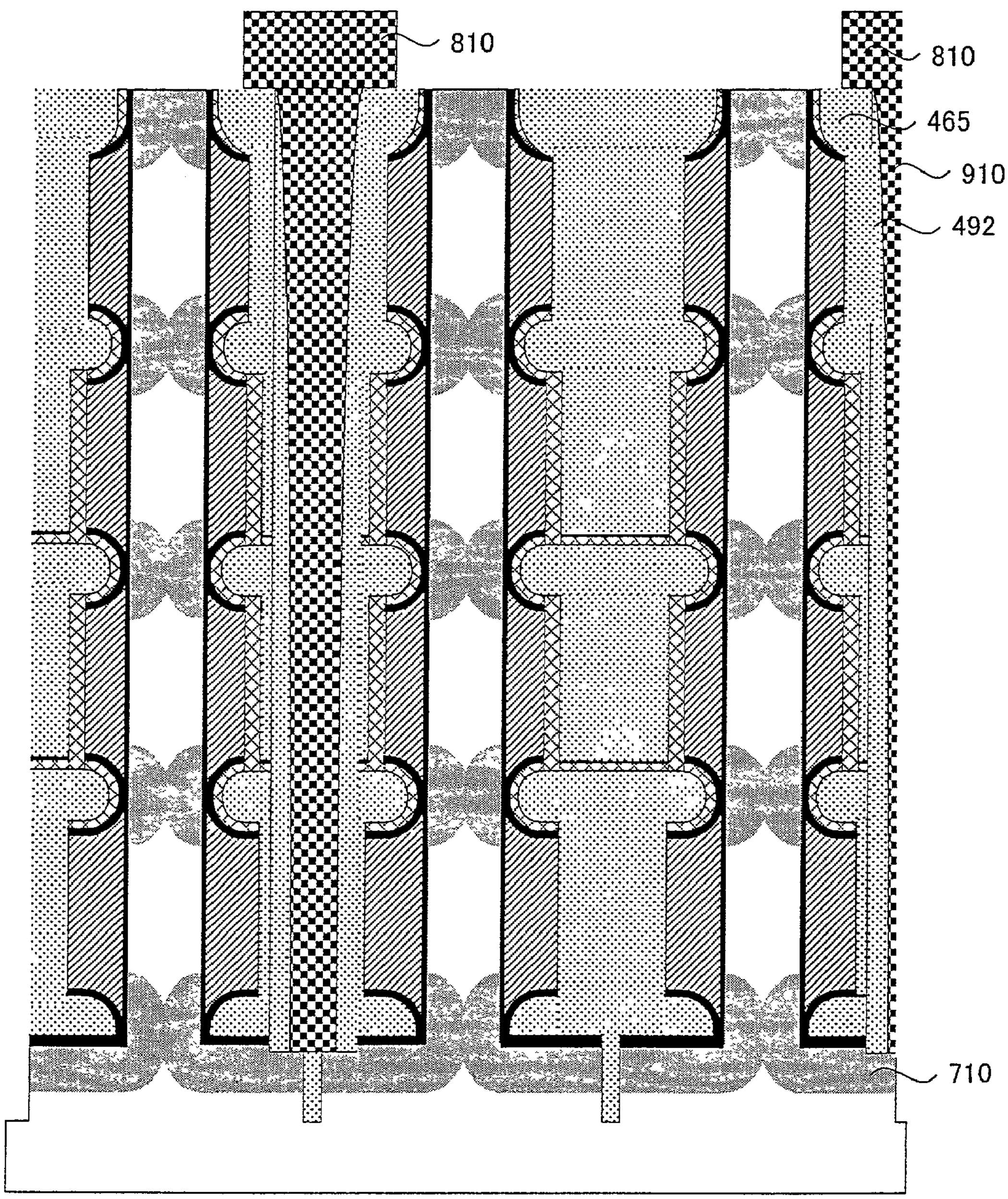
Figure 682:
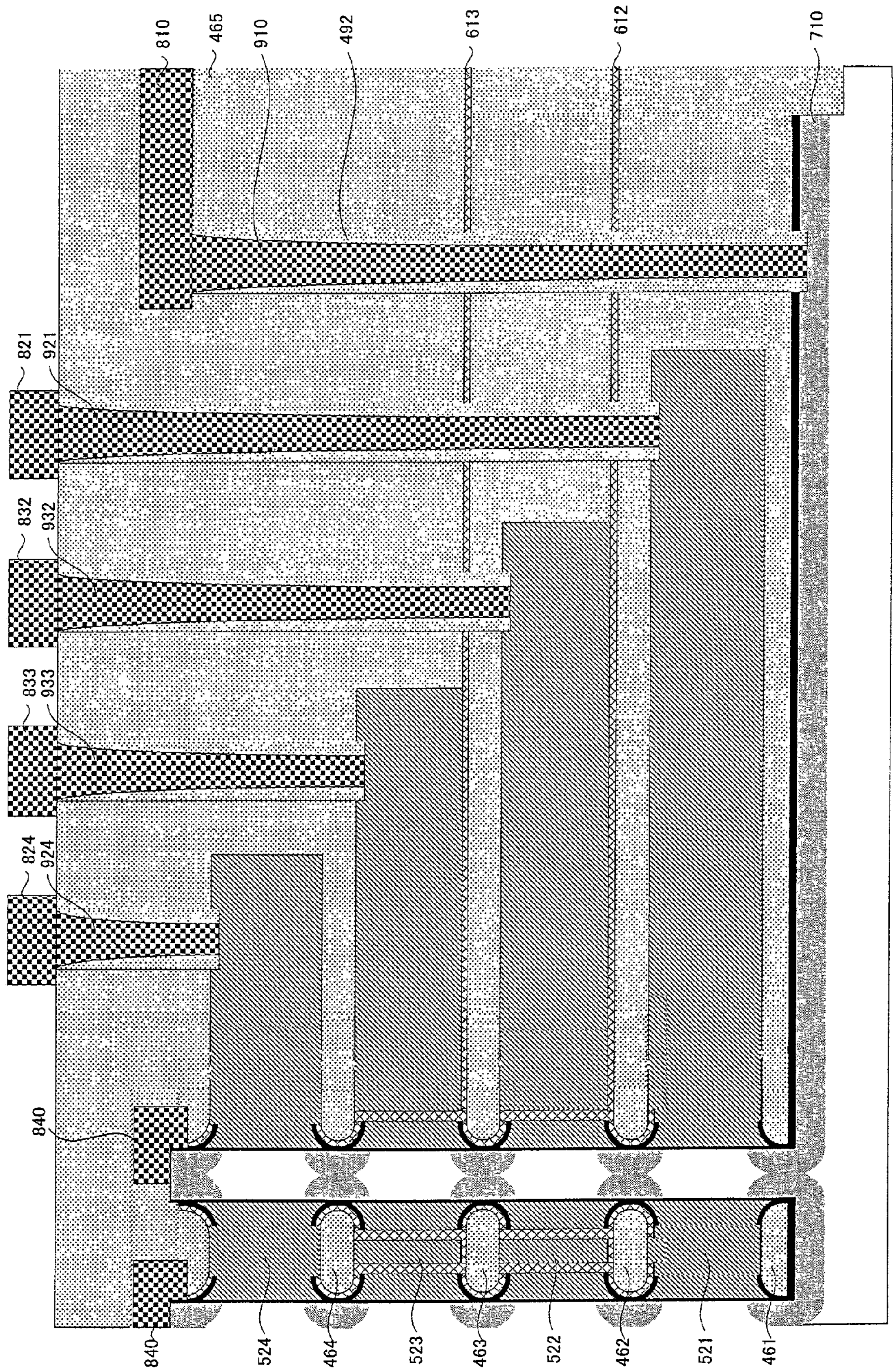
Figure 683:
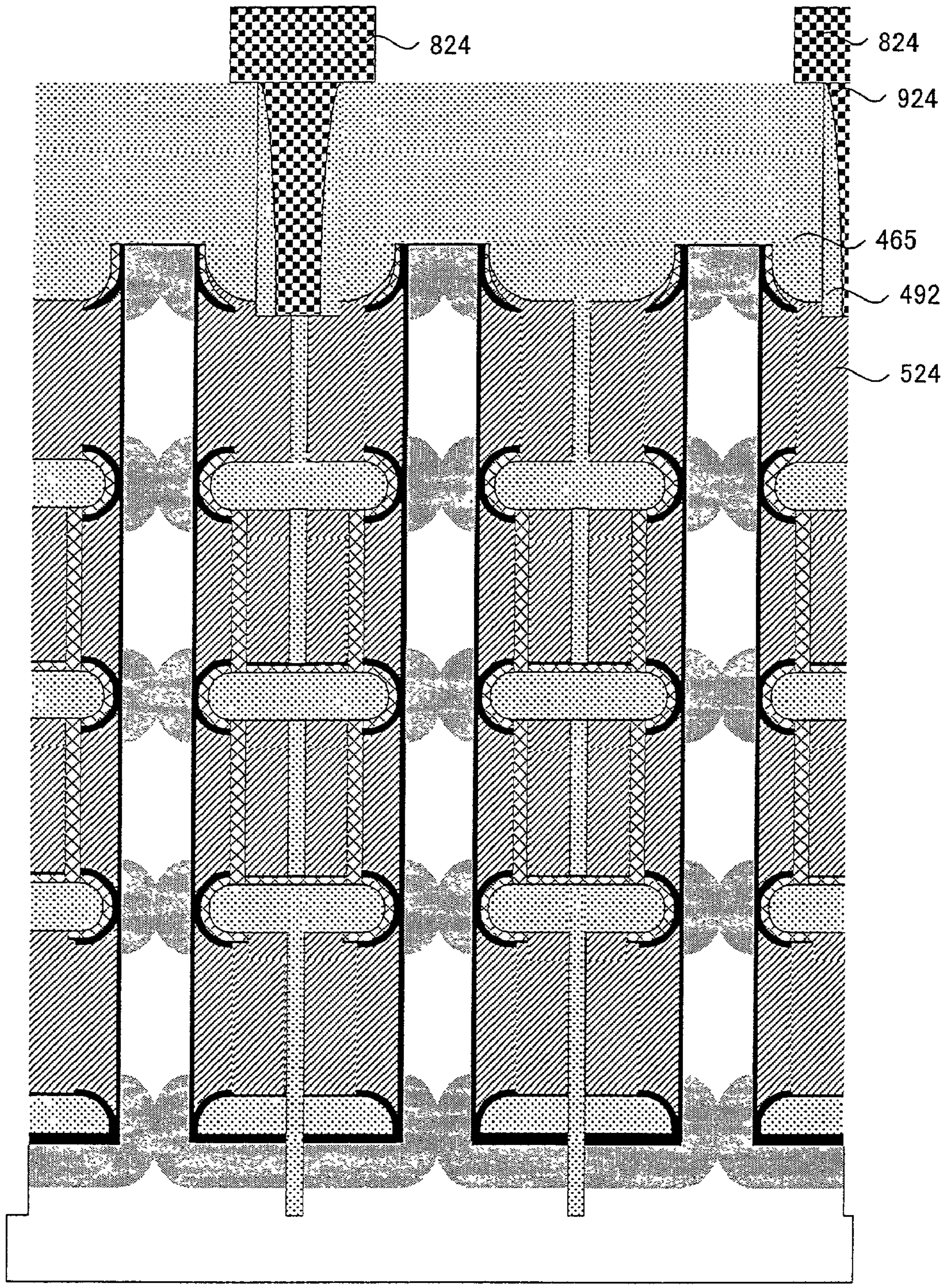
Figure 684:
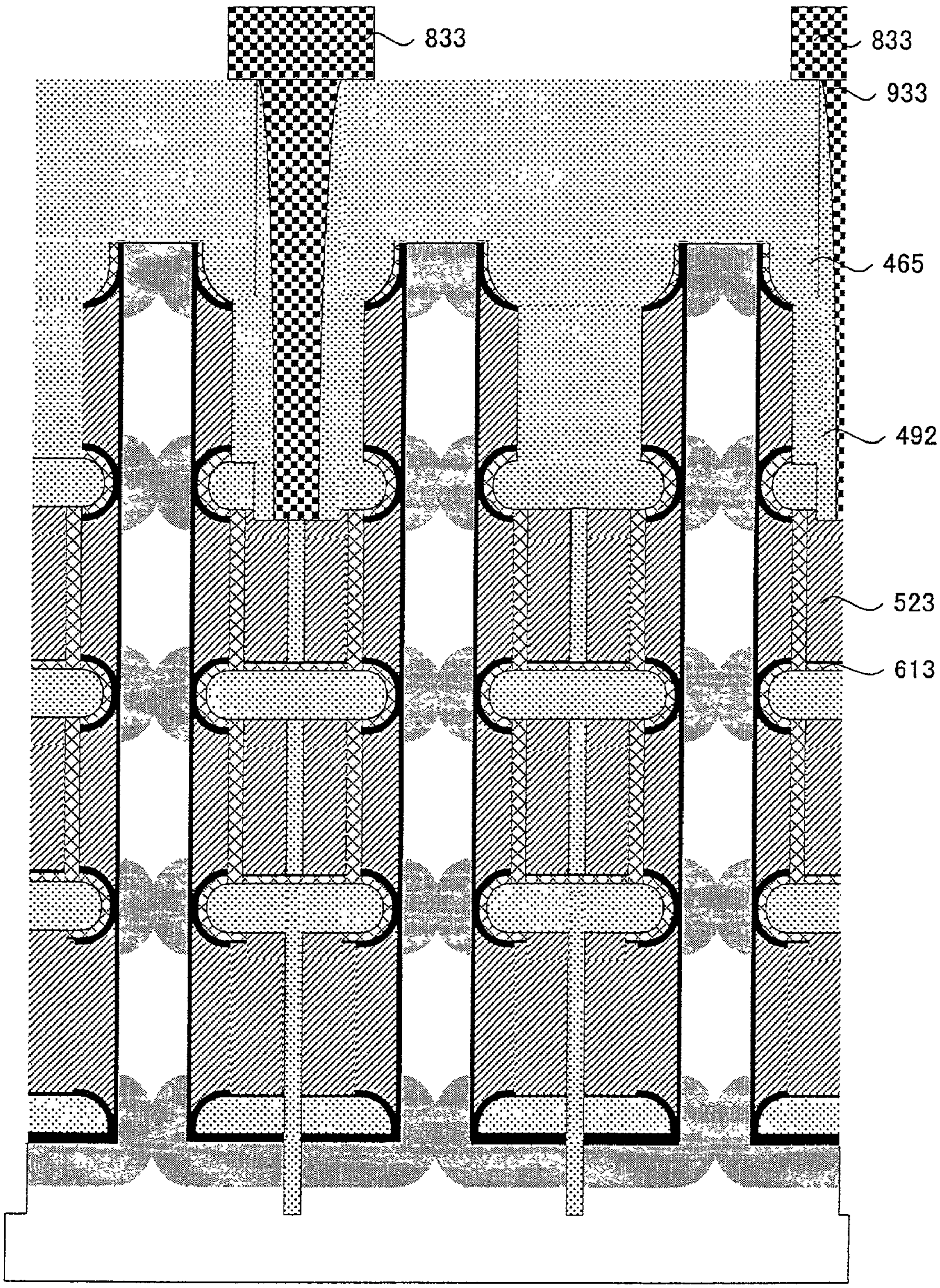
Figure 685:
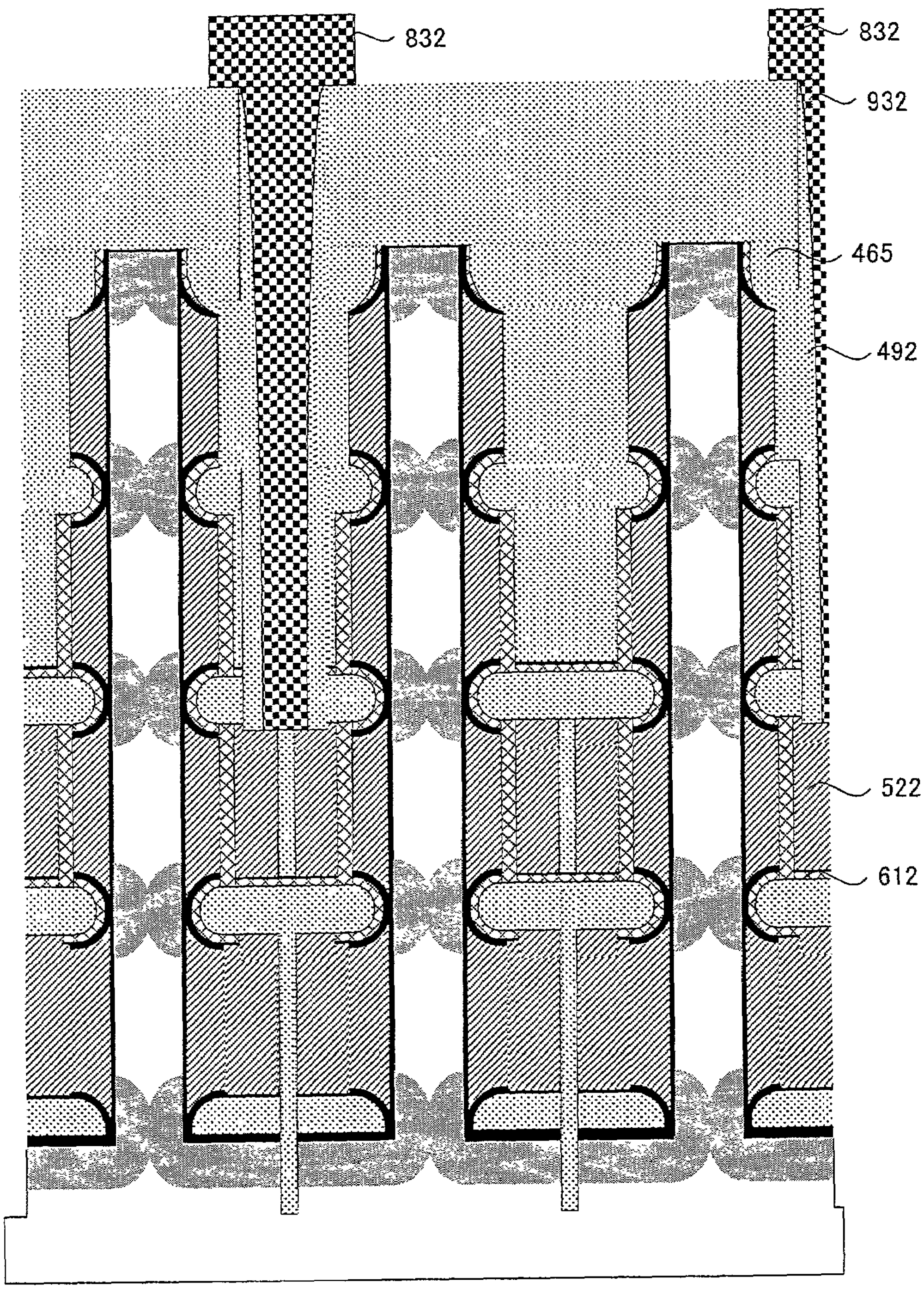
Figure 686:
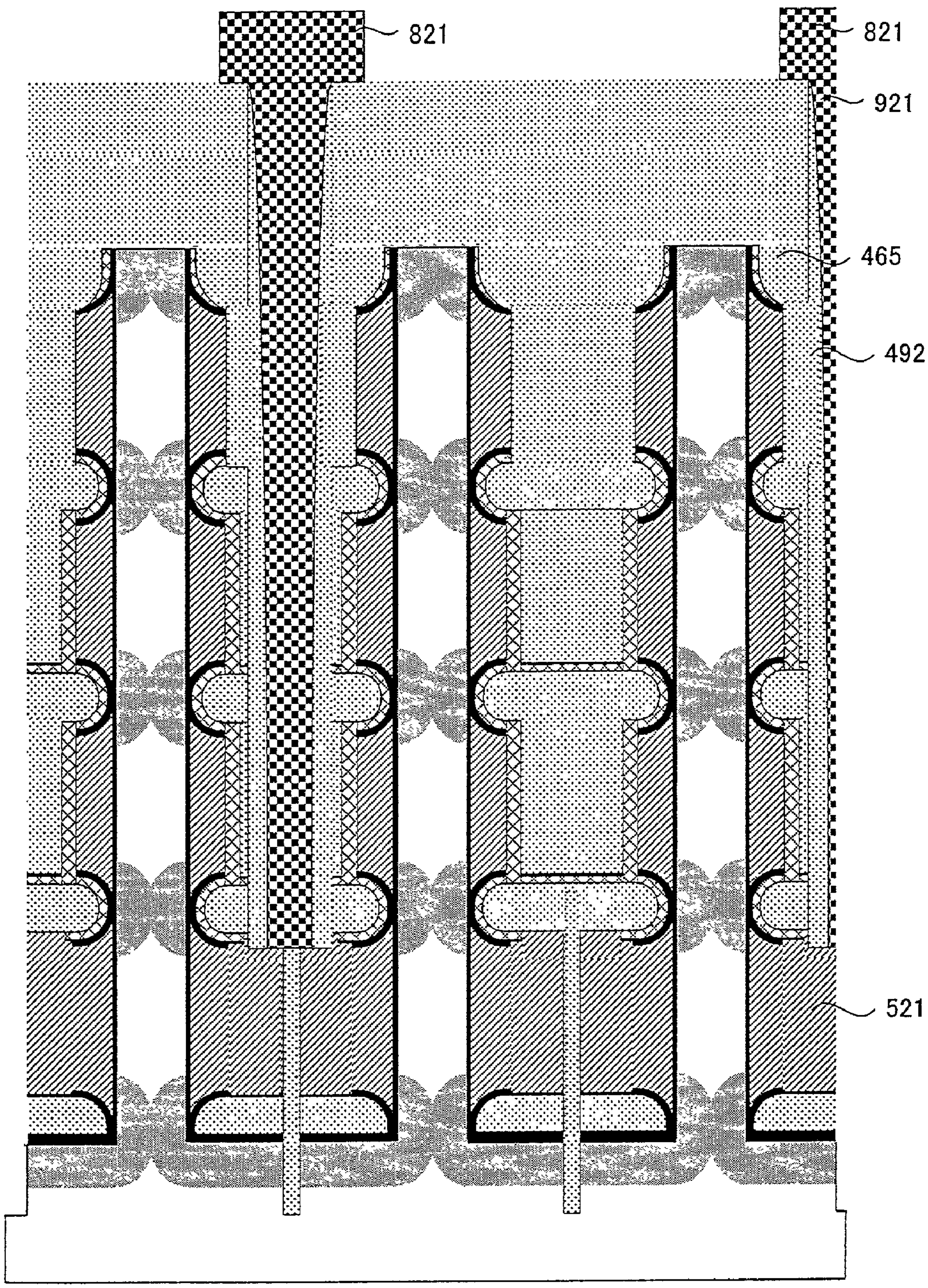
Figure 687:
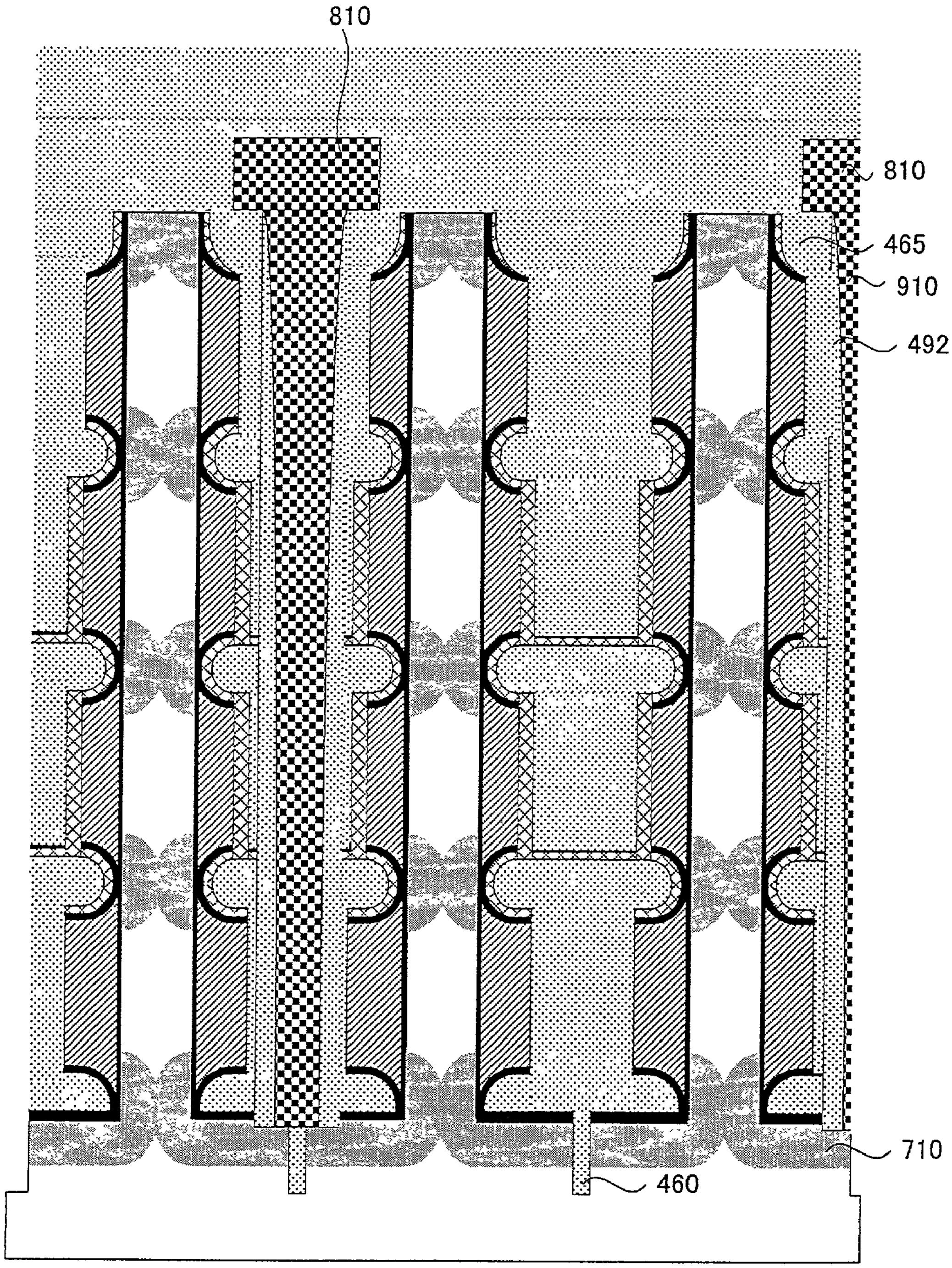
Figure 688:
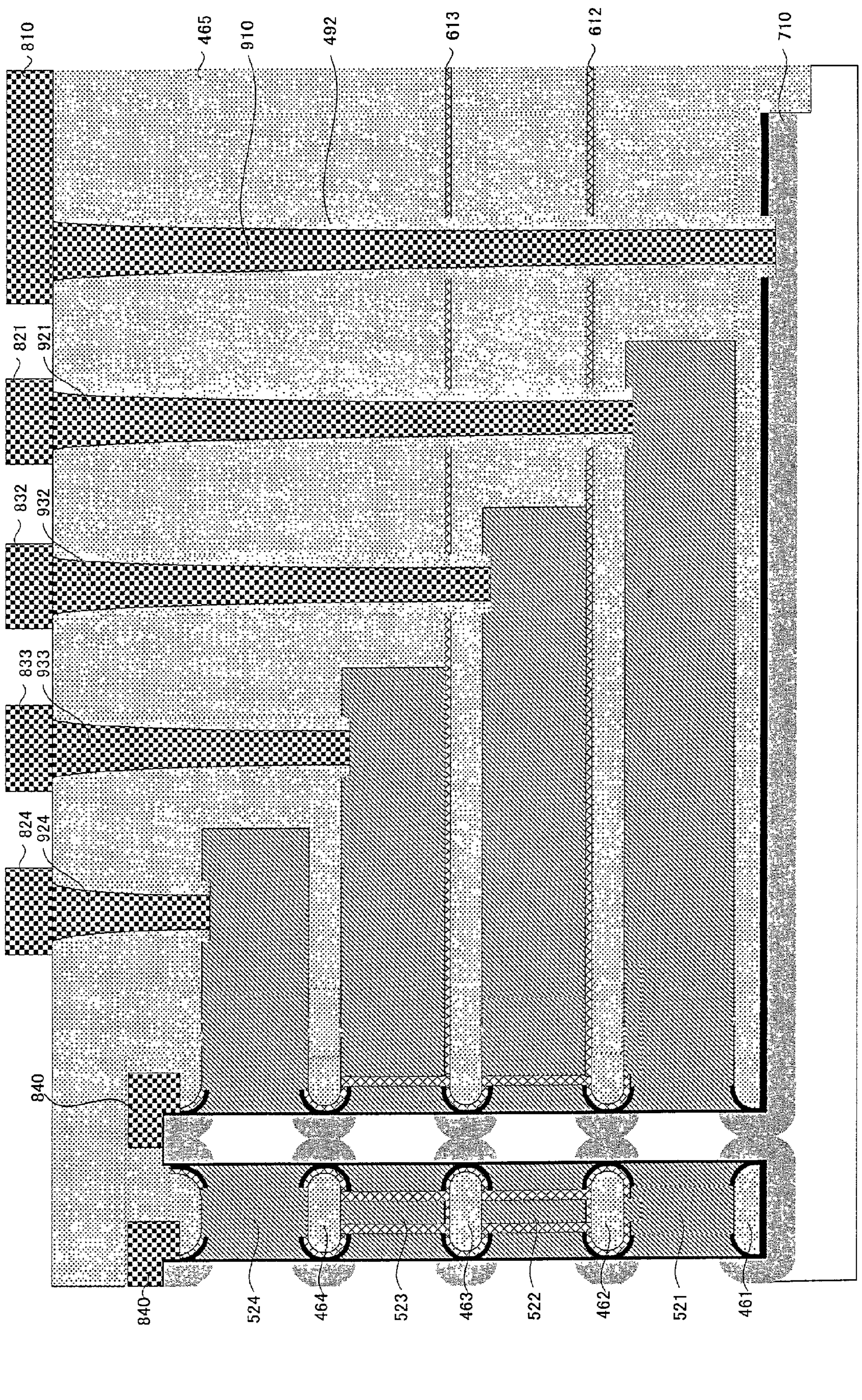
Figure 689:
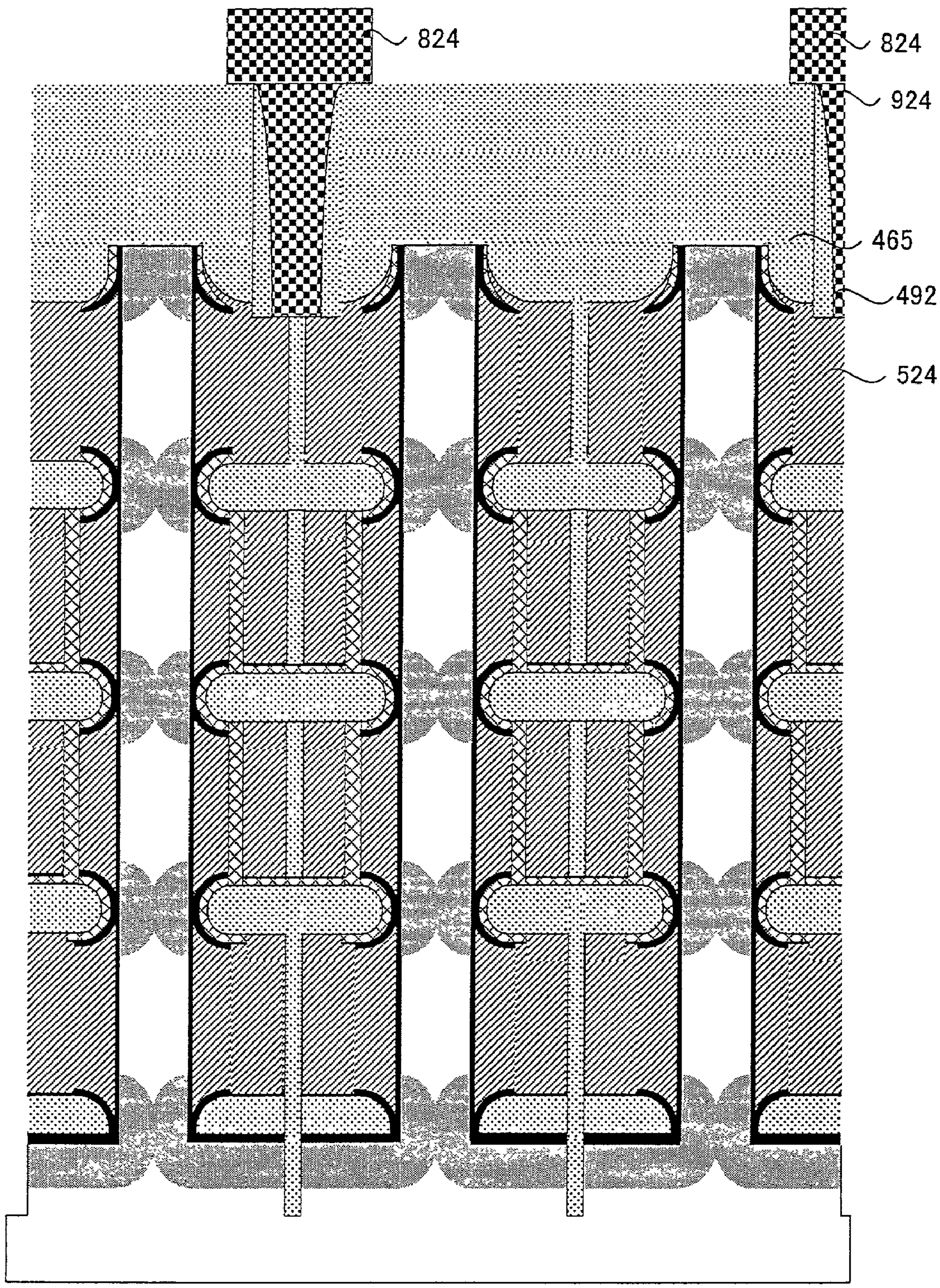

Sectional views of a lead-out portion including the contacts 921, 932, 933 and 924 are shown in FIG. 658 and FIG. 669, and sectional views of a lead-out portion including the contact 910 are shown in FIG. 560 and FIG. 583.

Figure 160:
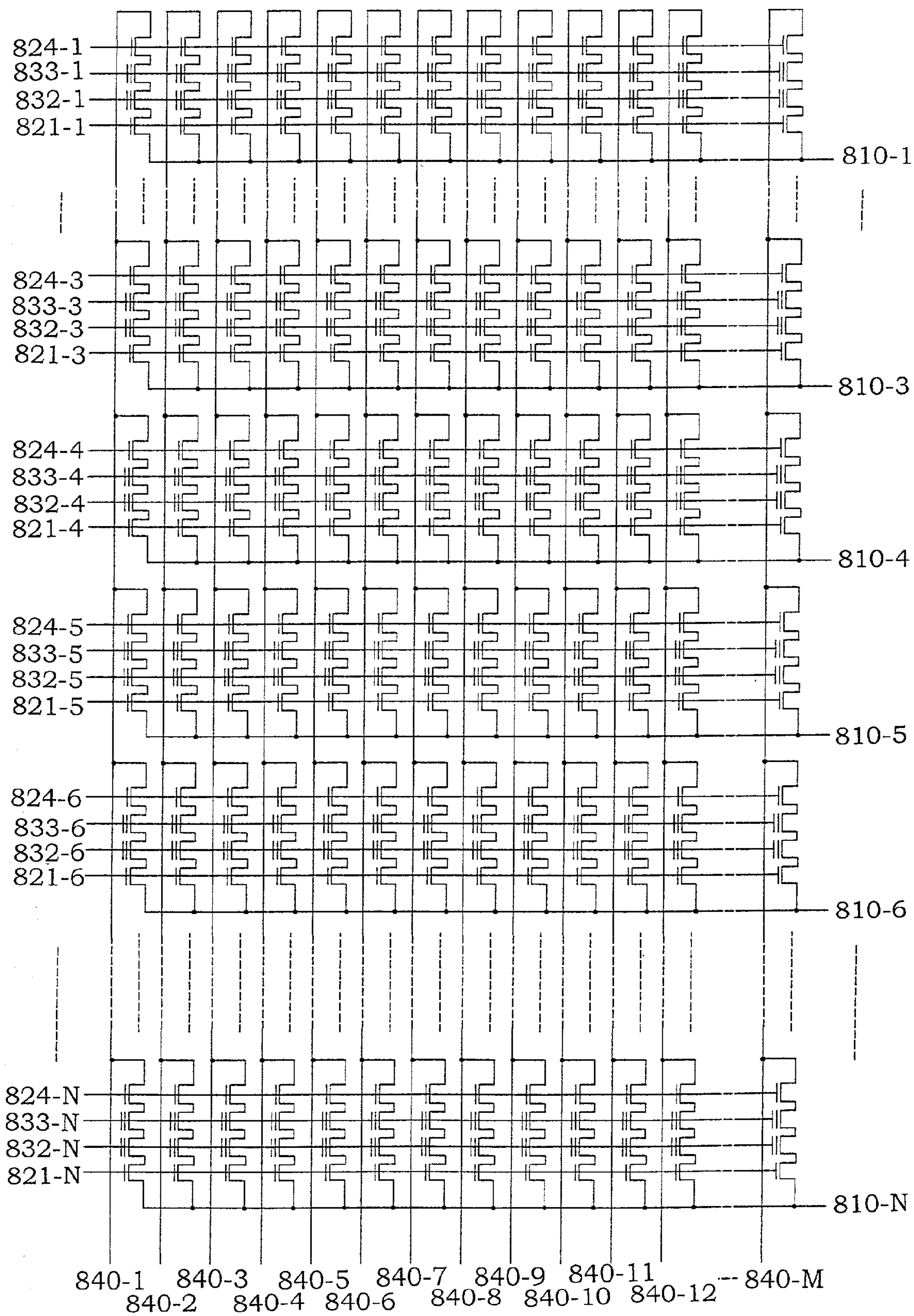
Figure 161:
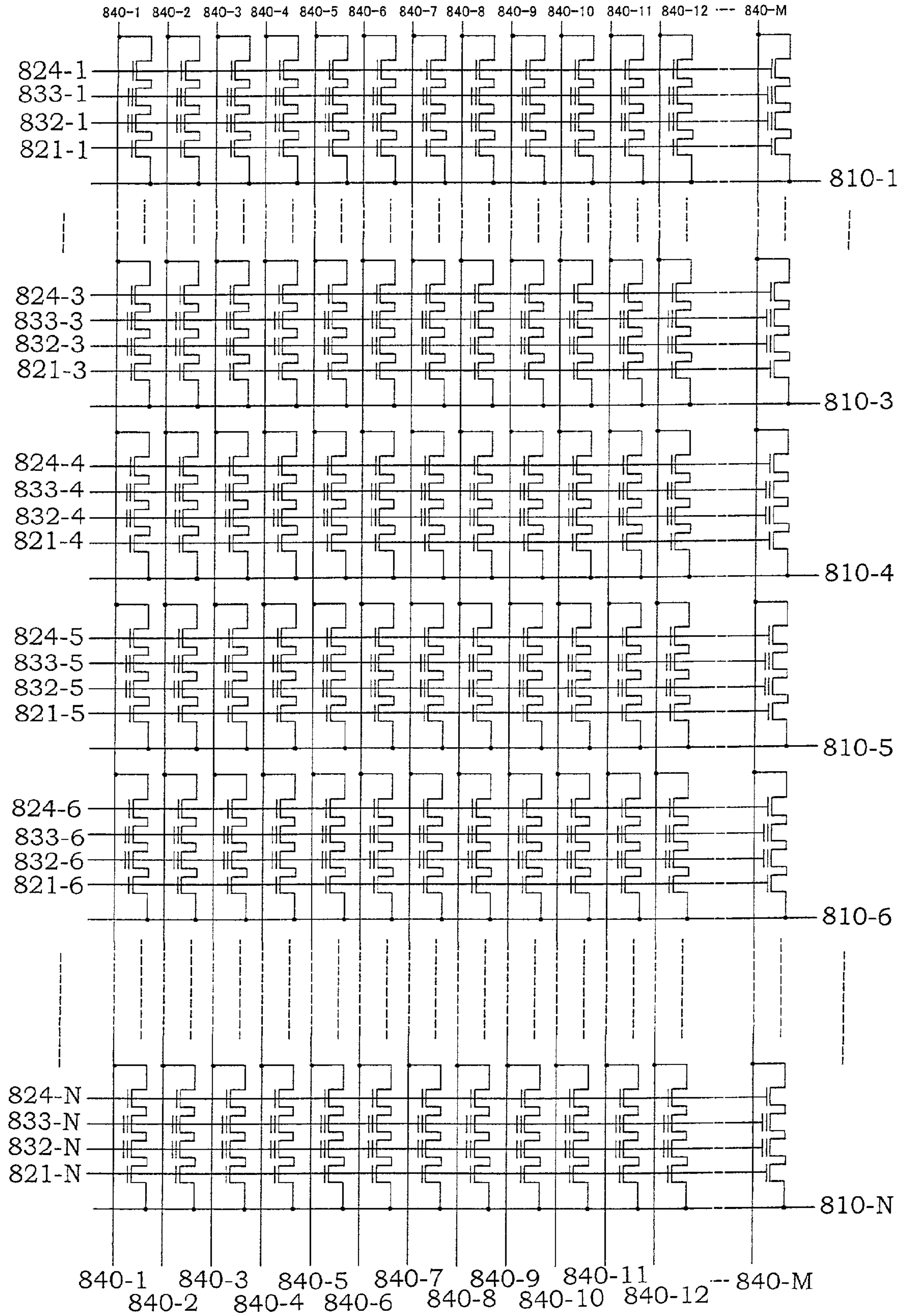
Figure 162:
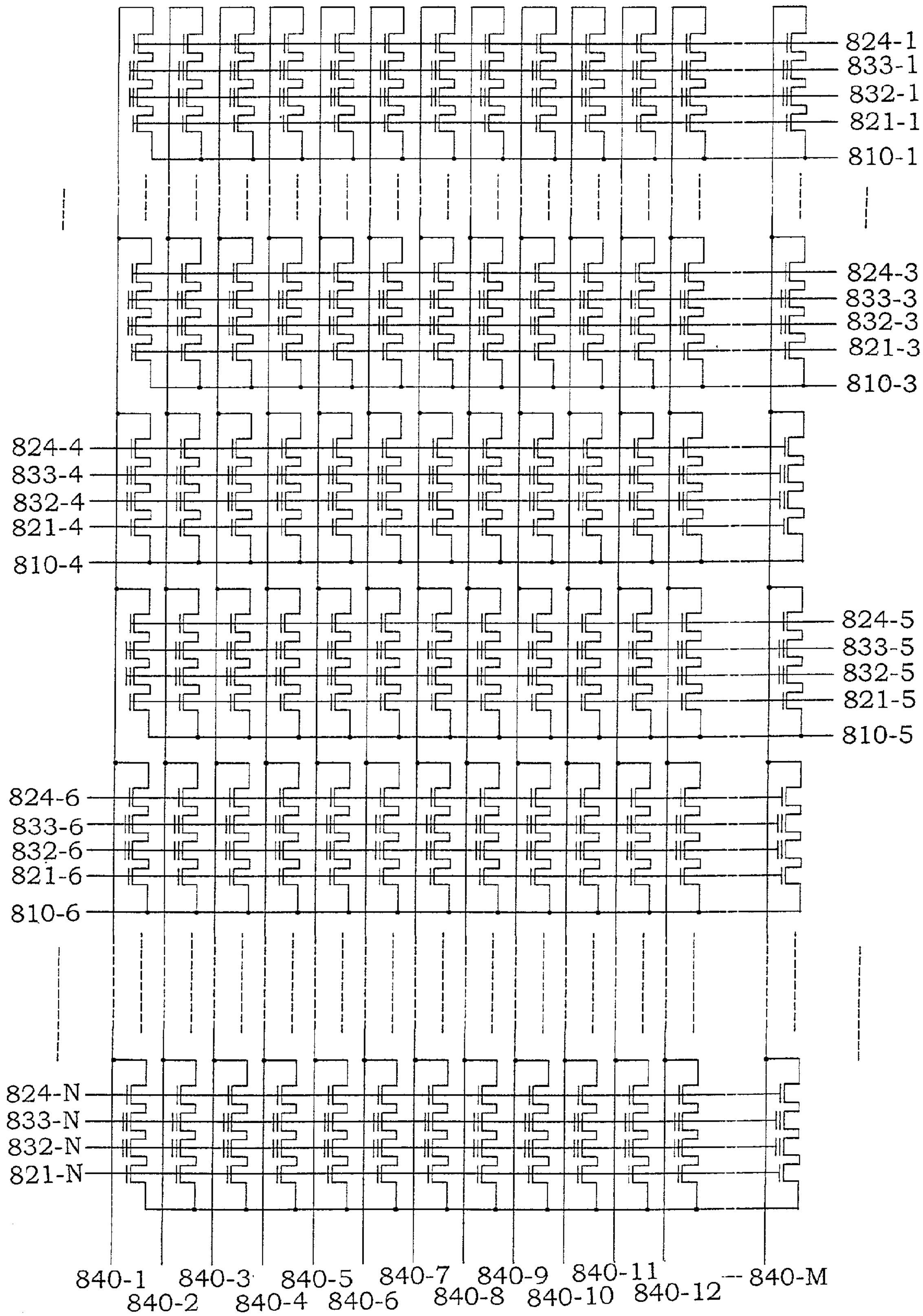
Figure 163:
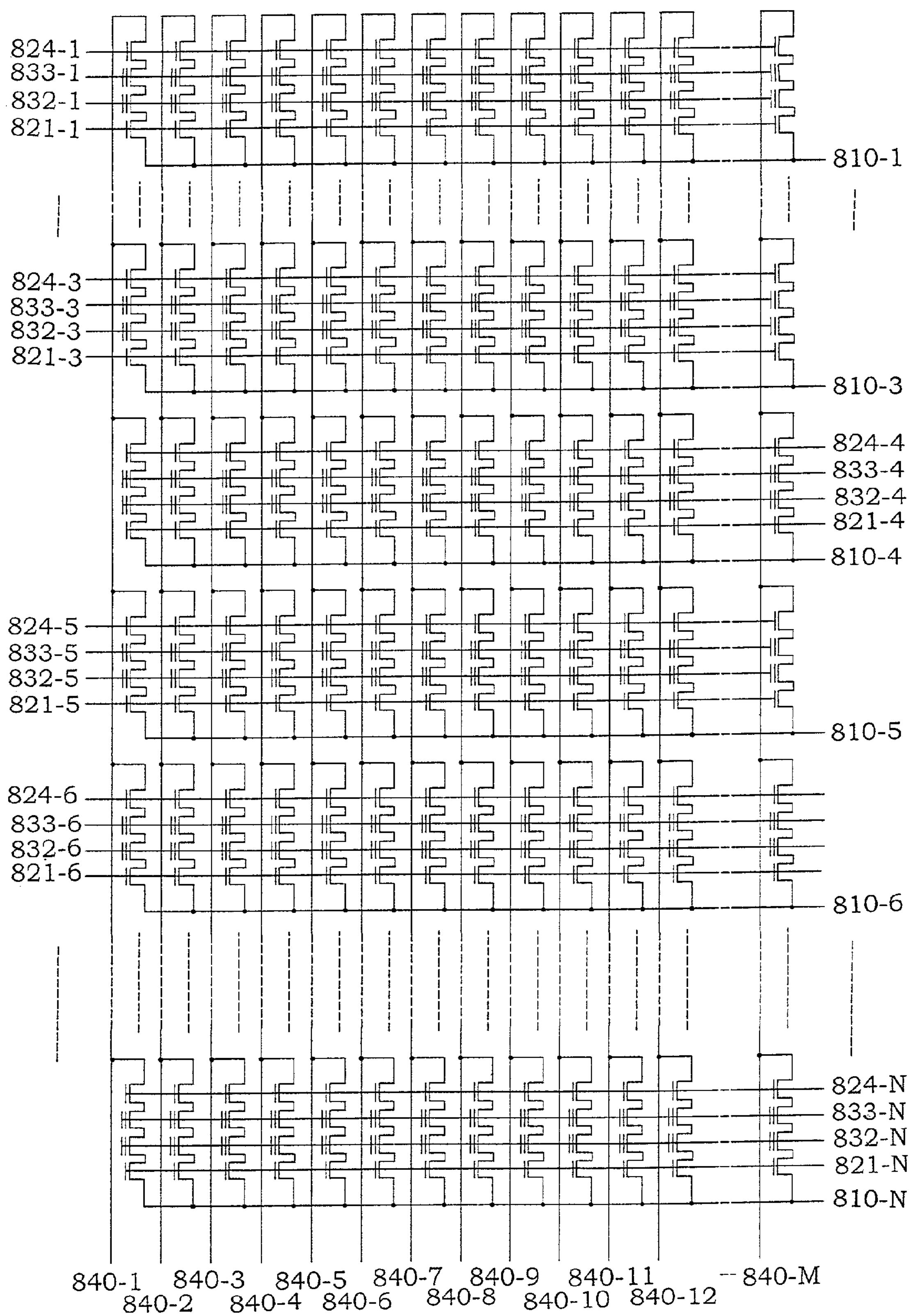
Figure 164:
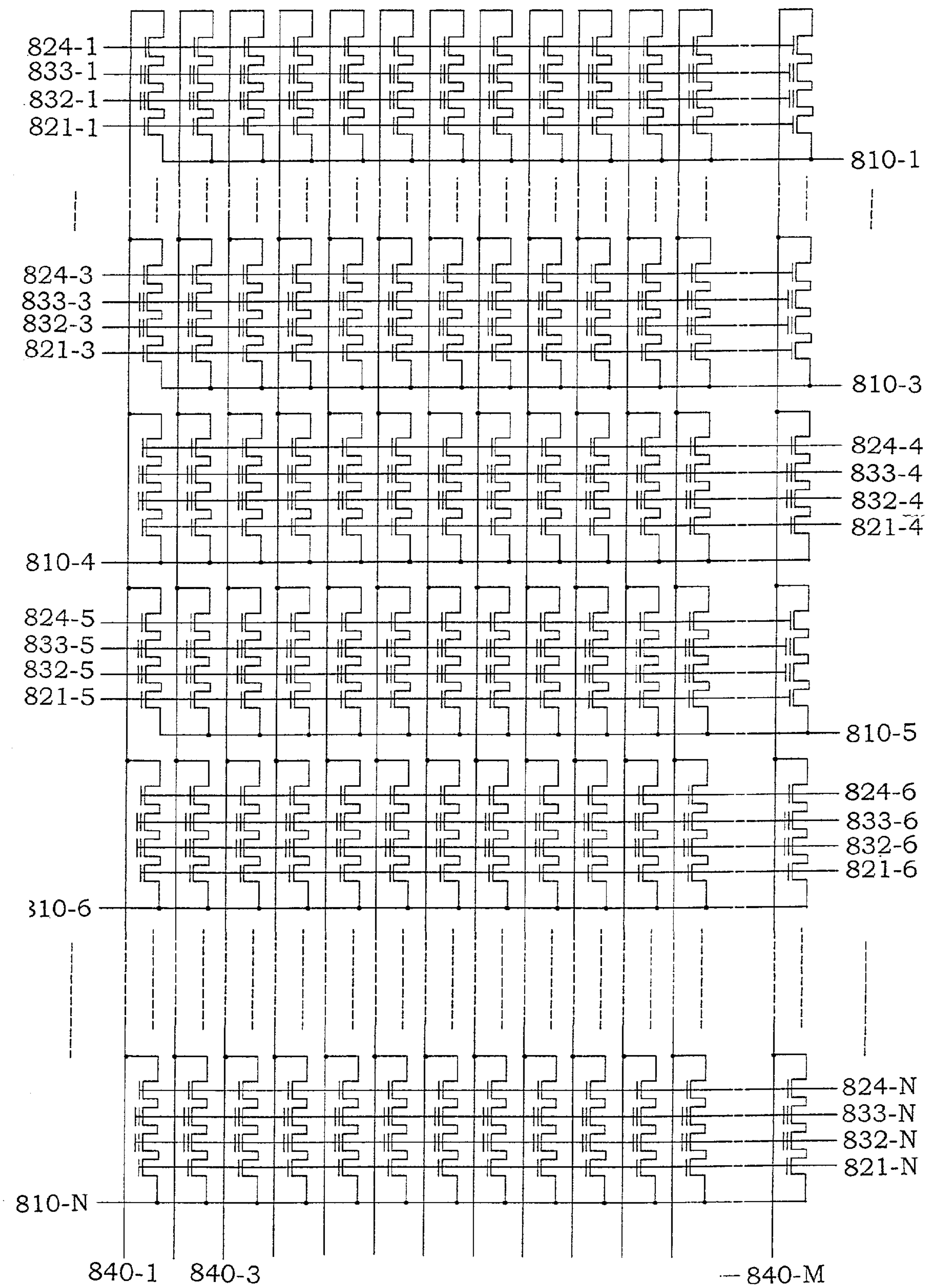

An equivalent circuit diagram of FIG. 3 is shown in FIG. 160.

Figure 4:
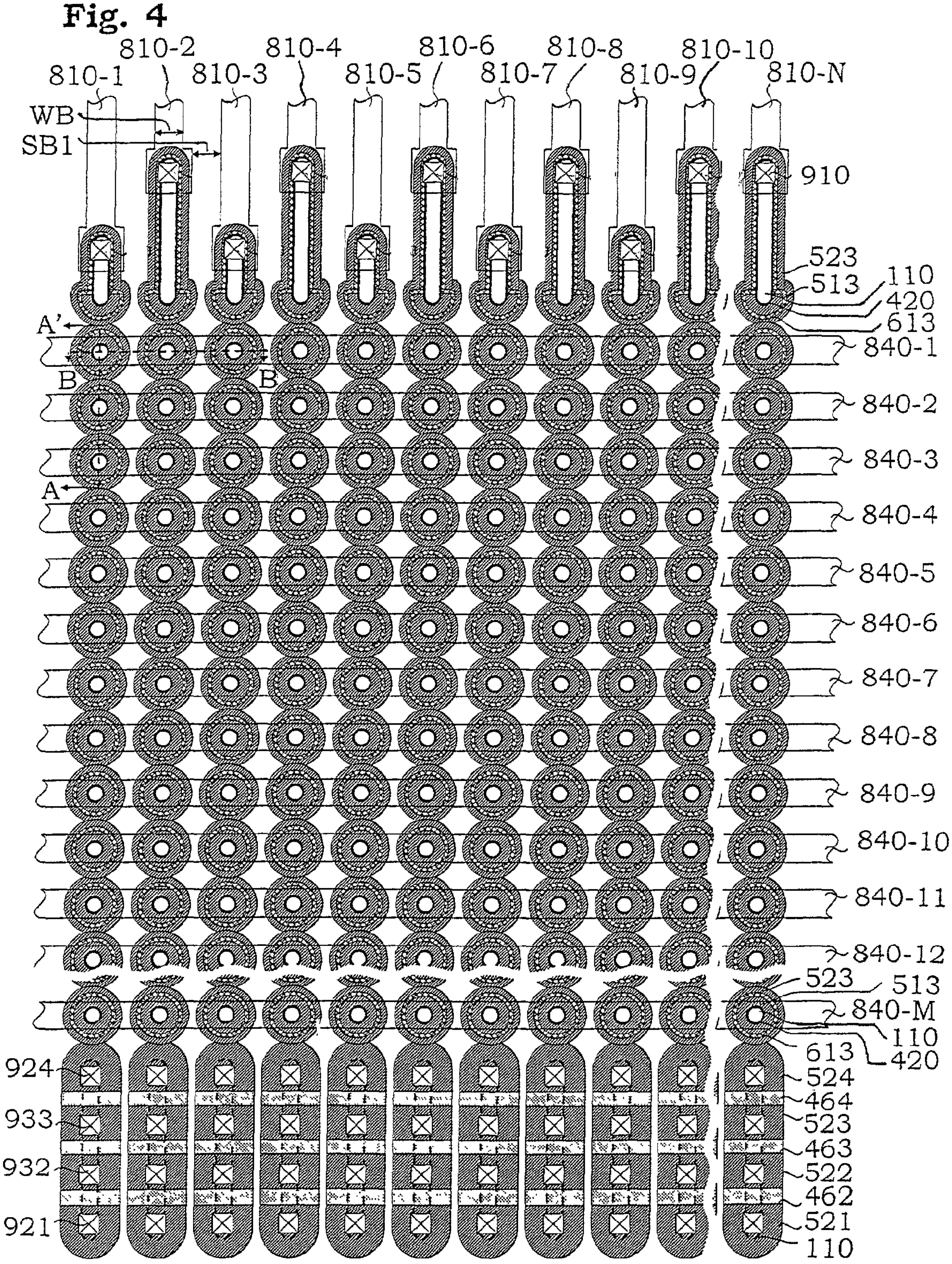

In FIG. 4, in contrast to FIG. 3, adjacent island-like semiconductor layers 110 which act as lead-out portions of first wiring layers have different lengths in the A–A' direction. Island-like semiconductor layers 110 of two different lengths which act as lead-out portions of first wiring layers are alternatively disposed at the A' side end of the memory cell array. Thereby, the narrowest interval SB1 between the first wiring layers is ensured to increase.

The above-mentioned disposition may be realized at the A side end of the memory cell array or alternately at the A side end and at the A' side end. So long as the above-mentioned disposition is realized, any first wiring layer may be optionally connected to either one of the island-like semiconductor layers 110 of the two different lengths.

Sectional views of a lead-out portion including the contacts 921, 932, 933 and 924 are shown in FIG. 658 and FIG. 669, and sectional views of a lead-out portion including the contact 910 are shown in FIG. 560 and FIG. 583.

An equivalent circuit diagram of FIG. 4 is shown in FIG. 160.

Figure 5:
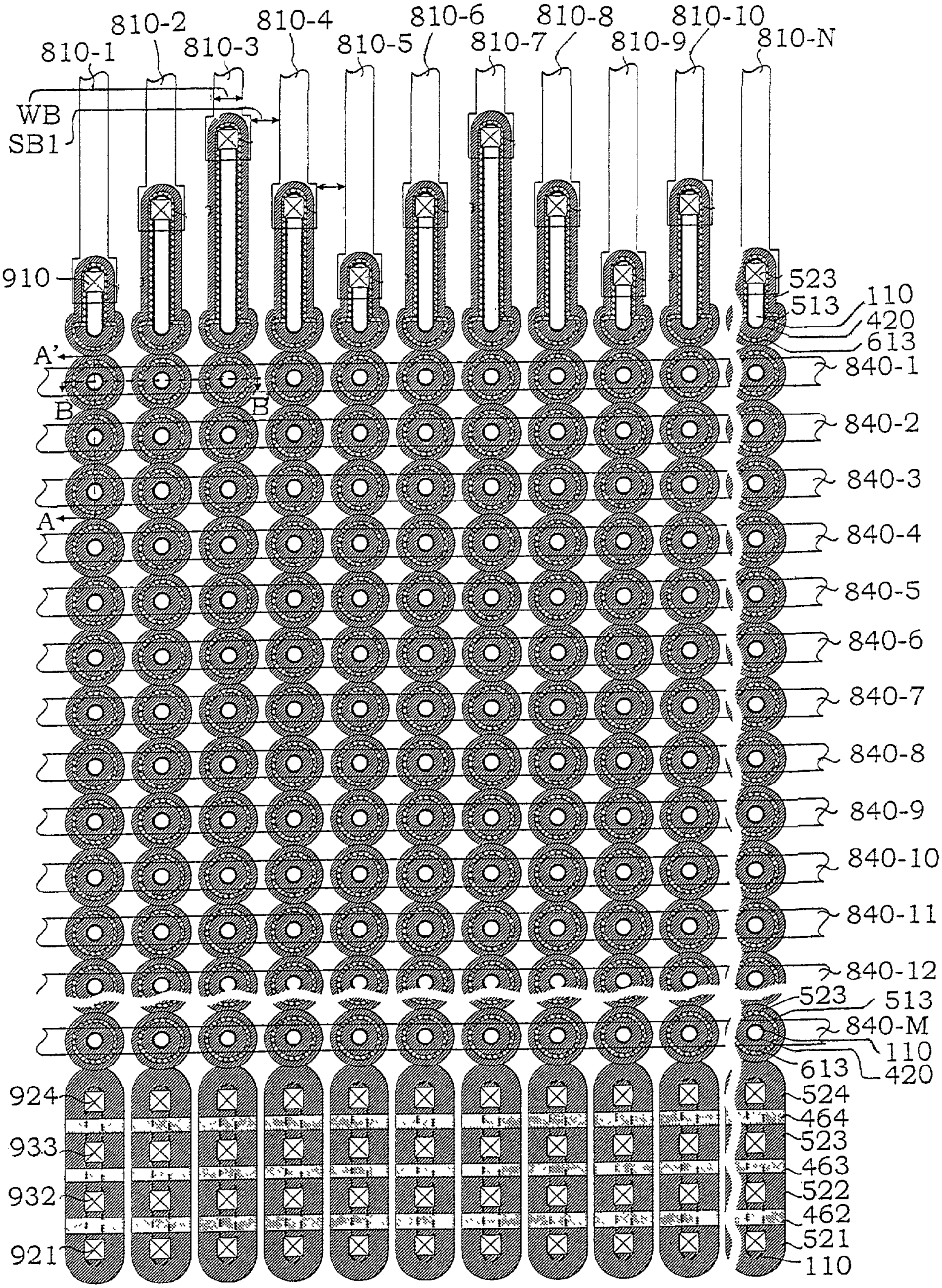

In FIG. 5, in contrast to FIG. 3, adjacent island-like semiconductor layers 110 which act as lead-out portions of first wiring layers have different lengths in the A–A' direction. Island-like semiconductor layers 110 of more than two different lengths which act as lead-out portions of first wiring layers are disposed in a mountain form as shown in FIG. 5 at the A' side end of the memory cell array. Thereby, the narrowest interval SB1 between the first wiring layers is ensured to increase. The above-mentioned disposition may be realized at the A side end of the memory cell array or alternately at the A side end and at the A' side end. So long as the above-mentioned disposition is realized, any first wiring layer may be optionally connected to any one of the island-like semiconductor layers 110 of more than two different lengths.

Sectional views of a lead-out portion including the contacts 921, 932, 933 and 924 are shown in FIG. 658 and FIG. 669, and sectional views of a lead-out portion including the contact 910 are shown in FIG. 560 and FIG. 583.

An equivalent circuit diagram of FIG. 5 is shown in FIG. 160.

Figure 10:
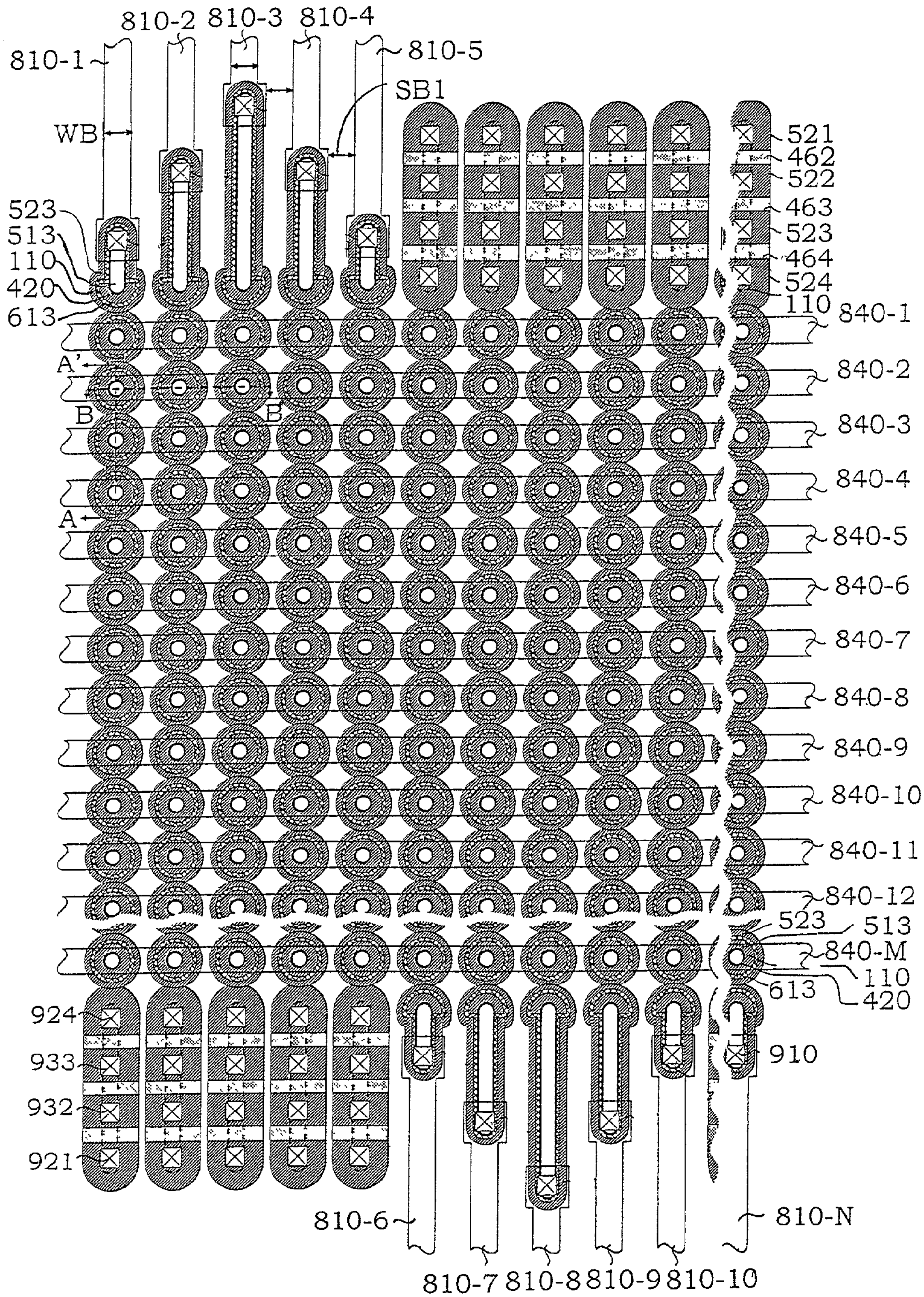
Figure 167:
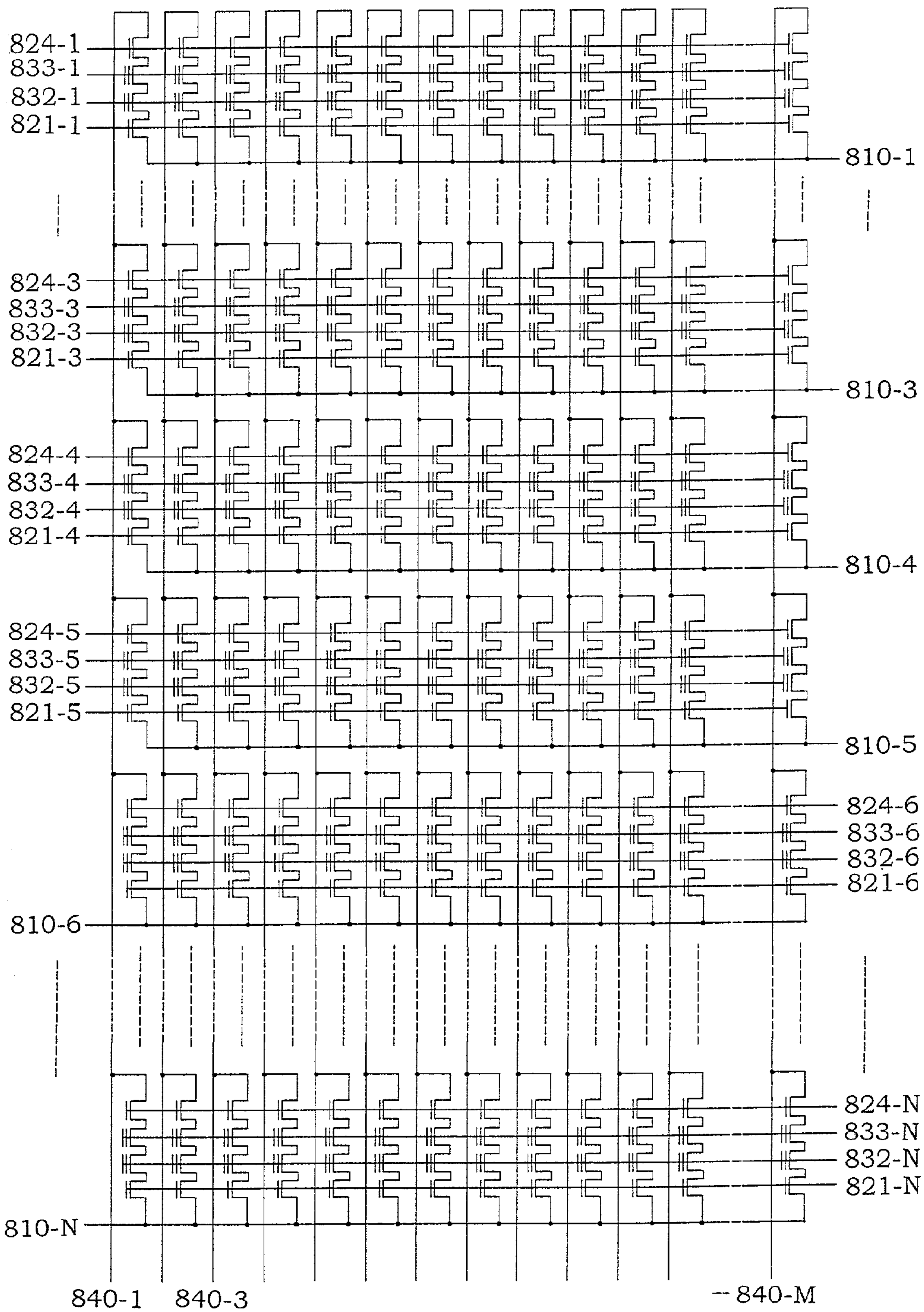

In FIG. 10, in contrast to FIG. 5, the above-mentioned disposition is realized alternately at the A side end and at the A' side end. An equivalent circuit diagram of FIG. 10 is shown in FIG. 167.

Figure 37:
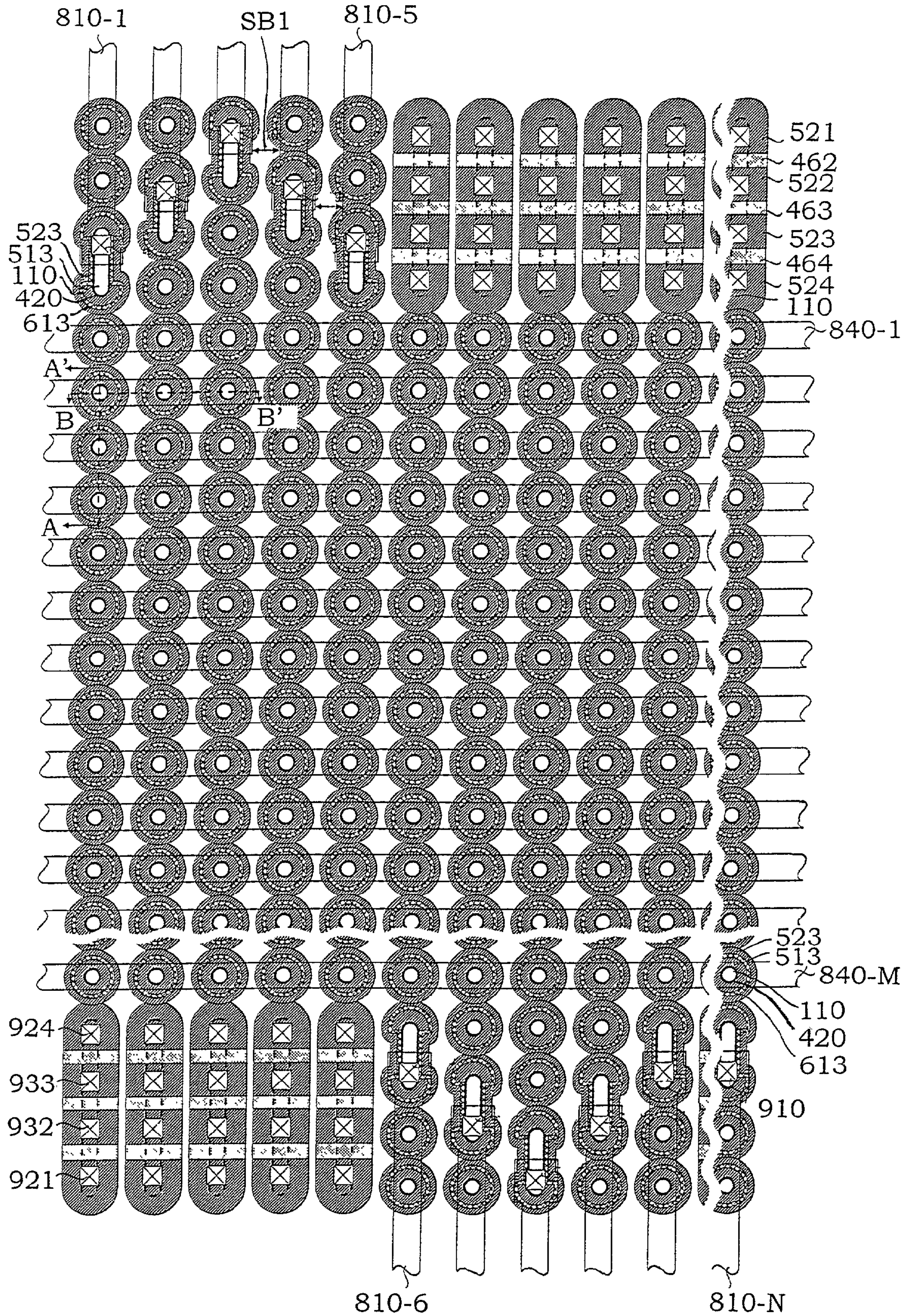

In FIG. 37, in contrast to FIG. 10, island-like semiconductor layers not connected to the fourth wiring layers are provided as dummies and disposed as shown in FIG. 37, instead of changing the length of the island-like semiconductor layers 110 which act as lead-out portions of the first wiring layers. Thereby, the memory cell array of FIG. 37 has the same effect as that of FIG. 10.

Figure 6:
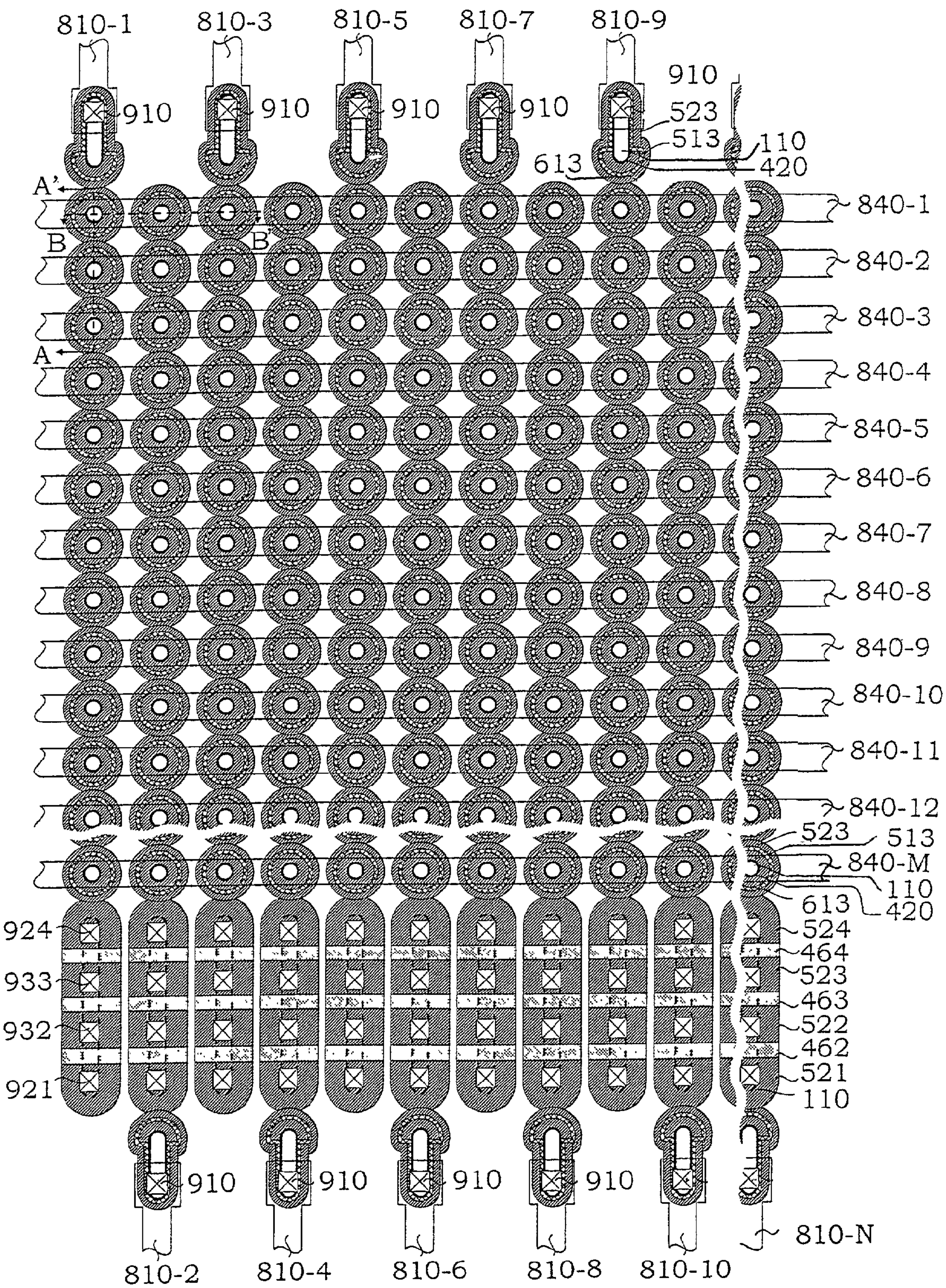

In FIG. 6, in contrast to FIG. 3, the island-like semiconductor layers 110 which act as lead-out portions of the first wiring layers are disposed alternately at the A side end and at the A' side end of the memory cell array.

Sectional views of a lead-out portion including the contacts 921, 932, 933 and 924 are shown in FIG. 658 and FIG. 669, and sectional views of a lead-out portion including the contact 910 are shown in FIG. 560 and FIG. 583.

Figure 15:
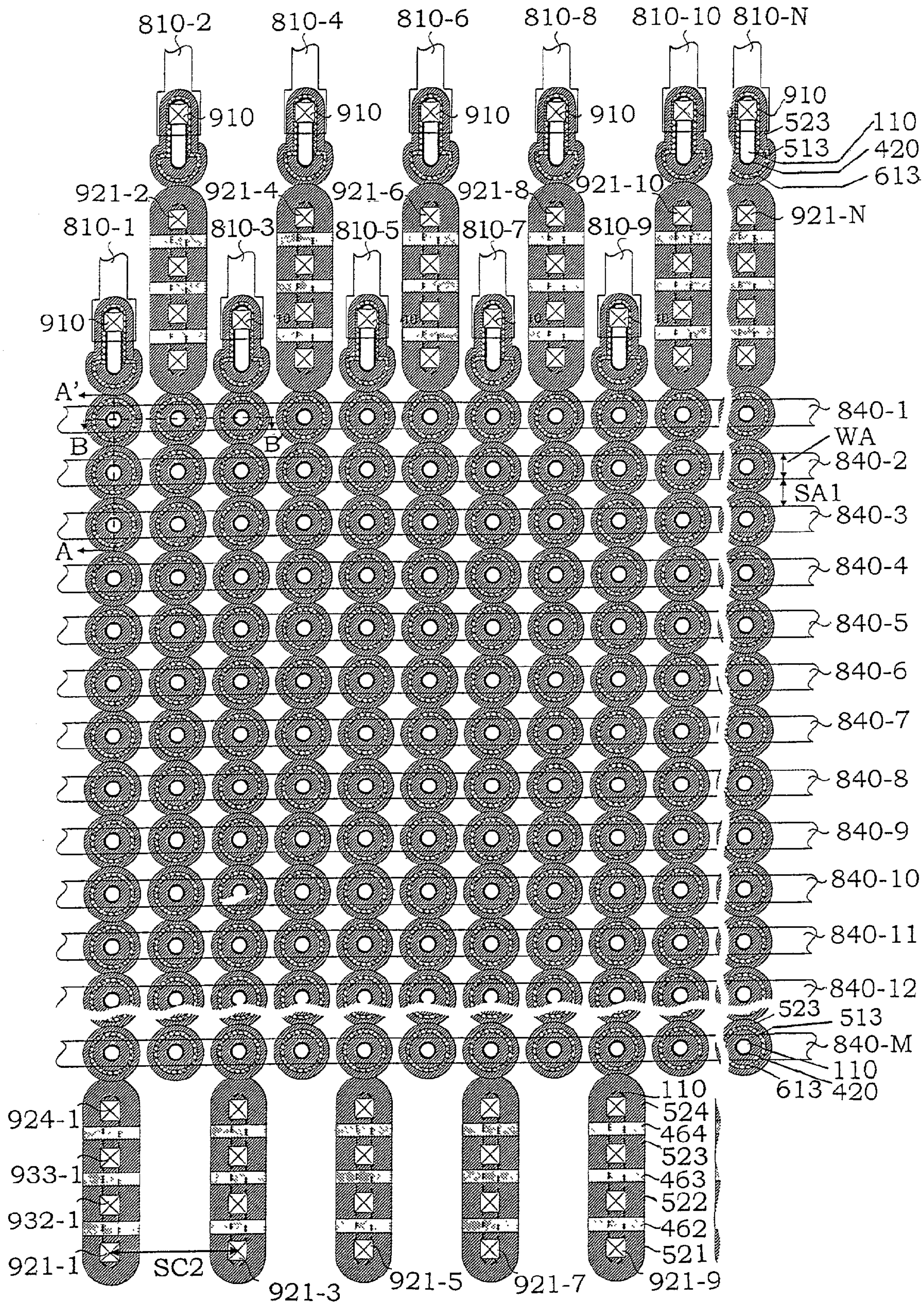

In FIG. 15, in contrast to FIG. 3, the island-like semiconductor layers 110 which act as lead-out portions of the second and third wiring layers are disposed alternately at the A side end and at the A' side end of the memory cell array.

Figure 7:
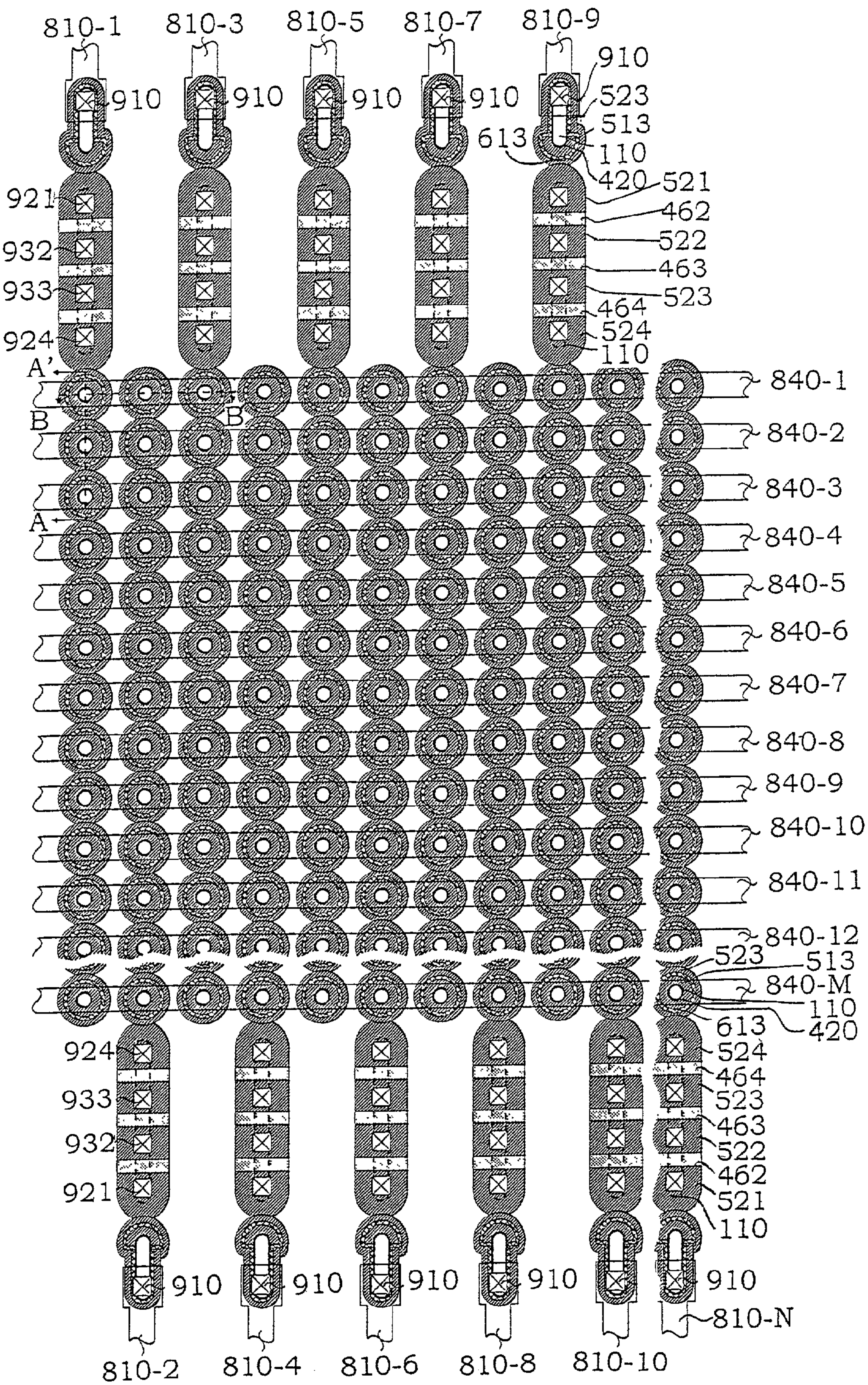

In FIG. 7, the island-like semiconductor layers 110 which act as lead-out portions of the first wiring layers and the island-like semiconductor layers 110 which act as lead-out portions of the second and third wiring layers are disposed alternately at the A side end and at the A' side end of the memory cell array. The lead-out portions of the first wiring layers are connected to the lead-out portions of the second and third wiring layers.

Figure 8:
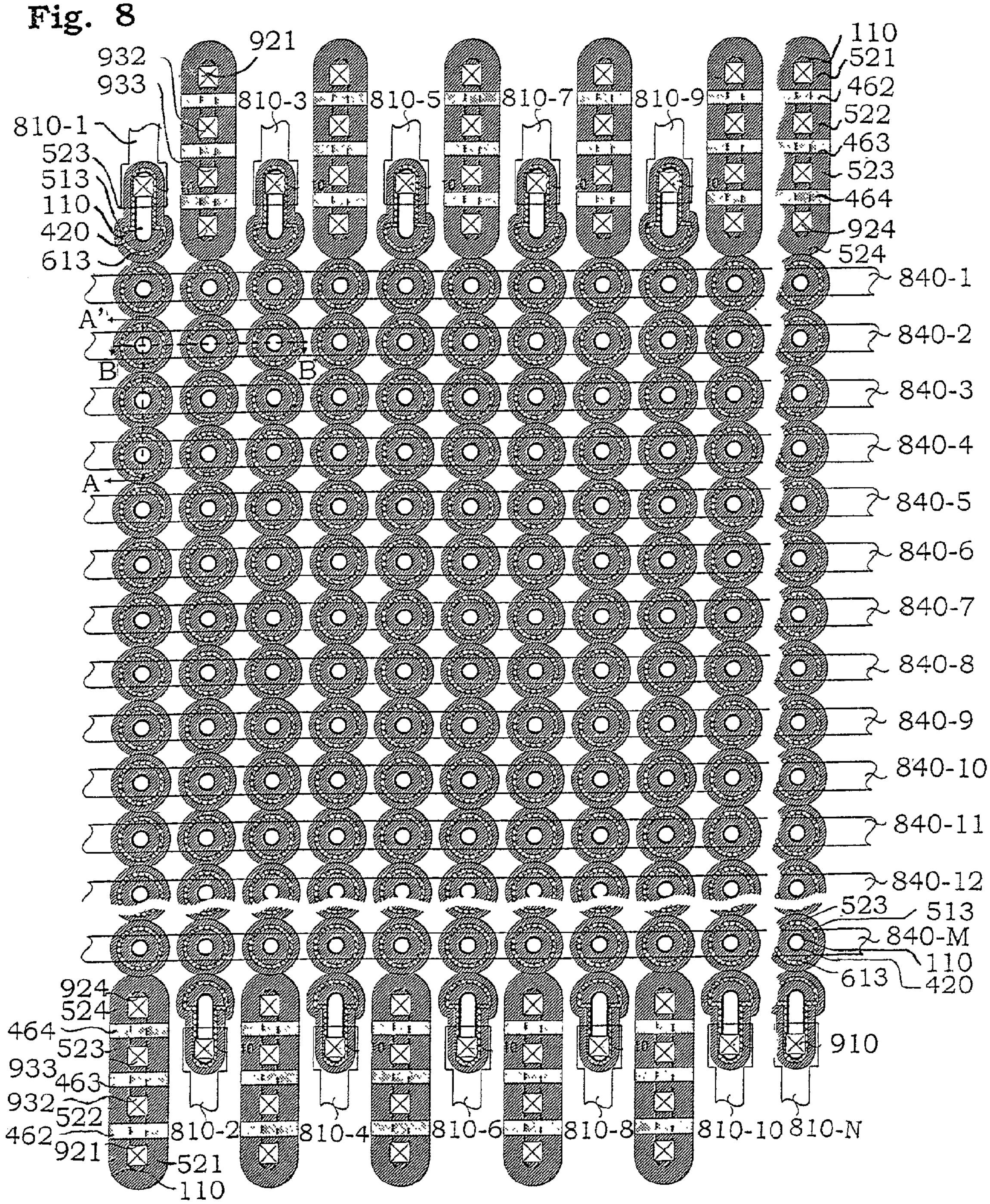

In FIG. 8, the island-like semiconductor layers 110 which act as lead-out portions of the first wiring layers and the island-like semiconductor layers 110 which act as lead-out portions of the second and third wiring layers are disposed alternately at the A side end and at the A' side end of the memory cell array. The lead-out portions of the first wiring layers and the lead-out portions of the second and third wiring layers are connected respectively to both the ends of the rows of the memory cells continuous in the A–A' direction.

Equivalent circuit diagrams of FIG. 6, FIG. 15, FIG. 7 and FIG. 8 are shown in FIG. 161, FIG. 163, FIG. 162 and FIG. 164, respectively.

In the case where the lead-out portions of the first wiring layers are contacted to the lead-out portions of the second and third wiring layers, the lead-out portions of the second and third wiring layers may be disposed nearer to the memory cell array or the lead-out portions of the first wiring layers may be disposed nearer to the memory cell array.

Figure 30:
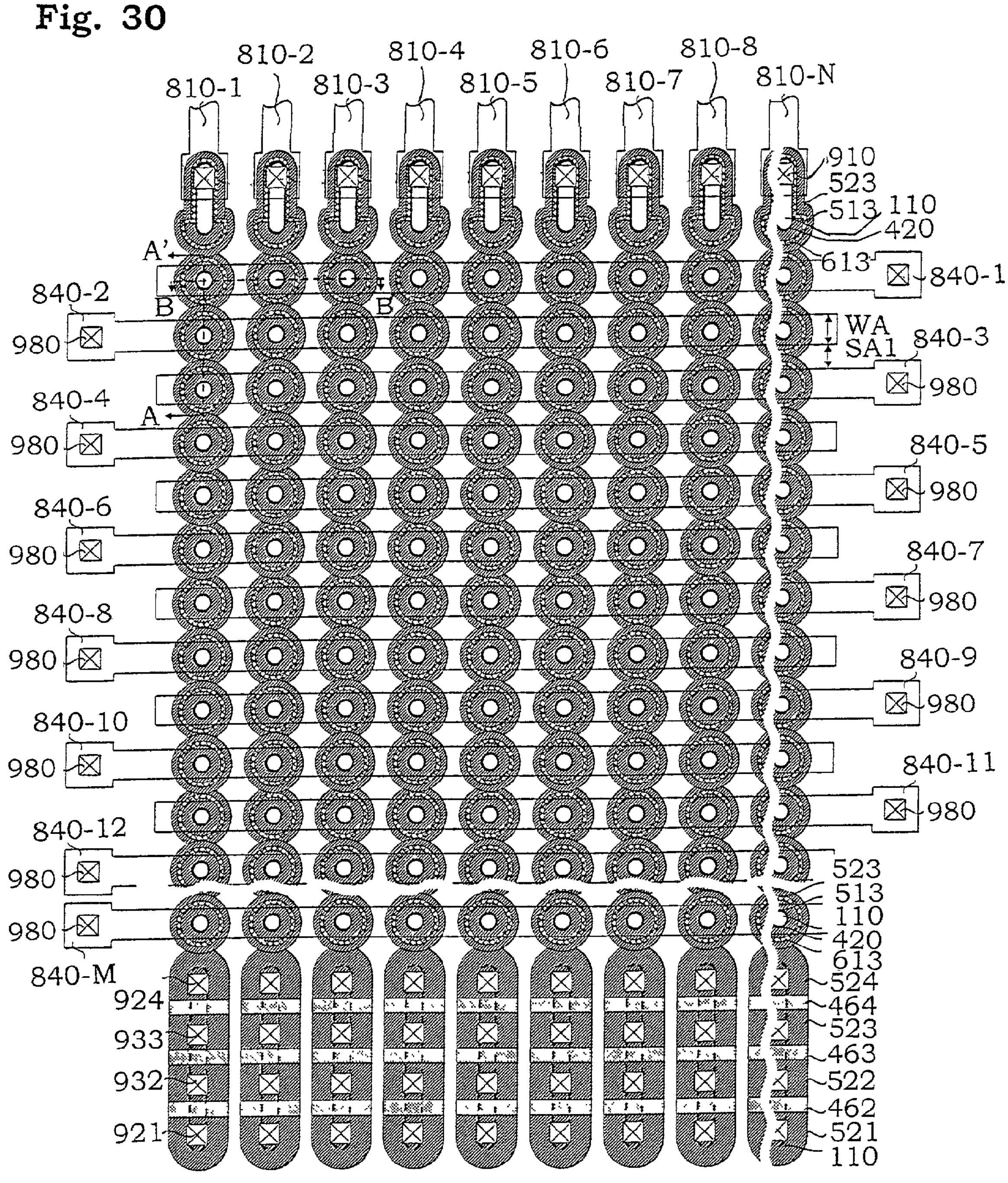
Figure 176:
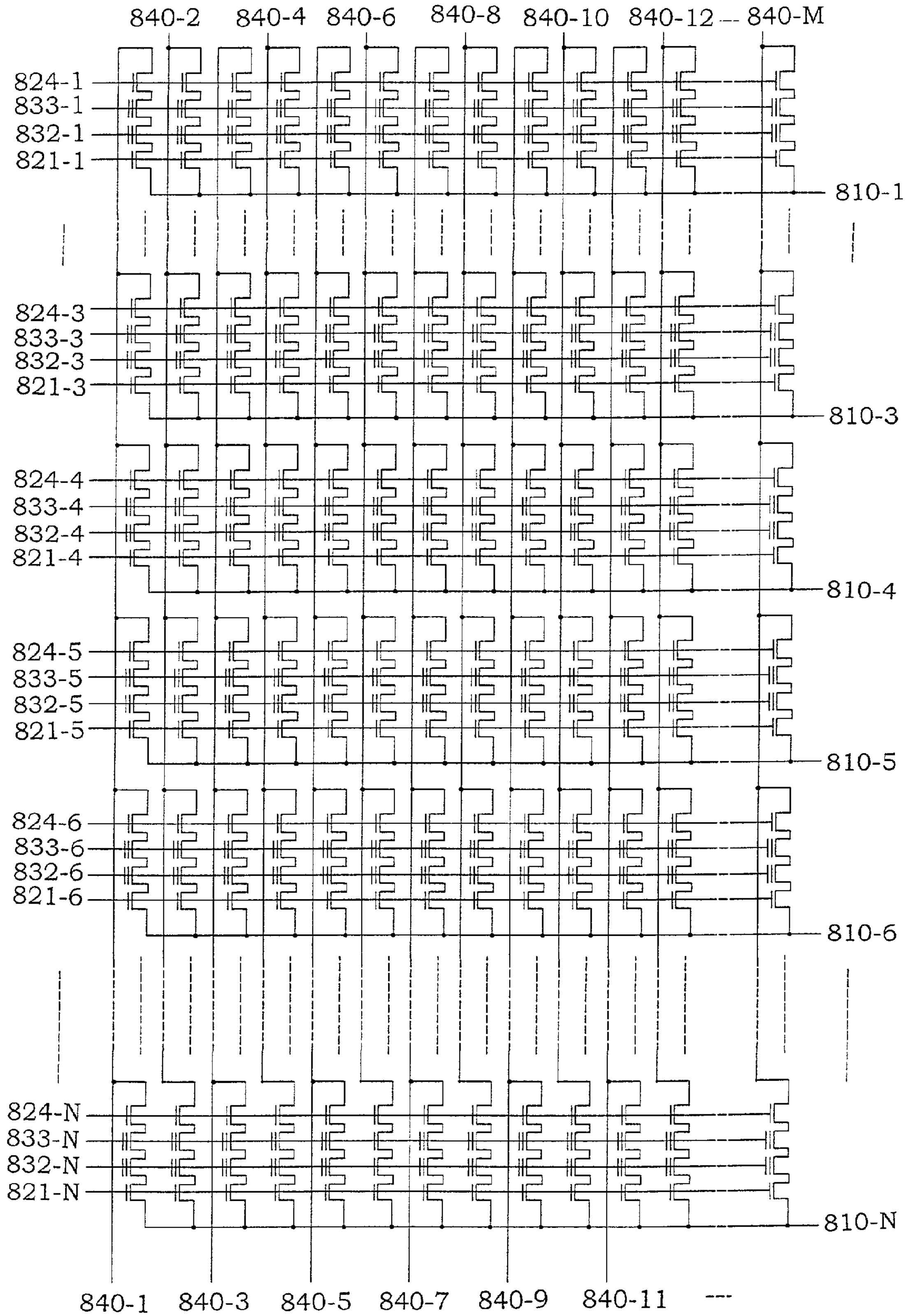

In FIG. 30, in contrast to FIG. 3, lead-out portions of the fourth wiring layers 840-1 to 840-M are disposed alternately at a B-side end and at a B'-side end of the memory cell array. An equivalent circuit diagram of FIG. 30 is shown in FIG. 176.

Figure 36:
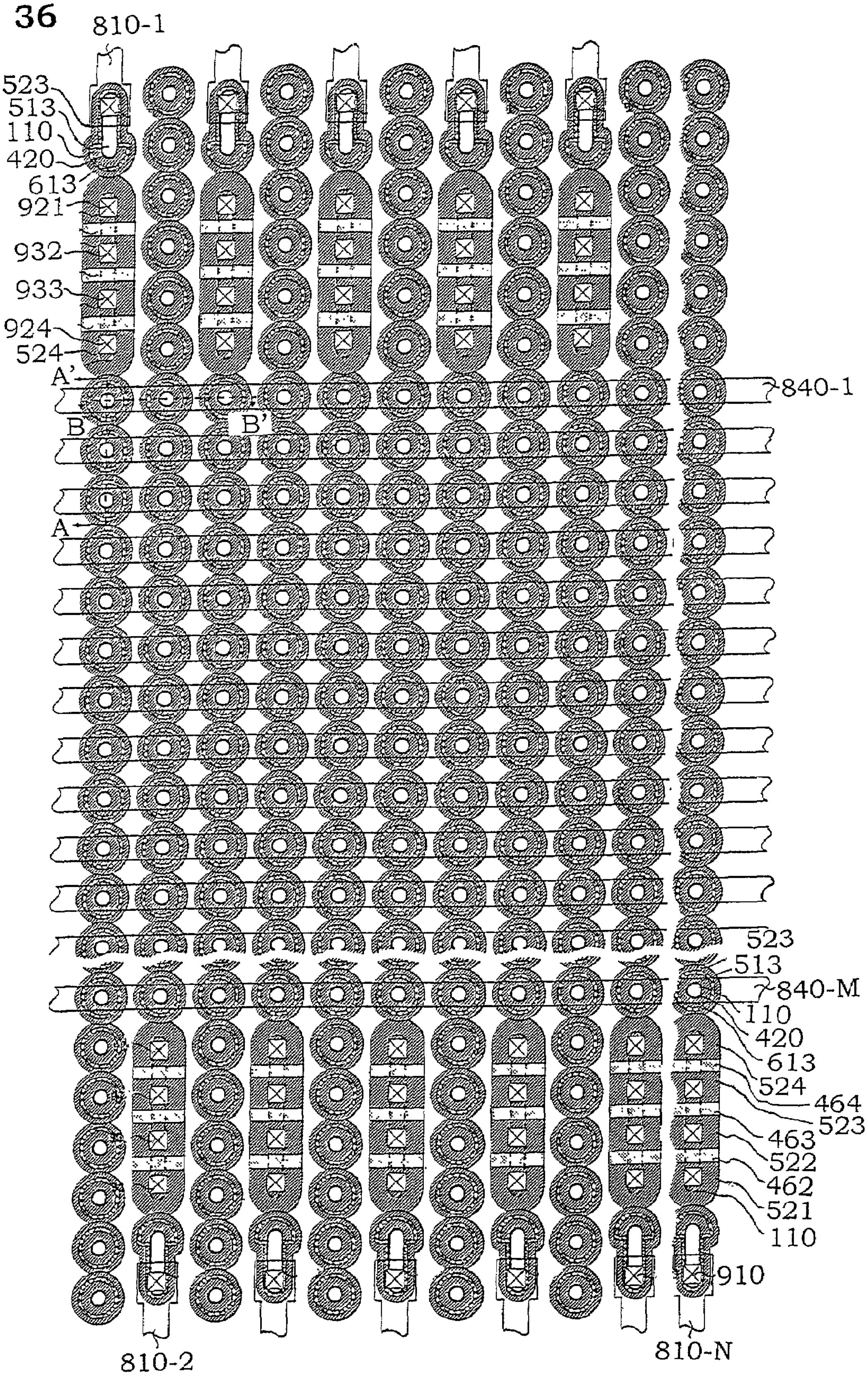

In FIG. 36, in contrast to FIG. 7, island-like semiconductor layers 110 not connected to the fourth wiring layers are provided between adjacent lead-out portions of the first wiring layers and between adjacent lead-out portions of the second and third wiring layers.

Figure 9:
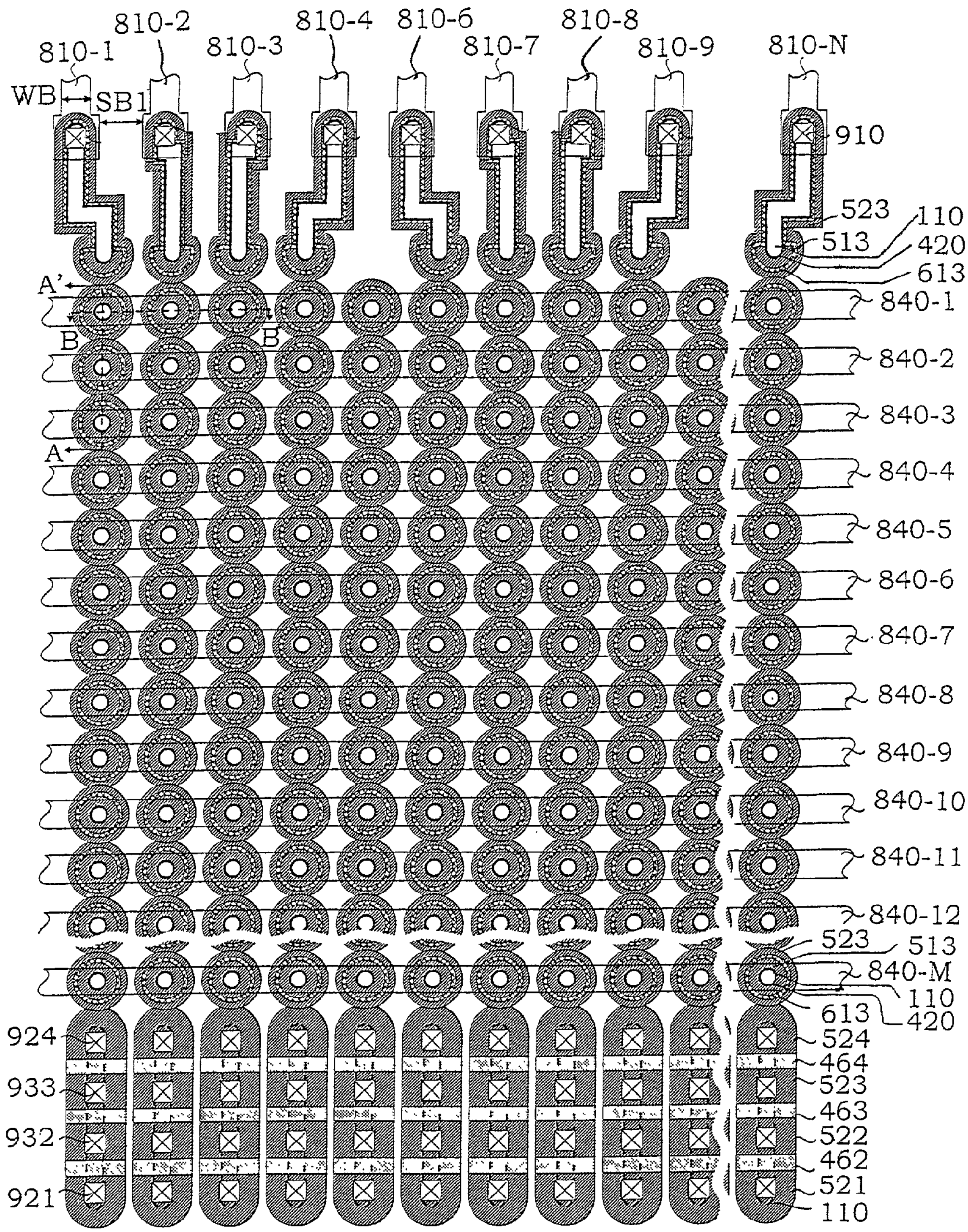
Figure 165:
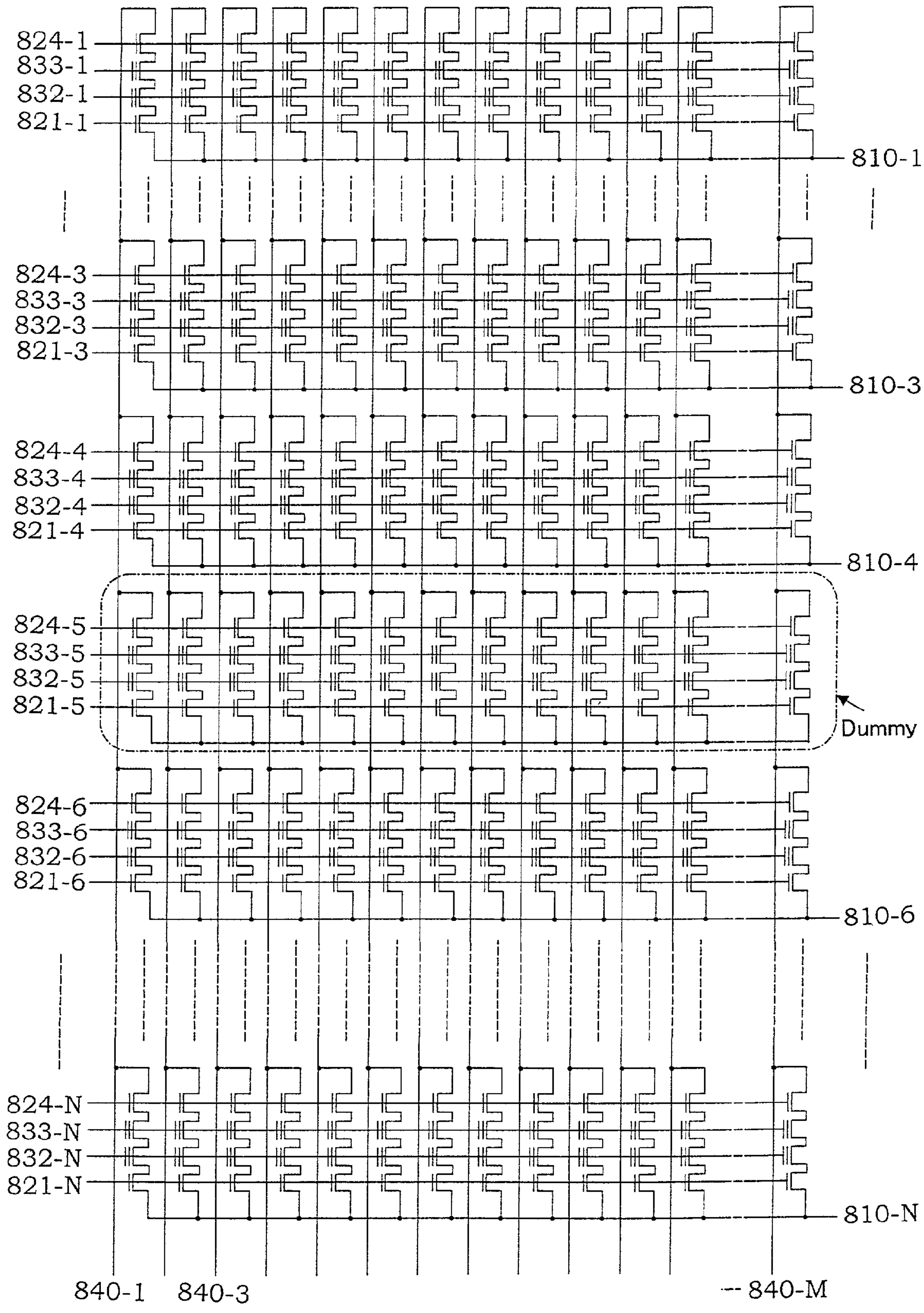

In FIG. 9, in contrast to FIG. 3, island-like semiconductor layers 110 not connected to the first wiring layers are provided as dummies to ensure spaces for placing the first wiring layers. The island-like semiconductor layers 110 which act as lead-out portions of the first wiring layers have two or more different shapes and are disposed at the A' side end of the memory cell array as shown in FIG. 9. Thereby the narrowest interval SB1 between the first wiring layers is ensured to increase. One or a plurality of dummies may be provided in a plurality of rows of memory cells. The distance between the dummy and its adjacent island-like semiconductor layer in the B–B' direction may be equal or unequal to the intervals between the island-like semiconductor layers in the B–B' direction in the memory cell array. This applies not only to FIG. 9 but also to FIG. 12, FIG. 13, FIG. 16, FIG. 24 and FIG. 25. An equivalent circuit diagram of FIG. 9 is shown in FIG. 165.

The above-mentioned arrangement may be realized at the A side end of the memory cell array or alternately at the A side end and at the A' side end. So long as the above-mentioned arrangement is realized, any first wiring layers may be optionally connected to any one of the island-like semiconductor layers 110 of the two or more different shapes.

Figure 14:
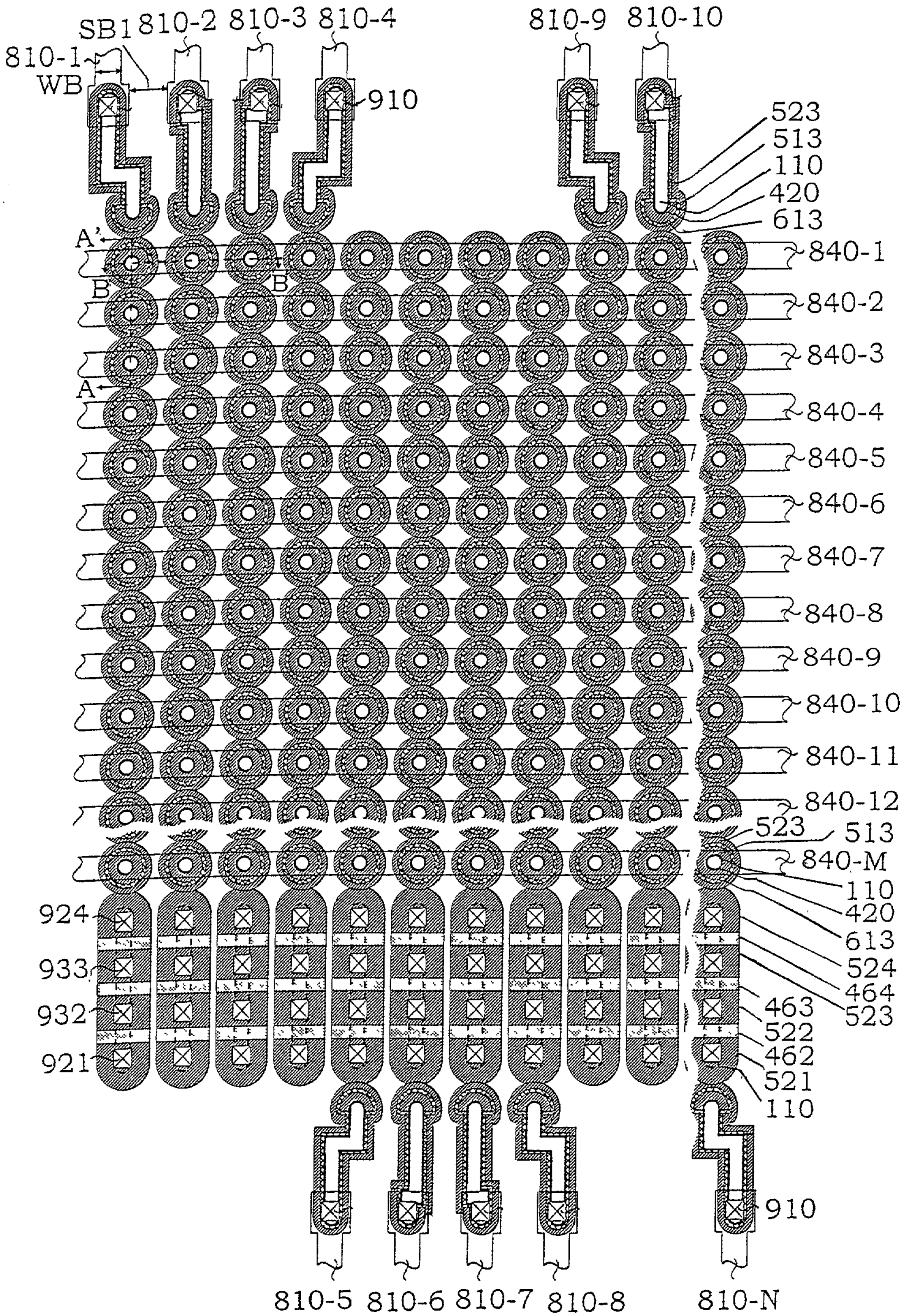
Figure 166:
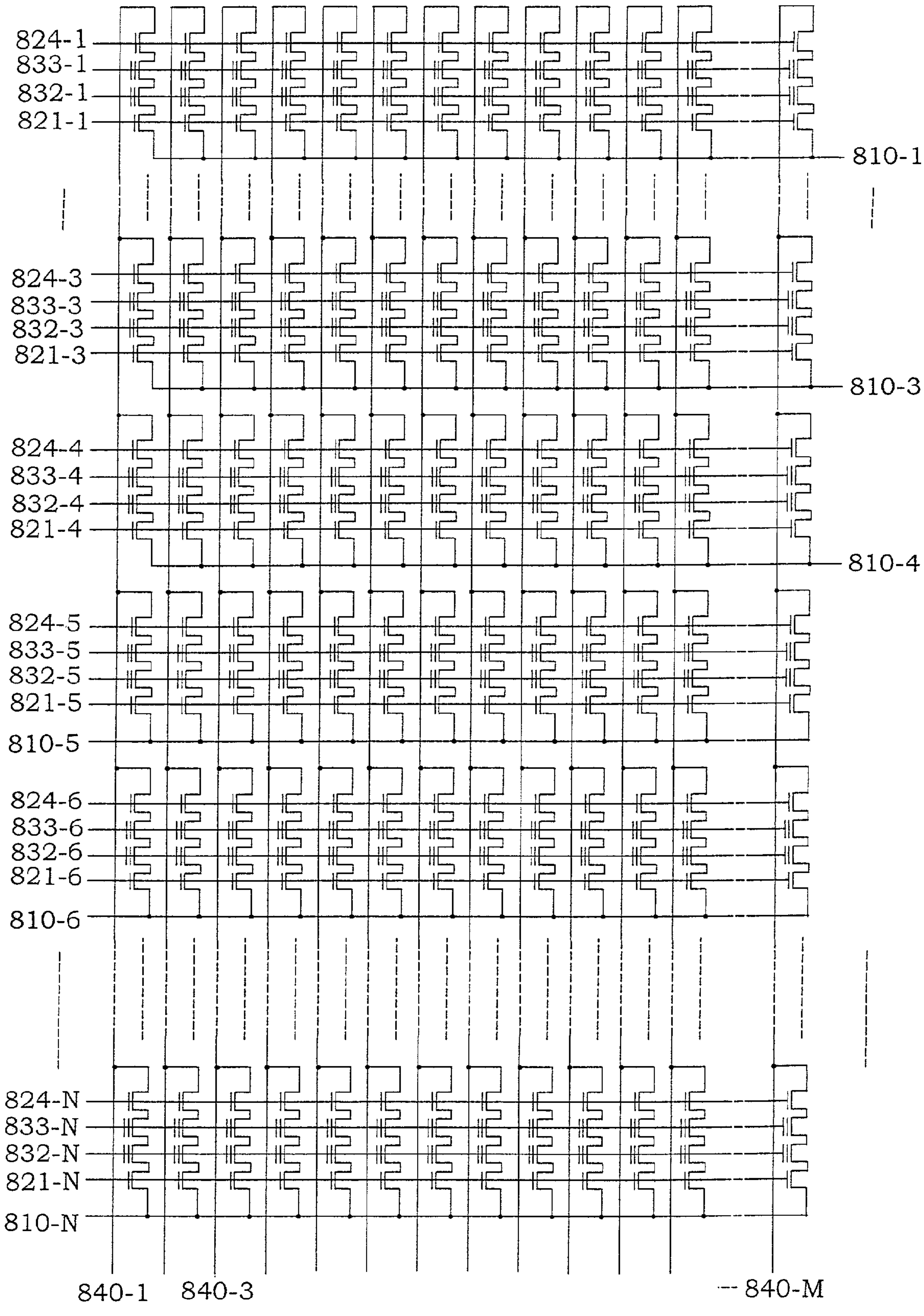

In FIG. 14, in contrast to FIG. 9, the island-like semiconductor layers 110 not connected to the first wiring layers are not provided, but the above-mentioned arrangement at the A' side end is realized alternatively at the A side end and at the A' side end. An equivalent circuit diagram of FIG. 14 is shown in FIG. 166. This case is more advantageous than the case of FIG. 9 since the island-like semiconductor layers as the dummy are not provided and the memory cells can be more highly integrated.

Figure 35:
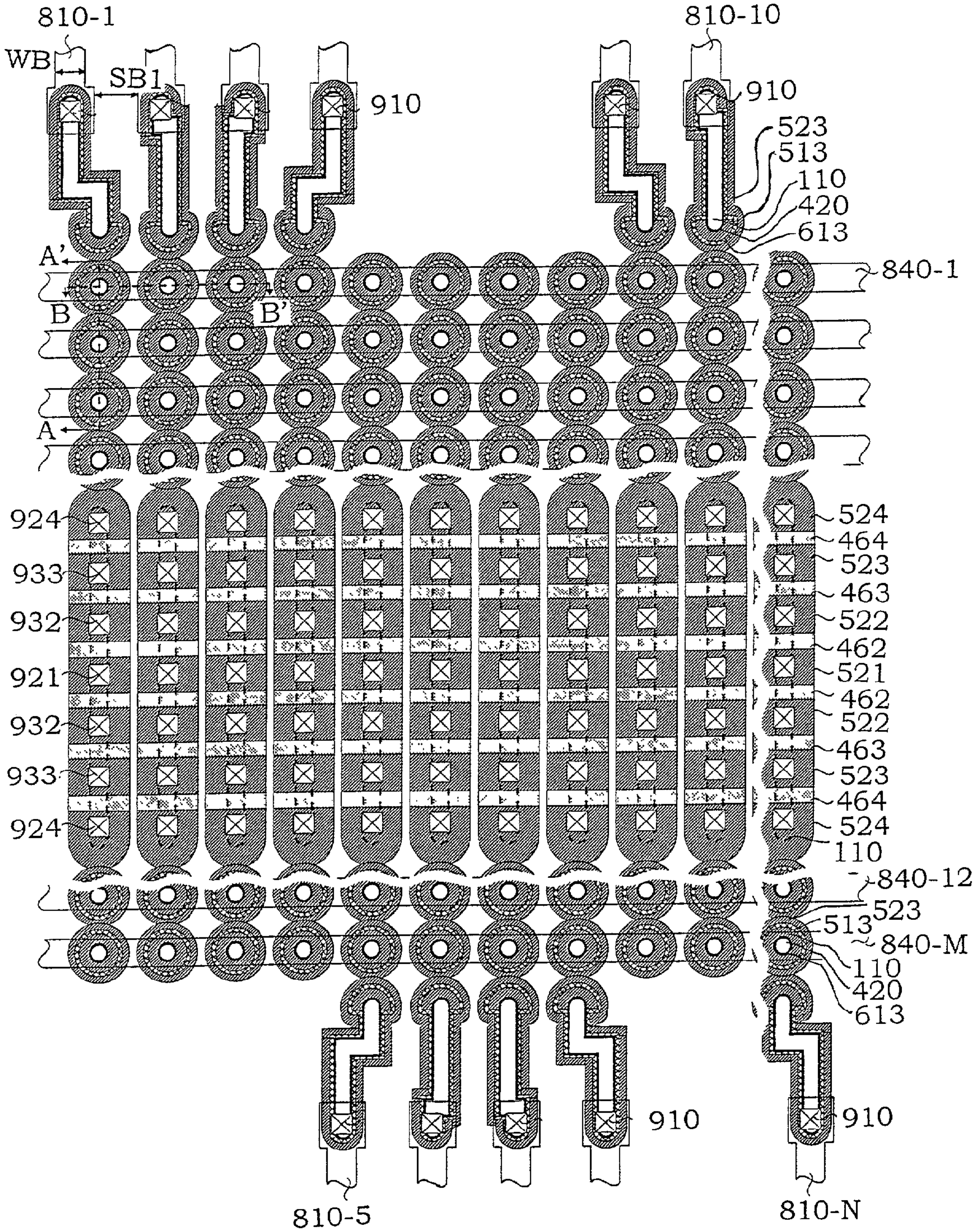
Figure 173:
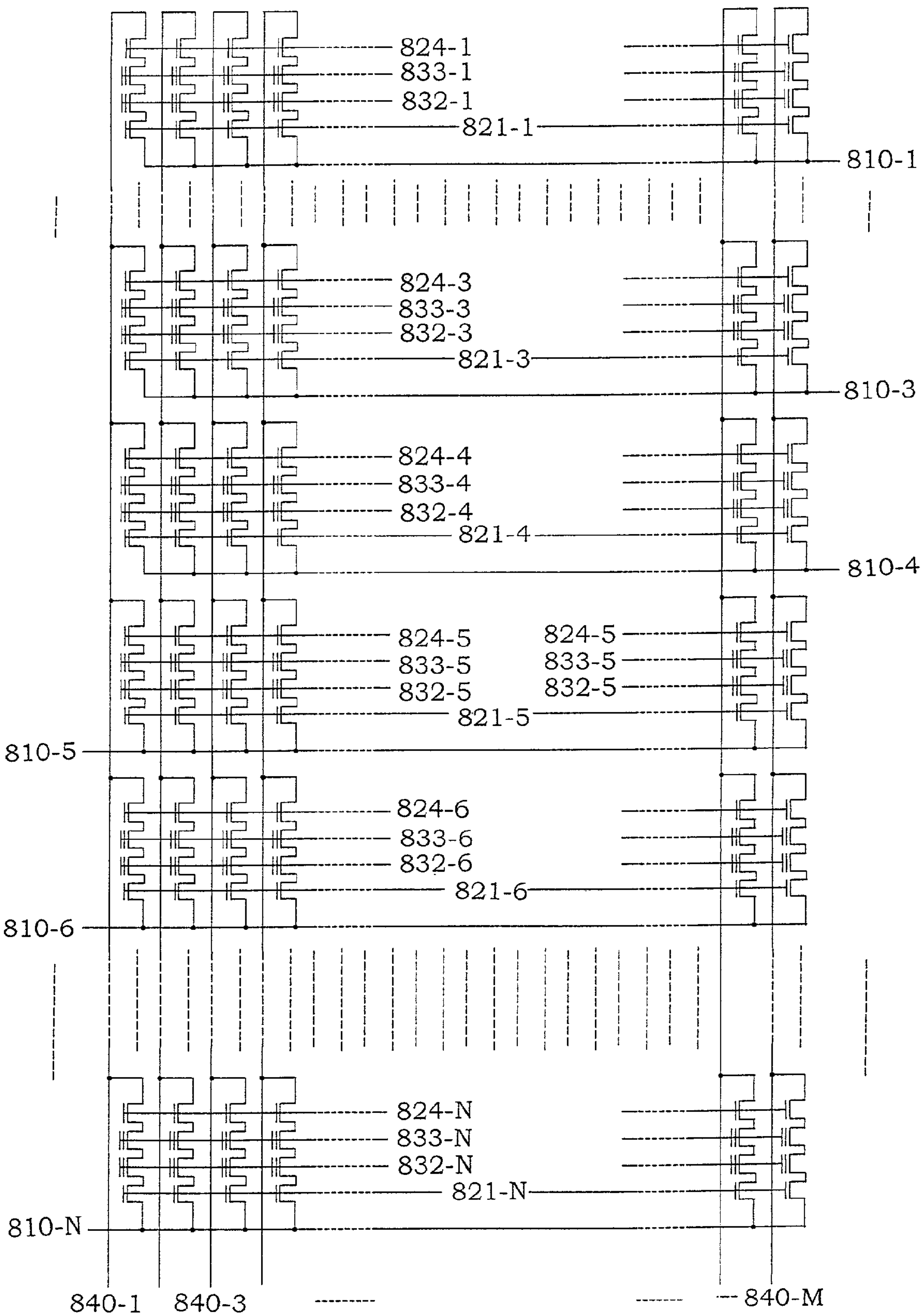

In FIG. 35, in contrast to FIG. 9, the lead-out portions of the second and third wiring layers are disposed midway along the rows of memory cells continuous in the A–A' direction. An equivalent circuit diagram of FIG. 35 is shown in FIG. 173.

Figure 11:
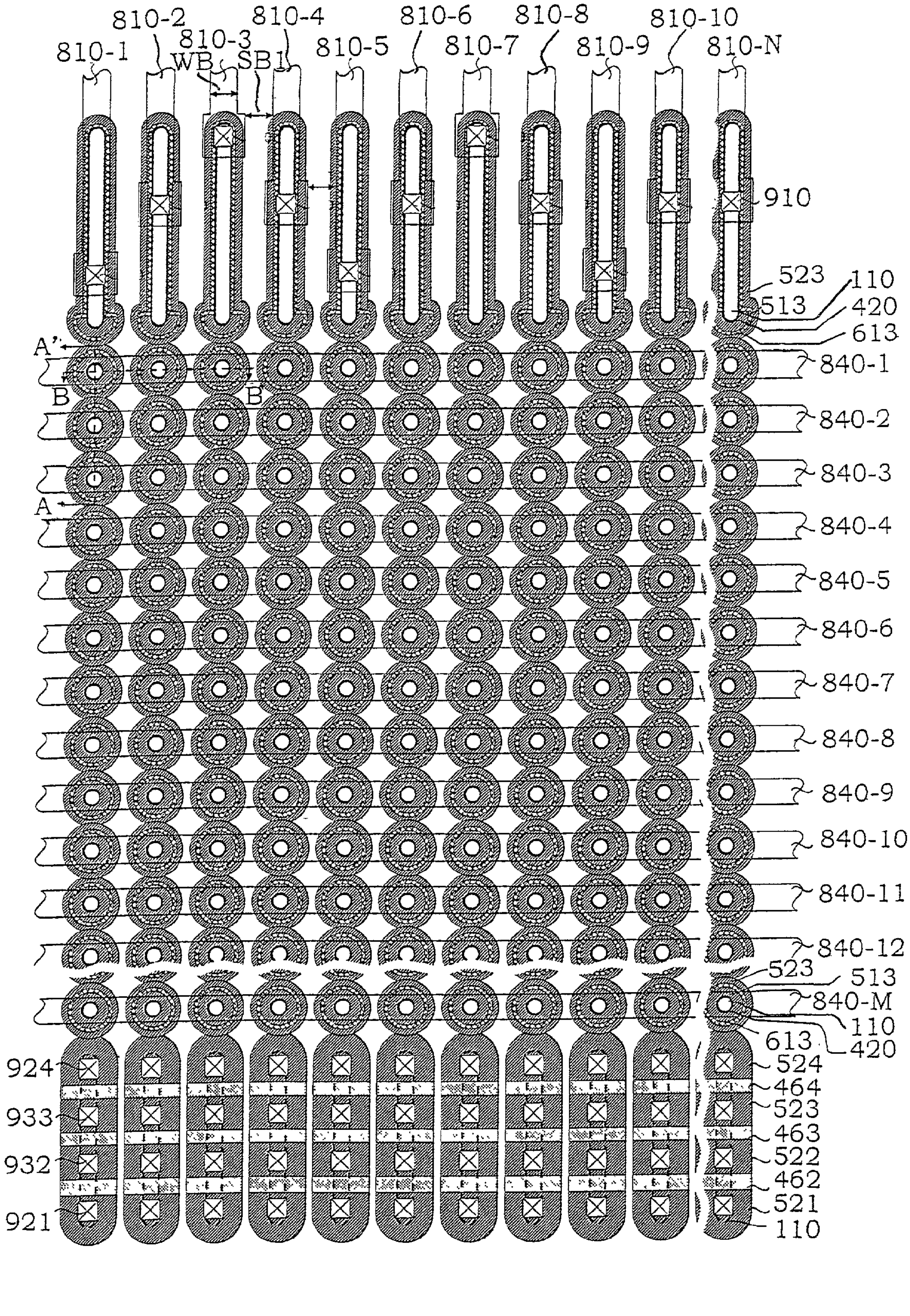

In FIG. 11, in contrast to FIG. 3, the positions of the first contacts 910 disposed in adjacent island-like semiconductor layers 110 which act as lead-out portions of the first wiring layers are shifted to each other in the A–A' direction. Thereby the narrowest interval SB1 between the first wiring layers is ensured to increase. An equivalent circuit diagram of FIG. 11 is shown in FIG. 160.

The above-mentioned arrangement may be realized at the A side end of the memory cell array or alternately at the A side end and at the A' side end.

Figure 12:
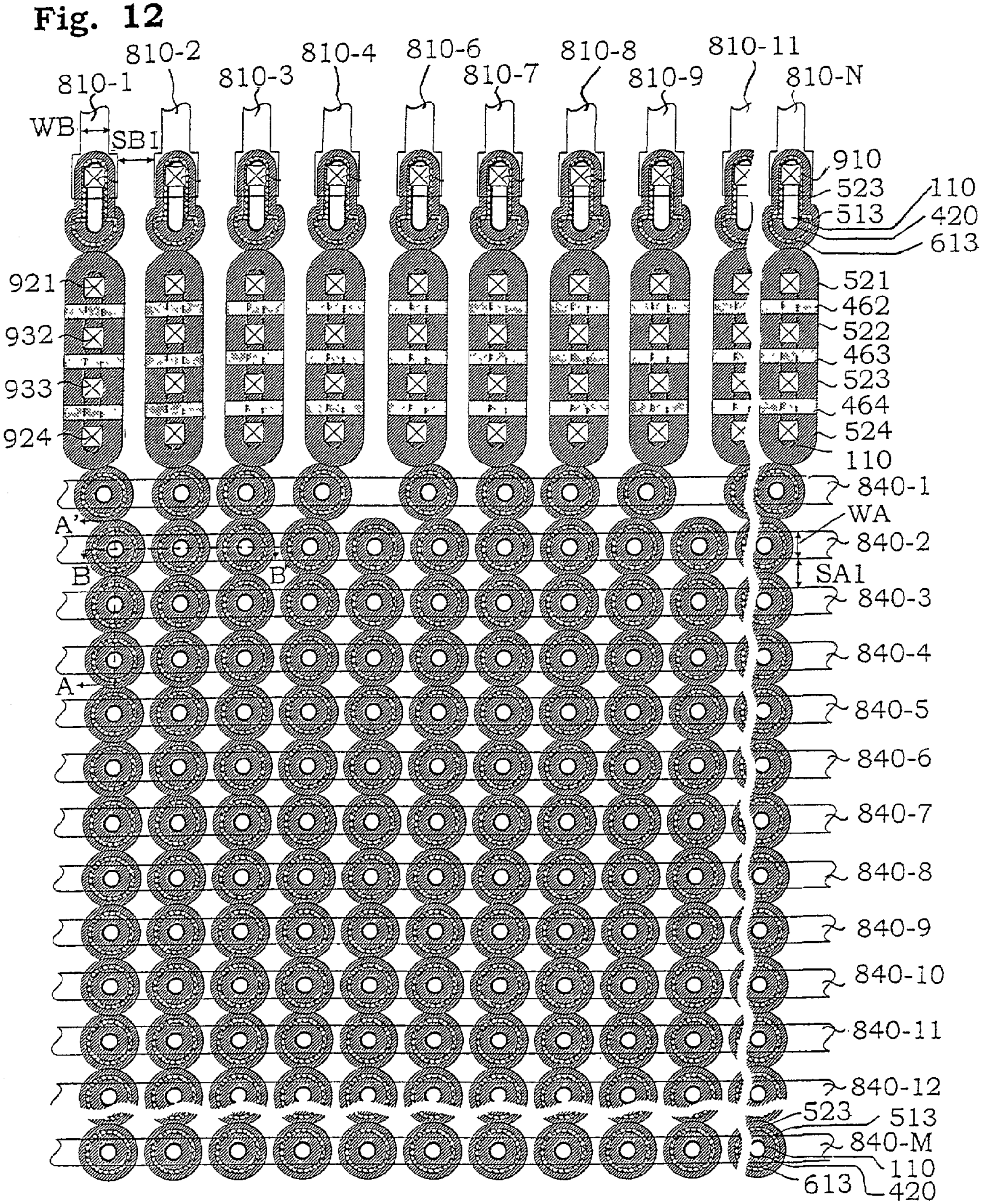
Figure 168:
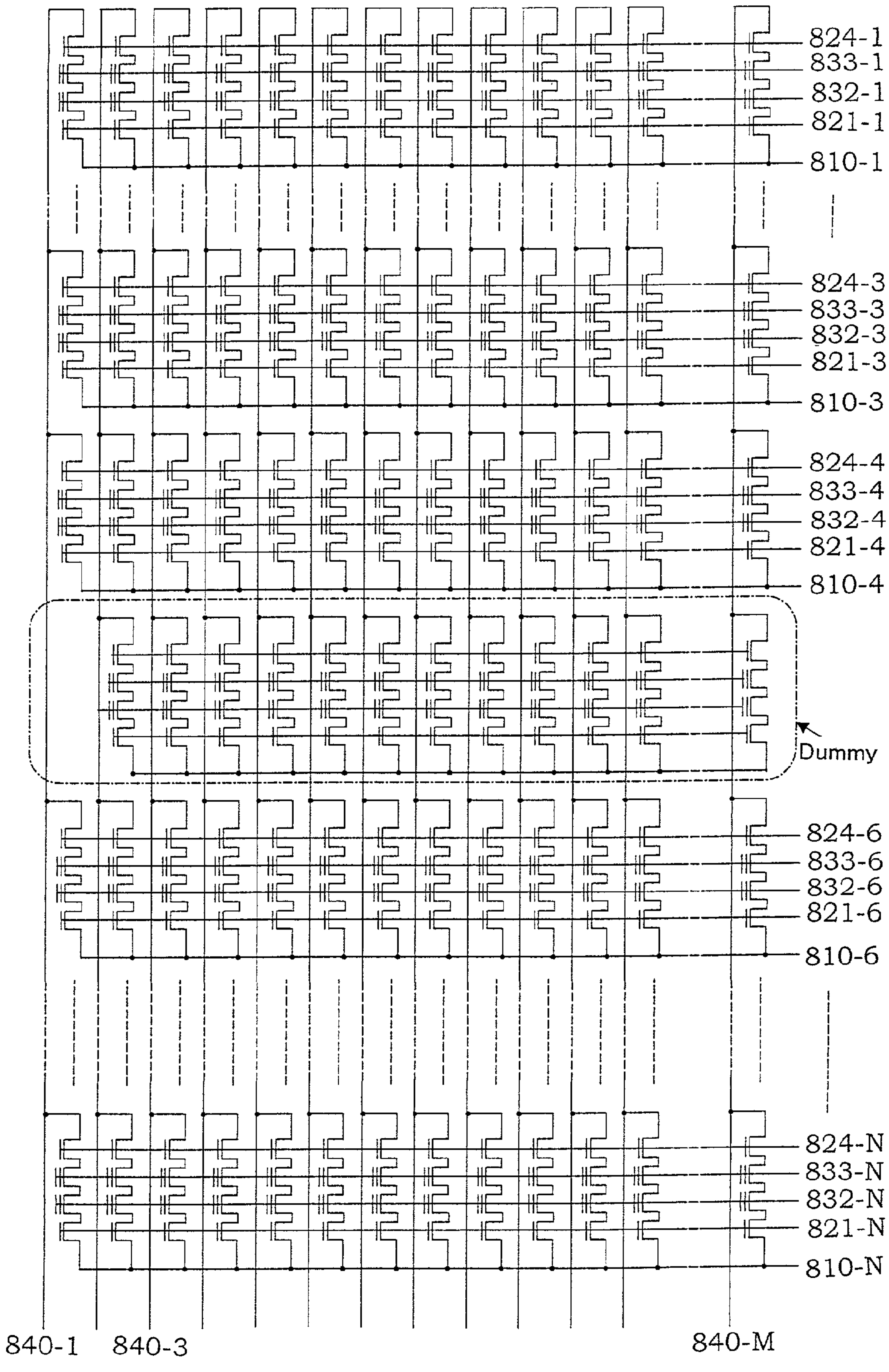

In FIG. 12, in contrast to FIG. 3, island-like semiconductor layers 110 not connected to the first, second and third wiring layers are provided as dummyies to ensure spaces for placing the first, second and third wiring layers. The Island-like semiconductor layers 110 on which the memory cell are disposed are extended in the B–B' direction as they approach the lead-out portions of the first, second and third wiring layers. Thereby the narrowest interval SB1 between the first wiring layers is ensured to increase. The lead-out portions of the first wiring layers are contacted with the lead-out portions of the second and third wiring layers. An equivalent circuit diagram of FIG. 12 is shown in FIG. 168.

Figure 13:
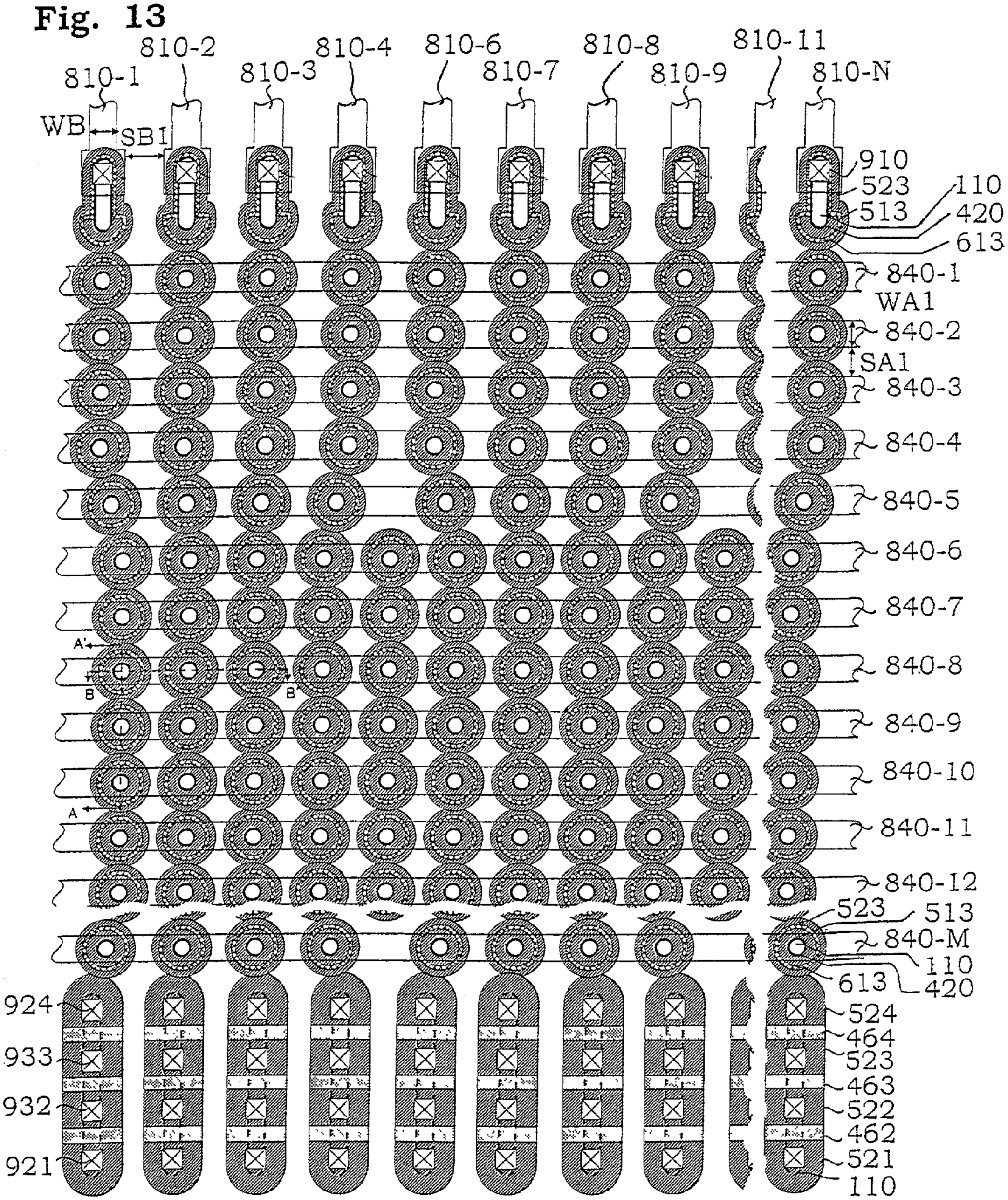
Figure 169:
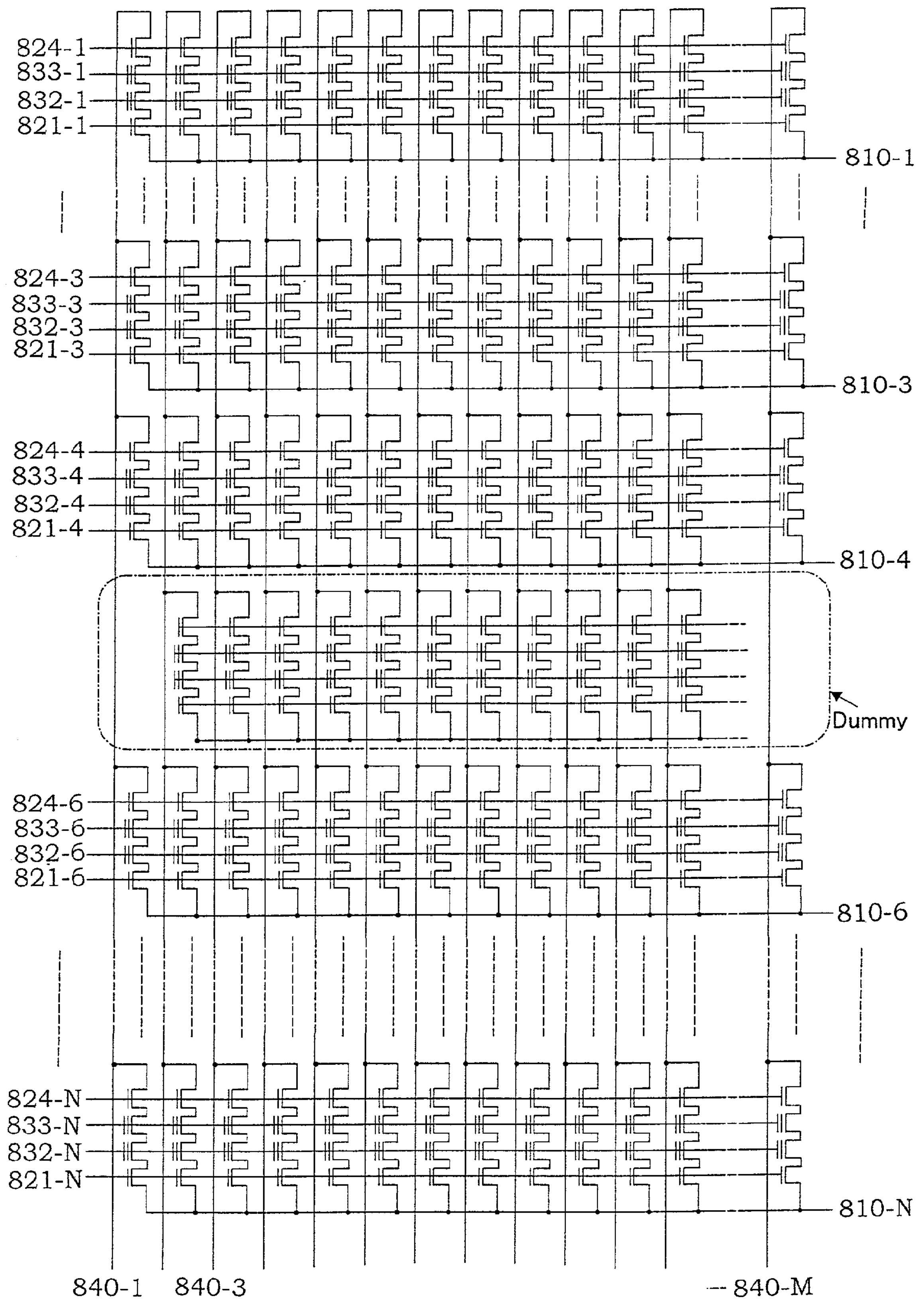

In FIG. 13, in contrast to FIG. 12, the lead-out portions of the first wiring layers are not contacted with the lead-out portions of the second and third wiring layers. The lead-out portions of the first wiring layers are disposed at the A' side end of the memory cell array and the lead-out portions of the second and third wiring layers are disposed at the A side end of the memory cell array. An equivalent circuit diagram of FIG. 13 is shown in FIG. 169.

Figure 16:
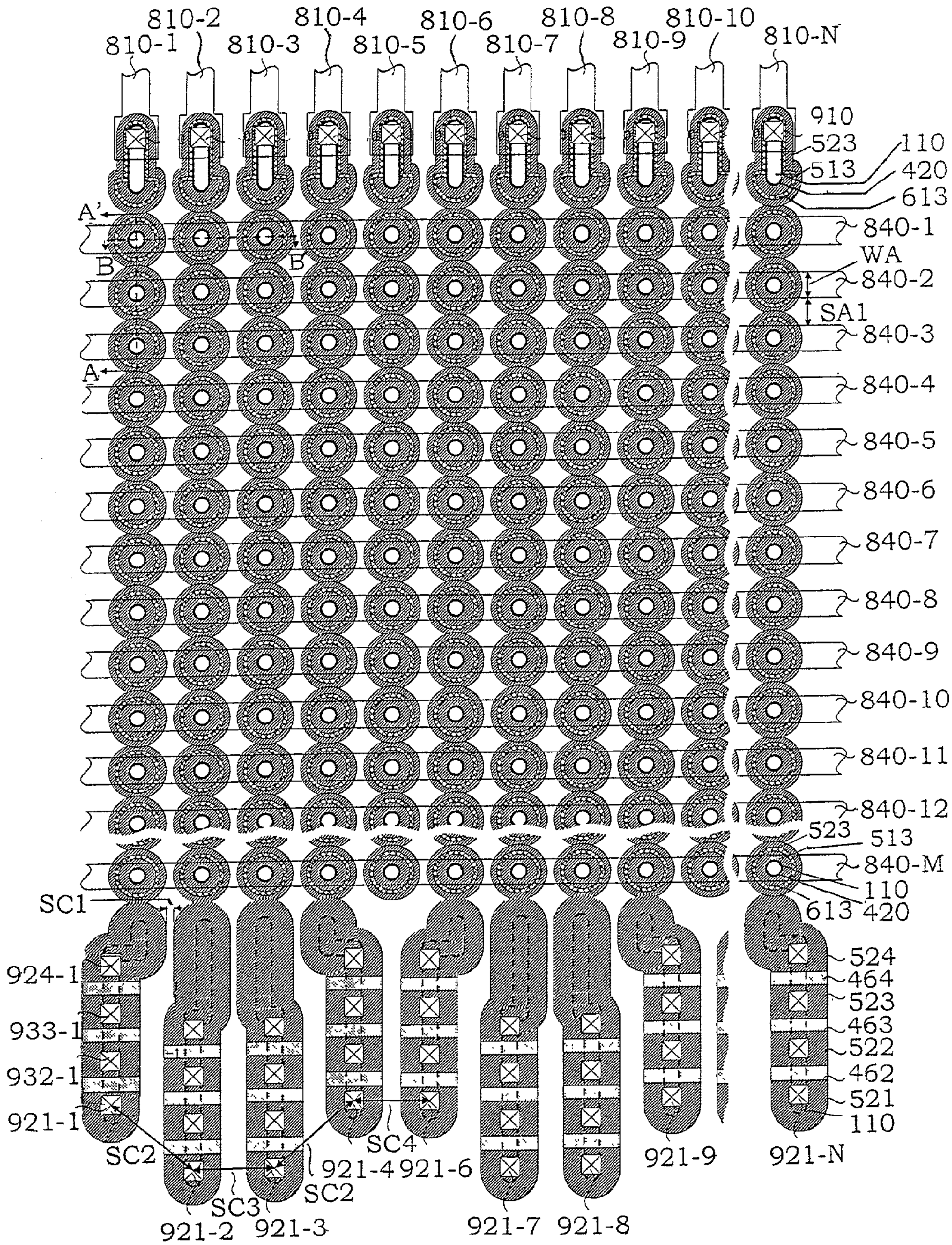
Figure 170:
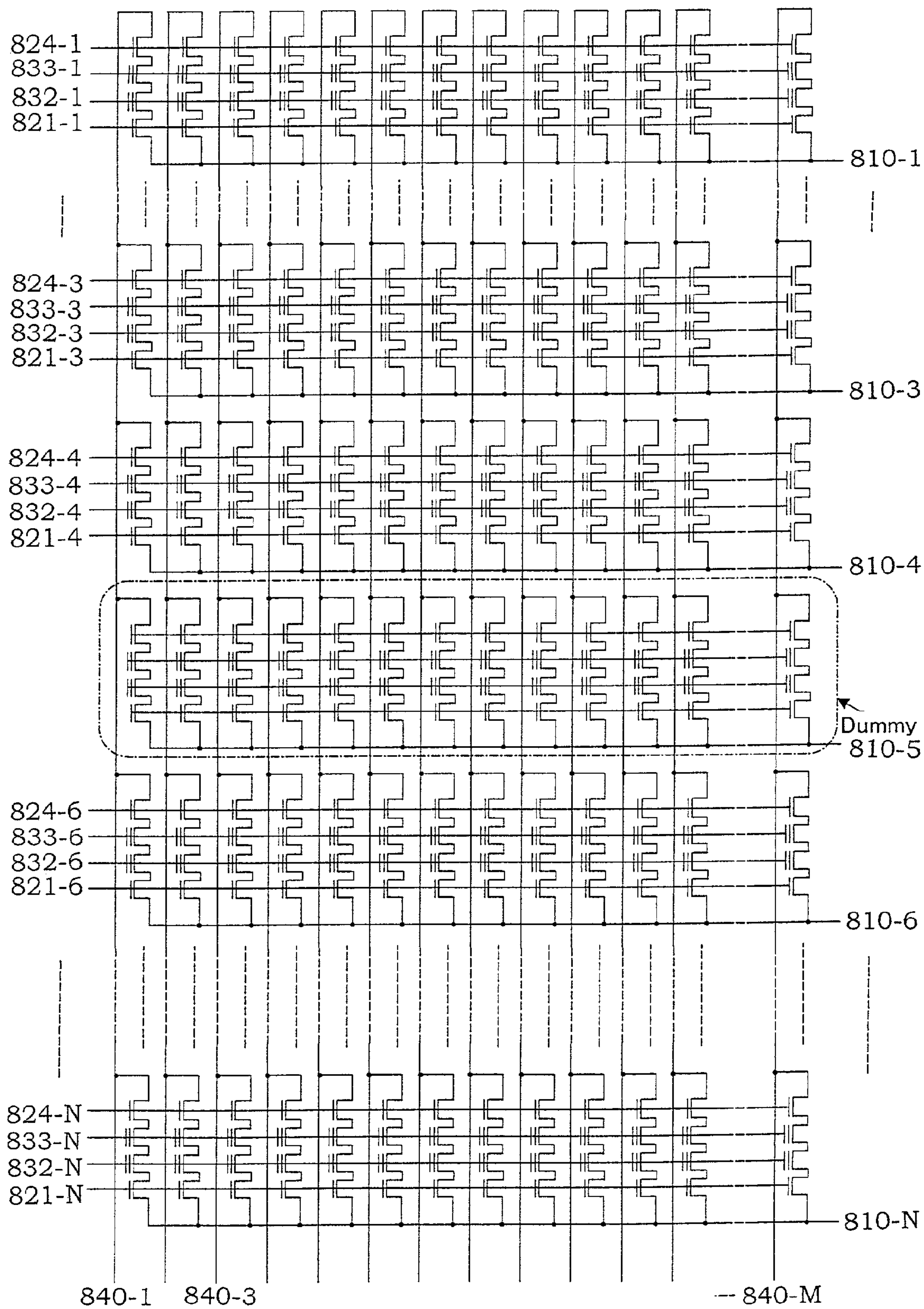

In FIG. 16, in contrast to FIG. 3, island-like semiconductor layers 110 which connected to the second and third wiring layers are provided as dummies to ensure spaces for placing the second and third wiring layers. The island-like semiconductor layers 110 which are lead-out portions of the second and third wiring layers have two or more different shapes and are disposed at the A side end of the memory cell array, as shown in FIG. 16. Thereby the intervals between the second or third contacts, e.g., SC2 between 921-1 and 921-2 and between 921-3 and 921-4, SC3 between 921-2 and 921-3 and SC4 between 921-4 and 921-6, are ensured to increase as compared with FIG. 3. An equivalent circuit diagram of FIG. 16 is shown in FIG. 170.

The above-mentioned arrangement may be realized at the A' side end of the memory cell arrays or alternately at the A side end and at the A' side end.

Figure 20:
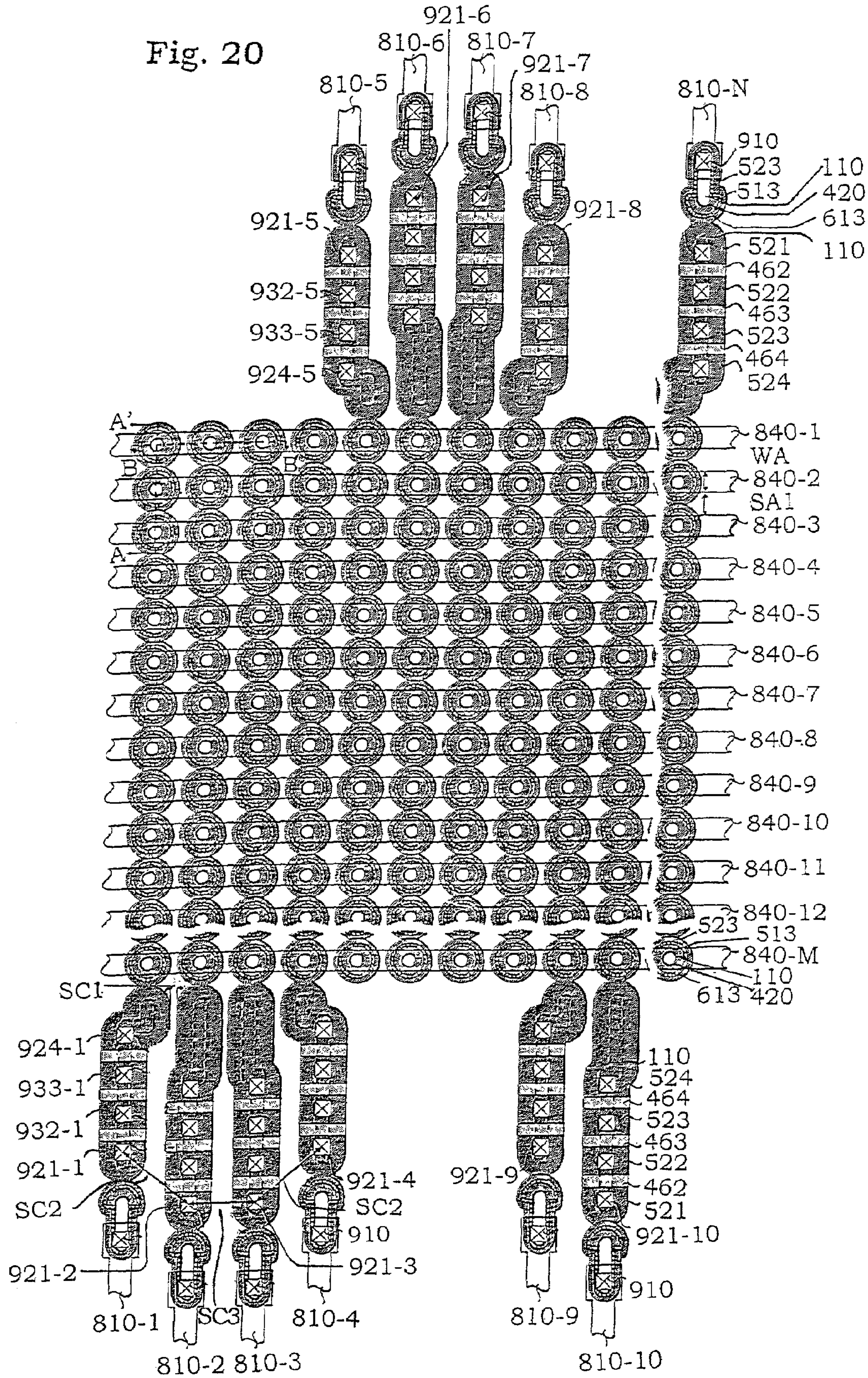
Figure 171:
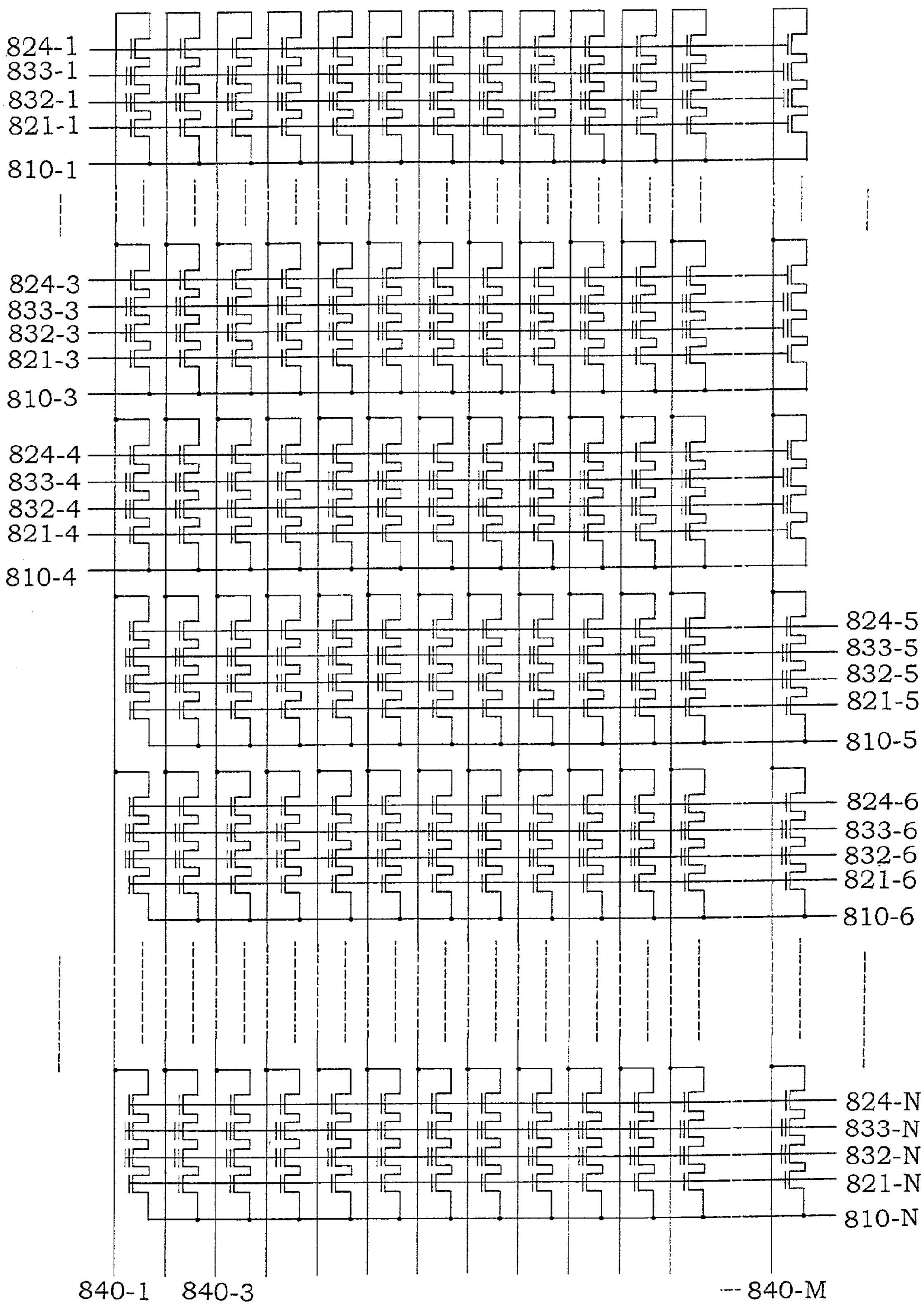

In FIG. 20, in contrast to FIG. 16, the island-like semiconductor layers 110 not connected to the second and third wiring layers are not provided, but the above-mentioned arrangement at the A side end is realized alternatively at the A side end and at the A' side end. An equivalent circuit diagram of FIG. 20 is shown in FIG. 171. This case is more advantageous than the case of FIG. 16 since the memory cells can be more highly integrated since the island-like semiconductor layers as the dummies are not provided.

Figure 17:
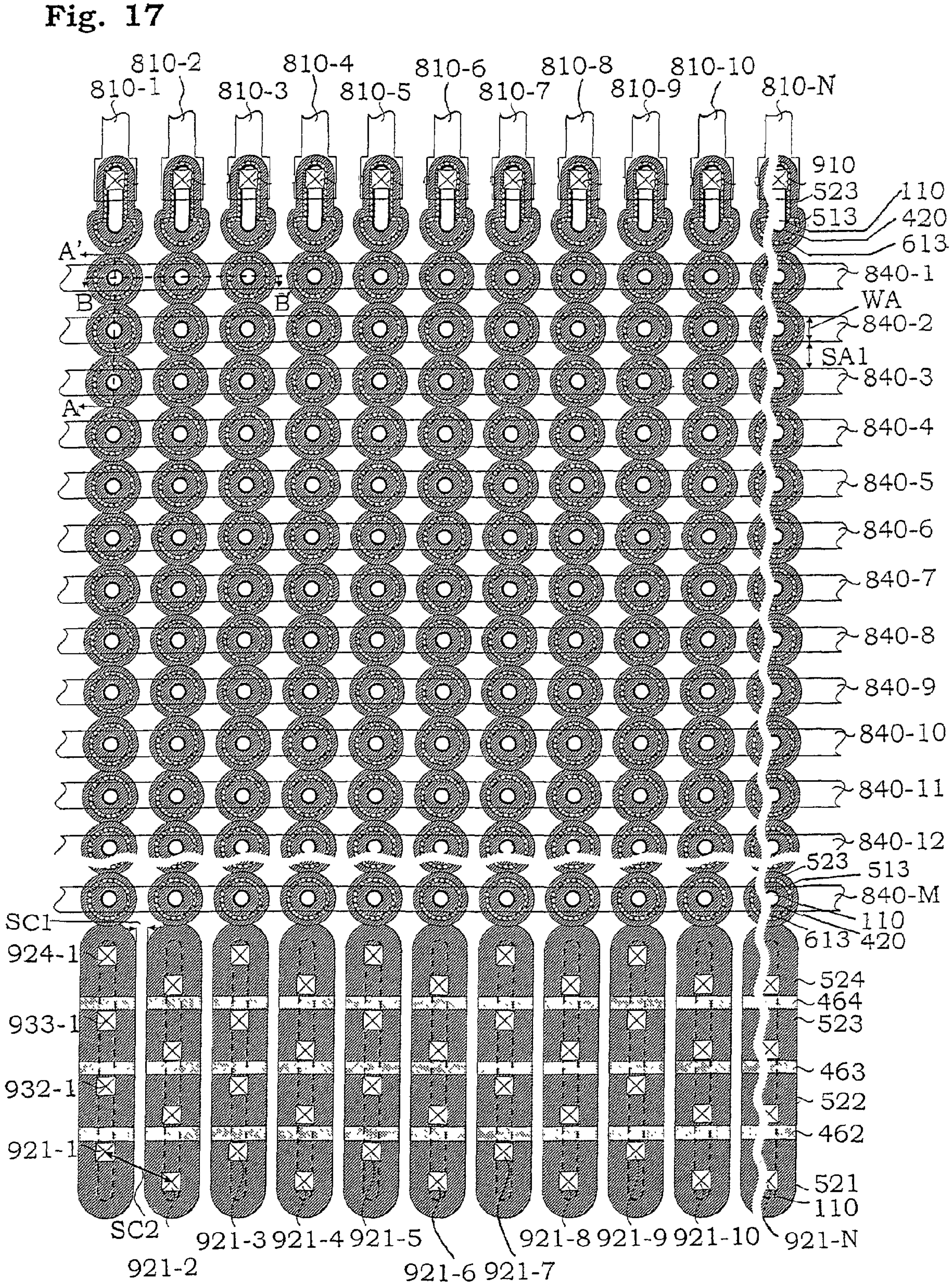

In FIG. 17, in contrast to FIG. 3, the positions of the second and third contacts 921, 932, 933 and 924 disposed in adjacent island-like semiconductor layers 110 which are lead-out portions of the second and third wiring layers are shifted to each other in the A–A' direction. Thereby the intervals between the second or third contacts, e.g., SC2 between 921-1 and 921-2 and between 921-3 and 921-4, SC3 between 921-2 and 921-3 and SC4 between 921-4 and 921-6, are ensured to increase as compared with FIG. 3. Sectional views of a lead-out portion including the contacts 921, 932, 933 and 924 are shown in FIG. 658 and FIG. 669, and sectional views of a lead-out portion including the contact 910 are shown in FIG. 560 and FIG. 583. An equivalent circuit diagram of FIG. 17 is shown in FIG. 160.

The above-mentioned arrangement may be realized at the A side end of the memory cell array or alternately at the A side end and at the A' side end.

Figure 18:
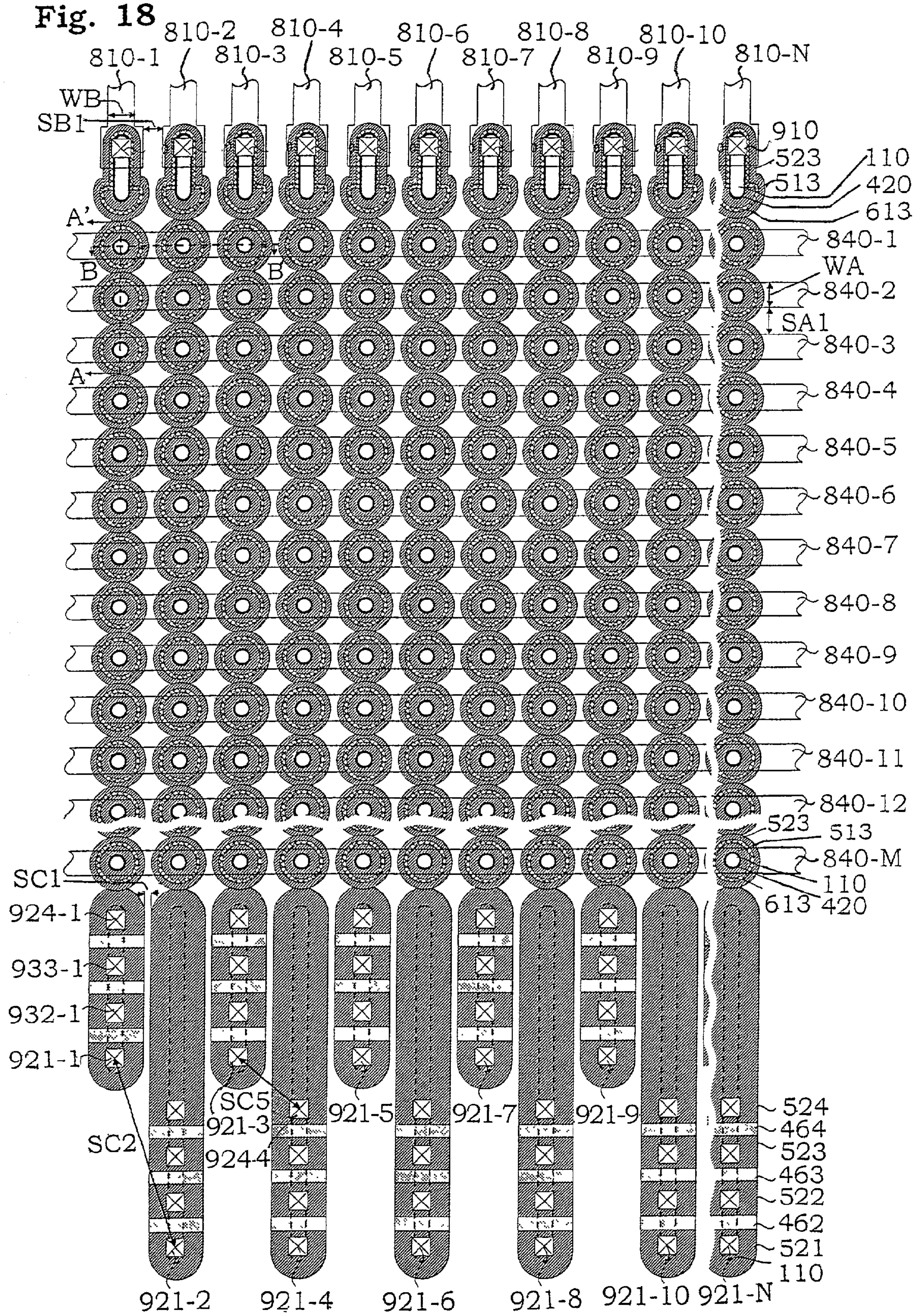

In FIG. 18, in contrast to FIG. 3, adjacent island-like semiconductor layers 110 which act as lead-out portions of second and third wiring layers have different lengths in the A–A' direction. Island-like semiconductor layers 110 of two different lengths which act as lead-out portions of the second and third wiring layers are disposed at the A side end of the memory cell array. Thereby, the intervals between the second or third contacts, e.g., SC2 between 921-1 and 921-2, are ensured to increase as compared with FIG. 3. Also, in this case, the smallest interval between the second or third contacts, e.g., SC5 between 921-3 and 924-4, can be ensured to be larger than any interval between the second or third contacts in FIG. 3. This is an advantage because the second and third wiring layers can be formed more easily. An equivalent circuit diagram of FIG. 18 is shown in FIG. 160.

The above-mentioned arrangement may be realized at the A' side end of the memory cell array or alternately at the A side end and at the A' side end.

Figure 39:
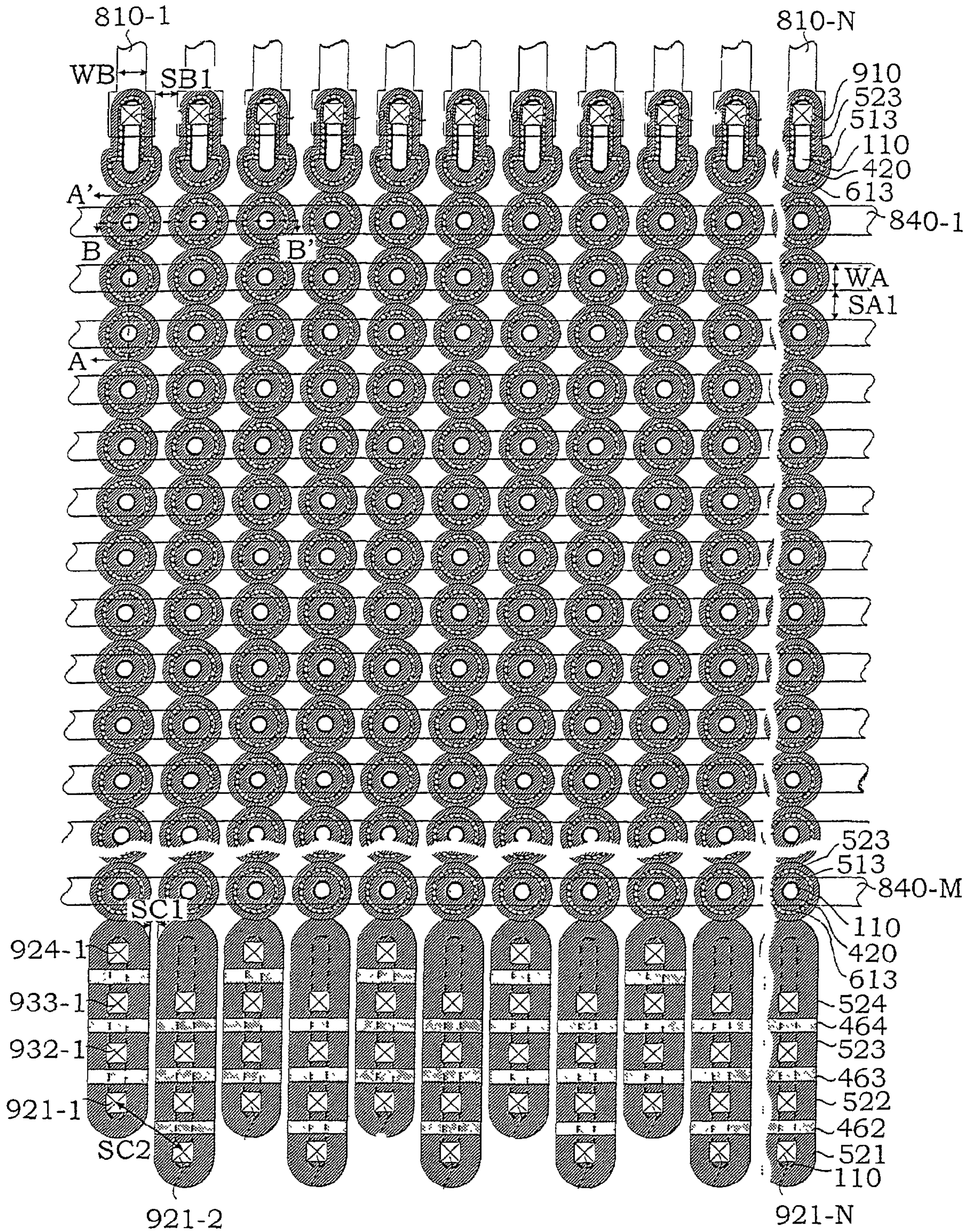

In FIG. 39, in contrast to FIG. 18, the difference of the length of adjacent island-like semiconductor layers 110 which act as lead-out portions of the second and third wiring layers is about a disposition interval of the memory cells continuous in the A–A' direction. Thereby, the intervals between the second or third contacts, e.g., SC2 between 921-1 and 921-2, are ensured to increase as compared with FIG. 3. Sectional views of a lead-out portion including the contacts 921, 932, 933 and 924 are shown in FIG. 658 and FIG. 669, and sectional views of a lead-out portion including the contact 910 are shown in FIG. 560 and FIG. 583.

Figure 19:
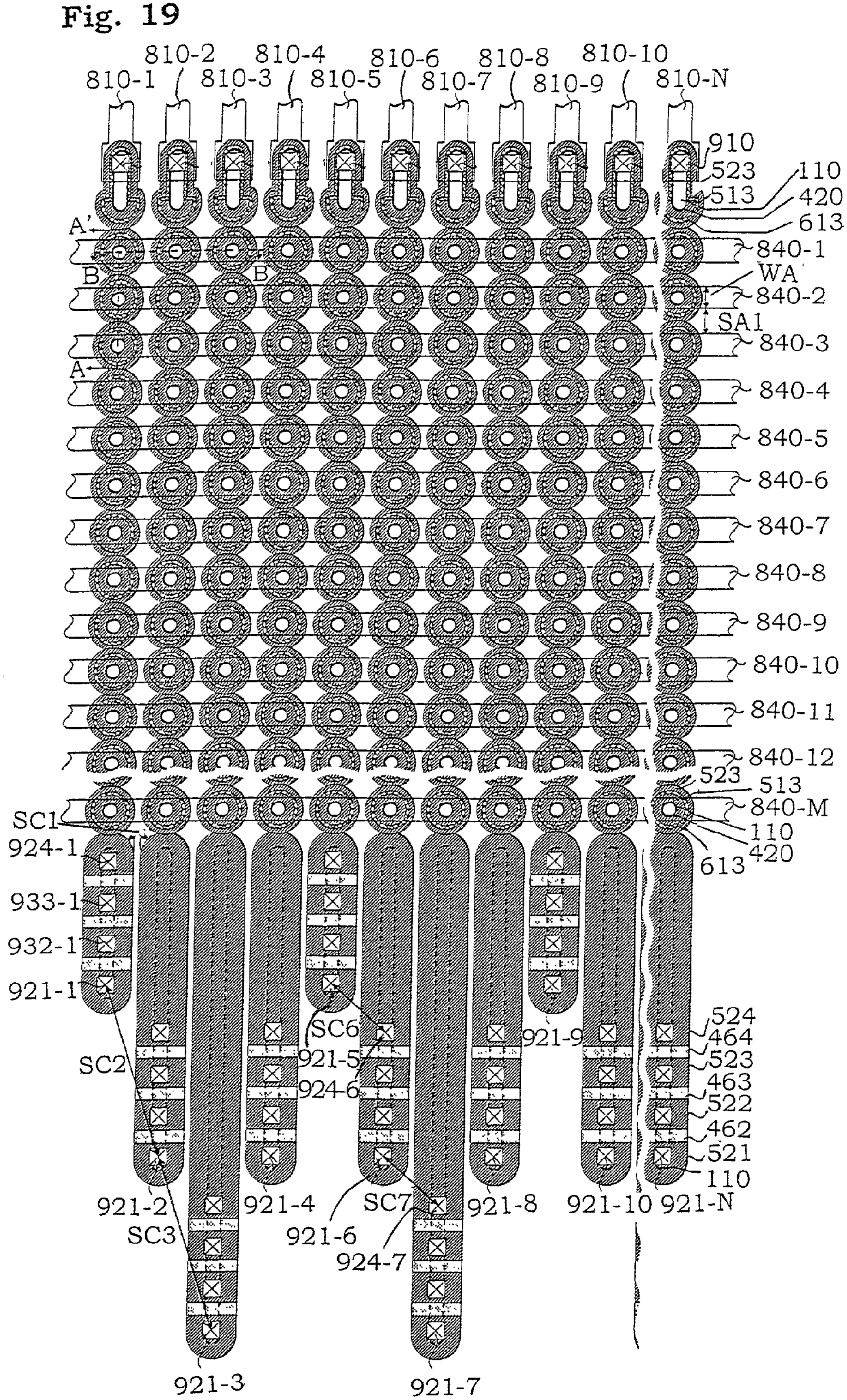

In FIG. 19, in contrast to FIG. 3, adjacent island-like semiconductor layers 110 which act as lead-out portions of the second and third wiring layers have different lengths in the A–A' direction. Island-like semiconductor layers 110 of more than two different lengths which act as lead-out portions of the second and third layers are disposed in a mountain form as shown in FIG. 19 at the A side end of the memory cell array. Thereby, the intervals between the second or third contacts, e.g., SC2 between 921-1 and 921-2 and SC3 between 921-2 and 921-3, are ensured to increase as compared with FIG. 3. In this case, the narrowest intervals between the second and third contacts, e.g., SC6 between 921-5 and 924-6 and SC7 between 921-6 and 924-7, are also ensured to be larger than any interval between the second and third contacts in FIG. 3. This arrangement has an advantage because the second and third wiring layers can be formed more easily. An equivalent circuit diagram of FIG. 19 is shown in FIG. 160.

The above-mentioned arrangement may be realized at the A' side end of the memory cell array or alternately at the A side end and at the A' side end. So long as the above-mentioned arrangement is realized, the second and third wiring layers may be optionally connected to either one of the island-like semiconductor layers 110 of the more than two different lengths which act as the lead-out portions of the second and third wiring layers.

Figure 40:
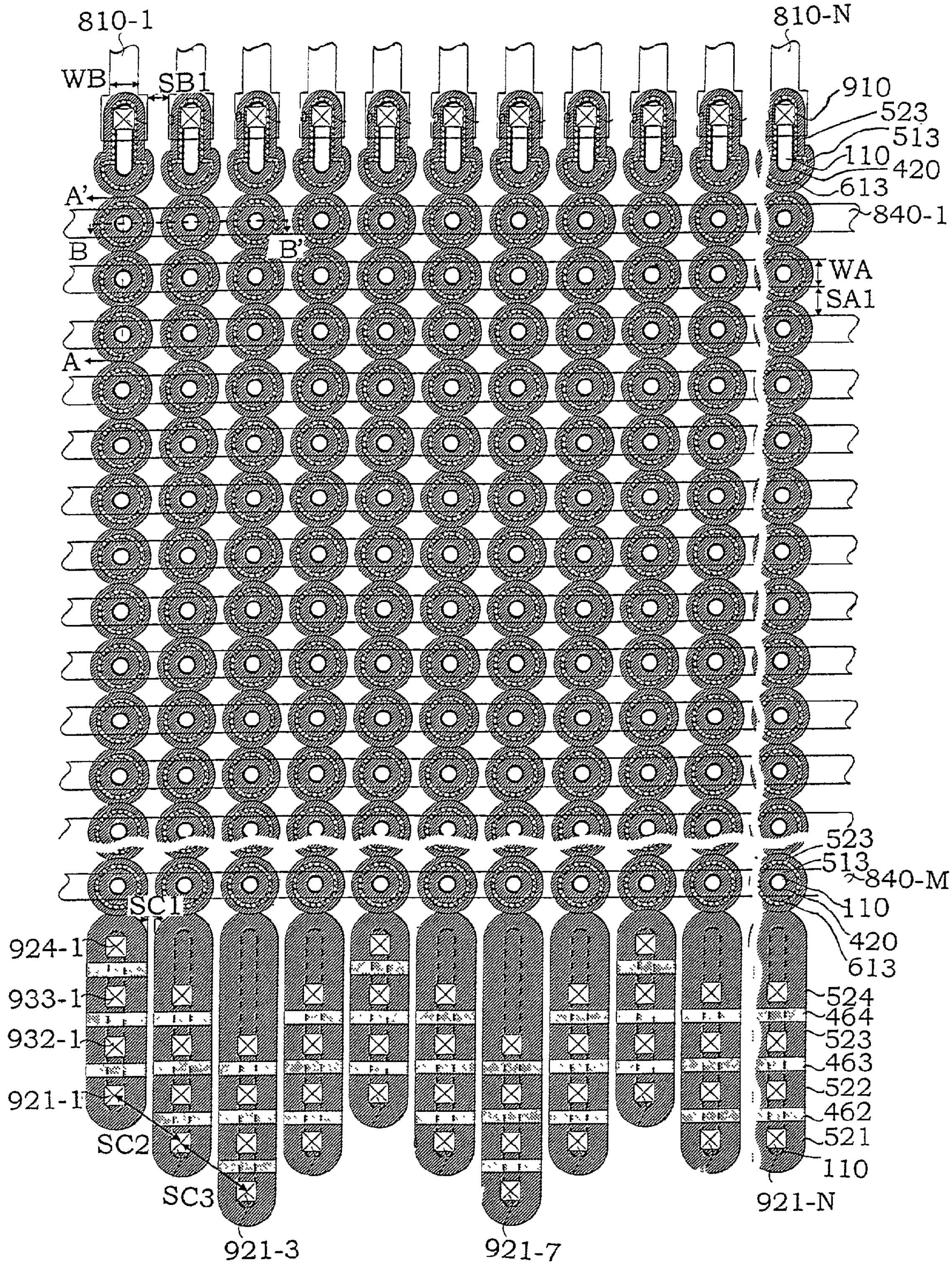

In FIG. 40, in contrast to FIG. 19, the difference in the more than two lengths of the island-like semiconductor layers 110 which act as lead-out portions of the second and third wiring layers is about a disposition interval of the memory cells continuous in the A–A' direction, for example, as shown in FIG. 40. Thereby, the intervals between the second or third contacts, e.g., SC2 between 921-1 and 921-2 and SC3 between 921-2 and 921-3, are ensured to increase as compared with FIG. 3. Sectional views of a lead-out portion including the contacts 921, 932, 933 and 924 are shown in FIG. 658 and FIG. 669, and sectional views of a lead-out portion including the contact 910 are shown in FIG. 560 and FIG. 583. An equivalent circuit diagram of FIG. 18 is shown in FIG. 160.

Figure 38:
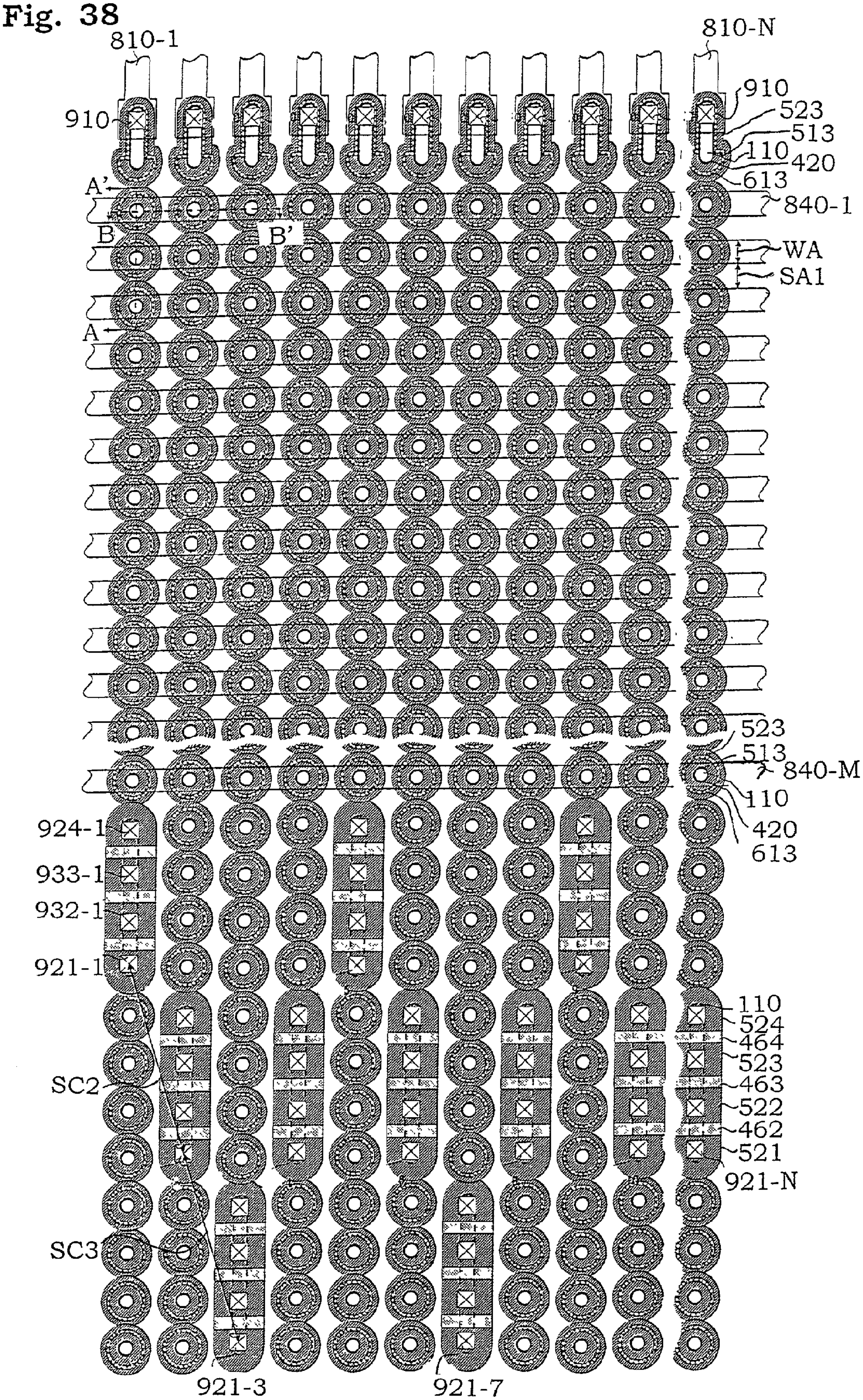

In FIG. 38, in contrast to FIG. 19, island-like semiconductor layers 110 not connected to the fourth wiring layers are provided and disposed as dummies as shown in FIG. 38 without changing lengths of adjacent island-like semiconductor layers 110 which act as lead-out portions of the second and third wiring layers in the A–A' direction. Thereby, the same effect as obtained in FIG. 19 is obtained.

Figure 21:
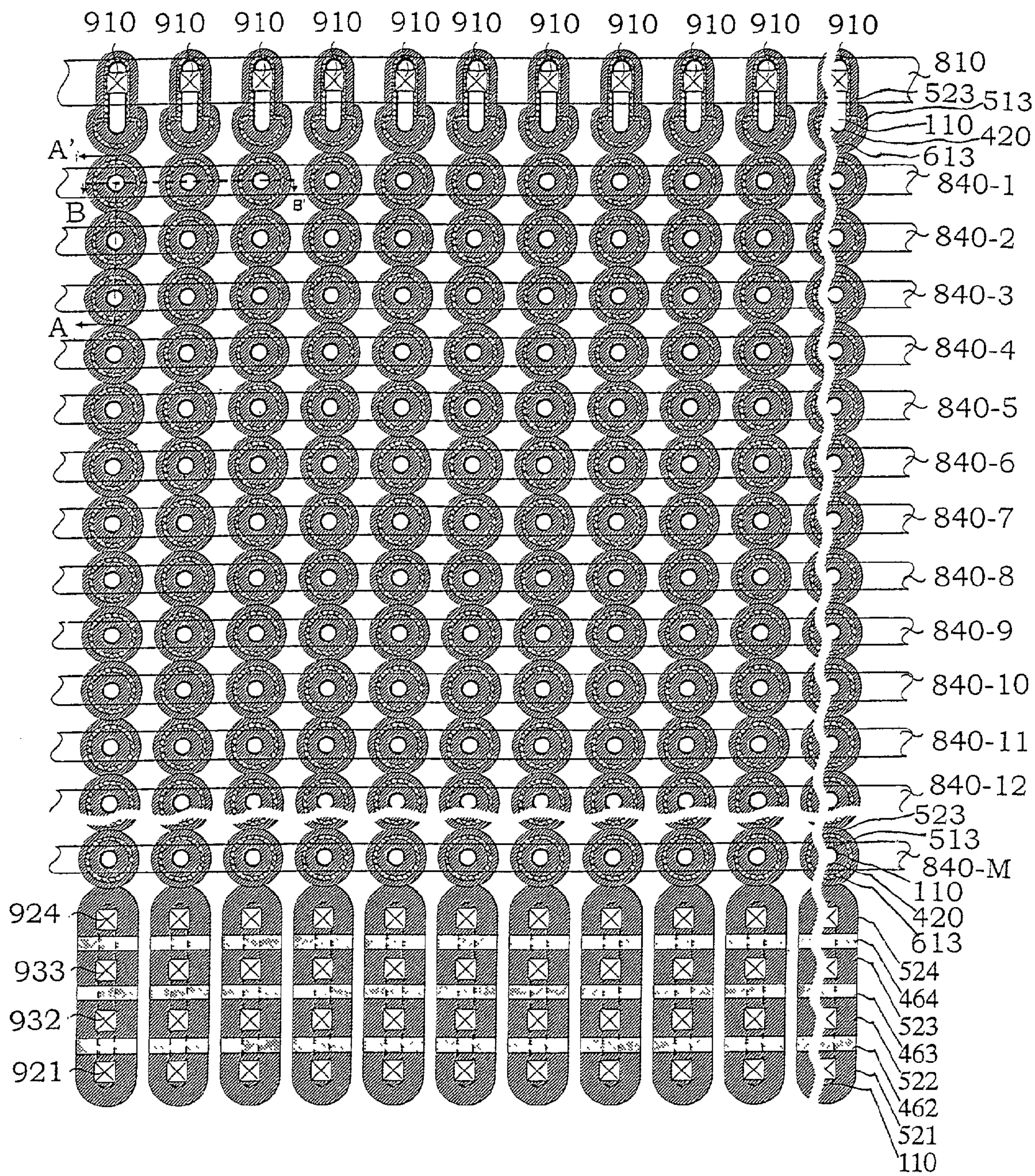
Figure 172:
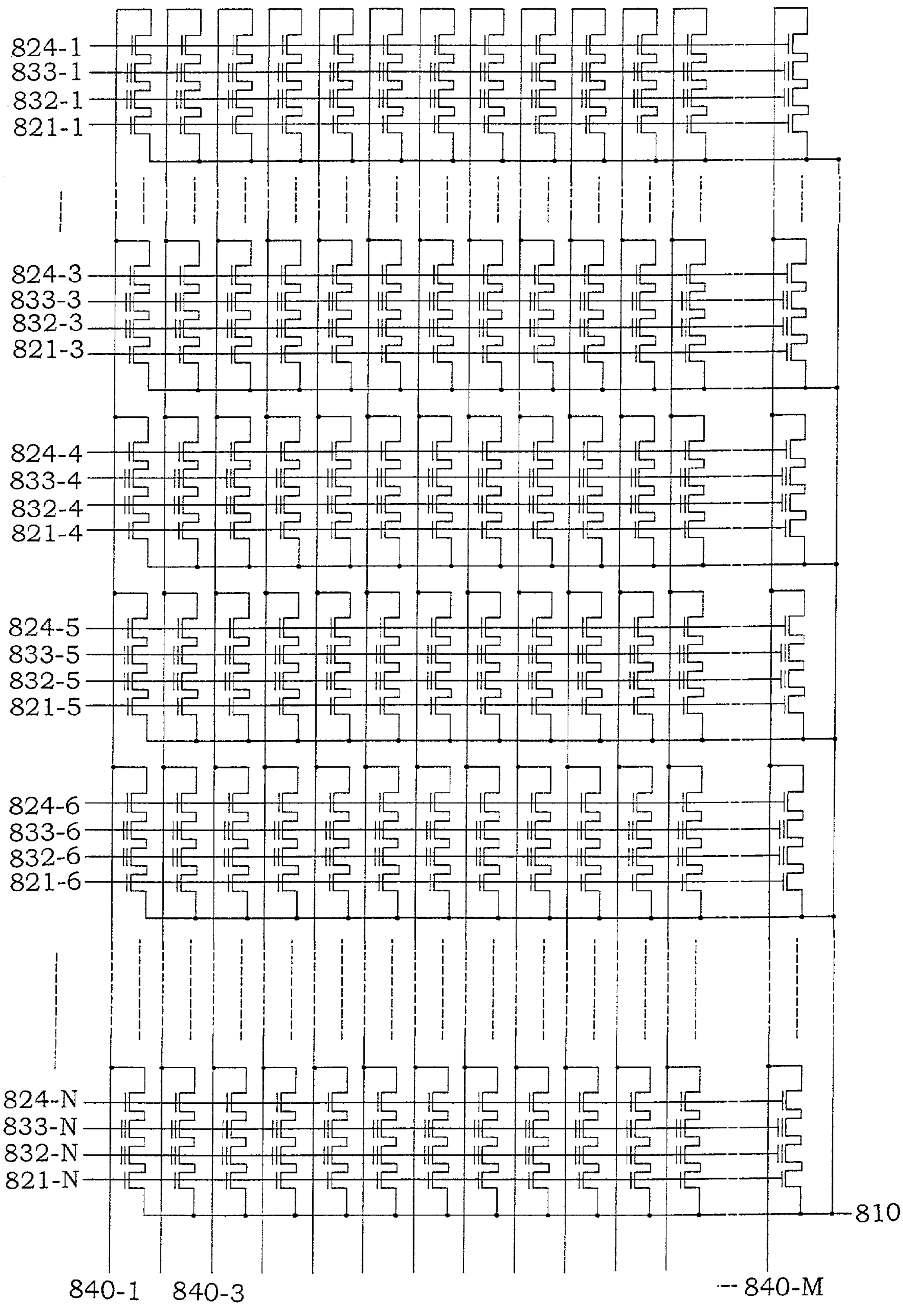

In FIG. 21, in contrast to FIG. 3, all the first contacts 910 are connected by a single first wiring layer 810. An equivalent circuit diagram of FIG. 21 is shown in FIG. 172.

The island-like semiconductor layers 110 which act as lead-out portions of the first wiring layers may be disposed at the A side end of the memory cell array.

Figure 22:
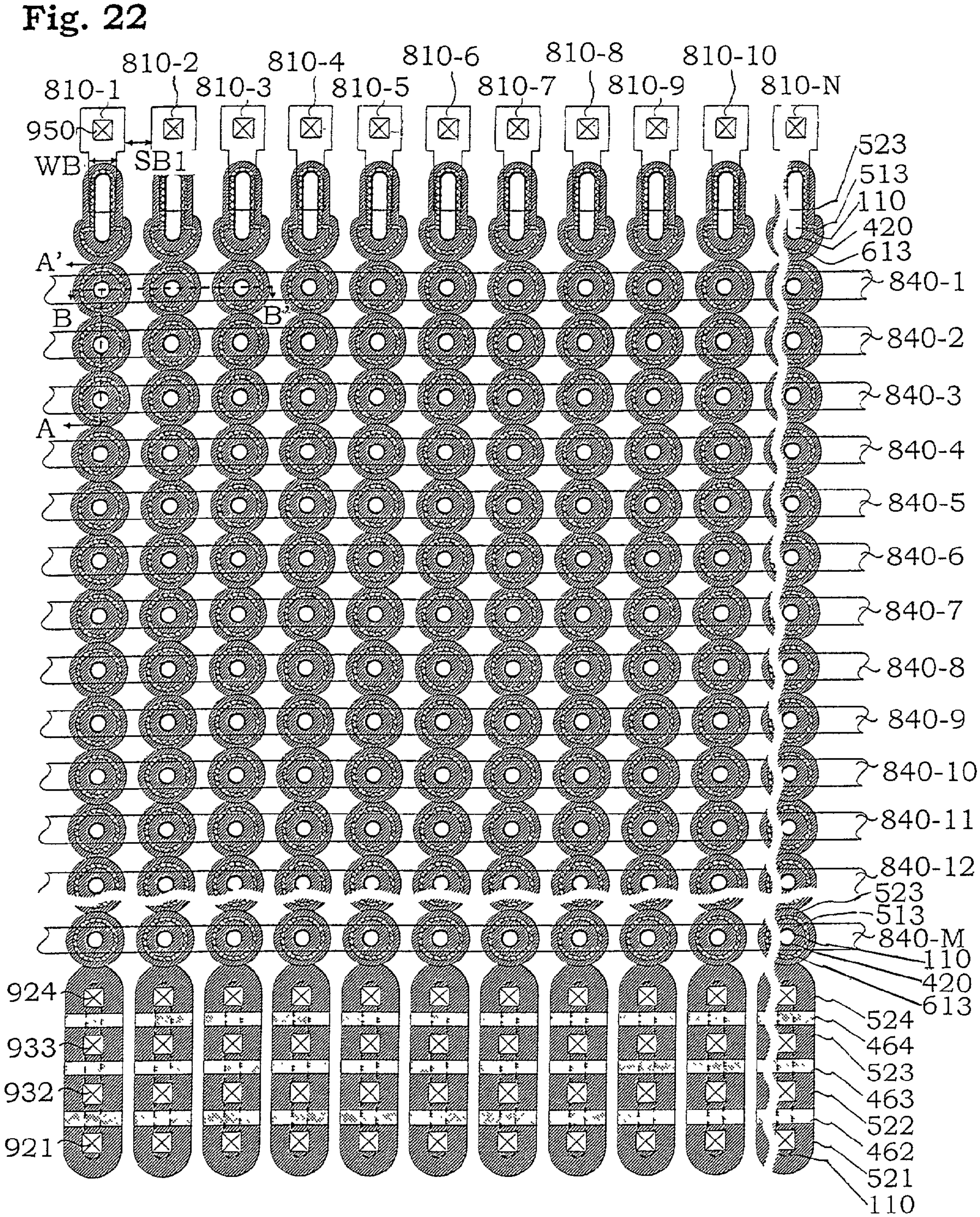

In FIG. 22, in contrast to FIG. 3, the island-like semiconductor layers 110 which act as lead-out portions of the first wiring layers are connected to first wiring layers 810 instead of forming the first contacts 910 in the island-like semiconductor layers 110. An equivalent circuit diagram of FIG. 22 is shown in FIG. 160.

Figure 23:
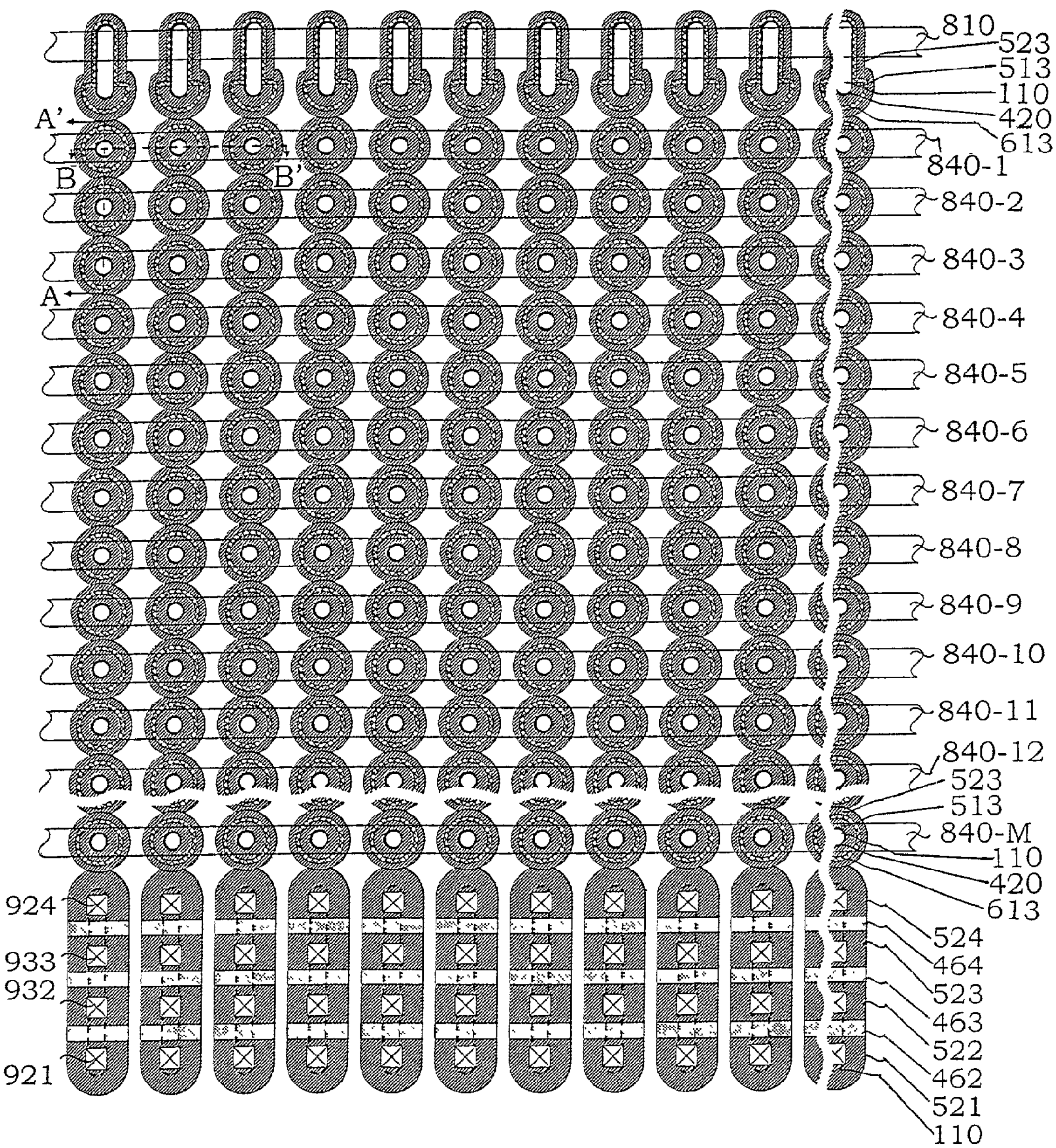

In FIG. 23, in contrast to FIG. 3, all the island-like semiconductor layers 110 which act as lead-out portions of the first wiring layers are connected to a single first wiring layer 810 instead of forming the first contacts 910 in the island-like semiconductor layers 110. An equivalent circuit diagram of FIG. 23 is shown in FIG. 172.

The island-like semiconductor layers 110 which act as the lead-out portions of the first wiring layers may be disposed at the A side end of the memory cell array.

Figure 24:
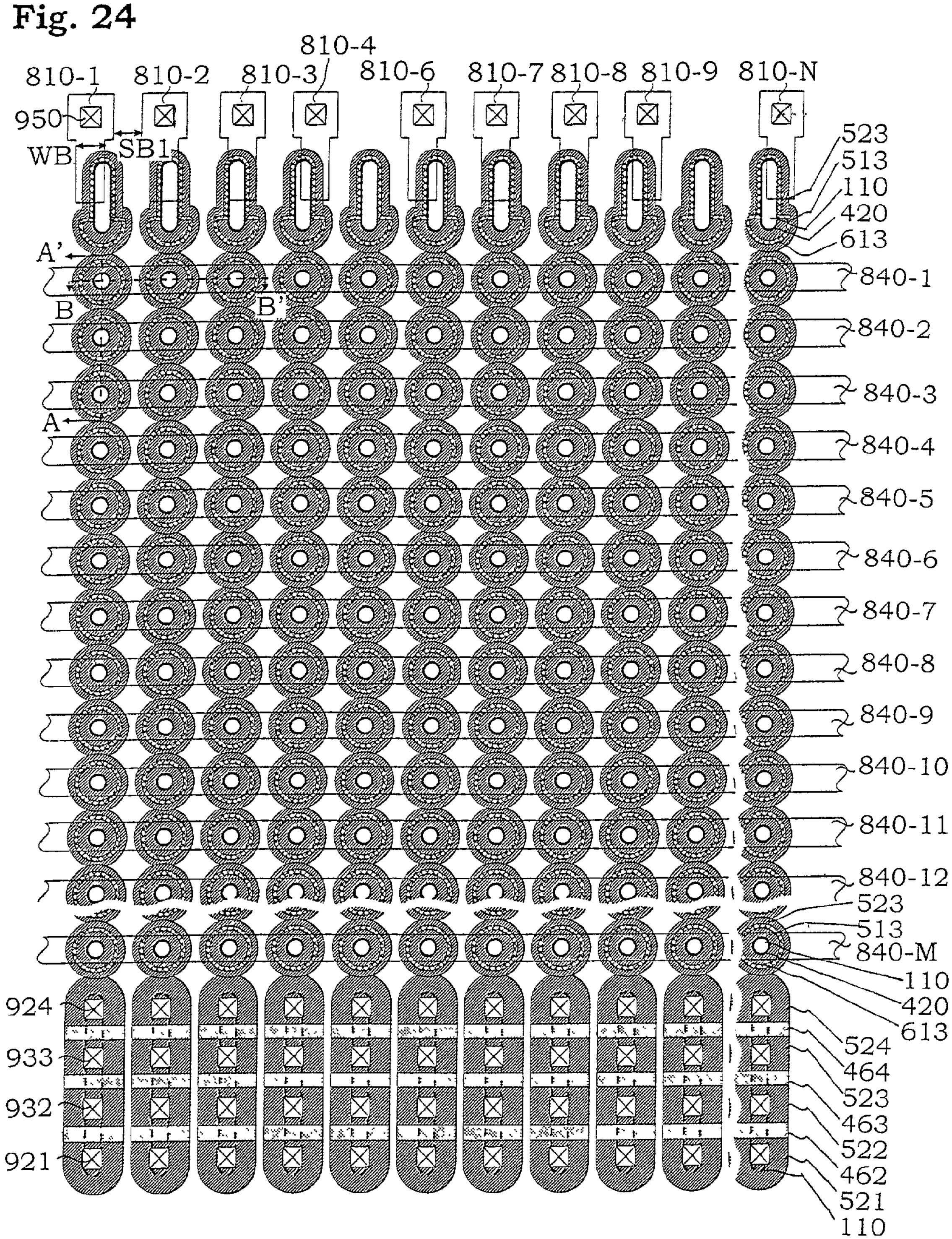

In FIG. 24, in contrast to FIG. 3, the island-like semiconductor layers 110 which act as lead-out portions of the first wiring layers are connected to first wiring layers 810 instead of forming the first contacts 910 in the island-like semiconductor layers 110. Island-like semiconductor layers 110 not connected to the first wiring layers are provided as dummies to ensure spaces for placing the first wiring layers. The intervals between the first wiring layers 810-1, 810-2 . . . are set to be larger than the intervals between the island-like semiconductor layers 110 which act as the lead-out portions of the first wiring layers in the B–B' direction so that the narrowest interval SB1 between the first wiring layers is insured to be larger. An equivalent circuit diagram of FIG. 24 is shown in FIG. 165. By thus setting the intervals between the first wiring layers to be larger than those between the island-like semiconductor layers 110 which act as the lead-out portions of the first wiring layers, this arrangement has advantages in that the patterning of the first wiring layers becomes easier and the contacts for leading out the first wiring layers can be formed with an increased patterning margin.

Figure 25:
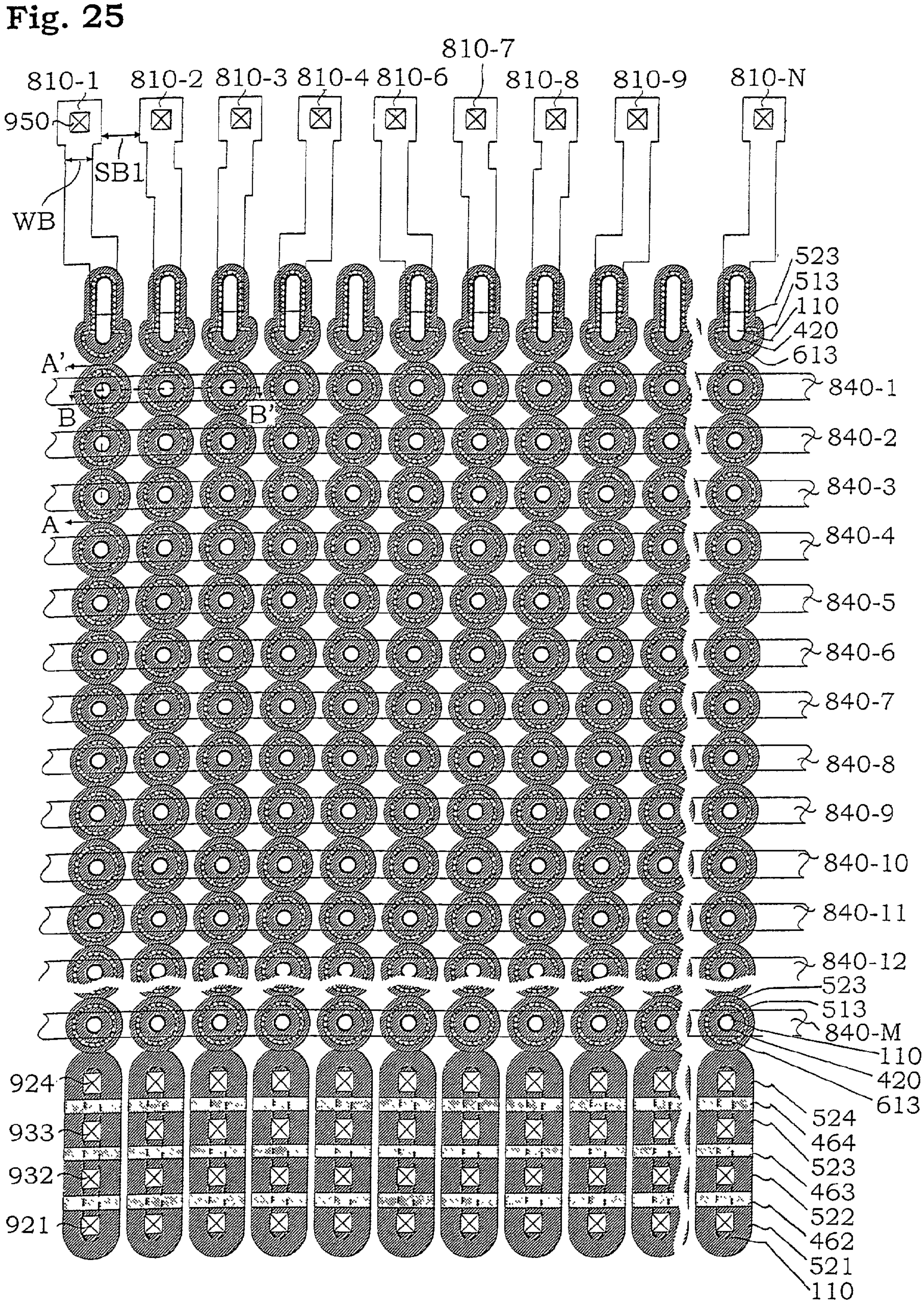

In FIG. 25, in contrast to FIG. 3, the island-like semiconductor layers 110 which act as lead-out portions of the first wiring layers are connected to first wiring layers 810 instead of forming the first contacts 910 in the island-like semiconductor layers 110. Island-like semiconductor layers 110 not connected to the first wiring layers are provided as dummies to ensure spaces for placing the first wiring layers. The first wiring layers are formed into two or more different hook shapes and disposed at the A' side end of the memory cell array as shown in FIG. 25 so that the narrowest interval SB1 between the first wiring layers is ensured to increase. An equivalent circuit diagram of FIG. 25 is shown in FIG. 165.

The above-mentioned arrangement may be realized at the A side end of the memory cell array or alternately at the A side end and at the A' side end. So long as the above-mentioned arrangement is realized, the first wiring layers of the two or more different hook shapes may be optionally connected to any of the island-like semiconductor layers 110 which act as the lead-out portion of the first wiring layers.

Figure 26:
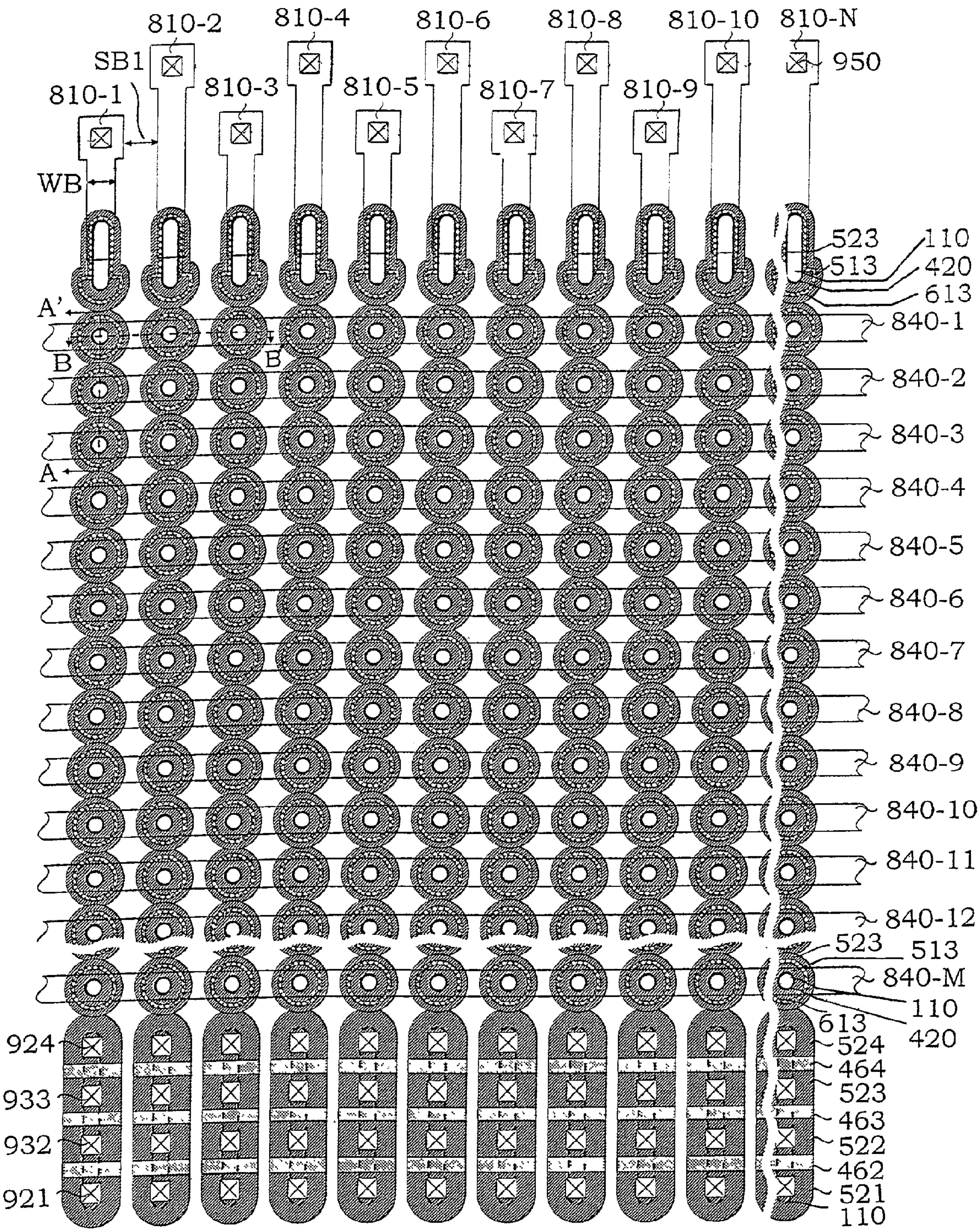

In FIG. 26, in contrast to FIG. 3, the island-like semiconductor layers 110 which act as lead-out portions of the first wiring layers are connected to first wiring layers 810 instead of forming the first contacts 910 in the island-like semiconductor layers 110. First wiring layer of two different lengths are alternately disposed at the A' side end of the memory cell array. Thereby, the narrowest interval SB1 between the first wiring layers is ensured to increase. An equivalent circuit diagram of FIG. 26 is shown in FIG. 160.

The above-mentioned arrangement may be realized at the A side end of the memory cell array or alternately at the A side end and at the A'-side end. So long as the above-mentioned arrangement is realized, the first wiring layers of the two different lengths may be optionally connected to any of the island-like semiconductor layers 110 which act as the lead-out portions of the first wiring layers.

Figure 27:
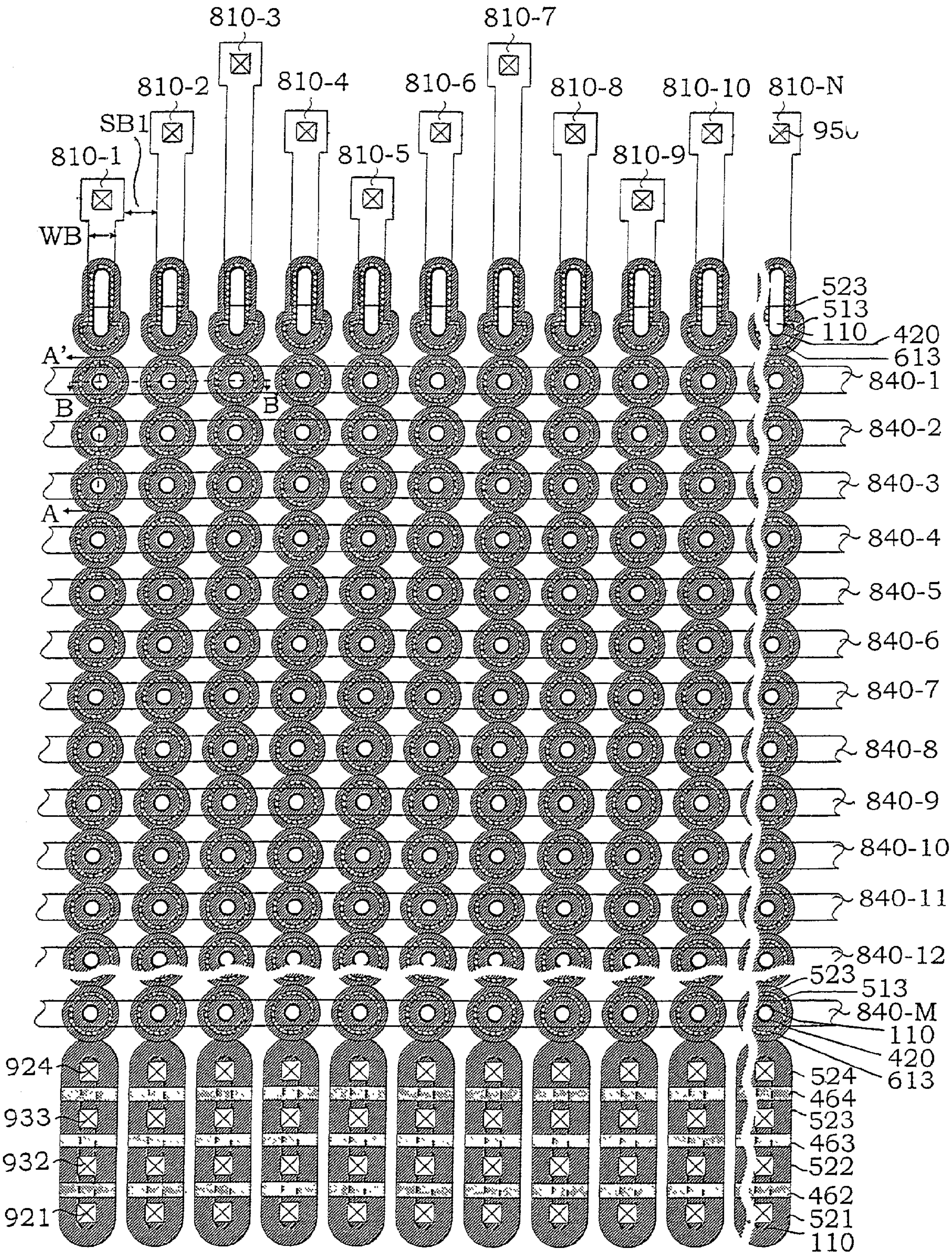

In FIG. 27, in contrast to FIG. 3, the island-like semiconductor layers 110 which act as lead-out portions of the first wiring layers are connected to first wiring layers 810 instead of forming the first contacts 910 in the island-like semiconductor layers 110. First wiring layers 810 of more than two different lengths are disposed in a mountain form as shown in FIG. 27 at the A' side end of the memory cell array. Thereby, the narrowest interval SB1 between the first wiring layers is ensured to increase. An equivalent circuit diagram of FIG. 27 is shown in FIG. 160.

The above-mentioned arrangement may be realized at the A side end of the memory cell array or alternately at the A side end and at the A' side end. So long as the above-mentioned arrangement is realized, the first wiring layers of more than two different lengths may be optionally connected to any of the island-like semiconductor layers 110 which act as the lead-out portions of the first wiring layers.

Figure 28:
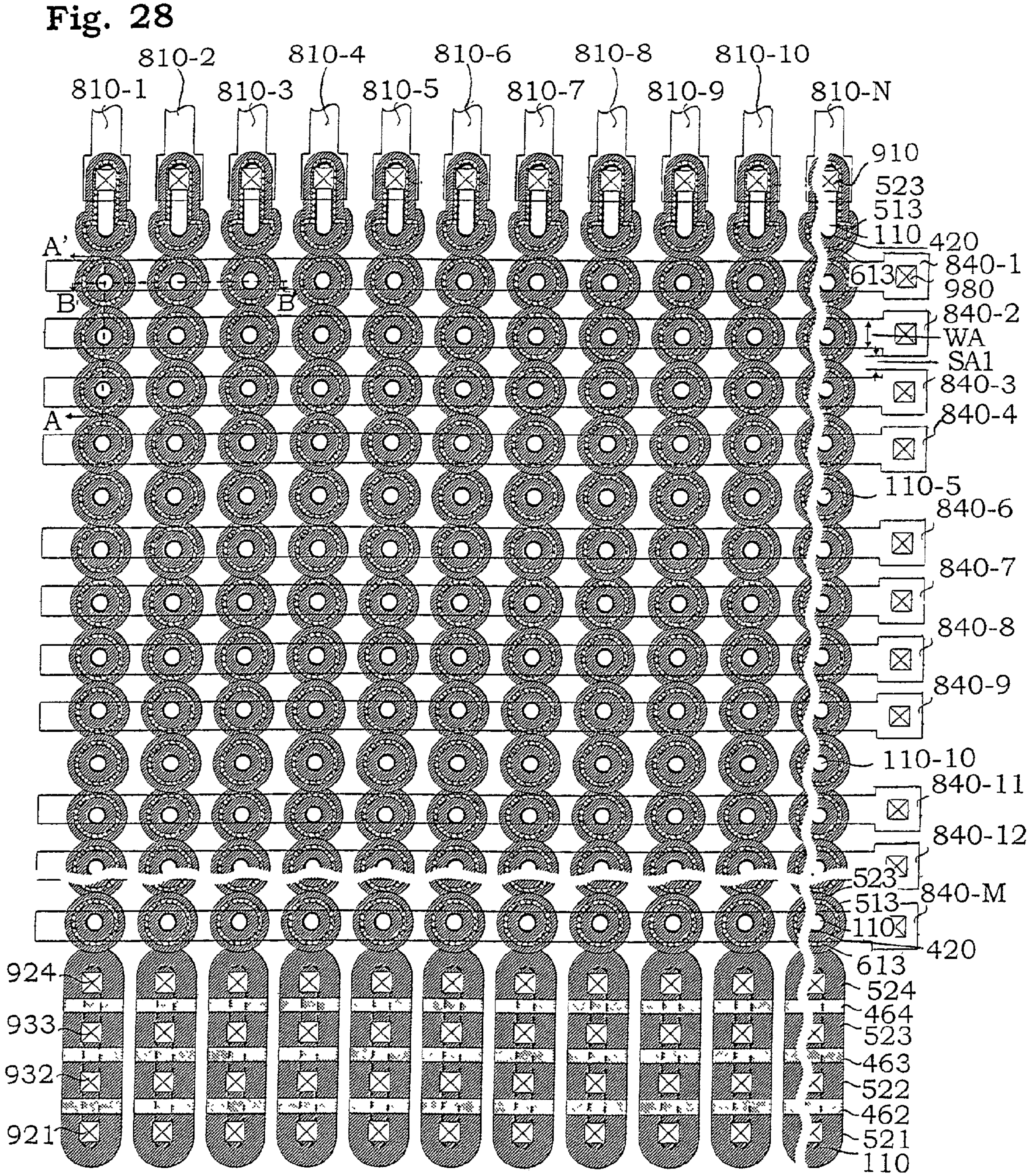
Figure 174:
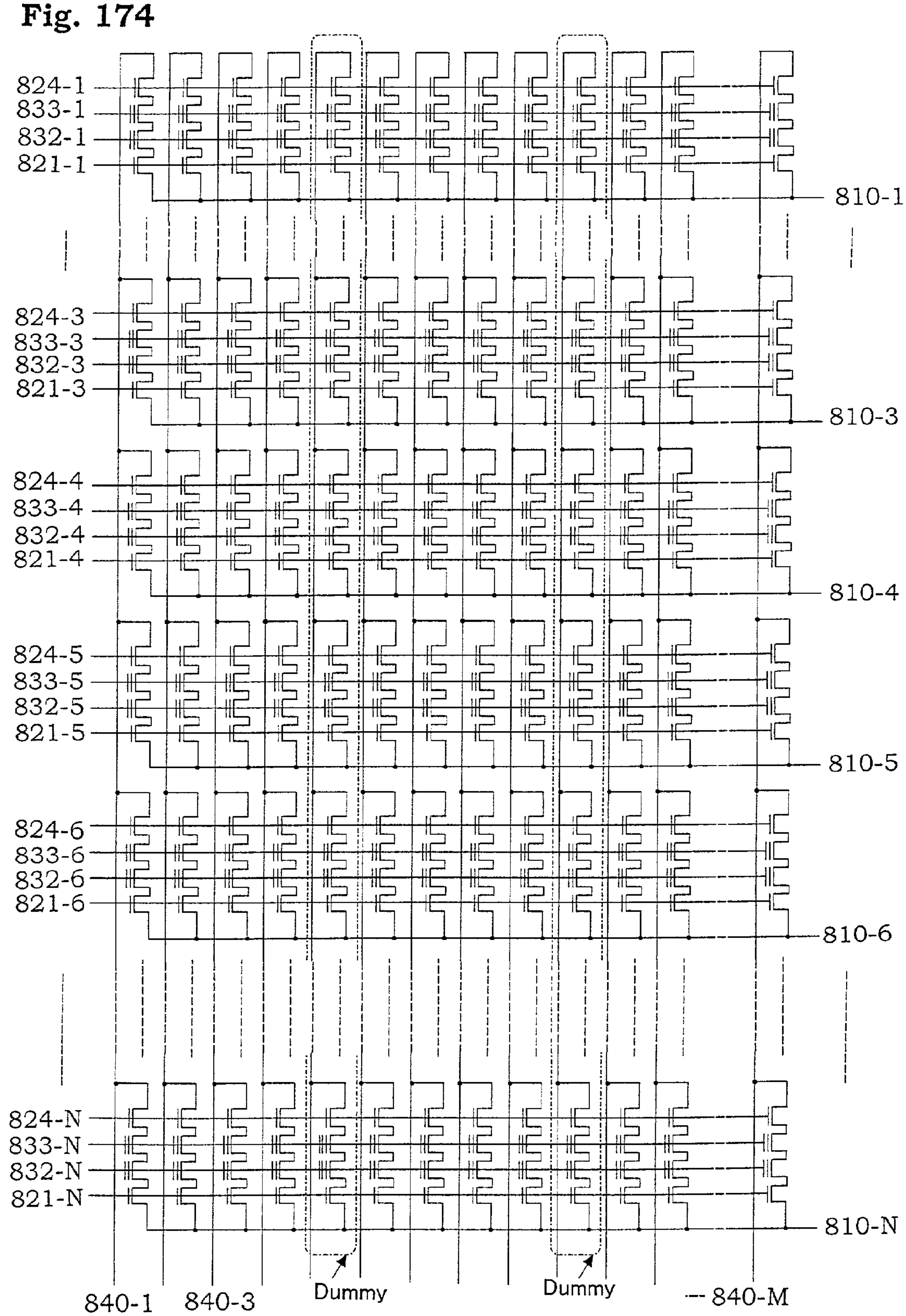

In FIG. 28, in contrast to FIG. 3, island-like semiconductor layers 110 not connected to the fourth wiring layers are provided as dummies to ensure spaces for placing the fourth wiring layers. The intervals between the fourth wiring layers are set larger than the intervals between the island semiconductors 110 in the A–A' direction. Thereby, the narrowest interval SA1 between the fourth wiring layers is ensured to increase. An equivalent circuit diagram of FIG. 28 is shown in FIG. 174. More particularly, in the case where there exist N first wiring layers, one fourth wiring layer is connected to N island semiconductor layers 110 as shown in FIG. 28. A fourth wiring layer, for example, 840-6, which is the nearest to the dummy island semiconductor layer 110-5 is shifted to the dummy island layer 110-5 side as it can be connected with an island-like semiconductor layer 110 to which 840-6 is to be connected. The fourth wiring layers 840 from a fourth wiring layer 840-7 are disposed at larger intervals than the intervals between the island-like semiconductor layers in the A–A' direction, as shown in FIG. 28. Where a fourth wiring layer 840 cannot connect with an island-like semiconductor layer 110 any more, a dummy island-like semiconductor layer 110 is provided. Thus, by providing larger intervals between the fourth wiring layers 840 than those between the island-like semiconductor layers 110 in the A–A' direction, this arrangement has advantages in that pattering for wiring becomes easier and the contacts 980 for leading out the fourth wiring layers 840 can be formed with an increased patterning margin. One or a plurality of dummy island-like semiconductor layers may be provided in the memory cell array. The distance in the A–A' direction from the dummy to an island-like semiconductor layer adjacent to the dummy may be equal or unequal to the intervals in the A–A' direction between the island-like semiconductor layers 110 in the memory array. This can apply not only to FIG. 28 but also to FIG. 29. The top of the dummy island semiconductor 110 may be fixed to a certain potential, preferably to the same potential as that of the first wiring layer 810 or to ground.

Figure 29:
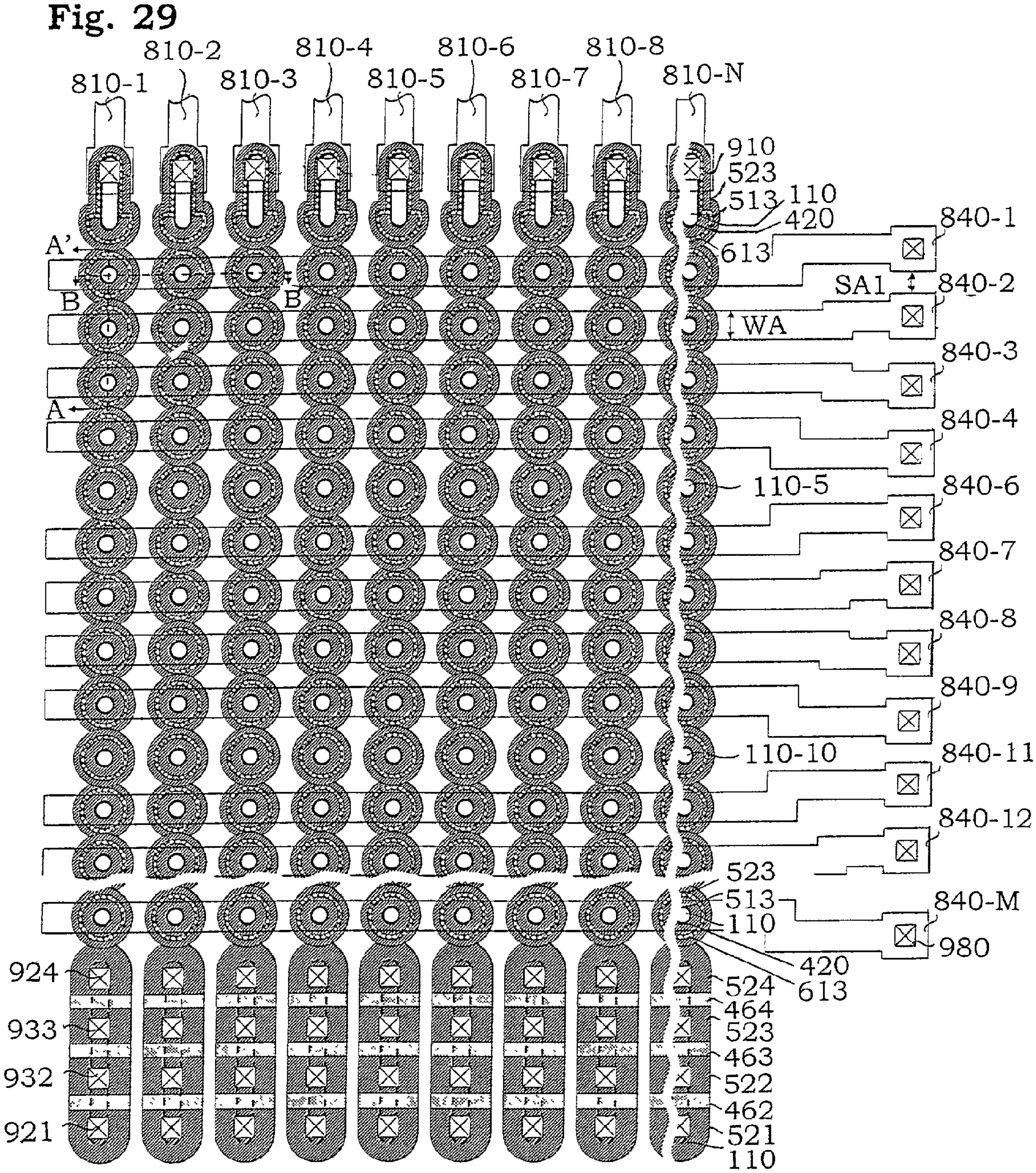
Figure 175:
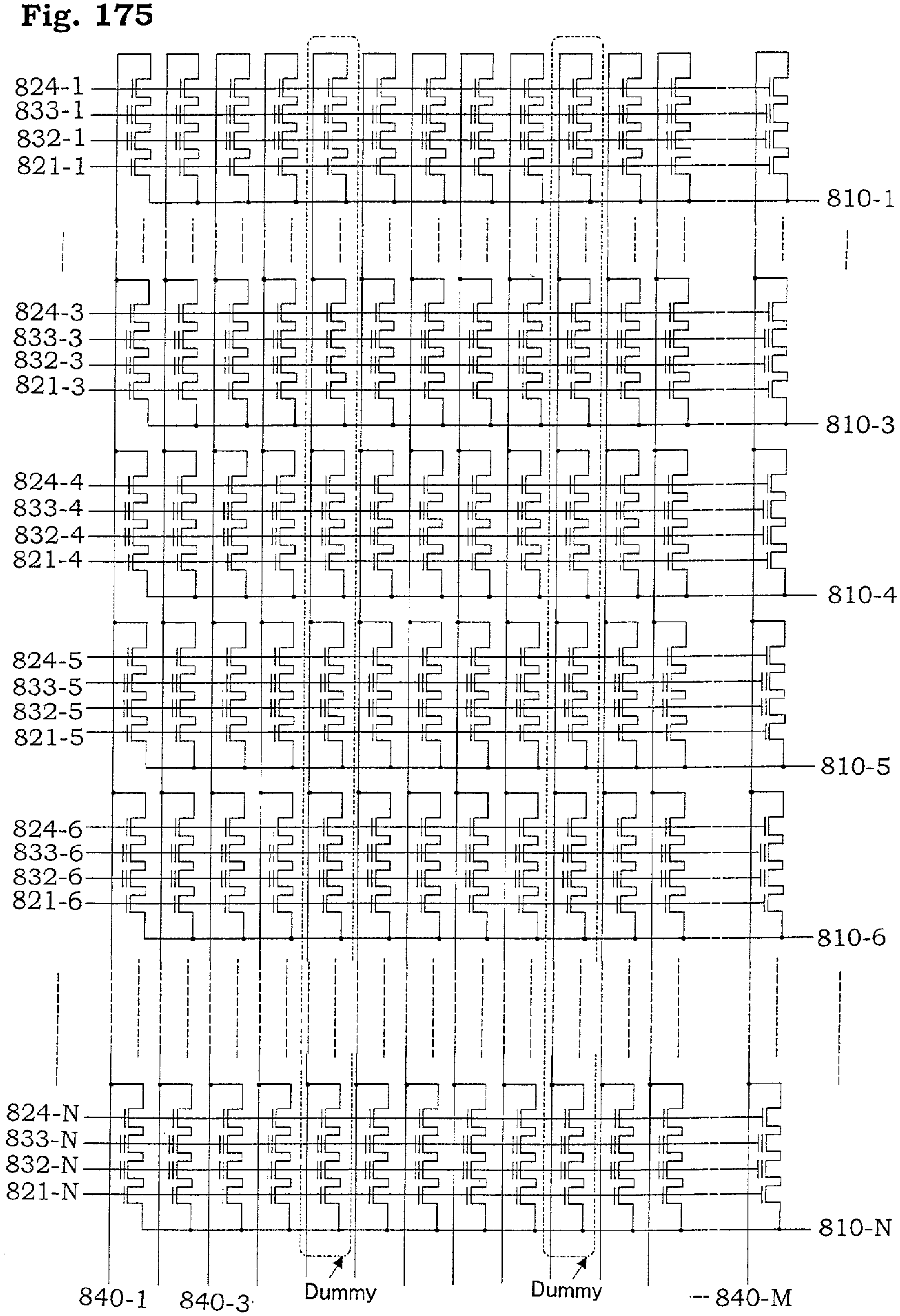

In FIG. 29, in contrast to FIG. 3, island-like semiconductor layers 110 not connected to the fourth wiring layers are provided as dummies to ensure spaces for placing the fourth wiring layers. The fourth wiring layers are formed into two or more hook shapes and disposed at the B' side end of the memory cell array, as shown in FIG. 29. Thereby, the narrowest interval SA1 between the fourth wiring layer is ensured to increase. An equivalent circuit diagram of FIG. 29 is shown in FIG. 175.

The above-mentioned arrangement may be realized at the B side end of the memory cell array or alternately at the B side end and at the B' side end. So long as the above-mentioned arrangement is realized, the fourth wiring layers of two or more different shapes may be optionally located anywhere. The top of the dummy island semiconductor layers 110 may be fixed to a certain potential, preferably to the same potential as that of the first wiring layer 810 or to ground.

Figure 34:
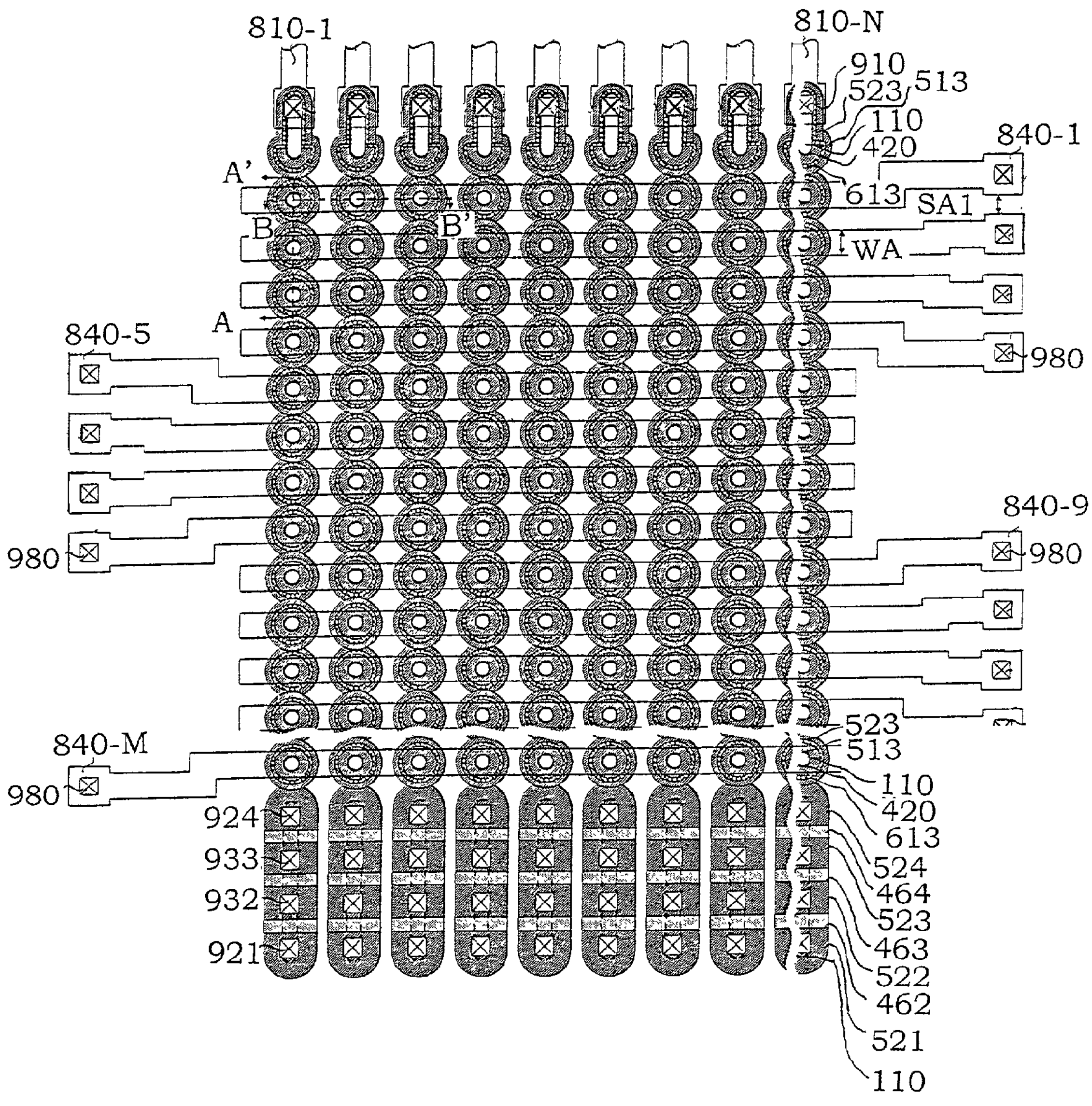
Figure 178:
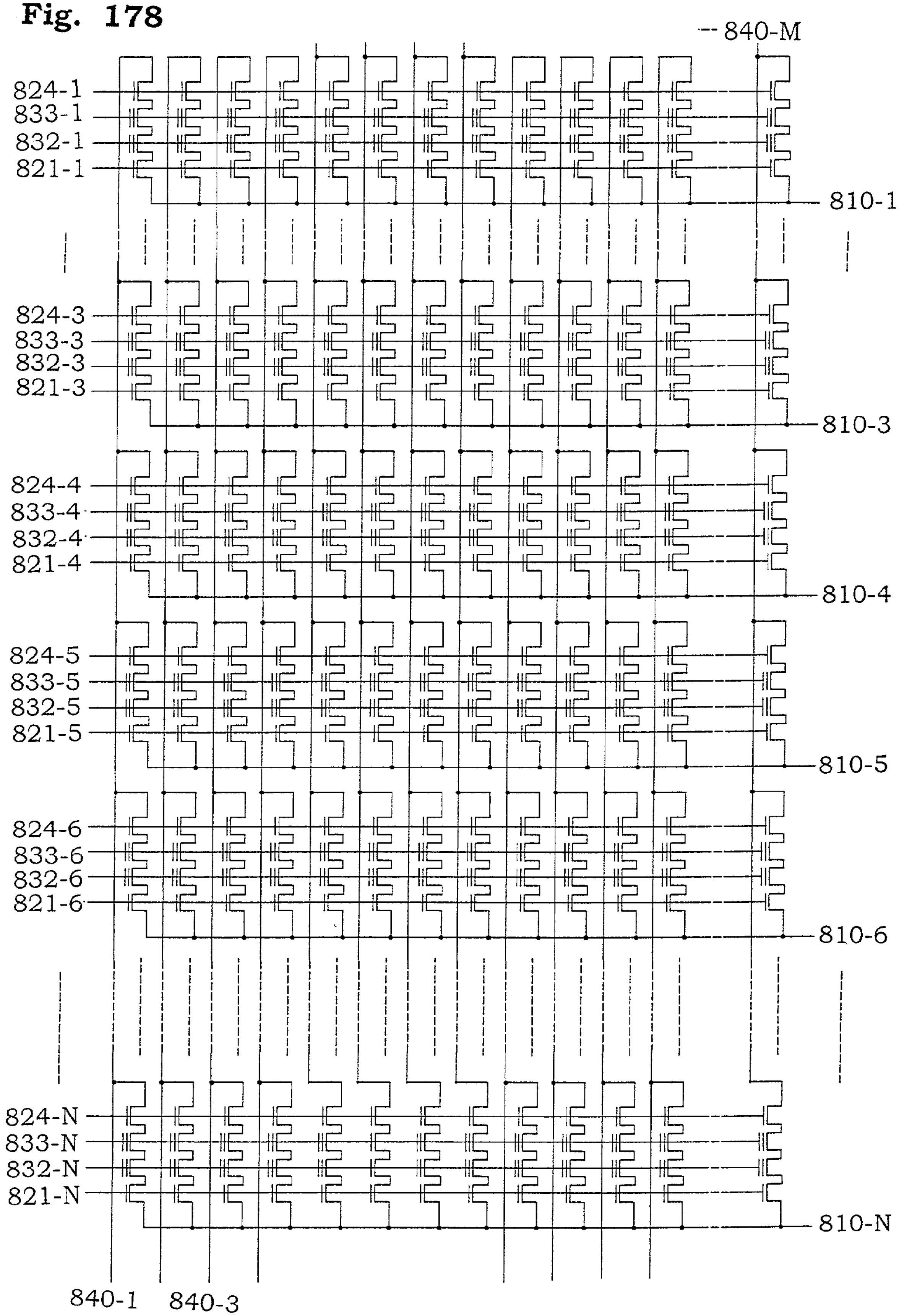

In FIG. 34, in contrast to FIG. 29, the island-like semiconductor layers 110 not connected to the fourth wiring layers are not provided, but the above-mentioned arrangement at the B' side end is realized alternatively at the B side end and at the B' side end. An equivalent circuit diagram of FIG. 34 is shown in FIG. 178. This case is more advantageous than the case of FIG. 29 since the memory cells can be more highly integrated since the dummy island-like semiconductor layers are not provided.

Figure 31:
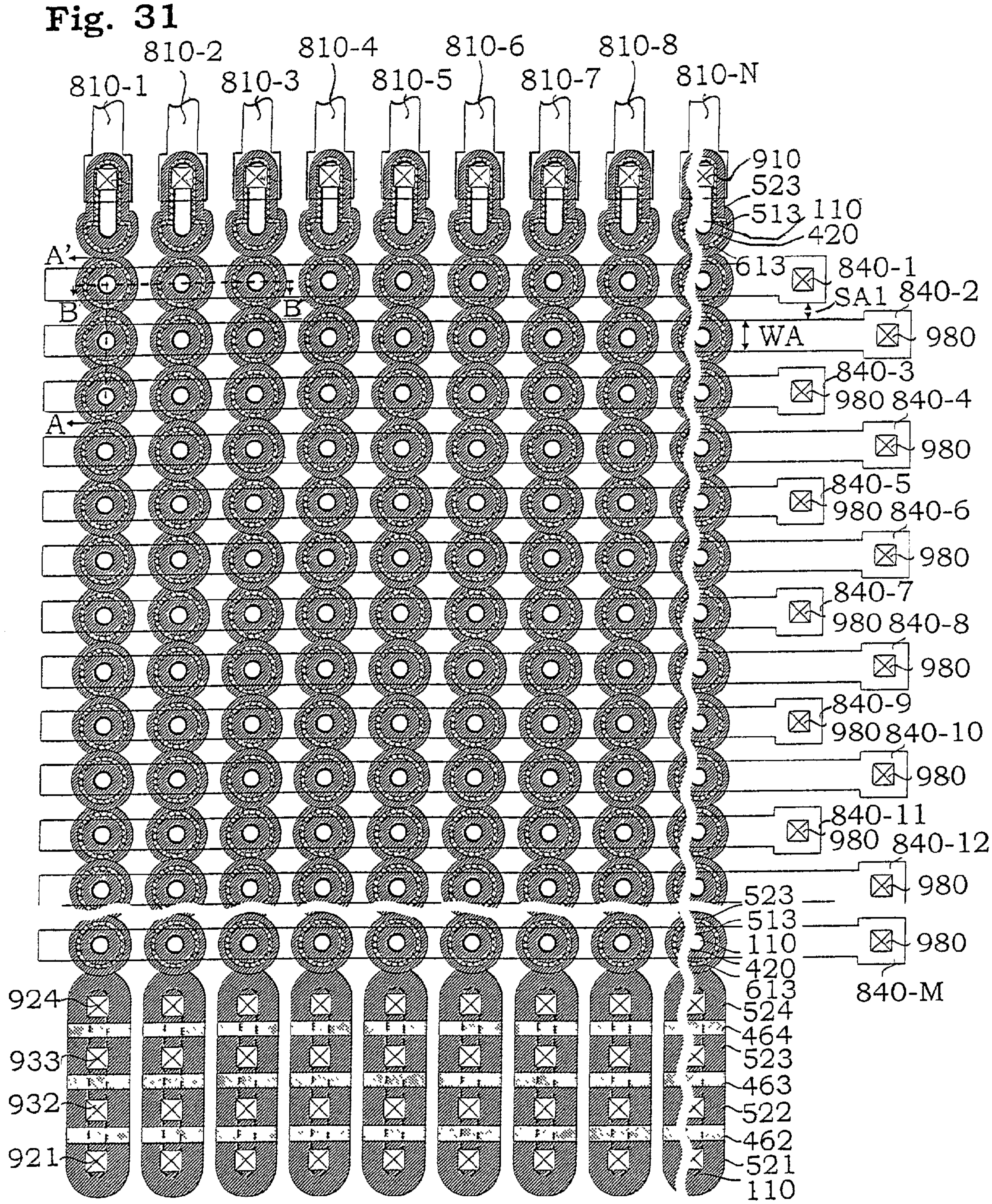

In FIG. 31, in contrast to FIG. 3, adjacent fourth wiring layers have different lengths in the B–B' direction. Fourth wiring layers of two different lengths are alternately disposed at the B' side end of the memory cell array. Thereby, the narrowest interval SA1 between the fourth wiring layers is ensured to increase. An equivalent circuit diagram of FIG. 31 is shown in FIG. 160.

The above-mentioned arrangement may be realized at the B side end of the memory cell array or alternately at the B side end and at the B' side end. So long as the above-mentioned arrangement is realized, the fourth wiring layers of two different lengths may be optionally located anywhere.

Figure 32:
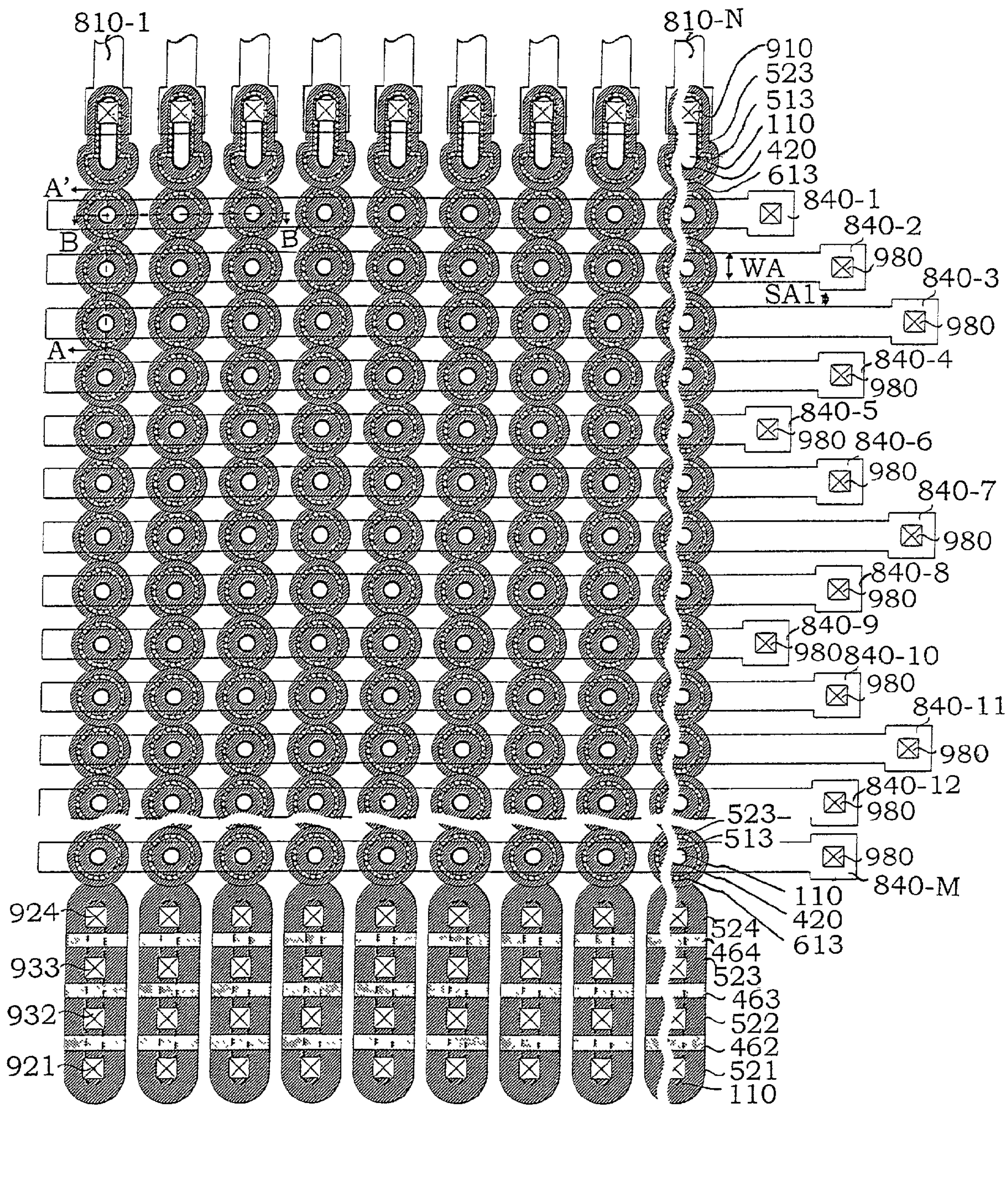

In FIG. 32, in contrast to FIG. 3, adjacent fourth wiring layers have different lengths in the B–B' direction. The fourth wiring layers have more than two different lengths and are disposed in a mountain form as shown in FIG. 32 at the B' side end of the memory cell array. Thereby, the narrowest interval SA1 between the fourth wiring layers is ensured to increase. An equivalent circuit diagram of FIG. 32 is shown in FIG. 160.

The above-mentioned arrangement may be realized at the B side end of the memory cell array or alternately at the B side end and at the B' side end. So long as the above-mentioned arrangement is realized, the fourth wiring layers of more than two different lengths may be optionally located anywhere.

Figure 33:
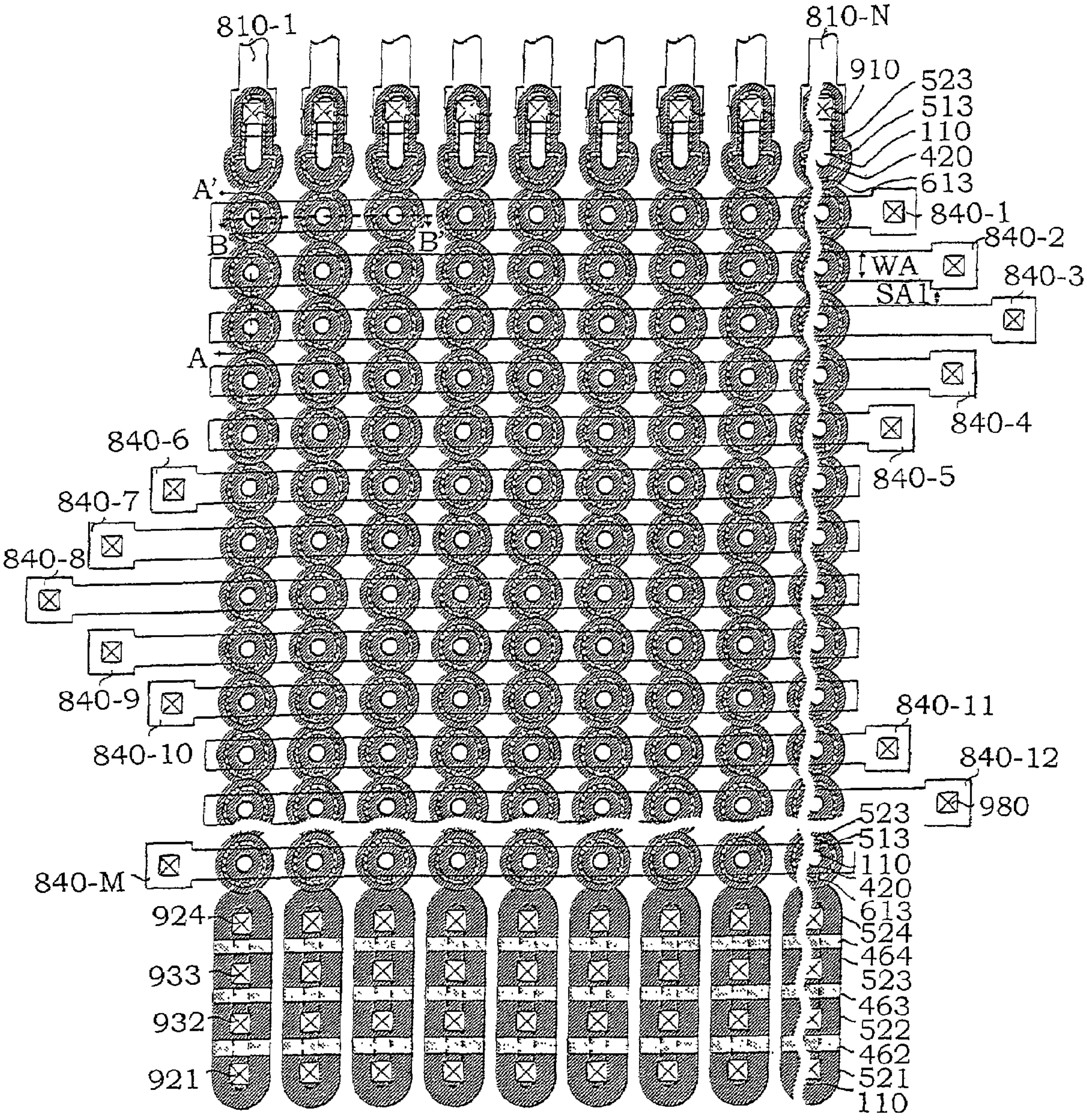
Figure 177:
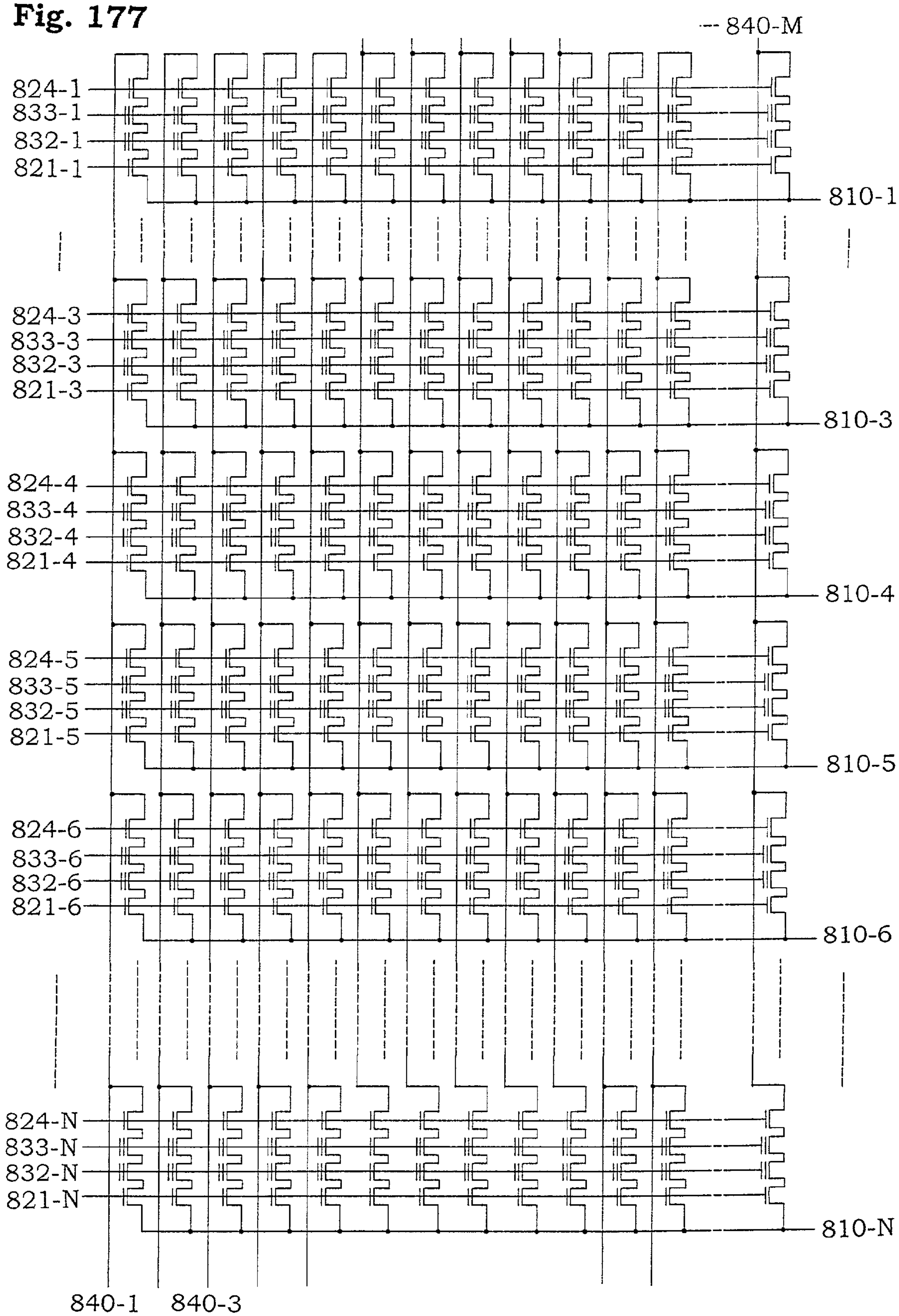

In FIG. 33, in contrast to FIG. 32, the above-mentioned arrangement at the B' side end is realized alternately at the B side end and at B' side end. An equivalent circuit diagram of FIG. 33 is shown in FIG. 177.

Figure 41:
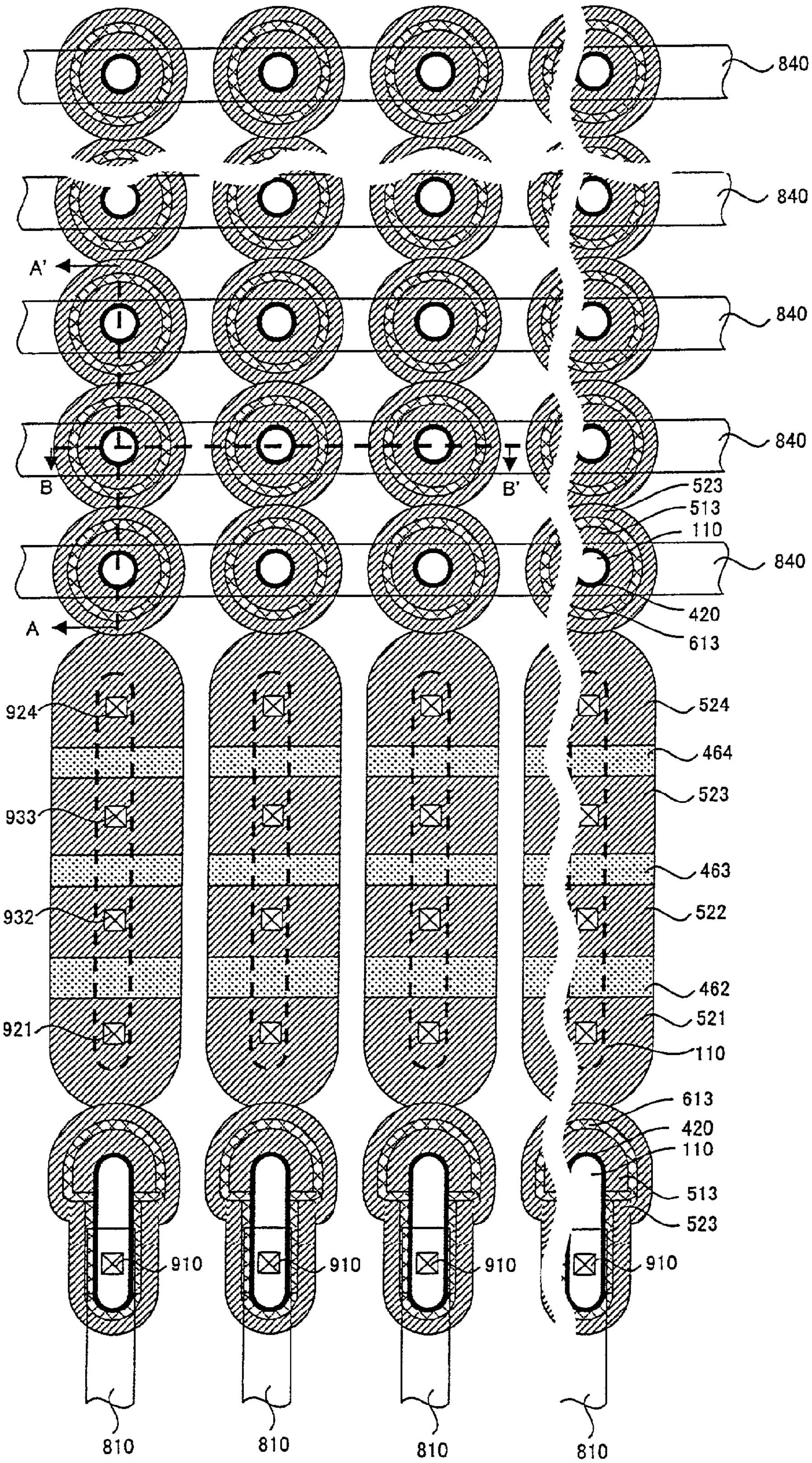

In FIG. 41, in contrast to FIG. 1, the island-like semiconductor layers connected to the first contacts 910 and the island-like semiconductor layers connected to the second contacts 921 and 924 and the third contacts 932 and covered with the second conductive film are continuously disposed at the A side end of the rows of memory cells in the A–A' direction. As compared with FIG. 1, the first wiring layers 810 and the fourth wiring layers 840 have larger widths, and the first conductive film formed on part of the island-like semiconductor layers connected to the first contacts 910 with intervention of an insulating film is larger. The first wiring layers 810, the fourth wiring layers 840 and the first insulating film may be used separately or in combination since they are independent of each other.

Figure 42:
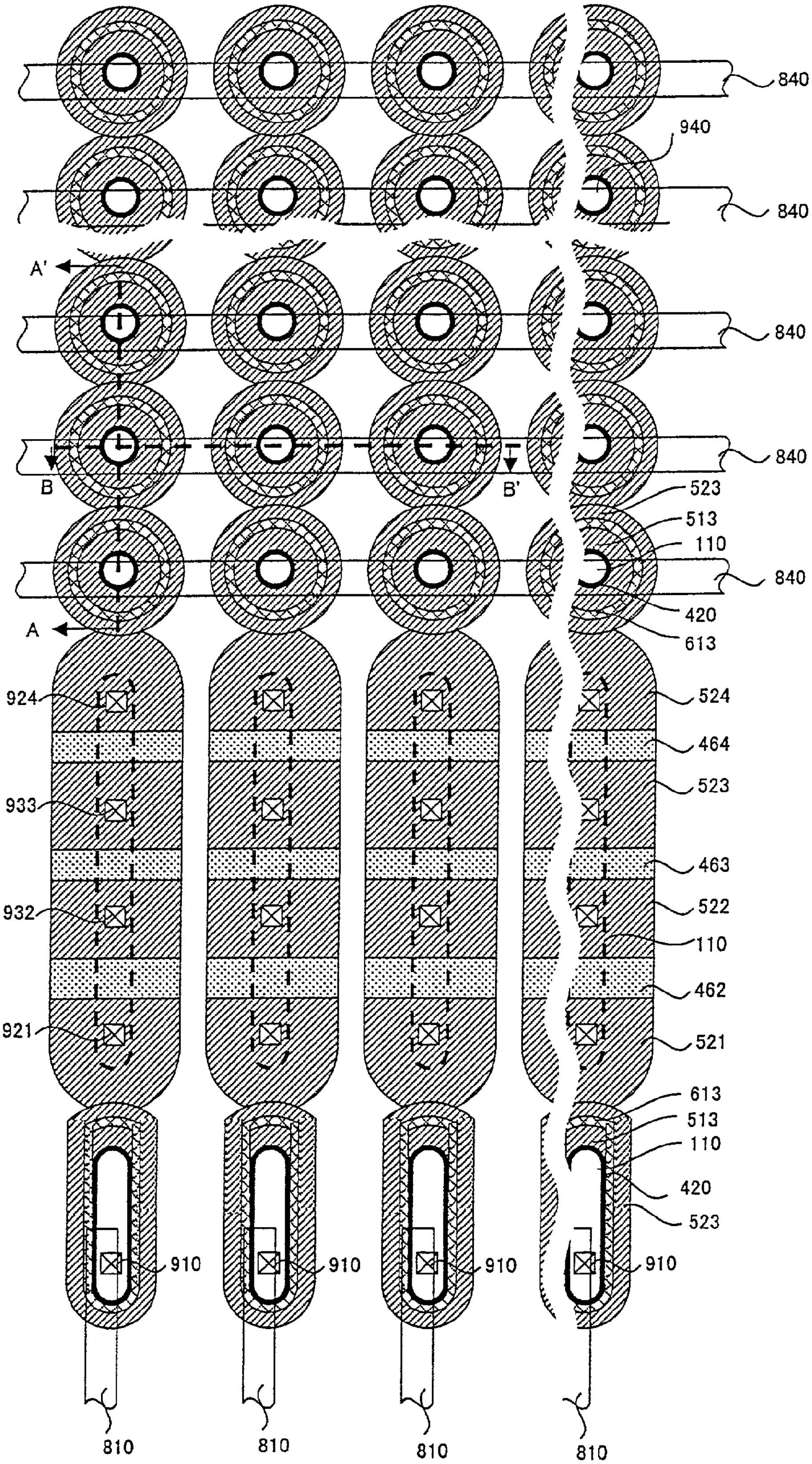

In FIG. 42, in contrast to FIG. 1, the island-like semiconductor layers connected to the first contacts 910 and the island-like semiconductor layers connected to the second contacts 921 and 924 and the third contacts 932 and covered with the second conductive film are continuously disposed at the A side end of the rows of memory cells in the A–A' direction. As compared with FIG. 1, the first wiring layers 810 and the fourth wiring layers 840 are shifted with respect to the contacts 810 and the contacts 940, respectively, and the first conductive film formed on part of the island-like semiconductor layers connected to the first contacts 910 with intervention of an insulating film is smaller. The first wiring layers 810, the fourth wiring layers 840 and the first insulating film may be used separately or in combination since they are independent of each other.

Figure 43:
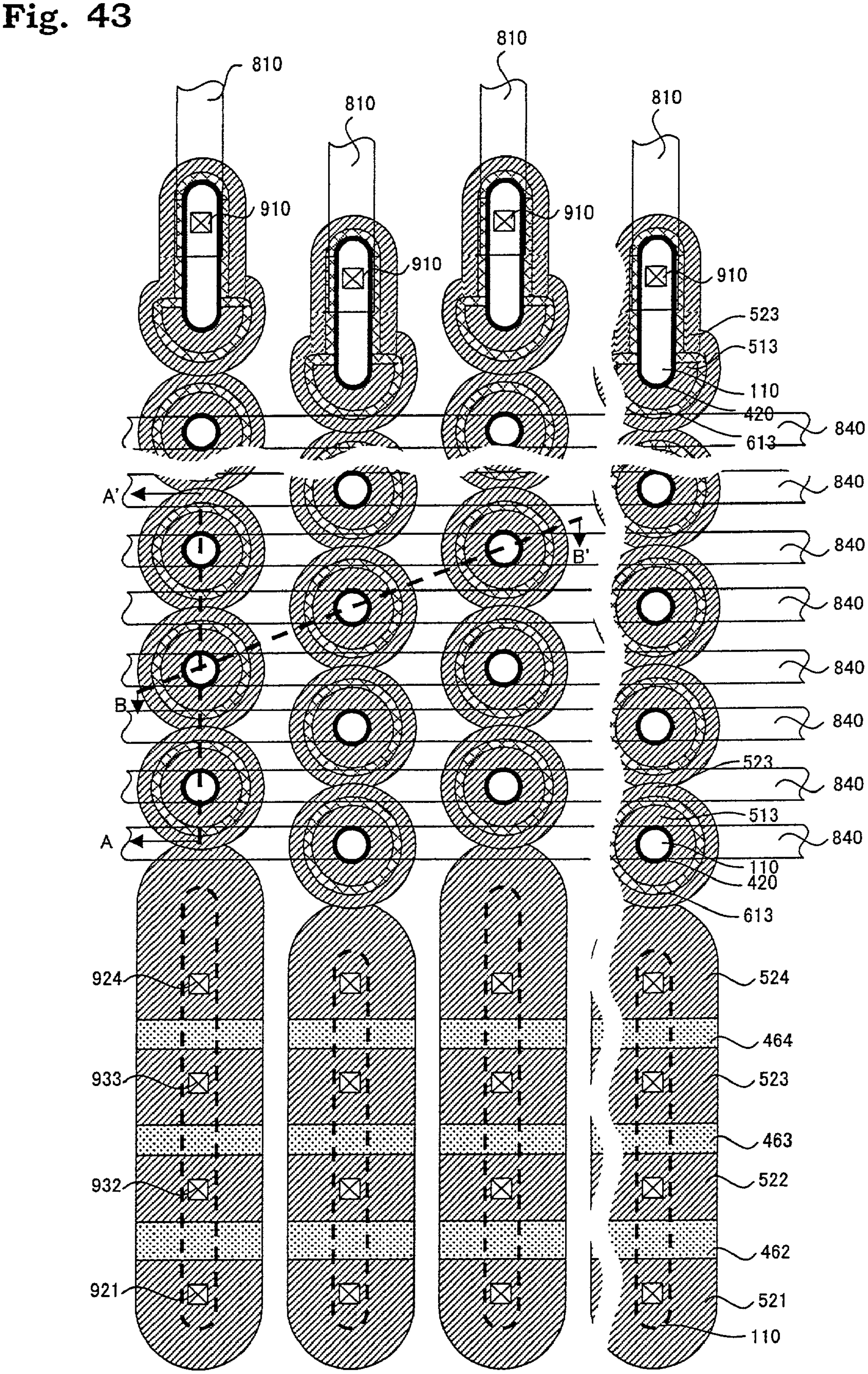

In FIG. 43, the island-like semiconductor layers in a columnar form for constituting memory cells are located at intersections where a group of parallel lines and another group of parallel lines cross at oblique angles. First, second, third and fourth wiring layers for selecting and controlling the memory cells are disposed in parallel to the surface of the substrate. By changing intervals between the island-like semiconductor layers between the A–A' direction which crosses the fourth wiring layers 840 and the B–B' direction, second conductive films which act as the control gates of the memory cells are formed continuously in one direction, in the A–A' direction in FIG. 43, to form the third wiring layers. Likewise, second conductive films which act as the gates of the selection gate transistors are formed continuously in one direction to form the second wiring layers. Further, terminals for electrically connecting with the first wiring layers disposed on a substrate side of the island-like semiconductor layers are provided at the A' side end of rows of memory cells connected in the A–A' direction in FIG. 43, and terminals for electrically connecting with the second and third wiring layers are provided at the A side end of the rows of memory cells connected in the A–A' direction in FIG. 43. The fourth wiring layers 840 disposed on a side of the island-like semiconductor layers opposite to the substrate are electrically connected to the island-like semiconductor layers in the columnar form for constituting the memory cells. In FIG. 43, the fourth wiring layers 840 are formed in the direction crossing the second and third wiring layers. The terminals for electrically connecting with the first wiring layers are formed of island-like semiconductor layers, and the terminals for electrically connecting with the second and third wiring layers are formed of the second conductive film covering the island-like semiconductor layers.

The terminals for electrically connecting with the first, second and third wiring layers are connected to first contacts 910, second contacts 921 and 924 and third contacts 932, respectively. In FIG. 43, the first wiring layers 810 are lead out to the top of the semiconductor memory via the first contacts 910.

The arrangement of the island-like semiconductor layers in the columnar form is not particularly limited to that shown in FIG. 43 but may be any arrangement so long as the above-mentioned positional relationship and electric connection between the wiring layers are realized. The island-like semiconductor layers connected to the first contacts 910 are all located at the A' side end of the rows of memory cells connected in the A–A' direction in FIG. 43. However, they may be located entirely or partially located on the A side end or may be located at any of the island-like semiconductor layers for constituting the memory cells connected in the A–A' direction. The island-like semiconductor layers coated with the second conductive film and connected to the second contacts 921 and 924 and the third contacts 932 may be located at an end where the first contacts 910 are not disposed, may be continuously located at the end where the first contacts 910 are disposed and may be located at any of the island-like semiconductor layers for constituting the memory cells connected in the A–A' direction. The second contacts 921 and 924 and the third contacts 932 may be located at different places. The width and shape of the first wiring layers 810 and the fourth wiring layers 840 are not particularly limited so long as desired wiring can be obtained. In the case where the first wiring layers are formed in self-alignment with the second and third wiring layers formed of the second conductive film, the island-like semiconductor layers which are the terminal for electrically connecting with the first wiring layers are electrically insulated from the second and third wiring layers but contact the second and third wiring layers with intervention of an insulating film. In FIG. 43, for example, the first conductive films are formed on part of the sidewalls of the island-like semiconductor layers connected to the first contacts 910 with intervention of insulating films. The first conductive films are located to face the island-like semiconductor layers for constituting the memory cells. The second conductive films are formed on the side faces of the first conductive films with intervention of insulating films. The second conductive films are connected to the second and third wiring layers formed continuously in the A–A' direction. The shape of the first and the second conductive films is not particularly limited.

The first conductive films on the sidewalls of the island-like semiconductor layers which act as the terminals for electrically connecting with the first wiring layers may be removed by setting the distance between said island-like semiconductor layers and the first conductive films on the island-like semiconductor layers for constituting the memory cells, for example, to be two or less times larger than the thickness of the second conductive films. In FIG. 43, the second and third contacts are formed on the second wiring layers 821 and 824 and the third wiring layers 832 which are formed to cover the top of the island-like semiconductor layers. However, the shape of the second and third wiring layers are not particularly limited so long as their connection is realized. FIG. 43 also shows lines for sectional views, i.e., line A–A' and line B–B' to be used for explaining examples of production processes.

Figure 44:
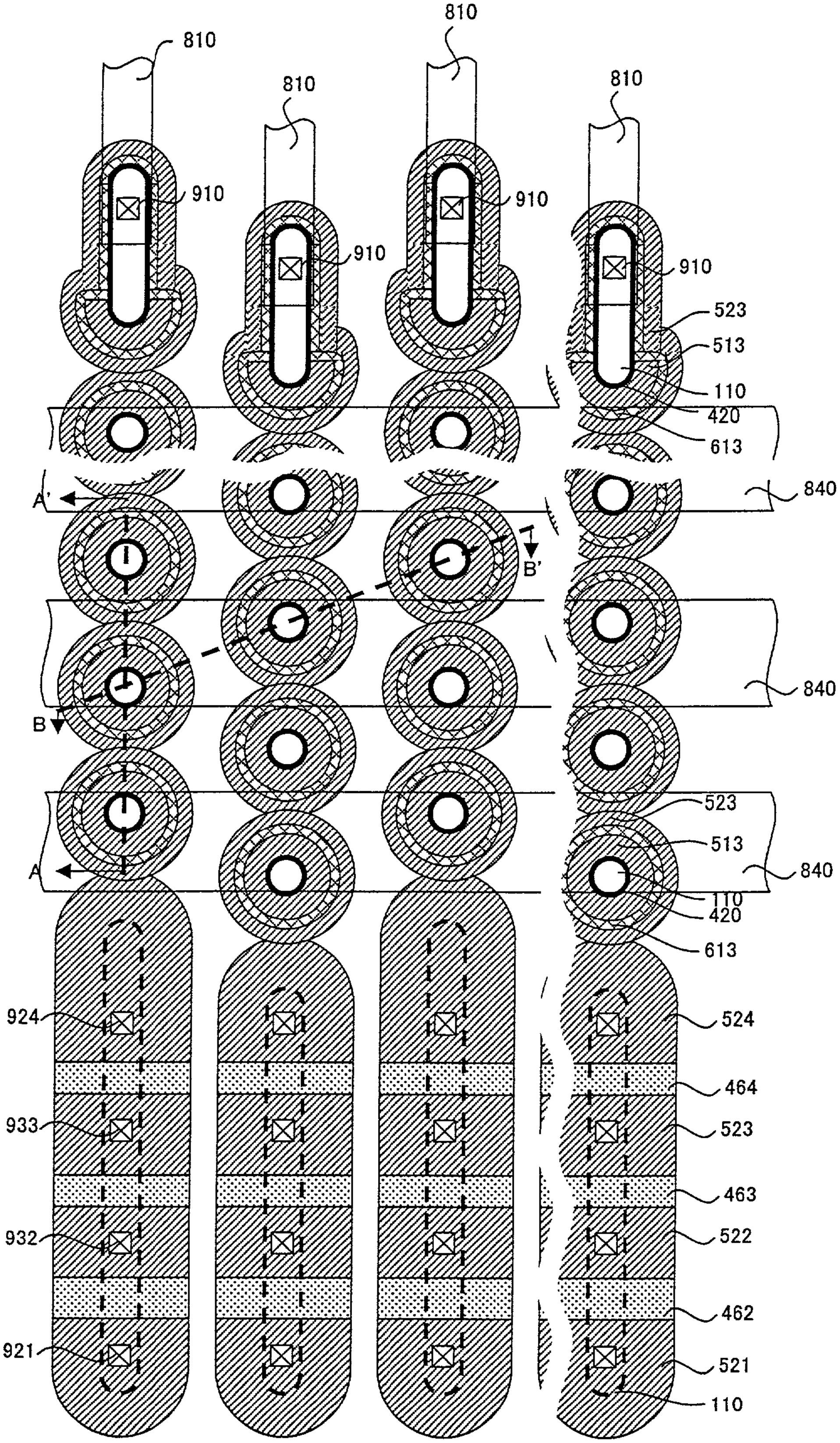

In FIG. 44, in contrast to FIG. 43, the sum of the width and the interval of the fourth wiring layers 840 (the sum will be referred to as a pitch of the fourth wiring layers 840) is larger than the sum of the width and the interval in the A–A' direction of the island-like semiconductor layer 110 (the sum will be referred to as a pitch of the island-like semiconductor layers in the A–A' direction). Island-like semiconductor layers 110 not connected to the fourth wiring layers 840 are provided as dummies to ensure spaces for placing the fourth wiring layers 840. More particularly, if there exist N first wiring layers, one fourth wiring layer is connected to N island-like semiconductor layers as shown in FIG. 44, and dummies are island-like semiconductor layers which are the nearest to the said one fourth wiring layer, i.e., N/2 island-like semiconductor layers on each side of the fourth wiring layer. On a side of the N/2 dummies, is also disposed a fourth wiring layer 840 connected to N island-like semiconductor layers. This positional relationship between the fourth wiring layers each connected to N island-like semiconductor layers and the dummy island-like semiconductor layers is continued in the A–A' direction.

By thus providing a larger pitch for the fourth wiring layers 840 than for the island-like semiconductor layers in the A–A' direction, the contacts for leading out the fourth wiring layers 840 can be formed with an increased pattering margin and the patterning of metal wiring can be facilitated. Also this arrangement has an advantage in that the necessary number of the fourth wiring layers 840 can be decreased as compared with the arrangement of FIG. 43 and therefore the necessary area for the control circuit for the fourth wiring layers can be reduced.

Figure 45:
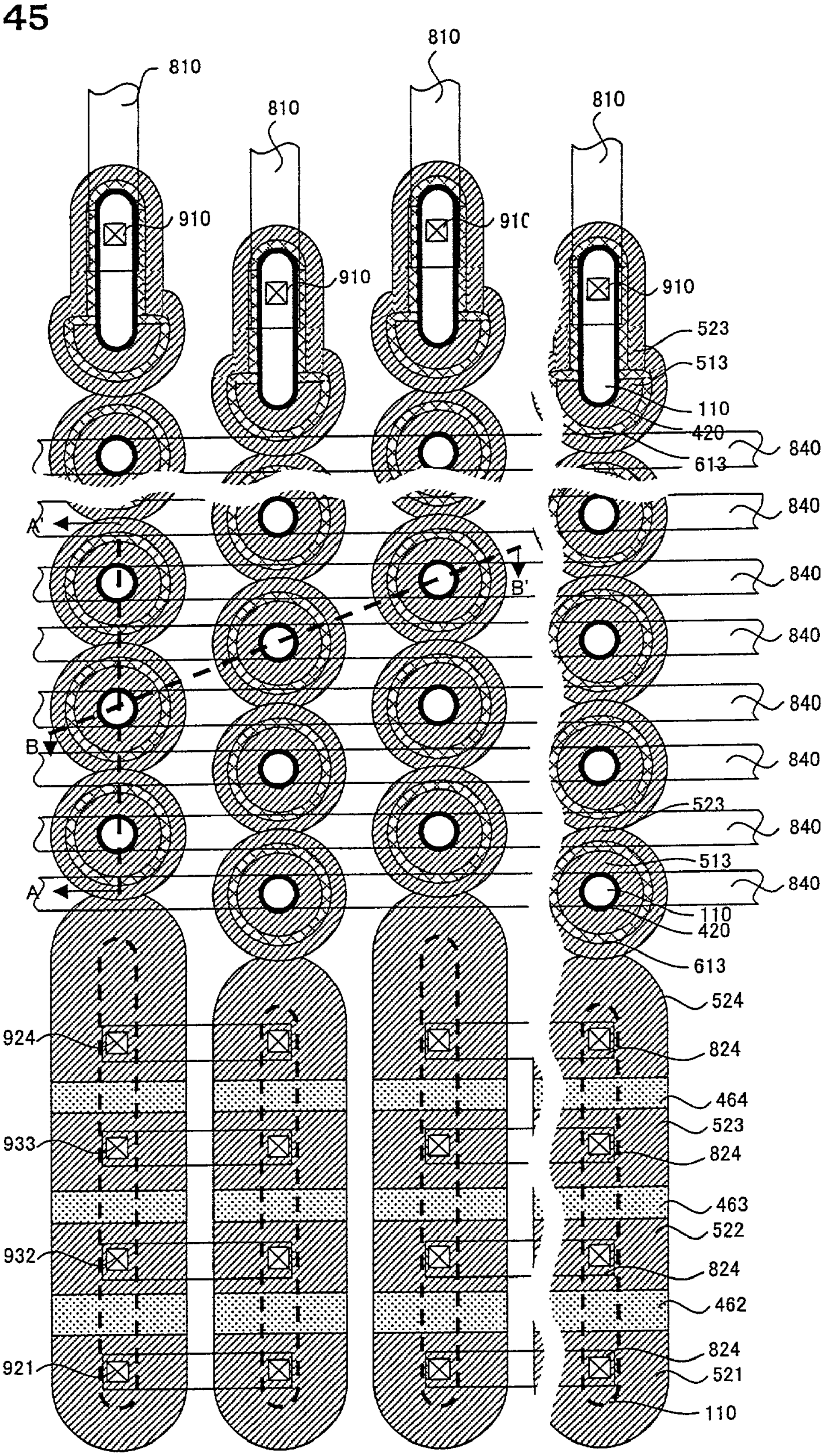

In FIG. 45, in contrast to FIG. 43, two contacts adjacent in the B–B' direction are connected, for example, by metal wiring. For example, adjacent contacts 924 are connected by the second wiring layer 824, and likewise, contacts 921, contacts 932 and contacts 933 are connected by the second wiring layer 821 and the third wiring layers 832 and 833, respectively. Also two adjacent contacts 910 may be connected in the same manner. Instead of connecting the contacts by wiring layers, a contact may be formed to connect to adjacent second conductive films at the same time, for example.

Figure 46:
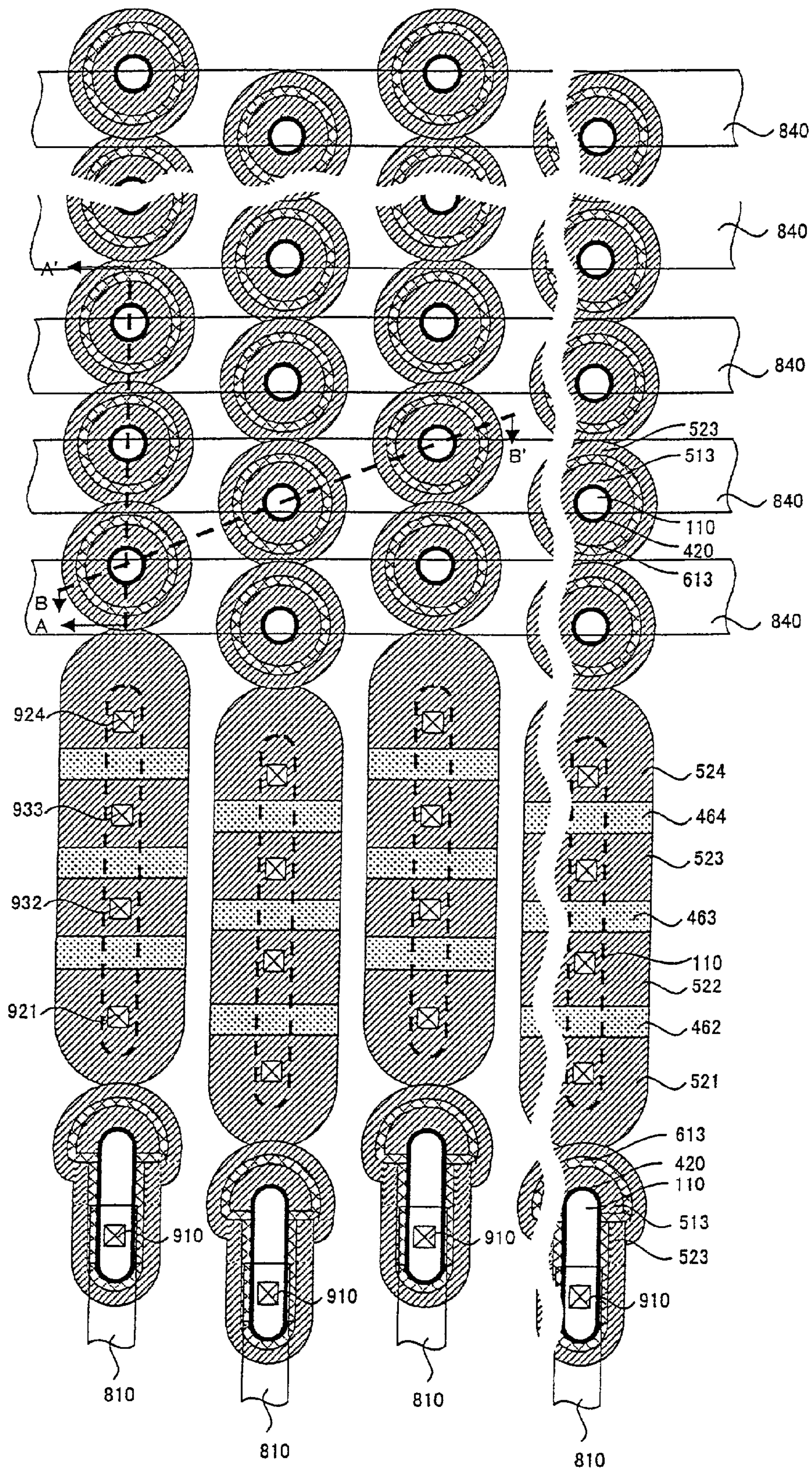

In FIG. 46, in contrast to FIG. 43, the island-like semiconductor layers connected to the first contacts 910 and the island-like semiconductor layers connected to the second contacts 921 and 924 and the third contacts 932 and covered with the second conductive film are continuously disposed at the A side end of the rows of memory cells in the A–A' direction. As compared with FIG. 43, the first wiring layers 810 and the fourth wiring layers 840 have larger widths, and all the island-like semiconductor layers connected to the second contacts 921 and 924 and the third contacts 932 and covered with the second conductive film have the same size. The first wiring layers 810, the fourth wiring layers 840 and the above island-like semiconductor layers may be used separately or in combination since their sizes are independent of each other.

In FIG. 43, memory cells in a row in the A–A' direction and memory cells in an adjacent row in the A–A' direction are not connected to the same fourth wiring layer 840. However, as shown in FIG. 46, the memory cells in the row in the A–A' direction and the memory cells in the adjacent row in the A–A' direction may be connected to the same fourth wiring layer 840. Thereby, in the case where the fourth wiring layers 840 are formed at the minimum photoetching dimension, the intervals between the memory cells continuous in the A–A' direction can be set smaller in the example of FIG. 46 than in the example of FIG. 43. According to the example of FIG. 46, the necessary number of the fourth wiring layers 840 can be decreased to half as compared with the example of FIG. 43 and therefore the necessary area for the control circuit for the fourth wiring layers can be reduced.

Therefore, the example of FIG. 46 has an advantage in that the degree of integration of the semiconductor memory is improved as compared with the example of FIG. 43. Although the fourth wiring layers are in a linear form of predetermined width in FIG. 46, the shape of the fourth wiring layers is not particularly limited so long as the memory cells in adjacent rows in the A–A' direction may be connected to the same fourth wiring layer 840.

Figure 47:
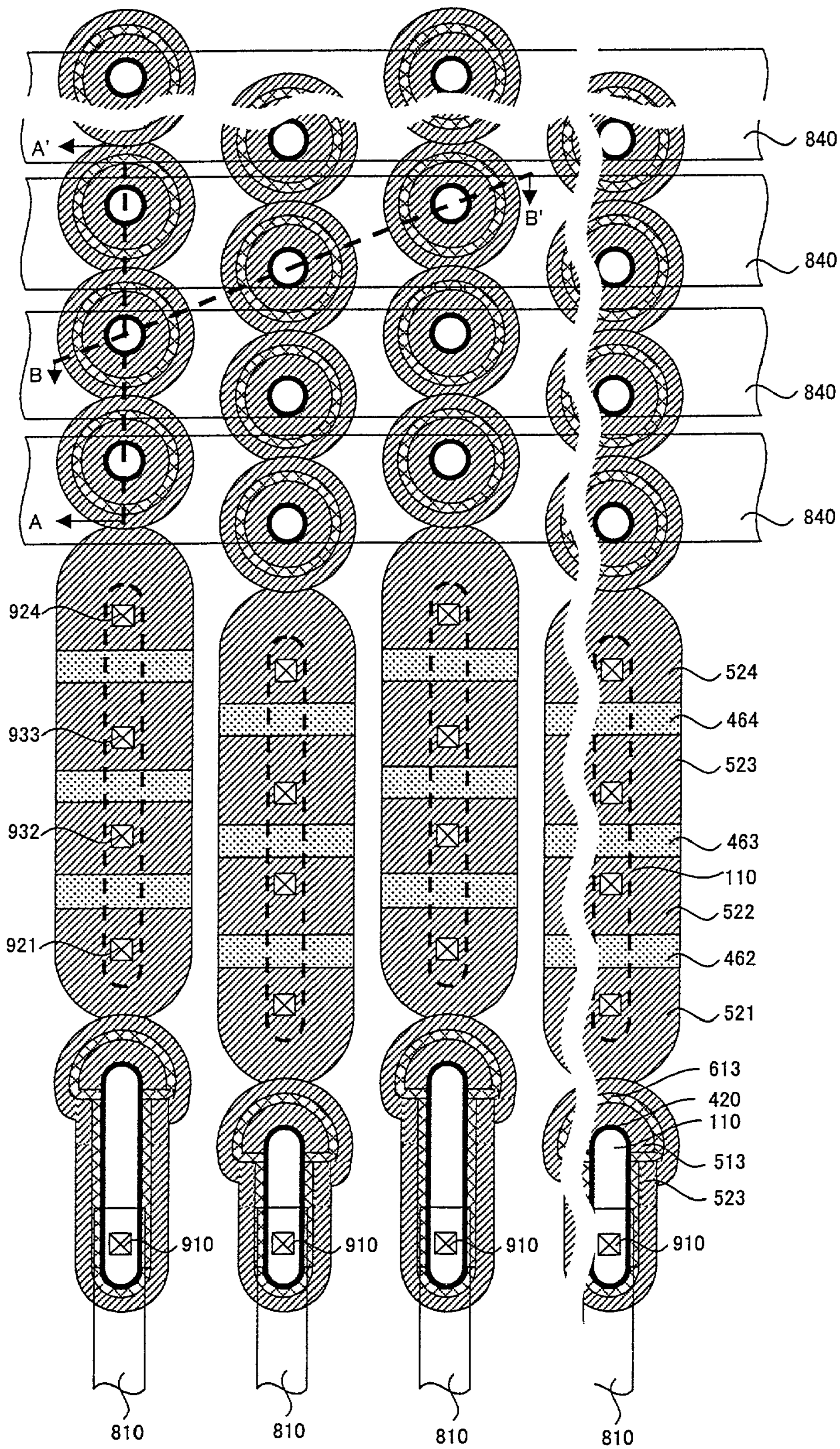

In FIG. 47, as in FIG. 46, the island-like semiconductor layers connected to the first contacts 910 and the island-like semiconductor layers connected to the second contacts 921 and 924 and the third contacts 932 and covered with the second conductive film are continuously disposed at the A side end of the rows of memory cells in the A–A' direction. However, as compared with FIG. 46, the first wiring layers 810 and the fourth wiring layers 840 have larger widths, and the island-like semiconductor layers connected to the first contacts 910 have different sizes. The first wiring layers 810, the fourth wiring layers 840 and the above island-like semiconductor layers may be used separately or in combination since their sizes are independent of each other.

As compared with the example of FIG. 46, the example of FIG. 47 has an advantage in that the contact area of the island-like semiconductor layers in the columnar form for constituting the memory cells with the fourth wiring layers 840 increases and therefore the contact resistance decreases.

Figure 48:
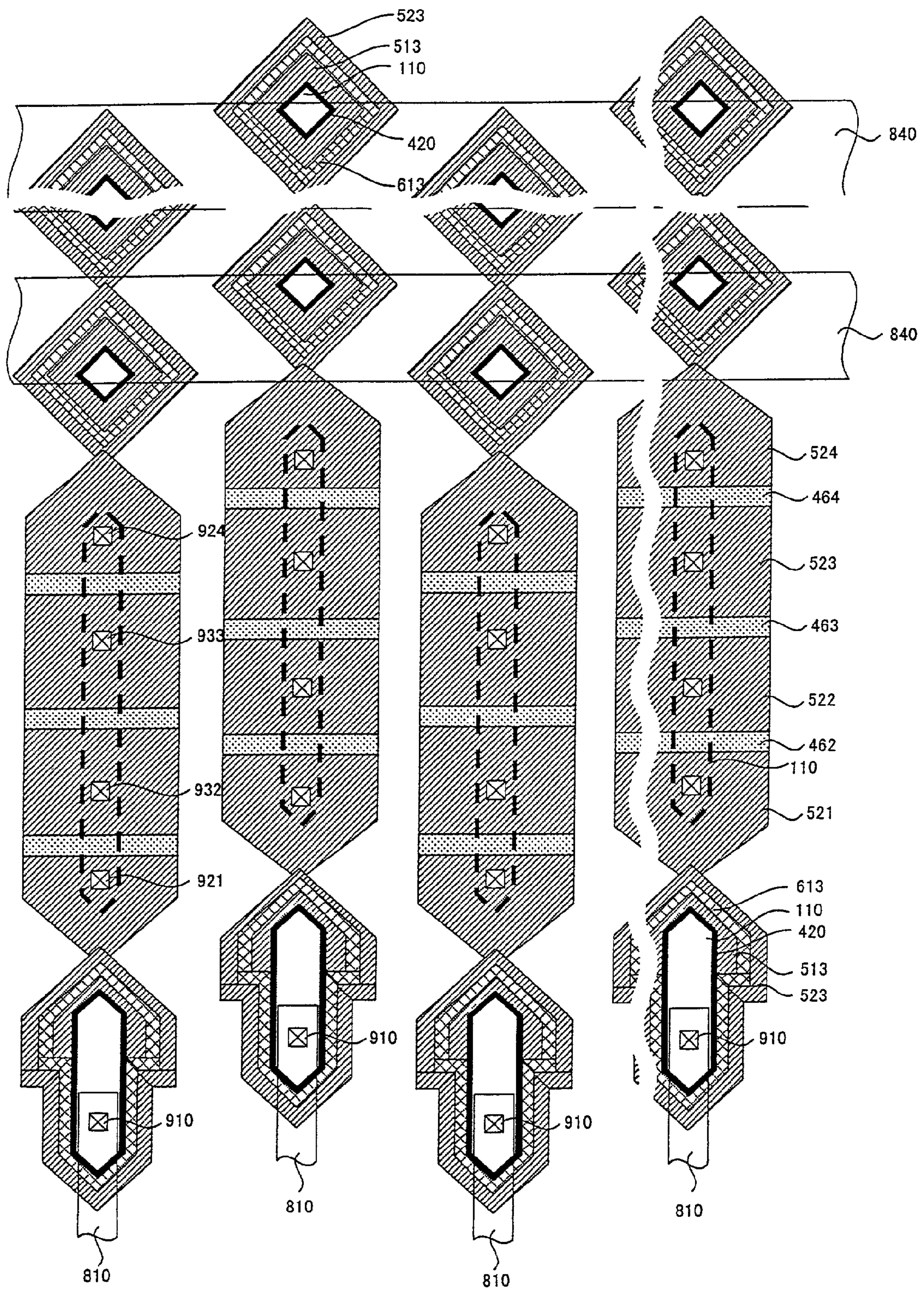
Figure 49:
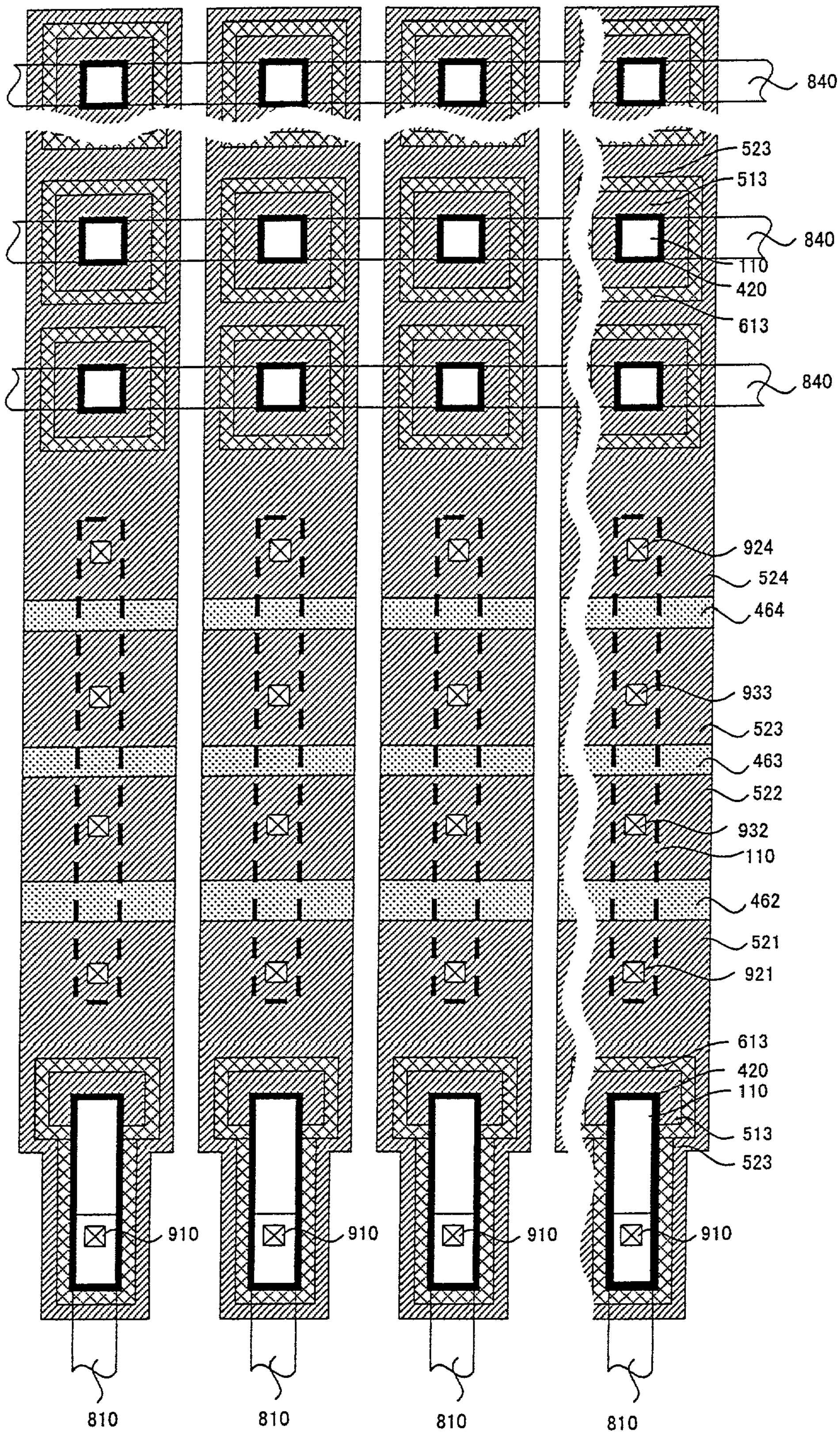

FIG. 48 and FIG. 49, in contrast to FIG. 1 and FIG. 43, the island-like semiconductor layers for constituting the memory cells have a square cross section. In FIG. 48 and FIG. 49, the island-like semiconductor layers are differently oriented. The cross section of the island-like semiconductor layers is not particularly limited to circular or square but may be elliptic, hexagonal or octagonal, for example. However, if the island-like semiconductor layers have a dimension close to the minimum photoetching dimension, the island-like semiconductor layers, even if they are designed to have corners like square, hexagon or octagon, may be rounded by photolithography and etching, so that the island-like semiconductor layers may have a cross section near to circle or ellipse.

Figure 50:
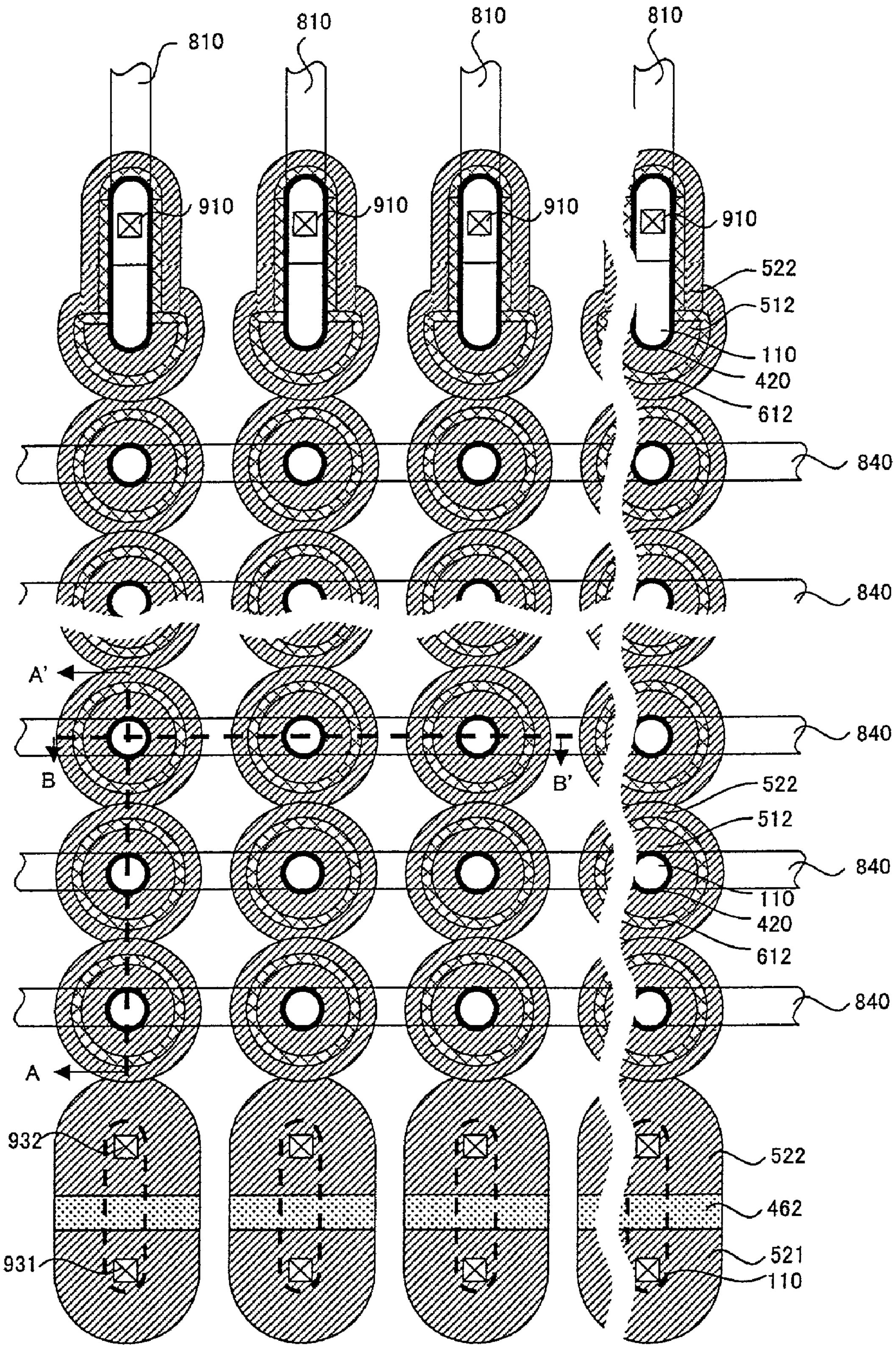

In FIG. 50, in contrast to FIG. 1, two memory cells are formed in series on an island-like semiconductor layer for constituting memory cells, and the selection gate transistor is not formed. FIG. 50 also shows lines for sectional views, i.e., line A–A' and line B–B' to be used for explaining examples of production processes.

Figure 51:
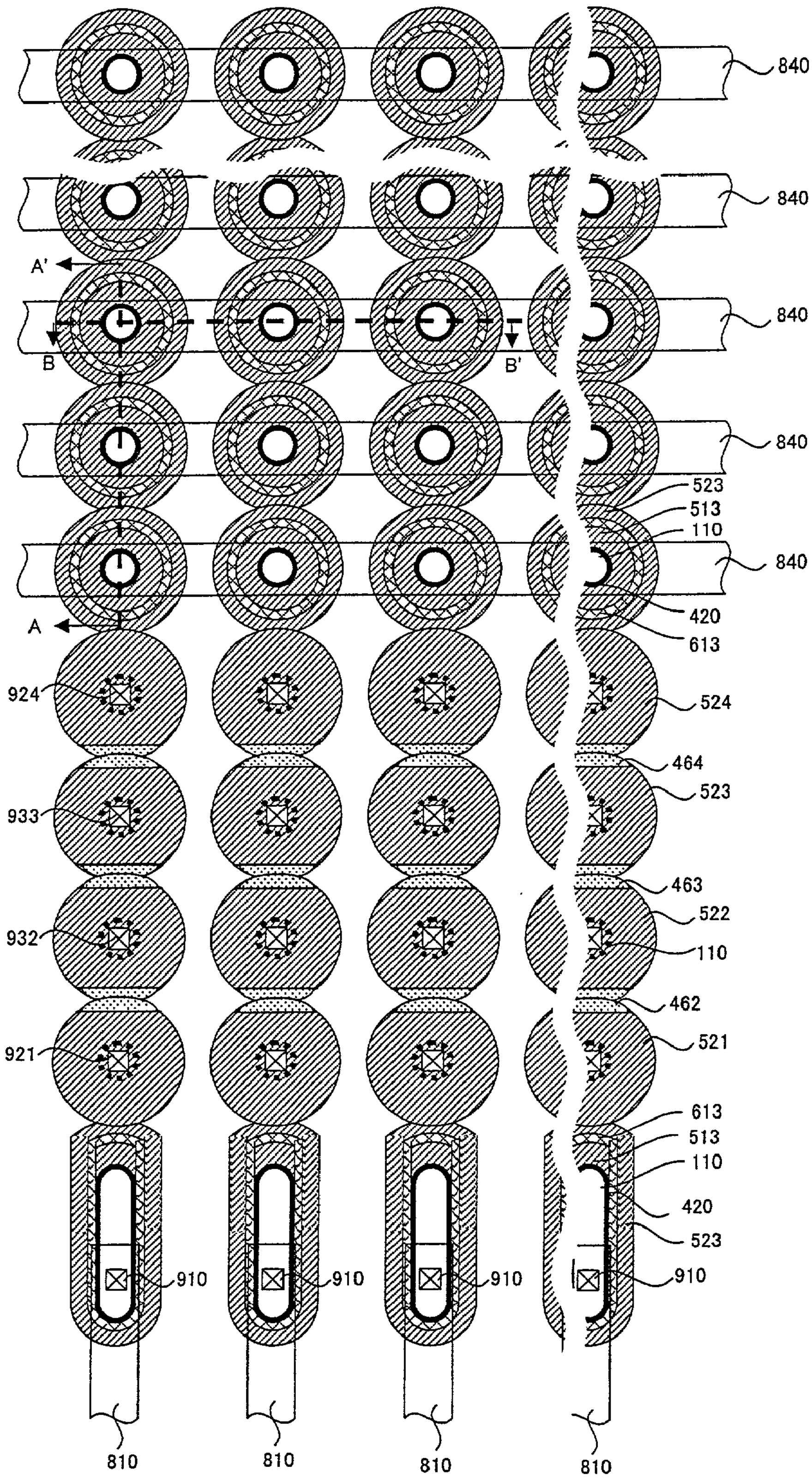

In FIG. 51, in contrast to FIG. 1, the island-like semiconductor layers connected to the second contacts 921 and 924 and the third contacts 932 and covered with the second conductive film are not formed jointly as in FIG. 1 and FIG. 41, but are formed as separate island-like semiconductor layers for every wiring layer like the island-like semiconductor layers for constituting the memory cell array.

Figure 52:
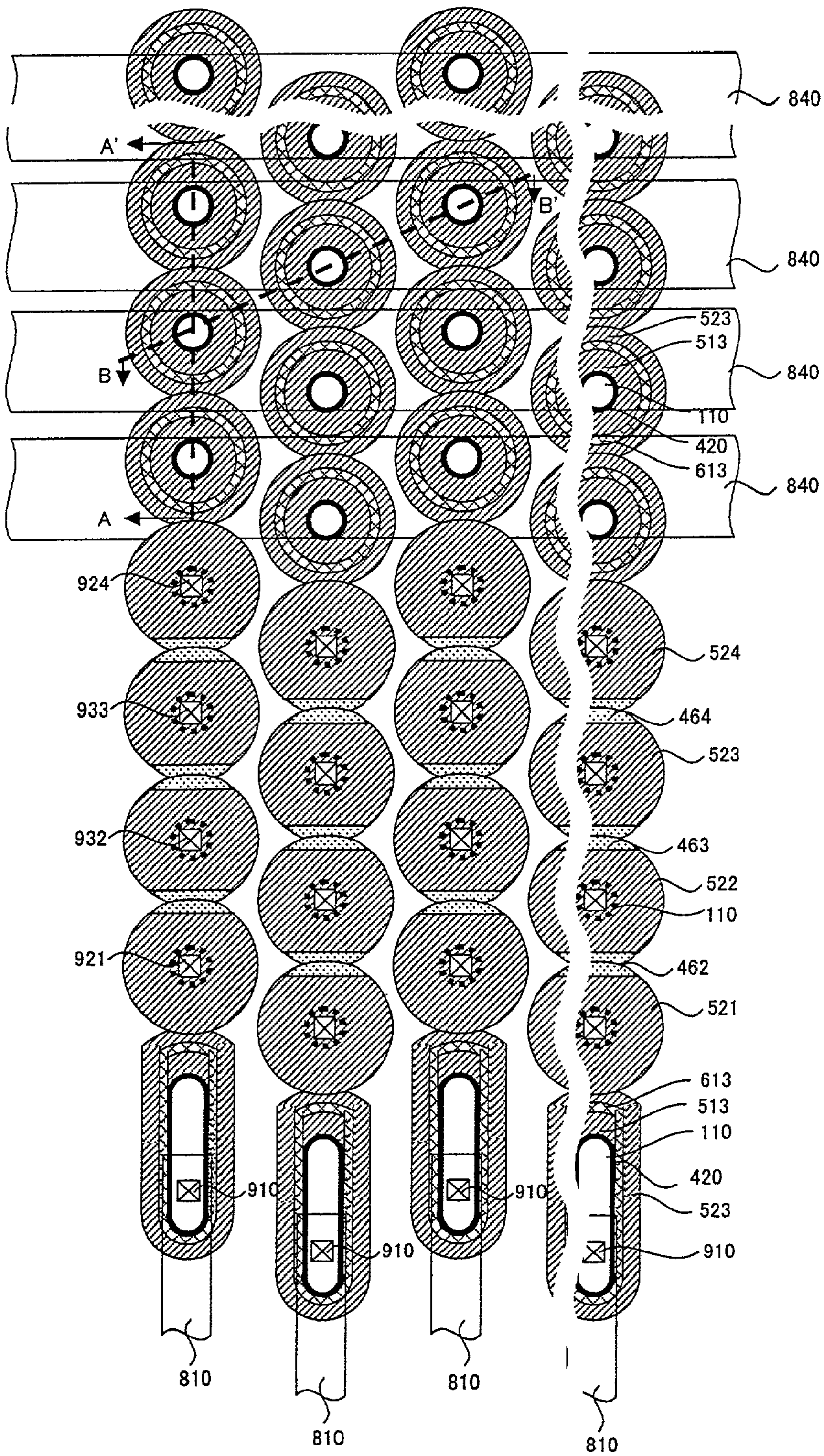

In FIG. 52, in contrast to FIG. 51, the island-like semiconductor layers are arranged at decreased intervals in the direction of the fourth wiring layer as in FIG. 45, and separate island-like semiconductor layers is used for every wiring layer like the island-like semiconductor layers for constituting the memory cell array. In this case, even if the intervals between the island-like semiconductor layers in the A–A' direction is almost equal to the intervals between the island-like semiconductor in the direction of the fourth wiring layers 840, the second wiring layers 821 and 824 and the third wiring layers 832 are not connected to each other in the direction of the fourth wiring layers 840 by adjusting the thickness of the second conductive film and the first conductive film of the island-like semiconductor layers.

Figure 53:
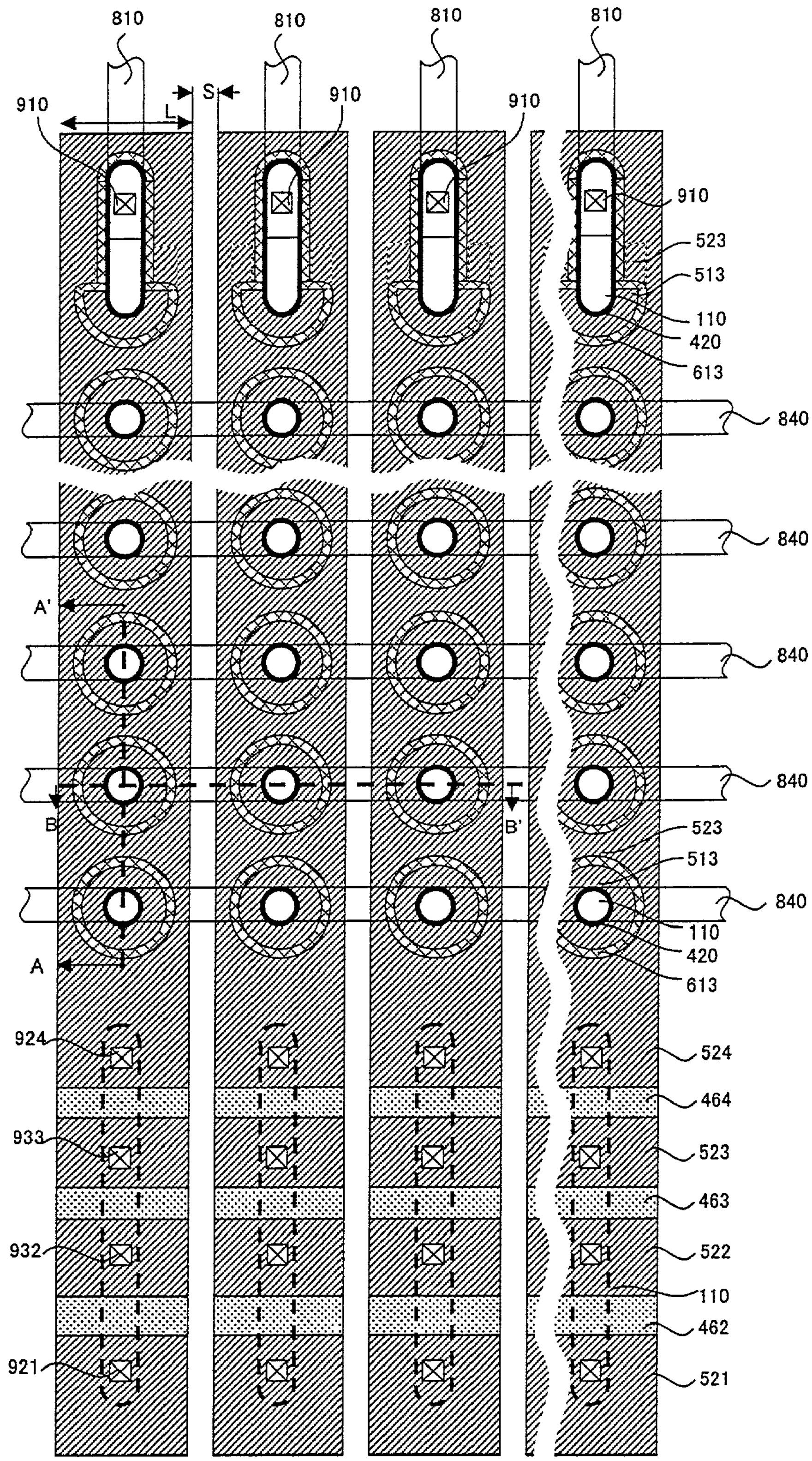

In FIG. 53, in contrast to FIG. 1, the separate second wiring layers of the second conductive films are formed by patterning using photolithography so that the intervals of the second conductive films in the B–B' direction is smaller than the width of the second conductive films in the B–B' direction.

Figure 54:
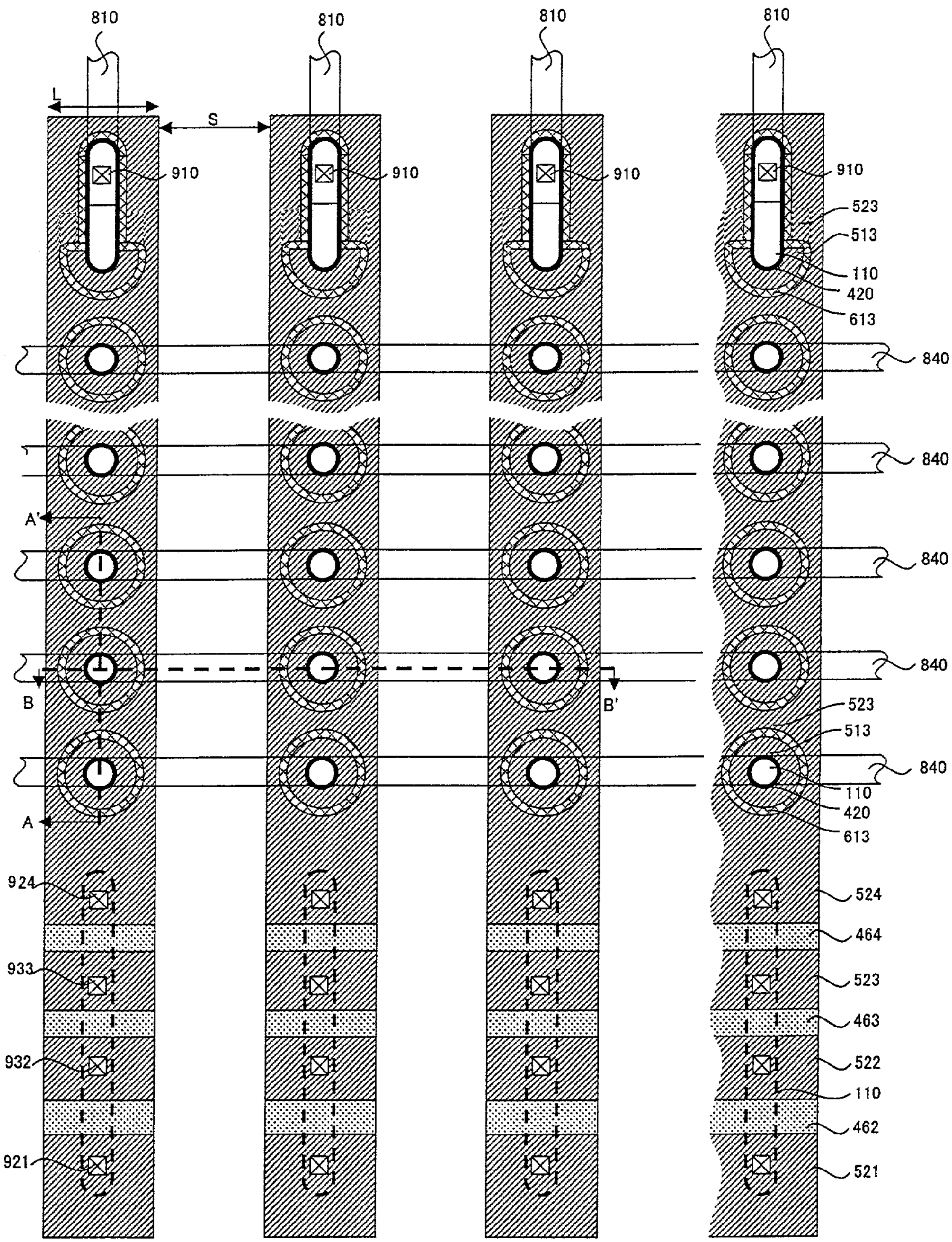

In FIG. 54, in contrast to FIG. 53, the intervals of the second conductive films in the B–B' direction is equal to the width of the second conductive films in the B–B' direction.

Figure 55:
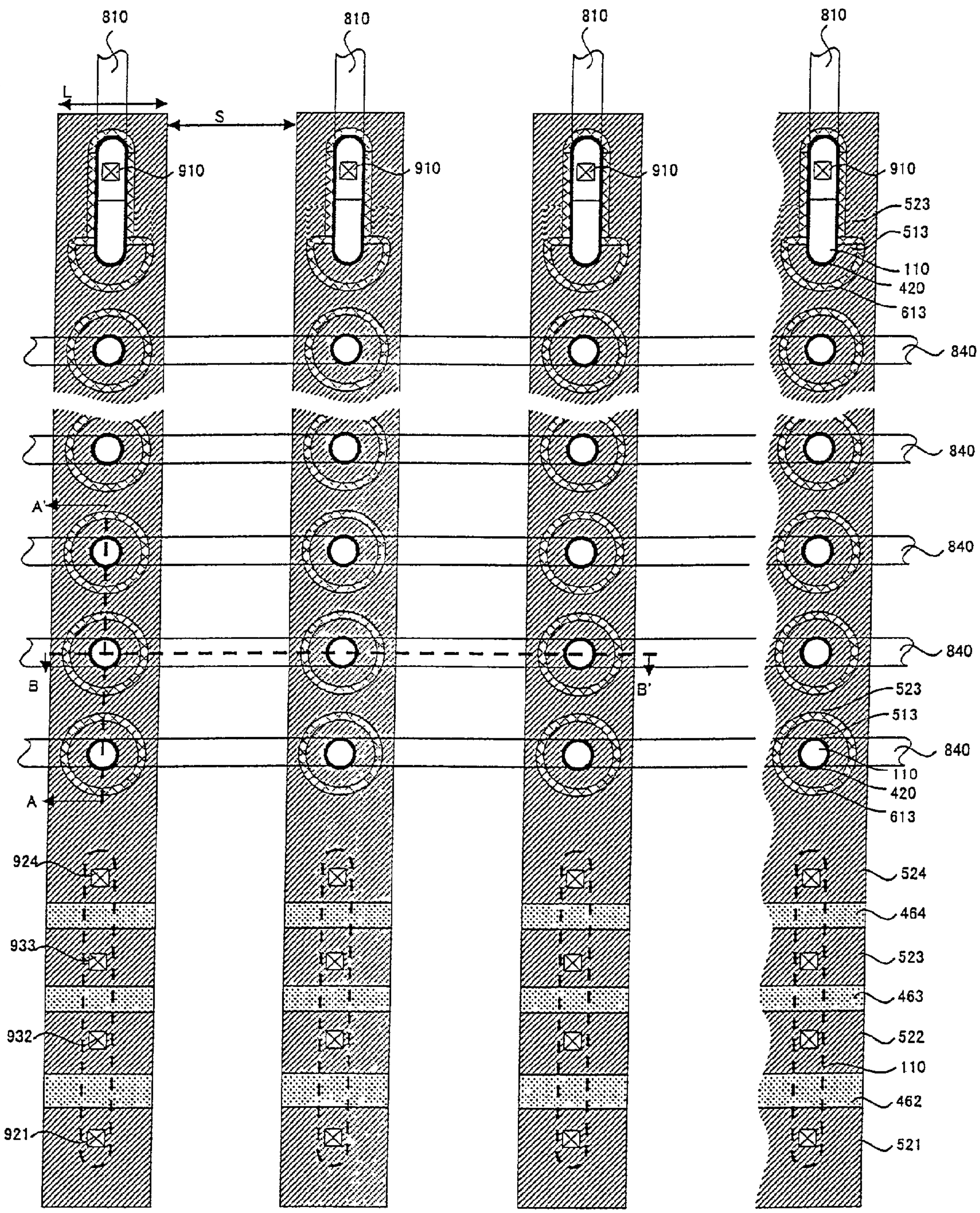

In FIG. 55, in contrast to FIG. 53, the intervals of the second conductive films in the B–B' direction is larger than the width of the second conductive films in the B–B' direction.

Figure 56:
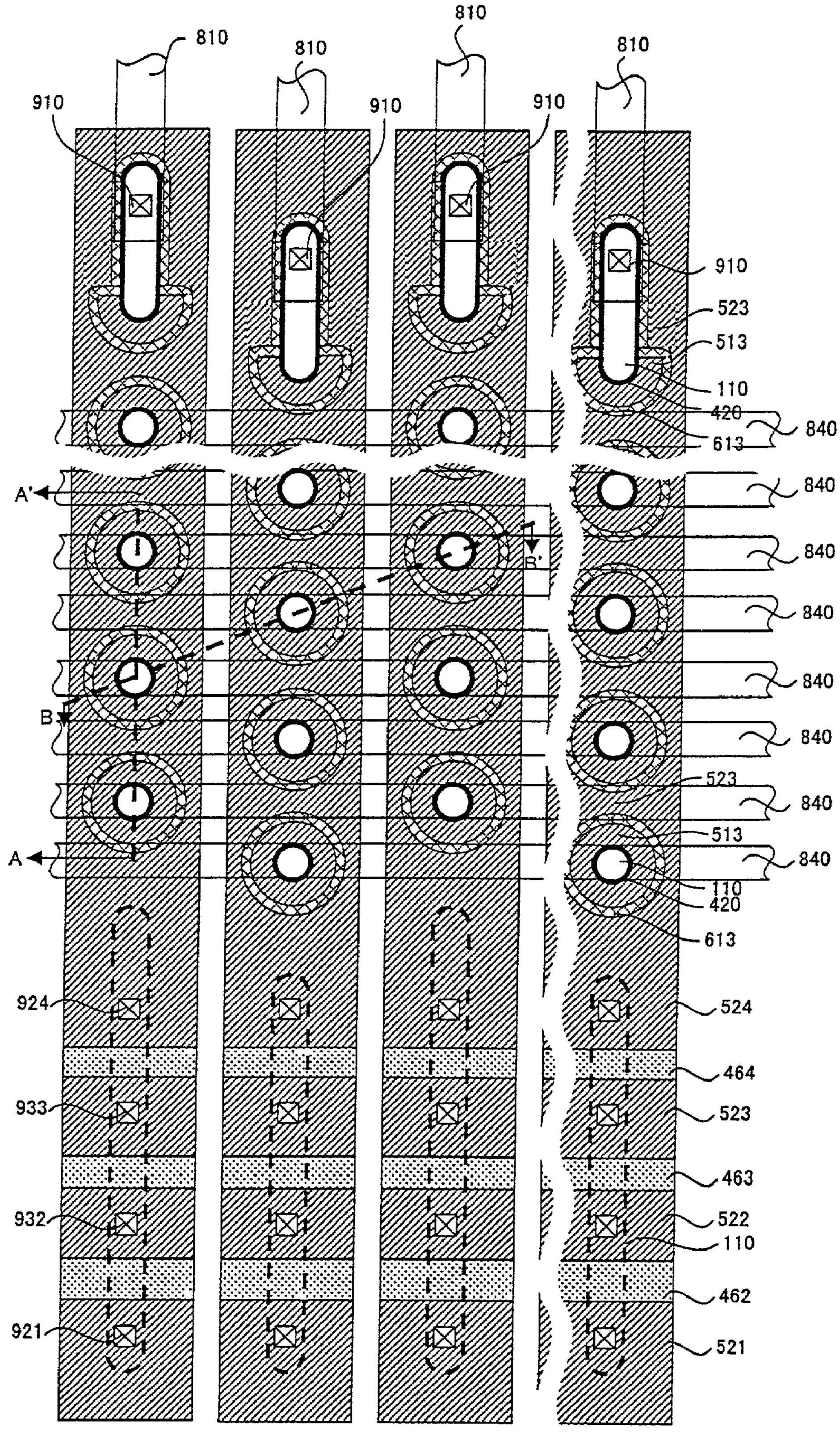

In FIG. 56, in contrast to FIG. 53, the island-like semiconductor layers are arranged as in FIG. 43.

Figure 57:
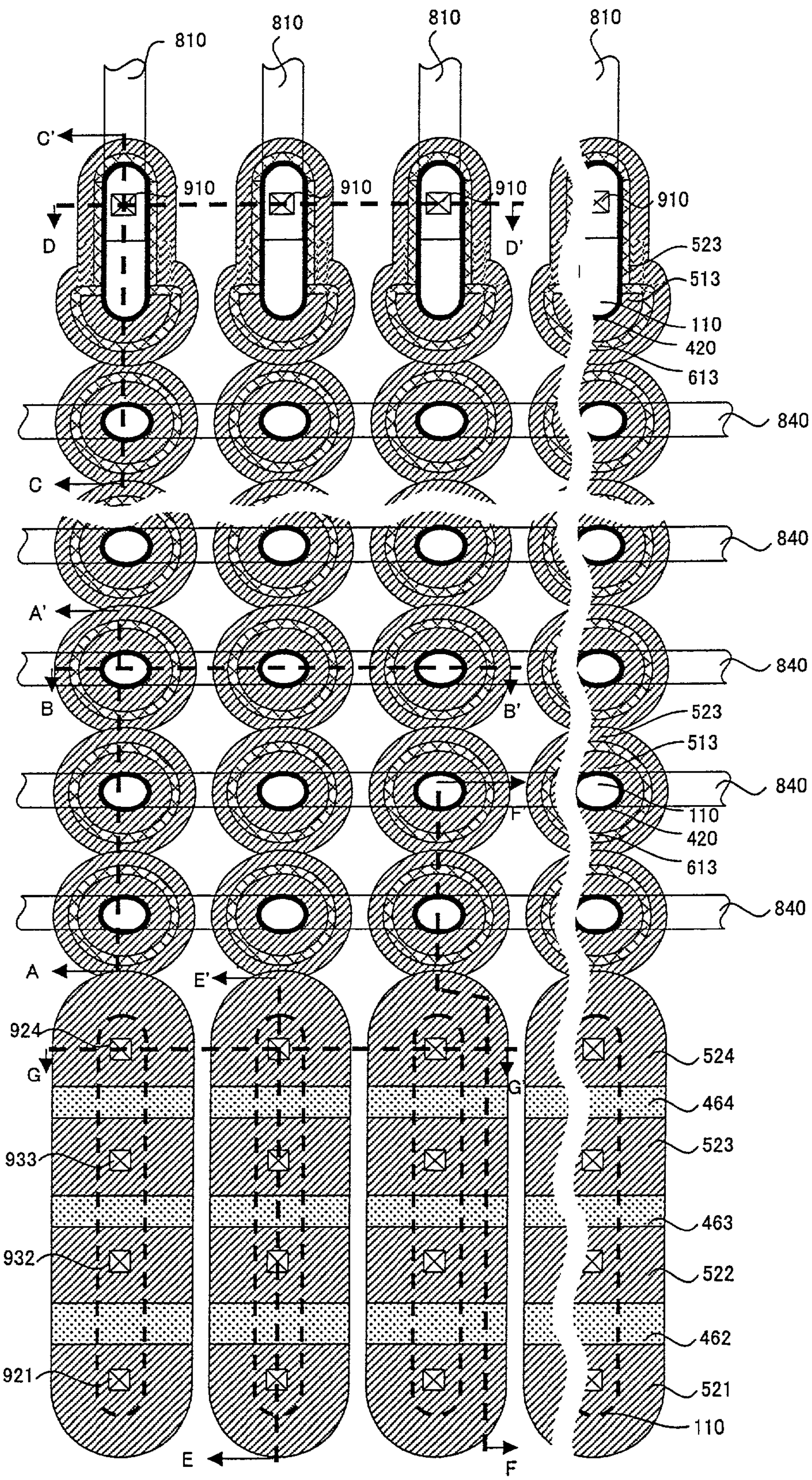

In FIG. 57, in contrast to FIG. 1, the island-like semiconductor layers for constituting the memory cells have an elliptic cross section, and the major axis of ellipse is in the B–B' direction.

Figure 58:
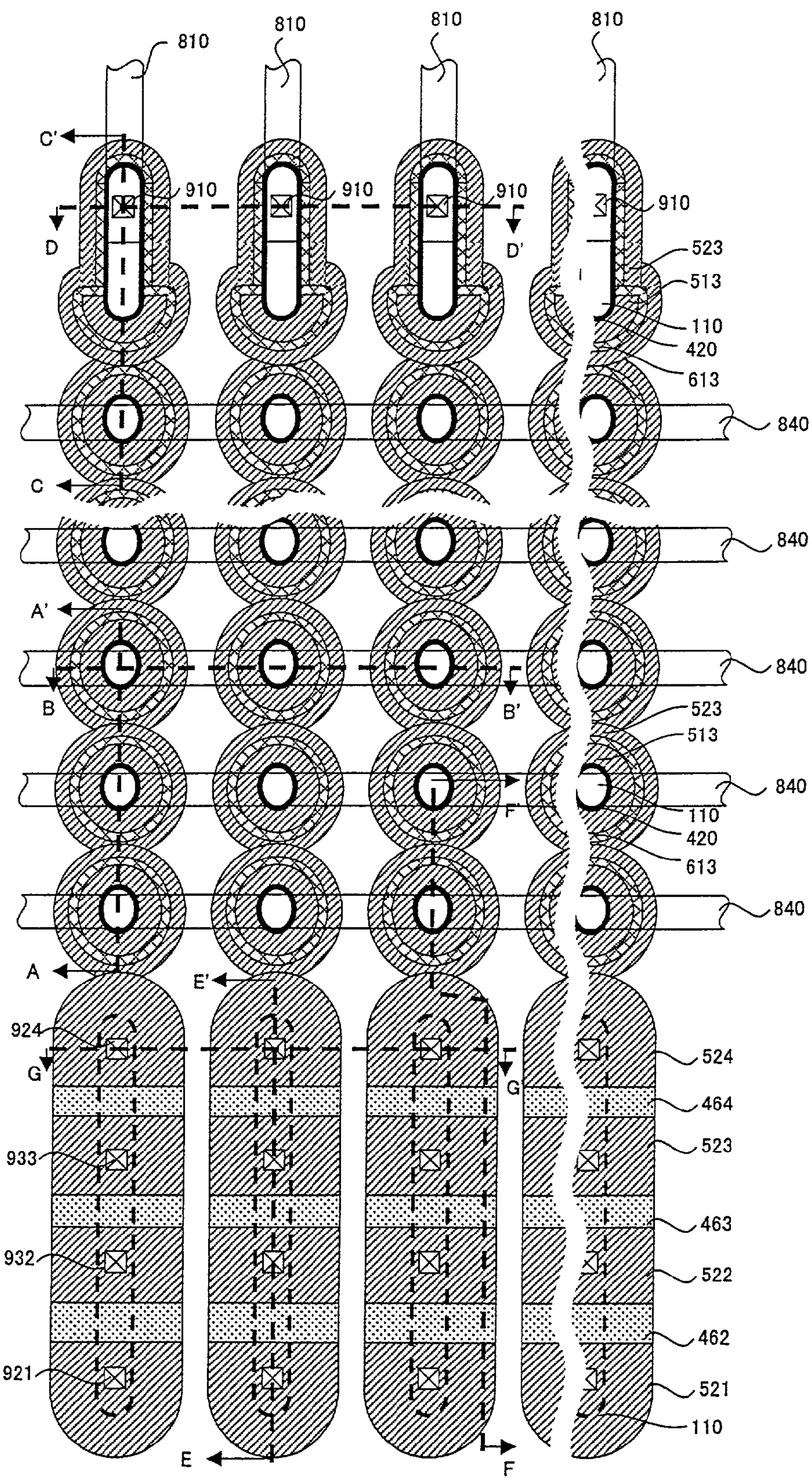

In FIG. 58, in contrast to FIG. 57, the major axis of ellipse is in the A–A' direction. The major axis may be not only in the A–A' or B–B' direction but in any direction.

Figure 59:
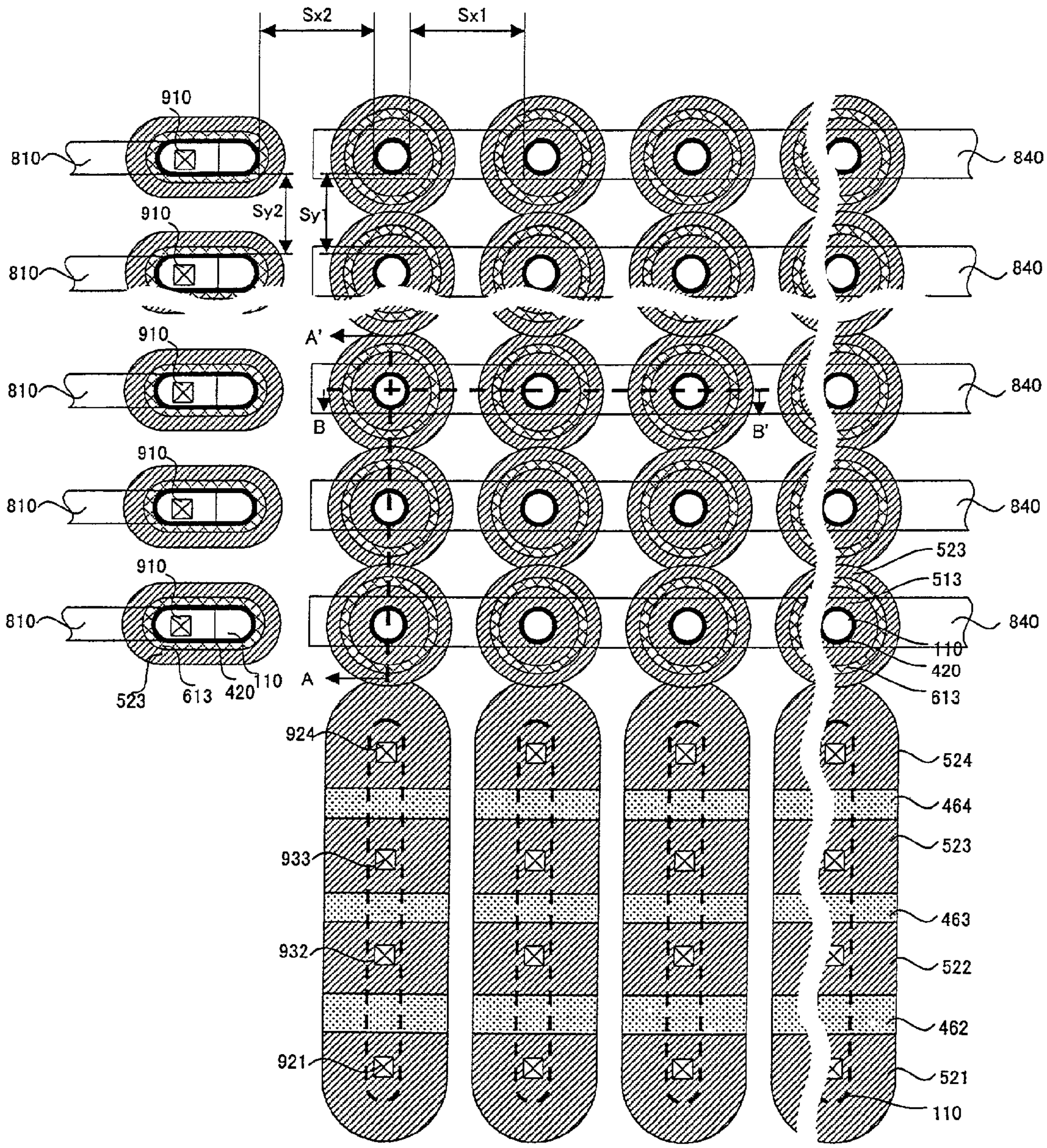

In FIG. 59, in contrast to FIG. 1, the direction of the first wiring layers 810 is in parallel with the direction of the fourth wiring layers 840. The first wiring layers 810 and the forth wiring layers 840 are in the B–B' direction and the lead-out portions of the first wiring layers 810 are disposed at the B side end of the memory cell array. Sx1 represents the intervals between the island-like semiconductor layers 110 in the B–B' direction in the memory cell array in which the island-like semiconductor layers 110 are periodically arranged, and Sx2 represents the distance between the island-like semiconductor layer 110 at the B side end of the memory cell array and the island-like semiconductor layer 110 which is the lead-out portion of the first wiring layer 810. Sy1 represents the intervals between the island-like semiconductor layers 110 in the A–A' direction in the memory cell array in which the island-like semiconductor layers 110 are periodically arranged, and Sy2 represents the intervals between island-like semiconductor layers 110 functioning as the lead-out portions of the first wiring layers 810. By setting the values of Sx1 and Sx2 larger than those of Sy1 and Sy2, the first wiring layers to be buried may be formed in self-alignment. Further, it is unnecessary to provide the shape and structure of the lead-out portions of the first wiring layers as in the example of FIG. 1 for not separating the first wiring layers when the memory cells continuous in the A–A' direction and the lead-out portions of the first wiring layers are formed in self-alignment with the second and third wiring layers.

Figure 60:
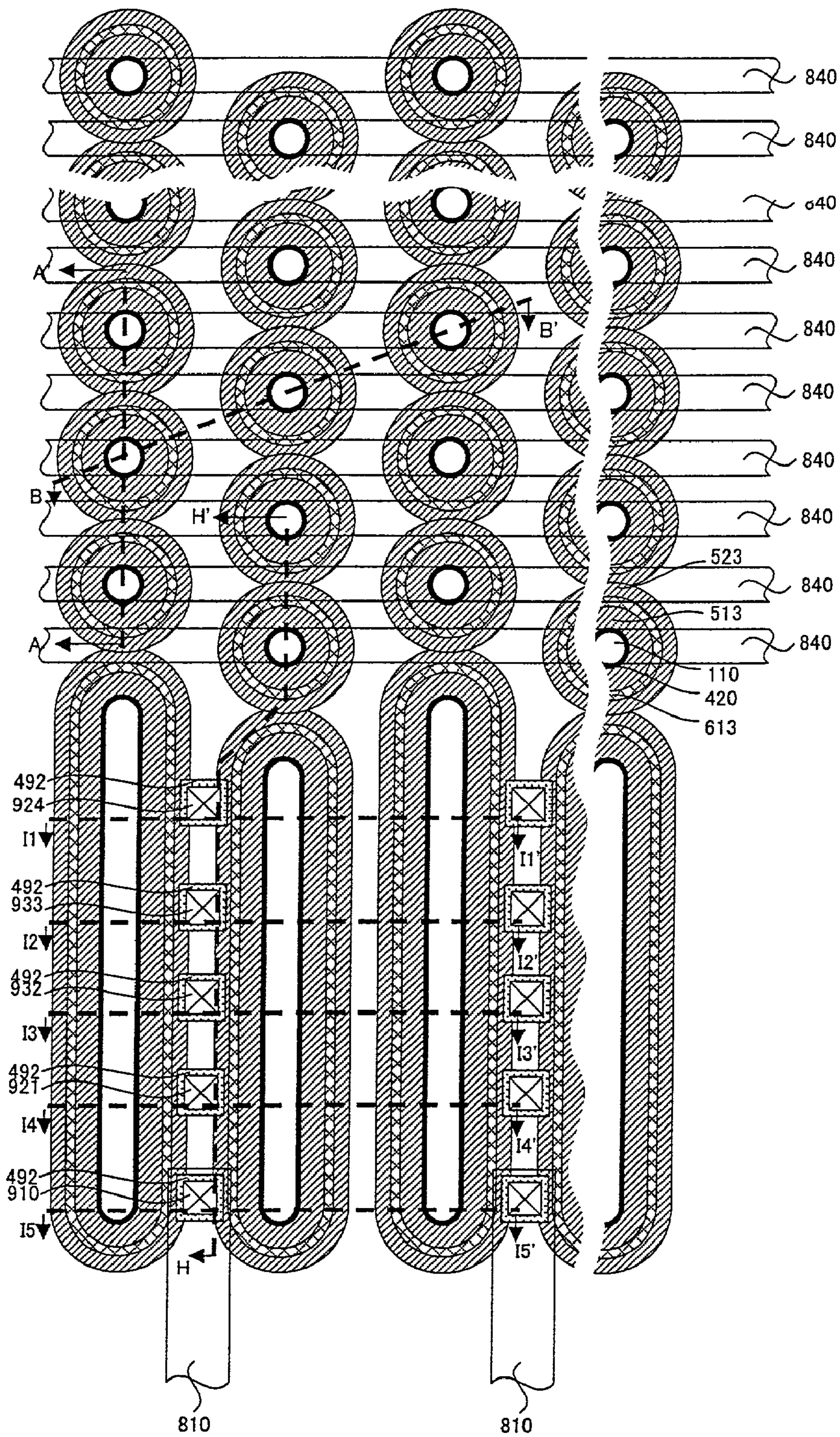

In FIG. 60, in contrast to FIG. 43, (a) wiring layer(s) and (a) insulating film(s) above a desired wiring layer are removed by anisotropic etching and contacts are formed in the desired layer. Common contacts are formed for adjacent second wiring layers 821 and 824 and adjacent third wiring layers 832. For example, in FIG. 60, contacts are formed in a desired wiring layer commonly to the memory cells continuous in a row in the H–H' direction and the memory cells continuous in an adjacent row in the H–H' direction. For operating one of adjacent memory cells, a desired potential is given to every two fourth diffusion layers 840 to select the memory cell. In contrast to FIG. 60, contacts may be formed in desired wiring layers for the respective memory cells continuous in the H–H' direction instead of providing common contacts in the desired wiring layer to the memory cells in adjacent rows in the H–H' direction. FIG. 60 also shows lines for sectional views, i.e., line H–H', line I1–I1' to line I5–I5', to be used for explaining examples of production processes. Sectional views of a lead-out portion including the contacts 921, 932, 933 and 924 are shown in FIG. 670 to FIG. 675, and sectional views of a lead-out portion including the contact 910 are shown in FIG. 560 and FIG. 583.

Figure 61:
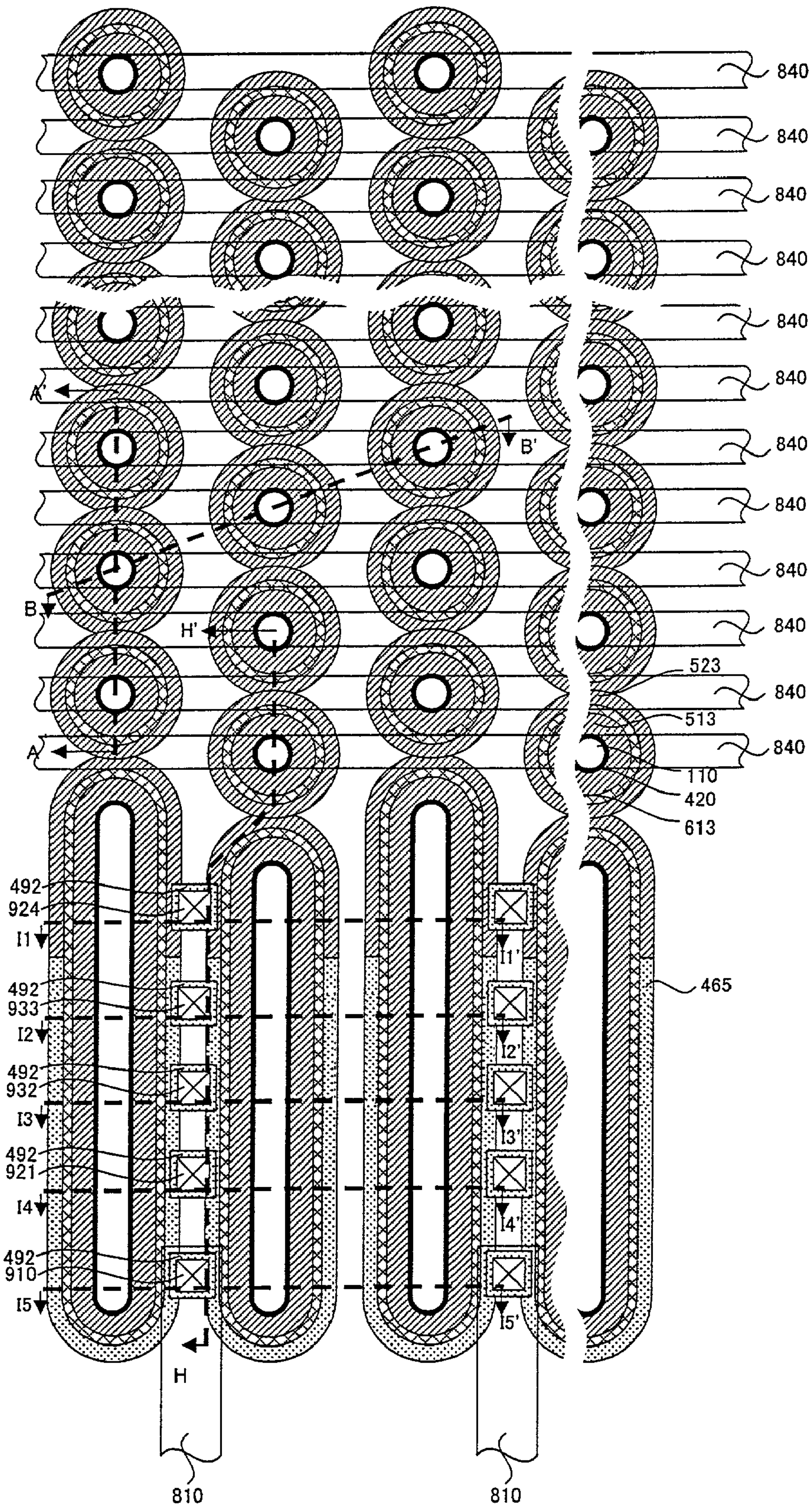

In FIG. 61, in contrast to FIG. 43, the second wiring layers 821 and 824 and the third wiring layers 832 are in the form of steps in contact regions where contacts are provided. (A) insulating film(s) and the like above a desired wiring layer is/are removed by anisotropic etching, and the contacts are formed in the desired wiring layer. Common contacts are formed for adjacent second wiring layers 821 and 824 and adjacent third wiring layers 832, or separate contacts may be formed for the respective wiring layers. FIG. 61 also shows lines for sectional views, i.e., line H–H', line I1–I1' to line I5–I5', to be used for explaining examples of production processes.

Sectional views of a lead-out portion including the contacts 921, 932, 933 and 924 are shown in FIG. 676 to FIG. 681, and sectional views of a lead-out portion including the contact 910 are shown in FIG. 560 and FIG. 583.

Figure 62:
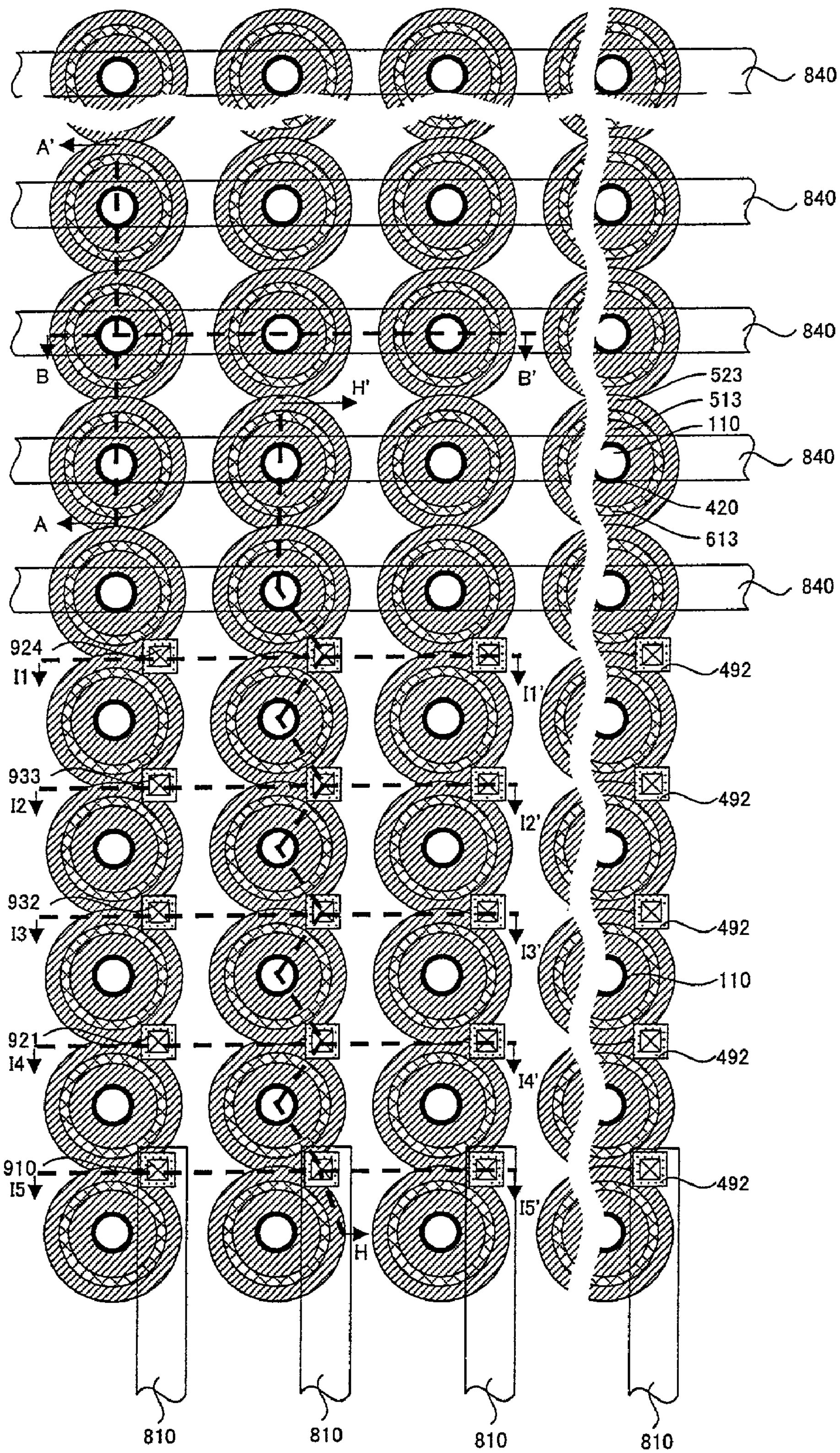

In FIG. 62, in contrast to FIG. 1, (a) wiring layer(s) and (a) insulating film(s) above a desired wiring layer are removed by anisotropic etching and contacts are formed in the desired layer. Separate contacts are formed for the second wiring layers 821 and 824 and the third wiring layers 832. FIG. 62 also shows lines for sectional views, i.e., line H–H', line I1–I1' to line I5–I5', to be used for explaining examples of production processes.

Sectional views of a lead-out portion including the contacts 921, 932, 933 and 924 are shown in FIG. 776 to FIG. 781, and sectional views of a lead-out portion including the contact 910 are shown in FIG. 560 and FIG. 583.

Figure 63:
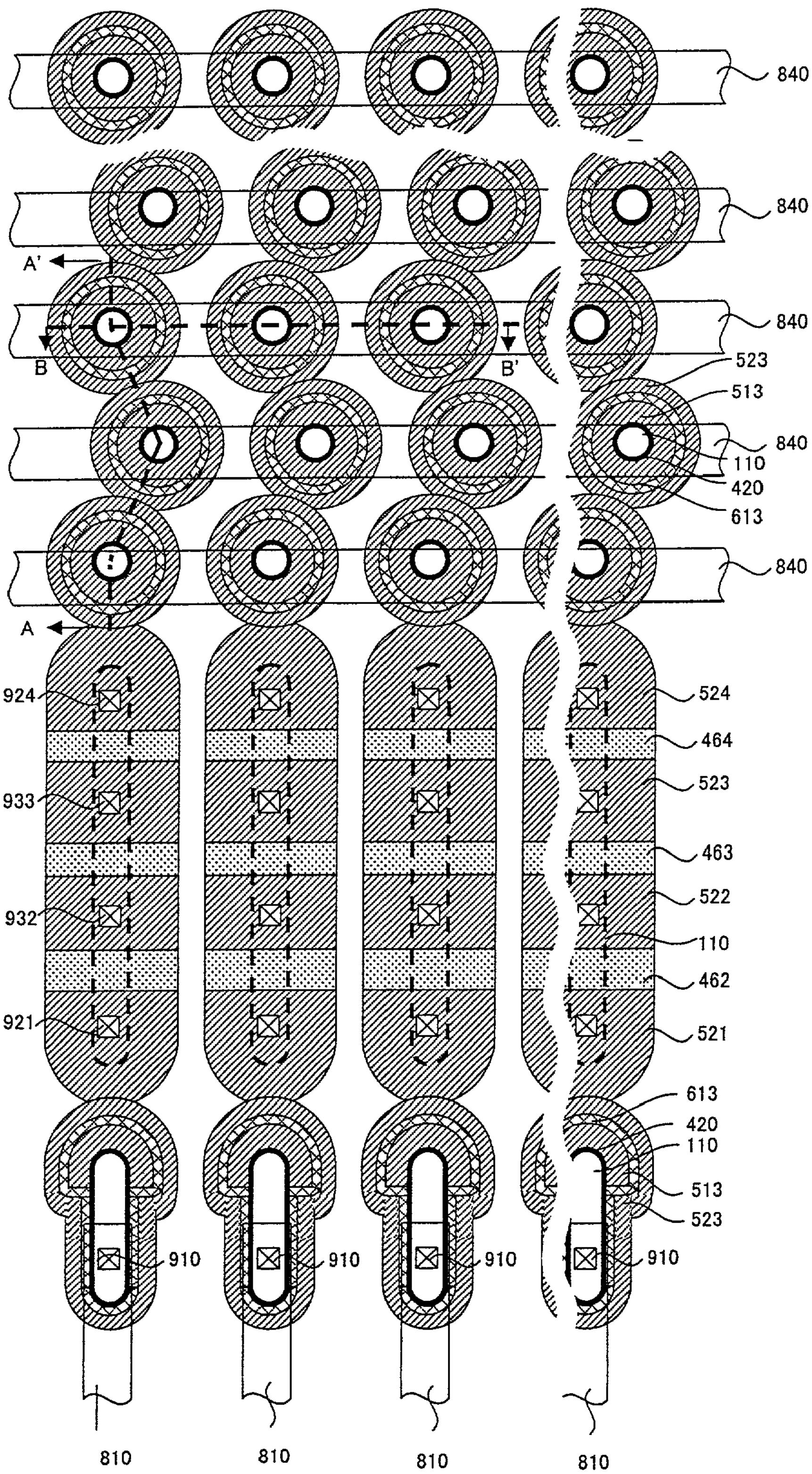

In FIG. 63, in contrast to FIG. 1, the island-like semiconductor layers for constituting connected memory cells are not formed linearly. In the example of FIG. 1, the island-like semiconductor layers are arranged in straight lines in the A–A' direction. In the example of FIG. 63, the island-like semiconductor layers are partially shifted from the straight lines. Thereby, the island-like semiconductor layers can be formed more densely. Such arrangement is not particularly limited to the example of FIG. 63 but may be in any configuration so long as the island-like semiconductor layers can be formed more densely than in the linear arrangement.

Figure 64:
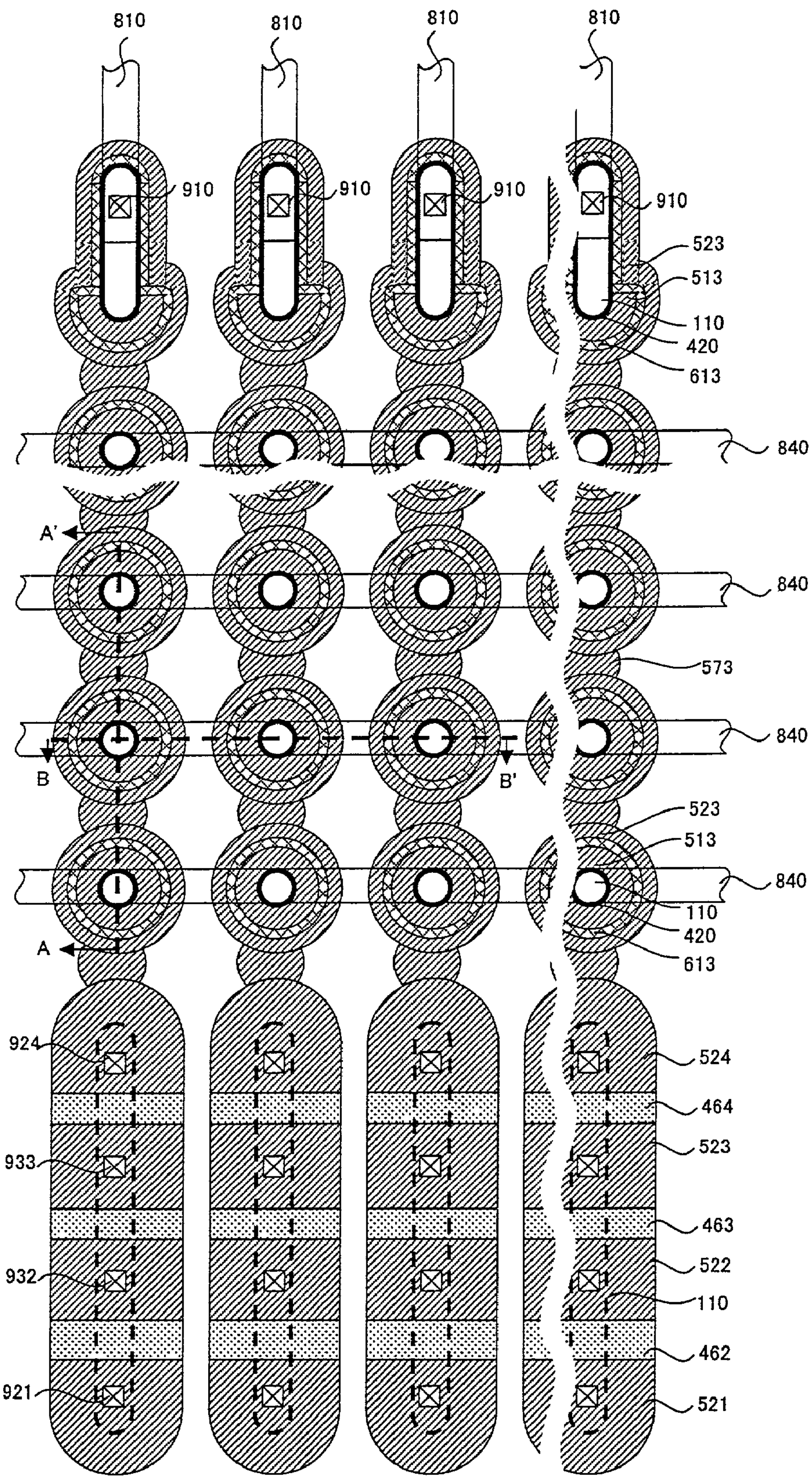

In FIG. 64, in contrast to FIG. 1, the memory cells and terminals for electrically connecting with the wiring layers are separately formed. The memory cells and the terminals are electrically connected later by burying conductive films in desired positions, for example, in hole-form trenches formed in island-like semiconductor layer separation portions by patterning using photolithography. In FIG. 64, the memory cells are connected linearly in the A–A' direction. However, it is not always necessary to connect the memory cells in the A–A' direction or even linearly. Not all the memory cells need to be connected.

In FIG. 68, in contrast to FIG. 43, the contact regions are formed in slits having a width two or less times as large as the thickness of the polysilicon film (the second conductive film). Within the slits, the second wiring layers 821 and 824 and the third wiring layers 832 are formed in a step form. The contacts are formed in desired wiring layers. In this example, the contacts for the first, second and third wiring layers are all formed in one slit. By making the contact regions in the slits having a width two or less times as large as the thickness of the polysilicon film, the polysilicon film is lead out to the top of the semiconductor memory even if the polysilicon film is not deposited to a height almost equal to the height of the island-like semiconductor layers. The slits are not necessarily linear so long as their width is about two or less times as large as the thickness of the polysilicon film. The slits may have the same length or different lengths. In contrast to the example of FIG. 68, common contacts may be formed in desired wiring layers to the memory cells continuous in a row in the H–H' direction and the memory cells continuous in an adjacent row in the H–H' direction. FIG. 68 also shows lines for sectional views, i.e., line H–H' and line I1–I1', to be used for explaining examples of production processes.

Sectional views of a lead-out portion including the contacts 921, 932, 933 and 924 are shown in FIG. 748 to FIG. 753, and sectional views of a lead-out portion including the contact 910 are shown in FIG. 560 and FIG. 583.

Figure 69:
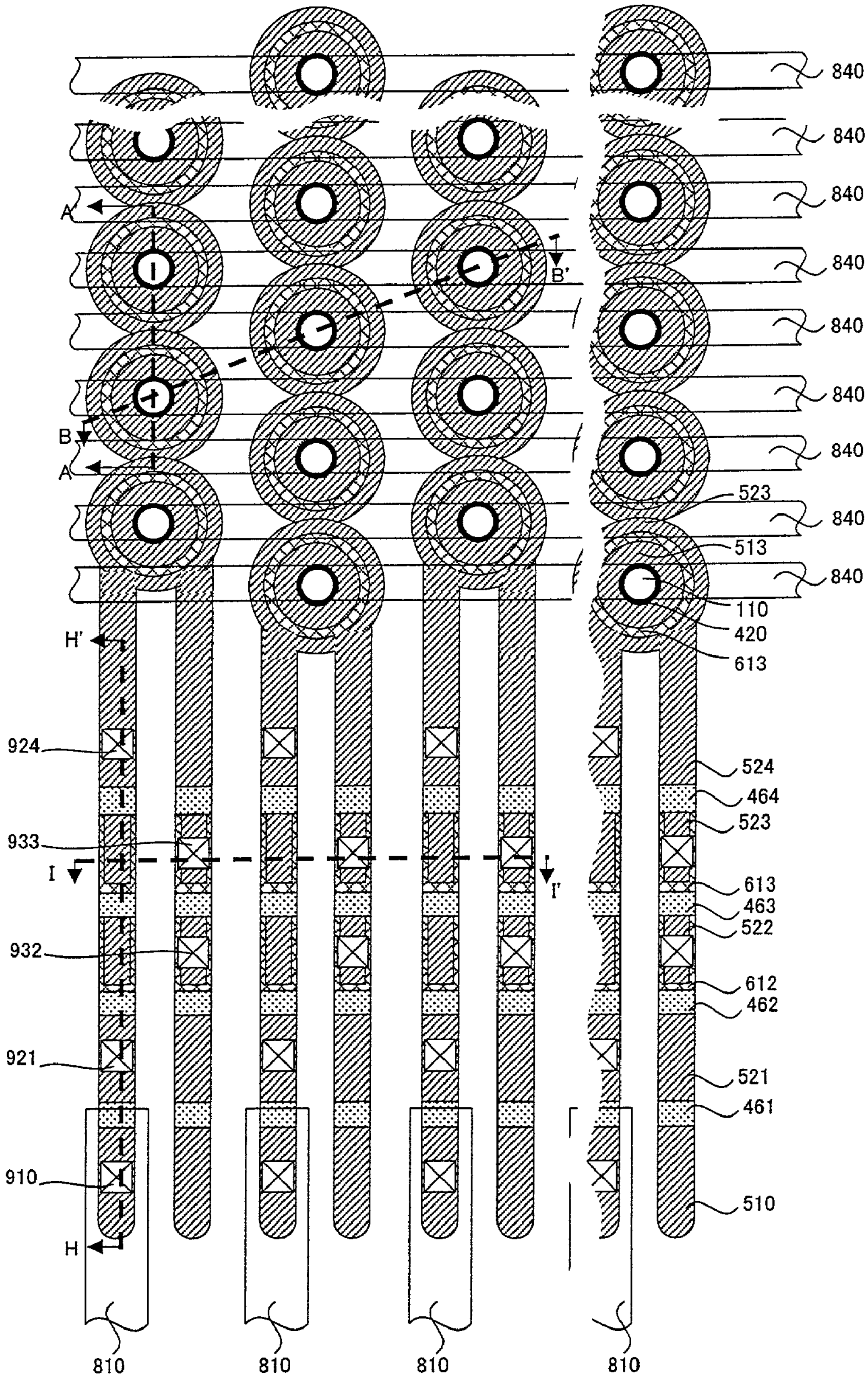

In FIG. 69, in contrast to FIG. 43, one contact region is formed in a plurality of slits having a width two or less times as large as the thickness of the polysilicon film (the second conductive film). Within the slits, the second wiring layers 821 and 824 and the third wiring layers 832 are formed in a step form. The contacts are formed in desired wiring layers. In this example, two slits are formed for every row of memory cells continuous in the H–H' direction. The contacts of the first and second wiring layers are formed in one of the slits, and the contacts of the third wiring layers are formed in the other. It is not particularly limited the contact of which wiring layer is formed in what position in which of the plurality of slits. By making the contact regions in the slits having a width two or less times as large as the thickness of the polysilicon film, the polysilicon film is lead out to the top of the semiconductor memory even if the polysilicon film is not deposited to a height almost equal to the height of the island-like semiconductor layers. The slits are not necessarily linear so long as their width is about two or less times as large as the thickness of the polysilicon film. The slits may have the same length or different lengths. In the case where a plurality of slits are formed for one row of memory cells, as compared with the formation of a single slit, the length of the slits can be decreased and the area necessary for the lead-out portions can be reduced. In contrast to the example of FIG. 69, common contacts may be formed in desired wiring layers to the memory cells continuous in a row in the H–H' direction and the memory cells continuous in an adjacent row in the H–H' direction. FIG. 69 also shows lines for sectional views, i.e., line H–H' and line I1–I1', to be used for explaining examples of production processes.

Figure 70:
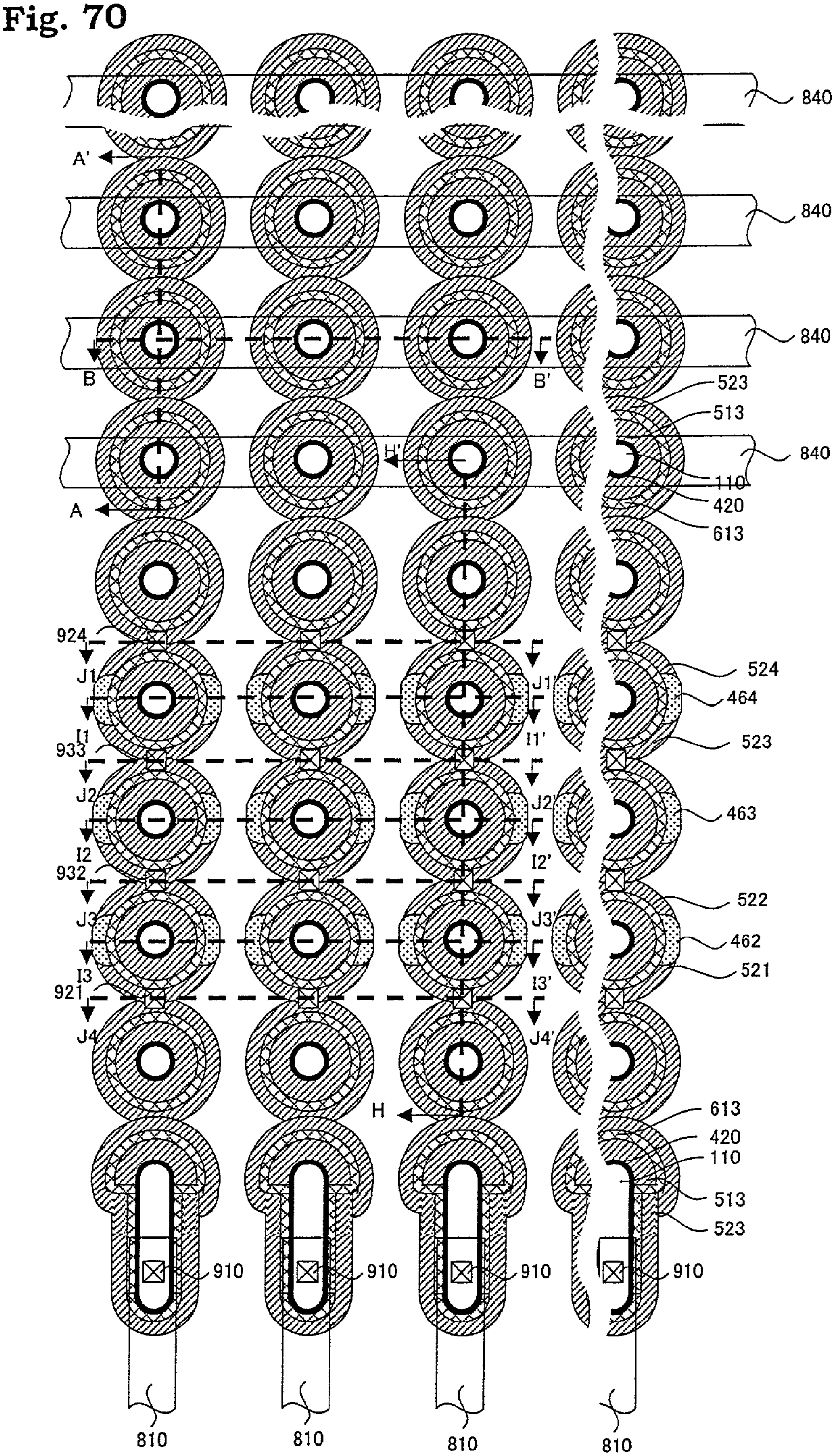

In FIG. 70, in contrast to FIG. 51, the top of the island-like semiconductor layers are not covered with the second conductive films connected to the second contacts 921 and 924 and the third contacts 932. The second contacts 921 and 924 and the third contacts 932 are formed on second conductive films formed between island-like semiconductor layers adjacent in the A–A' direction. FIG. 70 also shows lines for sectional views, i.e., line H–H', line I1–I1' to line I4–I4', and line J1–J1' to line J4–J4' to be used for explaining examples of production processes.

Figure 71:
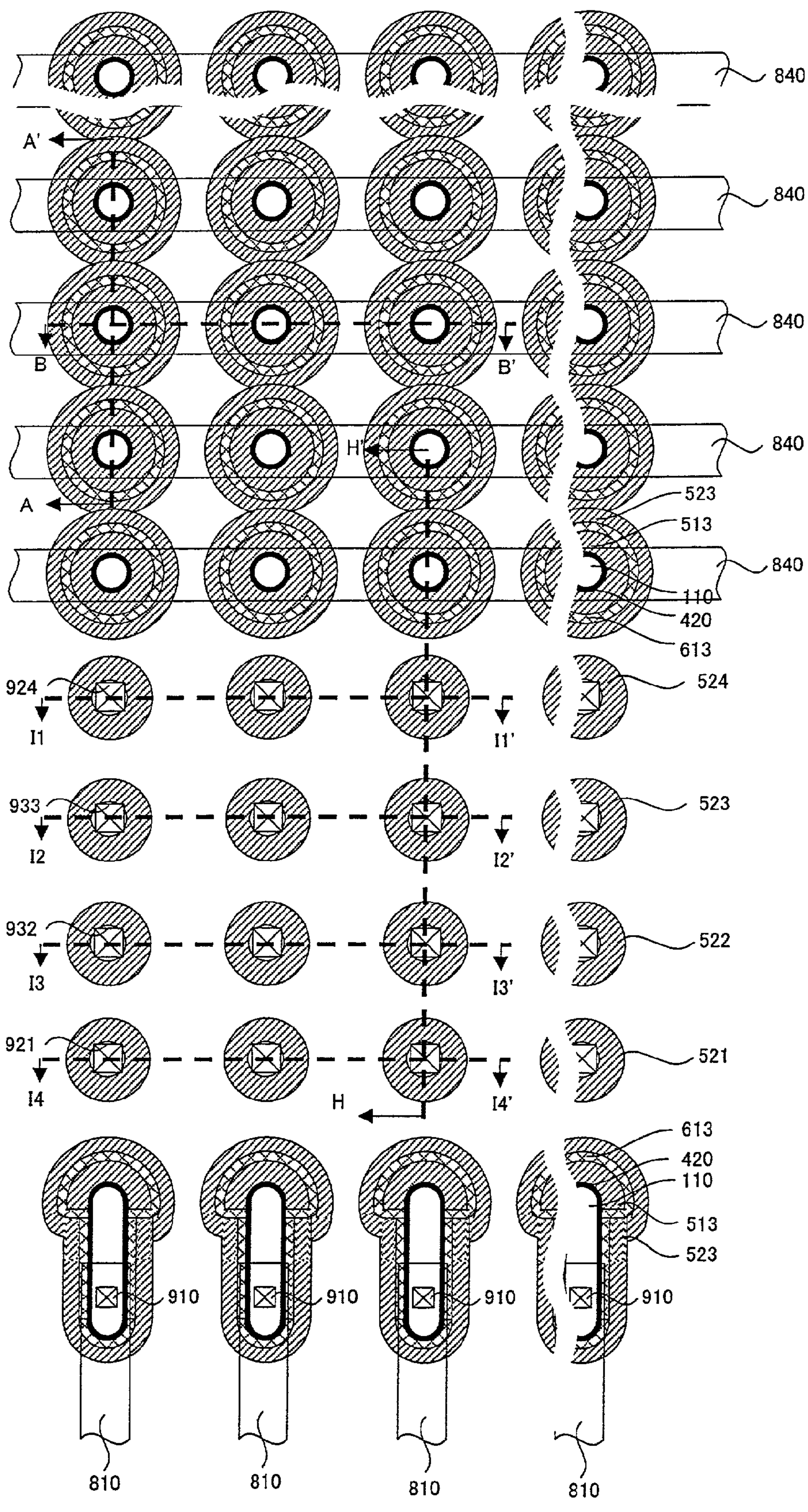
Figure 72:
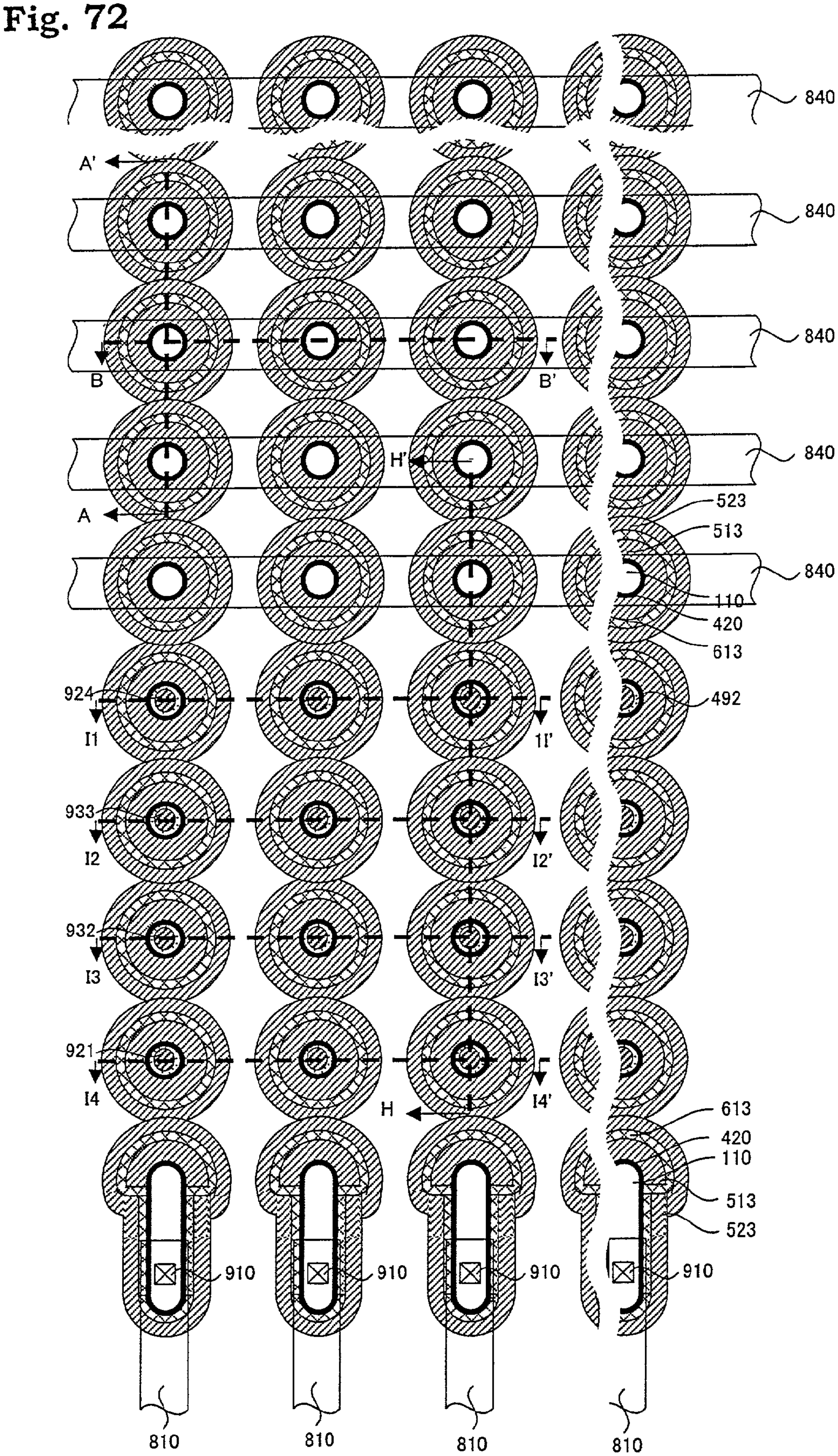

In FIG. 71, in contrast to FIG. 51, the top of the island-like semiconductor layers are not covered with the second conductive films connected to the second contacts 921 and 924 and the third contacts 932. Further, the first conductive films are removed, and the second conductive films are electrically connected to impurity diffusion layers formed in the island-like semiconductor layers. FIG. 71 also shows lines for sectional views, i.e., line H–H' and line I1–I1' to line I4–I4' to be used for explaining examples of production processes.

In FIG. 72, in contrast to FIG. 51, the top of the island-like semiconductor layers are not covered with the second conductive films connected to the second contacts 921 and 924 and the third contacts 932. The second contacts 921 and 924 and the third contacts 932 are formed in holes formed by removing the island-like semiconductor layers. FIG. 72 also shows lines for sectional views, i.e., line H–H' and line I1–I1' to line I5–I5' to be used for explaining examples of production processes.

In the above descriptions, the semiconductor memories having floating gates as charge storage layers with reference to their plan views, FIGS. 1 to 64 and FIGS. 68 to 72. However, the arrangements and structures shown in these figures may be combined in various ways.

In FIG. 65, in contrast to FIG. 1, there is shown an example in which laminated insulating films are used as the charge storage layers as in the MONOS structure. The example of FIG. 65 is the same as the example of FIG. 1, except that the charge storage layers are changed from the floating gates to the laminated insulating films. FIG. 65 also shows lines for sectional views, i.e., line A–A' and line B–B', to be used for explaining examples of production processes.

In FIG. 66, in contrast to FIG. 1, there is shown an example in which MIS capacitors are used as the charge storage layers as in the DRAM structure. The example of FIG. 65 is the same as the example of FIG. 1, except that the charge storage layers are changed from the floating gates to the MIS capacitors and the bit lines are in parallel to the source lines. FIG. 66 also shows lines for sectional views, i.e., line A–A' and line B–B', to be used for explaining examples of production processes.

FIG. 67, there is shown an example in which MIS transistors are used as the charge storage layers, for example, as in the SRAM structure. FIG. 67 shows a memory cell array in which island-like semiconductor layers in a columnar form for constituting memory cells are arranged to be located at points of intersection where a group of parallel lines and another group of parallel lines cross at right angles. First wiring layers of impurity diffusion layers 3721 for selecting and controlling the memory cells, third wiring layers of control gates 3514 and fourth wiring layers as bit lines are disposed in parallel to the surface of the substrate. Second wiring layers 3840 of second conductive films 3512 and third conductive films 3513 are arranged in two directions, i.e., in the directions vertical and horizontal to the surface of the substrate. The shape of the second, third and fourth wiring layers is not particularly limited so long as they are connected respectively. FIG. 67 also shows lines for sectional views, i.e., line J1–J1', line J2–J2', line K1–K1' and line K2–K2', to be used for explaining examples of production processes. In FIG. 67, are not shown first wiring layers 3710, first wiring layers 3850 and terminals for connecting with these wiring layers for avoiding complexity. For easy distinction of the island-like semiconductor layers 3110 from the wiring layers, the island-like semiconductor layers are shown in a circular form, but this is not limitative.

Embodiments of Memory Cell Arrays as Shown in Sectional Views

FIG. 73 to FIG. 100 show sectional views of semiconductor memories having floating gates as charge storage layers. Of FIG. 73 to FIG. 100, odd-numbered figures show sectional views taken on line A–A' in FIG. 1 and even-numbered figures show sectional views taken on line B–B' in FIG. 1.

Figure 73:
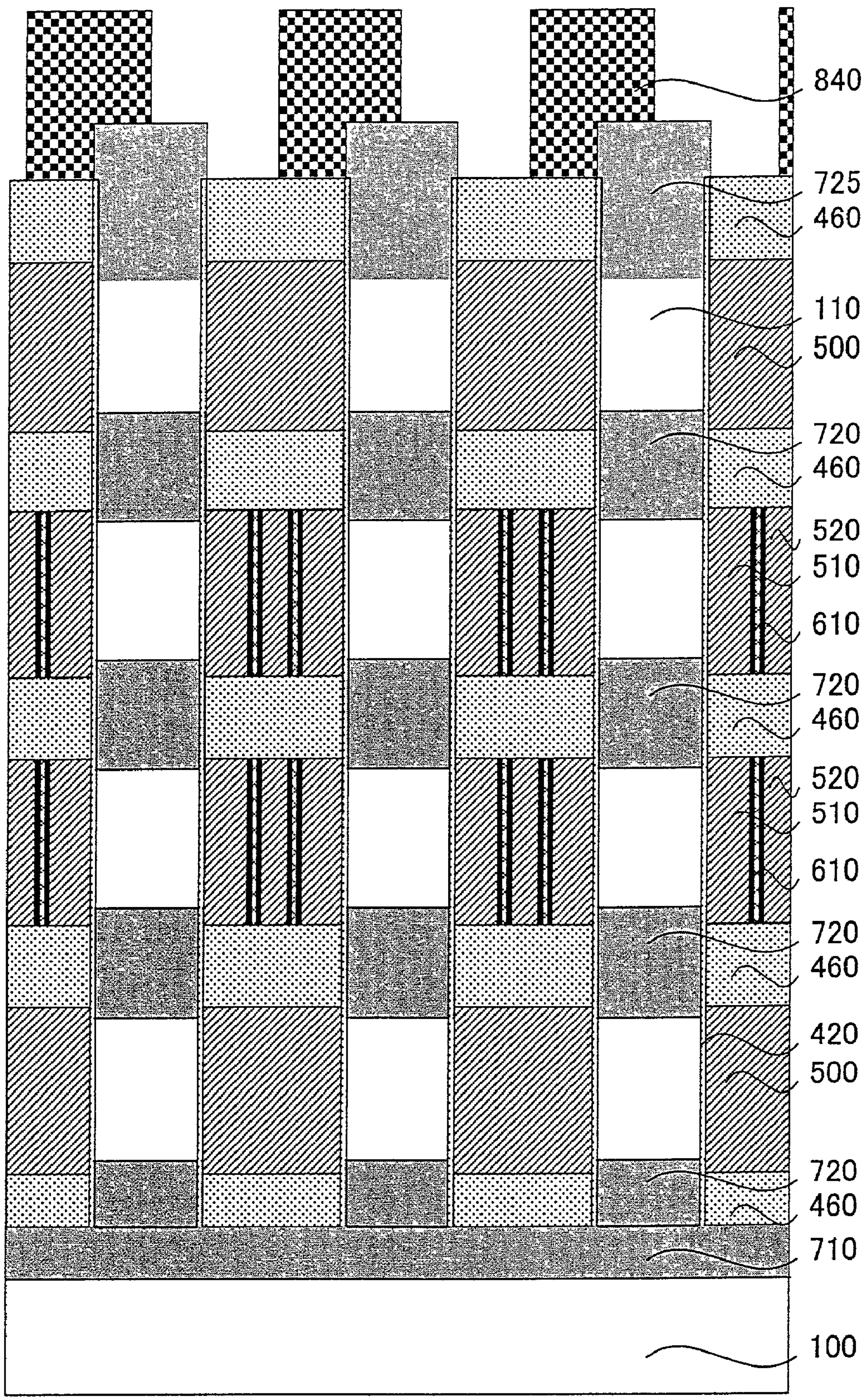
FIG. 73 is a sectional view of a semiconductor memory having floating gates as charge storage layers, corresponding to a sectional view as taken on line A–A' in FIG. 1.

In these embodiments, a plurality of island-like semiconductor layers 110 are formed in matrix on a P-type silicon substrate 100. Transistors having a second or fifth electrode as a selection gate are disposed in an upper part and in a lower part of each island-like semiconductor layer 110. Between these selection gate transistors, a plurality of memory transistors, e.g., two memory transistors, are disposed. The transistors are connected in series along each island-like semiconductor layer. More particularly, a silicon oxide film 460 having a predetermined thickness is formed as an eighth insulating film at the bottom of trenches between the island-like semiconductor layers. The second electrode 500 functioning as the selection gate is formed on a sidewall of the island-like semiconductor layer with intervention of a gate insulating film, so as to surround the island-like semiconductor layer. Thus a selection gate transistor is formed. A floating gate 510 is formed on the sidewall of the island-like semiconductor layer above the selection gate transistor with intervention of a tunnel oxide film 420, so as to surround the island-like semiconductor layer. Outside the floating gate 510, a control gate 520 is formed with intervention of an interlayer insulating film 610 of a multi-layered film. Thus a memory transistor is formed. A plurality of memory transistors are formed in the same manner, and above them, is formed a transistor having the fifth electrode 500 as the selection gate in the same manner as described above. As shown in FIG. 1 and FIG. 73, the selection gate 500 and the control gate 520 are provided continuously along a plurality of transistors in one direction to form a selection gate line which is a second or fifth wiring and a control gate line which is a third wiring.

A source diffusion layer 710 is formed on the semiconductor substrate so that the active regions of memory cells are in a floating state with respect to the semiconductor substrate. Further, diffusion layers 720 are formed so that the active region of each memory cell is in the floating state. Drain diffusion layers 725 for the memory cells are formed on the tops of the respective island-like semiconductor layers 110. Oxide films 460 are formed as eighth insulating films between the thus arranged memory cells in such a manner that the tops of the drain diffusion layers 725 are exposed. Al wirings 840 are provided as bit lines to connect drain diffusion layers 725 for memory cells in a direction crossing the control gate lines. Preferably, the diffusion layers 720 have an impurity concentration distribution such that the impurity concentration gradually decreases from the surface of the island-like semiconductor layers 110 to the inside thereof rather than a uniform impurity concentration distribution. Such an impurity concentration distribution may be obtained, for example, by a thermal diffusion process after an impurity is introduced into the island-like semiconductor layers 110. Thereby, the junction breakdown voltage between the diffusion layers 720 and the island-like semiconductor layers 110 improves and the parasitic capacity decreases. It is also preferably that the source diffusion layer 710 have an impurity concentration distribution such that the impurity concentration gradually decreases from the surface of the semiconductor substrate 100 to the inside thereof. Thereby, the junction breakdown voltage between the source diffusion layer 710 and the semiconductor substrate 100 improves and the parasitic capacity decreases in the first wiring layer.

Figure 74:
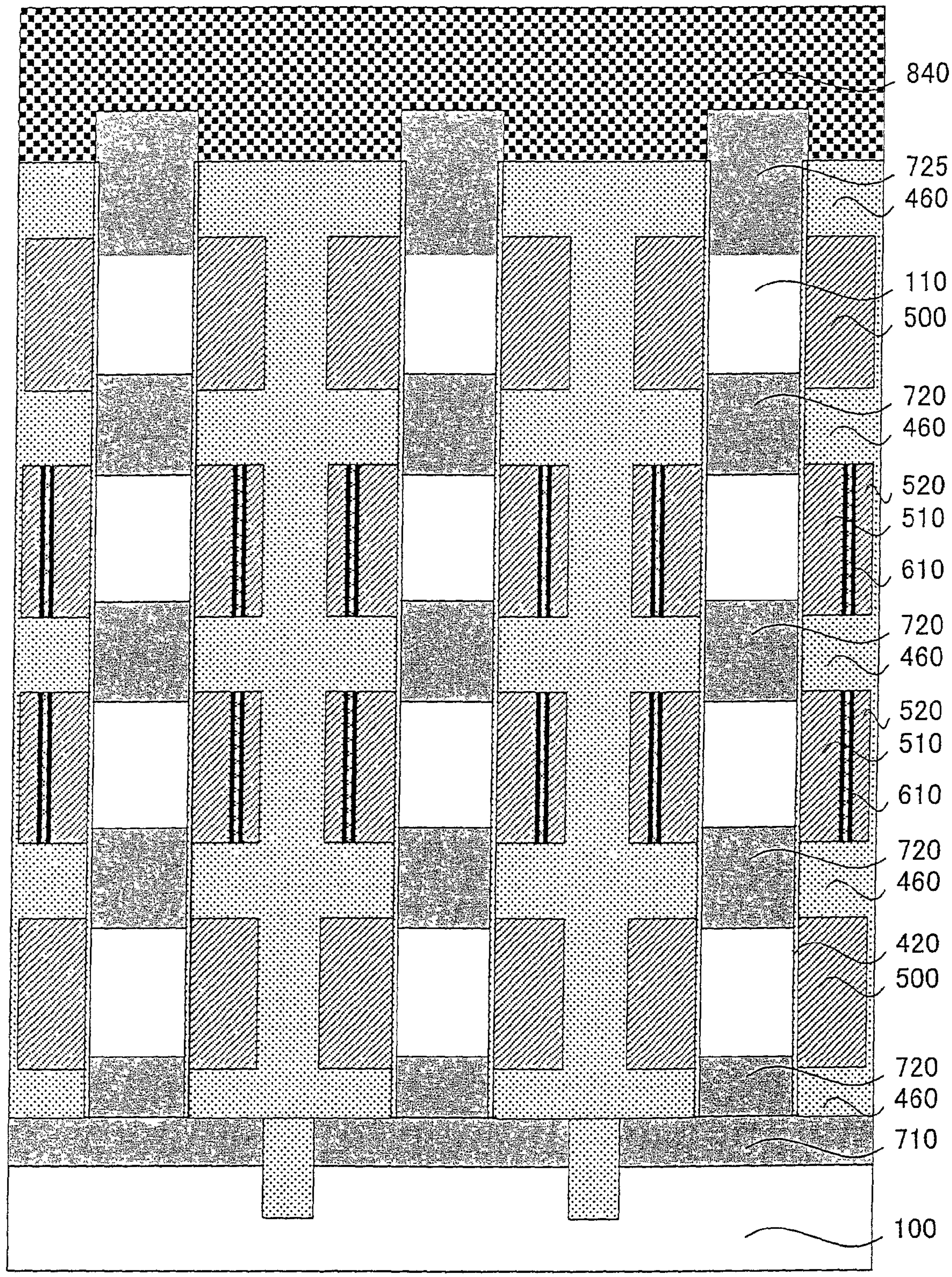
FIG. 74 is a sectional view of another semiconductor memory having floating gates as charge storage layers, corresponding to a sectional view as taken on line B–B' in FIG.

FIG. 73 and FIG. 74 show an example in which the thickness of the gate insulating film of the selection gate transistors is equal to that of the gate insulating film of the memory transistors.

Figure 75:
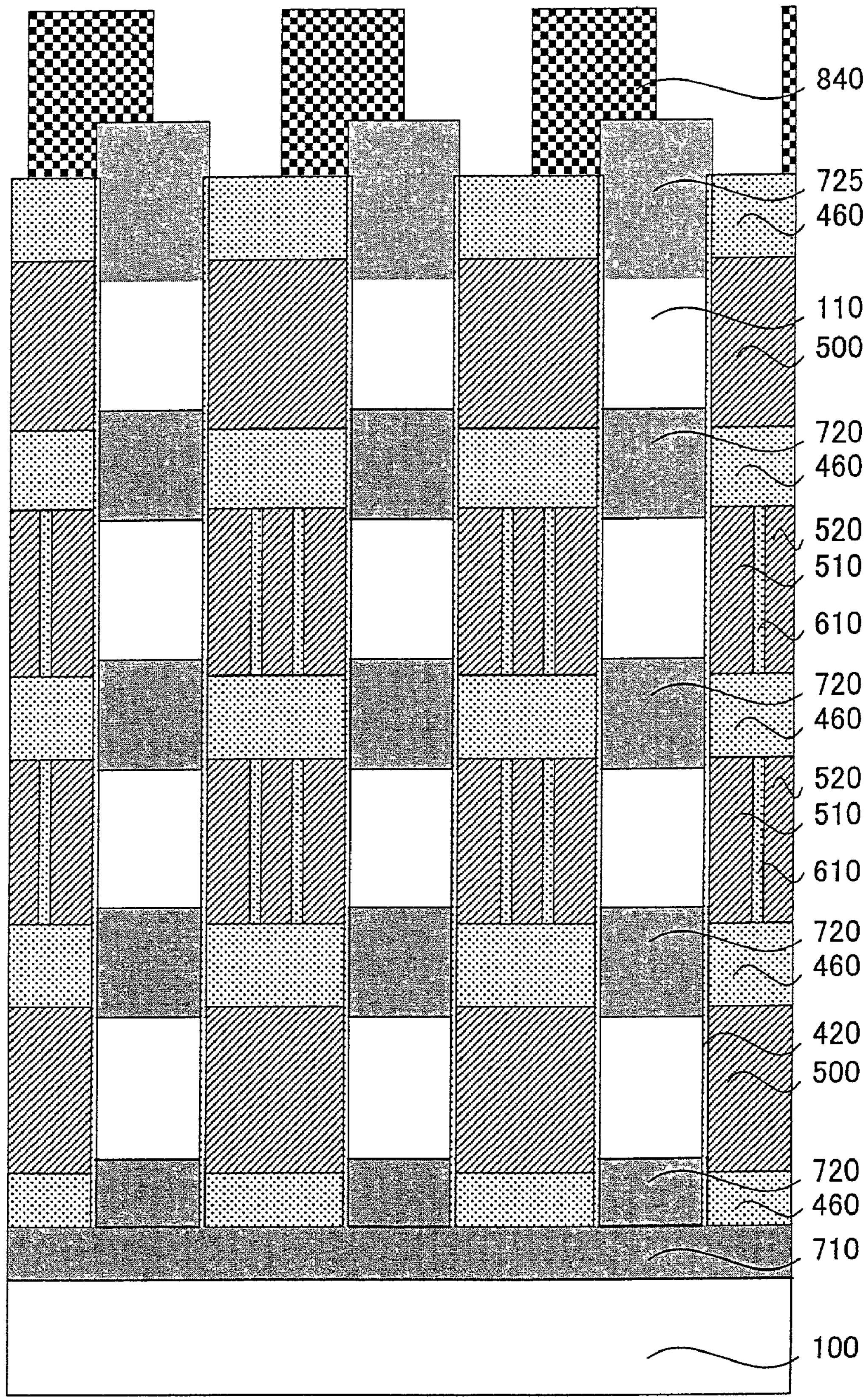
FIG. 75 is a sectional view of a semiconductor memory having floating gates as charge storage layers, corresponding to a sectional view as taken on line A–A' in FIG. 1.
Figure 76:
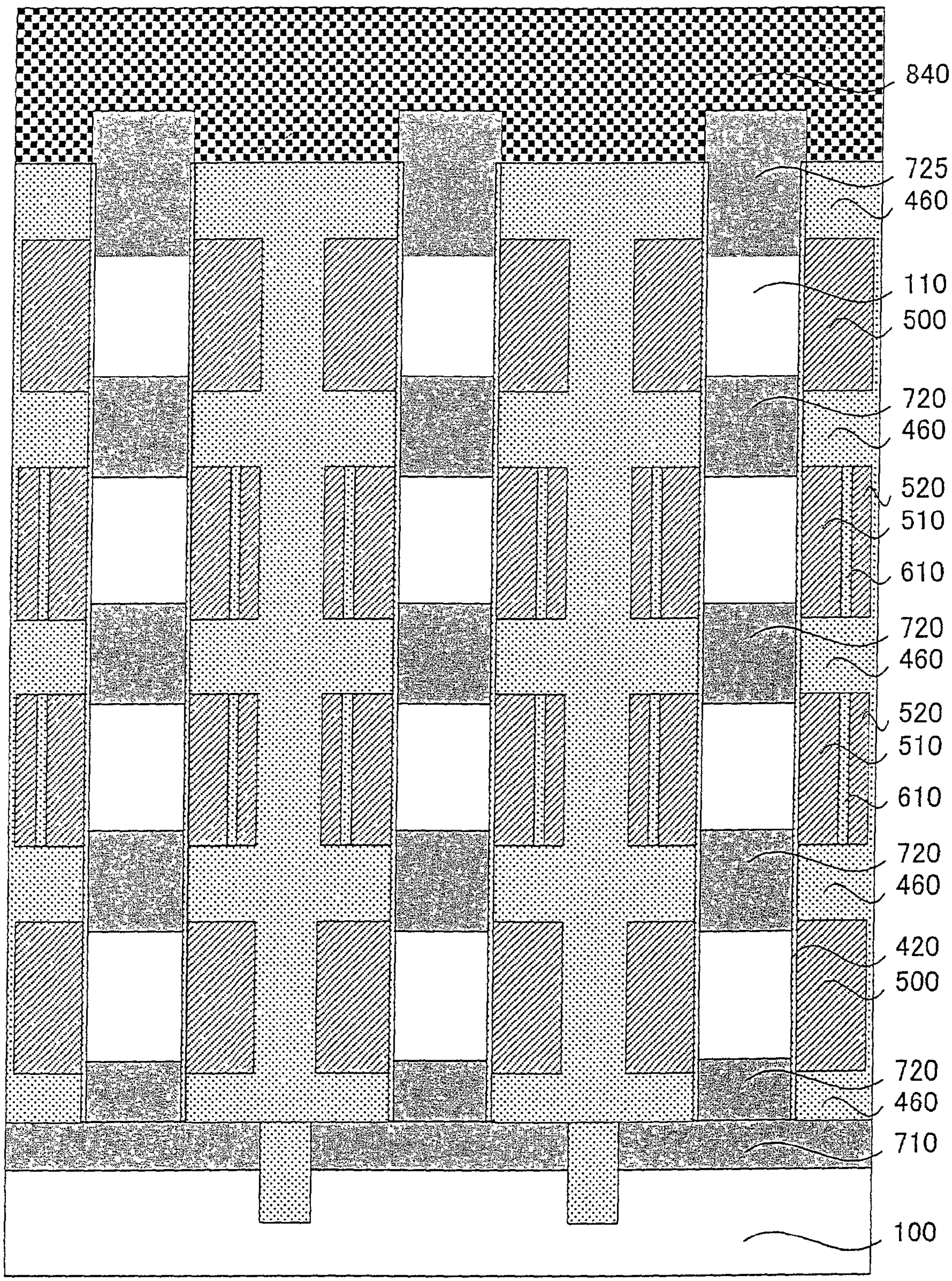
FIG. 76 is a sectional view of a semiconductor memory having floating gates as charge storage layers, corresponding to a sectional view as taken on line B–B' in FIG. 1.

In an example shown in FIG. 75 and FIG. 76, in contrast to FIG. 73 and FIG. 74, the interlayer insulating film 610 is formed of a single layer film.

Figure 77:
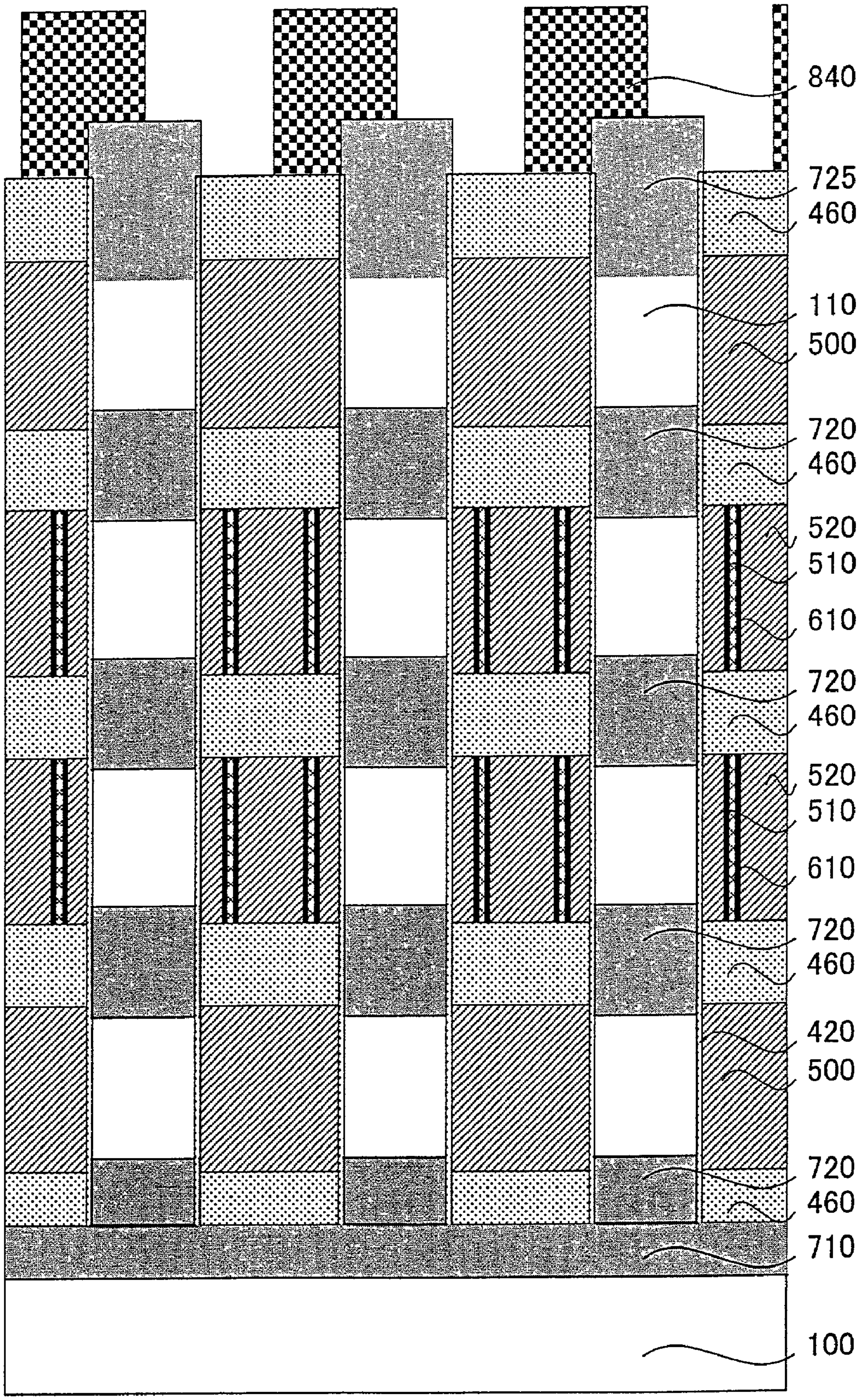
FIG. 77 is a sectional view of a semiconductor memory having floating gates as charge storage layers, corresponding to a sectional view as taken on line A–A' in FIG. 1.
Figure 78:
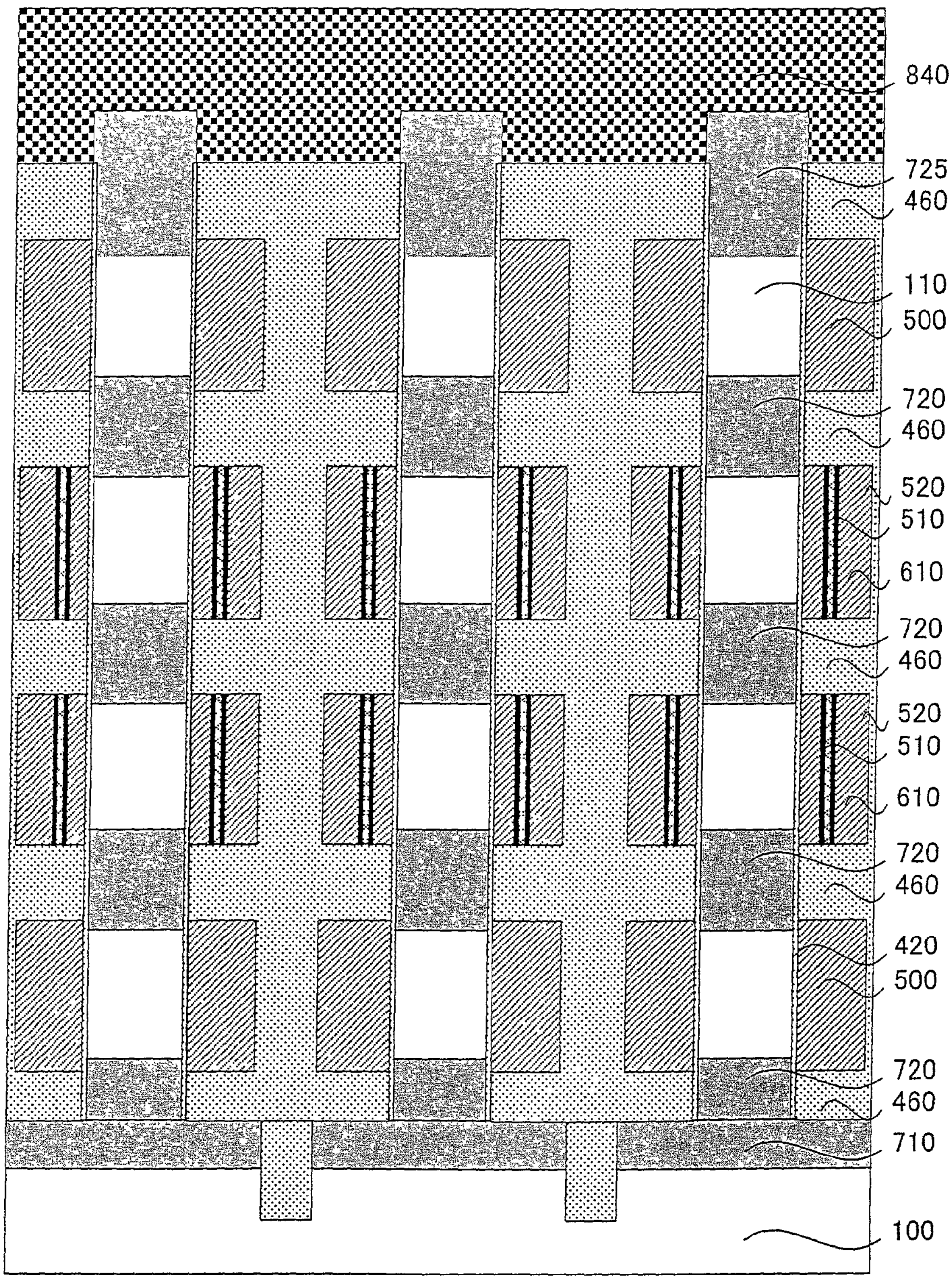
FIG. 78 is a sectional view of a semiconductor memory having floating gates as charge storage layers, corresponding to a sectional view as taken on line B–B' in FIG. 1.

In an example shown in FIG. 77 and FIG. 78, in contrast to FIG. 73 and FIG. 74, in the memory cell, the thickness of the control gate 520 is larger than the thickness of floating gate 510 so that the resistance of the third wiring layer can be easily reduced.

Figure 79:
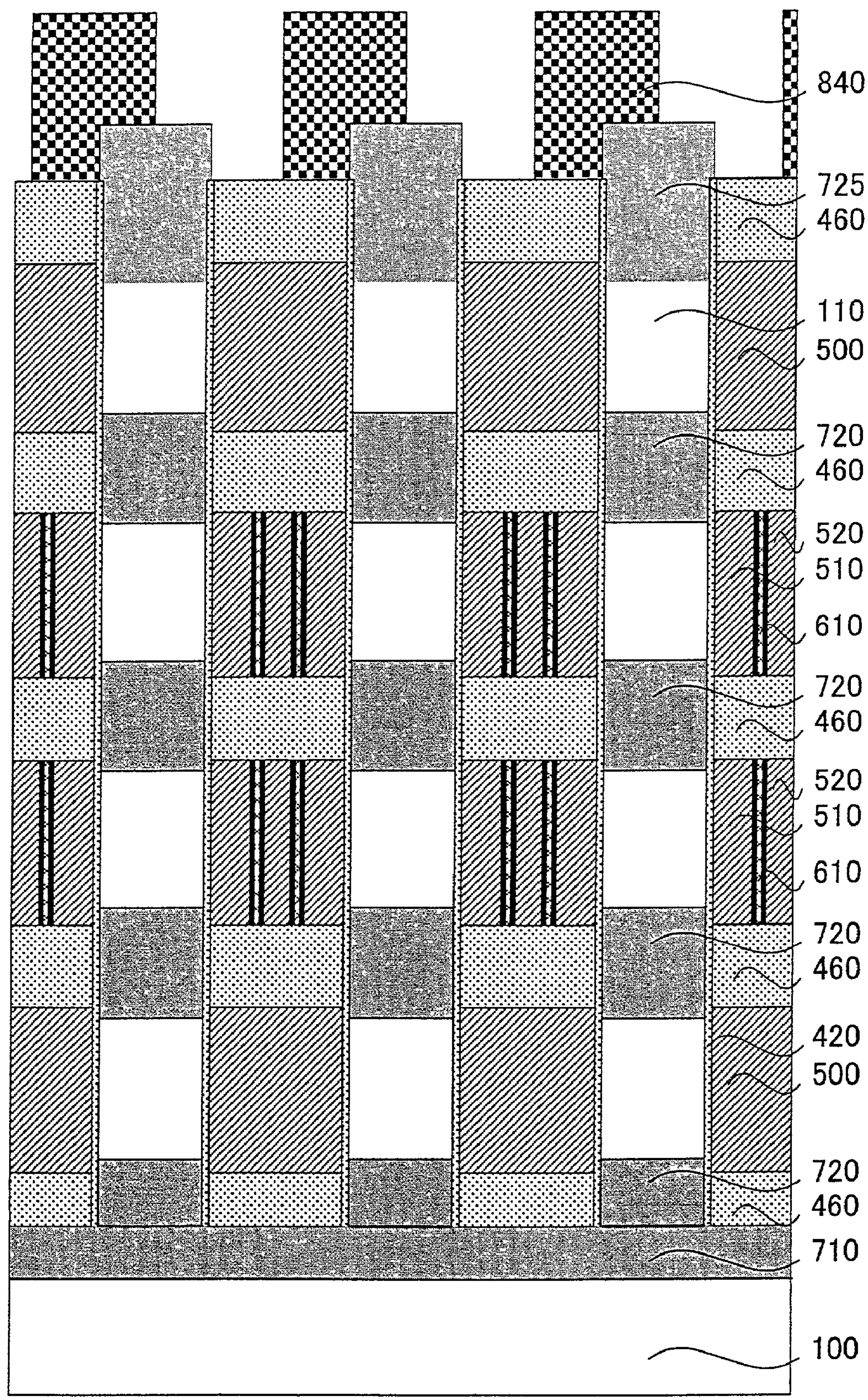
FIG. 79 is a sectional view of a semiconductor memory having floating gates as charge storage layers, corresponding to a sectional view as taken on line A–A' in FIG. 1.
Figure 80:
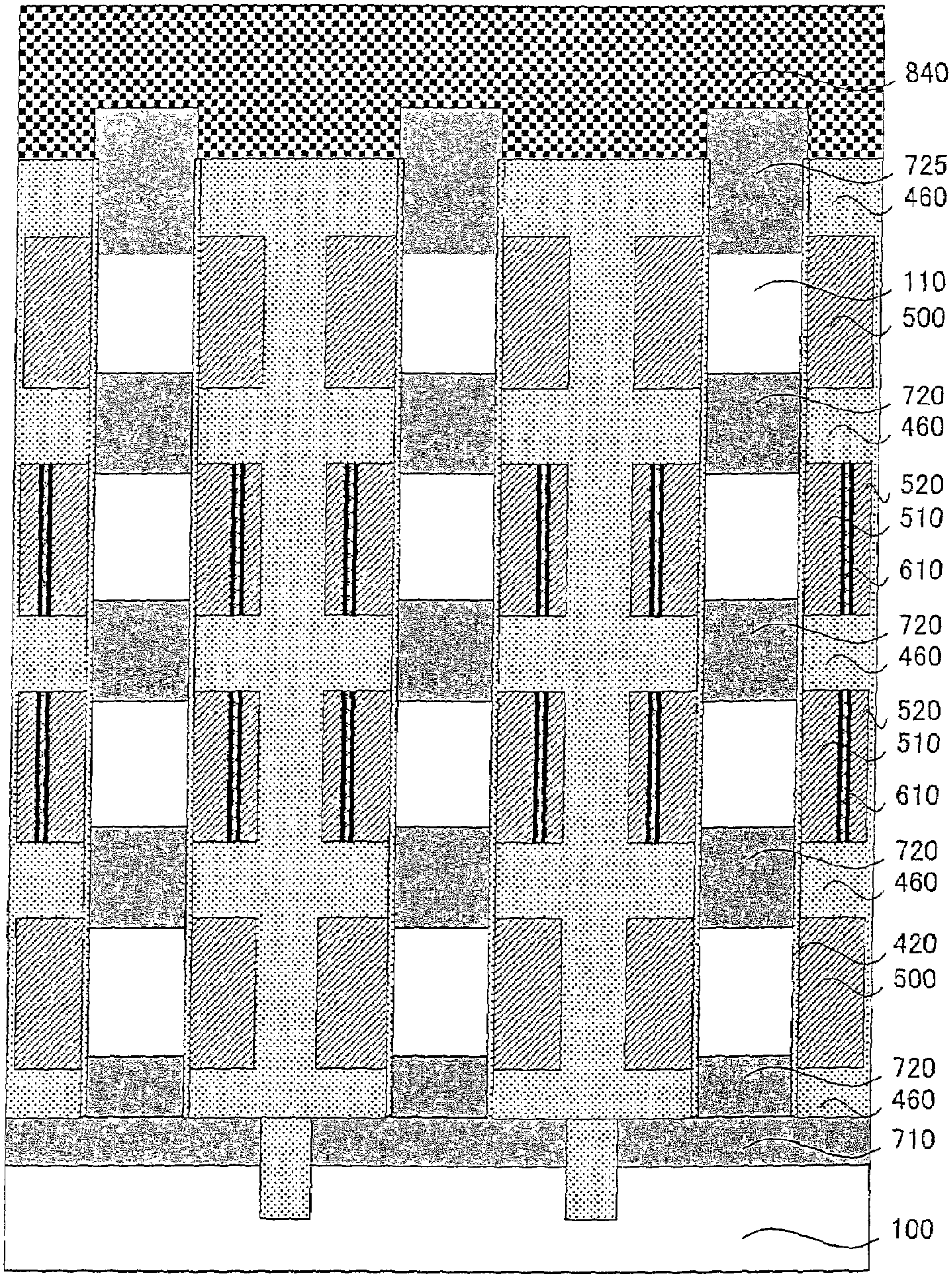
FIG. 80 is a sectional view of a semiconductor memory having floating gates as charge storage layers, corresponding to a sectional view as taken on line B–B' in FIG. 1.

In an example shown in FIG. 79 and FIG. 80, in contrast to FIG. 73 and FIG. 74, the surface of the tunnel oxide 420 is positioned outside the periphery of the island-like semiconductor layer 110.

Figure 81:
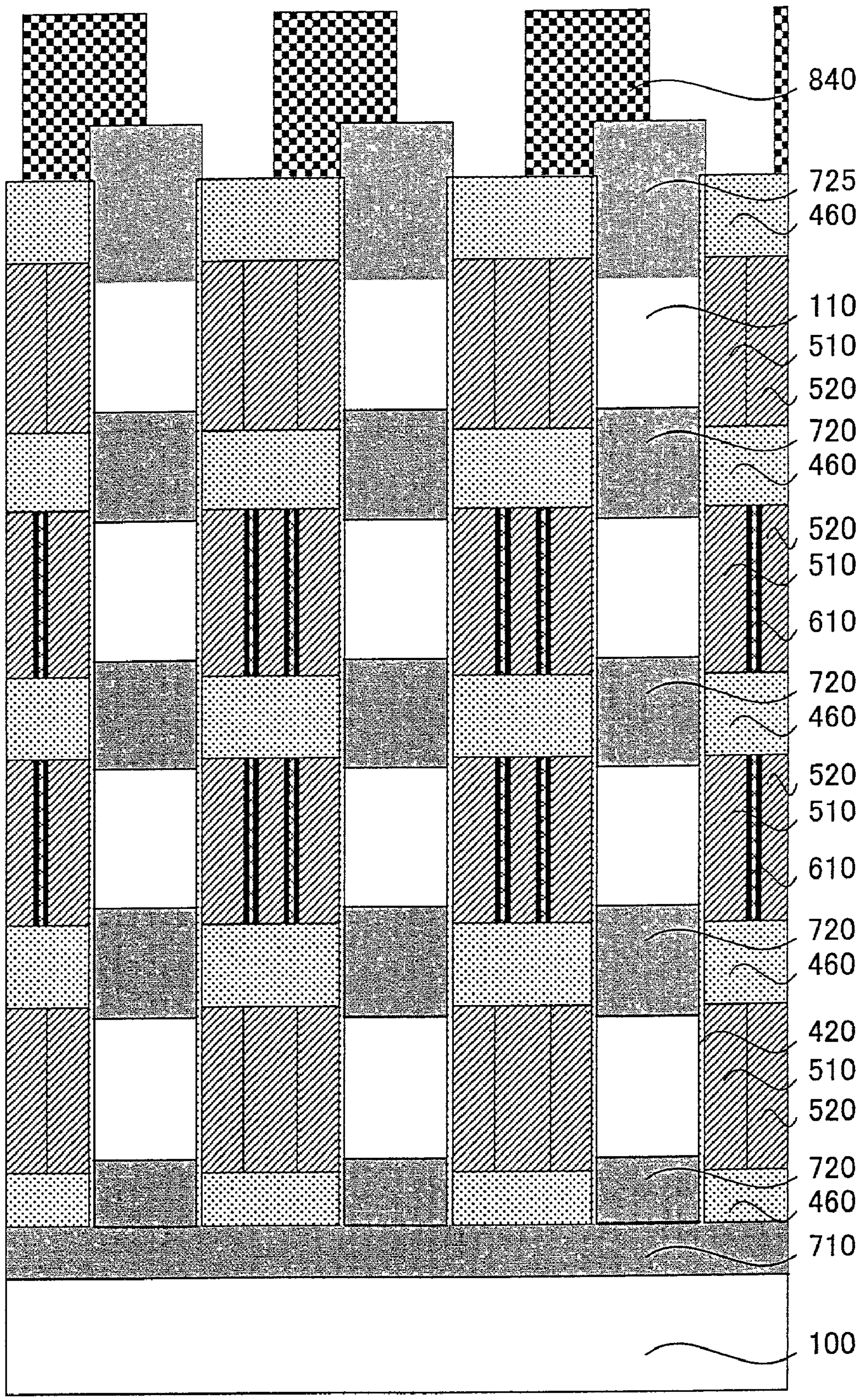
FIG. 81 is a sectional view of a semiconductor memory having floating gates as charge storage layers, corresponding to a sectional view as taken on line A–A' in FIG. 1.
Figure 82:
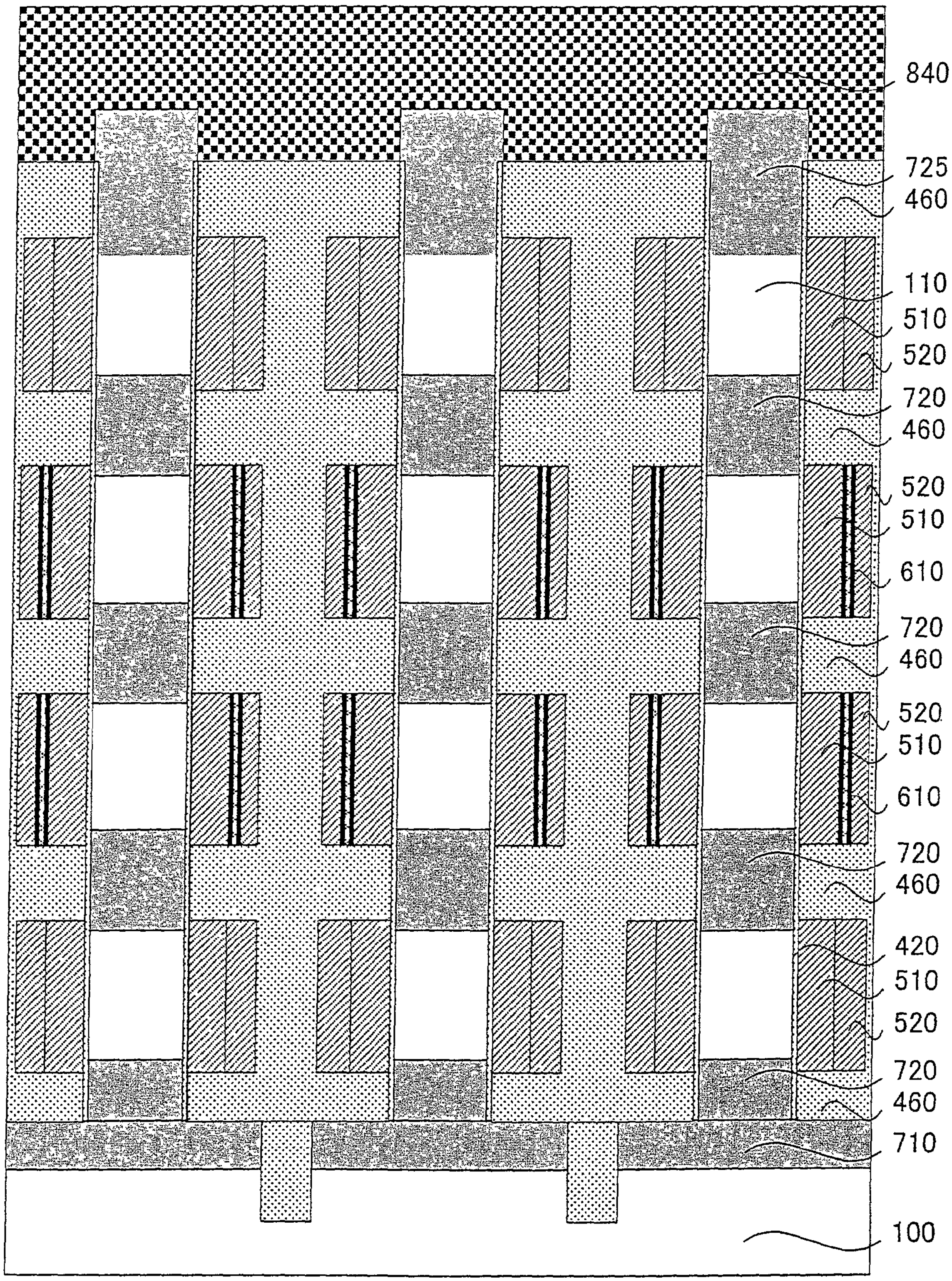
FIG. 82 is a sectional view of a semiconductor memory having floating gates as charge storage layers, corresponding to a sectional view as taken on line B–B' in FIG. 1.

In an example shown in FIG. 81 and FIG. 82, in contrast to FIG. 73 and FIG. 74, the gate of the selection gate transistor is formed not by a single deposition of a conductive film but by a plurality of, i.e., two, depositions of the conductive film.

Figure 83:
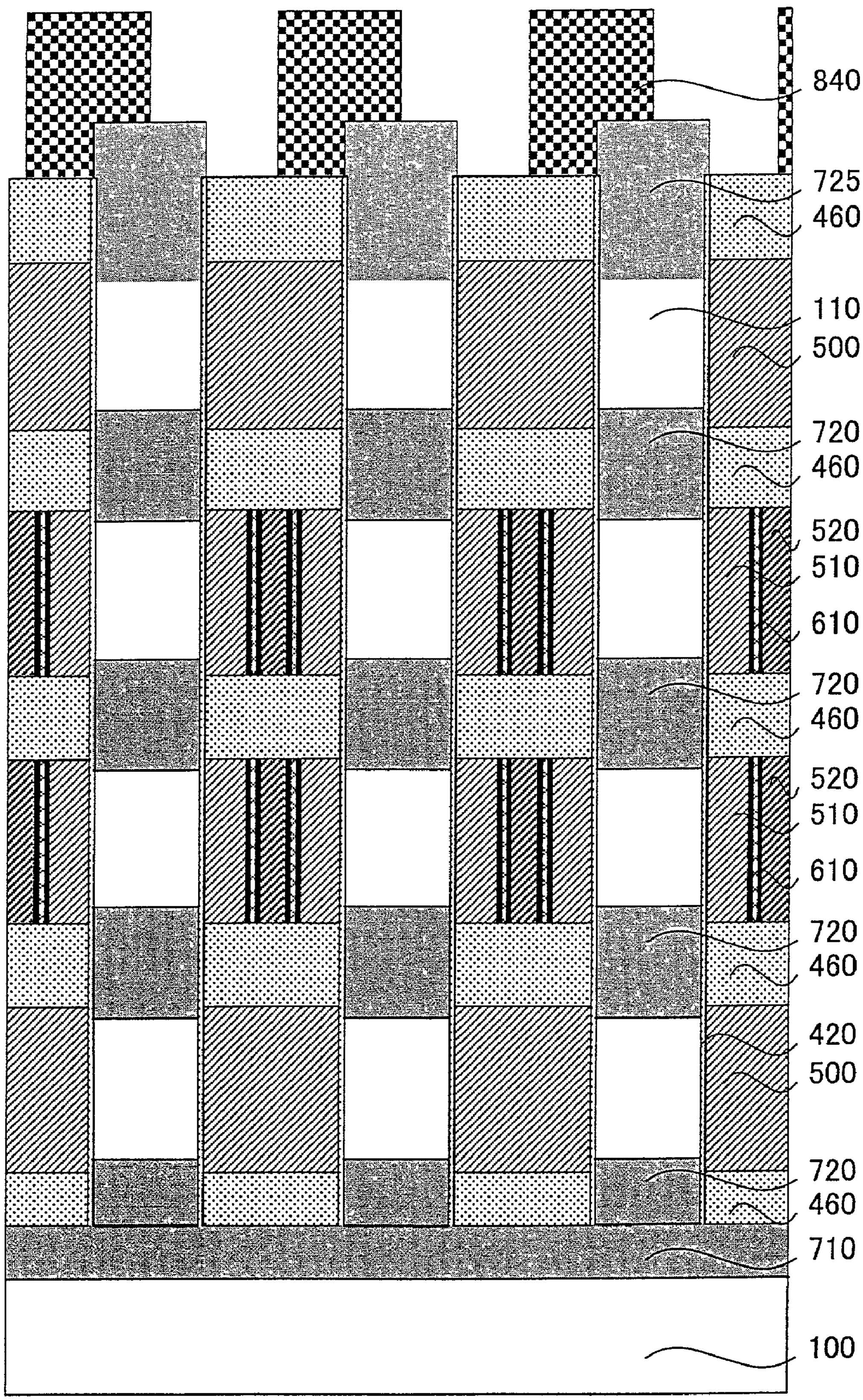
FIG. 83 is a sectional view of a semiconductor memory having floating gates as charge storage layers, corresponding to a sectional view as taken on line A–A' in FIG. 1.
Figure 84:
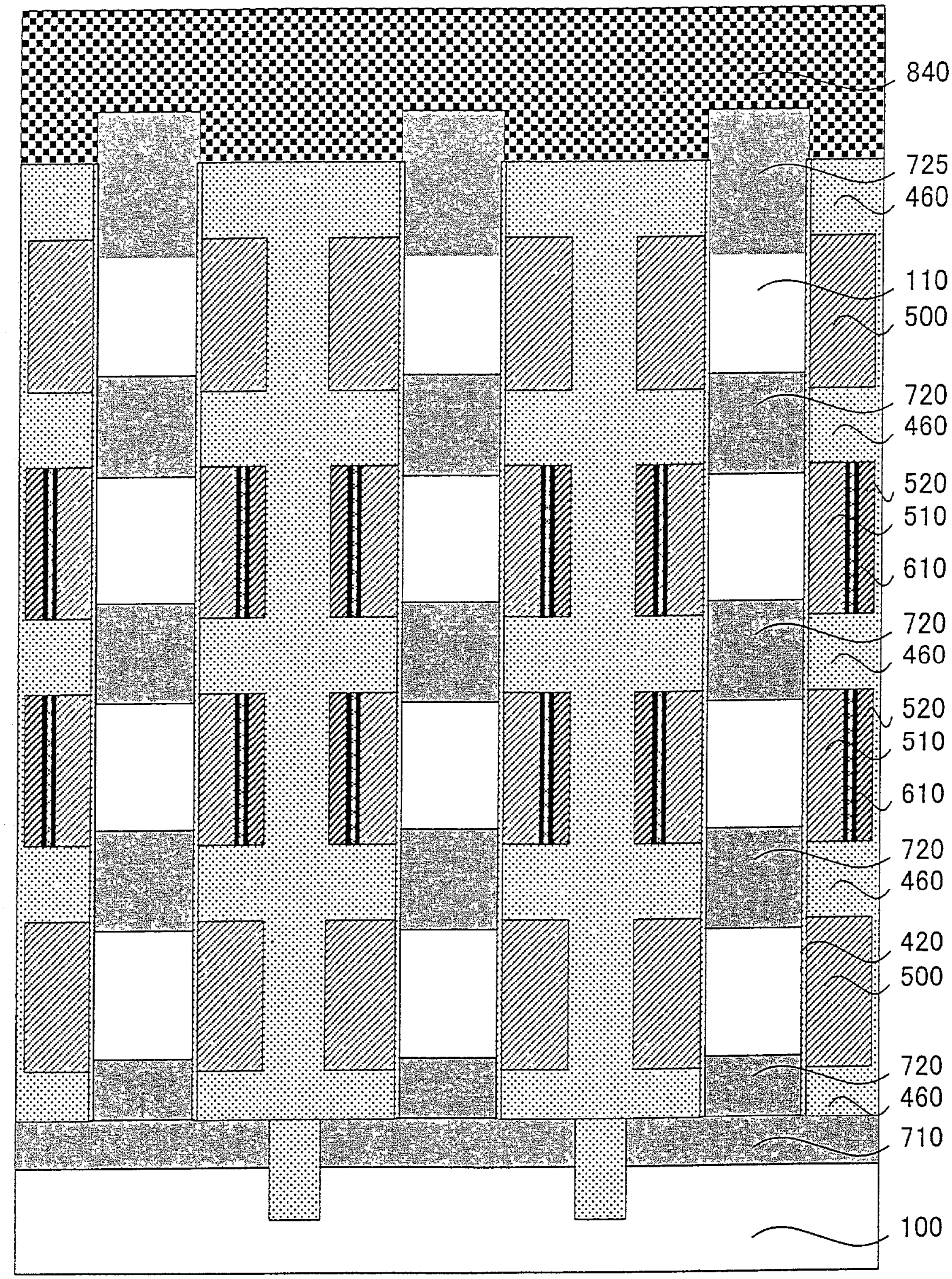
FIG. 84 is a sectional view of a semiconductor memory having floating gates as charge storage layers, corresponding to a sectional view as taken on line B–B' in FIG. 1.

In an example shown in FIG. 83 and FIG. 84, in contrast to FIG. 73 and FIG. 74, the control gate 520 and the floating gate 510 of the memory cell are formed of different materials.

Figure 85:
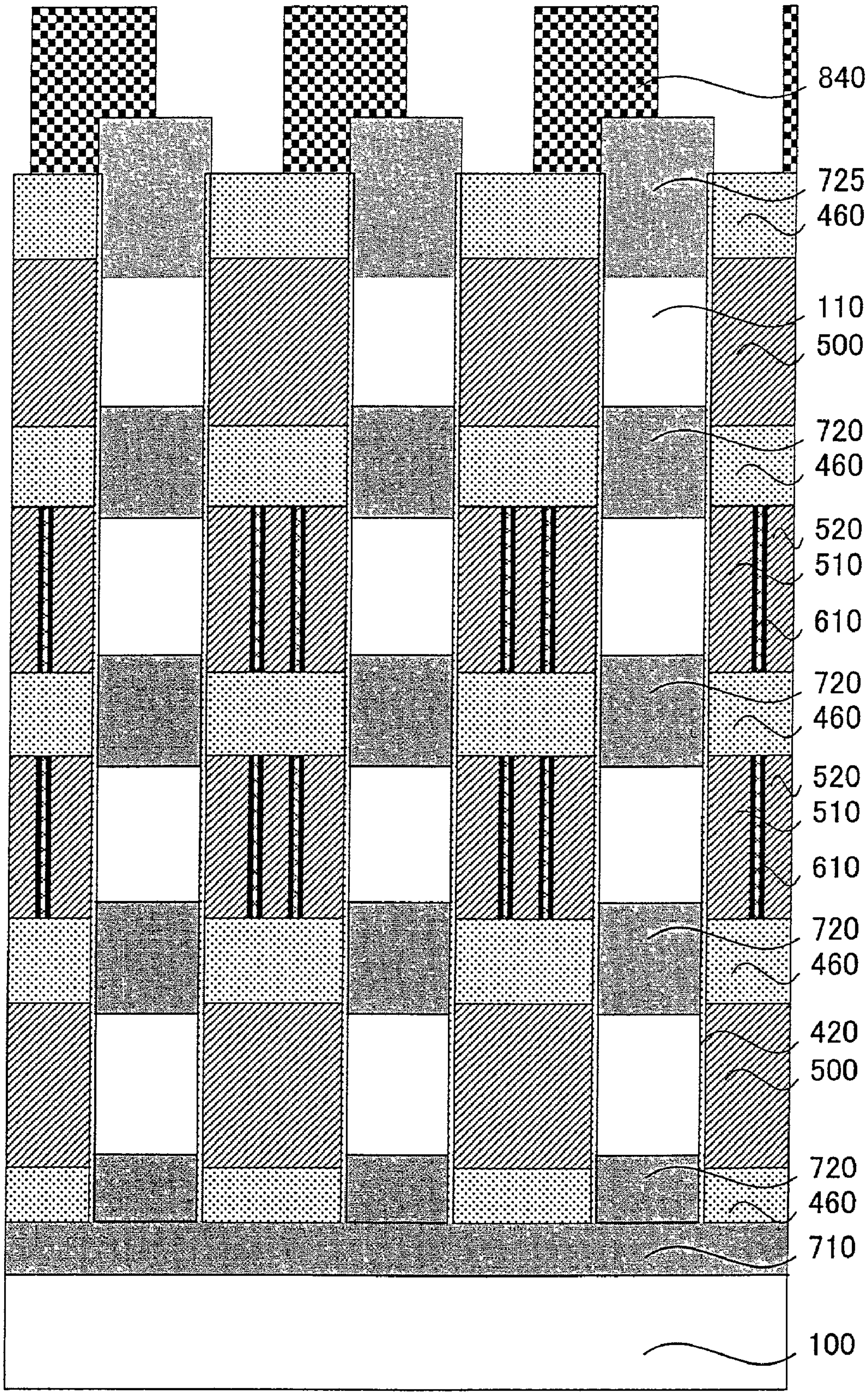
FIG. 85 is a sectional view of a semiconductor memory having floating gates as charge storage layers, corresponding to a sectional view as taken on line A–A' in FIG. 1.
Figure 86:
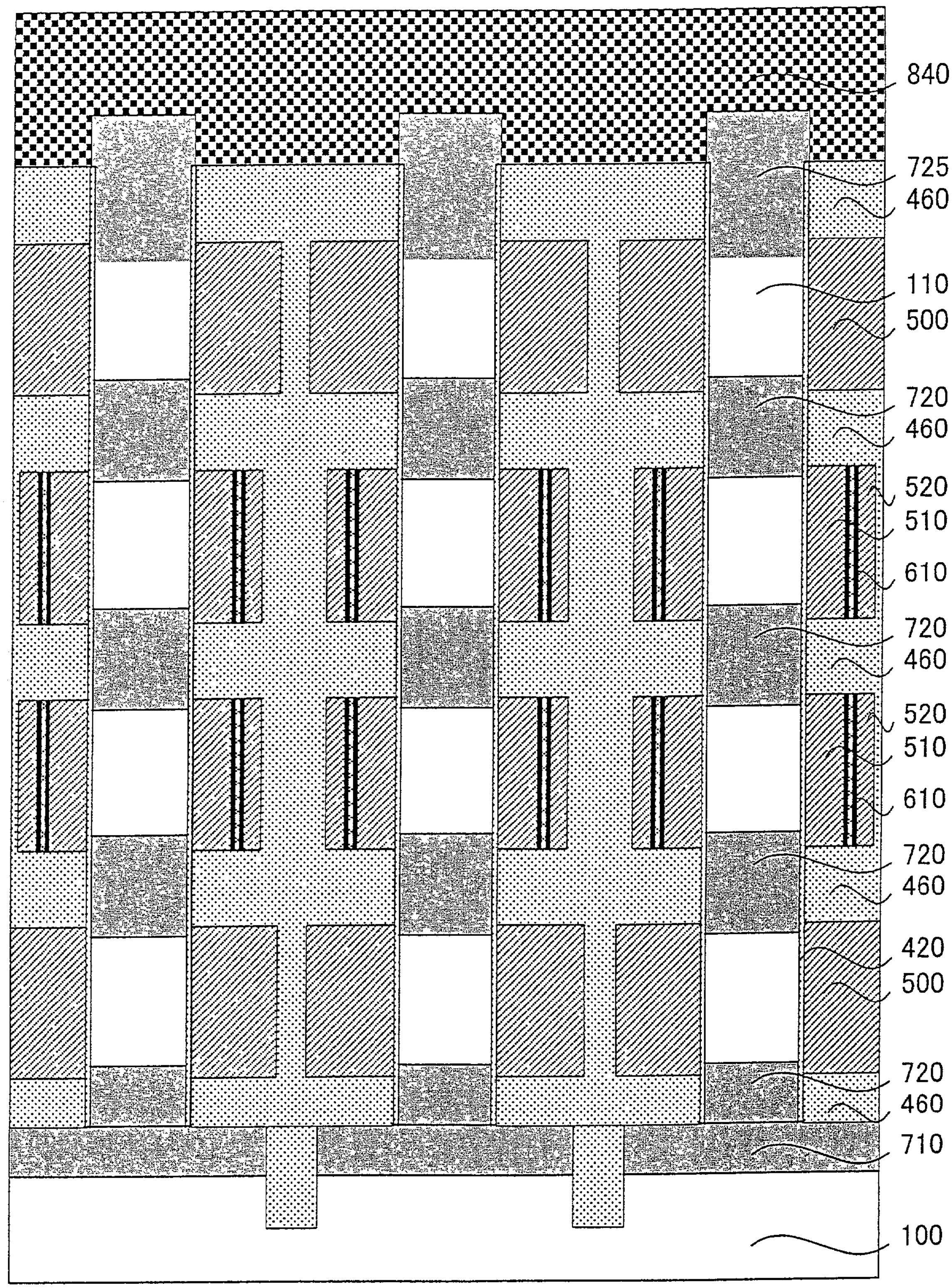
FIG. 86 is a sectional view of a semiconductor memory having floating gates as charge storage layers, corresponding to a sectional view as taken on line B–B' in FIG. 1.

In an example shown in FIG. 85 and FIG. 86, in contrast to FIG. 73 and FIG. 74, the control gate 520 of the memory cell and the gate 500 of the selection gate transistor have different outer circumferences.

Figure 87:
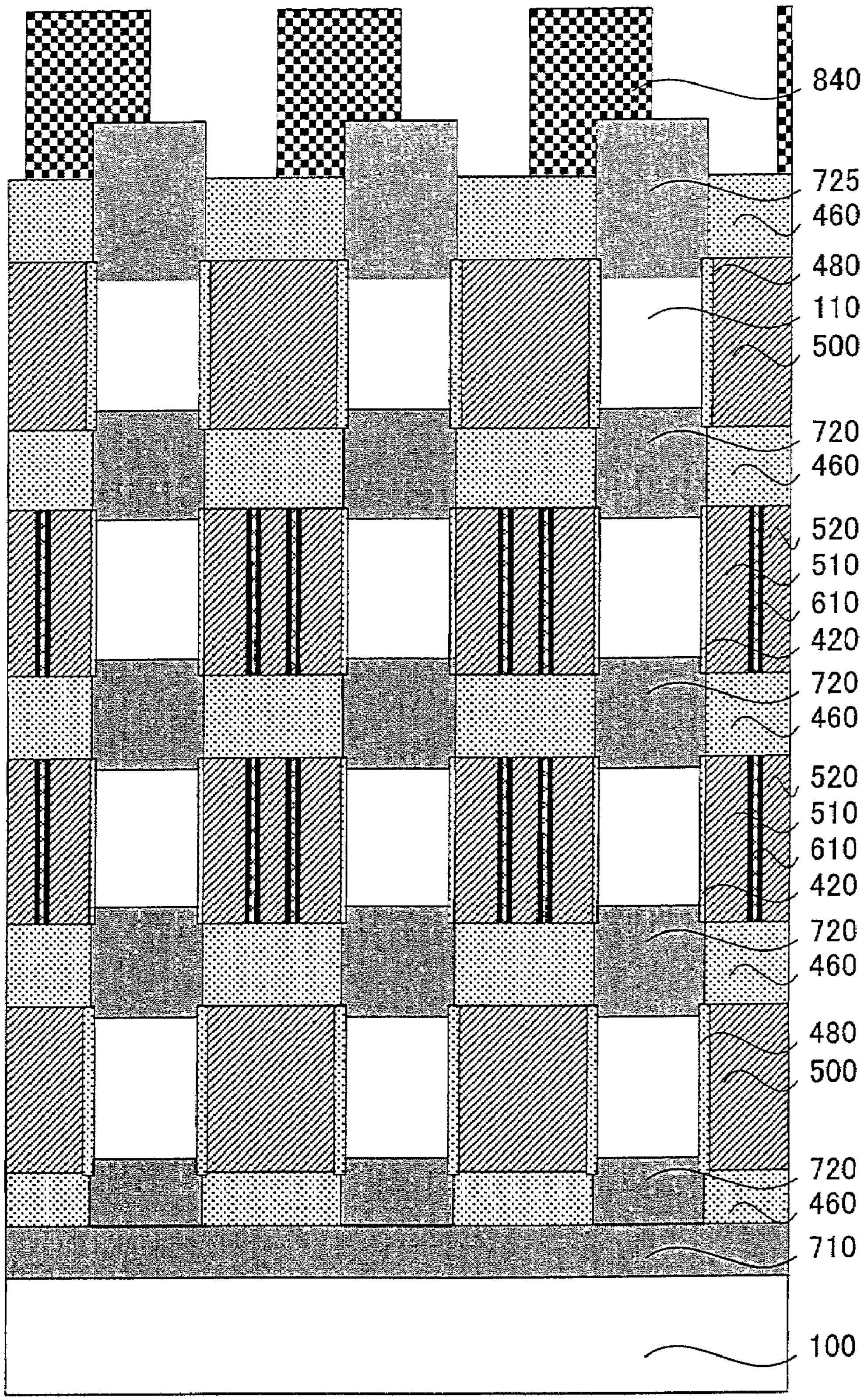
FIG. 87 is a sectional view of a semiconductor memory having floating gates as charge storage layers, corresponding to a sectional view as taken on line A–A' in FIG. 1.
Figure 88:
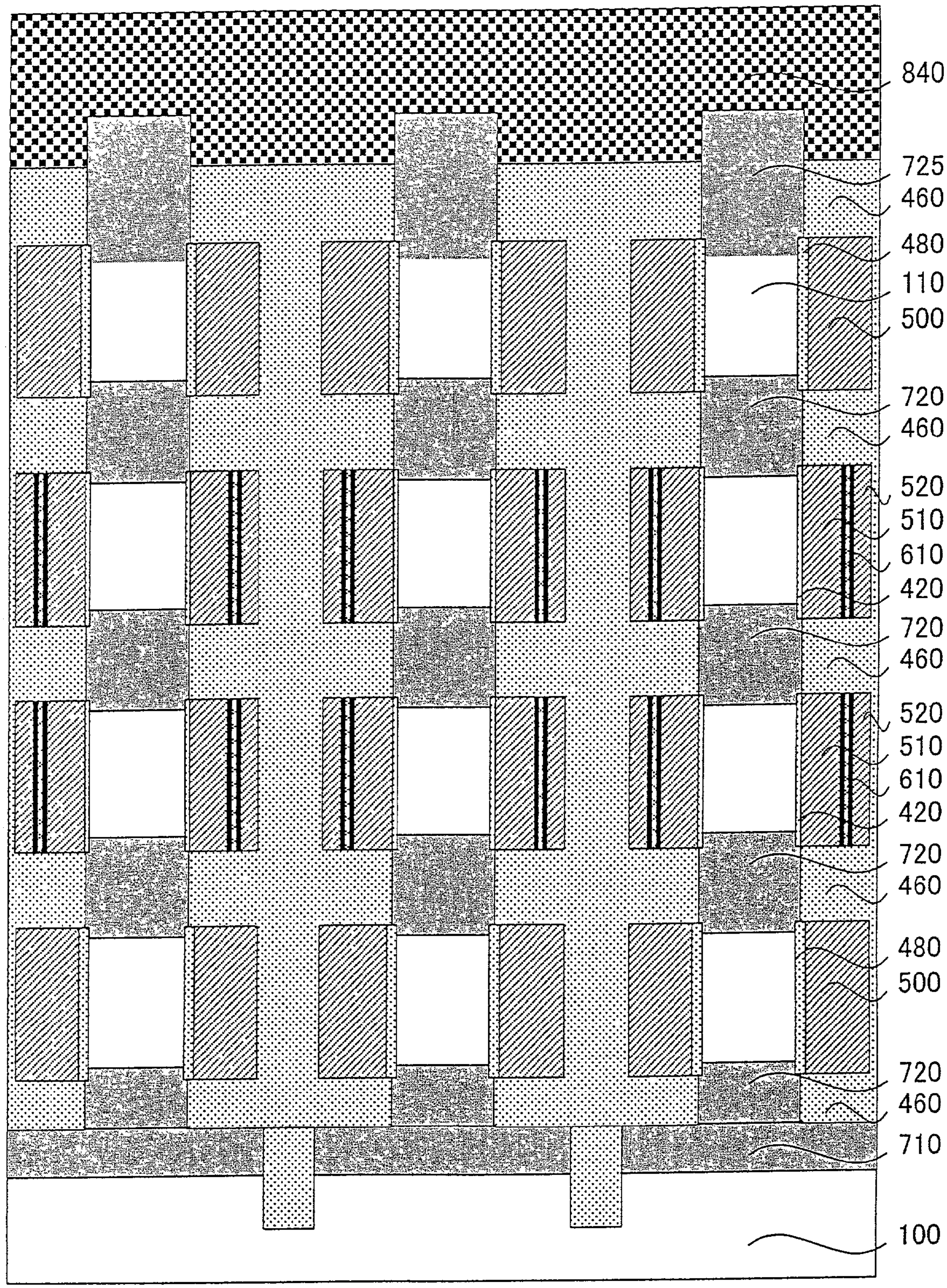
FIG. 88 is a sectional view of a semiconductor memory having floating gates as charge storage layers, corresponding to a sectional view as taken on line B–B' in FIG. 1.

In the example of FIG. 87 and FIG. 88, the thickness of the gate insulating film of the selection gate transistor is larger than that of the gate insulating film of the memory transistor.

Figure 89:
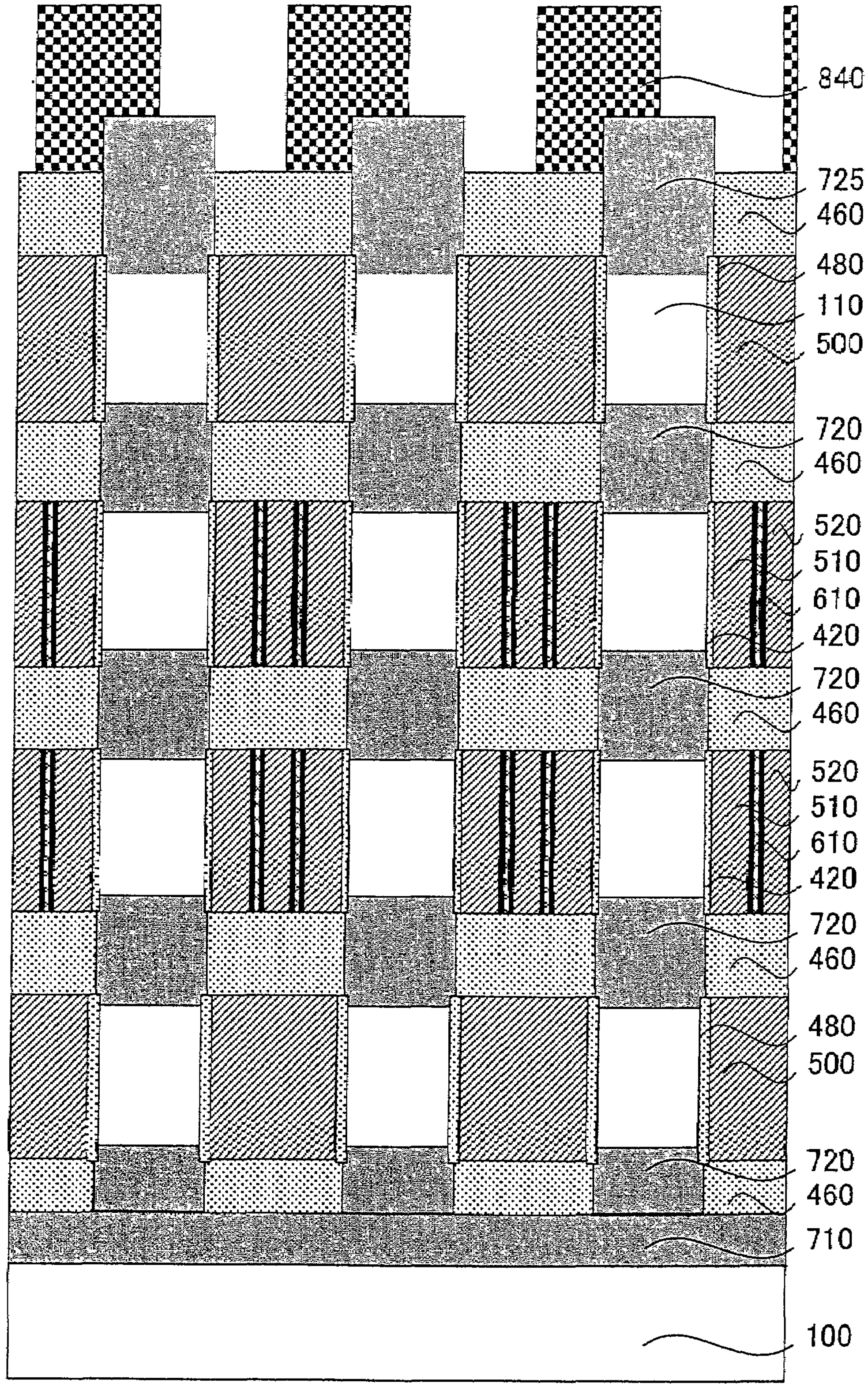
FIG. 89 is a sectional view of a semiconductor memory having floating gates as charge storage layers, corresponding to a sectional view as taken on line A–A' in FIG. 1.
Figure 90:
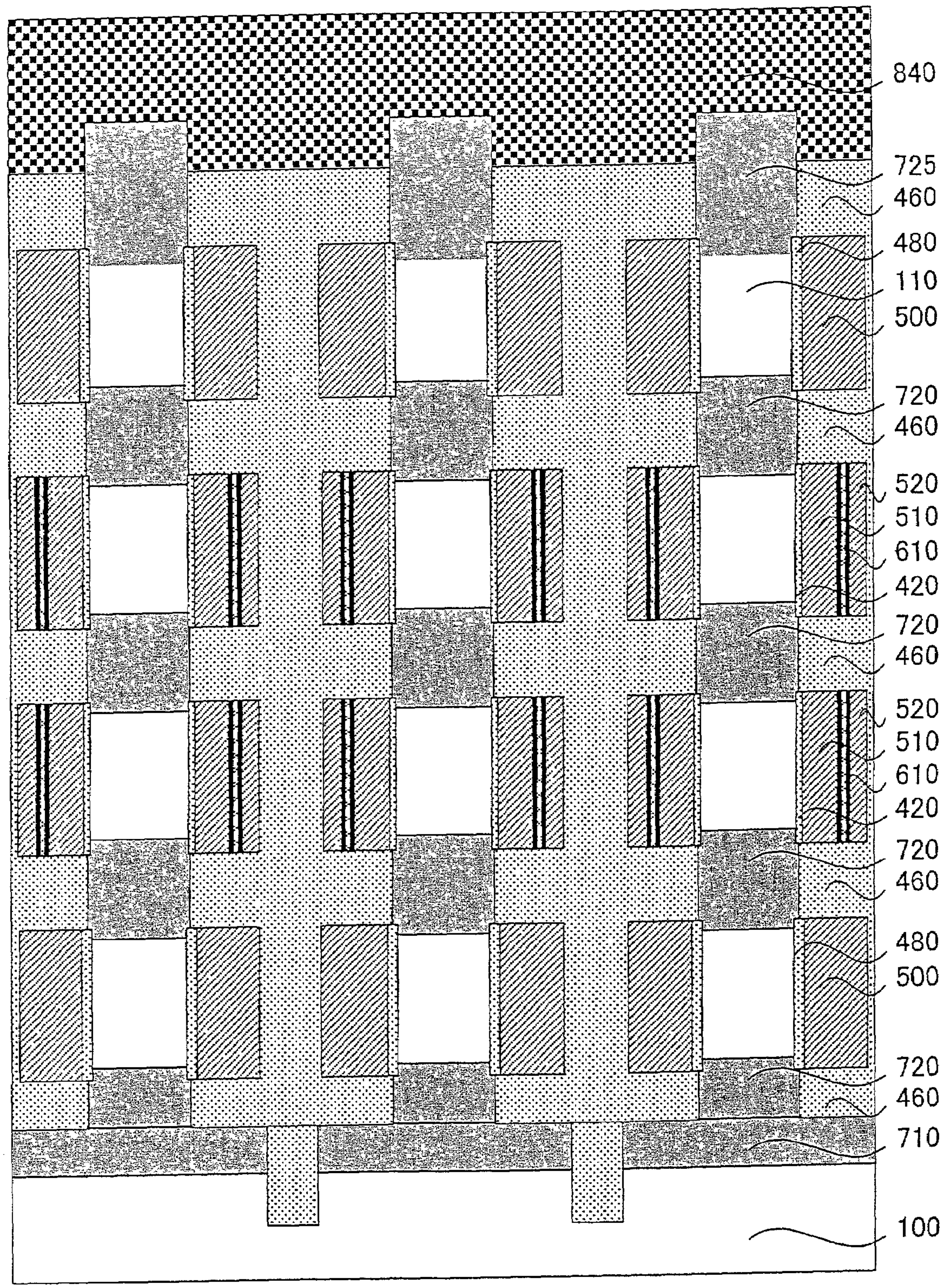
FIG. 90 is a sectional view of a semiconductor memory having floating gates as charge storage layers, corresponding to a sectional view as taken on line B–B' in FIG. 1.

In the example of FIG. 89 and FIG. 90, in contrast to FIG. 87 and FIG. 88, the surfaces of the tunnel oxide films 420 and 480 are positioned outside the periphery of the island-like semiconductor layer 110.

Figure 91:
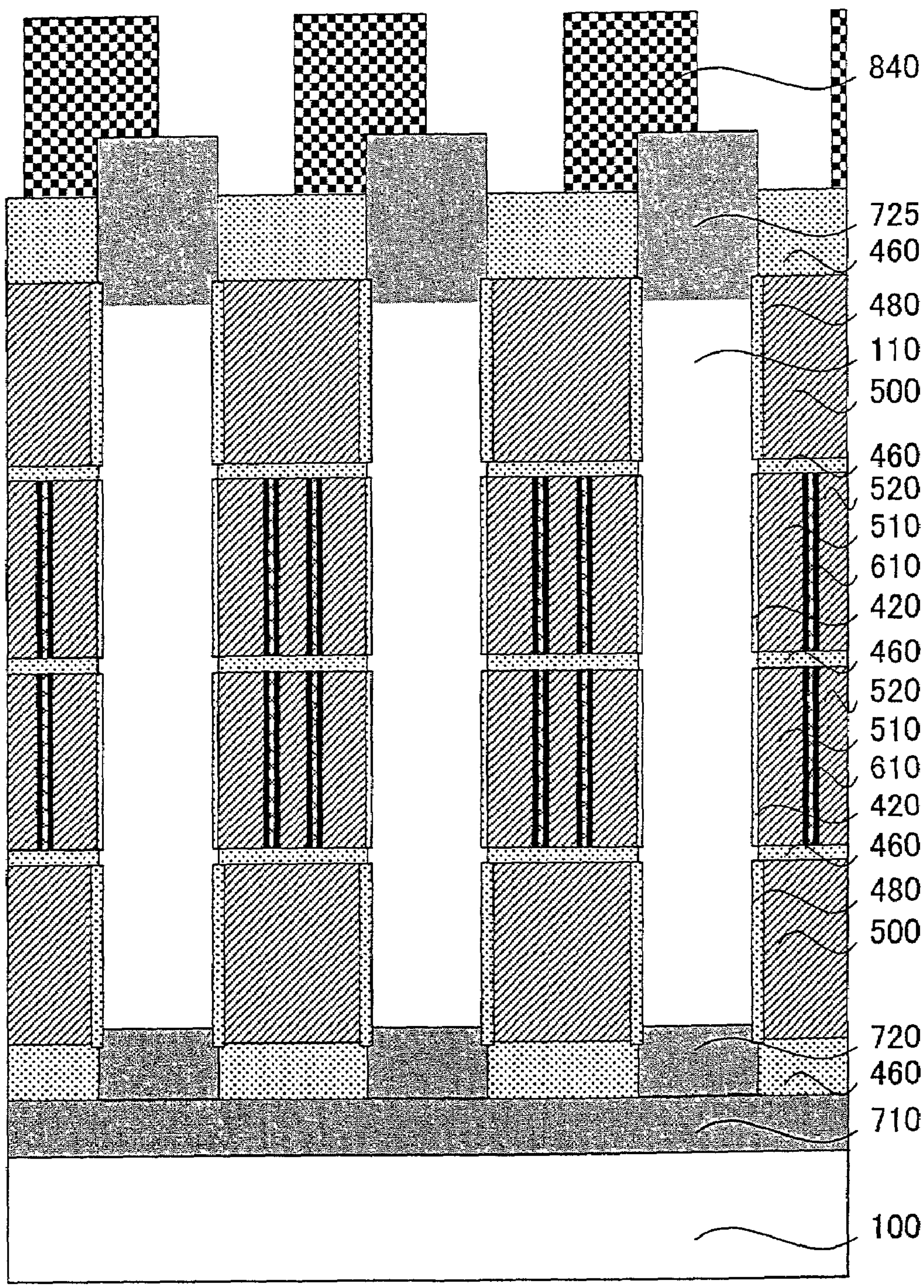
FIG. 91 is a sectional view of a semiconductor memory having floating gates as charge storage layers, corresponding to a sectional view as taken on line A–A' in FIG. 1.
Figure 92:
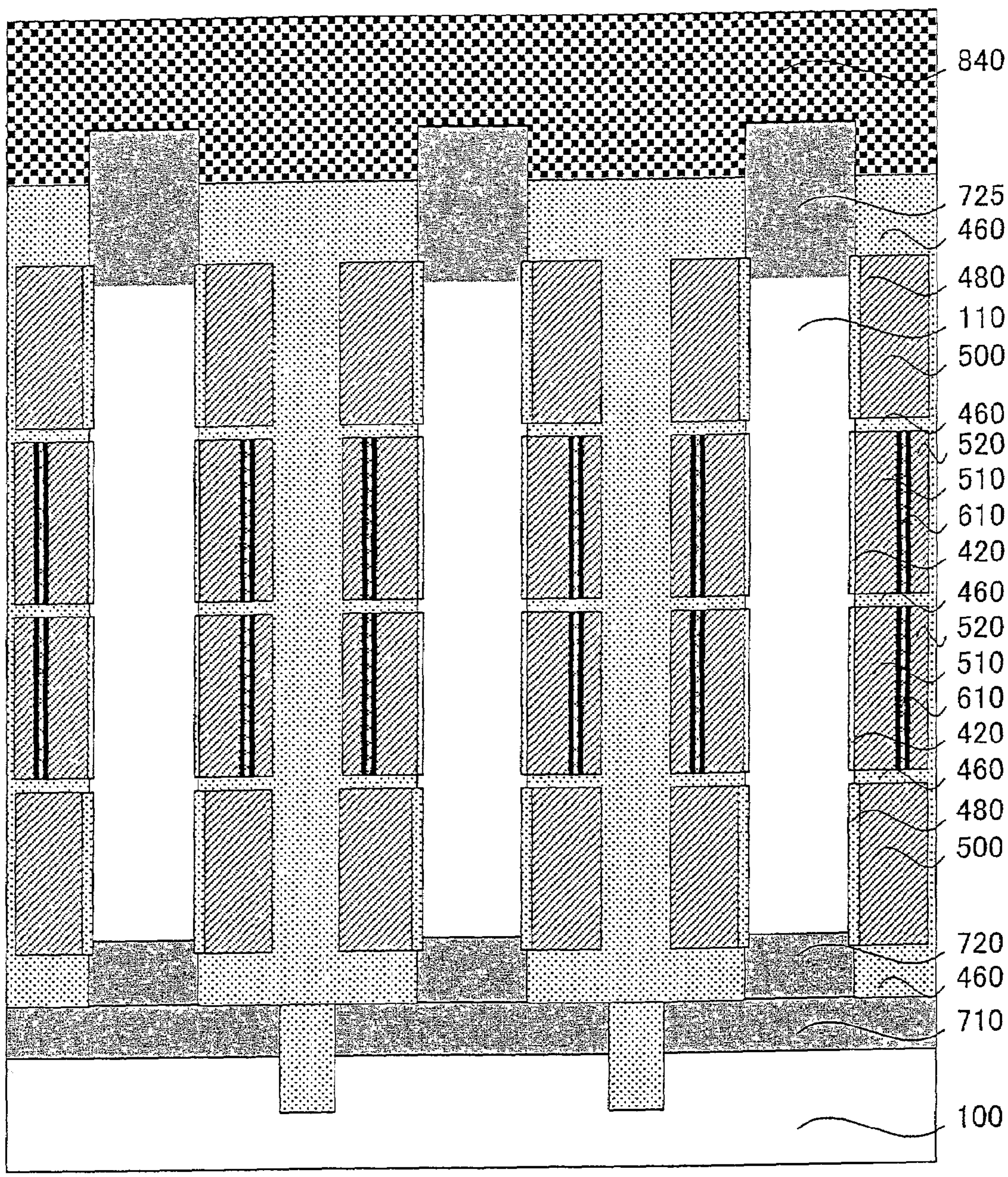
FIG. 92 is a sectional view of a semiconductor memory having floating gates as charge storage layers, corresponding to a sectional view as taken on line B–B' in FIG. 1.

In the example of FIG. 91 and FIG. 92, the diffusion layers 720 are not provided between the transistors.

Figure 93:
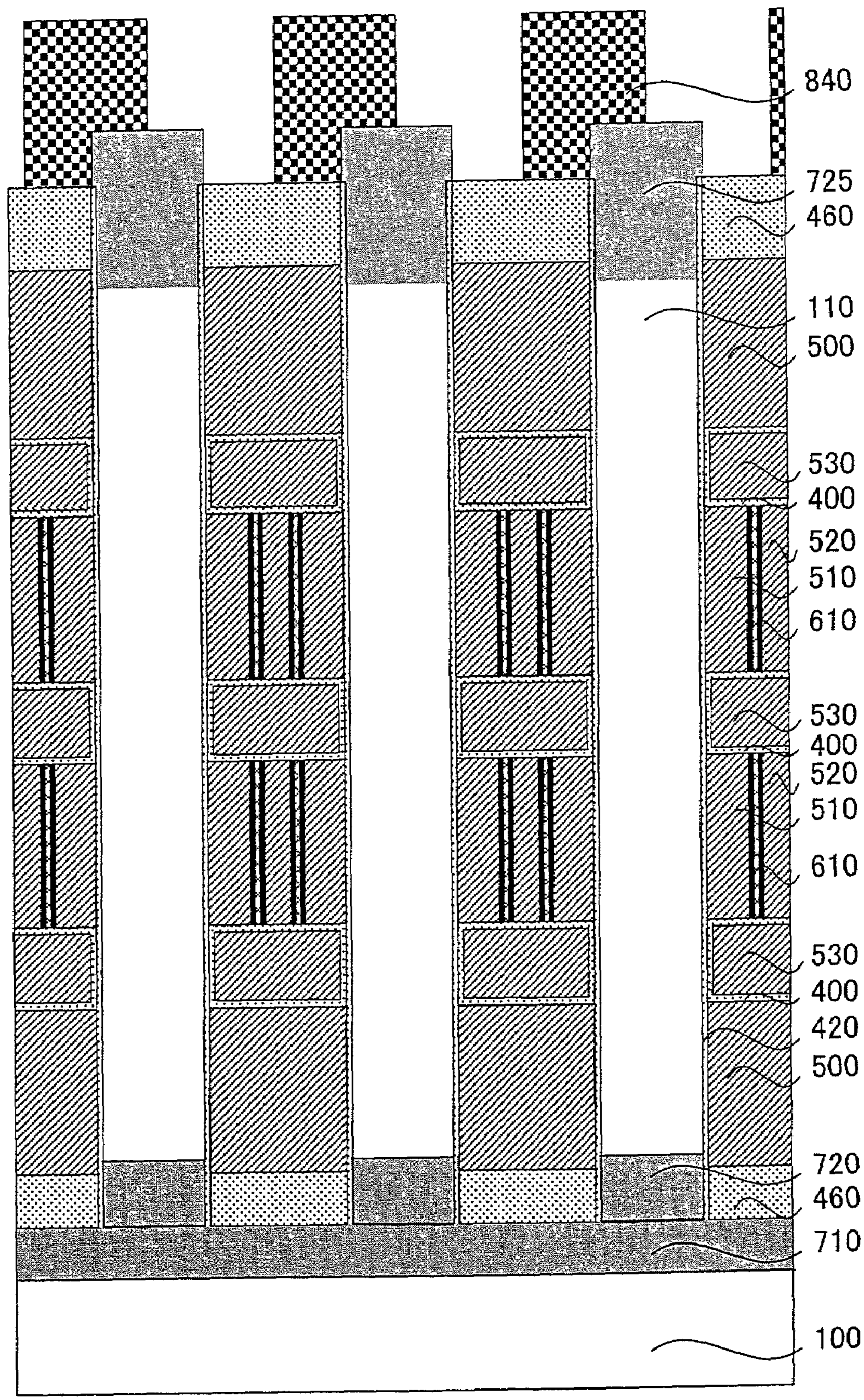
FIG. 93 is a sectional view of a semiconductor memory having floating gates as charge storage layers, corresponding to a sectional view as taken on line A–A' in FIG. 1.
Figure 94:
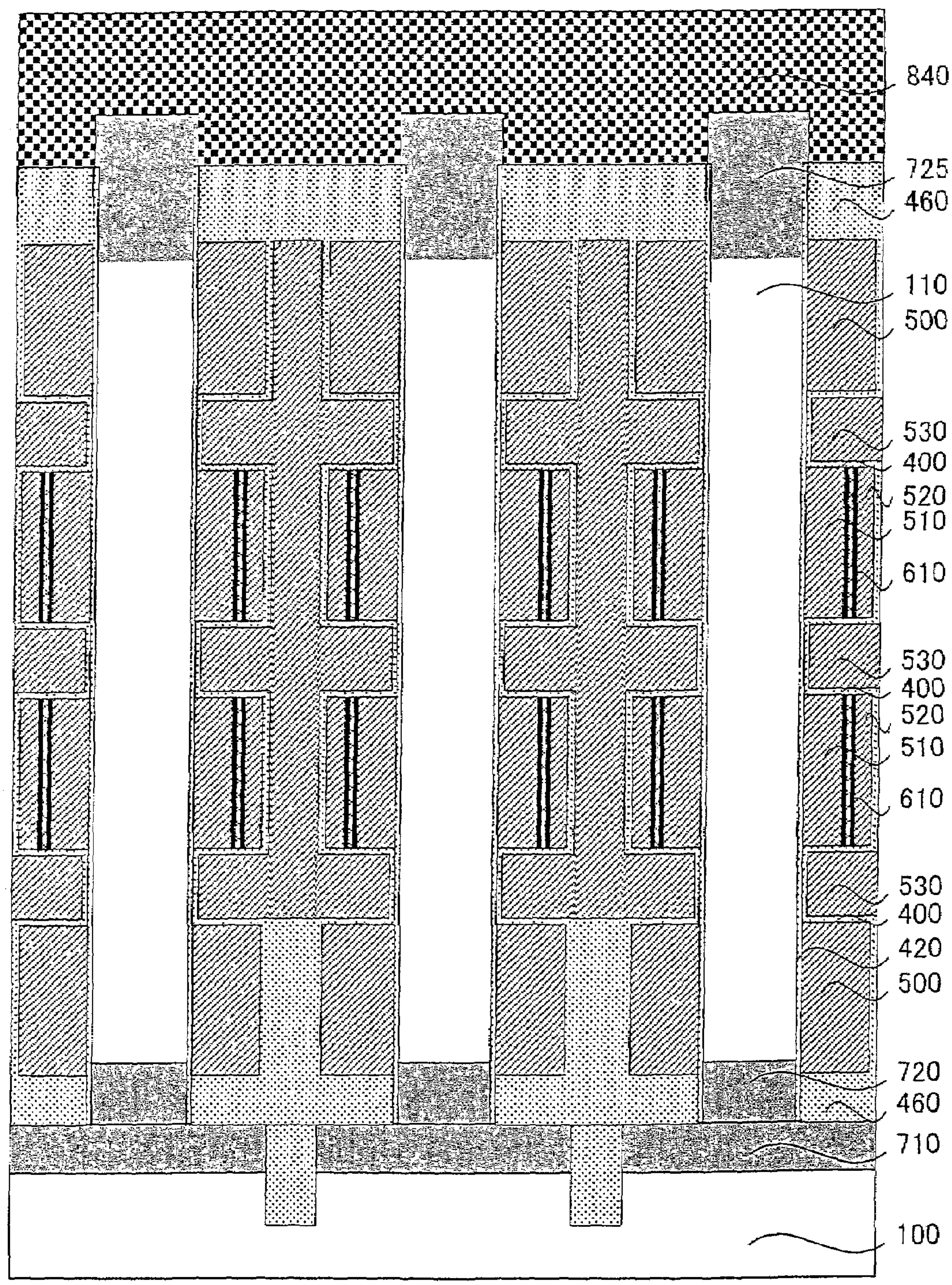
FIG. 94 is a sectional view of a semiconductor memory having floating gates as charge storage layers, corresponding to a sectional view as taken on line B–B' in FIG. 1.

In the example of FIG. 93 and FIG. 94, the diffusion layers 720 are not provided between the transistors and polysilicon films 530 are formed as third electrodes between the gate electrodes 500, 510 and 520 of the memory transistors and the selection gate transistors.

Figure 95:
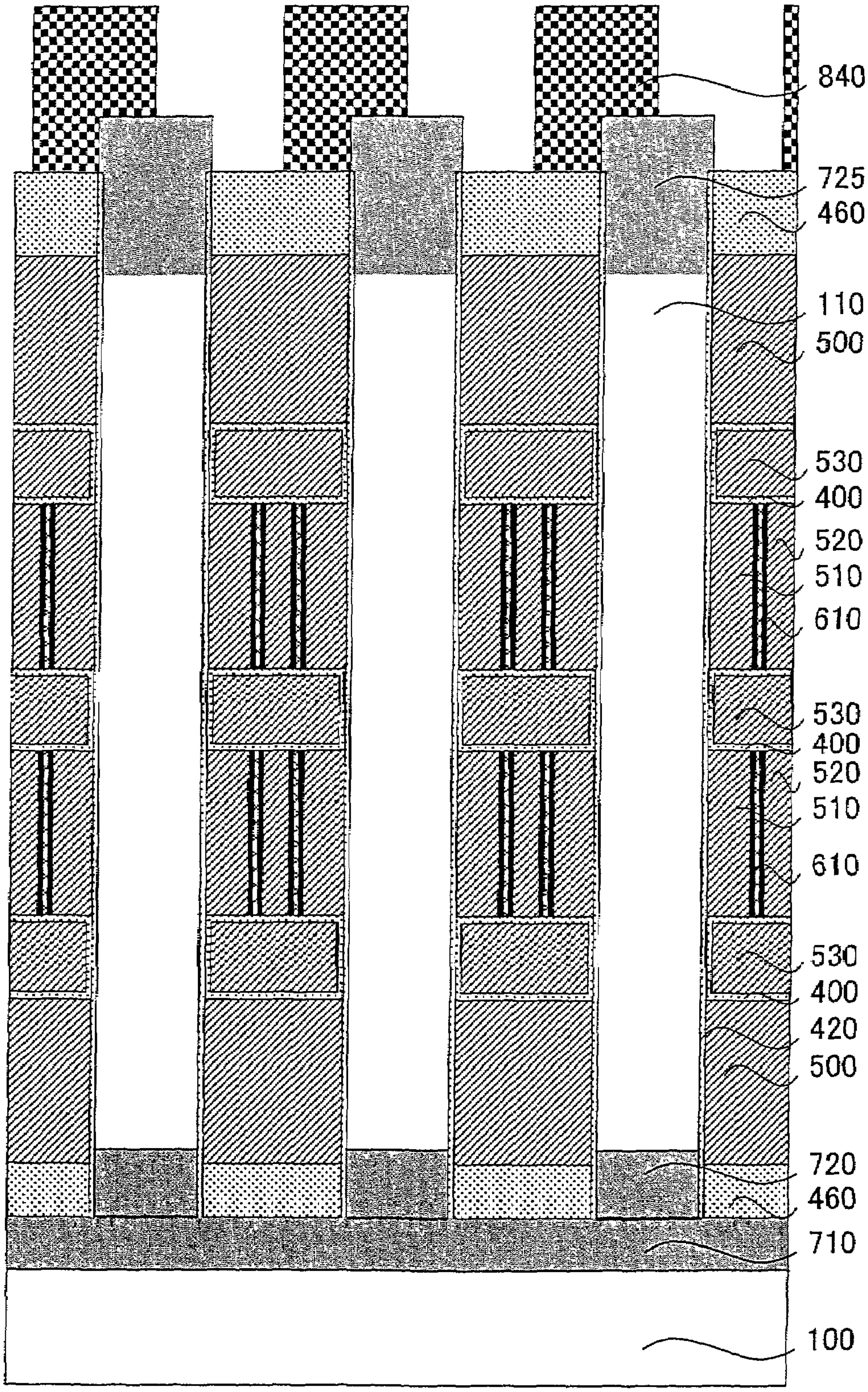
FIG. 95 is a sectional view of a semiconductor memory having floating gates as charge storage layers, corresponding to a sectional view as taken on line A–A' in FIG. 1.
Figure 96:
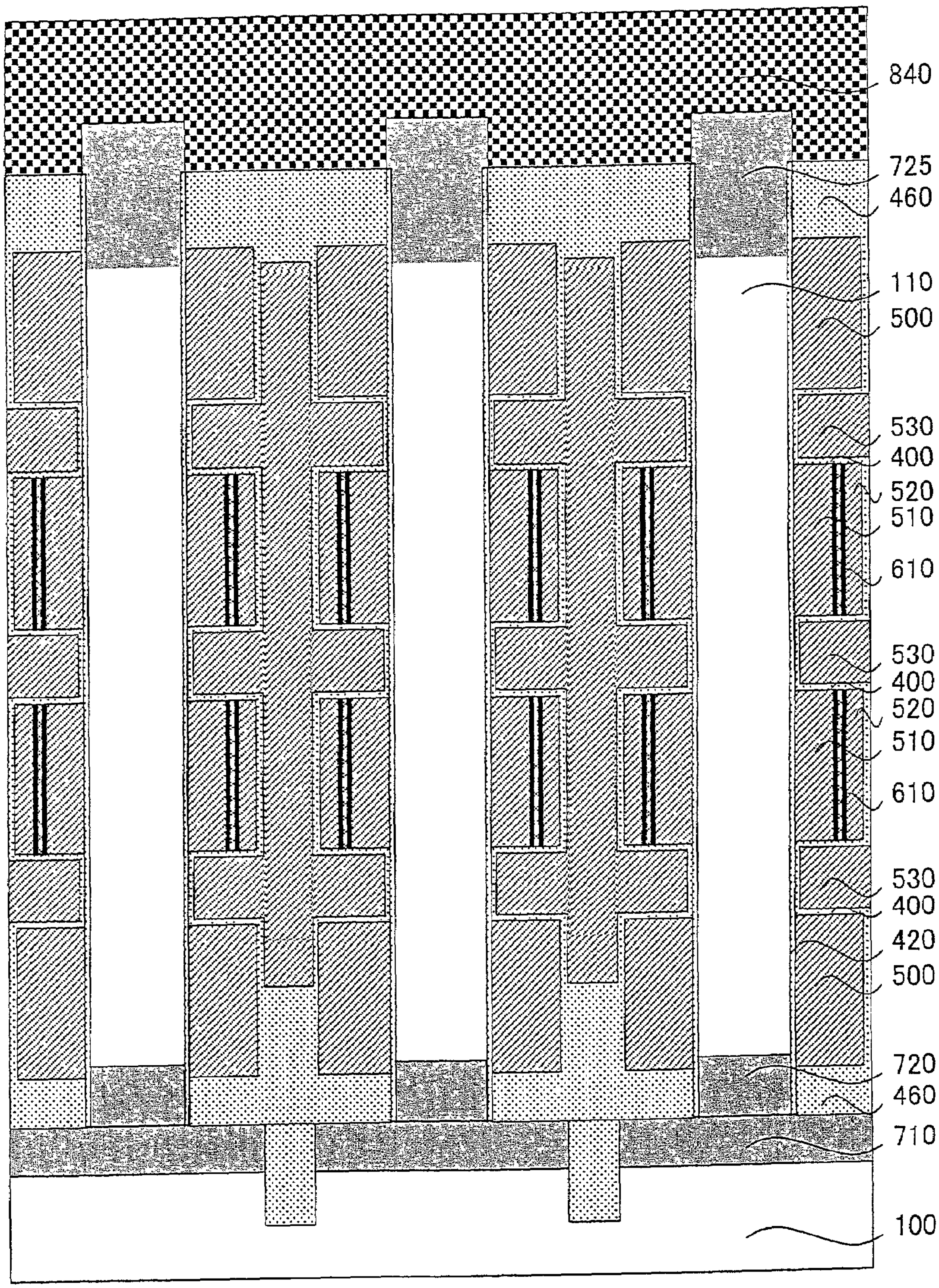
FIG. 96 is a sectional view of a semiconductor memory having floating gates as charge storage layers, corresponding to a sectional view as taken on line B–B' in FIG. 1.

In the example of FIG. 95 and FIG. 96, in contrast to FIG. 93 and FIG. 94, the position of the bottom and upper ends of the polysilicon films 530 as the third electrodes is different from the position of the upper ends of the gates 500 of the selection gate transistors.

The polysilicon films as the third electrodes are not shown in FIG. 1 for avoiding complexity.

Figure 97:
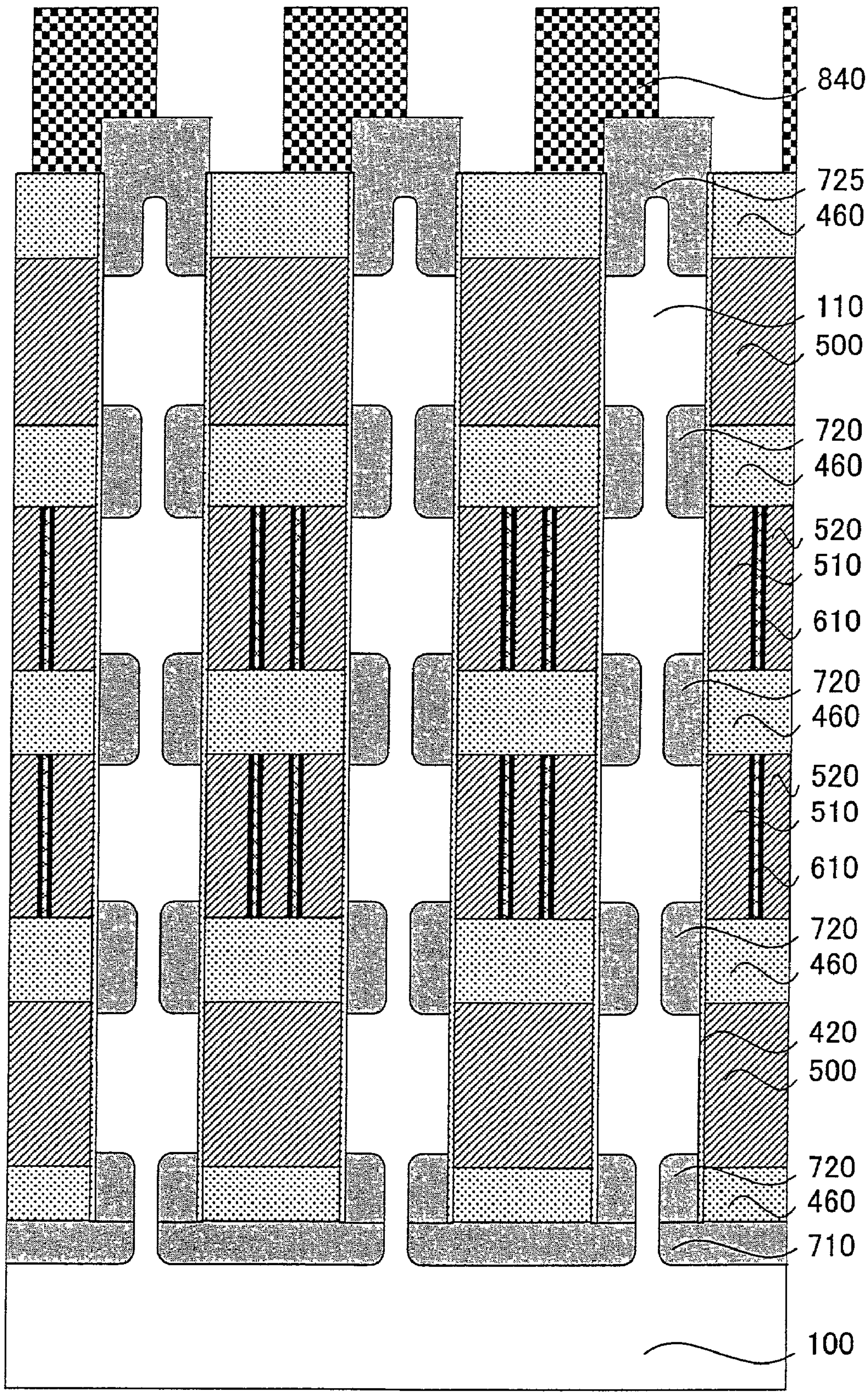
FIG. 97 is a sectional view of a semiconductor memory having floating gates as charge storage layers, corresponding to a sectional view as taken on line A–A' in FIG. 1.
Figure 98:
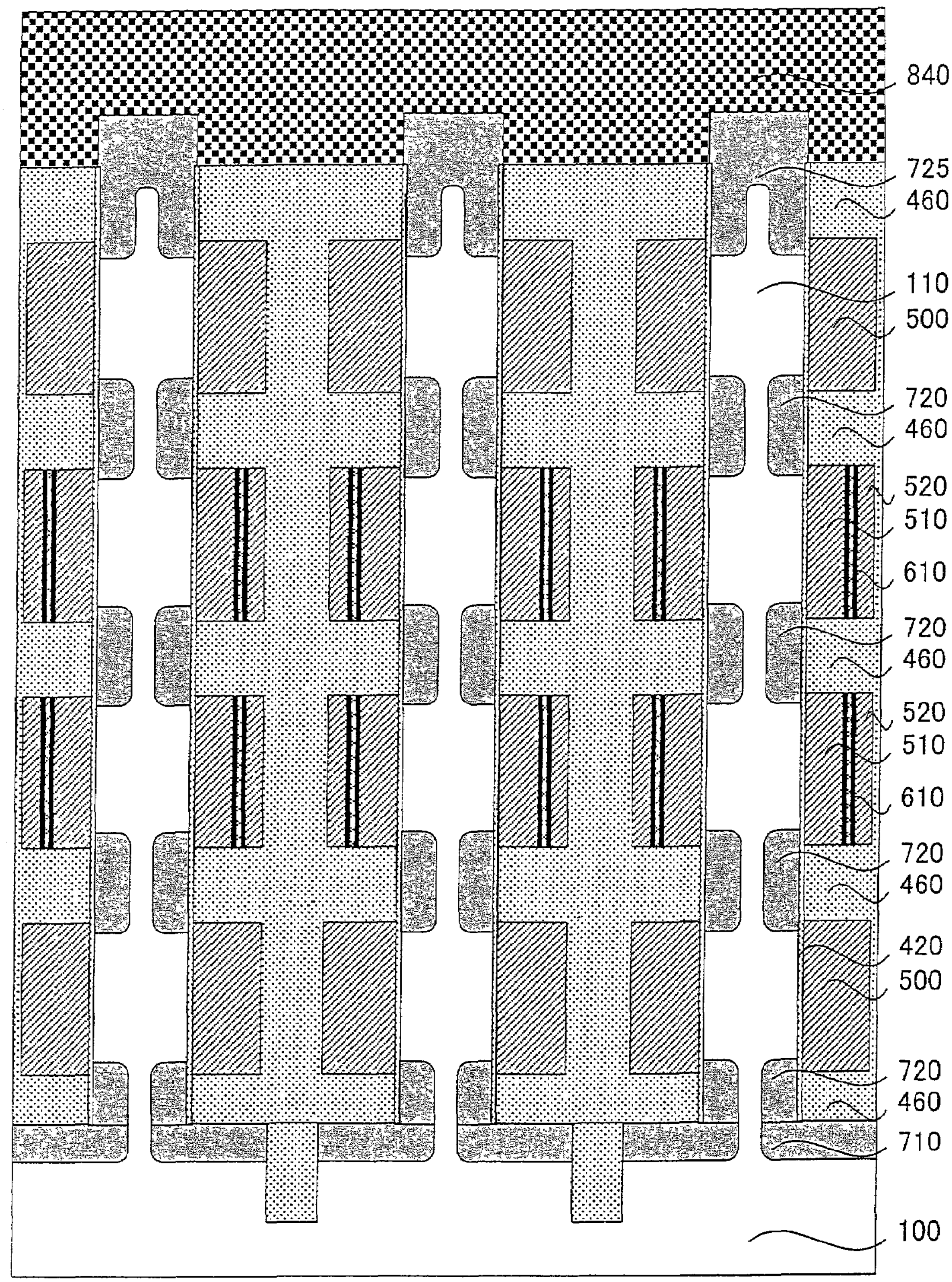
FIG. 98 is a sectional view of a semiconductor memory having floating gates as charge storage layers, corresponding to a sectional view as taken on line B–B' in FIG. 1.

In the example of FIG. 97 and FIG. 98, the source diffusion layer 710 is disposed so that the semiconductor substrate 100 is connected to the island-like semiconductor layer 110, and the diffusion layer 720 is disposed so that the active regions of adjacent transistors are connected to each other in the island-like semiconductor layer 110. The island-like semiconductor layer 110 and the semiconductor substrate 100 becomes in an electrically floating state owing to a depletion layer formed on a semiconductor substrate or an island-like semiconductor layer of a PN junction formed between the source diffusion layer 710 and the semiconductor substrate 100 or the island-like semiconductor layer 110 by a difference between a potential given to the source diffusion layer 710 and a potential given to the semiconductor substrate 100 at reading or at erasing. The active regions of the adjacent transistors are electrically insulated from each other owing to a depletion layer formed in the island-like semiconductor of the PN junction formed betWeen the diffusion layer 720 awd the island-like semiconductor layer 110 by a difference between the potential given to the diffusion layer 720 and a potential given to the island-like semiconductor layer 110.

Figure 99:
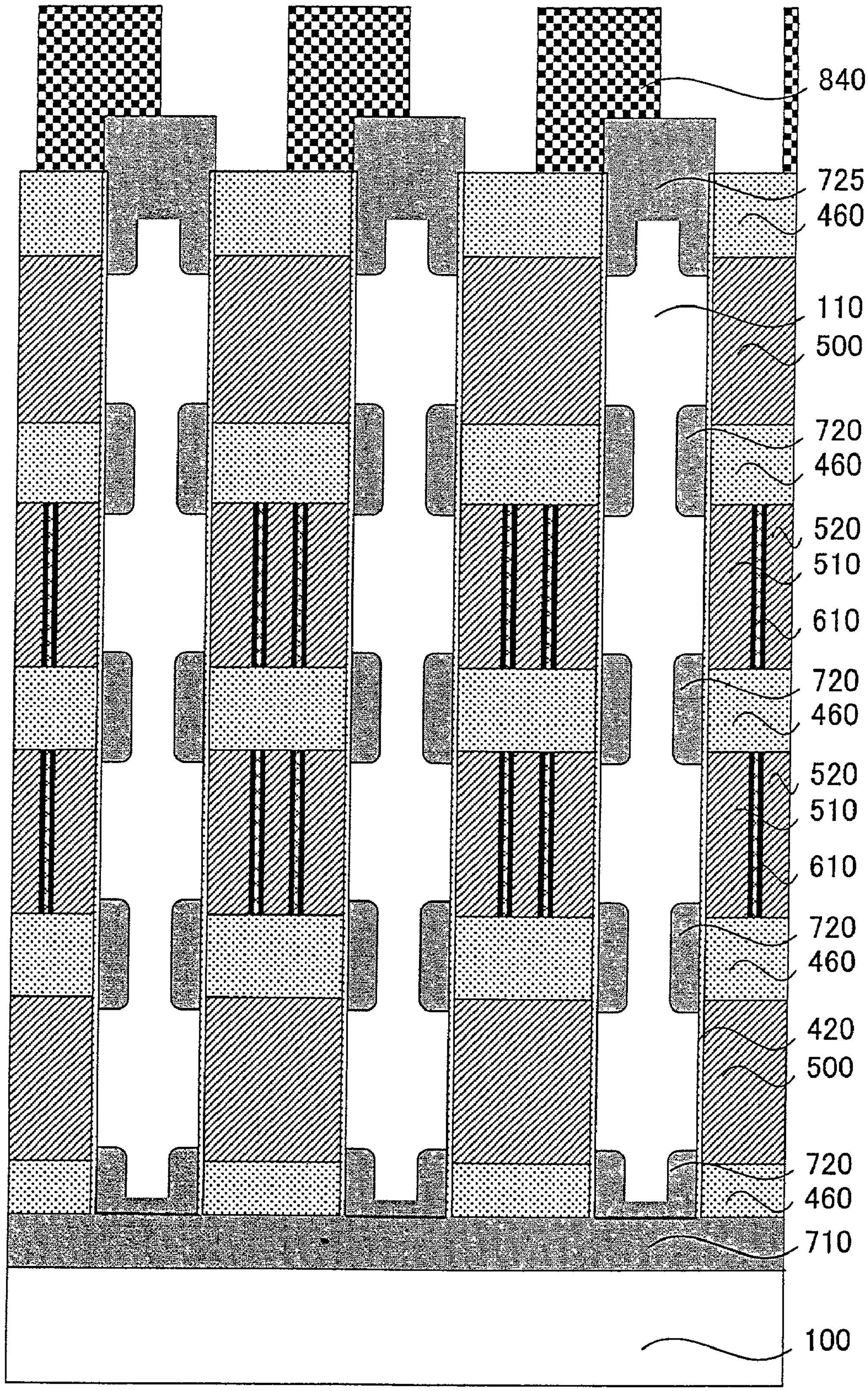
FIG. 99 is a sectional view of a semiconductor memory having floating gates as charge storage layers, corresponding to a sectional view as taken on line A–A' in FIG. 1.
Figure 100:
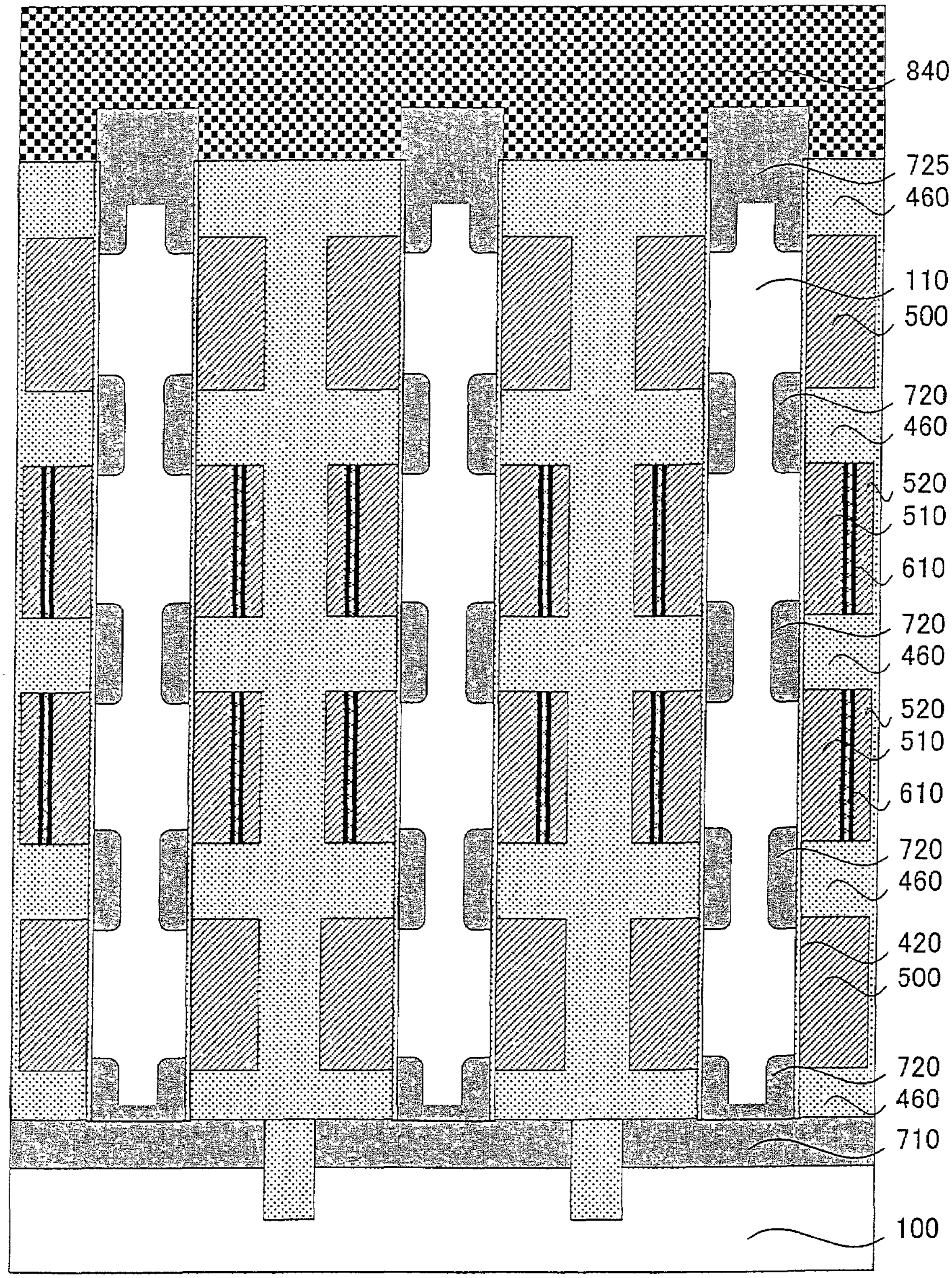
FIG. 100 is a sectional view of a semiconductor memory having floating gates as charge storage layers, corresponding to a sectional view as taken on line B–B' in FIG. 1.

In the example of FIG. 99 and FIG. 100, the island-like semiconductor layer 110 becomes in the floating state owing to the source diffusion layer 710, but the active regions of the memory cells are not electrically insulated by the diffusion layer 720.

FIG. 101 to FIG. 112 show sectional views of semiconductor memories having laminated insulating films as charge storage layers. Of FIG. 101 to FIG. 112, odd-numbered figures show sectional views taken on line A–A' in FIG. 65 which is a plan view illustrating memory cell array of the MONOS structure and even-numbered figures show sectional views taken on line B–B' in FIG. 65.

Examples shown in FIG. 101 to FIG. 112 are the same as those shown in FIG. 73 to FIG. 96 except that the charge storage layers are changed from the floating gates to the laminated insulating films.

Figure 101:
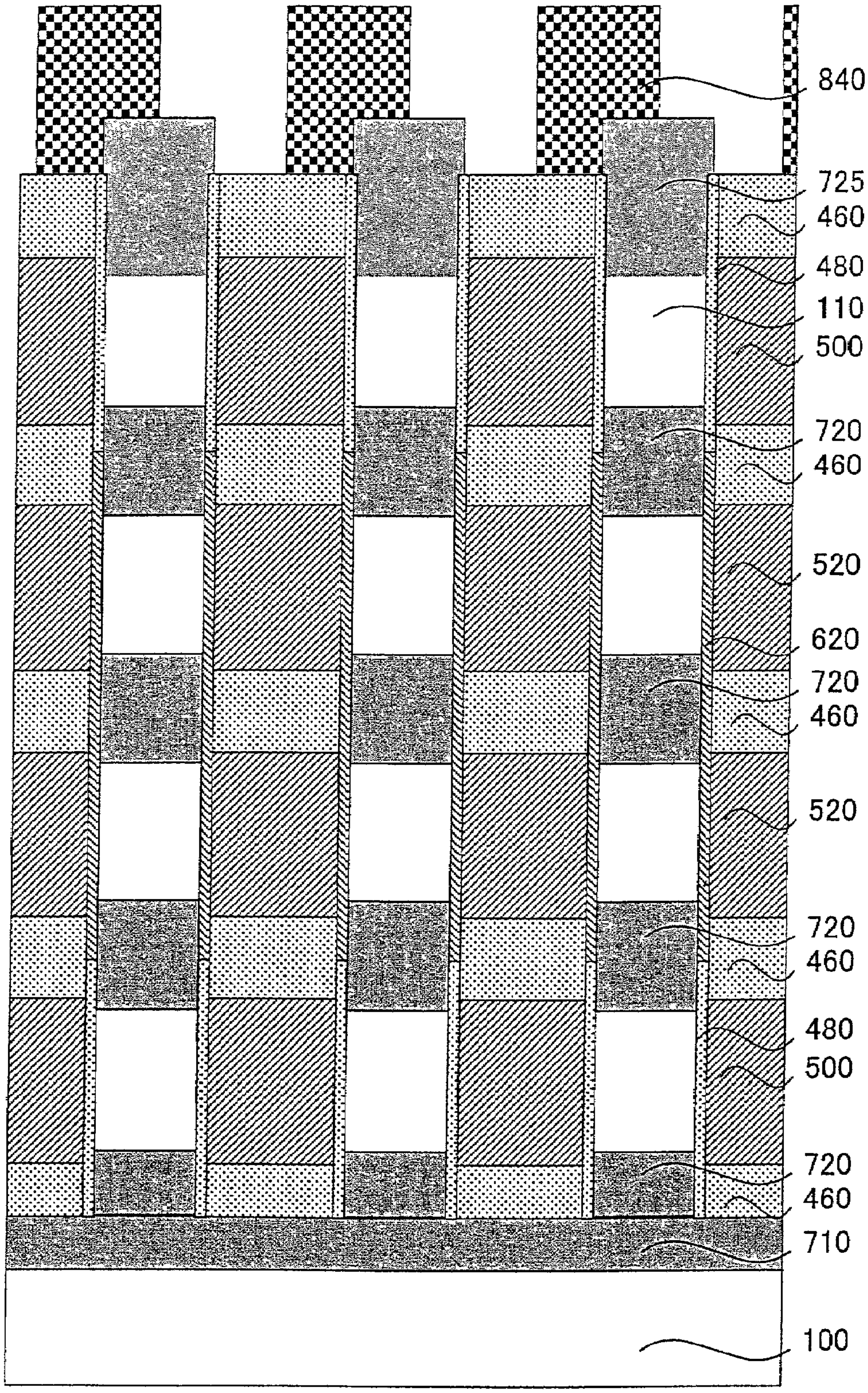
FIG. 101 is a sectional view of a semiconductor memory having laminated insulating films as charge storage layers in accordance with the present invention, corresponding to a sectional view as taken on line A–A' in FIG. 1.
Figure 102:
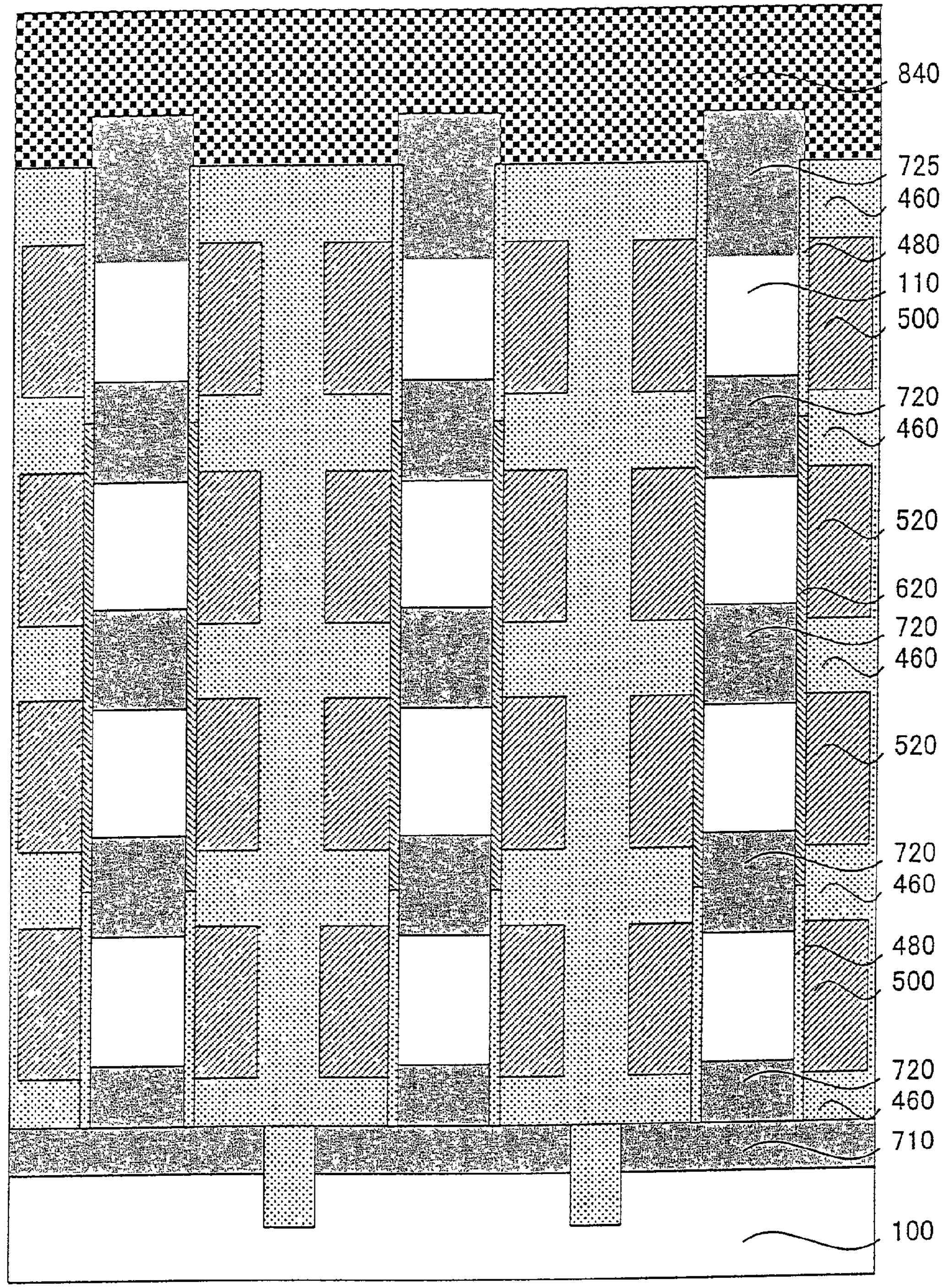
FIG. 102 is a sectional view of a semiconductor memory having laminated insulating films as charge storage layers in accordance with the present invention, corresponding to a sectional view as taken on line B–B' in FIG. 1.
Figure 103:
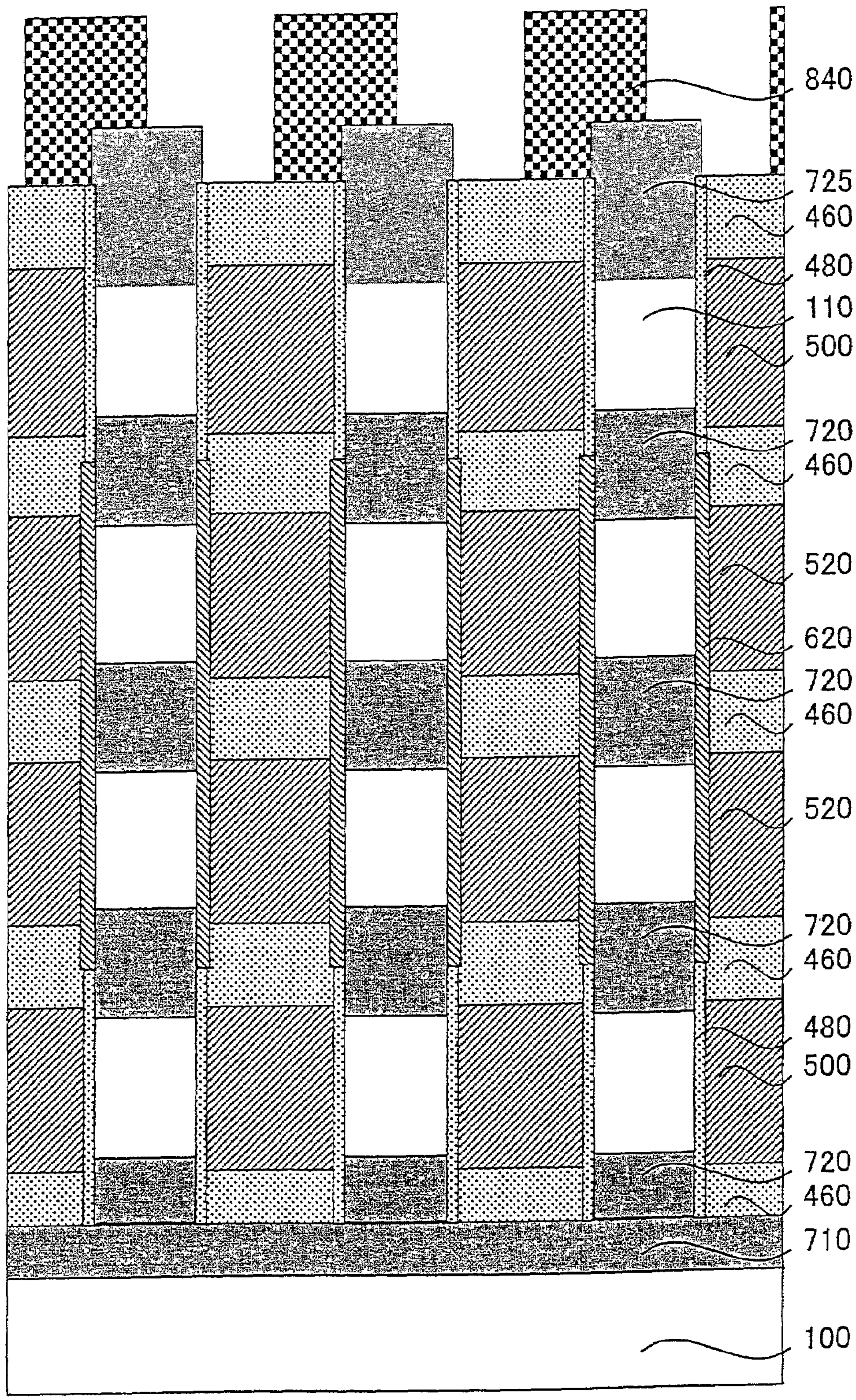
FIG. 103 is a sectional view of a semiconductor memory having laminated insulating films as charge storage layers, corresponding to a sectional view as taken on line A–A' in FIG. 1.
Figure 104:
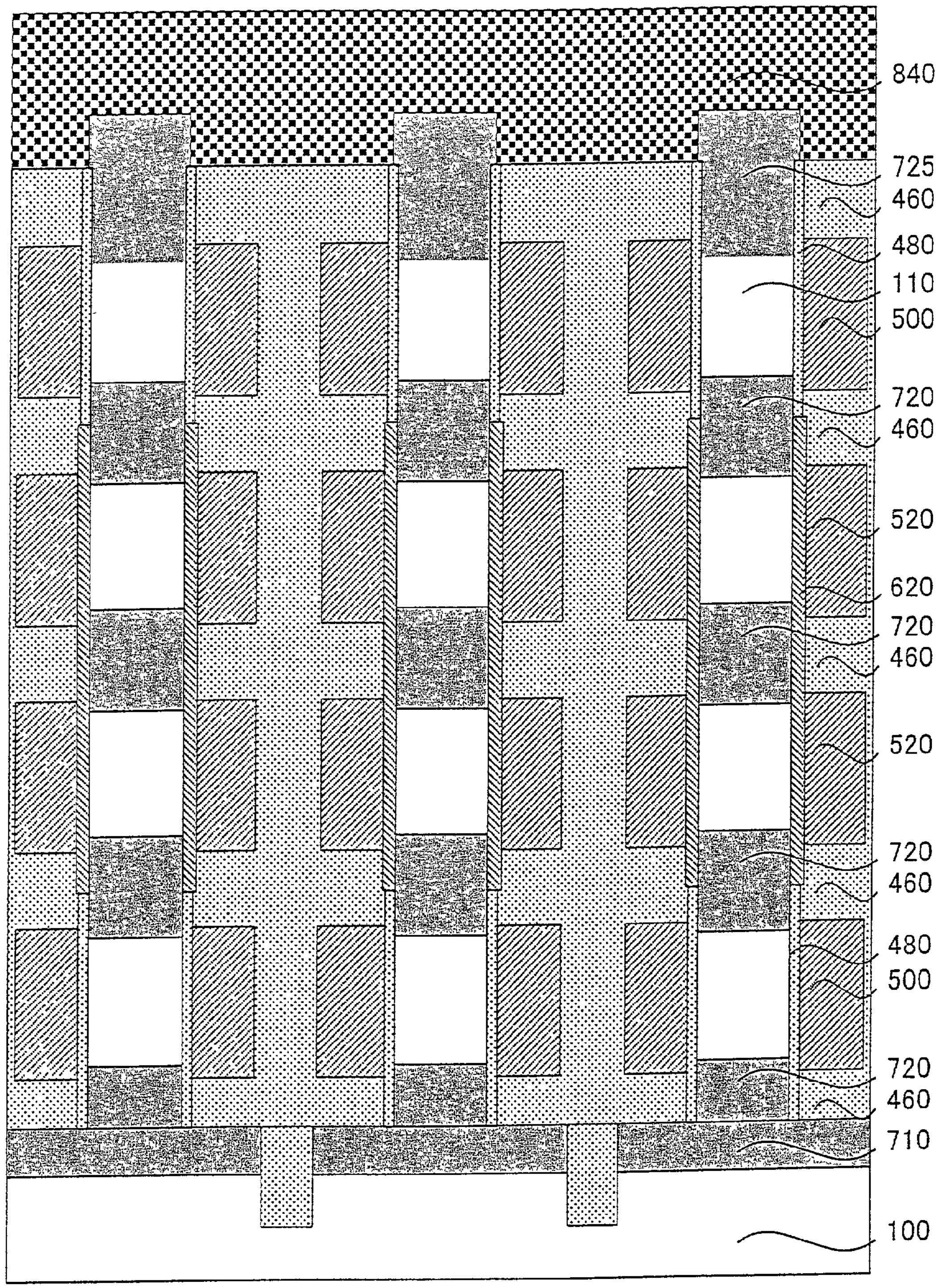
FIG. 104 is a sectional view of a semiconductor memory having laminated insulating films as charge storage layers, corresponding to a sectional view as taken on line B–B' in FIG. 1.

In the example of FIG. 103 and FIG. 104, in contrast to FIG. 101 and FIG. 102, the thickness of the laminated insulating films is larger than the thickness of the gates of the selection gate transistors.

Figure 105:
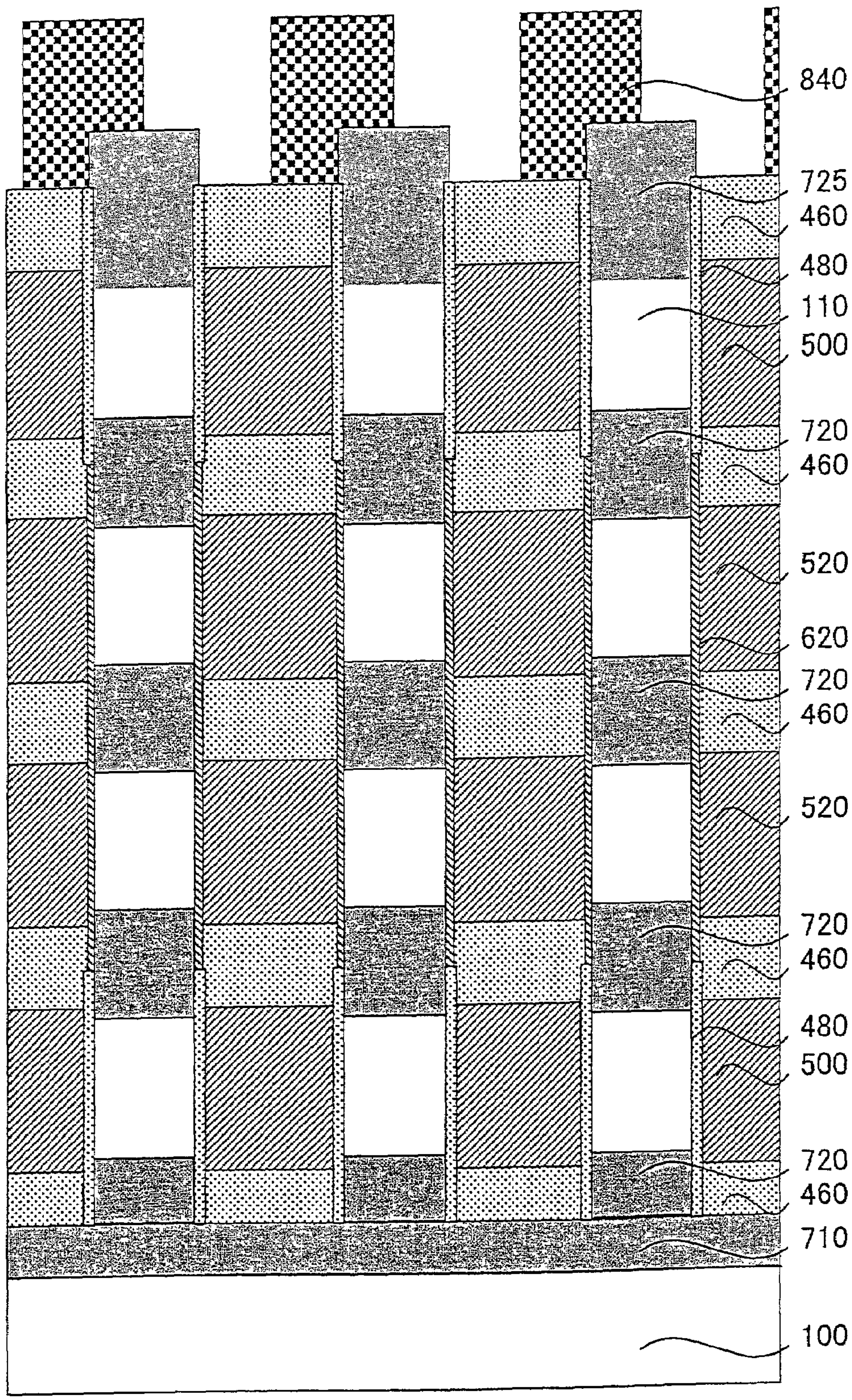
FIG. 105 is a sectional view of a semiconductor memory having laminated insulating films as charge storage layers, corresponding to a sectional view as taken on line A–A' in FIG. 1.
Figure 106:
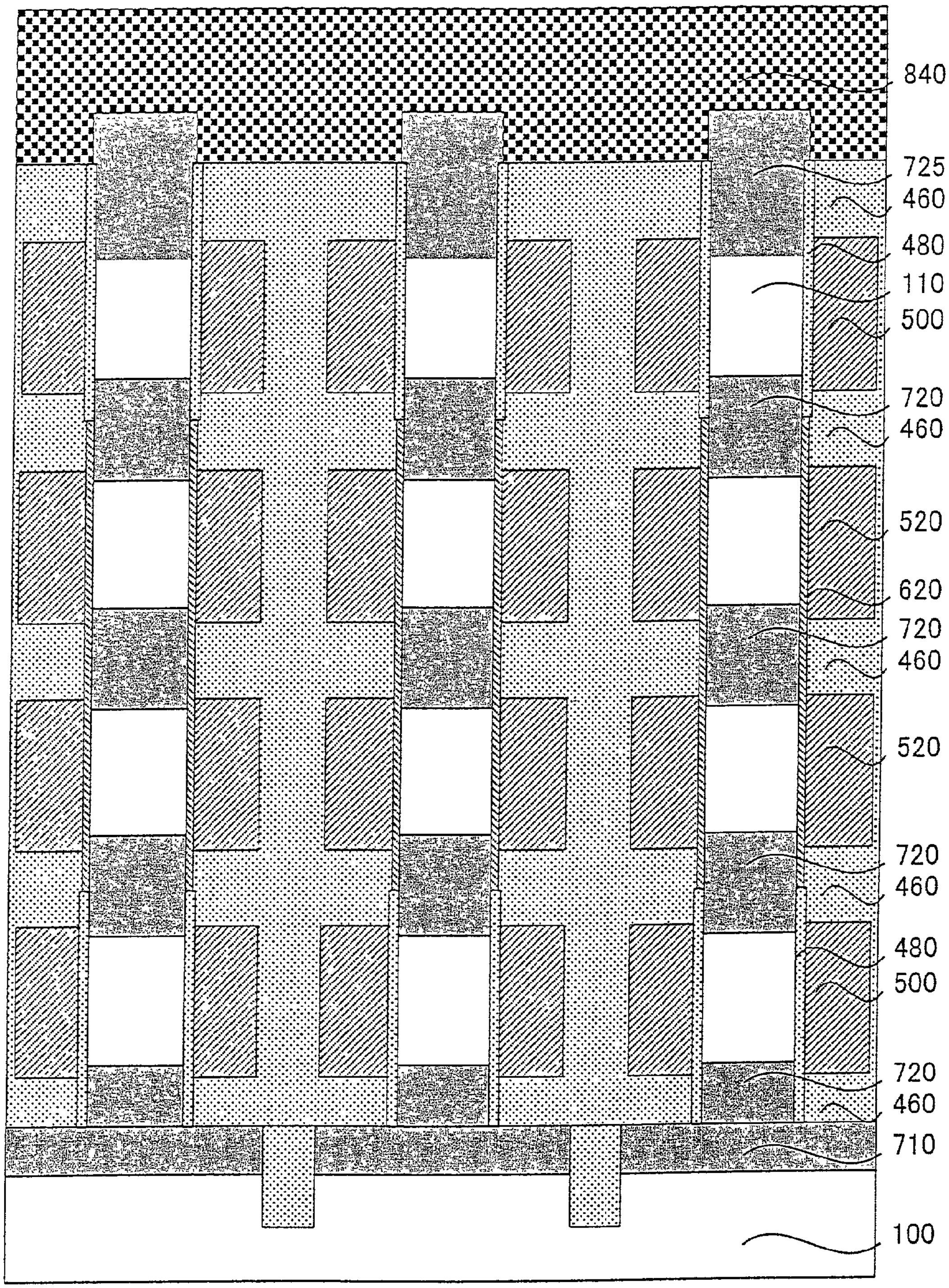
FIG. 106 is a sectional view of a semiconductor memory having laminated insulating films as charge storage layers, corresponding to a sectional view as taken on line B–B' in FIG. 1.
Figure 107:
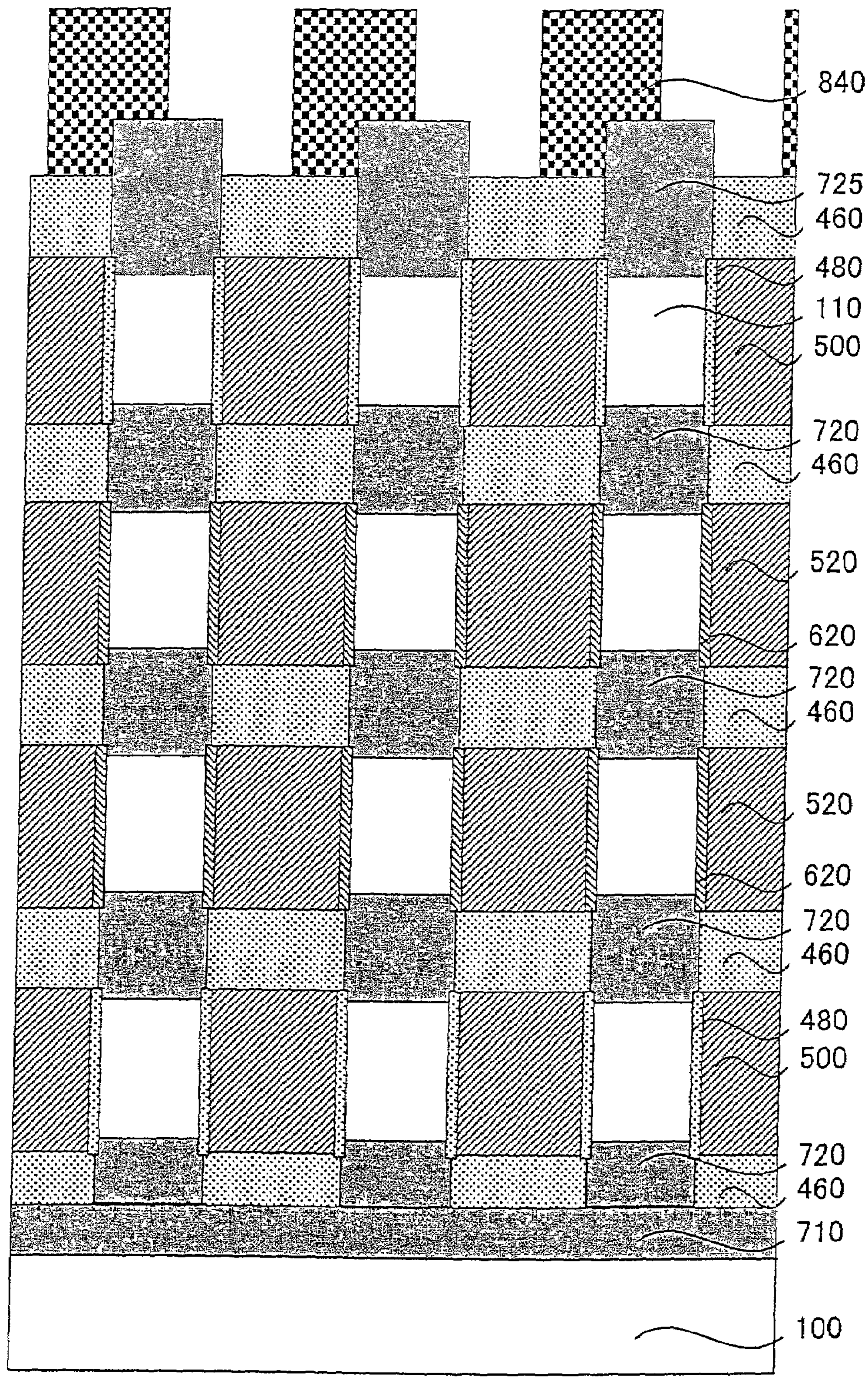
FIG. 107 is a sectional view of a semiconductor memory having laminated insulating films as charge storage layers, corresponding to a sectional view as taken on line A–A' in FIG. 1.
Figure 108:
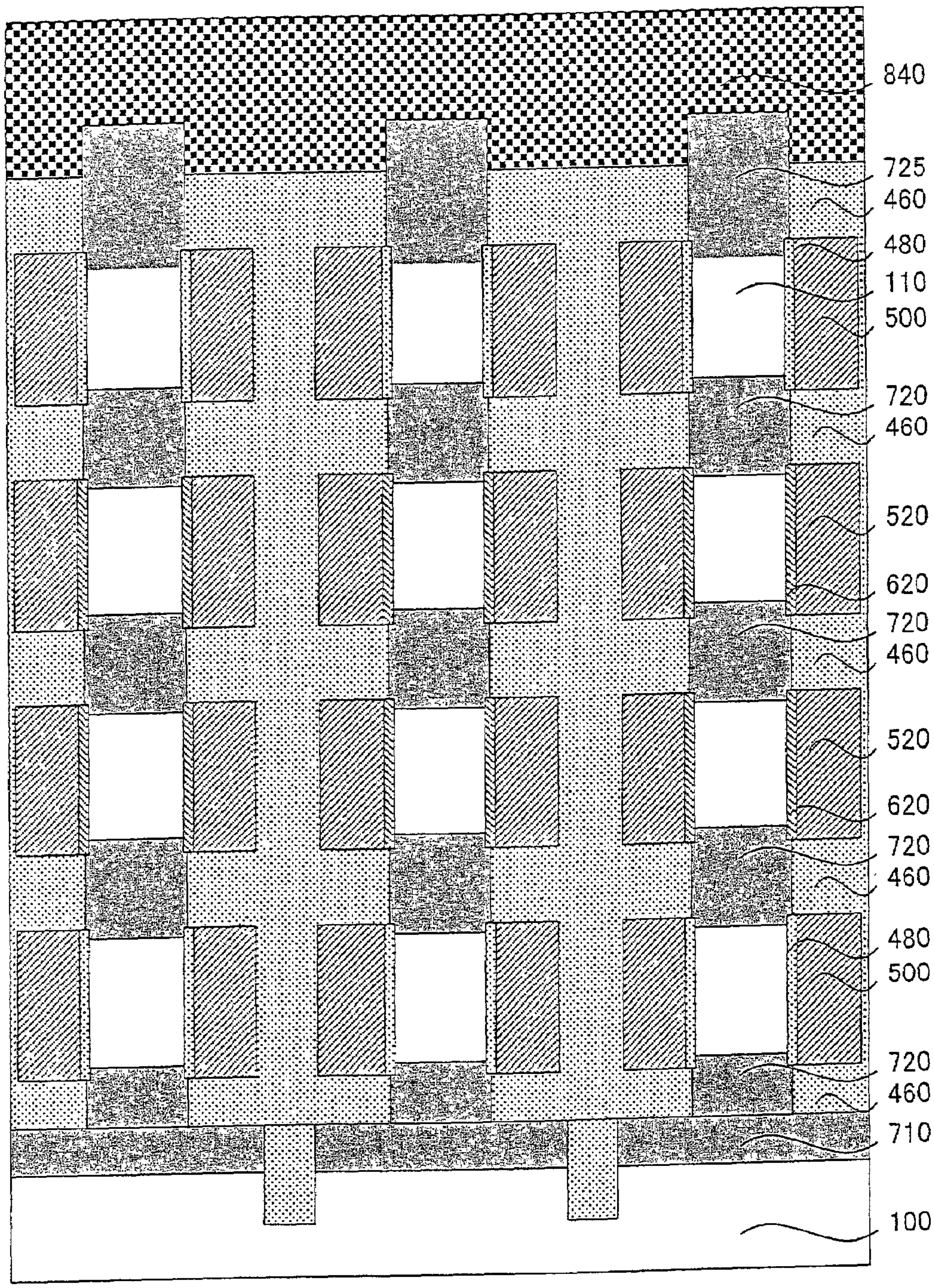
FIG. 108 is a sectional view of a semiconductor memory having laminated insulating films as charge storage layers, corresponding to a sectional view as taken on line B–B' in FIG. 1.
Figure 109:
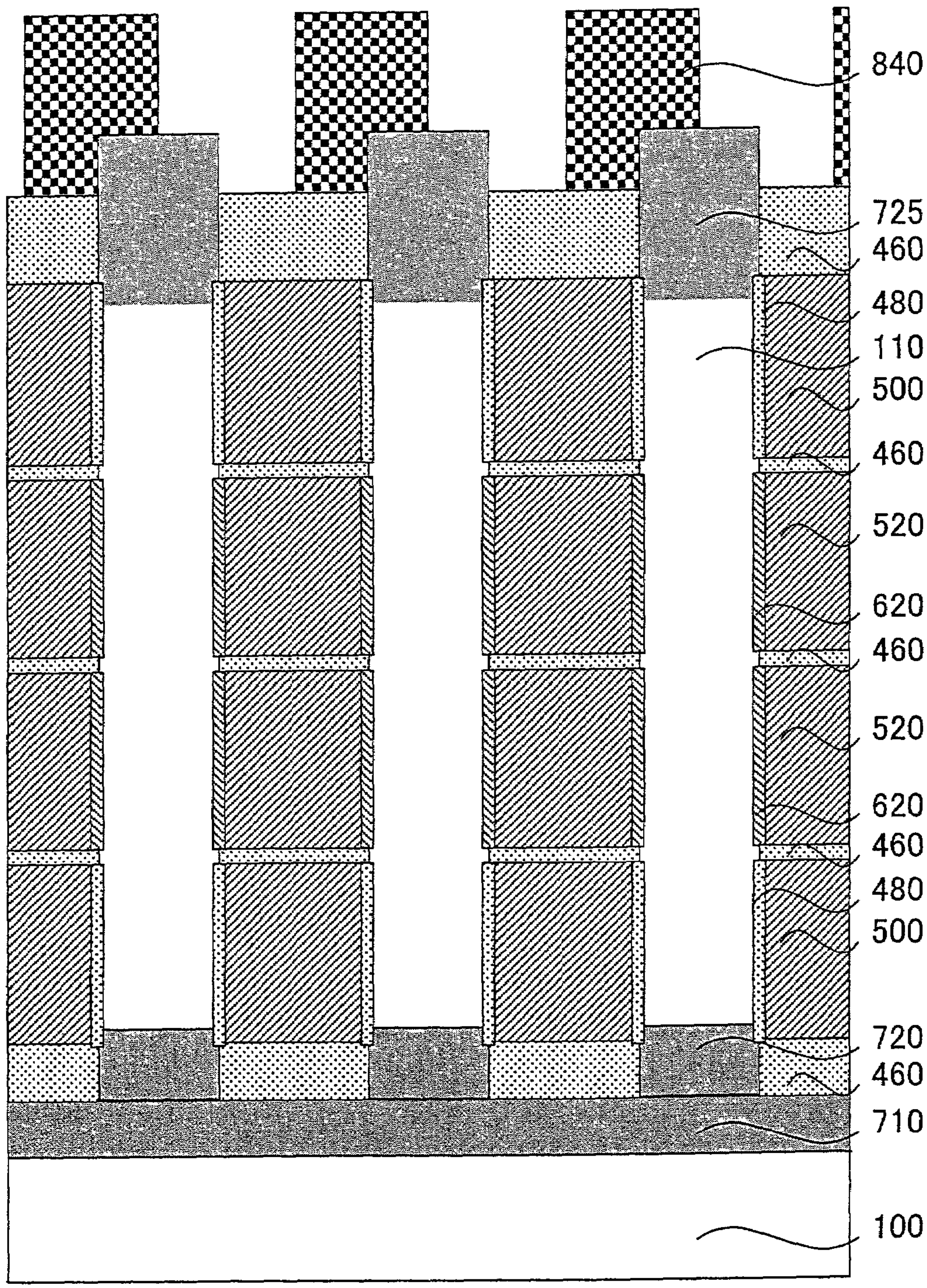
FIG. 109 is a sectional view of a semiconductor memory having laminated insulating films as charge storage layers, corresponding to a sectional view as taken on line A–A' in FIG. 1.
Figure 110:
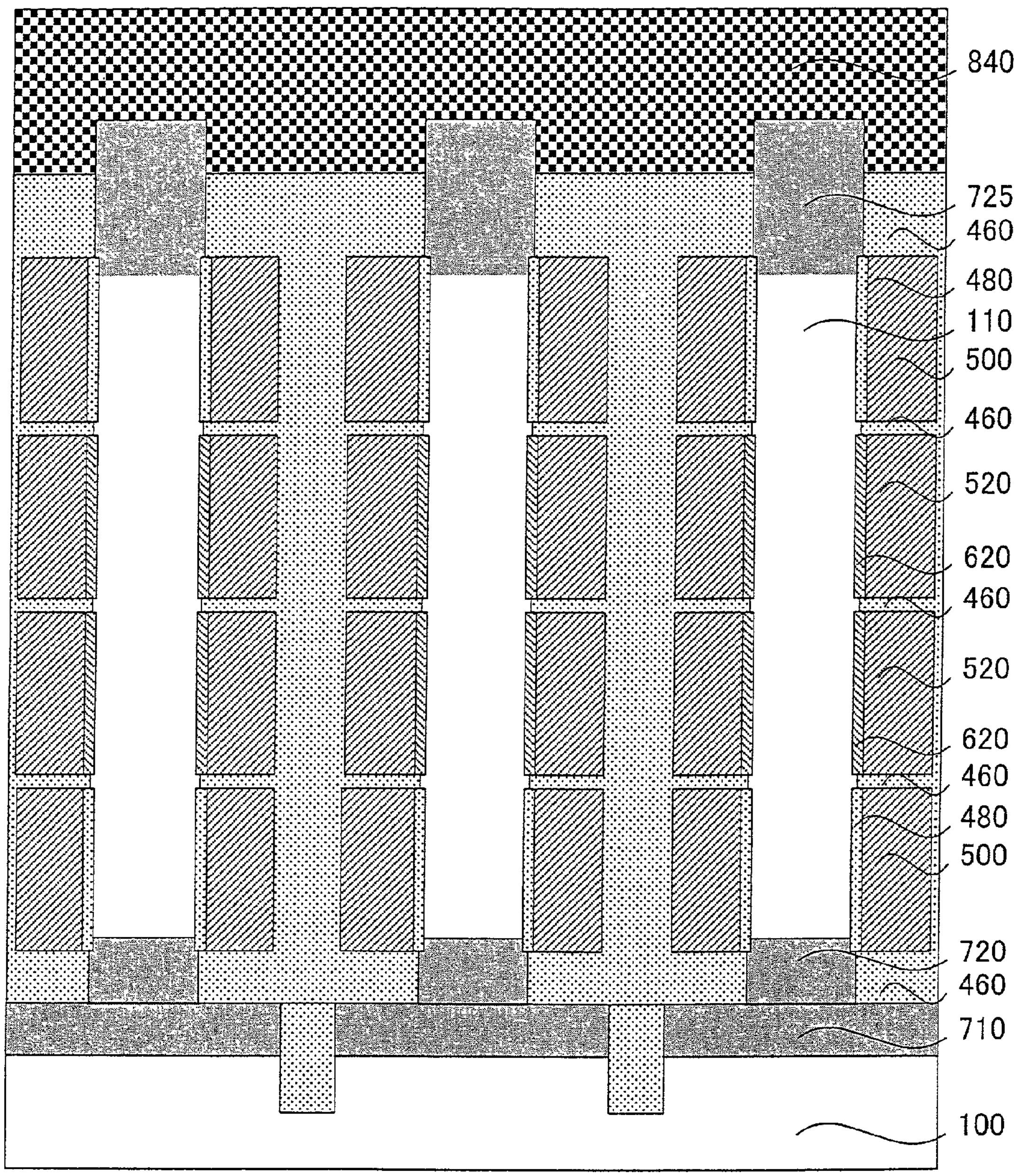
FIG. 110 is a sectional view of a semiconductor memory having laminated insulating films as charge storage layers, corresponding to a sectional view as taken on line B–B' in FIG. 1.
Figure 111:
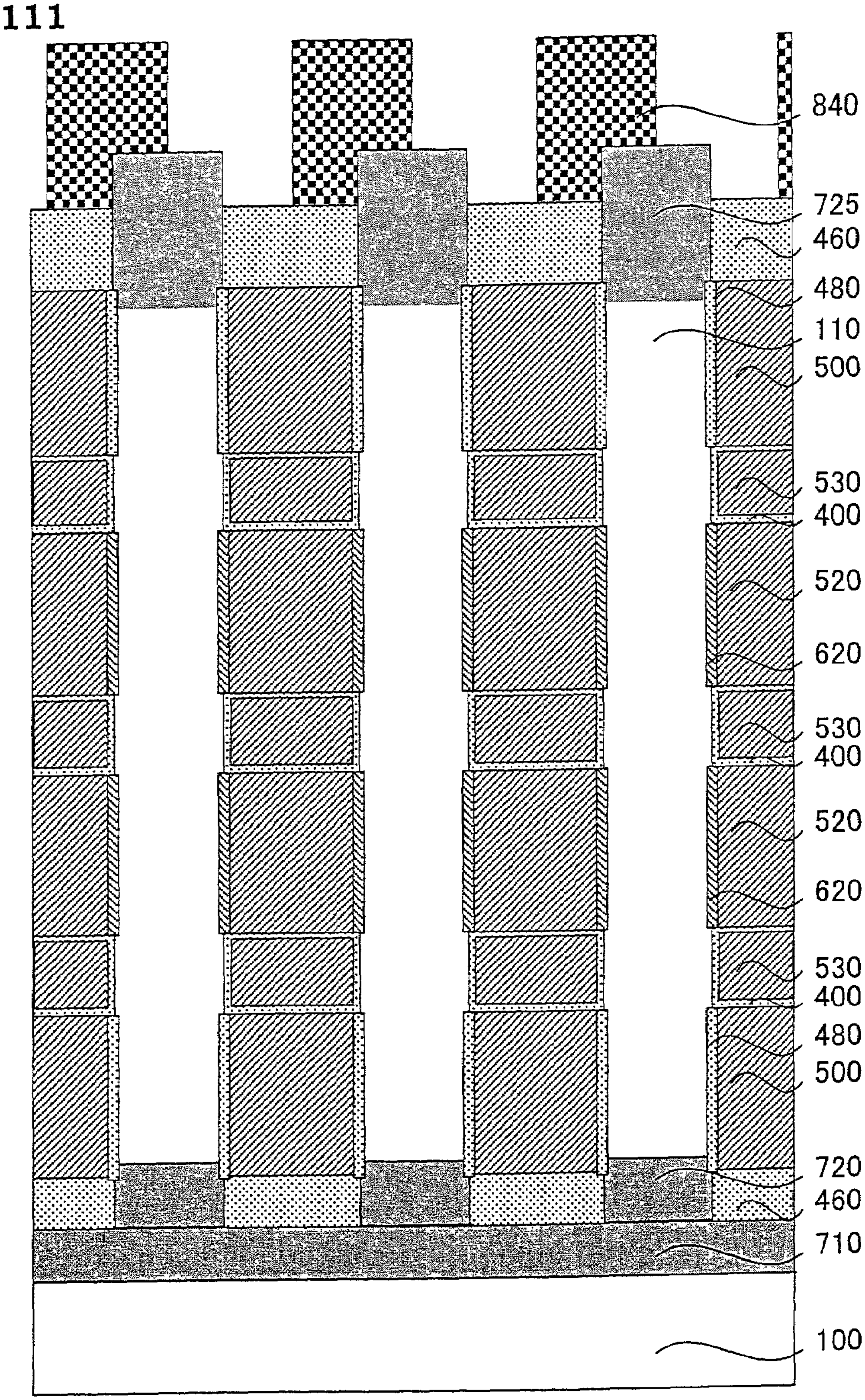
FIG. 111 is a sectional view of a semiconductor memory having laminated insulating films as charge storage layers, corresponding to a sectional view as taken on line A–A' in FIG. 1.
Figure 112:
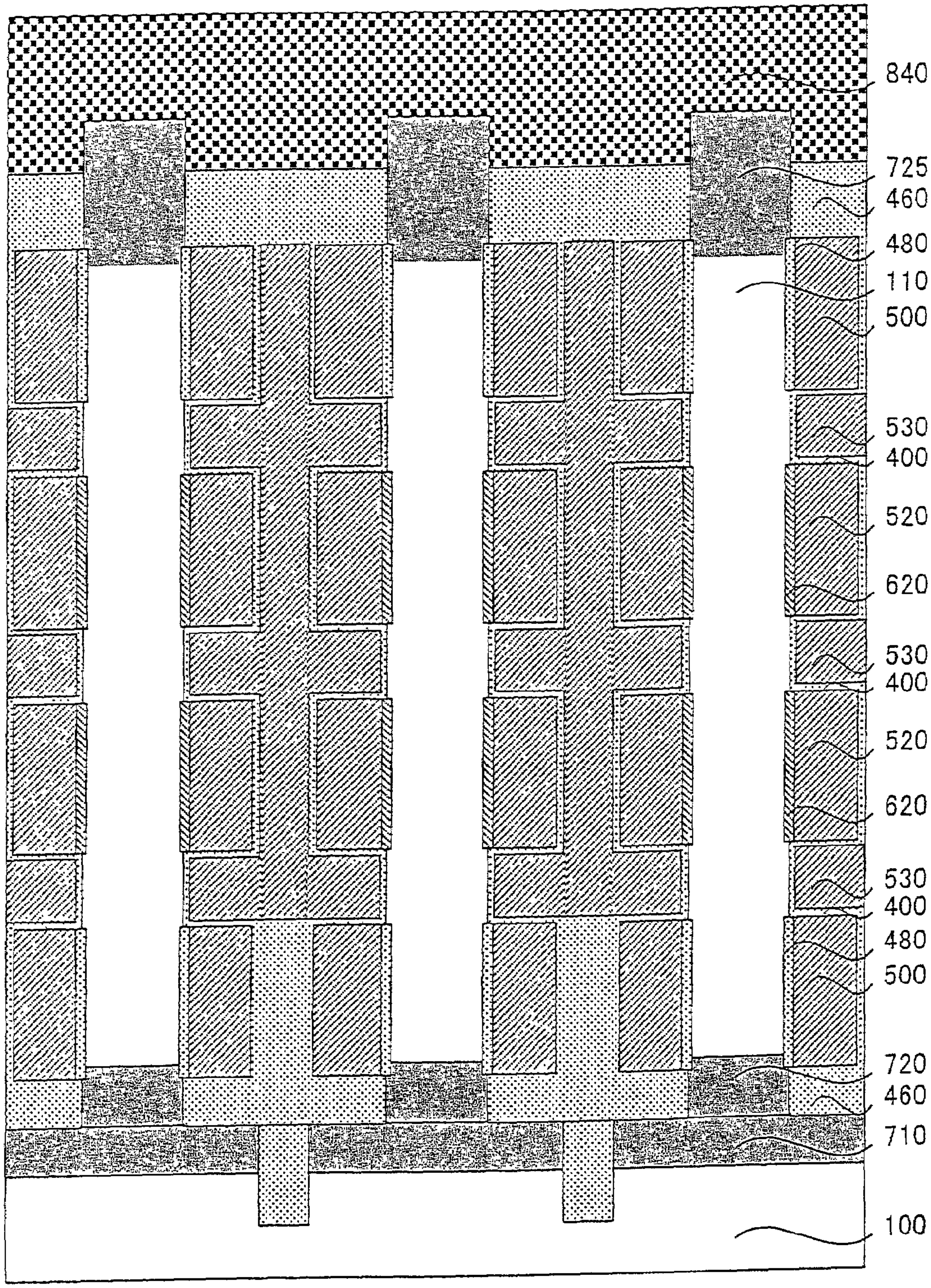
FIG. 112 is a sectional view of a semiconductor memory having laminated insulating films as charge storage layers, corresponding to a sectional view as taken on line B–B' in FIG. 1.
Figure 113:
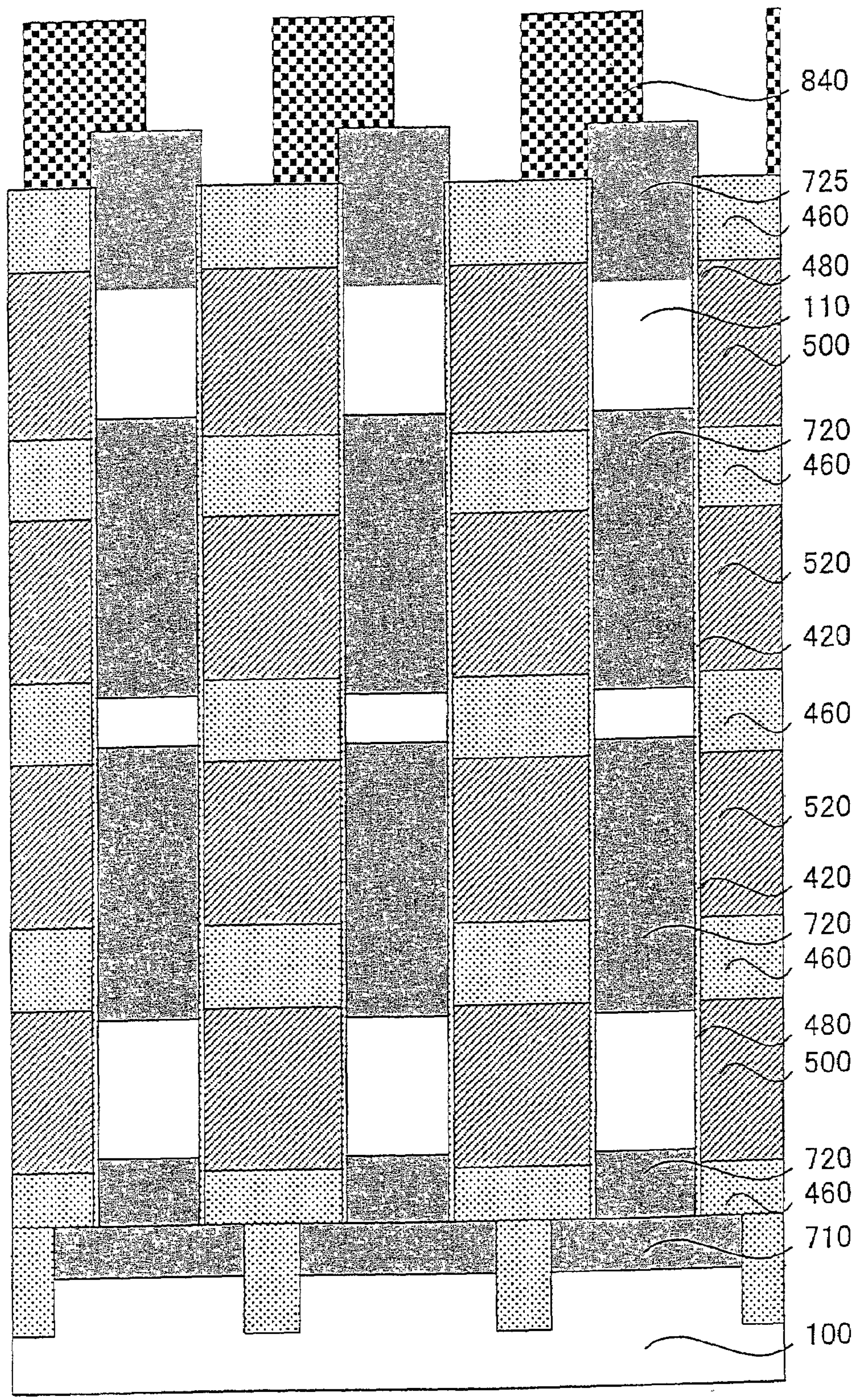
FIG. 113 is a sectional view of a semiconductor memory having MIS capacitors as charge storage layers in accordance with the present invention, corresponding to a sectional view as taken on line A–A' in FIG. 1.
Figure 114:
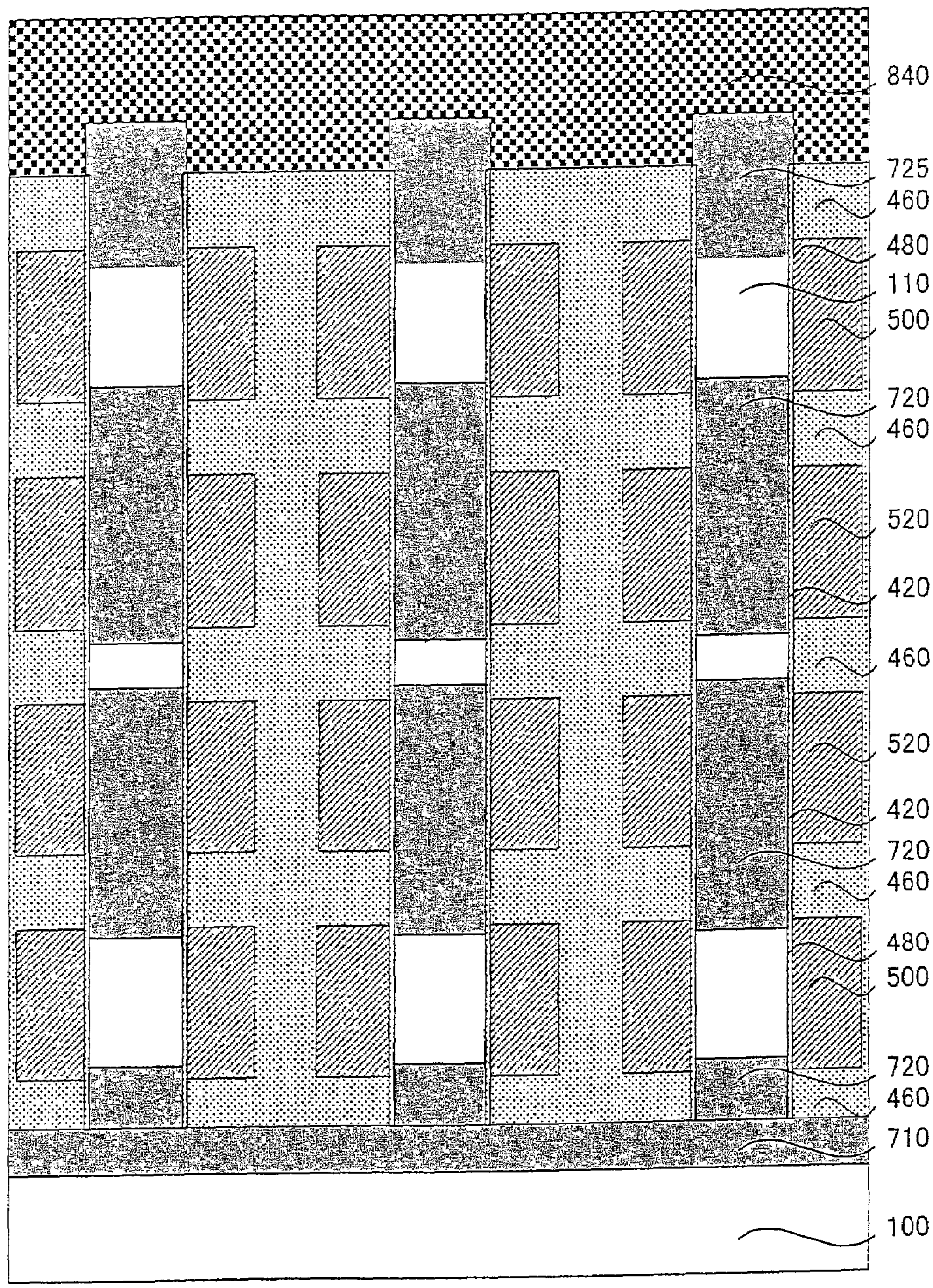
FIG. 114 is a sectional view of a semiconductor memory having MIS capacitors as charge storage layers in accordance with the present invention, corresponding to a sectional view as taken on line B–B' in FIG. 1.
Figure 115:
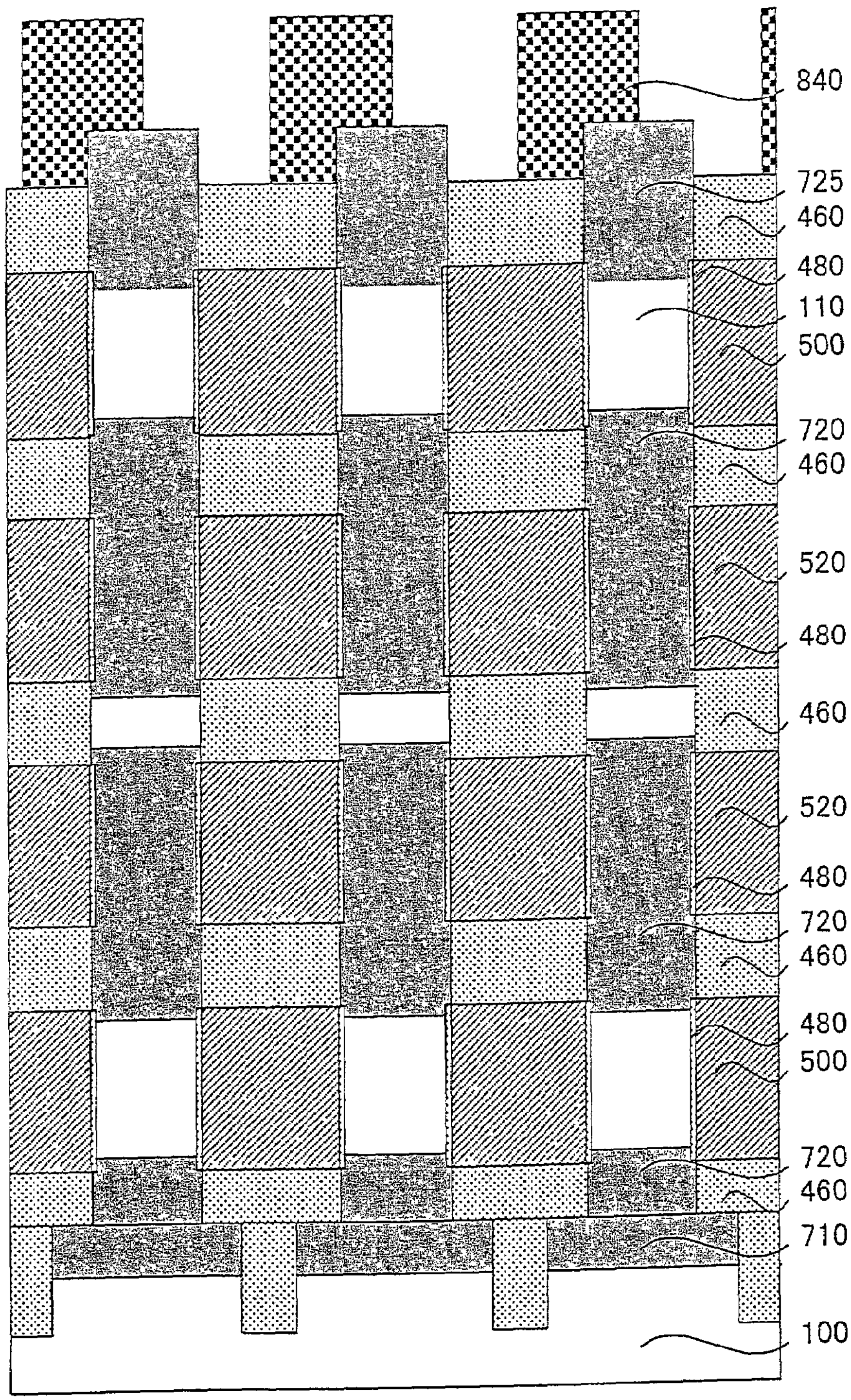
FIG. 115 is a sectional view of a semiconductor memory having MIS capacitors as charge storage layers, corresponding to a sectional view as taken on line A–A' in FIG. 1.
Figure 116:
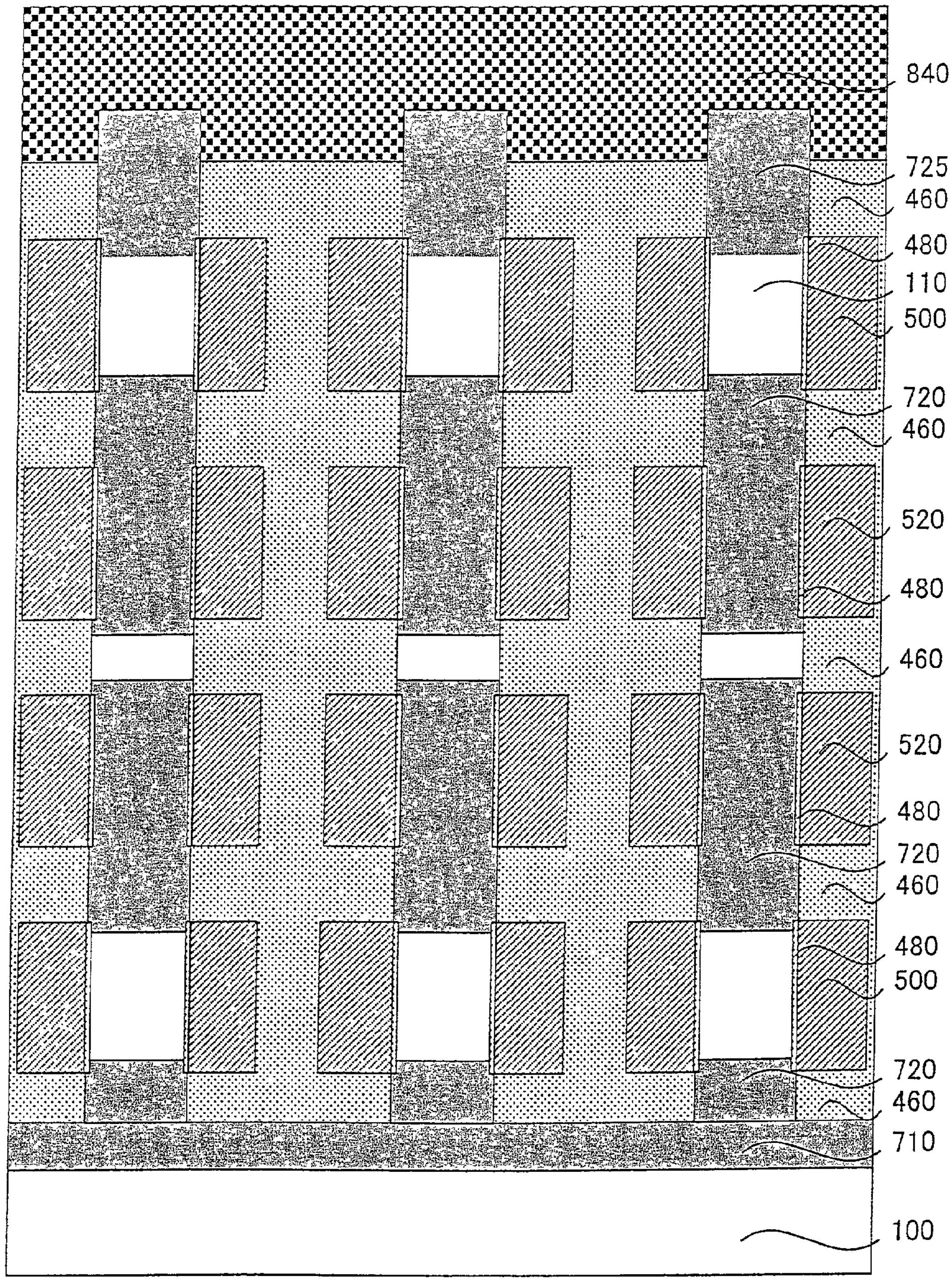
FIG. 116 is a sectional view of a semiconductor memory having MIS capacitors as charge storage layers, corresponding to a sectional view as taken on line A–A' in FIG. 1.

In the example of FIG. 105 and FIG. 106, in contrast to FIG. 101 and FIG. 102, the thickness of the laminated insulating films is smaller than the thickness of the gates of the selection gate transistors.

FIG. 113 to FIG. 118 show sectional views of semiconductor memories having MIS capacitors as charge storage layers. Of FIG. 113 to FIG. 118, odd-numbered figures show sectional views taken on line A–A' in FIG. 66 which is a plan view illustrating DRAM memory cell array and even-numbered figures show sectional views taken on line B–B' in FIG. 66.

Examples shown in FIG. 113 to FIG. 118 are the same as those shown in FIG. 73 to FIG. 76 except that the charge storage layers are changed from the floating gates to the MIS capacitors, the diffusion layers are positioned on the side of memory capacitors and the bit lines (the fourth wiring) are in parallel to the source lines (the first wiring).

FIG. 119 to FIG. 122 show sectional views of semiconductor memories having MIS transistors as charge storage layers. FIG. 119 to FIG. 122 show sectional views taken on line J1–J1', J2–J2', K1–K1' and K2–K2' in FIG. 67 which is a plan view illustrating SRAM memory cell array.

Figure 119:
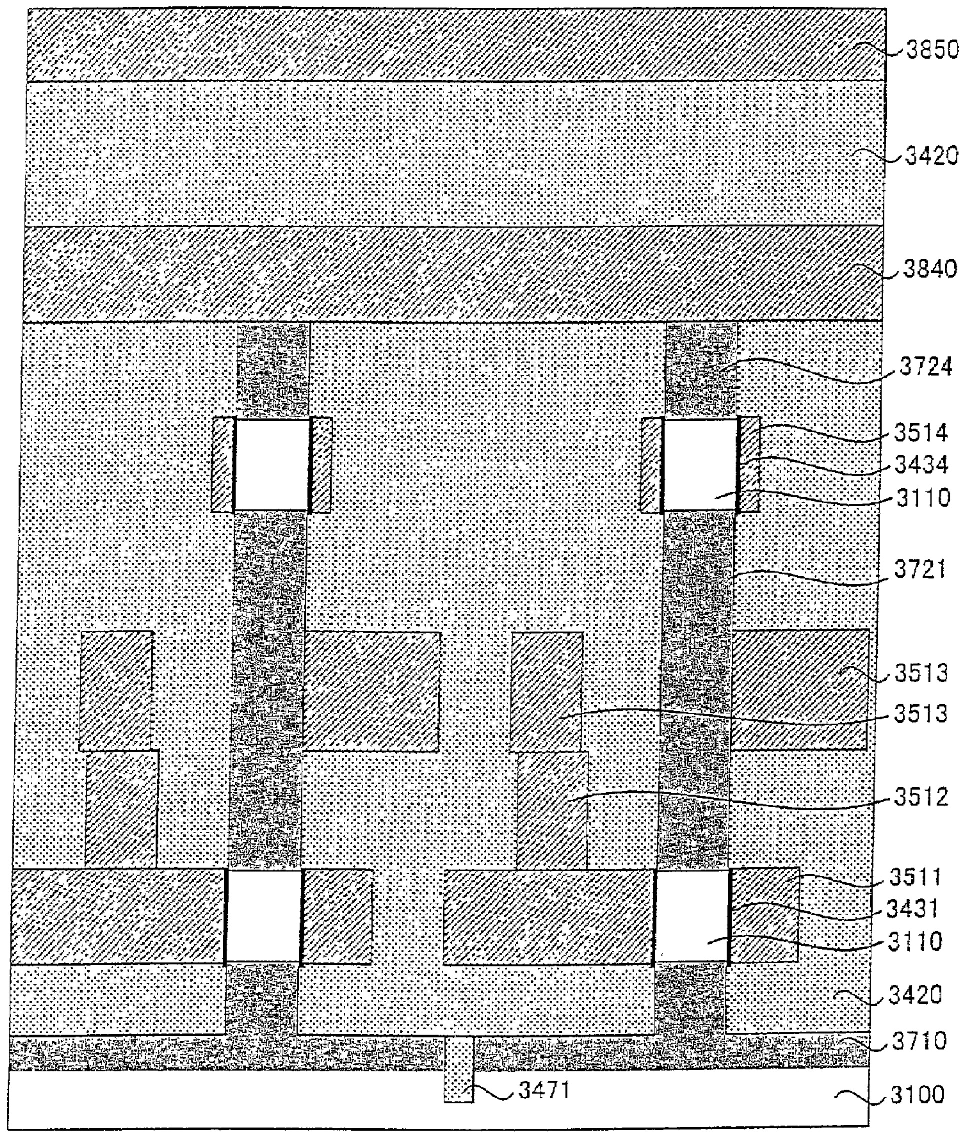
FIG. 119 is a sectional view of a semiconductor memory having MIS transistors as charge storage layers, corresponding to a sectional view as taken on line A–A' in FIG. 1.
Figure 120:
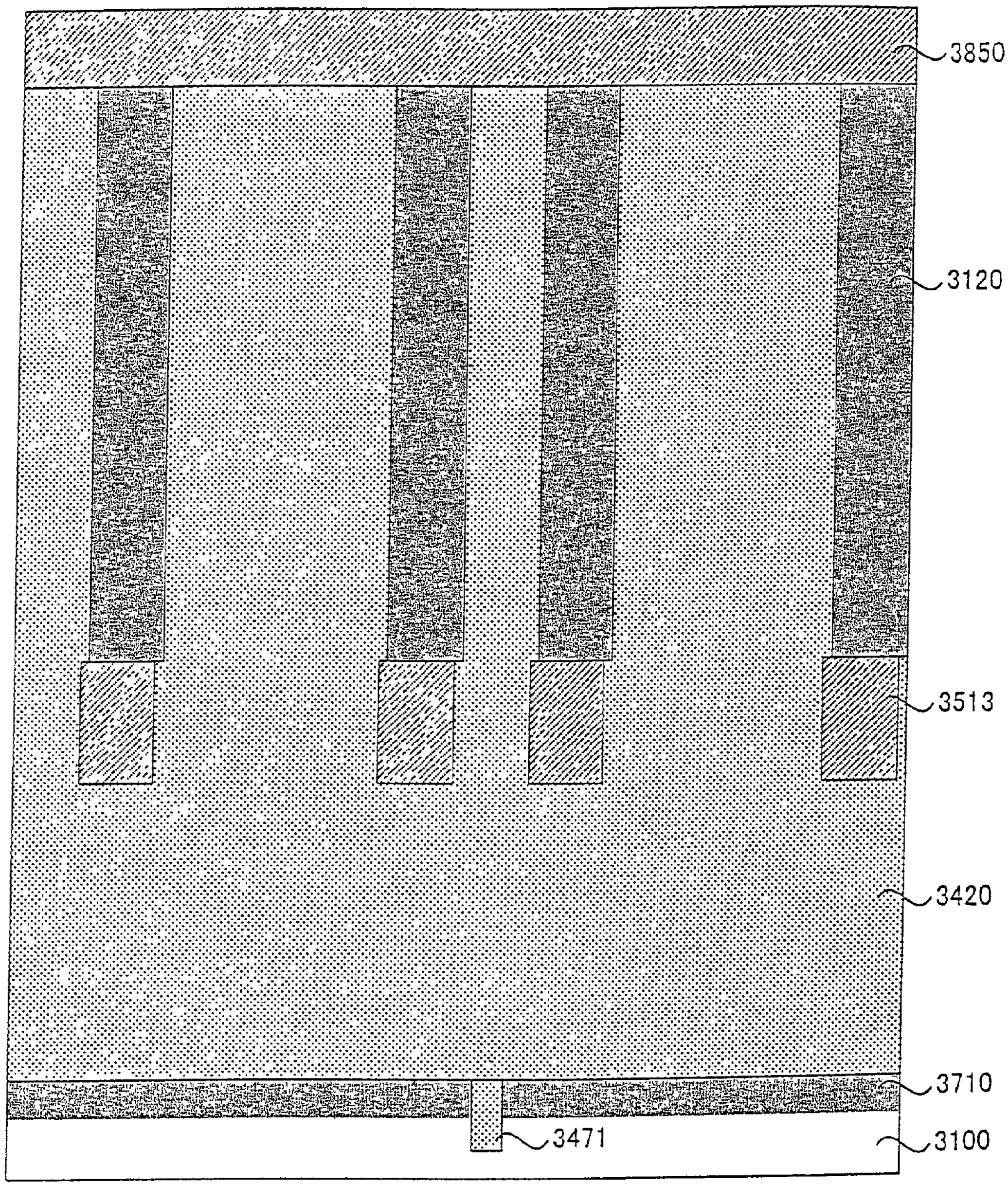
FIG. 120 is a sectional view of a semiconductor memory having MIS transistors as charge storage layers, corresponding to a sectional view as taken on line B–B' in FIG. 1.
Figure 121:
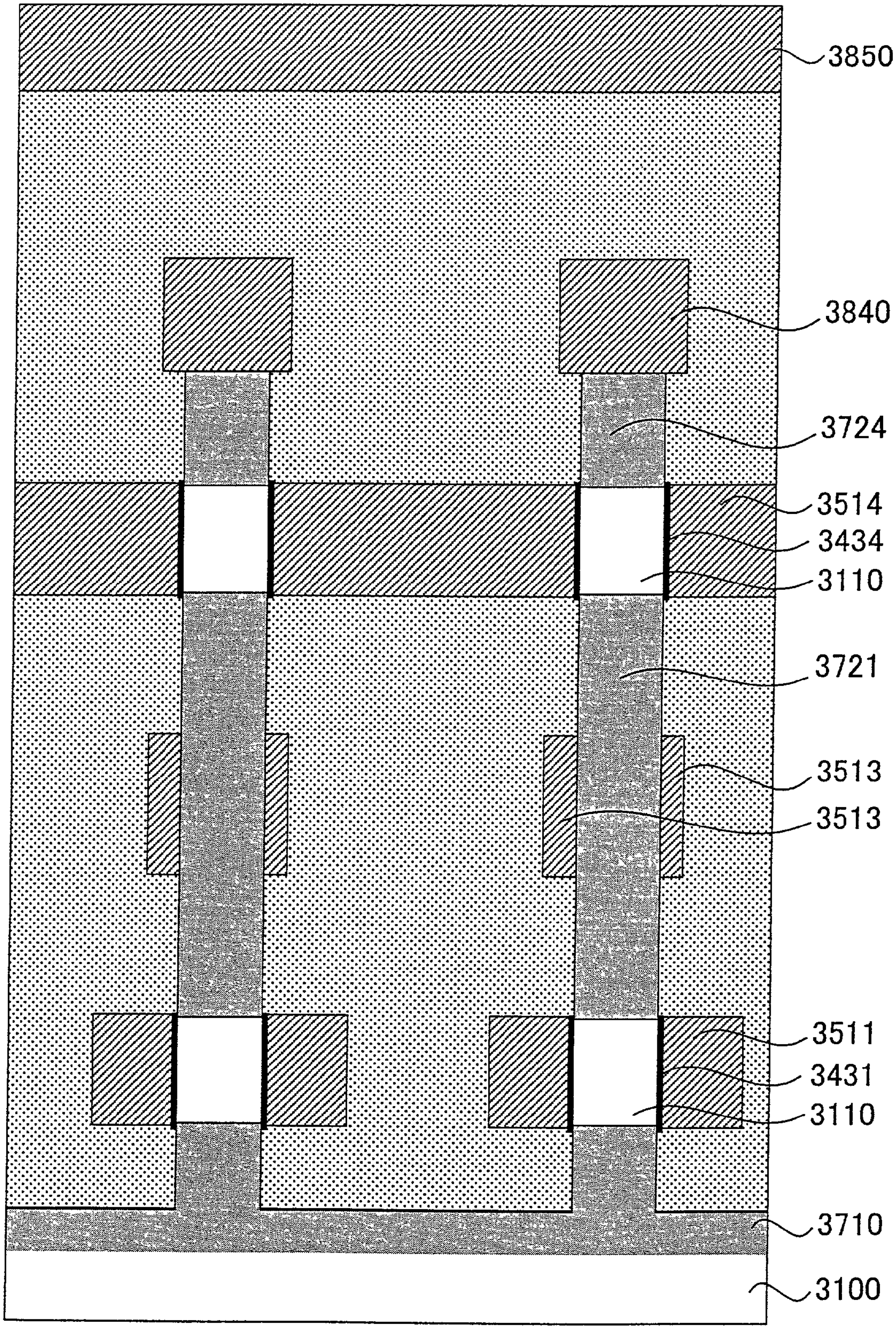
FIG. 121 is a sectional view of a semiconductor memory having MIS transistors as charge storage layers, corresponding to a sectional view as taken on line A–A' in FIG. 1.

In examples shown in FIG. 119 to FIG. 122, a plurality of island-like semiconductor layers 3110 are formed in matrix on a P-type silicon substrate 3100. As shown in FIG. 119 and FIG. 121, two MIS transistors are disposed in an upper part and in a lower part of each island-like semiconductor layer 3110. The transistors are connected in series along each island-like semiconductor layer. More particularly, memory gates 3511 are disposed on the sidewall of each island-like semiconductor layer 3110 with intervention of a gate insulating film 3431 so as to surround the island-like semiconductor layer 3110. A third electrode 3514 functioning as a control gate is disposed on the sidewall of the island-like semiconductor layer 3110 with intervention of a gate insulating film 3434 above the memory gate transistor. As shown in FIG. 121, the third electrode 3514 is provided continuously with regard to a plurality of transistors in one direction to form a control gate line.

Further, as shown in FIG. 119 and FIG. 121, an impurity diffusion layer 3710 is formed in the semiconductor substrate electrically in common to transistors disposed at the bottom so that the active regions of memory cells are in a floating state with respect to the semiconductor substrate. Further, diffusion layers 3721 are formed in the island-like semiconductor layers 3110 so that the active region of each memory cell is in the floating state. Impurity diffusion layers 3724 for the memory cells are formed on the tops of the respective island-like semiconductor layers 3110. Thereby the transistors are connected in series along the island-like semiconductor layers 3110. As shown in FIG. 119 and FIG. 121, fourth wiring layers 3840 are provided as bit lines to connect second impurity diffusion layers 3724 of memory cells in a direction crossing the control gate lines.

Figure 122:
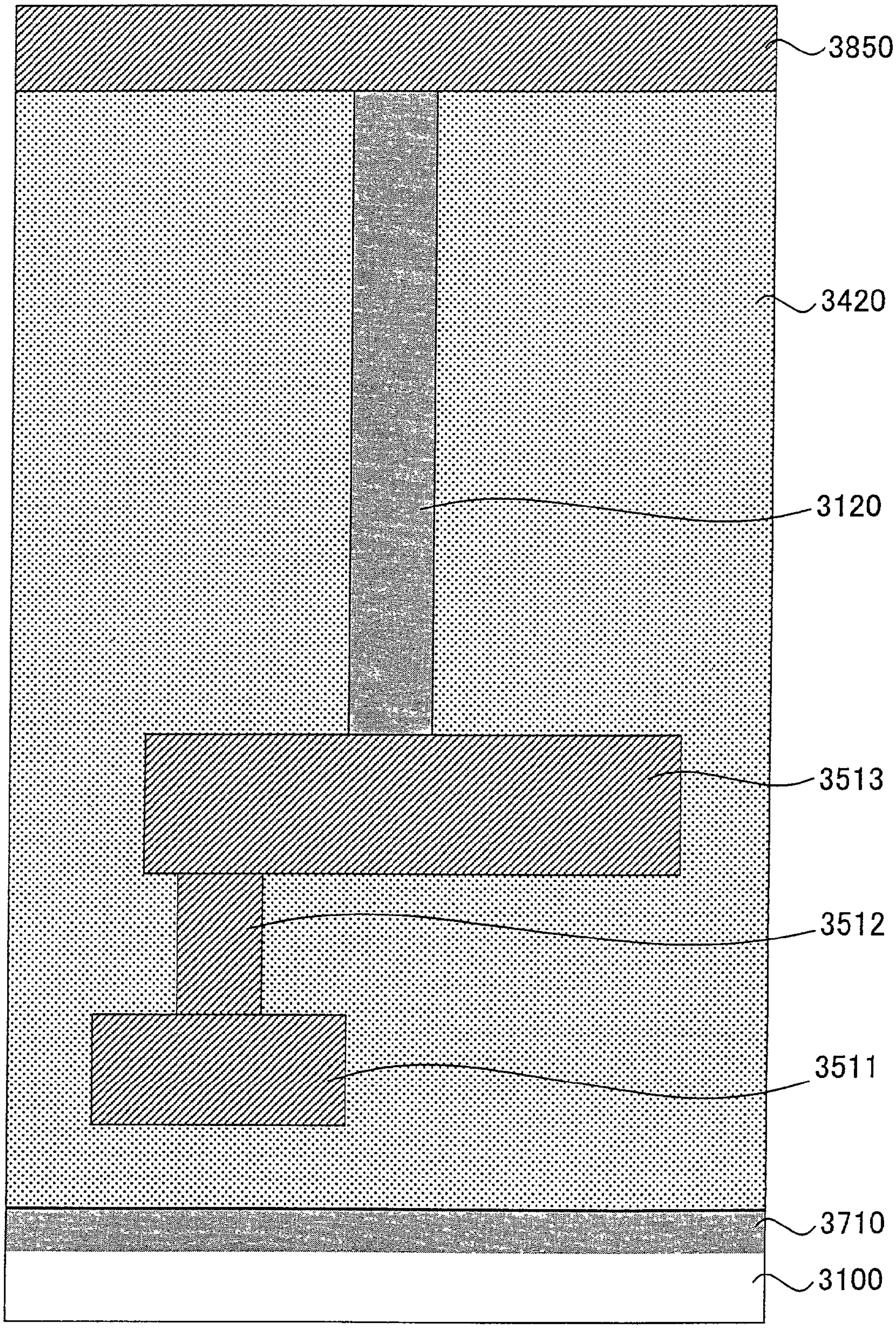
FIG. 122 is a sectional view of a semiconductor memory having MIS transistors as charge storage layers, corresponding to a sectional view as taken on line B–B' in FIG. 1.

In this example, a memory cell is constituted of four transistors and two high-resistance elements formed of a pair of island-like semiconductor layers. As shown in FIG. 119 and FIG. 121, a first conductive film 3511 which is a memory gate is connected to a second impurity diffusion layer 3721 located in an opposing island-like semiconductor layer via a second conductive film 3512 and a third conductive film 3513. Further, as shown in FIG. 120 and FIG. 122, the third conductive film 3513 connected to the second impurity diffusion layer 3721 located in each of the island-like semiconductor layers 3110 is connected to a second wiring layer 3120 formed of impurity diffusion layer which functions as a high-resistance element. The second wiring layers 3120 are connected to fifth wiring layers which forms electrically common electrodes. Also as shown in FIG. 120 and FIG. 122, a first impurity diffusion layer 3710 electrically common to memory cells adjacent in the direction of the fourth wiring layers 3840 is electrically insulated by an insulating separation film, e.g., a silicon oxide film 3471 which is an eleventh insulating film.

The memory cells and wiring layers thus arranged are insulated from each other by placing an oxide film 3420 which is a third insulating film.

In this example, the memory cell is constituted of four transistors formed on sidewalls of P-type island-like semiconductor layers and two high-resistance elements. However, transistors formed on an N-type semiconductor may be used instead of the high-resistance elements. The constitution of the memory cell is not particularly limited so long as a desired function can be obtained.

Embodiments of Operating Principles of Memory Cell Arrays

The above-described semiconductor memories have the memory function according to the state of a charge stored in the charge storage layer. The operating principles for reading, writing and erasing data will be explained with a memory cell having a floating gate as the charge storage layer, for example.

A reading process is now explained with a semiconductor memory according to the present invention which is so constructed that, in island-like semiconductor layers having memory cells provided with a charge storage layer and a third electrode as a control gate electrode, a fourth electrode is connected to one end of each island-like semiconductor layer and a first electrode is connected to another end of the island-like semiconductor layer.

Figure 123:
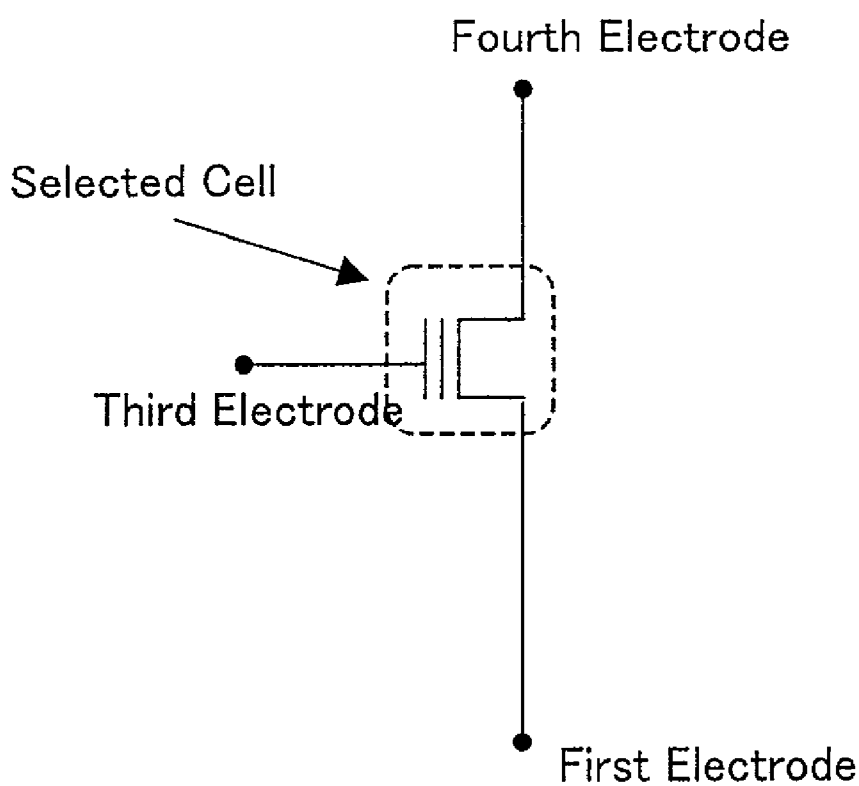
FIG. 123 to FIG. 178 are equivalent circuit diagrams of semiconductor memories in accordance with the present invention.

FIG. 123 shows the equivalent circuit diagram of the memory cell of the semiconductor memory of this structure.

For example, in the case where the island-like semiconductor layers are formed of a P-type semiconductor, a selected cell as shown in FIG. 123 is read by applying a first potential to the first electrode, a third potential to the third electrode connected to the selected cell and a fourth potential to the fourth electrode connected to the selected cell. The fourth potential is larger than the first potential. A “0” or “1” is judged from a current flowing through the fourth or first electrode. At this time, the third potential is a potential allowing the distinction of the amount of a charge stored in the charge storage layer, i.e., a potential allowing the judgment of “0” or “1.”

Figure 181:
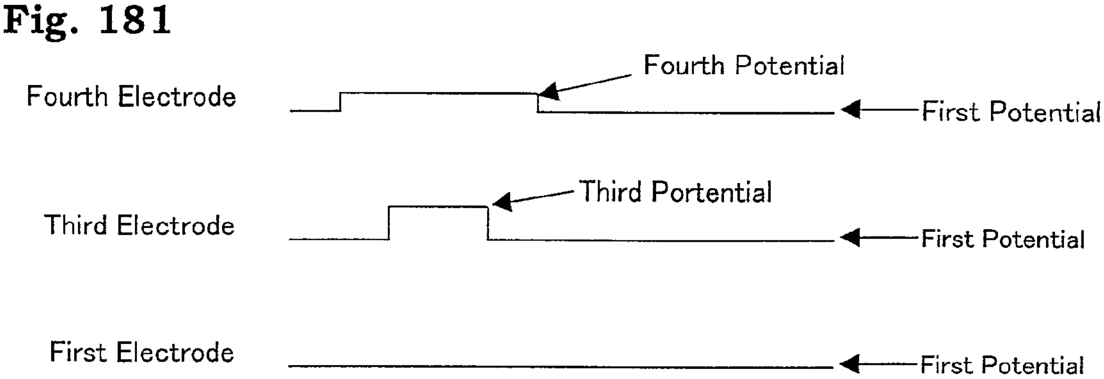

FIG. 181 shows a timing chart showing an example of timing of applying each potential for reading data. In FIG. 181, a ground potential is applied as the first potential, and the memory cell has a threshold of 5.0 V to 7.5 V when it is in a written state and has a threshold of 0.5 V to 3 V when it is in an erased state.

First, the ground potential as the first potential is applied to the first, third and fourth electrodes. In this state, the fourth potential, e.g., 1 V, is applied to the fourth electrode. The third potential, e.g., 4 V, is applied to the third electrode connected to the selected cell, and the current flowing through the fourth or first electrode is sensed. The third electrode is returned to the ground potential, i.e., the first potential, and the fourth electrode is returned to the ground potential, i.e., the first potential.

The potentials may be applied to the respective electrodes in another order or simultaneously. Further, the respective electrodes may be returned to the ground potential, i.e., the first potential, in another order or simultaneously. Here, the same potential is preferably applied initially as the first potential to the first, third and fourth electrodes, but different potentials may be applied. The third potential may be kept applied to the third electrode.

Figure 182:
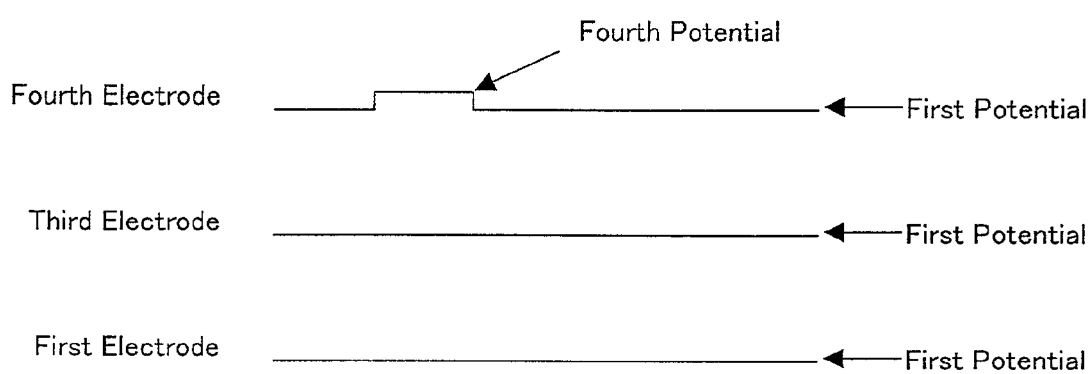

FIG. 182 shows another timing chart showing an example of timing of applying each potential for reading data. In FIG. 182, a ground potential is applied as the first potential, and the memory cell has a threshold of 1.0 V to 3.5 V when it is in the written state and has a threshold of −1.0 V or lower when it is in the erased state.

First, the ground potential as the first potential is applied to the first, third and fourth electrodes. In this state, the fourth potential, e.g., 1 V, is applied to the fourth electrode. The third potential, e.g., 0 V, is applied to the third electrode connected to the selected cell, and the current flowing through the fourth or first electrode is sensed. The third electrode is returned to the ground potential, i.e., the first potential, and the fourth electrode is returned to the ground potential, i.e., the first potential.

The potentials may be applied to the respective electrodes in another order or simultaneously. Further, the respective electrodes may be returned to the ground potential, i.e., the first potential, in another order or simultaneously.

Here, the same potential is preferably applied initially as the first potential to the first, third and fourth electrodes, but different potentials may be applied. The third potential may be kept applied to the third electrode.

The examples of the principle of reading a memory cell formed of the P-type semiconductor have been described above. The polarity of all the electrodes may be reversed as in the case of island-like semiconductor layers formed of an N-type semiconductor. At this time, the potentials have a relationship in magnitude reverse to that mentioned above.

A reading process is now explained with a semiconductor memory according to the present invention which is constructed to have island-like semiconductor layers which include, as selection gate transistors, a transistor provided with a second electrode as a gate electrode and a transistor provided with a fifth electrode as a gate electrode, a plurality of (e.g., L (L is a positive integer)) memory cells having a charge storage layer between the selection gate transistors and provided with a third electrode as a control gate electrode, the memory cells being connected in series.

Figure 124:
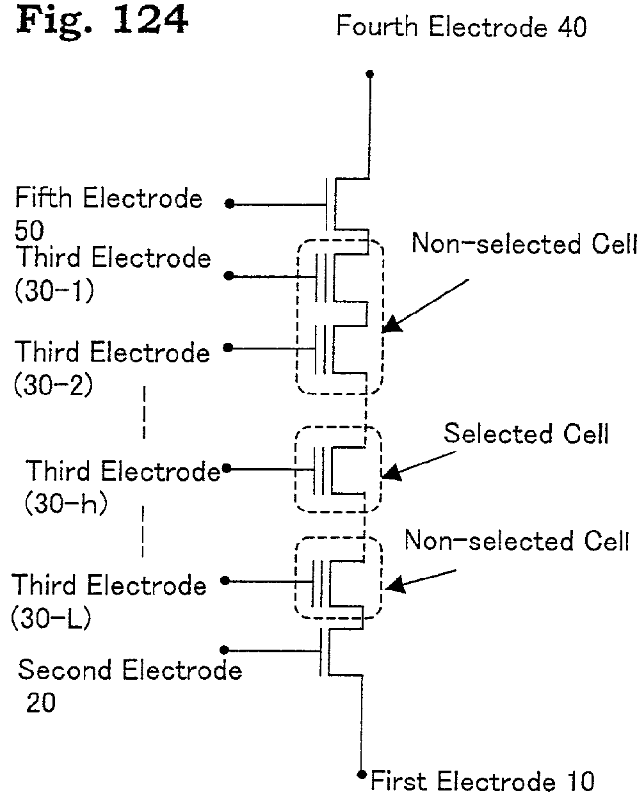

FIG. 124 shows the equivalent circuit diagram of the above-described memory cell. For example, in the case the island-like semiconductor layers are formed of a P-type semiconductor, a selected cell as shown in FIG. 124 is read out by applying a first potential to a first electrode 10 connected to the island-like semiconductor layer including the selected cell, a second potential to a second electrode 20 arranged in series with the selected cell, a third potential to a third electrode (30-h) ($1 \leqq h \leqq L$, wherein h is a positive integer) connected to the selected cell, a seventh potential to third electrodes (30-1 to 30-(h−1)) connected to non-selected cells arranged in series with the selected cell, an eleventh potential to third electrodes (30-(h+1) to 30-L) connected to non-selected cells arranged in series with the selected cell, a fourth potential to a fourth electrode and a fifth potential to the fifth electrode 50 arranged in series with the selected cell. The fourth potential is larger than the first potential. The “0” or “1” is judged from the current flowing through the fourth electrode 40 or the first electrode 10. At this time, the third potential is a potential allowing the distinction of the amount of a charge stored in the charge storage layer, i.e., a potential allowing the judgment of “0” or “1.” The seventh and eleventh potentials are potentials always allowing a cell current to flow through the memory cell regardless of the amount of the charge stored in the charge storage layer, i.e., potentials allowing the formation of a reverse layer in the channel region of the memory cell. For example, they are not lower than the threshold voltage that the memory transistor having the third electrode as the gate electrode can take. If h=1, third electrodes (30-2 to 30-L) are given the same potential as the third electrodes (30-(h+1) to 30-L) are given when 2≦h≦L−1. If h=L, the third electrodes (30-1 to 30-(L−1)) are given the same potential as the third electrodes (30-1 to 30-(h−1)) are given when 2≦h≦L−1. This can apply to other examples illustrated in FIGS. 179 to 278 attached to the present specification.

The second and fifth potentials are potentials allowing the cell current to flow, e.g., potentials not lower than the threshold voltages that the memory transistors having the second and fifth electrodes as the gate electrodes can take. In the case where the first electrode 10 is formed as an impurity diffusion layer in the semiconductor substrate and the channel region of the selected memory cell is electrically connected to the semiconductor substrate, the first potential applied to the first electrode 10 connected to the island-like semiconductor layer including the selected cell is such that, by applying the first potential, the island-like semiconductor layer becomes in the electrically floating state from the semiconductor substrate by a depletion layer extended toward the semiconductor substrate. Thereby, the potential of the island-like semiconductor layer equals the first potential, and the selected cell on the island-like semiconductor layer can be read without being affected by the potential of the substrate.

The selected memory cell is apparently back-biased to the substrate since the potential of the first electrode rises with respect to the potential of the substrate because of a resistant component in the impurity diffusion layer from the first electrode of the island-like semiconductor layer including the selected memory cell to a power source when a reading current flows through the first electrode.

However, in the present invention, it is possible to prevent a back-bias effect which may occur when the semiconductor substrate is electrically connected with the channel region of a memory cell on the island-like semiconductor layer and has the same potential with the channel region, and a rise in the threshold and a decrease in the current owing to the back bias can be prevented.

In the case where the first electrode 10 is formed as an impurity diffusion layer in the semiconductor substrate and the tenth potential applied to the semiconductor substrate is the ground potential, the first potential is generally a ground potential. In the case where the first electrode 10 is formed to be electrically insulated from the semiconductor substrate, for example, where the first electrode 10 is formed of an impurity diffusion layer in an SOI substrate and is insulated from the semiconductor substrate by an insulating film, the first potential is not necessarily the same as the tenth potential. The memory cells may be sequentially read out from a memory cell connected to a third electrode (30-L) to a memory cell connected to a third electrode (30-1), or may be read in an opposite order or at random.

Figure 183:
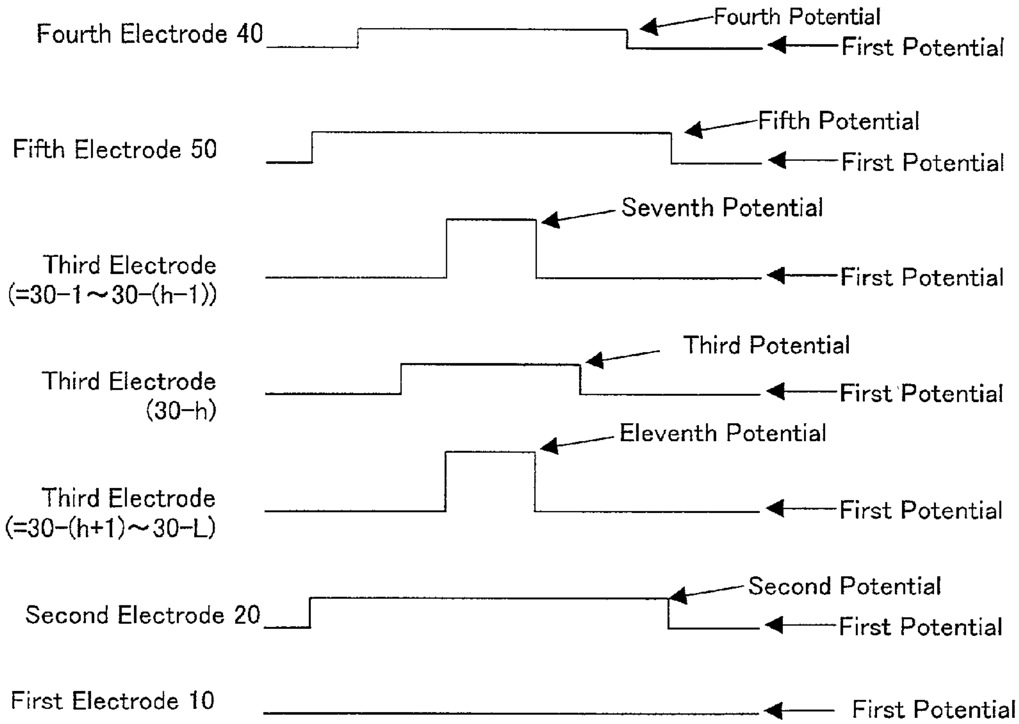

FIG. 183 shows a timing chart showing an example of timing of applying each potential for reading data. In FIG. 183, a ground potential is applied as the first potential, and the thresholds of the transistors having the second electrode and the fifth electrode are, for example, 0.5 V. The memory cell has a threshold of 5.0 V to 7.5 V when it is in the written state and has a threshold of 0.5 V to 3 V when it is in the erased state.

First, the ground potential as the first potential is applied to the first electrode 10, the second electrode 20, the third electrodes 30, the fourth electrode 40 and the fifth electrode 50. In this state, the second potential, e.g., 3 V, is applied to the second electrode. The fifth potential, e.g., 3 V which is equal to the second potential, is applied to the fifth electrode. The fourth potential, e.g., 1 V, is applied to the fourth electrode. The third potential, e.g., 4 V, is applied to the third electrode (30-h) connected to the selected cell. The seventh potential, e.g., 8 V is applied to the third electrodes (30-1 to 30-(h−1)) and the eleventh potential, e.g., 8 V which is equal to the seventh potential, is applied to the third electrodes (30-(h+1) to 30-L). The current flowing through the fourth or first electrode is sensed.

Third electrodes (not 30-h) other than the third electrode (30-h) are returned to the ground potential, i.e., the first potential, and the third electrode (30-h) is returned to the ground potential, i.e., the first potential. The fourth electrode 40 is returned to the ground potential, i.e., the first potential. The second electrode 20 and the fifth electrode 50 are returned to the ground potential, i.e., the first potential. The potentials may be applied to the respective electrodes in another order or simultaneously. Further, the respective electrodes may be returned to the ground potential, i.e., the first potential, in another order or simultaneously. The second and fifth potentials may be different, and the eleventh and seventh potentials may be different. Here, the same potential is preferably applied initially as the first potential to the first electrode 10, the second electrode 20, the third electrodes (30-1 to 30-L), the fourth electrode 40 and the fifth electrode 50, but different potentials may be applied. The third potential may be kept applied to the third electrode (30-h).

In the above example, the reading process has been described with the case where the selected cell is a memory cell having the third electrode (30-h) as the gate electrode. However, the reading process is the same with the case where the selected cell is a memory cell having a third electrode other than the third electrode (30-h) as the gate electrode. The first and fourth potentials may be changed with each other.

Figure 184:
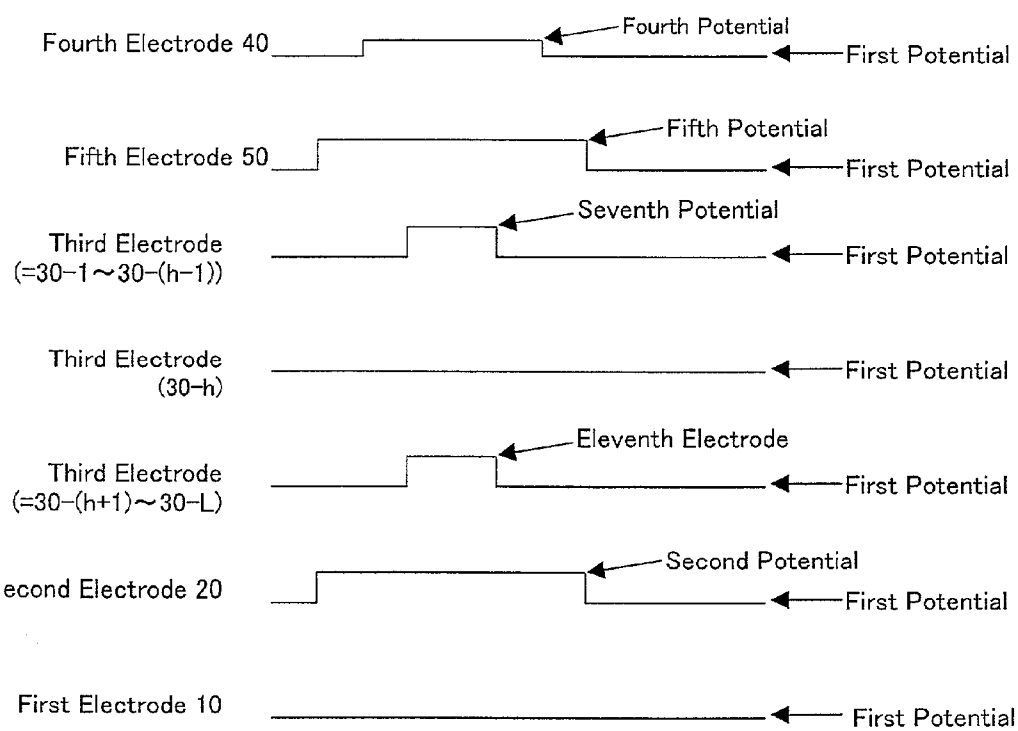

FIG. 184 shows a timing chart showing an example of timing of applying each potential for reading data. In FIG. 184, a ground potential is applied as the first potential, and the thresholds of the transistors having the second electrode and the fifth electrode are, for example, 0.5 V. The memory cell has a threshold of 1.0 V to 3.5 V when it is in the written state and has a threshold of −1.0 V or lower when it is in the erased state.

First, the ground potential as the first potential is applied to the first electrode 10, the second electrode 20, the third electrodes 30, the fourth electrode 40 and the fifth electrode 50. In this state, the second potential, e.g., 3 V, is applied to the second electrode 20, and the fifth potential, e.g., 3 V which is equal to the second potential, is applied to the fifth electrode 50. The fourth potential, e.g., 1 V, is applied to the fourth electrode 40, and the third potential, e.g., the ground potential which is the first potential, is kept applied to the third electrode (30-h) connected to the selected cell. The seventh potential, e.g., 5 V, is applied to the third electrodes (30-1 to 30-(h−1)) connected to the non-selected cells arranged in series with the selected cell, and the eleventh potential, e.g., 5 V which is equal to the seventh potential, is applied to the third electrodes (30-(h+1) to 30-L) connected to the non-selected cells arranged in series with the selected cell. The current flowing through the fourth electrode 40 or the first electrode 10 is sensed. The third electrodes (not 30-h) other than the third electrode (30-h) are returned to the ground potential, i.e., the first potential, and the fourth electrode 40 is returned to the ground potential, i.e., the first potential. The second electrode 20 and the fifth electrode 50 are returned to the ground potential, i.e., the first potential. The potentials may be applied to the respective electrodes in another order or simultaneously. Further, the respective electrodes may be returned to the ground potential, i.e., the first potential, in another order or simultaneously. The second and fifth potentials may be different, and the eleventh and seventh potentials may be different. Here, the same potential is preferably applied initially as the first potential to the first electrode 10, the second electrode 20, the third electrodes (30-1 to 30-L), the fourth electrode and the fifth electrode 50, but different potentials may be applied. The third potential may be kept applied to the third electrode (30-h). The third electrode (30-h) may at the ground potential.

In the above example, the reading process has been described with the case where the selected cell is a memory cell having the third electrode (30-h) as the gate electrode. However, the reading process is the same with the case where the selected cell is a memory cell having a third electrode other than the third electrode (30-h) as the gate electrode. The first and fourth potentials may be changed with each other.

Have been described above the examples of the principle of reading date in the case of island-like semiconductor layers having a plurality of (e.g., L (L is a positive integer)) memory cells formed of the P-type semiconductor arranged in series and selection transistors formed to sandwich the memory cells. The polarity of all the electrodes may be reversed as in the case of island-like semiconductor layers formed of an N-type semiconductor. At this time, the potentials have a relationship in magnitude reverse to that mentioned above.

A reading process is now explained with a semiconductor memory according to the present invention which is so constructed to have island-like semiconductor layers provided with, for example, two memory cells connected in series, the memory cells having the charge storage layer between the selection gate transistors and a third electrode as a control gate electrode.

Figure 126:
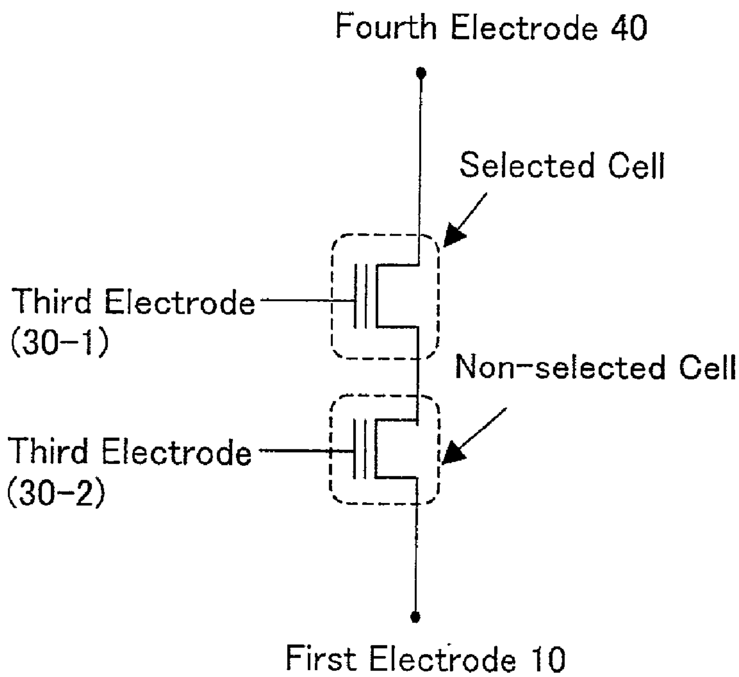

FIG. 126 shows the equivalent circuit diagram of the above-described memory cell.

For example, in the case where the island-like semiconductor layer is formed of a P-type semiconductor, a selected cell shown in FIG. 126 is read by applying a first potential to the first electrode 10 connected to an island-like semiconductor layer including the selected cell, a third potential to the third electrode (30-1) connected to the selected cell and an eleventh potential to a third electrode (30-2) connected to a non-selected cell arranged in series with the selected cell, a fourth potential to the fourth electrode 40 connected to the island-like semiconductor layer including the selected cell. The fourth potential is larger than the first potential. A "0" or "1" is judged from a current flowing through the fourth electrode 40 or the first electrode 10. At this time, the third potential is a potential allowing the distinction of the amount of a charge stored in the charge storage layer, i.e., a potential allowing the judgement of "0" or "1." The eleventh potential is a potential always allowing a cell current to flow through the memory cell regardless of the amount of the charge stored in the charge storage layer, i.e., a potential allowing the formation of a reverse layer in the channel region of the memory cell. For example, the eleventh potential is not lower than the threshold voltage that the memory transistor having the third electrode as the gate electrode can take.

In the case where the first electrode 10 is formed as an impurity diffusion layer in the semiconductor substrate and the channel region of a selected memory cell is electrically connected to the semiconductor substrate, the first potential applied to the first electrode 10 connected to the island-like semiconductor layer including the selected cell is such that, by applying the first potential, the island-like semiconductor layer becomes in the electrically floating state from the semiconductor substrate by a depletion layer extended toward the semiconductor substrate.

Thereby, the potential of the island-like semiconductor layer equals the first potential, and the selected cell on the island-like semiconductor layer can be read without being affected by the potential of the substrate.

The selected memory cell is apparently back-biased to the substrate since the potential of the first electrode rises with respect to the potential of the substrate because of a resistant component in the impurity diffusion layer from the first electrode of the island-like semiconductor layer including the selected memory cell to a power source when a reading current flows through the first electrode.

However, in the present invention, it is possible to prevent a back-bias effect which may occur when the semiconductor substrate is electrically connected with the channel region of a memory cell on the island-like semiconductor layer and has the same potential with the channel region, and a rise in the threshold and a decrease in the current owing to the back bias can be prevented.

In the case where the first electrode 10 is formed as the impurity diffusion layer in the semiconductor substrate and the tenth potential applied to the semiconductor substrate is the ground potential, the first potential is generally the ground potential. In the case where the first electrode 10 is electrically insulated from the semiconductor substrate, for example, where the first electrode 10 is formed of an impurity diffusion layer on an SOI substrate and is insulated from the semiconductor substrate by an insulating film, the first potential is not necessarily the same as the tenth potential.

Figure 185:
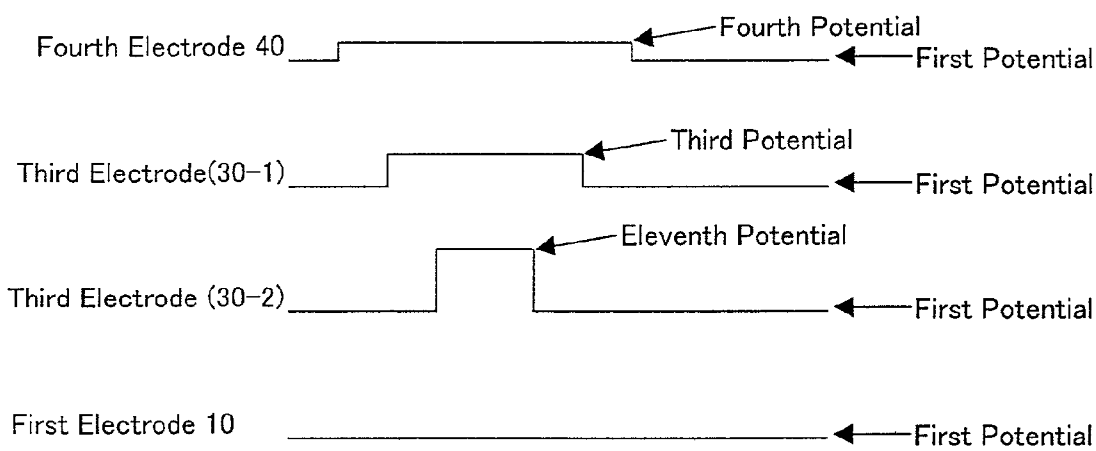

FIG. 185 shows a timing chart showing an example of timing of applying each potential for reading data. In FIG. 185, a ground potential is applied as the first potential, and the thresholds of the transistors having the second electrode and the fifth electrode are, for example, 0.5 V. The memory cell has a threshold of 5.0 V to 7.5 V when it is in the written state and has a threshold of 0.5 V to 3 V when it is in the erased state.

First, the ground potential as the first potential is applied to the first electrode 10, the third electrodes (30-1 to 30-2) and the fourth electrode 40. In this state, the fourth potential, e.g., 1 V, is applied to the fourth electrode 40, and the third potential, e.g., 4 V, is applied to the third electrode (30-1) connected to the selected cell, and the eleventh potential, e.g., 8 V which is equal to the seventh potential, is applied to the third electrode (30-2) connected to a non-selected cell arranged in series with the selected cell. The current flowing through the fourth electrode 40 or the first electrode 10 is sensed. The third electrode (30-2) is returned to the ground potential, i.e., the first potential, the third electrode (30-1) is returned to the ground potential, i.e., the first potential, and the fourth electrode 40 is returned to the ground potential, i.e., the first potential. The potentials may be applied to the respective electrodes in another order or simultaneously. Further, the respective electrodes may be returned to the ground potential, i.e., the first potential, in another order or simultaneously. Here, the same potential is preferably applied initially as the first potential to the first electrode 10, the third electrodes (30-1 to 30-2) and the fourth electrode 40, but different potentials may be applied. The third potential may be kept applied to the third electrode (30-1). The third potential may be a ground potential.

In the above example, the reading process has been described with the case where the selected cell is a memory cell having the third electrode (30-1) as the gate electrode. However, the reading process is the same with the case where the selected cell is a memory cell having a third electrode other than the third electrode (30-1) as the gate electrode. The first and fourth potentials may be changed with each other.

Figure 186:
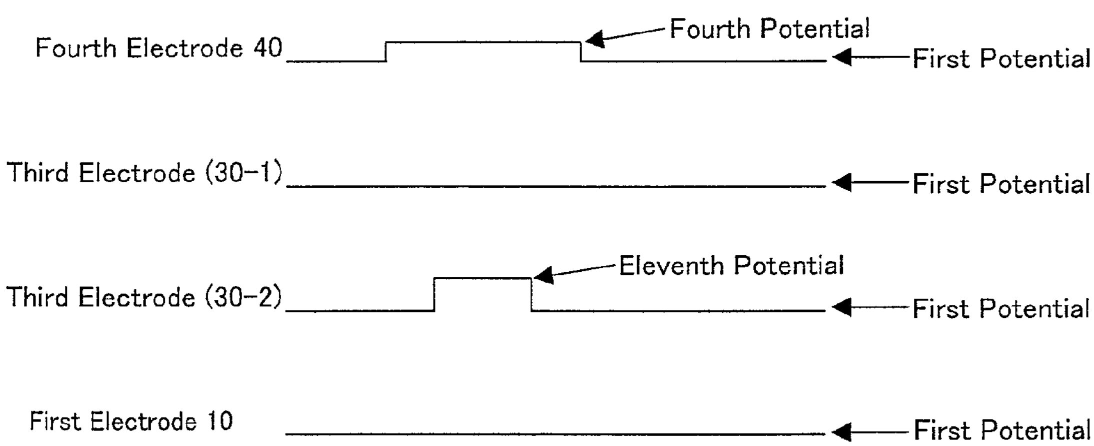

FIG. 186 shows a timing chart showing an example of timing of applying each potential for reading data. In FIG. 186, a ground potential is applied as the first potential, and the thresholds of the transistors having the second electrode and the fifth electrode are, for example, 0.5 V. The memory cell has a threshold of 1.0 V to 3.5 V when it is in the written state and has a threshold of −1.0 V or lower when it is in the erased state.

First, the ground potential as the first potential is applied to the first electrode 10, the third electrodes (30-1 to 30-2) and the fourth electrode 40. In this state, the fourth potential, e.g., 1 V, is applied to the fourth electrode 40, and the third potential, e.g., the ground potential which is the first potential, is applied to the third electrode (30-1) connected to the selected cell. The eleventh potential, e.g., 5 V which is equal to the seventh potential, is applied to the third electrode (30-2) connected to a non-selected cell arranged in series with the selected cell. The current flowing through the fourth electrode 40 or the first electrode 10 is sensed. The third electrode (30-2) is returned to the ground potential, i.e., the first potential, the third electrode (30-1) is returned to the ground potential, i.e., the first potential, and the fourth electrode 40 is returned to the ground potential, i.e., the first potential. The potentials may be applied to the respective electrodes in another order or simultaneously. Further, the respective electrodes may be returned to the ground potential, i.e., the first potential, in another order or simultaneously. Here, the same potential is preferably applied initially as the first potential to the first electrode 10, the third electrodes (30-1 to 30-2) and fourth electrode 40, but different potentials may be applied. The third potential may be kept applied to the third electrode (30-1). The third potential may be a ground potential. In the above example, the reading process has been described with the case where the selected cell is a memory cell having the third electrode (30-1) as the gate electrode. However, the reading process is the same with the case where the selected cell is a memory cell having a third electrode other than the third electrode (30-1) as the gate electrode. The first and fourth potentials may be changed with each other.

Has been described above the examples of the principle of reading the two memory cells arranged in series and formed of the P-type semiconductor. However, the polarity of all the electrodes may be reversed as in the case of island-like semiconductor layers formed of an N-type semiconductor. At this time, the potentials have a relationship in level reverse to that mentioned above.

A reading process is now explained with a semiconductor memory according to the present invention which is constructed to include a plurality of (e.g., M×N, wherein M and N are positive integers) island-like semiconductor layers each having, as selection gate transistors, a transistor provided with the second electrode as a gate electrode and a transistor provide with the fifth electrode as a gate electrode and a plurality of (e.g., L, wherein L is a positive integer) memory cells connected in series, the memory cells each provided with the charge storage layer between the selection gate transistors and the third electrode as a control gate electrode. In this memory cell array, a plurality of (e.g., M) fourth wires arranged in parallel with the semiconductor substrate are connected to end portions of the island-like semiconductor layers, and first wires are connected to opposite end portions of the island-like semiconductor layers. A plurality of (e.g., N×L) third wires are arranged in a direction crossing the fourth wires and are connected to the third electrodes of the memory cells.

Figure 128:
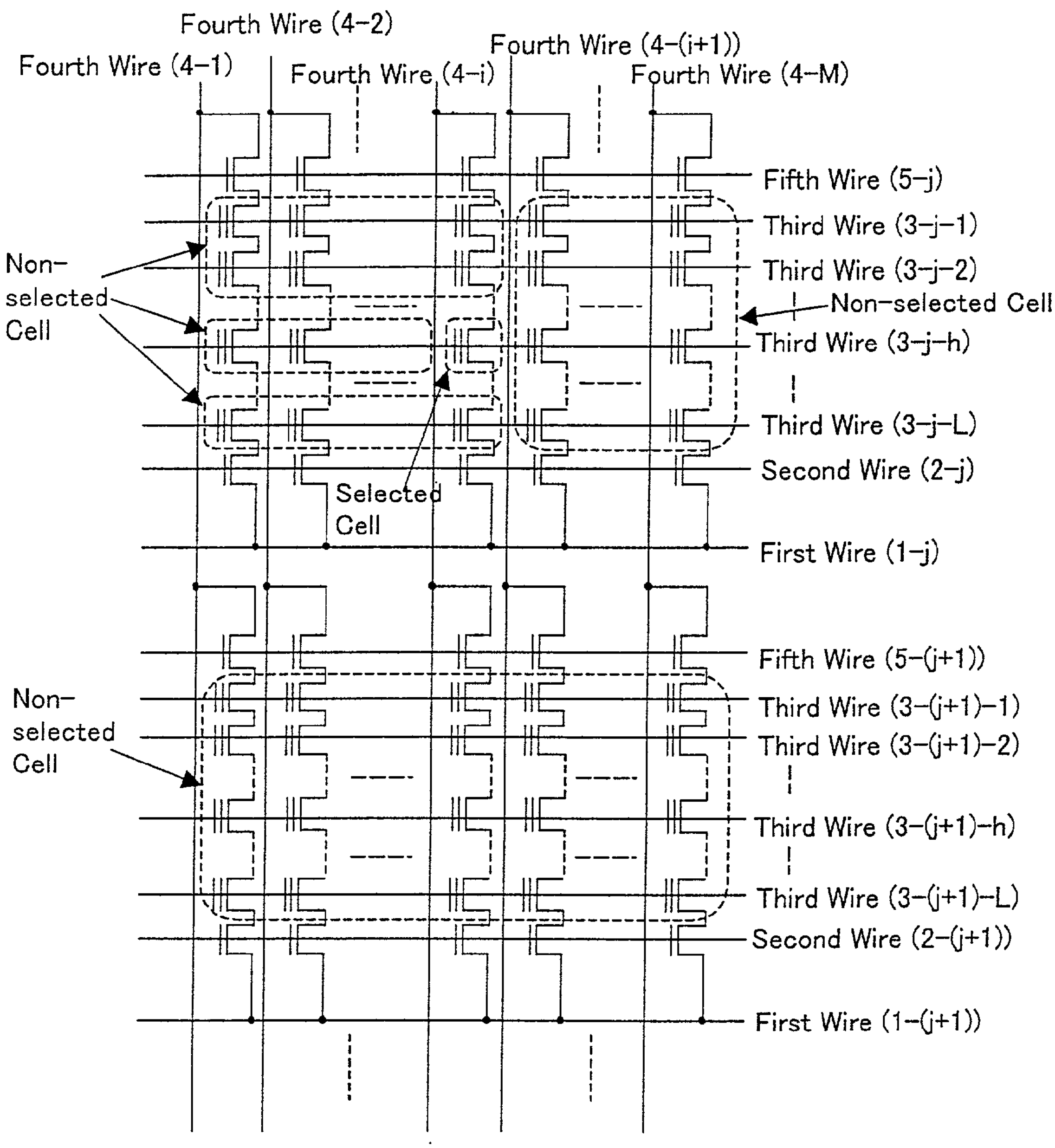

FIG. 128 shows the equivalent circuit diagram of the above-described memory cell array in which the first wires are in parallel to the third wires. For example, in the case where the island-like semiconductor layers are formed of a P-type semiconductor, a selected cell shown in FIG. 128 is read by applying a first potential to the first wire (1-j, wherein j is a positive integer, 1≦j≦N) connected to an island-like semiconductor layer including the selected cell, a second potential to a second wire (2-j) connected to a second electrode arranged in series with the selected cell, a third potential to a third wire (3-j-h, wherein h is a positive integer, 1≦h≦N) connected to the selected cell, a seventh potential to third wires (3-j-1 to 3-j-(h−1)) connected to non-selected cells arranged in series with the selected cell, an eleventh potential to third wires (3-j-(h+1) to 3-j-L) connected to non-selected cells arranged in series with the selected cell, a twelfth potential to third wires (not 3-j-1 to 3-j-L) not arranged in series with the selected cell and connected to non-selected cells, a fourth potential to a fourth wire (4-i, wherein i is a positive integer, 1≦i≦M) connected to the island-like semiconductor layer including the selected cell, an eighth potential to fourth wires (not 4-i) other than the fourth wire (4-i), a fifth potential to a fifth wire (5-j) connected to a fifth electrode arranged in series with the selected cell, and a sixth potential to at least either second wires (not 2-j) other than the second wire (2-j) or fifth wires (not 5-j) other than the fifth wire (5-j). If h=1, third electrodes (3-j-2 to 3-j-L) are provided with the same potential as applied to third electrodes (3-j-(h+1) to 3-j-L) when 2≦h≦L−1. If h=L, third electrodes (3-j-1 to 3-j-(L−1)) are provided with the same potential as applied to third electrodes (3-j-1 to 3-j-(h−1)) when 2≦h≦L−1. The above applies to other examples shown in FIGS. 179 to 278 attached to the present specification.

The fourth potential is larger than the first potential. A “0” or “1” is judged from a current flowing through the fourth wire (4-i) or the first wire (1-i). At this time, the third potential is a potential allowing the distinction of the amount of a charge stored in the charge storage layer, i.e., a potential allowing the judgment of the “0” or “1.” The seventh and eleventh potentials are potentials always allowing a cell current to flow through the memory cell regardless of the amount of the charge stored in the charge storage layer, i.e., potentials allowing the formation of a reverse layer in the channel region of the memory cell. For example, the seventh and eleventh potentials are not lower than the threshold voltage that a memory transistor having the third electrode connected to the third wire as the gate electrode can take. The second and fifth potentials are potentials allowing a cell current to flow, for example, potentials not lower than the threshold voltages that memory transistors having the second electrode connected to the second wire and the fifth electrode connected to the fifth wire as the gate electrodes can take. The sixth potential is a potential not allowing a cell current to flow, for example, potentials not higher than the threshold voltages that the memory transistors having the second electrode connected to the second wire and the fifth electrode connected to the fifth wire as the gate electrodes can take. The eighth potential is preferably equal to the first potential.

In the case where the first wires (1-1 to 1-N) are formed as impurity diffusion layers in the semiconductor substrate and the channel regions of a selected memory cells are electrically connected to the semiconductor substrate, the first potential applied to the first wire (1-j) connected to the island-like semiconductor layer including the selected cell is such that, by applying the first potential, the island-like semiconductor layer becomes in the electrically floating state from the semiconductor substrate by a depletion layer extended toward the semiconductor substrate. Thereby, the potential of the island-like semiconductor layer equals the first potential, and the selected cell on the island-like semiconductor layer can be read without being affected by the potential of the substrate.

The selected memory cell is apparently back-biased to the substrate since the potential of the first electrode rises with respect to the potential of the substrate because of a resistant component in the impurity diffusion layer from the first electrode of the island-like semiconductor layer including the selected memory cell to a power source when a reading current flows through the first wire (1-j).

However, in the present invention, it is possible to prevent a back-bias effect which may occur when the semiconductor substrate is electrically connected with the channel region of a memory cell on the island-like semiconductor layer and has the same potential with the channel region, and a rise in the threshold and a decrease in the current owing to the back bias can be prevented.

In the case where the first wires (1-1 to 1-N) are formed as impurity diffusion layers in the semiconductor substrate and the tenth potential applied to the semiconductor substrate is the ground potential, the first potential is generally the ground potential. In the case where the first wires (1-1 to 1-N) are electrically insulated from the semiconductor substrate, for example, where the first electrodes (1-1 to 1-N) are formed of impurity diffusion layers on an SOI substrate and are insulated from the semiconductor substrate by an insulating film, the first potential is not necessarily the same as the tenth potential. The memory cells may be sequentially read from a memory cell connected to a third electrode (3-j-L) to a memory cell connected to a third electrode (3-j-1), or may be read in reverse order or at random.

Further, some or all memory cells connected to the third wire (3-j-h) may be read at the same time. For a particular example, the memory cells connected to the third wire (3-j-h) may be read simultaneously by given intervals, for example, every eight fourth wires (e.g., a fourth wire (4-(i−16)), a fourth wire (4-(i−8)), a fourth wire (4-i), a fourth wire (4-(i+8)), a fourth wire (4-(i+16)), . . . ). A plurality of third wires having uncommon fourth wires may be read at the same time. The above-mentioned ways of reading may be combined.

Figure 133:
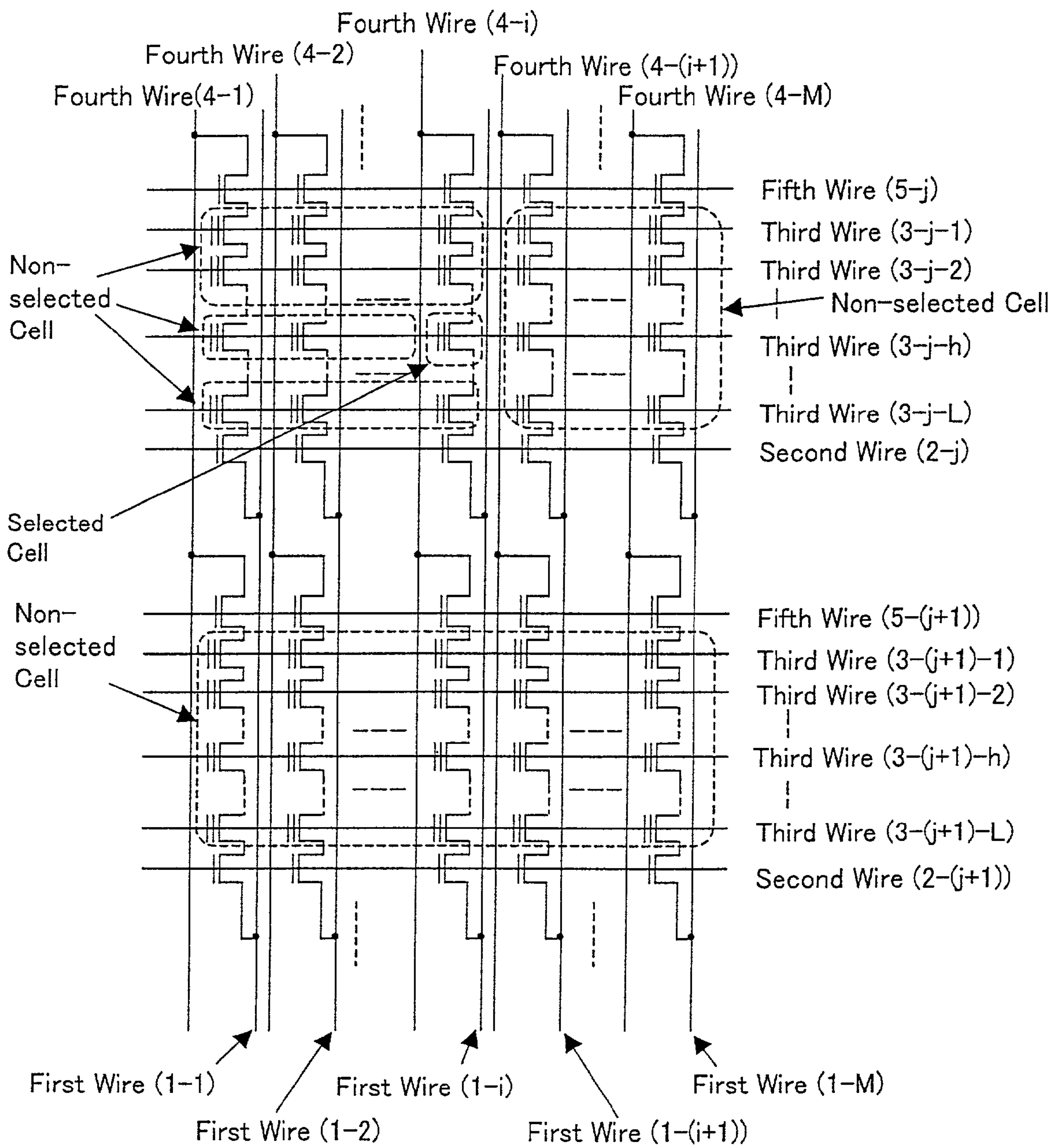

FIG. 133 shows the equivalent circuit diagram of a memory cell array in which the first wires are in parallel to the fourth wires. The application of potentials for reading data is the same as in FIG. 128 except that the first potential is applied to the first wire (1-i).

Figure 135:
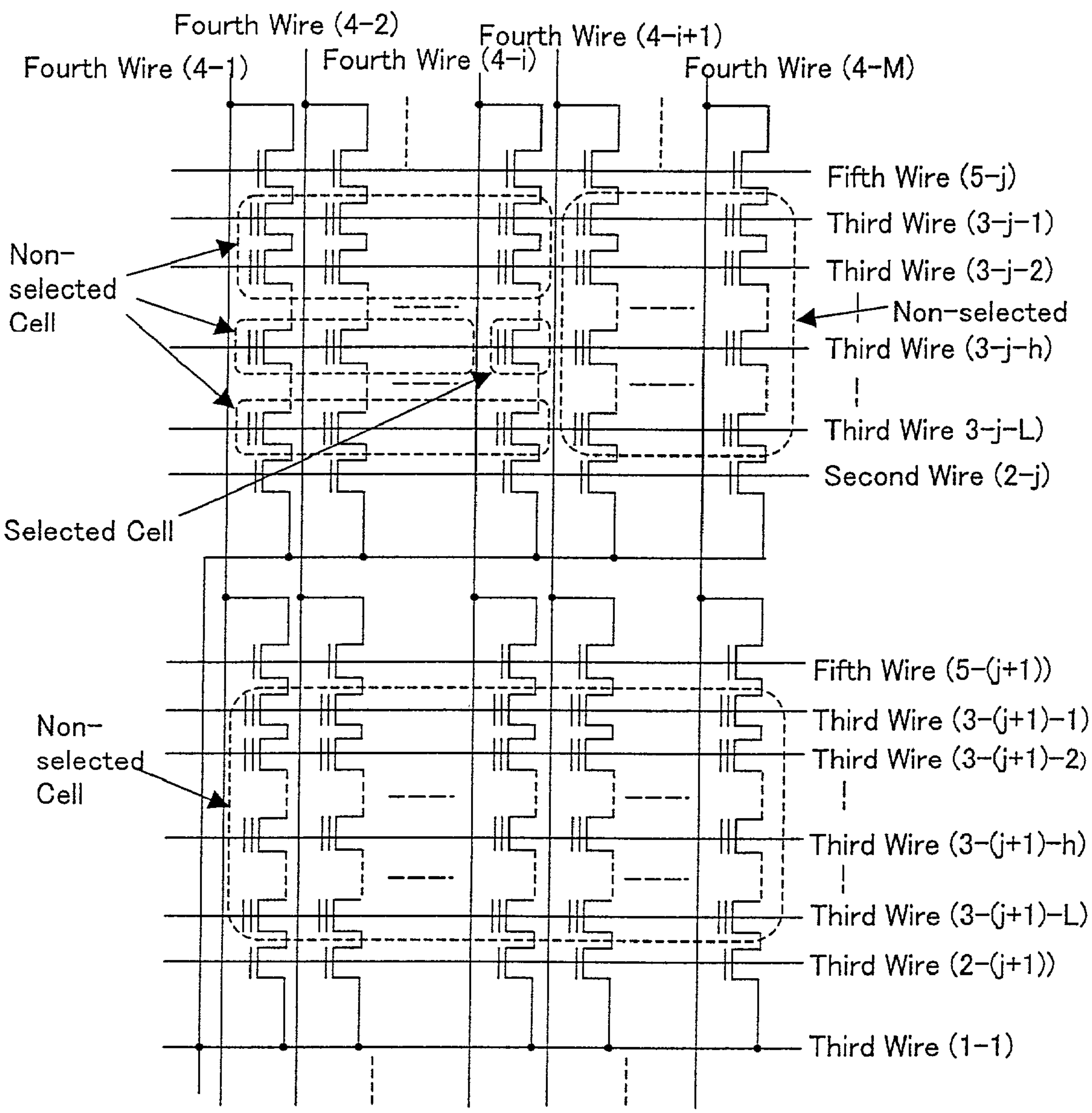

FIG. 135 shows the equivalent circuit diagram of a memory cell array in which a plurality of first wires are electrically connected in common. The application of potentials for reading data is the same as in FIG. 128 except that the first potential is applied to the first wire (1-1).

Figure 187:
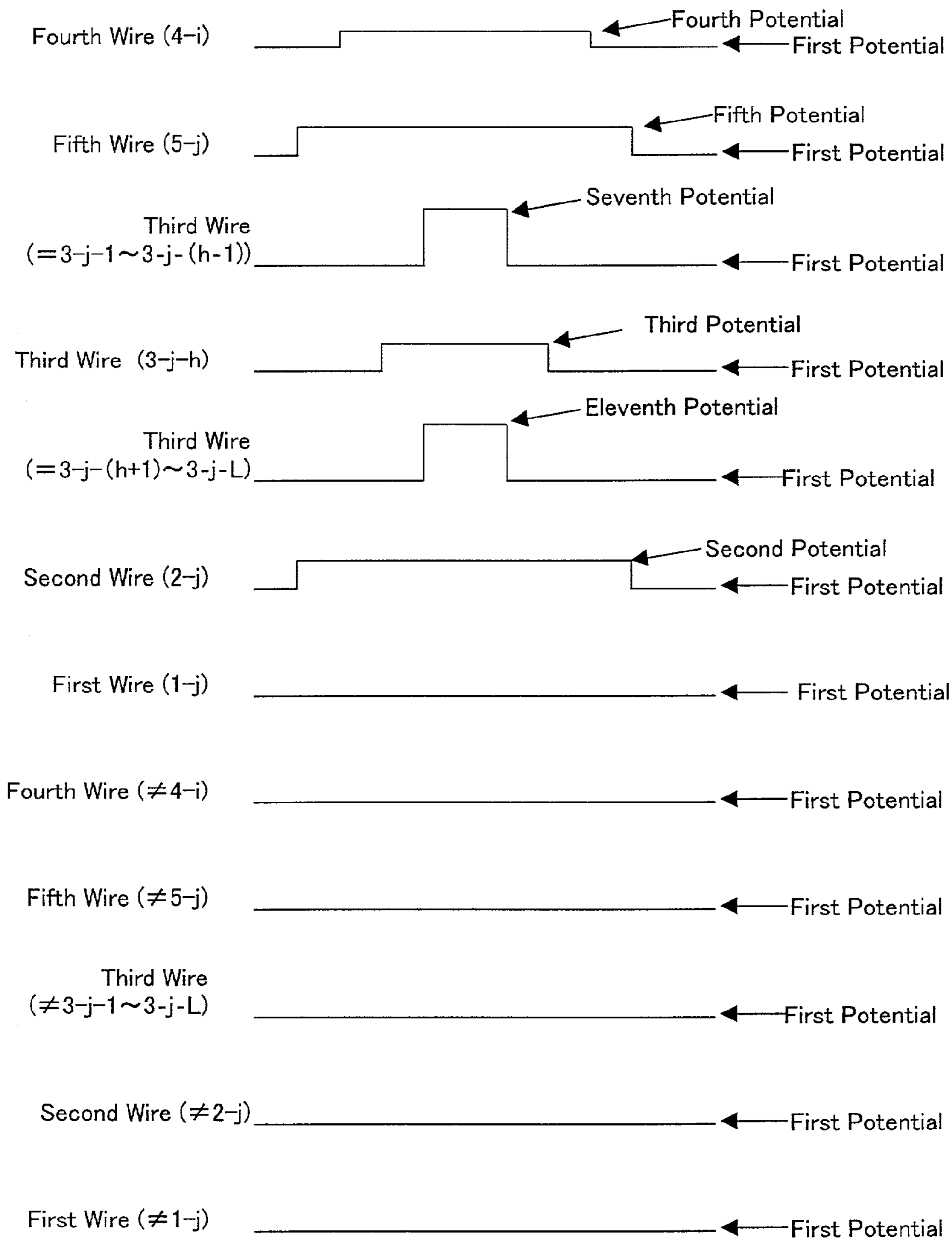

FIG. 187 shows a timing chart showing an example of timing of applying each potential for reading data in the case where the first wires are arranged in parallel to the third wires. In FIG. 187, a ground potential is applied as the first potential, and the thresholds of transistors having gate electrodes connected to the second wire and the fifth wire are, for example, 0.5 V. The memory cell has a threshold of 5.0 V to 7.5 V when it is in the written state and has a threshold of 0.5 V to 3 V when it is in the erased state.

First, the ground potential as the first potential is applied to the first wires (1-1 to 1-N), the second wires (2-1 to 2-N), the third wires (3-1-1 to 3-N-L), the fourth wires (4-1 to 4-M) and the fifth wires (5-1 to 5-N). In this state, the second potential, e.g., 3V, is applied to the second wire (2-j), and the fifth potential, e.g., 3 V which is equal to the second potential, is applied to the fifth wire (5-j). The fourth potential, e.g., 1 V, is applied to the fourth wire (4-i), and the third potential, e.g., 4 V, is applied to the third wire (3-j-h) connected to the selected cell. The seventh potential, e.g., 8 V, is applied to third wires (3-j-1 to 3-j-(h−1)) connected to non-selected cells arranged in series with the selected cell, and the eleventh potential, e.g., 8 V which is equal to the seventh potential, is applied to third wires (3-j-(h−1) to 3-j-L) connected to non-selected cells arranged in series with the selected cell. The current flowing through the fourth wire (4-i) or the first wire (1-j) is sensed. The third wires (not 3-j-h) other than the third wire (3-j-h) are returned to the ground potential, i.e., the first potential, and then the third wire (3-j-h) is returned to the ground potential, i.e., the first potential. The fourth wiring (4-i) is returned to the ground potential, i.e., the first potential, and the second wire (2-j) and the fifth wire (5-j) are returned to the ground potential, i.e., the first potential. The potentials may be applied to the respective wires in another order or simultaneously. Further, the respective wires may be returned to the ground potential, i.e., the first potential, in another order or simultaneously.

The second and fifth potentials may be different, and the eleventh and seventh potential may be different. Here, the same potential is preferably applied initially as the first potential to the first wires (1-1 to 1-N), the second wires (2-1 to 2-N), the third wires (3-1-1 to 3-N-L), the fourth wires (4-1 to 4-M) and the fifth wires (5-1 to 5-N), but different potentials may be applied. The third potential may be kept applied to the third wire (3-j-h). In the above example, the reading process has been described with the case where the selected cell is a memory cell having the third wire (3-j-h) as the gate electrode. However, the reading process is the same with the case where the selected cell is a memory cell having a third wire other than the third wire (3-j-h) as the gate electrode.

Figure 188:
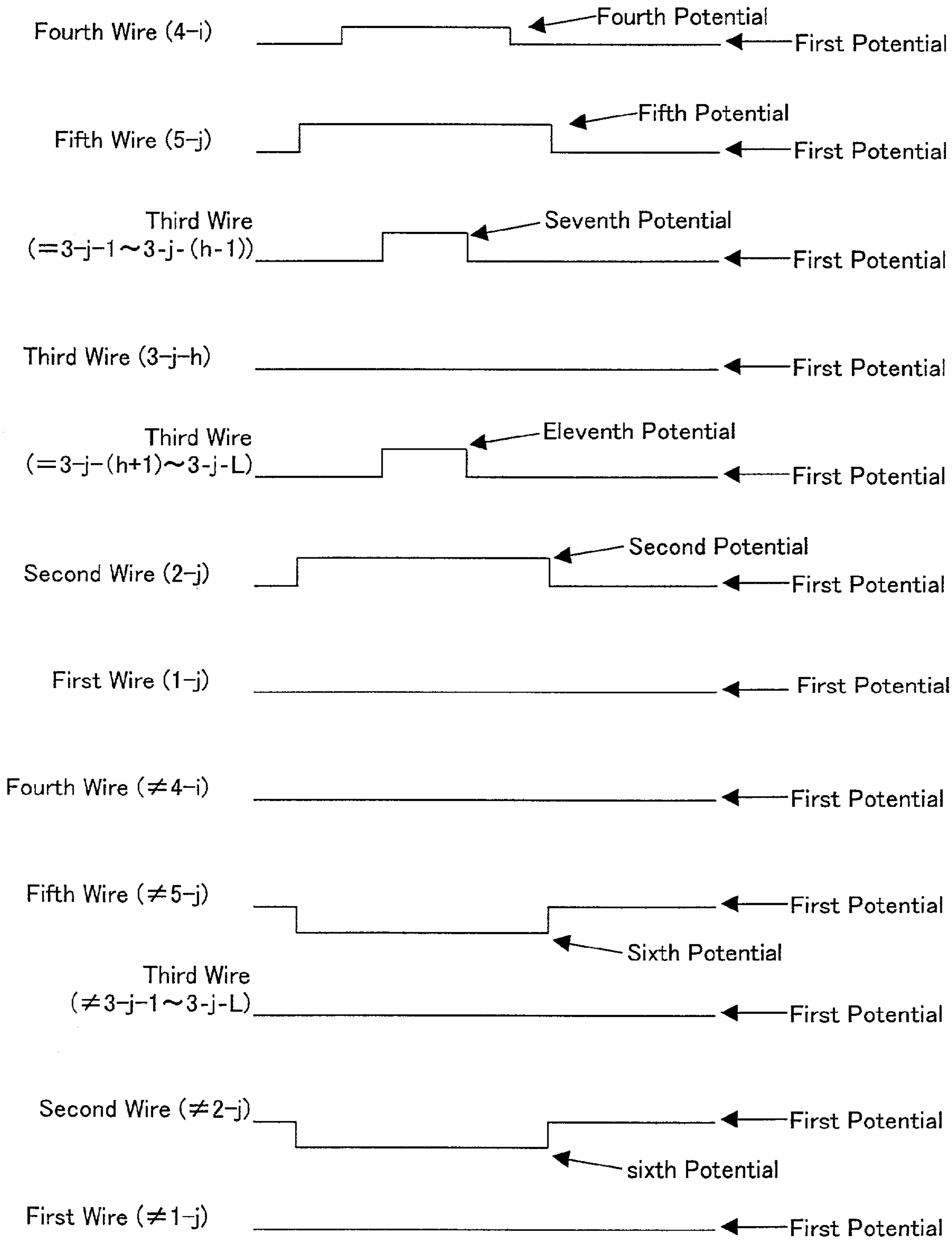

FIG. 188 shows a timing chart showing an example of timing of applying each potential for reading data in the case where the first wires are arranged in parallel to the third wires. In FIG. 188, a ground potential is applied as the first potential, and the thresholds of transistors having gate electrodes connected to the second wire and the fifth wire are, for example, 0.5 V. The memory cell has a threshold of 1.0 V to 3.5 V when it is in the written state and has a threshold of 1.0 V or lower when it is in the erased state.

First, the ground potential as the first potential is applied to the first wires (1-1 to 1-N), the second wires (2-1 to 2-N), the third wires (3-1-1 to 3-N-L), the fourth wires (4-1 to 4-M) and the fifth wires (5-1 to 5-N). In this state, the sixth potential, e.g., 1 V, is applied to second wires (not 2-j) and fifth wires (not 5-j), the second potential, e.g., 3 V, is applied to the second wire (2-j), and the fifth potential, e.g., 3 V which is equal to the second potential, is applied to the fifth wire (5-j). The fourth potential, e.g., 1 V, is applied to the fourth wire (4-i). The third potential, e.g., the ground potential which is the first potential, is kept applied to the third wiring (3-j-h) connected to the selected cell. The seventh potential, e.g., 5 V, is applied to third wires (3-j-1 to 3-j-(h−1)) connected to non-selected cells arranged in series with the selected cell, the eleventh potential, e.g., 5 V which is equal to the seventh potential, is applied to third wires (3-j-(h−1) to 3-j-L) connected to non-selected cells arranged in series with the selected cell, and the twelfth potential is applied to third wires (not 3-j-1 to 3-j-L) connected to non-selected cells not arranged in series with the selected cell. The current flowing through the fourth wire (4-i) or the first wire (1-j) is sensed. The third wires (not 3-j-h) other than the third wire (3-j-h) are returned to the ground potential, i.e., the first potential, and the fourth wire (4-i) is returned to the ground potential, i.e., the first potential. The second wire (2-j), the fifth wire (5-j), the second wires (not 2-j) and the fifth wires (not 5-j) are returned to the ground potential, i.e., the first potential.

The potentials may be applied to the respective wires in another order or simultaneously. Further, the respective wires may be returned to the ground potential, i.e., the first potential, in another order or simultaneously. The second and fifth potentials may be different, and the eleventh and seventh potential may be different. Here, the same potential is preferably applied initially as the first potential to the first wires (1-1 to 1-N), the second wires (2-1 to 2-N), the third wires (3-1-1 to 3-N-L), the fourth wires (4-1 to 4-M) and the fifth wires (5-1 to 5-N), but different potentials may be applied. The third potential may be kept applied to the third wire (3-j-h). The sixth potential may be the ground potential. In the above example, the reading process has been described with the case where the selected cell is a memory cell having the third wire (3-j-h) as the gate electrode. However, the reading process is the same with the case where the selected cell is a memory cell having a third wire other than the third wire (3-j-h) as the gate electrode.

Figure 189:
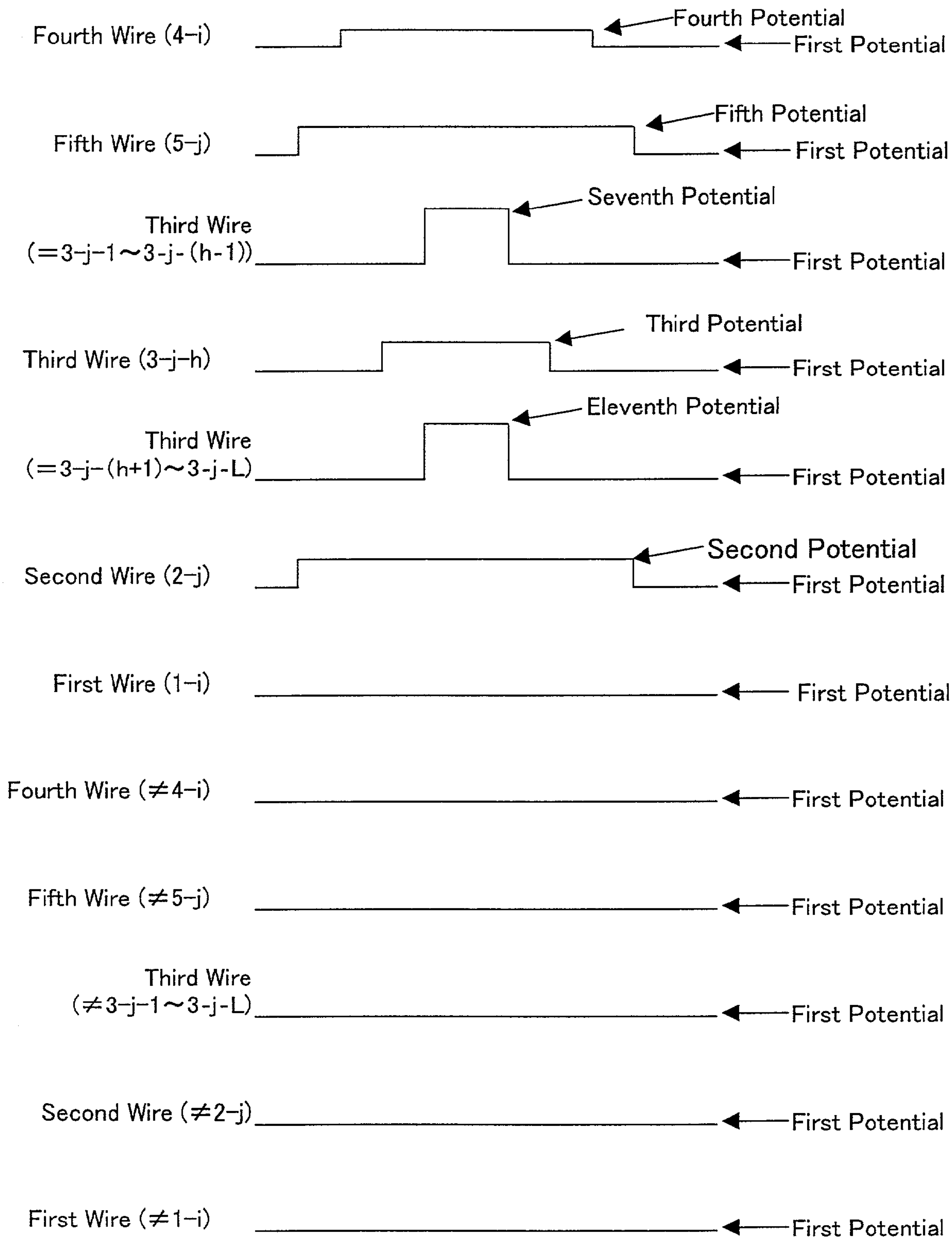

Have been described above the examples of the principle of reading data in cases where the first wires are arranged in parallel to the third wires. FIG. 189 shows a timing chart showing an example of timing of applying each potential for reading data when the first wires are arranged in parallel to the fourth wires. In FIG. 189, a ground potential is applied as the first potential, and the thresholds of transistors having gate electrodes connected to the second wire and the fifth wire are, for example, 0.5 V. The memory cell has a threshold of 5.0 V to 7.5 V when it is in the written state and has a threshold of 0.5 V to 3 V when it is in the erased state. FIG. 189 conforms to FIG. 187 except that a first wire (1-i) in place of the first wire (1-j) is connected to the end portion of the island-like semiconductor layer including the selected cell.

Figure 190:
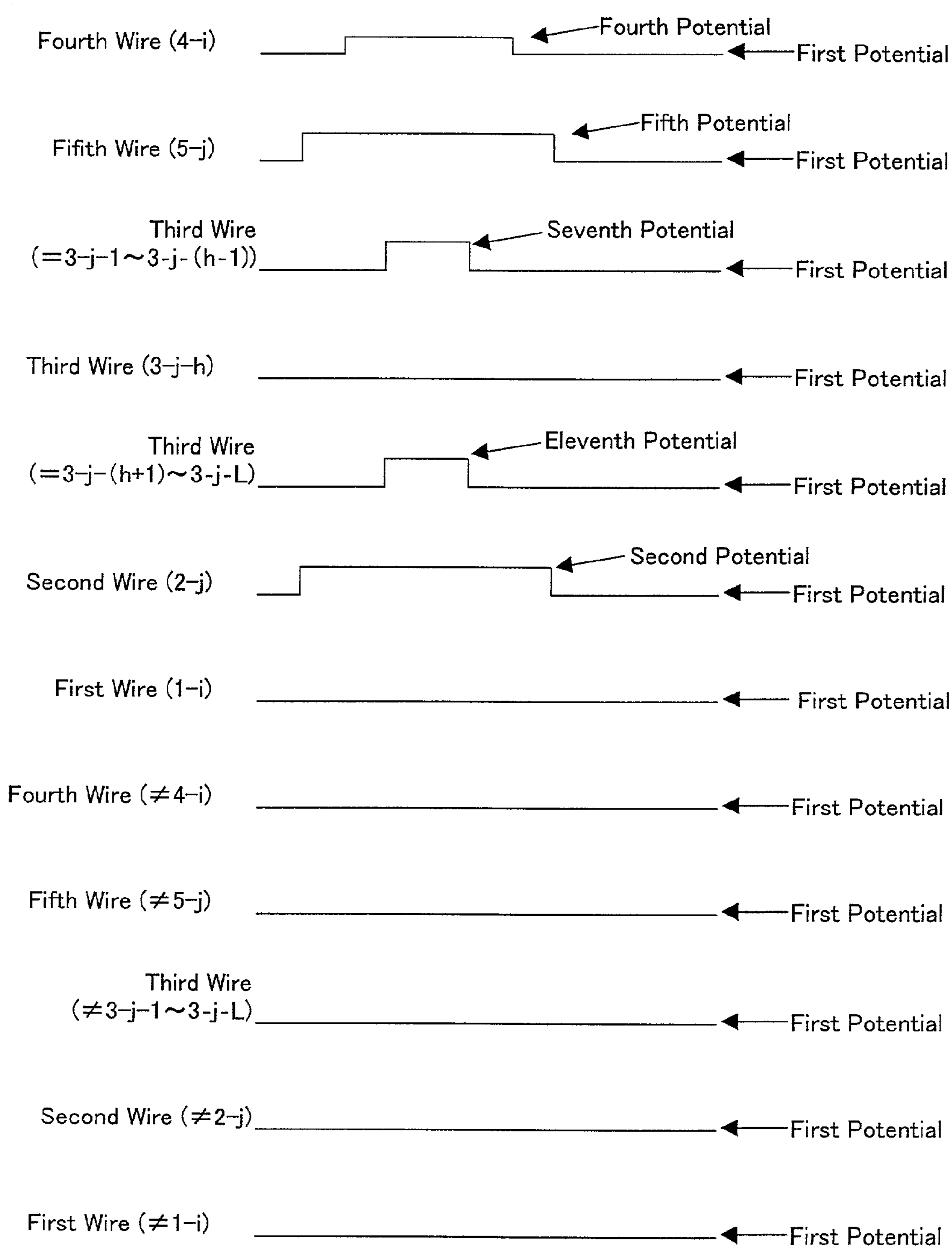

FIG. 190 shows a timing chart showing an example of timing of applying each potential for reading data in the case where the first wires are arranged in parallel to the fourth wires. In FIG. 190, a ground potential is applied as the first potential, and the thresholds of transistors having gate electrodes connected to the second wire and the fifth wire are, for example, 0.5 V. The memory cell has a threshold of 1.0 V to 3.5 V when it is in the written state and has a threshold of 1.0 V or lower when it is in the erased state. FIG. 190 conforms to FIG. 188 except that a first wiring (1-i) in place of the first wiring (1-j) is connected to the end portion of the island-like semiconductor layer including the selected cell and the sixth potential equals the first potential. However, the sixth potential does not necessarily equal the first potential.

Figure 191:
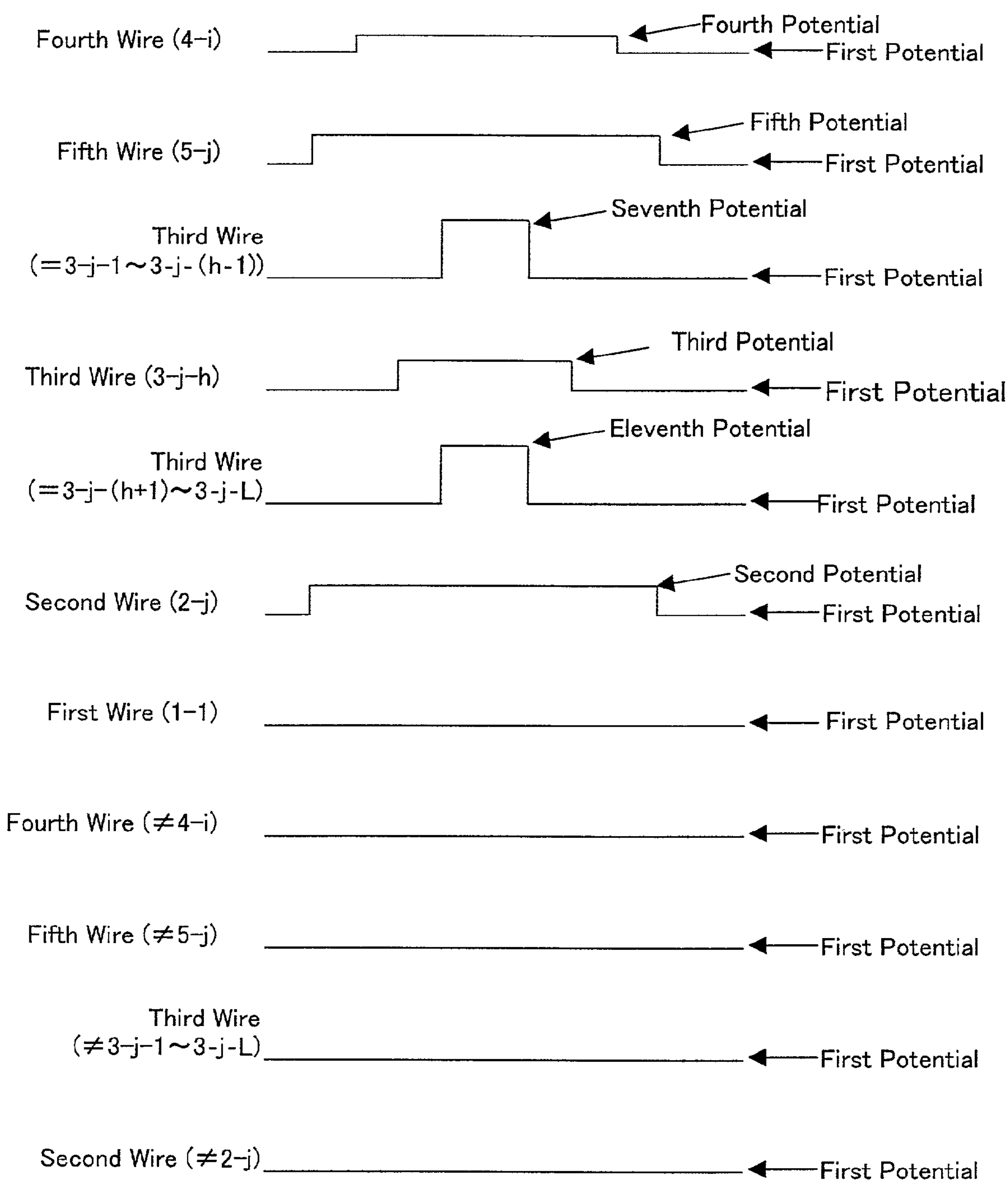

Have been described above the examples of the principle of reading in cases where the first wires are arranged in parallel to the fourth wires. FIG. 191 shows a timing chart showing an example of timing of applying each potential for reading data when the first wirings are connected in common to the entire array. In FIG. 191, a ground potential is applied as the first potential, and the thresholds of transistors having gate electrodes connected to the second wire and the fifth wire are, for example, 0.5 V. The memory cell has a threshold of 5.0 V to 7.5 V when it is in the written state and has a threshold of 0.5 V to 3 V when it is in the erased state. FIG. 191 conforms to FIG. 187 except that a first wire (1-1) in place of the first wire (1-j) is connected to the end portion of the island-like semiconductor layer including the selected cell.

Figure 192:
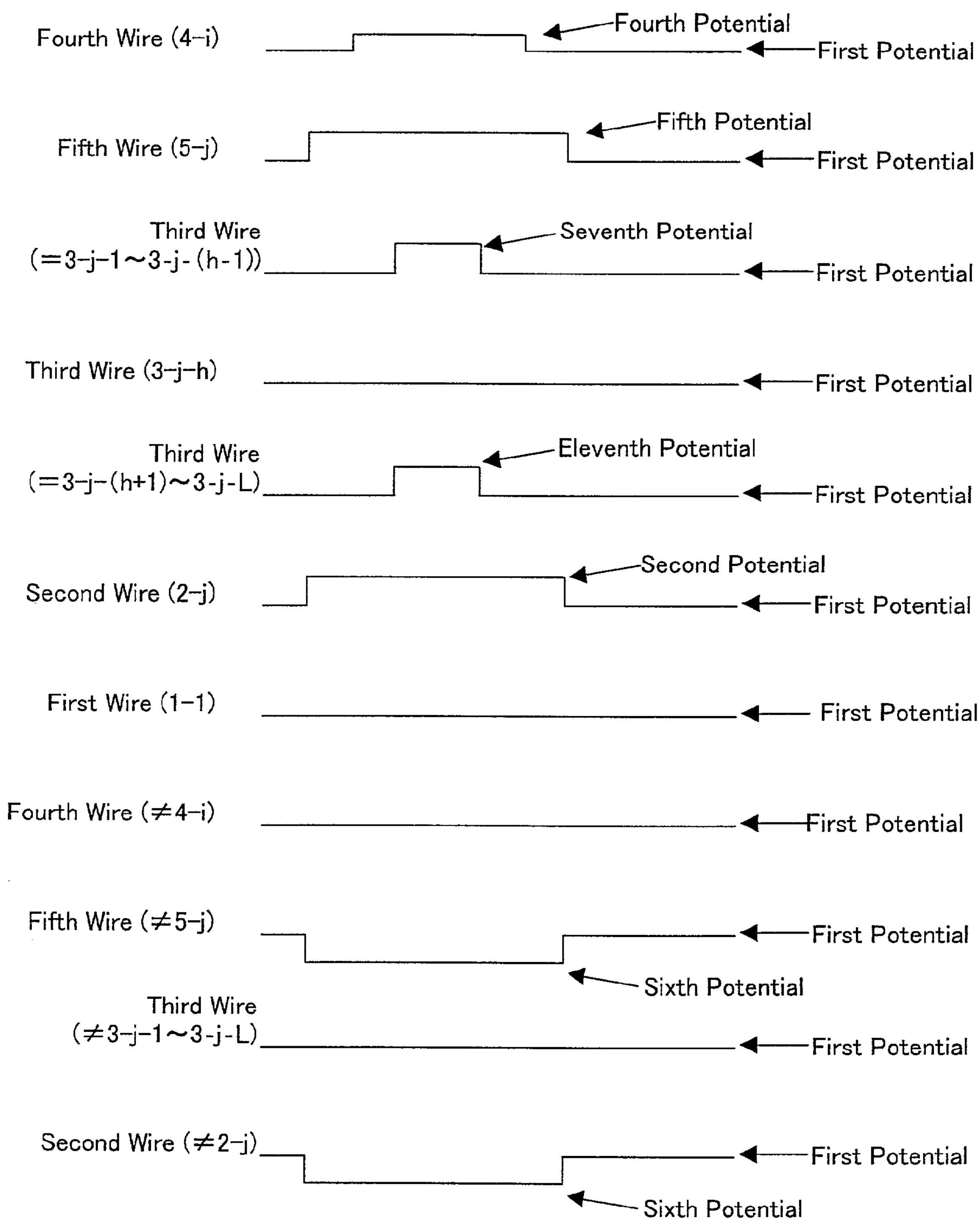

FIG. 192 shows a timing chart showing an example of timing of applying each potential for reading data when the first wires are connected in common to the entire array. In FIG. 192, a ground potential is applied as the first potential, and the thresholds of transistors having gate electrodes connected to the second wire and the fifth wire are, for example, 0.5 V. The memory cell has a threshold of 1.0 V to 3.5 V when it is in the written state and has a threshold of 1.0 V or lower when it is in the erased state. FIG. 192 conforms to FIG. 188 except that a first wire (1-1) in place of the first wiring (1-j) is connected to the end portion of the island-like semiconductor layer including the selected cell.

Have been described above the examples of the principle of reading in cases where M×N island-like semiconductor layers having a plurality of (e.g., L wherein L is a positive integer) memory cells formed of the P-type semiconductor and arranged in series and selection transistors formed to sandwich the memory cells. However, the polarity of the electrodes may be reversed as in the case of island-like semiconductor layers formed of an N-type semiconductor. At this time, the potentials have a relationship in magnitude reverse to that mentioned above.

A reading process is now explained with a semiconductor memory according to the present invention which is constructed to include a plurality of (e.g., M×N, wherein M and N are positive integers) island-like semiconductor layers having, for example, two memory cells connected in series which have the charge storage layer between the selection gate transistors and the third electrode as a control gate electrode. In the memory cell array, a plurality of (e.g., M) fourth wires arranged in parallel to the semiconductor substrate are connected to end portions of the island-like semiconductor layers, and first wires are connected to opposite end portions of the island-like semiconductor layers. A plurality of (e.g., N×2) third wires are arranged in a direction crossing the fourth wires and connected to the third electrodes of the memory cells.

Figure 138:
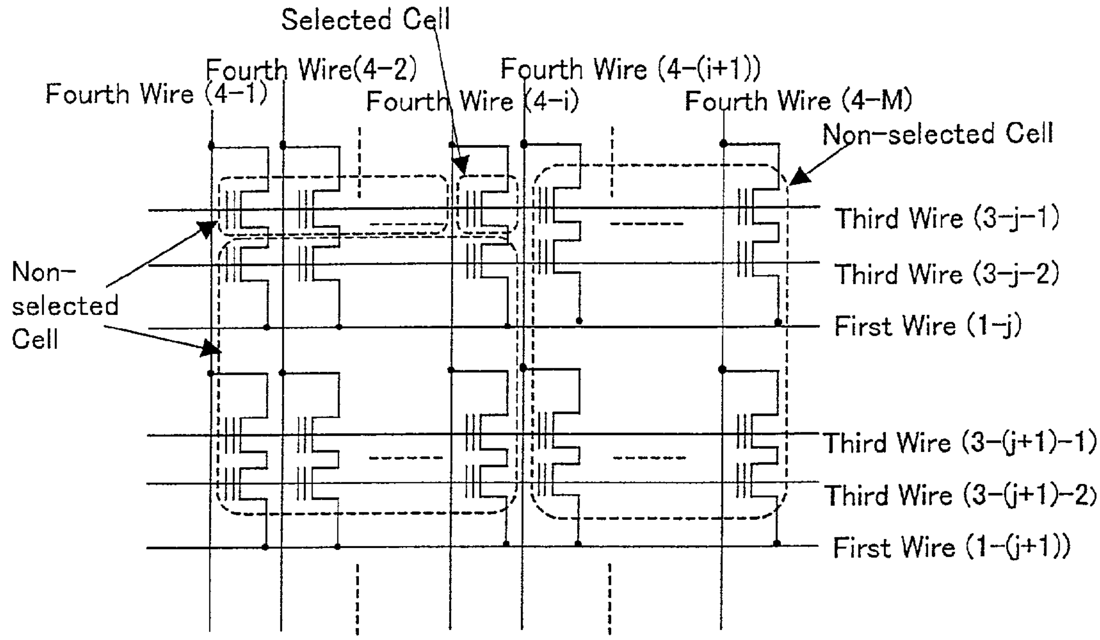

FIG. 138 shows the equivalent circuit diagram of the above-described memory cell array in which the first wires are in parallel to the third wires. For example, in the case where the island-like semiconductor layers are formed of a P-type semiconductor, a selected cell shown in FIG. 138 is read by applying a first potential to a first wire (1-j, wherein j is a positive integer, $1 \leqq j \leqq N$) connected to an island-like semiconductor layer including the selected cell, a third potential to a third wire (3-j-1) connected to the selected cell, an eleventh potential to a third wire (3-j-2) connected to a non-selected cell arranged in series with the selected cell, a twelfth potential to third wires (not 3-j-1 to 3-j-2) connected to non-selected cells not arranged in series with the selected cell and, a fourth potential to a fourth wire (4-i, wherein i is a positive integer, $1 \leqq i \leqq M$) connected to the island-like semiconductor layer including the selected cell and an eighth potential to fourth wires (not 4-i) other than the fourth wire (4-i). The fourth potential is larger than the first potential. A “0” or “1” is judged from a current flowing through the fourth wire (4-i) or the first wire (1-j). At this time, the third potential is a potential allowing the distinction of the amount of a charge stored in the charge storage layer, i.e., a potential allowing the judgement of "0" or "1." The eleventh potential is a potential always allowing a cell current to flow through the memory cell regardless of the amount of the charge stored in the charge storage layer, i.e., a potential allowing the formation of a reverse layer in the channel region of the memory cell. For example, the eleventh potential is not lower than the threshold voltage that a memory transistor having the third electrode connected to the third wire as the gate electrode can take. The eighth potential is preferably equal to the first potential.

In the case where the first wires (1-1 to 1-N) are formed as impurity diffusion layers in the semiconductor substrate and the channel regions of a selected memory cells are electrically connected to the semiconductor substrate, the first potential applied to the first wire (1-j) connected to the island-like semiconductor layer including the selected cell is such that, by applying the first potential, the island-like semiconductor layer becomes in the electrically floating state from the semiconductor substrate by a depletion layer extended toward the semiconductor substrate.

Thereby, the potential of the island-like semiconductor layer equals the first potential, and the selected cell on the island-like semiconductor layer can be read without being affected by the potential of the substrate.

The selected memory cell is apparently back-biased to the substrate since the potential of the first electrode rises with respect to the potential of the substrate because of a resistant component in the impurity diffusion layer from the first electrode of the island-like semiconductor layer including the selected memory cell to a power source when a reading current flows through the first wire (1-j).

However, in the present invention, it is possible to prevent a back-bias effect which may occur when the semiconductor substrate is electrically connected with the channel region of the memory cell on the island-like semiconductor layer and has the same potential with the channel region, and a rise in the threshold and a decrease in the current owing to the back bias can be prevented.

In the case where the first wires (1-1 to 1-N) are formed as impurity diffusion layers in the semiconductor substrate and the tenth potential applied to the semiconductor substrate is the ground potential, the first potential is generally the ground potential. In the case where the first wires (1-1 to 1-N) are electrically insulated from the semiconductor substrate, for example, where the first electrodes (1-1 to 1-N) are formed of impurity diffusion layers on an SOI substrate and are insulated from the semiconductor substrate by an insulating film, the first potential is not necessarily the same as the tenth potential. The memory cells may be sequentially read from a memory cell connected to a third electrode (3-j-2) to a memory cell connected to a third electrode (3-j-1), or may be read in reverse order or at random. Further, some or all memory cells connected to the third wire (3-j-1) may be read at the same time. For a particular example, the memory cells connected to the third wire (3-j-1) may be read simultaneously by given intervals, for example, every eight fourth wires (e.g., a fourth wire (4-(i−16)), a fourth wire (4-(i−8)), a fourth wire (4-i), a fourth wire (4-(i+8)), a fourth wire (4-(i+16)), . . . ). A plurality of third wires having uncommon fourth wires may be read at the same time. The above-mentioned ways of reading may be combined.

Figure 142:
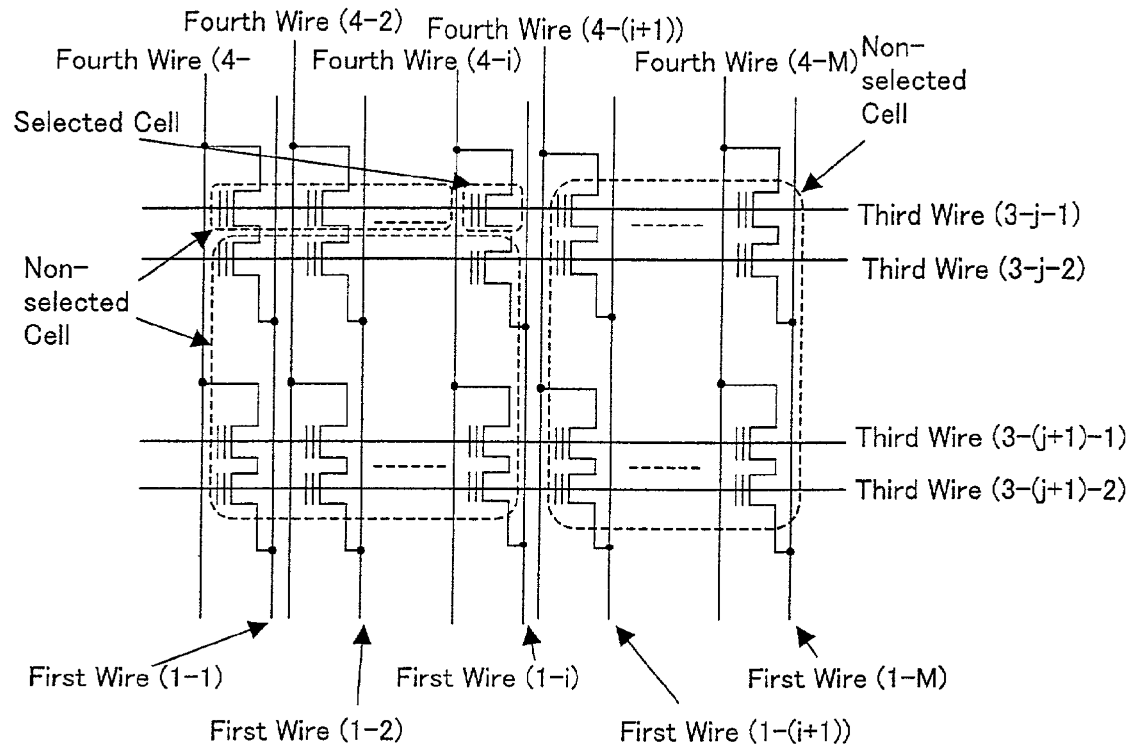

FIG. 142 shows the equivalent circuit diagram of a memory cell array in which the first wires are in parallel to the fourth wires. The application of the potentials for reading data is the same as in FIG. 138 except that the first potential is applied to the first wire (1-i).

Figure 146:
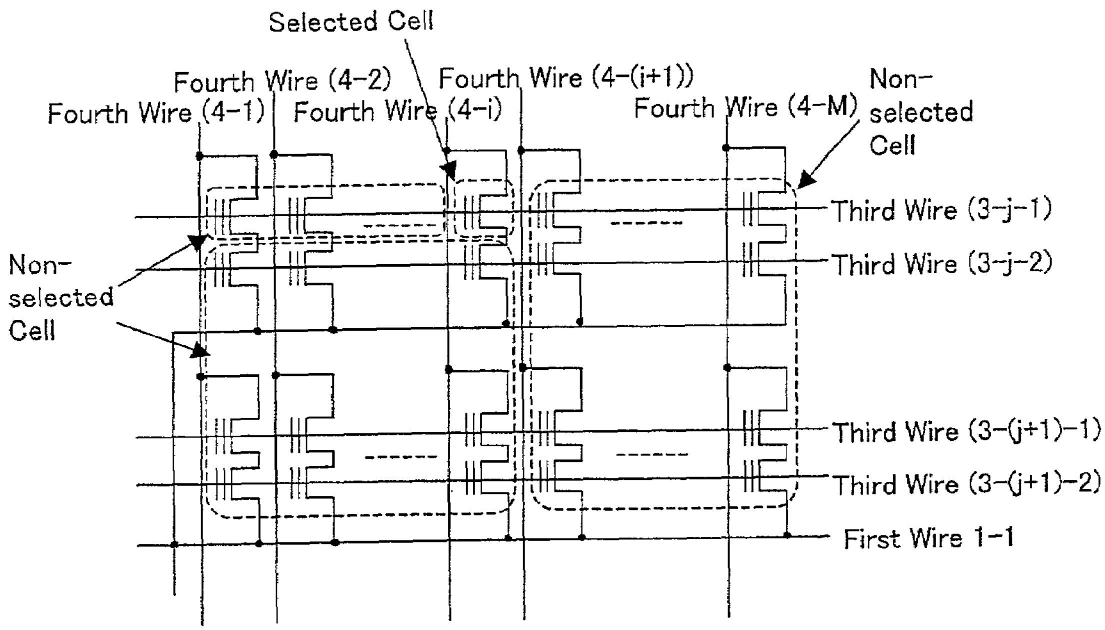

FIG. 146 shows the equivalent circuit diagram of a memory cell array in which a plurality of first wires are electrically connected in common. The application of the potentials for reading data is the same as in FIG. 138 except that the first potential is applied to the first wire (1-1).

Figure 193:
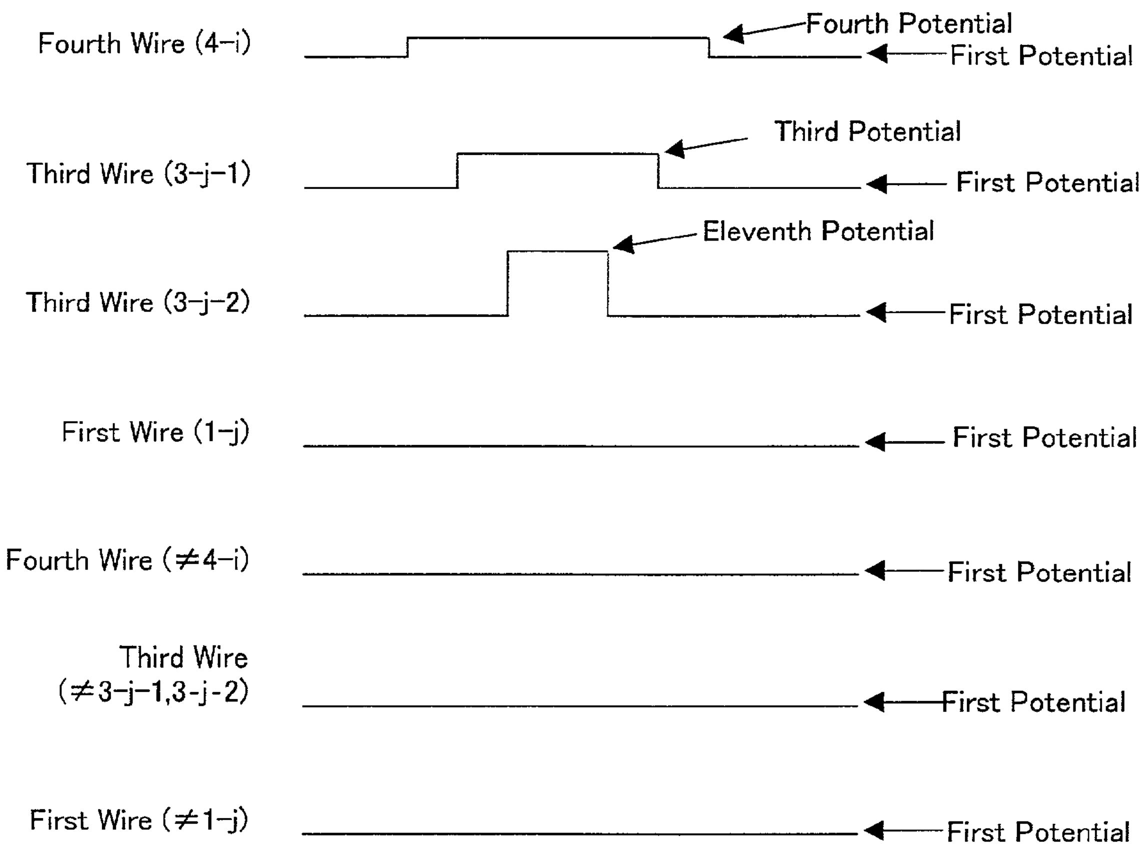

FIG. 193 shows a timing chart showing an example of timing of applying each potential for reading data when the first wires are arranged in parallel to the third wires. In FIG. 193, a ground potential is applied as the first potential, and the memory cell has a threshold of 5.0 V to 7.5 V when it is in the written state and has a threshold of 0.5 V to 3 V when it is in the erased state.

First, the ground potential as the first potential is applied to the first wires (1-1 to 1-N), the third wires (3-1-1 to 3-N-2), and the fourth wirings (4-1 to 4-M). In this state, the fourth potential, e.g., 1 V, is applied to a fourth wire (4-i). The third potential, e.g., 4 V, is applied to a third wire (3-j-1) connected to the selected cell. The eleventh potential, e.g., 8 V, is applied to a third wire (3-j-2) connected to a non-selected cell arranged in series with the selected cell. The current flowing through the fourth wire (4-i) or the first wire (1-j) is sensed. Thereafter, the third wire (3-j-2) is returned to the ground potential, i.e., the first potential, and the third wire (3-j-1) is returned to the ground potential, i.e., the first potential. The fourth wiring (4-i) is returned to the ground potential, i.e., the first potential. The potentials may be applied to the respective wires in another order or simultaneously. Further, the respective wires may be returned to the ground potential, i.e., the first potential, in another order or simultaneously. Here, the same potential is preferably applied initially as the first potential to the first wires (1-1 to 1-N), the second wires (2-1 to 2-N), the third wires (3-1-1 to 3-N-2), the fourth wires (4-1 to 4-M) and the fifth wires (5-1 to 5-N), but different potentials may be applied. The third potential may be kept applied to the third wire (3-j-1). In the above example, the reading process has been described with the case where the selected cell is a memory cell having the third wire (3-j-1) as the gate electrode. However, the reading process is the same with the case where the selected cell is a memory cell having the third wire (3-j-2) as the gate electrode.

Figure 194:
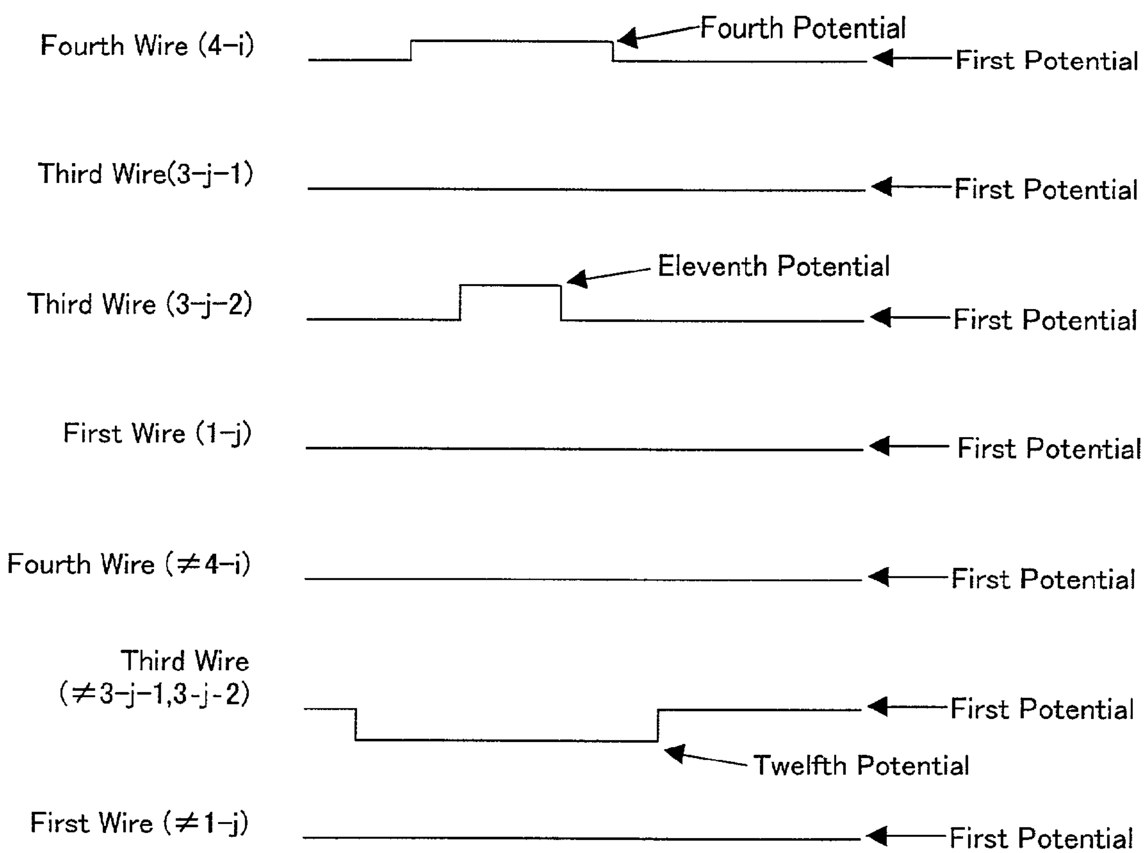

FIG. 194 shows a timing chart showing an example of timing of applying each potential for reading data when the first wires are arranged in parallel to the third wires. In FIG. 194, a ground potential is applied as the first potential, and the memory cell has a threshold of 1.0 V to 3.5 V when it is in the written state and has a threshold of −3.0 V to −1.0 V when it is in the erased state.

First, the ground potential as the first potential is applied to the first wires (1-1 to 1-N), the third wires (3-1-1 to 3-N-2) and the fourth wires (4-1 to 4-M). In this state, the twelfth potential, e.g., 4 V, is applied to third wires (not 3-j-1 to 3-j-2) connected to non-selected cells not arranged in series with the selected cell. The fourth potential, e.g., 1 V, is applied to a fourth wire (4-i). The third potential, e.g., the ground potential which is the first potential, is applied to a third wire (3-j-1) connected to the selected cell. The eleventh potential, e.g., 5 V, is applied to a third wire (3-j-2) connected to a non-selected cell arranged in series with the selected cell. The current flowing through the fourth wire (4-i) or the first wire (1-j) is sensed. The fourth wire (4-i) is returned to the ground potential, i.e., the first potential, and the third wires (not 3-j-1 to 3-j-2) are returned to the ground potential, i.e., the first potential. The potentials may be applied to the respective wires in another order or simultaneously. Further, the respective wires may be returned to the ground potential, i.e., the first potential, in another order or simultaneously. Here, the same potential is preferably applied initially as the first potential to the first wires (1-1 to 1-N), the third wires (3-1-1 to 3-N-2) and the fourth wires (4-1 to 4-M), but different potentials may be applied. The third potential may be kept applied to the third wire (3-j-1). In the above example, the reading process has been described with the case where the selected cell is a memory cell having the third wire (3-j-1) as the gate electrode. However, the reading process is the same with the case where the selected cell is a memory cell having the third wire (3-j-2) as the gate electrode.

Figure 195:
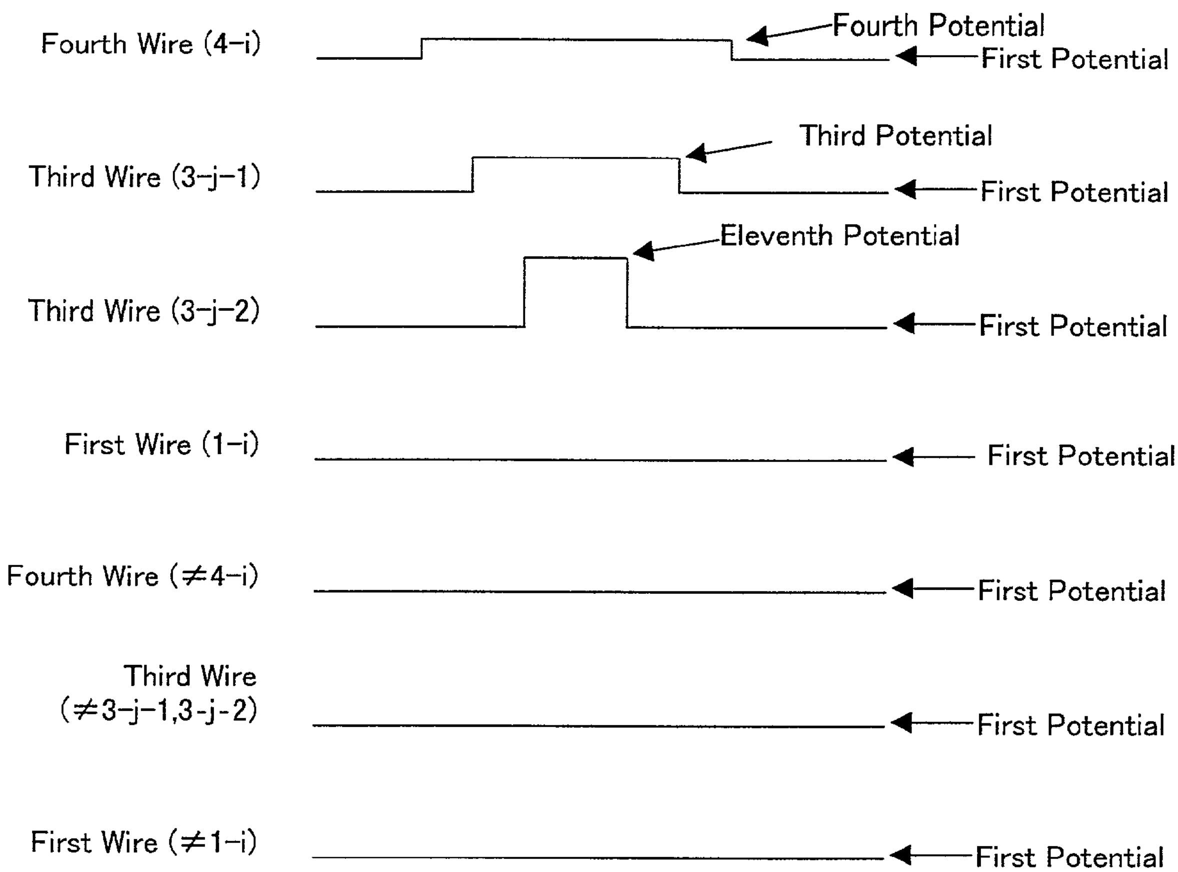

Have been described above the examples of the principle of reading data in cases where the first wires are arranged in parallel to the third wires. FIG. 195 shows a timing chart showing an example of timing of applying each potential for reading data in the case where the first wires are arranged in parallel to the fourth wires. In FIG. 195, a ground potential is applied as the first potential, and the memory cell has a threshold of 5.0 V to 7.5 V when it is in the written state and has a threshold of 0.5 V to 3.0 V when it is in the erased state.

FIG. 195 conforms to FIG. 193 except that a first wire (1-i) in place of the first wire (1-j) is connected to the end portion of the island-like semiconductor layer including the selected cell.

Figure 196:
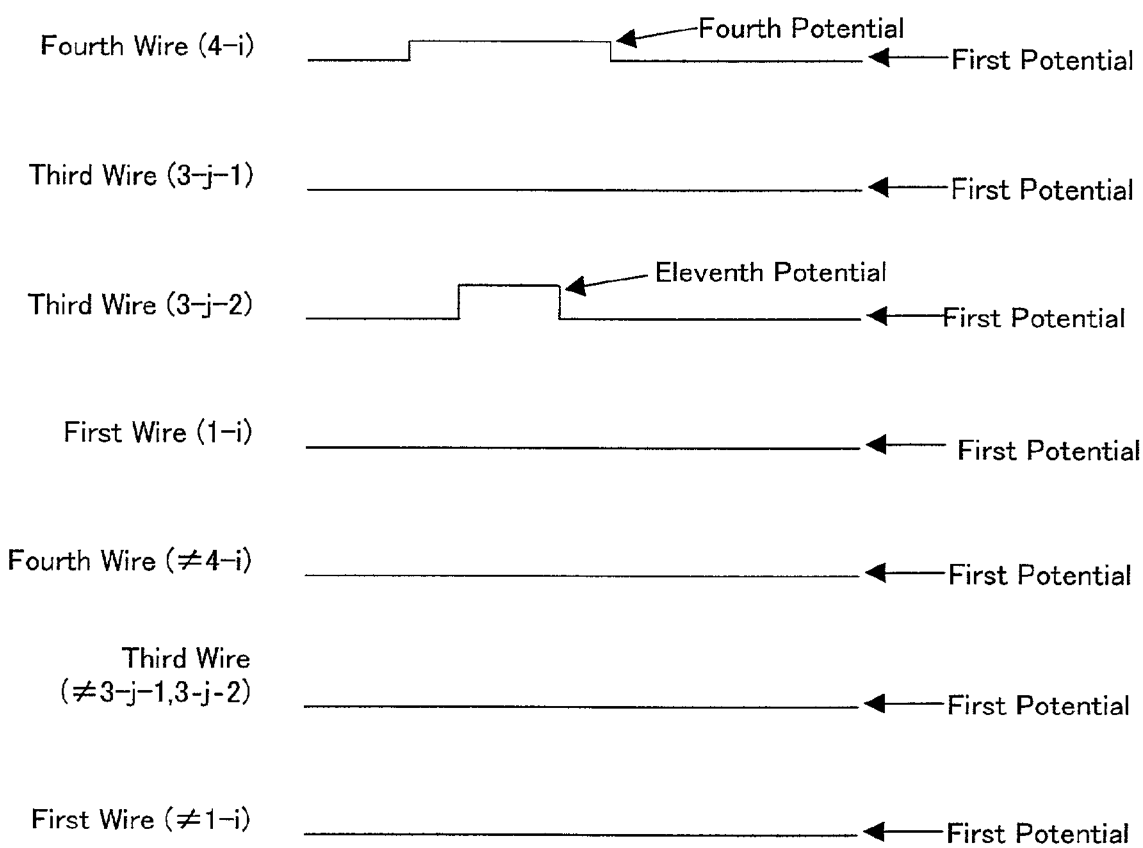

FIG. 196 shows a timing chart showing an example of timing of applying each potential for reading data when the first wires are arranged in parallel to the fourth wires. In FIG. 196, a ground potential is applied as the first potential, and the memory cell has a threshold of 1.0 V to 3.5 V when it is in the written state and has a threshold of −1.0 V or lower when it is in the erased state. FIG. 196 conforms to FIG. 194 except that a first wire (1-i) in place of the first wire (1-j) is connected to the end portion of the island-like semiconductor layer including the selected cell and the twelfth potential equals the first potential. However, the twelfth potential does not necessarily equal the first potential.

Figure 179:
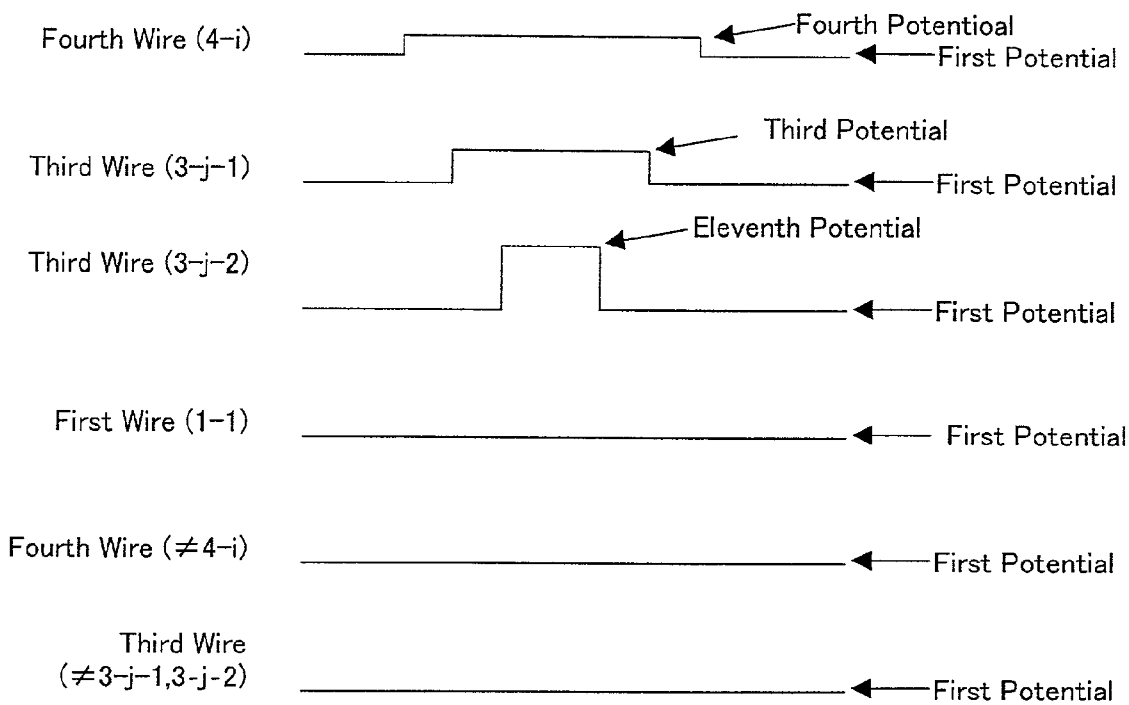
FIG. 179 to FIG. 198 show examples of timing charts at reading data from semiconductor memories in accordance with the present invention.

Have been described above the examples of the principle of reading data in cases where the first wires are arranged in parallel to the fourth wires. FIG. 179 shows a timing chart showing an example of timing of applying each potential for reading data in the case where the first wires are connected in common to the entire array. In FIG. 179, a ground potential is applied as the first potential, and the memory cell has a threshold of 5.0 V to 7.5 V when it is in the written state and has a threshold of 0.5 V to 3.0 V when it is in the erased state. FIG. 179 conforms to FIG. 193 except that a first wire (1-i) in place of the first wire (1-j) is connected to the end portion of the island-like semiconductor layer including the selected cell.

Figure 180:
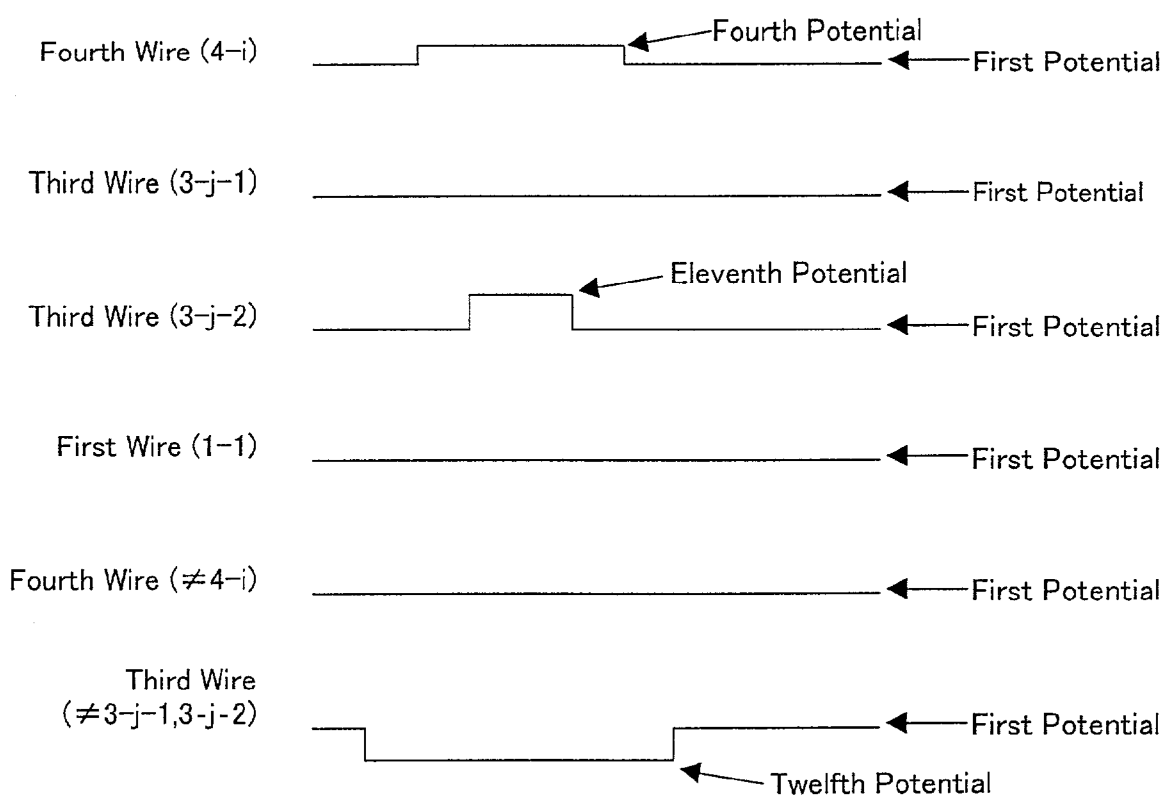

FIG. 180 shows a timing chart showing an example of timing of applying each potential for reading data in the case where the first wires are connected in common to the entire array. In FIG. 180, a ground potential is applied as the first potential, and the memory cell has a threshold of 1.0 V to 3.5 V when it is in the written state and has a threshold of −1.0 V or lower when it is in the erased state. FIG. 180 conforms to FIG. 194 except that a first wire (1-i) in place of the first wire (1-j) is connected to the end portion of the island-like semiconductor layer including the selected cell.

Have been described above the examples of the principle of reading data in cases of the M×N island-like semiconductor layers each having a plurality of (e.g., L wherein L is a positive integer) memory cells formed of the P-type semiconductor and arranged in series. However, the polarity of all the electrodes may be reversed as in the case of island-like semiconductor layers formed of an N-type semiconductor. At this time, the potentials have a relationship in magnitude reverse to that mentioned above.

A writing process is now explained with a semiconductor memory according to the present invention which is so constructed that a memory cell has a charge storage layer in an island-like semiconductor layer and a third electrode as a control gate electrode. The writing process utilizes a Fowler-Nordheim tunneling current (referred to as F-N current hereinafter).

FIG. 123 shows an equivalent circuit diagram of the memory cell of the above-described structure. For example, in the case where the island-like semiconductor layers are formed of a P-type semiconductor, a selected cell shown in FIG. 123 is written by applying a first potential to the first electrode of an island-like semiconductor layer including the selected cell, a third potential to the third electrode connected to the selected cell and a fourth potential to the fourth electrode of the island-like semiconductor layer. The application of these potentials generates the F-N current only in the tunnel oxide film of the selected cell and changes the state of a charge in the charge storage layer. For example, if a “1” is written by storing a negative charge in the charge storage layer, the third potential is larger than the fourth potential. If a “1” is written by drawing a negative charge from the charge storage layer, i.e., by storing a positive charge, the third potential is smaller than the fourth potential. Thus, the “0” or “1” can be set by utilizing a change in the state of the charge in the charge storage layer. At this time, the third potential is a potential such that the “1” can be written by a difference between the third and fourth potentials. For example, the third potential is a potential allowing the generation of a sufficient F-N current flow by a difference between the third and fourth potentials. The F-N current flows in the tunnel oxide film of the memory transistor having, as the gate electrode, the third electrode to which the third potential is applied and thereby changes the state of the charge in the charge storage layer. The first electrode may be opened.

In the case where the channel region of a selected memory cell is electrically connected to the semiconductor substrate, for example, in the case where the island-like semiconductor layer is not floated from the semiconductor substrate by an impurity diffusion layer, the memory cell is written if the tenth potential applied to the semiconductor substrate is a potential such that the “1” is written by a difference between the third potential and the tenth potential, for example, a potential such that a sufficiently large F-N current flows by a difference between the third potential and the tenth potential. The F-N current flows in the tunnel oxide film of the memory transistor having, as the gate electrode, the third electrode to which the third potential is applied.

In the case where the first electrode is formed as an impurity diffusion layer in the semiconductor substrate and the tenth potential applied to the semiconductor substrate is a ground potential, the first potential is generally the ground potential. In the case where the first electrode is electrically insulated from the semiconductor substrate, for example, in the case where the first electrode is formed of an impurity diffusion layer on an SOI substrate and is insulated from the semiconductor substrate by an insulating film, the first potential is not necessarily the same as the tenth potential.

The writing of “1” in the selected cell has been so far described by taking for example the case where the memory cells having floating gates as the charge storage layers are written with the “1” by changing the state of the charge in the charge storage layers and with the "0" by not changing the state of the charge and the F-N current is used as means for changing the state of the charge. However, the charge storage layer may be, for example, a dielectric or a laminated insulating film as well as the floating gate. Also, it is needless to say that the "0" may be written by changing the state of the charge in the charge storage layer and the "1" may be written by not changing the state of the charge. Further, the "0" may be written by slightly changing the state of the charge in the charge storage layer and the "1" may be written by greatly changing the state of the charge, and vice versa. Furthermore, the "0" is written by changing the state of the charge in the charge storage layer to negative and the "1" is written by changing the state of the charge to positive, and vice versa. The above-mentioned definitions of "0" and "1" may be combined. The F-N current is not the only means for changing the state of the charge in the charge storage layer.

An example of application of the potentials for writing data has been described. Now examples of timing of applying the above-described potentials for writing data are explained with the case where one memory cell is disposed in an island-like semiconductor layer formed of a P-type semiconductor.

Figure 197:
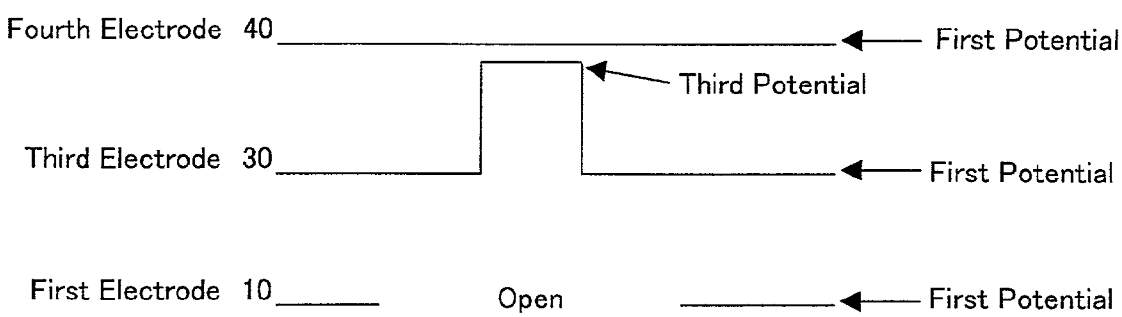

FIG. 197 is a timing chart showing an example of applying each potential for writing data in the case where the first electrode is open. For example, if the "1" is written by storing a negative charge in the charge storage layer, the ground potential as the first potential is first applied to the first, third and fourth electrodes. In this state, the first electrode is opened. The fourth potential, e.g., a ground potential which is the first potential, is kept applied to the fourth electrode. The third potential, e.g., 20 V, is applied to the third electrode. This state is maintained for a desired period of time to write the "1." The timing of applying the potentials to the respective electrodes may be in another order or simultaneous. The third electrode is returned to the ground potential, i.e., the first potential, and the first electrode is returned to the ground potential, i.e., the first potential. The timing of returning the respective electrodes to the ground potential, i.e., the first potential, may be in another order or simultaneous. The potentials applied may be any combination of potentials so long as they satisfy conditions for writing the "1" in a desired cell. Here, the same potential is preferably applied initially as the first potential to the first, third and fourth electrodes, but different potentials may be applied. The first and fourth electrodes may be changed with each other.

Figure 198:
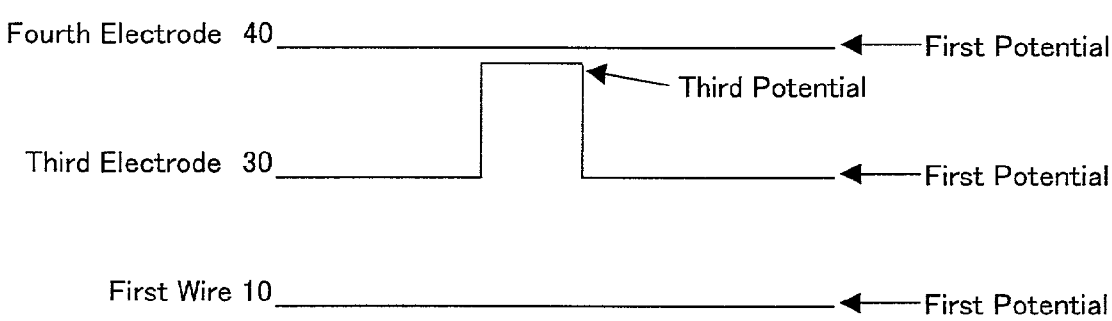

FIG. 198 is a timing chart showing an example of applying each potential for writing data in the case where the ground potential is applied as the first potential to all the first electrodes. For example, if the "1" is written by storing a negative charge in the charge storage layer, the ground potential as the first potential is first applied to the first, third and fourth electrodes. In this state, the fourth potential, e.g., a ground potential which is the first potential, is kept applied to the fourth electrode. The third potential, e.g., 20 V, is applied to the third electrode. This state is maintained for a desired period of time to write the "1." The third electrode is returned to the ground potential, i.e., the first potential. The potentials applied may be any combination of potentials so long as they satisfy conditions for writing the "1" in a desired cell. Here, the same potential is preferably applied initially as the first potential to the first, third and fourth electrodes, but different potentials may be applied.

Have been described the examples of the principle of writing in the case where one memory cell is disposed in the island-like semiconductor layer formed of the P-type semiconductor. The polarity of all the electrodes may be reversed as in the case of island-like semiconductor layers formed of an N-type semiconductor. At this time, the potentials have a relationship in magnitude reverse to that mentioned above.

A writing process is now explained with a semiconductor memory according to the present invention which is constructed to have island-like semiconductor layers each including two memory cells provided with a charge storage layer between gate transistors and a third electrode as a control gate electrode and connected in series. The writing process utilizes a channel hot electron current (referred to as CHE current hereinafter).

FIG. 123 shows an equivalent circuit diagram of the above-described memory cell. For example, in the case the island-like semiconductor layers are formed of a P-type semiconductor, a selected cell shown in FIG. 123 is written by applying a first potential to a first electrode of an island-like semiconductor layer including the selected cell, a third potential to a third electrode connected to the selected cell, and a fourth potential to a fourth electrode of the island-like semiconductor layer including the selected cell. This application of the potentials generates the CHE current in the channel region of the selected cell and changes the state of the charge in the charge storage layer. For example, if the "1" is written by storing a negative charge in the charge storage layer, the fourth potential is larger than the first potential, the third potential is larger than the first potential, the first potential is preferably the ground potential, and the third or fourth potential is a potential such that the "1" can be written by a potential difference between the third and first potentials and a potential difference between the fourth and first potential, for example, a potential allowing the generation of a sufficient CHE current. The CHE current flows in the tunnel oxide film of the memory transistor having, as the gate electrode, the third electrode to which the third potential is applied and thereby changes the state of the charge in the charge storage layer.

In the case where the first electrode is formed as an impurity diffusion layer in the semiconductor substrate and the tenth potential applied to the semiconductor substrate is a ground potential, the first potential is generally the ground potential. In the case where the first electrode is electrically insulated from the semiconductor substrate, for example, in the case where the first electrode is formed of an impurity diffusion layer on an SOI substrate and is insulated from the semiconductor substrate by an insulating film, the first potential is not necessarily the same as the tenth potential.

The writing of "1" in the selected cell has been so far described by taking for example the case where the memory cells having floating gates as the charge storage layers are written with the "1" by changing the state of the charge in the charge storage layers and with the "0" by not changing the state of the charge and the CHE current is used as means for changing the state of the charge. However, the charge storage layer may be, for example, a dielectric or a laminated insulating film as well as the floating gate. Also, it is needless to say that the "0" may be written by changing the state of the charge in the charge storage layer and the "1" may be written by not changing the state of the charge. Further, the "0" may be written by slightly changing the state of the charge in the charge storage layer and the "1" may be written by greatly changing the state of the charge, and vice versa. Furthermore, the "0" is written by changing the state of the charge in the charge storage layer to negative and the "1" is written by changing the state of the charge to positive, and vice versa. The above-mentioned definitions of "0" and "1" may be combined. The CHE current is not the only means for changing the state of the charge in the charge storage layer.

An example of application of the potentials for writing data has been described. Now examples of timing of applying the above-described potentials for writing data are explained with the case where one memory cell is disposed in an island-like semiconductor layer formed of a P-type semiconductor.

Figure 199:
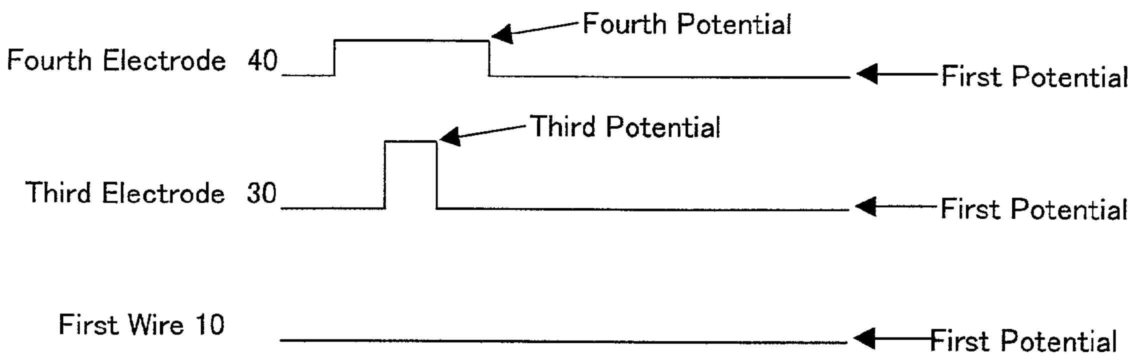
FIG. 199 to FIG. 235 show examples of timing charts at writing data in semiconductor memories in accordance with the present invention.

FIG. 199 shows a timing chart showing an example of applying each potential for writing data in the case where the ground potential is applied as the first potential to the first electrode. For example, if the "1" is written by storing a negative charge in the charge storage layer, the ground potential as the first potential is first applied to the first, third and fourth electrodes. In this state, the fourth potential, e.g., 6V, is applied to the fourth electrode. The third potential, e.g., 12 V, is applied to the third electrode connected to the selected cell. This state is maintained for a desired period of time to write the "1." The timing of applying the potentials to the respective electrodes may be in another order or simultaneous. The third electrode is returned to the ground potential and the fourth electrode is returned to the ground potential. The timing of returning the respective electrodes to the ground potential may be in another order or simultaneous. The potentials applied may be any combination of potentials so long as they satisfy conditions for writing the "1" in a desired cell. Here, the same potential is preferably applied initially as the first potential to the first, third and fourth electrodes, but different potentials may be applied.

Figure 200:
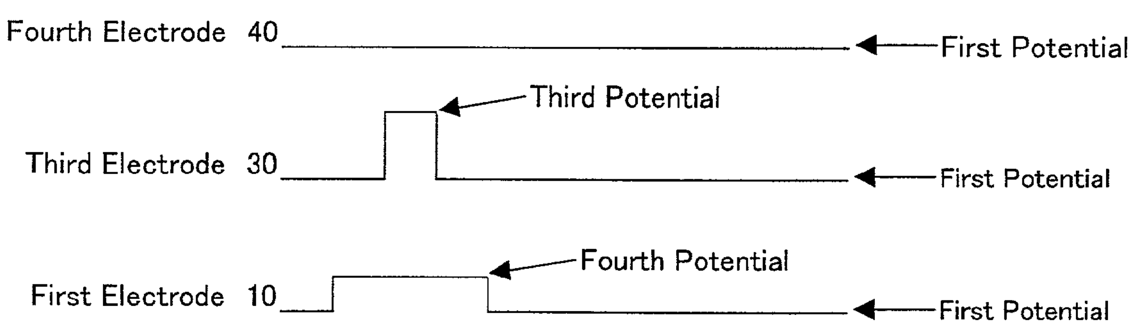

In contrast to FIG. 199, FIG. 200 shows a timing chart for writing data in the case where the first electrode is exchanged with the fourth electrode. FIG. 200 conforms to FIG. 199 except that the first potential and the fourth potential are changed with each other.

Have been described the examples of the principle of writing in the case where one memory cell is disposed in each island-like semiconductor layer formed of the P-type semiconductor. The polarity of all the electrodes may be reversed as in the case of island-like semiconductor layers formed of an N-type semiconductor. At this time, the potentials have a relationship in magnitude reverse to that mentioned above.

A writing process is now explained with a semiconductor memory according to the present invention which is constructed to have island-like semiconductor layers each of which includes, as selection gate transistors, a transistor having the second electrode as a gate electrode and a transistor having the fifth electrode as a gate electrode and a plurality of (e.g., L, L is a positive integer) memory cells provided with a charge storage layer between gate transistors and the third electrode as a control gate electrode and connected in series. The writing process utilizes the F-N current.

FIG. 124 shows an equivalent circuit diagram of the above-described memory cell. For example, in the case the island-like semiconductor layers are formed of a P-type semiconductor, a selected cell shown in FIG. 124 is written by applying a first potential to a first electrode 10 of an island-like semiconductor layer including the selected cell, a second potential to a second electrode 20 arranged in series with the selected cell, a third potential to a third electrode (30-h) (h is an positive integer, $1 \leqq h \leqq L$), a seventh potential to a third electrode (3-j-1 to 3-j-(h−1)) connected to non-selected cells arranged in series with the selected cell, an eleventh potential to third electrodes (3-j-(h+1) to 3-j-L) connected to non-selected cells arranged in series with the selected cell, a fourth potential to the fourth electrode 40 of the island-like semiconductor layer including the selected cell and a fifth potential to the fifth electrode 50 arranged in series with the selected cell. The application of these potentials generates the F-N current only in the tunnel oxide film of the selected cell and changes the state of the charge in the charge storage layer. For example, if the "1" is written by storing a negative charge in the charge storage layer, the third potential is larger than the fourth potential. If the "1" is written by drawing a negative charge from the charge storage layer, i.e., by storing a positive charge, the third potential is smaller than the fourth potential. Thereby, the "0" or "1" can be set by utilizing a change in the state of the charge in the charge storage layer. At this time, the third potential is a potential such that the "1" can be written by a difference between the third and fourth potentials. For example, the third potential is a potential allowing the generation of a sufficient F-N current flow by a difference between the third and fourth potentials. The F-N current flows in the tunnel oxide film of the memory transistor having, as the gate electrode, the third electrode to which the third potential is applied and thereby changes the state of the charge in the charge storage layer. The seventh potential is a potential always allowing a cell current to flow through the memory cell regardless of the state of the charge stored in the charge storage layer, i.e., a potential allowing the formation of a reverse layer in the channel region of the memory cell, and not generating a change in the charge by the F-N current flowing the tunnel oxide film. For example, if the "1" is written by storing a negative charge in the charge storage layer, the seventh potential is a potential which is not less than the threshold that memory transistors having as gate electrodes the third electrodes connected to the third electrodes (3-j-1 to 3-j-(h−1)) can take and sufficiently reduces the F-N current flowing the tunnel oxide film of the memory transistors having as gate electrodes the third electrodes to which the seventh potential is applied. The eleventh potential may be a potential sufficiently reduces the F-N current flowing the tunnel oxide film of the memory transistors having as gate electrodes the third electrodes to which the eleventh potential is applied. The second potential is a potential not allowing the cell current to flow, for example, a potential not higher than the threshold of a transistor having the second electrode 20 as a gate electrode. The fifth potential may be a potential allowing the cell current to flow, for example, a potential not lower than the threshold of a transistor having the fifth electrode 50 as a gate electrode. The first electrode 10 may be opened.

In the case where the channel region of a selected memory cell is electrically connected to the semiconductor substrate, for example, in the case where the island-like semiconductor layer is not floated from the semiconductor substrate by an impurity diffusion layer, all memory cells having the third electrodes to which the third potential is applied can also be written at the same time if the tenth potential applied to the semiconductor substrate is a potential such that the "1" is written by a difference between the third potential and the tenth potential, for example, a potential such that a sufficiently large F-N current flows by a difference between the third potential and the tenth potential. The F-N current flows in the tunnel oxide film of the memory transistor having, as the gate electrode, the third electrode to which the third potential is applied.

In the case where the first electrode is formed as an impurity diffusion layer in the semiconductor substrate and the tenth potential applied to the semiconductor substrate is the ground potential, the first potential is generally the ground potential. In the case where the first electrode is electrically insulated from the semiconductor substrate, for example, in the case where the first electrode is formed of an impurity diffusion layer on an SOI substrate and is insulated from the semiconductor substrate by an insulating film, the first potential is not necessarily the same as the tenth potential. Memory cells may be sequentially written from a memory cell connected to a third electrode (3-L) to a memory cell connected to a third electrode (3-1), or may be written in reverse order or at random. Further, some or all memory cells connected to the third electrode (3-h) may be written at the same time, some or all memory cells connected to the third electrodes (3-1 to 30-L) may be written at the same time, and some or all memory cells connected to the third electrodes (30-1 to 30-L) may be written at the same time.

The writing of "1" in the selected cell has been so far described by taking for example the case where the memory cells having floating gates as the charge storage layers are written with the "1" by changing the state of the charge in the charge storage layers and with the "0" by not changing the state of the charge and the F-N current is used as means for changing the state of the charge. However, the charge storage layer may be, for example, a dielectric or a laminated insulating film as well as the floating gate. Also, it is needless to say that the "0" may be written by changing the state of the charge in the charge storage layer and the "1" may be written by not changing the state of the charge. Further, the "0" may be written by slightly changing the state of the charge in the charge storage layer and the "1" may be written by greatly changing the state of the charge, and vice versa. Furthermore, the "0" is written by changing the state of the charge in the charge storage layer to negative and the "1" is written by changing the state of the charge to positive, and vice versa. The above-mentioned definitions of "0" and "1" may be combined. The F-N current is not the only means for changing the state of the charge in the charge storage layer.

An example of application of the potentials for writing data has been described. Now examples of timing of applying the above-described potentials for writing data are explained with the case of a plurality of (e.g., L, L is a positive integer) memory cells which are formed of a P-type semiconductor and connected in series.

Figure 201:
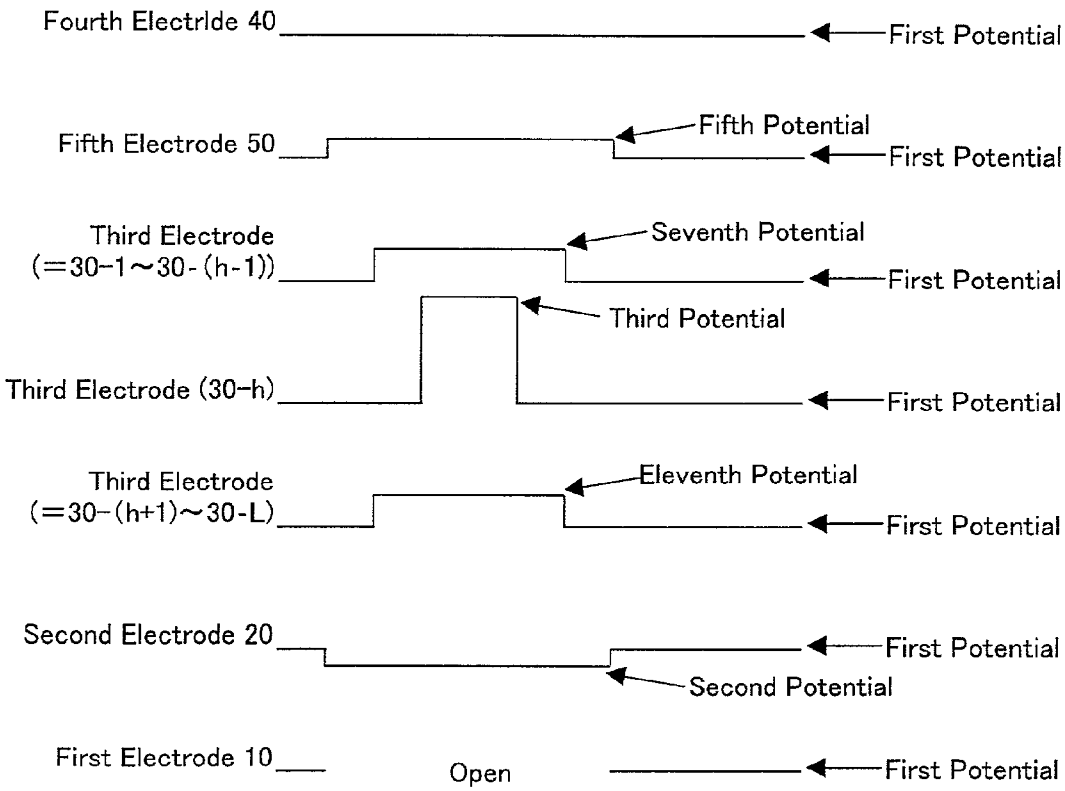

FIG. 201 is a timing chart showing an example of timing of applying each potential for writing data. In FIG. 201, the first electrode is open, the thresholds of transistors having gate electrodes connected to the second electrode and the fifth electrode are, for example, 0.5 V, and the memory cell has a threshold of 1.0 V to 3.5 V when it is in the written state and has a threshold of −1.0 V or lower when it is in the erased state. For example, if the "1" is written by storing a negative charge in the charge storage layer, the ground potential as the first potential is first applied to the first electrode 10, the second electrode 20, the third electrodes (30-1 to 30-L), the fourth electrode 40 and the fifth electrode 50. In this state, the first electrode 10 is opened. The second potential, e.g., 1 V, is applied to the second electrode 20, and the fifth potential, e.g., 1 V, is applied to the fifth electrode 50. The ground potential which is the first potential is kept applied as the fourth potential to the fourth electrode 40. The seventh potential, e.g., 10 V, is applied to third electrodes (30-1 to 30-(h−1)) (h is a positive integer, 1≦h≦L), the eleventh potential, e.g., 10 V, is applied to third electrodes (30-(h+1) to 30-L), and the third potential, e.g., 20 V, is applied to the third electrode (30-h). This state is maintained for a desired period of time to write the "1." The timing of applying the potentials to the respective electrodes may be in another order or simultaneous. The third electrode (30-h) is returned to the ground potential, i.e., the first potential, the third electrodes (not 30-h) are returned to the ground potential, i.e., the first potential, the second electrode 20 and the fifth electrode 50 are returned to the ground potential, i.e., the first potential, and the first electrode 10 is returned to the ground potential, i.e., the first potential. The timing of returning the respective electrodes to the ground potential may be in another order or simultaneous. The potentials applied may be any combination of potentials so long as they satisfy conditions for writing the "1" in a desired cell. Here, the same potential is preferably applied initially as the first potential to the first electrode 10, the second electrode 20, the third electrode 30-h, the fourth electrode 40 and the fifth electrode 50, but different potentials may be applied. In the above example, the writing process has been described with the case where the selected cell is a memory cell having the third electrode (30-h) as the gate electrode. However, the writing process is the same with the case where the selected cell is a memory cell having a third electrode other than the third electrode (30-h) as the gate electrode.

Figure 202:
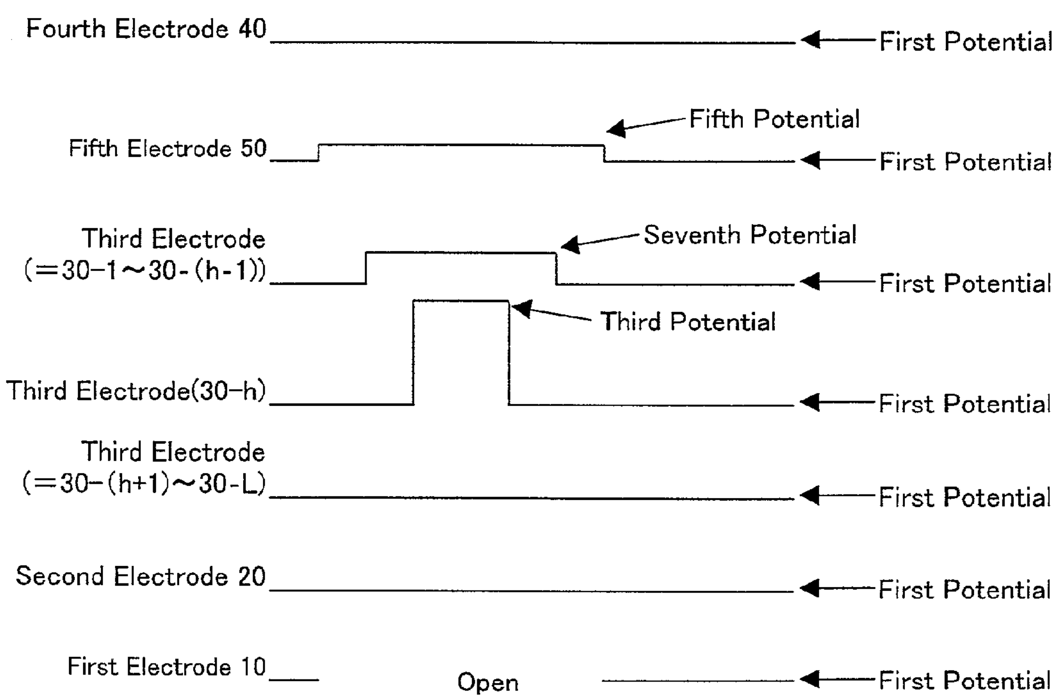

In contrast to FIG. 201, FIG. 202 shows a timing chart for writing data in the case where the eleventh potential is the ground potential. The writing of the selected cell of FIG. 202 conforms to that of FIG. 201 without being affected by application of the ground potential, i.e., the first potential, as the eleventh potential to the third electrodes (30-(h+1) to 30-L, h is a positive integer, 1≦h≦L).

Figure 203:
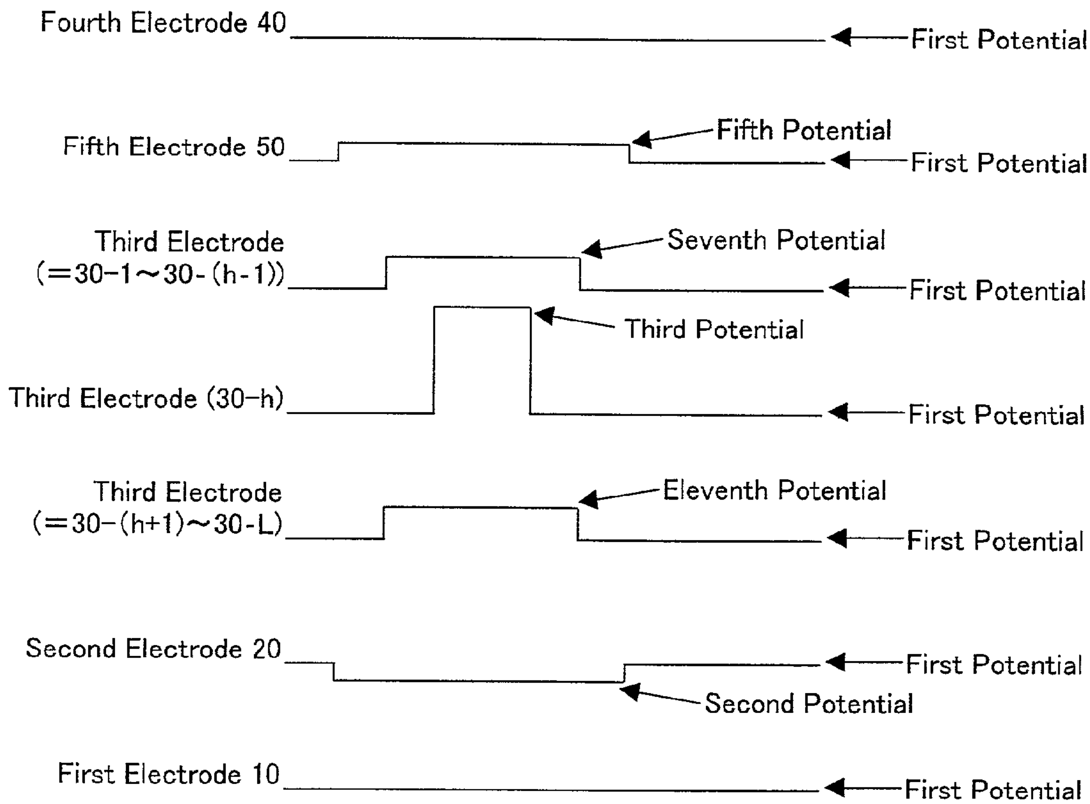

In contrast to FIG. 201, FIG. 203 shows a timing chart for writing data in the case where the first potential is the ground potential. The writing of the selected cell of FIG. 203 conforms to that of FIG. 201 without being affected by the application of the ground potential as the first potential to the first electrode 10 if the second potential is not higher than the threshold of the transistor having the second electrode 20 as the gate electrode.

Figure 204:
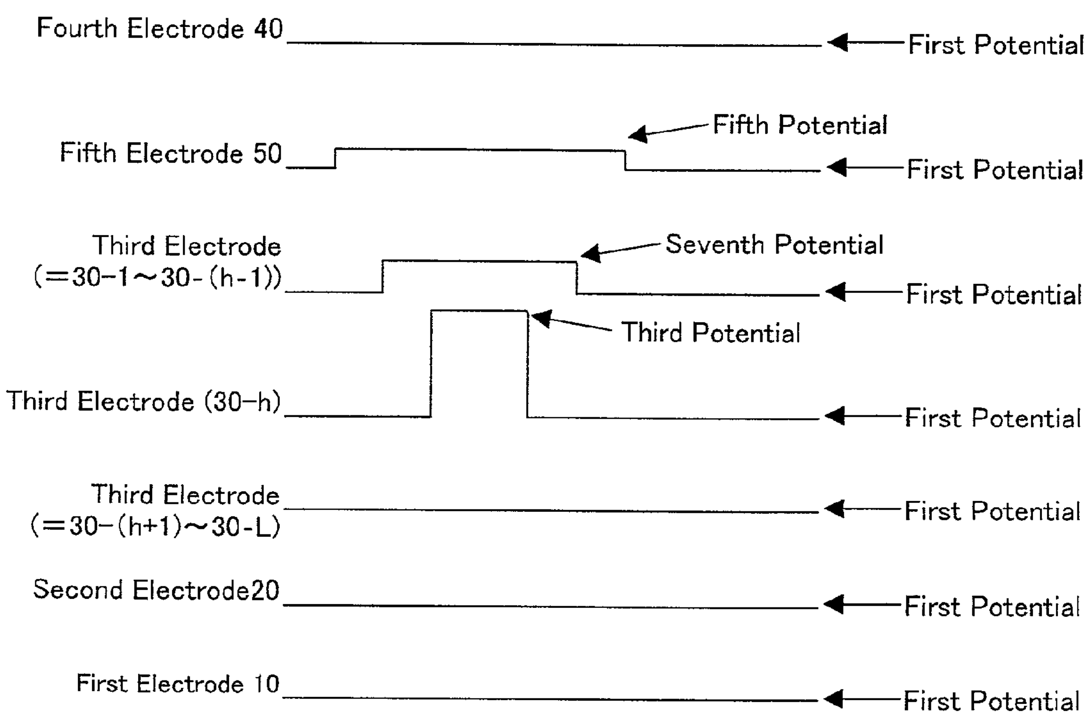

In contrast to FIG. 202, FIG. 204 shows a timing chart for writing data in the case where the first potential is the ground potential. The writing of the selected cell of FIG. 204 conforms to that of FIG. 202 without being affected by the application of the ground potential as the first potential to the first electrode 10 if the second potential is not higher than the threshold of the transistor having the second electrode 20 as the gate electrode.

Have been described above the examples of the principle of writing in the case of a plurality of (e.g., L, L is a positive integer) memory cells formed of the P-type semiconductor arranged in series. The polarity of all the electrodes may be reversed as in the case of island-like semiconductor layers formed of an N-type semiconductor. At this time, the potentials have a relationship in magnitude reverse to that mentioned above.

A writing process is now explained with a semiconductor memory according to the present invention which is constructed to have island-like semiconductor layers each including two memory cells which are provided with a charge storage layer between the gate transistors and a third electrode as a control gate electrode and are connected in series. The writing process utilizes the F-N current.

FIG. 126 shows an equivalent circuit diagram of the above-described memory cell. For example, in the case where the island-like semiconductor layers are formed of a P-type semiconductor, a selected cell shown in FIG. 126 is written by applying a first potential to a first electrode 10 of an island-like semiconductor layer including the selected cell, a third potential to a third electrode (30-1) connected to the selected cell, the eleventh potential to a third electrode (30-2) connected a non-selected cell arranged in series with the selected cell, and a fourth potential to a fourth electrode 40 of the island-like semiconductor layer including the selected cell. The application of these potentials generates the F-N current only in the channel region of the selected cell and changes the state of the charge in the charge storage layer. For example, if the "1" is written by storing a negative charge in the charge storage layer, the third potential is larger than the fourth potential. If the "1" is written by drawing a negative charge from the charge storage layer, i.e., by storing a positive charge, the third potential is smaller than the fourth potential. Thus, the "0" or "1" can be set by utilizing a change in the state of the charge in the charge storage layer. At this time, the third potential is a potential such that the "1" can be written by a difference between the third and fourth potentials. For example, the third potential is a potential allowing the generation of a sufficient F-N current flow by a difference between the third and fourth potentials. The F-N current flows in the tunnel oxide film of the memory transistor having, as the gate electrode, the third electrode to which the third potential is applied and thereby changes the state of the charge in the charge storage layer. The eleventh potential is a potential such that a change in the charge is not generated by the F-N current flowing in the tunnel oxide film. For example, if the "1" is written by storing a negative charge in the charge storage layer, the eleventh potential may be a potential which is not lower than the threshold of a memory transistor having the third electrode (30-2) as the gate electrode and sufficiently reduces the F-N current flowing in the tunnel oxide film of the memory transistor having as the gate electrode the third electrode to which the eleventh potential is applied. The first electrode 10 may be opened.

In the case where the channel region of a selected memory cell is electrically connected to the semiconductor substrate, for example, in the case where the island-like semiconductor layer is not floated from the semiconductor substrate by an impurity diffusion layer, all memory cells having the third electrodes to which the third potential is applied can also be written at the same time if the tenth potential applied to the semiconductor substrate is a potential such that the "1" is written by a difference between the third potential and the tenth potential, for example, a potential such that a sufficiently large F-N current flows by a difference between the third potential and the tenth potential. The F-N current flows in the tunnel oxide film of the memory transistor having, as the gate electrode, the third electrode to which the third potential is applied.

In the case where the first electrode is formed as an impurity diffusion layer in the semiconductor substrate and the tenth potential applied to the semiconductor substrate is a ground potential, the first potential is generally the ground potential. In the case where the first electrode is electrically insulated from the semiconductor substrate, for example, in the case where the first electrode is formed of an impurity diffusion layer on an SOI substrate and is insulated from the semiconductor substrate by an insulating film, the first potential is not necessarily the same as the tenth potential.

The writing of "1" in the selected cell has been so far described by taking for example the case where the memory cells having floating gates as the charge storage layers are written with the "1" by changing the state of the charge in the charge storage layers and with the "0" by not changing the state of the charge and the F-N current is used as means for changing the state of the charge. However, the charge storage layer may be, for example, a dielectric or a laminated insulating film as well as the floating gate. Also, it is needless to say that the "0" may be written by changing the state of the charge in the charge storage layer and the "1" may be written by not changing the state of the charge. Further, the "0" may be written by slightly changing the state of the charge in the charge storage layer and the "1" may be written by greatly changing the state of the charge, and vice versa. Furthermore, the "0" is written by changing the state of the charge in the charge storage layer to negative and the "1" is written by changing the state of the charge to positive, and vice versa. The above-mentioned definitions of "0" and "1" may be combined. The F-N current is not the only means for changing the state of the charge in the charge storage layer.

An example of application of the potentials for writing data has been described. Now examples of timing of applying the above-described potentials for writing data are explained with the case of two memory cells formed of a P-type semiconductor and arranged in series.

Figure 205:
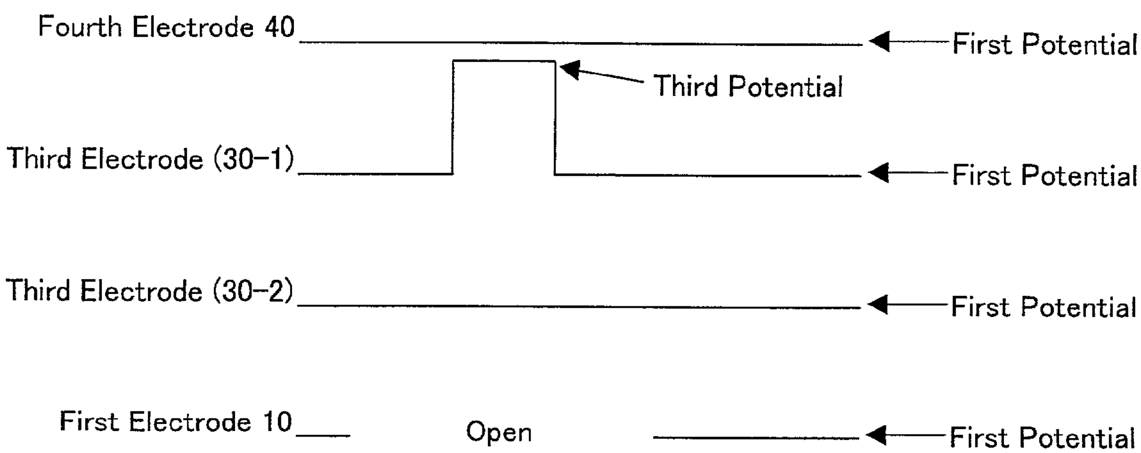

FIG. 205 is a timing chart showing an example of applying each potential for writing data. In FIG. 205, the first electrode is open, and the memory cell has a threshold of 1.0 V to 3.5 V when it is in the written state and has a threshold of 1.0 V or lower when it is in the erased state. For example, if the "1" is written by storing a negative charge in the charge storage layer, the ground potential as the first potential is first applied to the first electrode 10, the third electrodes (30-1 to 30-2) and the fourth electrode 40. In this state, the first electrode is opened. The ground potential which is the first potential is kept applied as the fourth potential to the fourth electrode 40. The eleventh potential, e.g., the ground potential which is the first potential, is applied to the third electrode (30-2), and the third potential, e.g., 20 V, is applied to the third electrode (30-1). This state is maintained for a desired period of time to write the "1." The timing of applying the potentials to the respective electrodes may be in another order or simultaneous. The third electrode (30-1) is returned to the ground potential, i.e., the first potential, and the first electrode 10 is returned to the ground potential, i.e., the first potential. The timing of returning the respective electrodes to the ground potential, i.e., the first potential, may be in another order or simultaneous. The potentials applied may be any combination of potentials so long as they satisfy conditions for writing the "1" in a desired cell. Here, the same potential is preferably applied initially as the first potential to the first electrode 10, the third electrodes 30-1 to 30-2 and the fourth electrode 40, but different potentials may be applied.

In the above example, the writing process has been described with the case where the selected cell is a memory cell having the third electrode (30-1) as the gate electrode. However, the writing process is the same with the case where the selected cell is a memory cell having the third electrode (30-2) as the gate electrode.

Figure 206:
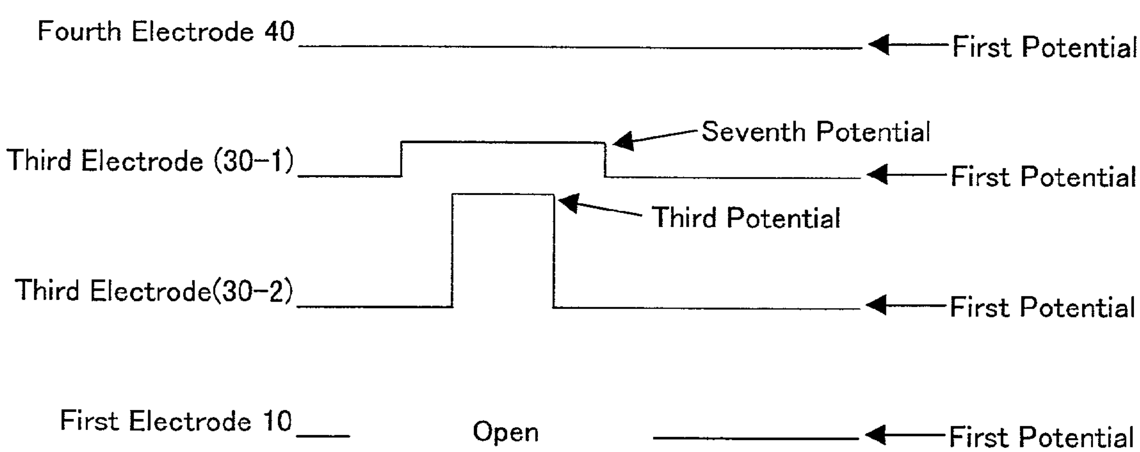

In contrast to FIG. 201, explanation is given of the case where the selected cell is a memory cell having the third electrode (30-2) as the gate electrode. FIG. 206 shows a timing chart showing an example of applying each potential for writing data. In FIG. 206, the first electrode is open, and the memory cell has a threshold of 1.0 V to 3.5 V when it is in the written state and has a threshold of −1.0 V or lower when it is in the erased state. For example, if the "1" is written by storing a negative charge in the charge storage layer, the ground potential as the first potential is first applied to the first electrode 10, the third electrodes (30-1 to 30-2) and the fourth electrode 40. In this state, the first electrode is opened. The ground potential which is the first potential is kept applied as the fourth potential to the fourth electrode 40. The eleventh potential, e.g., 10V, is applied to the third electrode (30-1), and the third potential, e.g., 20 V, is applied to the third electrode (30-2). This state is maintained for a desired period of time to write the "1." The timing of applying the potentials to the respective electrodes may be in another order or simultaneous. The third electrode (30-2) is returned to the ground potential, i.e., the first potential, the third electrode (30-1) is returned to the ground potential, i.e., the first potential, and the first electrode 10 is returned to the ground potential, i.e., the first potential. The timing of returning the respective electrodes to the ground potential may be in another order or simultaneous. The potentials applied may be any combination of potentials so long as they satisfy conditions for writing the "1" in a desired cell. Here, the same potential is preferably applied initially as the first potential to the first electrode 10, the third electrodes 30-1 to 30-2 and the fourth electrode 40, but different potentials may be applied.

Figure 207:
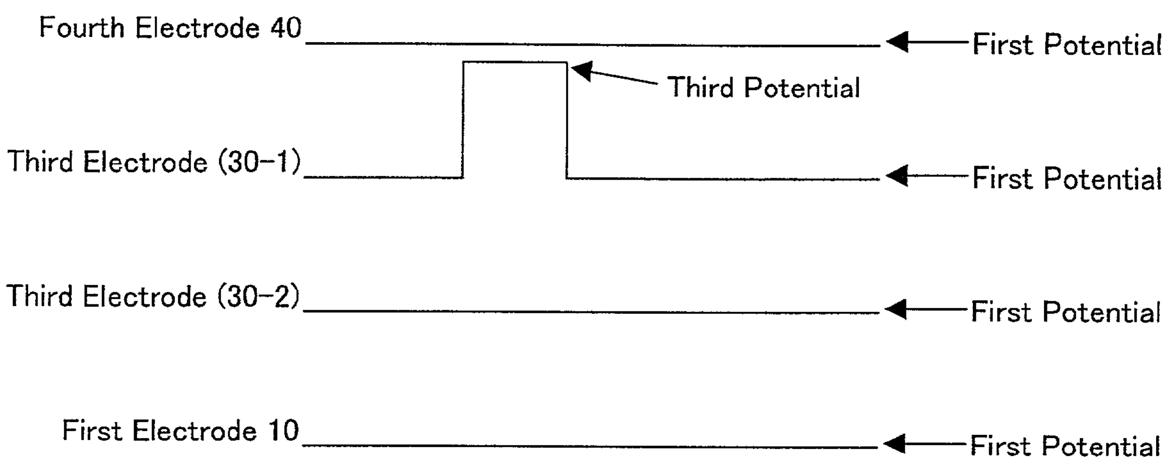

In contrast to FIG. 205, FIG. 207 is a timing chart showing an example of applying each potential for writing data in the case where the first potential is the ground potential. The writing of the selected cell of FIG. 207 conforms to that of FIG. 205 without being affected by application of the ground potential as the first potential to the first electrode 10.

Figure 208:
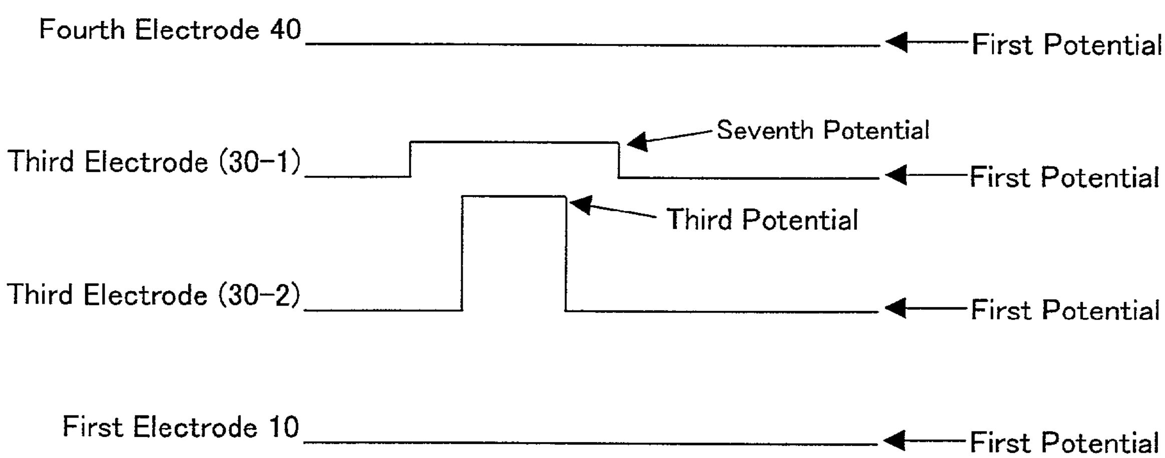

In contrast to FIG. 206, FIG. 208 is a timing chart showing an example of applying each potential for writing data in the case where the first potential is the ground potential. The writing of the selected cell of FIG. 208 conforms to that of FIG. 206 without being affected by application of the ground potential as the first potential to the first electrode 10.

Have been described above the examples of the principle of writing in the case of two memory cells formed of the P-type semiconductor arranged in series. The polarity of all the electrodes may be reversed as in the case of island-like semiconductor layers formed of an N-type semiconductor. At this time, the potentials have a relationship in magnitude reverse to that mentioned above.

A writing process is now explained with a semiconductor memory according to the present invention which is constructed to have island-like semiconductor layers each including two memory cells which are provided with a charge storage layer between the gate transistors and a third electrode as the control gate electrode and are connected in series. The writing process utilizes the CHE current.

FIG. 126 shows an equivalent circuit diagram of the above-described memory cell. For example, in the case the island-like semiconductor layers are formed of a P-type semiconductor, a selected cell shown in FIG. 126 is written by applying a first potential to a first electrode 10 of an island-like semiconductor layer including the selected cell, a third potential to a third electrode (30-1) connected to the selected cell, an eleventh potential to a third electrode (30-2) connected to a non-selected cell arranged in series with the selected cell, and a fourth potential to a fourth electrode 40 of the island-like semiconductor layer including the selected cell. The application of these potentials generates the CHE current only in the channel region of the selected cell and changes the state of the charge in the charge storage layer. For example, if the "1" is written by storing a negative charge in the charge storage layer, the fourth potential is larger than the first potential, the third potential is larger than the first potential, the first potential is preferably the ground potential, the third or fourth potential is such that the "1" can be written by a potential difference between the third and first potentials and a potential difference between the fourth and first potential. For example, the third or fourth potential is such that a sufficient CHE current is generated by a potential difference between the third and first potentials and a potential difference between the fourth and first potential. The CHE current flows in the tunnel oxide film of a memory transistor having, as the gate electrode, the third electrode to which the third potential is applied.

The eleventh potential is a potential always allowing the cell current to flow in the memory cell regardless of the state of the charge in the charge storage layer, that is, a potential allowing the formation of a reverse layer in the channel region of the memory cell, but the state of the charge in the charge storage layer is not changed by the eleventh potential. For example, if the "1" is written by storing a negative charge in the charge storage layer, the eleventh potential may be a potential which is not lower than the threshold of a memory transistor having as the gate electrode the third electrode (30-2) and sufficiently reduces the F-N current or the CHE current flowing in the tunnel oxide film of the memory transistor having, as the gate electrode, the third electrode to which the eleventh potential is applied.

In the case where the first electrode 10 is formed as an impurity diffusion layer in the semiconductor substrate and the tenth potential applied to the semiconductor substrate is a ground potential, the first potential is generally the ground potential. In the case where the first electrode 10 is electrically insulated from the semiconductor substrate, for example, in the case where the first electrode 10 is formed of an impurity diffusion layer on an SOI substrate and is insulated from the semiconductor substrate by an insulating film, the first potential is not necessarily the same as the tenth potential.

The writing of "1" in the selected cell has been so far described by taking for example the case where the memory cells having floating gates as the charge storage layers are written with the "1" by changing the state of the charge in the charge storage layers and with the "0" by not changing the state of the charge and the CHE current is used as means for changing the state of the charge. However, the charge storage layer may be, for example, a dielectric or a laminated insulating film as well as the floating gate. Also, it is needless to say that the "0" may be written by changing the state of the charge in the charge storage layer and the "1" may be written by not changing the state of the charge. Further, the "0" may be written by slightly changing the state of the charge in the charge storage layer and the "1" may be written by greatly changing the state of the charge, and vice versa. Furthermore, the "0" is written by changing the state of the charge in the charge storage layer to negative and the "1" is written by changing the state of the charge to positive, and vice versa. The above-mentioned definitions of "0" and "1" may be combined. The CHE current is not the only means for changing the state of the charge in the charge storage layer.

An example of application of the potentials for writing data has been described. Now examples of timing of applying the above-described potentials for writing data are explained with the case of two memory cells formed of a P-type semiconductor and arranged in series.

Figure 209:
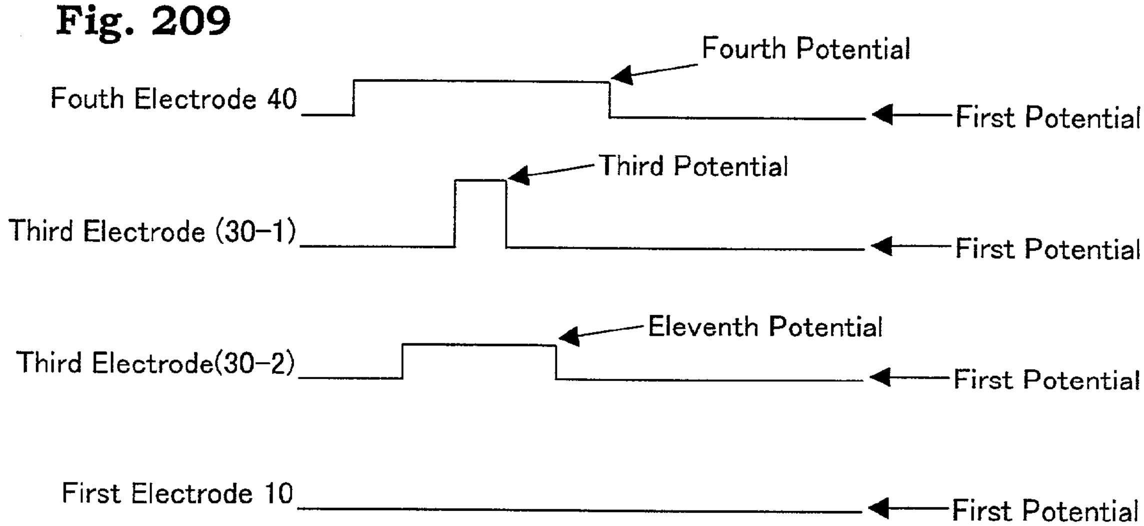

FIG. 209 is a timing chart showing an example of applying each potential for writing data. In FIG. 209, the first potential, e.g., the ground potential, is given to the first electrode, and the memory cell has a threshold of 5.0 V to 7.5 V when it is in the written state and has a threshold of 0.5 V to 3.0 V when it is in the erased state. For example, if the "1" is written by storing a negative charge in the charge storage layer, the ground potential as the first potential is first applied to the first electrode 10, the third electrodes (30-1 to 30-2) and the fourth electrode 40. In this state, the fourth potential, e.g., 6 V, is applied as the fourth potential to the fourth electrode 40. The eleventh potential, e.g., 8 V, is applied to the third electrode (30-2) connected to a non-selected cell arranged in series with the selected cell, and the third potential, e.g., 12V, is applied to the third electrode (30-1) connected to the selected cell. This state is maintained for a desired period of time to write the "1." The timing of applying the potentials to the respective electrodes may be in another order or simultaneous. The third electrode (30-1) is returned to the ground potential, the third electrode (30-2) is returned to the ground potential, and the fourth electrode 40 is returned to the ground potential. The timing of returning the respective electrodes to the ground potential may be in another order or simultaneous. The potentials applied may be any combination of potentials so long as they satisfy conditions for writing the "1" in a desired cell. Here, the same potential is preferably applied initially as the first potential to the first electrode 10, the third electrodes (30-1 to 30-2) and the fourth electrode 40, but different potentials may be applied. In the above example, the writing process has been described with the case where the selected cell is a memory cell having the third electrode (30-1) as the gate electrode. However, the writing process is the same with the case where the selected cell is a memory cell having the third electrode (30-2) as the gate electrode.

Figure 210:
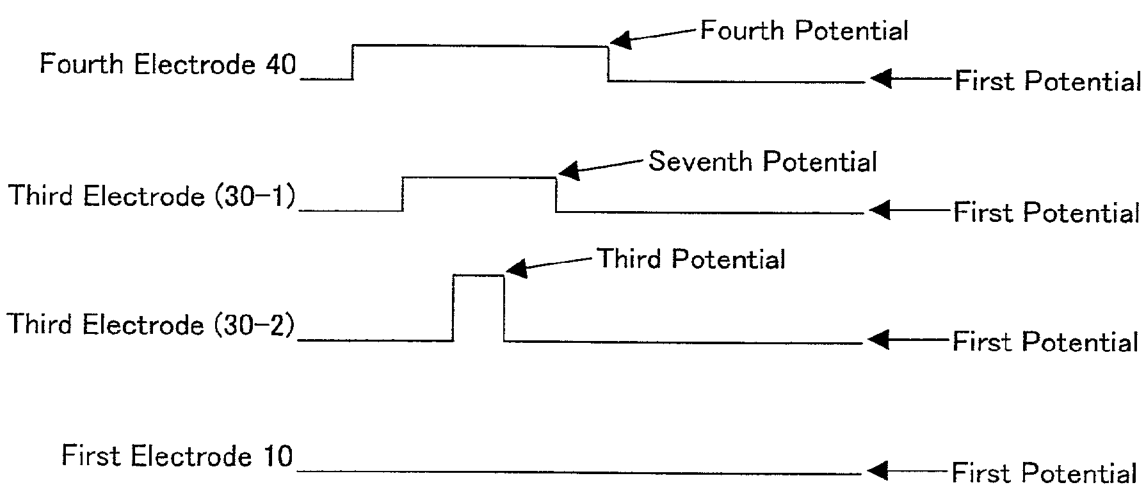

In contrast to FIG. 209, FIG. 210 is a timing chart showing an example of applying each potential for writing data in the case where the selected cell is a memory cell connected to the third electrode (30-2). FIG. 210 conforms to FIG. 209 except that the seventh potential instead of the eleventh potential is applied to the third electrode connected to the non-selected cell arranged in series with the selected cell. At this time, the seventh potential is equal to the eleventh potential.

Has been described above the examples of the principle of writing in the case of two memory cells formed of the P-type semiconductor and arranged in series. The polarity of all the electrodes may be reversed as in the case of island-like semiconductor layers formed of an N-type semiconductor. At this time, the potentials have a relationship in magnitude reverse to that mentioned above.

A writing process is now explained with a semiconductor memory according to the present invention which is constructed to include a plurality of (e.g., M×N, M and N are positive integers) island-like semiconductor layers each having, as selection gate transistors, a transistor provided with the second electrode as a gate electrode and a transistor provide with the fifth electrode as a gate electrode and a plurality of (e.g., L, L is a positive integer) memory cells provided with the charge storage layer between the selection gate transistors and the third electrode as a control gate electrode and connected in series. In this memory cell array, a plurality of (e.g., M) fourth wires arranged in parallel with the semiconductor substrate are connected to ends of the island-like semiconductor layers, and first wires are connected to opposite ends of the island-like semiconductor layers. A plurality of (e.g., N×L) third wires in parallel with the semiconductor substrate are arranged in a direction crossing the fourth wires and connected to the third electrodes of the memory cells. The writing process utilizes the F-N current.

FIG. 128 shows an equivalent circuit diagram of the above-described memory cell array in which the first wires are arranged in parallel to the third wires. For example, in the case where the island-like semiconductor layers are formed of a P-type semiconductor, a selected cell shown in FIG. 128 is written by applying a first potential to a first wire (1-j, j is a positive integer, 1≦j≦N) connected to an island-like semiconductor layer including the selected cell, a ninth potential to first wires (not 1-j) other than the first wire (1-j), a second potential to a second wire (2-j) connected to a second electrode arranged in series with the selected cell, a third potential to a third wire (3-j-h, h is a positive integer, 1≦h≦N) connected to the selected cell, a seventh potential to third wires (3-j-1 to 3-j-(h−1)) connected to non-selected cells arranged in series with the selected cell, an eleventh potential to third wires (3-j-(h+1) to 3-j-L) connected to non-selected cells arranged in series with the selected cell, a twelfth potential to other third wires (not 3-j-1 to 3-j-L), a fourth potential to a fourth wire (4-i, i is a positive integer, 1≦j≦M) connected to the fourth electrode of the island-like semiconductor layer including the selected cell, an eighth potential to fourth wires (not 4-i) other than the fourth wire (4-i), a fifth potential to a fifth wire (5-j) connected to a fifth electrode arranged in series with the selected cell, and a sixth potential to second wires (not 2-j) other than the second wire (2-j) or fifth wires (not 5-j) other than the fifth wire (5-j). The application of these potentials generates the F-N current only in the channel region of the selected cell and changes the state of the charge in the charge storage layer. For example, if the "1" is written by storing a negative charge in the charge storage layer, the third potential is larger than the fourth potential. If the "1" is written by drawing a negative charge from the charge storage layer, i.e., by storing a positive charge, the third potential is smaller than the fourth potential. Thus, the "0" or "1" can be set by utilizing a change in the state of the charge in the charge storage layer. At this time, the third potential is a potential such that the "1" can be written by a difference between the third and fourth potentials. For example, the third potential is a potential allowing the generation of a sufficient F-N current flow by a difference between the third and fourth potentials. The F-N current flows in the tunnel oxide film of the memory transistor having, as the gate electrode, the third electrode to which the third potential is applied and thereby changes the state of the charge in the charge strage layer. The seventh potential is a potential always allowing a cell current to flow through the memory cell regardless of the state of the charge stored in the charge storage layer, i.e., a potential allowing the formation of a reverse layer in the channel region of the memory cell, and not generating a change in the charge by the F-N current flowing the tunnel oxide film. For example, if the "1" is written by storing a negative charge in the charge storage layer, the seventh potential is a potential which is not less than the threshold that memory transistors having as gate electrodes the third electrodes connected to the third electrodes (3-j-1 to 3-j-(h−1)) can take and sufficiently reduces the F-N current flowing the tunnel oxide film of the memory transistors having as gate electrodes the third electrodes to which the seventh potential is applied.

The eleventh potential may be a potential sufficiently reduces the F-N current flowing the tunnel oxide film of the memory transistors having as gate electrodes the third electrodes to which the eleventh potential is applied. The second potential is a potential not allowing the cell current to flow, for example, a potential not higher than the threshold of a transistor having, as a gate electrode, the second electrode connected to the second wire (2-j). The fifth potential may be a potential allowing the cell current to flow, for example, a potential not lower than the threshold of a transistor having, as a gate electrode, the fifth electrode connected to the fifth wire (5-j). The sixth potential is a potential not allowing the cell current to flow, for example, a potential not higher than the threshold of the transistors having, as the gate electrodes, the second electrodes connected to the second wires (not 2-j) and the fifth electrodes connected to the fifth wires (not 5-j). The eighth potential is such that, in a transistor having, as the gate electrode, the fifth electrode connected to the fifth wire (5-j) and, as the source or drain electrode, the fourth electrode connected to a fourth wire (not 4-i), a cut-off state is generated by a potential difference between the eighth potential and the fifth potential which exceeds the threshold and a reverse layer is not generated in the channel region of a memory cell arranged in series with the above-mentioned transistor. The first wires (1-1 to 1-N) may be opened. Further, the fourth wires (not 4-i) may be opened, or has a potential such that the first and second potentials may become in the above-mentioned cut-off state. The eighth potential may be a potential such that, even if it is smaller than the fifth potential, the "1" is not written by a potential difference between the third and eighth potentials, for example, a potential such that sufficiently small is the F-N current caused by the potential difference to flow in the tunnel oxide film of the memory transistor having, as the gate electrode, the third electrode to which the third potential is applied.

In the case where the channel region of a selected memory cell is electrically connected to the semiconductor substrate, for example, in the case where the island-like semiconductor layer is not floated from the semiconductor substrate by an impurity diffusion layer, all memory cells having the third electrodes to which the third potential is applied can also be written at the same time if the tenth potential applied to the semiconductor substrate is a potential such that the "1" is written by a difference between the third potential and the tenth potential, for example, a potential such that a sufficiently large F-N current flows in the tunnel oxide film of the memory transistor having, as the gate electrode, the third electrode connected to the third wire to which the third potential is applied. At this time, in the case where the first wires (1-1 to 1-N) are formed as impurity diffusion layers in the semiconductor substrate, the ninth potential applied to the first wires (not 1-j) connected to the island-like semiconductor layers not including the selected cell is preferably a potential such that the island-like semiconductor layers are electrically floated from the semiconductor substrate by depletion layers extended by the application of the ninth potential. Thereby, the potential of the island-like semiconductor layers becomes equal to the ninth potential, and memory cells on the island-like semiconductor layers not including the selected cell are not written if the ninth potential is a potential such that the F-N current flowing in the tunnel oxide film of the memory transistors is sufficiently small. That is, the potential differences between the ninth and third potentials, between the ninth and seventh potentials and between the ninth and eleventh potentials are such that the F-N current flowing in the tunnel oxide films of the memory transistors is sufficiently small. If the channel regions of the memory cells are not connected electrically to the semiconductor substrate, the depletion layers owing to the ninth potential may be expended in any way.

In the case where the first wires (1-1 to 1-N) are formed as impurity diffusion layers in the semiconductor substrate and the tenth potential applied to the semiconductor substrate is the ground potential, the first potential is generally the ground potential. In the case where the first wires (1-1 to 1-N) are electrically insulated from the semiconductor substrate, for example, where the first electrodes (1-1 to 1-N) are formed of impurity diffusion layers on an SOI substrate and are insulated from the semiconductor substrate by an insulating film, the first potential is not necessarily the same as the tenth potential. Memory cells may be sequentially written from a memory cell connected to a third electrode (3-j-L) to a memory cell connected to a third electrode (3-j-1), or may be written in reverse order or at random. Further, some or all memory cells connected to the third wire (3-j-h) may be written at the same time, some or all memory cells connected to the third wires (3-j-1 to 3-j-L) may be written at the same time, and some or all memory cells connected to the third wires (3-1-1 to 3-N-L) may be written at the same time. Also, some or all memory cells connected to third wires selected regularly, e.g., a third wire (3-(j−8)-h), a third wire (3-j-h), a third wire (3-(j+8)-h), a third wire (3-(j+16)-h), . . . , may be written at the same time. Further some or all memory cells of one island-like semiconductor layer connected to the fourth wire (4-i) may be written at the same time, or some or all memory cells of some or all island-like semiconductor layers connected to the fourth wire (4-i) may be written at the same time. One, some or all memory cells of one island-like semiconductor layer connected to each of a plurality of fourth wires may be written at the same time, or some or all memory cells of some or all island-like semiconductor layers connected to each of a plurality of fourth wires may be written at the same time. The memory cells connected to the third wire (3-j-h) may be written at the same time at given intervals, for example, every eight fourth wires (e.g., a fourth wire (4-(i−16)), a fourth wire (4-(i−8)), a fourth wire (4-i), a fourth wire (4-(i+8)), a fourth wire (4-(i+16)), . . . ). All the memory cells having, as gate electrodes, the third electrodes connected to the third wire (3-j-h) can be written at the same time by applying the first potential to all the fourth wires, applying the fourth potential to the first wire (1-j) and the eighth potential to the first wires (not 1-j), exchanging the potentials of the second and fifth wires and applying the third potential to the third wire (3-j-h). Further, by applying the fourth potential to a plurality of first wires and applying the third potential to the third wires connected to the third electrodes of the memory cells included in the island-like semiconductor layers having the first electrodes connected to said plurality of first wires, all the memory cells having, as gate electrodes, the third electrodes connected to the third wires to which the third potential is applied can be written at the same time. The above-described writing processes may be combined.

The writing of "1" in the selected cell has been so far described by taking for example the case where the memory cells having floating gates as the charge storage layers are written with the "1" by changing the state of the charge in the charge storage layers and with the "0" by not changing the state of the charge and the F-N current is used as means for changing the state of the charge. However, the charge storage layer may be, for example, a dielectric or a laminated insulating film as well as the floating gate. Also, it is needless to say that the "0" may be written by changing the state of the charge in the charge storage layer and the "1" may be written by not changing the state of the charge. Further, the "0" may be written by slightly changing the state of the charge in the charge storage layer and the "1" may be written by greatly changing the state of the charge, and vice versa. Furthermore, the "0" is written by changing the state of the charge in the charge storage layer to negative and the "1" is written by changing the state of the charge to positive, and vice versa. The above-mentioned definitions of "0" and "1" may be combined. The F-N current is not the only means for changing the state of the charge in the charge storage layer.

FIG. 133 shows an equivalent circuit diagram of a memory cell array in which the first wires are arranged in parallel to the fourth wires. The application of the potentials for writing data is the same as that of FIG. 128 except that the first potential is applied to the first wire (1-i) and the ninth potential is applied to the first wires (not 1-i). FIG. 135 shows an equivalent circuit diagram of a memory cell array in which a plurality of first wires are electrically connected in common. The application of the potentials for writing data is the same as that of FIG. 128 except that the first potential is applied to the first wire (1-1).

Have been described above the examples of application of potentials for writing data. Now, timing charts for the above-described examples of application of potentials for writing data are explained with the case where a plurality of (e.g., M×N, M and N are positive integers) island-like semiconductor layers are arranged, each island-like semiconductor layer having a plurality of (e.g., L, L is a positive integer) memory cells connected in series and formed of a P-type semiconductor and selection gate transistors formed to sandwich the memory cells, and the first wires are arranged in parallel with the third wires.

Figure 211:
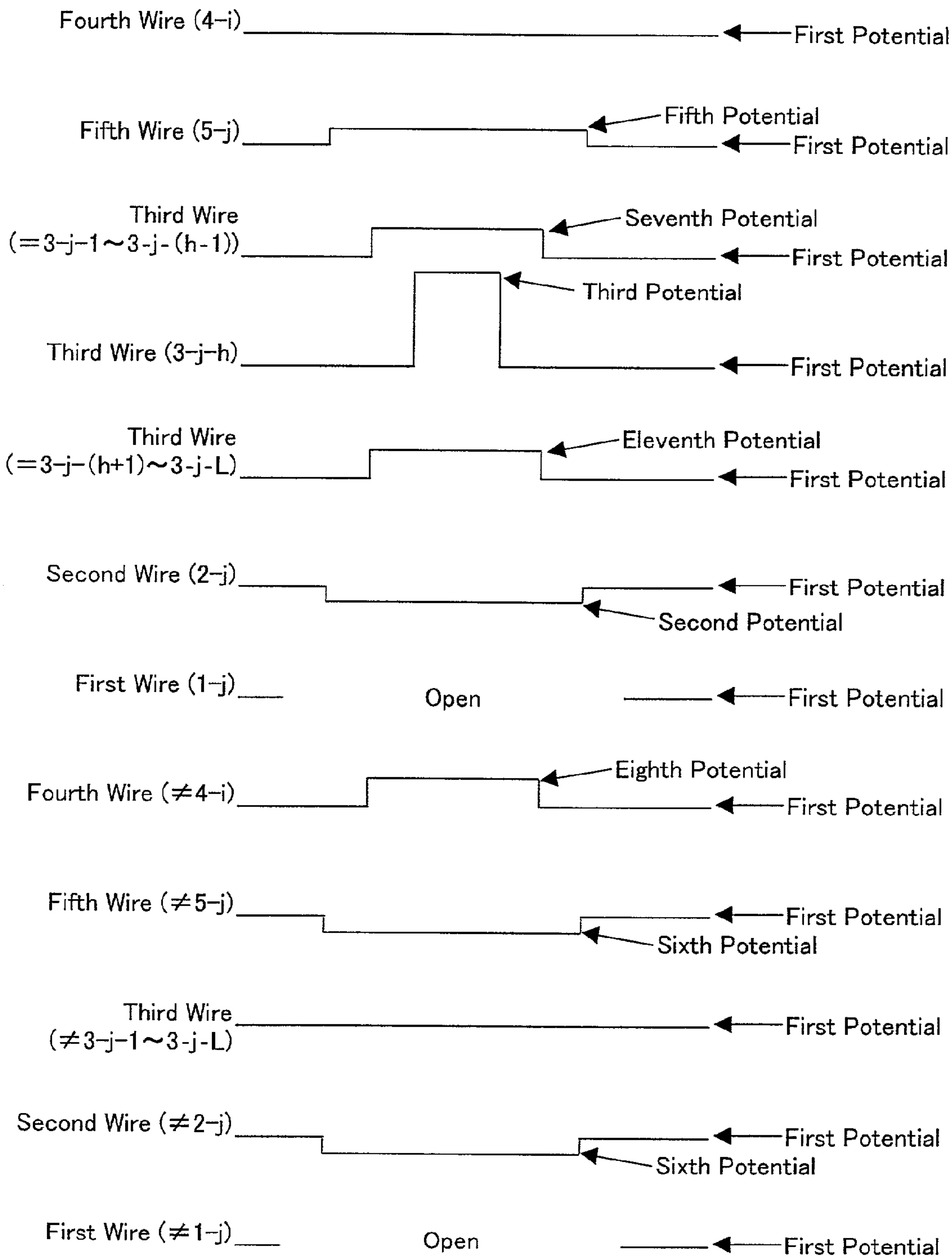

FIG. 211 shows a timing chart showing an example of timing of applying each potential for writing data. In FIG. 211, the first electrode is open, the thresholds of transistors having gate electrodes connected to the second wire and the fifth wire are, for example, 0.5 V, and the memory cell has a threshold of 1.0 V to 3.5 V when it is in the written state and has a threshold of −1.0 V or lower when it is in the erased state. For example, if the "1" is written by storing a negative charge in the charge storage layer, the ground potential as the first potential is first applied to the first wires (1-1 to 1-N), the second wires (2-1 to 2-N), the third wires (3-1-1 to 3-N-L), the fourth wires (4-1 to 4-M) and the fifth wires (5-1 to 5-N). In this state, the first wires (1-1 to 1-N) are opened. The sixth potential, e.g., 1 V, is applied to second wires (not 2-j) and fifth wires (not 5-j). The second potential, e.g., 1 V, is applied to the second electrode (2-j), and the fifth potential, e.g., 1 V, is applied to the fifth wire (5-j). The ground potential which is the first potential is kept applied as the fourth potential to the fourth wire (4-i). The eighth potential, e.g., 3 V, is applied to fourth wires (not 4-i) other than the fourth wire (4-i). The seventh potential, e.g., 10 V, is applied to third wires (3-j-1 to 3-j-(h−1) (h is a positive integer, 1≦h≦L) other than the third wire (3-j-h). The eleventh potential, e.g., 10 V, is applied to third wires (3-j-(h+1) to 3-j-L). The ground potential which is the first potential is applied as the twelfth potential to third wires (not 3-j-1 to 3-j-L) other than mentioned above. Thereafter, the third potential, e.g., 20 V, is applied to the third electrode (3-j-h). This state is maintained for a desired period of time to write the "1." The timing of applying the potentials to the respective electrodes may be in another order or simultaneous provided that, while the third potential, e.g., 20 V, is applied to the third electrode (3-j-h), at least the eighth potential, e.g., 3 V, is applied to the fourth wires (not 4-i) or the fifth wires (not 5-j) are grounded.

The third wire (3-j-h) is returned to the ground potential, i.e., the first potential. The third wires (not 3-j-h) other than the third wire (3-j-h) are returned to the ground potential, i.e., the first potential. The fourth wires (not 4-i) are returned to the ground potential, i.e., the first potential. The second wire (2-j) and the fifth wire (5-j) are returned to the ground potential, i.e., the first potential. The second wires (not 2-j) and the fifth wires (not 5-j) are returned to the ground potential, i.e., the first potential. The first wires (1-1 to 1-N) are returned to the ground potential, i.e., the first potential. At this time, the timing of returning the respective electrodes to the ground potential may be in another order or simultaneous provided that, while the third potential, e.g., 20 V, is applied to the third electrode (3-j-h), at least the eighth potential, e.g., 3 V, is applied to the fourth wires (not 4-i) or the fifth wires (not 5-j) are grounded, i.e., the first potential. The potentials applied may be any combination of potentials so long as they satisfy conditions for writing the "1" in a desired cell.

Here, the same potential is preferably applied initially as the first potential to the first wires (1-1 to 1-N), the second wires (2-1 to 2-N), the third wires (3-1-1 to 3-N-L), the fourth wires (4-1 to 4-M) and the fifth wires (5-1 to 5-N), but different potentials may be applied. In the above example, the writing process has been described with the case where the selected cell is a memory cell having the third wire (3-j-h) as the gate electrode. However, the writing process is the same with the case where the selected cell is a memory cell having a third wire other than the third wire (3-j-h) as the gate electrode.

Figure 212:
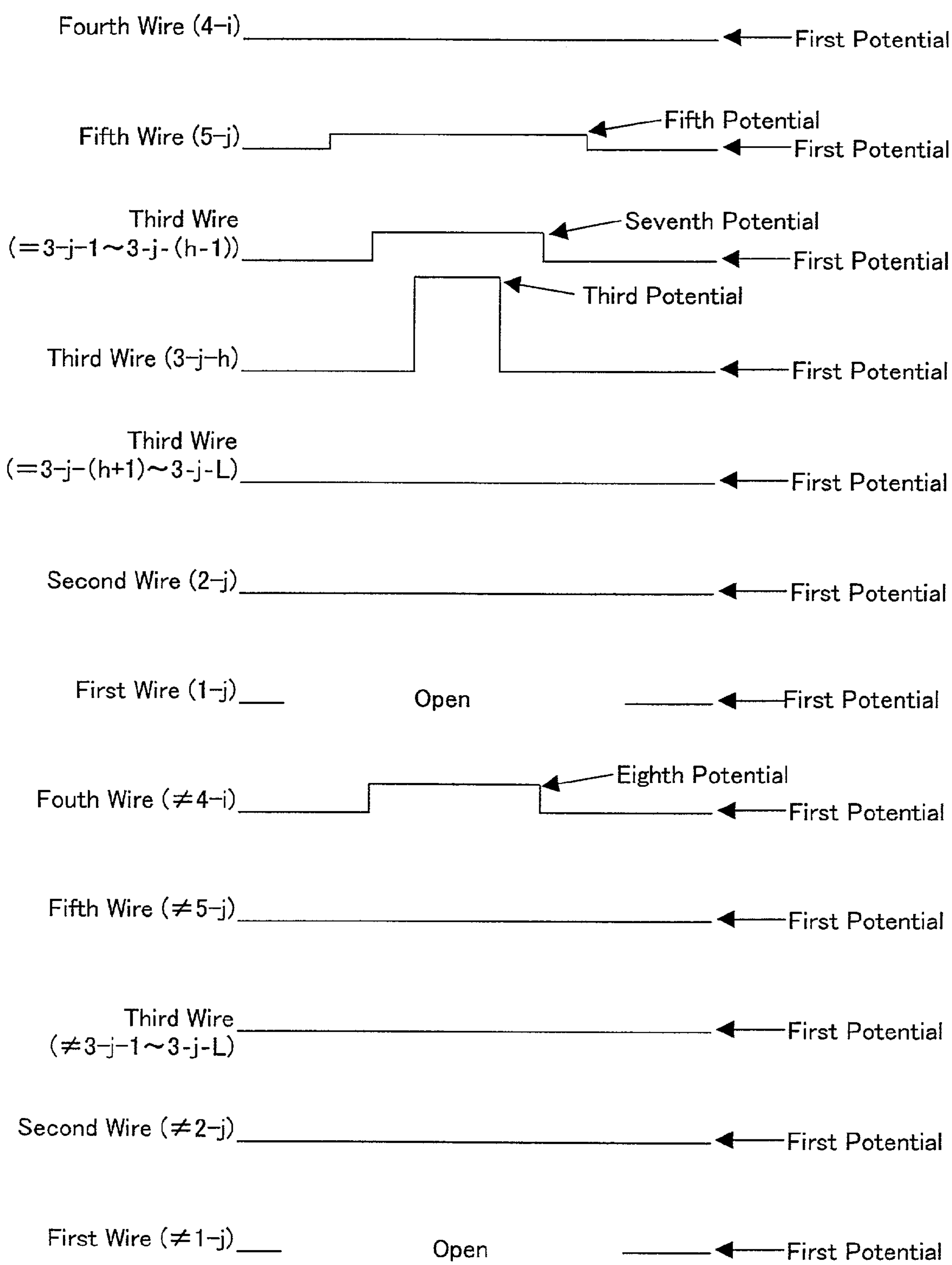

In contrast to FIG. 211, FIG. 212 shows a timing chart for writing data in the case where the eleventh potential is the ground potential. The writing of the selected cell of FIG. 212 conforms to that of FIG. 211 without being affected by application of the ground potential, which is the first potential, as the eleventh potential to the third wires (30-(h+1) to 30-L, h is a positive integer, 1≦h≦L).

Figure 213:
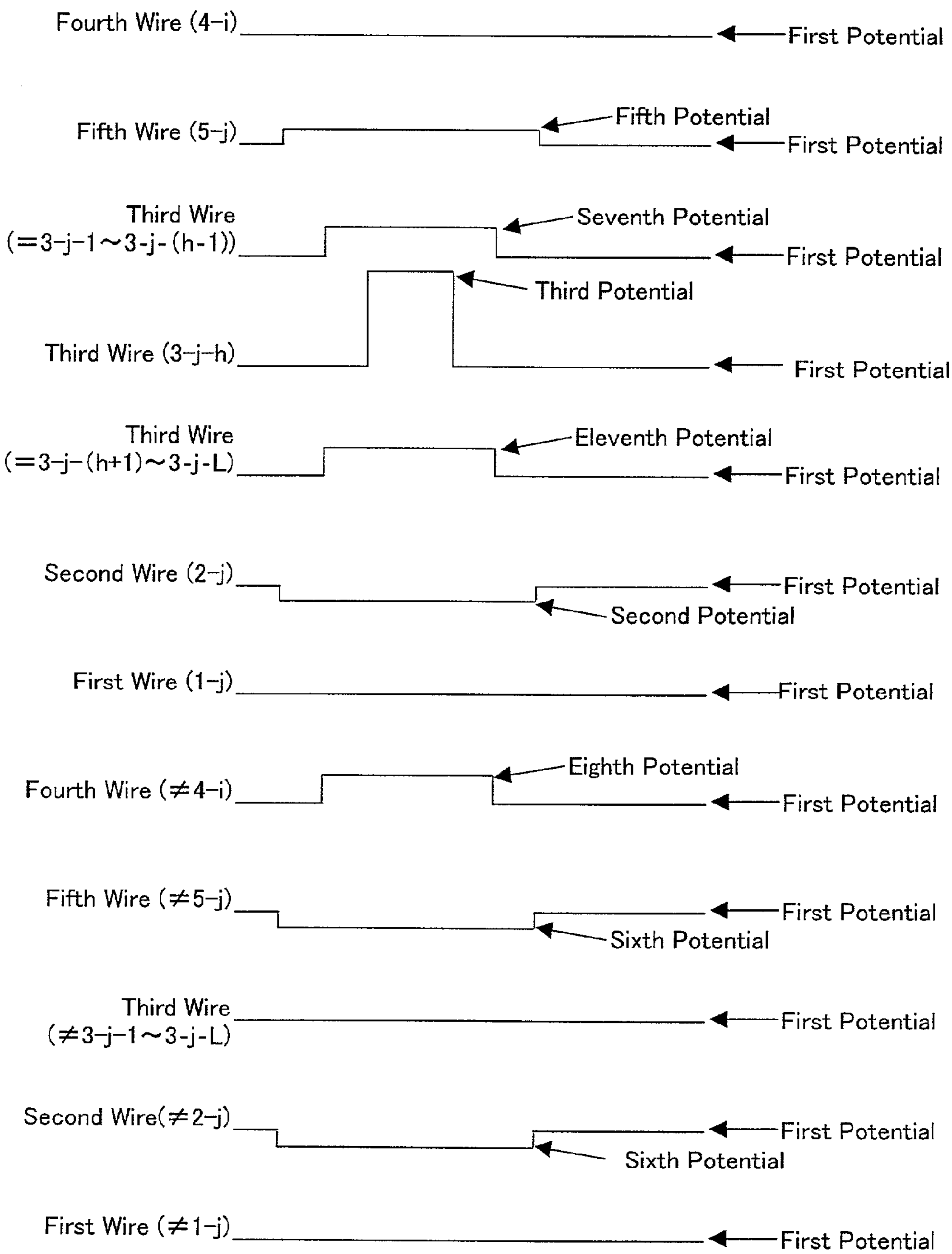

In contrast to FIG. 211, FIG. 213 shows a timing chart for writing data in the case where the first wire is grounded. The writing of the selected cell of FIG. 213 conforms to that of FIG. 211 without being affected by application of the ground potential as the first potential to the first wire (1-j) if the second potential is not higher than the threshold of the transistor having the second wire (2-j) as the gate electrode.

Figure 214:
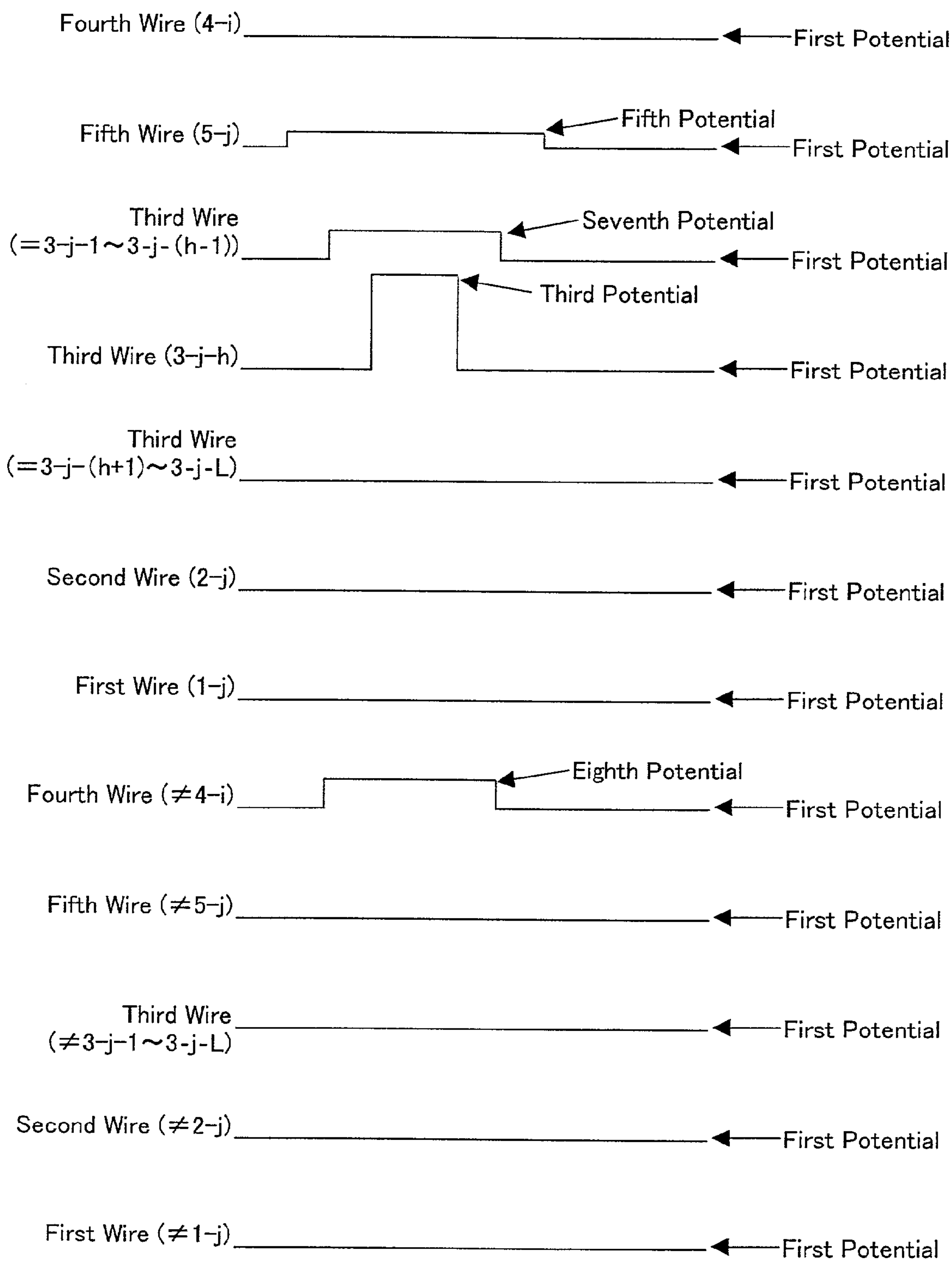
Figure 215:
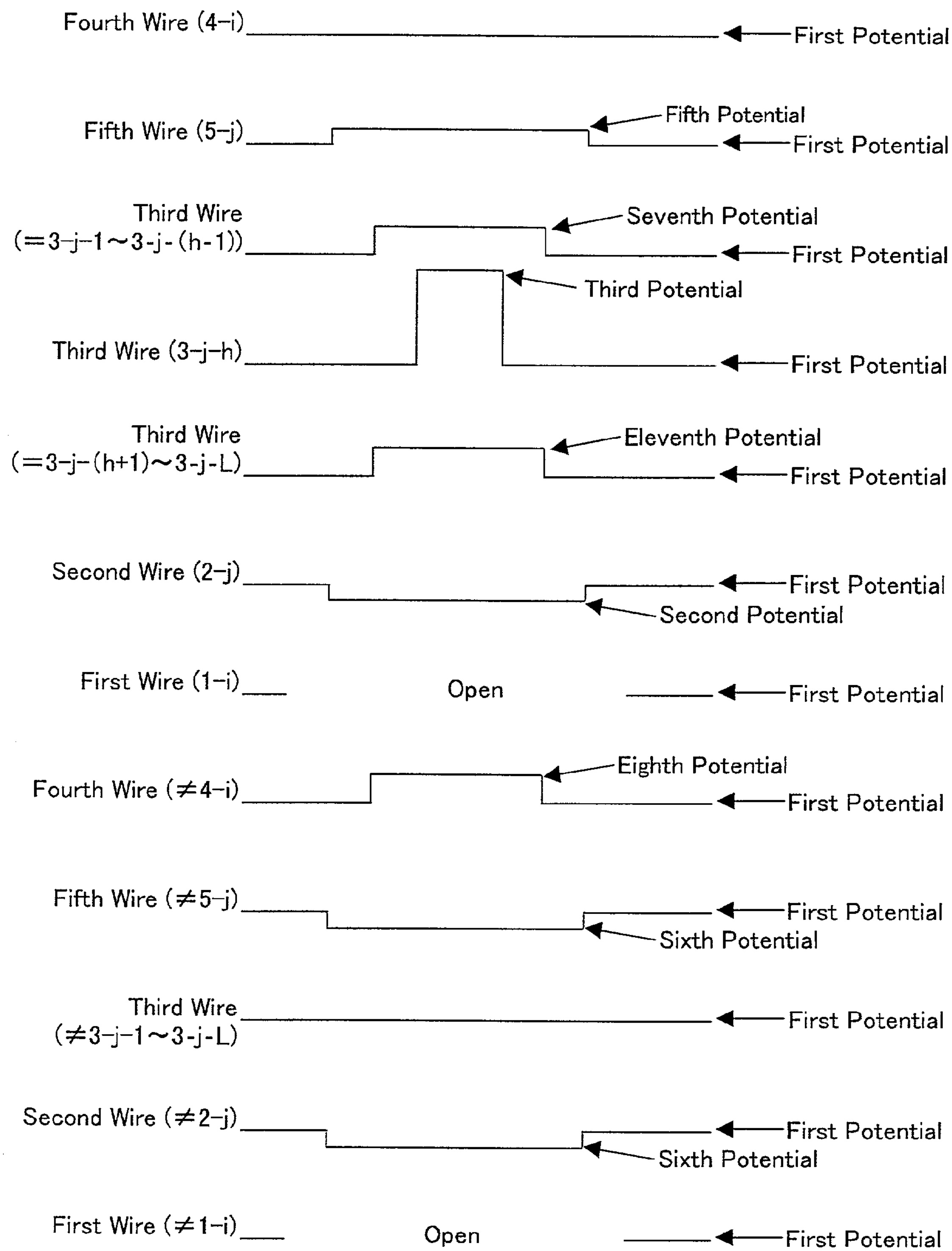
Figure 216:
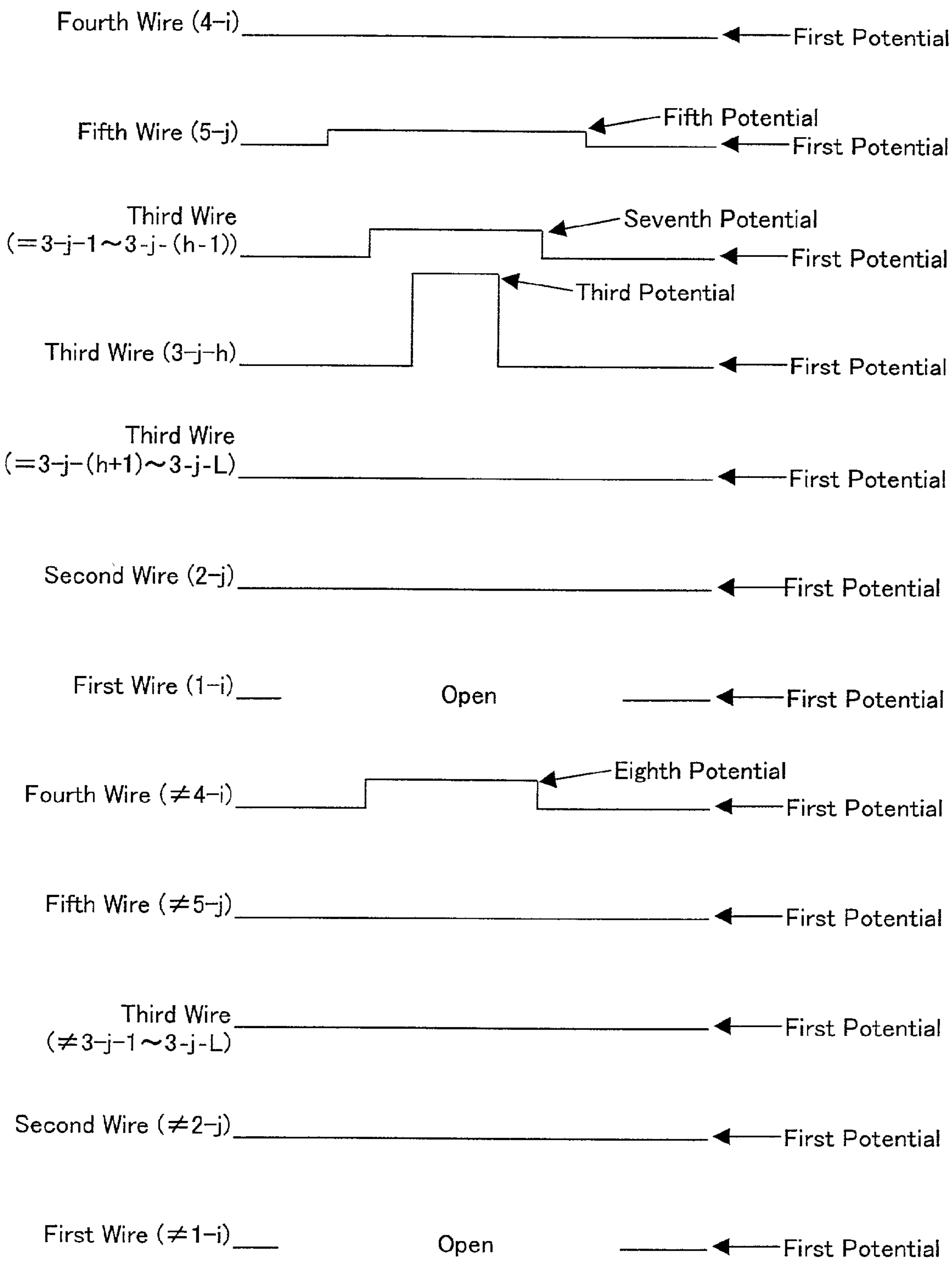
Figure 217:
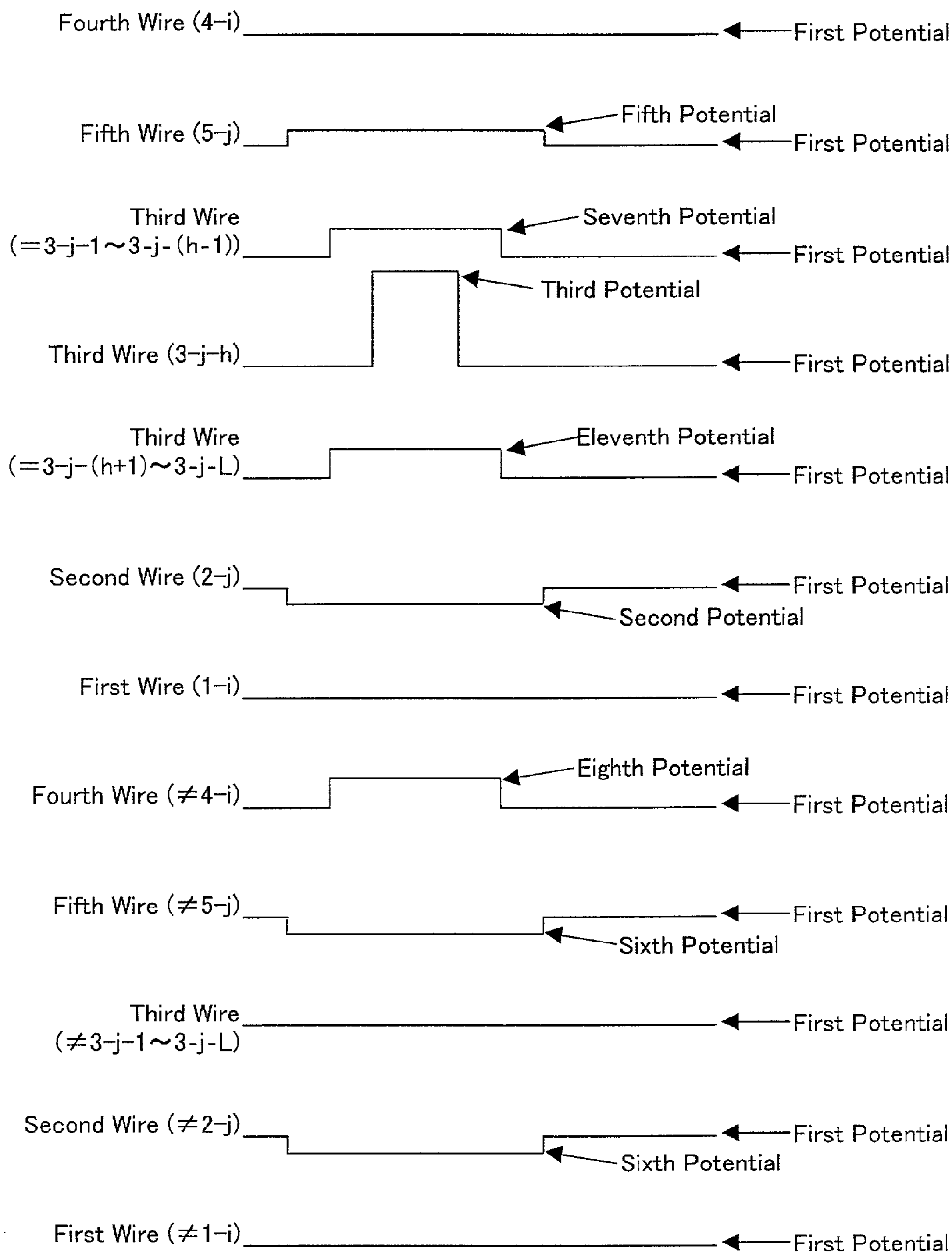
Figure 218:
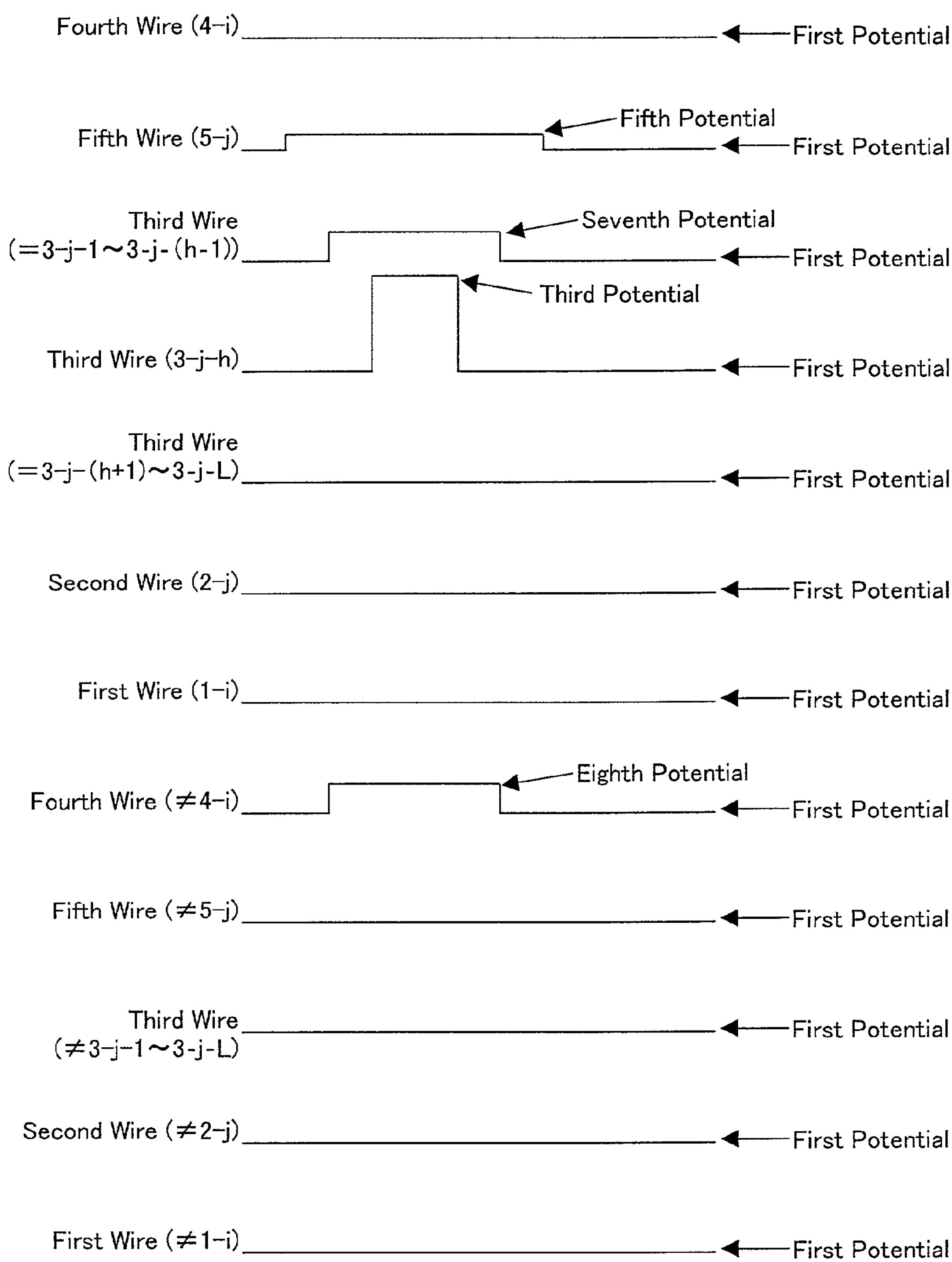
Figure 219:
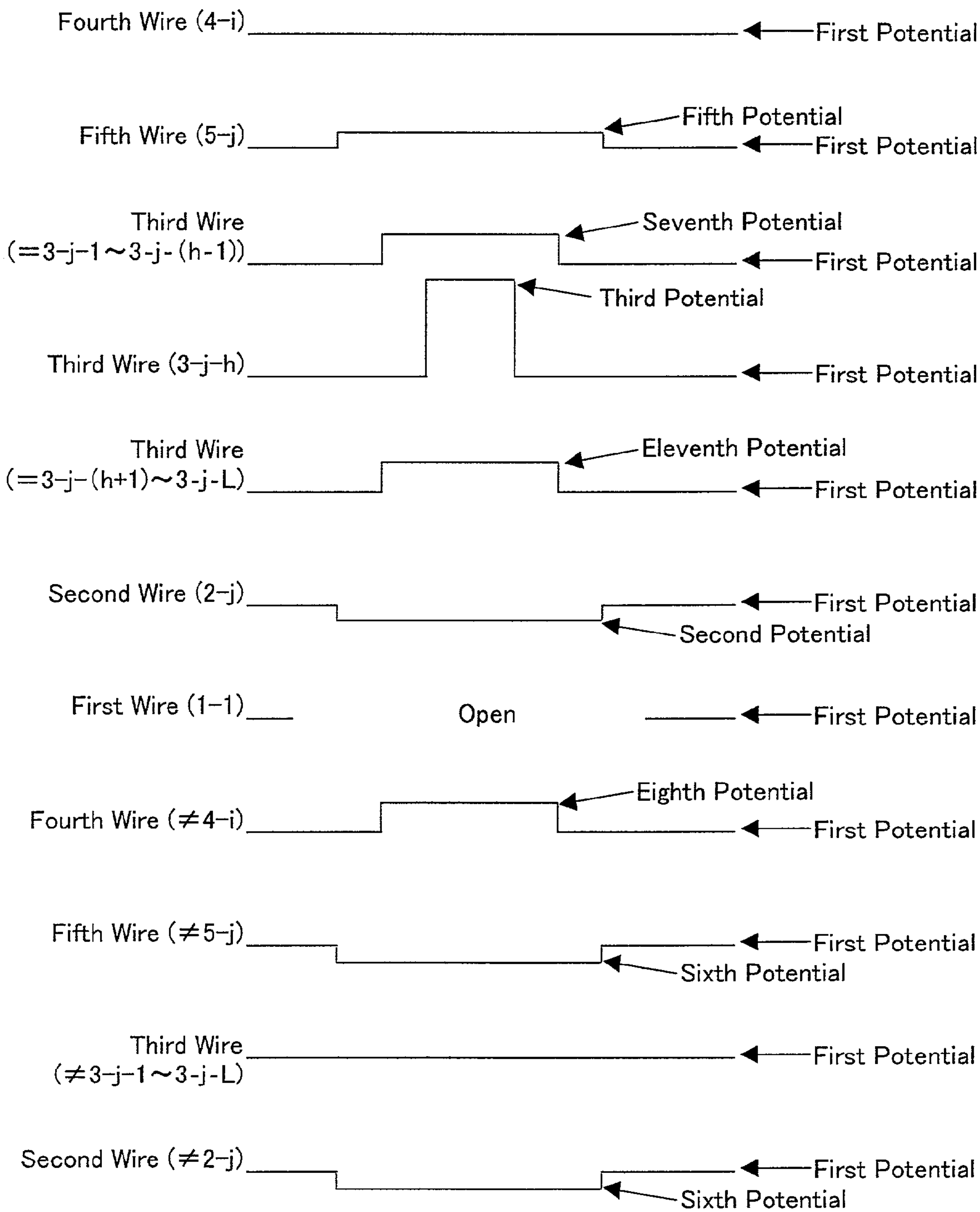
Figure 220:
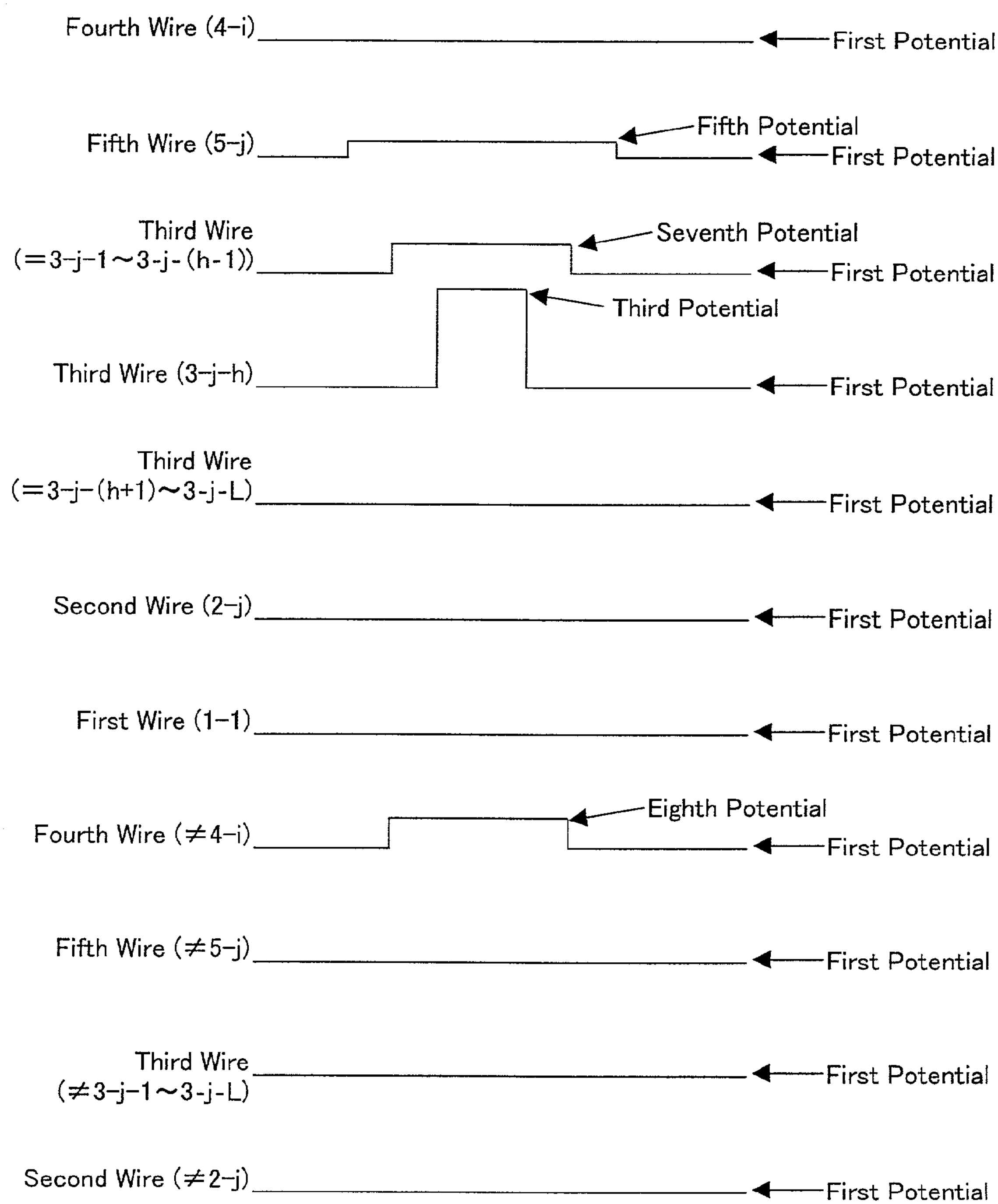
Figure 221:
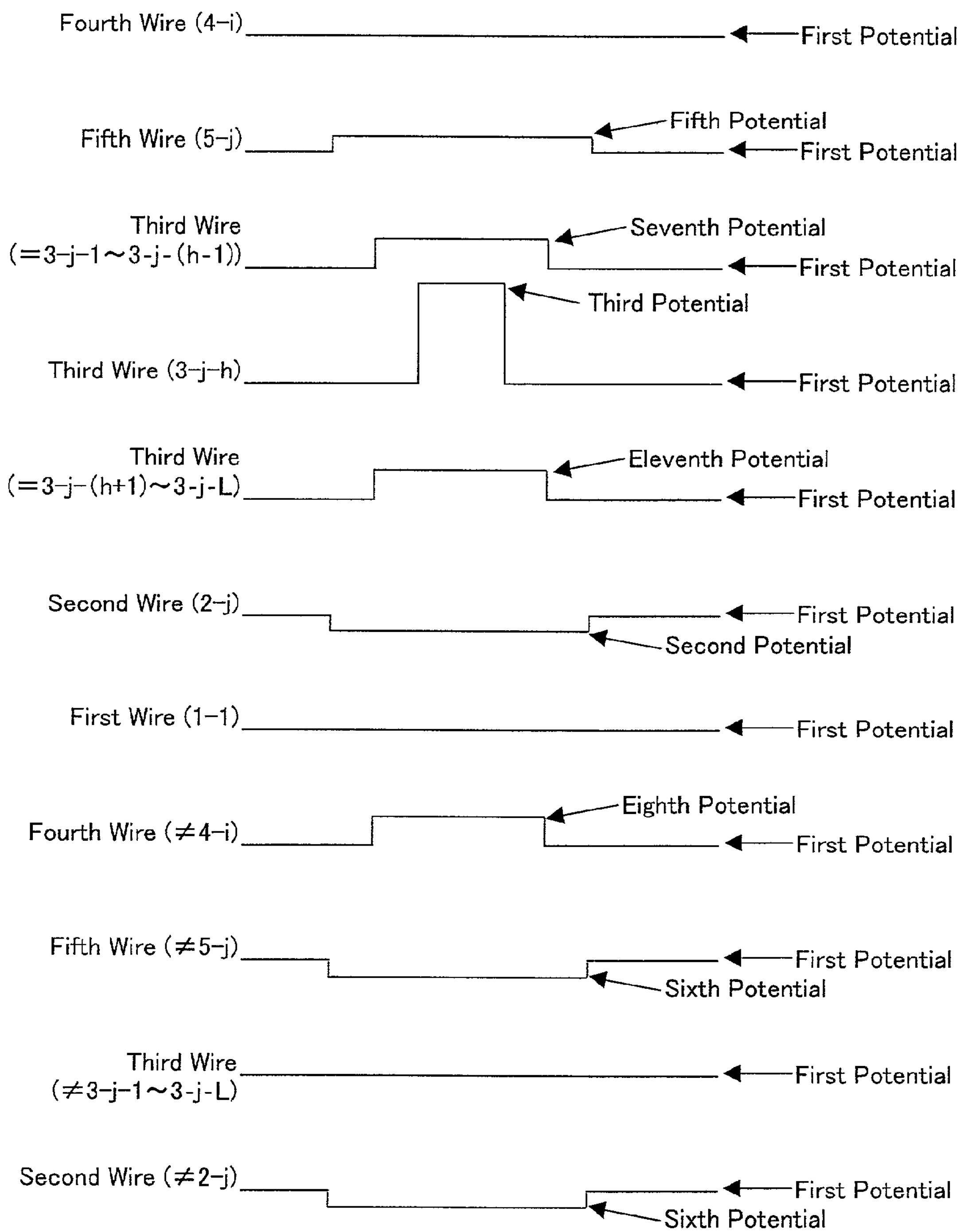
Figure 222:
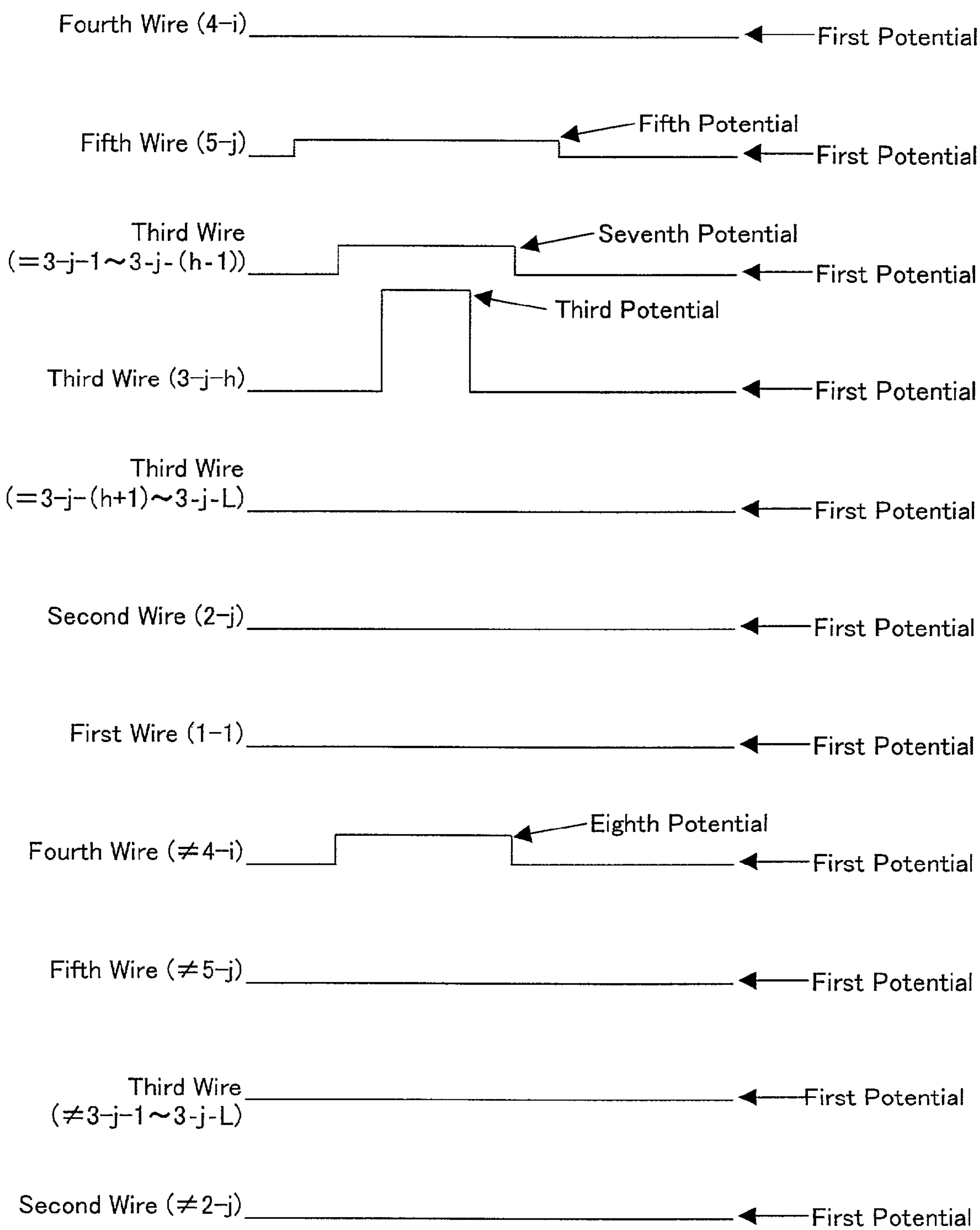

In contrast to FIG. 212, FIG. 214 shows a timing chart for writing data in the case where the first wire is grounded. The writing of the selected cell of FIG. 214 conforms to that of FIG. 212 without being affected by application of the ground potential as the first potential to the first wire (1-j) if the second potential is not higher than the threshold of the transistor having the second electrode 20 as the gate electrode.

Have been described above the examples of the principle of reading in cases where the first wires are arranged in parallel to the third wires. FIG. 215 to FIG. 218 are timing charts showing examples of timing for writing data when the first wires are arranged in parallel to the fourth wires. FIG. 215 to FIG. 218 conform to FIG. 211 to FIG. 214 except that the first wire (1-i) instead of the first wire (1-j) is connected to the end portion of the island-like semiconductor layer including the selected cell.

FIG. 219 to FIG. 222 are timing charts showing examples of timing for writing data when the first wires are connected in common to the entire array. FIG. 219 to FIG. 222 conform to FIG. 211 to FIG. 214 except that the first wire (1-1) instead of the first wire (1-j) is connected to the end of the island-like semiconductor layer including the selected cell.

Have been described above the examples of the principle of writing in cases of the M×N island-like semiconductor layers each having a plurality of (e.g., L, L is a positive integer) memory cells formed of the P-type semiconductor and arranged in series and the selection transistors formed to sandwich the memory cells. However, the polarity of all the electrodes may be reversed as in the case of island-like semiconductor layers formed of an N-type semiconductor. At this time, the potentials have a relationship in magnitude reverse to that mentioned above.

A writing process is now explained with a semiconductor memory according to the present invention which is constructed to include a plurality of (e.g., M×N, M and N are positive integers) island-like semiconductor layers each having two memory cells provided with the charge storage layer between the selection gate transistors and the third electrode as the control gate electrode and connected in series. In this memory cell array, a plurality of (e.g., M) fourth wires arranged in parallel with the semiconductor substrate are connected to ends of the island-like semiconductor layers, and first wires are connected to opposite ends of the island-like semiconductor layers. A plurality of (e.g., N×2) third wires in parallel with the semiconductor substrate are arranged in a direction crossing the fourth wires and connected to the third electrodes of the memory cells. The writing process utilizes the F-N current.

FIG. 138 shows an equivalent circuit diagram of the above-described memory cell array in which the first wires are arranged in parallel to the third wires. For example, in the case where the island-like semiconductor layers are formed of a P-type semiconductor, a selected cell shown in FIG. 138 is written by applying a first potential to a first wire (1-j, j is a positive integer, 1≦j≦N) connected to an island-like semiconductor layer including the selected cell, a ninth potential to first wires (not 1-j) other than the first wire (1-j), a third potential to a third wire (3-j-1) connected to the selected cell, an eleventh potential to a third wire (3-j-2) connected to a non-selected cell arranged in series with the selected cell, a twelfth potential to third wires (not 3-j-1 to 3-j-2) other than mentioned above, a fourth potential to a fourth wire (4-i, i is a positive integer, 1≦i≦M) connected to the fourth electrode of the island-like semiconductor layer including the selected cell, and an eighth potential to fourth wires (not 4-i) other than the fourth wire (4-i). The application of these potentials generates the F-N current only in the channel region of the selected cell and changes the state of the charge in the charge storage layer. For example, if the "1" is written by storing a negative charge in the charge storage layer, the third potential is larger than the fourth potential. If the "1" is written by drawing a negative charge from the charge storage layer, i.e., by storing a positive charge, the third potential is smaller than the fourth potential. Thus, the "0" or "1" can be set by utilizing a change in the state of the charge in the charge storage layer. At this time, the third potential is a potential such that the "1" can be written by a difference between the third and fourth potentials. For example, the third potential is a potential allowing the generation of a sufficient F-N current flow by a difference between the third and fourth potentials. The F-N current flows in the tunnel oxide film of the memory transistor having, as the gate electrode, the third electrode to which the third potential is applied and thereby changes the state of the charge in the charge storage layer. The eleventh potential may be a potential sufficiently reduces the F-N current flowing the tunnel oxide film of the memory transistors having as gate electrodes the third electrodes to which the eleventh potential is applied. The first wires (1-1 to 1-N) may be opened. The eighth potential is a potential such that the "1" is not written by a potential difference between the third and eight potentials, for example, such that small enough is the F-N current caused by the potential difference to flow in the tunnel oxide film of the memory transistor having, as the gate electrode, the third electrode to which the third potential is applied.

In the case where the channel region of a selected memory cell is electrically connected to the semiconductor substrate, for example, in the case where the island-like semiconductor layer is not floated from the semiconductor substrate by an impurity diffusion layer, all memory cells having the third electrodes to which the third potential is applied can also be written at the same time if the tenth potential applied to the semiconductor substrate is a potential such that the "1" is written by a difference between the third potential and the tenth potential, for example, a potential such that a sufficiently large F-N current flows in the tunnel oxide film of the memory transistor. At this time, in the case where the first wires (1-1 to 1-N) are formed as impurity diffusion layers in the semiconductor substrate, the ninth potential applied to the first wires (not 1-j) connected to the island-like semiconductor layers not including the selected cell is preferably a potential such that the island-like semiconductor layers are electrically floated from the semiconductor substrate by depletion layers extended by the application of the ninth potential. Thereby, the potential of the island-like semiconductor layers becomes equal to the ninth potential, and memory cells on the island-like semiconductor layers not including the selected cell are not written if the ninth potential is a potential such that the F-N current flowing in the tunnel oxide film of the memory transistors is sufficiently small. That is, the potential differences between the ninth and third potentials, between the ninth and seventh potentials and between the ninth and eleventh potentials are such that the F-N current flowing in the tunnel oxide films of the memory transistors is sufficiently small. If the channel regions of the memory cells are not connected electrically to the semiconductor substrate, the depletion layers owing to the ninth potential may be expended in any way.

In the case where the first wires (1-1 to 1-N) are formed as impurity diffusion layers in the semiconductor substrate and the tenth potential applied to the semiconductor substrate is the ground potential, the first potential is generally the ground potential. In the case where the first wires (1-1 to 1-N) are electrically insulated from the semiconductor substrate, for example, where the first electrodes (1-1 to 1-N) are formed of impurity diffusion layers on an SOI substrate and are insulated from the semiconductor substrate by an insulating film, the first potential is not necessarily the same as the tenth potential. Memory cells may be sequentially written from a memory cell connected to a third electrode (3-j-2) to a memory cell connected to a third electrode (3-j-1), or may be written in reverse order or at random. Further, some or all memory cells connected to the third wire (3-j-1) may be written at the same time, some or all memory cells connected to the third wires (3-j-1 to 3-j-2) may be written at the same time, and some or all memory cells connected to the third wires (3-1-1 to 3-N-2) may be written at the same time. Also, some or all memory cells connected to third wires selected regularly, e.g., a third wire (3-(j−8)-h), a third wire (3-j-h), a third wire (3-(j+8)-h), a third wire (3-(j+16)-h), . . . , (h=1 or 2) may be written at the same time. Further some or all memory cells of one island-like semiconductor layer connected to the fourth wire (4-i) may be written at the same time, or some or all memory cells of some or all island-like semiconductor layers connected to the fourth wire (4-i) may be written at the same time. One, some or all memory cells of one island-like semiconductor layer connected to each of a plurality of fourth wires may be written at the same time, or some or all memory cells of some or all island-like semiconductor layers connected to each of a plurality of fourth wires may be written at the same time. The memory cells connected to the third wire (3-j-h)

may be written at the same time at given intervals, for example, every eight fourth wires (e.g., a fourth wire (4-(i−16)), a fourth wire (4-(i−8)), a fourth wire (4-i), a fourth wire (4-(i+8)), a fourth wire (4-(i+16)), . . . ). All the memory cells having, as gate electrodes, the third electrodes connected to the third wire (3-j-h) can be written at the same time by applying the first potential to all the fourth wires, applying the fourth potential to the first wire (1-j) and the eighth potential to the first wires (not 1-j), exchanging the potentials of the second and fifth wires and applying the third potential to the third wire (3-j-h). Further, by applying the fourth potential to a plurality of first wires and applying the third potential to the third wires connected to the third electrodes of the memory cells included in the island-like semiconductor layers having the first electrodes connected to said plurality of first wires, all the memory cells having, as gate electrodes, the third electrodes connected to the third wires to which the third potential is applied can be written at the same time.

The above-described writing processes may be combined.

The writing of "1" in the selected cell has been so far described by taking for example the case where the memory cells having floating gates as the charge storage layers are written with the "1" by changing the state of the charge in the charge storage layers and with the "0" by not changing the state of the charge and the F-N current is used as means for changing the state of the charge. However, the charge storage layer may be, for example, a dielectric or a laminated insulating film as well as the floating gate. Also, it is needless to say that the "0" may be written by changing the state of the charge in the charge storage layer and the "1" may be written by not changing the state of the charge. Further, the "0" may be written by slightly changing the state of the charge in the charge storage layer and the "1" may be written by greatly changing the state of the charge, and vice versa. Furthermore, the "0" is written by changing the state of the charge in the charge storage layer to negative and the "1" is written by changing the state of the charge to positive, and vice versa. The above-mentioned definitions of "0" and "1" may be combined. The F-N current is not the only means for changing the state of the charge in the charge storage layer.

FIG. 142 shows an equivalent circuit diagram of a memory cell array in which the first wires are arranged in parallel to the fourth wires. The application of the potentials for writing data of FIG. 142 is the same as that of FIG. 138 except that the first potential is applied to the first wire (1-i) and the ninth potential is applied to the first wires (not 1-i).

FIG. 146 shows an equivalent circuit diagram of a memory cell array in which a plurality of first wires are electrically connected in common. The application of the potentials for writing data of FIG. 146 is the same as that of FIG. 138 except that the first potential is applied to the first wire (1-1).

Have been described above the examples of application of potentials for writing data. Now, timing charts for the above-described examples of application of potentials for writing data are explained with the case where a plurality of (e.g., M×N, wherein M and N are positive integers) island-like semiconductor layers are arranged, each island-like semiconductor layer having two memory cells connected in series and formed of a P-type semiconductor, and the first wires are arranged in parallel with the third wires.

Figure 223:
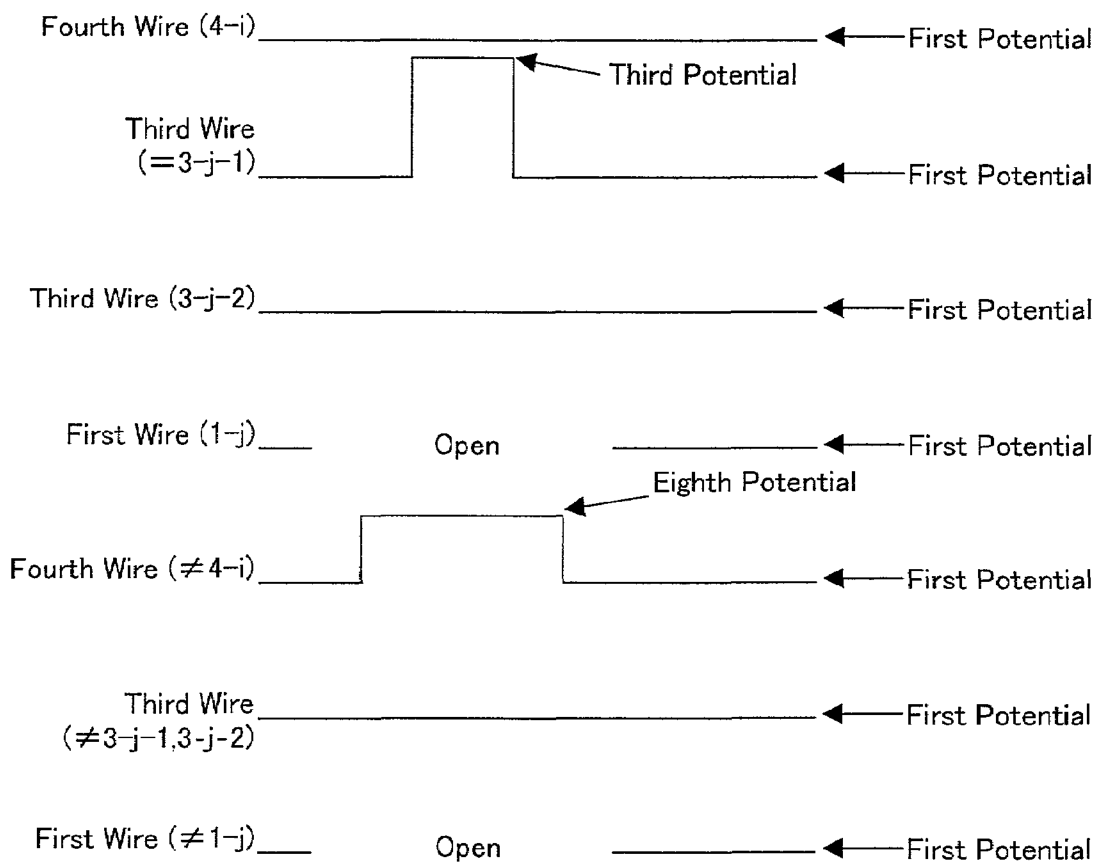

FIG. 223 is a timing chart showing an example of timing of applying each potential for writing data. In FIG. 223, the first wire is open, and the memory cell has a threshold of 1.0 V to 3.5 V when it is in the written state and has a threshold of −1.0 V or lower when it is in the erased state. For example, if the "1" is written by storing a negative charge in the charge storage layer, the ground potential as the first potential is first applied to the first wires (1-1 to 1-N), the third wires (3-1-1 to 3-N-L) and the fourth wires (4-1 to 4-M). In this state, the first wires (1-1 to 1-N) are opened. Thereafter, the ground potential which is the first potential is kept applied as the fourth potential to the fourth wire (4-i). The eighth potential, e.g., 10 V, is applied to fourth wires (not 4-i) other than the fourth wire (4-i). The eleventh potential, e.g., the ground potential which is the first potential, is applied to the third wire (3-j-1). The ground potential which is the first potential is applied as the twelfth potential to third wires (not 3-j-1 to 3-j-2) other than mentioned above. The third potential, e.g., 20 V, is applied to the third wire (3-j-1). This state is maintained for a desired period of time to write the "1." At this time, the timing of applying the potentials to the respective wires may be in another order or simultaneous provided that, while the third potential, e.g., 20 V, is applied to the third wire (3-j-1), at least the eighth potential, e.g., 10 V, is applied to the fourth wires (not 4-i). The third wire (3-j-1) is returned to the ground potential, i.e., the first potential. The third wires (not 3-j-1) other than the third wire (3-j-1) are returned to the ground potential, i.e., the first potential. The fourth wires (not 4-i) are returned to the ground potential, i.e., the first potential. At this time, the timing of returning the respective wires to the ground potential may be in another order or simultaneous provided that, while the third potential, e.g., 20 V, is applied to the third wire (3-j-1), at least the eighth potential, e.g., 10 V, is applied to the fourth wires (not 4-i). The potentials applied may be any combination of potentials so long as they satisfy conditions for writing the "1" in a desired cell.

Here, the same potential is preferably applied initially as the first potential to the first wires (1-1 to 1-N), the third wires (3-1-1 to 3-N-2), and the fourth wires (4-1 to 4-M), but different potentials may be applied. In the above example, the writing process has been described with the case where the selected cell is a memory cell having the third wire (3-j-1) as the gate electrode. However, the writing process is the same with the case where the selected cell is a memory cell having a third wire (3-j-2) as the gate electrode.

Figure 139:
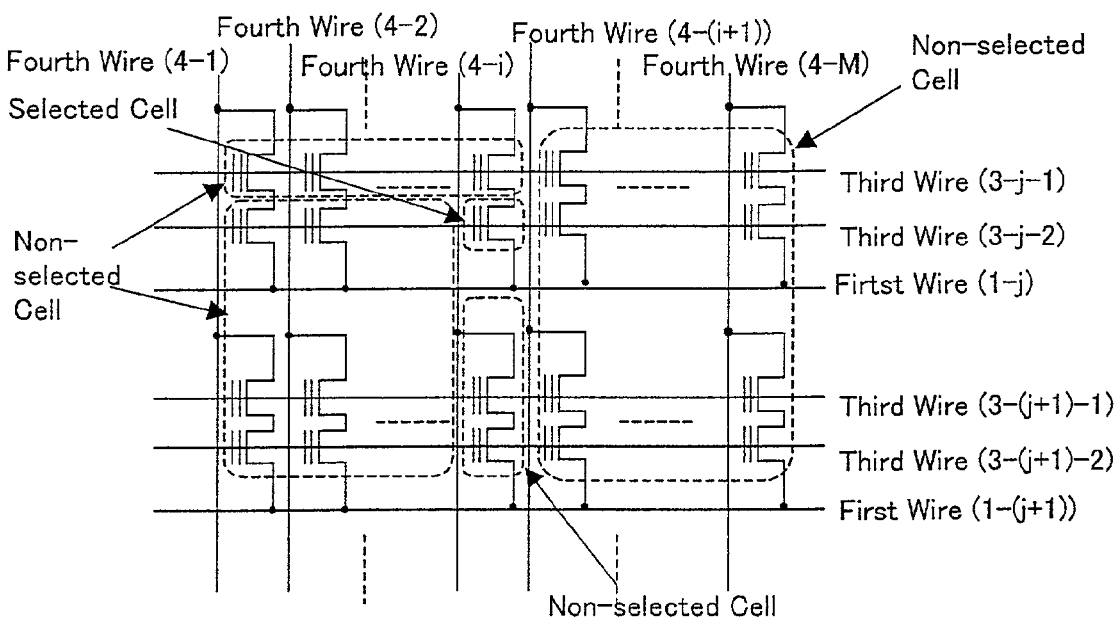
Figure 224:
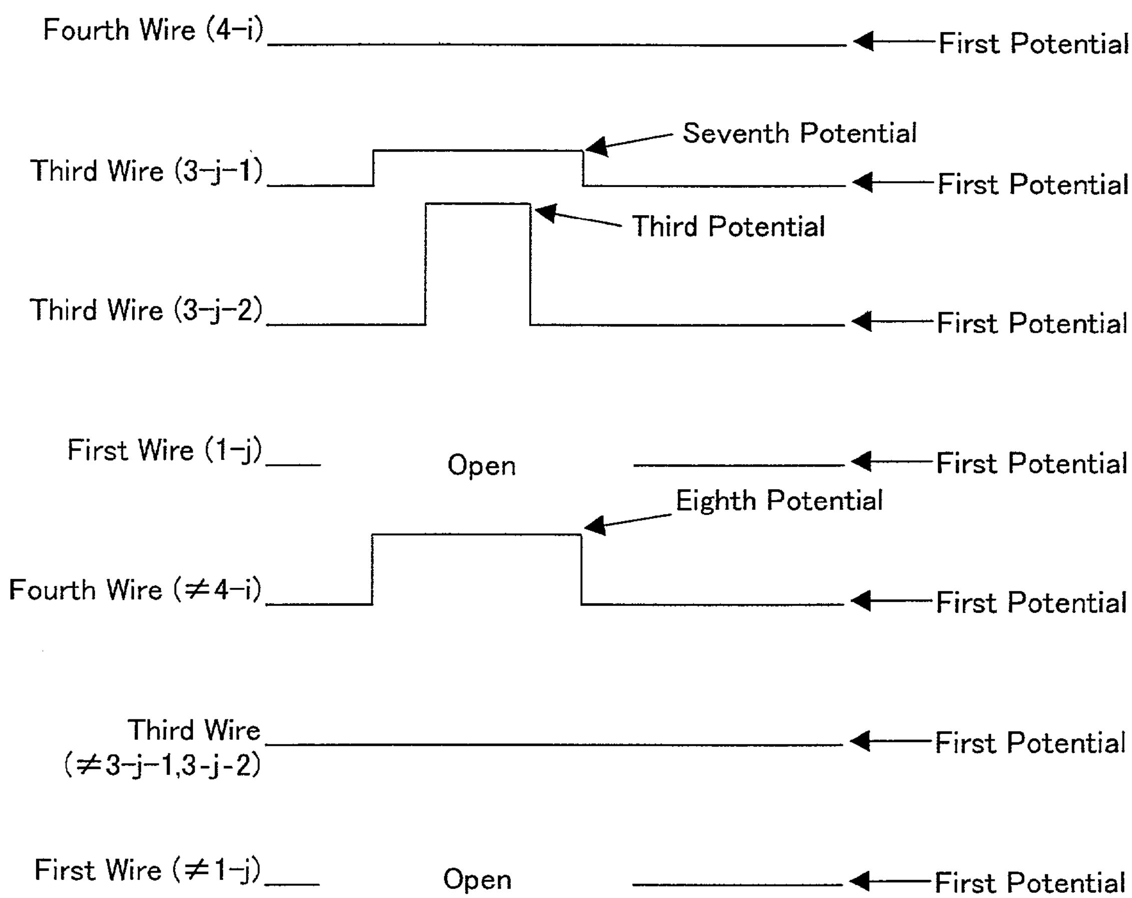

In contrast to FIG. 223, FIG. 224 is a timing chart showing an example of applying each potential for writing data in the case where the selected cell is a memory cell connected to the third electrode (3-j-2). FIG. 139 is an equivalent circuit diagram in the case where the selected cell is the memory cell connected to the third electrode (3-j-2). FIG. 224 conforms to FIG. 123 except that the seventh potential instead of the eleventh potential is applied to the third electrode connected to a non-selected cell arranged in series with the selected cell. At this time, the seventh potential is a potential always allowing a cell current to flow through the memory cell regardless of the state of the charge stored in the charge storage layer, i.e., a potential allowing the formation of a reverse layer in the channel region of the memory cell, and not generating a change in the charge by the F-N current flowing the tunnel oxide film. For example, if the "1" is written by storing a negative charge in the charge storage layer, the seventh potential is a potential which is not less than the threshold that memory transistors having as gate electrodes the third electrodes connected to the third electrodes (3-j-1 to 3-j-(h−1)) can take and sufficiently reduces the F-N current flowing the tunnel oxide film of the memory transistors having as gate electrodes the third electrodes to which the seventh potential is applied.

Figure 143:
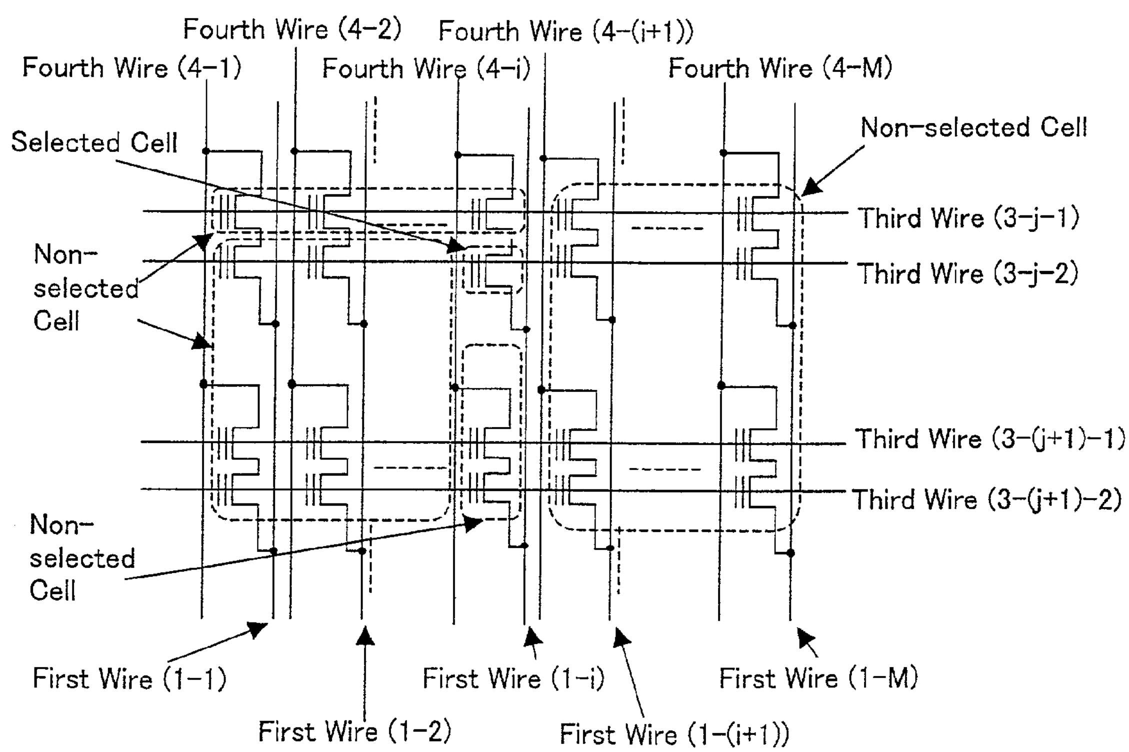
Figure 225:
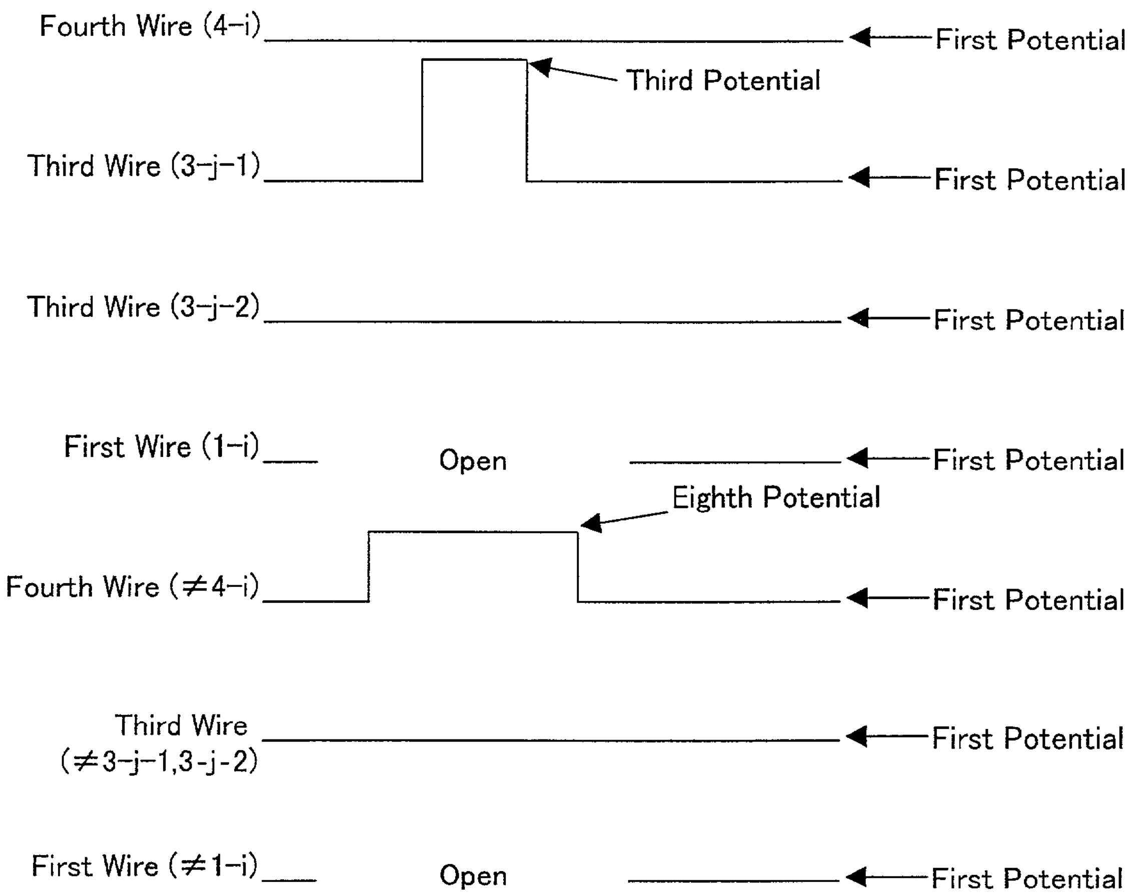
Figure 226:
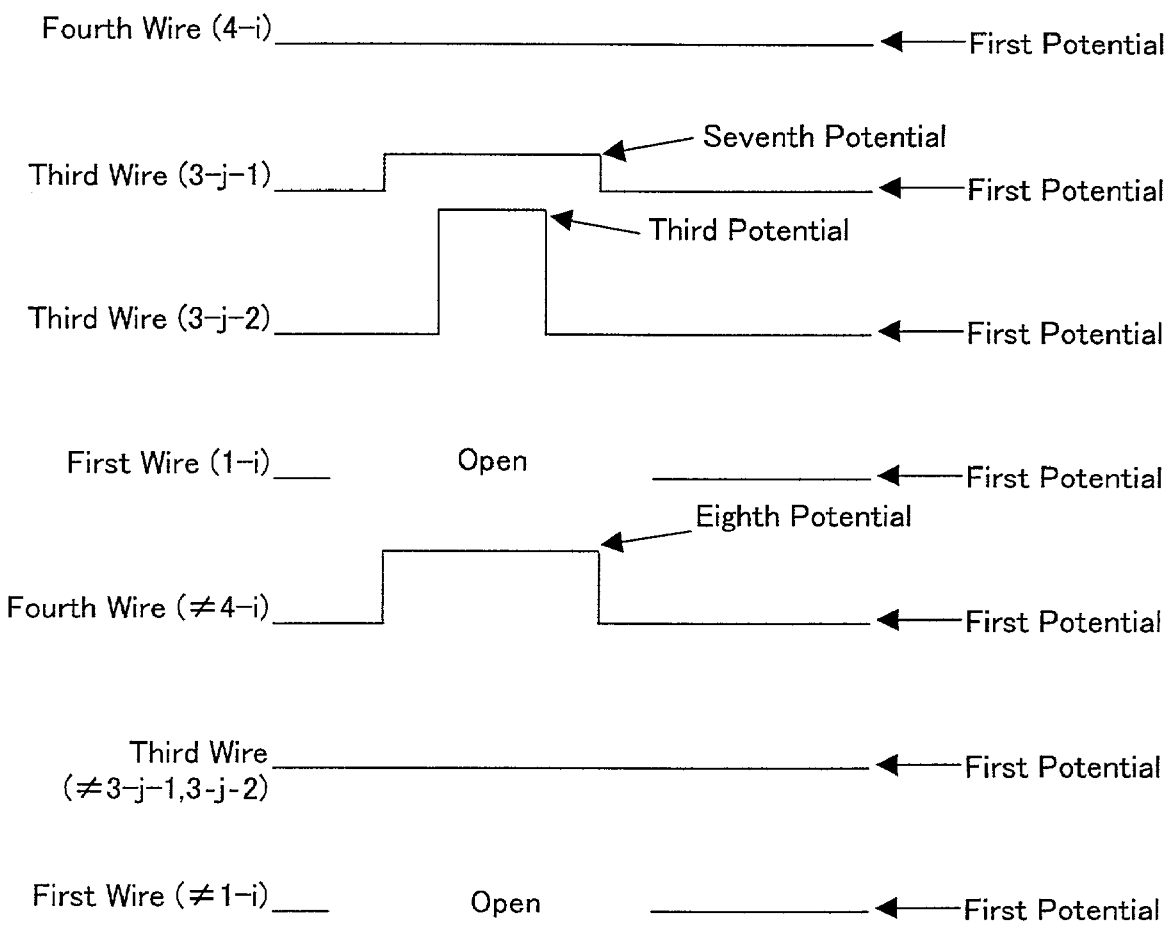
Figure 227:
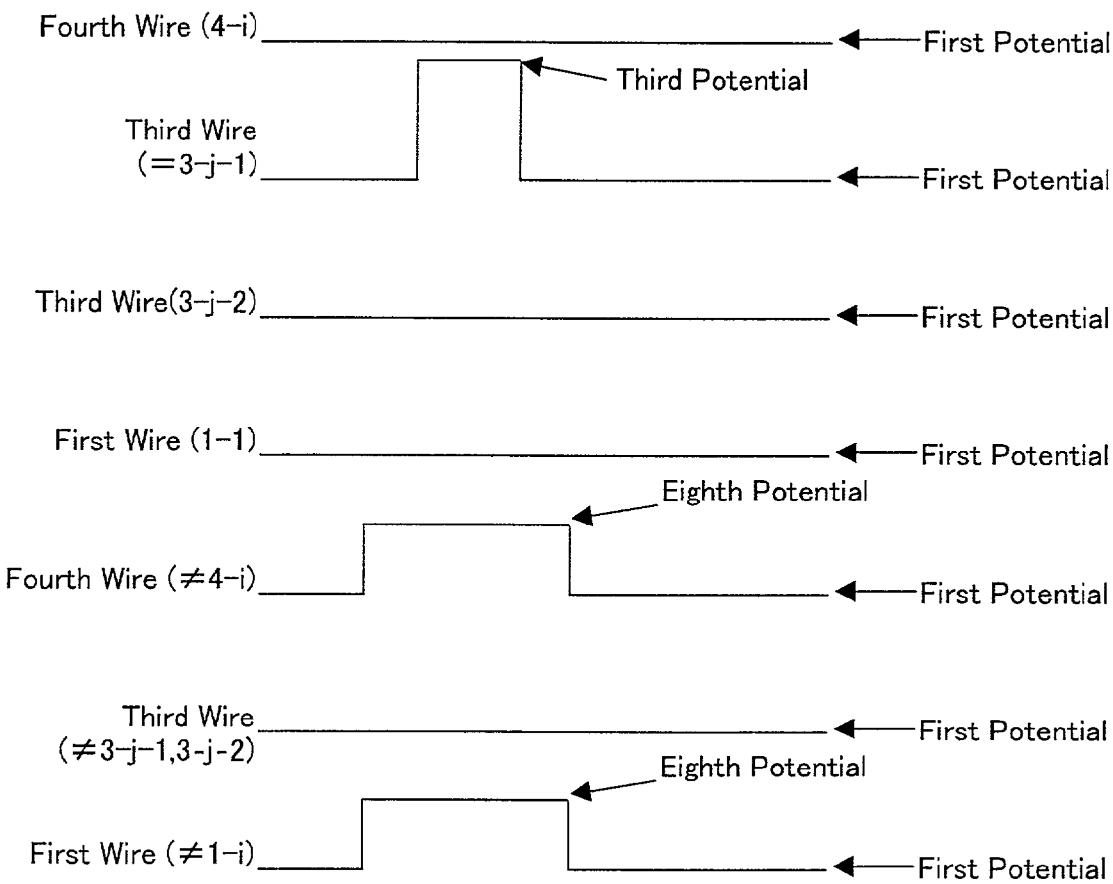
Figure 228:
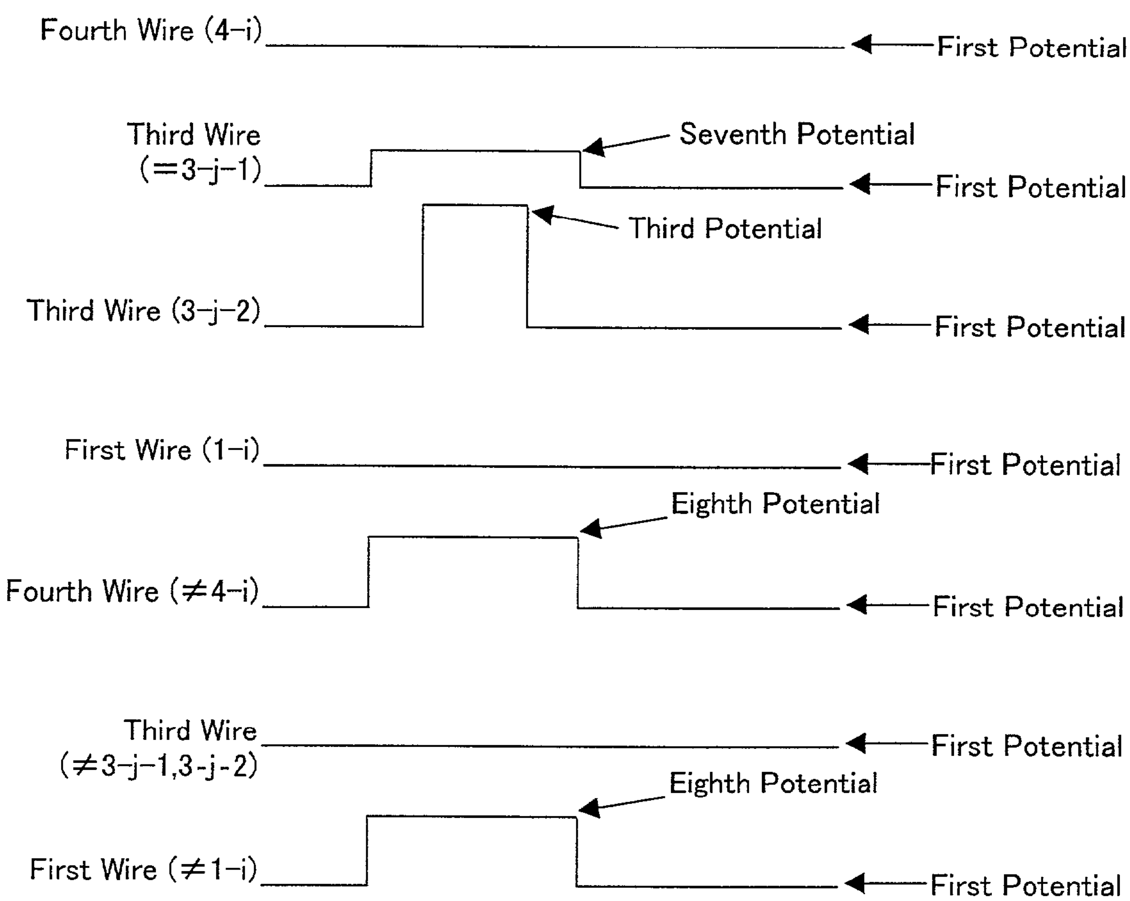

FIG. 225 to FIG. 228 are timing charts showing examples of applying each potential for writing data in the case where the first wires are arranged in parallel to the fourth wires. FIG. 225 and FIG. 226 conform to FIG. 223 and FIG. 224, respectively, except that the first wire (1-i) instead of the first wire (1-j) is connected to the end of the island-like semiconductor layer including the selected cell. In the FIG. 227 and FIG. 228, even if a ground potential, i.e., the first potential, is kept applied to the first wire (1-i) connected to the end of the island-like semiconductor layer including the selected cell, the writing of the selected cell is not affected, and the writing operation of FIG. 227 and 228 conform to that of FIG. 223 and FIG. 224. FIG. 143 shows an equivalent circuit in the case where the selected cell is a memory cell connected to the third electrode (3-j-2). In this case, the eighth potential is preferably applied to the non-selected first wires (not 1-i).

Figure 147:
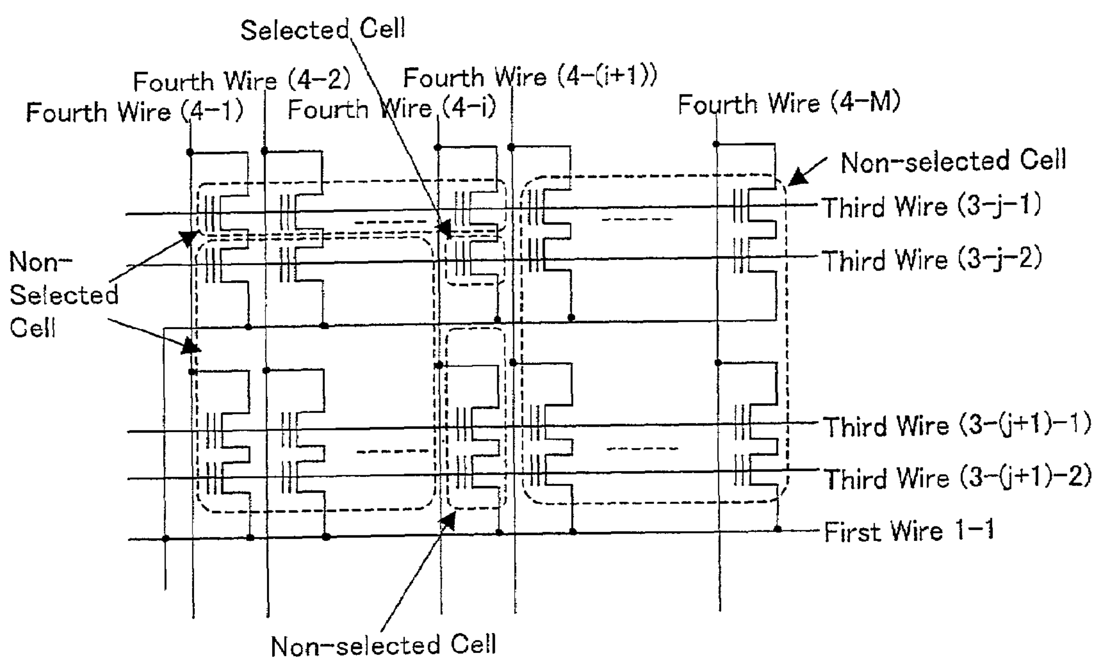
Figure 229:
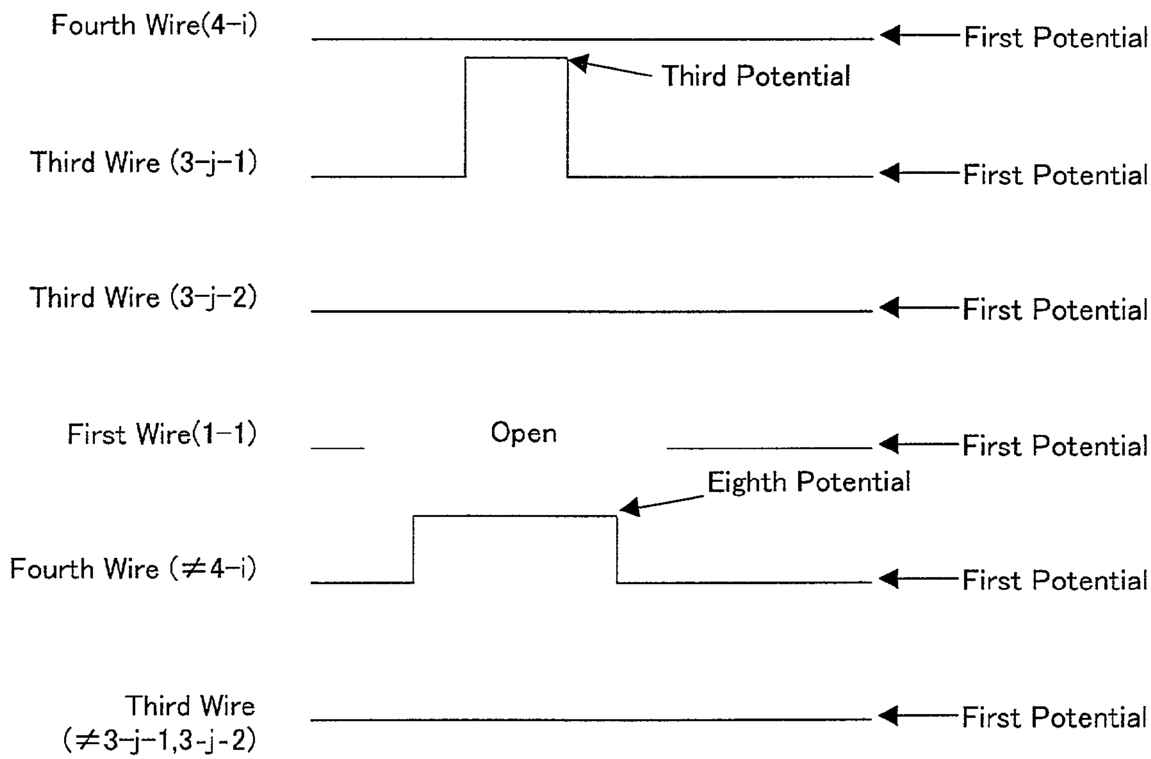
Figure 230:
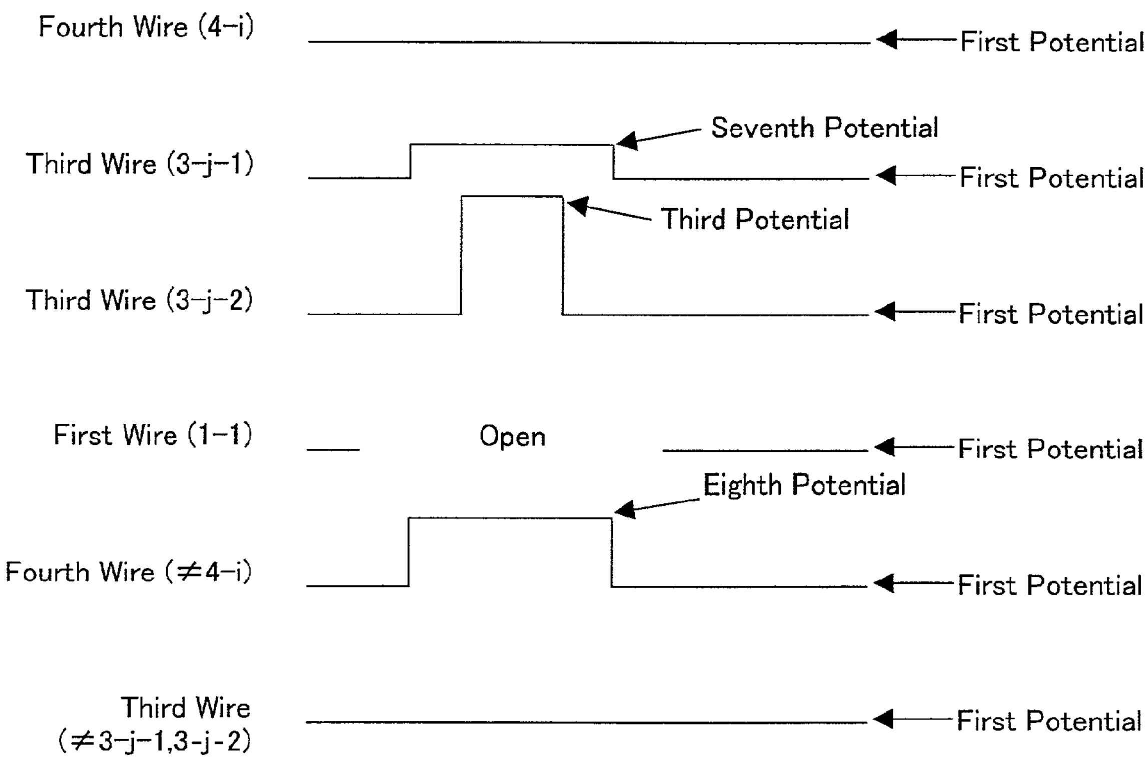

FIG. 229 and FIG. 230 are timing charts showing examples of applying each potential for writing data in the case where the first wires are connected in common to the entire array. FIG. 229 and FIG. 230 conform to FIG. 223 and FIG. 224, respectively, except that the first wire (1-1) instead of the first wire (1-j) is connected to the end of the island-like semiconductor layer including the selected cell. FIG. 147 shows an equivalent circuit in the case where the selected cell is a memory cell connected to the third electrode (3-j-2).

Have been described above the examples of writing date in cases where there are arranged the M×N (M and N are positive integers) island-like semiconductor layers each having two memory cells formed of the P-type semiconductor and arranged in series. However, the polarity of all the electrodes may be reversed as in the case of island-like semiconductor layers formed of an N-type semiconductor. At this time, the potentials have a relationship in magnitude reverse to that mentioned above.

A writing process is now explained with a semiconductor memory according to the present invention which is constructed to include a plurality of (e.g., M×N, M and N are positive integers) island-like semiconductor layers each having two memory cells provided with the charge storage layer and the third electrode as the control gate electrode and connected in series. In this memory cell array, a plurality of (e.g., M) fourth wires arranged in parallel with the semiconductor substrate are connected to ends of the island-like semiconductor layers, and first wires are connected to opposite ends of the island-like semiconductor layers. A plurality of (e.g., N×2) third wires in parallel with the semiconductor substrate are arranged in a direction crossing the fourth wires and connected to the third electrodes of the memory cells. The writing process utilizes the CHE current.

FIG. 138 is an equivalent circuit diagram of the above-described memory cell array in which the first wires are arranged in parallel with the third wires. For example, in the case where the island-like semiconductor layers are formed of a P-type semiconductor, a selected cell shown in FIG. 138 is written by applying a first potential to a first wire (1-j, j is a positive integer, 1≦j≦N) connected to an island-like semiconductor layer including the selected cell, a ninth potential to first wires (not 1-j) other than the above-mentioned first wire (1-j), a third potential to a third wire (3-j-1) connected to the selected cell, an eleventh potential to a third wire (3-j-2) connected to a non-selected cell arranged in series with the selected cell, a twelfth potential to other third wires (not 3-j-1 to 3-j-2), a fourth potential to a fourth wire (4-i, i is an integer, 1≦i≦M) connected to the fourth electrode of the island-like semiconductor layer including the selected cell, and an eighth potential to fourth wires (not 4-i) other than the fourth wire (4-i). The application of these potentials generates the CHE current in the channel region of the selected cell and changes the state of the charge in the charge storage layer. For example, if the "1" is written by storing a negative charge in the charge storage layer, the fourth potential is larger than the first potential and the third potential is larger than the first potential. At this time, the first potential is preferably a ground potential. The third or fourth potential is a potential such that the "1" can be written by a potential difference between the third and first potentials and a potential difference between the fourth and first potential, for example, a potential such that the CHE current is sufficiently generated as means for changing the state of the charge by these potential differences. The CHE current flows in the tunnel oxide film of the memory transistor having, as the gate electrode, the third electrode to which the third potential is applied. The eleventh potential is a potential always allowing the cell current to flow in a selected memory cell regardless of the state of the charge in the charge storage layer, that is, a potential allowing a reverse layer to form in the channel region of the memory cell but not causing a change in the state of the charge in the charge storage layer. For example, if the "1" is written by storing electrons in the charge storage layer, the eleventh potential is a potential which is not smaller than the threshold that a memory transistor having, as the gate electrode, the third electrode connected to the third wire (3-j-2) can take and which can sufficiently reduce the F-N or CHE current flowing in the tunnel oxide film of the memory transistor having, as the gate electrode, the third electrode to which the eleventh potential is applied. The eighth potential is a potential such that the "1" is not written by potential differences between the eighth potential and the first potential, between the eighth potential and the third potential and between the eighth potential and the eleventh potential, for example, a potential such that owing to the potential differences, only a sufficiently small CHE and F-N currents flow in the tunnel oxide film of the memory transistor having the third electrode as the gate electrode. At this time, the eighth potential is desirably a ground potential and may be open. The ninth potential may be an optional potential such that the "1" is not written by potential differences between the ninth potential and the eighth potential, between the ninth potential and the fourth potential and between the ninth potential and the twelfth potential, but is desirably equal to the eighth potential. The ninth potential may be open. The twelfth potential is desirably a ground potential.

In the case where the first wires (1-1 to 1-N) are formed as impurity diffusion layers in the semiconductor substrate and the tenth potential applied to the semiconductor substrate is the ground potential, the first potential is generally the ground potential. In the case where the first wires (1-1 to 1-N) are electrically insulated from the semiconductor substrate, for example, in the case where the first electrodes (1-1 to 1-N) are formed of impurity diffusion layers on an SOI substrate and are insulated from the semiconductor substrate by an insulating film, the first potential is not necessarily the same as the tenth potential.

Memory cells may be sequentially written from a memory cell connected to a third electrode (3-j-2) to a memory cell connected to a third electrode (3-j-1), or may be written in reverse order. Further, some or all memory cells connected to the third wire (3-j-1) may be written at the same time, some or all memory cells connected to the third wires (3-1-1 to 3-N-2) may be written at the same time. Also, some or all memory cells connected to third wires selected regularly, e.g., a third wire (3-(j−8)-1), a third wire (3-j-1), a third wire (3-(j+8)-1), a third wire (3-(j+16)-1), . . . , may be written at the same time. Further the memory cells of some or all island-like semiconductor layers connected to the fourth wire (4-i) may be written at the same time. The memory cells of one island-like semiconductor layer connected to each of a plurality of fourth wires may be written at the same time, or the memory cells of some or all island-like semiconductor layers connected to each of a plurality of fourth wires may be written at the same time. The memory cells connected to the third wire (3-j-1) may be written at the same time at given intervals, for example, every eight fourth wires (e.g., a fourth wire (4-(i−16)), a fourth wire (4-(i−8)), a fourth wire (4-i), a fourth wire (4-(i+8)), a fourth wire (4-(i+16)), . . . ). All the memory cells having, as gate electrodes, the third electrodes connected to the third wire (3-j-1) can also be written at the same time by applying the first potential to all the fourth wires, applying the fourth potential to the first wire (1-j), the eighth potential to the first wires (not 1-j), and applying the third potential to the third wire (3-j-1). The selected cell can also be written by applying the ninth potential (the first potential<the ninth potential<the fourth potential) to fourth wires (not 4-i) not including the selected cell, applying the first potential to the fourth wire (4-i), applying the fourth potential to the first wire (1-j), applying the eighth potential to first wires (not 1-j) and applying the third potential to the third wire (3-j-1). Further, by applying the fourth potential to a plurality of first wires, applying the third potential to the third wire (3-j-1) connected to the third electrodes of the memory cells included in the island-like semiconductor layers having the first electrodes connected to said plurality of first wires, all the memory cells having, as gate electrodes, the third electrodes connected to the third wires to which the third potential is applied can be written at the same time. The above-described writing processes may be combined.

The writing of "1" in the selected cell has been so far described by taking for example the case where the memory cells having floating gates as the charge storage layers are written with the "1" by changing the state of the charge in the charge storage layers and with the "0" by not changing the state of the charge and the CHE current is used as means for changing the state of the charge. However, the charge storage layer may be, for example, a dielectric or a laminated insulating film as well as the floating gate. Also, it is needless to say that the "0" may be written by changing the state of the charge in the charge storage layer and the "1" may be written by not changing the state of the charge. Further, the "0" may be written by slightly changing the state of the charge in the charge storage layer and the "1" may be written by greatly changing the state of the charge, and vice versa. Furthermore, the "0" is written by changing the state of the charge in the charge storage layer to negative and the "1" is written by changing the state of the charge to positive, and vice versa. The above-mentioned definitions of "0" and "1" may be combined. The CHE current is not the only means for changing the state of the charge in the charge storage layer.

FIG. 142 shows an equivalent circuit diagram of a memory cell array in which the first wires are arranged in parallel to the fourth wires. The application of the potentials of FIG. 142 is the same as that of FIG. 138 except that the first potential is applied to the first wire (1-i) and the ninth potential is applied to the first wires (not 1-i).

FIG. 146 shows an equivalent circuit diagram of a memory cell array in which a plurality of first wires are electrically connected in common. The application of the potentials of FIG. 146 is the same as that of FIG. 138 except that the first potential is applied to the first wire (1-1).

Have been described above the examples of application of potentials for writing data. Now, examples of timing charts for the above-described application of the potentials for writing data are explained with the case where M×N (M and N are positive integers) island-like semiconductor layers are arranged, each having two memory cells connected in series and formed of a P-type semiconductor, and the first wires are arranged in parallel with the third wires.

Figure 231:
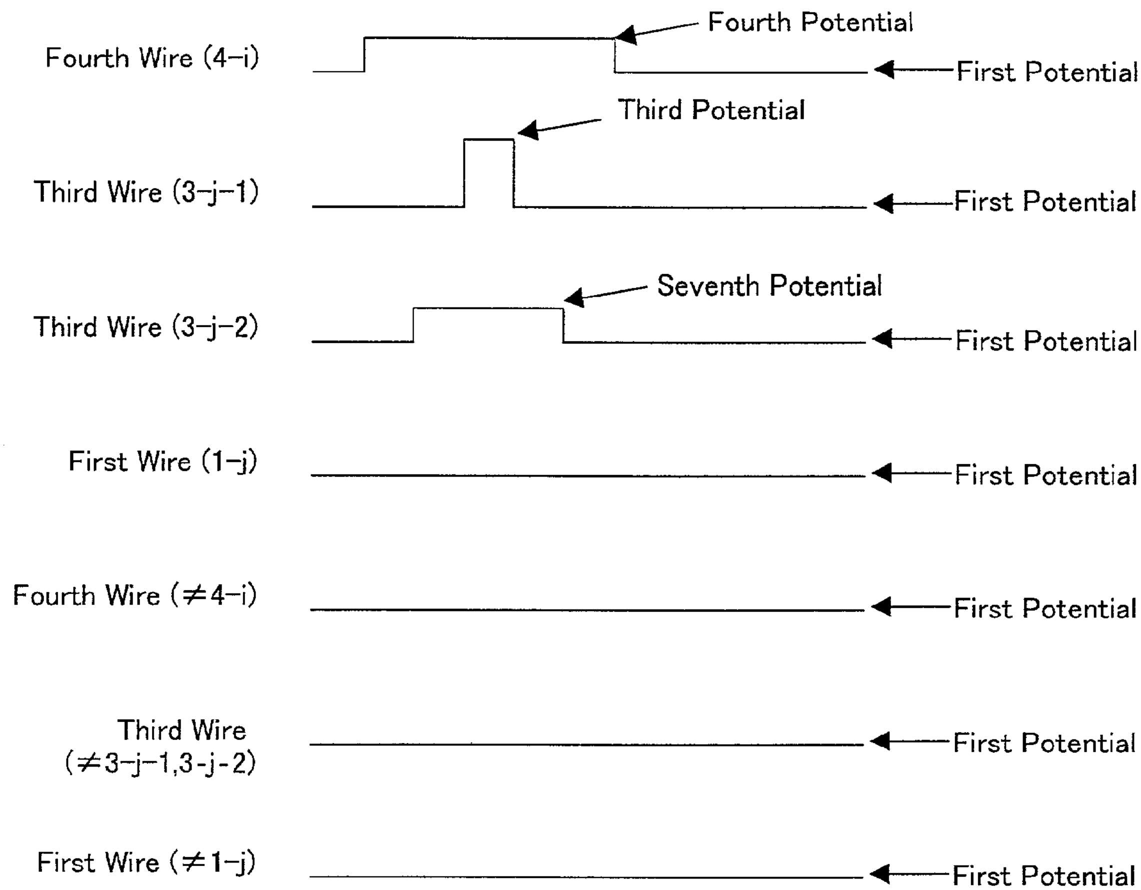

FIG. 231 is a timing chart showing an example of applying each potential for writing data. In FIG. 231, a ground potential is applied as the first potential and the ninth potential to the first wire, and the memory cell has a threshold of 5.0 V to 7.5 V when it is in the written state and has a threshold of 0.5 V to 3.0 V when it is in the erased state. For example, if the "1" is written by storing a negative charge in the charge storage layer, the ground potential as the first potential is first applied to the first wires (1-1 to 1-N), the third wires (3-1-1 to 3-N-2) and the fourth wires (4-1 to 4-M). In this state, the fourth potential, e.g., 6 V, is applied to the fourth wire (4-i). The eighth potential , e.g., the ground potential which is the first potential, is applied to fourth wires (not 4-i) other than the fourth wire (4-i). The twelfth potential is applied to third wires (not 3-j-1 to 3-j-2) connected to non-selected cells not arranged in series with the selected cell. The eleventh potential, e.g., 8 V, is applied to the third wire (3-j-2) connected to a non-selected cell arranged in series with the selected cell. The third potential, e.g., 12 V, is applied the third wire (3-j-1) connected to the selected cell. The "1" is written by maintaining this state for a desired time period. At this time, the timing of applying the potentials to the respective wires may be in another order or simultaneous. The third wire (3-j-1) is returned to the ground potential, the third wire (3-j-2) is returned to the ground potential, and the fourth wire (4-i) is returned to the ground potential. At this time, the respective electrodes may be returned to the ground potential in another order or simultaneously. The potentials given may be any combination of potentials so long as they meet conditions for writing the "1" in a desired cell. Here, the same potential is preferably applied initially as the first potential to the first wires (1-1 to 1-N), the third wires (3-1-1 to 3-N-2) and the fourth wires (4-1 to 4-M), but different potentials may be applied. In the above example, the writing process has been described with the case where the selected cell is a memory cell having the third wire (3-j-1) as the gate electrode. However, the writing process is the same with the case where the selected cell is a memory cell having a third wire other than the third wire (3-j-1) as the gate electrode.

Figure 232:
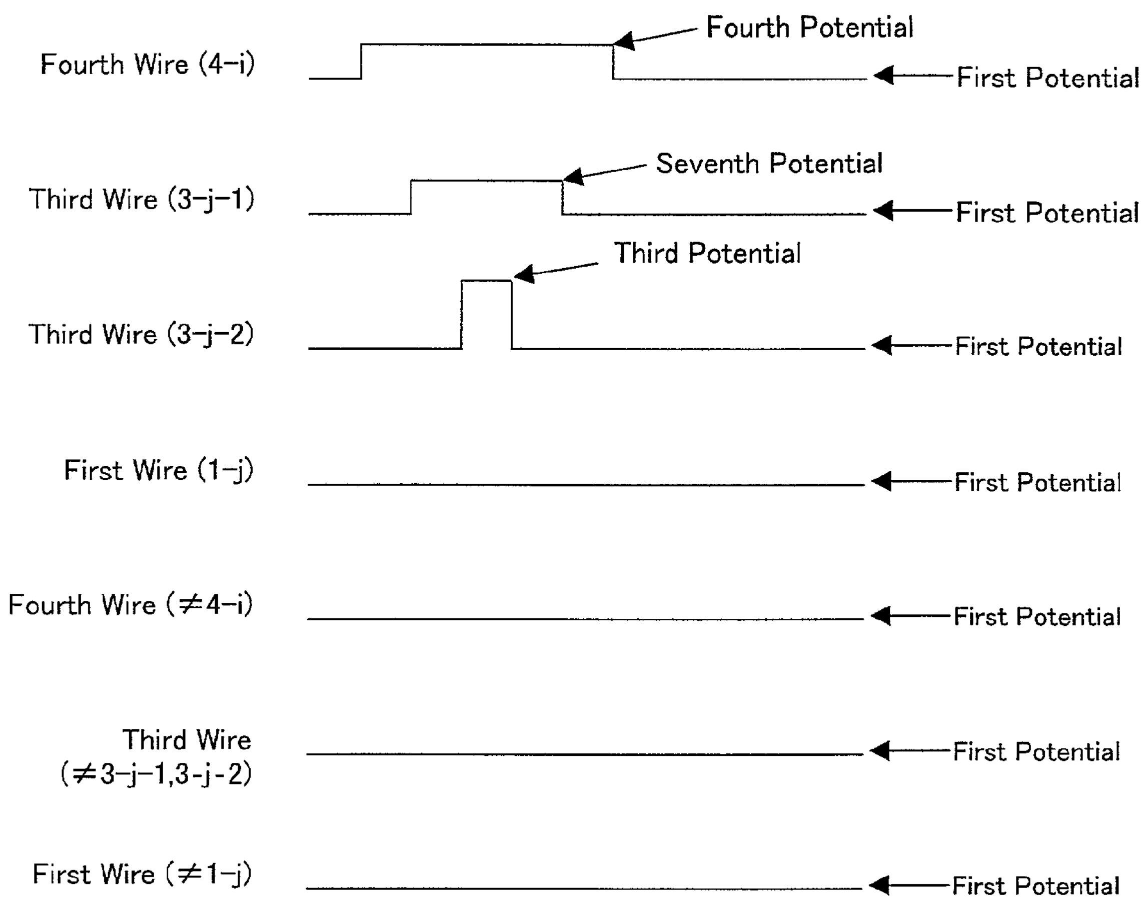

In contrast to FIG. 231, FIG. 232 shows a timing chart for writing data in the case where the selected cell is a memory cell connected to the third wire (3-j-2). FIG. 232 conforms to FIG. 231 except that the seventh potential instead of the eleventh potential is applied to the third wire connected to the non-selected cell arranged in series with the selected cell. At this time, the seventh potential is equal to the eleventh potential. FIG. 139 is an equivalent circuit diagram in the case where the selected cell is a memory cell connected to the third wire (3-j-2).

Figure 233:
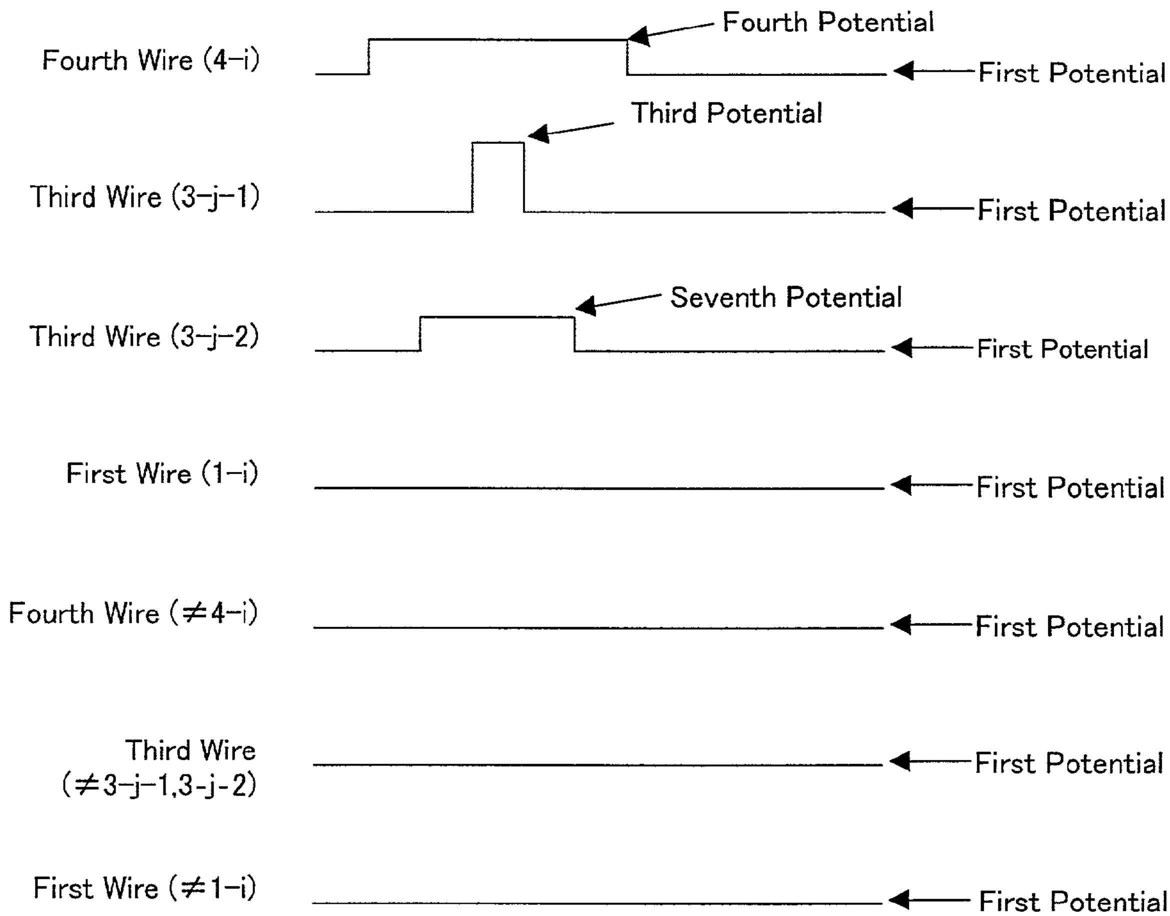

Have been described above the examples of the principle of writing data in the case where the first wires are arranged in parallel to the third wires. Now, FIG. 233 shows a timing chart for writing data in the case where the first wires are arranged in parallel to the fourth wires. In FIG. 233, a ground potential is applied as the first potential, and the memory cell has a threshold of 5.0 V to 7.5 V when it is in the written state and has a threshold of 0.5 V to 3.0 V when it is in the erased state. FIG. 233 conforms to FIG. 231 except that the first wire (1-i) instead of the first wire (1-j) is connected to the end of the island-like semiconductor layer including the selected cell.

Figure 234:
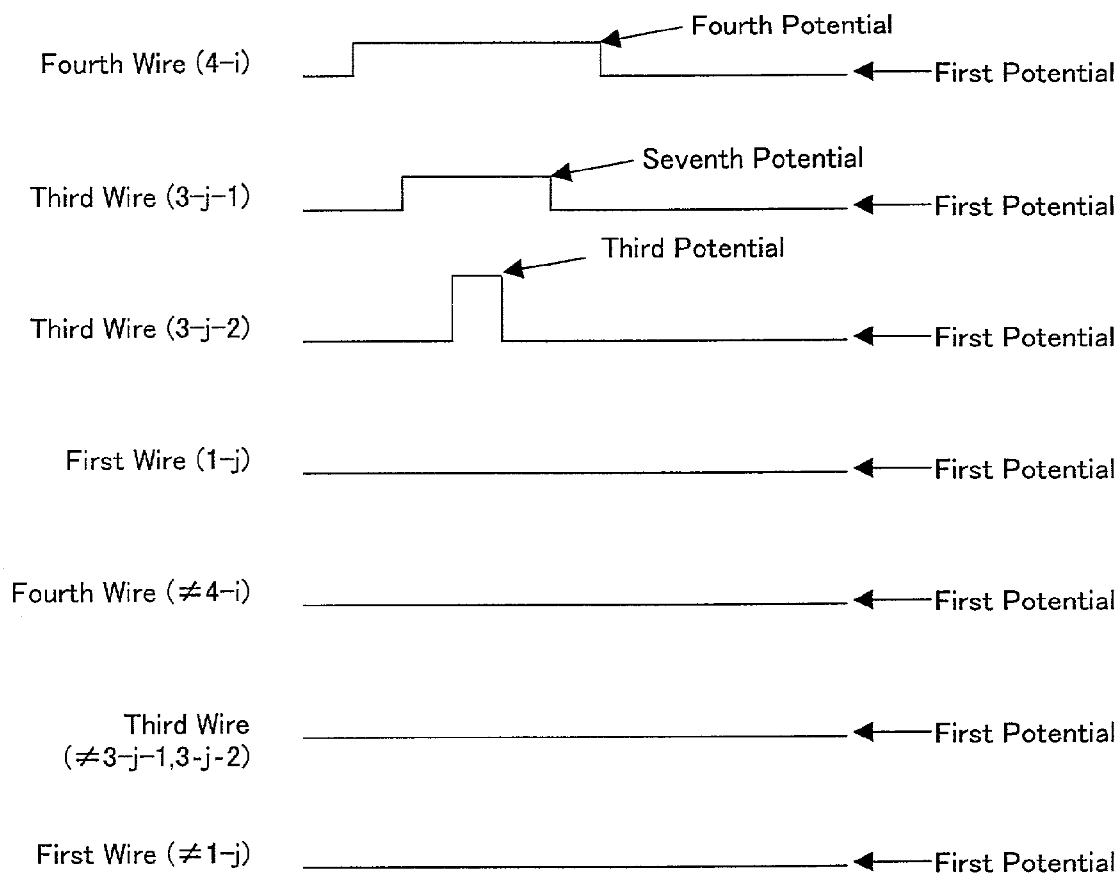

In contrast to FIG. 233, FIG. 234 shows a timing chart for writing data in the case where the selected cell is a memory cell connected to the third wire (3-j-2). FIG. 234 conforms to FIG. 233 except that the seventh potential instead of the eleventh potential is applied to the third wire connected to the non-selected cell arranged in series with the selected cell. At this time, the seventh potential is equal to the eleventh potential. FIG. 143 is an equivalent circuit diagram in the case where the selected cell is a memory cell connected to the third wire (3-j-2).

Figure 235:
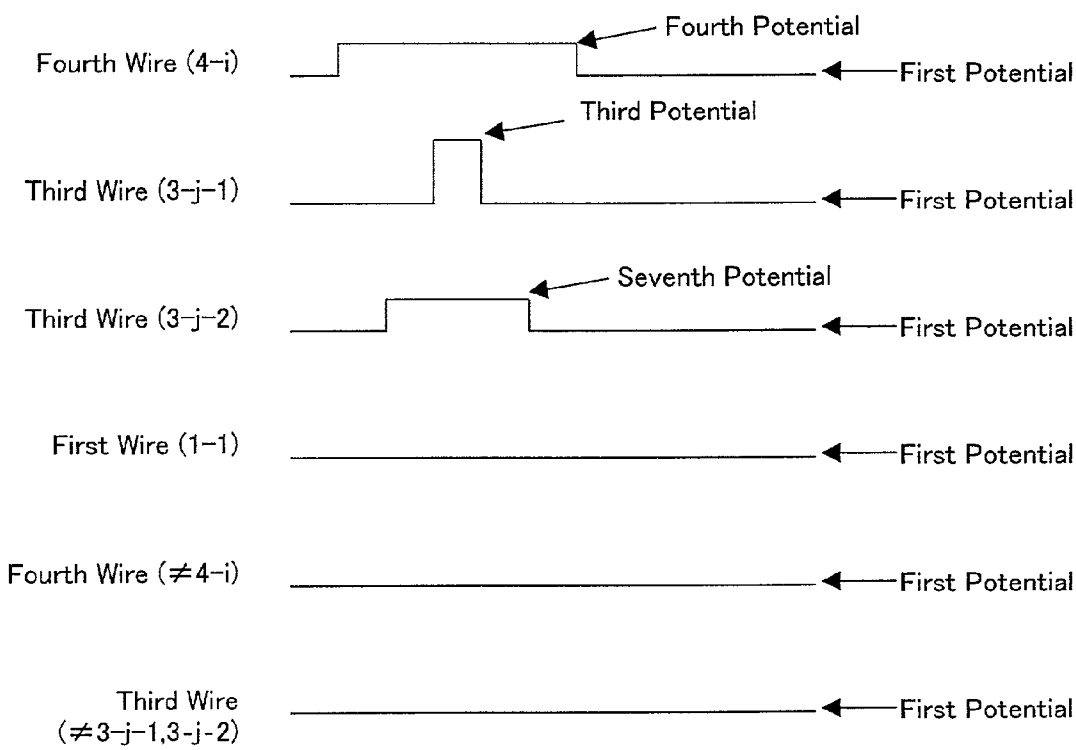

Have been described above the examples of the principle of writing data in the case where the first wires are arranged in parallel to the fourth wires. Now, FIG. 235 shows a timing chart for writing data in the case where the first wires are connected in common to the entire array. In FIG. 235, a ground potential is applied as the first potential, and the memory cell has a threshold of 5.0 V to 7.5 V when it is in the written state and has a threshold of 0.5 V to 3.0 V when it is in the erased state. FIG. 235 conforms to FIG. 231 except that the first wire (1-1) instead of the first wire (1-j) is connected to the end of the island-like semiconductor layer including the selected cell.

Figure 236:
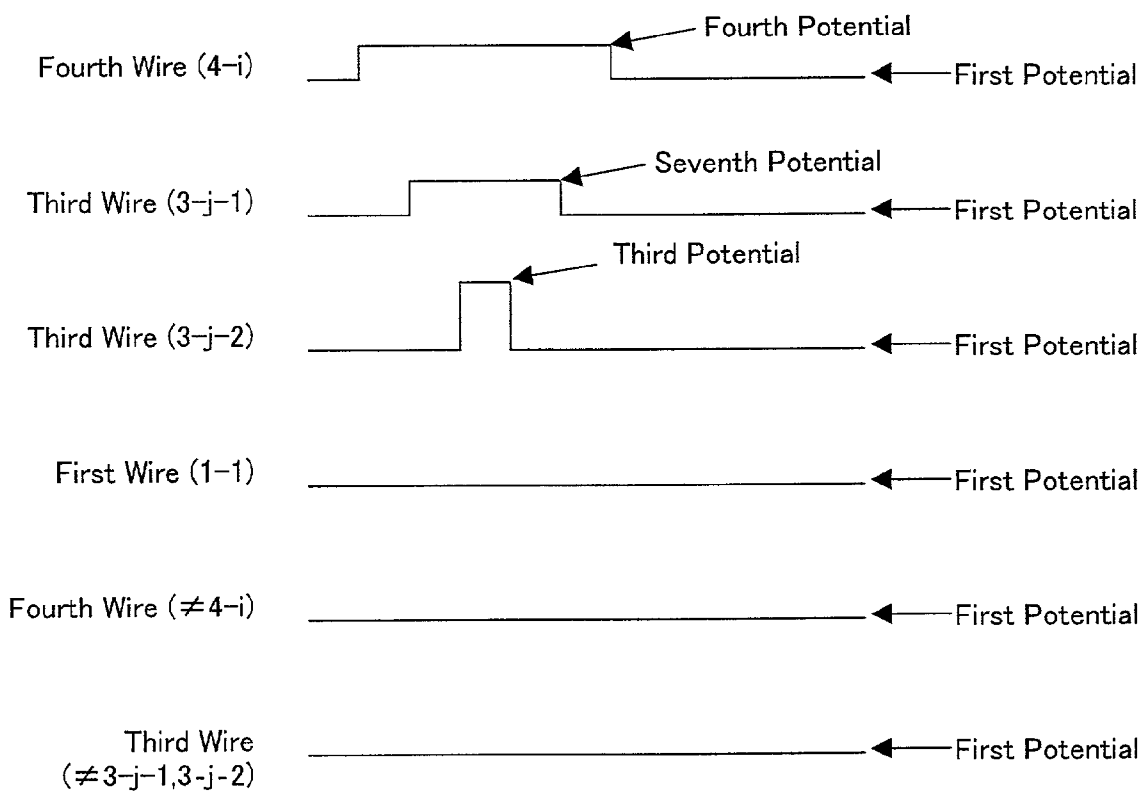
FIG. 236 to FIG. 278 show examples of timing charts at erasing data from semiconductor memories in accordance with the present invention.

In contrast to FIG. 235, FIG. 236 shows a timing chart for writing data in the case where the selected cell is a memory cell connected to the third wire (3-j-2). FIG. 236 conforms to FIG. 235 except that the seventh potential instead of the eleventh potential is applied to the third wire connected to the non-selected cell arranged in series with the selected cell. At this time, the seventh potential is equal to the eleventh potential. FIG. 147 is an equivalent circuit diagram in the case where the selected cell is a memory cell connected to the third wire (3-j-2).

Have been described the examples of writing data in the case where there are arranged M×N (M and N are positive integers) island-like semiconductor layers including two memory cells formed of the P-type semiconductor and arranged in series. The polarity of all the electrodes may be reversed as in the case of island-like semiconductor layers formed of an N-type semiconductor. At this time, the potentials have a relationship in magnitude reverse to that mentioned above.

An erasing process is now explained with a semiconductor memory according to the present invention which is so constructed to have island-like semiconductor layers to which is connected a memory cell provided with a charge storage layer and a third electrode as a control gate electrode. The erasing process utilizes an F-N current.

FIG. 123 shows an equivalent circuit diagram of the memory cell of this structure. For example, in the case where the island-like semiconductor layers are formed of a P-type semiconductor, a selected cell as shown in FIG. 123 is erased by applying a first potential to the first electrode connected to the island-like semiconductor layer, a third potential to the third electrode connected to the selected cell and a fourth potential to the fourth electrode connected to the island-like semiconductor layer including the selected cell. The application of these potentials causes the F-N current to occur only in a tunnel oxide film of the selected cell to change the state of a charge in the charge storage layer. In the case where a negative charge is drawn from the charge storage layer for erasing data, for example, the fourth potential is larger than the third potential. Supposing that a "1" means that a negative charge is stored in the charge storage layer, the state of the charge in the charge storage layer is changed to a "0." At this time, the third potential is a potential allowing the change to "0" by a difference between the third potential and the fourth potential, that is, a potential allowing the occurrence of a sufficient F-N current as means for changing the state of the charge. The F-N current flows in the tunnel oxide film of a memory transistor having, as the gate electrode, the third electrode to which the third potential is applied. In the case where the first wires (1-1 to 1-N) are formed as impurity diffusion layers in the semiconductor substrate and the channel region of a selected memory cell is electrically connected to the semiconductor substrate when the first electrode is floating, the fourth potential applied to the first electrode connected to the island-like semiconductor layer including the selected cell is a potential such that the island-like semiconductor layer are electrically floated from the semiconductor substrate by a depletion layer extended toward the semiconductor substrate owing to the application of the fourth potential. Thereby the potential of the island-like semiconductor layer equals the fourth potential and a sufficiently large F-N current flows in the tunnel oxide film of the memory transistor of the selected cell on the island-like semiconductor layer, so that data is erased. That is, the difference between the fourth potential and the third potential becomes a potential difference allowing a sufficient F-N current to flow in the tunnel oxide film of the memory transistor. In the case where the channel region of the memory cell is not electrically connected to the semiconductor substrate, the depletion layer owing to the fourth potential may have any extension.

In the case where the first electrode is formed to be electrically insulated from the semiconductor substrate, for example, where the first electrode is formed of an impurity diffusion layer in an SOI substrate and is insulated from the semiconductor substrate by an insulating film, the first potential is not necessarily the same as the tenth potential.

Erasure may be defined as changing the state of the charge in the charge storage layer and raising the threshold of the selected memory transistor. In this case, the third potential is large than the fourth potential, and the third potential is a potential allowing the state of the charge in the charge storage layer to be changed sufficiently by the difference between the third potential and the fourth potential, for example, a potential allowing the occurrence of a sufficient F-N current. Means for changing the state of the charge in the charge storage layer is not limited to the F-N current.

Has been described an example of applying the potentials for erasing data. Now are described examples of timing charts for applying potentials for erasing data in the case where the selected cell is a memory cell having the selected third electrode as the gate electrode in island-like semiconductor layers having memory cells formed of a P-type semiconductor.

Figure 237:
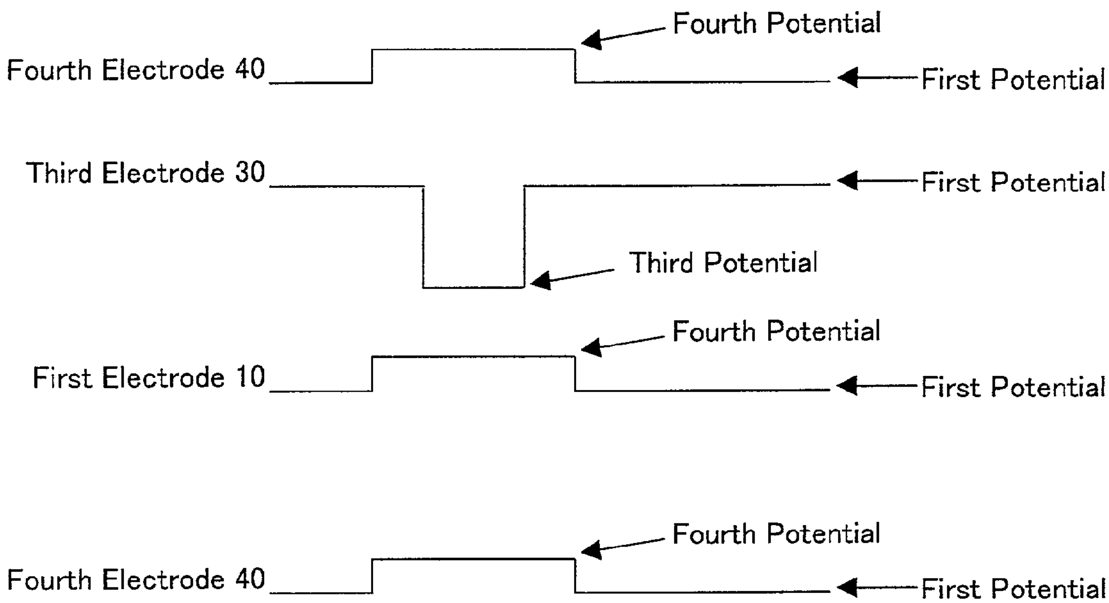

FIG. 237 shows a timing chart showing an example of timing of applying each potential for erasing data. In FIG. 237, a selected third electrode as shown in FIG. 123 is negative-biased, and the memory cell has a threshold of 1.0 V to 3.5 V when it is in the written state and has a threshold of 1.0 V or lower when it is in the erased state. For drawing a negative charge from the charge storage layer, for example, a ground potential is applied as the first potential to the first, third and fourth electrodes. The fourth potential, e.g., 6 V, is applied to the first electrode, and the fourth potential, e.g., 6 V, is applied to the fourth electrode. The third potential, e.g., 12 V, is applied to the third electrode. The selected cell is erased to "0" by sustaining this state for a desired period of time. The potentials may be applied to the respective electrodes in another order or simultaneously. The third electrode is returned to the ground potential, i.e., the first potential, the first electrode is returned to the ground potential, i.e., the first potential, and the fourth electrode is returned to the ground potential, i.e., the first potential. The respective electrodes may be returned to the ground potential, i.e., the first potential, in another order or simultaneously. The potentials given may be any combination of potentials so long as they meet conditions for erasing a desired cell. Here, the same potential is preferably applied initially as the first potential to the first, third and fourth electrodes, but different potentials may be applied.

Thereby the selected cell as shown in FIG. 123 is erased.

Figure 238:
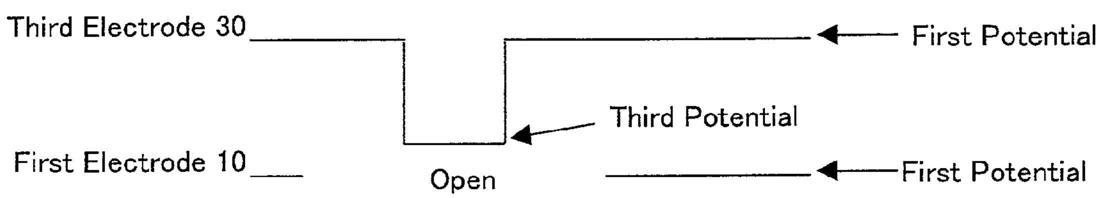

FIG. 238 shows a timing chart showing an example of timing of applying each potential for erasing data in the case where the first electrode is open in contrast to FIG. 237. The erasing process of FIG. 238 conforms to that of FIG. 237 except that the first electrode is open, and the selected cell is erased by a potential difference between the first electrode and the fourth electrode. Also in FIG. 238, the selected cell as shown in FIG. 123 is erased as in FIG. 237.

Figure 239:
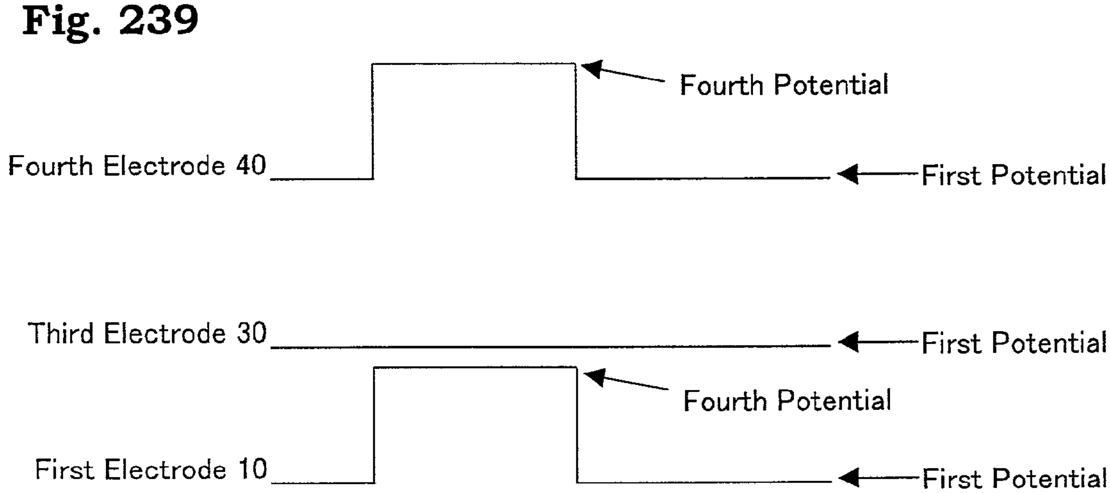

FIG. 239 shows a timing chart showing an example of timing of applying each potential for erasing data. In FIG. 239, 18 V is applied to the first electrode as the fourth potential, and the memory cell has a threshold of 1.0 V to 3.5 V when it is in the written state and has a threshold of −1.0 V or lower when it is in the erased state. For drawing a negative charge from the charge storage layer, for example, the ground potential as the first potential is applied to the first, third and fourth electrodes. In this state, the fourth potential, e.g., 18 V, is applied to the first electrode, and the fourth potential, e.g., 18 V, is applied to the fourth electrode. The third potential, e.g., the ground potential which is the first potential, is kept applied to the third electrode. The selected cell is erased to "0" by sustaining this state for a desired period of time. The potentials may be applied to the respective electrodes in another order or simultaneously. The fourth electrode is returned to the ground potential, i.e., the first potential. The respective electrodes may be returned to the ground potential, i.e., the first potential, in another order or simultaneously. The potentials given may be any combination of potentials so long as they meet conditions for erasing a desired cell. Here, the same potential is preferably applied initially as the first potential to the first, third and fourth electrodes, but different potentials may be applied. Thereby the selected cell as shown in FIG. 123 is erased.

Have been described above the examples of the principles of erasing data in the case of the island-like semiconductor layers having the memory cells formed of the P-type semiconductor. However, the polarity of all the electrodes may be reversed as in the case of island-like semiconductor layers formed of an N-type semiconductor. At this time, the potentials have a relationship in magnitude reverse to that mentioned above.

An erasing process is now explained with a semiconductor memory according to the present invention which is constructed to include island-like semiconductor layers each having, as selection gate transistors, the transistor provided with the second electrode as a gate electrode and a transistor provide with the fifth electrode as a gate electrode and a plurality of (e.g., L, wherein L is a positive integer) memory cells connected in series, the memory cells each being provided with the charge storage layer between the selection gate transistors and the third electrode as a control gate electrode. The erasing process utilizes an F-N current.

FIG. 124 shows an equivalent circuit diagram of the memory cell of this structure. For example, in the case where the island-like semiconductor layers are formed of a P-type semiconductor, a selected cell as shown in FIG. 124 is erased by applying a first potential to a first electrode 10 connected to an island-like semiconductor layer including the selected cell, a second potential to a second electrode 20 arranged in series with the selected cell, a third potential to a third electrode (30-h, wherein h is a positive integer, $1 \leqq h \leqq L$) connected to the selected cell, a seventh potential to third electrodes (30-1 to 30-(h−1)) connected to non-selected cells arranged in series with the selected cell, an eleventh potential to third electrodes (30-(h+1) to 30-L) connected to non-selected cells arranged in series with the selected cell, a fourth potential to the fourth electrode 40 connected to the island-like semiconductor layer including the selected cell, and a fifth potential to the fifth electrode 50 arranged in series with the selected cell. The application of these potentials causes the F-N current to occur only in the tunnel oxide film of the selected cell to change the state of the charge in the charge storage layer. In the case where a negative charge is drawn from the charge storage layer for erasing data, for example, the fourth potential is larger than the third potential. Supposing that the "1" means that a negative charge is stored in the charge storage layer, the state of the charge in the charge storage layer is changed to the "0." At this time, the third potential is a potential allowing the change to "0" by the difference between the third potential and the fourth potential, that is, a potential allowing the occurrence of a sufficient F-N current as means for changing the state of the charge. The F-N current flows in the tunnel oxide film of a memory transistor having, as the gate electrode, the third electrode to which the third potential is applied. The first electrode 10 may be open.

In the case where the first electrode 10 is formed as an impurity diffusion layer in the semiconductor substrate and the channel region of a selected memory cell is electrically connected to the semiconductor substrate when the potential of the first electrode is floating, the fourth potential applied to the first electrode 10 connected to the island-like semiconductor layer including the selected cell is a potential such that the island-like semiconductor layer and the semiconductor substrate are electrically floated by the depletion layer extended toward the semiconductor substrate owing to the application of the fourth potential. Thereby the potential of the island-like semiconductor layer equals the fourth potential and a sufficiently large F-N current flows in the tunnel oxide film of the memory transistor of the selected cell on the island-like semiconductor layer, so that data is erased. That is, the difference between the fourth potential and the third potential becomes a potential difference allowing a sufficient F-N current to flow in the tunnel oxide film of the memory transistor.

In the case where the channel region of the memory cell is not electrically connected to the semiconductor substrate, the depletion layer owing to the fourth potential may have any extension. The seventh potential is a potential causing a sufficiently smaller change in the state of the charge in the charge storage layers in non-selected cells than in the selected cell, for example, a potential such that a difference between the seventh potential and the fourth potential causes only a sufficiently small F-N current in the tunnel oxide films of the memory transistors having, as the gate electrodes, the third electrodes (30-1 to 30-(h−1)) to which the seventh potential is applied. The eleventh potential is a potential causing a sufficiently smaller change in the state of the charge in the charge storage layers in non-selected cells than in the selected cell, for example, a potential such that a difference between the eleventh potential and the fourth potential causes only a sufficiently small F-N current in the tunnel oxide films of the memory transistors having, as the gate electrodes, the third electrodes (30-(h+1) to 30-L) to which the eleventh potential is applied. The second potential is a potential not allowing the F-N current to flow in the gate oxide film of the transistor having the second electrode 20 as the gate electrode. The fifth potential is a potential not allowing the F-N current to flow in the gate oxide film of the transistor having the fifth electrode 50 as the gate electrode.

In the case where the first electrode is formed to be electrically insulated from the semiconductor substrate, for example, where the first electrode is formed of an impurity diffusion layer in an SOI substrate and is insulated from the semiconductor substrate by an insulating film, the first potential is not necessarily the same as the tenth potential.

In the case where the channel region of a selected memory cell is electrically connected to the semiconductor substrate, for example, in the case where impurity diffusion layers do not render the island-like semiconductor layers in the floating state from the substrate, the tenth potential applied to the semiconductor substrate can erase simultaneously all memory cells having as the gate electrodes the third electrodes to which the third potential is applied, provided that a difference between the tenth potential and the third potential causes a sufficient change in the state of the charge in the charge storage layer.

The memory cells may be sequentially erased from a memory cell connected to a third electrode (3-L) to a memory cell connected to a third electrode (3-1), or may be erased in reverse order or at random.

Erasure may be defined as changing the state of the charge in the charge storage layer and raising the threshold of the selected memory transistor. In this case, the third potential is large than the fourth potential, and the third potential is a potential allowing the state of the charge in the charge storage layer to be changed sufficiently by the difference between the third potential and the fourth potential, for example, a potential allowing the occurrence of a sufficient F-N current. Means for changing the state of the charge in the charge storage layer is not limited to the F-N current.

Has been described an example of applying the potentials for erasing data. Now are described examples of timing charts for applying potentials for erasing data in the case where there are arranged M×N (M and N are positive integers) island-like semiconductor layers having a plurality of (e.g., L wherein L is a positive integer) memory cells formed of the P-type semiconductor and arranged in series and the selected cell is a memory cell having the selected third electrode as the gate electrode. In the case where the selected cell is a memory cell having the selected third electrode as the gate electrode in island-like semiconductor layers having memory cells formed of a P-type semiconductor.

Figure 240:
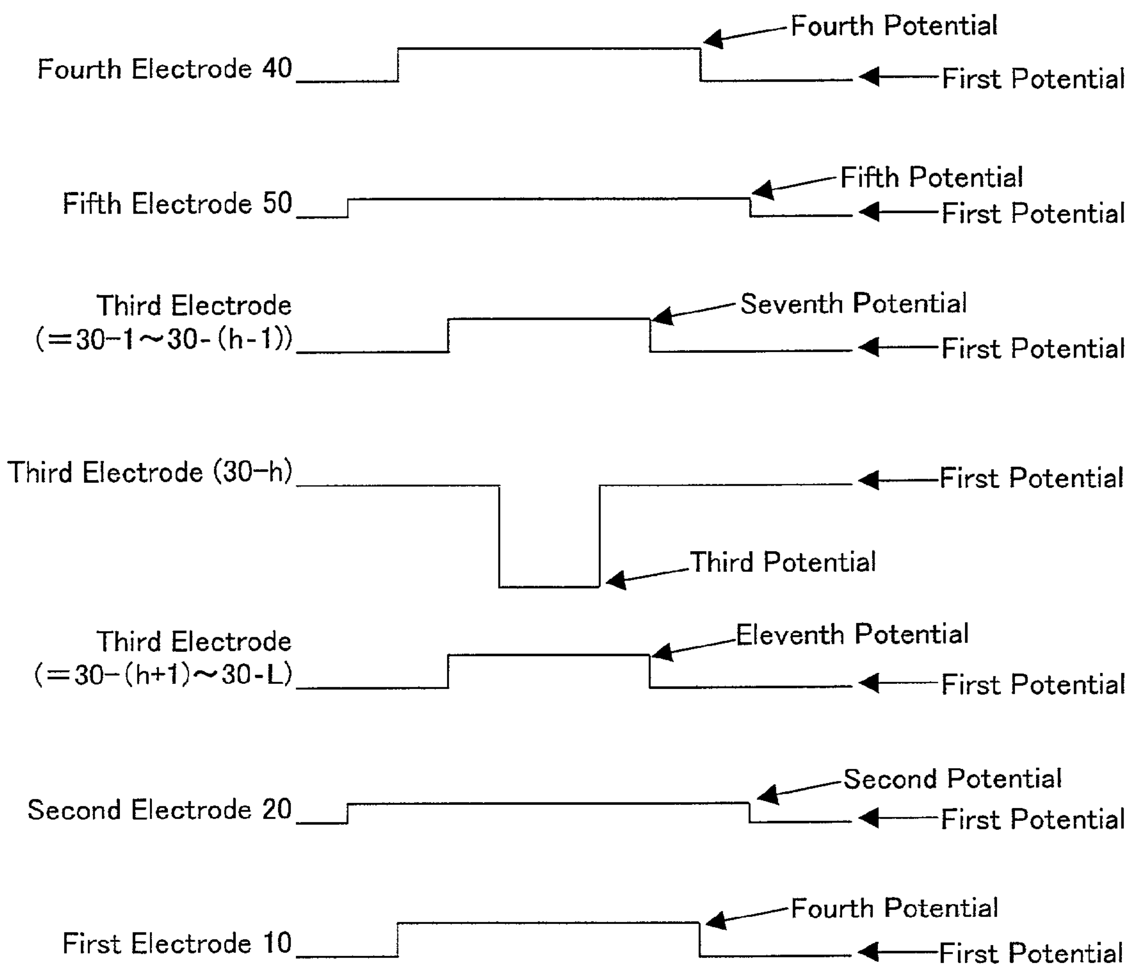

FIG. 240 shows a timing chart showing an example of timing of applying each potential for erasing data. In FIG. 240, a selected third electrode as shown in FIG. 124 is negative-biased, the threshold of the transistors having the second and fifth electrodes as the gate electrodes is 0.5 V, for example, and the memory cell has a threshold of 1.0 V to 3.5 V when it is in the written state and has a threshold of −1.0 V or lower when it is in the erased state. For drawing a negative charge from the charge storage layer, for example, a ground potential is applied as the first potential to the first electrode 10, the second electrode 20, the third electrodes (30-1 to 30-L), the fourth electrode 40 and the fifth electrode 50. In this state, the second potential, e.g., 6 V, is applied to the second electrode 20, the fifth potential, e.g., 6 V, is applied to the fifth electrode 50, the fourth potential, e.g., 6 V, is applied to the first electrode 10, the fourth potential, e.g., 6 V, is applied to the fourth electrode 40, the seventh potential, e.g., 6 V, is applied to third electrodes (30-1 to 30-(h−1)) (h is a positive integer, 1≦h≦L) other than the third electrode (30-h), the eleventh potential, e.g., 6 V, is applied to third electrodes (30-(h+1) to 30-L) (h is a positive integer, 1≦h≦L), and the third potential, e.g., 12 V, is applied to the third electrode (30-h). The selected cell is erased to "0" by sustaining this state for a desired period of time. The potentials may be applied to the respective electrodes in another order or simultaneously. The third electrode (30-h) is returned to the ground potential, i.e., the first potential; the third electrodes (not 30-h) other than the third electrode (30-h) are returned to the ground potential, i.e., the first potential; the fourth electrode 40 is returned to the ground potential, i.e., the first potential; the first electrode 10 is returned to the ground potential, i.e., the first potential; the second electrode 20 is returned to the ground potential, i.e., the first potential; and the fifth electrode 50 is returned to the ground potential, i.e., the first potential. The respective electrodes may be returned to the ground potential in another order or simultaneously. The potentials given may be any combination of potentials so long as they meet conditions for erasing a desired cell. The ground potential may be applied as the second potential, and the ground potential may be applied as the fifth potential to the fifth electrode 50. Here, the same potential is preferably applied initially as the first potential to the first electrode 10, the second electrode 20, the third electrodes (30-1 to 30-L), the fourth electrode 40 and the fifth electrode 50, but different potentials may be applied.

Thereby the selected cell as shown in FIG. 124 is erased. In the above example, the erasing process has been described with the case where the selected cell is a memory cell having the third electrode (30-h) as the gate electrode. However, the erasing process is the same with the case where the selected cell is a memory cell having a third electrode other than the third electrode (30-h) as the gate electrode.

Figure 241:
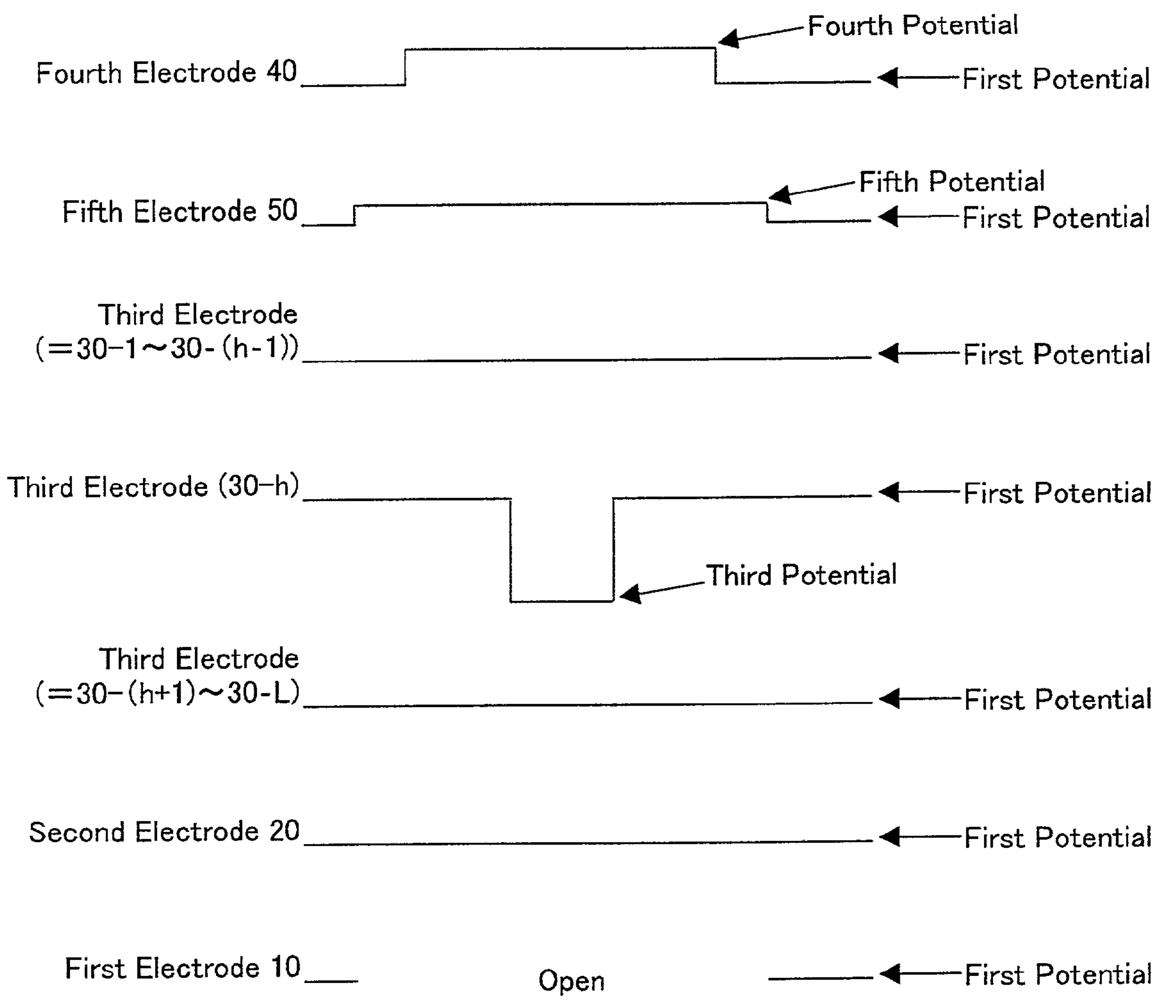

FIG. 241 shows a timing chart showing an example of timing of applying each potential for erasing data in the case where the first electrode is open in contrast to FIG. 240. The erasing process of FIG. 241 conforms to that of FIG. 240 except that the first electrode is open and the ground potential is applied as the first potential to the non-selected electrodes (not 30-h, h is a positive integer, 1≦h≦L) and the fourth electrode 40. Also in FIG. 241, the selected cell as shown in FIG. 124 is erased as in FIG. 241. If −12 V is applied as the third potential to the third electrodes (30-1 to 30-(h−1)) and the third electrodes (30-(h−1) to 30-L), a plurality of cells connected to the third electrodes (30-1 to 30-L) as shown in FIG. 124 are erased.

Figure 242:
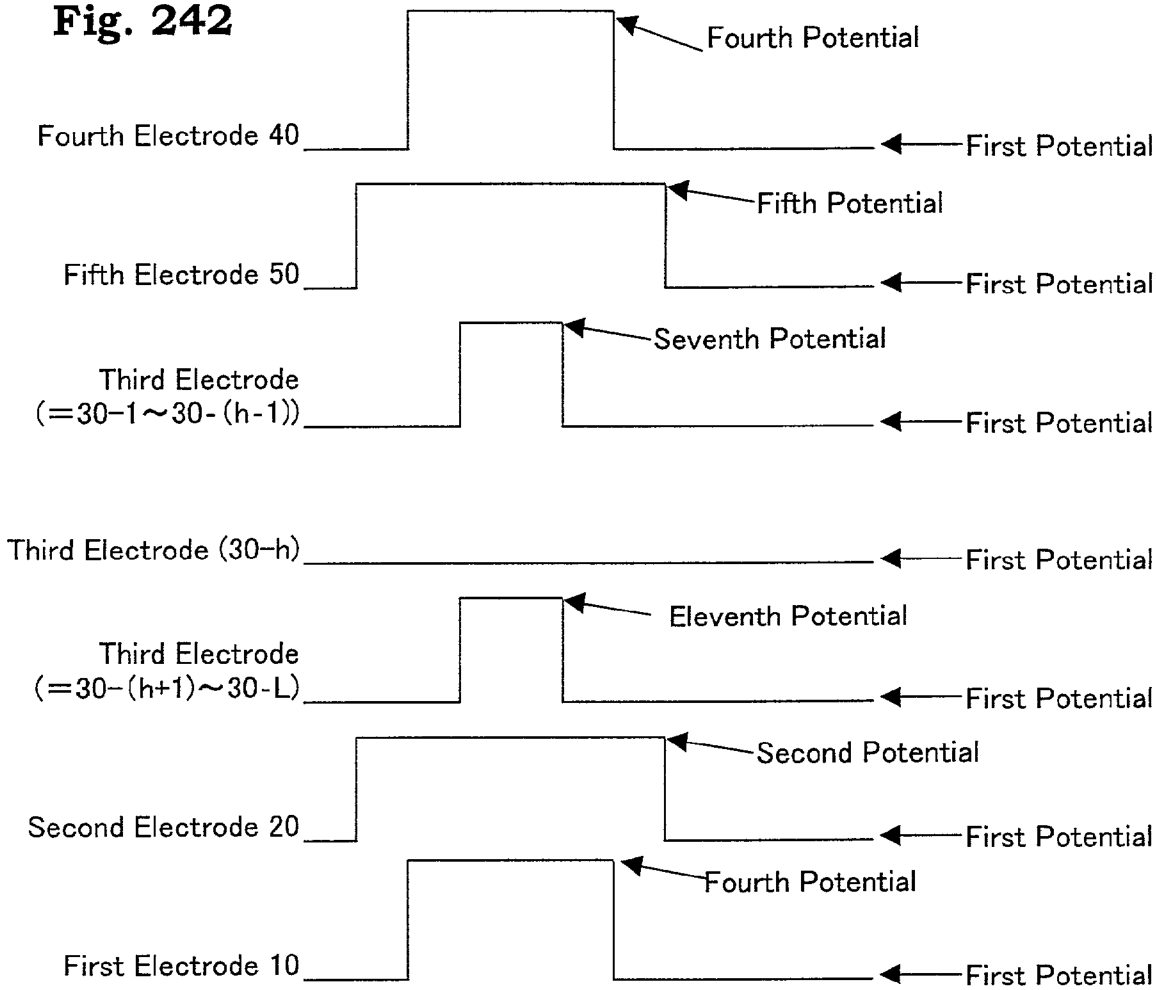

FIG. 242 shows a timing chart showing an example of timing of applying each potential for erasing data. In FIG. 242, the fourth potential, e.g., 18 V, is applied to the first electrode, the threshold of the transistors having the second and fifth electrodes as the gate electrodes is 0.5 V, for example, and the memory cell has a threshold of 1.0 V to 3.5 V when it is in the written state and has a threshold of −1.0 V or lower when it is in the erased state. For drawing a negative charge from the charge storage layer, for example, a ground potential is applied as the first potential to the first electrode 10, the second electrode 20, the third electrodes (30-1 to 30-L), the fourth electrode 40 and the fifth electrode

50. In this state, the second potential, e.g., 18 V, is applied to the second electrode 20, the fifth potential, e.g., 18 V, is applied to the fifth electrode 50, the fourth potential, e.g., 18 V, is applied to the fourth electrode 40 , the fourth potential, e.g., 18 V, is applied to the first electrode 10, the seventh potential, e.g., 10 V, is applied to third electrodes (30-1 to 30-(h−1)) (h is a positive integer, 1≦h≦L) other than the third electrode (30-h), the eleventh potential, e.g., 10 V, is applied to third electrodes (30-(h+1) to 30-L) (h is a positive integer, 1≦h≦L), and the third potential, e.g., the ground potential which is the first potential, is kept applied to the third electrode (30-h). The selected cell is erased to "0" by sustaining this state for a desired period of time. The potentials may be applied to the respective electrodes in another order or simultaneously. The third electrodes (not 30-h) other than the third electrode (30-h) are returned to the ground potential, i.e., the first potential, the fourth electrode 40 is returned to the ground potential, i.e., the first potential, the first electrode 10 is returned to the ground potential, i.e., the first potential, and the second electrode 20 and the fifth electrode 50 are returned to the ground potential, i.e., the first potential. The respective electrodes may be returned to the ground potential in another order or simultaneously. The potentials given may be any combination of potentials so long as they meet conditions for erasing a desired cell. Here, the same potential is preferably applied initially as the first potential to the first electrode 10, the second electrode 20, the third electrodes (30-1 to 30-L), the fourth electrode 40 and the fifth electrode 50, but different potentials may be applied.

Thereby the selected cell as shown in FIG. 124 is erased. In the above example, the erasing process has been described with the case where the selected cell is a memory cell having the third electrode (30-h) as the gate electrode. However, the erasing process is the same with the case where the selected cell is a memory cell having a third electrode other than the third electrode (30-h) as the gate.

Figure 125:
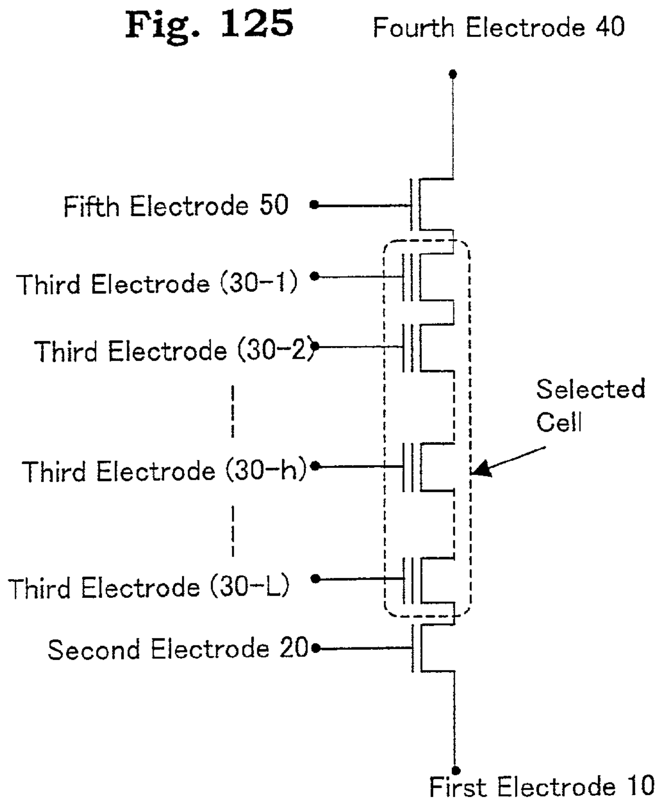
Figure 243:
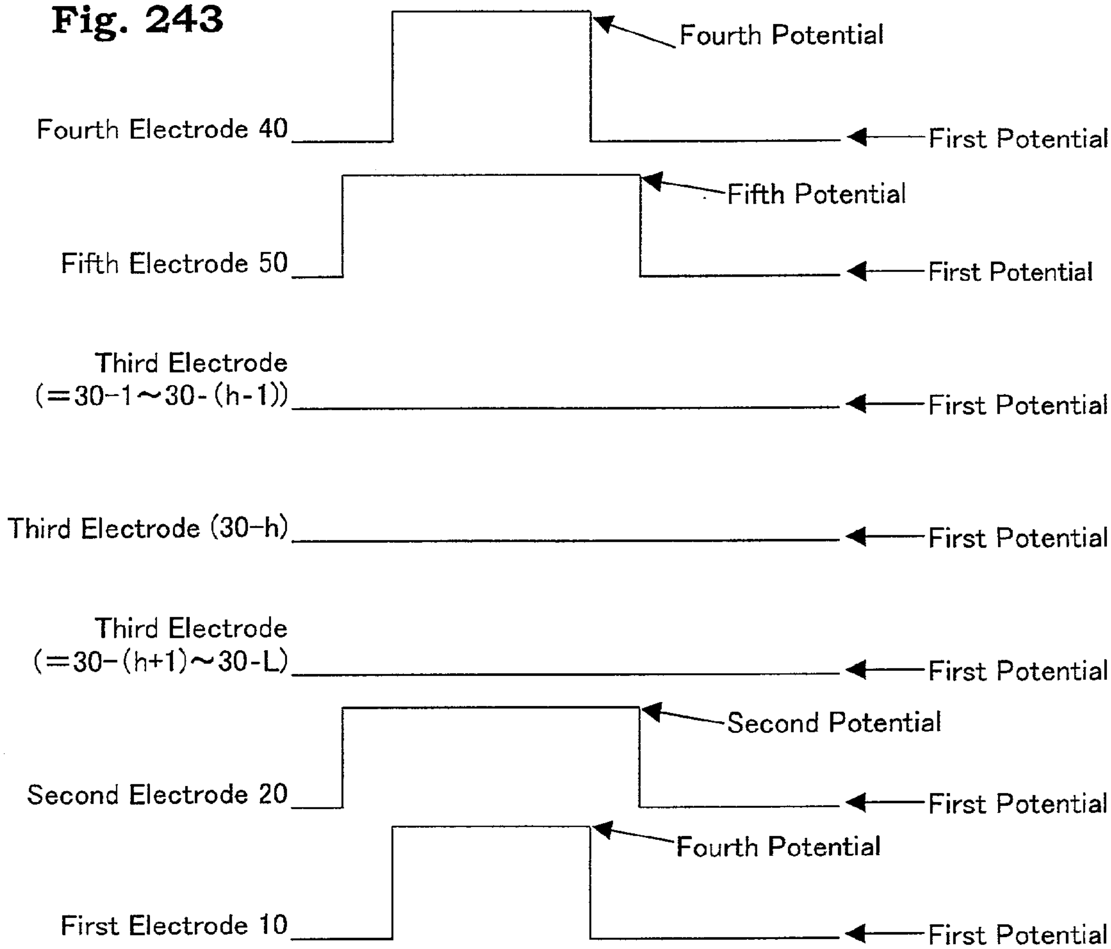

As shown in FIG. 243 illustrating a timing of applying each potential, if 18 V is applied as the third potential to the third electrodes (30-1 to 30-(h−1)) and the third electrodes (30-(h−1) to 30-L), a plurality of cells connected to the third electrodes (30-1 to 30-L) as shown in FIG. 125 are erased.

Have been described above the examples of the principles of erasing data in the case of the island-like semiconductor layers having a plurality of (e.g., L, L is a positive integer) memory cells formed of the P-type semiconductor and arranged in series and having the selection transistors formed to sandwich the memory cells therebetween. However, he polarity of all the electrodes may be reversed as in the case of island-like semiconductor layers formed of an N-type semiconductor. At this time, the potentials have a relationship in magnitude reverse to that mentioned above.

An erasing process is now explained with a semiconductor memory according to the present invention which is constructed to include island-like semiconductor layers each having, for example, two memory cells connected in series, the memory cells each being provided with the charge storage layer and the third electrode as a control gate electrode. The erasing process utilizes the F-N current.

FIG. 126 shows an equivalent circuit diagram of the memory cell of this structure. For example, in the case where the island-like semiconductor layers are formed of a P-type semiconductor, a selected cell as shown in FIG. 126 is erased by applying a first potential to a first electrode 10 connected to an island-like semiconductor layer including the selected cell, a second potential to a second electrode 20 arranged in series with the selected cell, a third potential to a third electrode (30-1) connected to the selected cell, an eleventh potential to third electrode (30-2) connected to a non-selected cell arranged in series with the selected cell, a fourth potential to the fourth electrode 40 connected to the island-like semiconductor layer including the selected cell, and a fifth potential to the fifth electrode 50 arranged in series with the selected cell. The application of these potentials causes the F-N current to occur only in the tunnel oxide film of the selected cell to change the state of the charge in the charge storage layer. In the case where a negative charge is drawn from the charge storage layer for erasing data, for example, the fourth potential is larger than the third potential. Supposing that the "1" means that a negative charge is stored in the charge storage layer, the state of the charge in the charge storage layer is changed to the "0." At this time, the third potential is a potential allowing the change to "0" by the difference between the third potential and the fourth potential, that is, a potential allowing the occurrence of a sufficient F-N current as means for changing the state of the charge. The F-N current flows in the tunnel oxide film of a memory transistor having, as the gate electrode, the third electrode to which the third potential is applied. The first electrode 10 may be open. In the case where the first electrode 10 is formed as an impurity diffusion layer in the semiconductor substrate and the channel region of a selected memory cell is electrically connected to the semiconductor substrate when the potential of the first electrode 10 is floating, the fourth potential applied to the first electrode 10 connected to the island-like semiconductor layer including the selected cell is a potential such that the island-like semiconductor layer and the semiconductor substrate are electrically floated by the depletion layer extended toward the semiconductor substrate owing to the application of the fourth potential.

Thereby the potential of the island-like semiconductor layer equals the fourth potential and a sufficiently large F-N current flows in the tunnel oxide film of the memory transistor of the selected cell on the island-like semiconductor layer, so that data is erased. That is, the difference between the fourth potential and the third potential becomes a potential difference allowing a sufficient F-N current to flow in the tunnel oxide film of the memory transistor. In the case where the channel region of the memory cell is not electrically connected to the semiconductor substrate, the depletion layer owing to the fourth potential may have any extension. The eleventh potential is a potential causing a sufficiently smaller change in the state of the charge in the charge storage layers in non-selected cells than in the selected cell, for example, a potential such that a difference between the eleventh potential and the fourth potential causes only a sufficiently small F-N current in the tunnel oxide film of the memory transistor having, as the gate electrode, the third electrode (30-2) to which the eleventh potential is applied. The second potential is a potential not allowing the F-N current to flow in the gate oxide film of the transistor having the second electrode 20 as the gate electrode. The fifth potential is a potential not allowing the F-N current to flow in the gate oxide film of the transistor having the fifth electrode 50 as the gate electrode.

In the case where the first electrode is formed to be electrically insulated from the semiconductor substrate, for example, where the first electrode is formed of an impurity diffusion layer in an SOI substrate and is insulated from the semiconductor substrate by an insulating film, the first potential is not necessarily the same as the tenth potential.

In the case where the channel region of a selected memory cell is electrically connected to the semiconductor substrate, for example, in the case where impurity diffusion layers do not render the island-like semiconductor layers in the floating state from the substrate, the tenth potential applied to the semiconductor substrate can erase simultaneously all memory cells having as the gate electrodes the third electrodes to which the third potential is applied, provided that a difference between the tenth potential and the third potential causes a sufficient change in the state of the charge in the charge storage layer.

The memory cells may be sequentially erased from a memory cell connected to a third electrode (30-2) to a memory cell connected to a third electrode (30-1), or may be erased in reverse order or at random.

Erasure may be defined as changing the state of the charge in the charge storage layer and raising the threshold of the selected memory transistor. In this case, the third potential is large than the fourth potential, and the third potential is a potential allowing the state of the charge in the charge storage layer to be changed sufficiently by the difference between the third potential and the fourth potential, for example, a potential allowing the occurrence of a sufficient F-N current. Means for changing the state of the charge in the charge storage layer is not limited to the F-N current.

Has been described an example of applying the potentials for erasing data. Now are described examples of timing charts for applying potentials for erasing data in the case where island-like semiconductor layers having two memory cells formed of the P-type semiconductor and arranged in series and the selected cell is a memory cell having the selected third electrode as the gate electrode.

Figure 244:
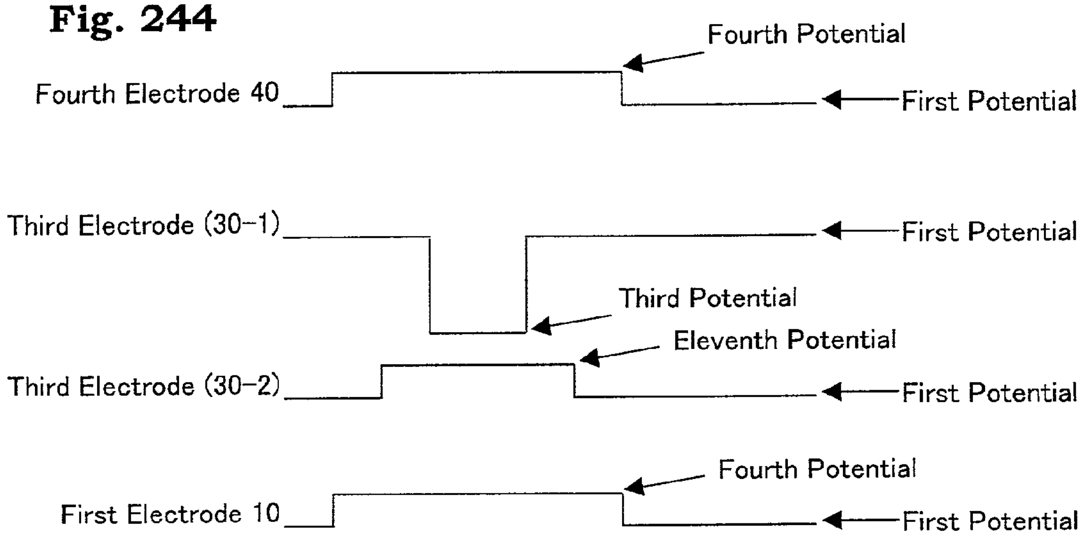

FIG. 244 shows a timing chart showing an example of timing of applying each potential for erasing data. In FIG. 244, a selected third electrode as shown in FIG. 126 is negative-biased, and the memory cell has a threshold of 1.0 V to 3.5 V when it is in the written state and has a threshold of 1.0 V or lower when it is in the erased state. For drawing a negative charge from the charge storage layer, for example, a ground potential is applied as the first potential to the first electrode 10, the third electrodes (30-1 to 30-2) and the fourth electrode 40. In this state, the fourth potential, e.g., 6 V, is applied to the first electrode 10, the fourth potential, e.g., 6 V, is applied to the fourth electrode 40, the eleventh potential, e.g., 6 V, is applied to the third electrode (30-2), and the third potential, e.g., 12 V, is applied to the third electrode (30-1). The selected cell is erased to “0” by sustaining this state for a desired period of time. The potentials may be applied to the respective electrodes in another order or simultaneously. The third electrode (30-1) is returned to the ground potential, i.e., the first potential, the third electrode (30-2) is returned to the ground potential, i.e., the first potential, the fourth electrode 40 is returned to the ground potential, i.e., the first potential, and the first electrode 10 is returned to the ground potential, i.e., the first potential. The respective electrodes may be returned to the ground potential in another order or simultaneously. The potentials given may be any combination of potentials so long as they meet conditions for erasing a desired cell. The eleventh potential is a potential causing a sufficiently smaller change in the state of the charge in the charge storage layers in the non-selected cell than in the selected cell, for example, a potential such that a difference between the eleventh potential and the fourth potential causes only a sufficiently small F-N current in the tunnel oxide film of the memory transistor having, as the gate electrode, the third electrode (30-2) to which the eleventh potential is applied. Here, the same potential is preferably applied initially as the first potential to the first electrode 10, the third electrodes (30-1 to 30-2), and the fourth electrode 40, but different potentials may be applied.

Thereby the selected cell as shown in FIG. 126 is erased. In the above example, the erasing process has been described with the case where the selected cell is a memory cell having the third electrode (30-1) as the gate electrode. However, the erasing process is the same with the case where the selected cell is a memory cell having the third electrode (30-2) as the gate electrode.

Figure 245:
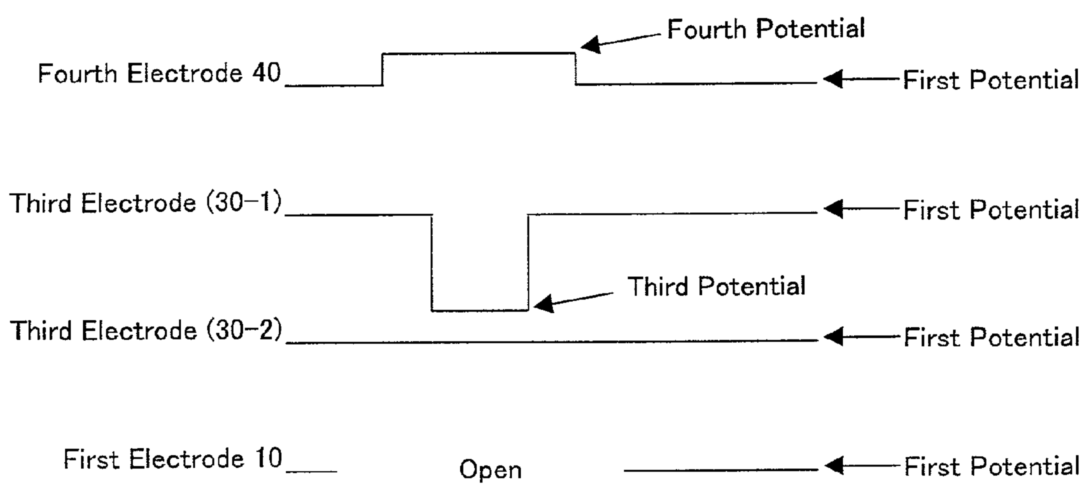

FIG. 245 shows a timing chart showing an example of timing of applying each potential for erasing data in the case where the first electrode is open in contrast to FIG. 245. The erasing process of FIG. 245 conforms to that of FIG. 244 except that the first electrode 10 is open and the ground potential is applied as the first potential to the non-selected electrode (30-2) and the fourth electrode 40. Also in FIG. 244, the selected cell as shown in FIG. 126 is erased as in FIG. 244. If −12 V is applied as the third potential to the third electrodes (30-1 to 30-2), a plurality of cells connected to the third electrodes (30-1 to 30-2) as shown in FIG. 127 are erased.

Figure 246:
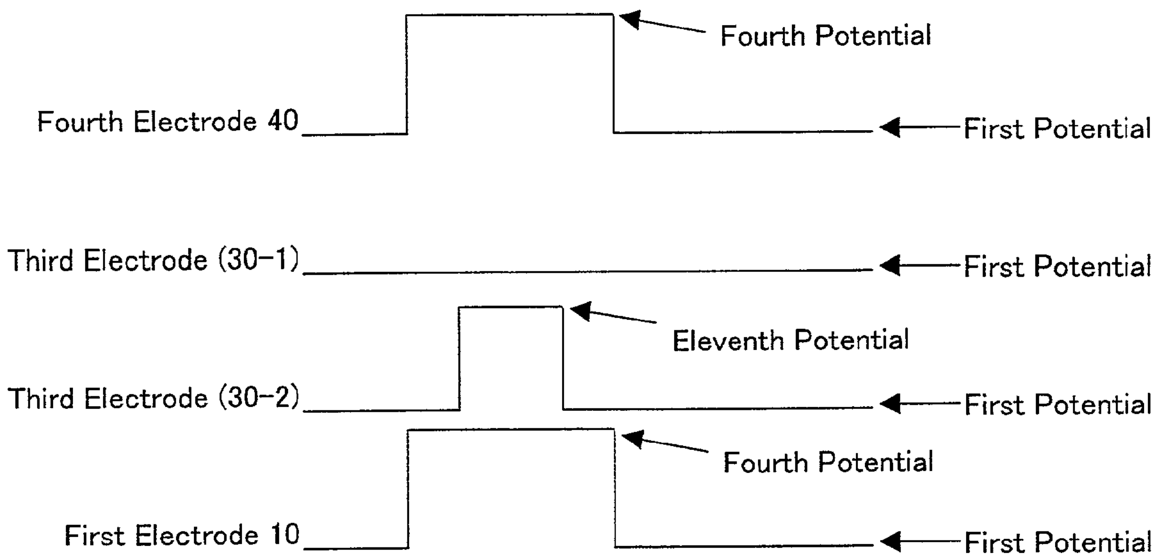

FIG. 246 shows a timing chart showing an example of timing of applying each potential for erasing data. In FIG. 246, the fourth potential, e.g., 18 V, is applied to the first electrode, and the memory cell has a threshold of 1.0 V to 3.5 V when it is in the written state and has a threshold of −1.0 V or lower when it is in the erased state. For drawing a negative charge from the charge storage layer, for example, a ground potential is applied as the first potential to the first electrode 10, the third electrodes (30-1 to 30-2) and the fourth electrode 40. In this state, the fourth potential, e.g., 18 V, is applied to the fourth electrode 40, the fourth potential, e.g., 18 V, is applied to the first electrode 10, the eleventh potential, e.g., 10 V, is applied to the third electrode (30-2), and the third potential, e.g., the ground potential which is the first potential, is kept applied to the third electrode (30-1). The selected cell is erased to “0” by sustaining this state for a desired period of time. The potentials may be applied to the respective electrodes in another order or simultaneously. The third electrode (30-2) is returned to the ground potential, i.e., the first potential, the fourth electrode 40 is returned to the ground potential, i.e., the first potential, and the first electrode 10 is returned to the ground potential, i.e., the first potential. The respective electrodes may be returned to the ground potential in another order or simultaneously. The potentials given may be any combination of potentials so long as they meet conditions for erasing a desired cell. Here, the same potential is preferably applied initially as the first potential to the first electrode 10, the third electrodes (30-1 to 30-2), and the fourth electrode 40, but different potentials may be applied. Thereby the selected cell as shown in FIG. 126 is erased.

In the above example, the erasing process has been described with the case where the selected cell is a memory cell having the third electrode (30-1) as the gate electrode. However, the erasing process is the same with the case where the selected cell is a memory cell having the third electrode (30-2) as the gate electrode.

Figure 127:
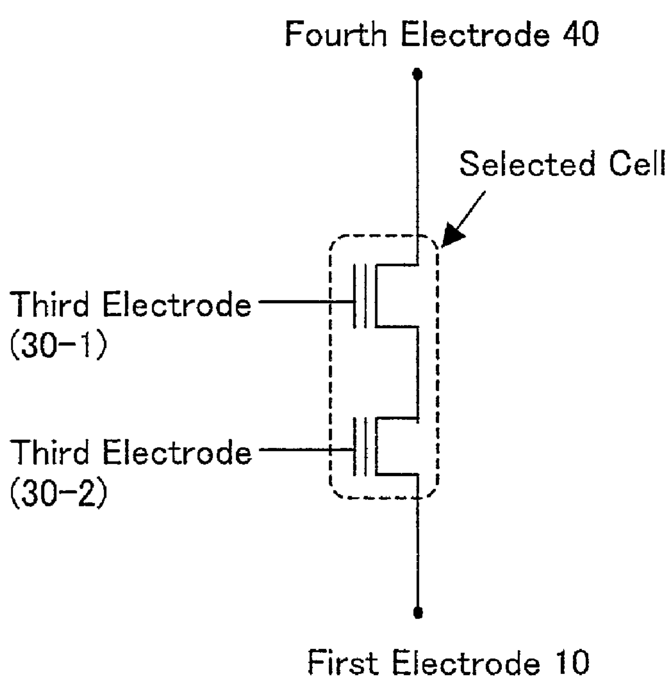
Figure 247:
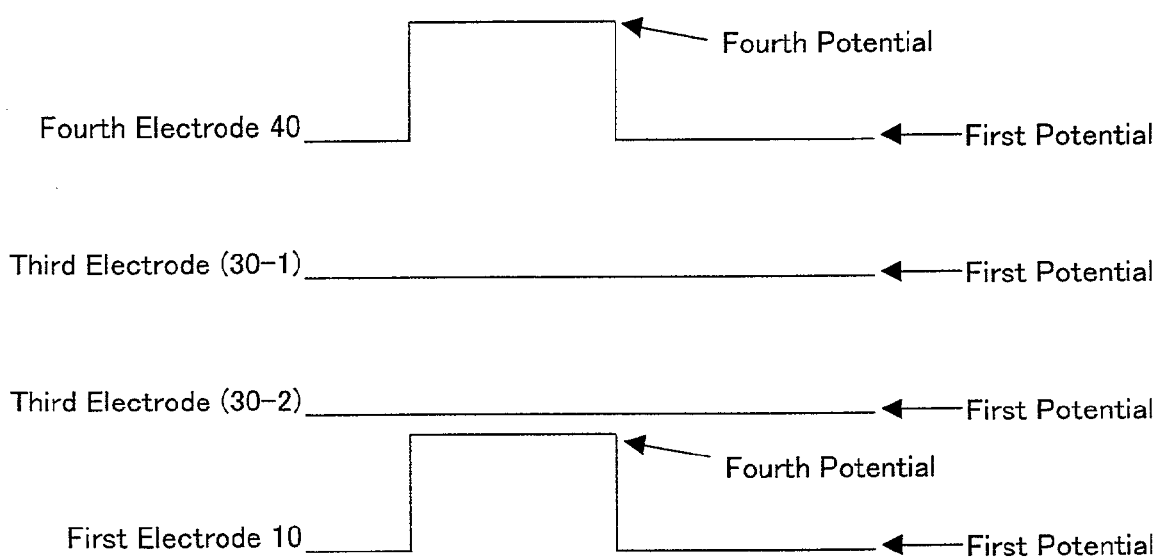

As shown in FIG. 247 illustrating a timing of applying each potential, if 18 V is applied as the third potential to the third electrodes (30-1 to 30-2), a plurality of cells connected to the third electrodes (30-1 to 30-2) as shown in FIG. 127 are erased.

Have been described above the examples of the principles of erasing data in the case of the island-like semiconductor layers having two memory cells formed of the P-type semiconductor and arranged in series. However, the polarity of all the electrodes may be reversed as in the case of island-like semiconductor layers formed of an N-type semiconductor. At this time, the potentials have a relationship in magnitude reverse to that mentioned above.

An erasing process is now explained with a semiconductor memory according to the present invention which is constructed to include a plurality of (e.g., M×N, wherein M and N are positive integers) island-like semiconductor layers each having, as selection gate transistors, a transistor provided with the second electrode as a gate electrode and a transistor provide with the fifth electrode as a gate electrode and a plurality of (e.g., L, wherein L is a positive integer) memory cells connected in series, the memory cells each provided with the charge storage layer between the selection gate transistors and the third electrode as a control gate electrode. In this memory cell array, a plurality of (e.g., M) fourth wires arranged in parallel with the semiconductor substrate are connected to end portions of the island-like semiconductor layers, and first wires are connected to opposite end portions of the island-like semiconductor layers. A plurality of (e.g., N×L) third wires are arranged in a direction crossing the fourth wires and are connected to the third electrodes of the memory cells. The erasing process utilizes the F-N current.

FIG. 128 shows an equivalent circuit diagram of the above-described memory cell array in which the first wires are arranged in parallel to the third wires. For example, in the case where the island-like semiconductor layers are formed of a P-type semiconductor, a selected cell shown in FIG. 128 is erased by applying a first potential to the first wire (1-j, wherein j is a positive integer, 1≦j≦N) connected to the first electrode connected to an island-like semiconductor layer including the selected cell, a ninth potential to first wires (not 1-j) other than the above-mentioned first wire (1-j), a second potential to a second wire (2-j) connected to the second electrode arranged in series with the selected cell, a third potential to a third wire (3-j-h, wherein h is a positive integer, 1≦h≦N) connected to the selected cell, a seventh potential to third wires (3-j-1 to 3-j-(h−1)) connected to non-selected cells arranged in series with the selected cell, an eleventh potential to third wires (3-j-(h+1) to 3-j-L) connected to non-selected cells arranged in series with the selected cell, a twelfth potential to third wires (not 3-j-1 to 3-j-L) not arranged in series with the selected cell, a fourth potential to a fourth wire (4-i, wherein i is a positive integer, 1≦i≦M) connected to the fourth electrode connected to the island-like semiconductor layer including the selected cell, an eighth potential to fourth wires (not 4-i) other than the above-mentioned fourth wire (4-i), a fifth potential to a fifth wire (5-j) connected to the fifth electrode arranged in series with the selected cell, and a sixth potential to at least either second wires (not 2-j) other than the second wire (2-j) or fifth wires (not 5-j) other than the fifth wire (5-j). The application of these potentials causes the F-N current to occur only in the tunnel oxide film of the selected cell to change the state of the charge in the charge storage layer. In the case where a negative charge is drawn from the charge storage layer for erasing data, for example, the fourth potential is larger than the third potential. Supposing that the "1" means that a negative charge is stored in the charge storage layer, the state of the charge in the charge storage layer is changed to the "0." At this time, the third potential is a potential allowing the change to "0" by the difference between the third potential and the fourth potential, that is, a potential allowing the occurrence of a sufficient F-N current as means for changing the state of the charge. The F-N current flows in the tunnel oxide film of a memory transistor having, as the gate electrode, the third electrode to which the third potential is applied. The seventh potential is a potential causing a sufficiently smaller change in the state of the charge in the charge storage layers in non-selected cells than in the selected cell, for example, a potential such that a difference between the seventh potential and the fourth potential causes only a sufficiently small F-N current in the tunnel oxide films of the memory transistors having, as the gate electrodes, the third electrodes connected to the third wires (30-j-1 to 30-j-(h−1)) to which the seventh potential is applied. The eleventh potential is a potential causing a sufficiently smaller change in the state of the charge in the charge storage layers in non-selected cells than in the selected cell, for example, a potential such that a difference between the eleventh potential and the fourth potential causes only a sufficiently small F-N current in the tunnel oxide films of the memory transistors having, as the gate electrodes, the third electrodes connected to the third wires (30-j-(h+1) to 30-j-L) to which the eleventh potential is applied. The second potential is a potential not allowing the F-N current to flow in the gate oxide film of the transistor having, as the gate electrode, the second electrode connected to the second wire. The fifth potential is a potential not allowing the F-N current to flow in the gate oxide film of the transistor having, as the gate electrode, the fifth electrode connected to the fifth wire. The sixth potential, as the second potential and the fifth potential, is a potential not allowing the F-N current to flow in the gate oxide film of the transistor having the second or fifth electrode as the gate electrode. The eighth potential is preferably a potential equal to the fourth or ninth potential applied to the terminal connected via an island-like semiconductor layer. The twelfth potential is a potential causing a sufficiently smaller change in the state of the charge in the charge storage layers in non-selected cells than in the selected cell, for example, a potential such that a difference between the twelfth potential and the eighth potential and a difference between the twelfth potential and the fourth potential cause only a sufficiently small F-N current in the tunnel oxide films of the memory transistors having, as the gate electrodes, the third electrodes connected to the third wires (not 3-j-1 to 30-j-L) to which the twelfth potential is applied.

The first wires (1-1 to 1-M) may be open and the ninth potential may be open. In the case where the first wires (1-1 to 1-N) are formed as impurity diffusion layers in the semiconductor substrate and the channel region of a selected memory cell is electrically connected to the semiconductor substrate when the potential of the first wires (1-1 to 1-N) is floating, the fourth potential applied to the first wire (1-j) connected to the island-like semiconductor layer including the selected cell is a potential such that the island-like semiconductor layer and the semiconductor substrate are electrically floated by a depletion layer extended toward the semiconductor substrate owing to the application of the fourth potential. Thereby the potential of the island-like semiconductor layer equals the fourth potential and a sufficiently large F-N current flows in the tunnel oxide film of the memory transistor of the selected cell on the island-like semiconductor layer, so that data is erased. That is, the difference between the fourth potential and the third potential becomes a potential difference allowing a sufficient F-N current to flow in the tunnel oxide film of the memory transistor. In the case where the channel region of the memory cell is not electrically connected to the semiconductor substrate, the depletion layer owing to the fourth potential may have any extension.

In the case where the first wires (1-1 to 1-N) are formed to be electrically insulated from the semiconductor substrate, for example, where the first wires (1-1 to 1-N) are formed of an impurity diffusion layer in an SOI substrate and is insulated from the semiconductor substrate by an insulating film, the first potential is not necessarily the same as the tenth potential.

In the case where the channel region of a selected memory cell is electrically connected to the semiconductor substrate, for example, in the case where impurity diffusion layers do not render the island-like semiconductor layers in the floating state from the substrate, the tenth potential applied to the semiconductor substrate can erase simultaneously all memory cells having as the gate electrodes the third electrodes to which the third potential is applied, provided that a difference between the tenth potential and the third potential causes a sufficient change in the state of the charge in the charge storage layer.

The memory cells may be sequentially erased from a memory cell connected to a third wire (3-j-L) to a memory cell connected to a third electrode (3-j-1), or may be erased in reverse order or at random. Further, some or all memory cells connected to the third wire (3-j-h) may be erased at the same time, some or all memory cells connected to the third wires (3-j-1 to 3-j-L) may be erased at the same time, and some or all memory cells connected to the third wires (3-1-1 to 3-N-L) may be erased at the same time. Also, some or all memory cells connected to third wires selected regularly, e.g., the third wires (3-(j−8)-h), (3-j-h), (3-(j+8)-h), (3-(j+16)-h), . . . , may be erased at the same time. Further some or all memory cells of one island-like semiconductor layer connected to the fourth wire (4-i) may be erased at the same time, or some or all memory cells of some or all island-like semiconductor layers connected to the fourth wire (4-i) may be erased at the same time. One, some or all memory cells of one island-like semiconductor layer connected to each of a plurality of fourth wires may be erased at the same time, or some or all memory cells of some or all island-like semiconductor layers connected to each of a plurality of fourth wires may be erased at the same time.

The memory cells connected to the third wire (3-j-h) may be erased at the same time by given intervals, for example, every eight fourth wires (e.g., a fourth wire (4-(i−16)), a fourth wire (4-(i−8)), a fourth wire (4-i), a fourth wire (4-(i+8)), a fourth wire (4-(i+16)), . . . ). All the memory cells having, as the gate electrodes, the third electrodes connected to the third wire (3-j-h) can be erased at the same time by applying the first potential to all the fourth wires, applying the fourth potential to the first wire (1-j) and the eighth potential to the first wires (not 1-j), exchanging the potentials of the second and fifth wires and applying the third potential to the third wire (3-j-h). At this time, the fourth potential may optionally be applied to the fourth wire. Further, by applying the fourth potential to a plurality of first wires and applying the third potential to the third wires connected to the third electrodes of the memory cells included in the island-like semiconductor layers having the first electrodes connected to said plurality of first wires, all the memory cells having, as gate electrodes, the third electrodes connected to the third wires to which the third potential is applied can be erased at the same time. The above-described erasing processes may be combined.

Erasure may be defined as changing the state of the charge in the charge storage layer and raising the threshold of the selected memory transistor. In this case, the third potential is large than the fourth potential, and the third potential is a potential allowing the state of the charge in the charge storage layer to be changed sufficiently by the difference between the third potential and the fourth potential, for example, a potential allowing the occurrence of a sufficient F-N current. Means for changing the state of the charge in the charge storage layer is not limited to the F-N current.

Figure 129:
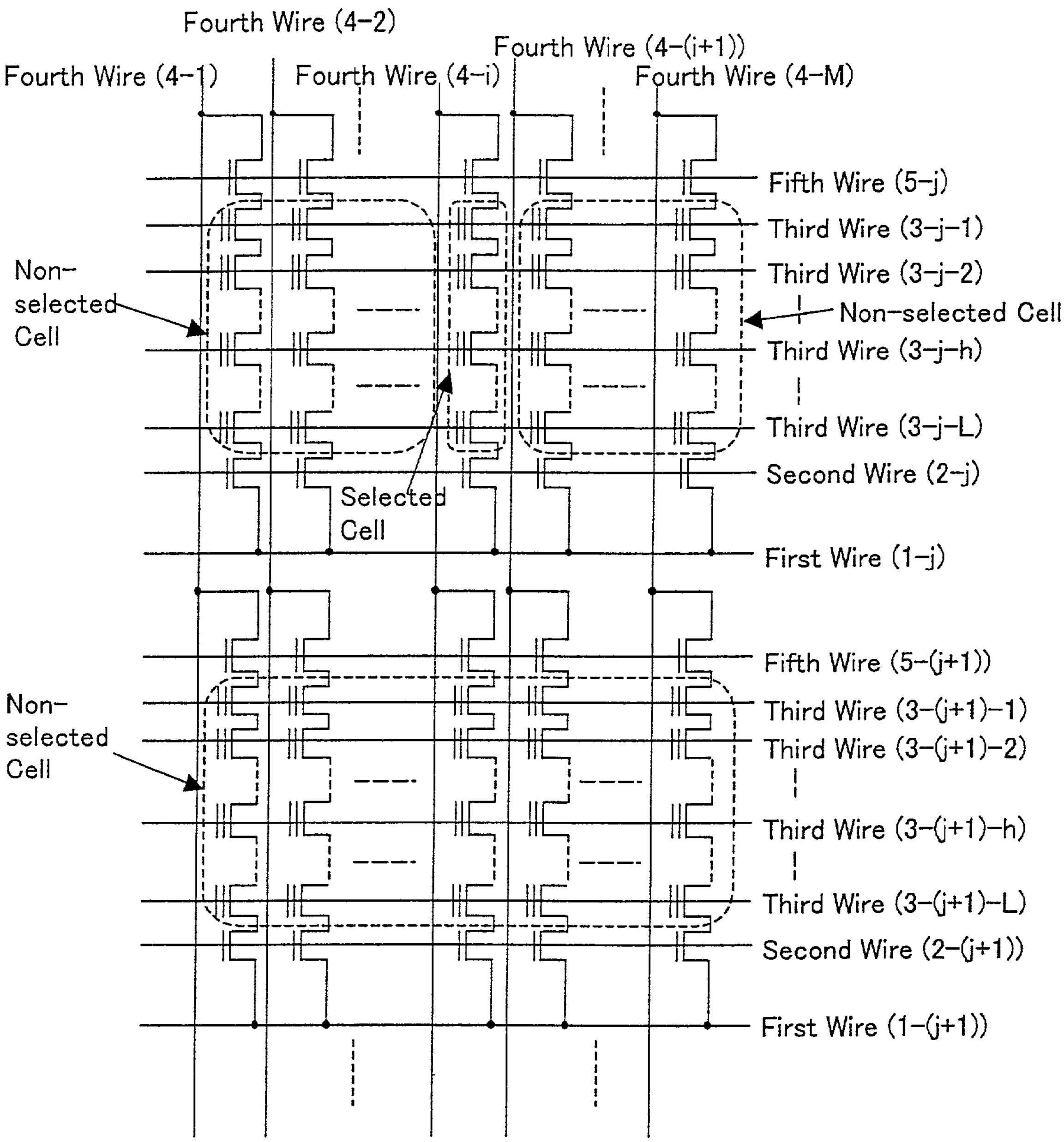

FIG. 129 shows an equivalent circuit diagram of a memory cell array in which the first wires are arranged in parallel to the third wires. All memory cells on an island-like semiconductor layer defined by the first wire (1-j) and the fourth wire (4-i) can be selected and erased. The application of the potentials of FIG. 129 is the same as that of FIG. 128 except that the third potential is applied to the third wires (3-j-1 to 3-j-L).

Figure 130:
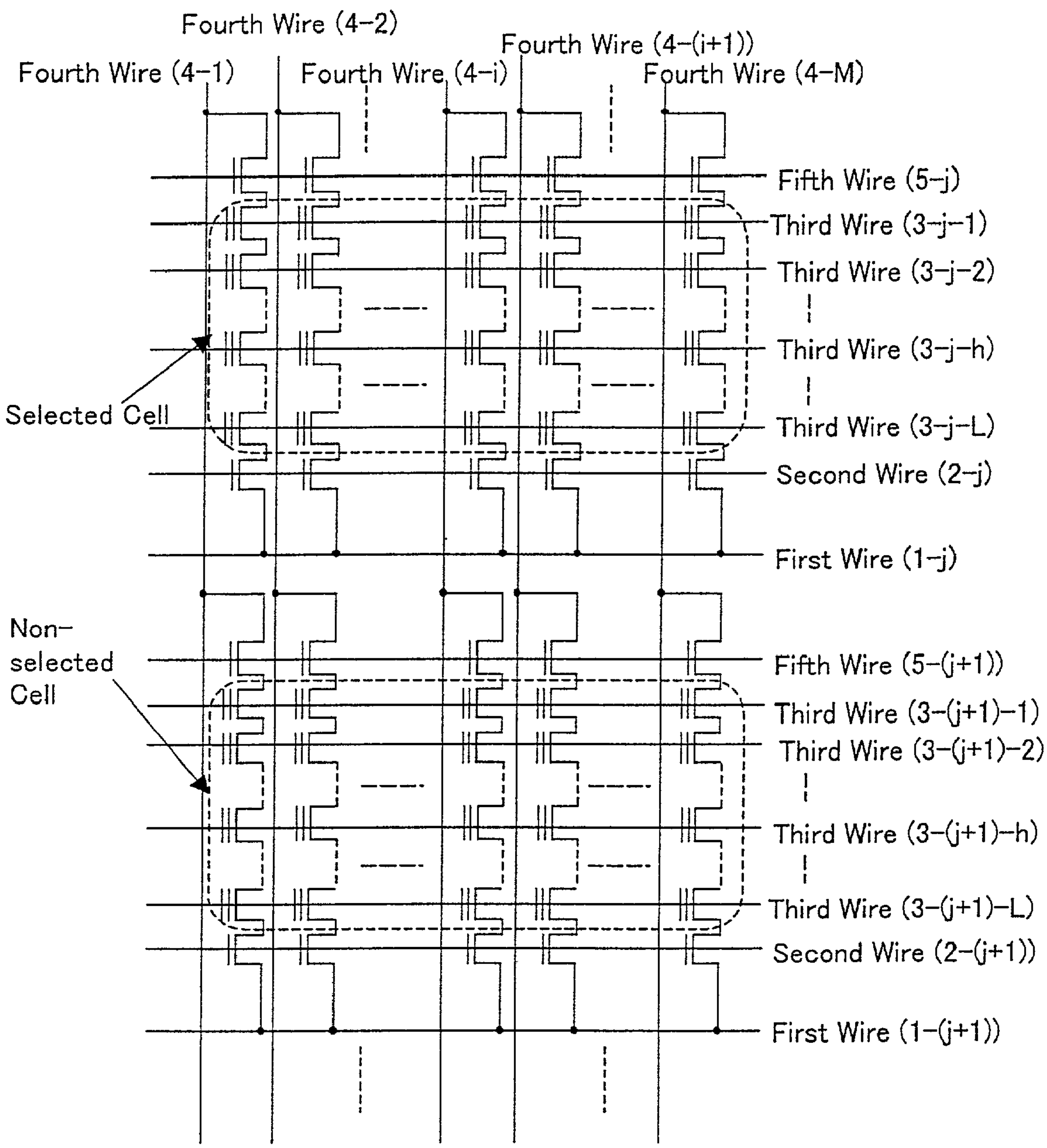

FIG. 130 shows an equivalent circuit diagram of a memory cell array in which the first wires are arranged in parallel to the third wires. All memory cells on all island-like semiconductor layers connected to the first wire (1-j) can be selected and erased. The application of the potentials of FIG. 130 is the same as that of FIG. 128 except that the third potential is applied to the third wires (3-j-1 to 3-j-L) and the fourth potential is applied to the fourth wires (4-1 to 4-M).

Figure 131:
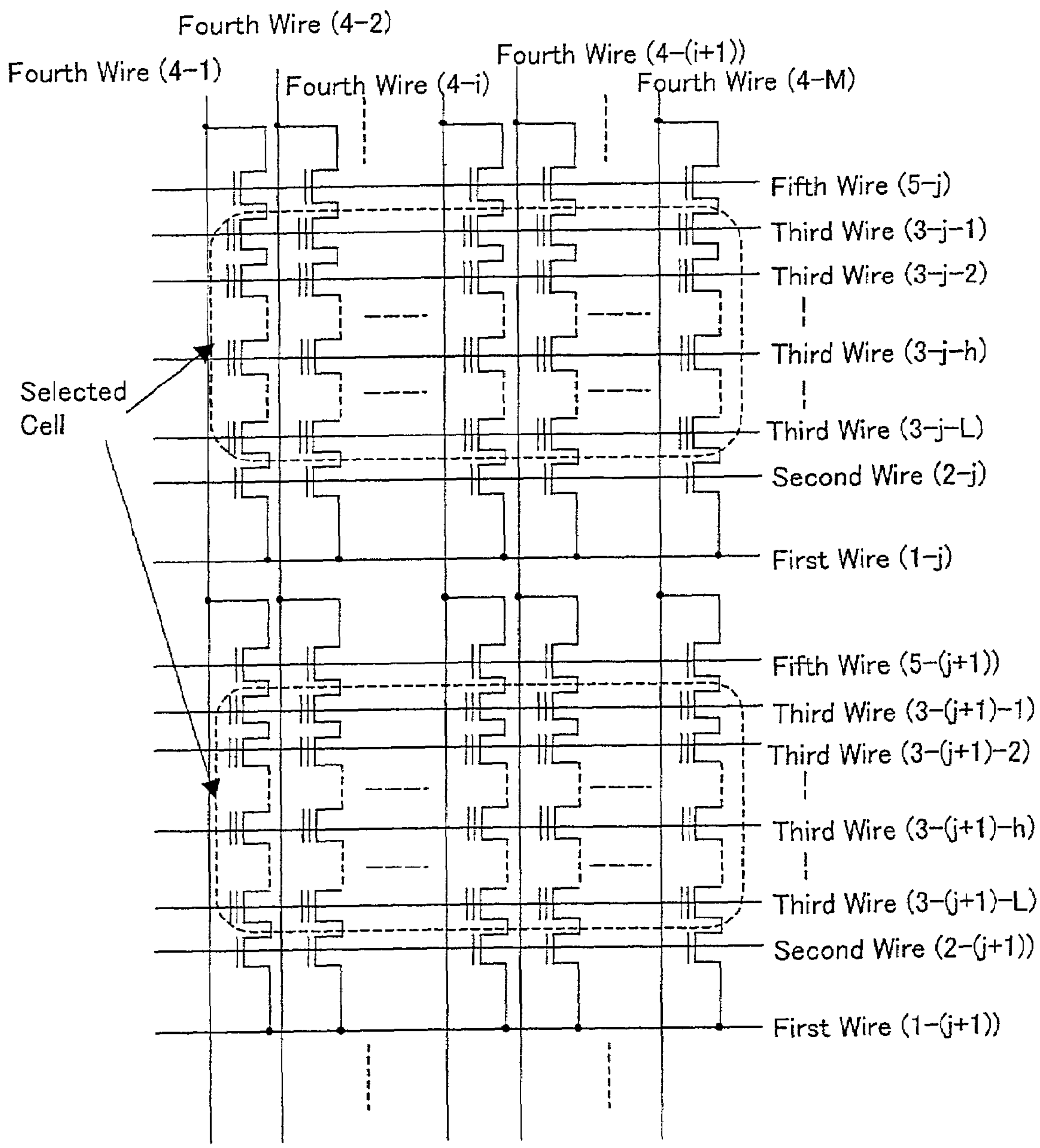

FIG. 131 shows an equivalent circuit diagram of a memory cell array in which the first wires are arranged in parallel to the third wires. All memory cells on all island-like semiconductor layers connected to the first wires (1-1 to 1-N) can be selected and erased. The application of the potentials of FIG. 131 is the same as that of FIG. 128 except that the fourth potential is applied to the first wires (1-1 to 1-N), the third potential is applied to the third wires (3-j-1 to 3-N-L) and the fourth potential is applied to the fourth wires (4-1 to 4-M).

FIG. 133 shows an equivalent circuit diagram of a memory cell array in which the first wires are arranged in parallel to the fourth wires. The application of the potentials of FIG. 133 is the same as that of FIG. 128 except that the fourth potential is applied to the first wire (1-i) and the ninth potential is applied to first wires (not 1-i).

Figure 134:
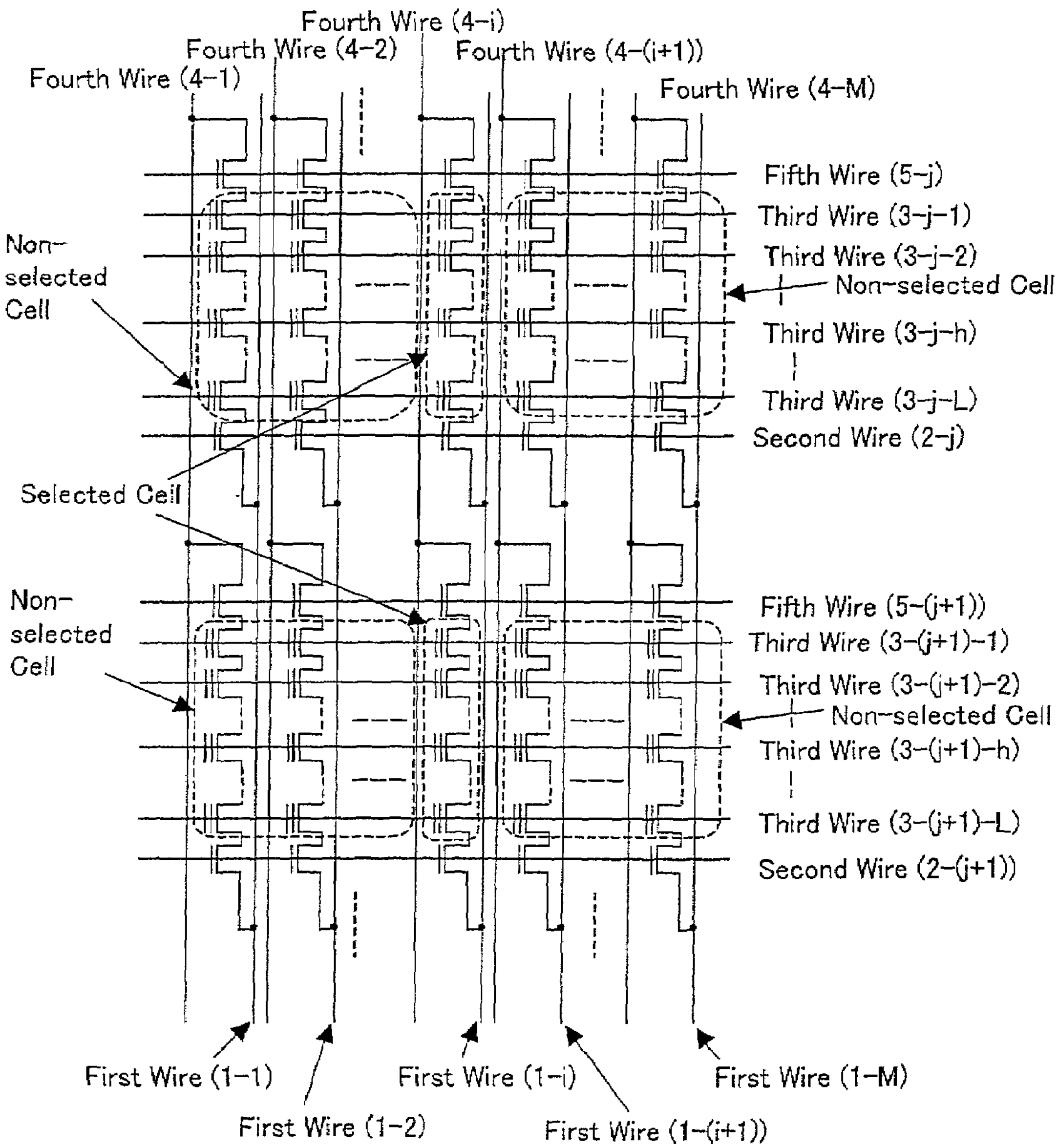

FIG. 134 shows an equivalent circuit diagram of a memory cell array in which the first wires are arranged in parallel to the fourth wires. All memory cells on an island-like semiconductor layer defined by the first wire (1-i) and the fourth wire (4-i) can be selected and erased. The application of the potentials of FIG. 134 is the same as that of FIG. 128 except that the third potential is applied to the third wires (3-j-1 to 3-N-L).

FIG. 135 shows an equivalent circuit diagram of a memory cell array in which a plurality of first wires are electrically connected in common. The application of the potentials of FIG. 135 is the same as that of FIG. 128 except that the fourth potential is applied to the first wire (1-i).

Figure 136:
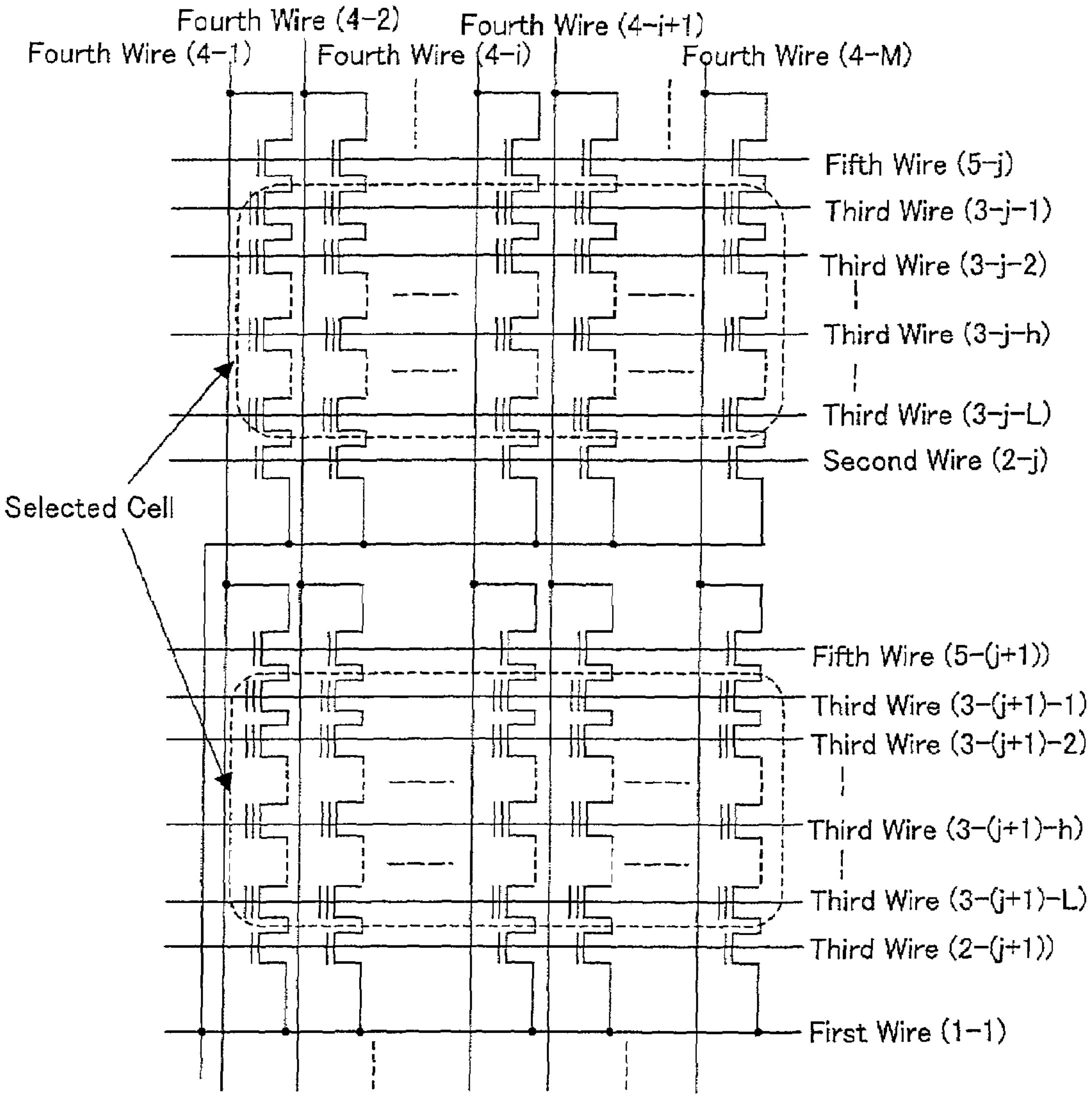

FIG. 136 shows an equivalent circuit diagram of a memory cell array in which a plurality of first wires are electrically connected in common. All memory cells on all island-like semiconductor layers connected to the first wire (1-1) can be selected and erased. The application of the potentials of FIG. 136 is the same as that of FIG. 135 except that the fourth potential is applied to the first wire (1-1), the third potential is applied to the third wires (3-j-1 to 3-(j+1)-L) and the fourth potential is applied to the fourth wires (4-1 to 4-M).

Figure 137:
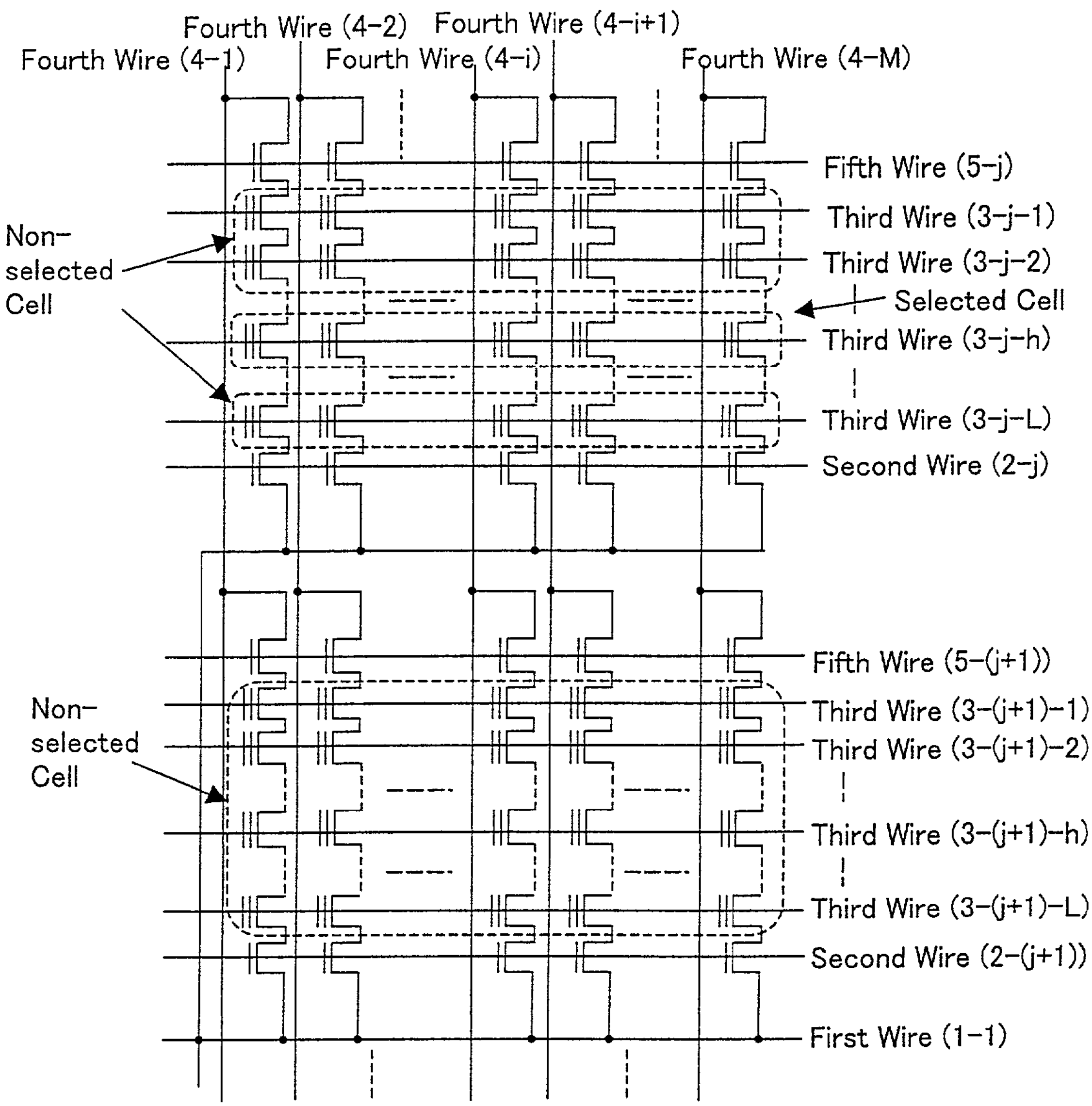

FIG. 137 shows an equivalent circuit diagram of a memory cell array in which a plurality of first wires are electrically connected in common. All memory cells connected to the third wire (3-j-h) can be selected and erased. The application of the potentials of FIG. 137 is the same as that of FIG. 135 except that the fourth potential is applied to the first wire (1-1), the third potential is applied to the third wire (3-j-h) and the fourth potential is applied to the fourth wires (4-1 to 4-M).

Have been described the examples of applying the potentials for erasing data. Now are described examples of timing charts for applying potentials for erasing data in the case where there are arranged M×N (M and N are positive integers) island-like semiconductor layers having a plurality of (e.g., L, L is a positive integer) memory cells formed of the P-type semiconductor and arranged in series and selection transistors formed to sandwich the memory cells therebetween, the first wires and the third wires are arranged in parallel and the selected cell is a memory cell having the selected third electrode as the gate electrode.

Figure 132:
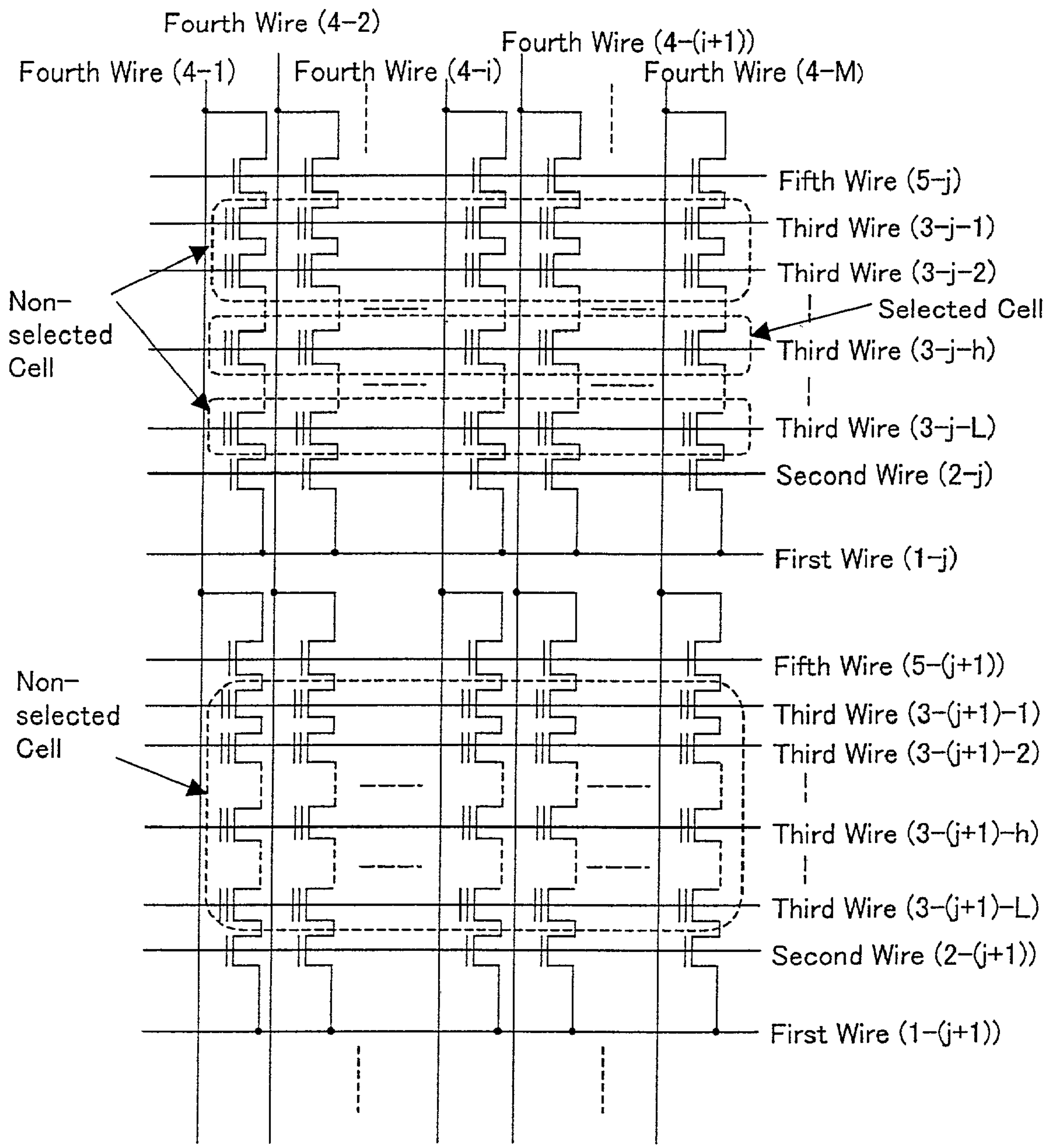
Figure 248:
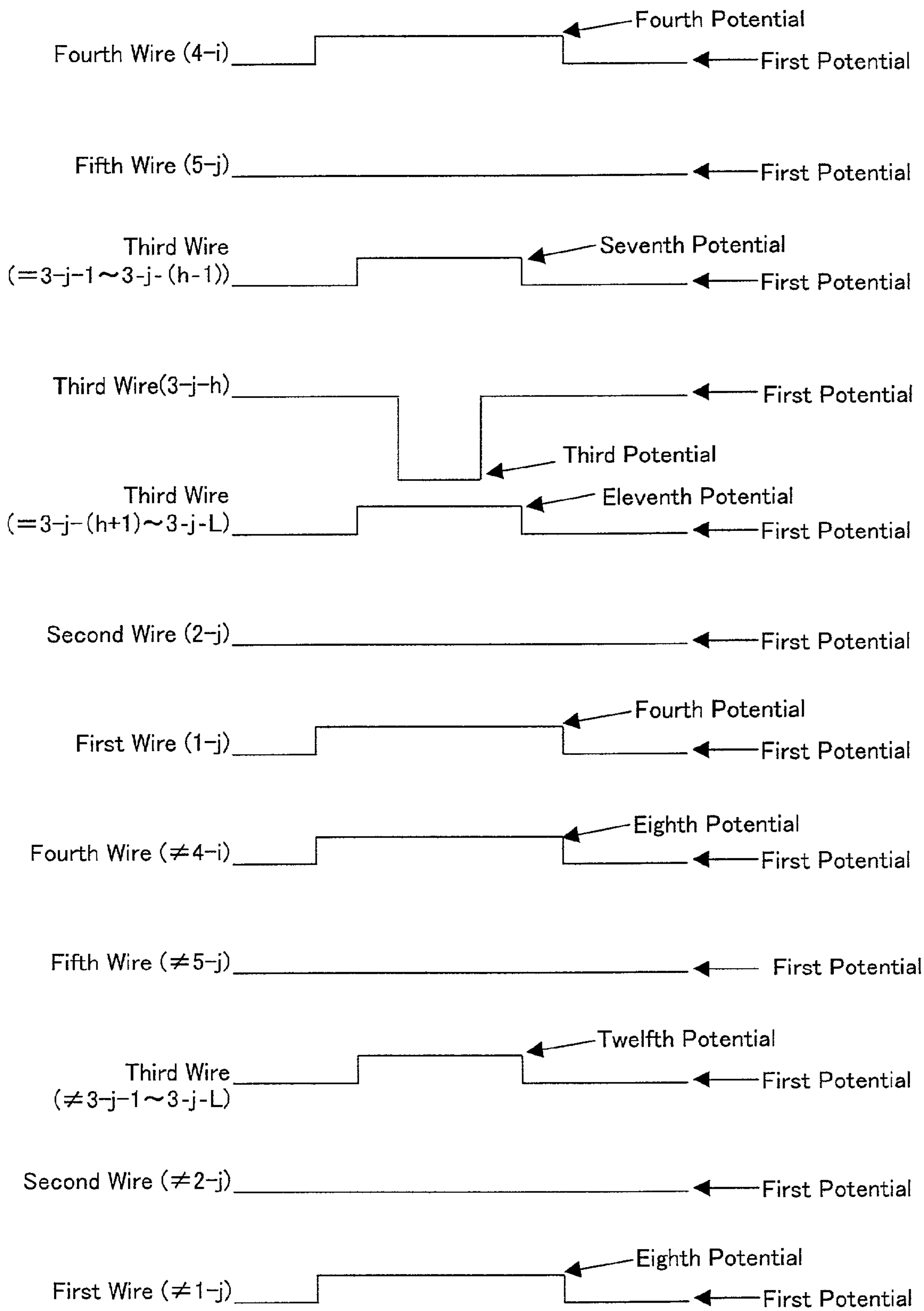

FIG. 248 shows a timing chart showing an example of timing of applying each potential for erasing data. In FIG. 248, a selected third electrode as shown in FIG. 132 is negative-biased, the threshold of transistors having gate electrodes connected to the second wire and the fifth wire is 0.5 V, for example, and the memory cell has a threshold of 1.0 V to 3.5 V when it is in the written state and has a threshold of −1.0 V or lower when it is in the erased state. For drawing a negative charge from the charge storage layer, for example, a ground potential is applied as the first potential to the first wires (1-1 to 1-N), the second wires (2-1 to 2-N), the third wires (3-1-1 to 3-N-L), the fourth wires (4-1 to 4-M) and the fifth wires (5-1 to 5-N). In this state, the eighth potential, e.g., 6 V which is equal to the fourth potential, is applied to first wires (not 1-j) other than the first wire (1-j), the eighth potential, e.g., 6 V which is equal to the fourth potential, is applied to fourth wires (not 4-i) other than the fourth wire (4-i), the fourth potential, e.g., 6 V, is applied to the first wire (1-j), the fourth potential, e.g., 6 V, is applied to the fourth wire (4-i), the seventh potential, e.g., 6 V, is applied to third wires (3-j-1 to 3-j-(h−1)) (h is a positive integer, 1≦h≦L) other than the third wire (3-j-h), the eleventh potential, e.g., 6 V, is applied to third wires (3-j-(h+1) to 3-j-L) (h is a positive integer, 1≦h≦L), the twelfth potential, e.g., 6 V, is applied to third wires (not 3-j-1 to 3-j-L) other than mentioned above, and the third potential, e.g., 12 V, is applied to the third wire (3-j-h). The selected cell is erased to "0" by sustaining this state for a desired period of time. The potentials may be applied to the respective wires in another order or simultaneously. The third wire (3-j-h) is returned to the ground potential, i.e., the first potential, the third wires (not 3-j-h) other than the third wire (3-j-h) are returned to the ground potential, i.e., the first potential, the fourth wires (4-1 to 4-M) are returned to the ground potential, i.e., the first potential, and the first wires (1-1 to 1-N) are returned to the ground potential, i.e., the first potential. The respective electrodes may be returned to the ground potential in another order or simultaneously. The potentials given may be any combination of potentials so long as they meet conditions for erasing a desired cell.

Here, the same potential is preferably applied initially as the first potential to the first wires (1-1 to 1-N), the second wires (2-1 to 2-N), the third wires (3-1-1 to 3-N-L), the fourth wires (4-1 to 4-M) and the fifth wires (5-1 to 5-N), but different potentials may be applied.

Thereby a plurality of cells connected to the selected third wire as shown in FIG. 132 are erased. In the above example, the erasing process has been described with the case where the selected cell is a memory cell having the third wire (3-j-h) as the gate electrode. However, the erasing process is the same with the case where the selected cell is a memory cell having a third wire other than the third wire (3-j-h) as the gate electrode.

Figure 249:
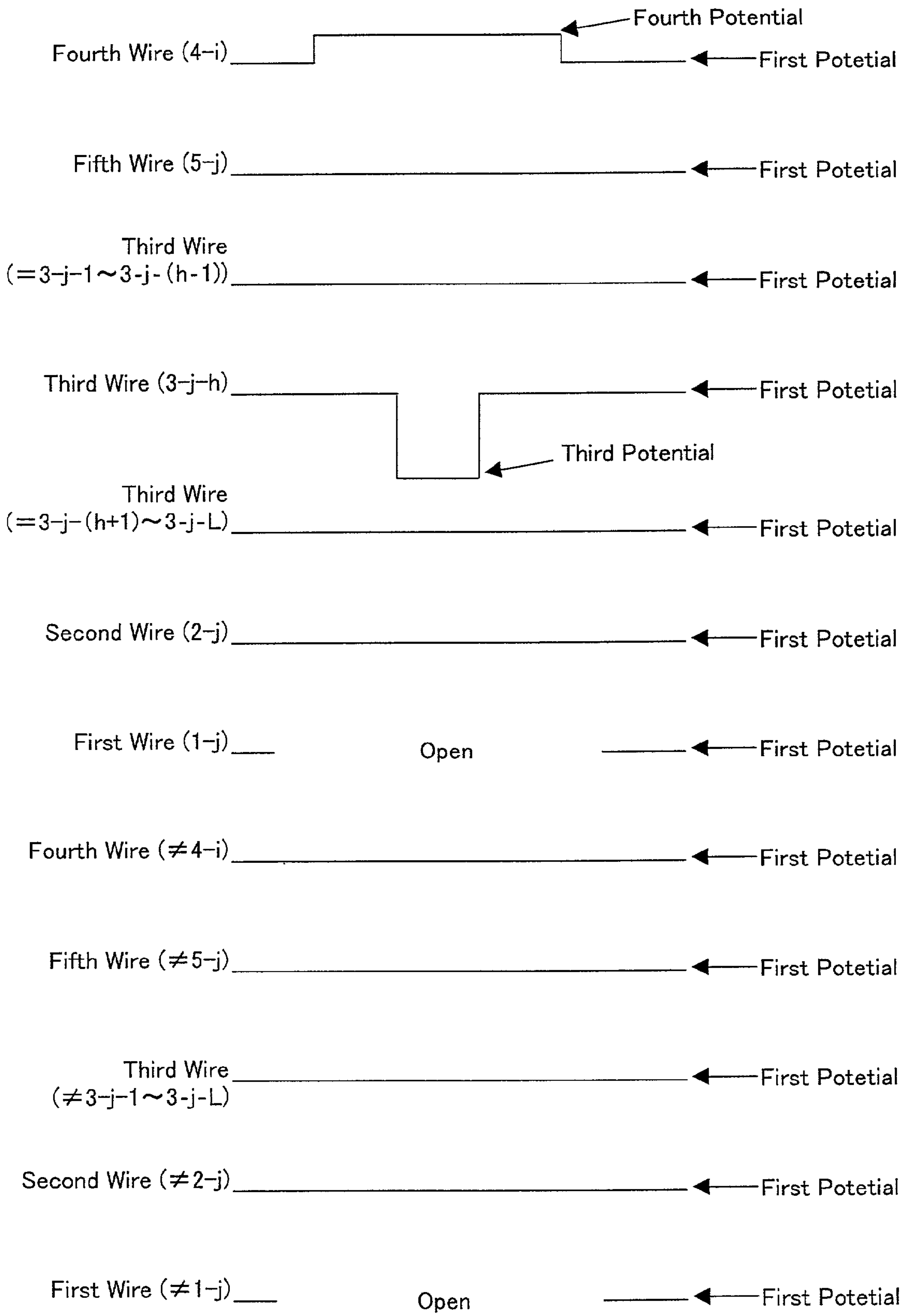

FIG. 249 shows a timing chart showing an example of timing of applying each potential for erasing data in the case where the first wire is open in contrast to FIG. 248. The erasing process of FIG. 249 conforms to that of FIG. 248 except that the first electrode 10 is open and the ground potential is applied as the first potential to the non-selected third wires (not 3-i-h) (h is a positive integer, 1≦h≦L) and the fourth wires (not 4-i). Also in FIG. 249, the selected cell as shown in FIG. 128 is erased as in FIG. 248.

If 6 V is applied as the eighth potential to the fourth wires (not 4-i), a plurality of cells connected to the elected third wire as shown in FIG. 132 are erased. If 6 V is applied as the eighth potential to the fourth wires (not 4-i) and −12 V is applied as the third potential to the third wires (3-i-1 to 3-i-(h−1))and the third wires (3-i-(h+1) to 3-i-L), a plurality of cells connected to the first wire (1-j) as shown in FIG. 130 are erased. If 6 V is applied as the fourth potential to all the fourth wires (4-1 to 4-M) and −12 V is applied as the third potential to all the third wires (3-1-1 to 3-N-L), all cells as shown in FIG. 131 are erased.

Figure 250:
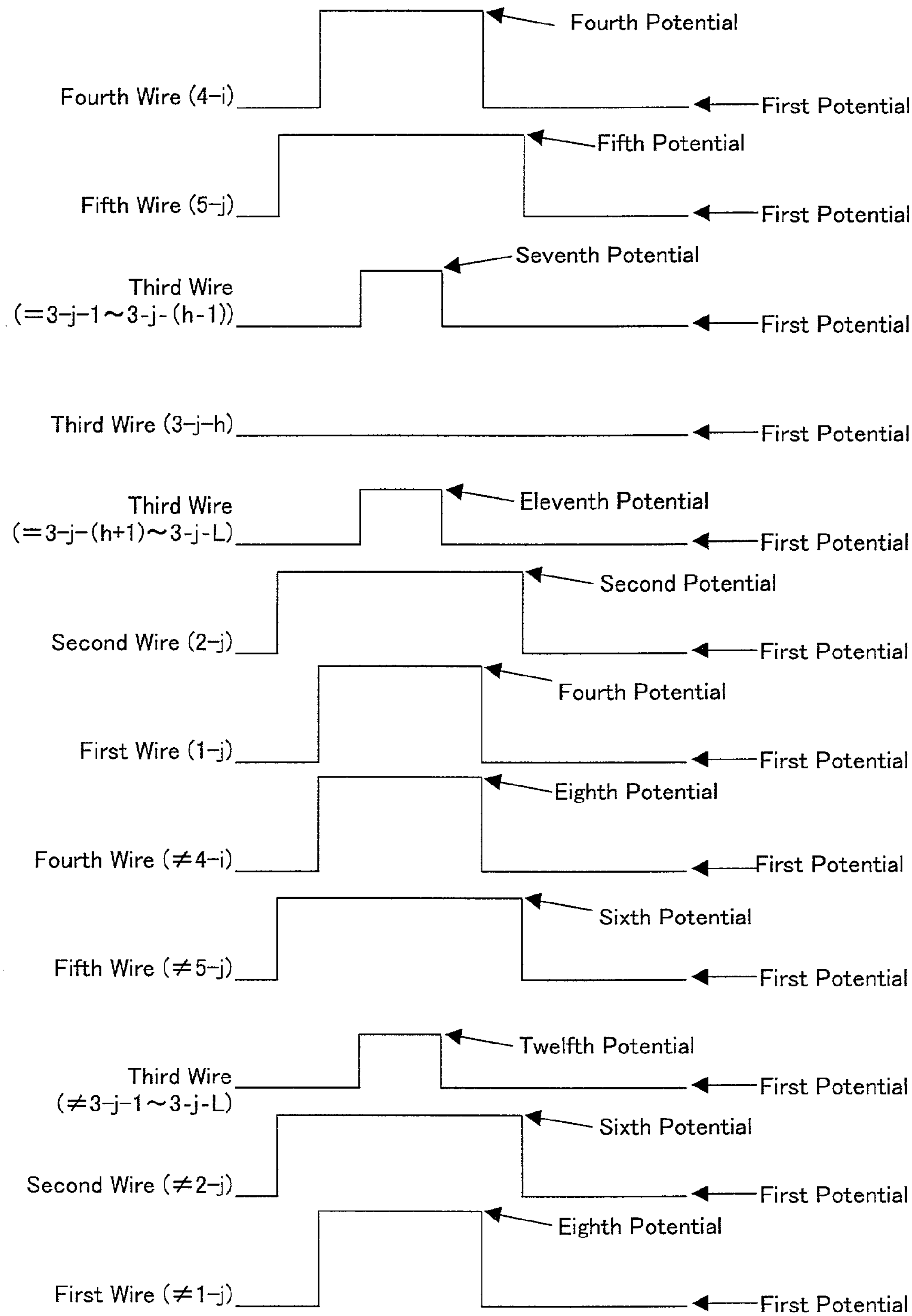

FIG. 250 shows a timing chart showing an example of timing of applying each potential for erasing data. In FIG. 250, 18 V for example is applied as the fourth potential and the ninth potential to the first wire, the threshold of transistors having gate electrodes connected to the second wire and the fifth wire is 0.5 V, for example, and the memory cell has a threshold of 1.0 V to 3.5 V when it is in the written state and has a threshold of −1.0 V or lower when. it is in the erased state. For drawing a negative charge from the charge storage layer, for example, a ground potential is applied as the first potential to the first wires (1-1 to 1-N), the second wires (2-1 to 2-N), the third wires (3-1-1 to 3-N-L), the fourth wires (4-1 to 4-M) and the fifth wires (5-1 to 5-N). In this state, the sixth potential, e.g., 18 V, is applied to second wires (not 2-j) and fifth wires (not 5-j), the second potential, e.g., 18 V, is applied to the second wire (2-j), the fifth potential, e.g., 18 V, is applied to the fifth wire (5-j), the eighth potential, e.g., 18 V which is equal to the fourth potential, is applied to fourth wires (not 4-i) other than the fourth wire (4-i), the eighth potential, e.g., 18 V which is equal to the fourth potential, is applied to first wires (not 1-j) other than the first wire (1-j), the fourth potential, e.g., 18 V, is applied to the fourth wire (4-i), the fourth potential, e.g., 18 V, is applied to the first wire (1-j), the seventh potential, e.g., 10 V, is applied to third wires (3-j-1 to 3-j-(h−1)) (h is a positive integer, 1≦h≦L) other than the third wire (3-j-h), the eleventh potential, e.g., 10 V, is applied to third wires (3-j-(h+1) to 3-j-L) (h is a positive integer, 1≦h≦L), the twelfth potential, e.g., 10 V, is applied to third wires (not 3-j-1 to 3-j-L) other than mentioned above, and the third potential, e.g., the ground potential which is the first potential, is kept applied to the third wire (3-j-h). The selected cell is erased to "0" by sustaining this state for a desired period of time. The potentials may be applied to the respective wires in another order or simultaneously. The third wires (not 3-j-h) other than the third wire (3-j-h) are returned to the ground potential, i.e., the first potential, the fourth wires (4-1 to 4-M) are returned to the ground potential, i.e., the first potential, the first wires (1-1 to 1-N) are returned to the ground potential, i.e., the first potential, and the second wires (2-1 to 2-N) and the fifth wires (5-1 to 5-N) are returned to the ground potential, i.e., the first potential. The respective electrodes may be returned to the ground potential in another order or simultaneously. The potentials given may be any combination of potentials so long as they meet conditions for erasing a desired cell. Here, the same potential is preferably applied initially as the first potential to the first wires (1-1 to 1-N), the second wires (2-1 to 2-N), the third wires (3-1-1 to 3-N-L), the fourth wires (4-1 to 4-M) and the fifth wires (5-1 to 5-N), but different potentials may be applied.

Figure 251:
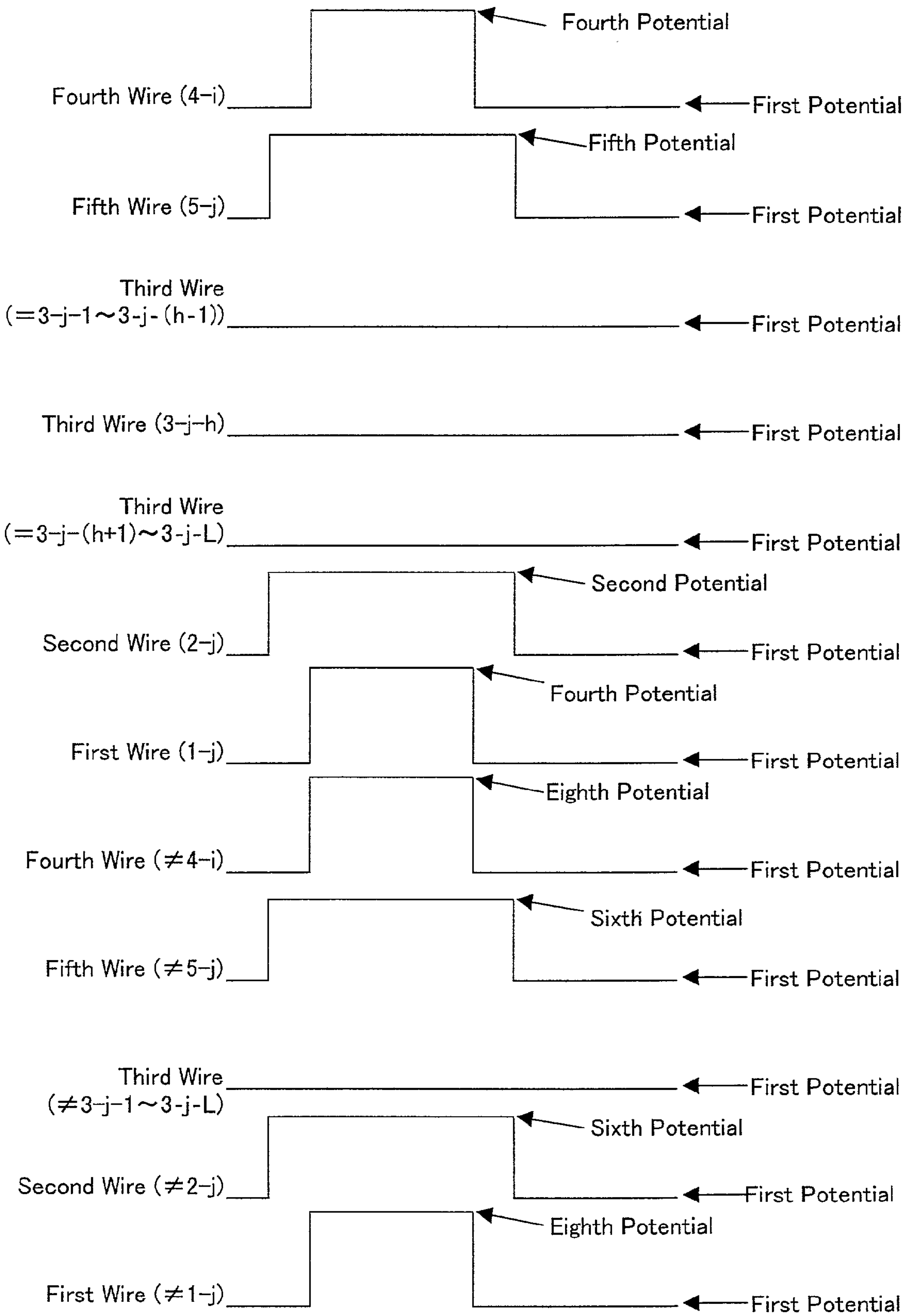
Figure 252:
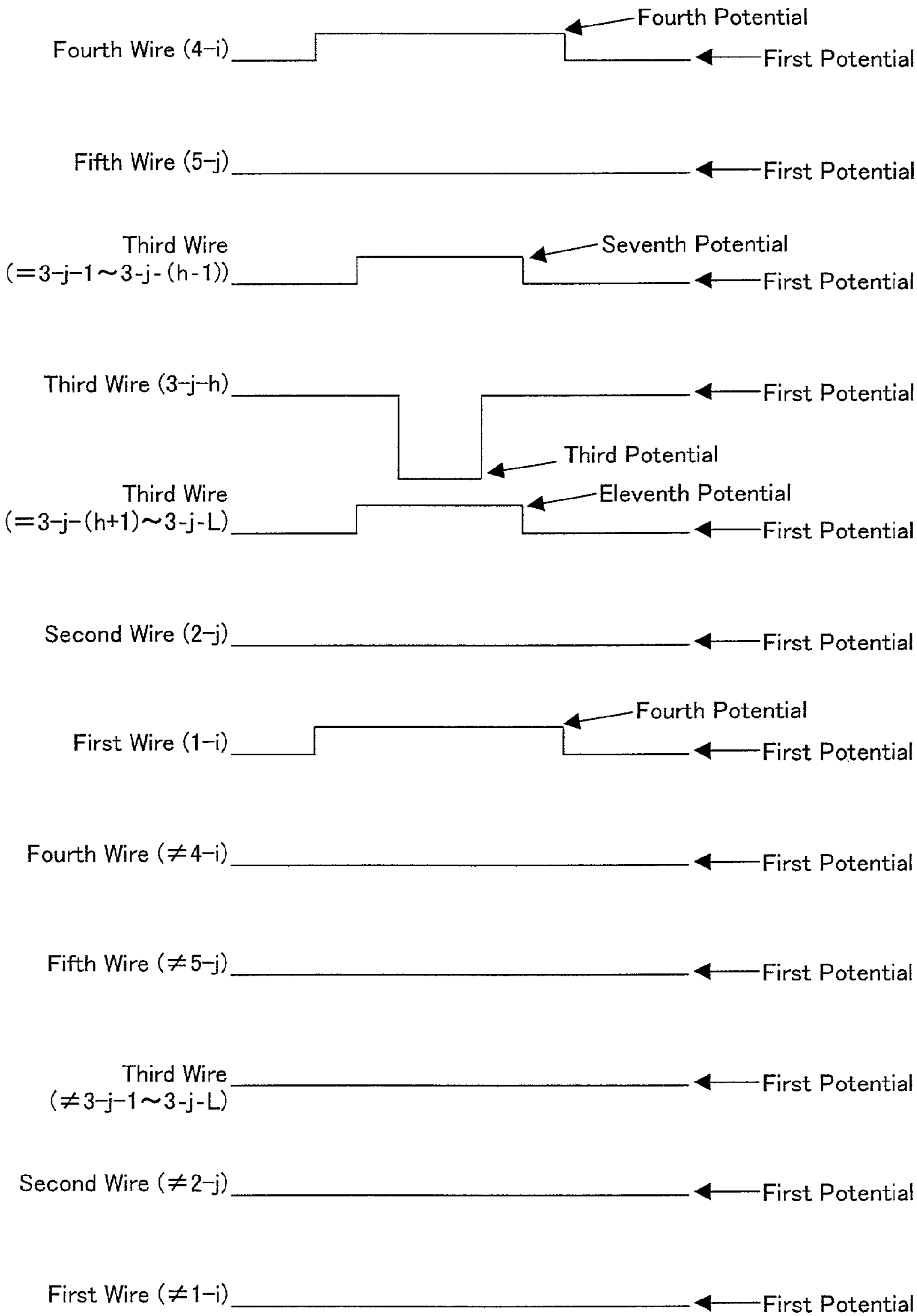
Figure 253:
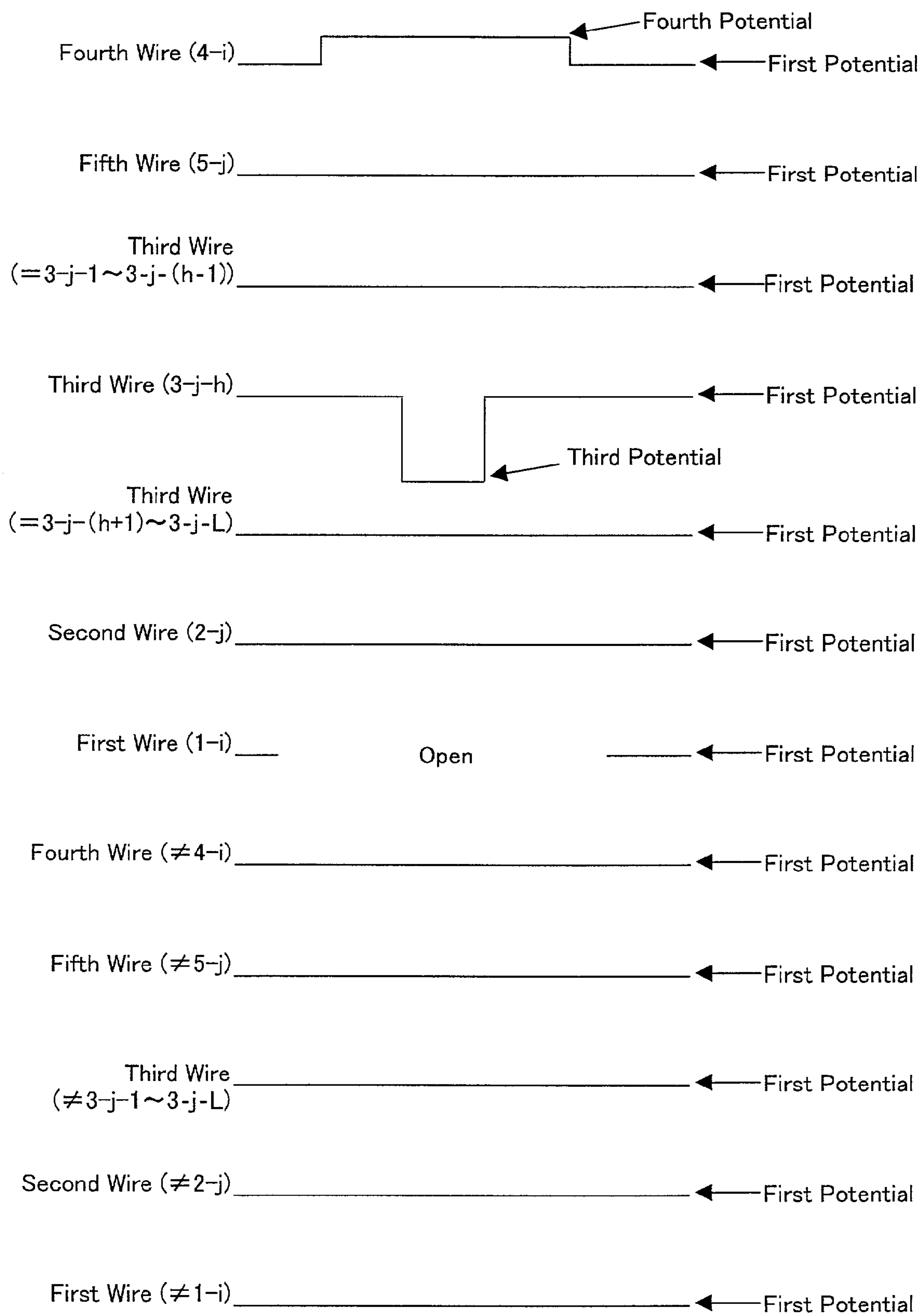
Figure 254:
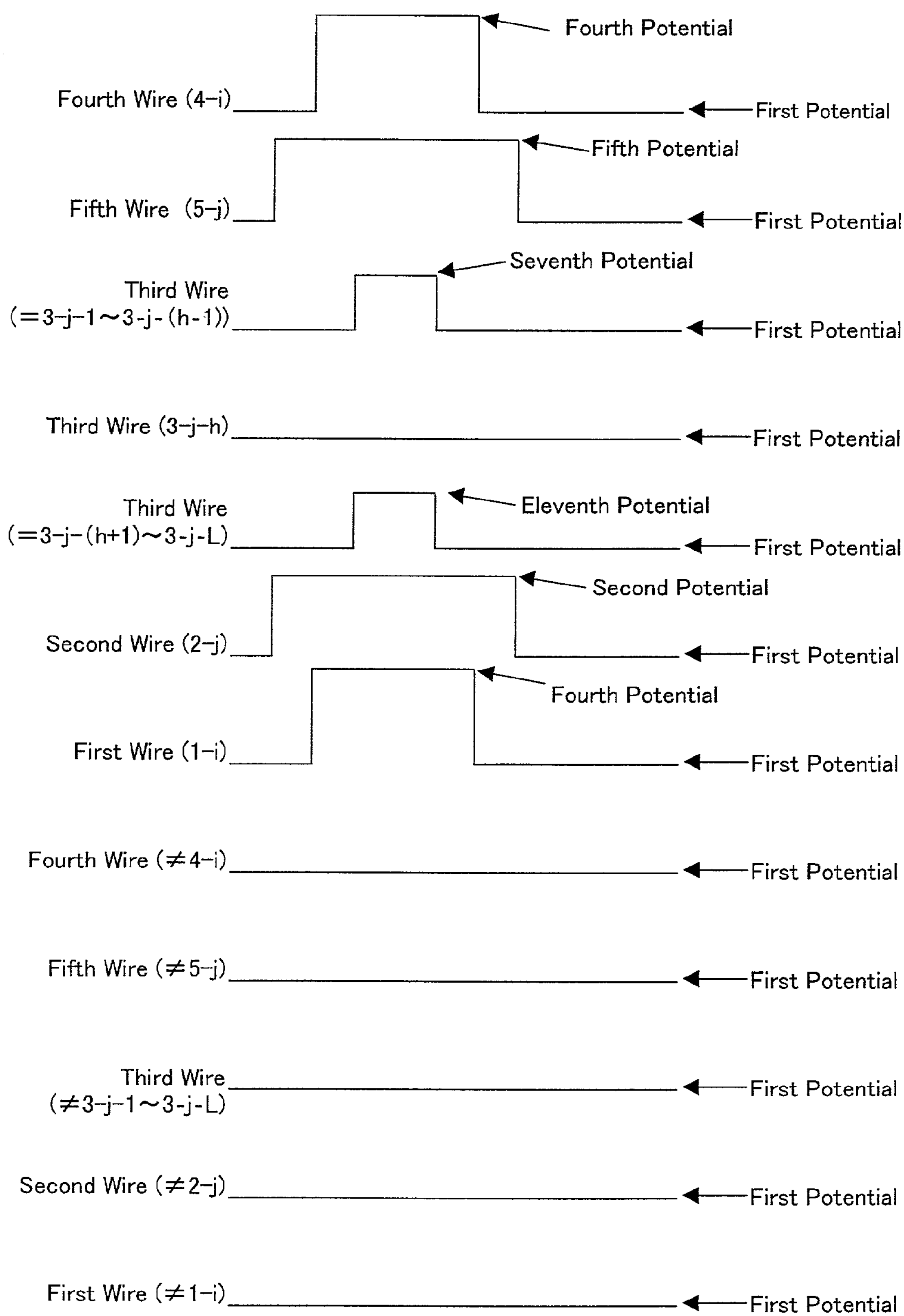
Figure 255:
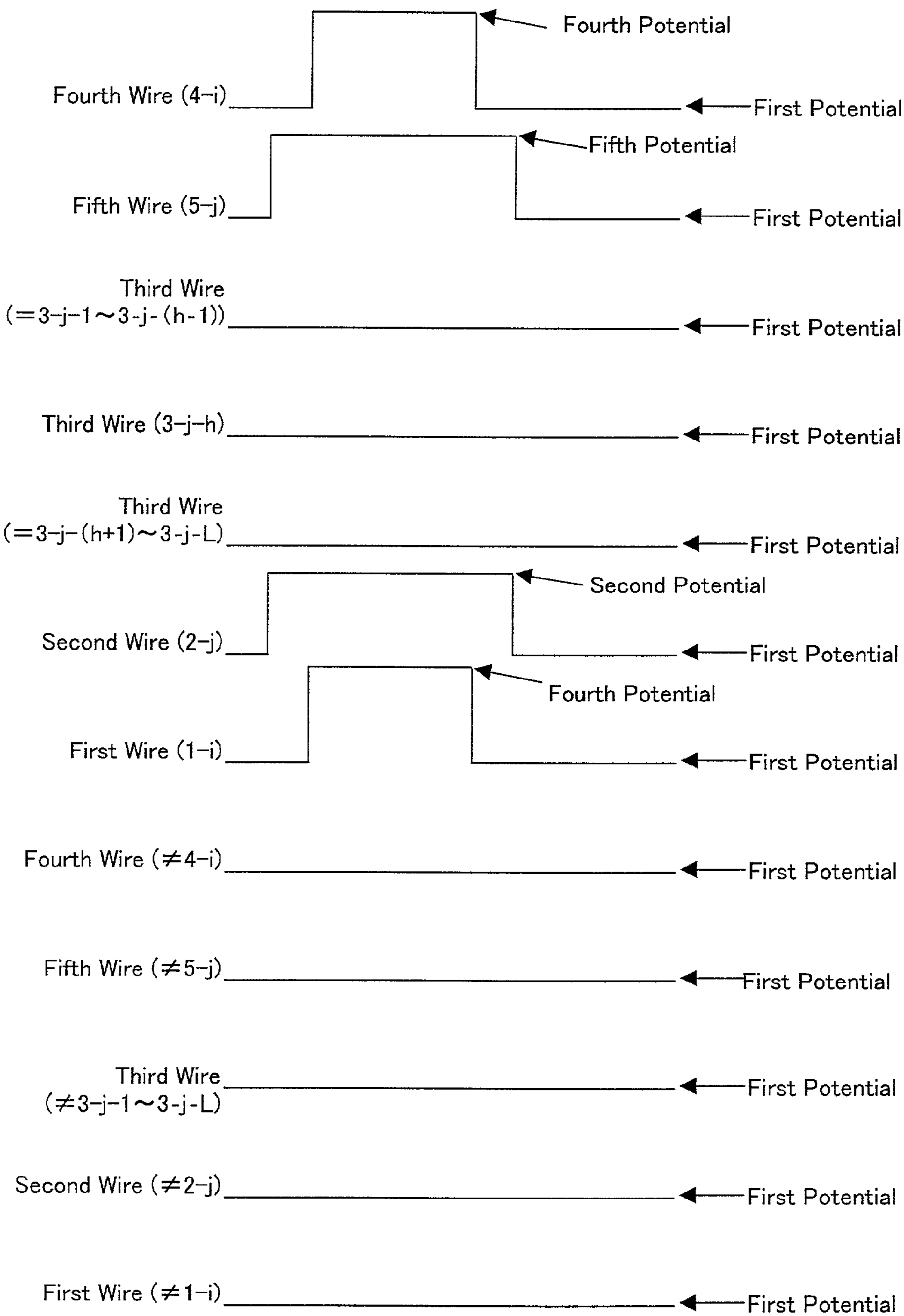

Thereby a plurality of cells connected to the selected third wire as shown in FIG. 132 are erased. In the above example, the erasing process has been described with the case where the selected cell is a memory cell having the third wire (3-j-h) as the gate electrode. However, the erasing process is the same with the case where the selected cell is a memory cell having a third wire other than the third wire (3-j-h) as the gate electrode. If the ground potential is applied as the third potential to the third wires (3-i-1 to 3-i-(h−1)) and the third wires (3-i-(h−1) to 3-i-L), a plurality of cells connected to the first wire (1-j) as shown in FIG. 130 are erased. If the ground potential is applied as the third potential to all the third wires (3-1-1 to 3-N-L), all cells as shown in FIG. 131 are erased when the potentials are applied at the timing shown in FIG. 251.

Figure 256:
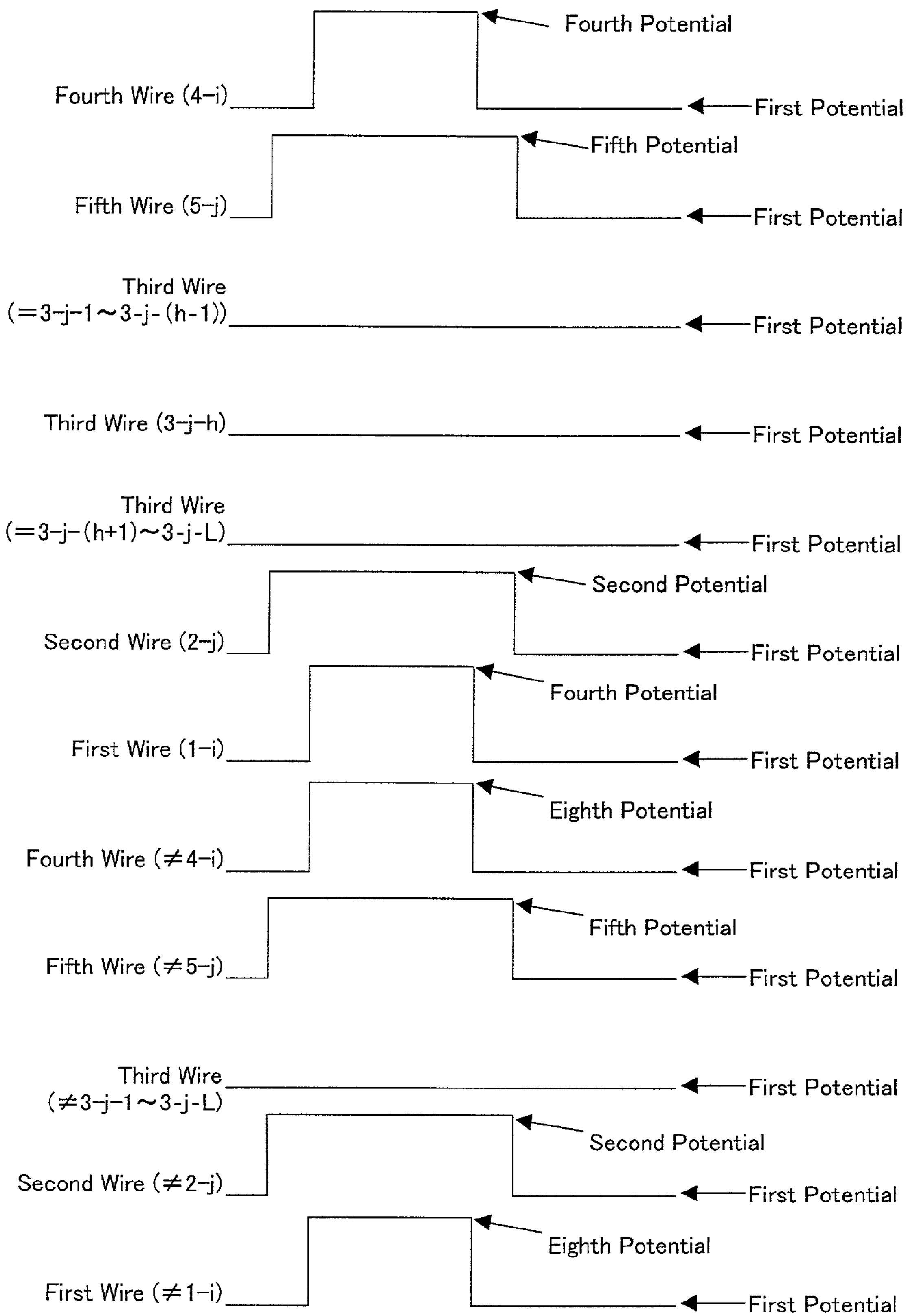
Figure 257:
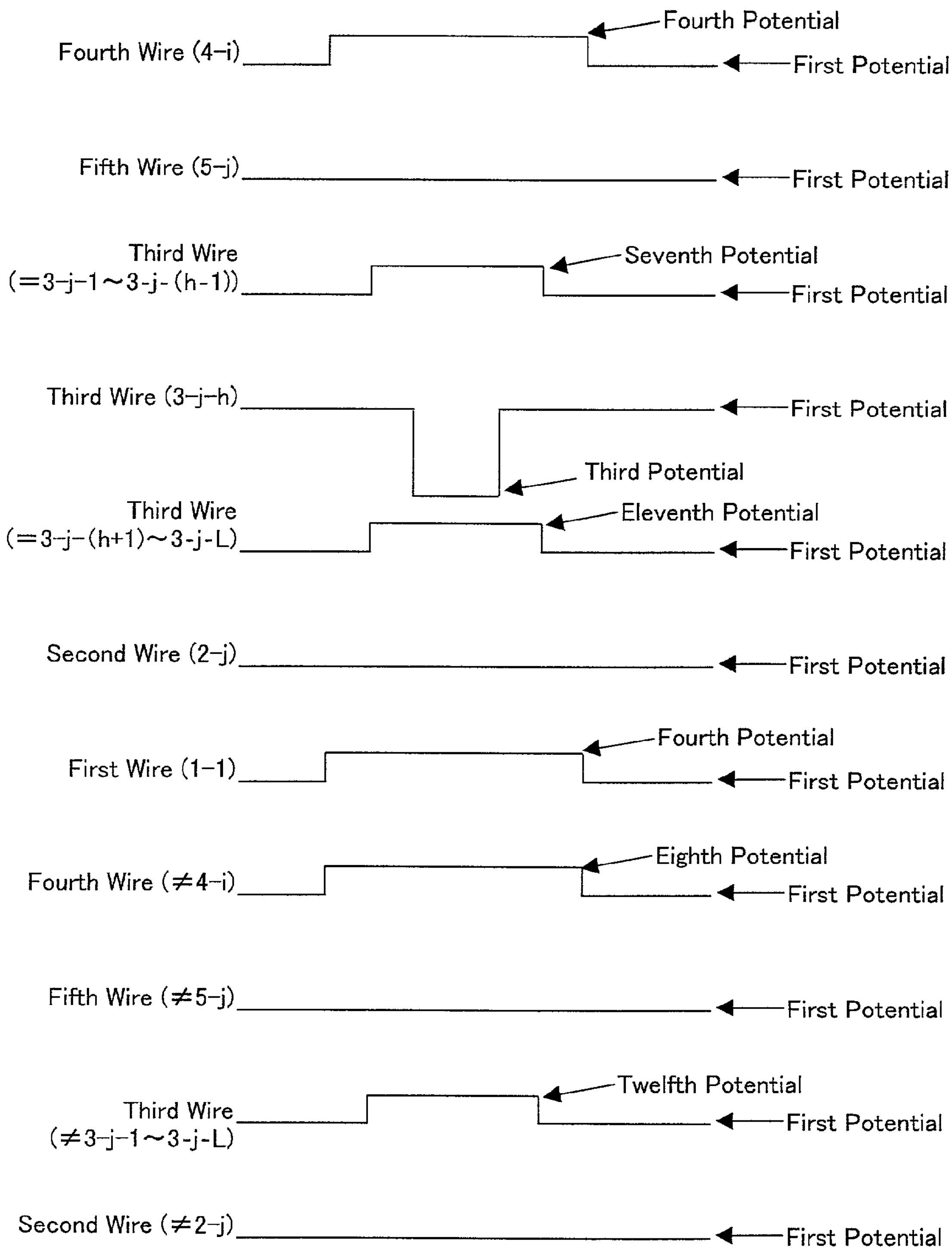
Figure 258:
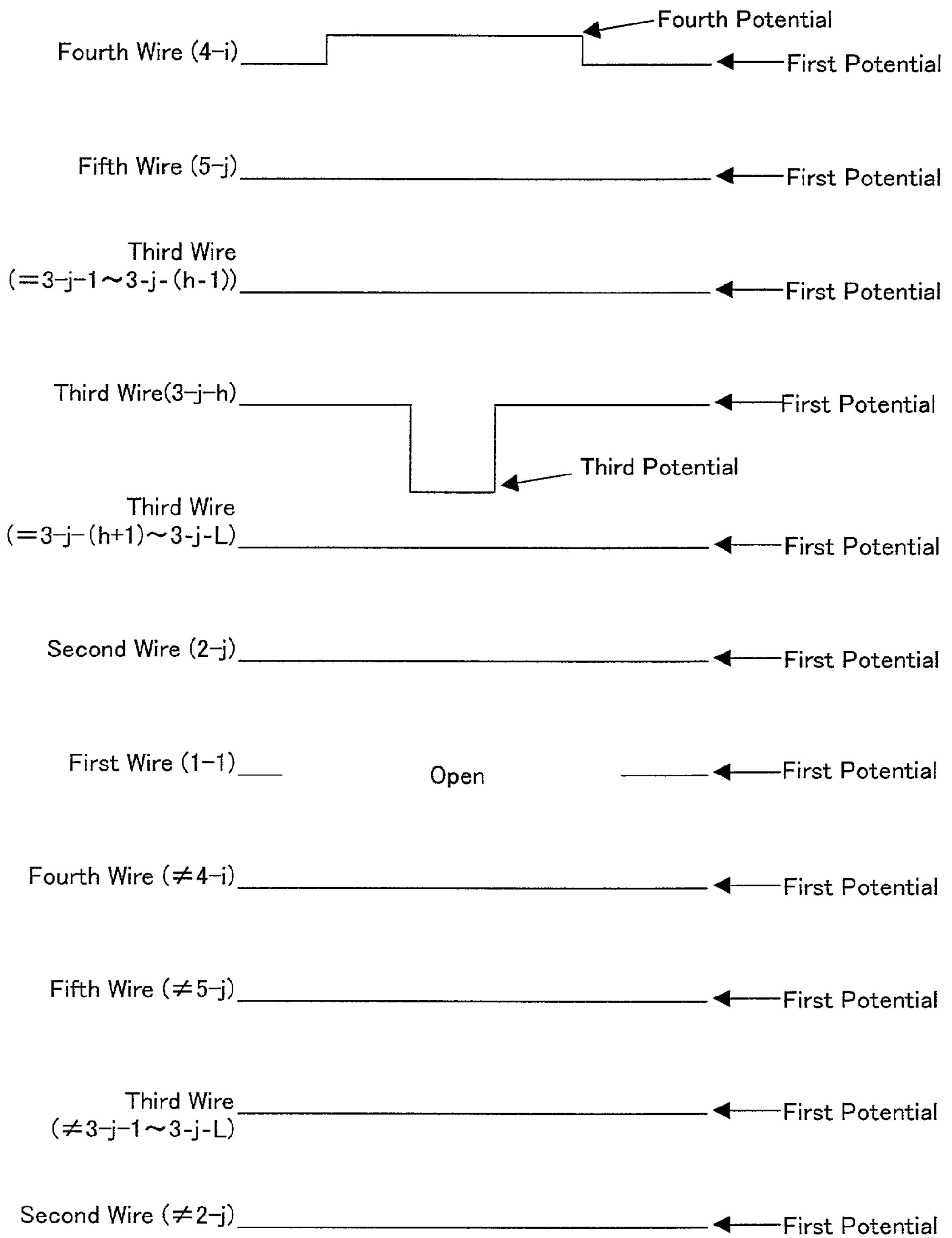
Figure 259:
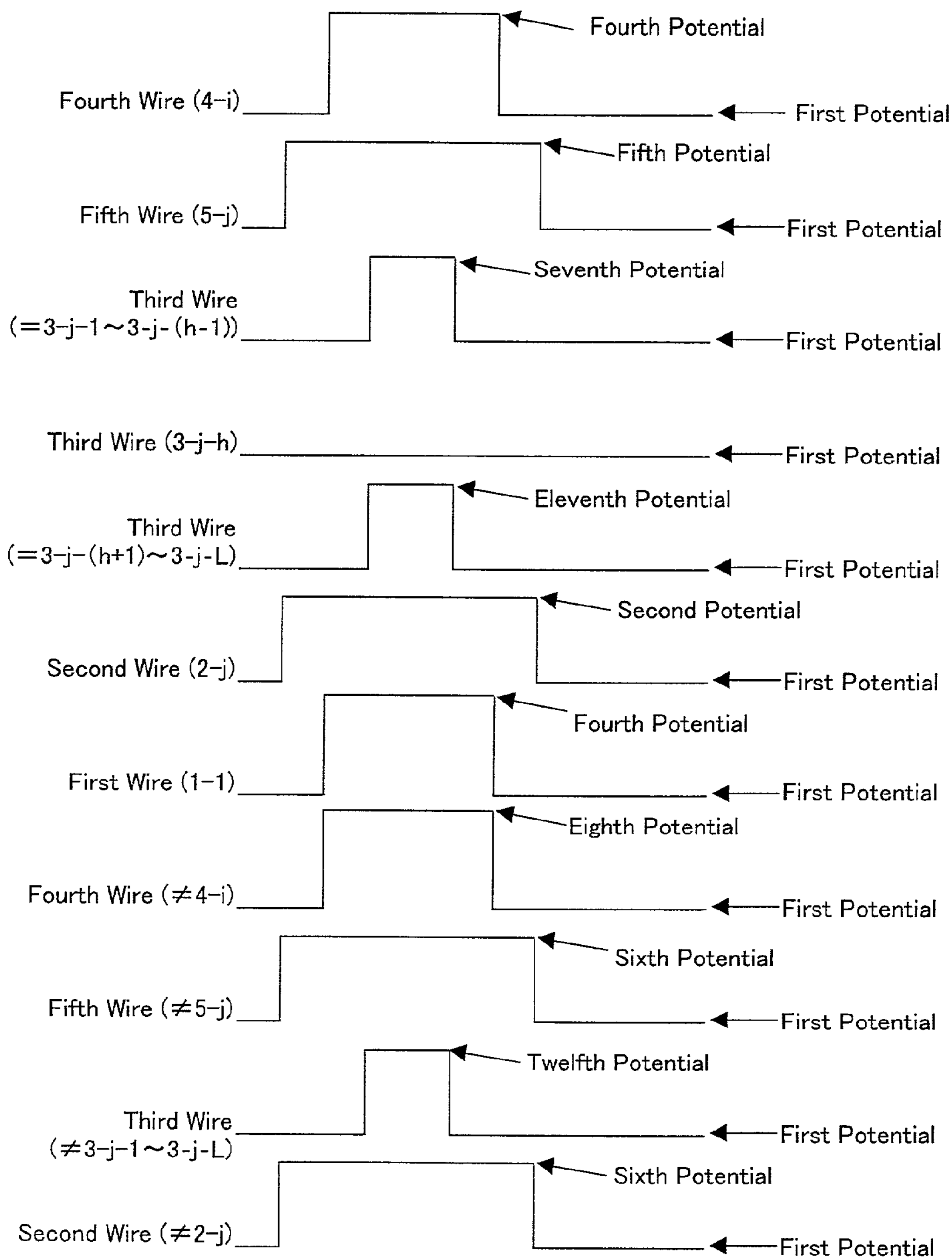
Figure 260:
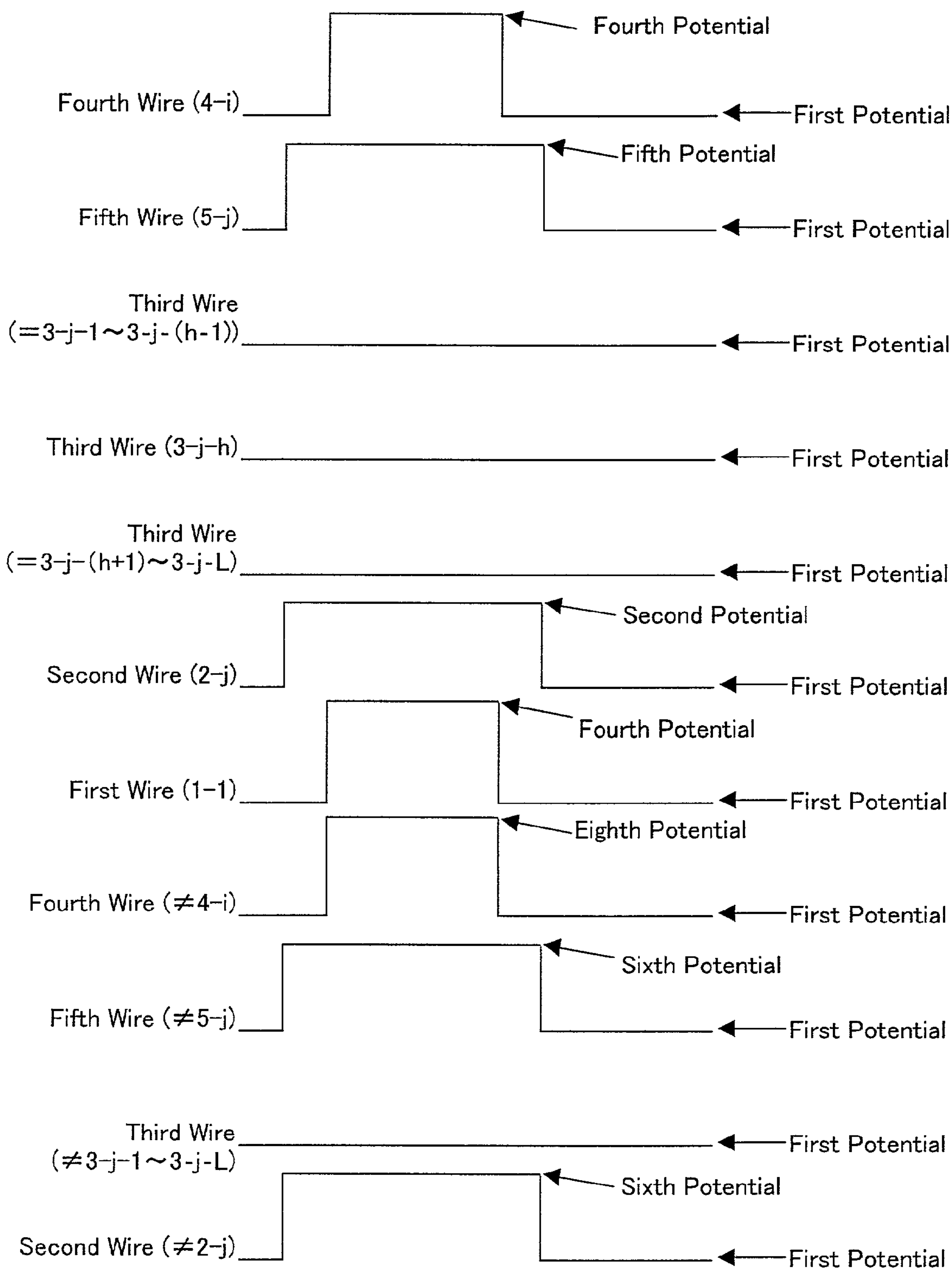

FIG. 252 to FIG. 255 show examples of timing charts for erasing data in the case where the first wires are arranged in parallel to the fourth wires. FIG. 252 to FIG. 255 conform to FIG. 248 to FIG. 251, respectively, except that the first wire (1-i) instead of the first wire (1-j) is connected to the end of the island-like semiconductor layer including the selected cell. At this time, as shown in FIG. 248 to FIG. 251, the ground potential may be applied as the first potential to the fifth wires (not 5-j), the fourth wires (not 4-i), the third wires (not 3-j-1 to 3-j-L), the second wires (not 2-j) and the first wires (not 1-i). If the ground potential is applied as the third potential to the third wires (3-j-1 to 3-j-L), cells connected to the first wire (1-i) as shown in FIG. 130 are erased when the potentials are applied at the timing shown in FIG. 255. As shown in FIG. 256, if 18 V for example is applied as the fifth potential to the fifth wires (not 5-j), 18 V for example is applied as the second potential to the second wires (not 2-j) and 18 V for example is applied as the fourth potential to the fourth wires (not 4-i) and the first wires (not 1-i), all cells as shown in FIG. 131 are erased.

FIG. 257 to FIG. 260 show examples of timing charts for erasing data in the case where the first wires are connected in common in the entire array. FIG. 257 to FIG. 260 conform to FIG. 248 to FIG. 251, respectively, except that the first wire (1-i) instead of the first wire (1-j) is connected to the end of the island-like semiconductor layer including the selected cell. If the ground potential is applied as the third potential to all the third wires (3-1-1 to 3-N-L), all cells as shown in FIG. 131 are erased when the potentials are applied at the timing shown in FIG. 260.

Have been described above the examples of the principles of erasing data in the case of M×N (M and N are positive integers) island-like semiconductor layers having a plurality of (e.g., L, L is a positive integer) memory cells formed of the P-type semiconductor and arranged in series and selection transistors formed to sandwich the memory cells therebetween. However, the polarity of all the electrodes may be reversed as in the case of island-like semiconductor layers formed of an N-type semiconductor. At this time, the potentials have a relationship in magnitude reverse to that mentioned above.

An erasing process is now explained with a semiconductor memory according to the present invention which is constructed to include a plurality of (e.g., M×N, wherein M and N are positive integers) island-like semiconductor layers each having, for example, two memory cells connected in series, the memory cells each being provided with the charge storage layer and the third electrode as a control gate electrode. In this memory cell array, a plurality of (e.g., M) fourth wires arranged in parallel with the semiconductor substrate are connected to end portions of the island-like semiconductor layers, and first wires are connected to opposite end portions of the island-like semiconductor layers. A plurality of (e.g., N×L) third wires are arranged in a direction crossing the fourth wires and are connected to the third electrodes of the memory cells. The erasing process utilizes the F-N current.

FIG. 138 shows an equivalent circuit diagram of the above-described memory cell array in which the first wires are arranged in parallel to the third wires. For example, in the case where the island-like semiconductor layers are formed of a P-type semiconductor, a selected cell shown in FIG. 138 is erased by applying a first potential to the first wire (1-j, wherein j is a positive integer, 1≦j≦N) connected to the first electrode connected to an island-like semiconductor layer including the selected cell, a ninth potential to first wires (not 1-j) other than the above-mentioned first wire (1-j), an eleventh potential to a third wire (3-j-2) connected to a non-selected cell arranged in series with the selected cell, a twelfth potential to third wires (not 3-j-1 to 3-j-2) connected to non-selected cells other than mentioned above, a fourth potential to a fourth wire (4-i, wherein i is a positive integer, 1≦i≦M) connected to the fourth electrode connected to the island-like semiconductor layer including the selected cell and an eighth potential to fourth wires (not 4-i) other than the above-mentioned fourth wire (4-i). The application of these potentials causes the F-N current to occur only in the tunnel oxide film of the selected cell to change the state of the charge in the charge storage layer. In the case where a negative charge is drawn from the charge storage layer for erasing data, for example, the fourth potential is larger than the third potential. Supposing that the "1" means that a negative charge is stored in the charge storage layer, the state of the charge in the charge storage layer is changed to the "0." At this time, the third potential is a potential allowing the change to "0" by the difference between the third potential and the fourth potential, that is, a potential allowing the occurrence of a sufficient F-N current as means for changing the state of the charge. The F-N current flows in the tunnel oxide film of a memory transistor having, as the gate electrode, the third electrode to which the third potential is applied. The eleventh potential is a potential causing a sufficiently smaller change in the state of the charge in the charge storage layers in non-selected cells than in the selected cell, for example, a potential such that a difference between the eleventh potential and the fourth potential causes only a sufficiently small F-N current in the tunnel oxide film of the memory transistor having, as the gate electrode, the third electrode connected to the third wire (3-j-2) to which the eleventh potential is applied. The second potential is a potential not allowing the F-N current to flow in the gate oxide film of the transistor having, as the gate electrode, the second electrode connected to the second wire. The fifth potential is a potential not allowing the F-N current to flow in the gate oxide film of the transistor having, as the gate electrode, the fifth electrode connected to the fifth wire. The sixth potential, as the second potential and the fifth potential, is a potential not allowing the F-N current to flow in the gate oxide film of the transistor having the second or fifth electrode as the gate electrode. The eighth potential is preferably a potential equal to the fourth or ninth potential applied to the terminal connected via an island-like semiconductor layer. The twelfth potential is a potential causing a sufficiently smaller change in the state of the charge in the charge storage layers in non-selected cells than in the selected cell, for example, a potential such that a difference between the twelfth potential and the eighth potential and a difference between the twelfth potential and the fourth potential cause only a sufficiently small F-N current in the tunnel oxide films of the memory transistors having, as the gate electrodes, the third electrodes connected to the third wires (not 3-j-1 to 3-j-2) to which the twelfth potential is applied. The first wires (1-1 to 1-N) may be open and the ninth potential may be open.

In the case where the first wires (1-1 to 1-N) are formed as impurity diffusion layers in the semiconductor substrate and the channel region of a selected memory cell is electrically connected to the semiconductor substrate when the potential of the first wires (1-1 to 1-N) is floating, the fourth potential applied to the first wire (1-j) connected to the island-like semiconductor layer including the selected cell is a potential such that the island-like semiconductor layer and the semiconductor substrate are electrically floated by a depletion layer extended toward the semiconductor substrate owing to the application of the fourth potential. Thereby the potential of the island-like semiconductor layer equals the fourth potential and a sufficiently large F-N current flows in the tunnel oxide film of the memory transistor of the selected cell on the island-like semiconductor layer, so that data is erased. That is, the difference between the fourth potential and the third potential becomes a potential difference allowing a sufficient F-N current to flow in the tunnel oxide film of the memory transistor. In the case where the channel region of the memory cell is not electrically connected to the semiconductor substrate, the depletion layer owing to the fourth potential may have any extension.

In the case where the first wires (1-1 to 1-N) are formed to be electrically insulated from the semiconductor substrate, for example, where the first wires (1-1 to 1-N) are formed of an impurity diffusion layer in an SOI substrate and is insulated from the semiconductor substrate by an insulating film, the first potential is not necessarily the same as the tenth potential.

In the case where the channel region of a selected memory cell is electrically connected to the semiconductor substrate, for example, in the case where impurity diffusion layers do not render the island-like semiconductor layers in the floating state from the substrate, the tenth potential applied to the semiconductor substrate can erase simultaneously all memory cells having as the gate electrodes the third electrodes to which the third potential is applied, provided that a difference between the tenth potential and the third potential causes a sufficient change in the state of the charge in the charge storage layer.

The memory cells may be sequentially erased from a memory cell connected to a third wire (3-j-2) to a memory cell connected to a third electrode (3-j-1), or may be erased in reverse order or at random. Further, some or all memory cells connected to the third wire (3-j-1) may be erased at the same time, some or all memory cells connected to the third wires (3-j-1 to 3-j-2) may be erased at the same time, and some or all memory cells connected to the third wires (3-1-1 to 3-N-2) may be erased at the same time. Also, some or all memory cells connected to third wires selected regularly, e.g., the third wires (3-(j−8)-h), (3-j-h), (3-(j+8)-h), (3-(j+16)-h), . . . (h=1 or 2), may be erased at the same time. Further some or all memory cells of one island-like semiconductor layer connected to the fourth wire (4-i) may be erased at the same time, or some or all memory cells of some or all island-like semiconductor layers connected to the fourth wire (4-i) may be erased at the same time. One, some or all memory cells of one island-like semiconductor layer connected to each of a plurality of fourth wires may be erased at the same time, or some or all memory cells of some or all island-like semiconductor layers connected to each of a plurality of fourth wires may be erased at the same time. The memory cells connected to the third wire (3-j-h) may be erased at the same time by given intervals, for example, every eight fourth wires (e.g., a fourth wire (4-(i−16)), a fourth wire (4-(i−8)), a fourth wire (4-i), a fourth wire (4-(i+8)), a fourth wire (4-(i+16)), . . . ).

All the memory cells having, as the gate electrodes, the third electrodes connected to the third wire (3-j-h) can be erased at the same time by applying the first potential to all the fourth wires, applying the fourth potential to the first wire (1-j) and the eighth potential to the first wires (not 1-j), exchanging the potentials of the second and fifth wires and applying the third potential to the third wire (3-j-h). At this time, the fourth potential may optionally be applied to the fourth wire. Further, by applying the fourth potential to a plurality of first wires and applying the third potential to the third wires connected to the third electrodes of the memory cells included in the island-like semiconductor layers having the first electrodes connected to said plurality of first wires, all the memory cells having, as gate electrodes, the third electrodes connected to the third wires to which the third potential is applied can be erased at the same time. The above-described erasing processes may be combined.

Erasure may be defined as changing the state of the charge in the charge storage layer and raising the threshold of the selected memory transistor. In this case, the third potential is large than the fourth potential, and the third potential is a potential allowing the state of the charge in the charge storage layer to be changed sufficiently by the difference between the third potential and the fourth potential, for example, a potential allowing the occurrence of a sufficient F-N current. Means for changing the state of the charge in the charge storage layer is not limited to the F-N current.

FIG. 139 shows an equivalent circuit diagram of a memory cell array in which the first wires are arranged in parallel to the third wires. The application of the potentials of FIG. 139 is the same as that of FIG. 128 for erasing data except that the third potential is applied to the third wire (3-j-2) and the seventh potential is applied to the third wires (3-j-1) connected to a non-selected cell. Here, the seventh potential is a potential causing a sufficiently smaller change in the state of the charge in the charge storage layers in non-selected cell than in the selected cell, for example, a potential such that a difference between the seventh potential and the fourth potential causes only a sufficiently small F-N current in the tunnel oxide film of the memory transistors having, as the gate electrodes, the third electrodes connected to the third wire (3-j-1) to which the seventh potential is applied.

Figure 140:
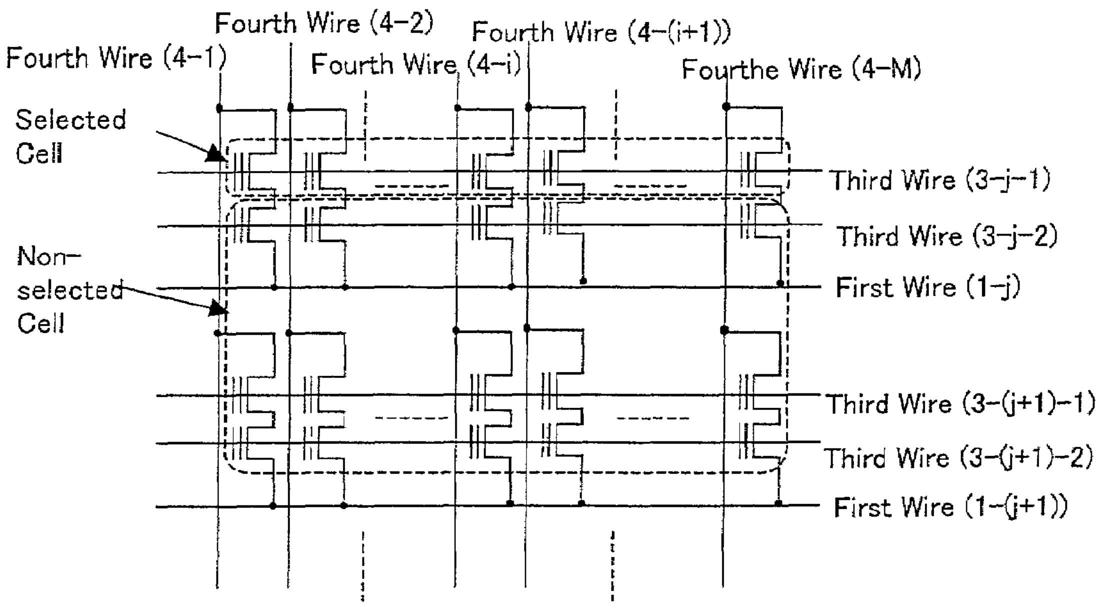

FIG. 140 shows an equivalent circuit diagram of a memory cell array in which the first wires are arranged in parallel to the third wires. The application of the potentials of FIG. 140 is the same as that of FIG. 128 for erasing data except that the fourth potential is applied to the fourth wires (4-1 to 4-M). A memory cell connected to the first wire (1-j) and the third wire (3-j-1) can be selected and erased.

Figure 141:
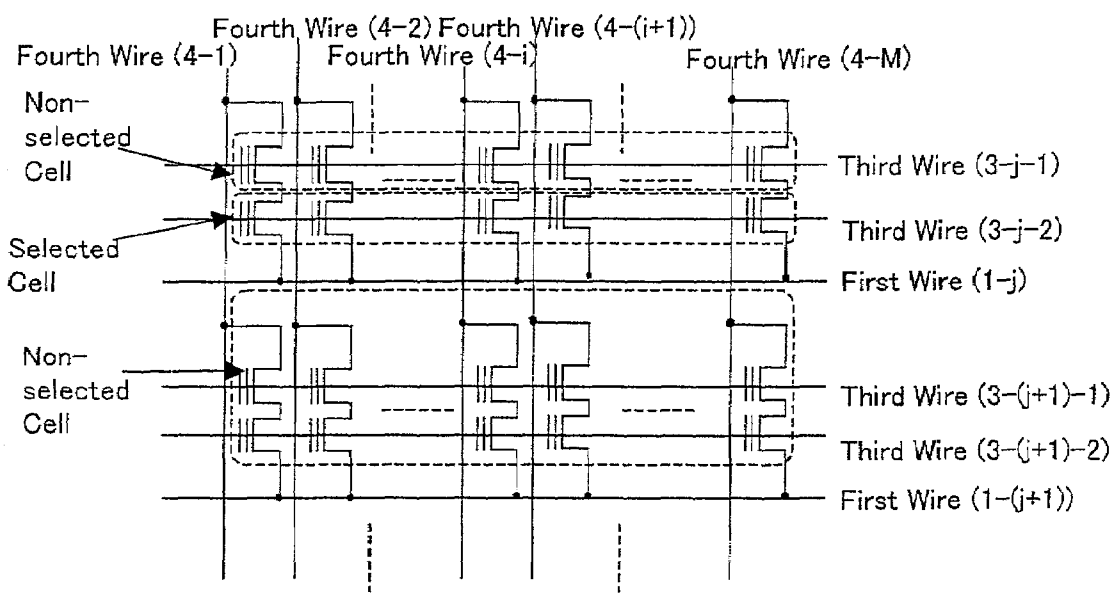

FIG. 141 shows an equivalent circuit diagram of a memory cell array in which the first wires are arranged in parallel to the third wires. The application of the potentials of FIG. 141 is the same as that of FIG. 139 for erasing data except that the third potential is applied to the third wire (3-j-2) and the seventh potential is applied to the third wires (3-j-1) connected to a non-selected cell. Here, the seventh potential is a potential causing a sufficiently smaller change in the state of the charge in the charge storage layers in non-selected cell than in the selected cell, for example, a potential such that a difference between the seventh potential and the fourth potential causes only a sufficiently small F-N current in the tunnel oxide film of the memory transistors having, as the gate electrodes, the third electrodes connected to the third wire (3-j-1) to which the seventh potential is applied.

FIG. 142 shows an equivalent circuit diagram of a memory cell array in which the first wires are arranged in parallel to the fourth wires. The application of the potentials of FIG. 142 is the same as that of FIG. 138 for erasing data except that the fourth potential is applied to the first wire (1-i) and the ninth potential is applied to the first wires (not 1-i).

FIG. 143 shows an equivalent circuit diagram of a memory cell array in which the first wires are arranged in parallel to the fourth wires. The application of the potentials of FIG. 143 is the same as that of FIG. 142 for erasing data except that the third potential is applied to the third wire (3-j-2) connected to the selected cell and the seventh potential is applied to the third wires (3-i-1) connected to the non-selected cell. Here, the seventh potential is a potential causing a sufficiently smaller change in the state of the charge in the charge storage layers in non-selected cell than in the selected cell, for example, a potential such that a difference between the seventh potential and the fourth potential causes only a sufficiently small F-N current in the tunnel oxide film of the memory transistors having, as the gate electrodes, the third electrodes connected to the third wire (3-j-1) to which the seventh potential is applied.

Figure 144:
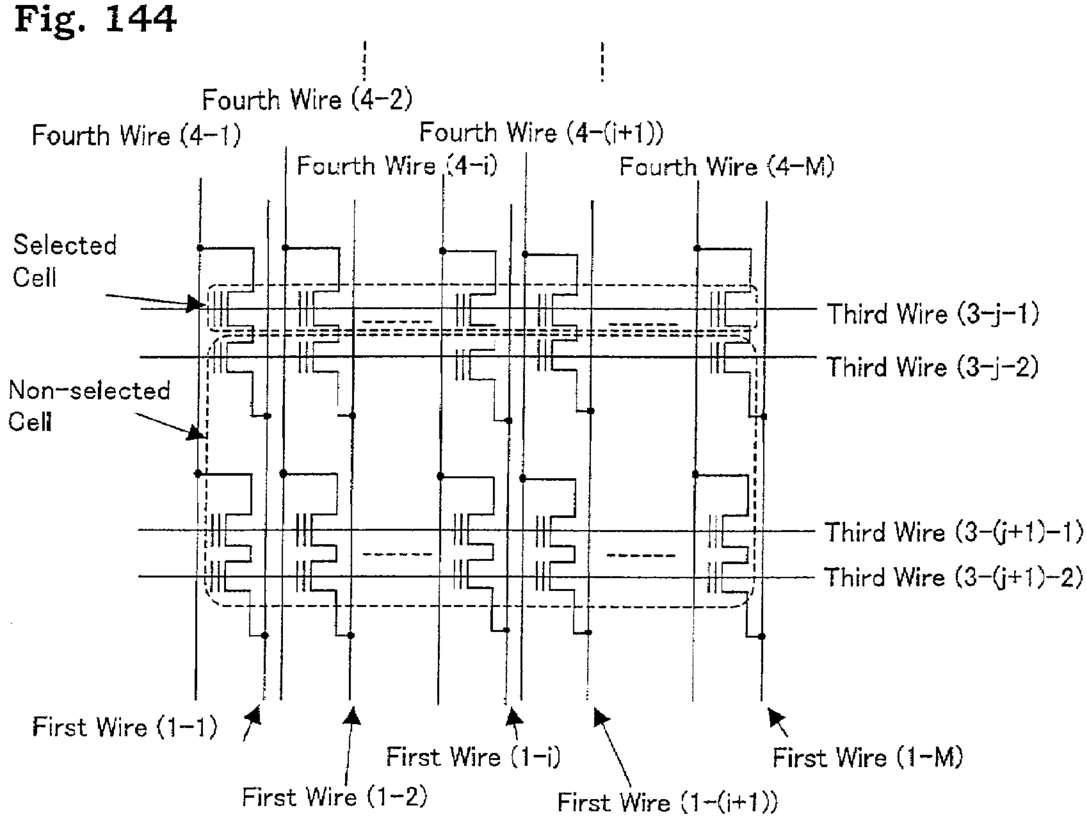

FIG. 144 shows an equivalent circuit diagram of a memory cell array in which the first wires are arranged in parallel to the fourth wires. A memory cell connected to the first wire (1-i) and the third wire (3-j-1) can be selected and erased. The application of the potentials of FIG. 144 is the same as that of FIG. 142 for erasing data except that the fourth potential is applied to the fourth wires (4-1 to 4-M).

Figure 145:
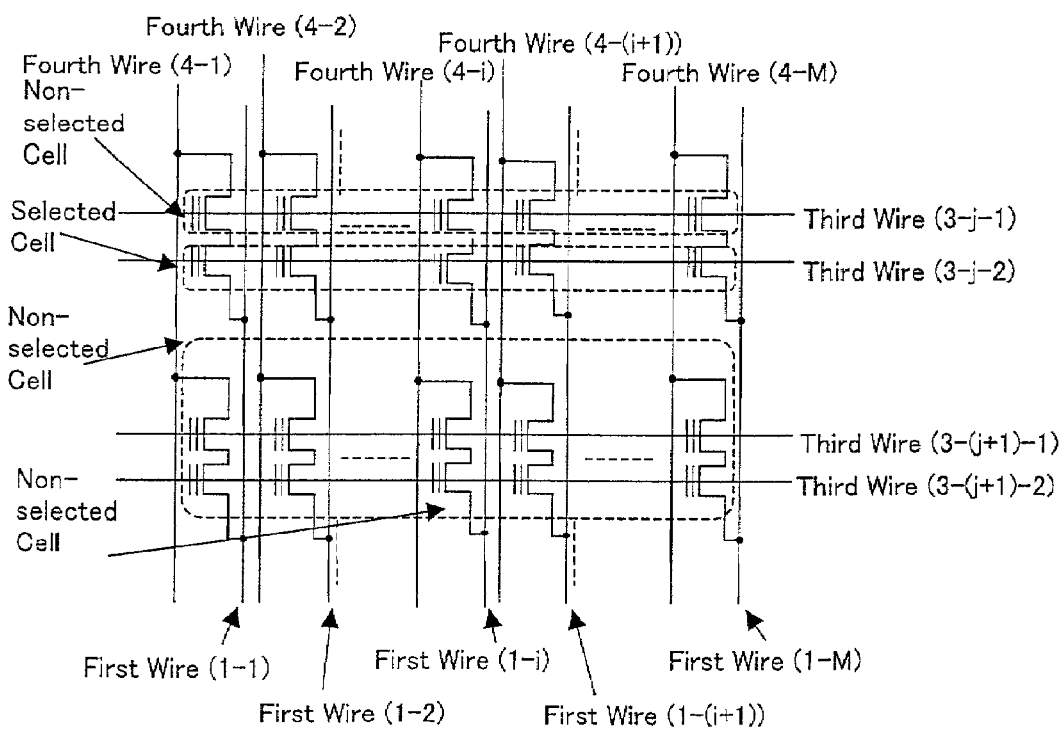

FIG. 145 shows an equivalent circuit diagram of a memory cell array in which the first wires are arranged in parallel to the third wires. The application of the potentials of FIG. 145 is the same as that of FIG. 144 for erasing data except that the third potential is applied to the third wire (3-j-2) connected to the selected cell and the seventh potential is applied to the third wires (3-j-1) connected to a non-selected cell. Here, the seventh potential is a potential causing a sufficiently smaller change in the state of the charge in the charge storage layers in non-selected cell than in the selected cell, for example, a potential such that a difference between the seventh potential and the fourth potential causes only a sufficiently small F-N current in the tunnel oxide film of the memory transistors having, as the gate electrodes, the third electrodes connected to the third wire (3-j-1) to which the seventh potential is applied.

FIG. 146 shows an equivalent circuit diagram of a memory cell array in which a plurality of first wires are electrically connected in common. The application of the potentials of FIG. 146 is the same as that of FIG. 138 for erasing data except that the fourth potential is applied to the first wire (1-1).

FIG. 147 shows an equivalent circuit diagram of a memory cell array in which a plurality of first wires are electrically connected in common. The application of the potentials of FIG. 147 is the same as that of FIG. 146 for erasing data except that the third potential is applied to the third wire (3-j-2) connected to the selected cell and the seventh potential is applied to the third wire (3-i-1) connected to a non-selected cell. Here, the seventh potential is a potential causing a sufficiently smaller change in the state of the charge in the charge storage layers in non-selected cell than in the selected cell, for example, a potential such that a difference between the seventh potential and the fourth potential causes only a sufficiently small F-N current in the tunnel oxide film of the memory transistors having, as the gate electrodes, the third electrodes connected to the third wire (3-j-1) to which the seventh potential is applied.

Figure 148:
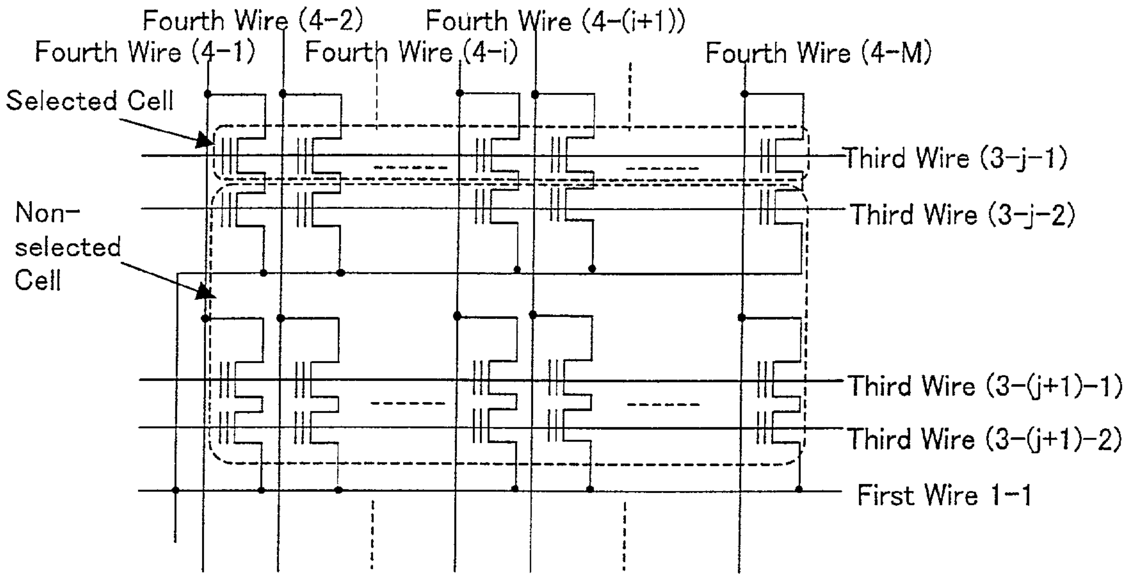

FIG. 148 shows an equivalent circuit diagram of a memory cell array in which a plurality of first wires are electrically connected in common. The application of the potentials of FIG. 148 is the same as that of FIG. 138 for erasing data except that the fourth potential is applied to the fourth wires (4-1 to 4-M).

Figure 149:
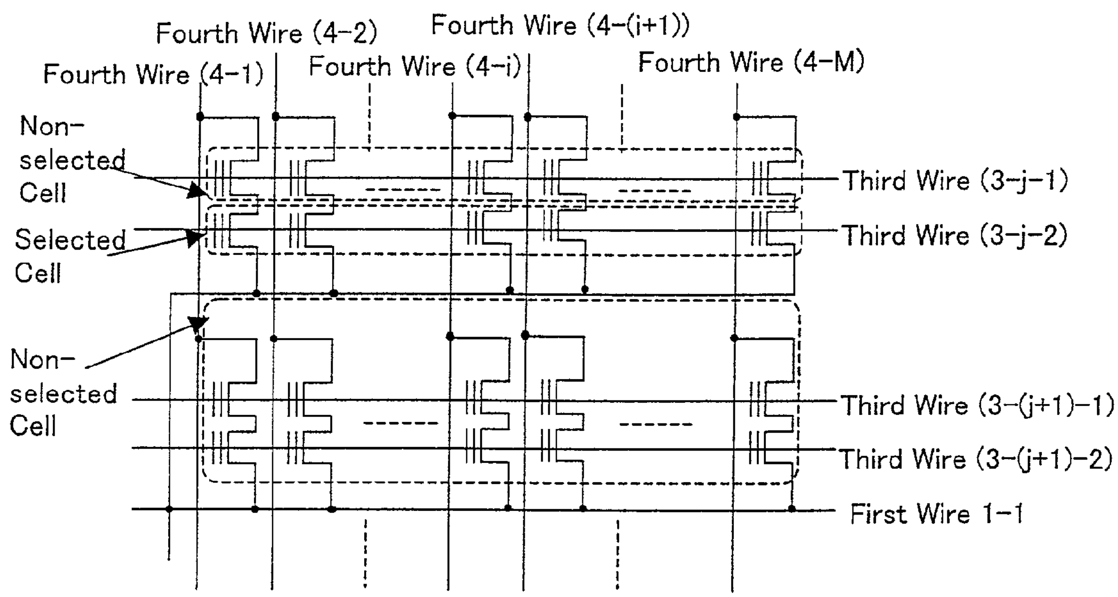

FIG. 149 shows an equivalent circuit diagram of a memory cell array in which a plurality of first wires are electrically connected in common. The application of the potentials of FIG. 149 is the same as that of FIG. 148 for erasing data except that the third potential is applied to the third wire (3-j-2) connected to the selected cell and the seventh potential is applied to the third wire (3-i-1) connected to a non-selected cell. Here, the seventh potential is a potential causing a sufficiently smaller change in the state of the charge in the charge storage layers in non-selected cell than in the selected cell, for example, a potential such that a difference between the seventh potential and the fourth potential causes only a sufficiently small F-N current in the tunnel oxide film of the memory transistors having, as the gate electrodes, the third electrodes connected to the third wire (3-j-1) to which the seventh potential is applied.

Figure 261:
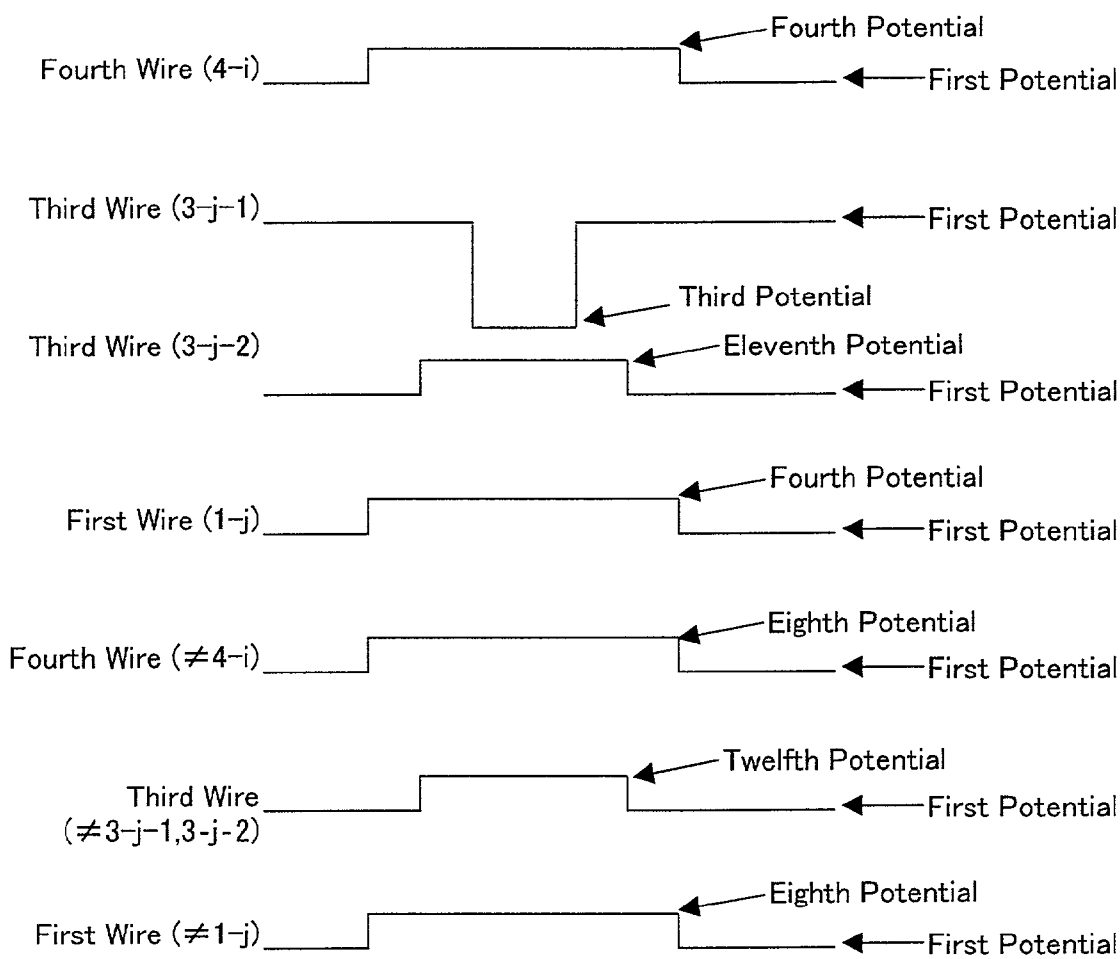

Have been described the examples of applying the potentials for erasing data. Now are described examples of timing charts for applying potentials for erasing data in the case where there are arranged M×N (M and N are positive integers) island-like semiconductor layers having two memory cells formed of the P-type semiconductor and arranged in series and selection transistors formed to sandwich the memory cells therebetween, the first wires and the third wires are arranged in parallel and the selected cell is a memory cell having the selected third electrode as the gate electrode. FIG. 261 shows a timing chart showing an example of timing of applying each potential for erasing data. In FIG. 261, a selected third wire as shown in FIG. 140 is negative-biased, and the memory cell has a threshold of 1.0 V to 3.5 V when it is in the written state and has a threshold of −1.0 V or lower when it is in the erased state. For drawing a negative charge from the charge storage layer, for example, a ground potential is applied as the first potential to the first wires (1-1 to 1-N), the third wires (3-1-1 to 3-N-L) and the fourth wires (4-1 to 4-M). In this state, the eighth potential, e.g., 6 V which is equal to the fourth potential, is applied to first wires (not 1-j) other than the first wire (1-j), the eighth potential, e.g., 6 V which is equal to the fourth potential, is applied to fourth wires (not 4-i) other than the fourth wire (4-i), the fourth potential, e.g., 6 V, is applied to the first wire (1-j), the fourth potential, e.g., 6 V, is applied to the fourth wire (4-i), the eleventh potential, e.g., 6 V, is applied to the third wire (3-j-2) other than the third wire (3-j-1), the twelfth potential, e.g., 6 V, is applied to third wires (not 3-j-1 to 3-j-2) other than mentioned above, and the third potential, e.g., 12 V, is applied to the third wire (3-j-1). The selected cell is erased to “0” by sustaining this state for a desired period of time. The potentials may be applied to the respective wires in another order or simultaneously.

The third wire (3-j-1) is returned to the ground potential, i.e., the first potential, the third wires (not 3-j-1) other than the third wire (3-j-1) are returned to the ground potential, i.e., the first potential, the fourth wires (4-1 to 4-M) are returned to the ground potential, i.e., the first potential, and the first wires (1-1 to 1-N) are returned to the ground potential, i.e., the first potential. The respective wires may be returned to the ground potential in another order or simultaneously. The potentials given may be any combination of potentials so long as they meet conditions for erasing a desired cell. Here, the same potential is preferably applied initially as the first potential to the first wires (1-1 to 1-N), the third wires (3-1-1 to 3-N-L) and the fourth wires (4-1 to 4-M), but different potentials may be applied.

Thereby a plurality of cells connected to the selected third wire as shown in FIG. 140 are erased. In the above example, the erasing process has been described with the case where the selected cell is a memory cell having the third wire (3-j-1) as the gate electrode. However, the erasing process is the same with the case where the selected cell is a memory cell having the third wire (3-j-2) as the gate electrode.

Figure 262:
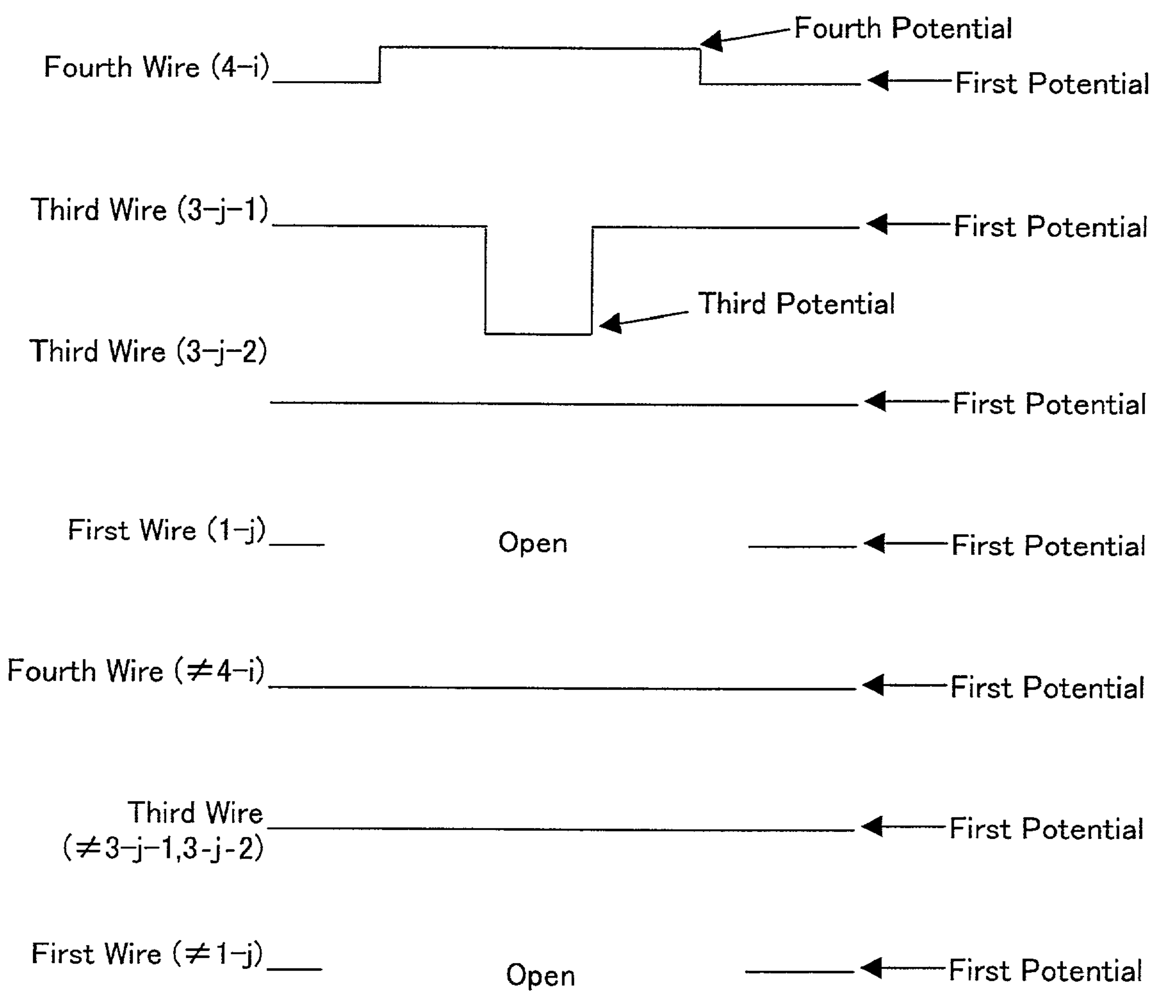

FIG. 262 shows a timing chart showing an example of timing of applying each potential for erasing data in the case where the first wire is open in contrast to FIG. 261. The erasing process of FIG. 262 conforms to that of FIG. 261 except that the first electrode 10 is open and the ground potential is applied as the first potential to the non-selected third wires (3-i-2) and the fourth wires (not 4-i). Also in FIG. 262, the selected cell as shown in FIG. 138 is erased as in FIG. 261. If 6 V is applied as the eighth potential to the fourth wires (not 4-i), a plurality of cells connected to the elected third wire as shown in FIG. 140 are erased. If 6 V is applied as the eighth potential to the fourth wires (not 4-i) and −12 V is applied as the third potential to the third wires (3-i-1 to 3-i-L), a plurality of cells connected to the first wire (1-j) are erased. If 6 V is applied as the fourth potential to all the fourth wires (4-1 to 4-M) and −12 V is applied as the third potential to all the third wires (3-1-1 to 3-N-2), all cells are erased.

Figure 263:
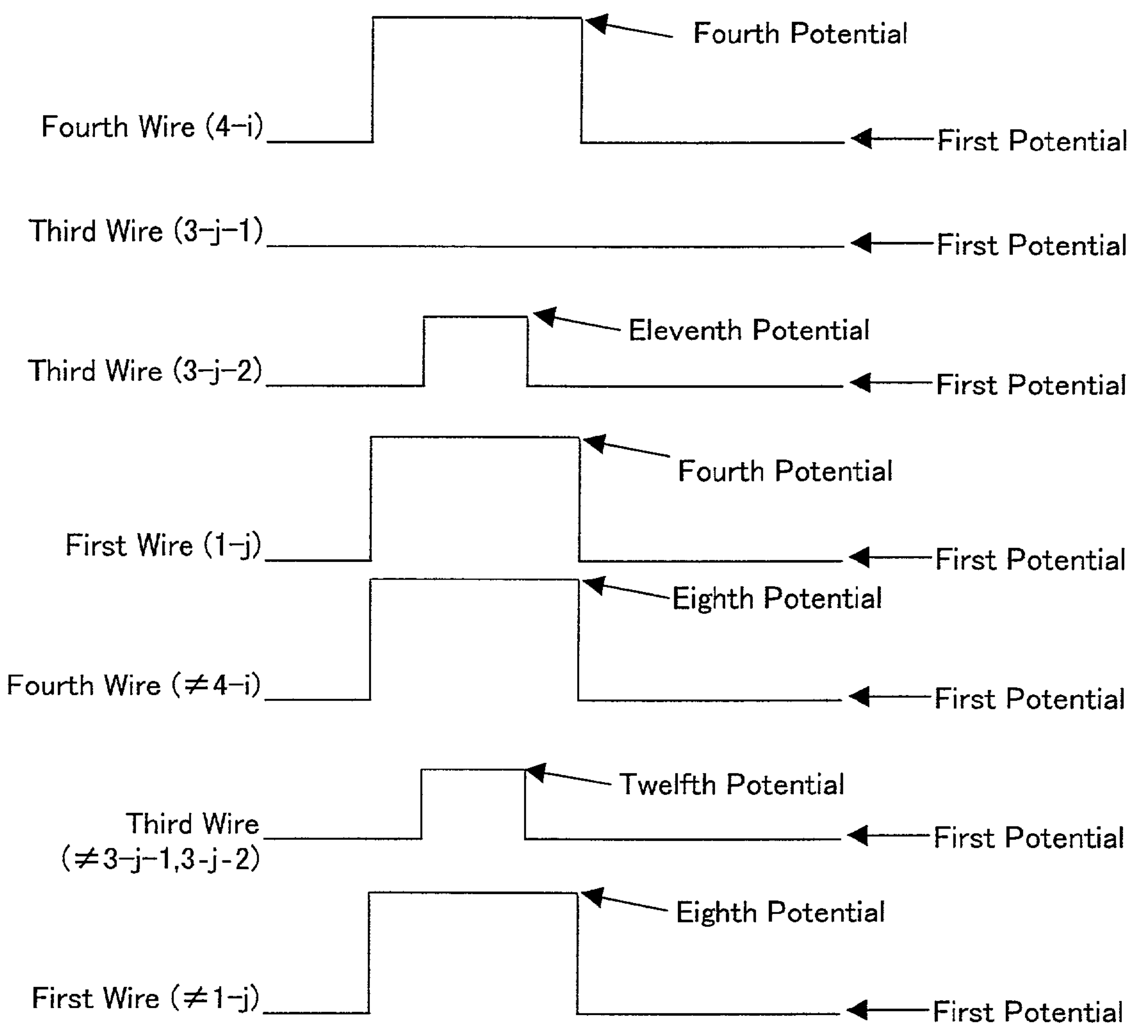

FIG. 263 shows a timing chart showing an example of timing of applying each potential for erasing data. In FIG. 263, 18 V for example is applied as the fourth potential and the ninth potential to the first wire, and the memory cell has a threshold of 1.0 V to 3.5 V when it is in the written state and has a threshold of −1.0 V or lower when it is in the erased state. For drawing a negative charge from the charge storage layer, for example, a ground potential is applied as the first potential to the first wires (1-1 to 1-N), the third wires (3-1-1 to 3-N-L) and the fourth wires (4-1 to 4-M). In this state, the eighth potential, e.g., 18 V which is equal to the fourth potential, is applied to fourth wires (not 4-i) other than the fourth wire (4-i), the eighth potential, e.g., 18 V which is equal to the fourth potential, is applied to first wires (not 1-j) other than the first wire (1-j), the fourth potential, e.g., 18 V, is applied to the fourth wire (4-i), the fourth potential, e.g., 18 V, is applied to the first wire (1-j), the eleventh potential, e.g., 10 V, is applied to the third wire (3-j-2), the twelfth potential, e.g., 10 V, is applied to third wires (not 3-j-1 to 3-j-2) other than mentioned above, and the third potential, e.g., the ground potential which is the first potential, is kept applied to the third wire (3-j-1). The selected cell is erased to "0" by sustaining this state for a desired period of time. The potentials may be applied to the respective wires in another order or simultaneously. The third wires (not 3-j-1) other than the third wire (3-j-1) are returned to the ground potential, i.e., the first potential, the fourth wires (4-1 to 4-M) are returned to the ground potential, i.e., the first potential, and the first wires (1-1 to 1-N) are returned to the ground potential, i.e., the first potential. The respective electrodes may be returned to the ground potential in another order or simultaneously. The potentials given may be any combination of potentials so long as they meet conditions for erasing a desired cell. Here, the same potential is preferably applied initially as the first potential to the first wires (1-1 to 1-N), the third wires (3-1-1 to 3-N-L), and the fourth wires (4-1 to 4-M), but different potentials may be applied.

Thereby a plurality of cells connected to the selected third wire as shown in FIG. 148 are erased. In the above example, the erasing process has been described with the case where the selected cell is a memory cell having the third wire (3-j-1) as the gate electrode. However, the erasing process is the same with the case where the selected cell is a memory cell having the third wire (3-j-2) as the gate electrode.

Figure 264:
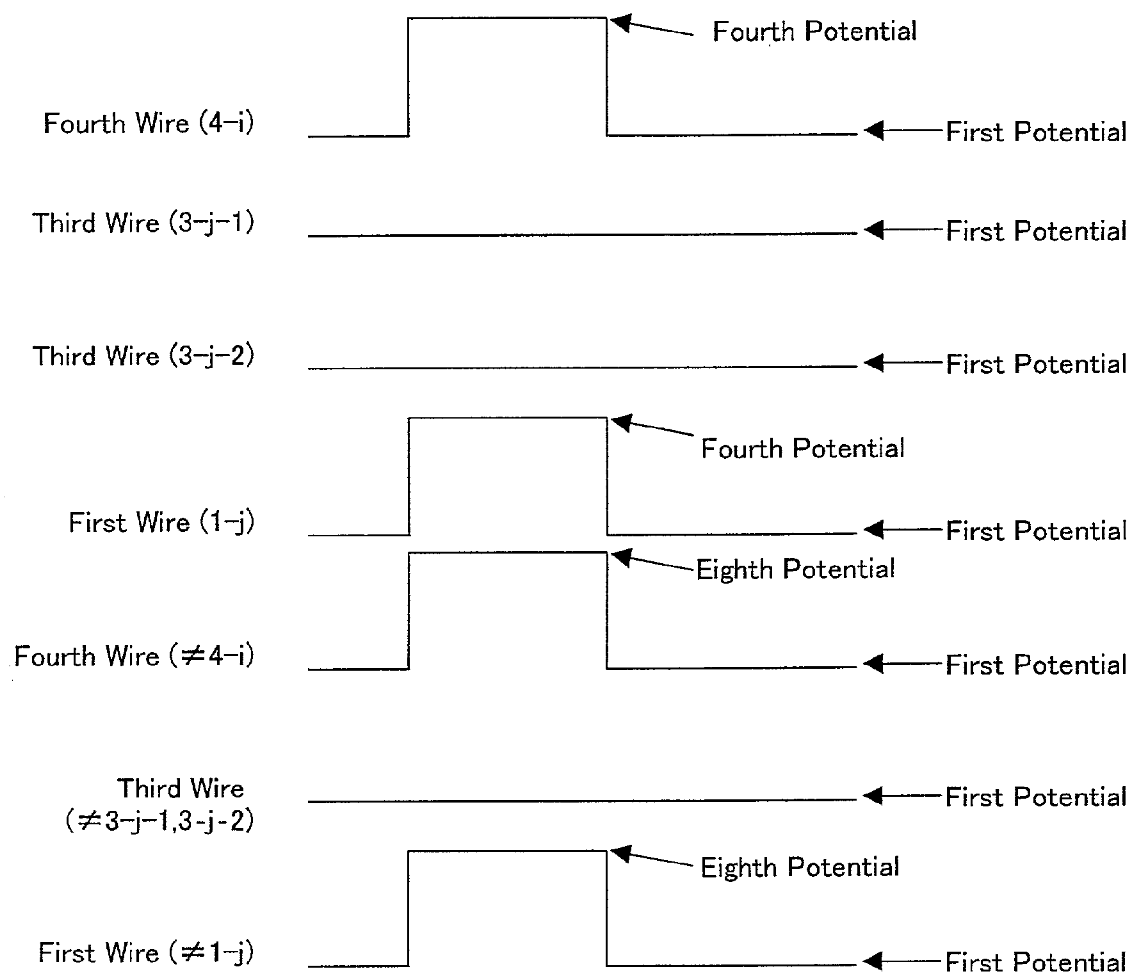
Figure 265:
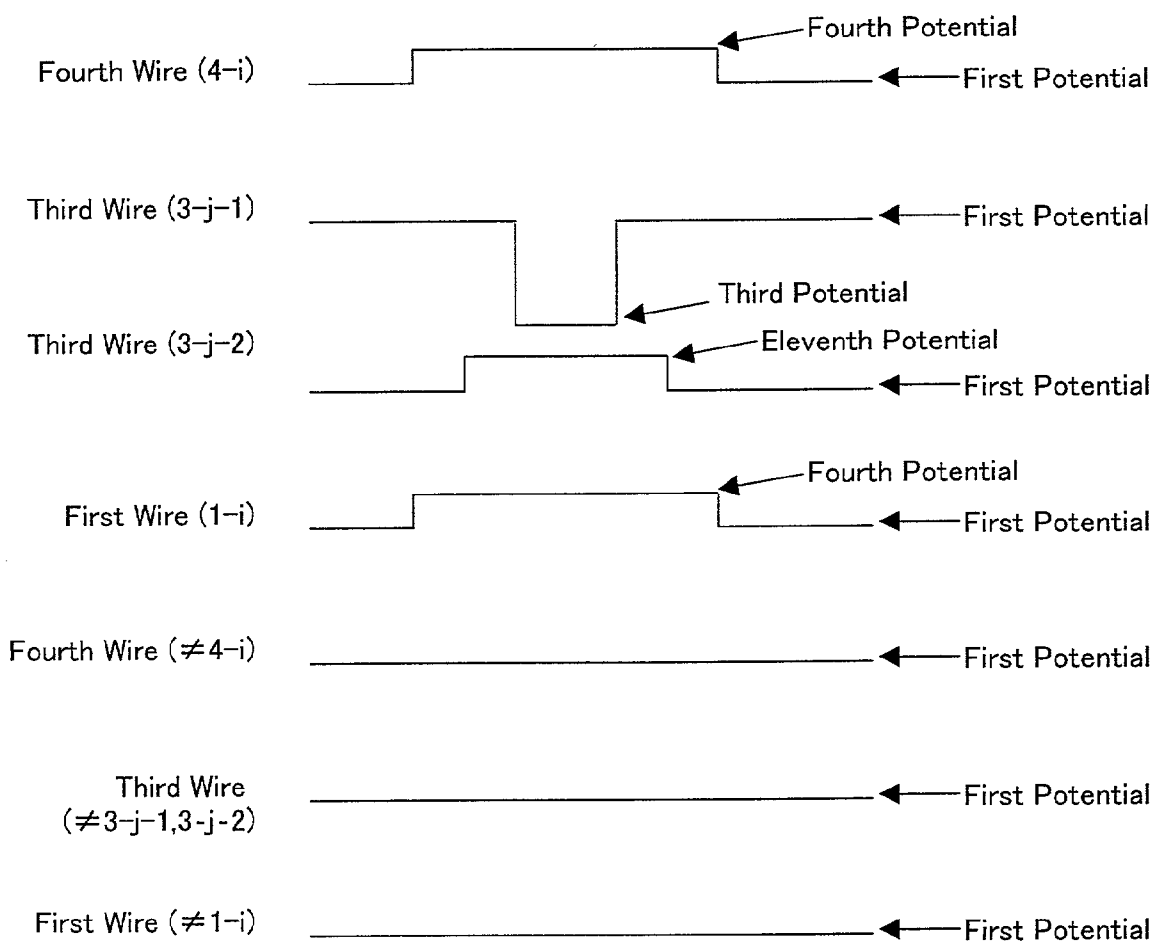
Figure 266:
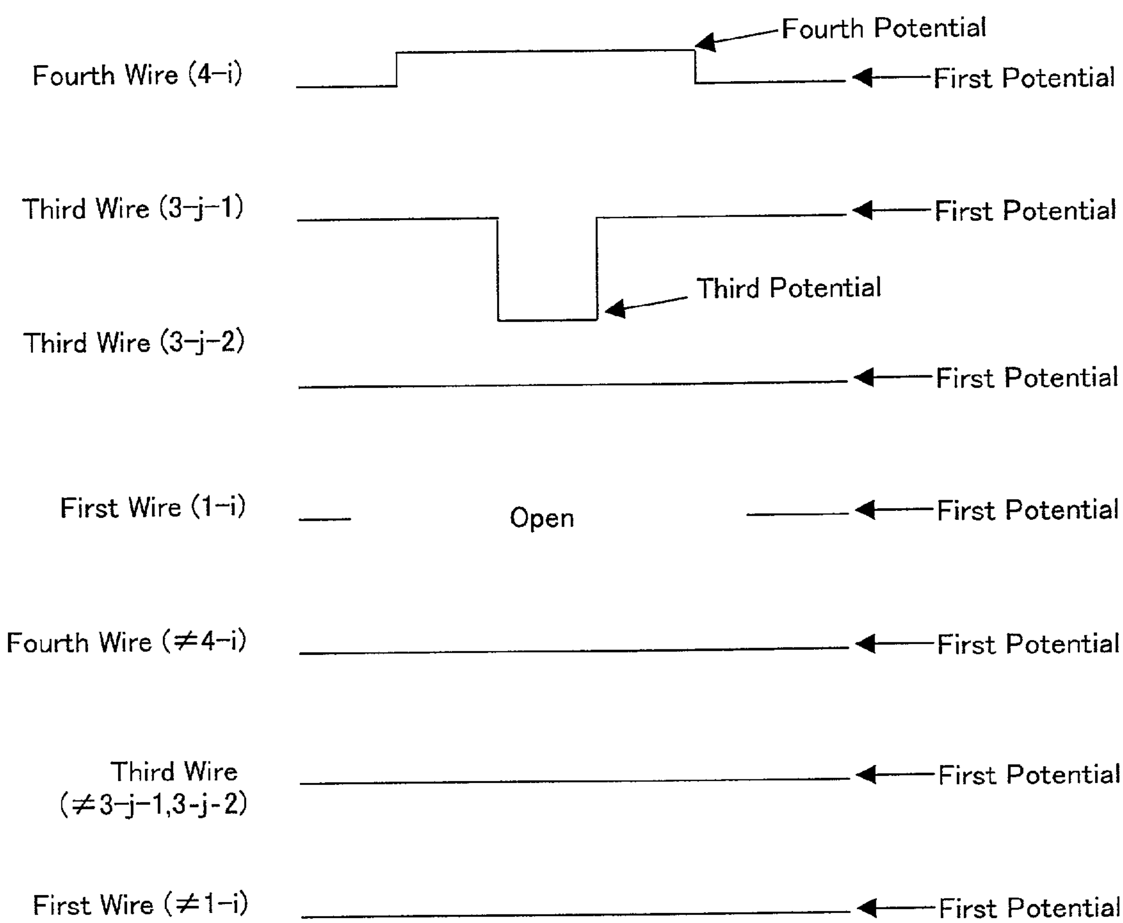
Figure 267:
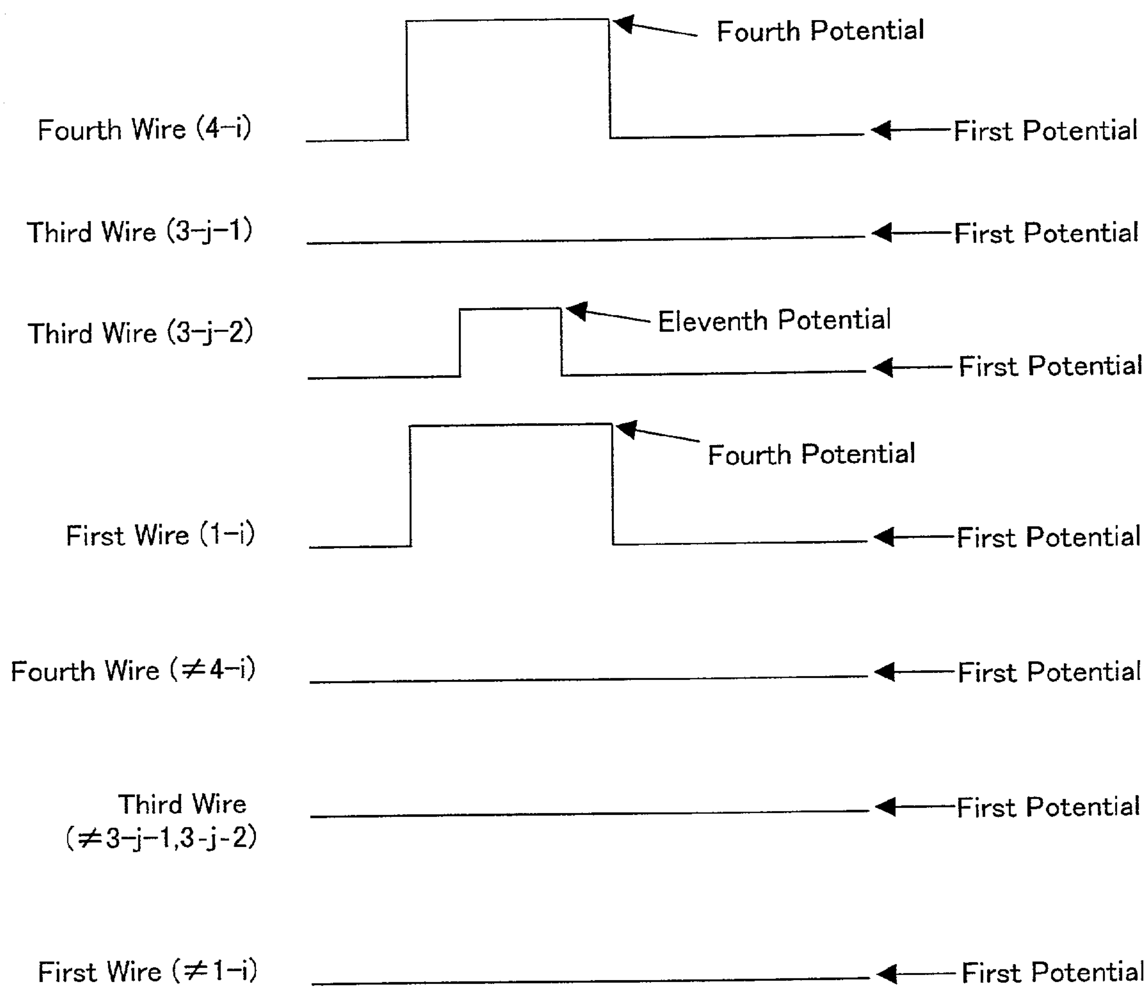
Figure 268:
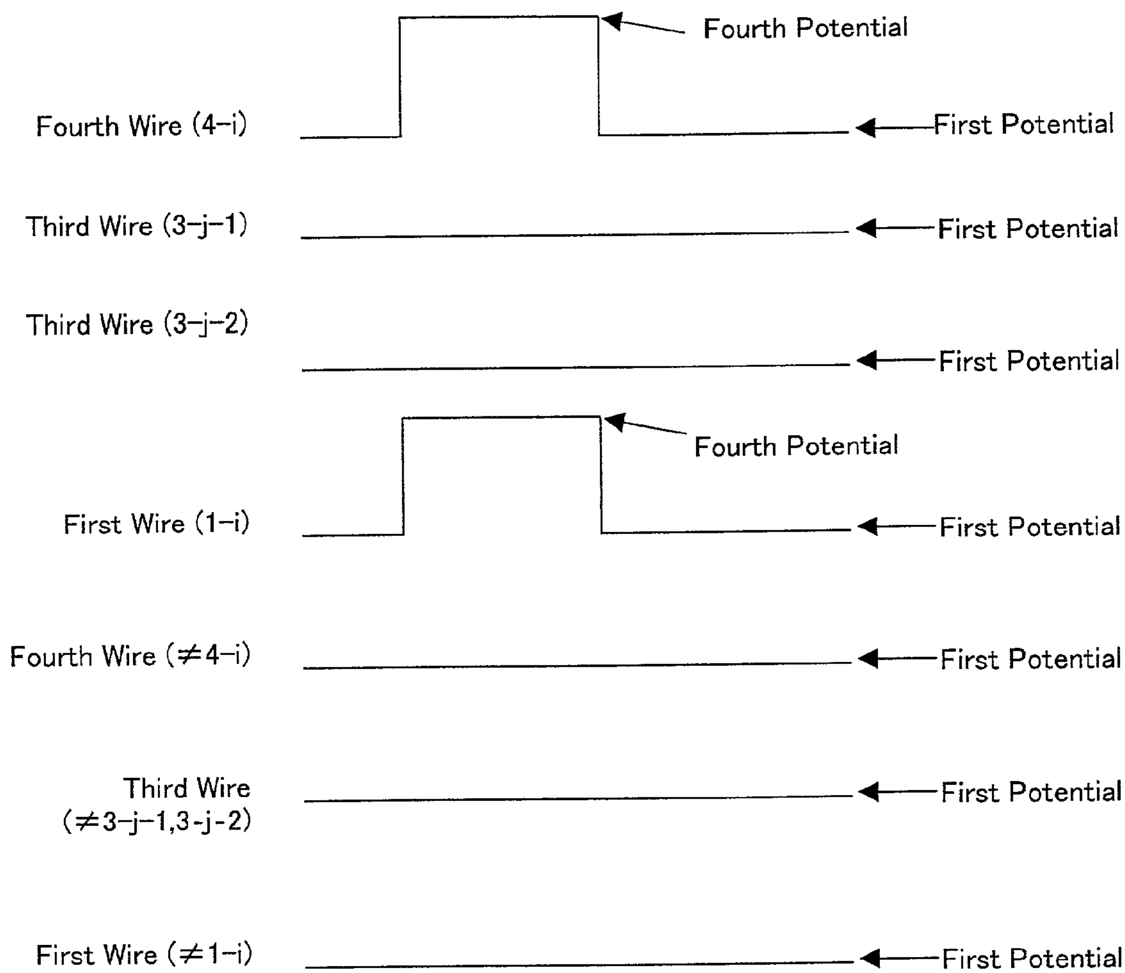
Figure 269:
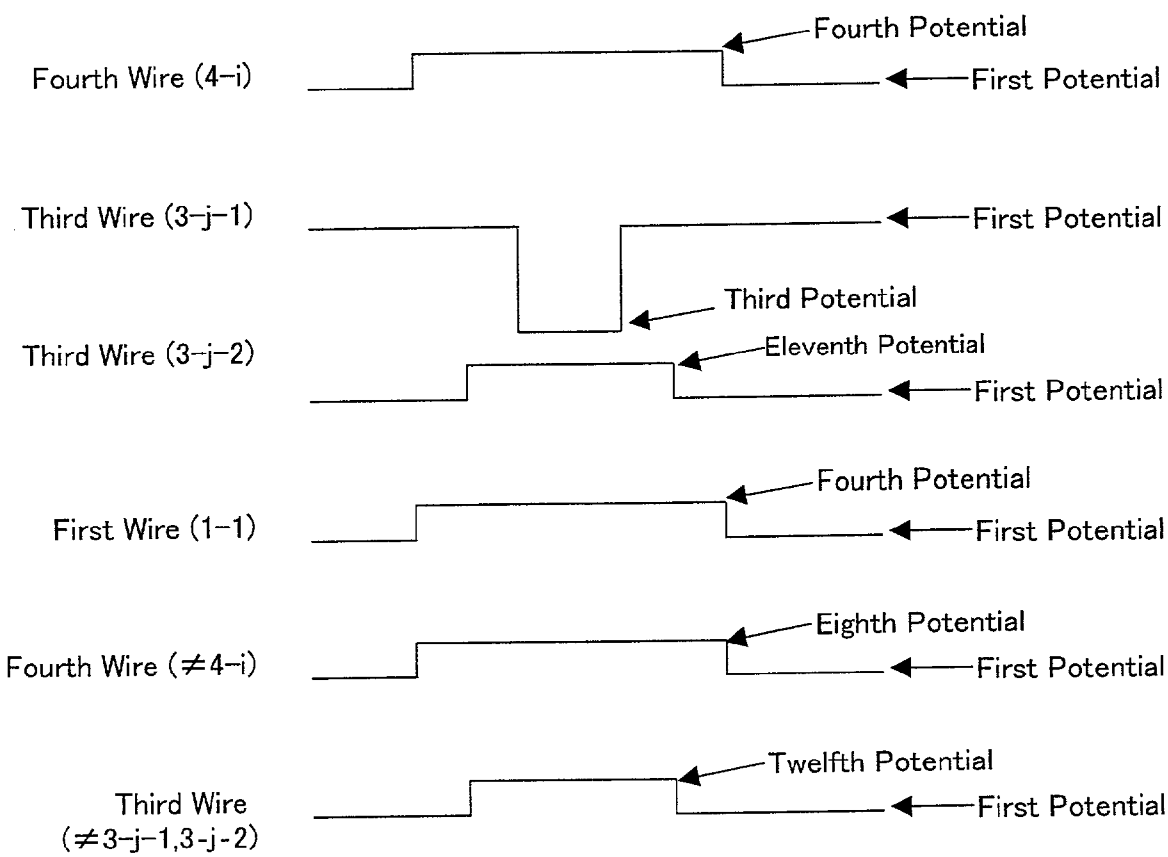
Figure 270:
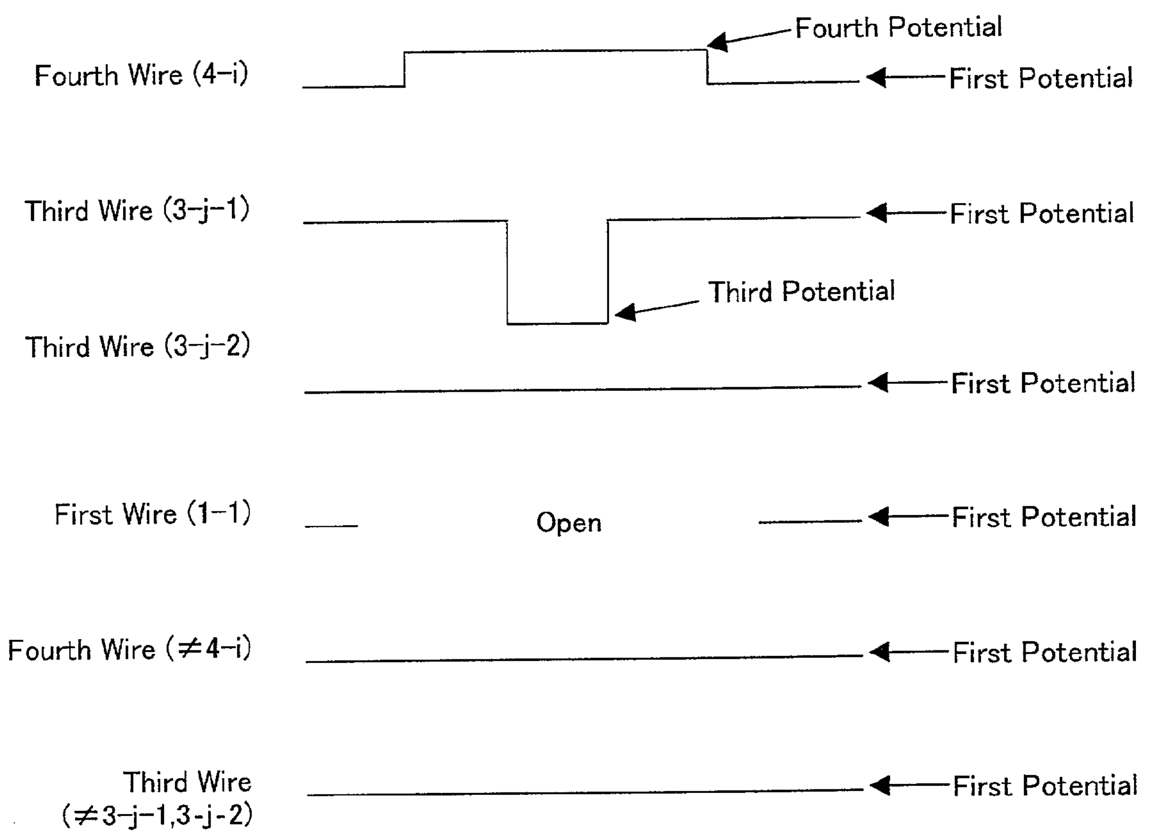
Figure 271:
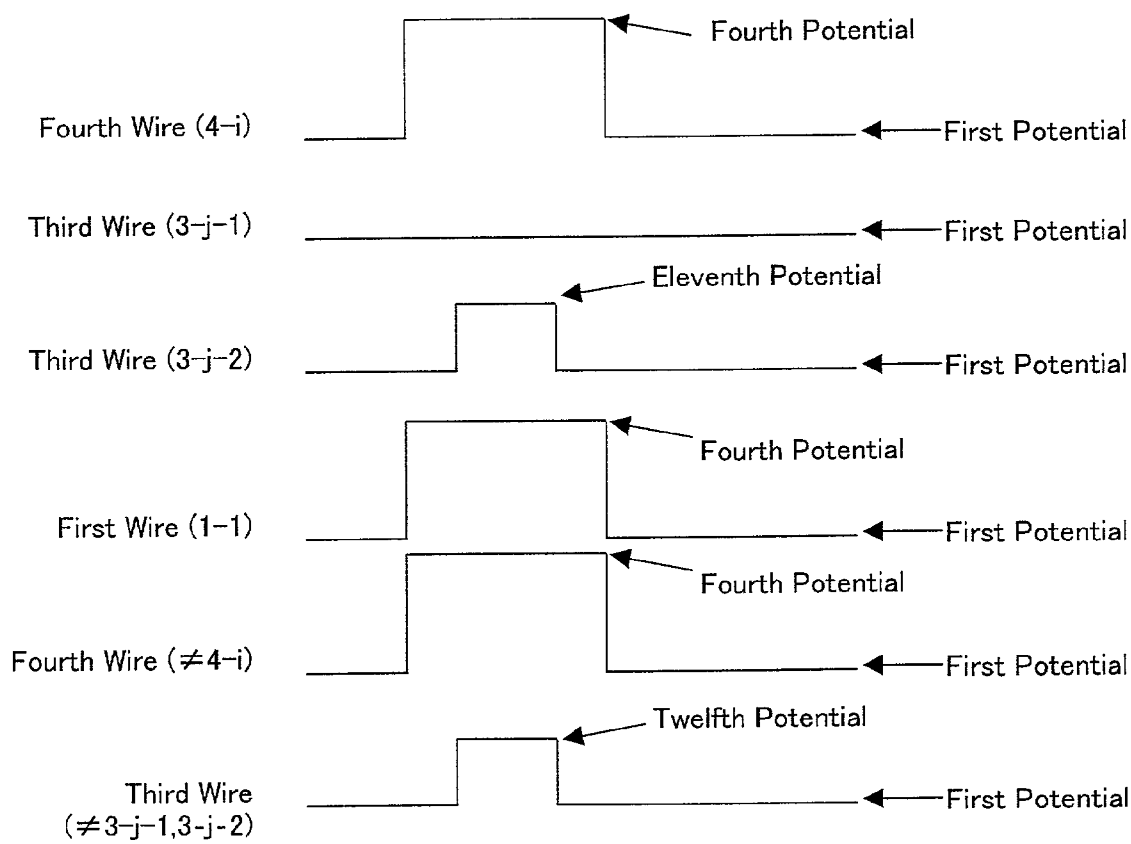
Figure 272:
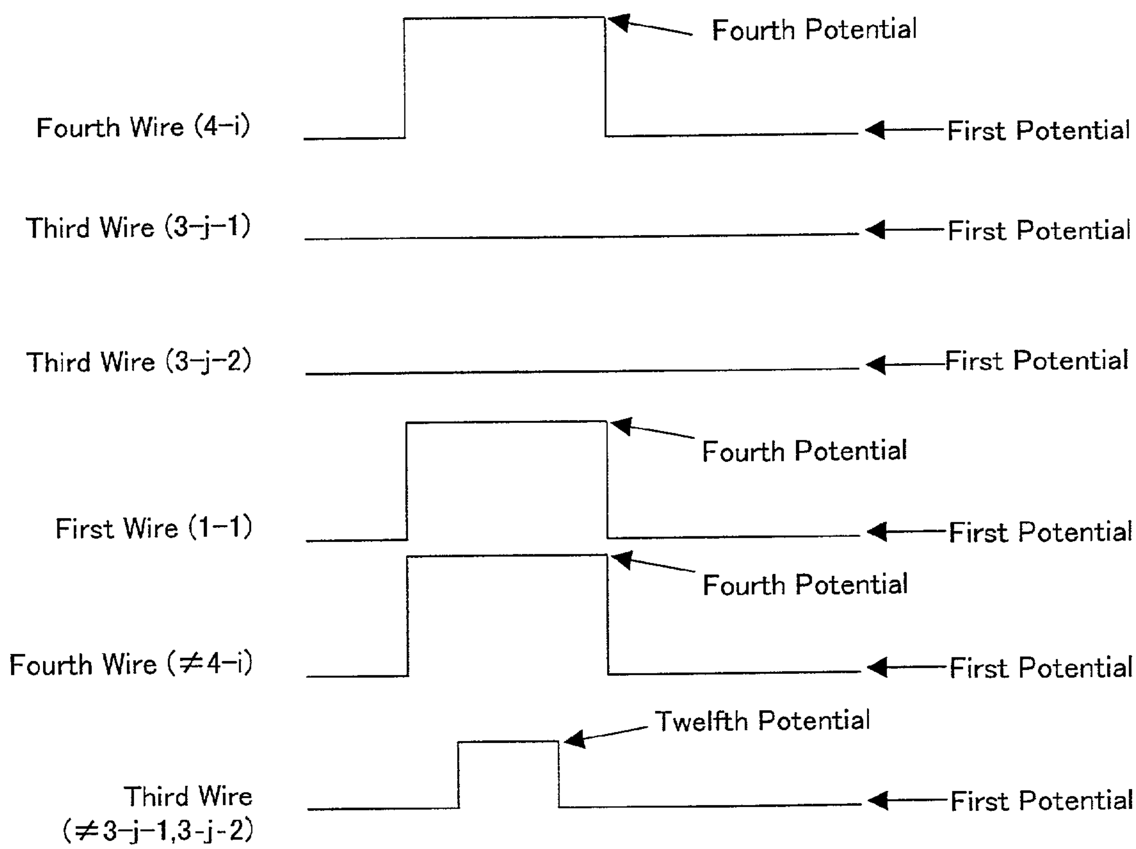

If the ground potential, i.e., the first potential, is applied as the third potential to the third wires (3-i-1 to 3-i-2) as shown in a timing chart of FIG. 264 for the potentials for erasing data, a plurality of cells connected to the first wire (1-j) are erased. If the ground potential is applied as the third potential to all the third wires (3-1-1 to 3-N-2), all cells are erased.

Have been described above the examples of the principle of erasing data in the case where the first wires are arranged in parallel to the third wires. FIG. 265 to FIG. 268 show examples of timing charts for erasing data in the case where the first wires are arranged in parallel to the fourth wires. FIG. 265 to FIG. 268 conform to FIG. 261 to FIG. 264, respectively, except that the first wire (1-i) instead of the first wire (1-j) is connected to the end of the island-like semiconductor layer including the selected cell. At this time, as shown in FIG. 265 to FIG. 268, the ground potential may be applied as the first potential to the fourth wires (not 4-i), the third wires (not 3-j-1 to 3-j-L) and the first wires (not 1-i).

FIG. 269 to FIG. 272 show examples of timing charts for erasing data in the case where the first wires are connected in common in the entire array. FIG. 269 to FIG. 272 conform to FIG. 261 to FIG. 264, respectively, except that the first wire (1-i) instead of the first wire (1-j) is connected to the end of the island-like semiconductor layer including the selected cell.

Have been described above the examples of the principles of erasing data in the case of M×N (M and N are positive integers) island-like semiconductor layers having two memory cells formed of the P-type semiconductor and arranged in series. However, the polarity of all the electrodes may be reversed as in the case of island-like semiconductor layers formed of an N-type semiconductor. At this time, the potentials have a relationship in magnitude reverse to that mentioned above.

An erasing process is now explained with a semiconductor memory according to the present invention which is constructed to include a plurality of (e.g., M×N, wherein M and N are positive integers) island-like semiconductor layers each having, for example, two memory cells connected in series, the memory cells being each provided with the charge storage layer and the third electrode as a control gate electrode. In this memory cell array, a plurality of (e.g., M) fourth wires arranged in parallel with the semiconductor substrate are connected to end portions of the island-like semiconductor layers, and first wires are connected to opposite end portions of the island-like semiconductor layers. A plurality of (e.g., N×2) third wires are arranged in parallel to the semiconductor substrate and in a direction crossing the fourth wires and are connected to the third electrodes of the memory cells. The erasing process utilizes the channel hot electron (CHE) current.

FIG. 140 shows an equivalent circuit diagram of the above-described memory cell array in which the first wires are arranged in parallel to the third wires. For example, in the case where the island-like semiconductor layers are formed of a P-type semiconductor, a selected cell shown in FIG. 140 is erased by applying a first potential to the first wire (1-j, wherein j is a positive integer, 1≦j≦N) connected to the first electrode of an island-like semiconductor layer including the selected cell, a ninth potential to first wires (not 1-j) other than the above-mentioned first wire (1-j), a third potential to the third wire (3-j-1) connected to the selected cell, an eleventh potential to a third wire (3-j-2) connected to a non-selected cell arranged in series with the selected cell, a twelfth potential to third wires (not 3-j-1 to 3-j-2) connected other than mentioned above, a fourth potential to a fourth wire (4-i, wherein i is a positive integer, 1≦i≦M) connected to the fourth electrode of the island-like semiconductor layer including the selected cell and an eighth potential to fourth wires (not 4-i) other than the above-mentioned fourth wire (4-i). The application of these potentials causes the CHE current to occur in the tunnel region of the selected cell to change the state of the charge in the charge storage layer. In the case where the "1" is erased by storing a negative charge in the charge storage layer, for example, the fourth potential is larger than the first potential and the third potential is larger than the first potential. In this case, the first potential is preferably a ground potential. The third or fourth potential is a potential such that the "1" can be erased by a difference between the third potential and the first potential or by a difference between the fourth potential and the first potential, for example, a potential such that the above-mentioned potential difference can produce a sufficient CHE current as means for changing the state of the charge in the charge storage layer. The CHE current flows in the tunnel oxide film of the memory transistor having as the gate electrode the third electrode to which the third potential is applied.

The eleventh potential is a potential always allowing the cell current to flow in the memory cell regardless of the state of the charge in the charge storage layer, that is, a potential such that a reverse layer can be formed in the channel region of the memory cell and the state of the charge in the charge storage layer is not changed by the eleventh potential. For example, supposing that the erasure of the "1" means storing electrons in the charge storage layer, for example, the eleventh potential is a potential not less than the threshold that the memory transistor having, as the gate electrode, the third electrode connected to the third wire (3-j-2) can take and allows only a sufficiently small F-N or CHE current to flow in the funnel oxide film of the memory transistor having, as the gate electrode, the third electrode to which the eleventh potential is applied. The ninth potential may be an optional potential which does not erase the "1" by the potential difference from the eight potential, the fourth potential and the twelfth potential, but is preferably equal to the eighth potential. The ninth potential may be open. The twelfth potential is preferably a grand potential.

In the case where the first wires (1-1 to 1-N) are formed as impurity diffusion layers in the semiconductor substrate and the tenth potential applied to the semiconductor substrate, the first potential is generally a ground potential. In the case where the first wires (1-1 to 1-N) are formed to be electrically insulated from the semiconductor substrate, for example, in the case where the first wires (1-1 to 1-N) are formed as impurity diffusion layers in an SOI substrate and is insulated from the semiconductor substrate by an insulating film, the first potential is not necessarily the same as the tenth potential.

The memory cells may be sequentially erased from a memory cell connected to a third wire (3-j-2) to a memory cell connected to a third electrode (3-j-1), or may be erased in reverse order or at random. Further, some or all memory cells connected to the third wire (3-j-1) may be erased at the same time, and some or all memory cells connected to the third wires (3-1-1 to 3-N-2) may be erased at the same time. Also, some or all memory cells connected to third wires selected regularly, e.g., the third wires (3-(j−8)-1), (3-j-1), (3-(j+8)-1), (3-(j+16)-1), . . . , may be erased at the same time. Further some or all memory cells of one island-like semiconductor layer connected to the fourth wire (4-i) may be erased at the same time, or some or all memory cells of some or all island-like semiconductor layers connected to the fourth wire (4-i) may be erased at the same time. Memory cells of one island-like semiconductor layer connected to each of a plurality of fourth wires may be erased at the same time, or memory cells of some or all island-like semiconductor layers connected to each of a plurality of fourth wires may be erased at the same time. The memory cells connected to the third wire (3-j-1) may be erased at the same time by given intervals, for example, every eight fourth wires (e.g., a fourth wire (4-(i−16)), a fourth wire (4-(i−8)), a fourth wire (4-i), a fourth wire (4-(i+8)), a fourth wire (4-(i+16)), . . . ). All the memory cells having, as the gate electrodes, the third electrodes connected to the third wire (3-j-1) can be erased at the same time by applying the first potential to all the fourth wires, applying the fourth potential to the first wire (1-j) and the eighth potential to the first wires (not 1-j) and applying the third potential to the third wire (3-j-1). Further, the selected cell can be erased by applying the ninth potential (the first potential<the ninth potential<the fourth potential) to fourth wires (not 4-i) not including the selected cell, the first potential to the fourth wire (4-i), the fourth potential to the first wire (1-j), the eight potential to first wires (not 1-j) and the third potential to the third wire (3-j-1). Further, all memory cells having, as the gate electrodes, the third electrodes connected to the third wire to which the third potential is applied by applying the fourth potential to a plurality of first wires, the third potential to the third wire (3-j-1) connected to the third electrode of the memory cell included in the island-like semiconductor layer having the first electrode connected to the first wire and the eleventh potential to the third wires (not 3-j-1). The above-described erasing processes may be combined.

Have been described so far the erasure of the "1" in the selected cell with reference to an example in which the floating gate functions as the charge storage layer, the erasure to the "1" means changing the state of the charge in the charge storage layer, the erasure to the "0" means not changing the state of the charge and the CHE current is utilized as means for changing the state of the charge. However, the charge storage layer may be a dielectric, a laminated insulating film and the like in addition to the floating gate. Also it is needless to say that the erasure to the "0" means changing the state of the charge in the charge storage layer and the erasure to the "1" means not changing the state of the charge. Further, the erasure to the "0" may mean slightly changing the state of the charge in the charge storage layer and the erasure to the "1" may mean greatly changing the state of the charge, vice versa. Further, the erasure to the "0" may mean changing the state of the charge in the charge storage layer to negative and the erasure to the "1" may mean changing the state of the charge to positive, vice versa. The above definitions of the "0" and "1" may be combined. The means for changing the state of the charge in the charge storage layer is not limited to the CHE current.

FIG. 142 shows an equivalent circuit diagram of a memory cell array in which the first wires are arranged in parallel to the fourth wires. The application of the potentials of FIG. 142 is the same as that of FIG. 138 for erasing data except that the first potential is applied to the first wire (1-i) and the ninth potential is applied to the first wires (not 1-i).

FIG. 146 shows an equivalent circuit diagram of a memory cell array in which a plurality of first wires are electrically connected in common. The application of the potentials of FIG. 146 is the same as that of FIG. 138 for erasing data except that the first potential is applied to the first wire (1-1).

Have been described the examples of applying the potentials for erasing data. Now are described examples of timing charts for applying potentials for erasing data in the case where there are arranged M×N (M and N are positive integers) island-like semiconductor layers having two memory cells formed of the P-type semiconductor and arranged in series and the first wires and the third wires are arranged in parallel.

Figure 273:
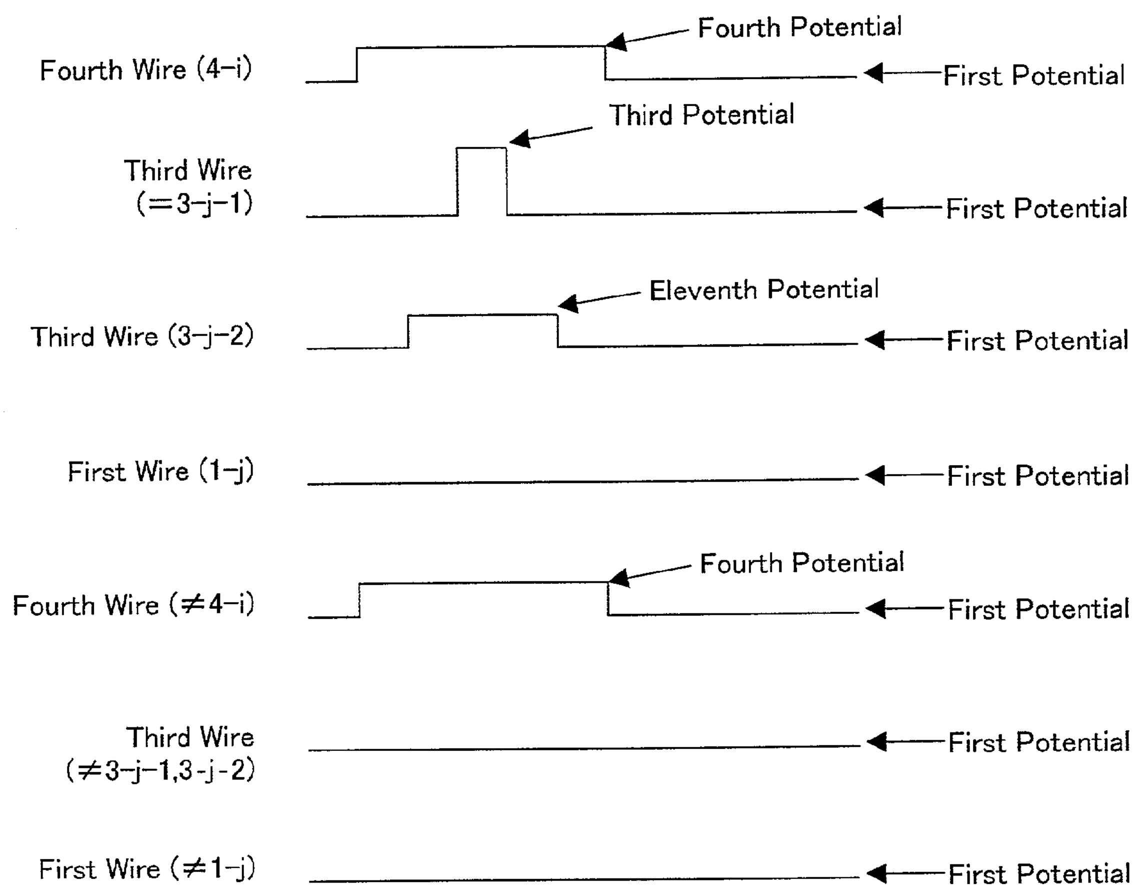

FIG. 273 shows a timing chart showing an example of timing of applying each potential for erasing data. In FIG. 273, a ground potential, for example, is applied as the first potential and ninth potential to the first wire, and the memory cell has a threshold of 5.0 V to 7.5 V when it is in the written state and has a threshold of 0.5 V to 3.0 V when it is in the erased state. In the case where the "1" is erased by storing a negative charge in the charge storage layer, for example, a ground potential is applied as the first potential to the first wires (1-1 to 1-N), the third wires (3-1-1 to 3-N-2) and the fourth wires (4-1 to 4-M). In this state, the fourth potential, e.g., 6 V, is applied to the fourth wire (4-i), the eighth potential, e.g., 6 V which is equal to the fourth potential, is applied to fourth wires (not 4-i) other than the fourth wire (4-i), the twelfth potential, e.g., a ground potential, is applied to third wires (not 3-j-1 to 3-j-2) connected to non-selected cells not arranged in series with the selected cell, the eleventh potential, e.g., 8 V, is applied to the third wire (3-j-2) connected to a non-selected cell arranged in series with the selected cell, and the third potential, e.g., 12 V, is applied to the third wire (3-j-1) connected to the selected cell. The selected cell is erased to "0" by sustaining this state for a desired period of time. The potentials may be applied to the respective wires in another order or simultaneously. The third wire (3-j-1) is returned to the ground potential, the third wires (3-j-2) is returned to the ground potential, and the fourth wires (4-1 to 4-M) are returned to the ground potential. The respective wires may be returned to the ground potential in another order or simultaneously. The potentials given may be any combination of potentials so long as they meet conditions for erasing a desired cell.

Here, the same potential is preferably applied initially as the first potential to the first wires (1-1 to 1-N), the third wires (3-1-1 to 3-N-2) and the fourth wires (4-1 to 4-M), but different potentials may be applied. In the above example, the erasing process has been described with the case where the selected cell is a memory cell having the third wire (3-j-1) as the gate electrode. However, the erasing process is the same with the case where the selected cell is a memory cell having, as the gate electrode, one of the third wires other than the third wire (3-j-1).

Figure 274:
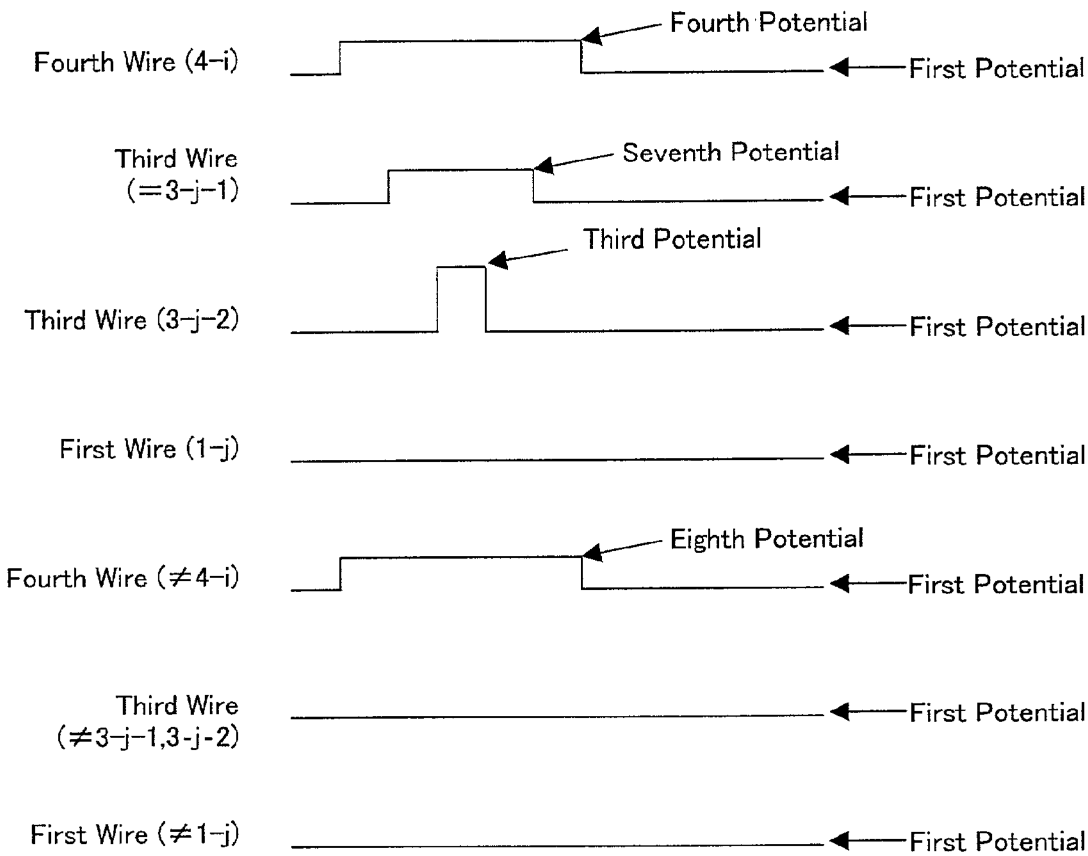

FIG. 274 shows a timing chart showing an example of timing of applying each potential for erasing data in the case where all memory cells connected to the third wire (3-j-2) are selected cells in contrast to FIG. 273. The erasing process of FIG. 274 conforms to that of FIG. 273 except that the seventh potential instead of the eleventh potential is applied to third wired connected to non-selected cells arranged in series with the selected cells. At this time, the seventh potential is the same as the eleventh potential. FIG. 141 shows an equivalent circuit diagram in the case where all memory cells connected to the third wire (3-j-2) are selected cells.

Figure 275:
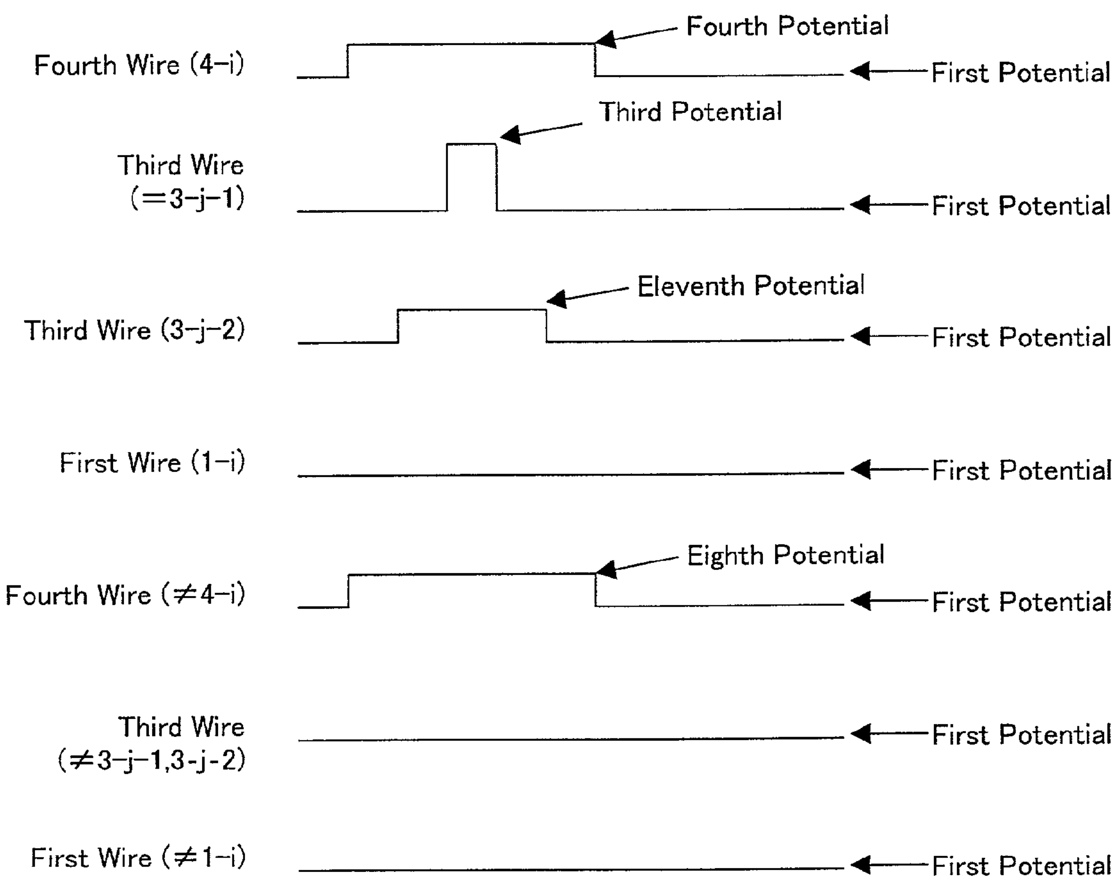

Have been described the examples of the principle of erasing data in the case where the first wires and the third wires are arranged in parallel. Now FIG. 275 shows an example of timing charts for applying potentials for erasing data in the case where the first wires and the fourth wires are arranged in parallel. In FIG. 275, a ground potential is applied as the first potential, and the memory cell has a threshold of 5.0 V to 7.5 V when it is in the erased state and has a threshold of 0.5 V to 3.0 V when it is in the written state. The application of the potentials of FIG. 275 conforms to that of FIG. 273 except that the first wire (1-i) instead of the first wire (1-j) is connected to the end of the island-like semiconductor layer including the selected cell.

Figure 276:
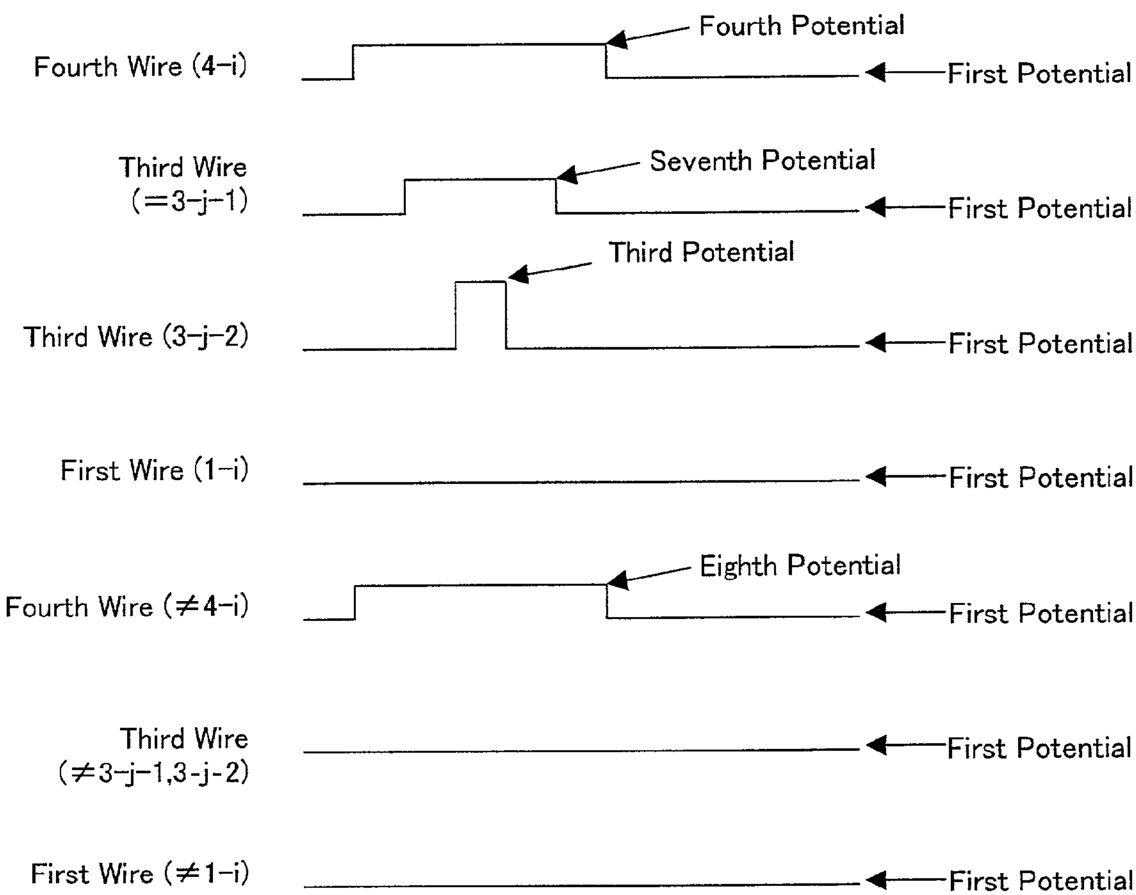

FIG. 276 shows a timing chart showing an example of timing of applying each potential for erasing data in the case where all memory cells connected to the third wire (3-j-2) are selected cells in contrast to FIG. 275. The erasing process of FIG. 276 conforms to that of FIG. 275 except that the seventh potential instead of the eleventh potential is applied to third wired connected to non-selected cells arranged in series with the selected cells. At this time, the seventh potential is the same as the eleventh potential. FIG. 145 shows an equivalent circuit diagram in the case where all memory cells connected to the third wire (3-j-2) are selected cells.

Figure 277:
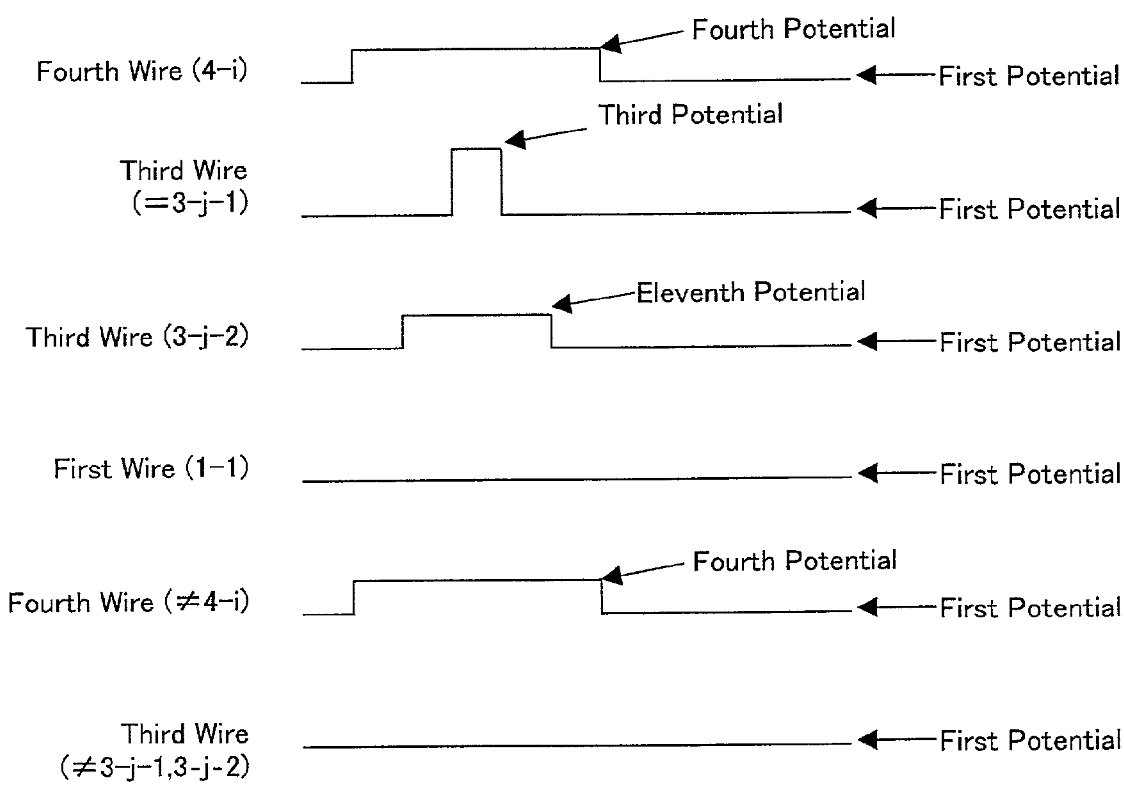

FIG. 277 shows a timing chart showing an example of timing of applying each potential for erasing data in the case where the first wires are connected in common in the entire array. In FIG. 277, a ground potential is applied as the first potential, and the memory cell has a threshold of 5.0 V to 7.5 V when it is in the erased state and has a threshold of 0.5 V to 3.0 V when it is in the written state. The application of the potential of FIG. 277 conforms to that of FIG. 273 except that the first wire (1-1) instead of the first wire (1-j) is connected to the end of the island-like semiconductor layer including the selected cell.

Figure 278:
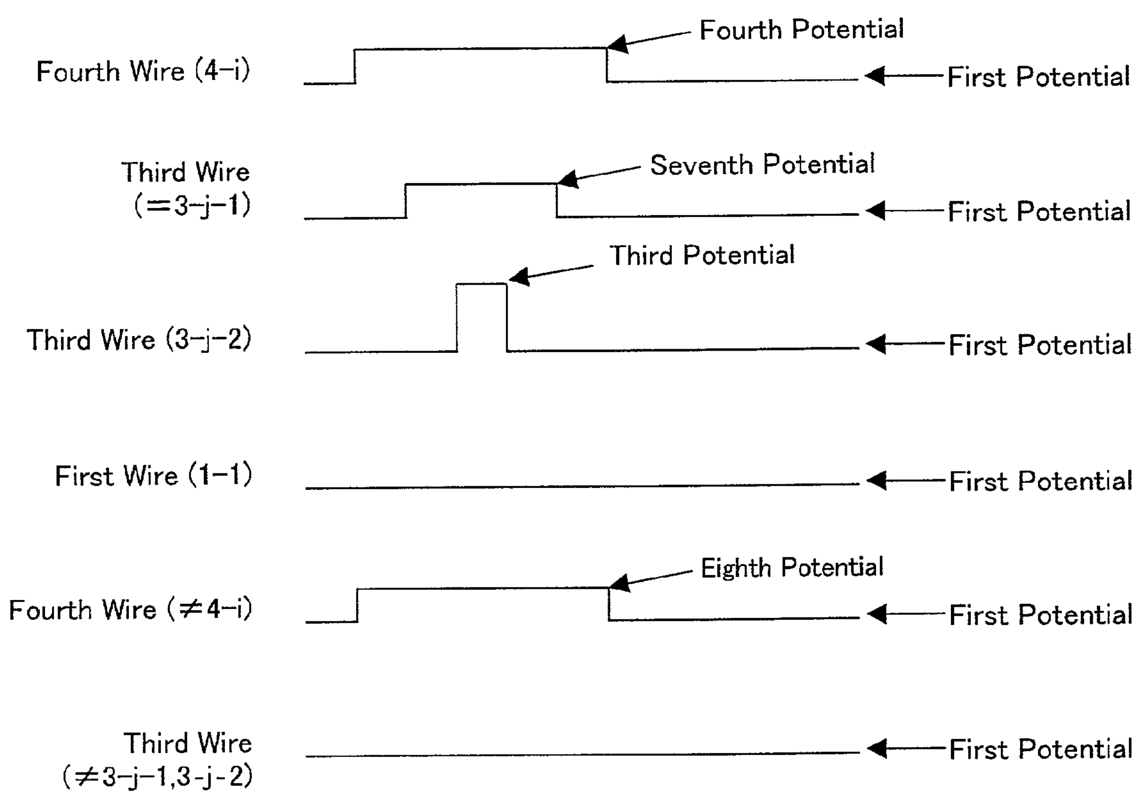

FIG. 278 shows a timing chart showing an example of timing of applying each potential for erasing data in the case where all memory cells connected to the third wire (3-j-2) are selected cells in contrast to FIG. 277. The erasing process of FIG. 278 conforms to that of FIG. 277 except that the seventh potential instead of the eleventh potential is applied to third wired connected to non-selected cells arranged in series with the selected cells. At this time, the seventh potential is the same as the eleventh potential. FIG. 149 shows an equivalent circuit diagram in the case where all memory cells connected to the third wire (3-j-2) are selected cells.

Have been described above the examples of the principles of erasing data in the case of M×N (M and N are positive integers) island-like semiconductor layers having two memory cells formed of the P-type semiconductor and arranged in series. However, the polarity of all the electrodes may be reversed as in the case of island-like semiconductor layers formed of an N-type semiconductor. At this time, the potentials have a relationship in magnitude reverse to that mentioned above.

Has been described so far the erasing process with the cases where the charge storage layer is the floating gate, the erasure data means changing the state of the charge in the charge storage layer to decrease the threshold of the selected memory transistor and the CHE current is used as means for changing the state of the charge. However, the charge storage layer may be a dielectric, a nitride film of the MONOS structure and the like in addition to the floating gate. Also the erasure may mean changing the state of the charge in the charge storage layer to increase the threshold of the selected memory transistor. The means for changing the state of the charge in the charge storage layer is not limited to the CHE current, but a hot hole may be utilized.

Have been described above the examples of the principles of erasing data in the case where there are arranged M×N (M and N are positive integers) island-like semiconductor layers having two memory cells formed of the P-type semiconductor and arranged in series and the first wire is in common in the entire array. However, the polarity of all the electrodes may be reversed as in the case of island-like semiconductor layers formed of an N-type semiconductor. At this time, the potentials have a relationship in magnitude reverse to that mentioned above.

Now explanation is given of memory cells other than those having floating gates as the charge storage layers.

Figure 150:
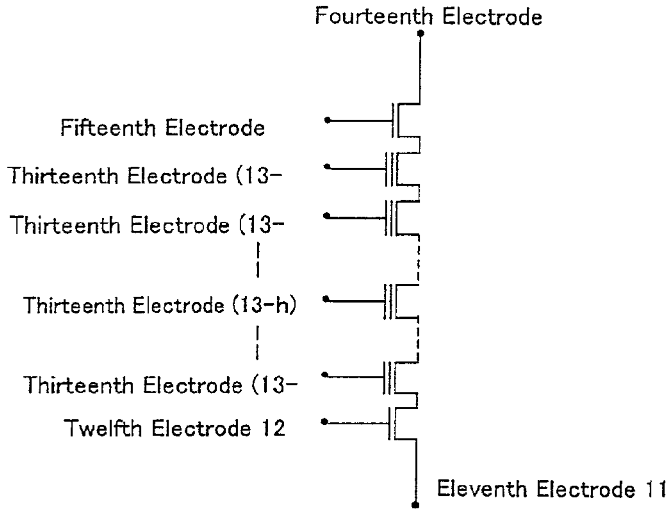
Figure 151:
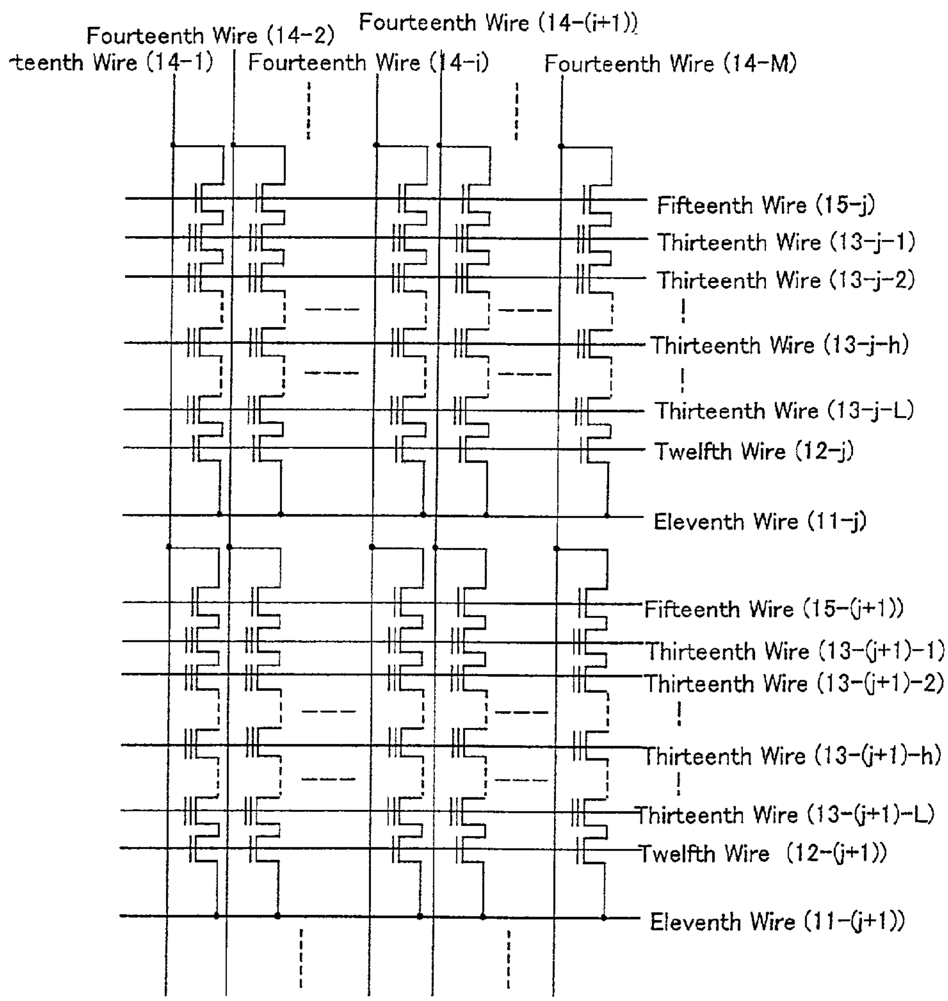

FIG. 150 and FIG. 151 are equivalent circuit diagrams of part of a memory cell array of the MONOS structure shown as an example in FIG. 65 and FIG. 101 to FIG. 110. FIG. 150 is an equivalent circuit diagram of memory cells of the MONOS structure arranged in one island-like semiconductor layer 110, and FIG. 151 is an equivalent circuit diagram in the case where a plurality of island-like semiconductor layers 110 are arranged.

Now explanation is given of the equivalent circuit diagram of FIG. 150.

The island-like semiconductor layer 110 has, as the selection gate transistors, a transistor provided with a twelfth electrode 12 as the gate electrode and a transistor provided with a fifth electrode 15 as the gate electrode and a plurality of (e.g., L, L is a positive integer) memory cells arranged in series. The memory cell has a laminated insulating film as the charge storage layer between the selection electrodes and has a thirteenth electrode (13-h, h is a positive integer, 1<h<L). A fourteenth electrode 14 is connected to an end of the island-like semiconductor layer 110 and an eleventh electrode 11 is connected to another end thereof.

Next explanation is given of the equivalent circuit diagram of FIG. 151.

Now there is shown a connection relationship between each circuit element arranged in each island-like semiconductor layer 110 shown in FIG. 150 and each wire in a memory cell array where a plurality of island-like semiconductor layers 110 are arranged.

Are provided a plurality of (e.g., M×N, M and N are positive integers; i is a positive integer, 1≦i≦M; j is a positive integer, 1≦j≦N) island-like semiconductor layers 110. In the memory cell array, a plurality of (e.g., M) fourteenth wires in parallel with the semiconductor substrate are connected with the above-mentioned fourteenth electrodes 14 provided in the island-like semiconductor layers 110. A plurality of (e.g., N×L) thirteenth wires in parallel with the semiconductor substrate and in a direction crossing the fourteenth wires 14 are connected with the above-mentioned thirteenth electrodes (13-h, h is a positive integer, 1≦h≦L) of the memory cells. The eleventh wires are arranged in parallel with the thirteenth wires. A plurality of (e.g., N) twelfth wires in parallel with the semiconductor substrate and in a direction crossing the fourteenth wires 14 are connected with the above-mentioned twelfth electrodes 12 of the memory cells, and a plurality of (e.g., N) fifteenth wires in parallel with the semiconductor substrate and in a direction crossing the fourteenth wires 14 are connected with the above-mentioned fifteenth electrodes 15 of the memory cells.

Figure 117:
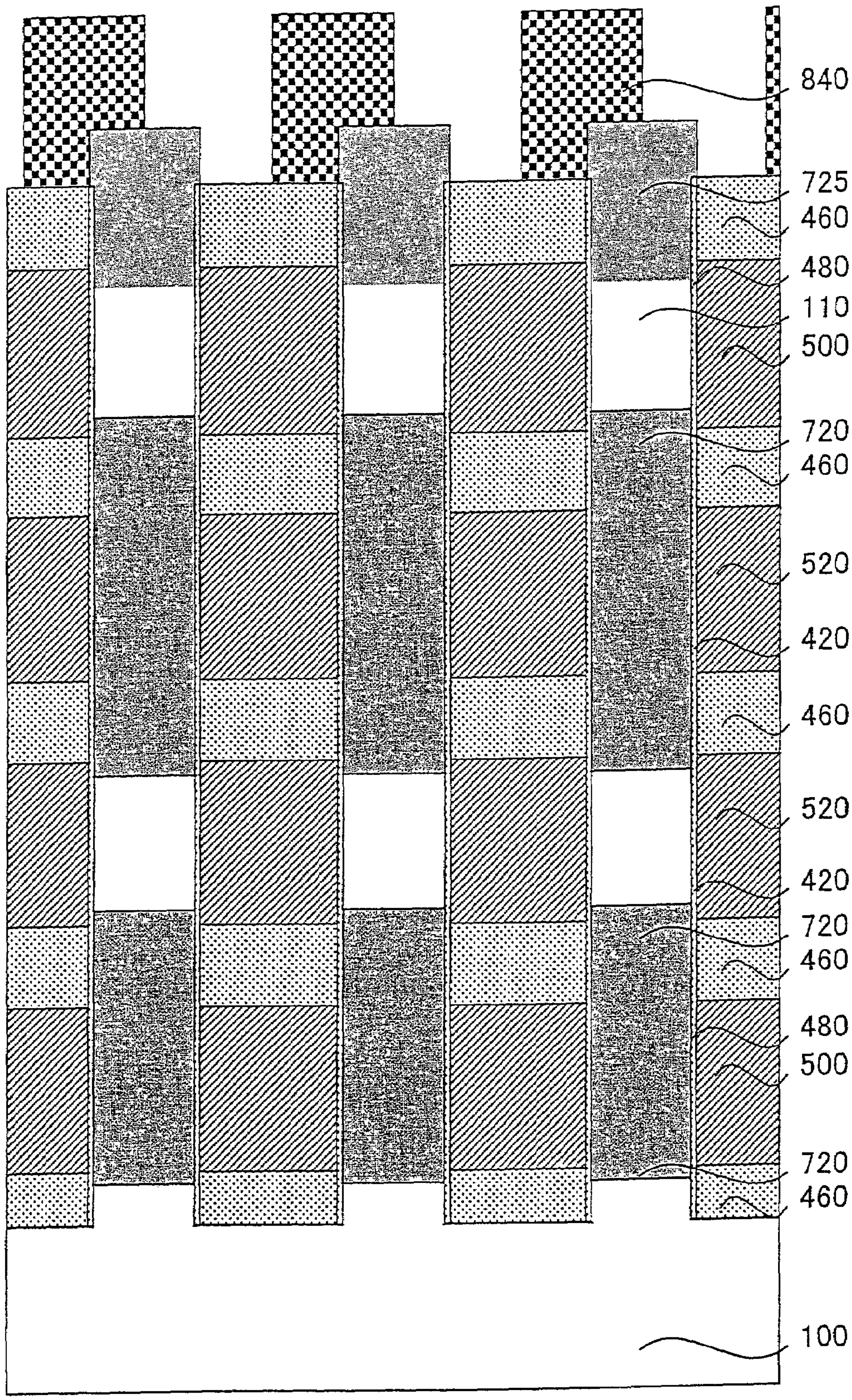
FIG. 117 is a sectional view of a semiconductor memory having MIS capacitors as charge storage layers, corresponding to a sectional view as taken on line A–A' in FIG. 1.
Figure 118:
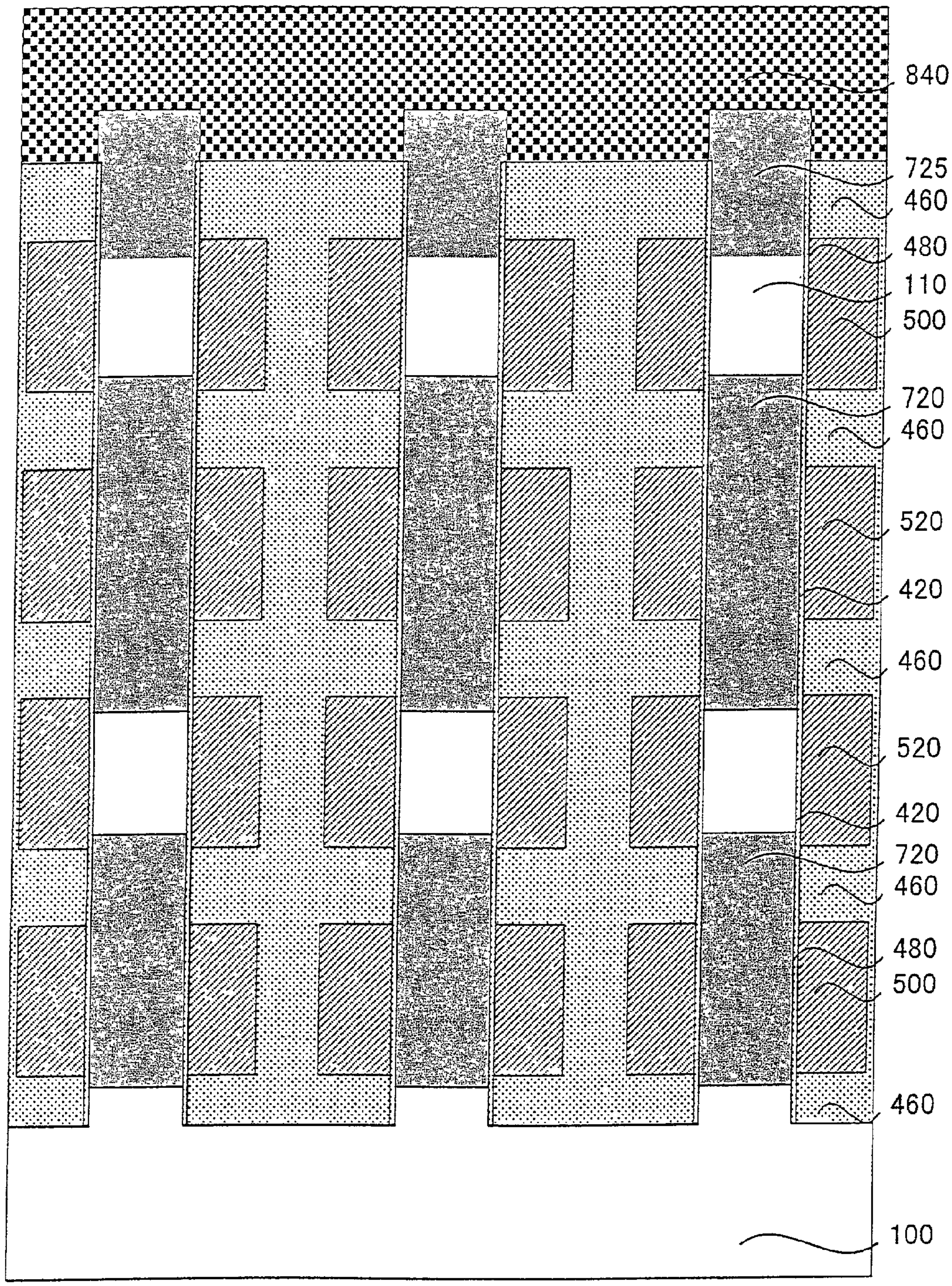
FIG. 118 is a sectional view of a semiconductor memory having MIS capacitors as charge storage layers, corresponding to a sectional view as taken on line B–B' in FIG. 1.
Figure 152:
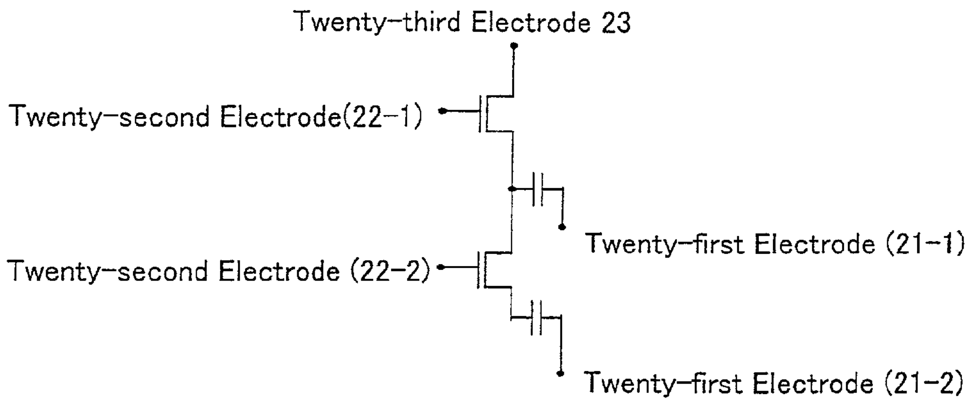
Figure 153:
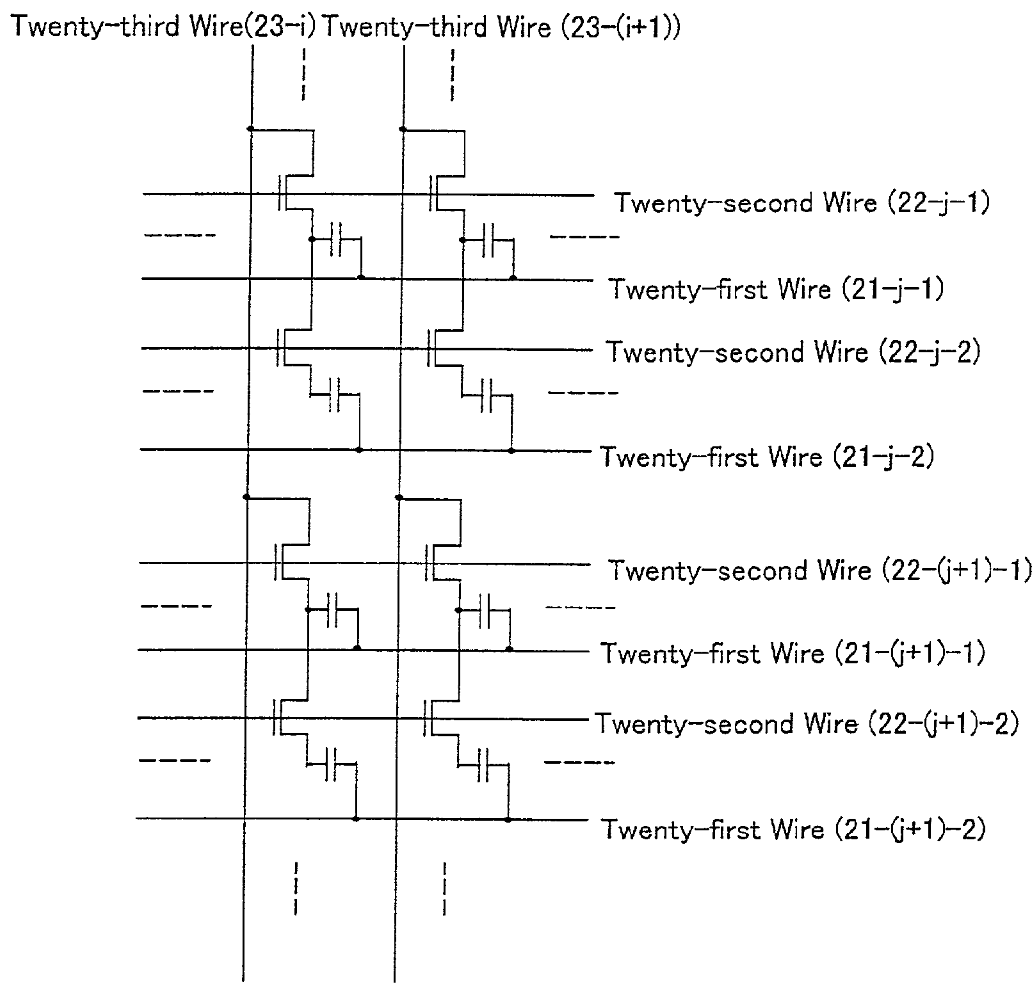

FIG. 152 and FIG. 153 are equivalent circuit diagrams of part of a memory cell array of the DRAM structure shown as an example in FIG. 66, FIG. 117 and FIG. 118. FIG. 152 is an equivalent circuit diagram of memory cells of the DRAM structure arranged in one island-like semiconductor layer 110, and FIG. 153 is an equivalent circuit diagram in the case where a plurality of island-like semiconductor layers 110 are arranged.

Now explanation is given of the equivalent circuit diagram of FIG. 152.

One memory cell is constituted of one transistor and one MIS capacitor connected in series. A twenty-third electrode 23 is connected to one end of the memory cell and a twenty-first electrode 21 is connected to another end of the memory cell. The memory cell is provided with a twenty-second electrode 22 as the gate electrode. For example, two memory cells are connected as shown in FIG. 152. Two twenty-first electrodes (21-1) and (21-2) and two twenty-second electrodes (22-1) and (22-2) are provided in one island-like semiconductor 110 and the twenty-third electrode 23 is provided at an end of the island-like semiconductor layer 110.

Explanation is given of the equivalent circuit diagram of FIG. 153.

Now there is shown a connection relationship between each circuit element arranged in each island-like semiconductor layer 110 shown in FIG. 152 and each wire in a memory cell array where a plurality of island-like semiconductor layers 110 are arranged.

Are provided a plurality of (e.g., M×N, M and N are positive integers; i is a positive integer, 1≦i≦M; j is a positive integer, 1≦j≦N) island-like semiconductor layers 110. In the memory cell array, a plurality of (e.g., M) twenty-third wires in parallel with the semiconductor substrate are connected with the above-mentioned twenty-third electrodes 23 provided in the island-like semiconductor layers 110. A plurality of (e.g., 2×N) twenty-second wires in parallel with the semiconductor substrate and in a direction crossing the twenty-third wires 23 are connected with the above-mentioned twenty-second electrodes (22-1) and (22-2). A plurality of (e.g., 2×N) twenty-first wires in a direction crossing the twenty-third wires 23 are connected with the above-mentioned twenty-first electrodes (21-1) and (21-2) of the memory cells.

FIG. 152 and FIG. 153 show an example in which two memory cells are arranged in one island-like semiconductor layer 110. However, three or more memory cells or one memory cell may be arranged in one island-like semiconductor layer 110.

In the equivalent circuit diagram shown in FIG. 152 and FIG. 153, an MIS capacitor, a transistor, an MIS capacitor and a transistor are disposed from the bottom of the island-like semiconductor layer 110. Alternatively, explanation is given of an example in which a transistor, an MIS capacitor, an MIS capacitor and a transistor are disposed from the bottom of the island-like semiconductor layer 110.

Figure 154:
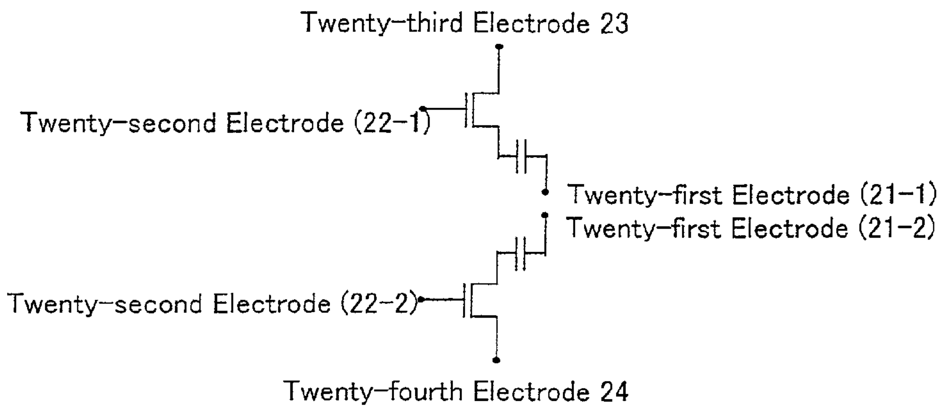
Figure 155:
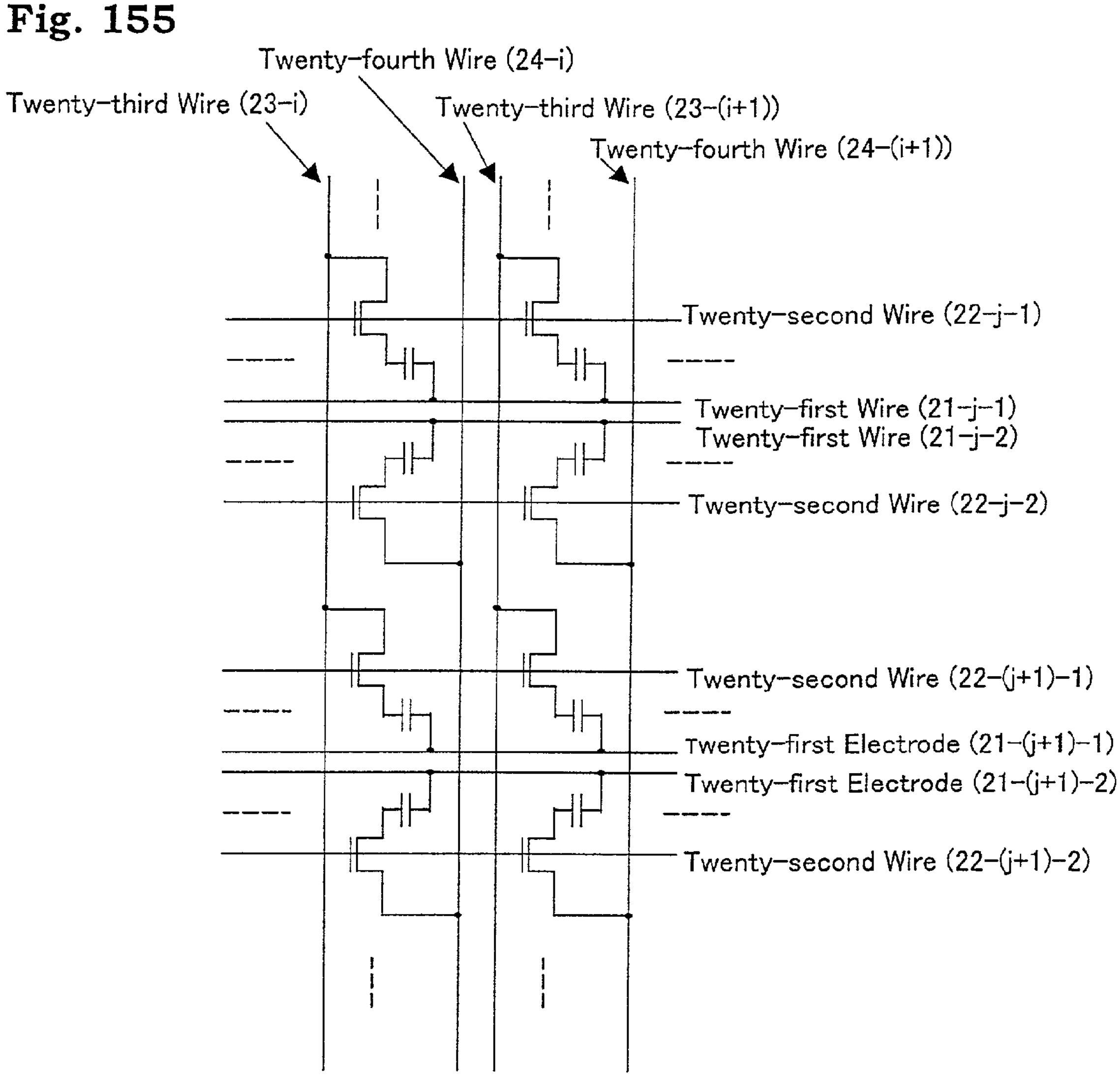

FIG. 154 and FIG. 155 are equivalent circuit diagrams of part of a memory cell array of the DRAM structure shown as an example in FIG. 66 and FIG. 113 to FIG. 116. FIG. 154 is an equivalent circuit diagram of memory cells of the DRAM structure arranged in one island-like semiconductor layer 110, and FIG. 155 is an equivalent circuit diagram in the case where a plurality of island-like semiconductor layers 110 are arranged.

Now explanation is given of the equivalent circuit diagram of FIG. 154.

As in the previous example, the memory cell is constituted of one transistor and one MIS capacitor connected in series. A twenty-third electrode 23 is connected to one end of the memory cell and a twenty-fourth electrode 24 is connected to another end of the memory cell. A twenty-second electrode 22 is connected as the gate electrode. For example, two memory cells are connected as shown in FIG. 154. Two twenty-first electrodes (21-1) and (21-2) and two twenty-second electrodes (22-1) and (22-2) are provided in one island-like semiconductor 110. The twenty-third electrode 23 is provided at an end of the island-like semiconductor layer 110, and the twenty-fourth electrode 24 is provided at another end of the island-like semiconductor layer 110.

Explanation is given of the equivalent circuit diagram of FIG. 155.

Now there is shown a connection relationship between each circuit element arranged in each island-like semiconductor layer 110 shown in FIG. 154 and each wire in a memory cell array where a plurality of island-like semiconductor layers 110 are arranged.

Are provided a plurality of (e.g., M×N, M and N are positive integers; i is a positive integer, 1≦i≦M; j is a positive integer, 1≦j≦N) island-like semiconductor layers 110. In the memory cell array, a plurality of (e.g., M) twenty-third wires in parallel with the semiconductor substrate are connected to the above-mentioned twenty-third electrodes 23 provided in the island-like semiconductor layers 110. A plurality of (e.g., M) twenty-fourth wires are connected to the above-mentioned twenty-fourth electrodes 24 provided in the island-like semiconductor layers 110. A plurality of (e.g., 2×M) twenty-second wires in parallel with the semiconductor substrate and in a direction crossing the twenty-third wires 23 and the twenty-fourth wires 24 are connected with the above-mentioned twenty-second electrodes (22-1) and (22-2). A plurality of (e.g., 2×N) twenty-first wires in a direction crossing the twenty-third wires 23 and the twenty-fourth wires 24 are connected to the above-mentioned twenty-first electrodes (21-1) and (21-2) of the memory cells.

Figure 156:
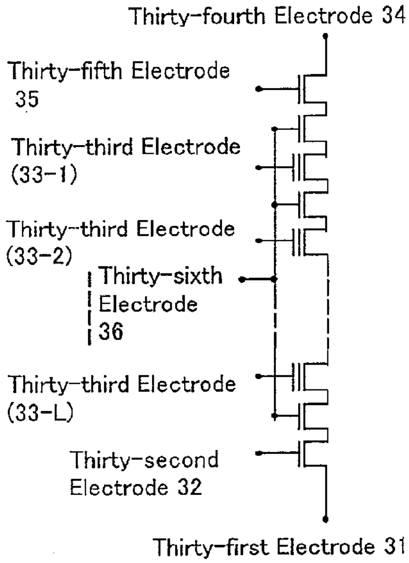
Figure 157:
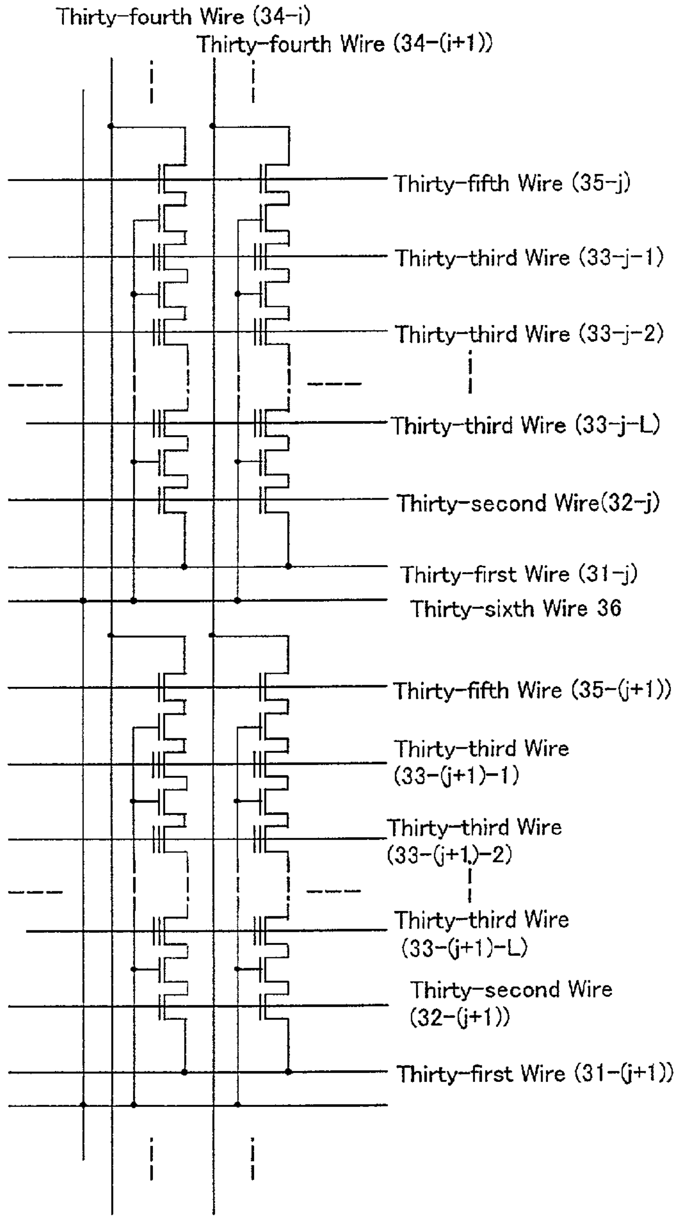

FIG. 156 and FIG. 157 are equivalent circuit diagrams of part of a memory cell array shown as an example in FIG. 93 to FIG. 96, FIG. 111 and FIG. 112 in which diffusion layers 720 are not disposed between the transistors and polysilicon films 530 are formed as third conductive films between the gate electrodes 500, 510 and 520 of the memory transistors and the selection gate transistors. FIG. 156 shows an equivalent circuit diagram of memory cells arranged in one island-like semiconductor layer 110 in which the polysilicon films 530 are formed as third conductive films between the gate electrodes of the memory transistors and the selection gate transistors, and FIG. 157 shows an equivalent circuit diagram in the case where a plurality of island-like semiconductor layers 110 are arranged.

Now explanation is given of the equivalent circuit diagram of FIG. 156.

The island-like semiconductor layer 110 has, as the selection gate transistors, a transistor provided with a thirty-second electrode 32 as the gate electrode and a transistor provided with a thirty-fifth electrode 35 as the gate electrode and a plurality of (e.g., L, L is a positive integer) memory cells arranged in series. The memory cell has a charge storage layer between the selection electrodes and has a thirty-third electrode (33-h, h is a positive integer, 1≦h≦L) as the control gate electrode. The island-like semiconductor layer 110 also has thirty-sixth electrodes as the gate electrodes between the transistors. A thirty-fourth electrode 34 is connected to an end of the island-like semiconductor layer 110 and a thirty-first electrode 31 is connected to another end thereof. A plurality of thirsty-sixth electrodes are connected as a whole and provided in the island-like semiconductor layers 110.

Explanation is given of the equivalent circuit diagram of FIG. 157.

Now there is shown a connection relationship between each circuit element arranged in each island-like semiconductor layer 110 shown in FIG. 156 and each wire in a memory cell array where a plurality of island-like semiconductor layers 110 are arranged.

Are provided a plurality of (e.g., M×N, M and N are positive integers; i is a positive integer, 1≦i≦M; j is a positive integer, 1≦j≦N) island-like semiconductor layers 110. In the memory cell array, a plurality of (e.g., M) thirty-fourth wires in parallel with the semiconductor substrate are connected to the above-mentioned thirty-fourth electrodes 34 provided in the island-like semiconductor layers 110. A plurality of (e.g., N×L) thirty-third wires in parallel with the semiconductor substrate and in a direction crossing the thirty-fourth wires 34 are connected with the above-mentioned thirty-third electrodes (33-h). A plurality of (e.g., N) thirty-first wires in a direction crossing the thirty-fourth wires 34 are connected to the above-mentioned thirty-first electrodes 31 of the island-like semiconductor layers 110. The thirty-first wires are arranged in parallel with the thirty-third wires. A plurality of (e.g., N) thirty-second wires 32 in parallel with the semiconductor substrate and in a direction crossing the thirty-fourth wires 34 are connected to the above-mentioned thirty-second electrodes 32. A plurality of (e.g., N) thirty-fifth wires 35 in parallel with the semiconductor substrate and in a direction crossing the thirty-fourth wires 34 are connected to the above-mentioned thirty-fifth electrodes 35. All the above-mentioned thirty-sixth electrodes 36 provided n the island-like semiconductor layers are connected in unity by thirty-sixth wires.

All the above-mentioned thirty-sixth electrodes 36 provided n the island-like semiconductor layers need not be connected in unity by thirty-sixth wires, but may be connected in two or more groups by dividing the memory cell array with the thirty-sixth wires 36. That is, the memory cell array may be so constructed that the thirty-sixth electrodes 36 are connected block by block.

Figure 158:
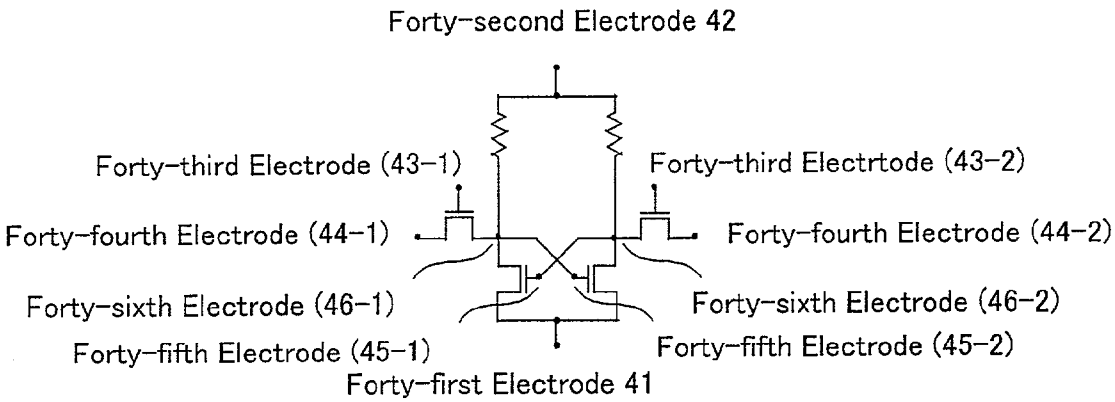
Figure 159:
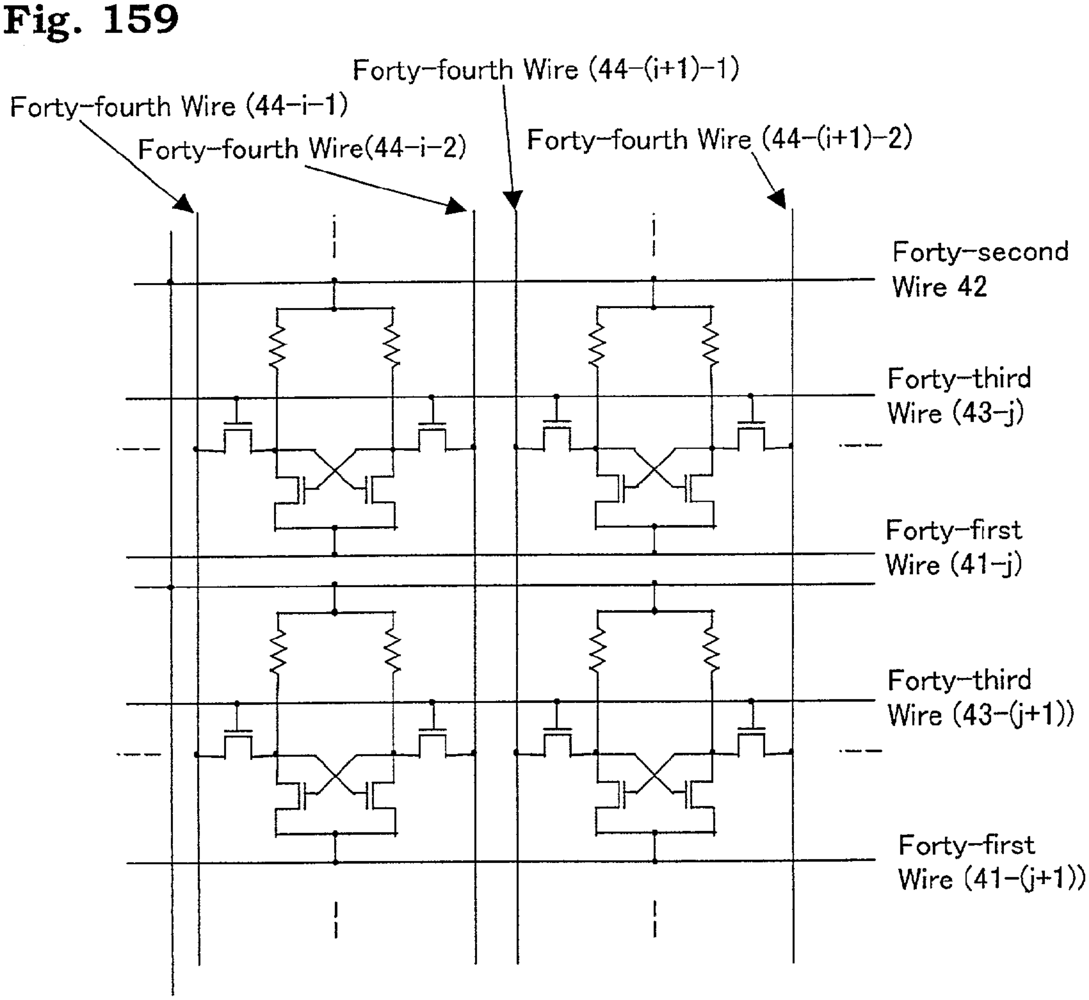

FIG. 158 and FIG. 159 are equivalent circuit diagrams of part of a memory cell array of the SRAM structure shown as an example in FIG. 67, FIG. 119 and FIG. 122. FIG. 158 is an equivalent circuit diagram of a memory cell of the SRAM structure arranged in two island-like semiconductor layers 110, and FIG. 159 is an equivalent circuit diagram in the case where a plurality of memory cells are arranged.

Now explanation is given of the equivalent circuit diagram of FIG. 158.

Two island-like semiconductor layers 110 are disposed adjacently. The island-like semiconductor layer has a transistor provided with, as the gate electrodes, a forty-third electrode and a forty-fifth electrodes connected in series. These four transistors are connected to each other as shown in FIG. 158. More particularly, a forty-sixth electrode (46-2) of a transistor having a forty-third electrode (43-2) as the gate electrode is connected to a forty-fifth electrode (45-1), and a forty-sixth electrode (46-1) of a transistor having a forty-third electrode (43-1) as the gate electrode is connected to a forty-fifth electrode (45-2). In these two adjacent island-like semiconductor layers 110, a forty-forth electrode (44-1) is connected to one end of one of the island-like semiconductor layers 110 and a forty-forth electrode (44-2) is connected to one end of the other of the island-like semiconductor layers 110. A forty-first electrode 41 is connected as a common electrode to other ends of the island-like semiconductor layers 110 to which the forty-forth electrodes (44-1) and (44-2) are not connected. Two high-resistance elements are connected to these four transistors as shown in FIG. 158. A forty-second electrode 42 is connected as a common electrode at an end at which the transistors are not connected.

Explanation is given of the equivalent circuit diagram of FIG. 159.

Now there is shown a connection relationship between each circuit element arranged on the basis of the two island-like semiconductor layers 110 shown in FIG. 158 and each wire in a memory cell array where a plurality of island-like semiconductor layers 110 are arranged.

Are provided a plurality of (e.g., 2×M×N, M and N are positive integers; i is a positive integer, $1 \leqq i \leqq M$; j is a positive integer, $1 \leqq j \leqq N$) island-like semiconductor layers 110. In the memory cell array, a plurality of (e.g., 2×M) forty-fourth wires in parallel with the semiconductor substrate are connected to the above-mentioned forty-fourth electrodes (44-1) and (44-2) provided in the island-like semiconductor layers 110. A plurality of (e.g., N) forty-third wires in parallel with the semiconductor substrate and in a direction crossing the forty-fourth wires 44 are connected with the above-mentioned forty-third electrodes (43-1) and (43-2). A plurality of (e.g., N) forty-first wires in a direction crossing the forty-fourth wires 44 are connected to the above-mentioned forty-first electrodes 41 of the island-like semiconductor layers 110. The forty-first wires may be connected in common to all forty-first electrodes provided in the island-like semiconductor layers 110. The above-mentioned forty-second electrodes 42 of high-resistance elements may be connected in unity by the forty-second wires.

The transistor constituting the memory cell may be constituted only of PMOS and the above-mentioned high resistance elements may be replaced with a transistor of an opposite type to the transistor having the forty-third or forty-fifth electrode as the gate electrode.

Now is described the operation principle of the case where the selection gate transistor is not connected to a memory cell adjacent to the selection gate transistor via an impurity diffusion layer, the memory cells are not connected to each other via an impurity diffusion layer, and instead of that, the interval between the selection gate transistor and the memory cell and that between the memory cells are as close as about 30 nm or less as compared with the case where the selection gate transistor and the memory cell as well as the memory cells are connected via an impurity diffusion layer. Where adjacent elements are sufficiently close to each other, a channel formed by a potential higher than the threshold applied to the gate of a selection gate transistor and the control gate of a memory cell connects to a channel of an adjacent element, and if a potential higher than the threshold is applied to the gates of all elements, the channels of all elements are connected. If a potential higher than the threshold is applied to the gates of all the elements, the channels of all the elements are connected. This state is equivalent to a state in which the selection transistor and the memory cell as well as the memory cells are connected via the impurity diffusion layer. Therefore, the operation principle is the same as that in the case where the selection transistor and the memory cell as well as the memory cells are connected via the impurity diffusion layer.

Now is described the operation principle of the case where the selection gate transistor is not connected to a memory cell adjacent to the selection gate transistor via an impurity diffusion layer, the memory cells are not connected to each other via an impurity diffusion layer, and instead of that, third conductive films between the selection transistor and the memory cell and between the gate electrodes of the memory cells. The third conductive films are located between elements and are connected to the island-like semiconductor layers with intervention of insulating films, e.g., silicon oxide films. That is, the third conductive film, the insulating film and the island-like semiconductor layer form an MIS capacitor. A channel is formed by applying to the third conductive film a potential such that a reverse layer is formed at the interface between the island-like semiconductor layer and the insulating film. The formed channel acts to adjacent elements in the same manner as an impurity diffusion layer connecting the elements. Therefore, if a potential allowing a channel to be formed is applied to the third conductive film, is produced the same action as in the case the selection gate transistor and the memory cell are connected via the impurity diffusion layer. Even if the potential allowing a channel to be formed is applied to the third conductive film, is produced the same action as in the case the selection gate transistor and the memory cell are connected via the impurity diffusion layer, when electrons are drawn from the charge storage layer if the island-like semiconductor layer is formed of a P-type semiconductor.

Embodiments of Processes of Producing Semiconductor Memories

First, are described examples in which, unlike the conventional memory, an impurity diffusion layer is so formed that an active region of each memory cell formed on a semiconductor substrate or semiconductor layer which is patterned in a pillar form is in a floating state with respect to the semiconductor substrate and further the semiconductor or semiconductor layer is formed to have a dimension not larger than the minimum photoetching dimension.

PRODUCTION EXAMPLE 1

In a semiconductor memory to be produced in this example, a semiconductor substrate is patterned in the form of pillars to form island-like semiconductor layers. Sides of the island-like semiconductor layers make active regions. A plurality of tunnel oxide films and floating gates as charge storage layers are formed on the active regions. The island-like semiconductor layers are each in an electrically floating state with respect to the semiconductor substrate. The active region of each memory cell is in the electrically floating state. Selection gate transistors are disposed at the top and the bottom of the island-like semiconductor layer. A plurality of memory transistors, for example, two memory transistors, are placed between the selection gate transistors and are connected in series along the island-like semiconductor layer. The thickness of gate insulating films of the selection gate transistors is equal to the thickness of gate insulating films of the memory transistors. In this production example, the selection gate and the floating gate of the transistors are formed at the same time.

FIGS. 279 to 298 and FIGS. 299 to 317 are sectional views taken on line A–A' and line B–B', respectively, in FIG. 1 which is a plan view illustrating a memory cell array of an EEPROM.

Figure 279:
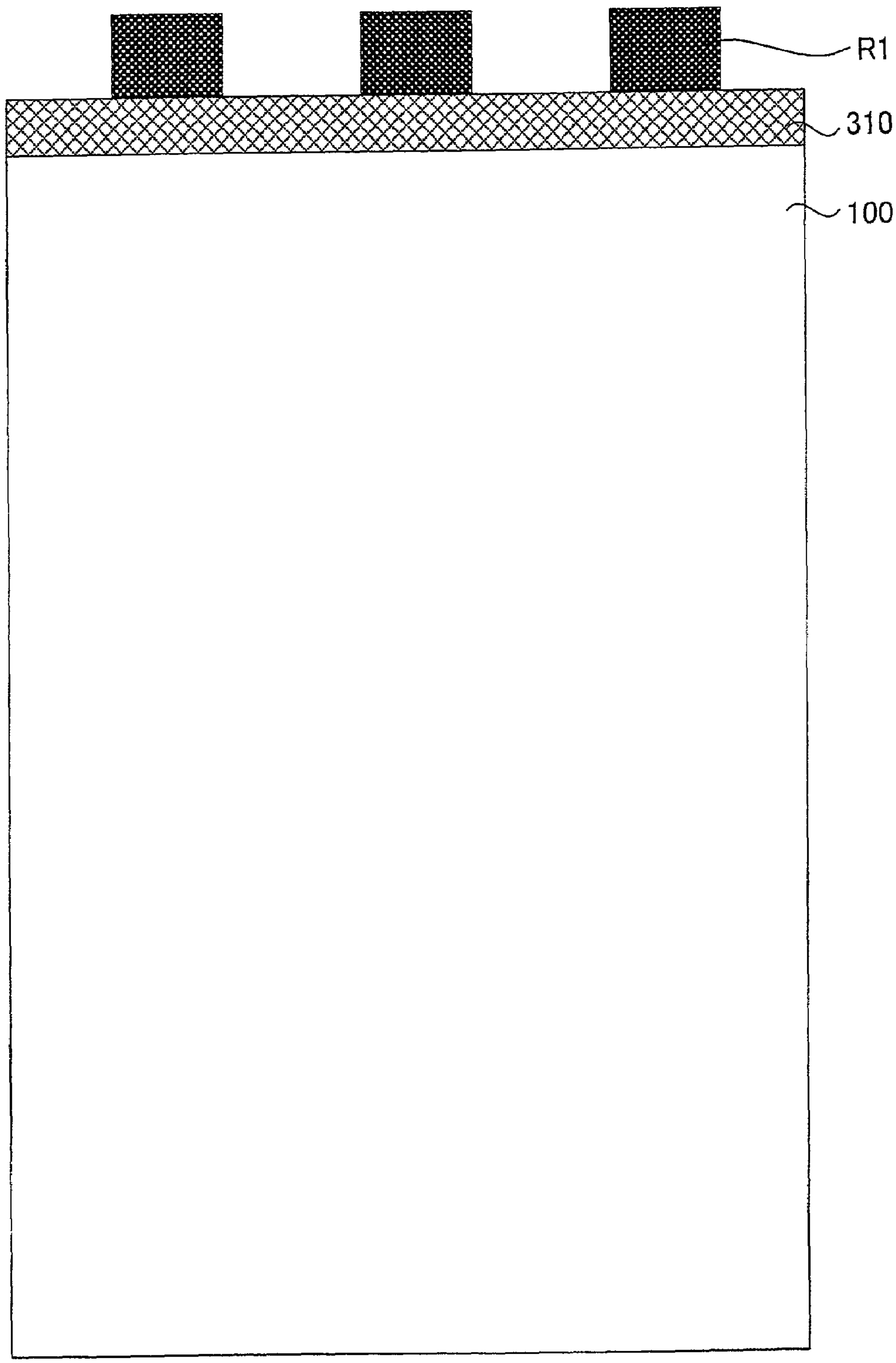
FIG. 279 to 298 are sectional views (taken on line A–A' in FIG. 1) illustrating production steps of Production Example 1 for producing a semiconductor memory in accordance with the present invention.
Figure 299:
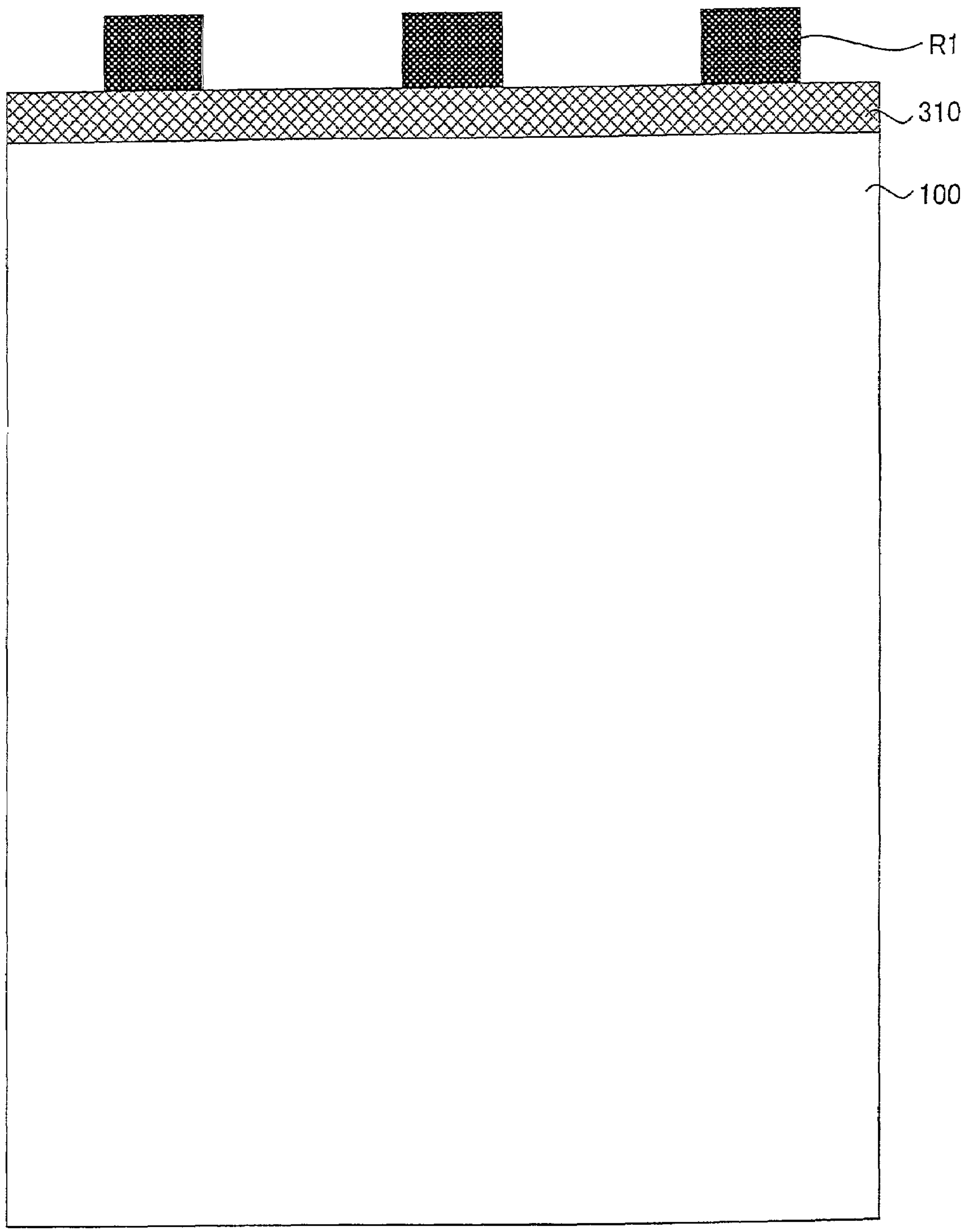
FIG. 299 to FIG. 317 are sectional views (taken on line B–B' in FIG. 1) illustrating production steps of Production Example 1 for producing a semiconductor memory in accordance with the present invention.

A silicon nitride film 310, for example, is deposited to a thickness of 200 to 2,000 nm as a first insulating film on a surface of a P-type silicon substrate 100, for example, as a semiconductor substrate. A resist film R1 is formed as a mask layer through patterning by a known photolithographic technique (FIG. 279 and FIG. 299). As the semiconductor substrate, in addition to a silicon substrate, usable are elementary semiconductor substrates such as a germanium substrate, compound semiconductor substrates such as a GaAs substrate and a ZnSe substrate, mixed crystal semiconductor substrates such as a silicon germanium semiconductor and the like. However, a silicon substrate is preferred.

Figure 280:
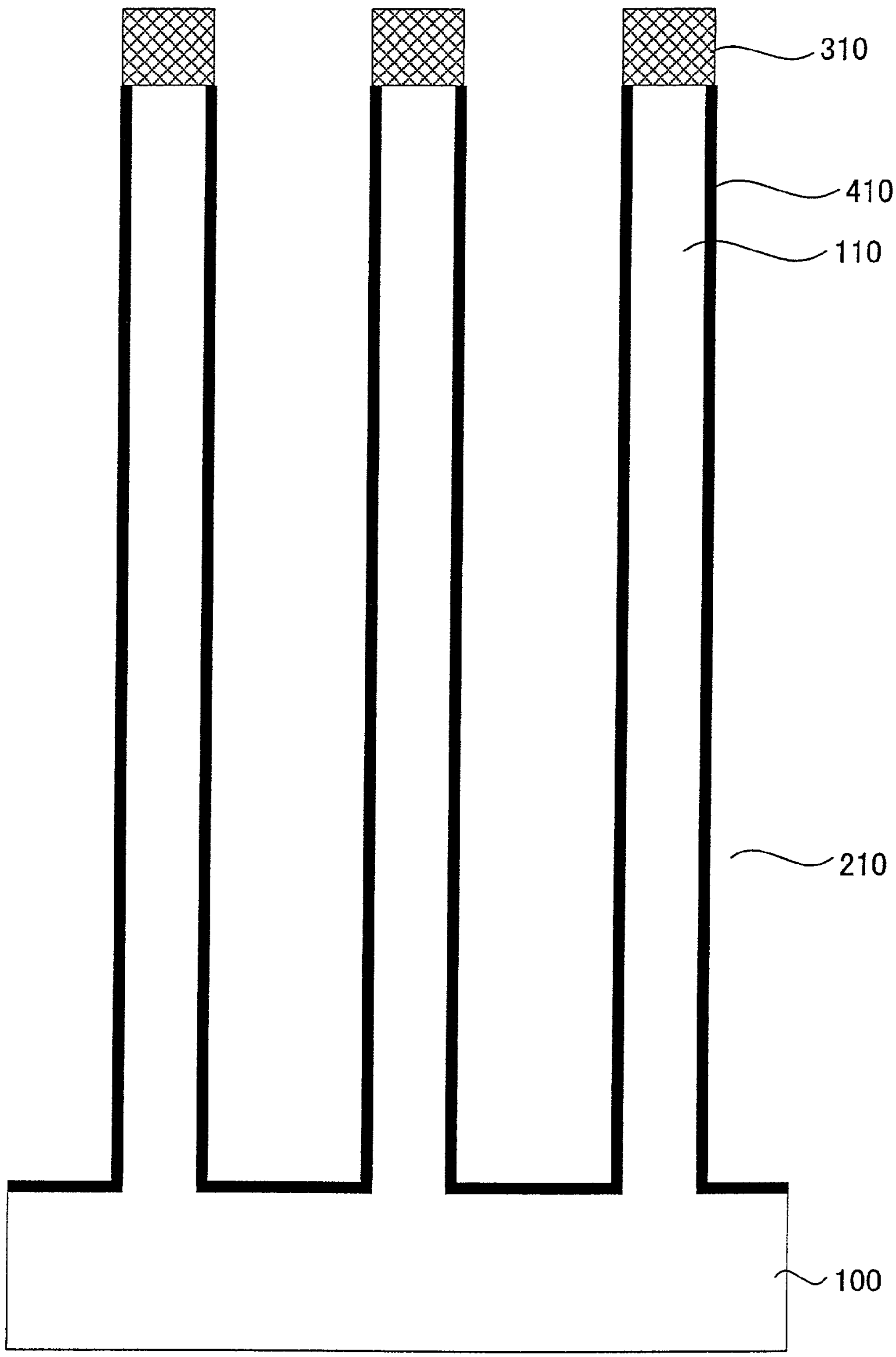
Figure 300:
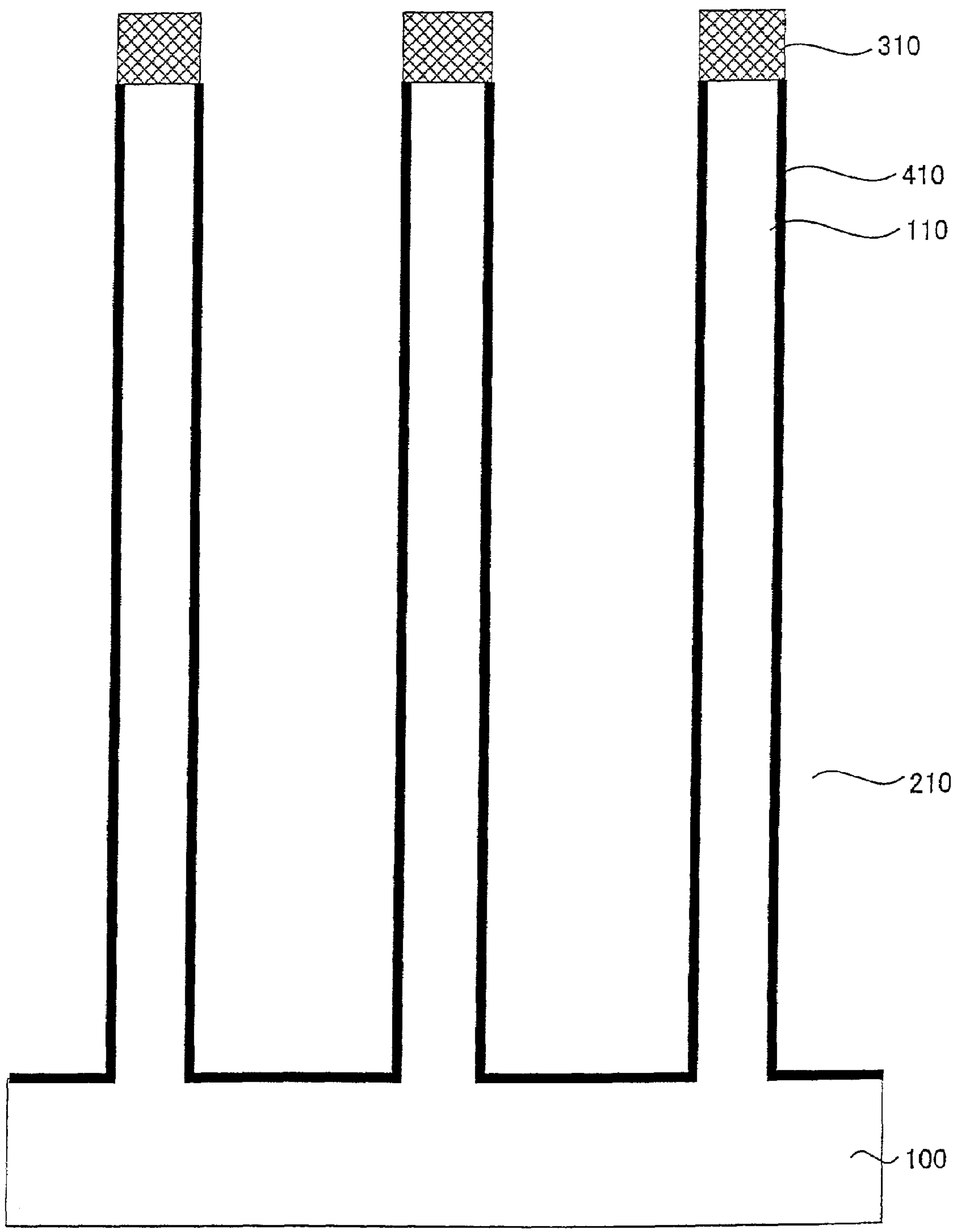

The silicon nitride film (the first insulating film) 310 is etched by reactive ion etching using the resist film R1 as a mask. The P-type silicon substrate 100 is etched to a depth of 2,000 to 20,000 nm by reactive ion etching using the silicon nitride film 310 as a mask to form a first trench 210 in a lattice form. Thereby the P-type silicon substrate 100 is separated into a plurality of island-like pillar-form semiconductor layers 110. The surface of the island-like semiconductor layer 110 is oxidized to form a second insulating film, for example, a thermally oxidized film 410, to a thickness of 10 nm to 100 nm. At this time, if the island-like semiconductor layer 110 has been formed in the minimum photoetching dimension, the dimension of the island-like semiconductor layer 110 is decreased by the formation of the thermally oxidized film 410, that is, the island-like semiconductor layer 110 is formed to have a dimension not larger than the minimum photoetching dimension (FIG. 280 and FIG. 300).

Figure 281:
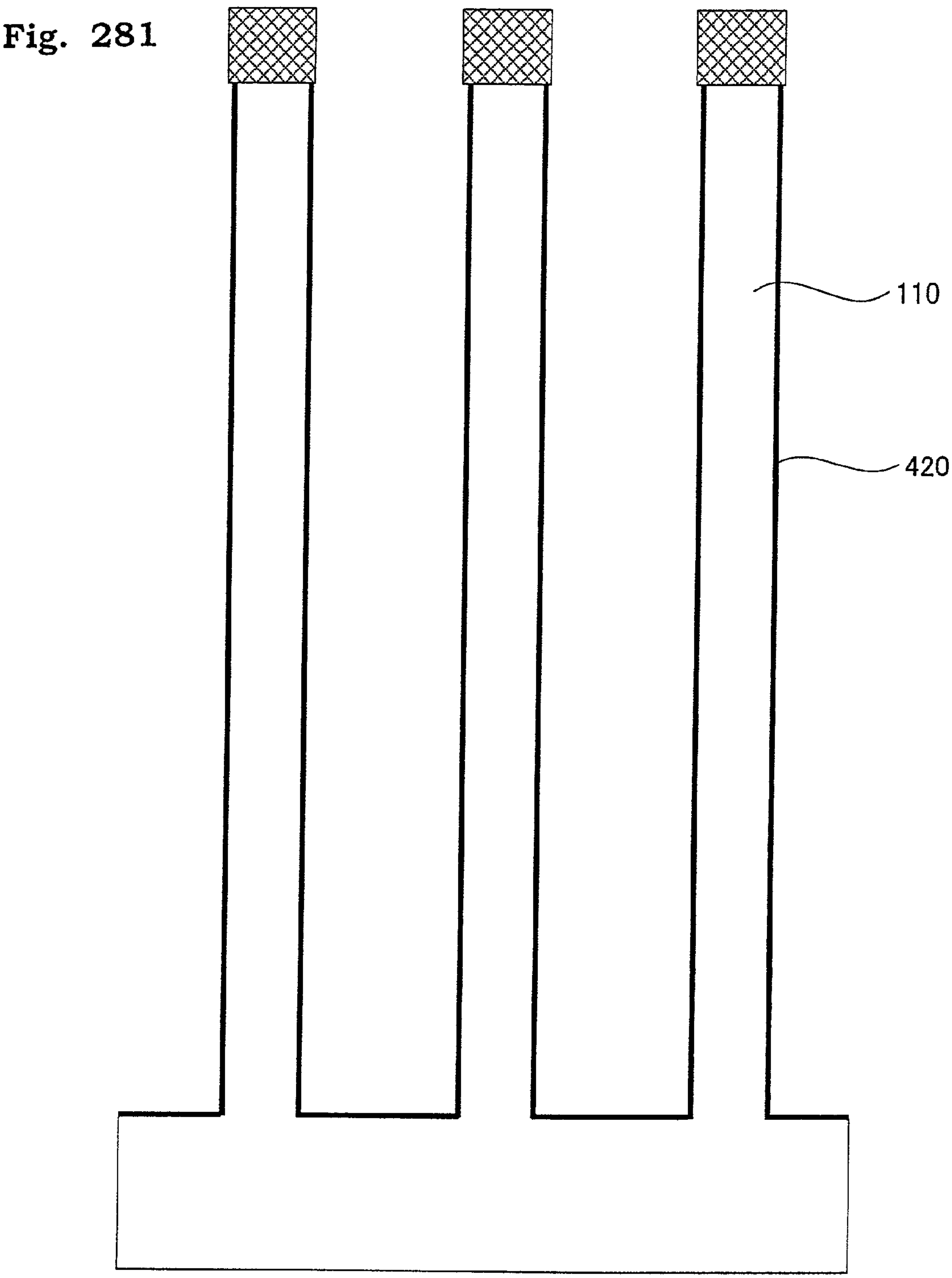
Figure 301:
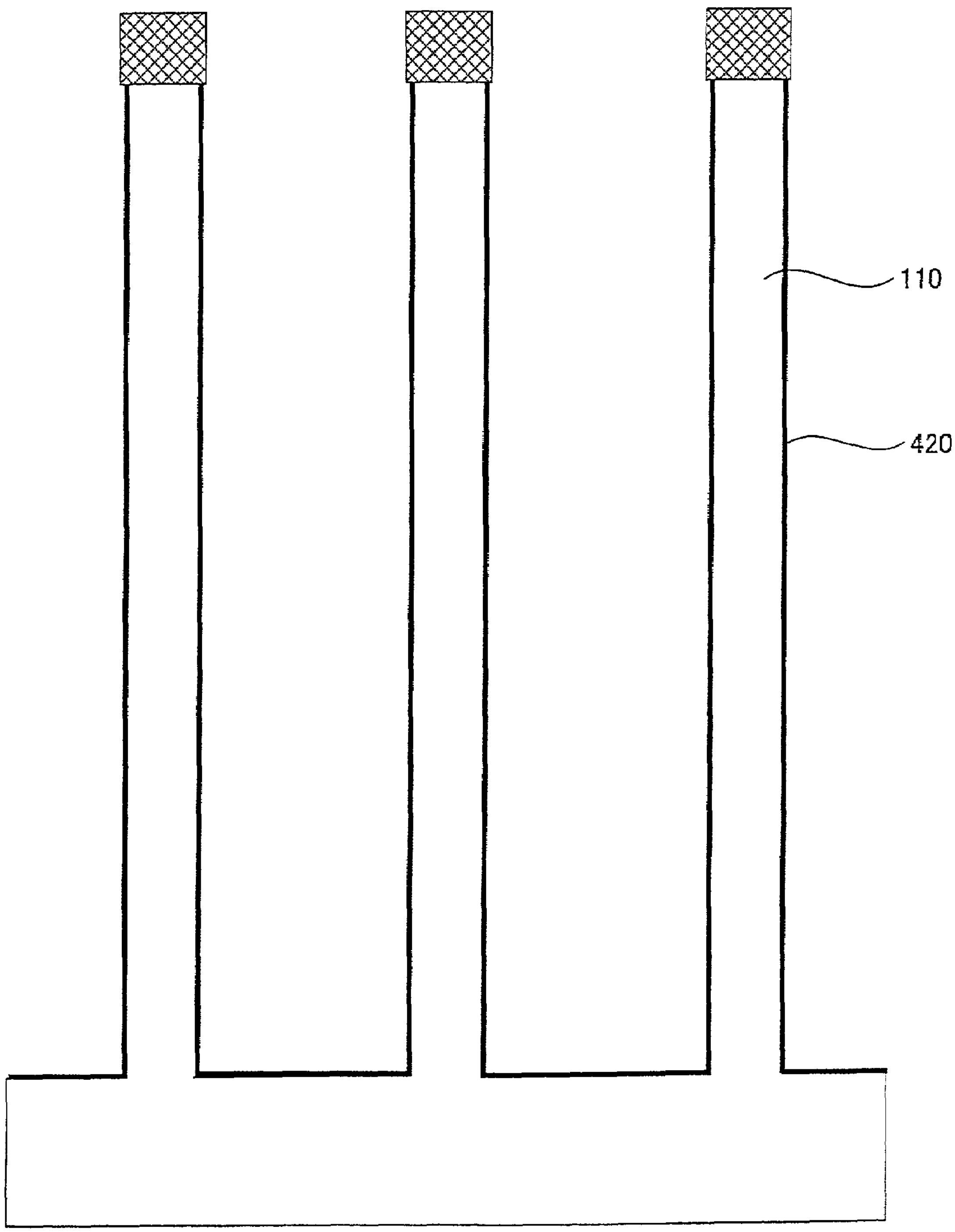

Next, the thermally oxidized film (the second insulating film) 410 is etched away from the periphery of each island-like semiconductor layer 110, for example, by isotropic etching. Then, as required, channel ion implantation is carried out into the sidewall of the island semiconductor layer 110 by slant ion implantation. For example, the ion implantation may be performed at an implantation energy of 5 to 100 keV at a boron dose of about $1\times10^{11}$ to $1\times10^{13}/cm^2$ at an angle of 5 to 45° with respect to the normal line of the surface of the substrate. Preferably the channel ion implantation is performed from various directions to the island-like semiconductor layers 110 because a surface impurity concentration becomes more uniform. Alternatively, instead of the channel ion implantation, an oxide film containing boron may be deposited by CVD with a view to utilizing diffusion of boron from the oxide film. The impurity implantation from the surface of the island-like semiconductor layers 110 may be carried out before the island-like semiconductor layers are covered with the thermally oxidized film 410, or the impurity implantation may be finished before the island-like semiconductor layers 110 are formed. Means for the implantation are not particularly limited so long as an impurity concentration distribution is almost equal over the island-like semiconductor layers 110. Subsequently, a silicon oxide film 420, for example, is formed as a third insulating film to be a tunnel oxide film to a thickness of about 10 nm around each island-like semiconductor layer 110, for example, by thermal oxidization (FIG. 281 and FIG. 301). The third oxide film, however, may be formed of not only a thermally oxidized film but also a CVD oxide film or a nitrogen oxide film. The third oxide film may be formed on the sidewall and the top surface of the island-like semiconductor layer 110 and on the entire surface of the semiconductor substrate 100, but may be formed at least on an active region-to be of the island-like semiconductor layer 100.

Figure 282:
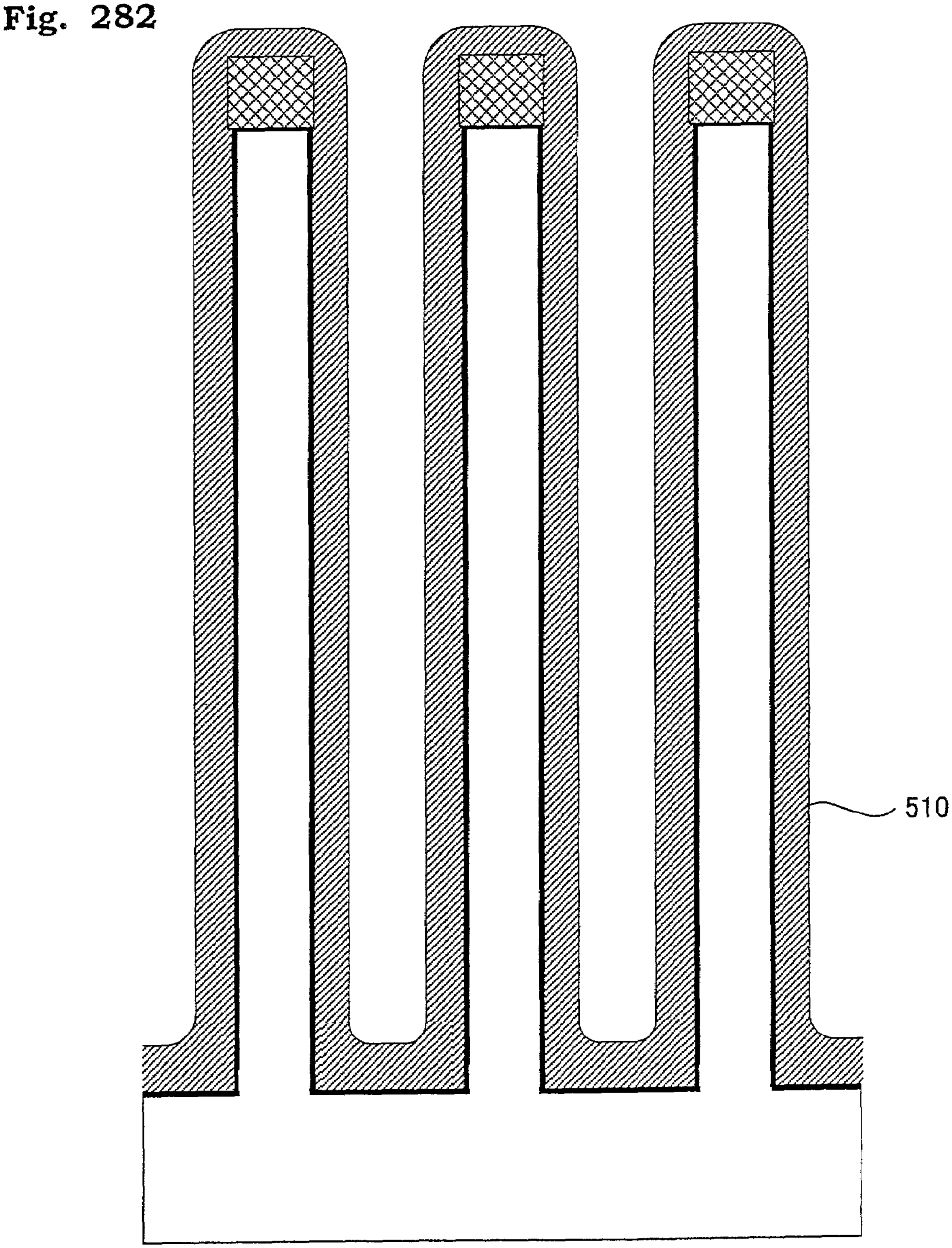
Figure 302:
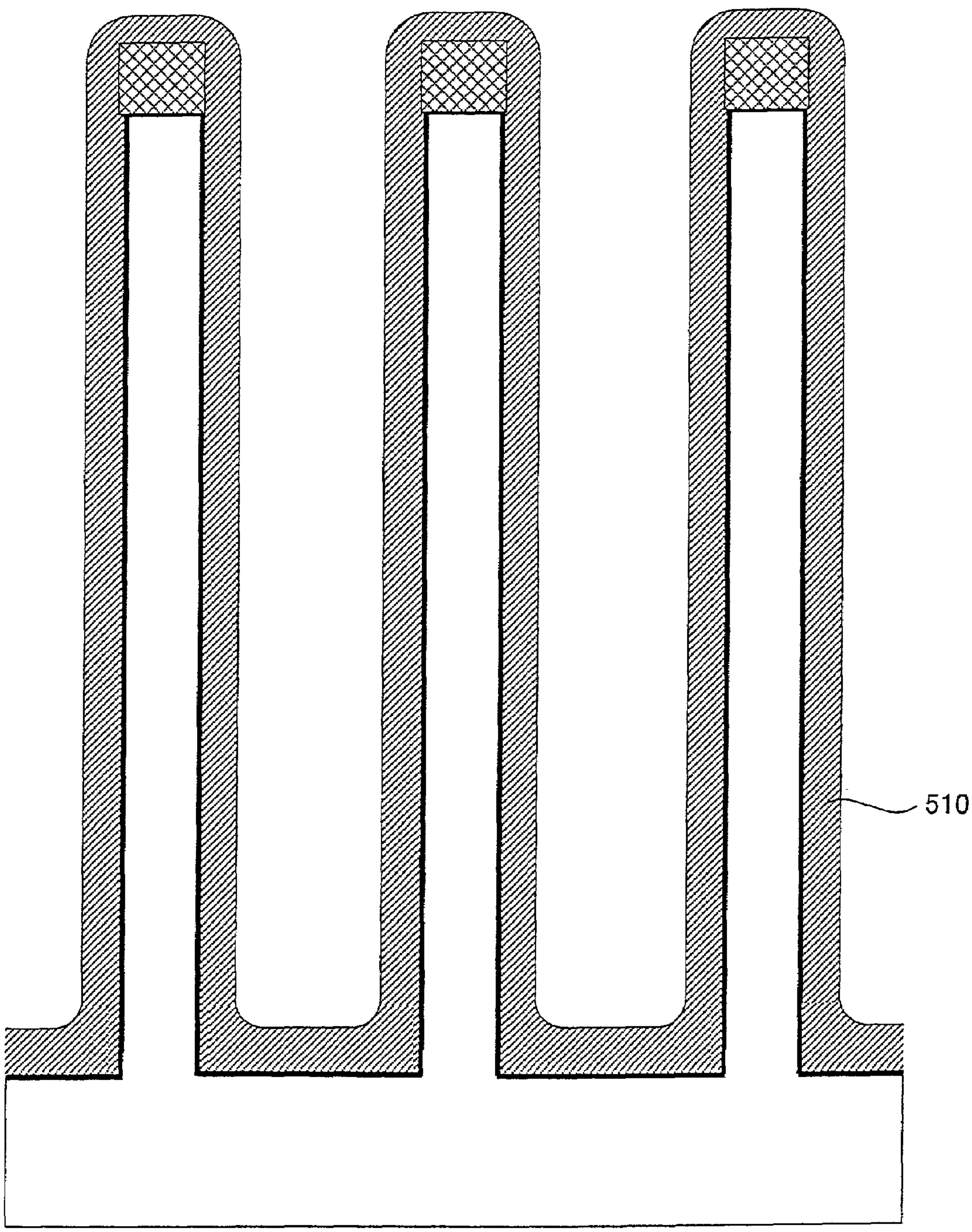

Subsequently, a polysilicon film 510, for example, is deposited as a first conductive film to a thickness of about 50 to 200 nm (FIG. 282 and FIG. 302). This first conductive film may be formed on the sidewall and the top surface of each island-like semiconductor layer 110 and on the entire surface of the semiconductor substrate 100, but may be formed at least on the sidewall of the island-like semiconductor layer 110.

Figure 283:
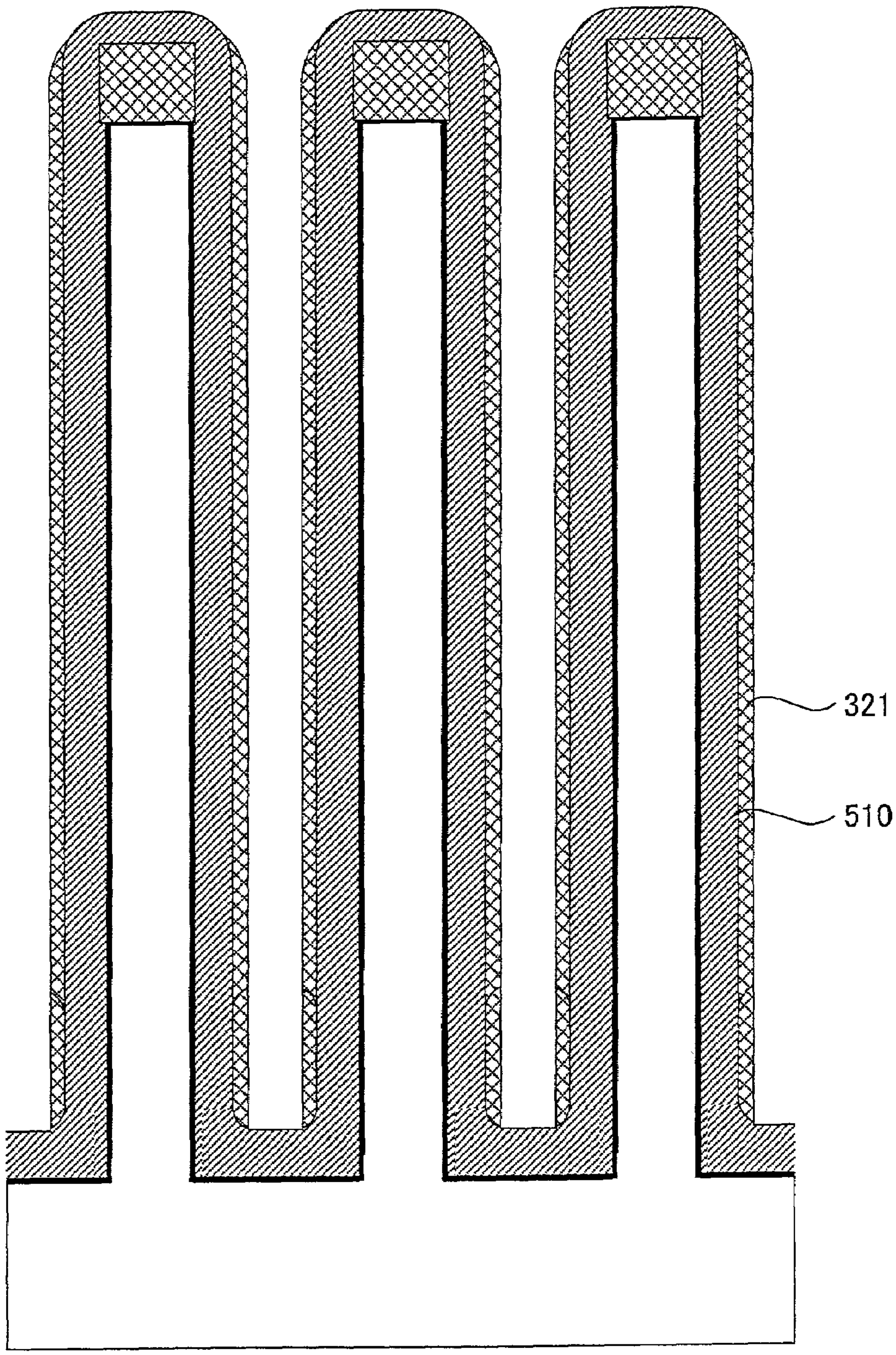
Figure 303:
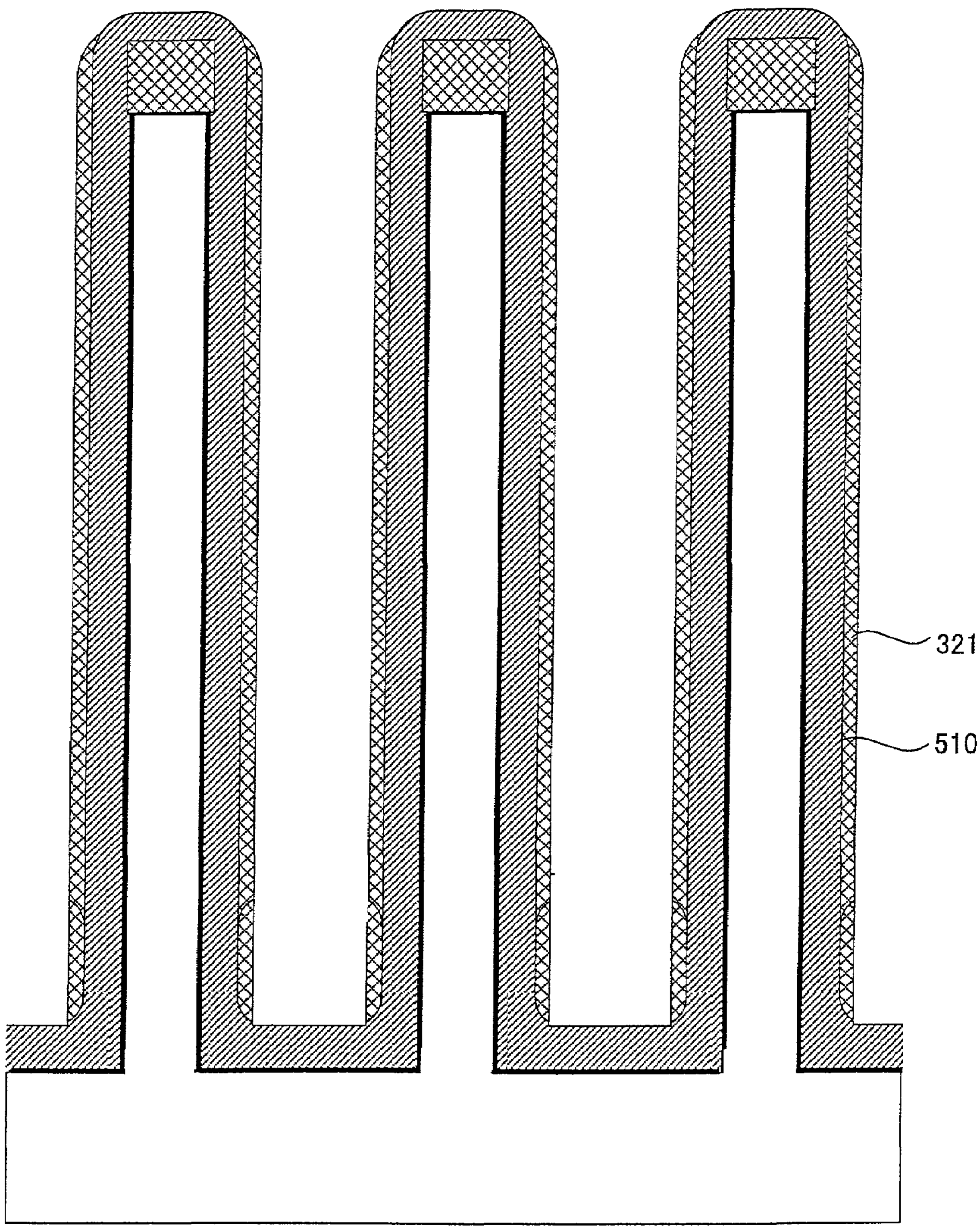

Thereafter, a silicon nitride film 321, for example, is deposited as a fourth insulating film to a thickness of 5 to 50 nm by CVD. The silicon nitride film 321 is etched by reactive ion etching to remain in the form of a sidewall spacer on the sidewall of the polysilicon film 510 (FIG. 283 and FIG. 303).

Figure 284:
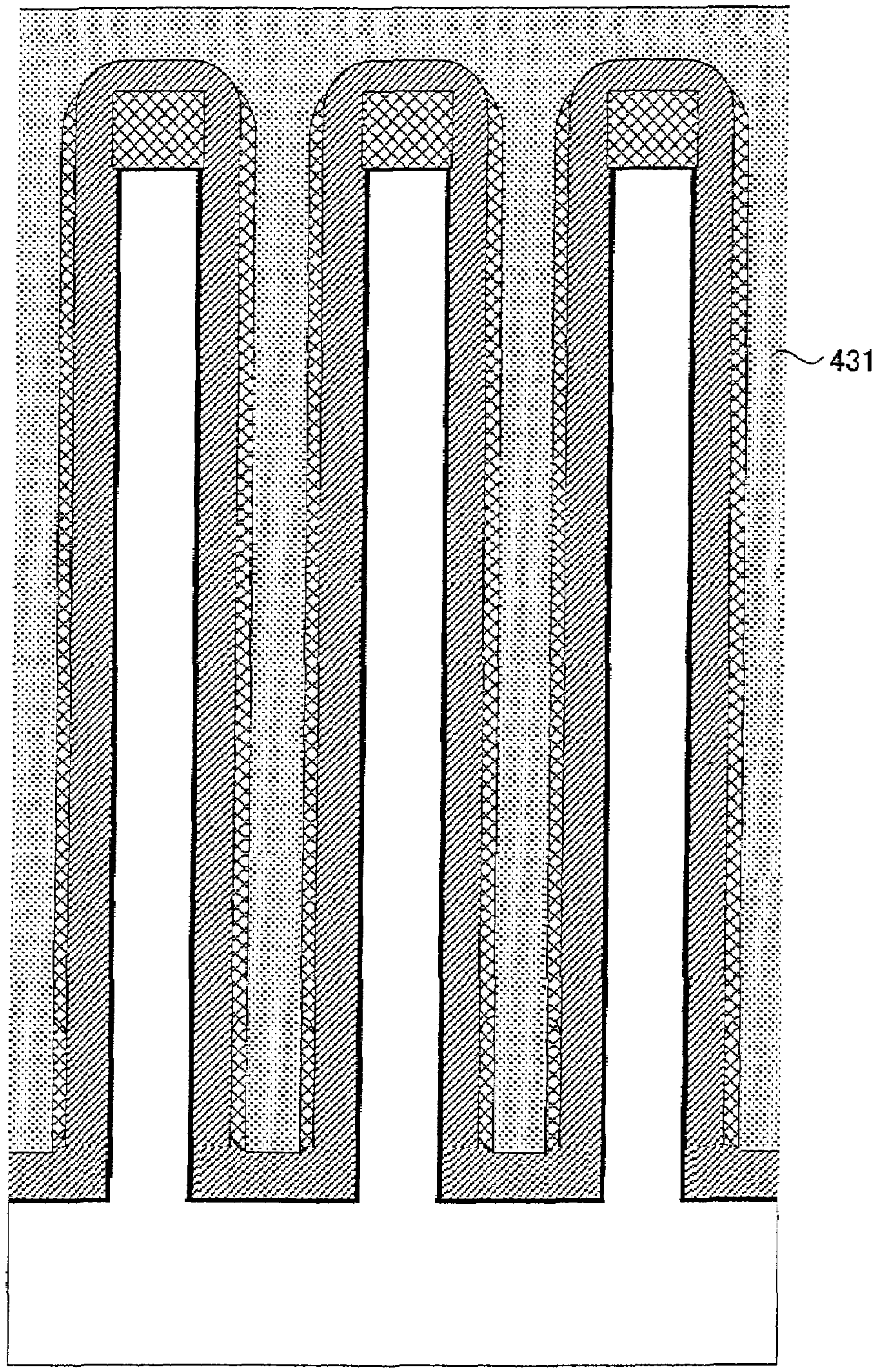
Figure 304:
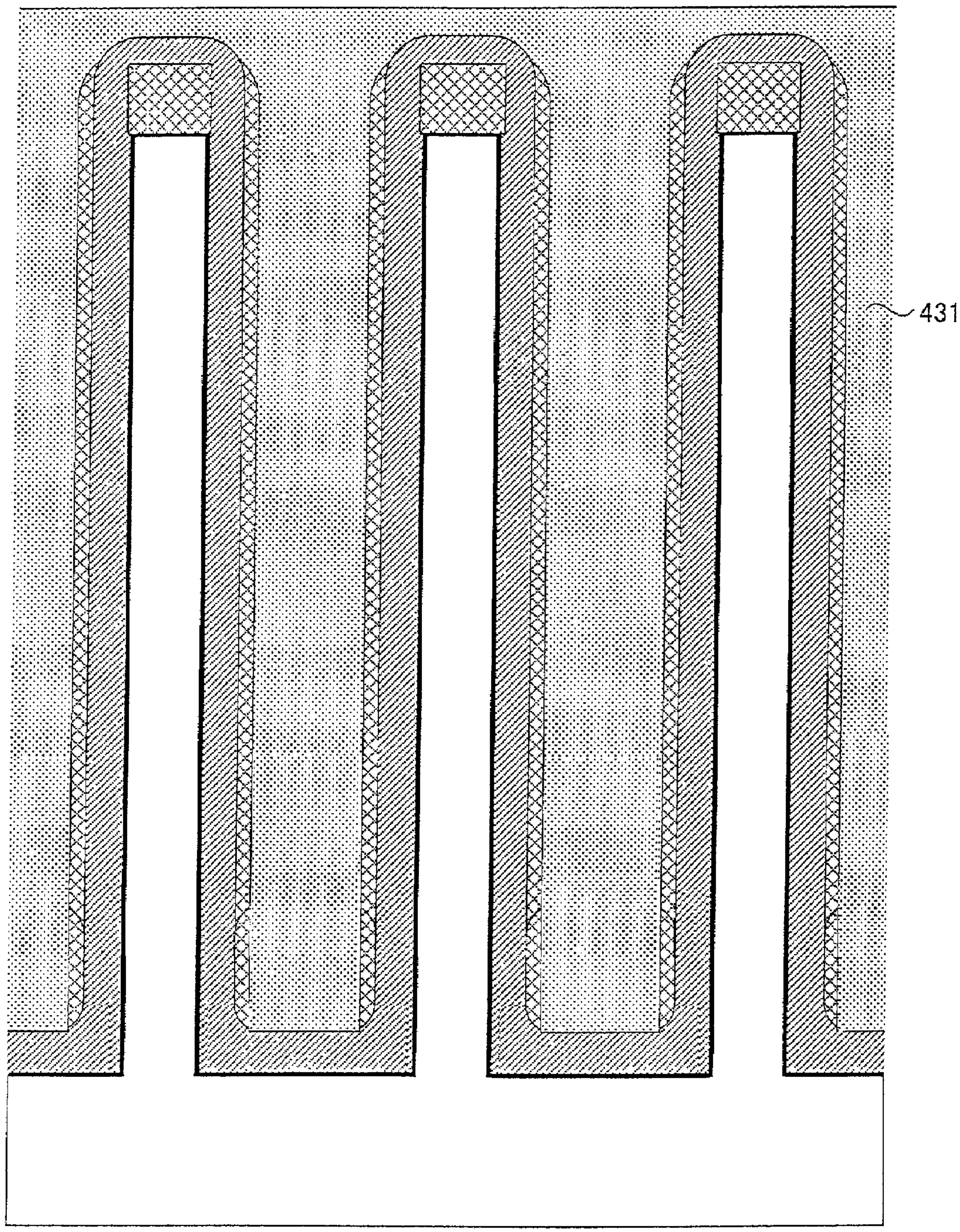

A silicon oxide film 431, for example, is deposited as a fifth insulating film to a thickness of 50 to 500 nm in the first lattice-form trench 210 by CVD (FIG. 284 and FIG. 304).

Figure 285:
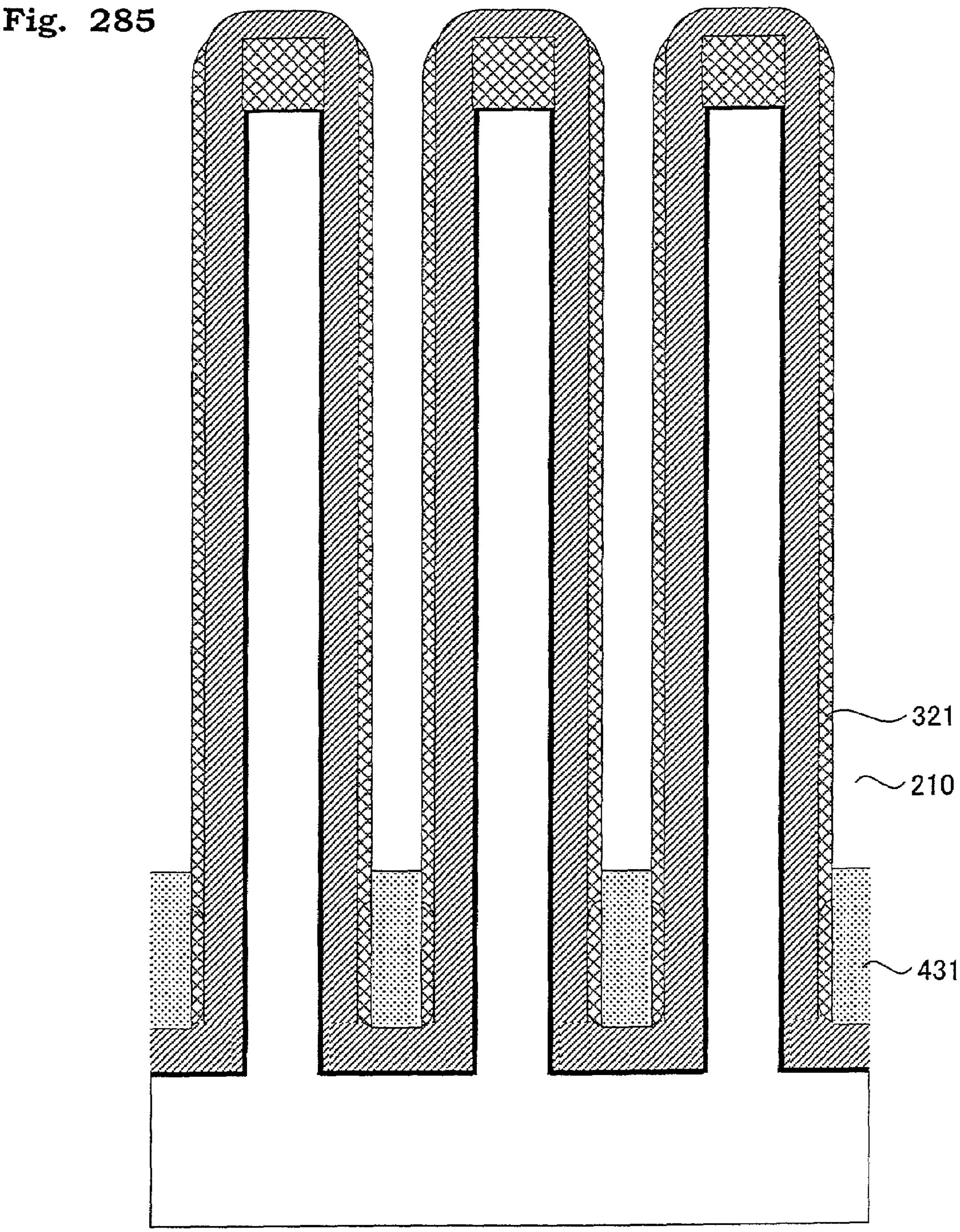
Figure 305:
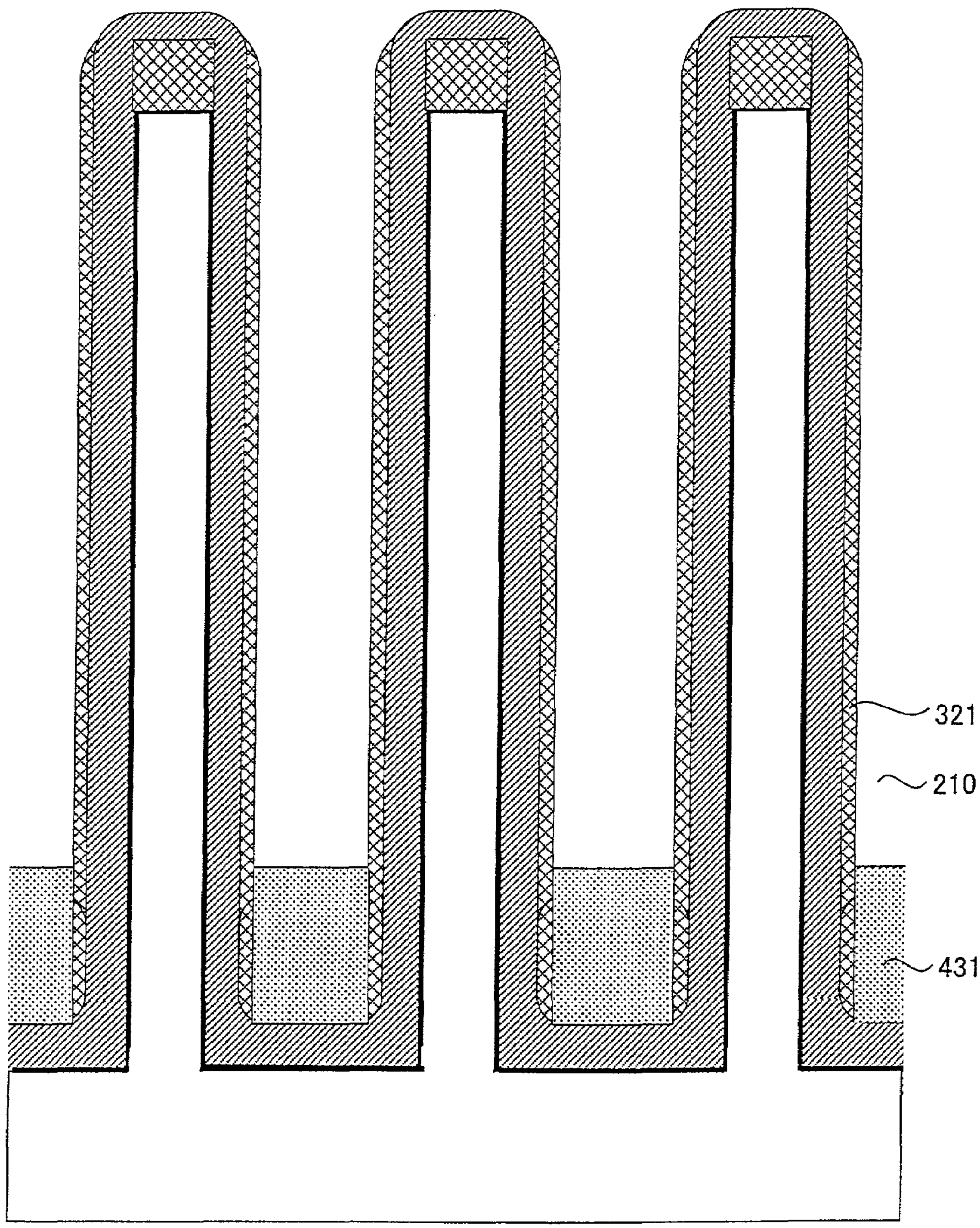

The silicon oxide film 431 is removed to a desired depth to form buried layers in the first trench 210 (FIG. 285 and FIG. 305).

Figure 286:
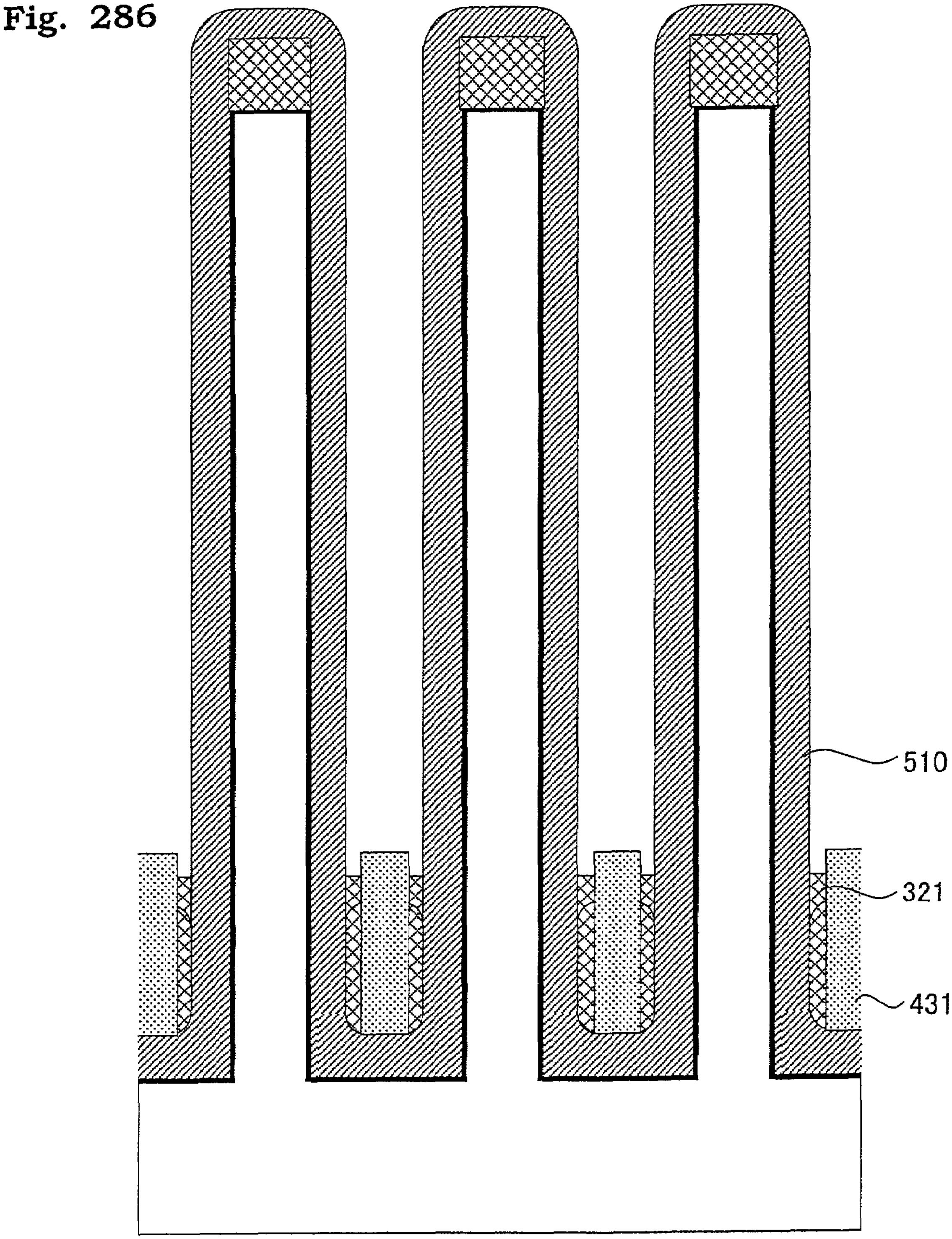
Figure 306:
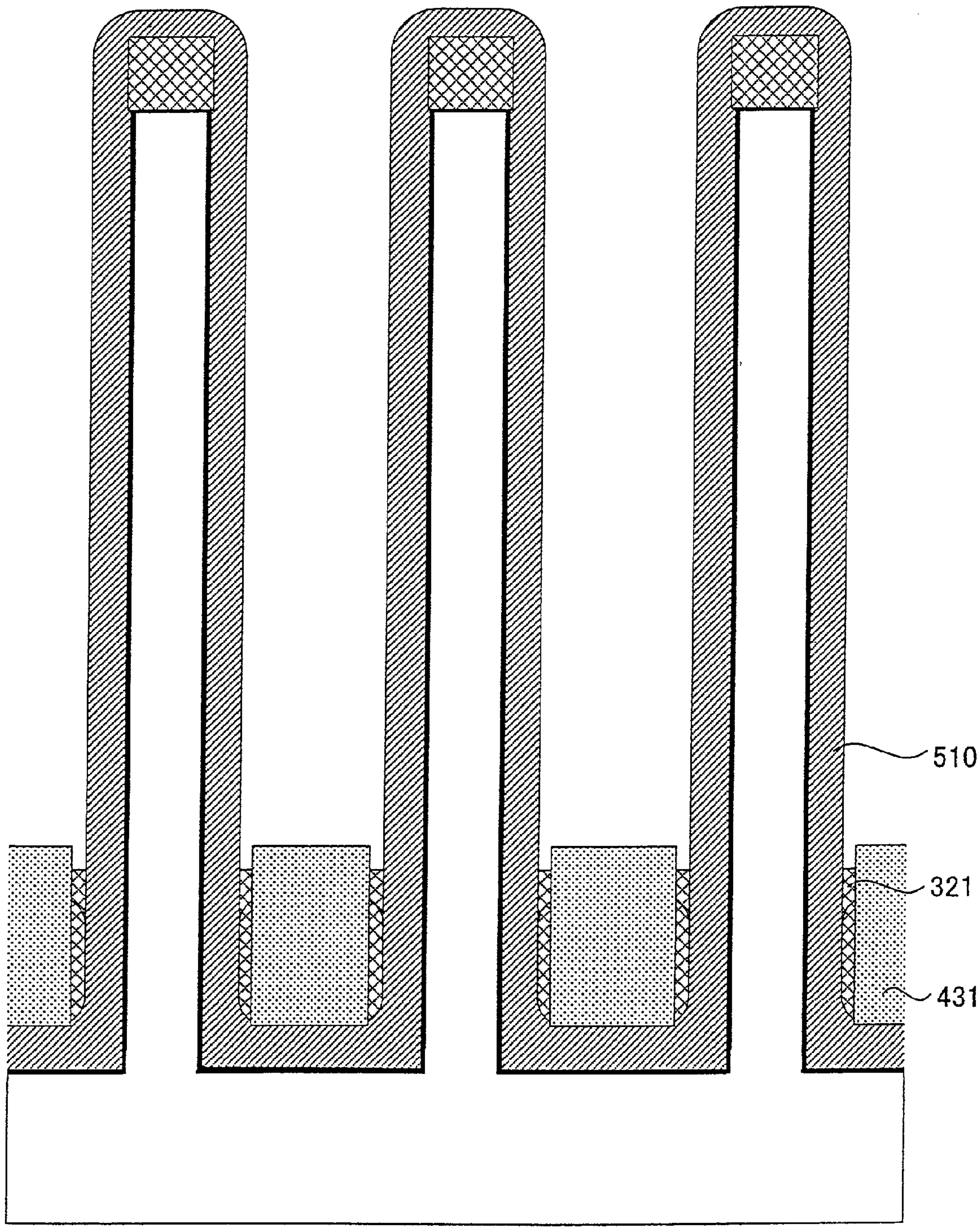

The silicon nitride film (the fourth insulating film) 321 is isotropically etched using the silicon oxide film (the fifth insulating film) 431 as a mask so that the silicon nitride film 321 remains only between the silicon oxide film 431 and the polysilicon film (the first conductive film) 510 (FIG. 286 and FIG. 306). At this time, the silicon nitride film 321 is lower than the top surface of the silicon oxide film 431 to form a recess. In this recess, a silicon oxide film 441 is deposited as a sixth insulating film to a thickness of about 3 to 30 nm. At this time, the above recess is filled if the thickness of the silicon oxide film 441 is about half or more of the thickness of the silicon nitride film 321. Since the oxide film 441 also deposits on the sidewall of the polysilicon film 510, the oxide film 441 is removed from the sidewall of the polysilicon film 510, for example, by isotropic etching. Thus the silicon oxide film 441 remains in the recess, and the silicon nitride film 321 is buried by the silicon oxide film 431 and the silicon oxide film 441.

Figure 287:
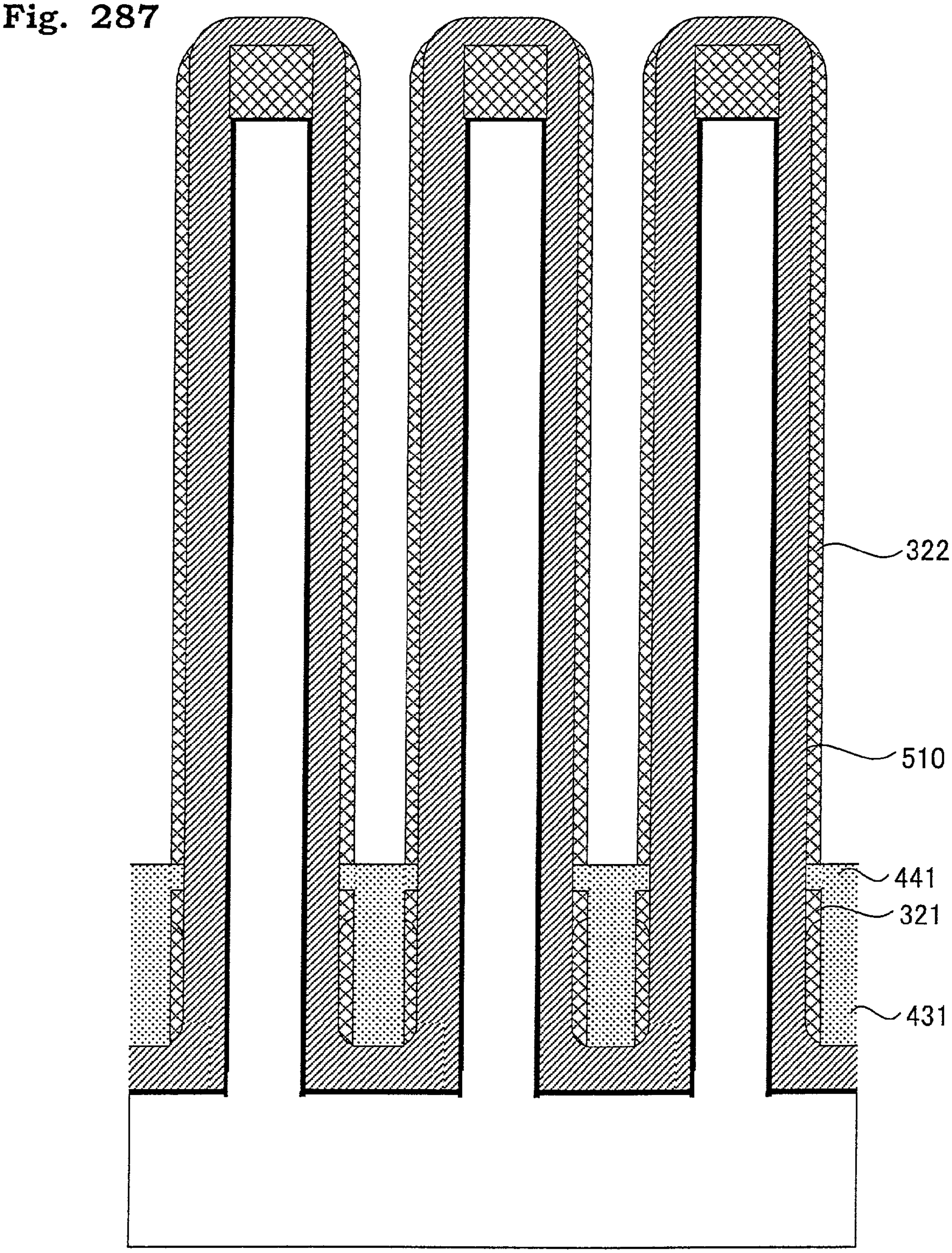
Figure 288:
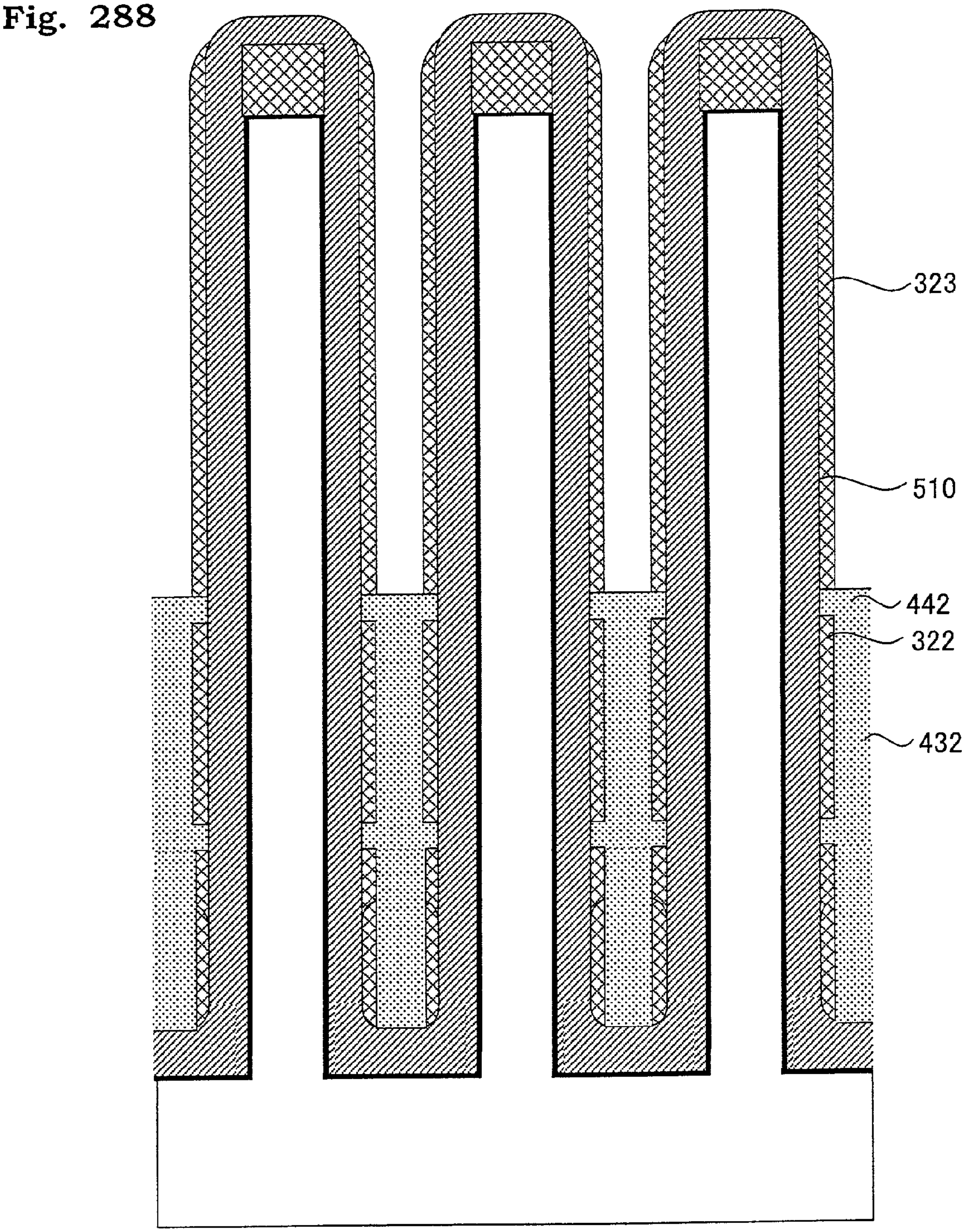
Figure 307:
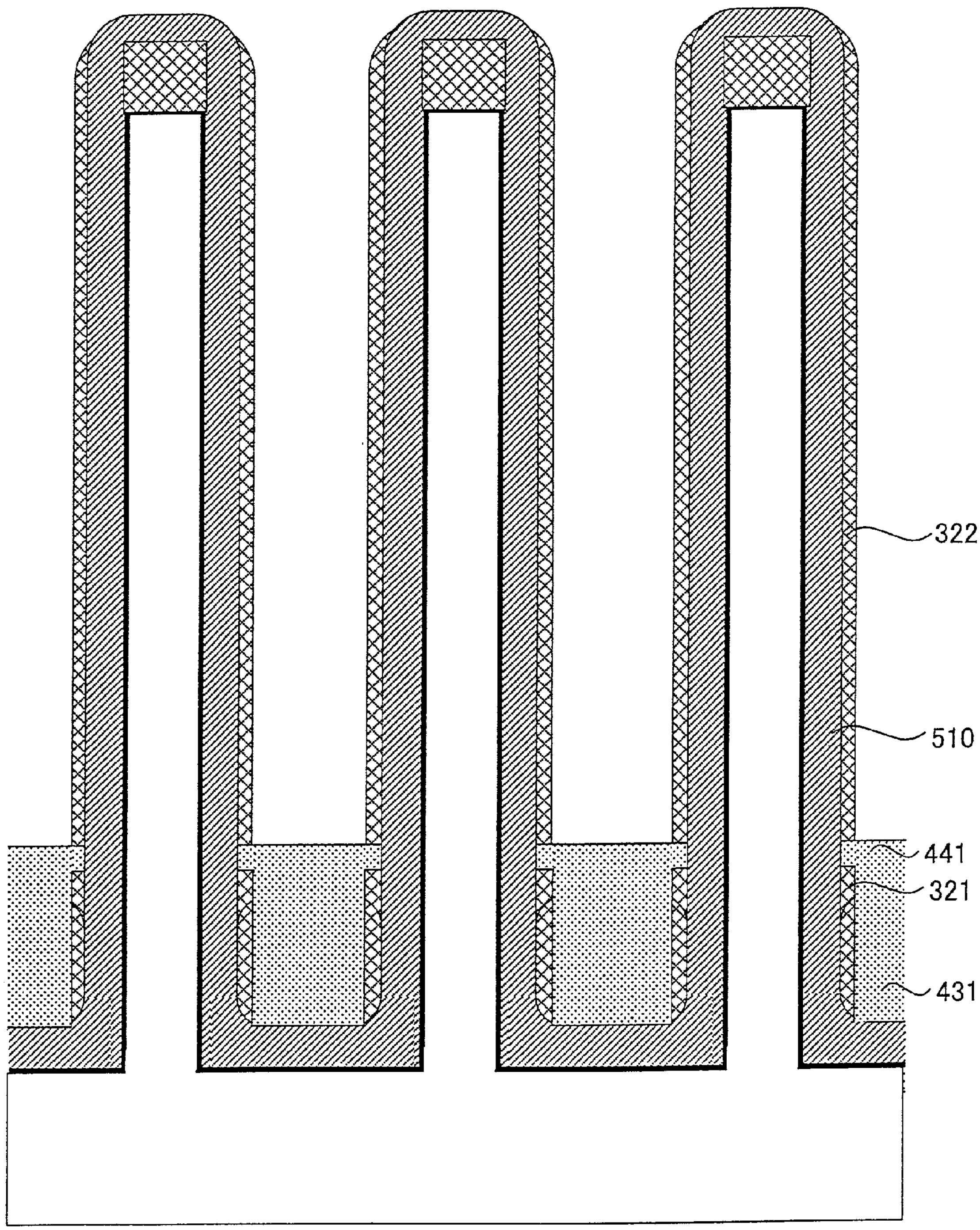
Figure 308:
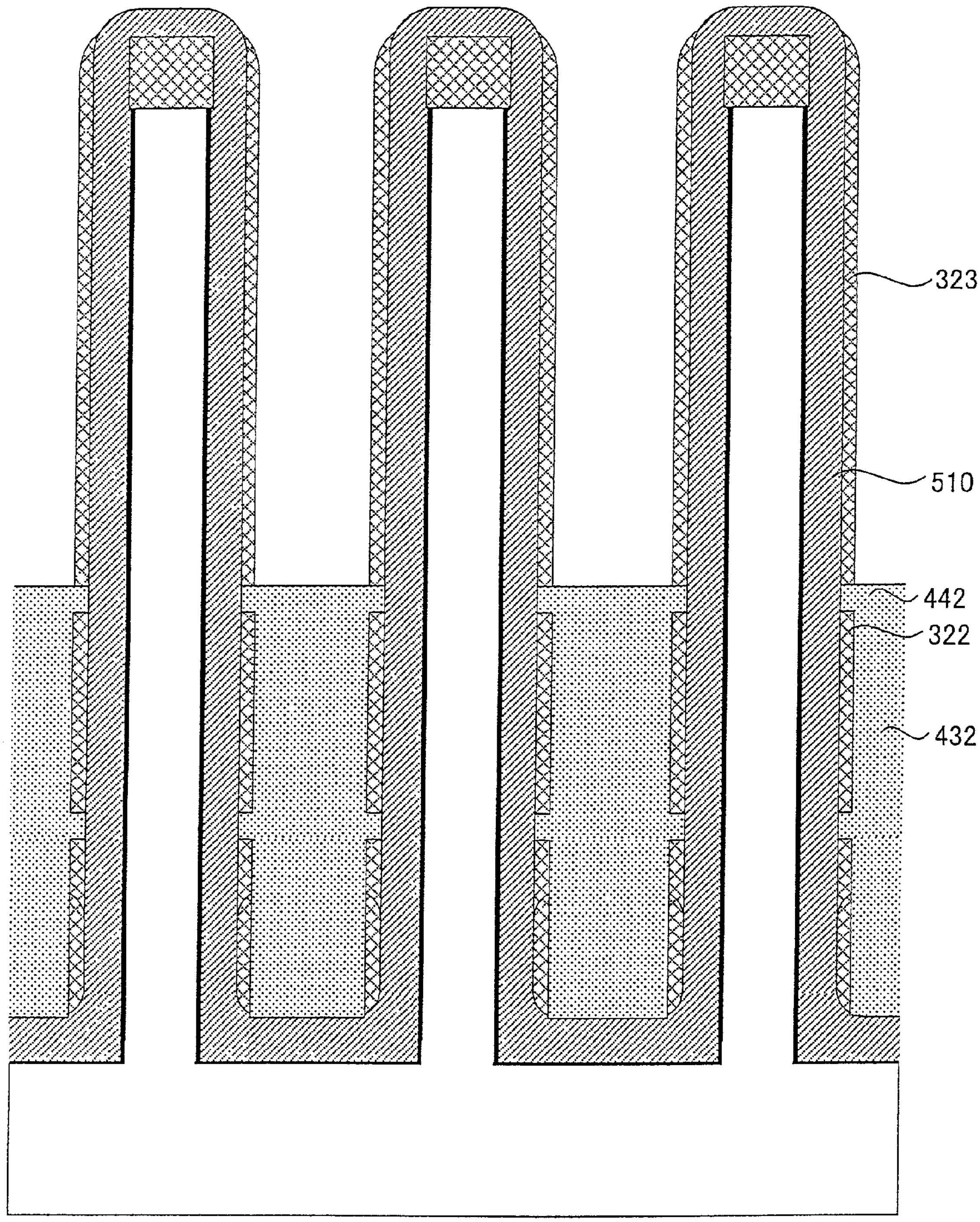

Subsequently, in the same manner, a silicon nitride film (a fourth insulating film) 322 is deposited to a thickness of about 5 to 50 nm by CVD. The silicon nitride film 322 is etched by reactive ion etching to remain in the form of a sidewall spacer on the sidewall of the polysilicon film 510 (FIG. 287 and FIG. 307).

Thereafter, in the same manner, a silicon oxide film (a fifth insulating film) 432 is buried and a silicon oxide film (a sixth insulating film) 442 is disposed on the top of the silicon nitride film 322 in the sidewall spacer form the silicon oxide film 441. Then, a silicon nitride film (a fourth insulating film) 323 is formed in the form of a sidewall spacer on the sidewall of the polysilicon film 510 in the same manner as described above (FIG. 288 and FIG. 308).

Figure 289:
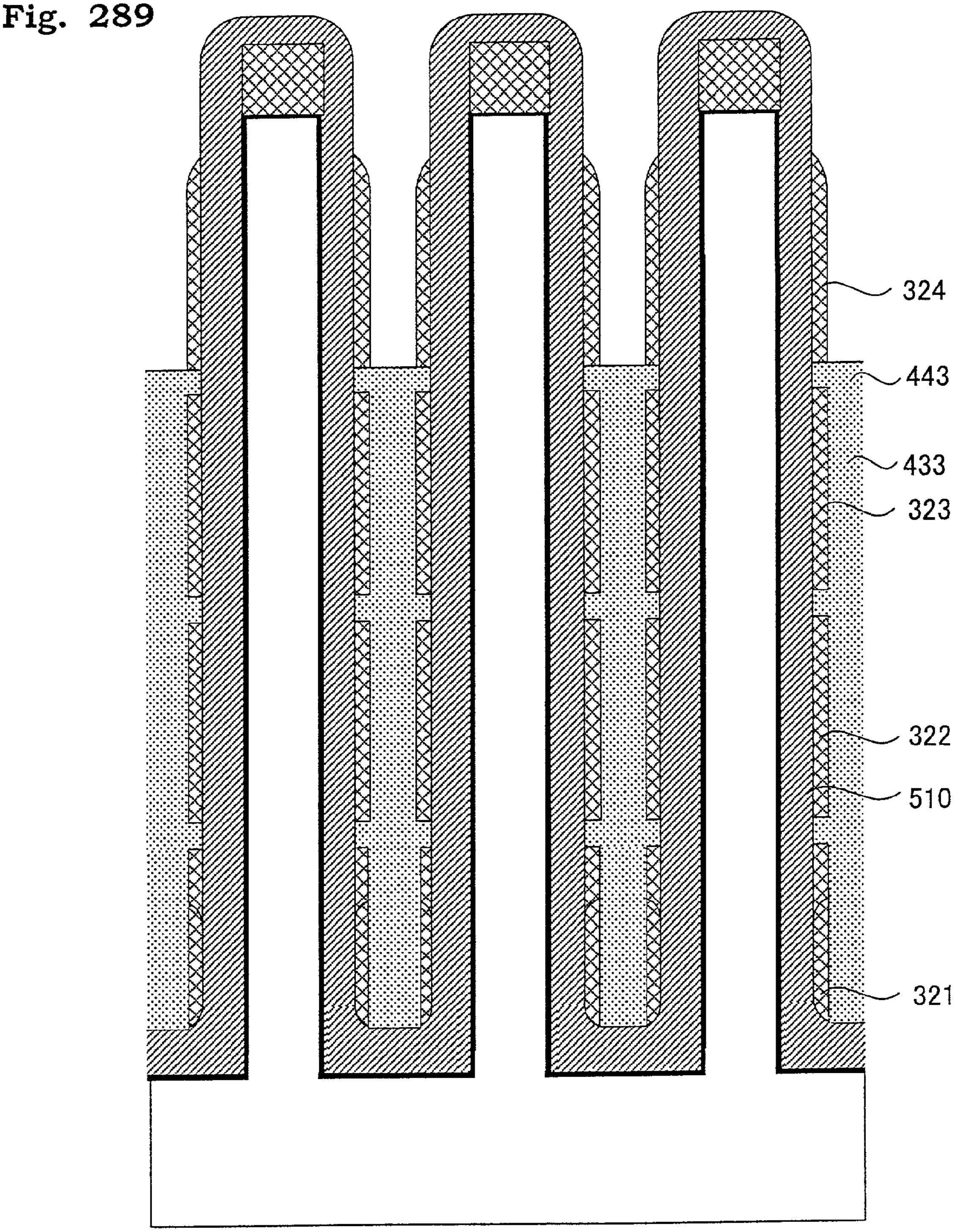
Figure 309:
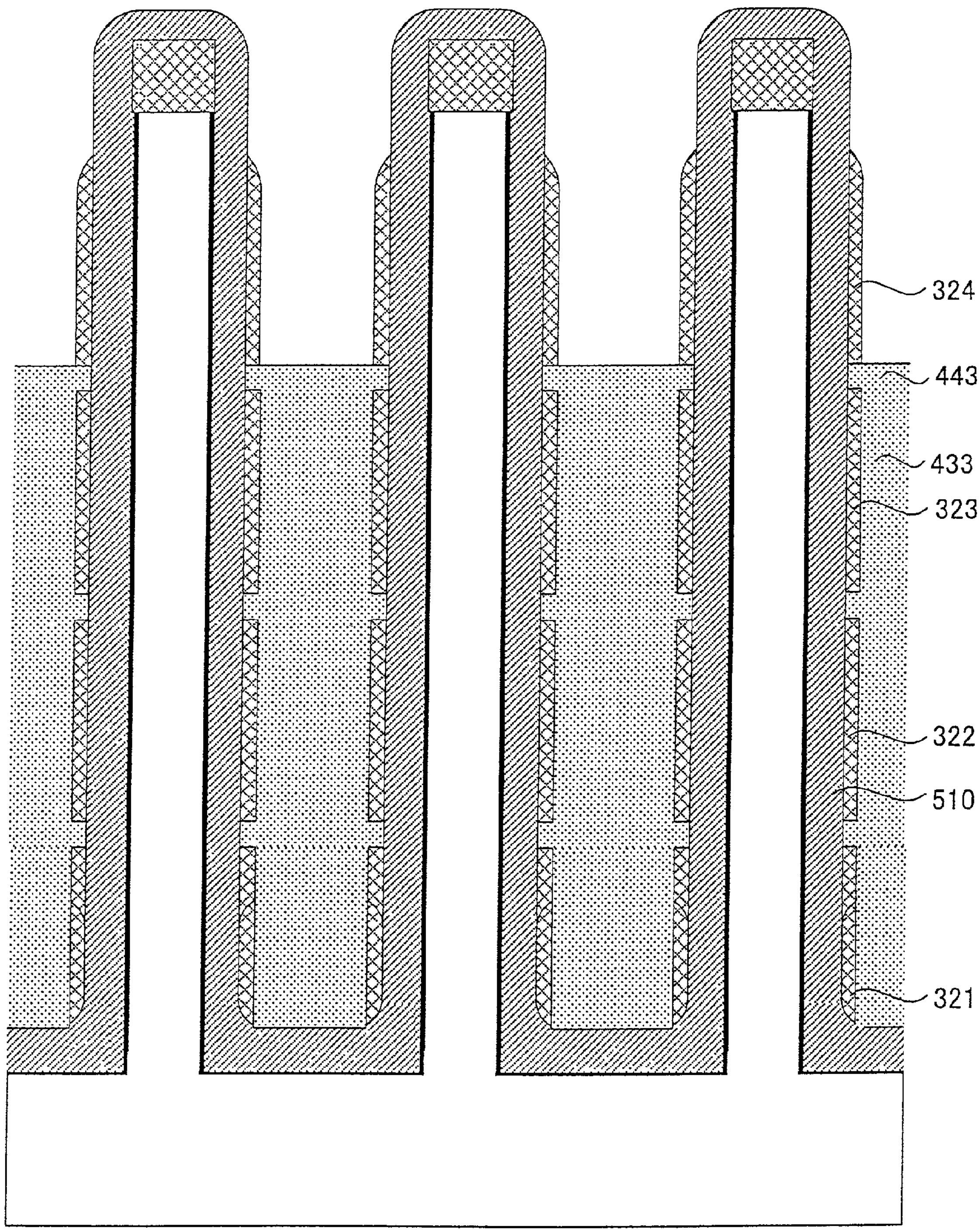

By repeating these steps, a plurality of sidewall spacers are formed of the silicon nitride film (the fourth insulating film) on the sidewall of the polysilicon film (the first conductive film) 510 (FIG. 289 and FIG. 309).

Figure 290:
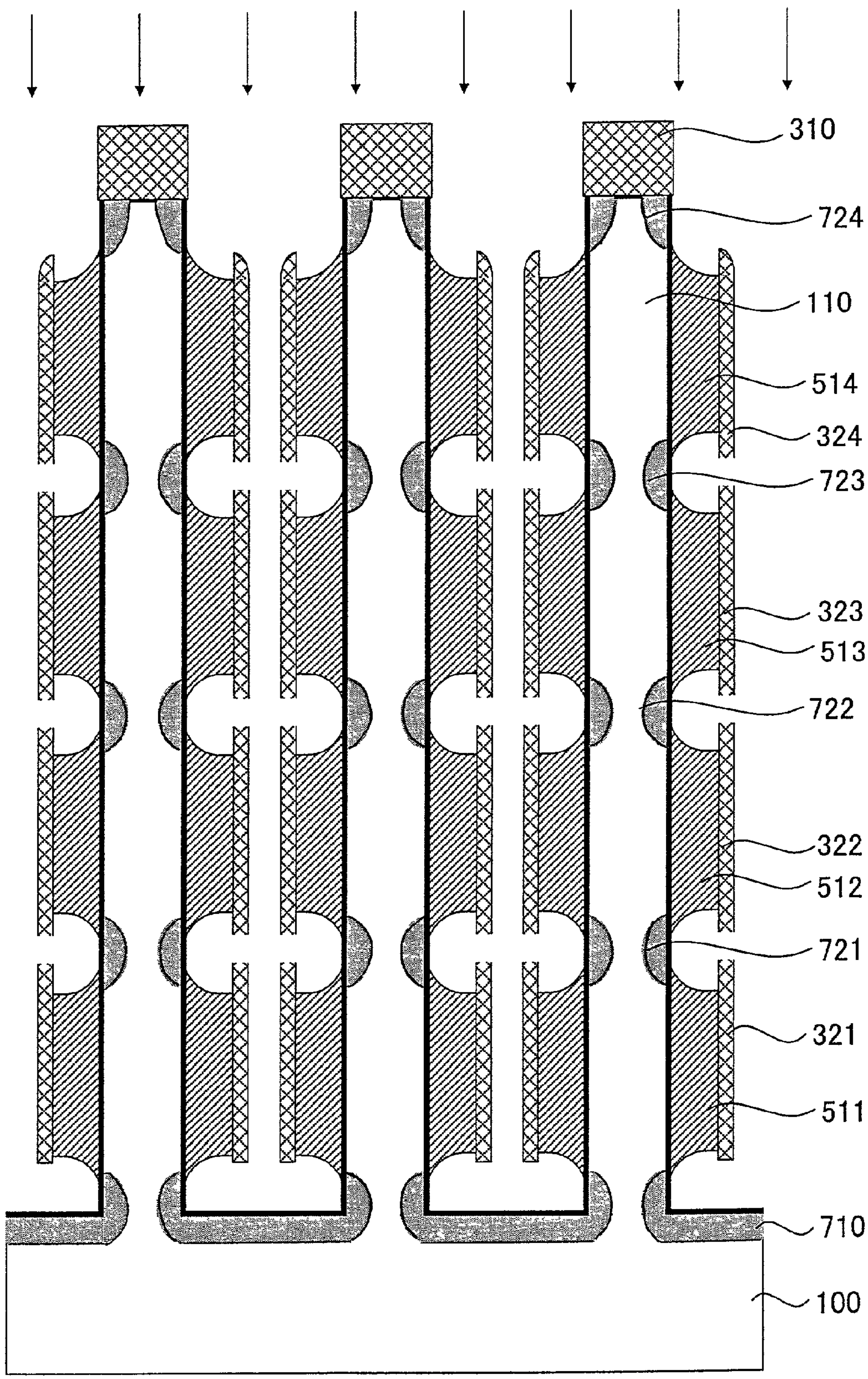
Figure 310:
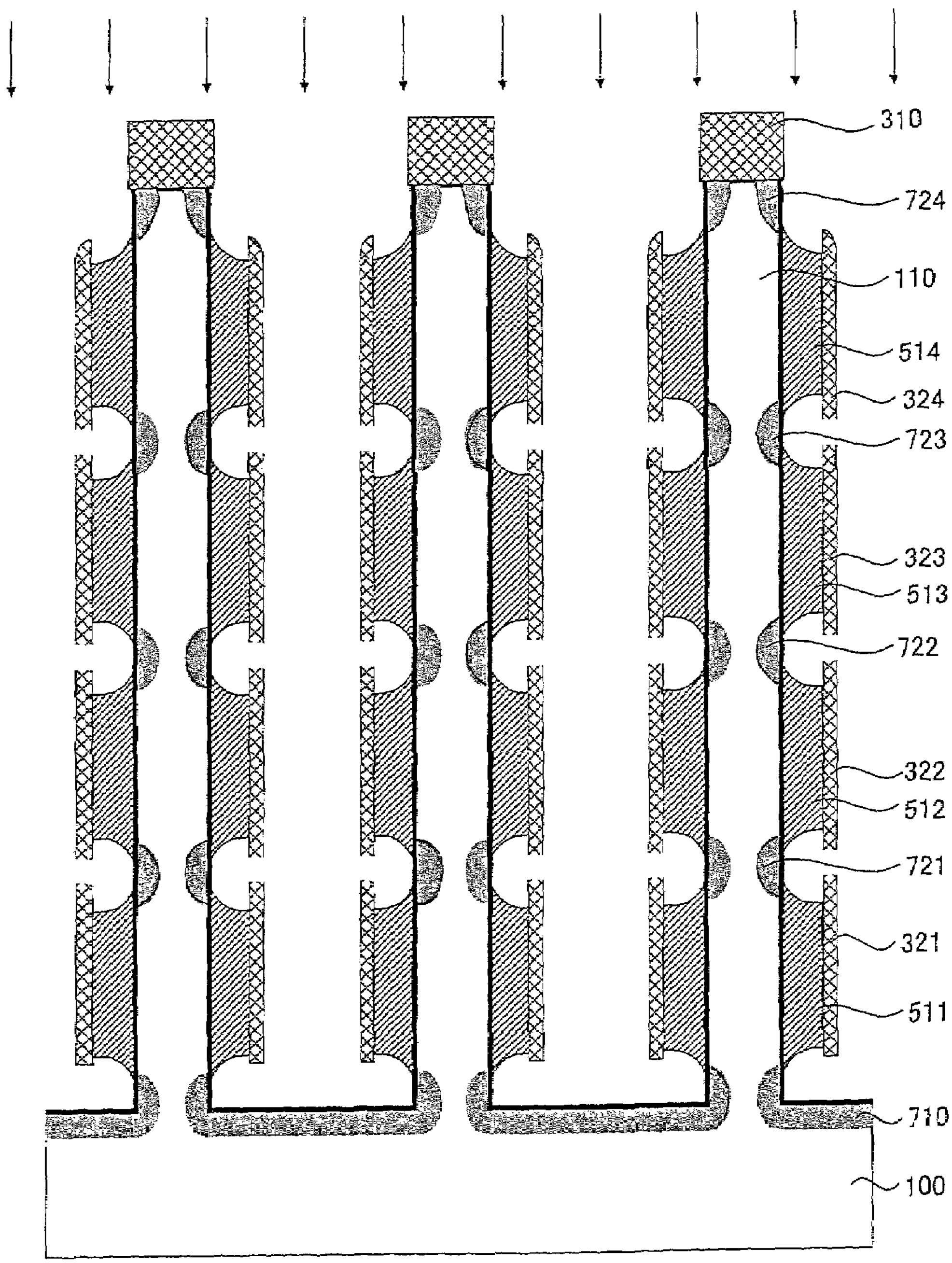

The polysilicon film 510 is divided by isotropic etching (FIG. 290 and FIG. 310). The polysilicon film 510 may be divided into polysilicon films 511 to 514 which are first conductive films, by thermal oxidization using silicon nitride films (fourth insulating films) 321 to 324 as a mask or by combination of etching and thermal oxidization. Impurity introduction is carried out into the island-like semiconductor layers 110 and the semiconductor substrate 100 in self-alignment with the divided polysilicon films 511 to 514 and the silicon nitride film (the first insulating film) 310. For example, N-type impurity diffusion layers 710 to 724 are formed in an arsenic concentration of about $1\times10^{18}$ to $1\times10^{21}/cm^3$ using a diffusion process (e.g., solid phase diffusion process, vapor phase diffusion process, etc.). At this time, the impurity diffusion layer 710 to be a first wiring layer may be adjusted about its impurity concentration by ion implantation (FIG. 290 and FIG. 310). For example, the ion implantation may be performed at an implantation energy of 5 to 100 keV at a phosphorus dose of about $1\times10^{13}$ to $1\times10^{15}/cm^2$ in a direction inclined by about 0 to 7°.

The timing of forming the impurity diffusion layer 710 is not necessarily the same as the timing of forming the N-type semiconductor layers 721 to 724. For example, the impurity diffusion layer 710 may be formed by ion implantation after the formation of the thermally oxidized film (the second insulating film) 410 or after the formation of the silicon oxide film (the third insulating film) 420. Alternatively, the impurity diffusion layer 710 may be formed by combining two or more of these timings.

Figure 291:
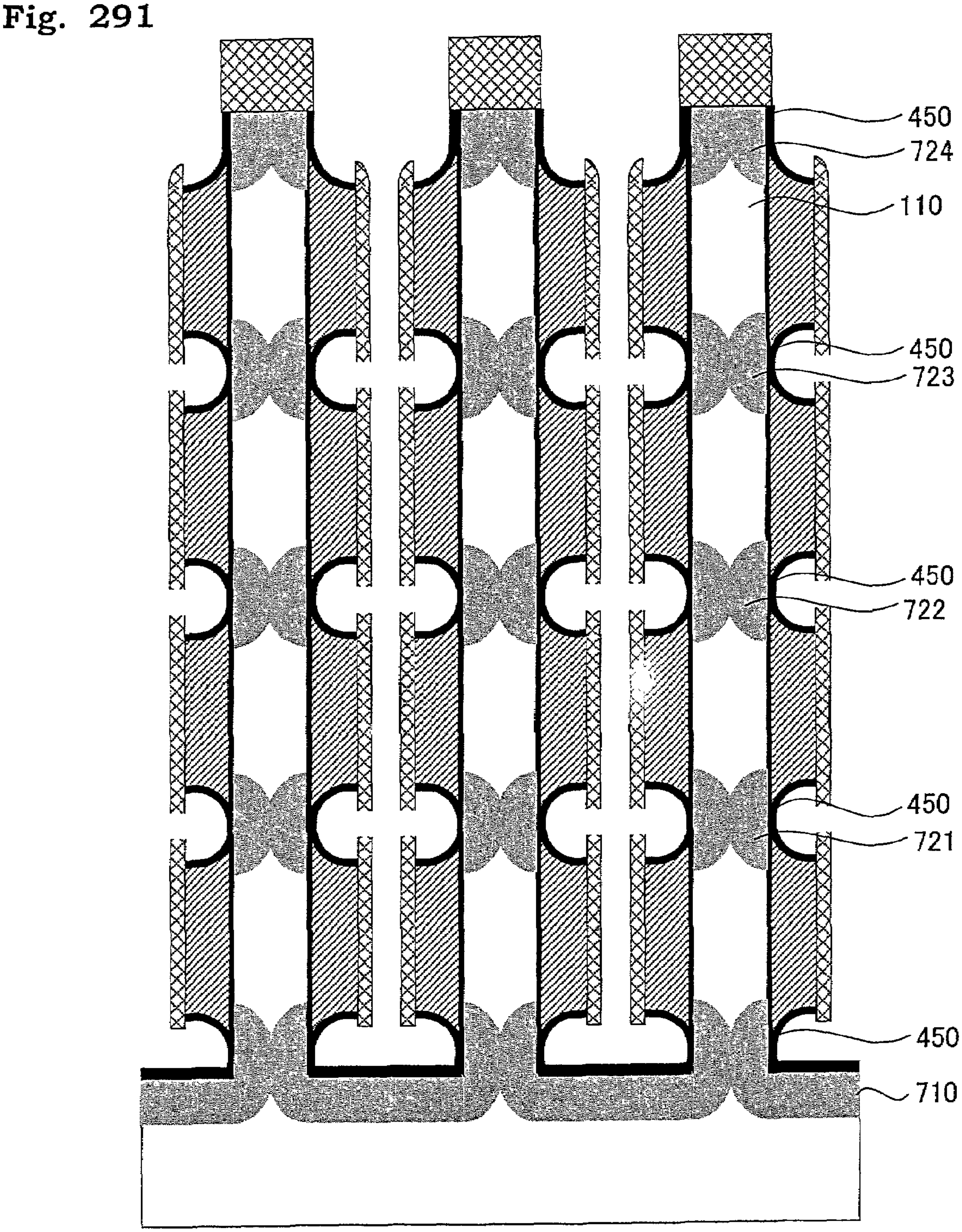
Figure 311:
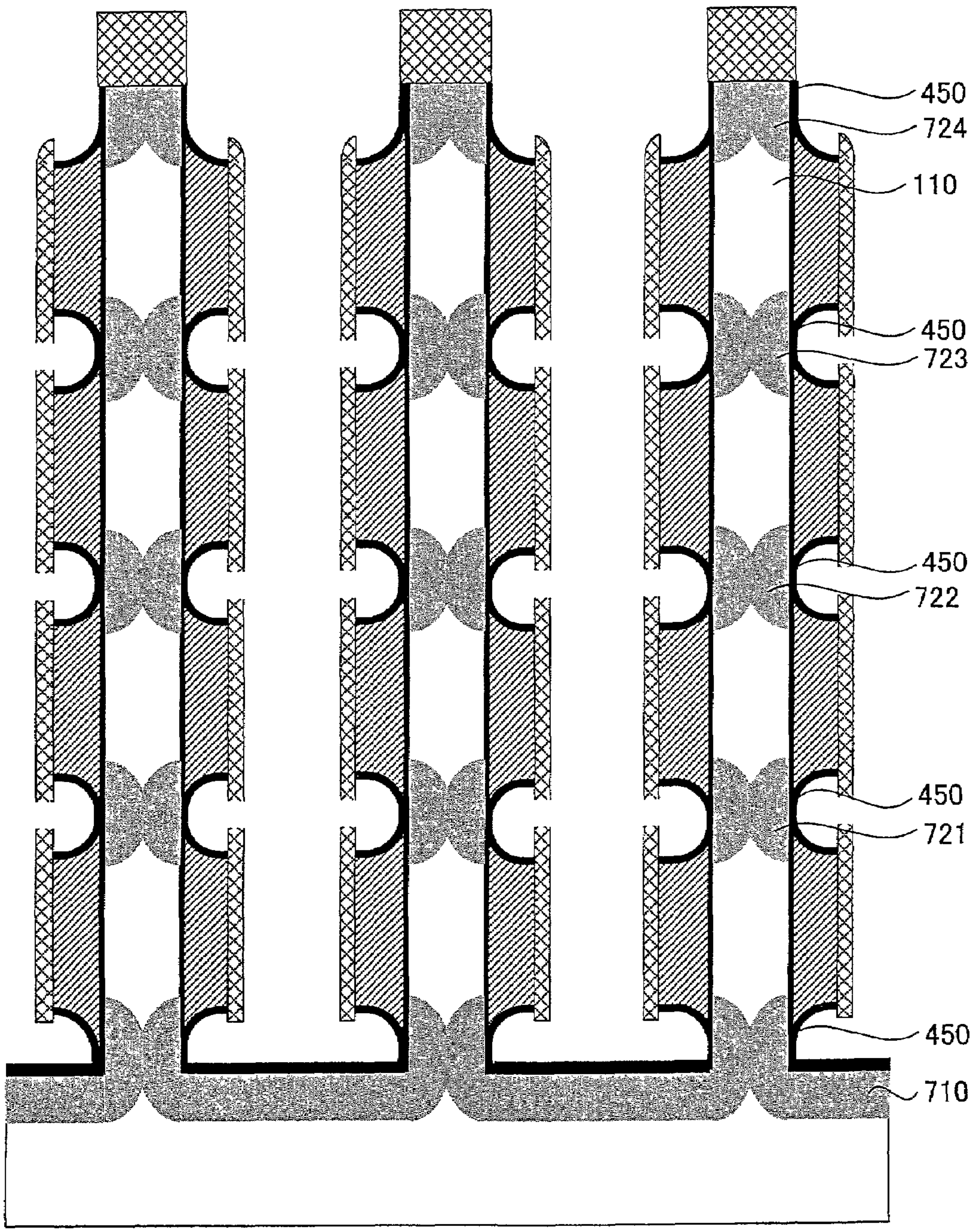

Thereafter, exposed portions of the polysilicon films 511 to 514 are thermally oxidized selectively to form silicon oxide films 450 of 5 to 50 nm thickness which are seventh insulating films. At this time, the impurity is diffused from the impurity diffusion layers 710 to 724 by thermal treatment to electrically float a P-type region of the island-like semiconductor layer 110 (FIG. 291 and FIG. 311). The timing of the impurity introduction to the polysilicon films 511 to 514 is not particularly limited so long as these films become conductive films. For example, the impurity introduction may be performed during the formation of the polysilicon film 510 or during the impurity introduction into the island-like semiconductor layers 110.

Figure 292:
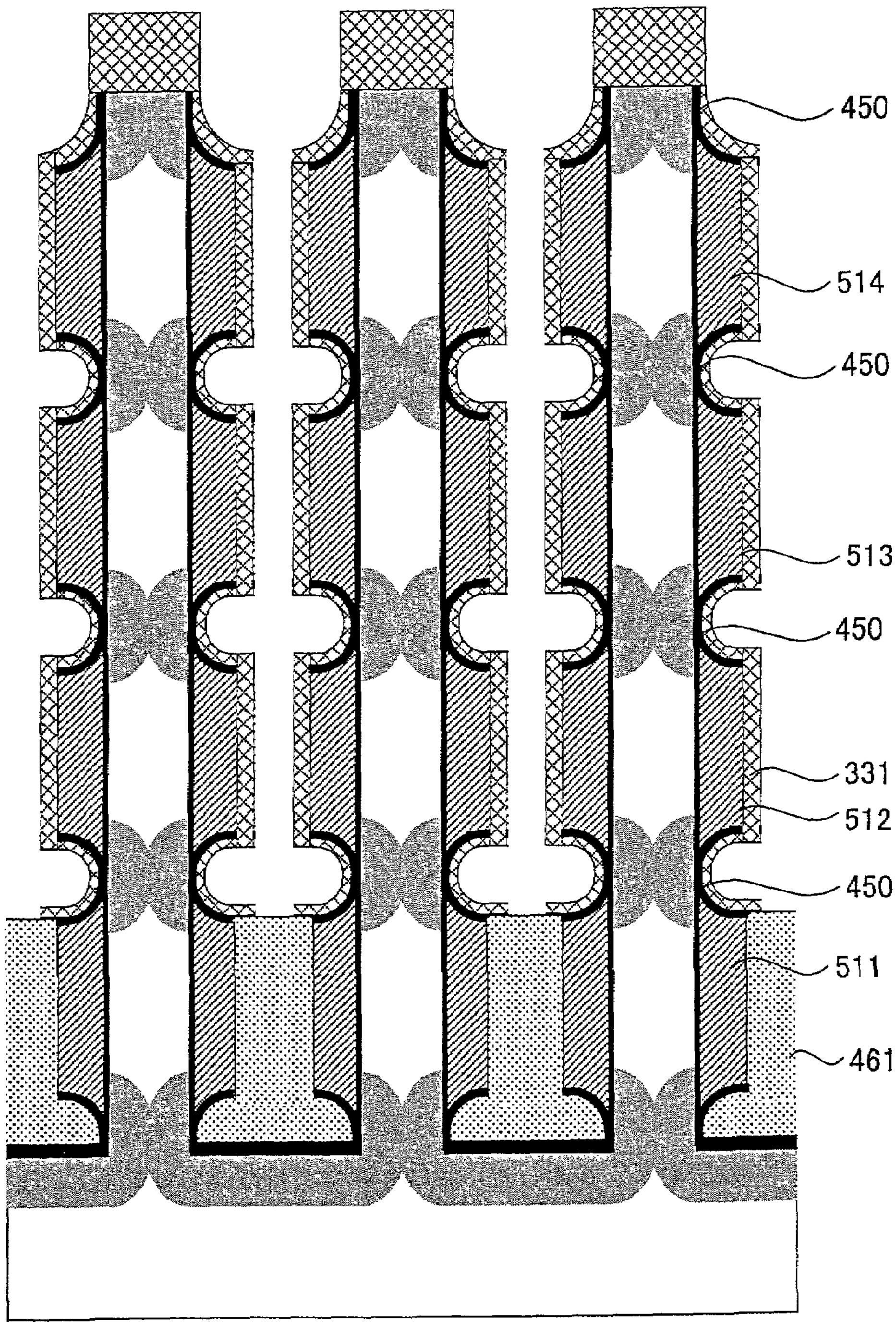
Figure 312:
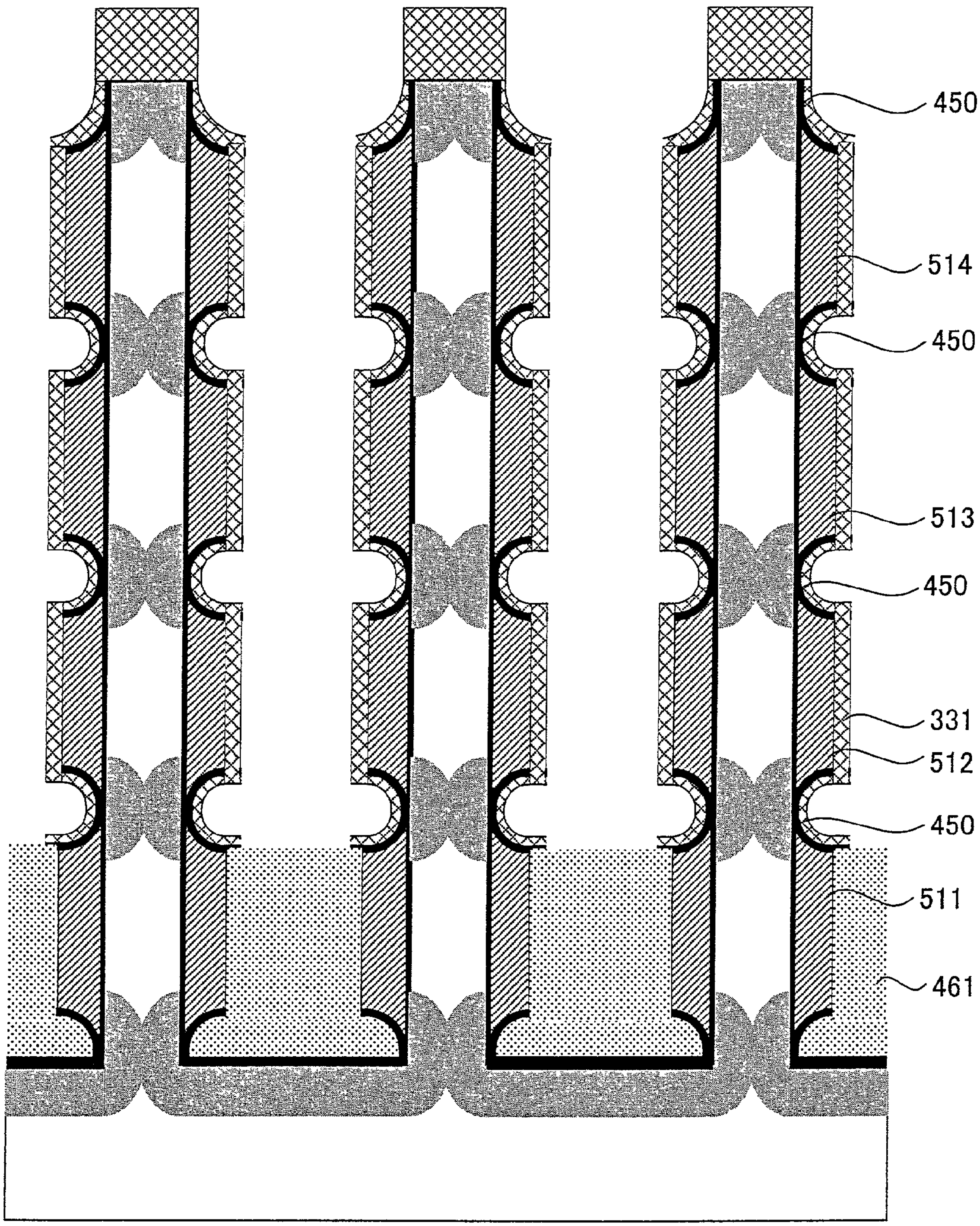

Thereafter, the sidewall spacers 321 to 324 of the silicon nitride film (the fourth insulating film) are removed, for example, by isotropic etching. Then, a silicon oxide film (eighth insulating film) 461 is deposited to a thickness of 50 to 500 nm and isotropically and anisotropically etched so that the silicon oxide film 461 is embedded to bury the side of the polysilicon 511. A silicon nitride film 331, for example, is deposited as a ninth insulating film to a thickness of 5 to 50 nm on the polysilicon films (the first conductive films) 512 to 514 and the silicon oxide film (the seventh insulating film) 450 to form sidewall spacers (FIG. 292 and FIG. 312).

Figure 293:
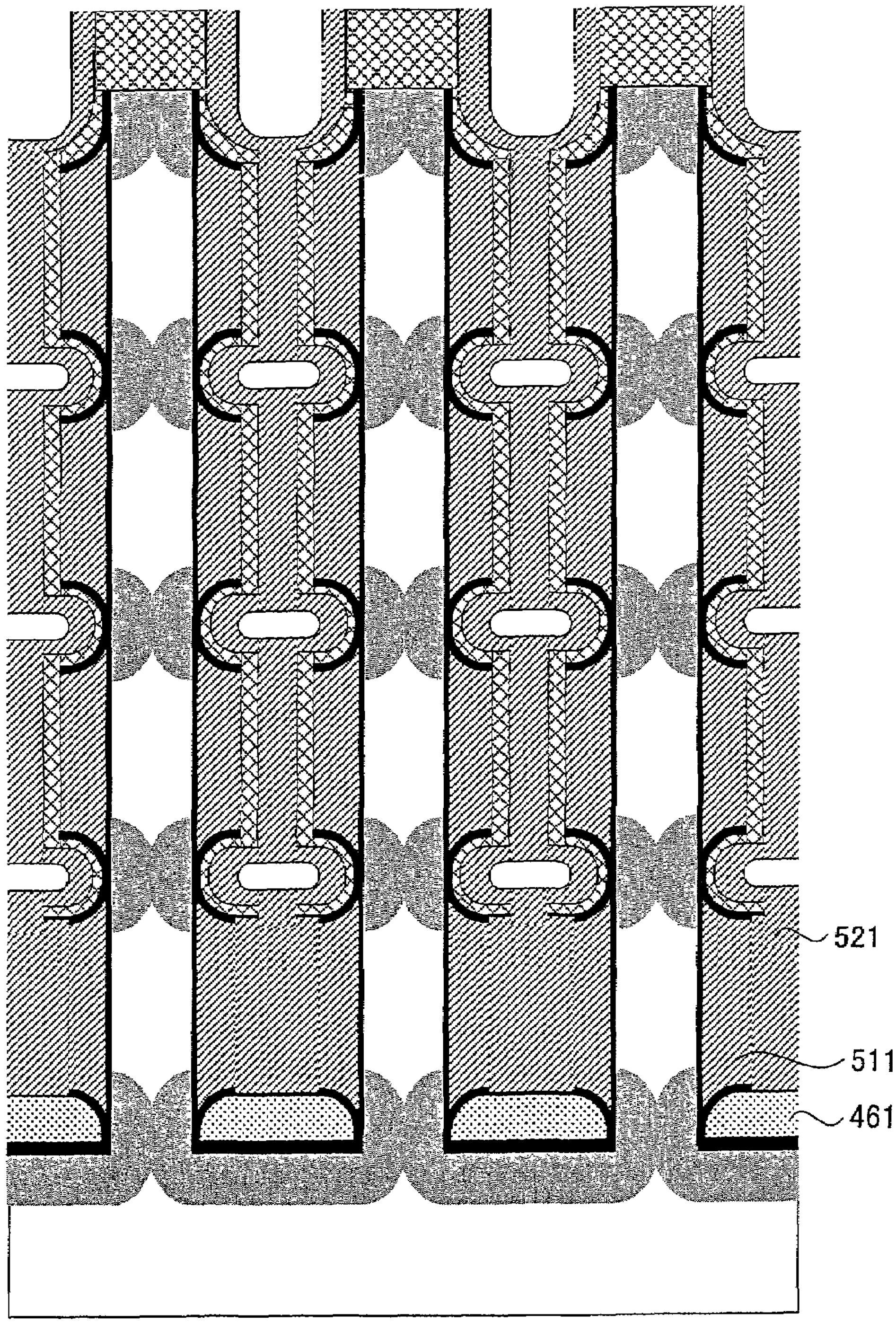
Figure 294:
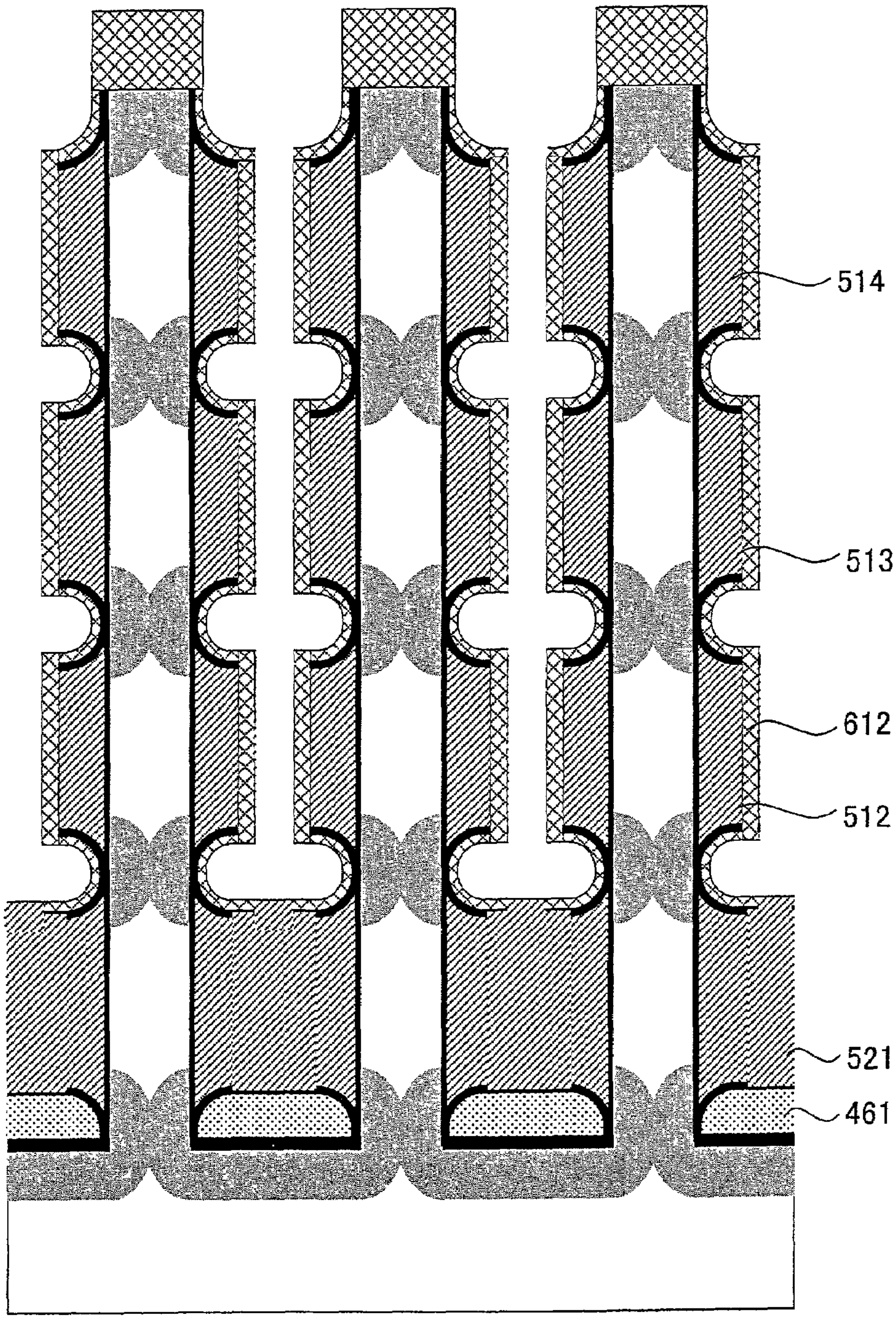
Figure 313:
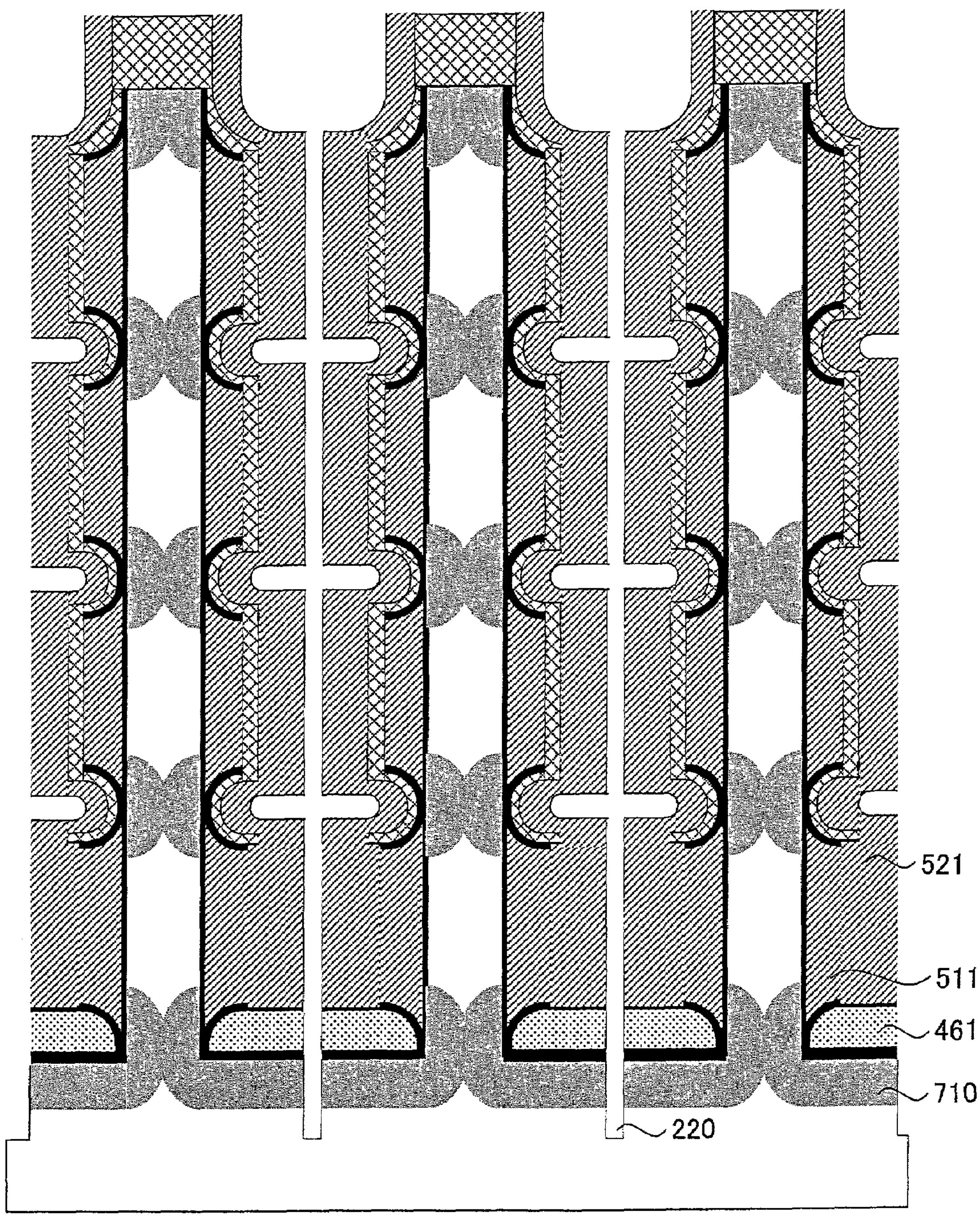
Figure 314:
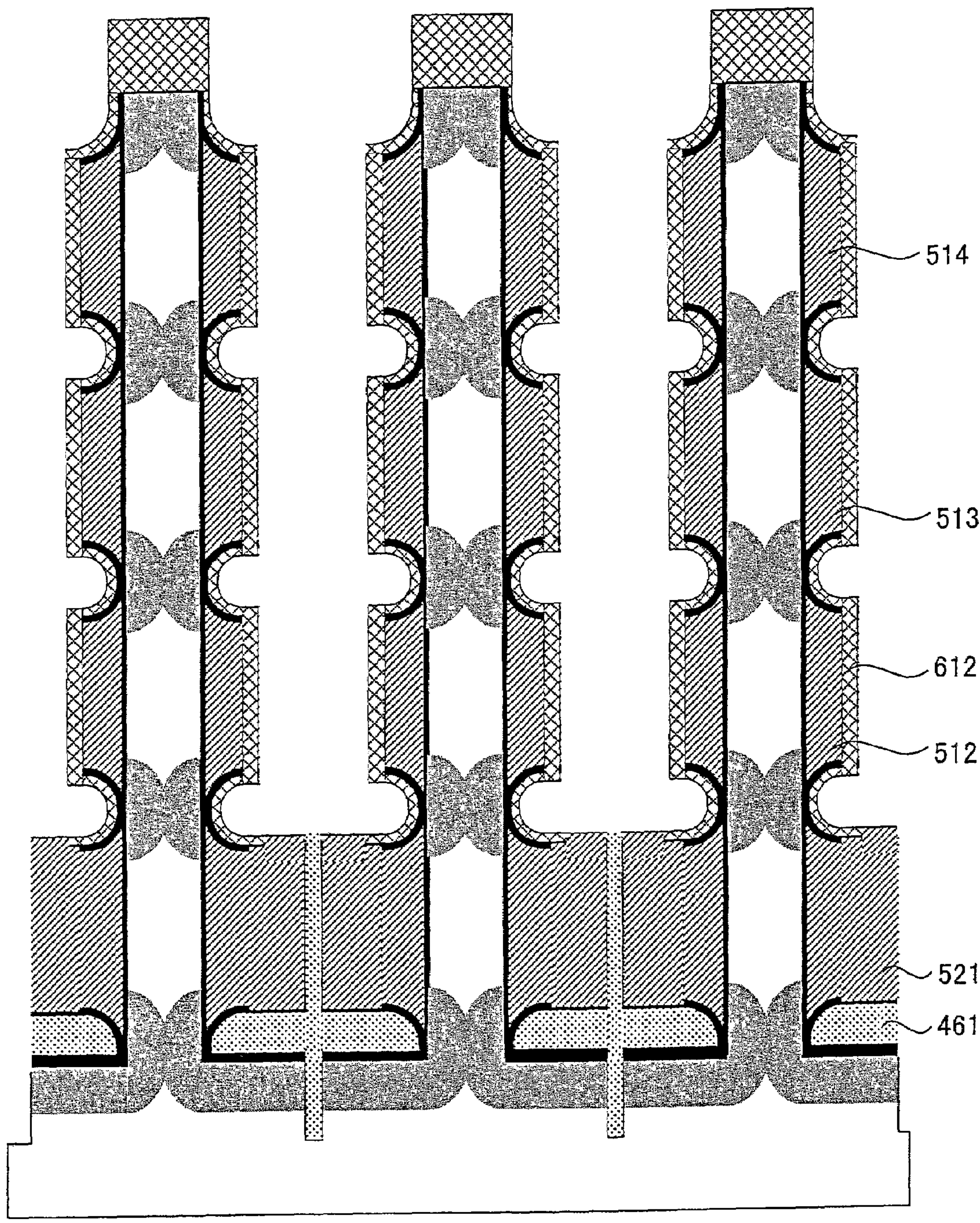

Subsequently, the silicon oxide film 461 is etched back to such a degree that the side of the polysilicon film 511 is exposed, and a polysilicon film 521, for example, is deposited a second conductive film to a thickness of 15 to 150 nm (FIG. 293). Then, as shown in FIG. 313, a second trench 220 is formed in the P-type silicon substrate 100 in self-alignment with the polysilicon film 521 to separate the impurity diffusion layer 710. That is, a separation portion of the first wiring layer is formed in self-alignment with a separation portion of the second conductive film. Subsequently, the polysilicon film 521 is etched back to such a degree that the polysilicon film 521 is able to contact the polysilicon film 511 to form a selection gate. At this time, by setting the intervals between the island-like semiconductor layers 110 in a direction of A–A' in FIG. 1 to a predetermined value or smaller, the polysilicon film 521 is formed into a second wiring layer to be a selection gate line continuous in the direction without need to use a masking process. Thereafter, a silicon oxide film 462 is deposited as an eighth insulating film to a thickness of 50 to 500 nm and anisotropically and isotropically etched so that the silicon oxide film 462 is embedded to bury the side and top of the polysilicon film (the second conductive film) 521. Then the sidewall spacer of the silicon nitride film (the ninth insulating film) 331 is removed by isotropic etching and an interlayer insulating film 612 is formed on exposed surfaces of the polysilicon films 512 to 514 (FIG. 294 and FIG. 314). This interlayer insulating film 612 may be formed of an ONO film, for example. More particularly, a silicon oxide film of 5 to 10 nm thickness is formed on the surface of the polysilicon film by thermal oxidization, and then, a silicon nitride film of 5 to 10 nm thickness and a silicon oxide film of 5 to 10 nm thickness are formed sequentially by CVD.

Figure 295:
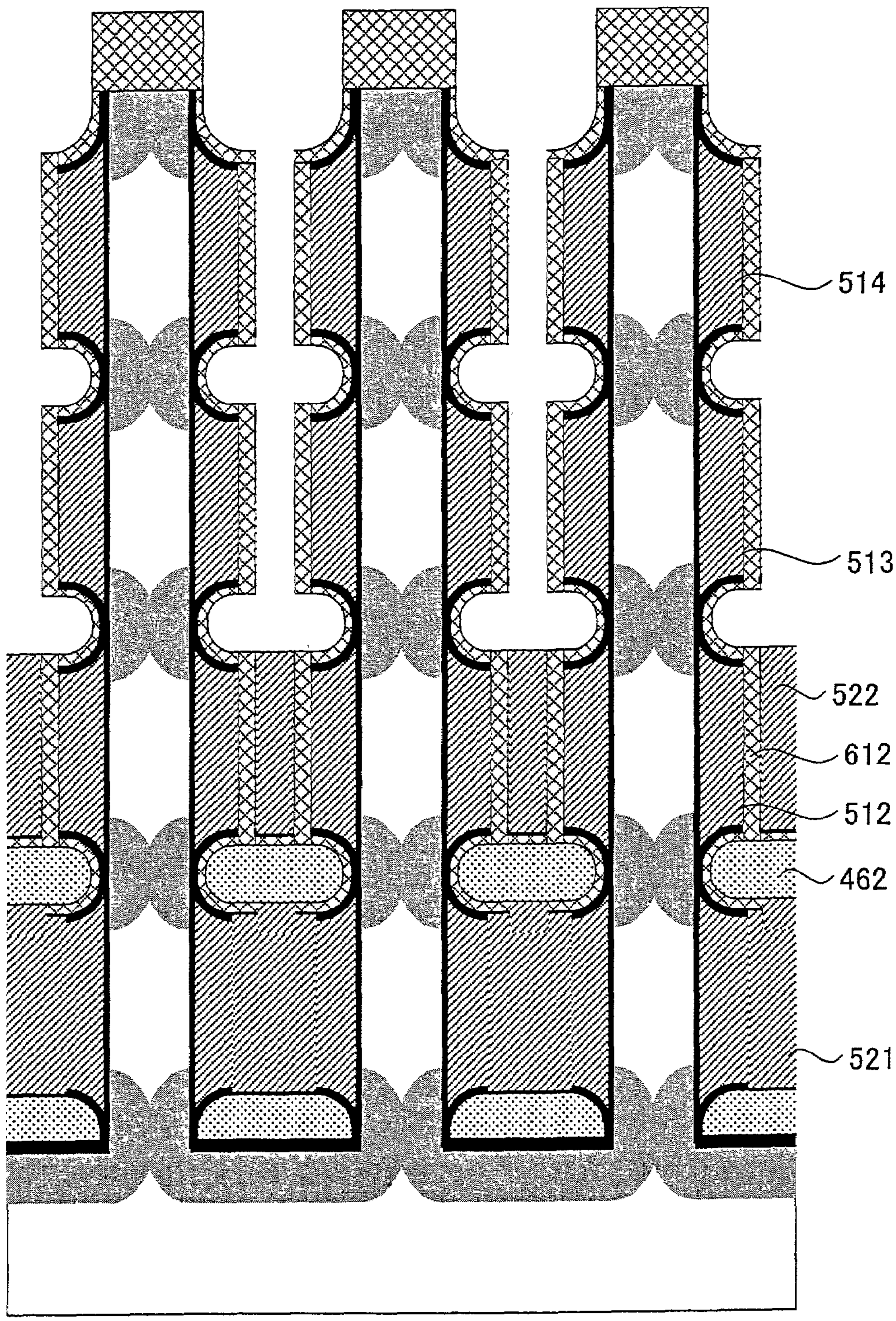
Figure 315:
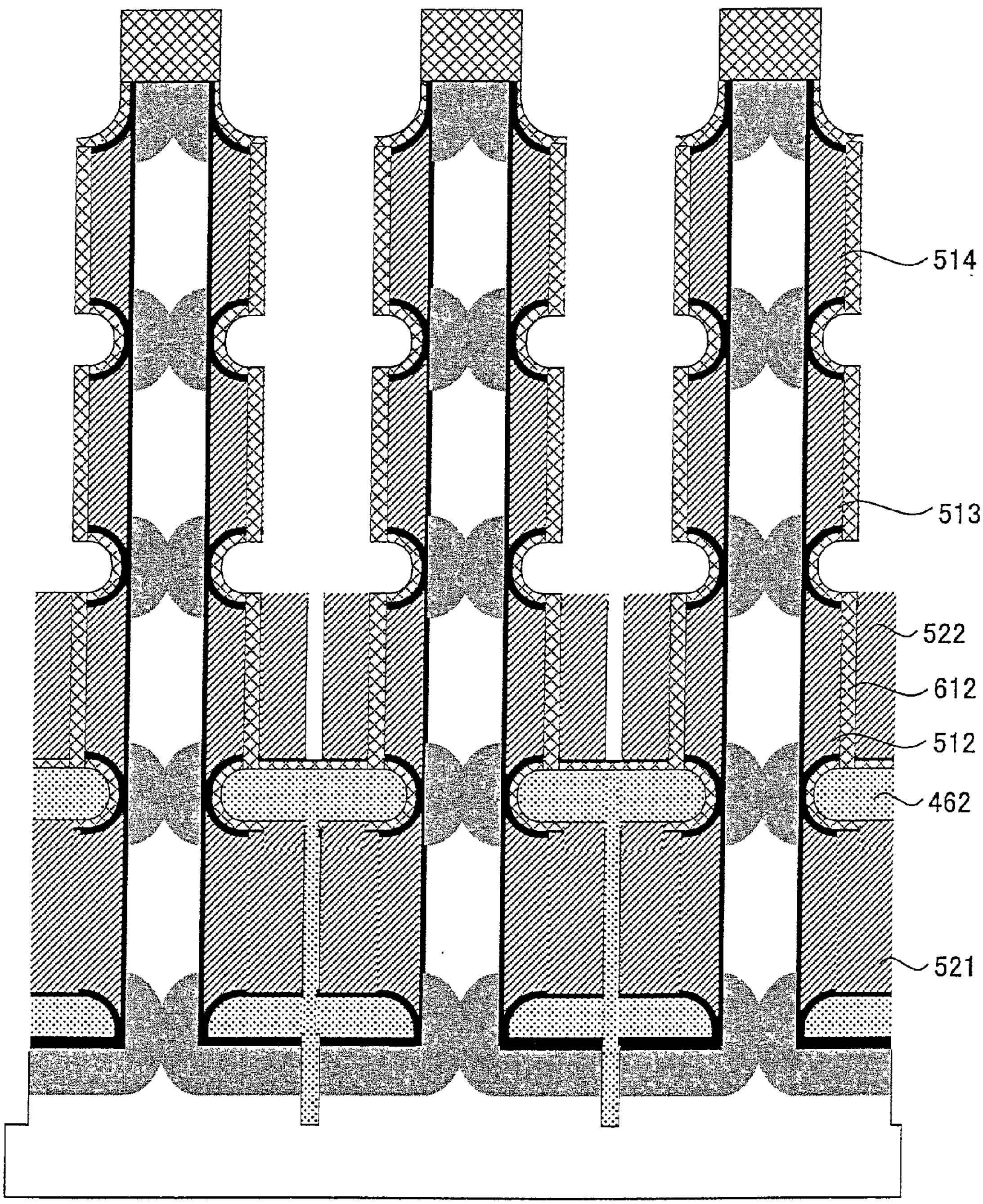

Subsequently, in the same manner, a polysilicon film (a second conductive film) 522 is deposited to a thickness of 15 to 150 nm and etched back so that the polysilicon film 522 is disposed on the side of the polysilicon film (the first conductive film) 512 with intervention of the interlayer insulating film 612 (FIG. 295 and FIG. 315). At this time, by setting the intervals between the island-like semiconductor layers 110 in the direction of A–A' in FIG. 1 to a predetermined value or smaller, the polysilicon film 522 is formed into a third wiring layer to be a control gate line continuous in the direction of A–A' without need to use a masking process. Thereafter, a silicon oxide film (an eighth insulating film) 463 is deposited to a thickness of 50 to 500 nm and anisotropically and isotropically etched so that the silicon oxide film 463 is embedded to bury the side and top of the polysilicon film (the second conductive film) 522.

Figure 296:
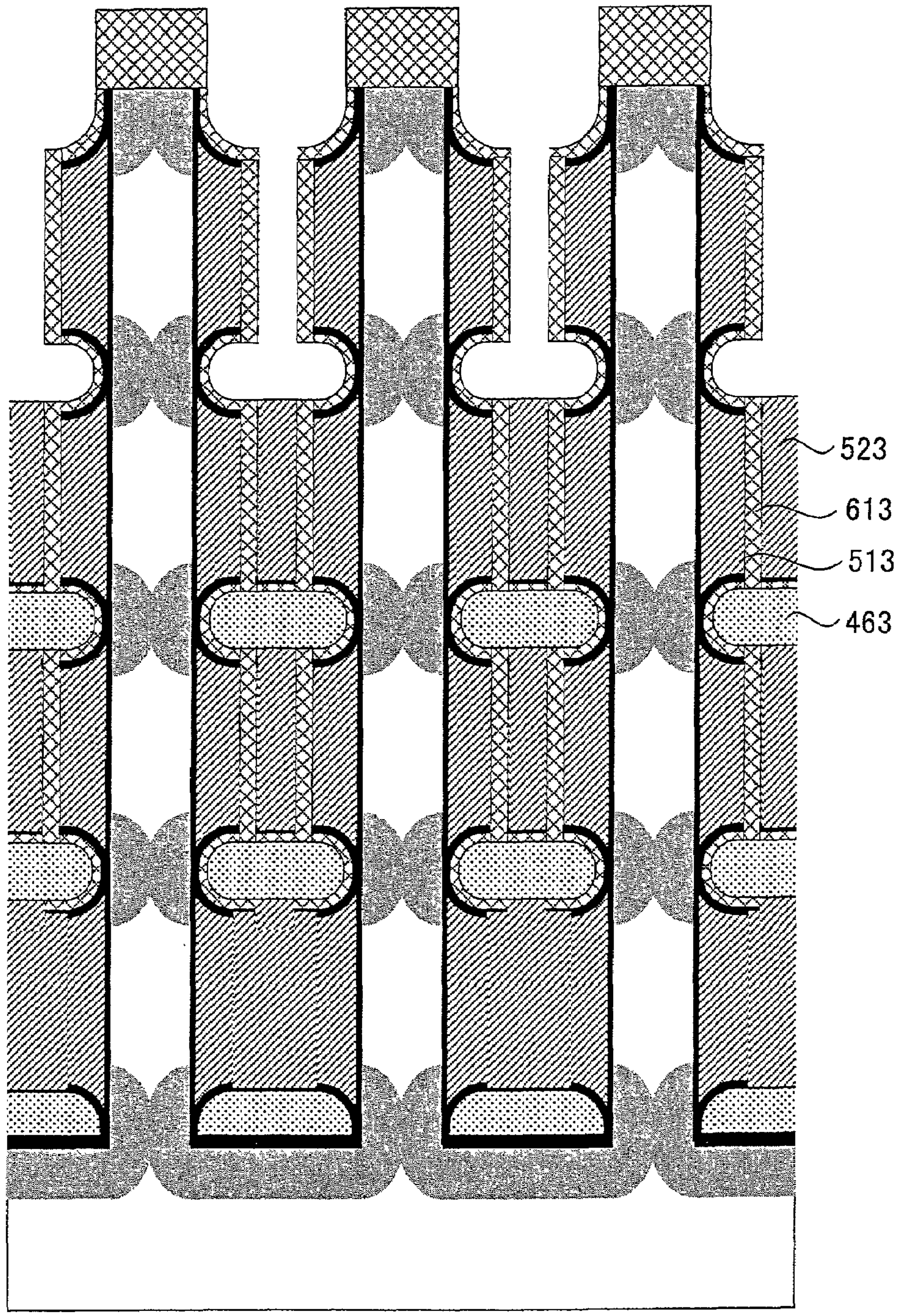
Figure 316:
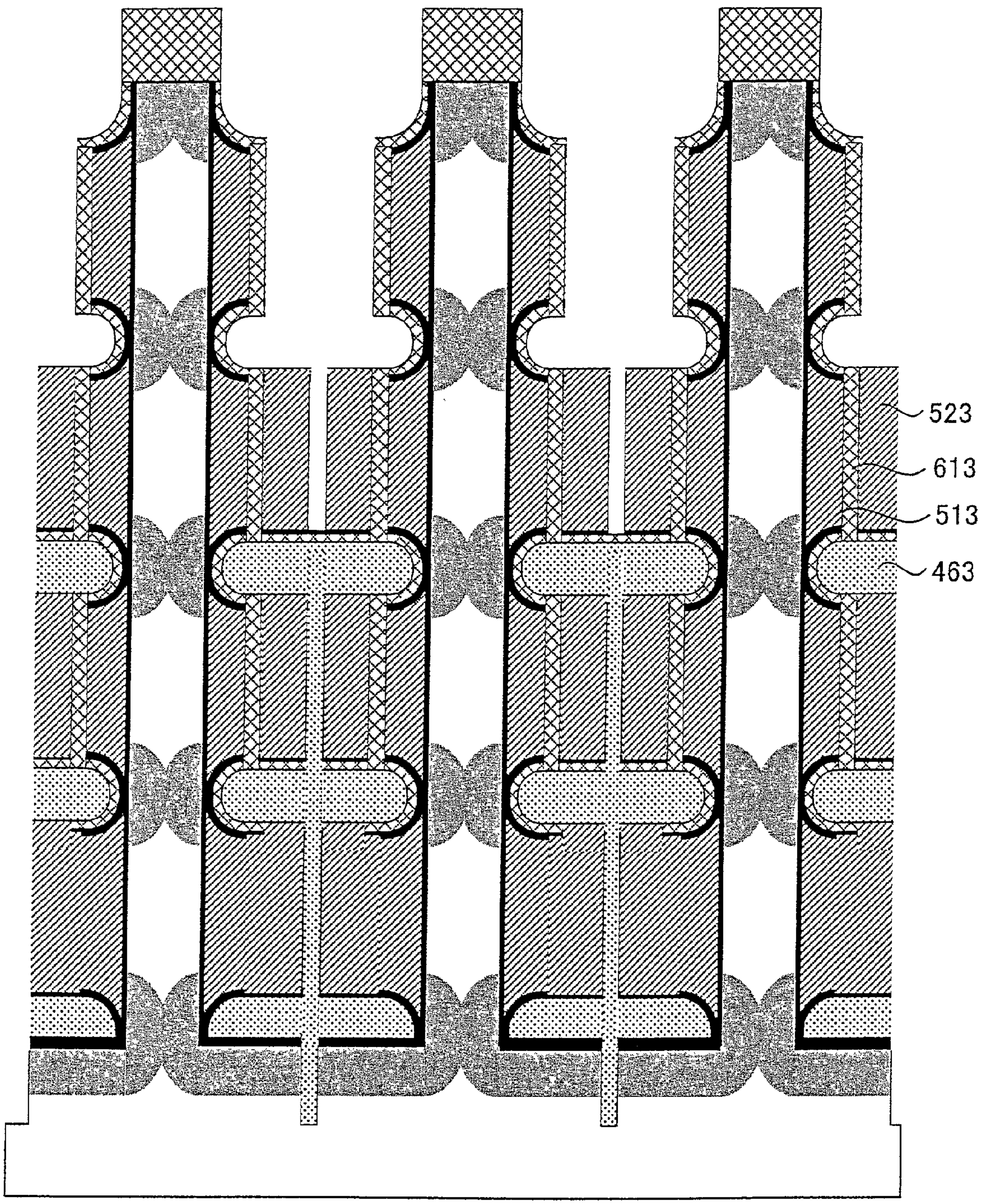

By repeating likewise, a polysilicon film (a second conductive film) 523 is disposed on the side of the polysilicon film (the first conductive film) 513 with intervention of an interlayer insulating film 613 (FIG. 296 and FIG. 316).

Figure 297:
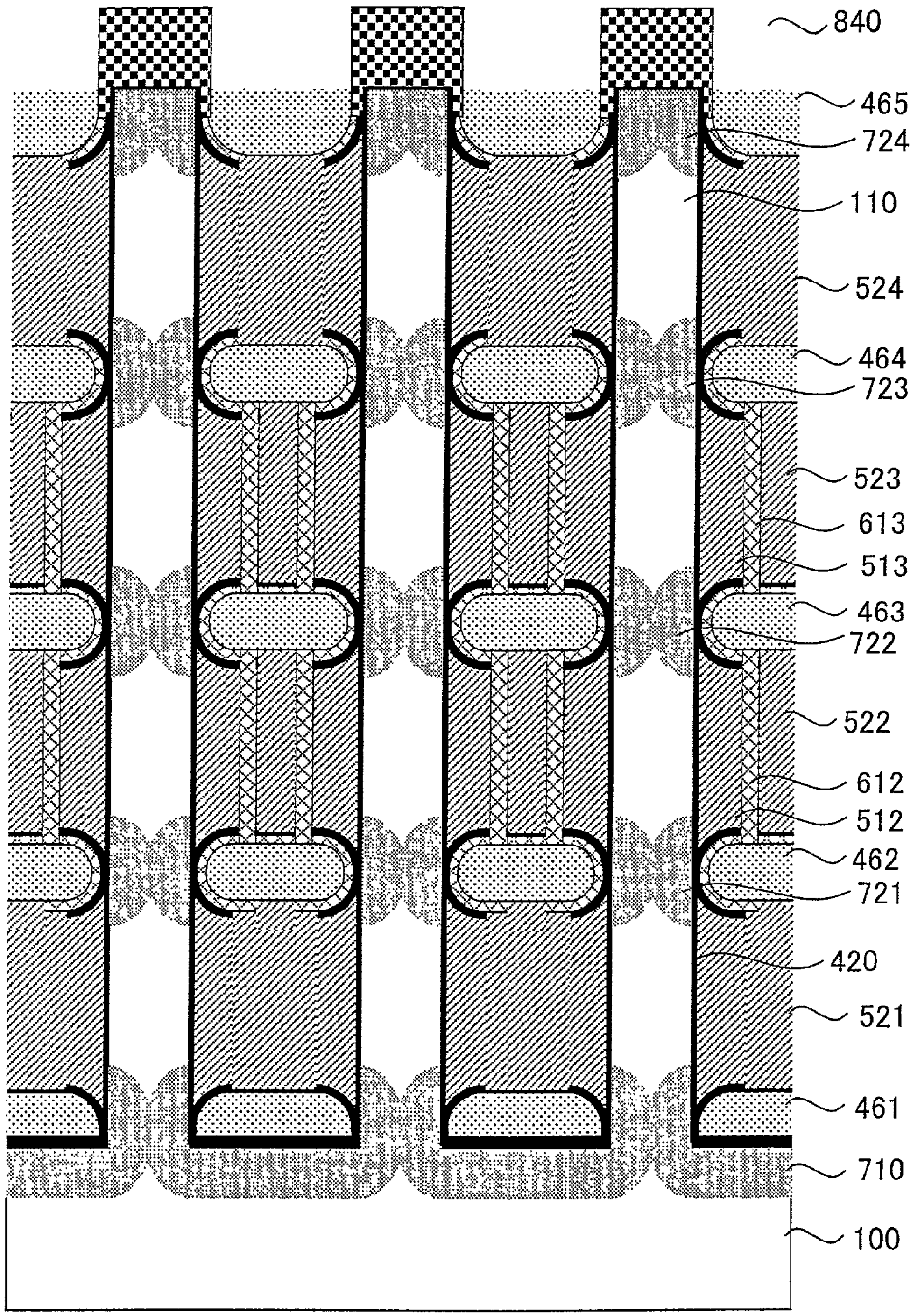
Figure 298:
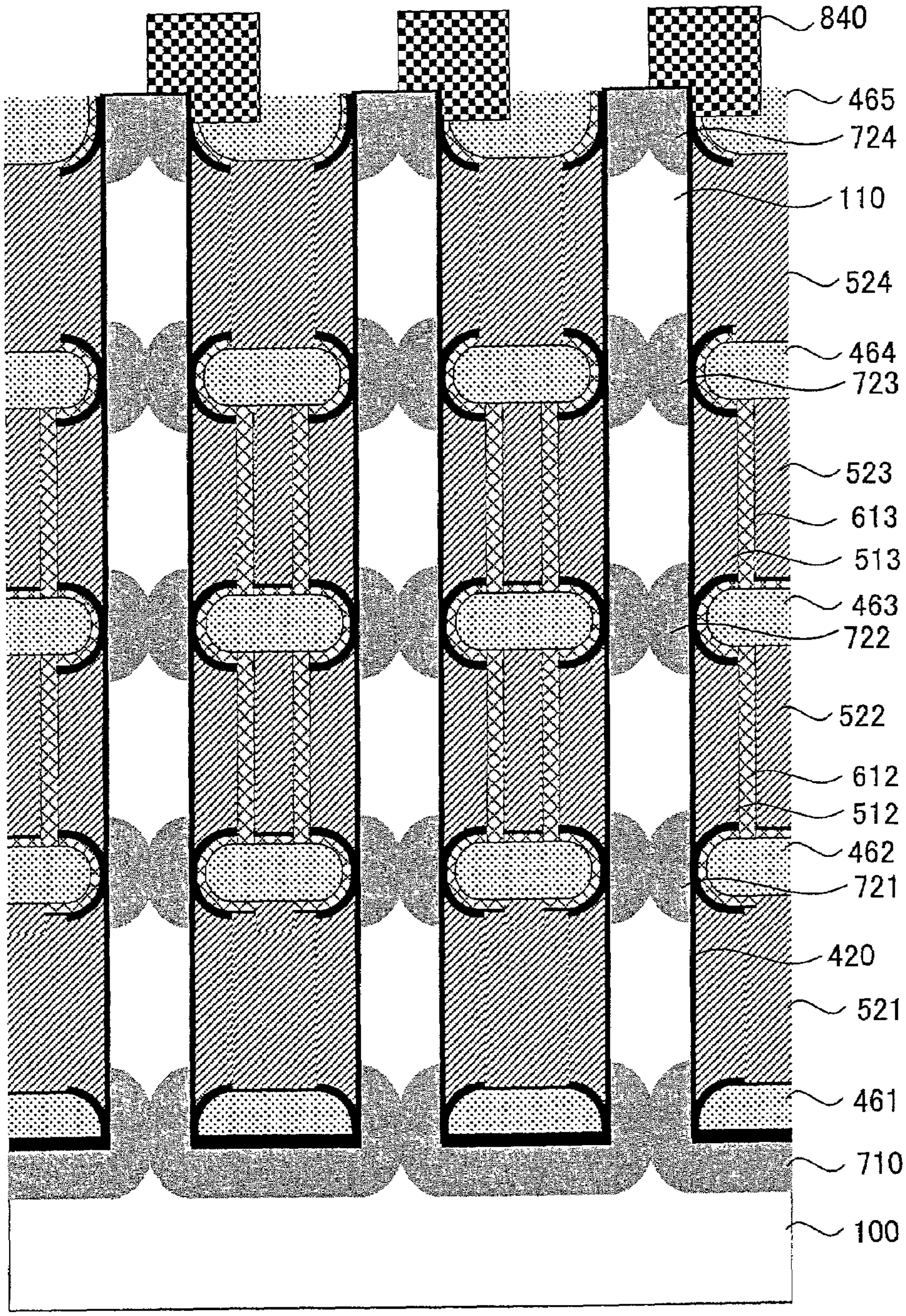
Figure 317:
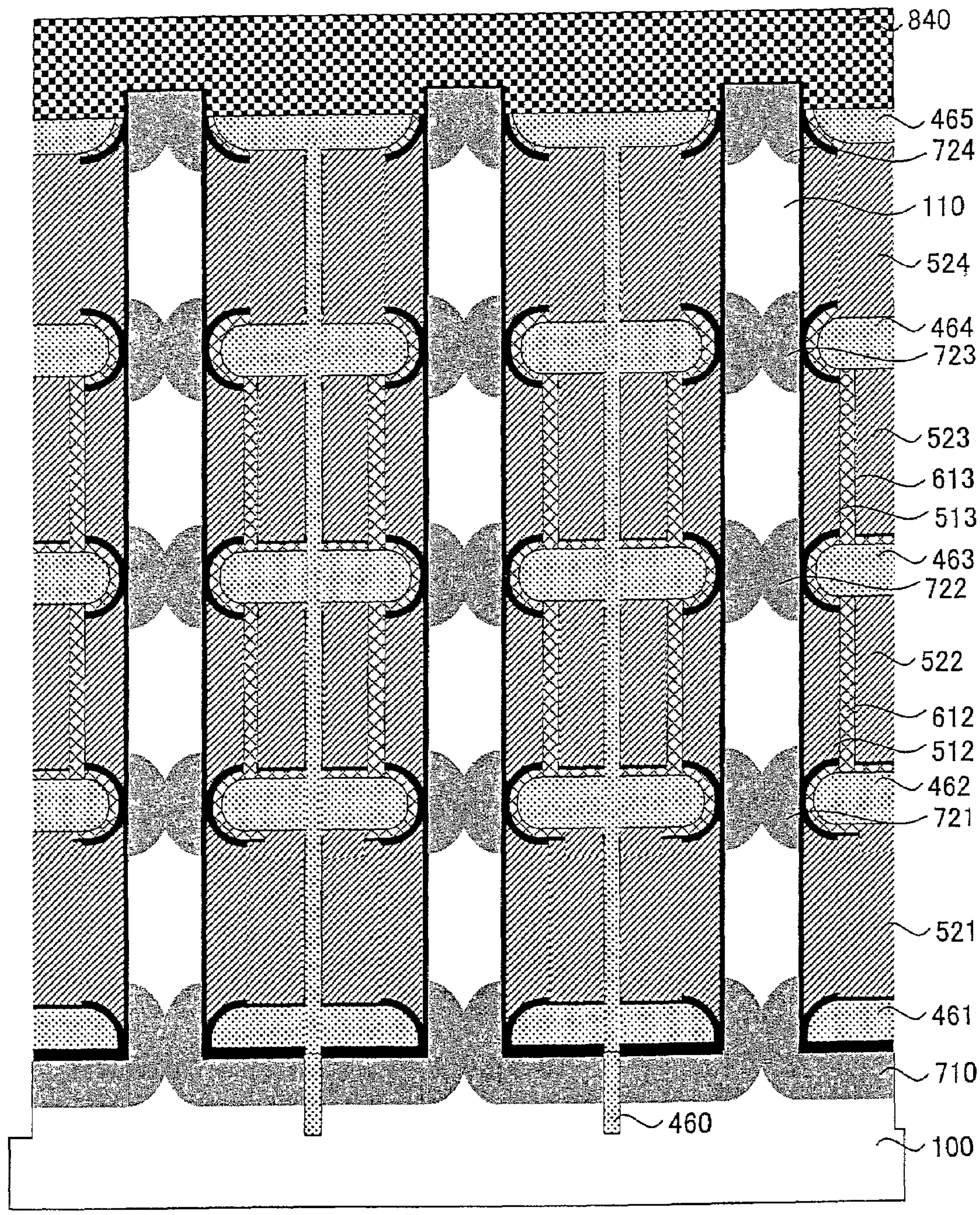

An oxide film 464 is embedded to bury the side and top of the polysilicon film 523. With regard to the polysilicon film 514 which is the topmost first conductive film, a polysilicon film (a second conductive film) 524 is etched back to such a degree that the polysilicon film 524 is able to contact the polysilicon film (the first conductive film) 514, in the same manner as the polysilicon film 511 which is the bottommost first conductive film. A silicon oxide film 465, for example, is deposited as a tenth insulating film to a thickness of 100 to 500 nm on the top of the polysilicon film 524. The top portion of the island-like semiconductor layer 110 provided with the impurity diffusion layer 724 is exposed by etch-back or by CMP. A fourth wiring layer 840 is formed as a bit line so that its direction crosses the direction of the second and third wiring layers and is connected to the top portion of the island-like semiconductor layer 110 (FIG. 297 and FIG. 317). FIG. 297 shows that the fourth wiring layer 840 is placed on the impurity diffusion layer 724 without mis-alignment. However, even if mis-alignment occurs, the fourth wiring layer 840 can be connected to the impurity diffusion layer 724 as shown in FIG. 298 (This is true of the following production examples).

Thereafter, by known techniques, an interlayer insulating film is formed, and a contact hole and metal wiring are formed. Thereby, a semiconductor memory is realized which has a memory function according to the state of a charge in the charge storage layer which is the floating gate made of the polysilicon film (the first conductive film).

In this example, films formed on the surface of the semiconductor substrate or the polysilicon film such as the silicon nitride film (the first insulating film) 310, the silicon nitride films (the fourth insulating films) 321, 322, 323 and 324 and the silicon nitride film (the ninth insulating film) 331 may be formed of a layered film of a silicon oxide film/a silicon nitride film from the silicon surface.

For forming the buried silicon oxide films, the silicon oxide films may be formed not only by CVD but also by rotational coating.

In the example, the control gates of the memory cells are formed continuously in one direction without using a mask. However, that is possible only where the island-like semiconductor layers are not disposed symmetrically to a diagonal. More particularly, by setting smaller the intervals between adjacent island-like semiconductor layers in the direction of the second and third wiring layers than those in the direction of the fourth wiring layer, it is possible to automatically obtain the wiring layers which are discontinuous in the direction of the fourth wiring layer and are continuous in the direction of the second and third wiring layers without using a mask. In contrast, if the island-like semiconductor layers are disposed symmetrically to a diagonal, for example, the wiring layers may be separated through patterning with use of resist films by photolithography.

By providing the selection gates in the top and the bottom of a set of memory cells, it is possible to prevent the phenomenon that a memory cell transistor is over-erased, i.e., a reading voltage is 0V and a threshold is negative, thereby the cell current flows even through a non-selected cell.

In this production example, the first lattice-form trench 210 is formed on the P-type semiconductor substrate, as an example. However, the first lattice-form trench 210 may be formed in an impurity diffusion layer of the same conductivity type as that of the semiconductor substrate, the impurity diffusion layer being formed in a P-type impurity diffusion layer formed in an N-type semiconductor substrate or in an N-type impurity diffusion layer formed in a P-type semiconductor substrate.

In addition, the impurity diffusion layer of the same conductivity type as that of the semiconductor substrate may be formed in an impurity diffusion layer which is of the conductivity type opposite to that of the semiconductor substrate and is formed in the island-like semiconductor layer.

This production example is applicable to the following various production examples.

In this production example, the first lattice-form trench 210 is formed on the P-type semiconductor substrate. However, the first lattice-form trench 210 may be formed in a P-type impurity diffusion layer formed in an N-type semiconductor substrate or in a P-type impurity diffusion layer formed in an N-type impurity diffusion layer formed in a P-type semiconductor substrate. The conductivity types of the impurity diffusion layers may be reversed. This production example is applicable to the following various production examples.

PRODUCTION EXAMPLE 2

In the previous example, the memory cell has a floating gate structure for the charge storage layer. However, the charge storage layer is not necessarily of the floating gate structure. In this example, the charge storage is realized by the trapping of a charge into a laminated insulating film. The present invention is also effective in the case of an MNOS structure and an MONOS structure. The laminated insulating film here means a laminate structure of a tunnel oxide film and a silicon nitride film, or this laminate structure further with a silicon oxide film formed on the surface of the silicon nitride film. Next, explanation is given of an example of production of a memory cell of this structure.

In a semiconductor memory to be produced in this example, a semiconductor substrate is patterned in the form of pillars to form island-like semiconductor layers. Sides of the island-like semiconductor layers make active regions. A plurality of laminated insulating films as charge storage layers are formed on the active regions. The island-like semiconductor layers are each in an electrically floating state with respect to the semiconductor substrate. The active region of each memory cell is in the electrically floating state. Selection gate transistors are disposed at the top and the bottom of the island-like semiconductor layer. A plurality of memory transistors, for example, two memory transistors, are placed between the selection gate transistors and are connected in series along the island-like semiconductor layer. In this production example, the selection gate and the floating gate of the transistors are formed at the same time.

FIGS. 318 to 325 and FIGS. 326 to 333 are sectional views taken on line A–A' and line B–B', respectively, in FIG. 65 which is a plan view illustrating a memory cell array of the MNOS or MONOS. In this example shown in FIG. 65, the island-like semiconductor layer 110 is columnar. The island-like semiconductor layer 110 may have a prism outward form instead of a columnar outward form. However, if the dimension of the island-like semiconductor layer 110 is as small as it approaches the minimum photoetching dimension, the island-like semiconductor layer 110, if designed in the prism form, is substantially columnar because its corners are rounded.

In this example, production steps before the formation of an oxide film 420 as an third insulating film to be a tunnel oxide film on the sidewall of each semiconductor layer 110 (FIG. 280) are the same as those in Production Example 1 (FIGS. 279 to 298 and FIGS. 299 to 317).

Figure 318:
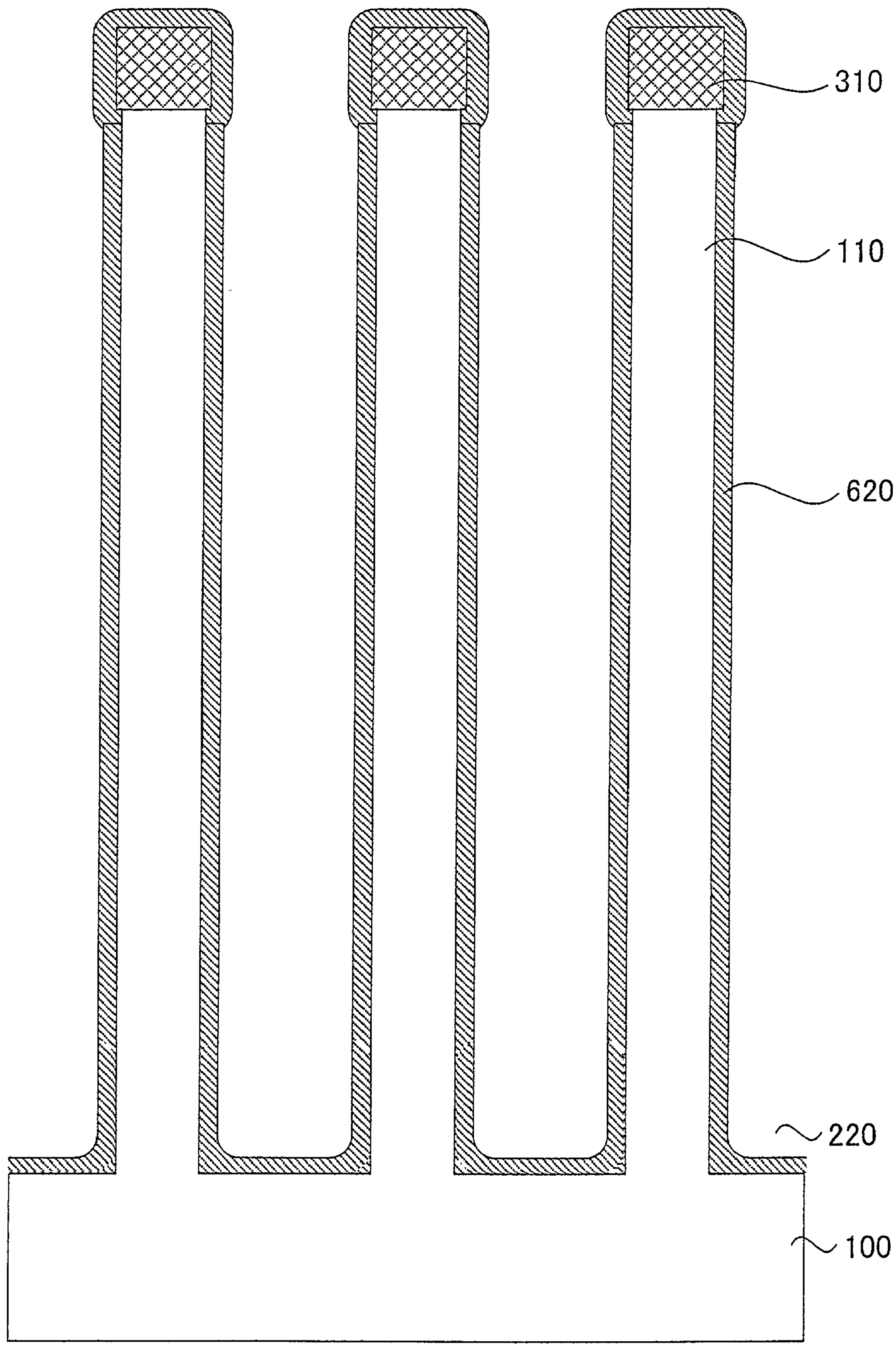
FIG. 318 to FIG. 325 are sectional views (taken on line A–A' in FIG. 1) illustrating production steps of Production Example 2 for producing a semiconductor memory in accordance with the present invention.
Figure 326:
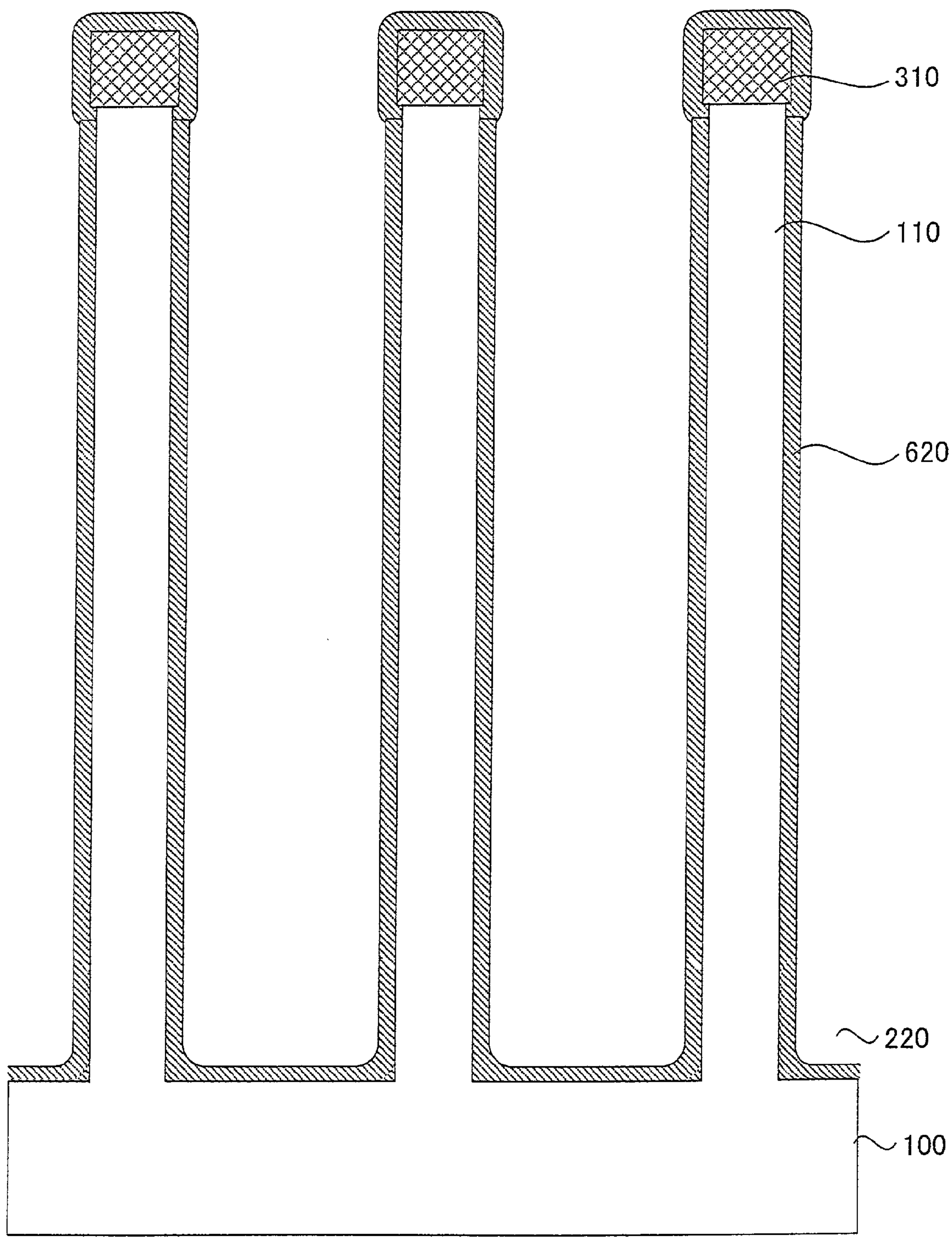
FIG. 326 to FIG. 333 are sectional views (taken on line B–B' in FIG. 1) illustrating production steps of Production Example 2 for producing a semiconductor memory in accordance with the present invention.

Thereafter, a laminated insulating film 620 to be a sidewall charge storage layer of each island-like semiconductor layer 110 is formed (FIGS. 318 and 326). Here, in the case where the laminated insulating film has the MNOS structure, a silicon nitride film of 4 to 10 nm thickness and a silicon oxide film of 2 to 5 nm thickness may be sequentially deposited on the surface of the island-like semiconductor layer 110 by CVD; or a silicon nitride film of 4 to 10 nm thickness may be formed on the surface of the island-like semiconductor layer 110 by CVD and the surface of the silicon nitride film may be oxidized to form a silicon oxide film of 2 to 5 nm thickness. In the case where the laminated insulating film has the MONOS structure, a silicon oxide film of 2 to 5 nm thickness, a silicon nitride film of 4 to 8 nm thickness and a silicon oxide film of 2 to 5 nm thickness may be sequentially deposited on the surface of the island-like semiconductor layer 110 by CVD; a silicon oxide film of 2 to 5 nm thickness and a silicon nitride film of 4 to 10 nm thickness may be sequentially deposited on the surface of the island-like semiconductor layer 110 by CVD and the surface of the island-like semiconductor layer 110 by CVD and the surface of the silicon nitride film may be oxidized to form a silicon oxide film of 2 to 5 nm thickness; or the silicon oxide film of 2 to 5 nm thickness may be formed by oxidizing the surface of the island-like semiconductor substrate 110. The above techniques may be combined variously.

Figure 319:
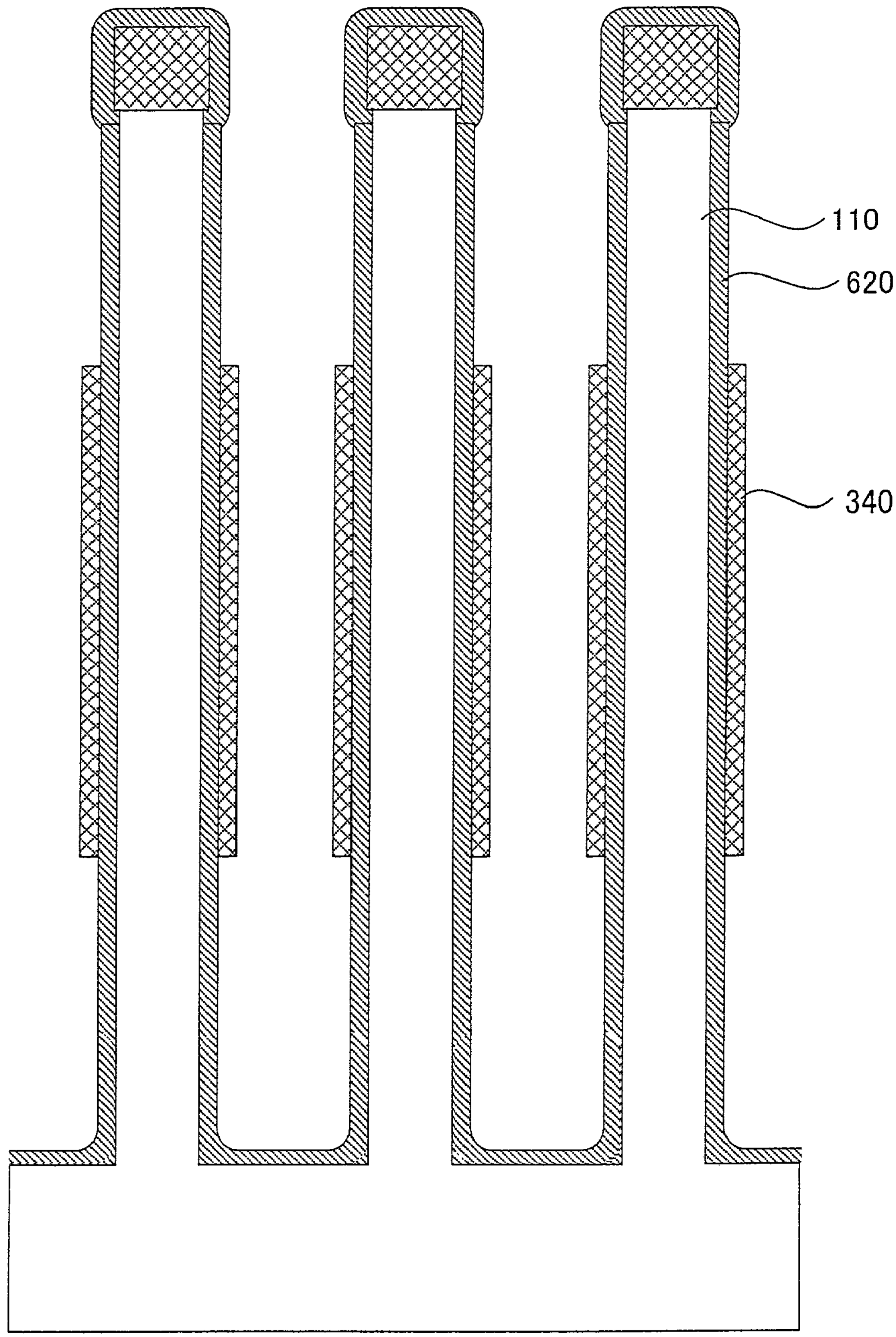
Figure 327:
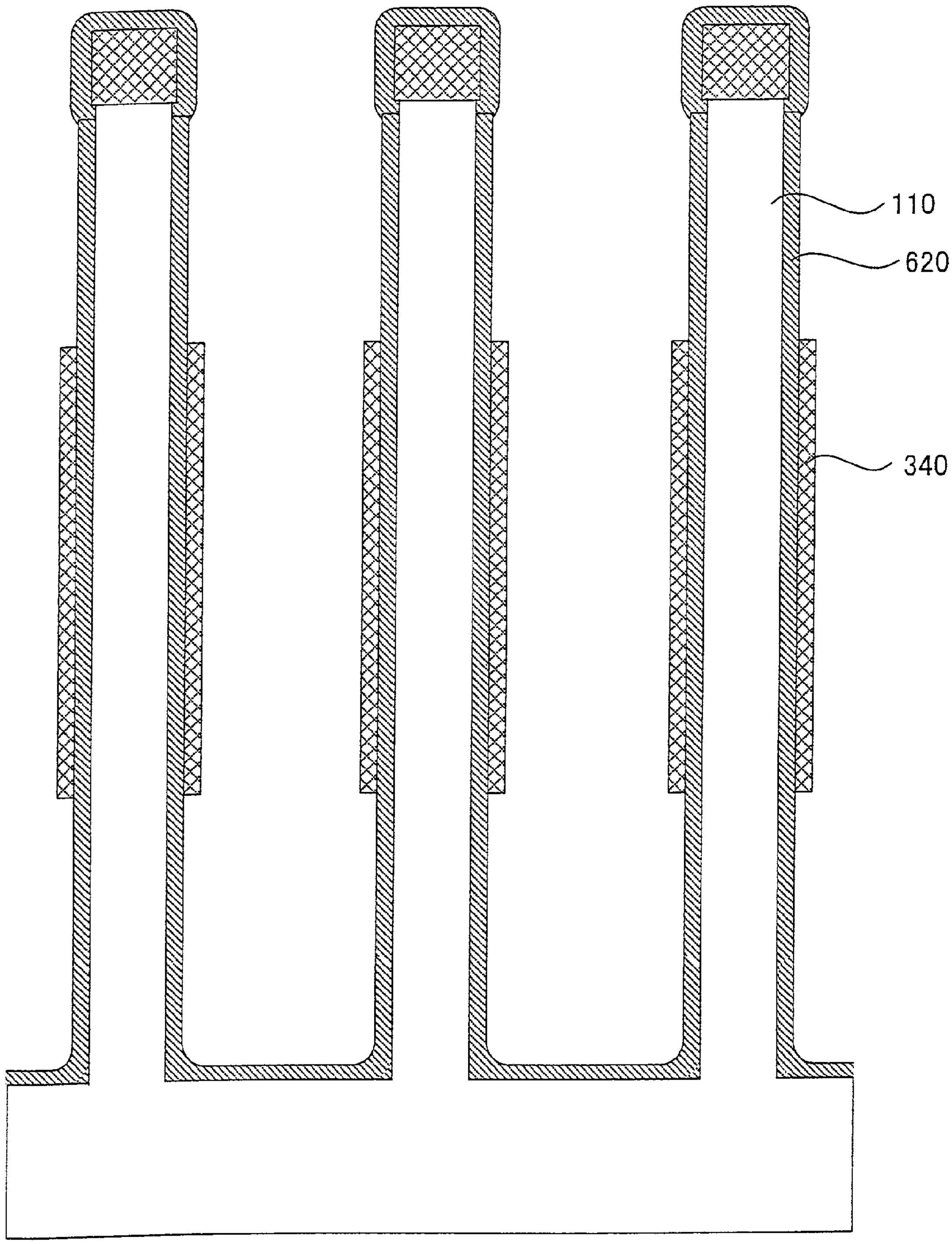

Thereafter, in the same manner as in production examples described below (FIGS. 350 to 369 and FIGS. 370 to 389), a silicon oxide film 471, for example, is deposited as an eleventh insulating film to a thickness of 50 to 500 nm and is anisotropically and isotropically etched so that the silicon oxide film 471 is buried in a first trench 210 almost to a height at which the top of a lower selection gate is positioned. Thereafter, a silicon nitride film 340, for example, is deposited as a twelfth insulating film to a thickness of 5 to 50 nm to form a sidewall spacer. Subsequently, like the eleventh insulating film, a silicon oxide film 472 is deposited to a thickness of 50 to 500 nm and is anisotropically or isotropically etched so that the silicon oxide film 472 is buried in the first trench 210 almost to a height at which the bottom of an upper selection gate is positioned. Thereafter, the sidewall spacer 340 of the silicon nitride film (the twelfth insulating film) is partially removed by isotropic etching using the silicon oxide film 472 as a mask (FIG. 319 and FIG. 327).

Figure 320:
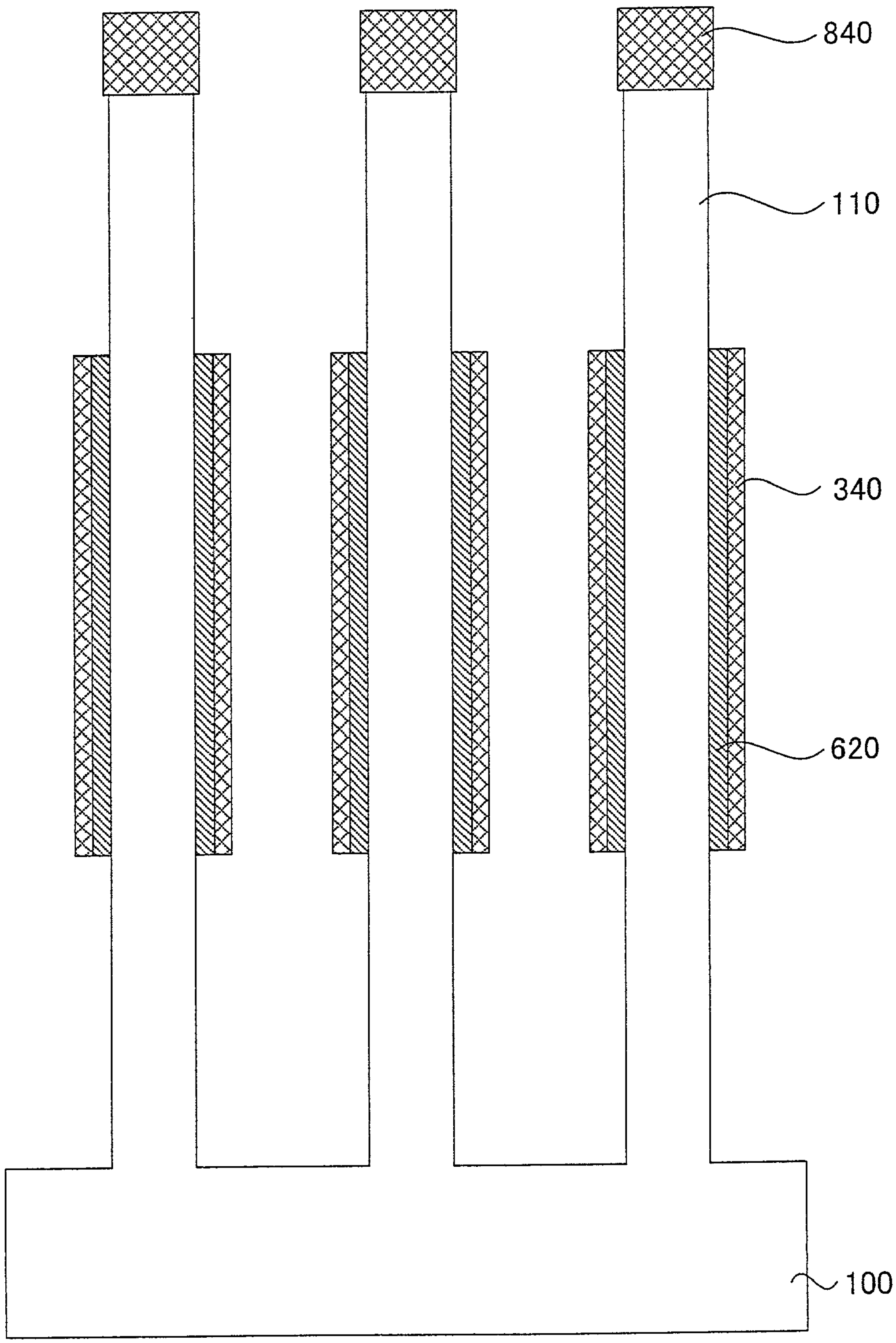
Figure 328:
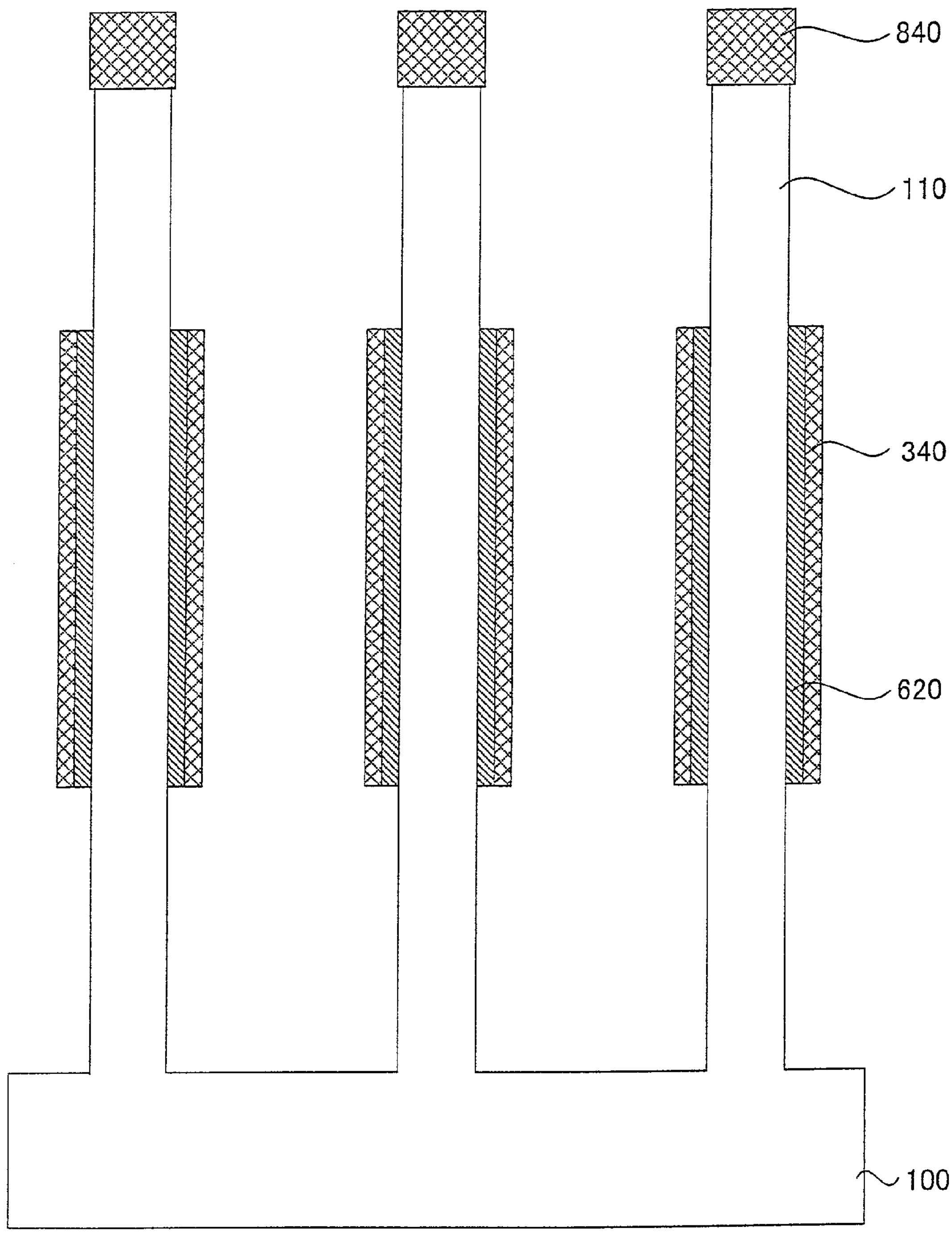

The laminated insulating film 620 is partially removed by isotropic etching using the sidewall spacer 340 of the silicon nitride film as a mask (FIG. 320 and FIG. 328).

Figure 321:
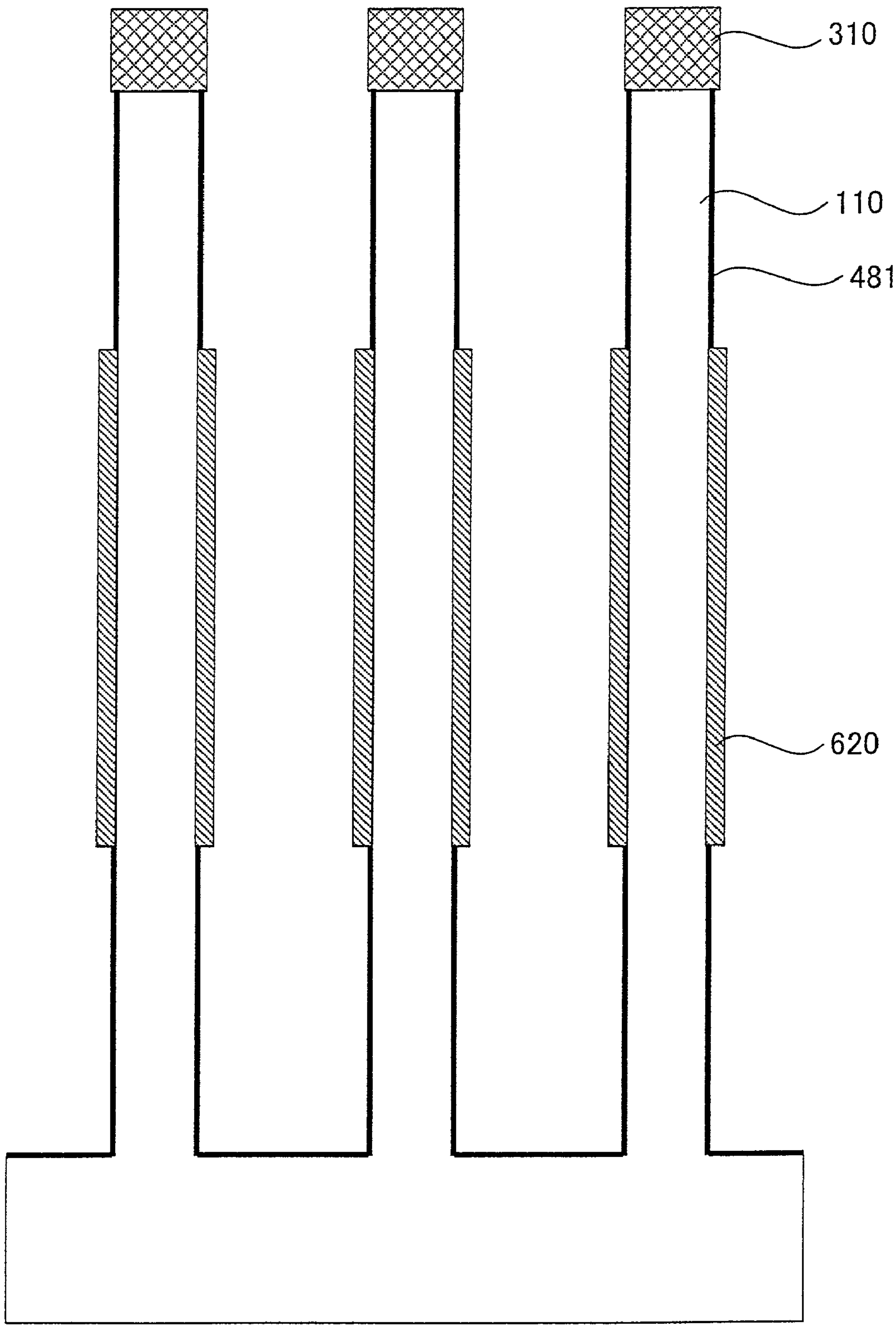
Figure 329:
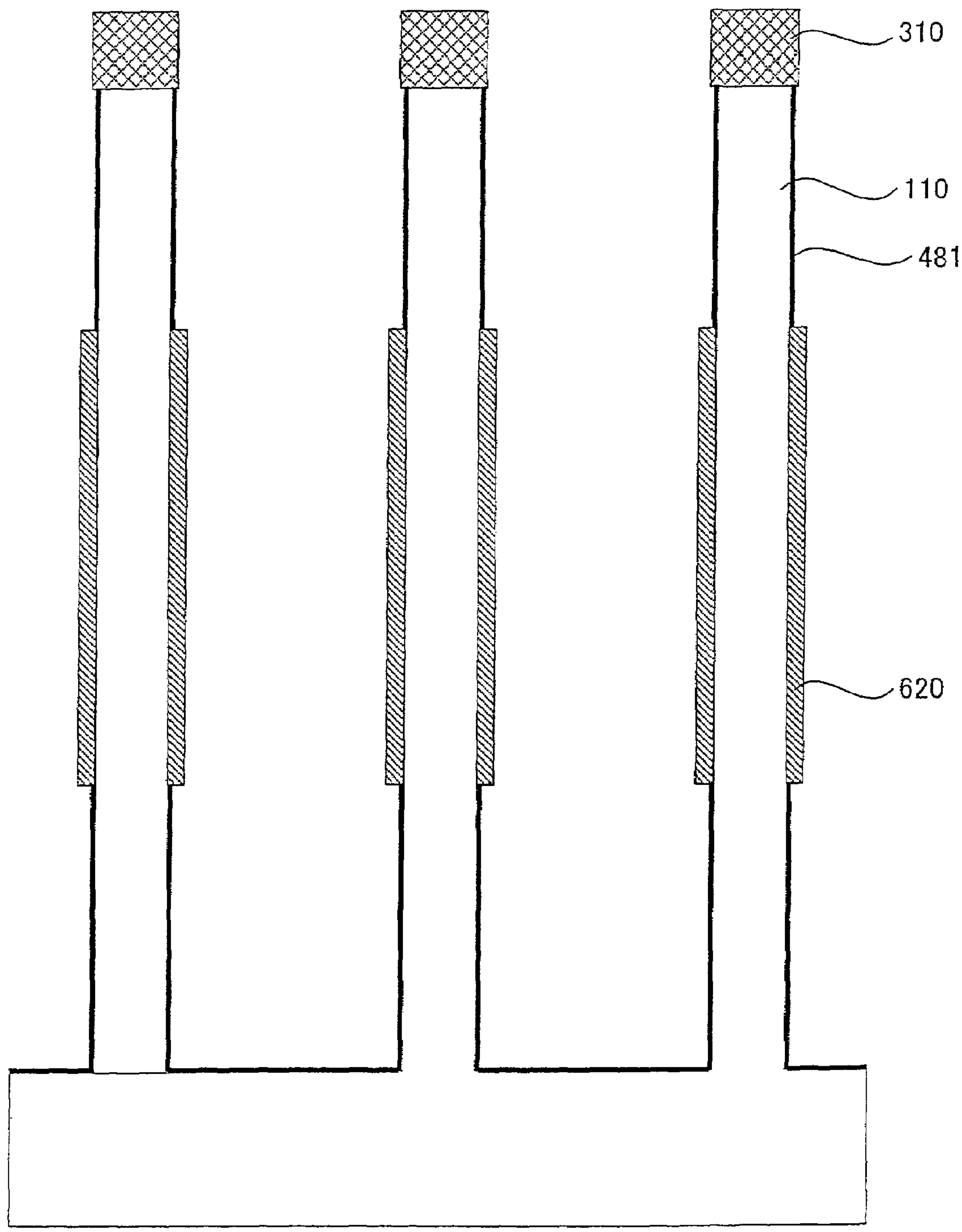

An oxide film 481 of about 20 to 30 nm thickness is formed as a thirteenth insulating film to be a gate oxide film around each island-like semiconductor layer 110, for example, by thermal oxidation. The sidewall spacer 340 of the silicon nitride film (the twelfth insulating film) is removed by isotropic etching (FIG. 321 and FIG. 329). Alternatively, after the laminated insulating film 620 may be partially removed (FIG. 320 and FIG. 328), the sidewall spacer 340 of the silicon nitride film (the twelfth insulating film) may be removed by isotropic etching and the oxide film 481 of about 20 to 30 nm thickness is formed as the thirteenth insulating film to be the gate oxide film around each island-like semiconductor layer 110. The silicon nitride film 340 may be substituted by a part of the laminated insulating film 620.

Figure 322:
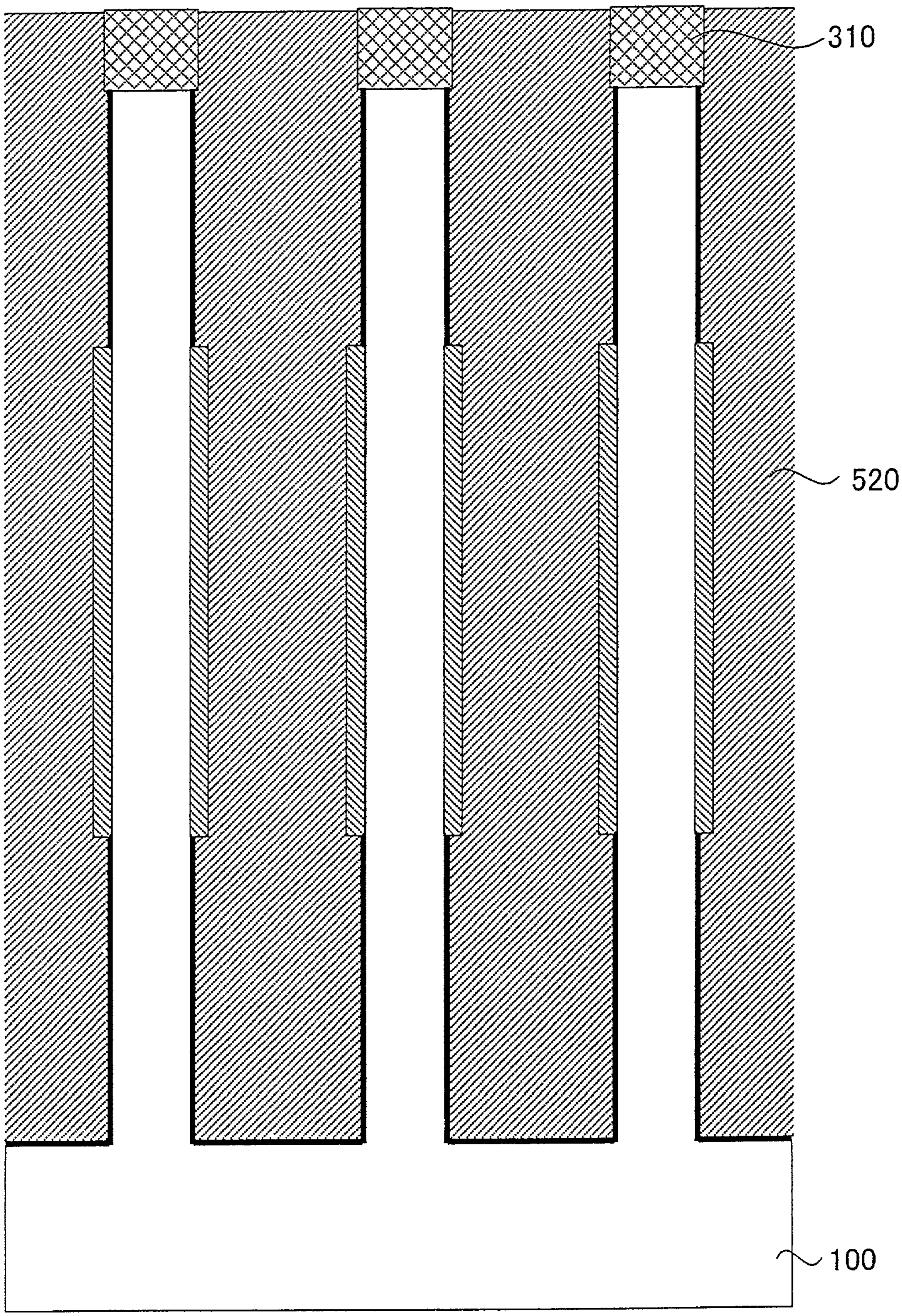
Figure 330:
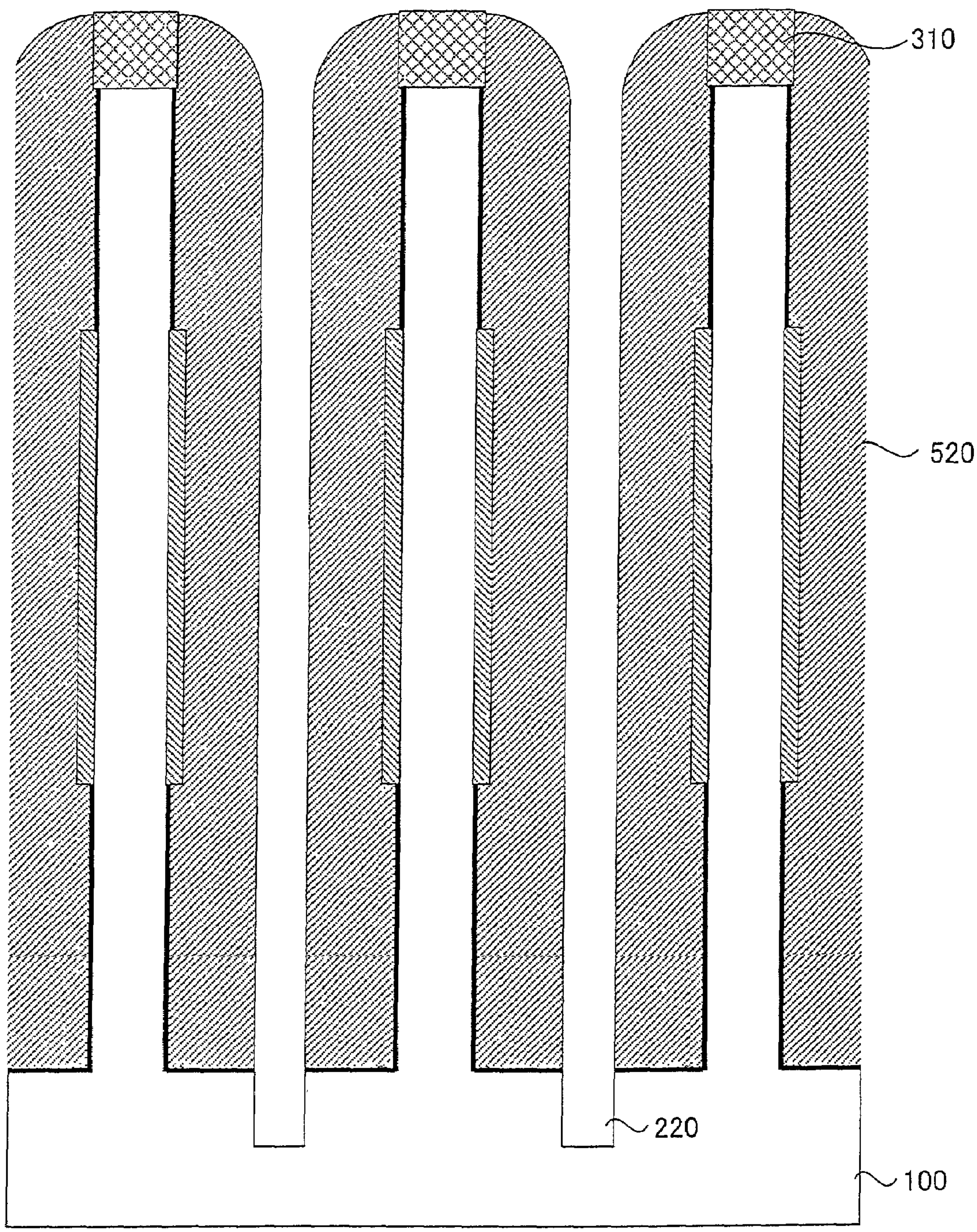

Subsequently, a polysilicon film 520 to be a second conductive film is deposited and etched back by anisotropic etching to form a second trench 220 in the semiconductor substrate 100 (FIG. 322 and FIG. 330).

Figure 323:
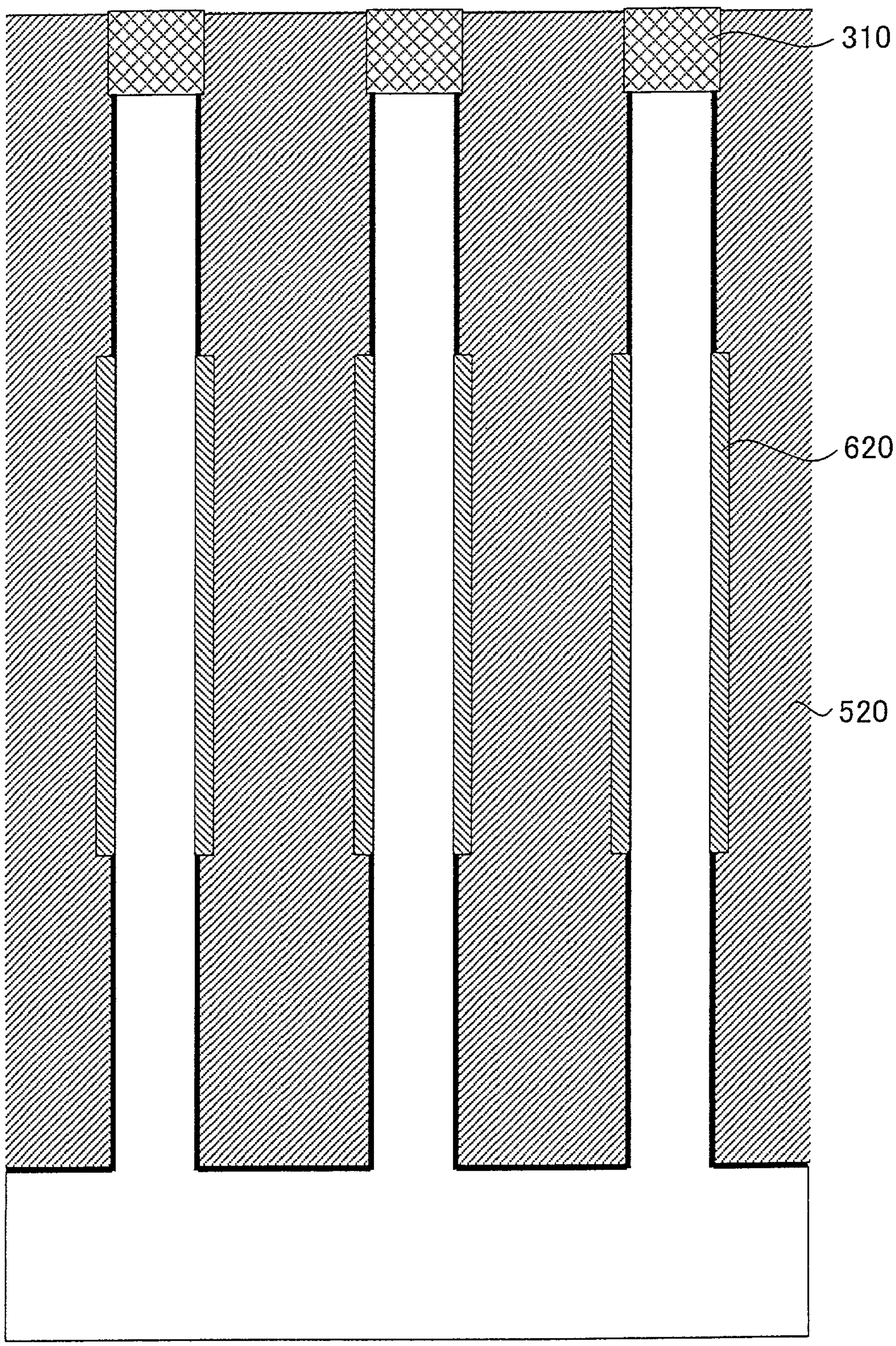
Figure 331:
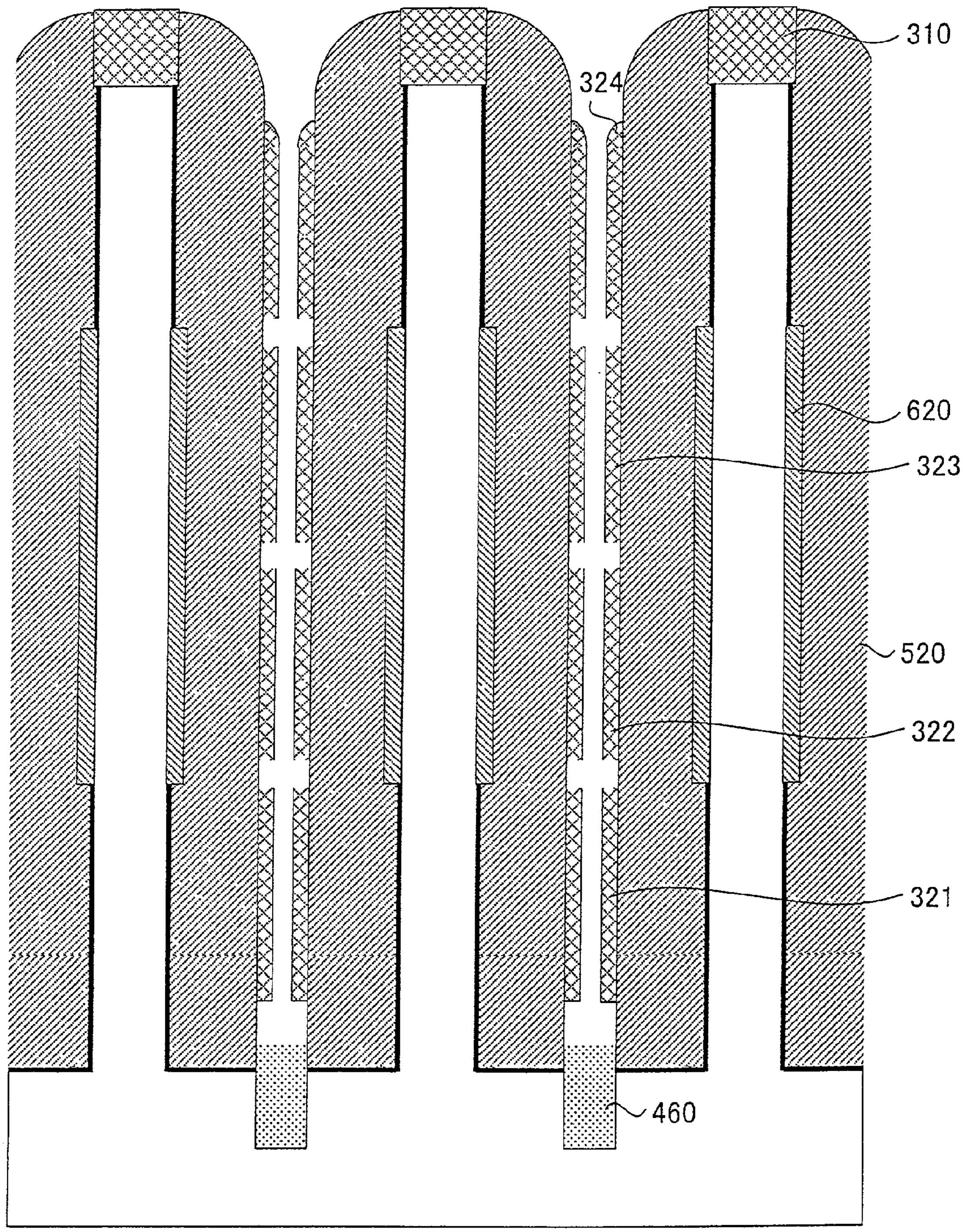

A silicon oxide film 460 which is an eighth insulating film is buried in the second trench 220. Using the same technique as that of Production Example 4 (FIGS. 355 to 361 and FIGS. 375 to 381), sidewall spacers 321, 322, 323 and 324 are formed of a silicon nitride film which is a fourth insulating film on the sidewall of the polysilicon film 520 (FIG. 323 and FIG. 331).

Figure 324:
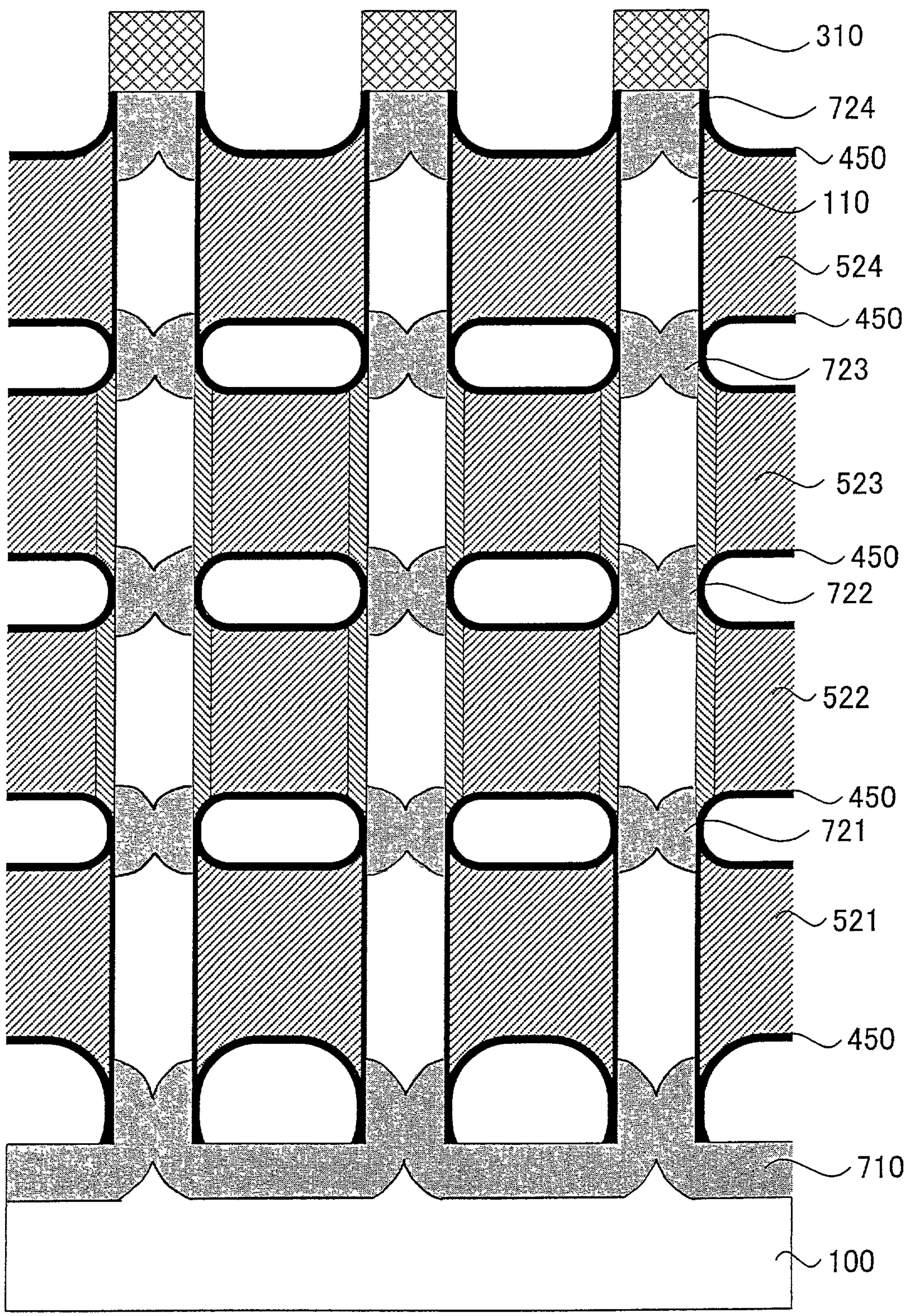
Figure 332:
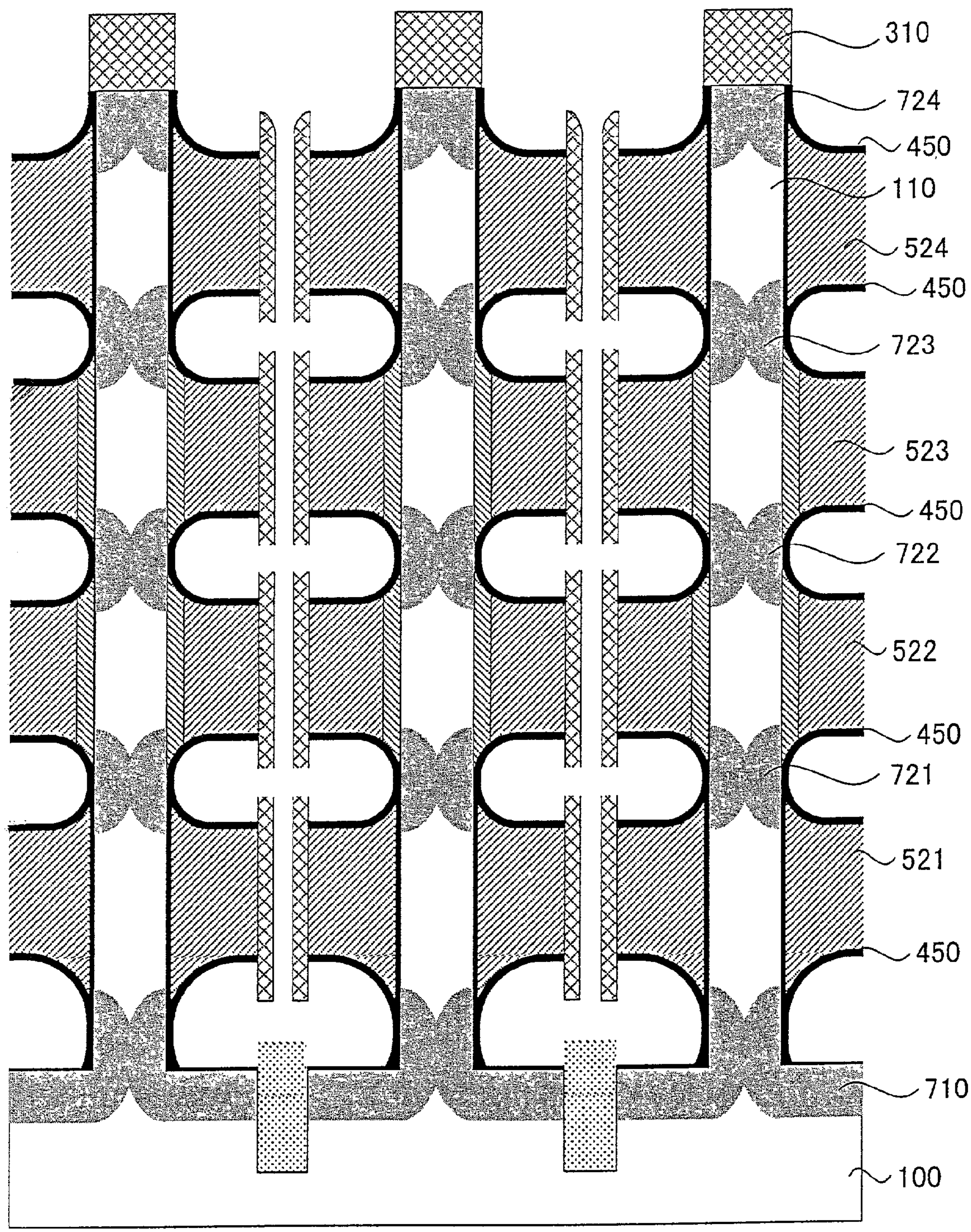

The polysilicon film (the second conductive film) 520 and the laminated insulating film 620 are divided by isotropic etching. Impurity introduction is carried out into the island-like semiconductor layer 110 in self-alignment with the divided polysilicon films (second conductive films) 521 to 524, the silicon nitride film (the first insulating film) 310 and the silicon oxide film (the eighth insulating film) 460. For example, N-type impurity diffusion layers 710 to 724 are formed in an arsenic concentration of about $1\times10^{18}$ to $1\times10^{21}/cm^3$ using a diffusion process (e.g., solid phase diffusion process, vapor phase diffusion process, etc.). The impurity introduction into the polysilicon films 521 to 524 may be performed during or after the formation of the polysilicon film 520. The timing of the introduction is not particularly limited so long as conductive films are obtained. Exposed portions of the polysilicon films 521 to 524 are selectively formed into oxide films 450 of 5 to 50 nm thickness which are seventh insulating films, for example, by thermal oxidation (FIG. 324 and FIG. 332).

Figure 325:
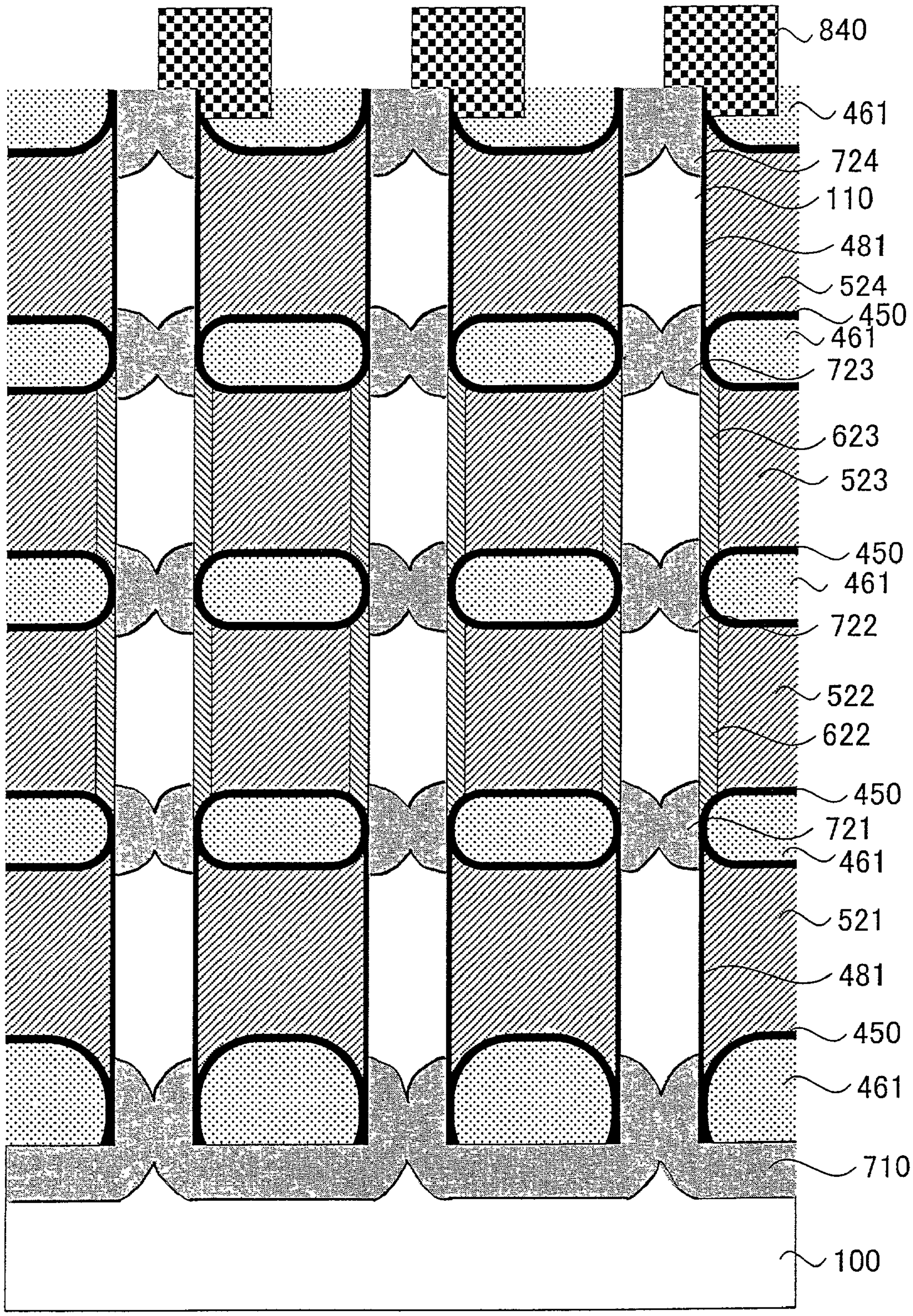
Figure 333:
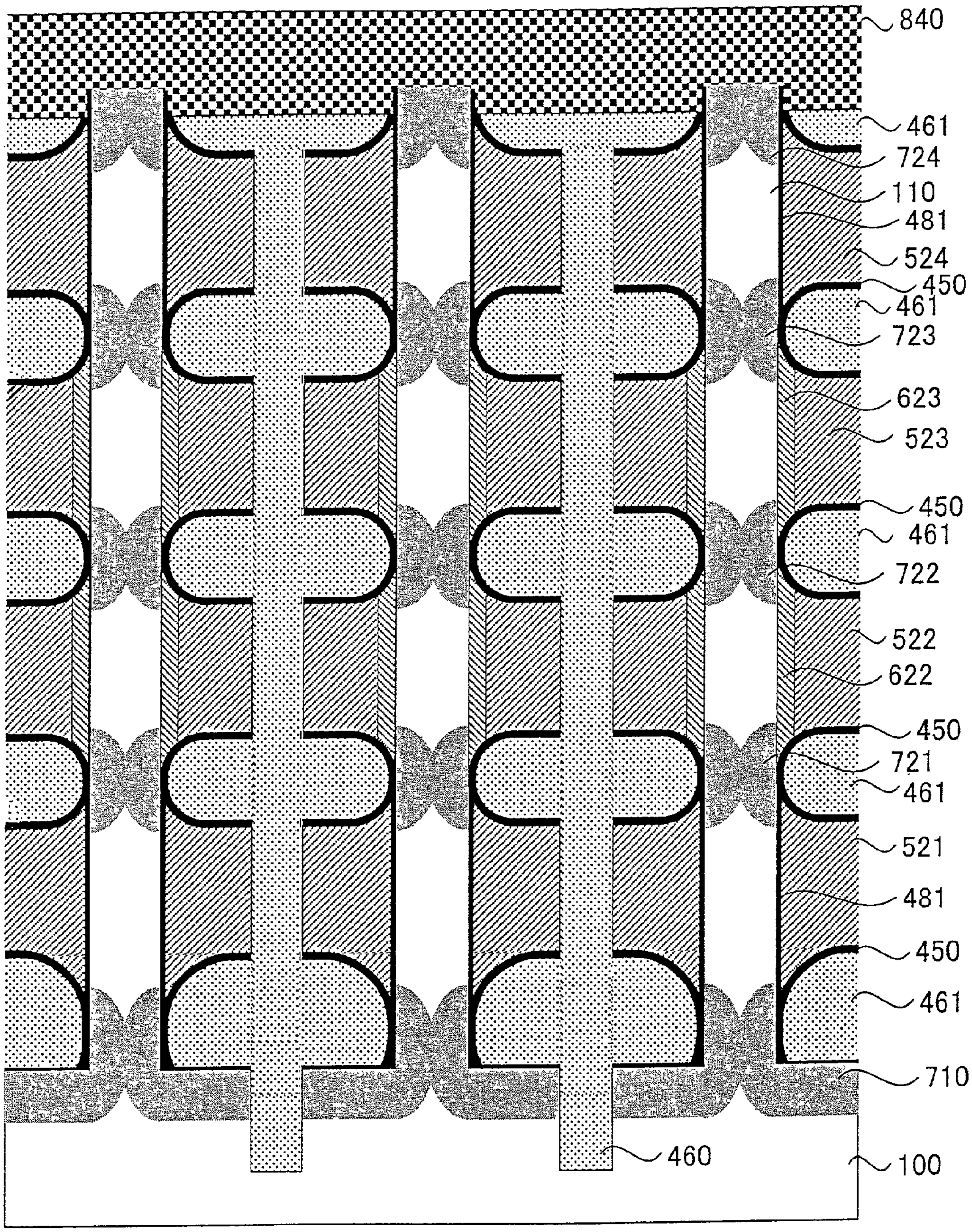

Thereafter, the sidewall spacers 321 to 324 of the silicon nitride film (the fourth insulating film) are removed by isotropic etching. An oxide film 461 which is an eighth insulating film is deposited to a thickness of 50 to 500 nm by CVD and etched back so that the oxide film 461 is buried in the first trench 210. The silicon nitride film (the first insulating film) 310 is removed by isotropic etching to expose the top of the island-like semiconductor layer 110 provided with the impurity diffusion layer 724. A fourth wiring layer 840 is connected as a bit line to the top of the island-like semiconductor layer 110 in such a manner that its direction crosses the direction of the second and third wiring layers (FIG. 325 and FIG. 333).

Thereafter, by known techniques, an interlayer insulating film is formed, and a contact hole and metal wiring are formed. Thereby, a semiconductor memory is realized which has a memory function according to the state of the charge in the charge storage layer which is formed of the laminated insulating film to have the MNOS or MONOS structure.

FIGS. 334 to 336 and FIGS. 337 to 339 show another example of production process for a semiconductor memory of the MNOS or MONOS structure. In this example, production steps until the removal of the sidewall spacer 340 of the silicon nitride film (the twelfth insulating film) (FIG. 321 and FIG. 329) are the same as those described above (FIGS. 318 to 325 and FIGS. 326 to 333).

Figure 334:
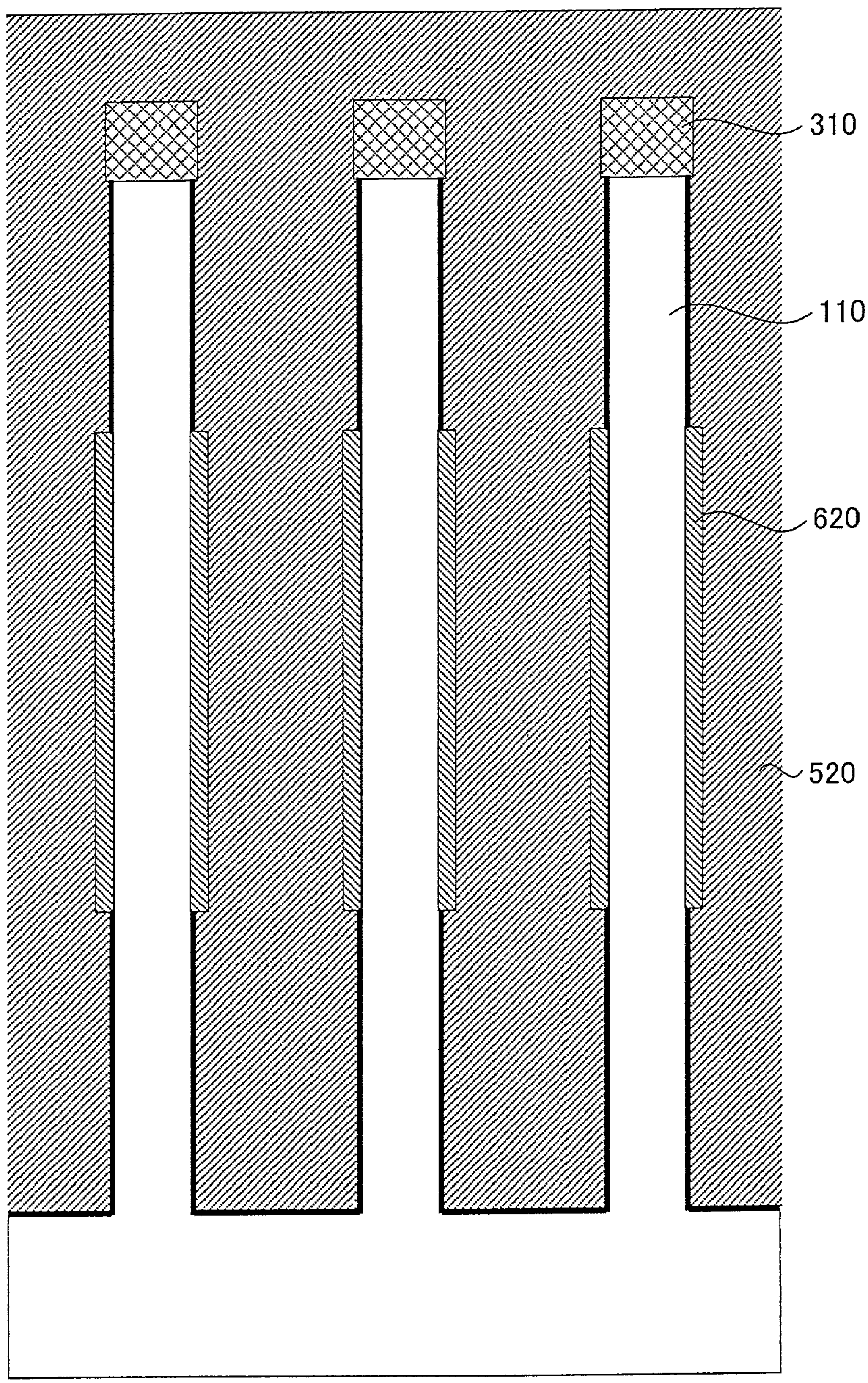
FIG. 334 to FIG. 336 are sectional views (taken on line A–A' in FIG. 1) illustrating production steps of Production Example 2 for producing a semiconductor memory in accordance with the present invention.
Figure 337:
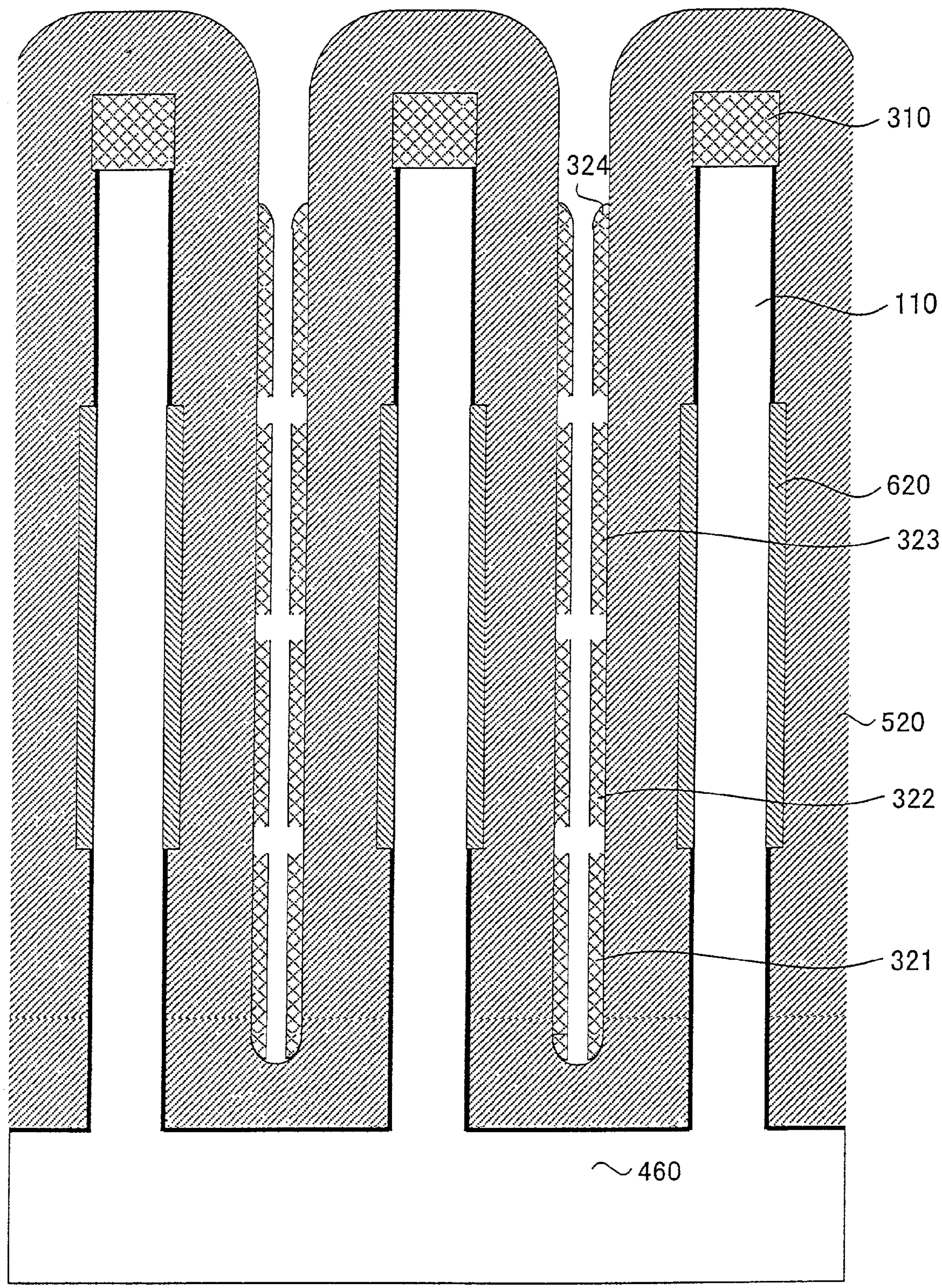
FIG. 337 to FIG. 339 are sectional views (taken on line B–B' in FIG. 1) illustrating production steps of Production Example 2 for producing a semiconductor memory in accordance with the present invention.

Thereafter, an oxide film 481 of about 20 to 30 nm thickness is formed as a thirteenth insulating film to be a gate oxide film around each island-like semiconductor layer 110 by thermal oxidation, for example. A polysilicon film 520 to be a second conductive film is deposited and a silicon oxide film 460 which is an eighth insulating film is buried in a second trench 220. Thereafter, using the same technique as that of Production Example 4 (FIGS. 355 to 361 and FIGS. 375 to 381), sidewall spacers 321, 322, 323 and 324 are formed of a silicon nitride film which is a fourth insulating film on the sidewall of the polysilicon film 520 (FIG. 334 and FIG. 337).

Figure 335:
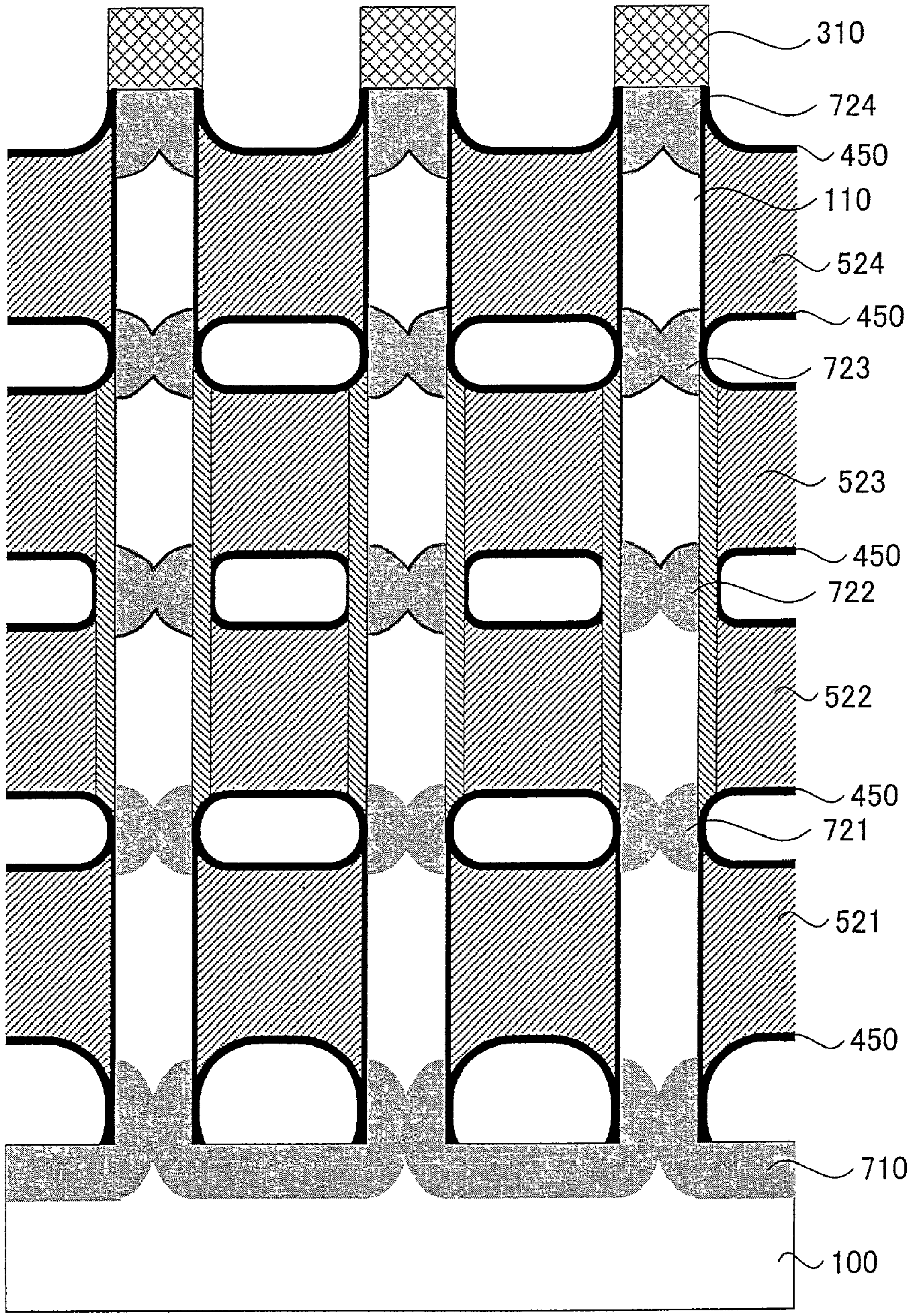
Figure 338:
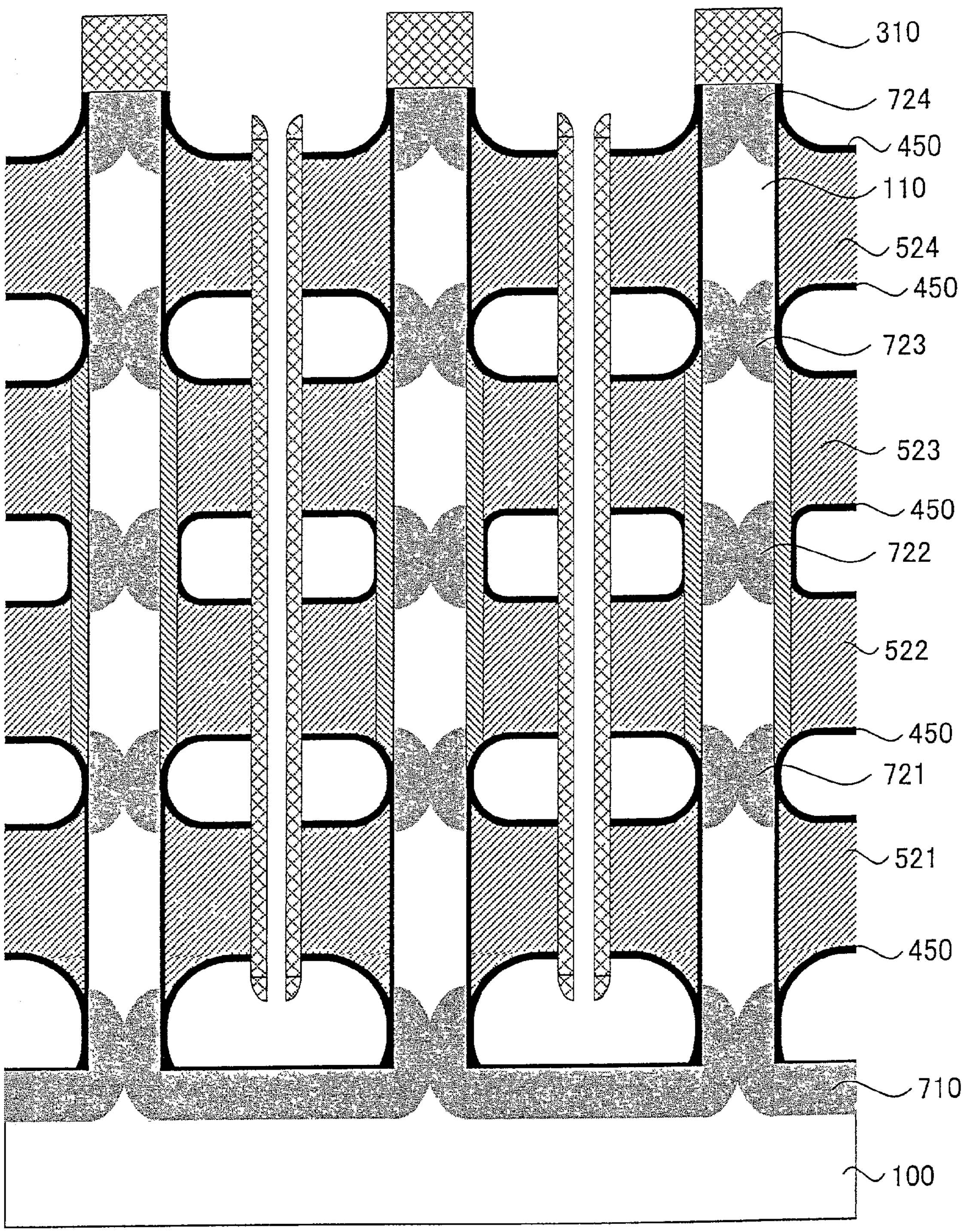

The polysilicon film 520 is divided by isotropic etching. Impurity introduction is carried out into the island-like semiconductor layer 110 and the semiconductor substrate 100 in self-alignment with the divided polysilicon films (second conductive films) 521 to 524 and the silicon nitride film (the first insulating film) 310. For example, N-type impurity diffusion layers 710 to 724 are formed at an arsenic concentration of about $1\times10^{18}$ to $1\times10^{21}/cm^3$ using a diffusion process (e.g., solid phase diffusion process, vapor phase diffusion process, etc.) (FIG. 335 and FIG. 338). The impurity introduction into the polysilicon films 521 to 524 may be performed during or after the formation of the polysilicon film 520. The timing of the introduction is not particularly limited so long as conductive films are obtained. The laminated insulating film 620 may not necessarily be divided when the polysilicon film 520 is divided.

Figure 336:
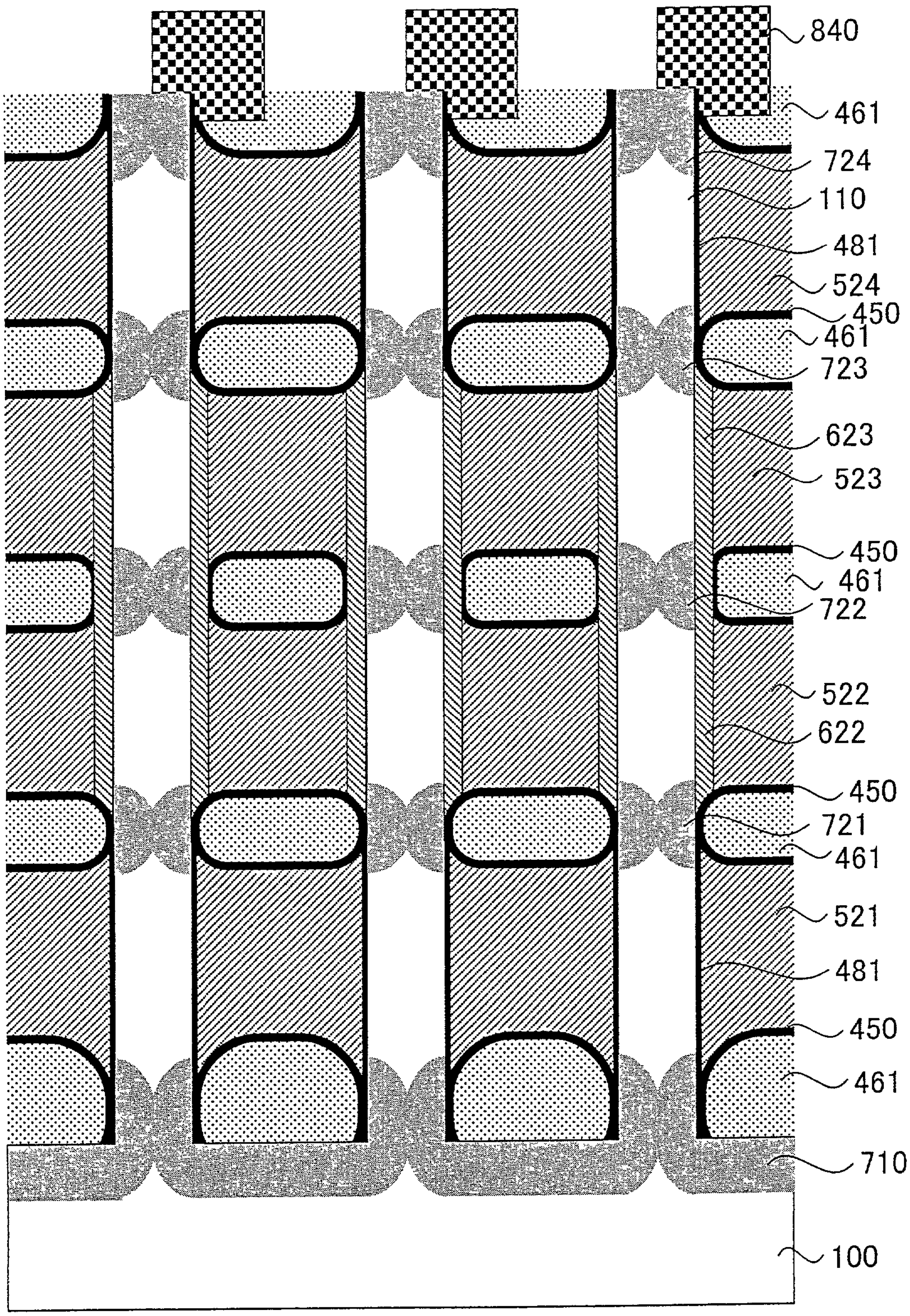
Figure 339:
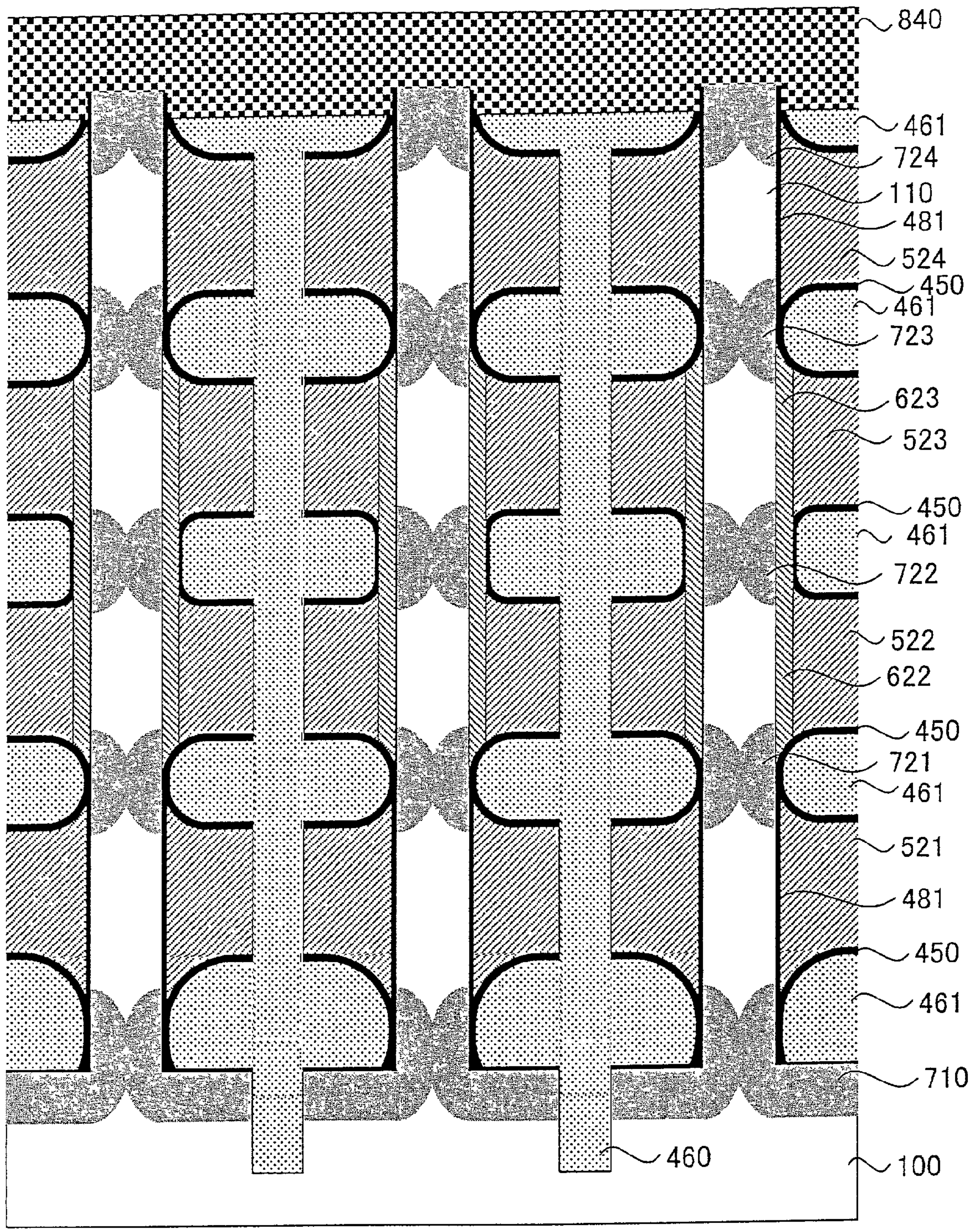

Exposed portions of the polysilicon films 521 to 524 are selectively formed into oxide films 450 of 5 to 50 nm thickness which are seventh insulating films, for example, by thermal oxidation. Thereafter, the sidewall spacers 321 to 324 of the silicon nitride film (the fourth insulating film) are removed by isotropic etching. A second trench 220 is formed in the semiconductor substrate 100 by anisotropic etching using the silicon nitride film 310 and the polysilicon films 521 to 524 as a mask (FIG. 336 and 339).

Thereafter, an oxide film 461 which is an eighth insulating film is deposited to a thickness of 50 to 500 nm by CVD and etched back so that the oxide film 461 is buried in the first and second trenches 210 and 220. The silicon nitride film 310 is removed by isotropic etching, and the top of the island-like semiconductor layer 110 provided with the impurity diffusion layer 724 is exposed. A fourth wiring layer 840 is connected as a bit line to the top of the island-like semiconductor layer 110 in such a manner that its direction crosses the direction of the second and third wiring layers.

Thereafter, by known techniques, an interlayer insulating film is formed, and a contact hole and metal wiring are formed. Thereby, a semiconductor memory is realized which has a memory function according to the state of the charge in the charge storage layer which is formed of the laminated insulating film to have the MNOS or MONOS structure.

In these example, films formed on the surface of the semiconductor substrate or the polysilicon film such as the silicon nitride film (the first insulating film) 310, the silicon nitride film (the twelfth insulating film) 340 and the silicon nitride films (the fourth insulating films) 321, 322, 323 and 324 may be formed of a layered film of a silicon oxide film/a silicon nitride film from the silicon surface.

Also, the control gates of the memory cells are formed continuously in one direction without using a mask. However, that is possible only where the island-like semiconductor layers are not disposed symmetrically to a diagonal. More particularly, by setting smaller the intervals between adjacent island-like semiconductor layers in the direction of the second and third wiring layers than those in the direction of the fourth wiring layer, it is possible to automatically obtain the wiring layers which are discontinuous in the direction of the fourth wiring layer and are continuous in the direction of the second and third wiring layers without using a mask. In contrast, if the island-like semiconductor layers are disposed symmetrically to a diagonal, for example, the wiring layers may be separated through patterning with use of resist films by photolithography.

The same effect as obtained by Production Example 1 is obtained by these production examples.

PRODUCTION EXAMPLE 3

In a semiconductor memory to be produced in this example, a semiconductor substrate is patterned in the form of pillars to form island-like semiconductor layers. Sides of the island-like semiconductor layers make active regions. A plurality of MIS capacitors as charge storage layers are formed on the active regions. The island-like semiconductor layers are each in an electrically floating state with respect to the semiconductor substrate. The active region of each memory cell is in the electrically floating state. One memory cell is constituted of one transistor and one capacitor. A plurality of memory cells, for example, two memory cells, are disposed on the island-like semiconductor layer and are connected in series along the island-like semiconductor layer. The thickness of gate insulating films of the transistors of the memory cells is equal to the thickness of capacitor insulating films of the capacitors of the memory cells. In this production example, the MIS capacitor and the transistor of each memory cell are formed at the same time.

Such a semiconductor memory may be produced by the following production process. FIGS. 340 to 344 and FIGS. 345 to 349 are sectional views taken on line A–A' and line B–B', respectively, in FIG. 66 which is a plan view illustrating a memory cell array of DRAM.

In this example, a silicon nitride film 340 which is a twelfth insulating film is deposited to a thickness of 5 to 50 nm. Using the same technique as that of Production Example 4 (FIGS. 350 to 352 and FIGS. 370 to 372), silicon nitride films (twelfth insulating films) 341, 342 and 343 are formed on regions on the sidewall of the island-like semiconductor layer 110 which are not region to be impurity diffusion layers and on the surface of the semiconductor substrate 100.

Figure 340:
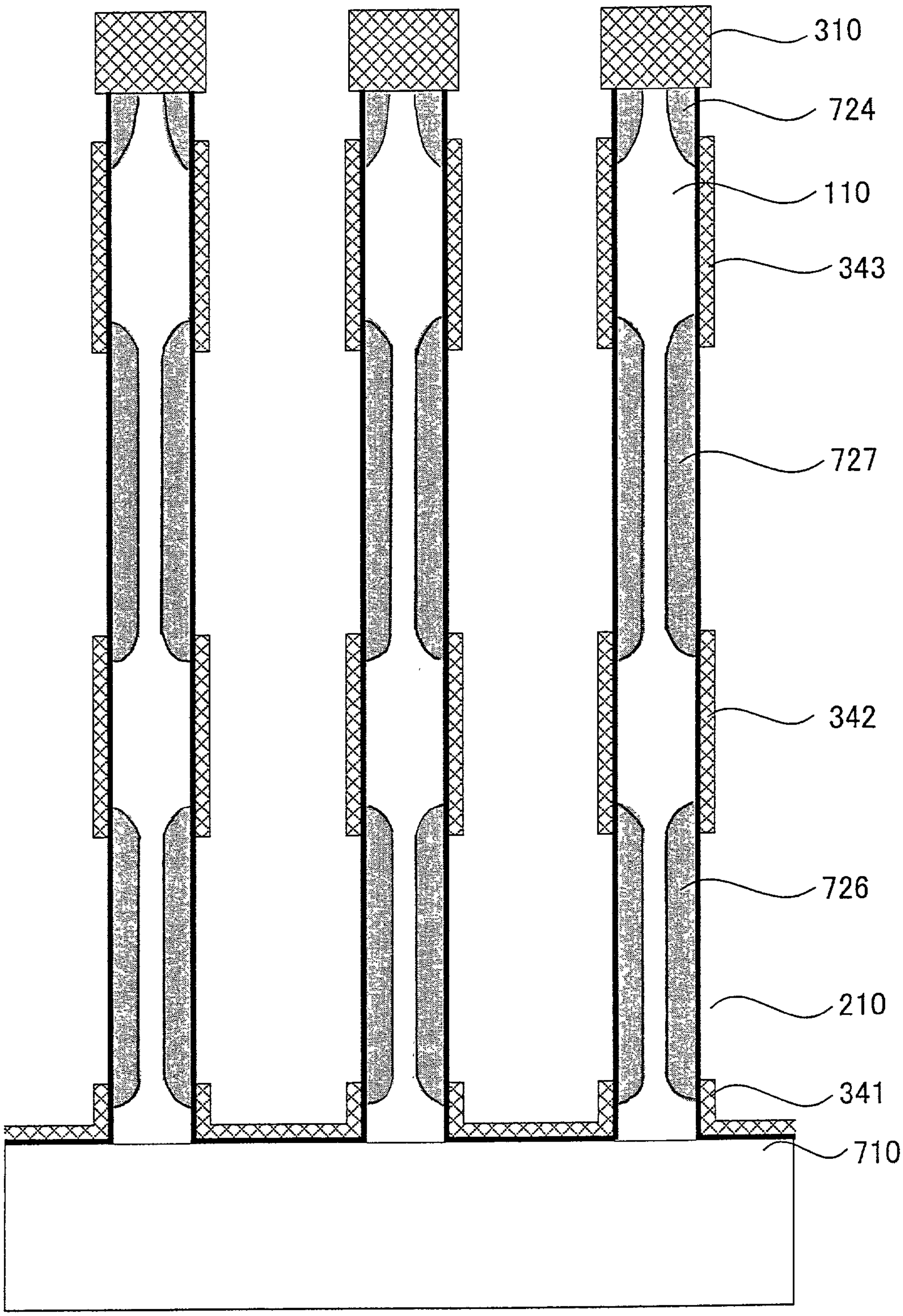
FIG. 340 to FIG. 344 are sectional views (taken on line A–A' in FIG. 66) illustrating production steps of Production Example 3 for producing a semiconductor memory in accordance with the present invention.
Figure 345:
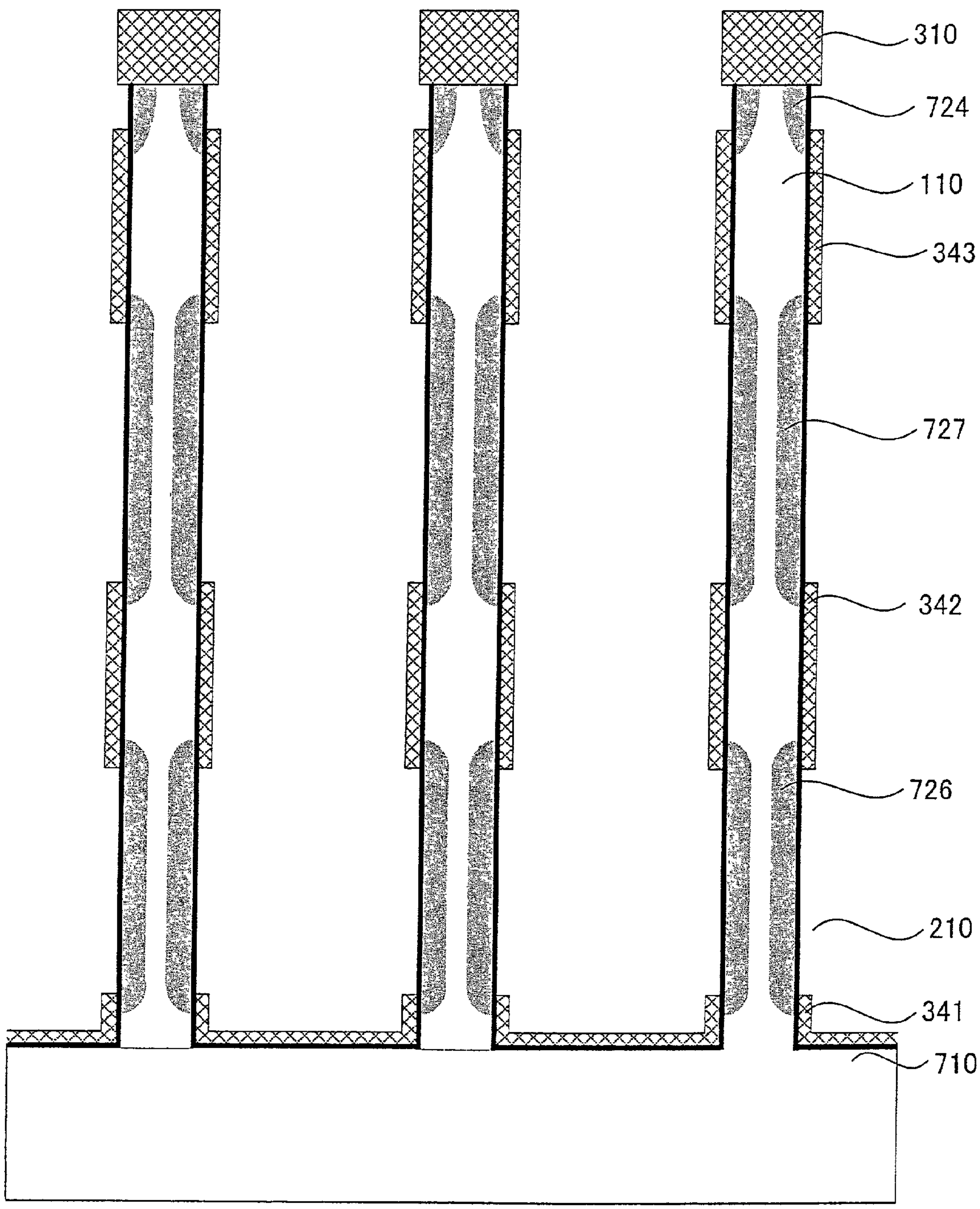
FIG. 345 to FIG. 349 are sectional views (taken on line B–B' in FIG. 66) illustrating production steps of Production Example 3 for producing a semiconductor memory in accordance with the present invention.

Subsequently, impurity introduction is carried out to form impurity diffusion layers as the silicon nitride films 341, 342 and 343 as a mask. For example, N-type impurity diffusion layers 724, 726 and 727 are formed at an arsenic concentration of about $1\times10^{18}$ to $1\times10^{21}$/cm$^3$ using a diffusion process (e.g., solid phase diffusion process, vapor phase diffusion process, etc.). Alternatively, the impurity diffusion layers are formed on the sidewall of the island semiconductor layer 110 using slant ion implantation, for example, at an implantation energy of 5 to 100 keV, an arsenic dose of about $1\times10^{14}$ to $1\times10^{16}$/cm$^2$ and an angle of about 5 to 45°. In the slant ion implantation, preferably, ions are implanted from various directions to the island-like semiconductor layers 110 because a surface impurity concentration becomes more uniform. Alternatively, for the above-mentioned ion introduction, an oxide film containing arsenic may be deposited by CVD with a view to utilizing diffusion of arsenic from the oxide film. At this time, the impurity diffusion layer 710 to be a first wiring layer may be adjusted about its impurity concentration by ion implantation as in the above-described examples (FIG. 340 and FIG. 345).

Figure 341:
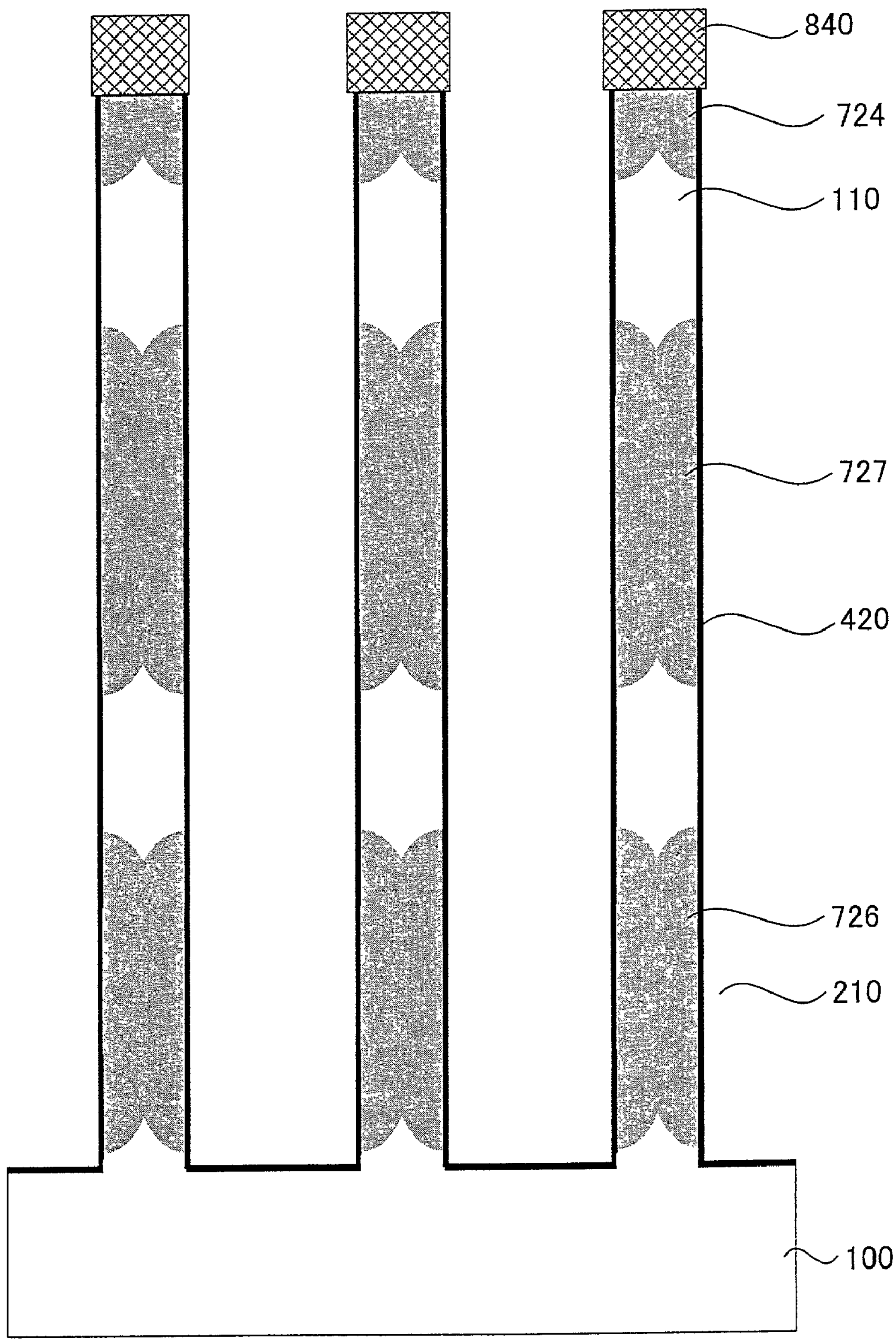
Figure 346:
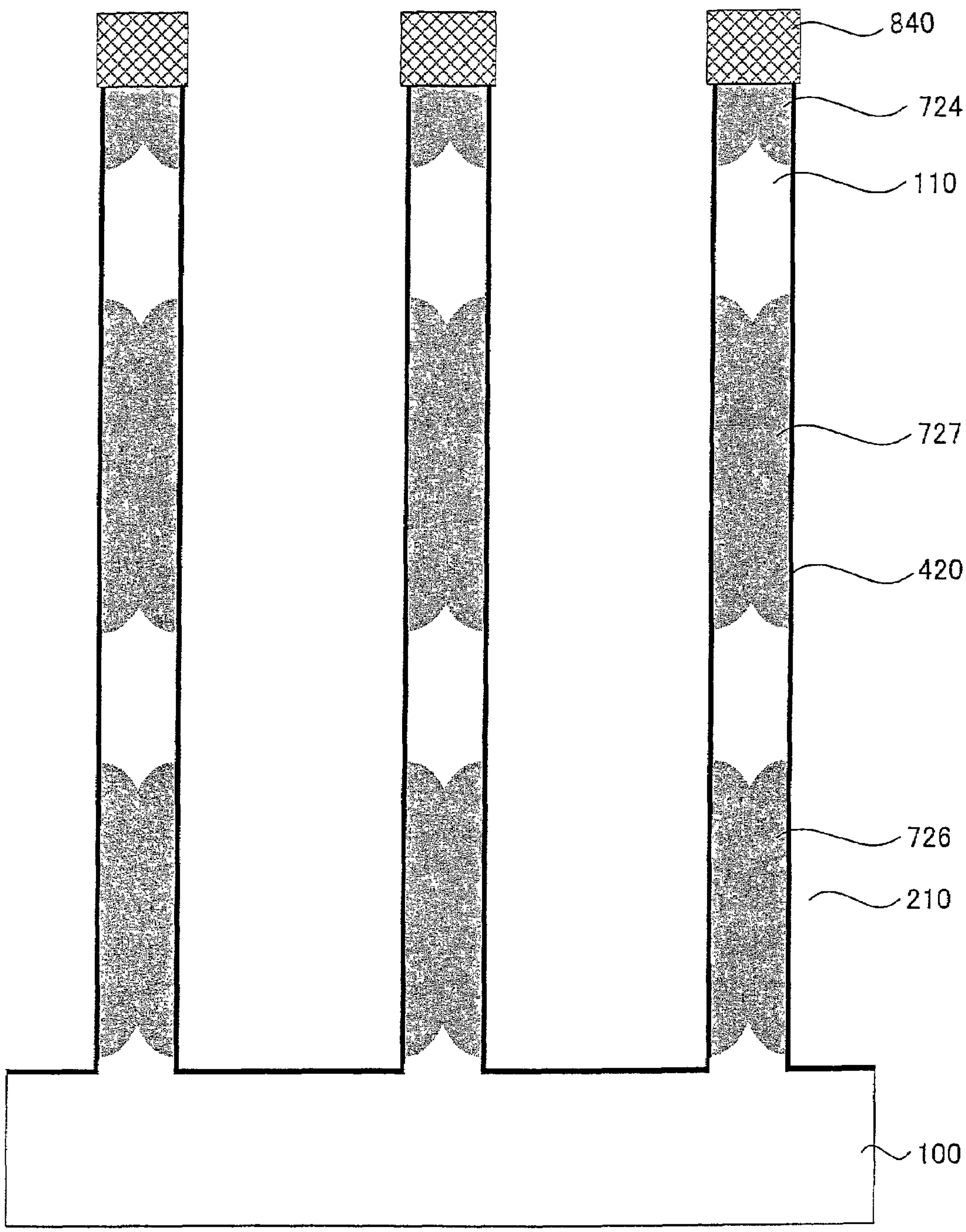

Subsequently, the silicon nitride films 341, 342 and 343 are removed by isotropic etching. An oxide film 420 is formed as a third insulating film to be a gate oxide film to a thickness of about 10 nm around each island-like semiconductor layer 110, for example, by thermal oxidization (FIG. 341 and FIG. 346). The gate oxide film, however, may be formed of not only a thermally oxidized film but also a CVD oxide film or a nitrogen oxide film.

Figure 342:
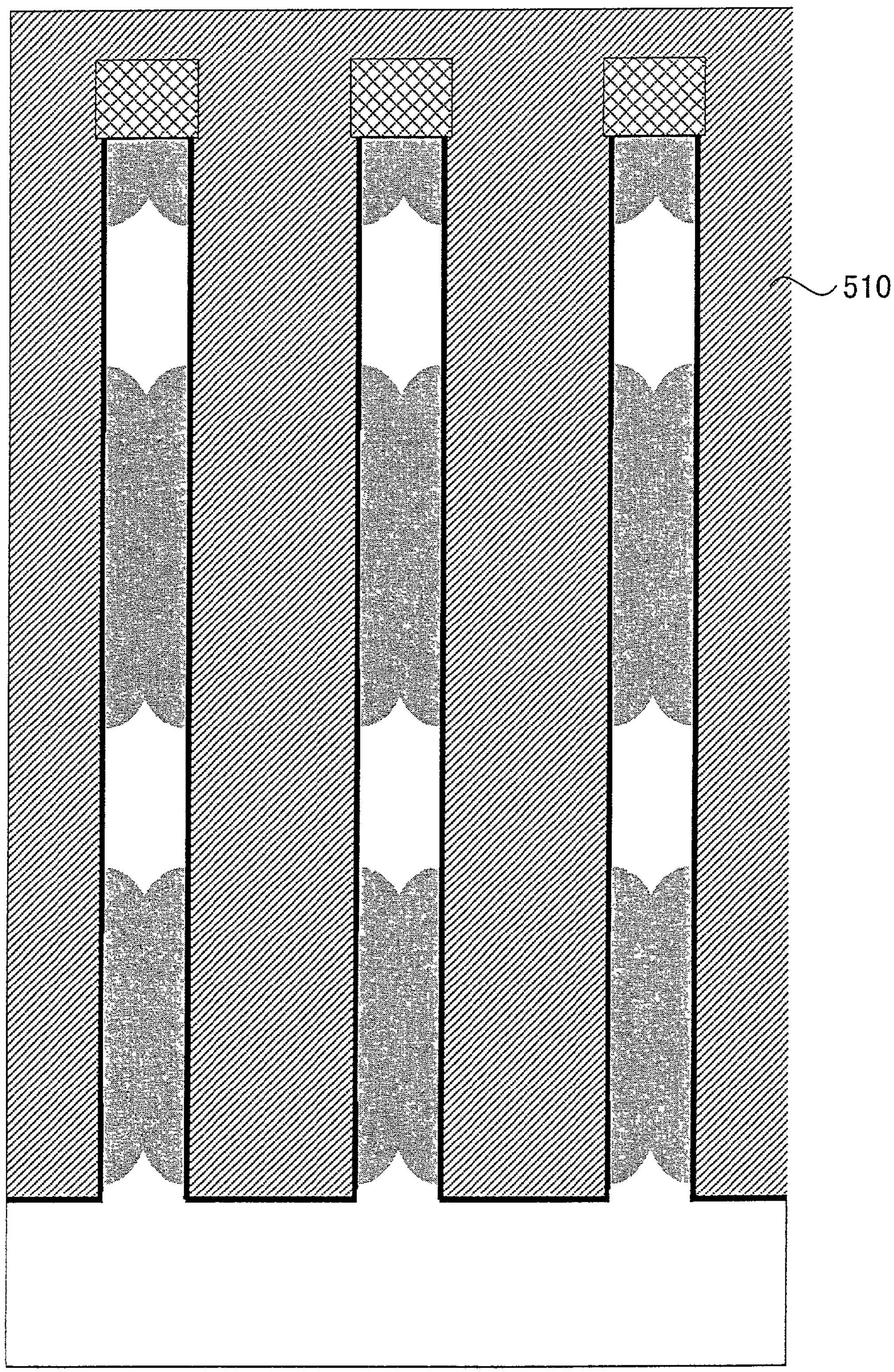
Figure 347:
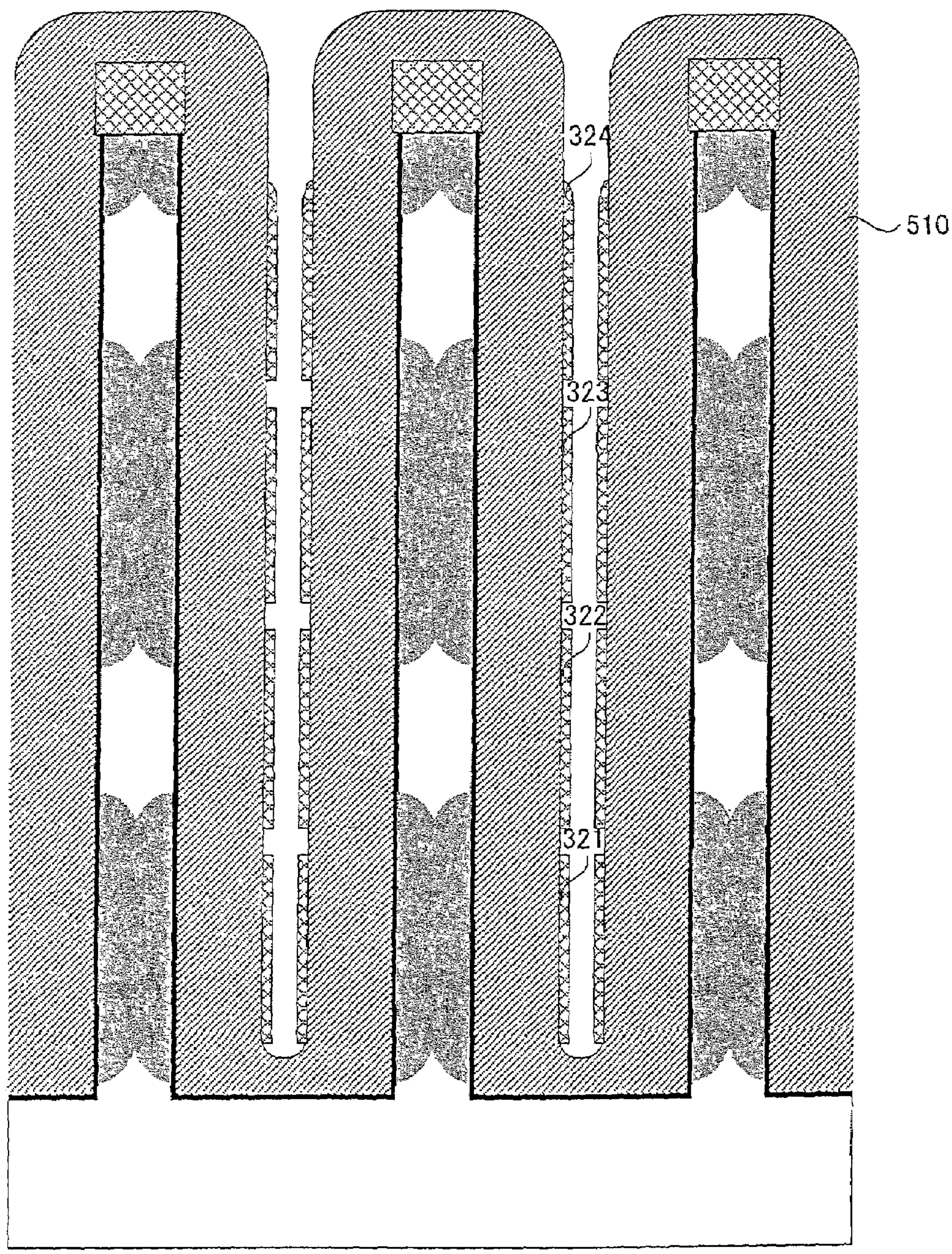

Subsequently, a polysilicon film 510, for example, is deposited to a thickness of about 50 to 500 nm as a first conductive film. At this time, the thickness of the polysilicon film 510 is so set that the polysilicon film 510 fills the first trench 210 only in a direction in which the intervals between the island-like semiconductor layers 110 are narrower as shown in 342. Using the same technique as that of Production Example 4 (FIGS. 355 to 361 and FIGS. 375 to 381), sidewall spacers 321, 322, 323 and 324 are formed of a silicon nitride film which is a fourth insulating film on the sidewall of the polysilicon film 510 (FIG. 342 and FIG. 347).

Figure 343:
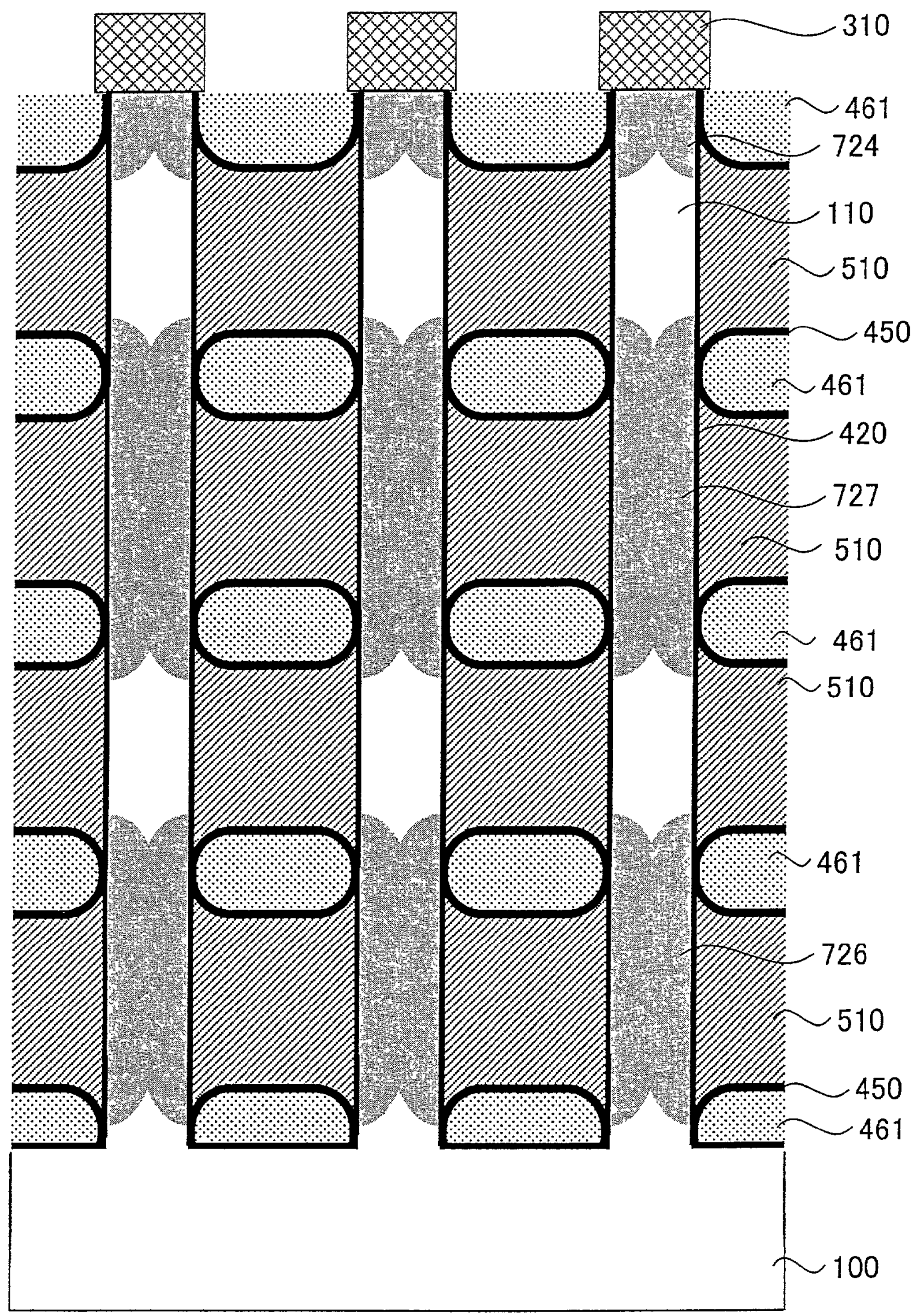
Figure 348:
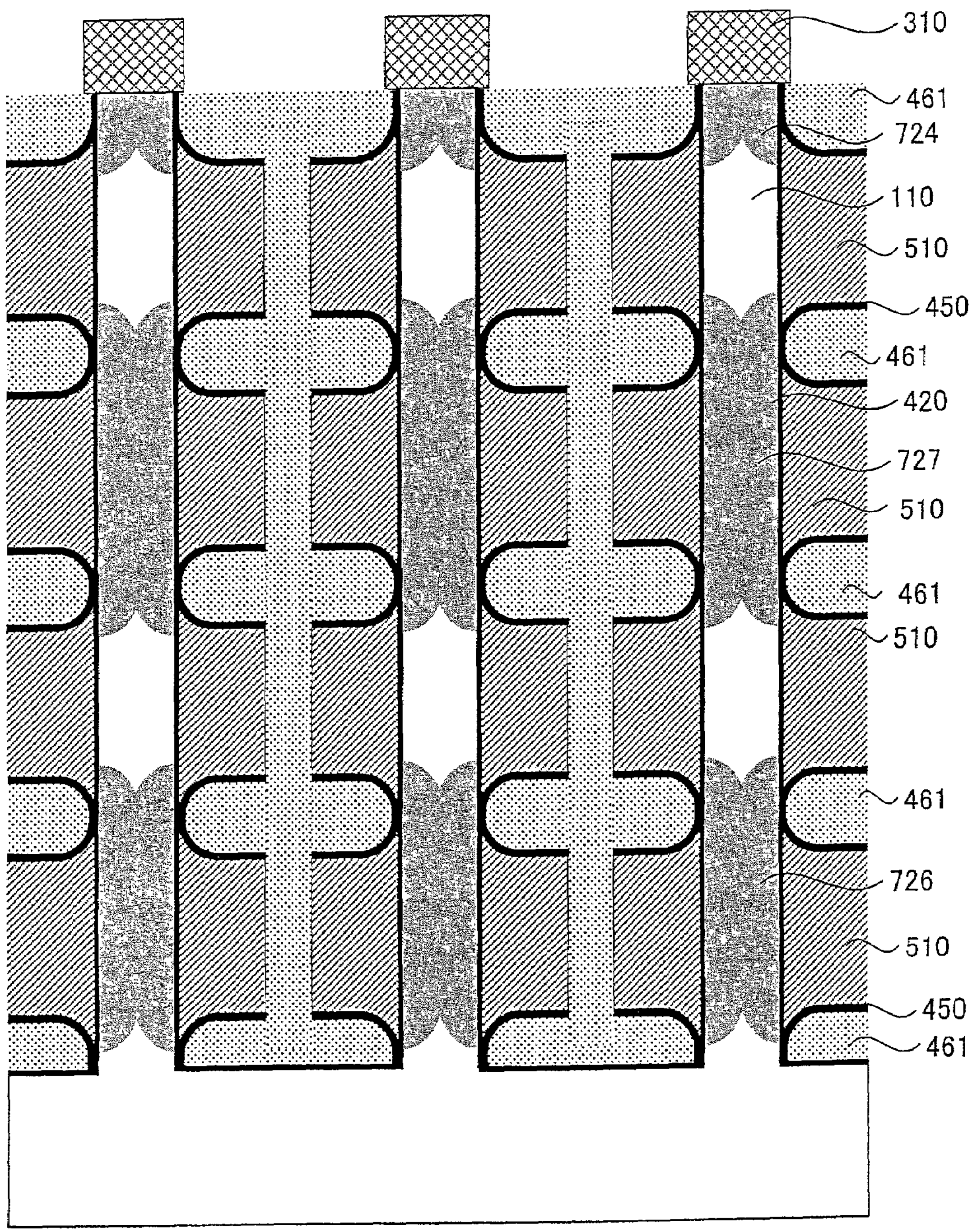

The polysilicon film 510 is divided by isotropic etching. An exposed portion of the polysilicon film 510 is formed selectively into an oxide film 450 of 5 to 50 nm thickness which is a seventh insulating film by thermal oxidation. Ion introduction into the polysilicon films (first conductive films) 521 to 524 may be performed during or after the formation of the polysilicon layer (the first conductive film) 510 or during or after the formation of the polysilicon layer (the first conductive film) 520. The timing of the ion introduction is not particularly limited so long as conductive films are obtained. The sidewall spacers 321 to 324 of the silicon nitride film (the fourth insulating film) are removed by isotropic etching. An oxide film (eighth insulating film) 461 is deposited to a thickness of 50 to 500 nm by CVD and etched back so that the oxide film 461 is buried in the first trench 210 (FIG. 343 and FIG. 348).

Figure 344:
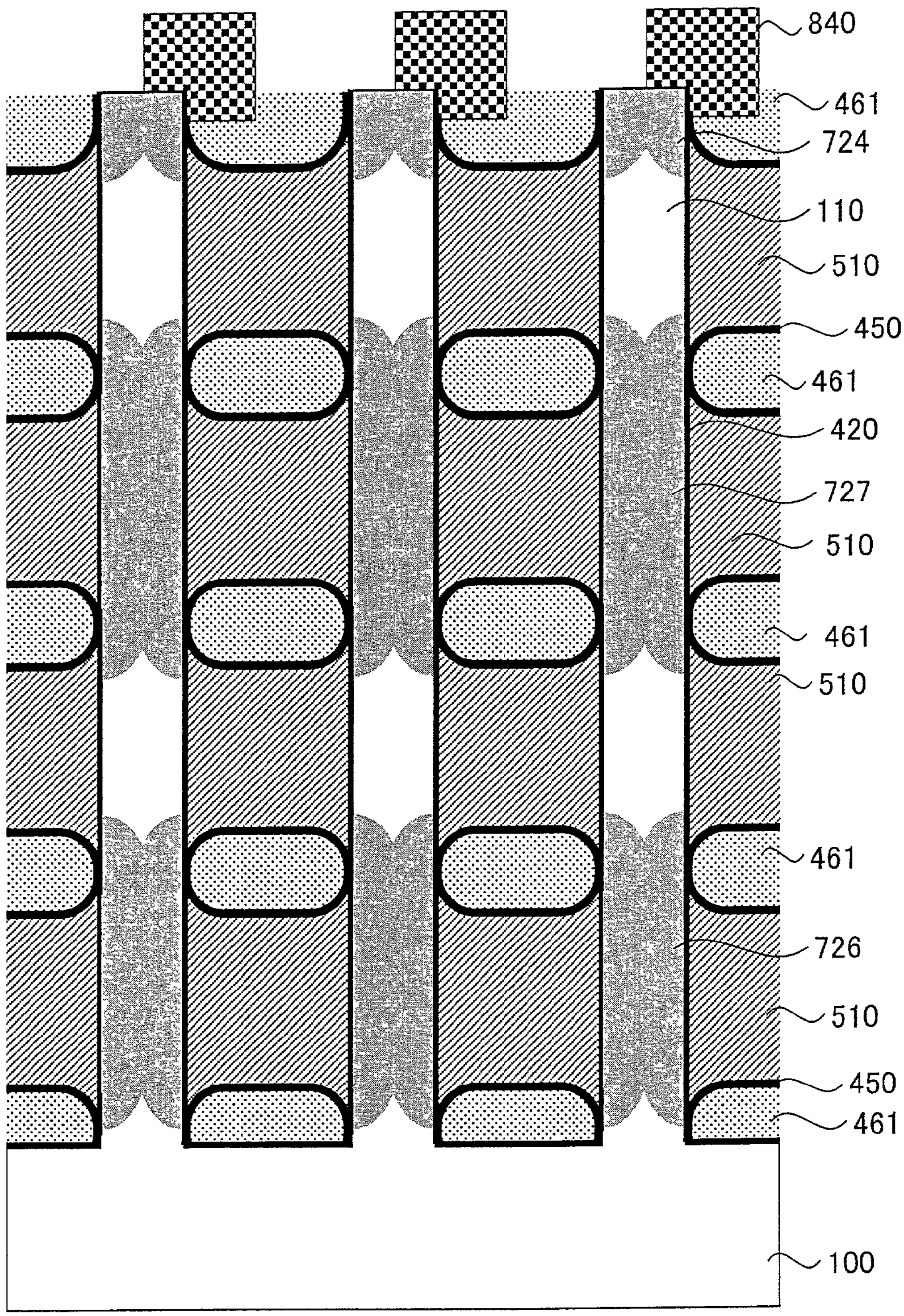
Figure 349:
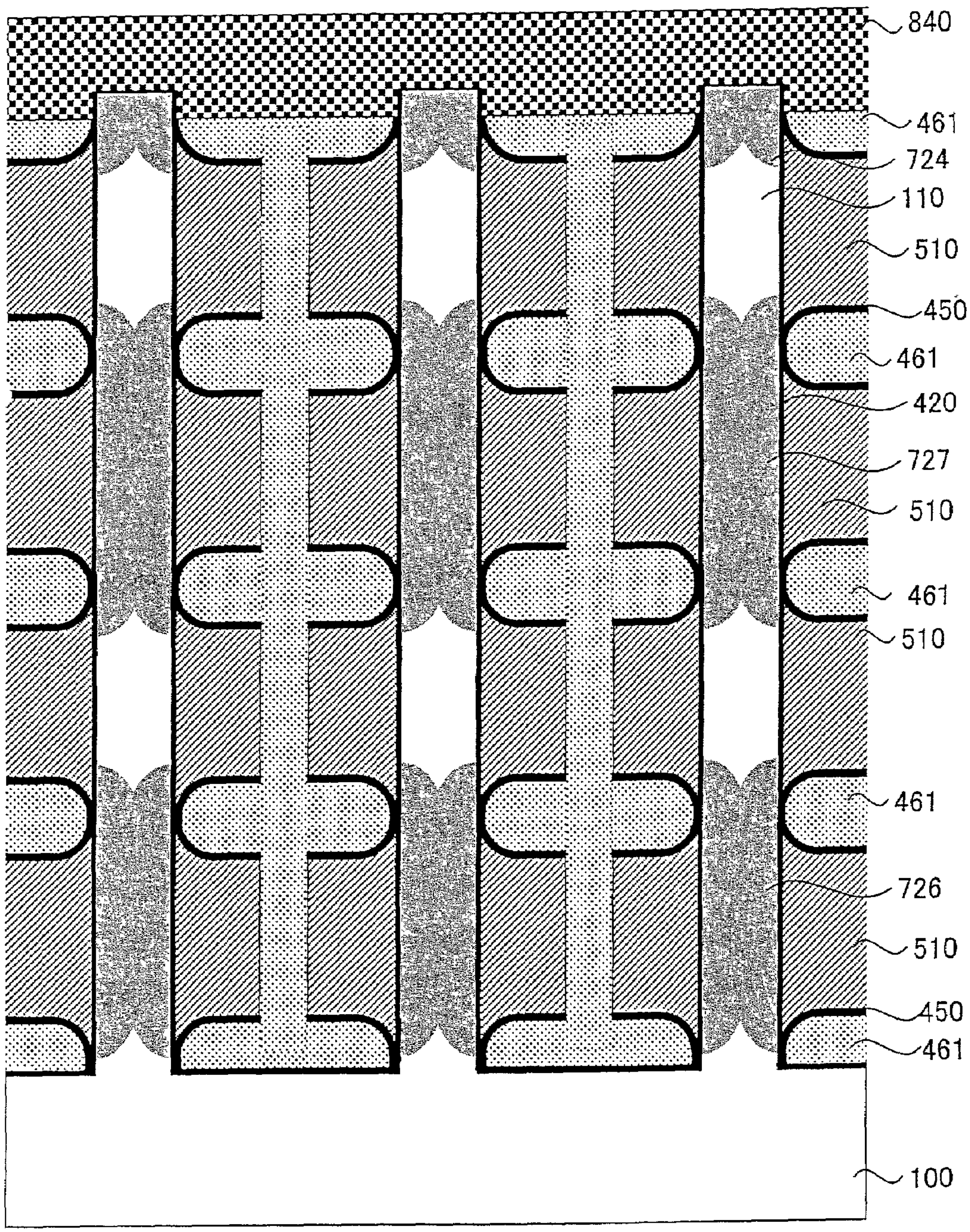

The silicon nitride film (the first insulating film) 310 is removed by isotropic etching and the top of the island-like semiconductor layer 110 provided with the impurity diffusion layer 724 is exposed. A fourth wiring layer 840 is connected as a bit line to the top of the island-like semiconductor layer 110 in such a manner that its direction crosses the direction of the second and third wiring layers (FIG. 344 and FIG. 349).

Thereafter, by known techniques, an interlayer insulating film is formed, and a contact hole and metal wiring are formed. Thereby, it is possible to arrange in series a plurality of DRAM elements, for example, two DRAM elements, having a one-transistor one-capacitor structure composed of an MIS capacitor as the charge storage layer on the island-like semiconductor layer.

In this example, films formed on the surface of the semiconductor substrate or the polysilicon film such as the silicon nitride film (the first insulating film) 310, the silicon nitride films (the twelfth insulating films) 341, 342 and 343 and the silicon nitride films (the fourth insulating films) 321, 322, 323 and 324 may be formed of a layered film of a silicon oxide film/a silicon nitride film from the silicon surface.

In this example, the control gates of the memory cells are formed continuously in one direction without using a mask. However, that is possible only where the island-like semiconductor layers are not disposed symmetrically to a diagonal. More particularly, by setting smaller the intervals between adjacent island-like semiconductor layers in the direction of the second and third wiring layers than those in the direction of the fourth wiring layer, it is possible to automatically obtain the wiring layers which are discontinuous in the direction of the fourth wiring layer and are continuous in the direction of the second and third wiring layers without using a mask. In contrast, if the island-like semiconductor layers are disposed symmetrically to a diagonal, for example, the wiring layers may be separated through patterning with use of resist films by photolithography. Also, a second trench 220 may be formed in the semiconductor substrate 100 through patterning with use of resist films by photolithography.

PRODUCTION EXAMPLE 4

In a semiconductor memory to be produced in this example, a semiconductor substrate is patterned in the form of pillars to form island-like semiconductor layers. Sides of the island-like semiconductor layers make active regions. A plurality of tunnel oxide films and floating gates as charge storage layers are formed on the active regions. The island-like semiconductor layers are each in an electrically floating state with respect to the semiconductor substrate. The active region of each memory cell is in the electrically floating state. Selection gate transistors are disposed at the top and the bottom of the island-like semiconductor layer. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. In this production example, the selection gate and the floating gate of the transistors are formed at the same time.

Such a semiconductor memory may be produced by the following production process. FIGS. 350 to 369 and FIGS. 370 to 389 are sectional views taken on line A–A' and line B–B', respectively, in FIG. 1 which is a plan view illustrating a memory cell array of an EEPROM.

Figure 350:
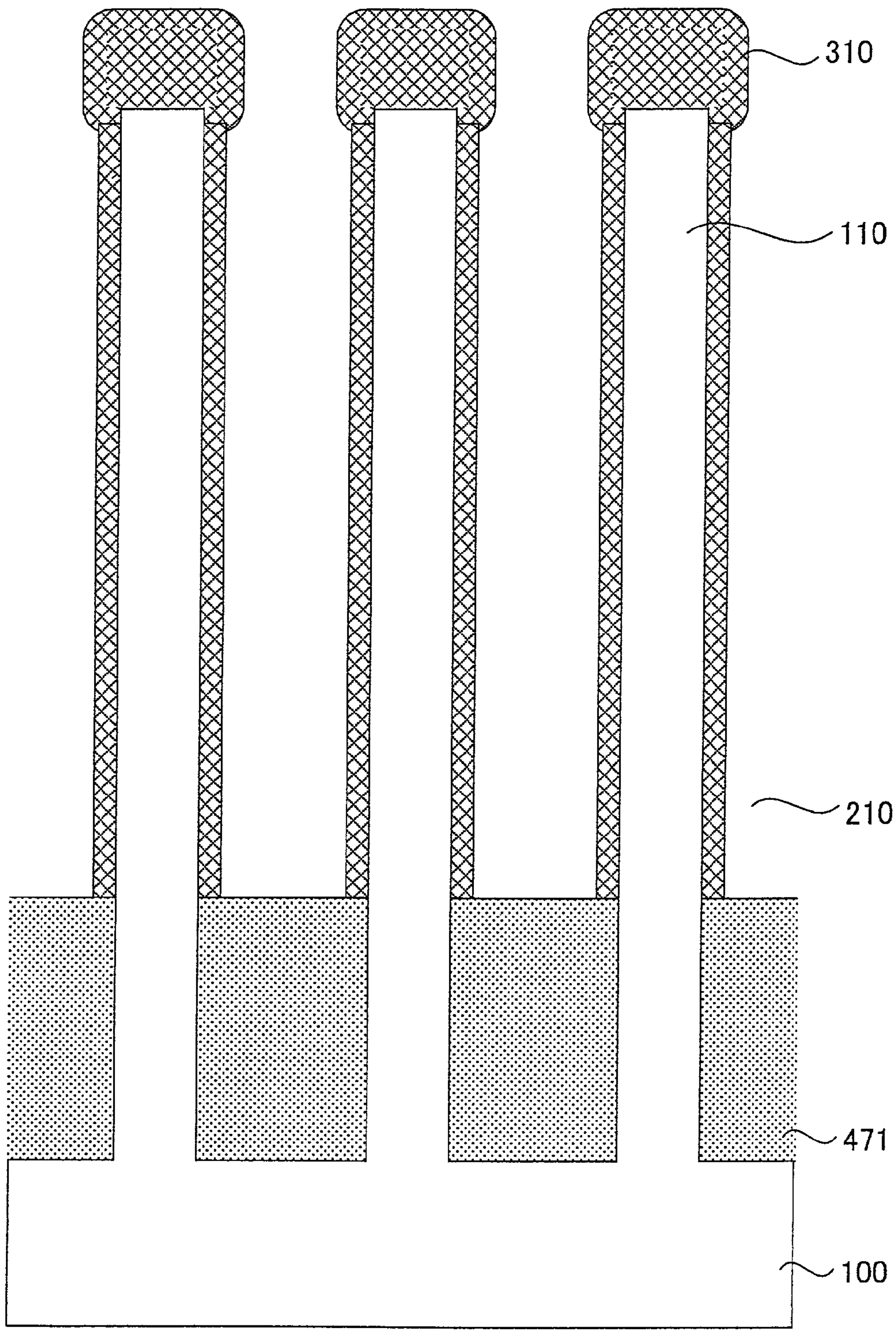
FIG. 350 to FIG. 369 are sectional views (taken on line A–A' in FIG. 1) illustrating production steps of Production Example 4 for producing a semiconductor memory in accordance with the present invention.
Figure 370:
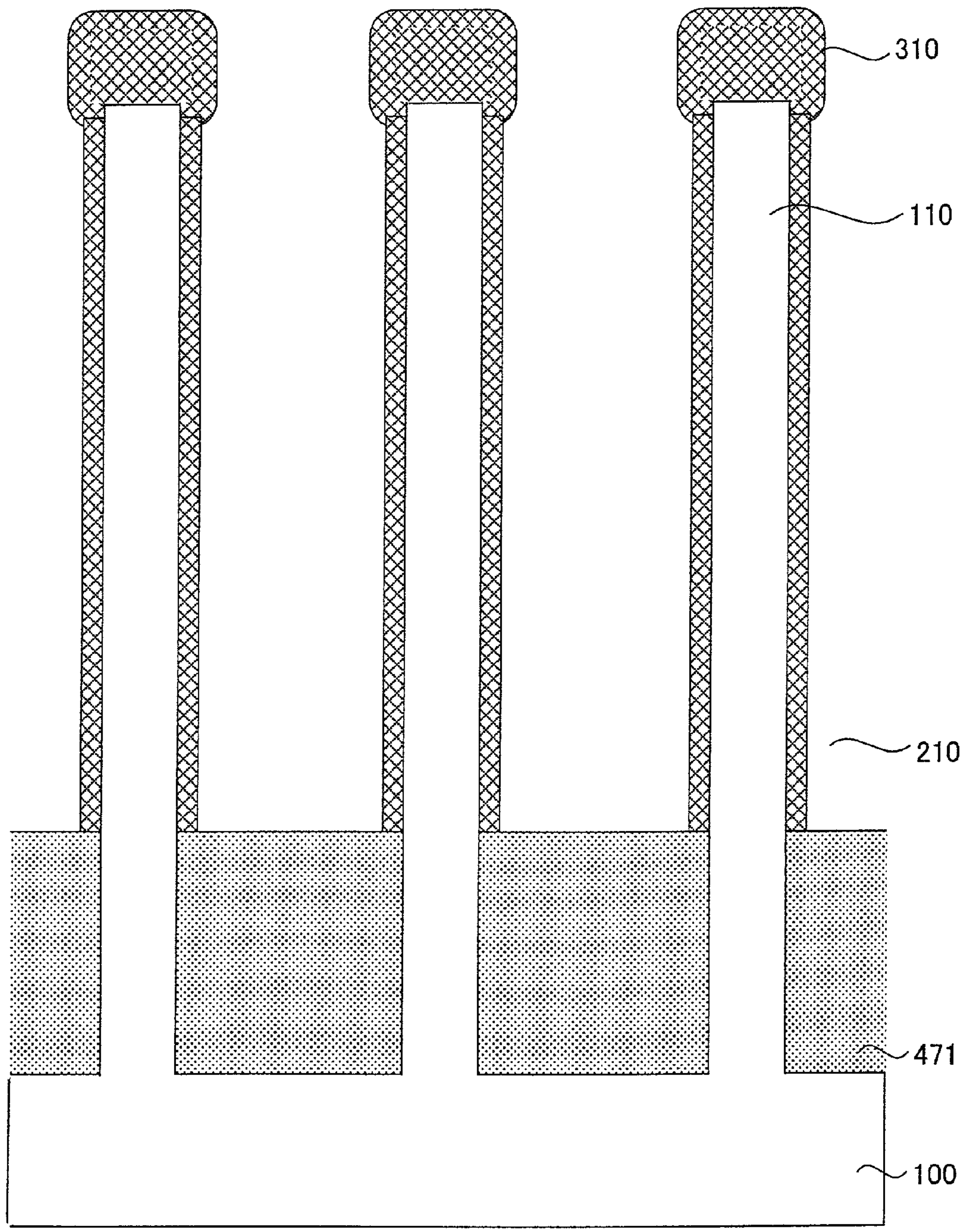
FIG. 370 to FIG. 389 are sectional views (taken on line B–B' in FIG. 1) illustrating production steps of Production Example 4 for producing a semiconductor memory in accordance with the present invention.

In this example, production steps until the channel ion implantation into the sidewall of each island-like semiconductor layer 110 are the same as those in Production Example 1. Thereafter, a silicon oxide film 471, for example, is deposited to a thickness of 50 to 500 nm as an eleventh insulating film and is anisotropically and isotropically etched so that the film 471 is buried in the first trench 210 almost to a height where the top of a lower selection gate is positioned. A twelfth insulating film, for example, a silicon nitride film 340 is deposited to form a sidewall spacer (FIG. 350 and FIG. 370).

Figure 351:
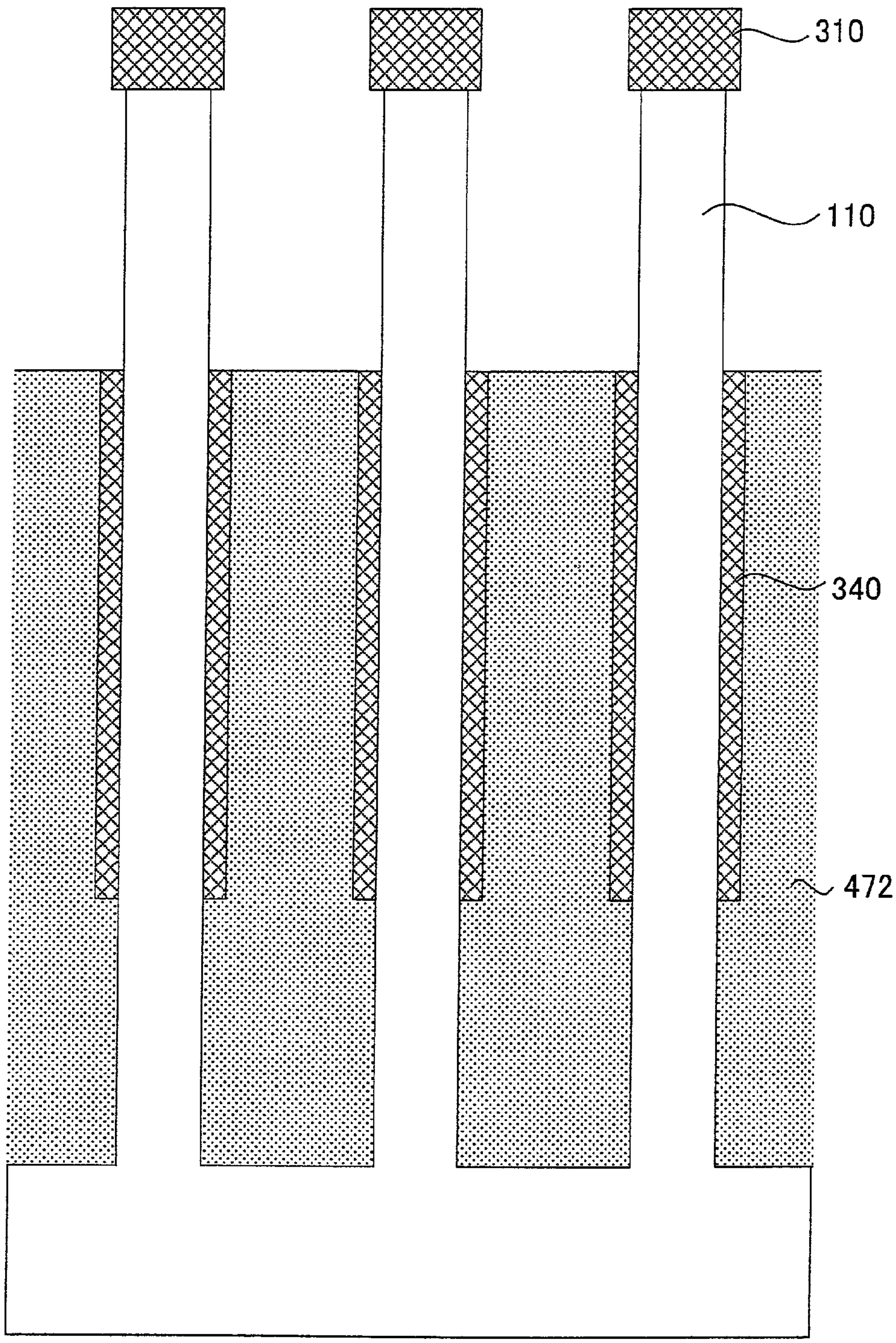
Figure 371:
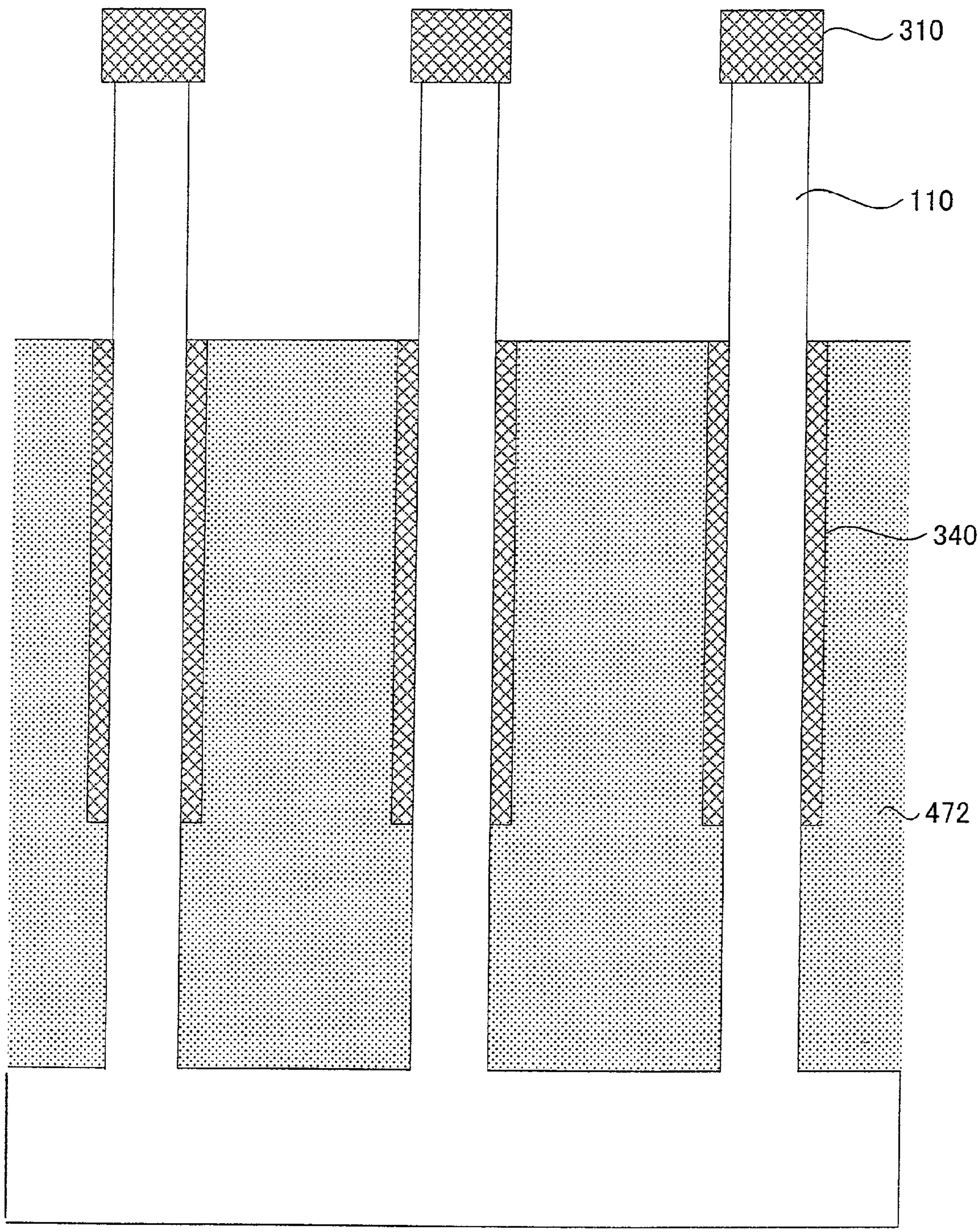

Subsequently, a silicon oxide film 472 is deposited to a thickness of 50 to 500 nm like the eleventh insulating film and is anisotropically and isotropically etched so that the film 472 is buried in the first trench 210 almost to a height where the bottom of an upper selection gate is positioned. The sidewall spacer 340 of the silicon nitride film (the twelfth insulating film) is partially removed by isotropic etching using the silicon oxide film (the eleventh insulating film) 472 as a mask (FIG. 351 and FIG. 371).

Figure 352:
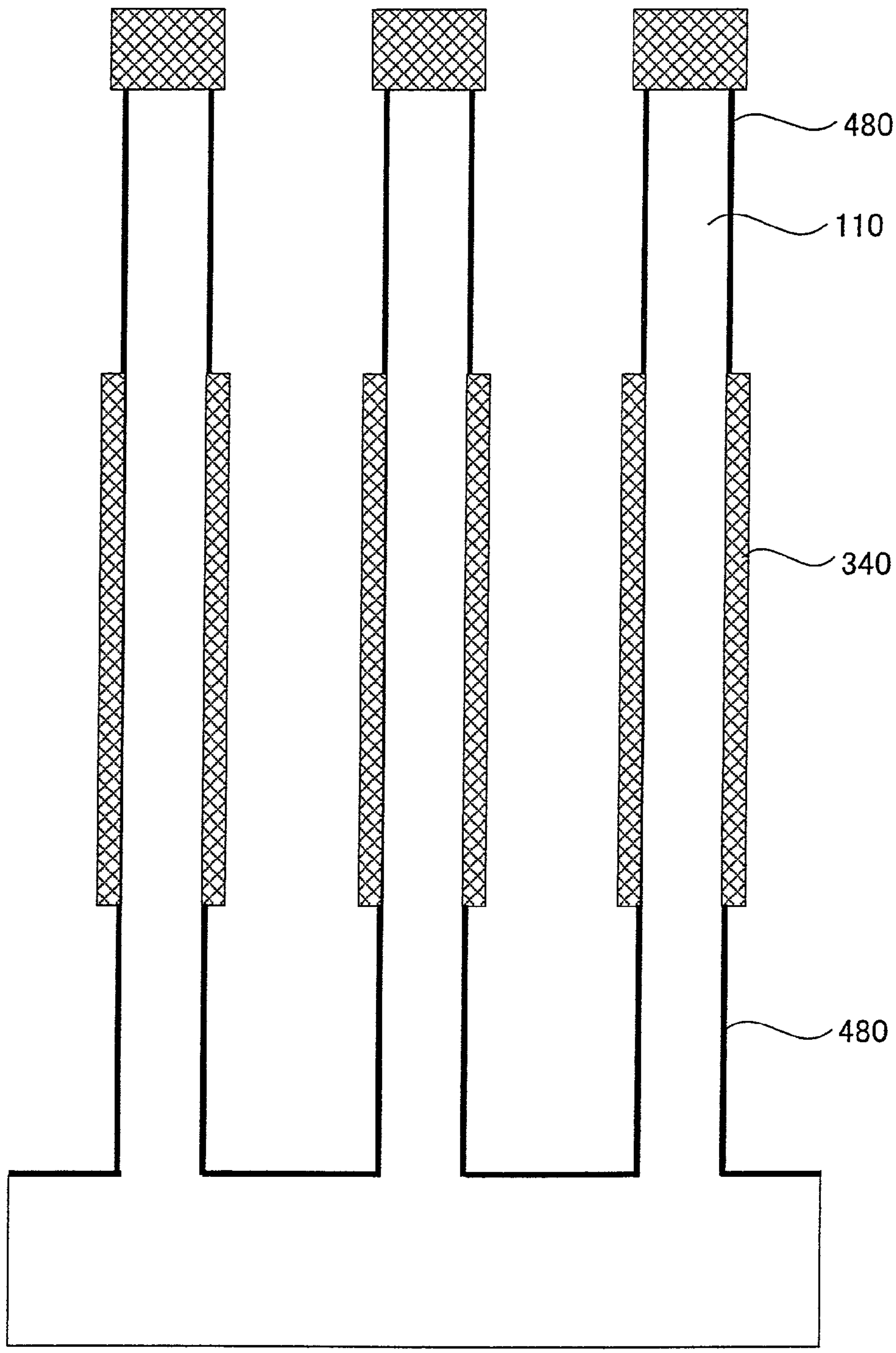
Figure 372:
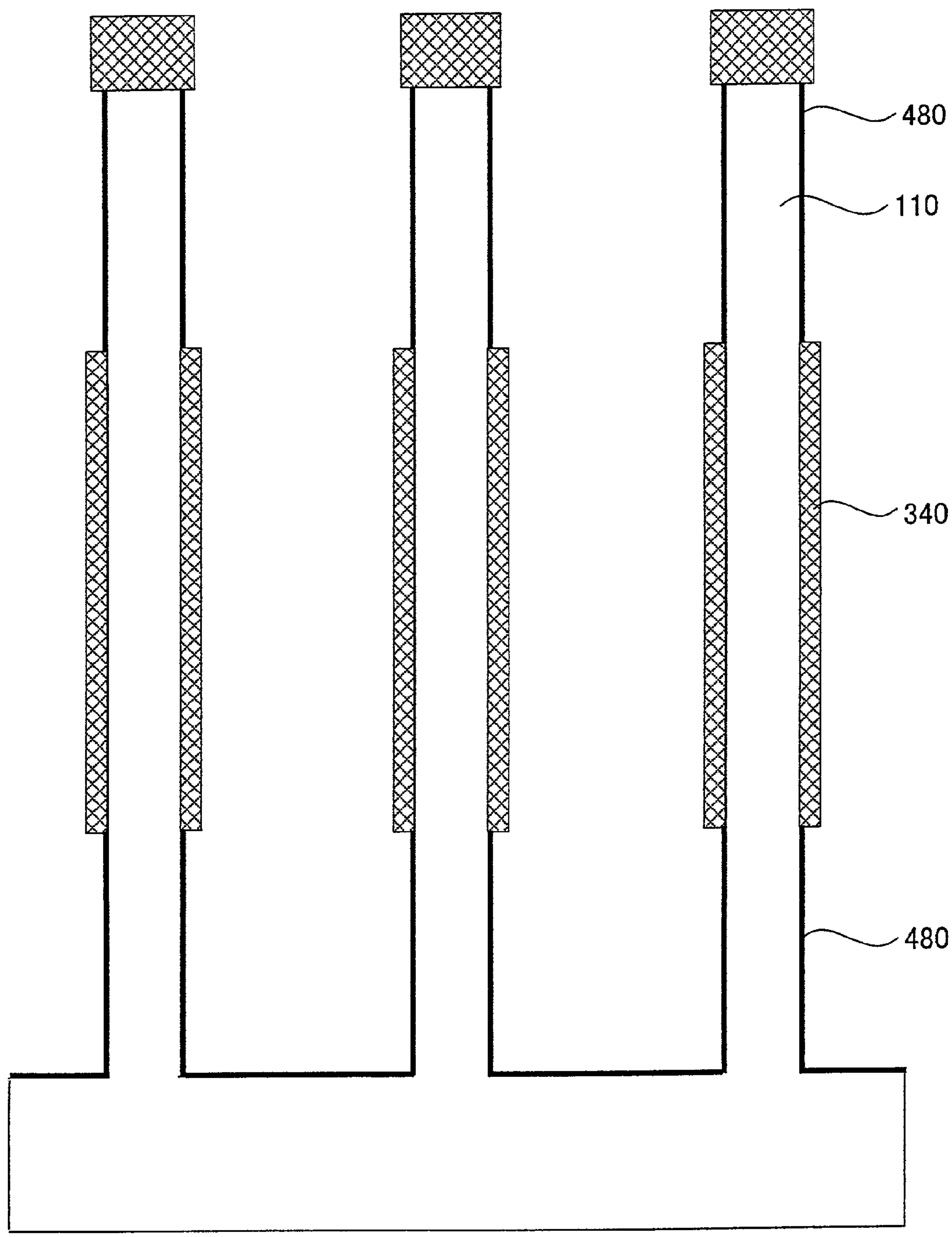

Subsequently, an oxide film 480 of about 15 to 25 nm thickness which is a thirteenth insulating film is formed around the island-like semiconductor layer 110, for example, by thermal oxidation (FIG. 352 and FIG. 372).

Figure 353:
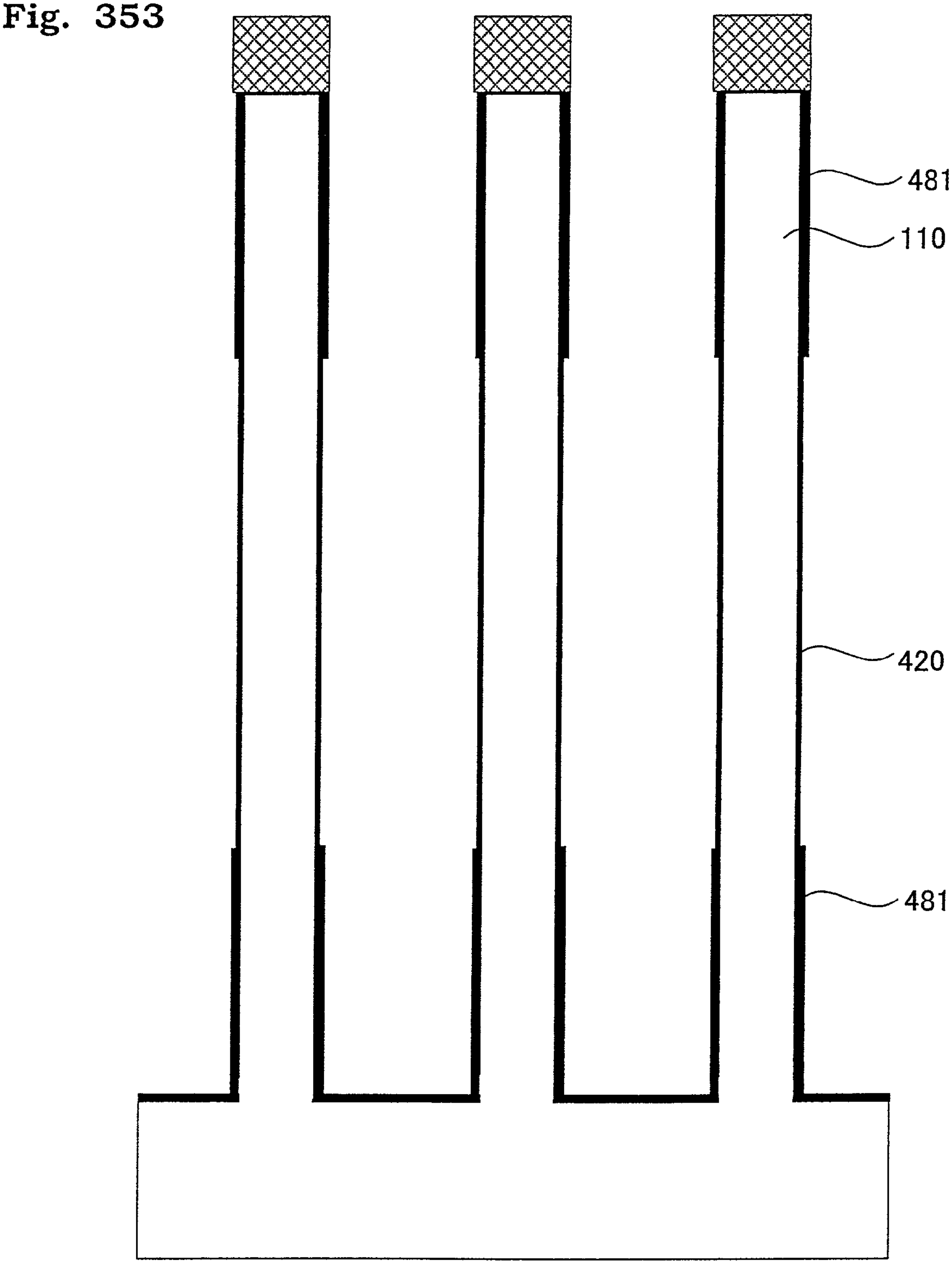
Figure 354:
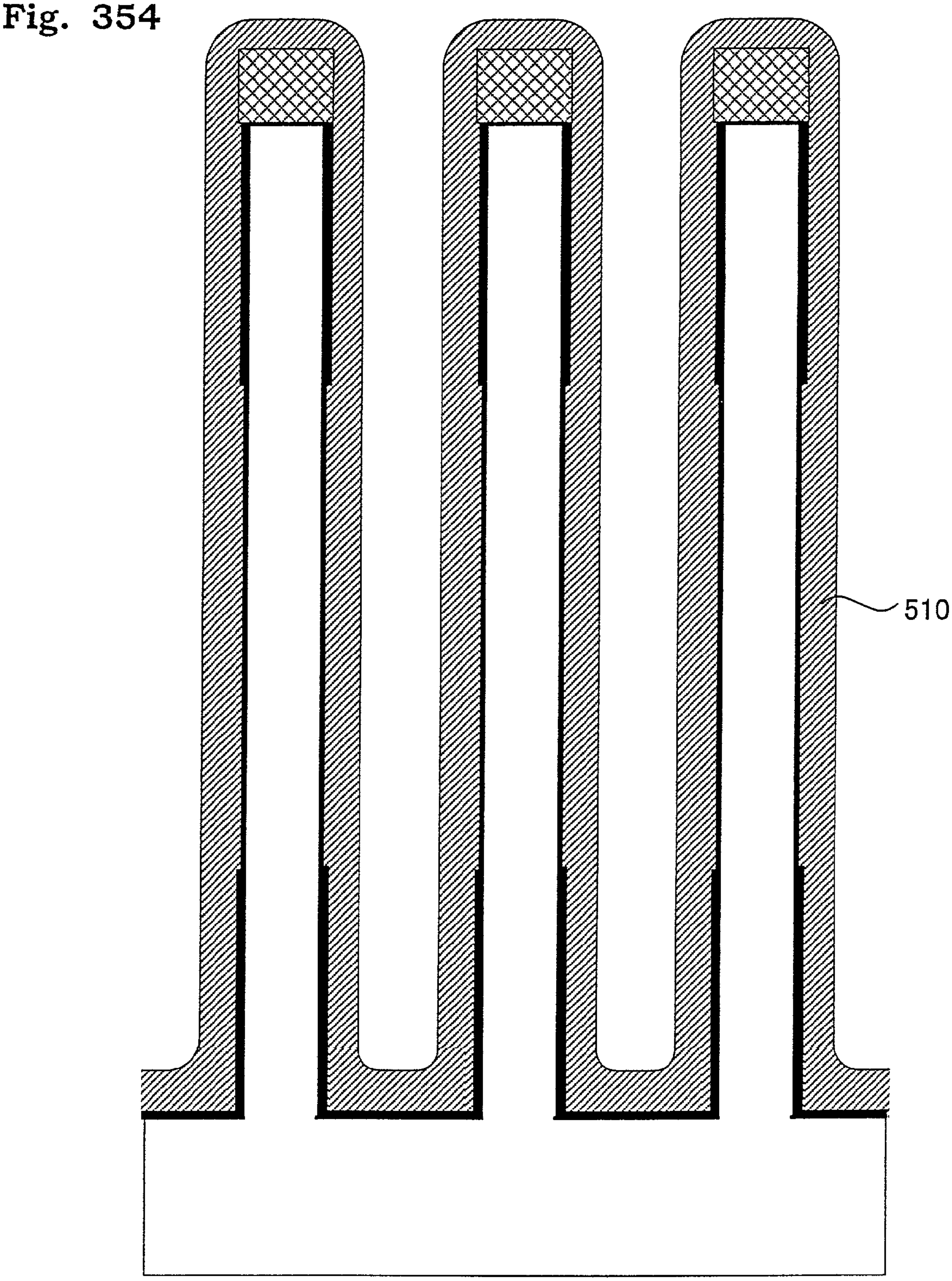
Figure 355:
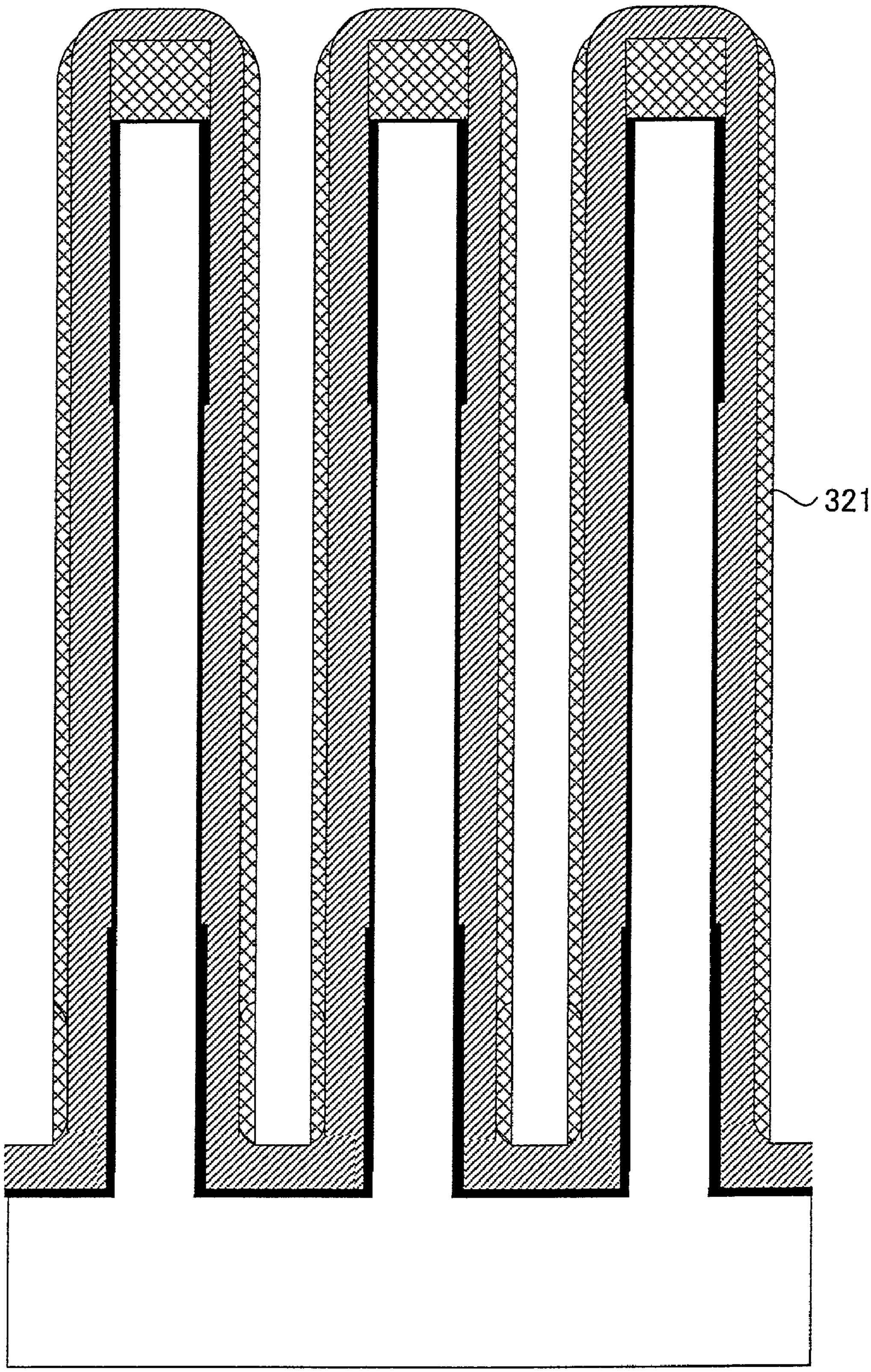
Figure 356:
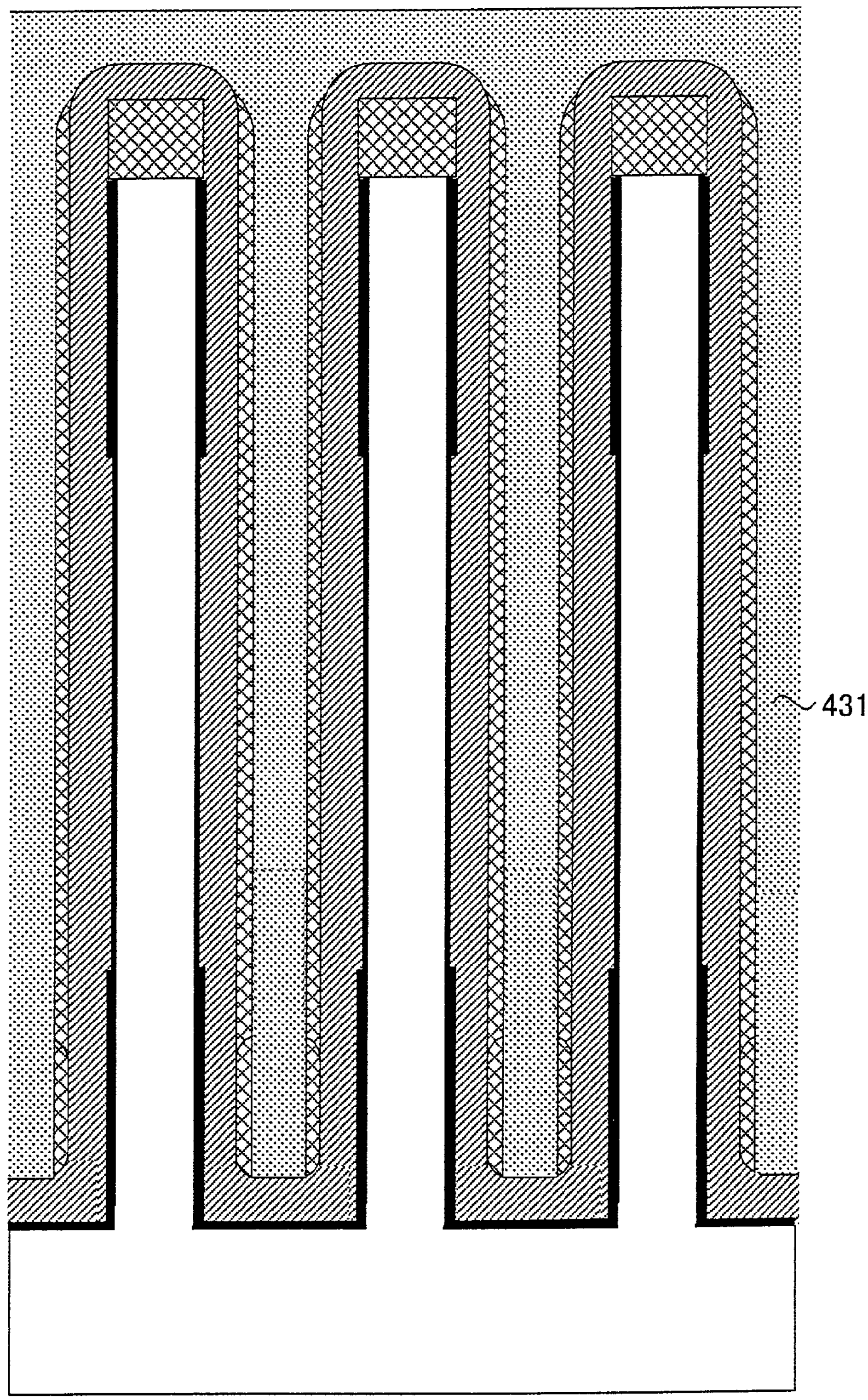
Figure 357:
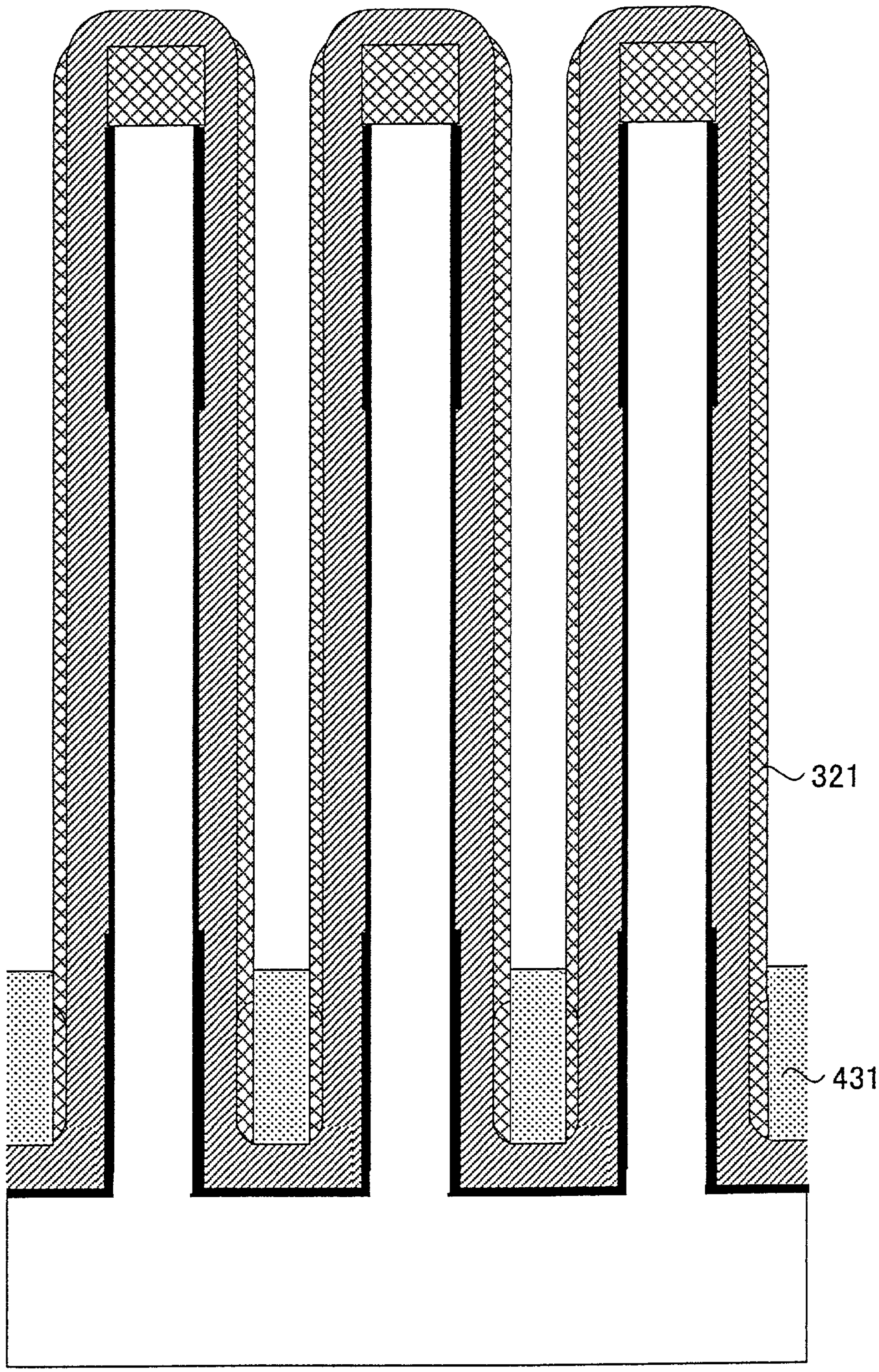
Figure 358:
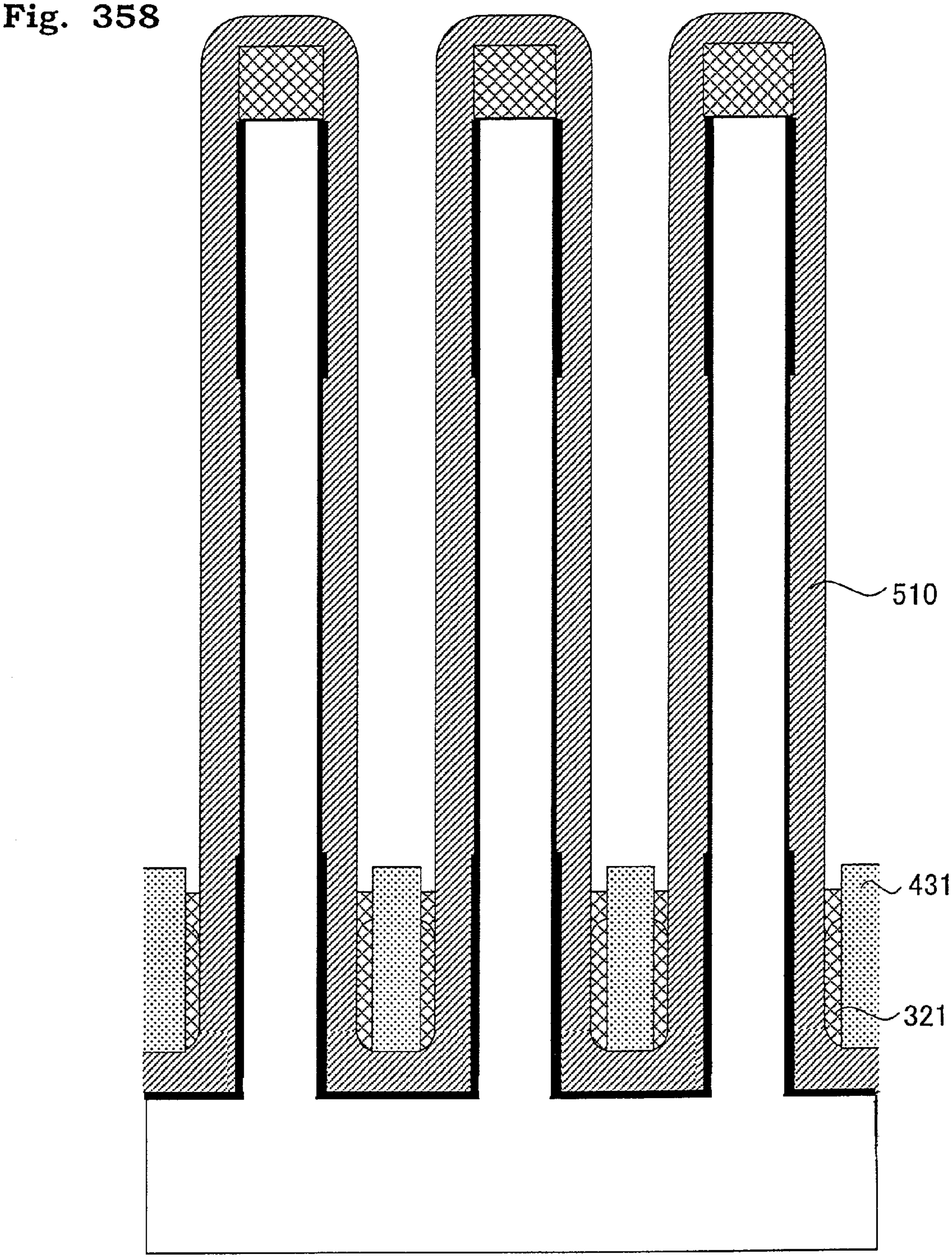
Figure 359:
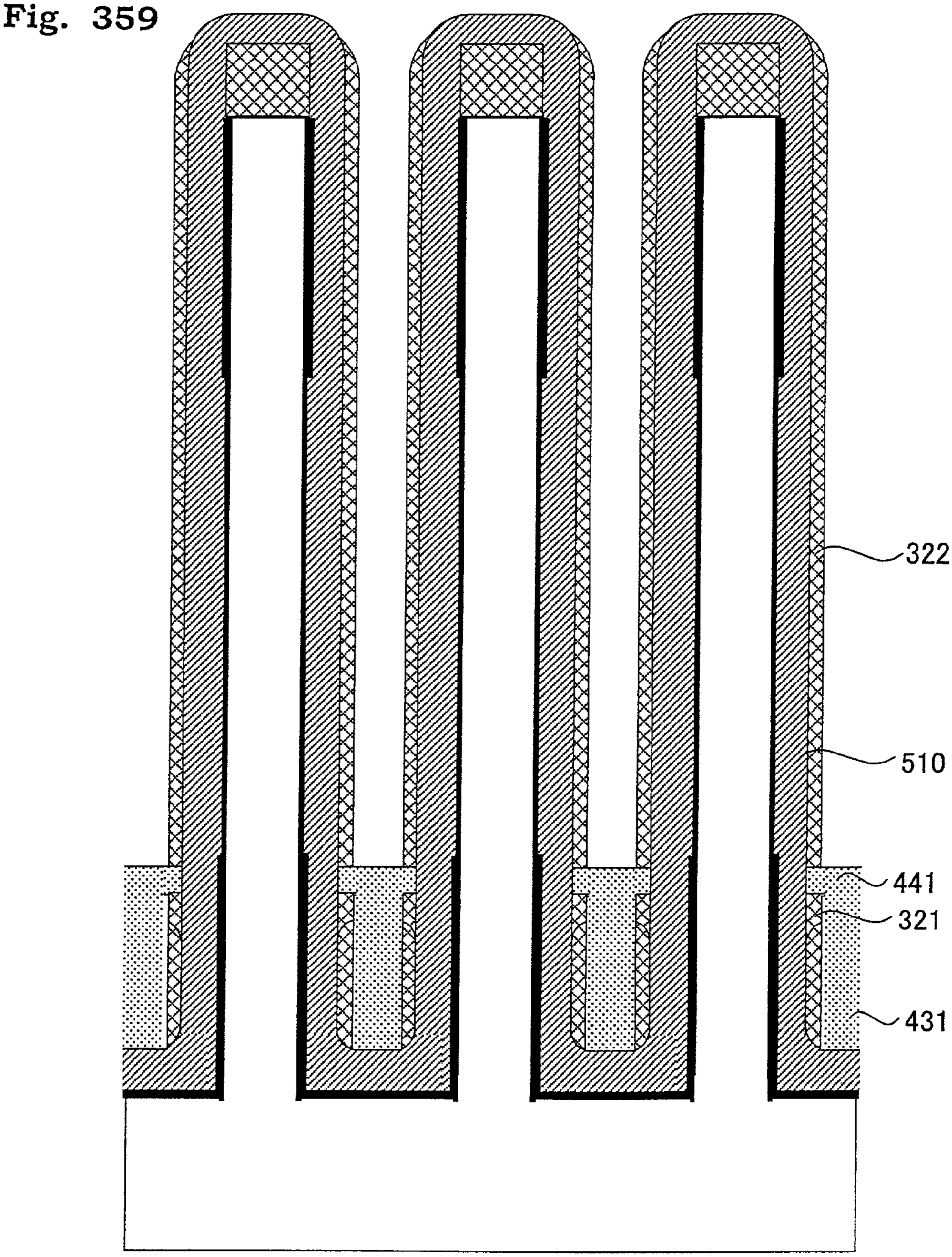
Figure 360:
Figure 361:
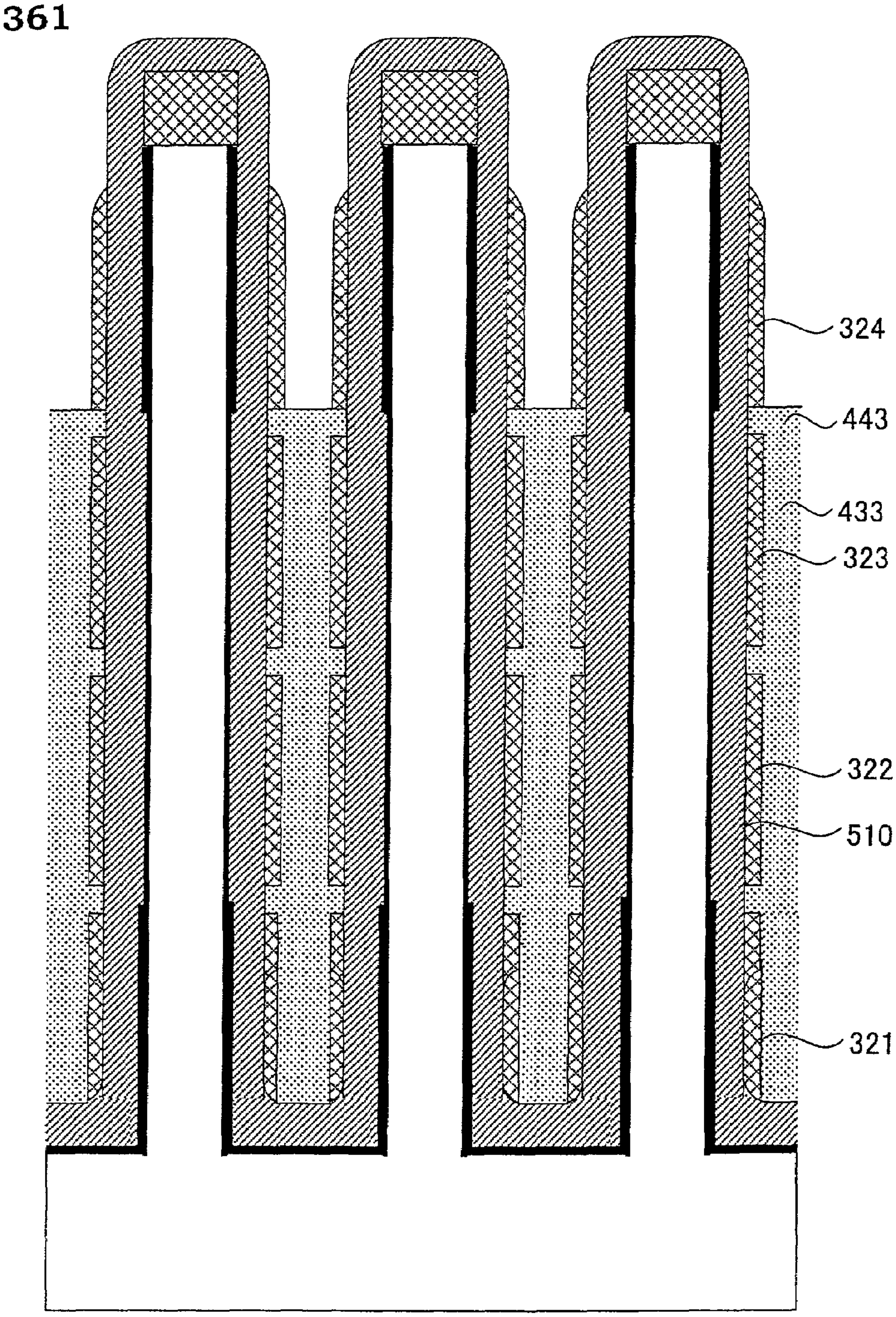
Figure 362:
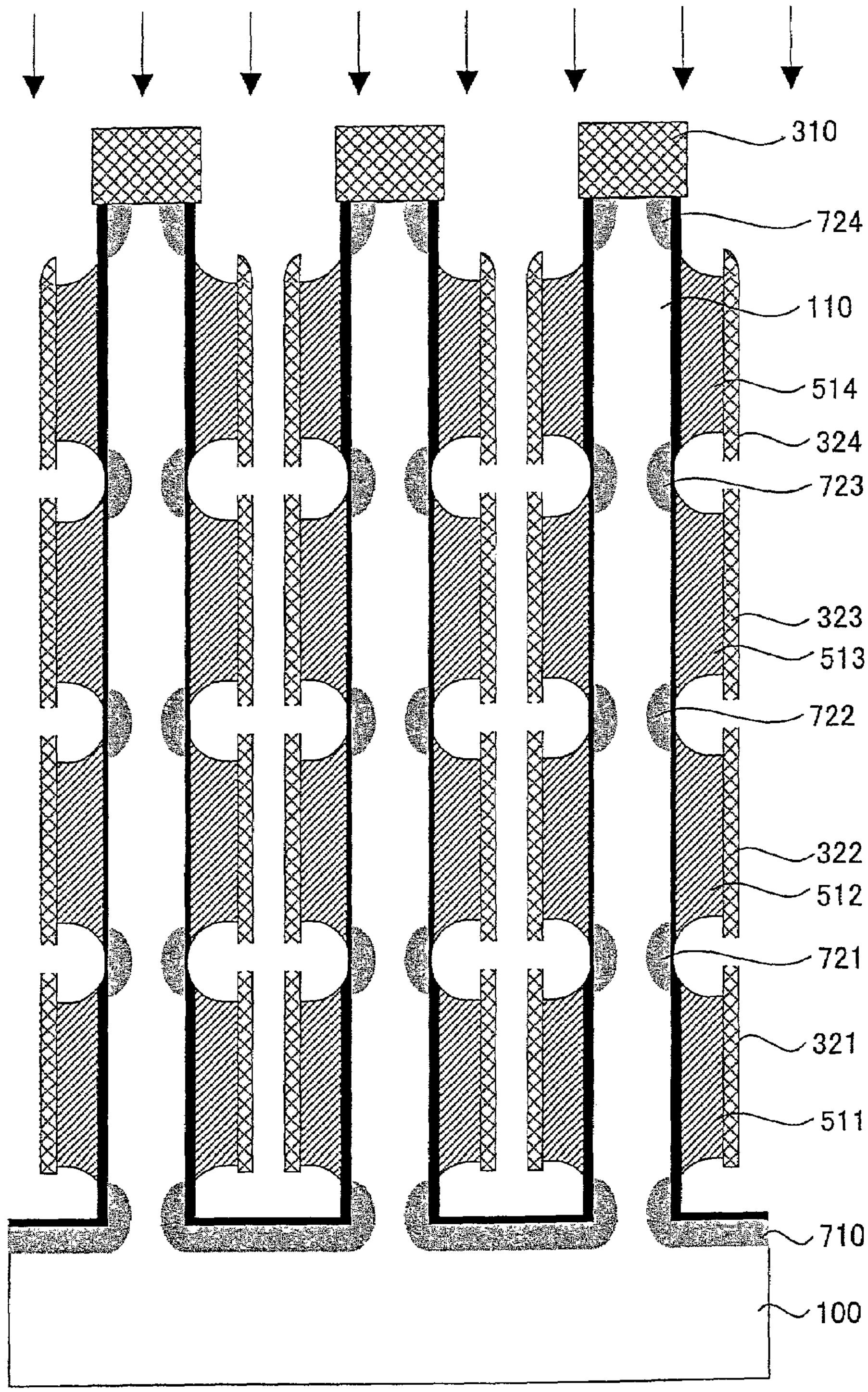
Figure 363:
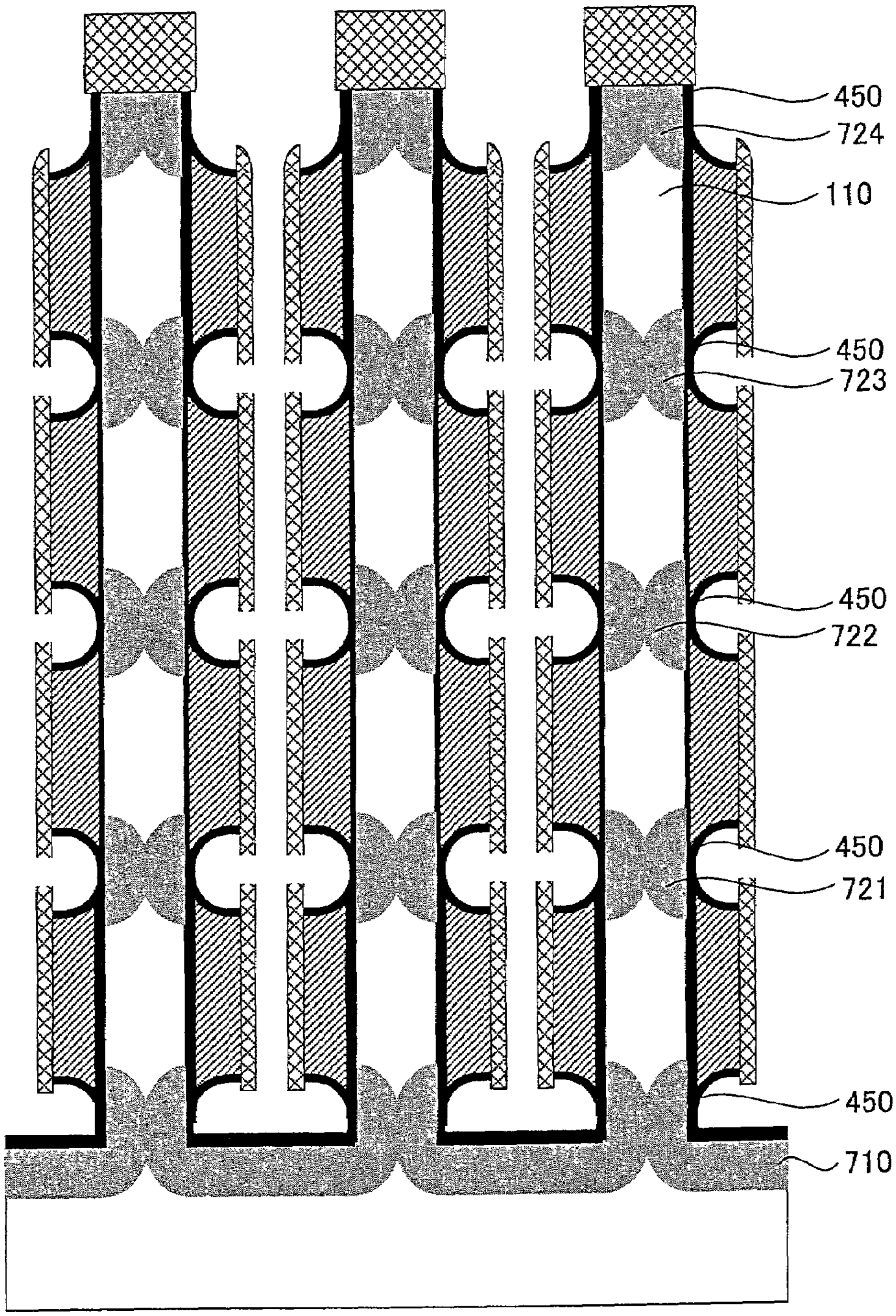
Figure 364:
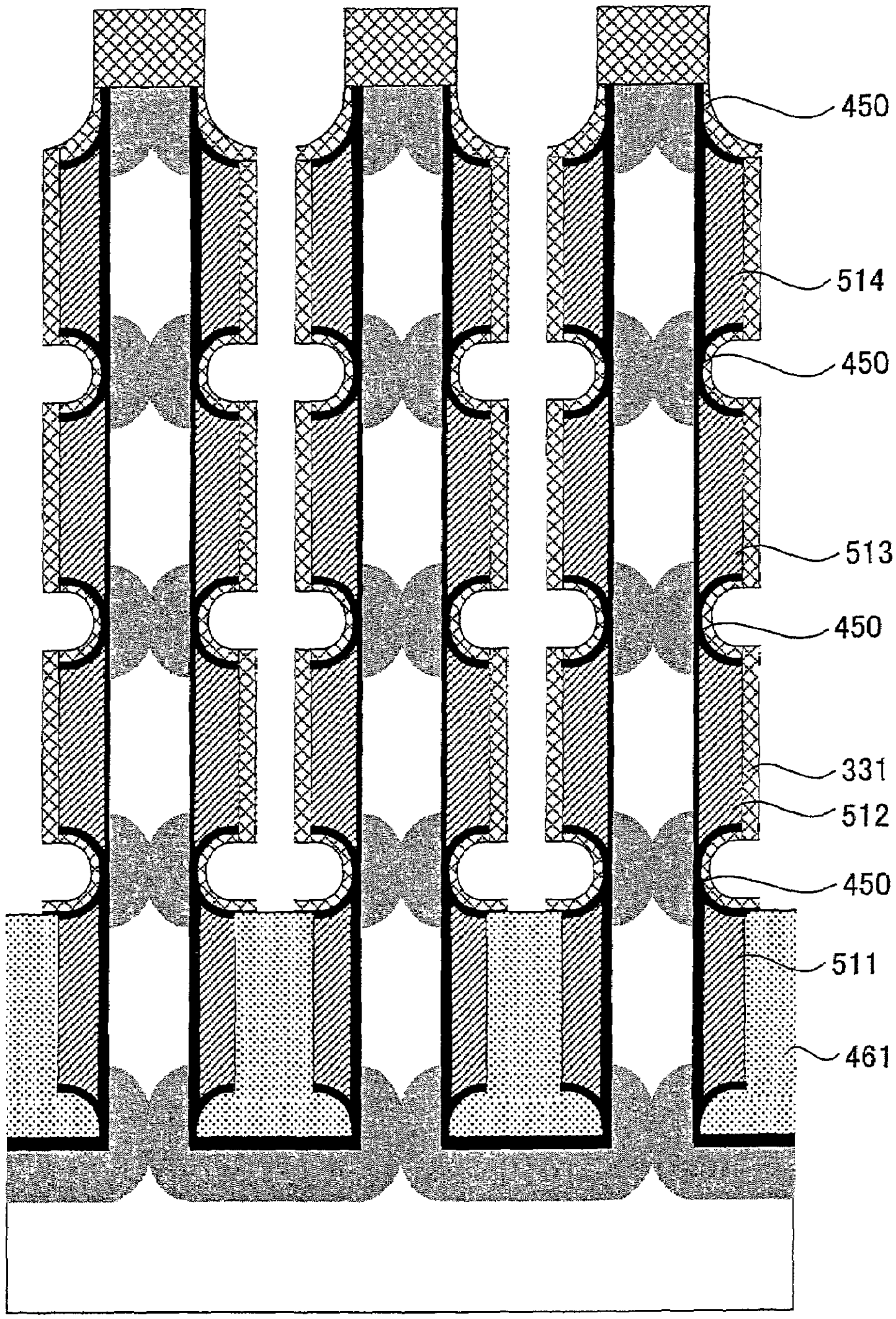
Figure 365:
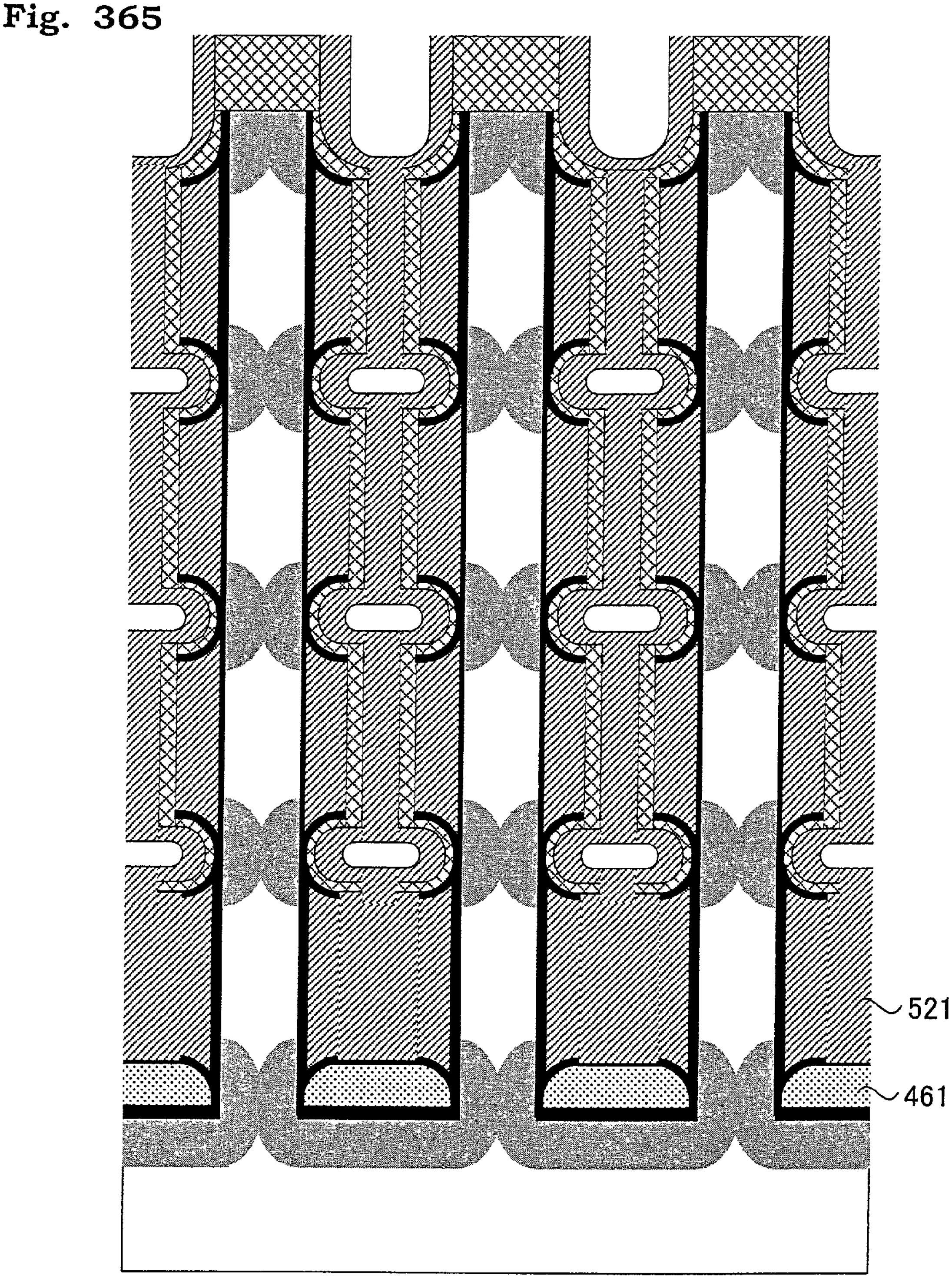
Figure 366:
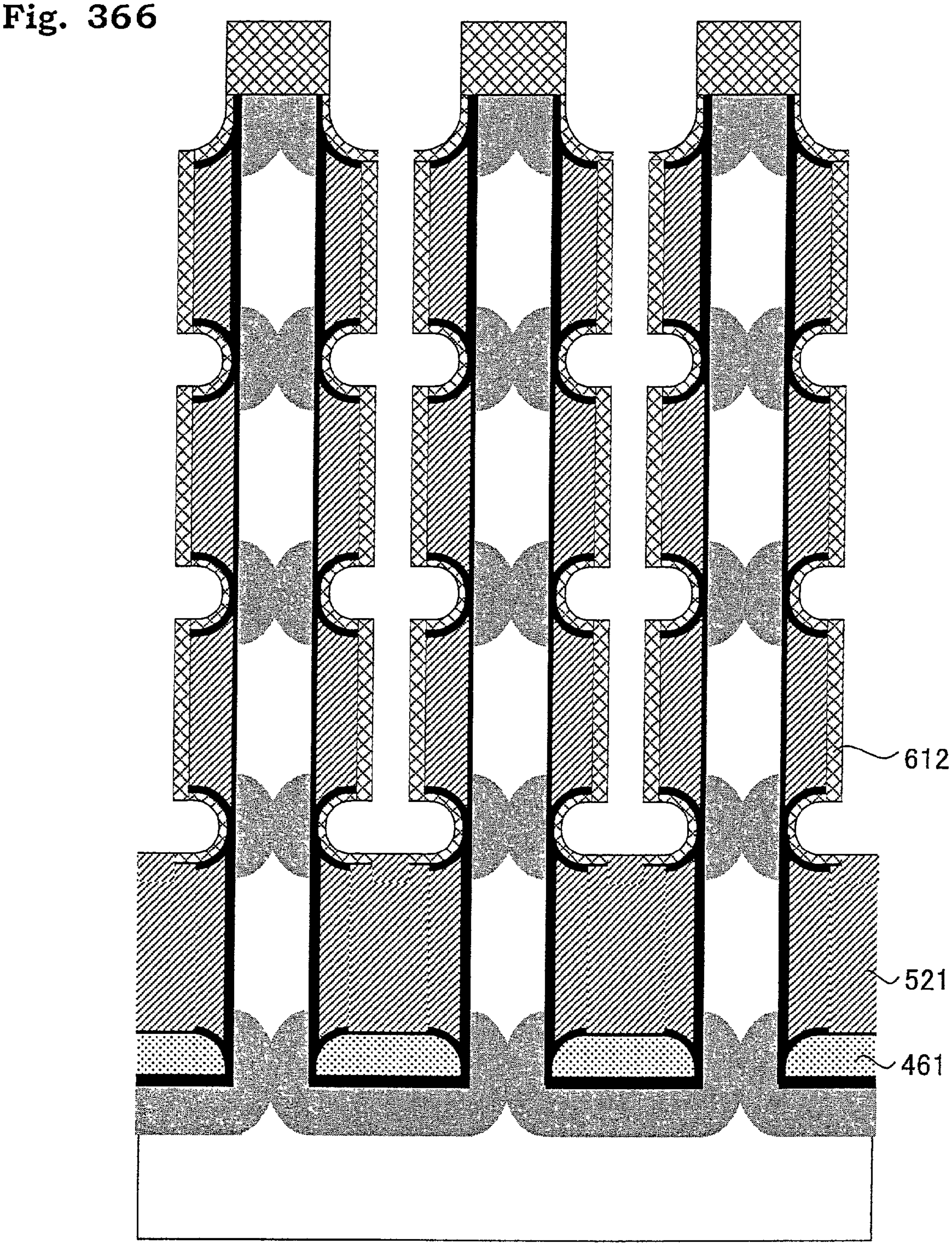
Figure 367:
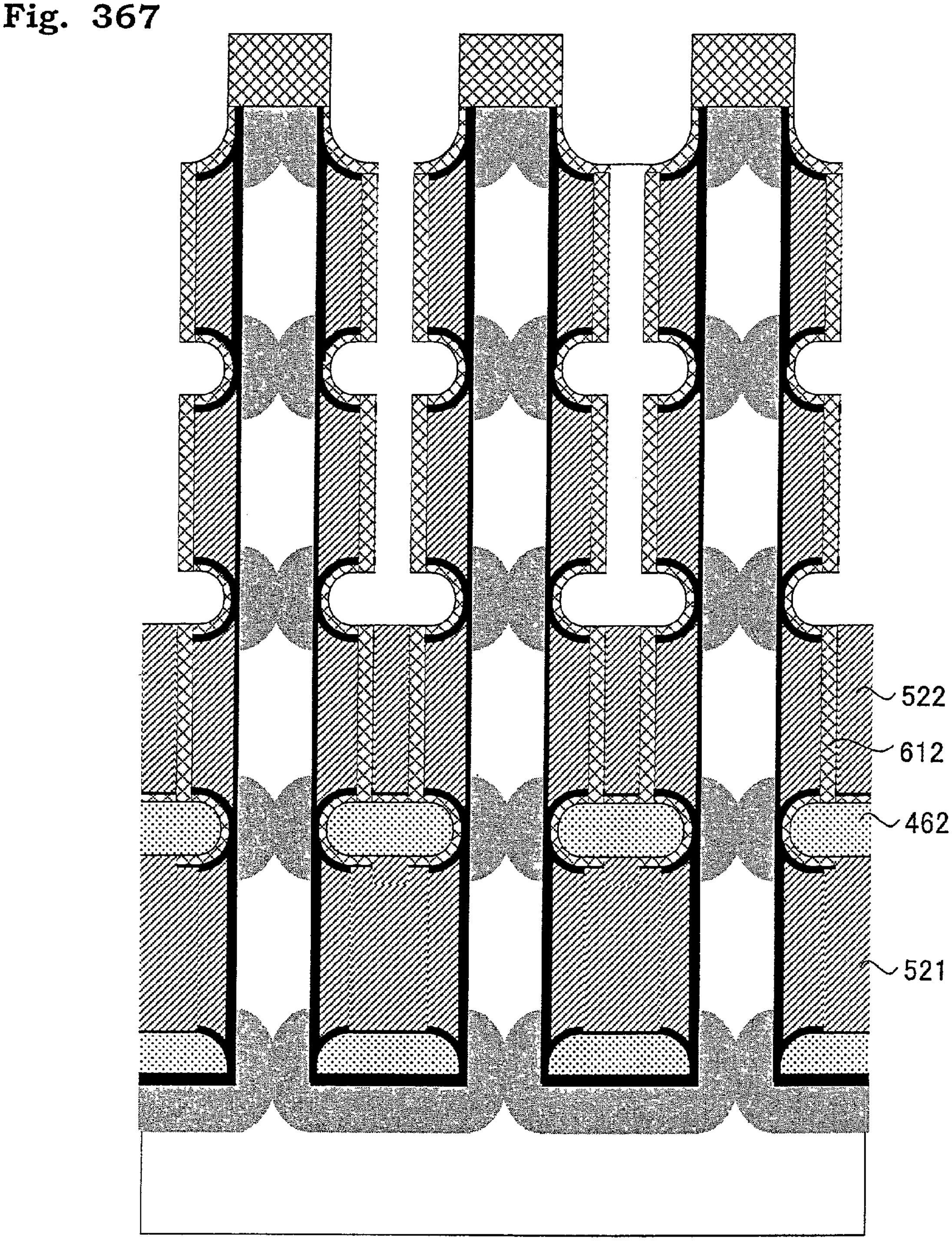
Figure 368:
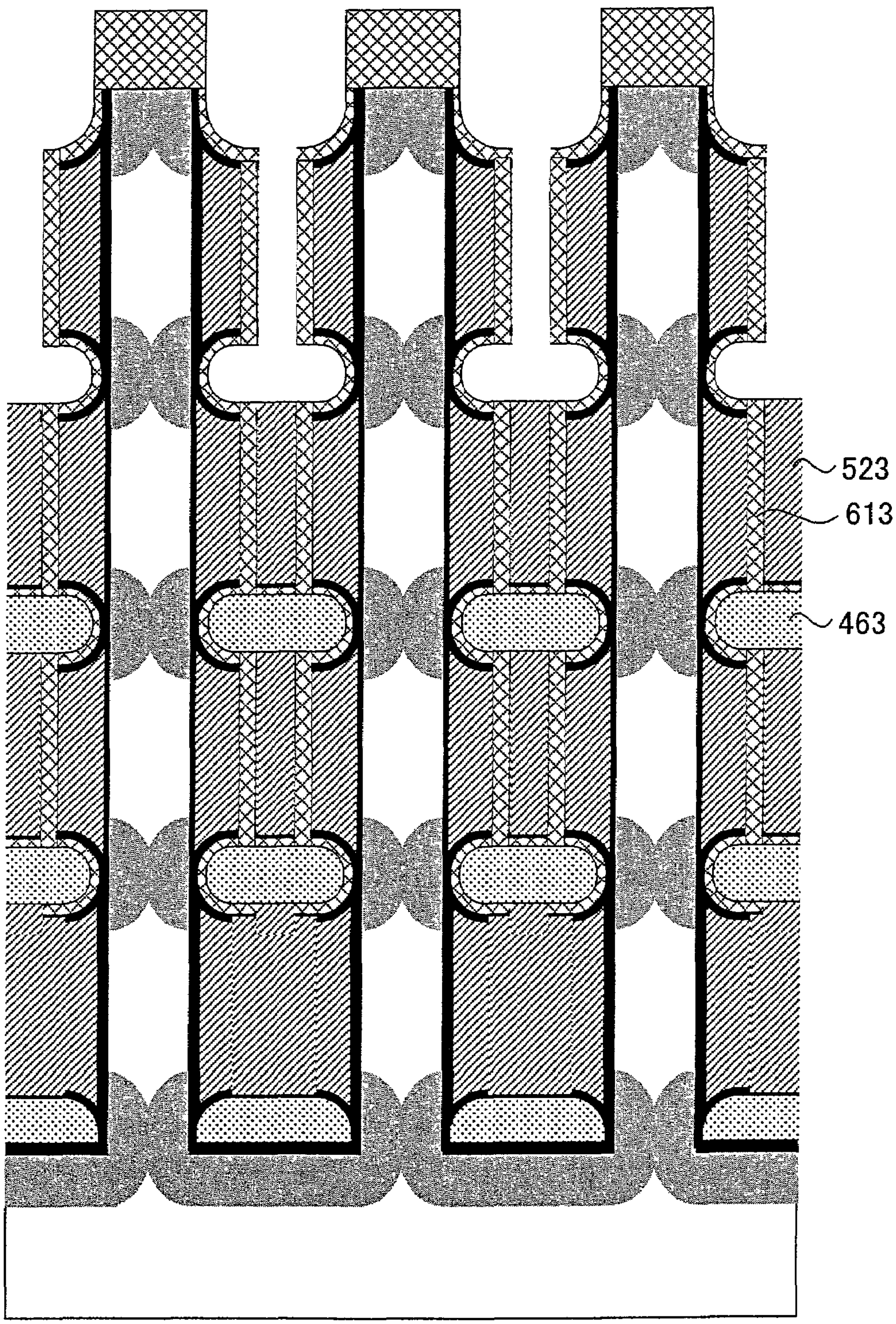
Figure 369:
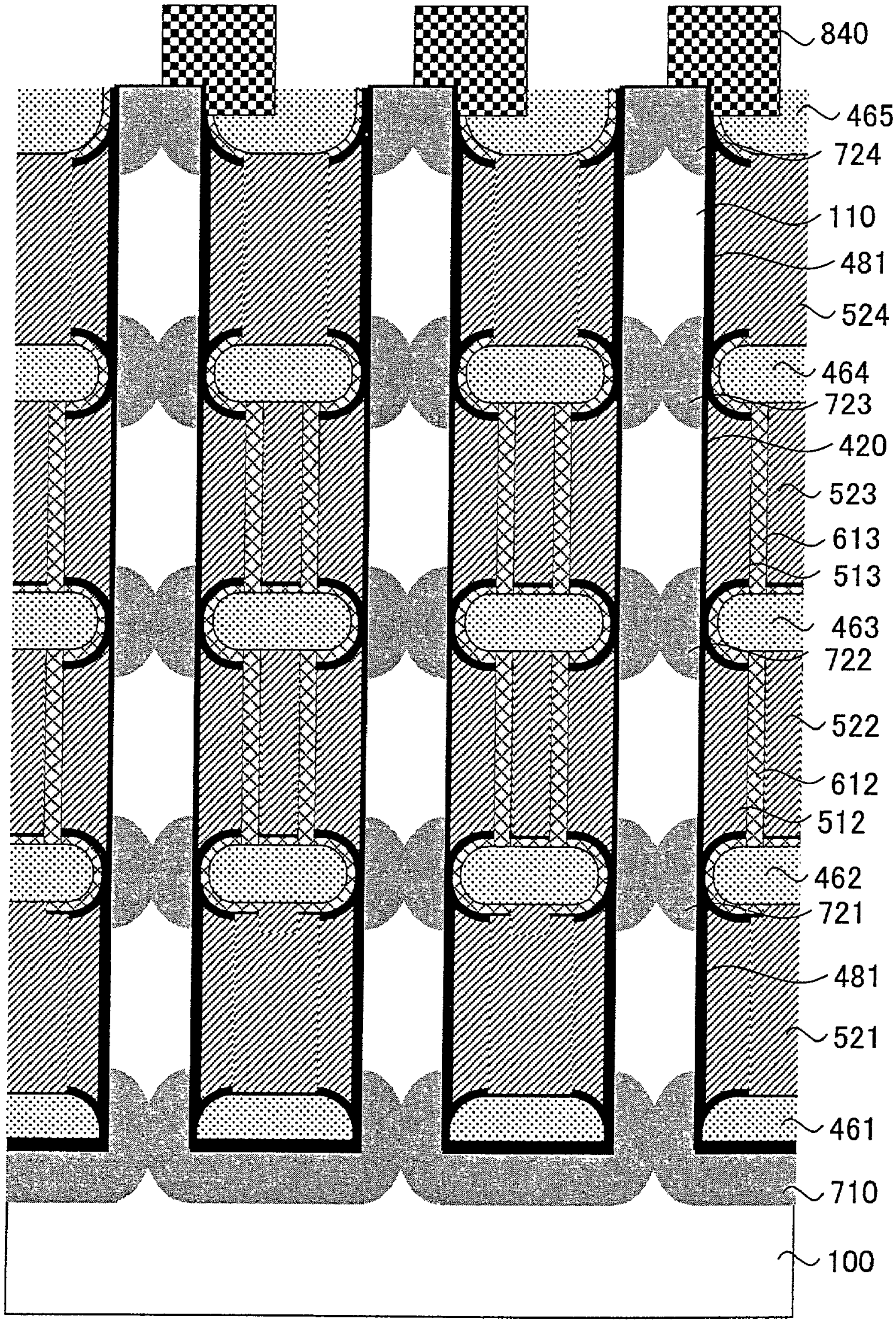
Figure 373:
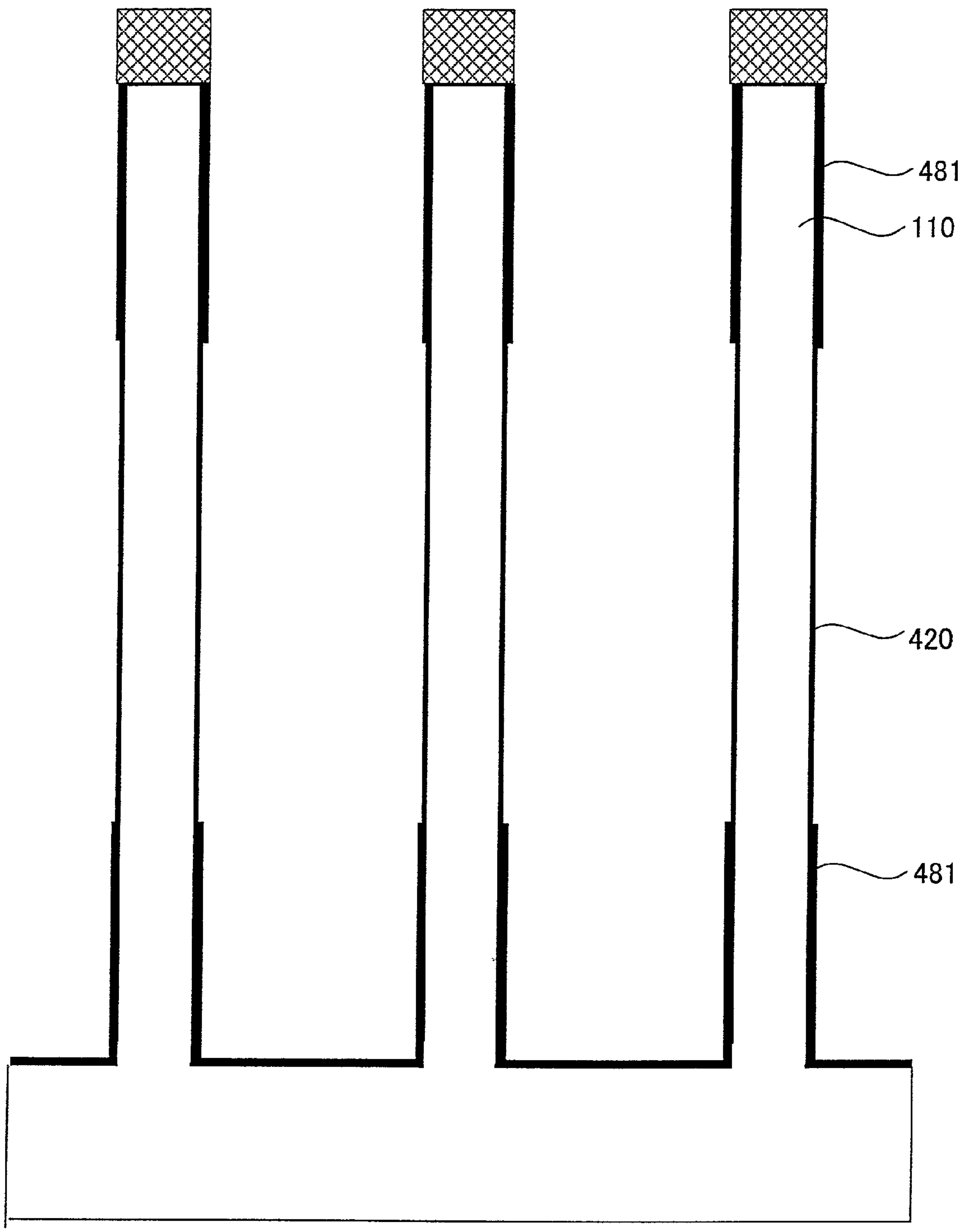
Figure 374:
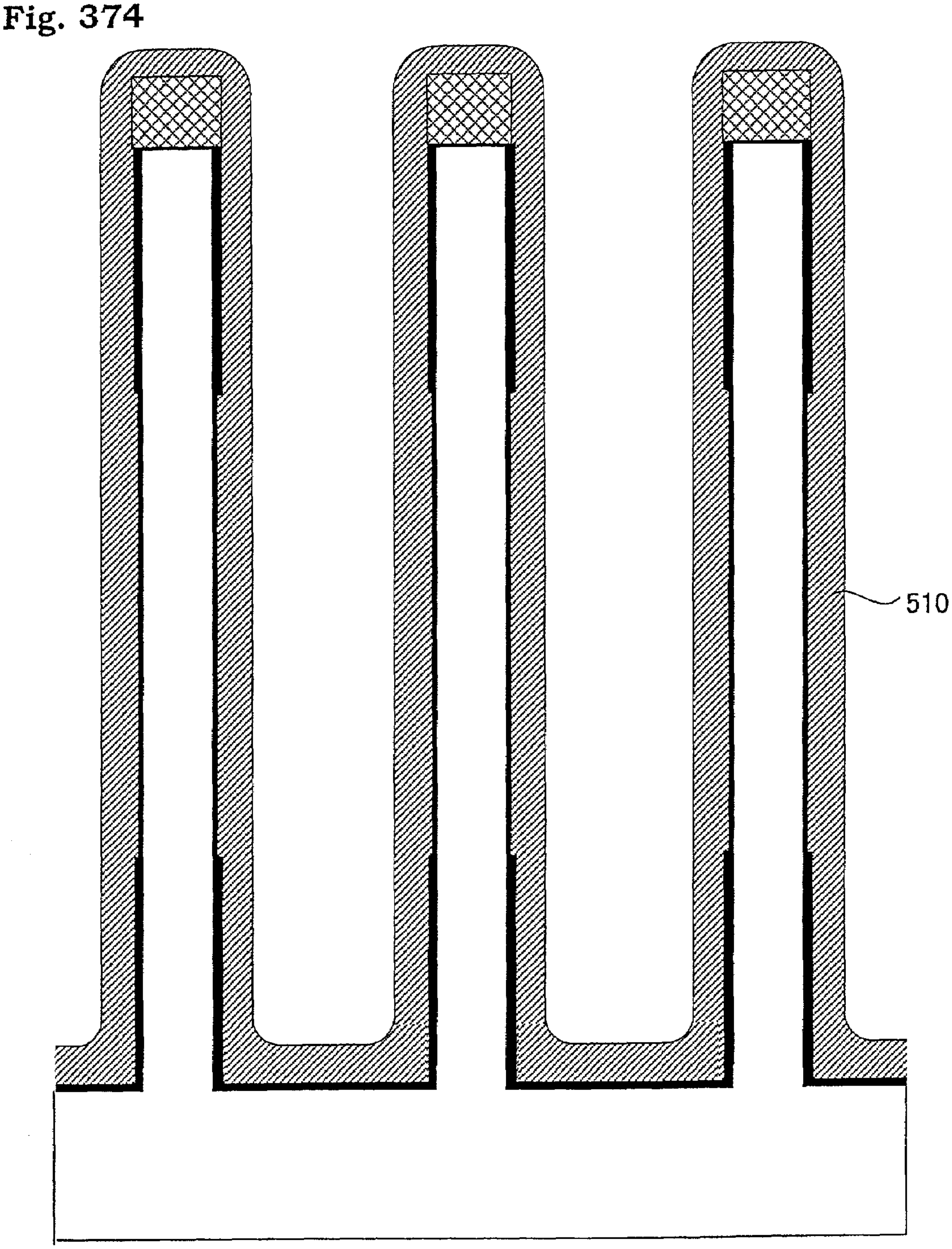
Figure 375:
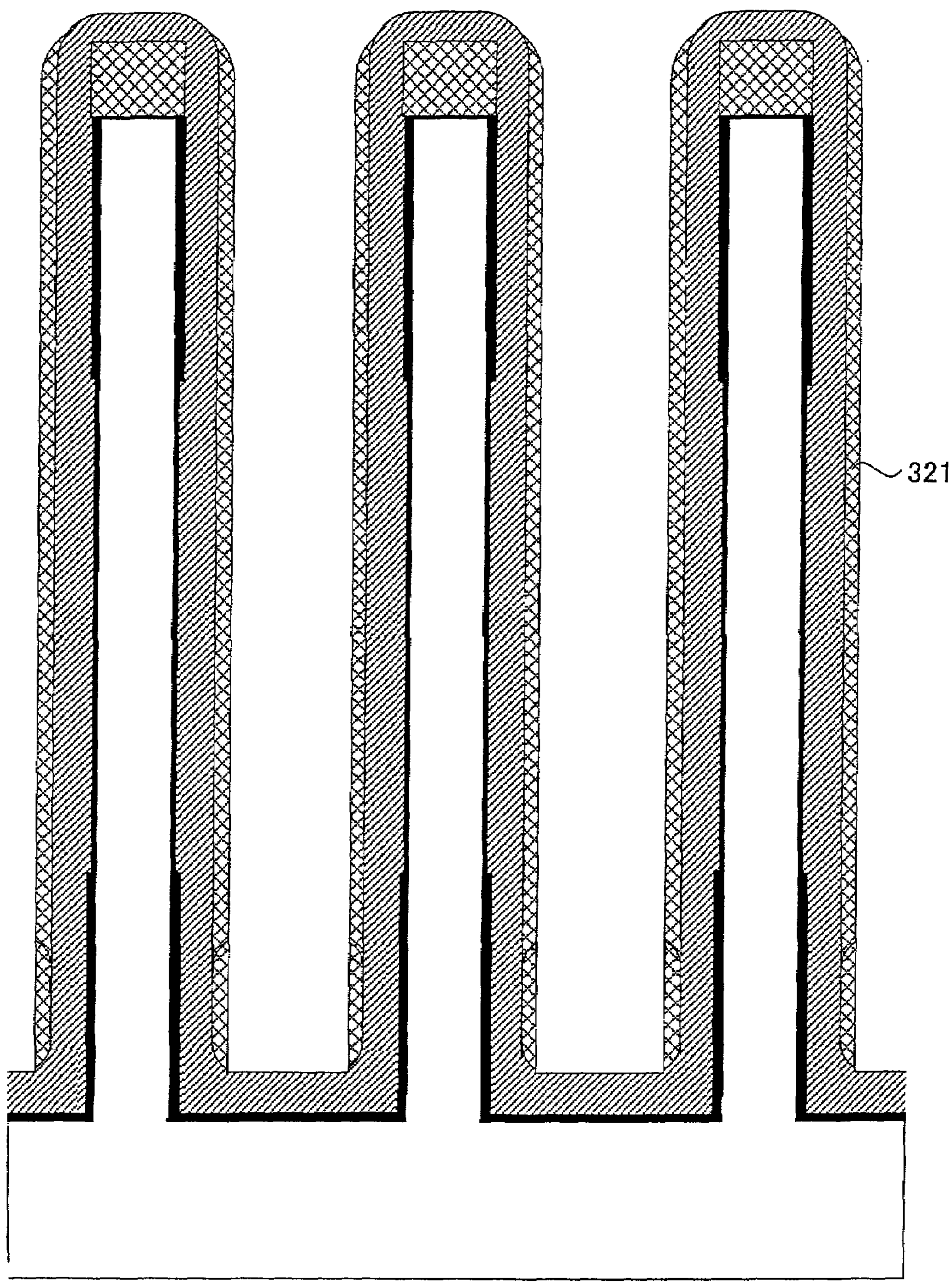
Figure 376:
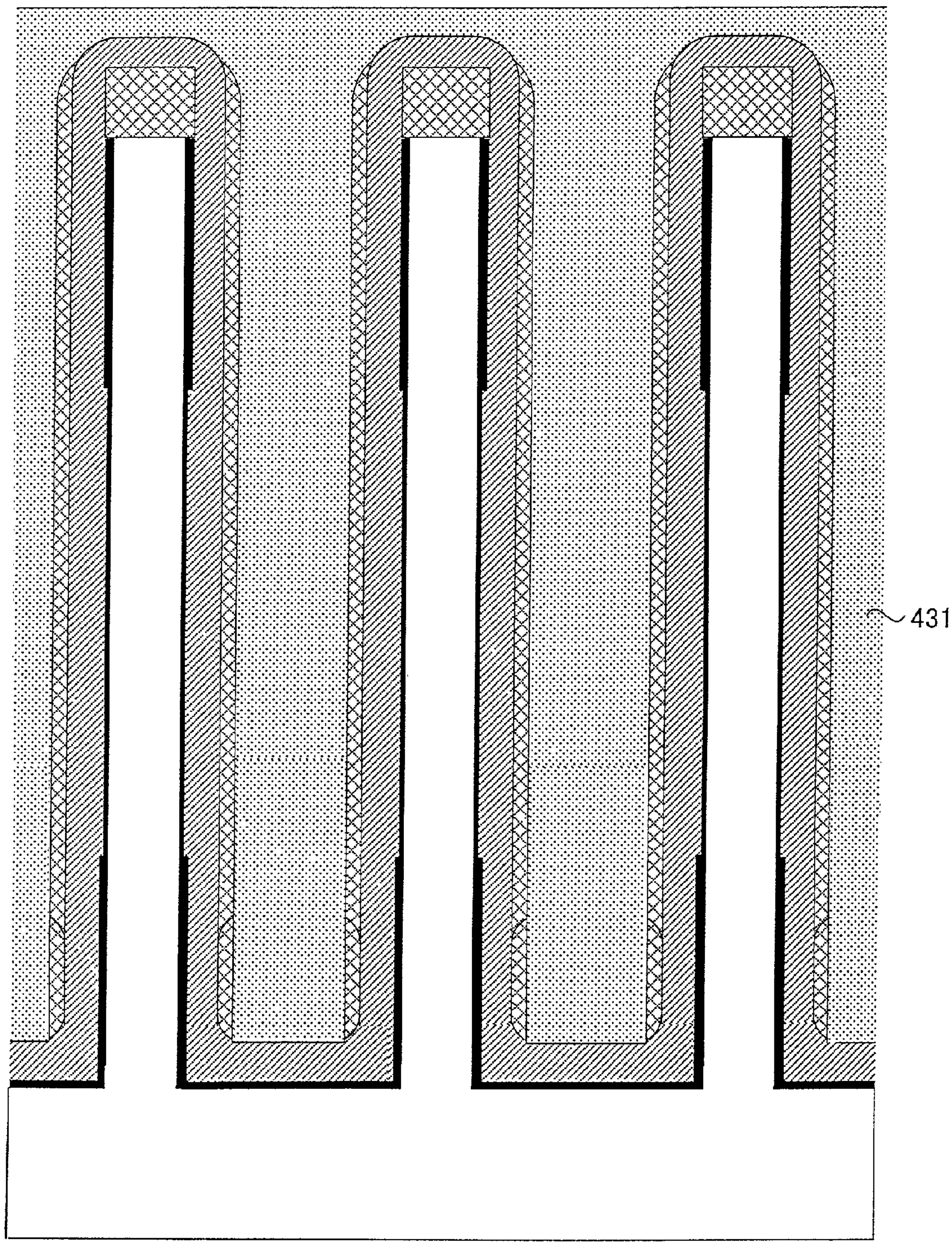
Figure 377:
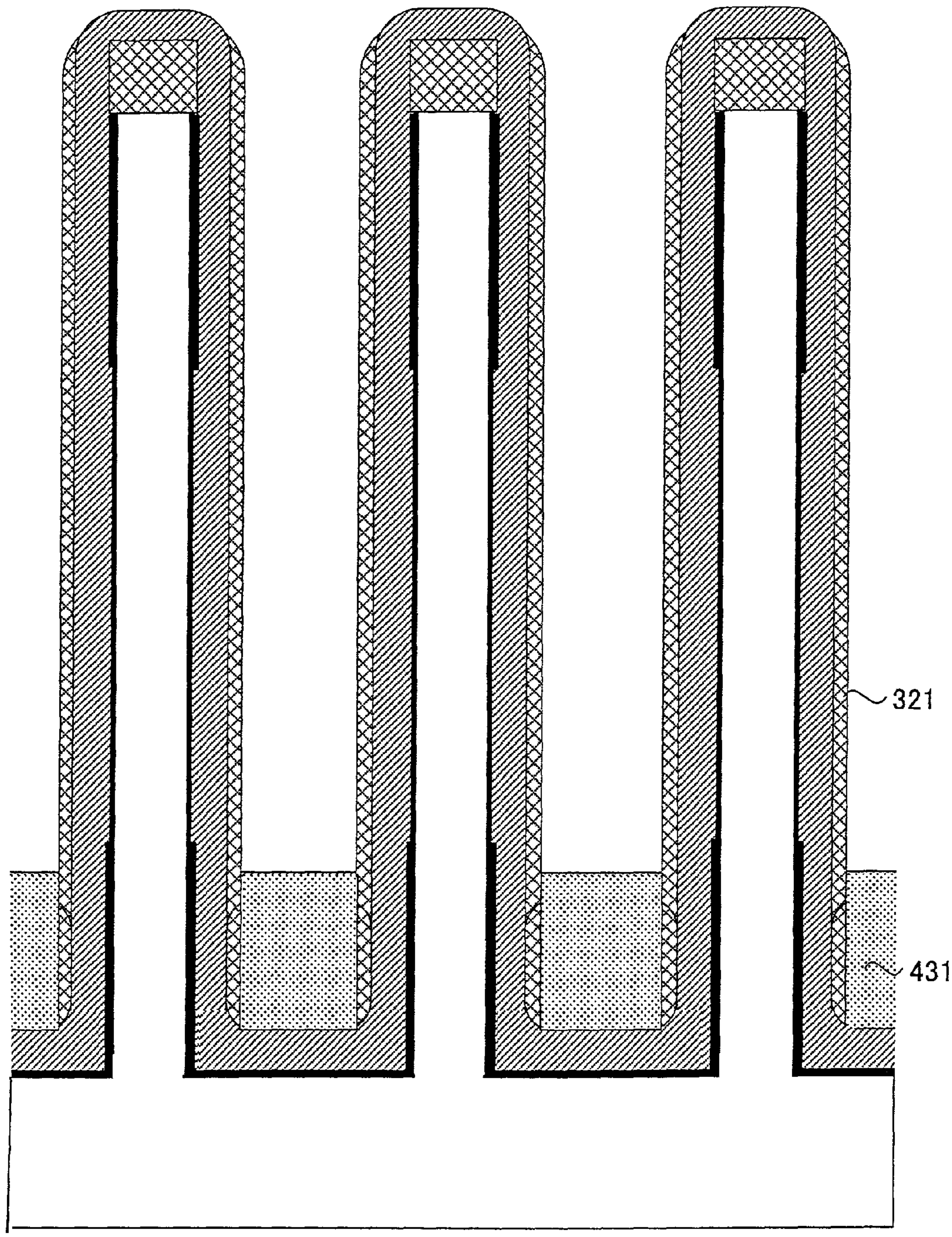
Figure 378:
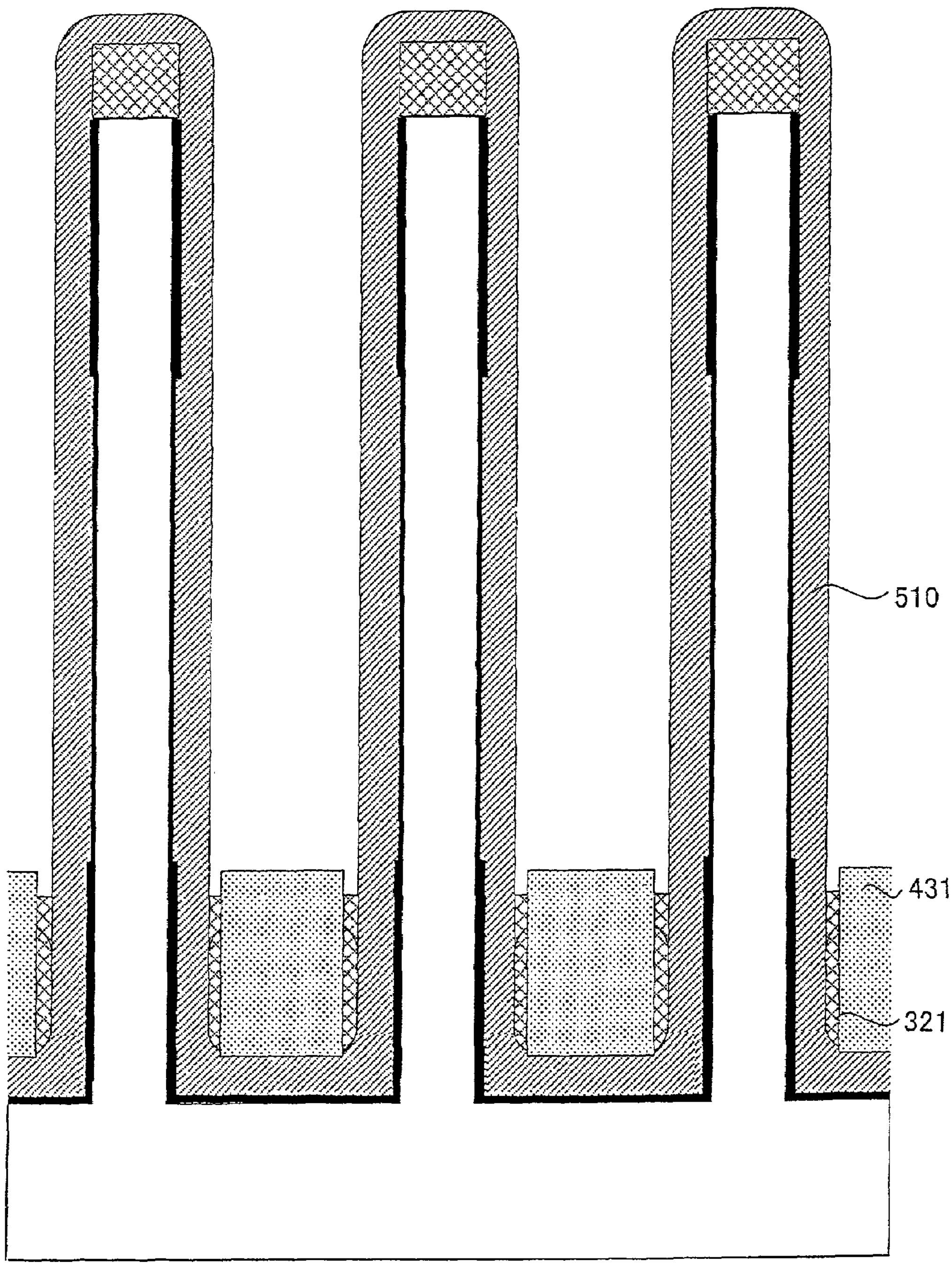
Figure 379:
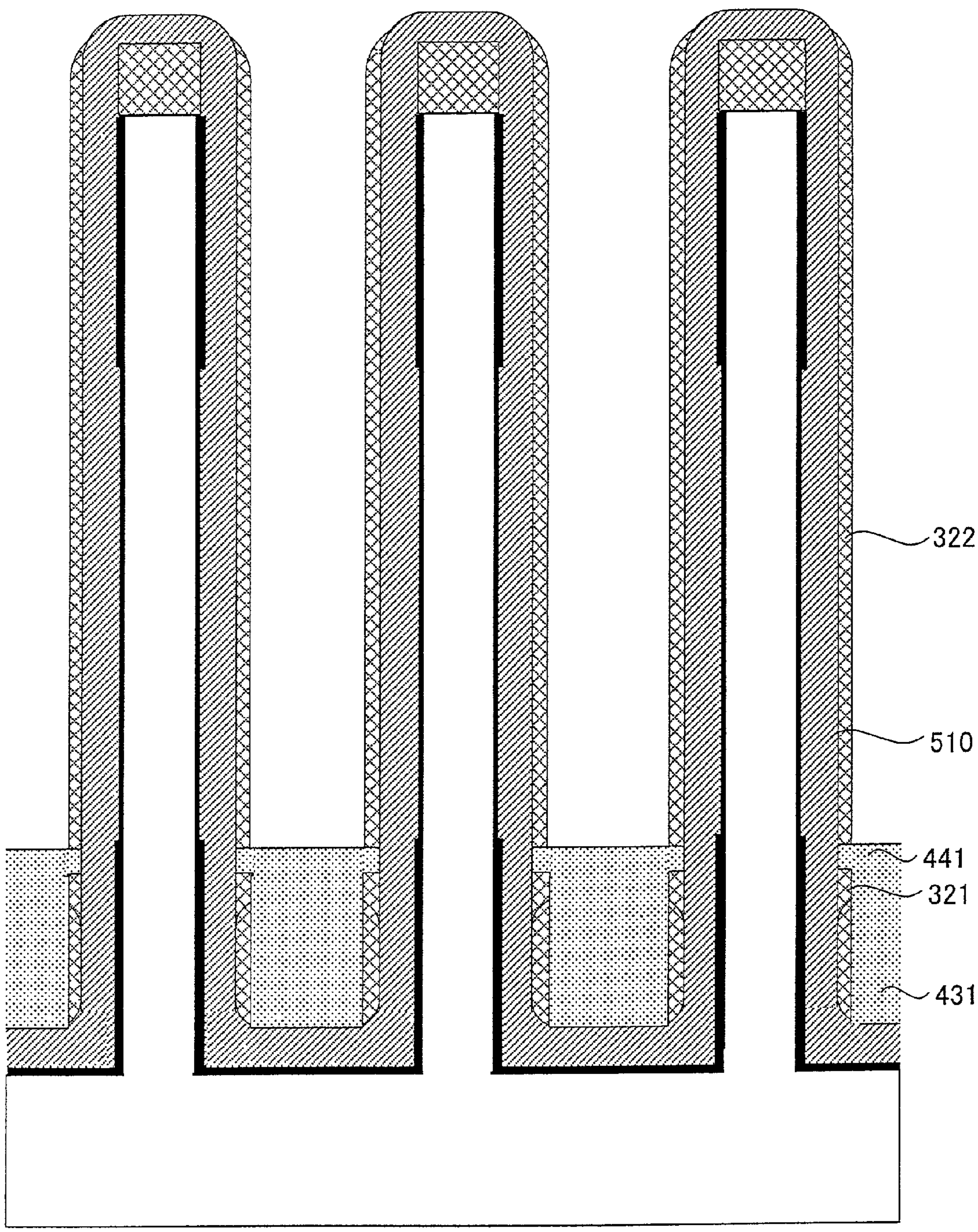
Figure 380:
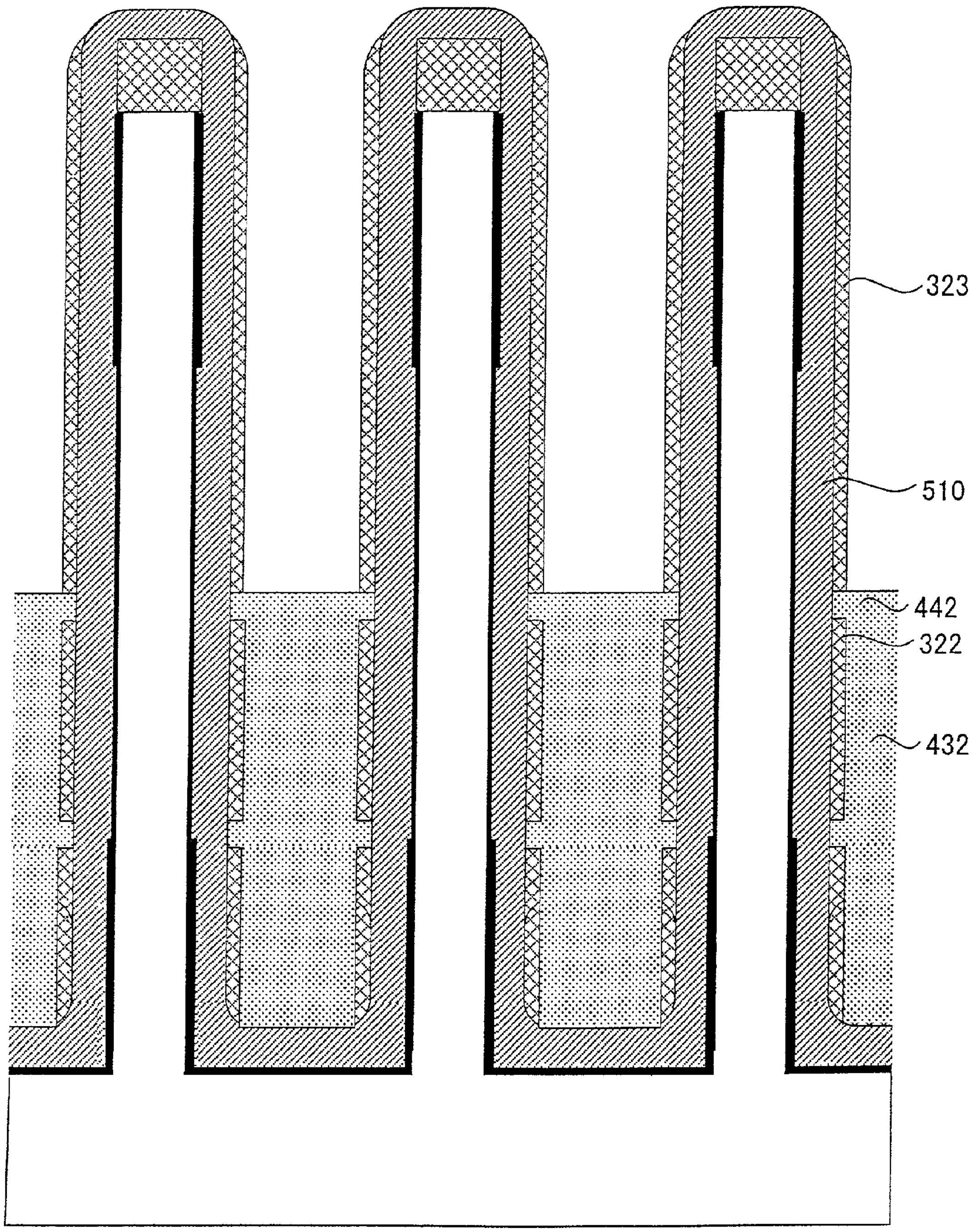
Figure 381:
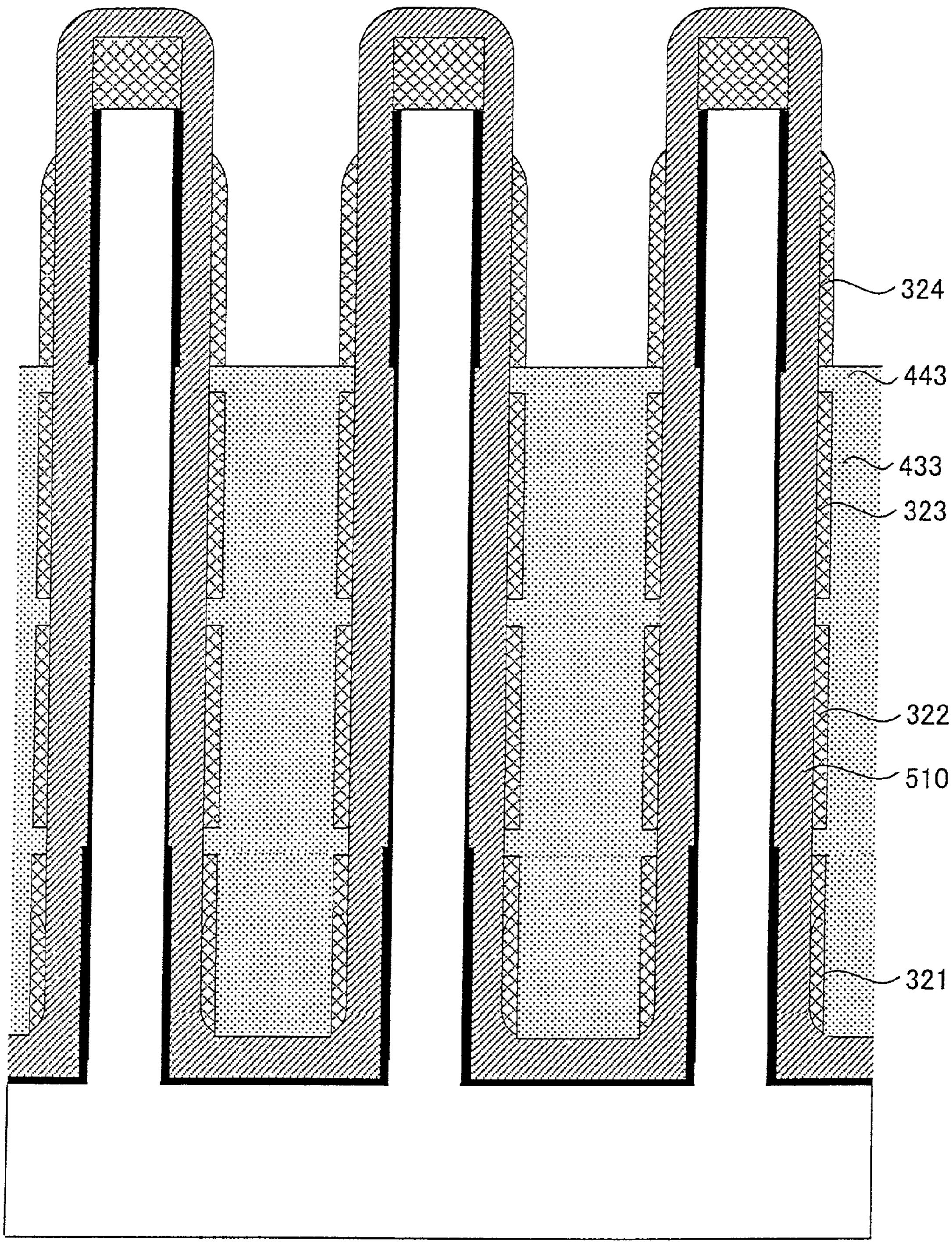
Figure 382:
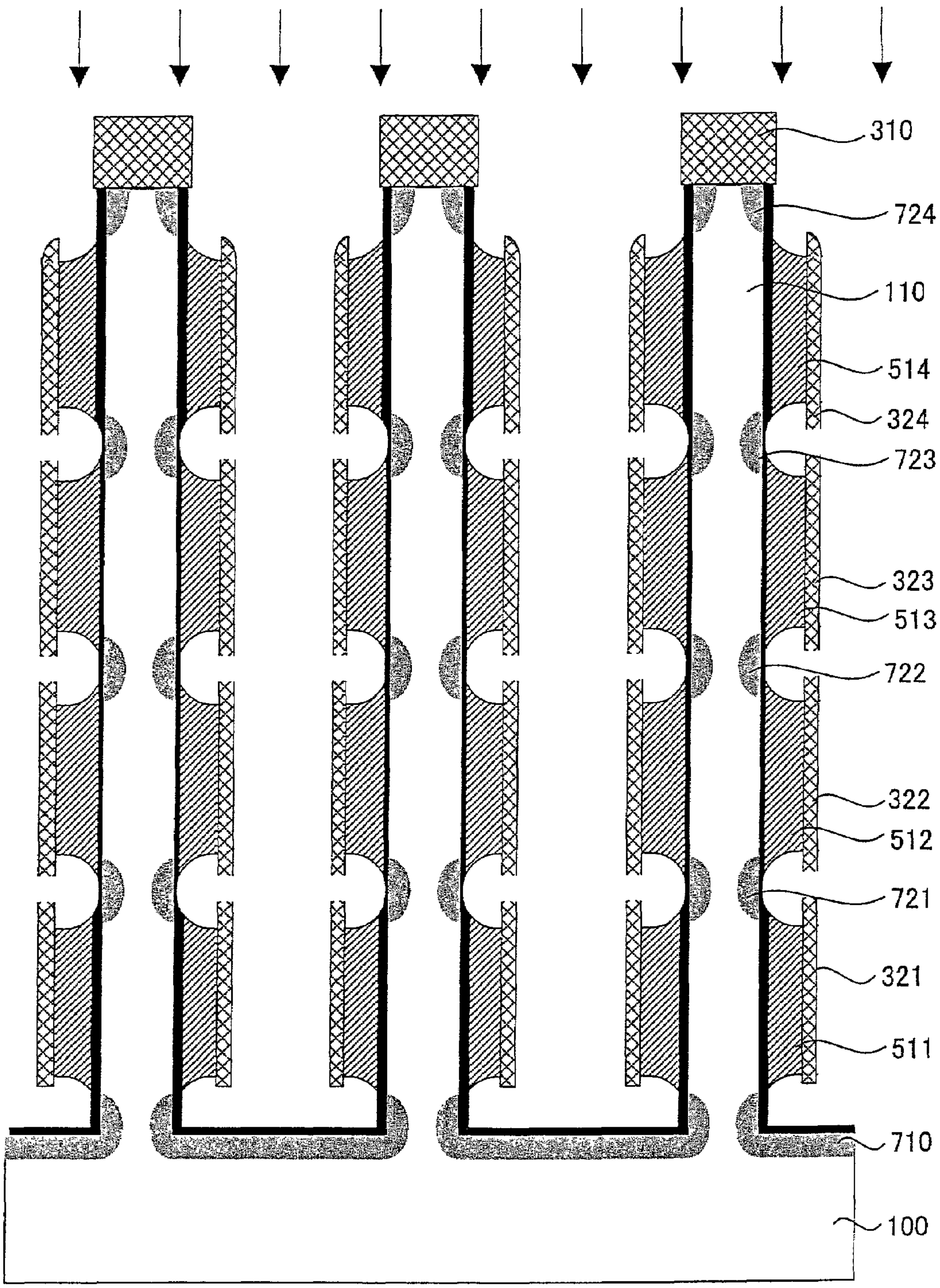
Figure 383:
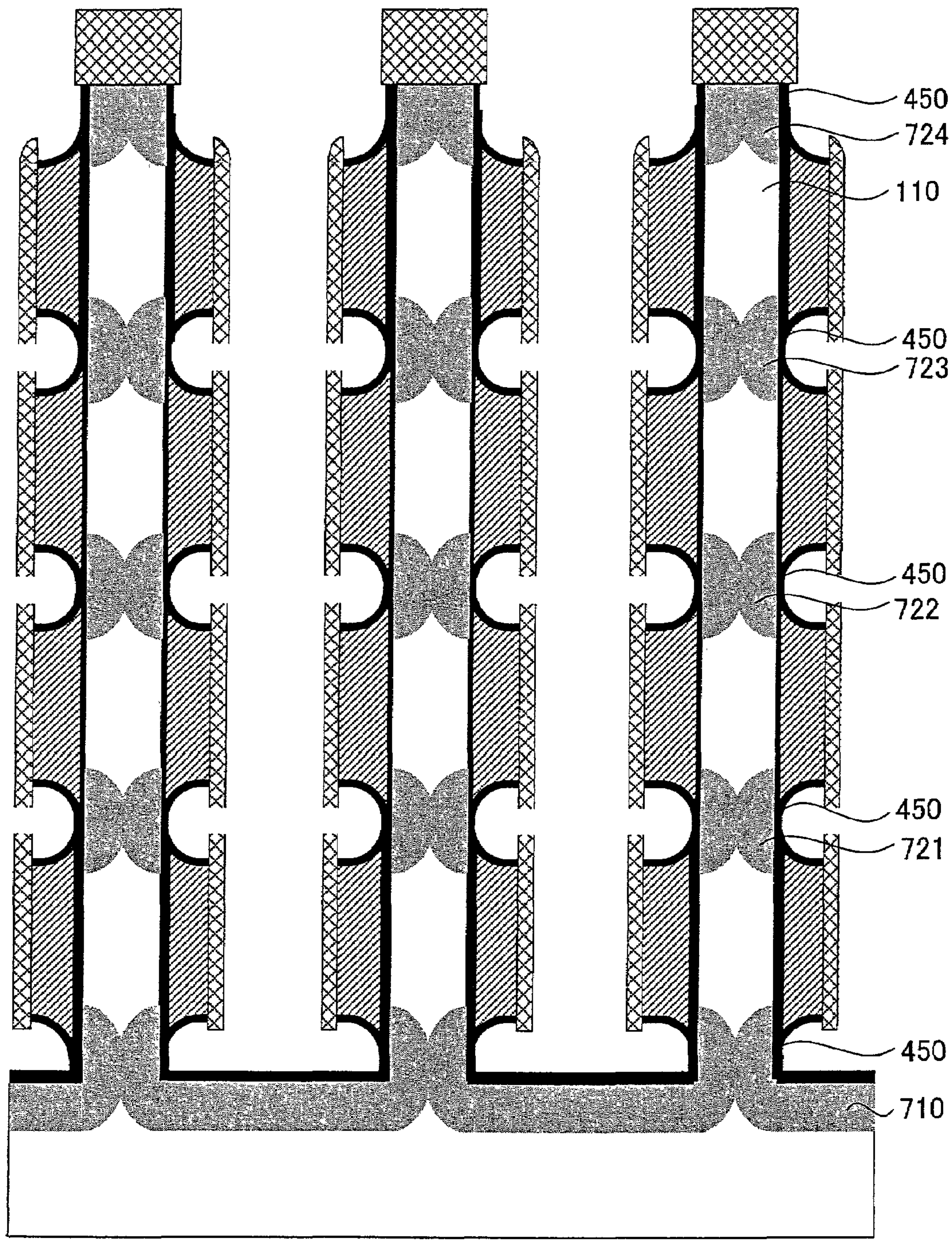
Figure 384:
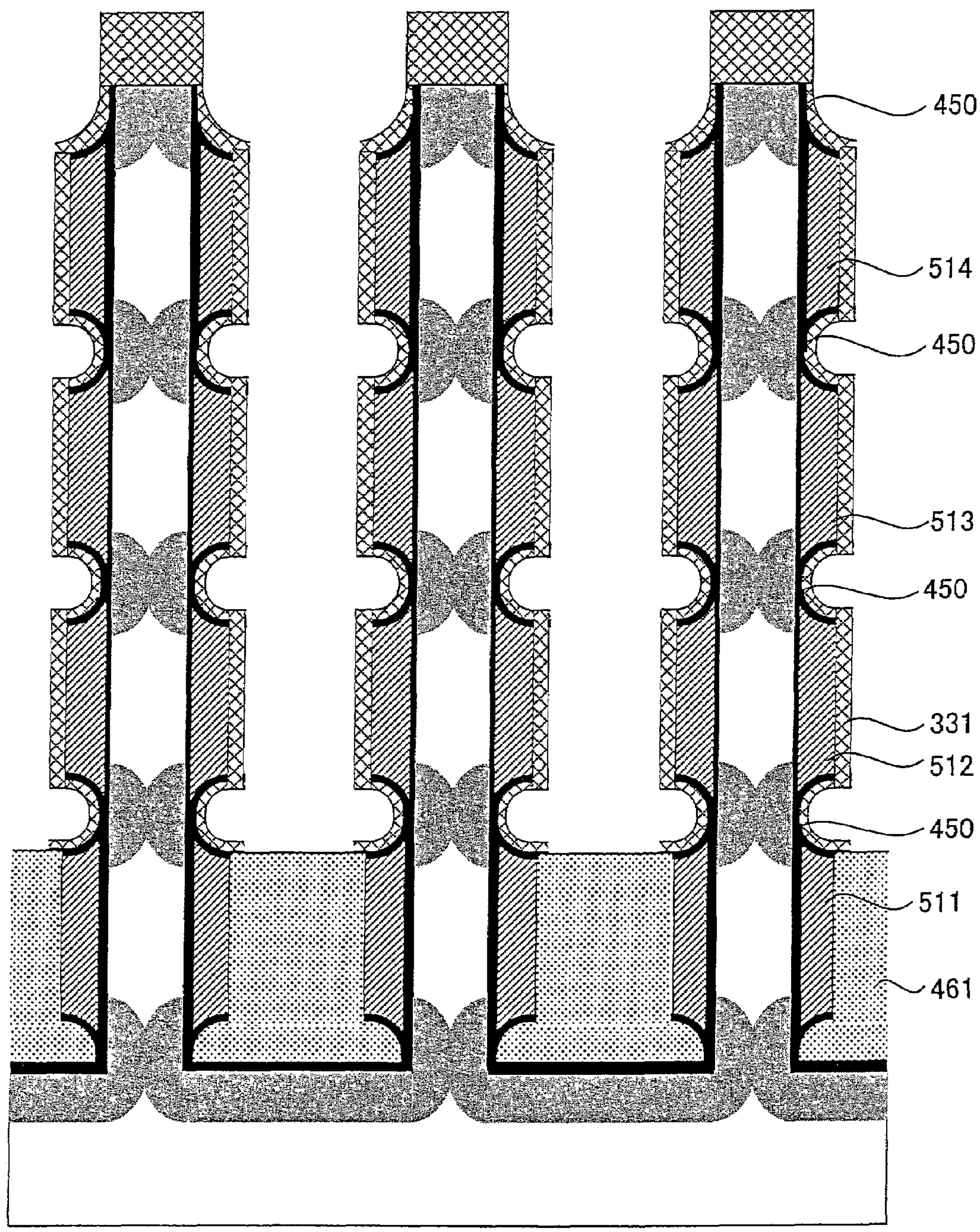
Figure 385:
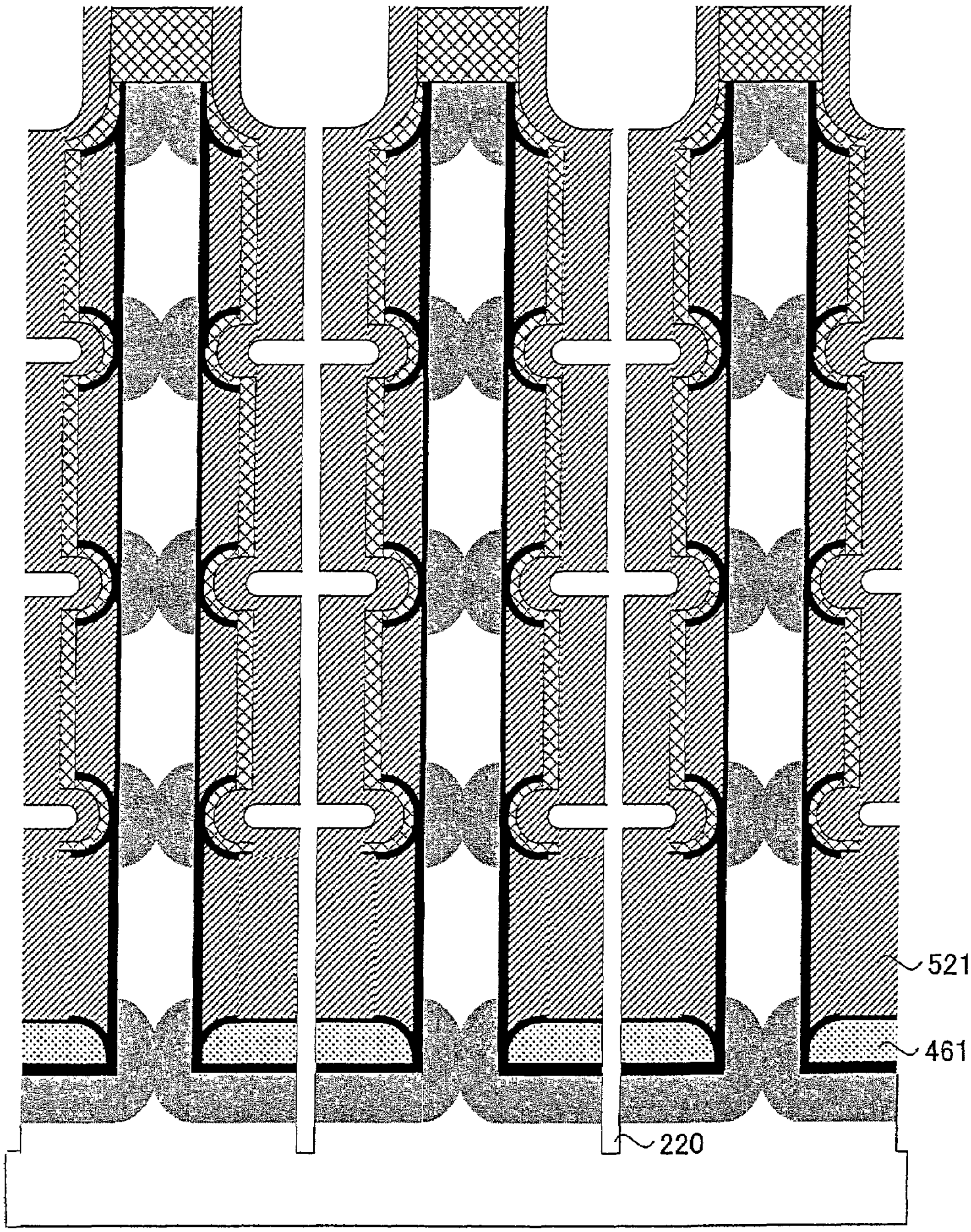
Figure 386:
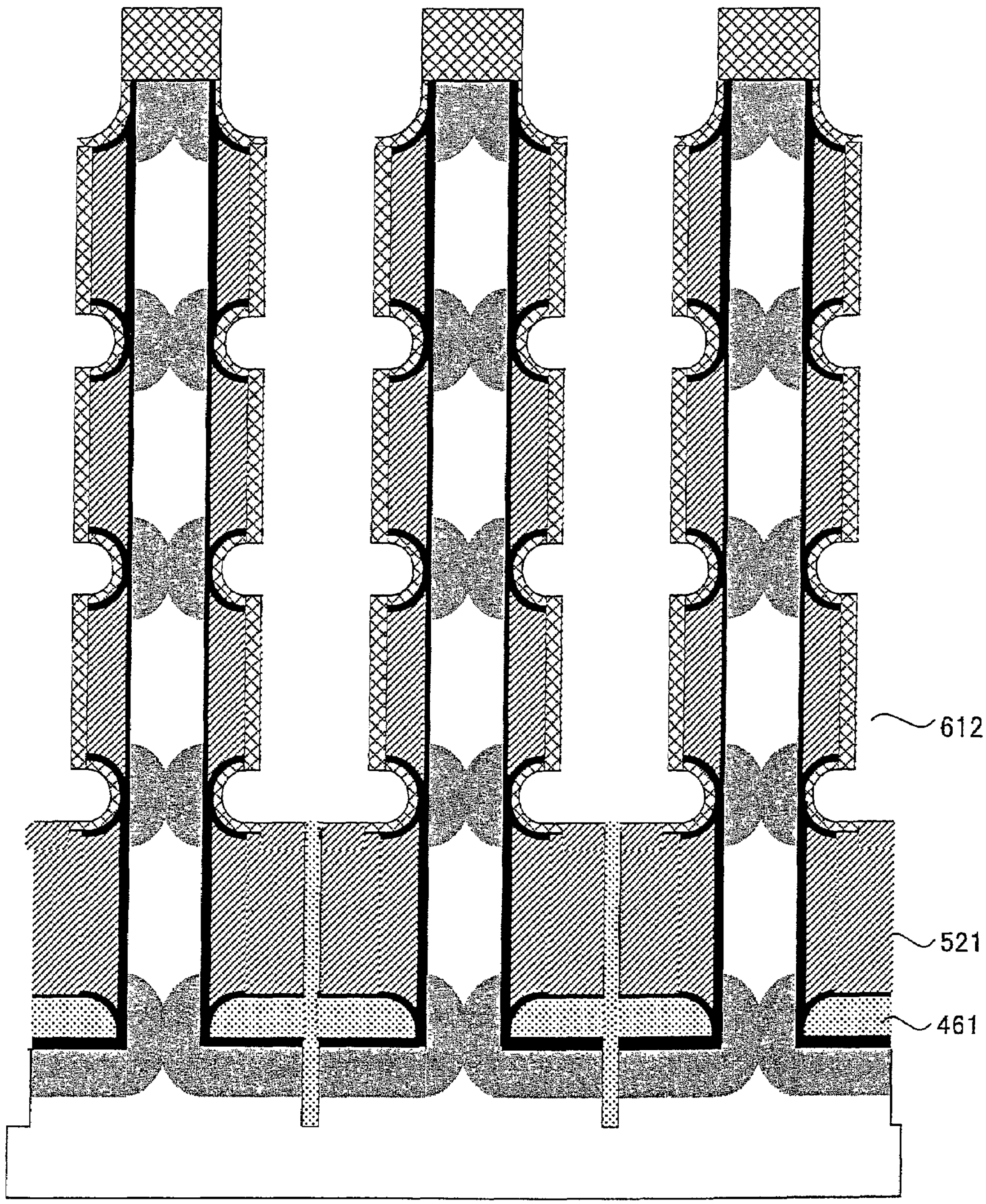
Figure 387:
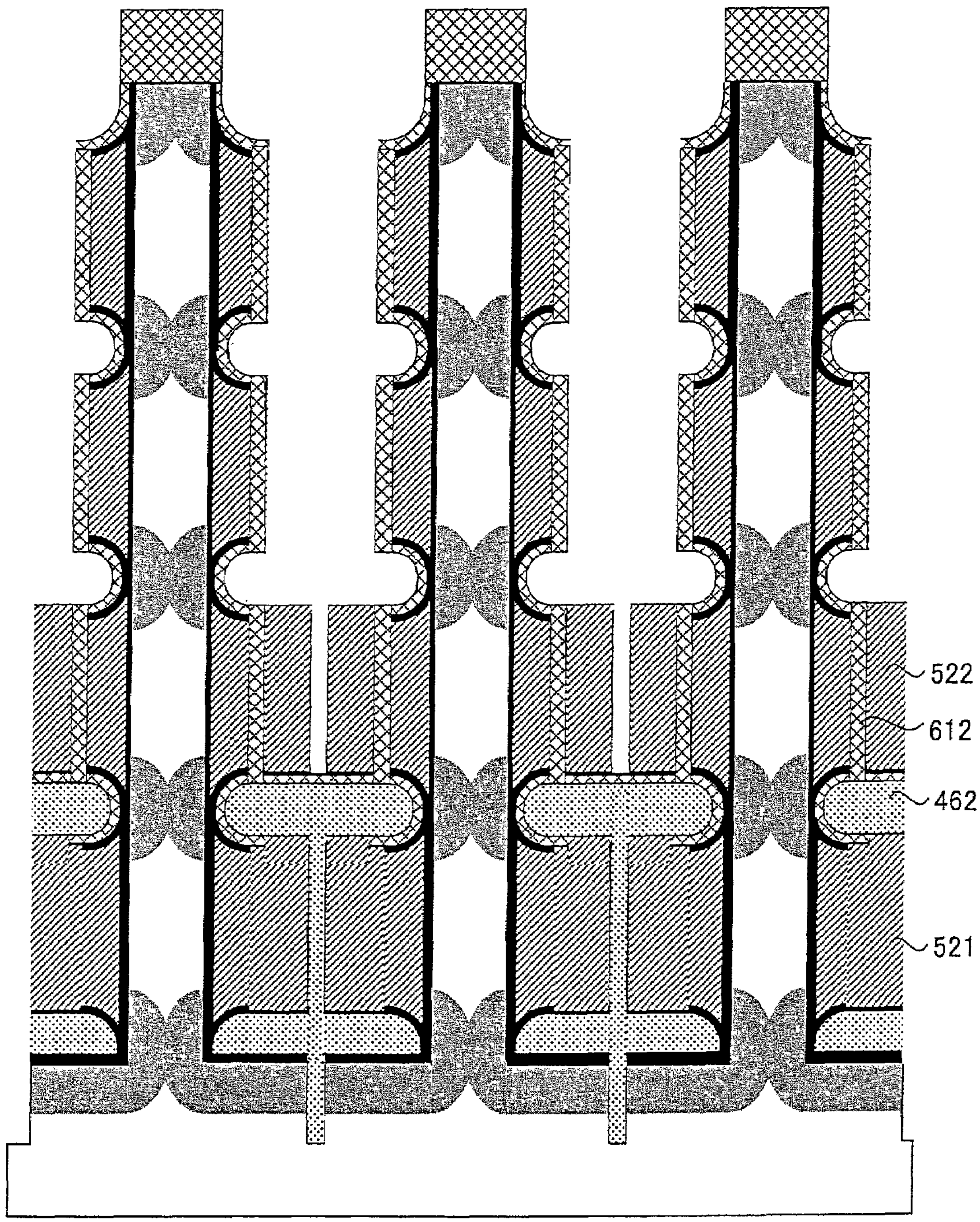
Figure 388:
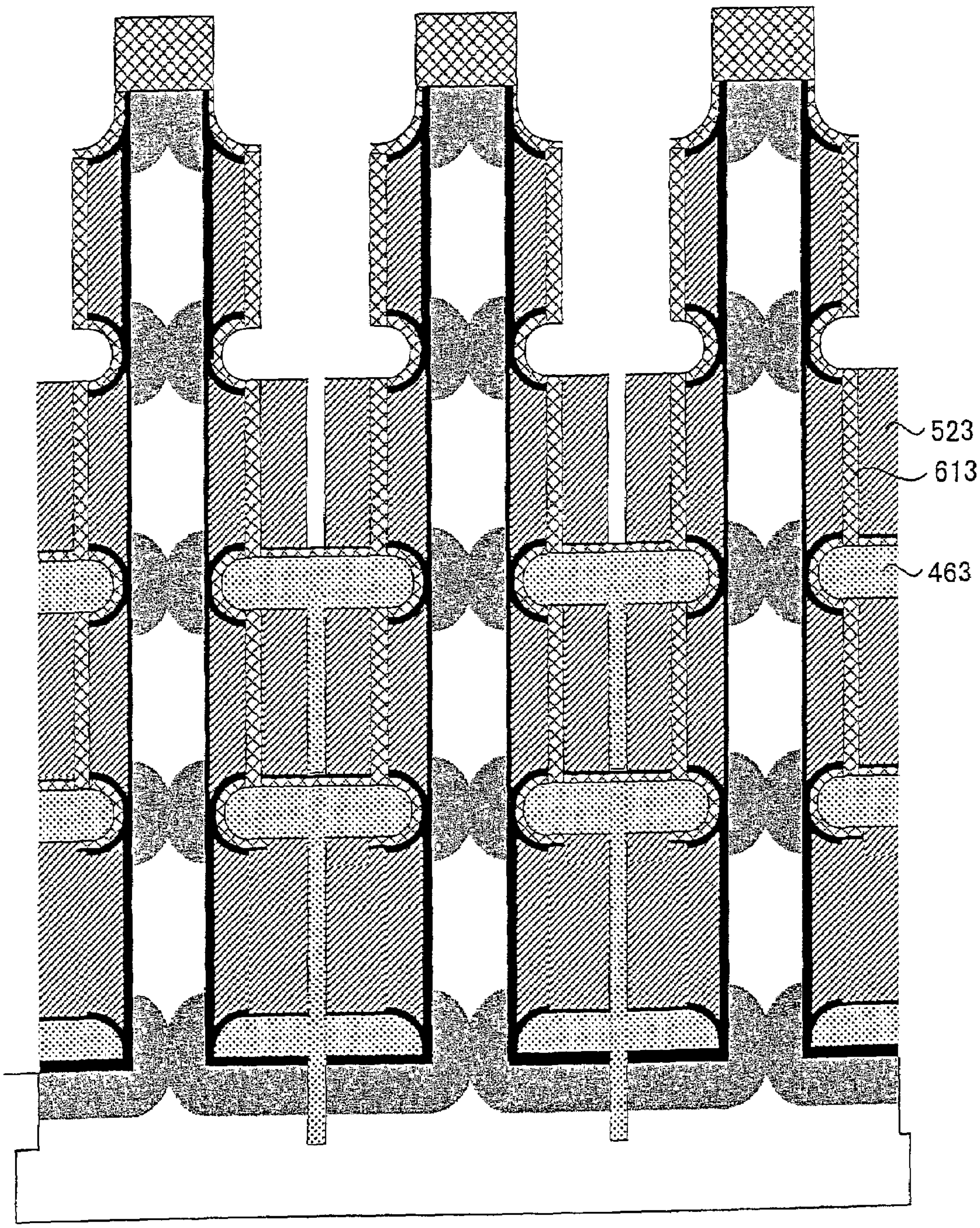
Figure 389:
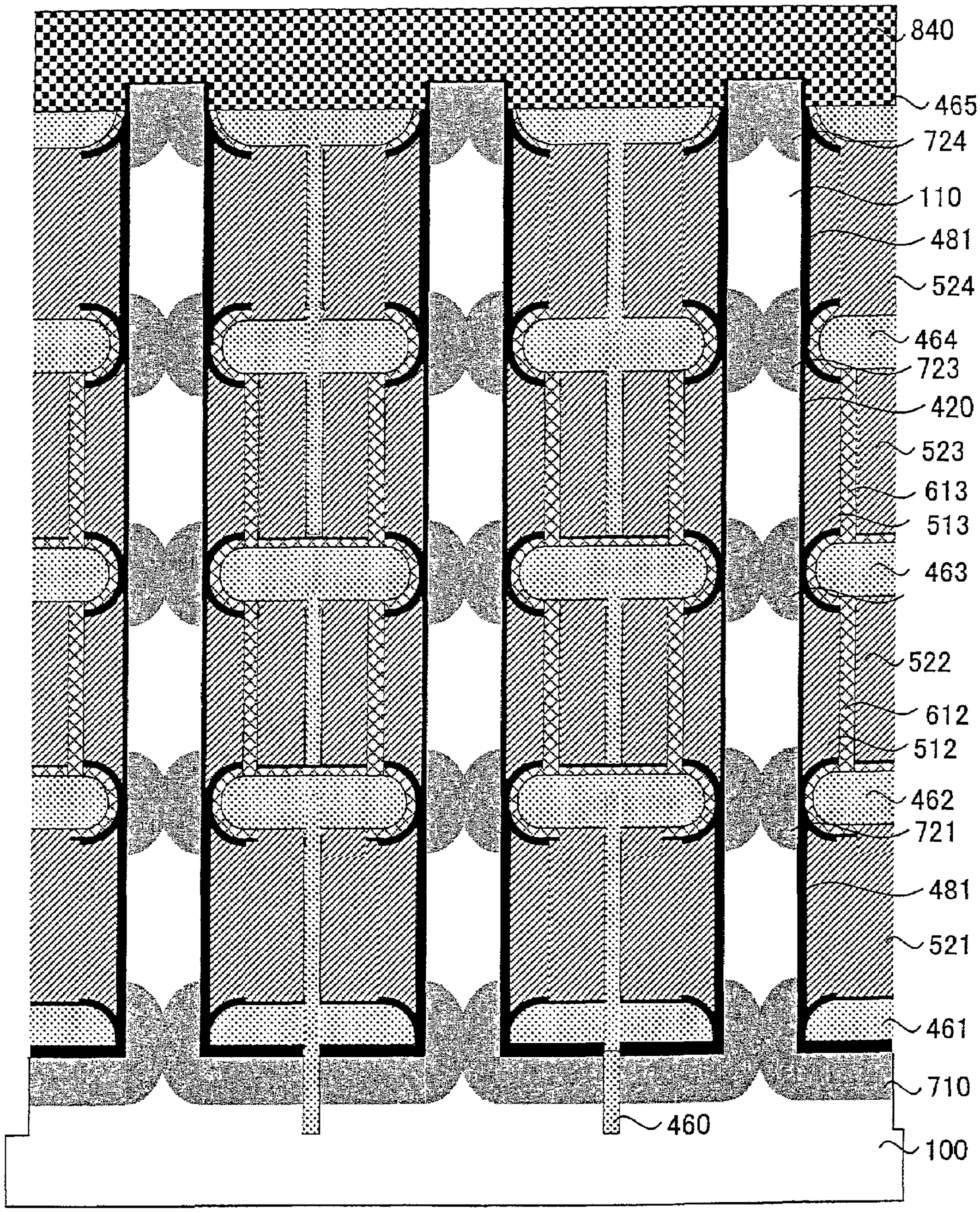

Next, the sidewall spacer 340 of the silicon nitride film (the twelfth insulating film) is removed by isotropic etching. An oxide film 420 is formed as a third insulating film to be a tunnel oxide film in a thickness of about 10 nm around each island-like semiconductor layer 110, for example, by thermal oxidation. At this time, the oxide film 480 is thickened to be an oxide film 481, which is thicker than the tunnel oxide film 420. The thickness of the oxide film 481 can be optionally set by the thicknesses of the oxide film 480 and the tunnel oxide film 420 (FIG. 353 and FIG. 373). The tunnel oxide film may be not only a thermally oxidized film but a CVD oxide film or a nitrogen oxide film. A first conductive film, for example, a polysilicon film 510, is deposited to about 50 to 200 nm.

Production steps thereafter (FIGS. 354 to 369 and FIGS. 374 to 389) follow Production Example 1 (FIGS. 282 to 298 and FIGS. 302 to 317).

In addition to the films of the previous examples, films formed on the surface of the semiconductor substrate such as the silicon nitride film (the twelfth insulating film) 340 may be a layered film of a silicon oxide film/a silicon nitride film from the silicon surface.

The same effect as obtained by Production Example 1 can be obtained by this example.

In contrast to the above-described production example (FIGS. 350 to 369 and FIGS. 370 to 389), the silicon oxide film (the eighth insulating film) 461 may be buried by anisotropic etching.

A particular example of production steps is now described in the case where the silicon oxide film 461 is buried by anisotropic etching. FIGS. 390 to 394 and FIGS. 395 to 399 are sectional views taken on line A–A' and line B–B', respectively, in FIG. 1 which is a plan view illustrating a memory cell array of an EEPROM.

In this example, production steps until the silicon nitride film 461 is deposited to a thickness of 50 to 500 nm by CVD are the same as those in the above-described production example (FIGS. 350 to 369 and FIGS. 370 to 389).

Figure 390:
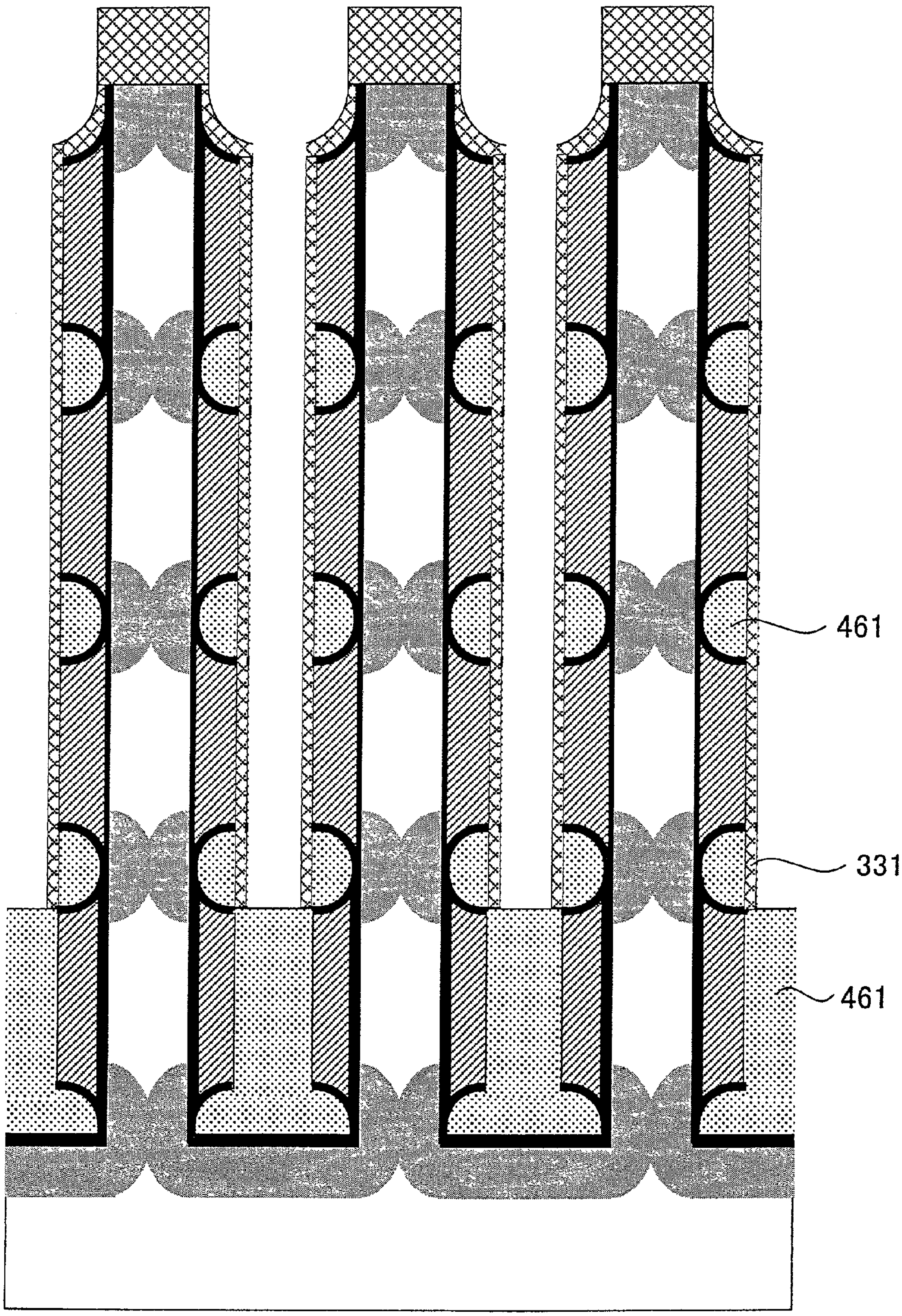
FIG. 390 to FIG. 394 are sectional views (taken on line A–A' in FIG. 1) illustrating production steps of Production Example 4 for producing a semiconductor memory in accordance with the present invention.
Figure 391:
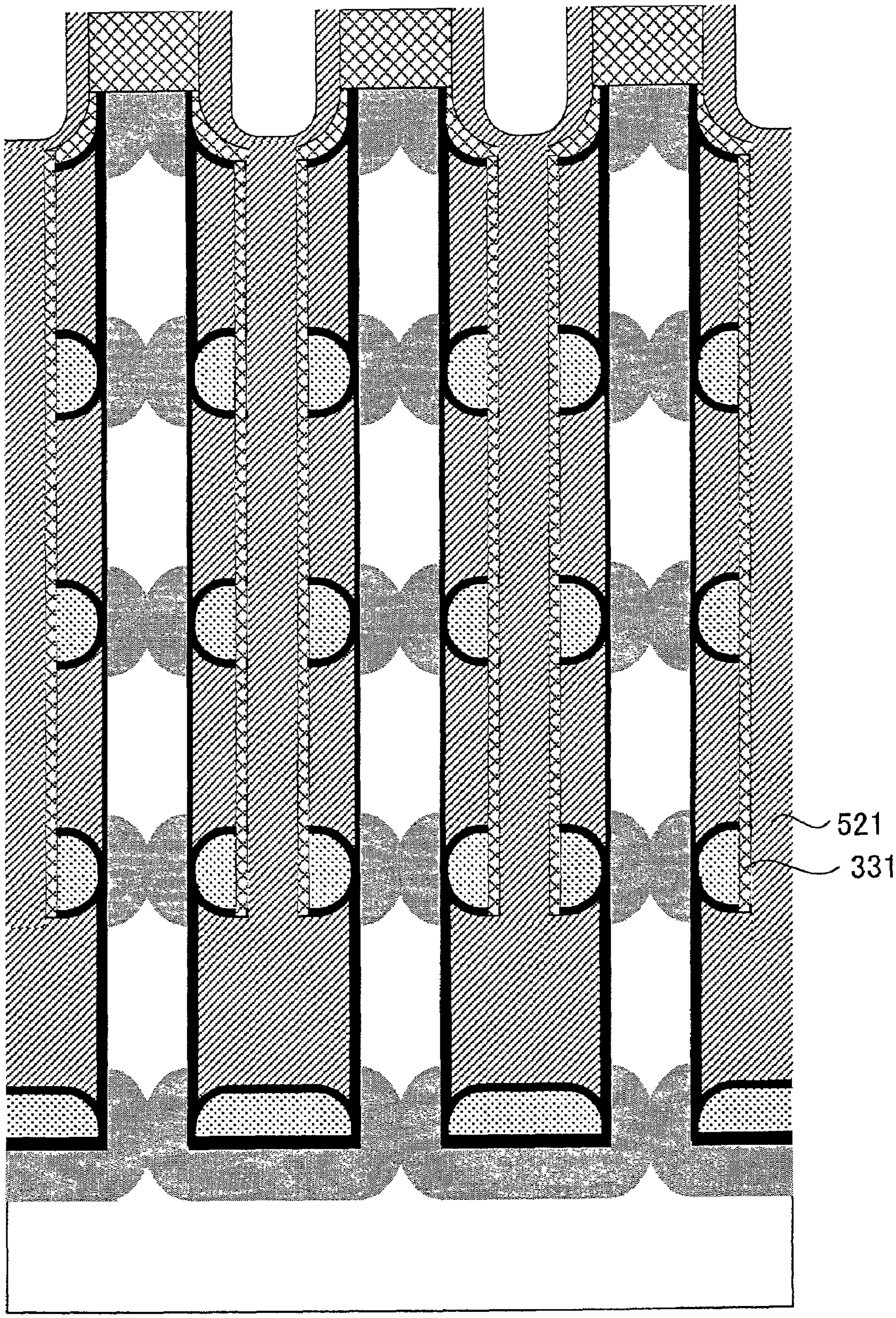
Figure 392:
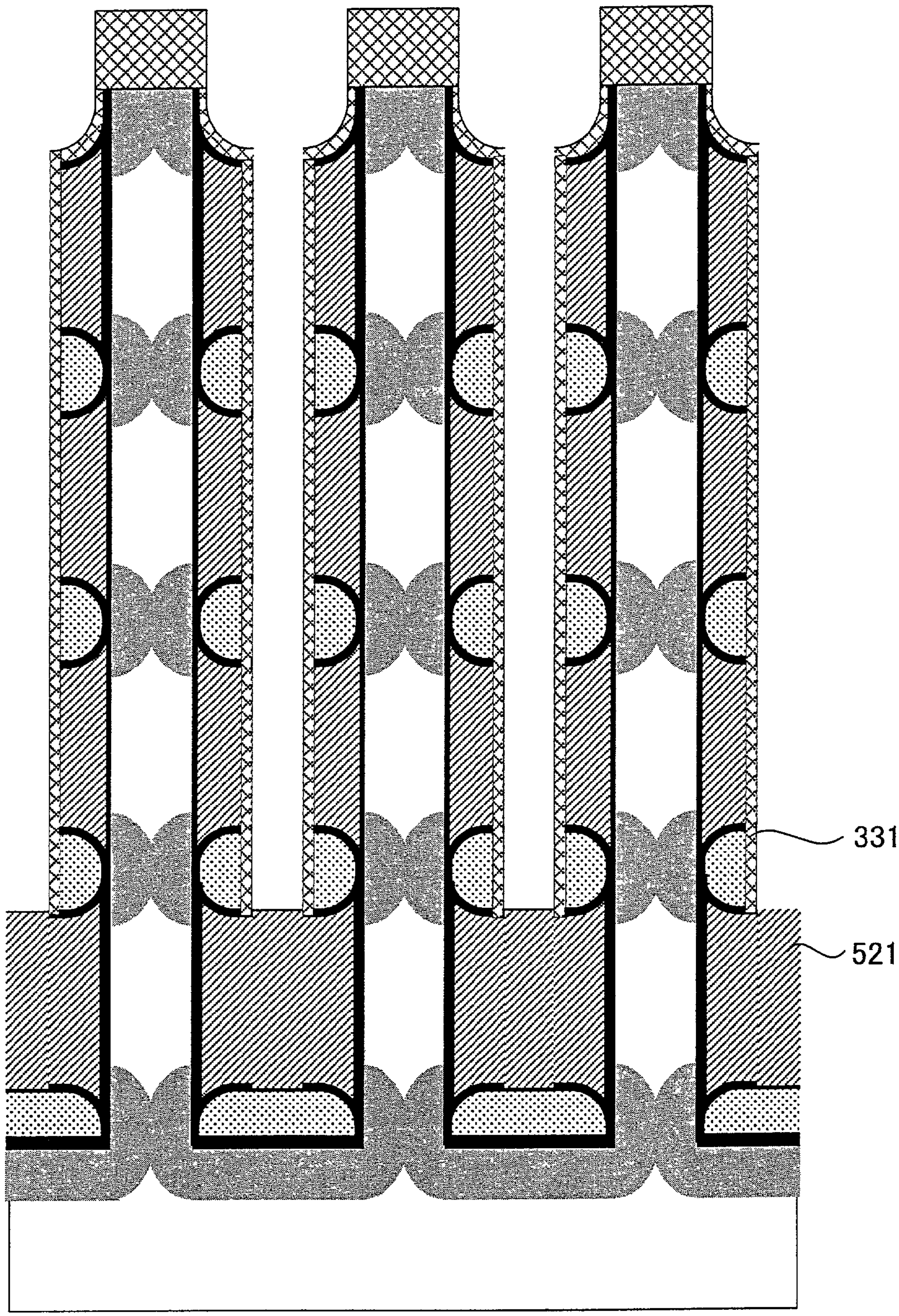
Figure 393:
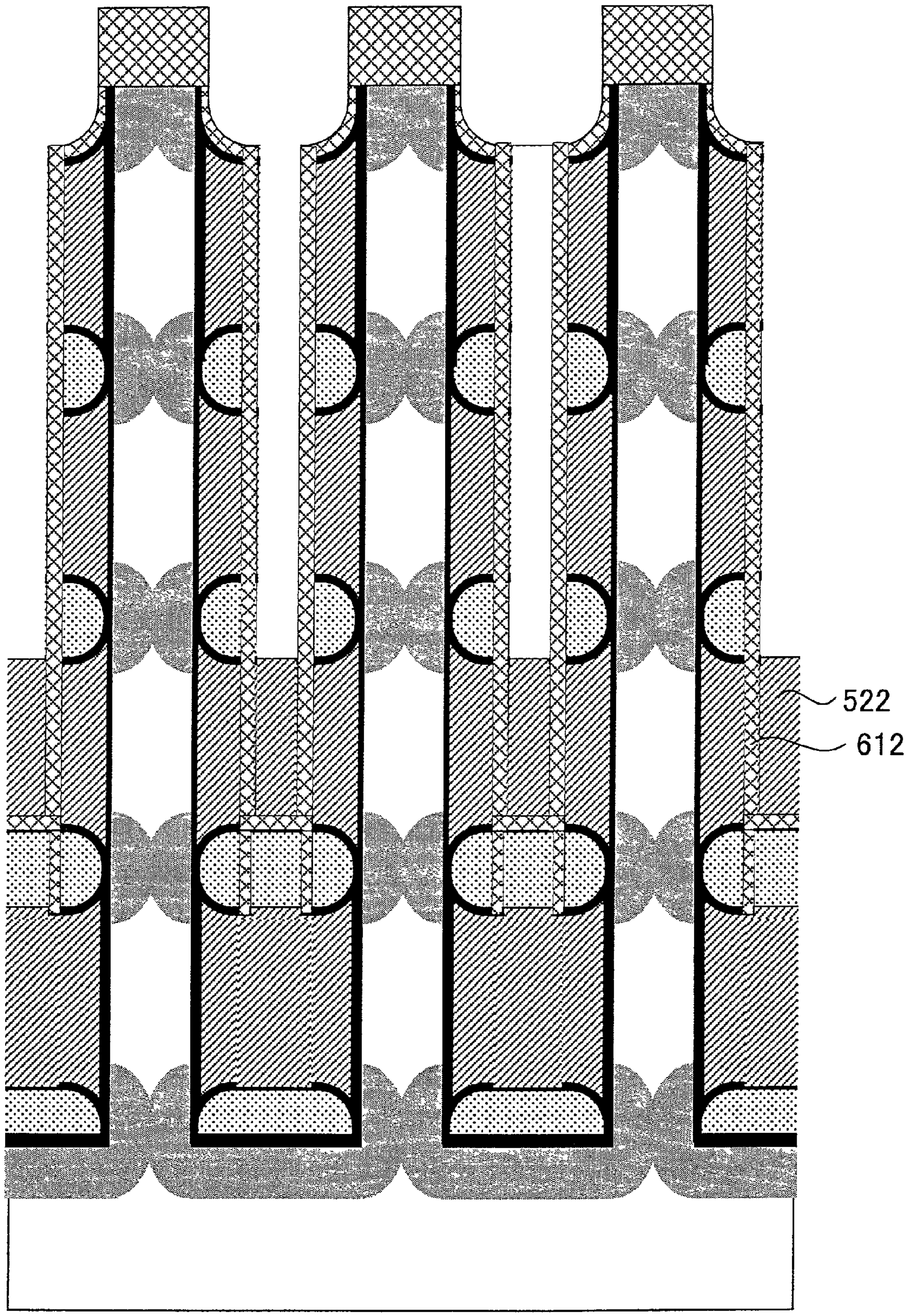
Figure 394:
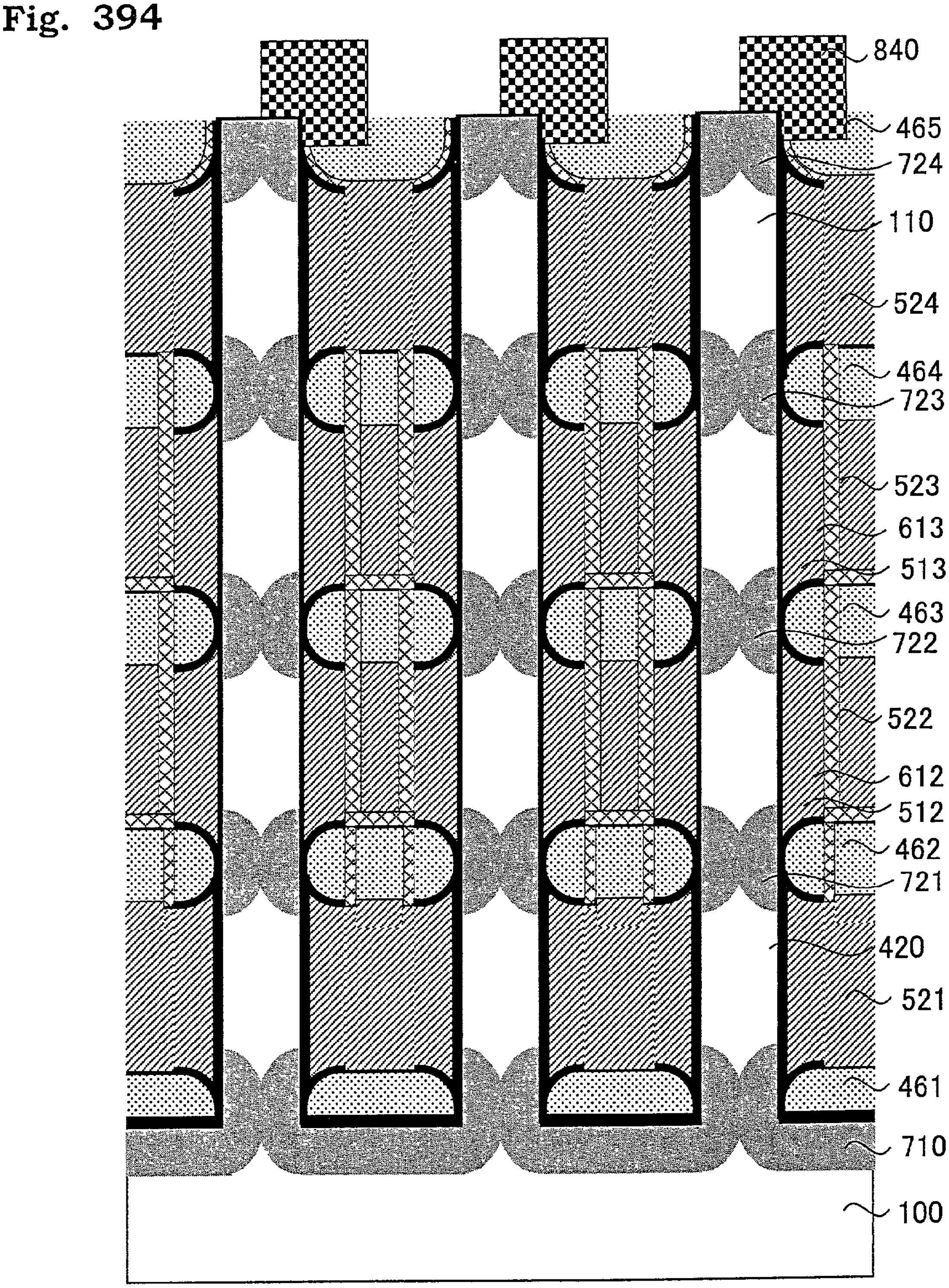
Figure 395:
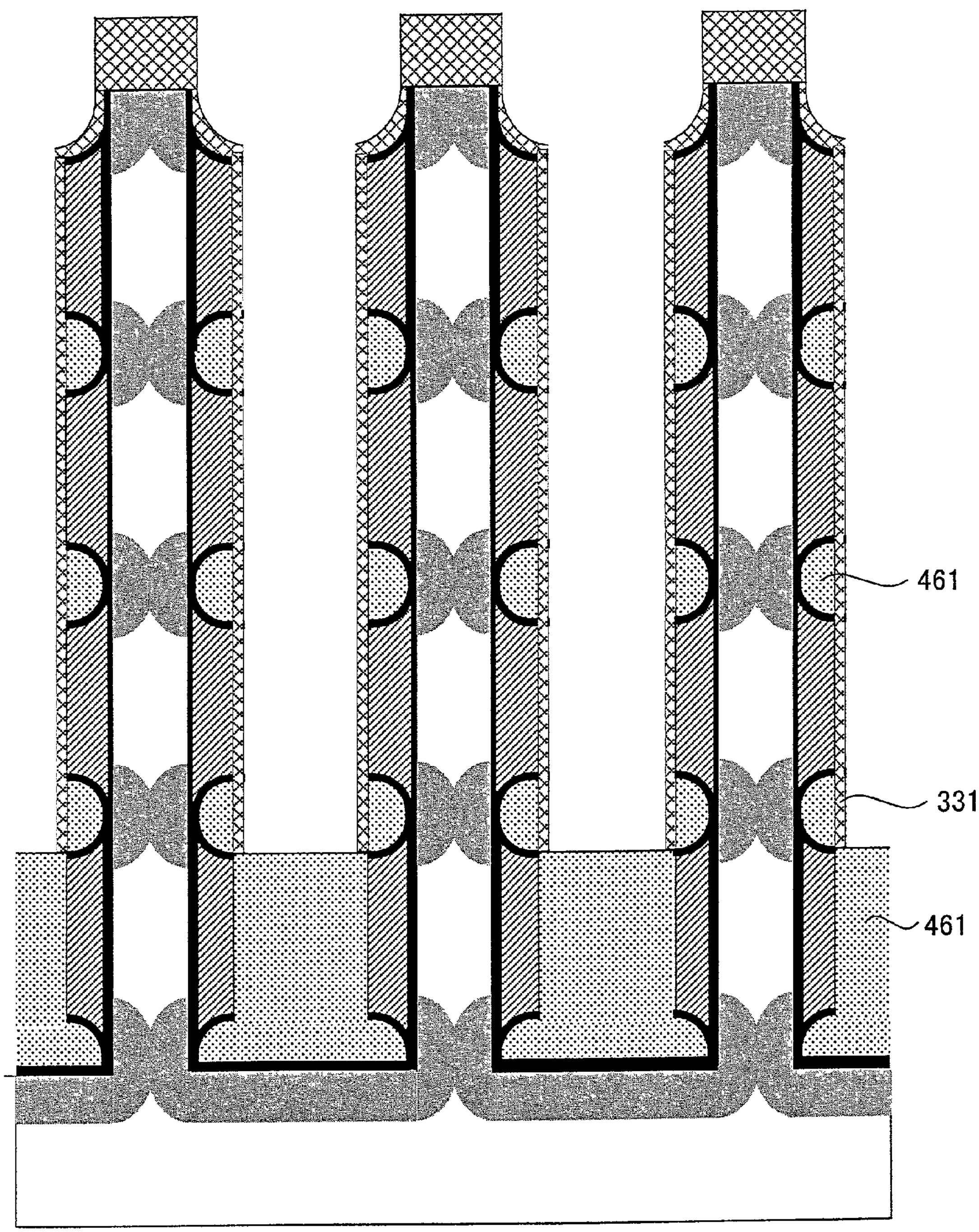
FIG. 395 to FIG. 399 are sectional views (taken on line B–B' in FIG. 1) illustrating production steps of Production Example 4 for producing a semiconductor memory in accordance with the present invention.
Figure 396:
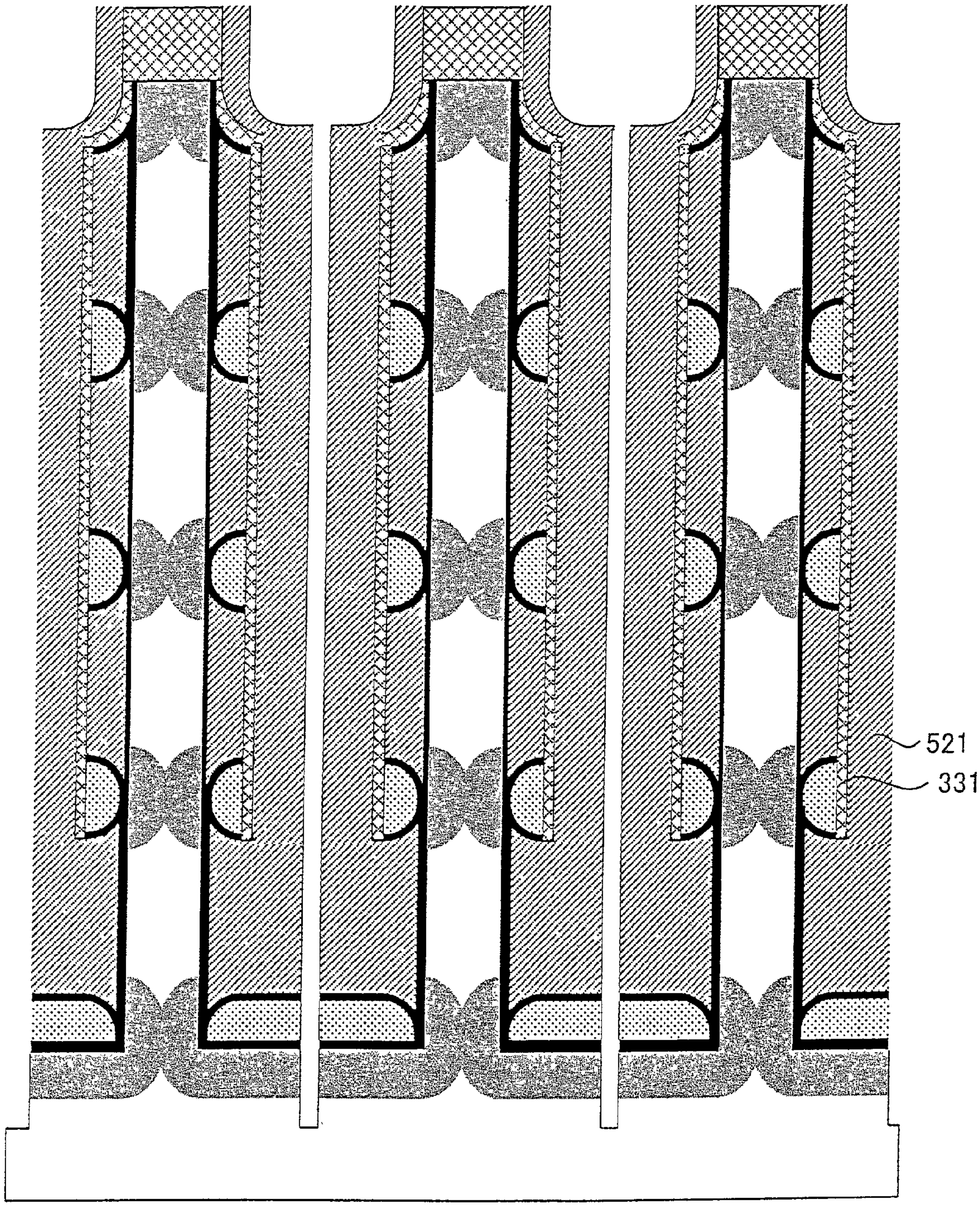
Figure 397:
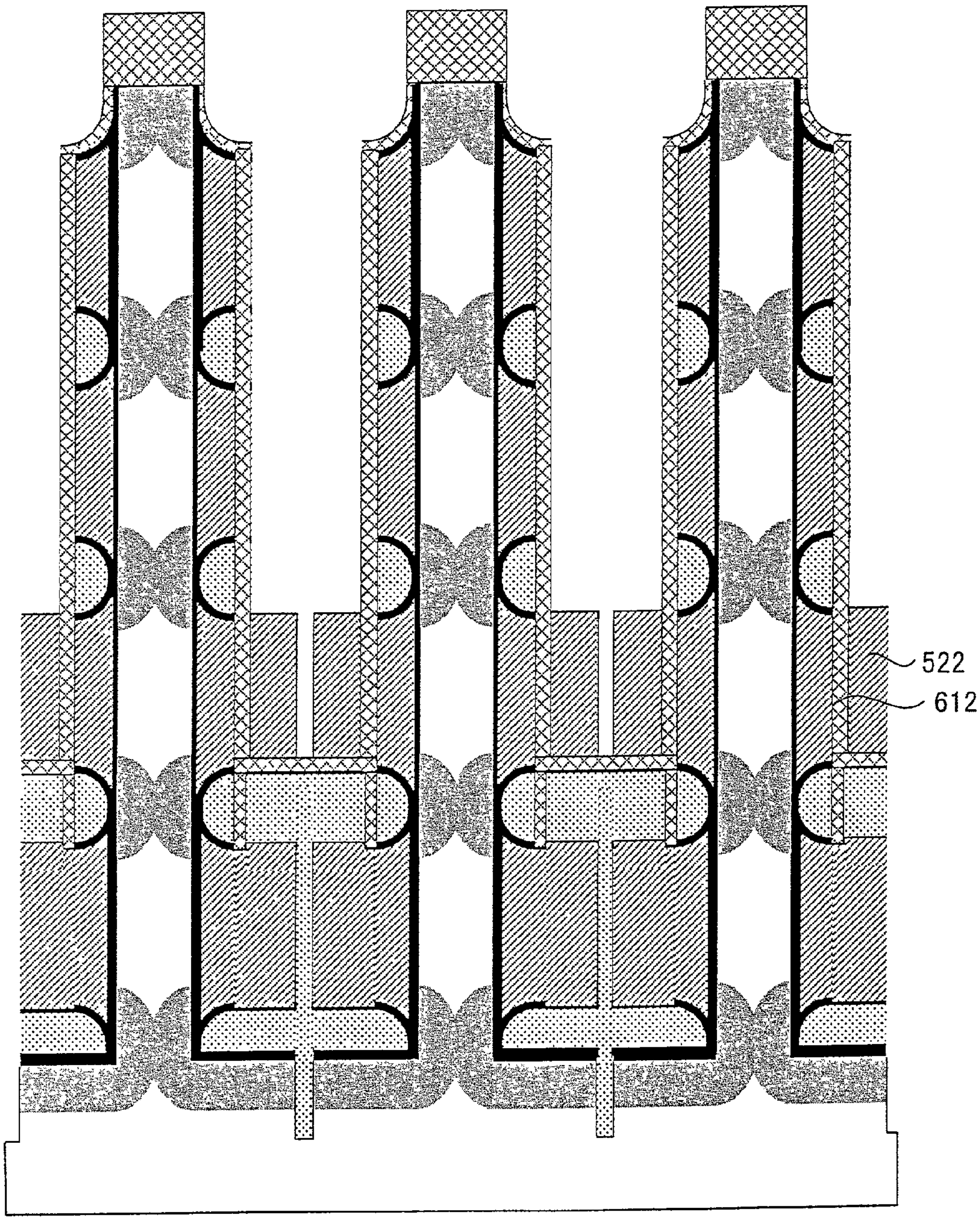
Figure 398:
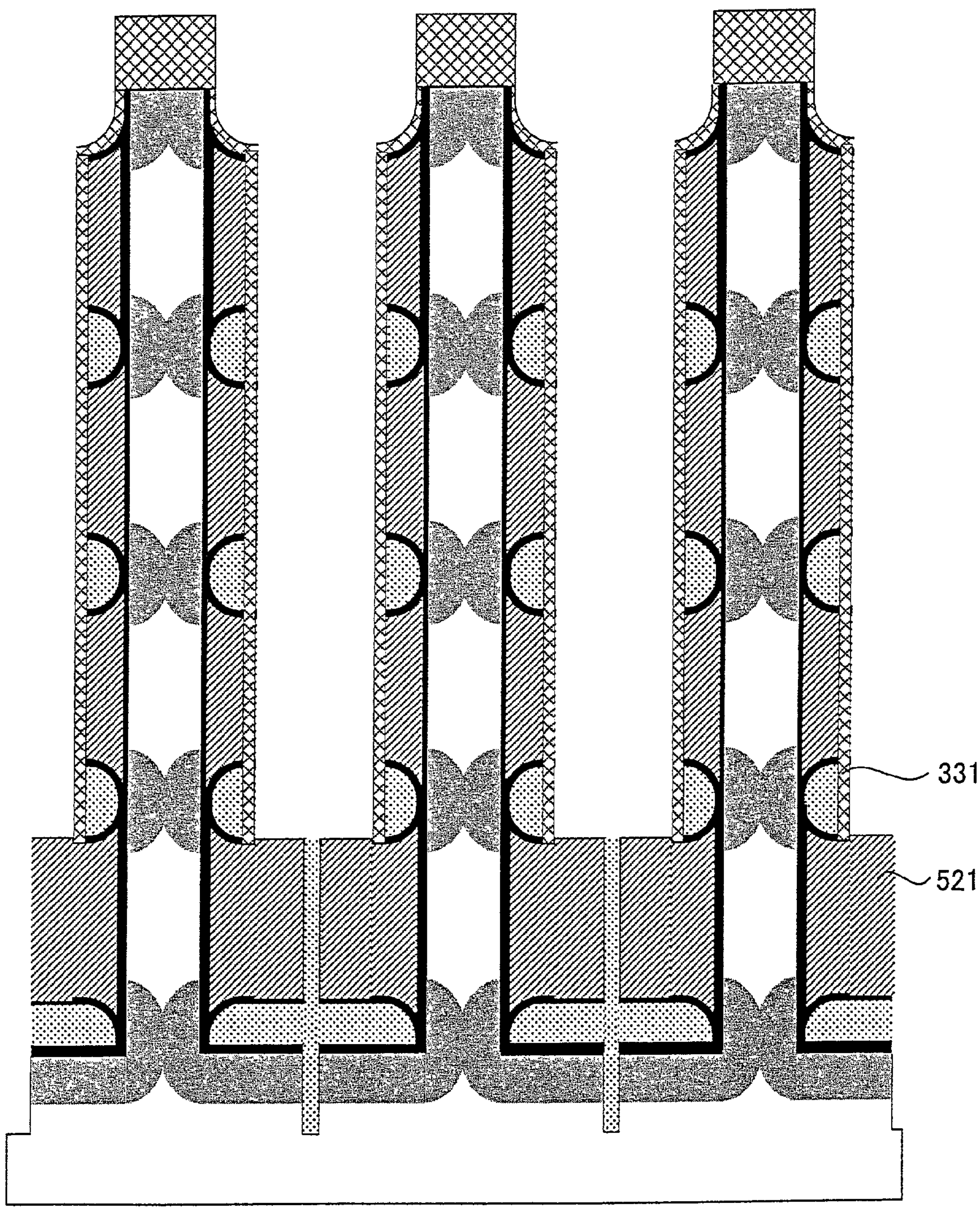
Figure 399:
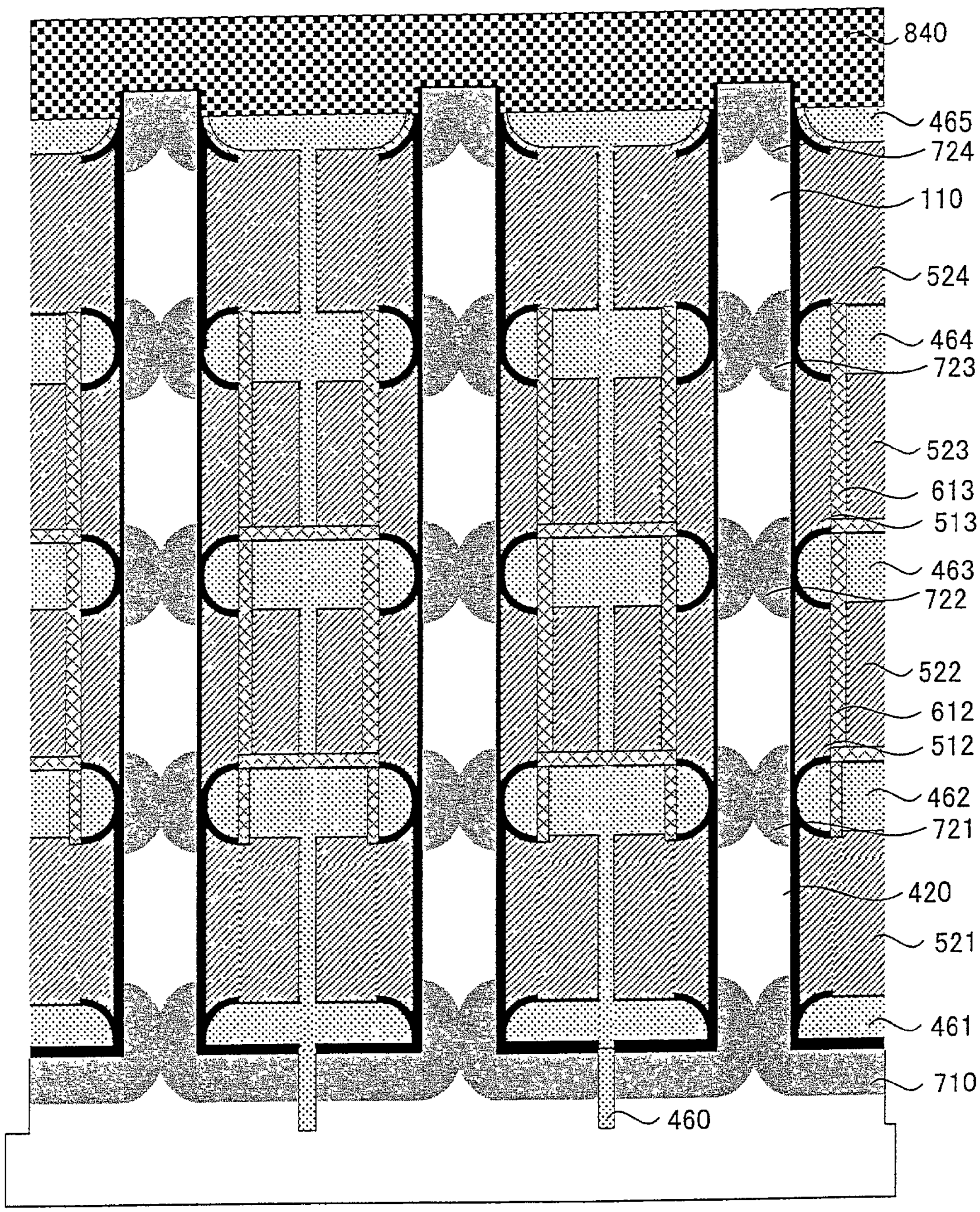

Thereafter, the silicon nitride film 461 is buried by anisotropic etching (FIG. 390 and FIG. 395). In this case, as shown in FIG. 390 and FIG. 395, the silicon nitride films 461 remains in recesses between polysilicon films (the first conductive films) 511 and 512, between polysilicon films (the first conductive films) 512 and 513 and between polysilicon films (the first conductive films) 513 and 514.

Next, a ninth insulating film, for example, a silicon nitride film 331, is deposited to a thickness of 5 to 50 nm on the polysilicon films 512 to 514 and the silicon oxide film (the seventh insulating film) 450.

Production steps thereafter (FIGS. 391 to 394 and FIGS. 369 to 399) follow the above-described production example.

Since the silicon nitride films 461 remains in the recesses between the polysilicon films 511 and 512, between the polysilicon films 512 and 513 and between the polysilicon films 513 and 514, it is possible to etch back the polysilicon films (second conductive films) 521 to 524 by anisotropic etching).

Thereby, the same effect as obtained by the previous examples can be obtained by this production example.

PRODUCTION EXAMPLE 5

In a semiconductor memory to be produced in this example, a semiconductor substrate to which an oxide film is inserted, for example, a semiconductor portion on an oxide film of an SOI substrate, is patterned in the form of pillars to form island-like semiconductor layers. Sides of the island-like semiconductor layers make active regions. A plurality of tunnel oxide films and floating gates as charge storage layers are formed on the active regions. The island-like semiconductor layers are each in an electrically floating state with respect to the semiconductor substrate. The active region of each memory cell is in the electrically floating state. Selection gate transistors are disposed at the top and the bottom of the island-like semiconductor layer. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. In this production example, the selection gate and the floating gate of the transistors are formed at the same time.

Such a semiconductor memory may be produced by the following production process. FIGS. 400 and 402 and FIGS. 401 and 403 are sectional views taken on line A–A' and line B–B', respectively, in FIG. 1 which is a plan view illustrating a memory cell array of an EEPROM.

Figure 400:
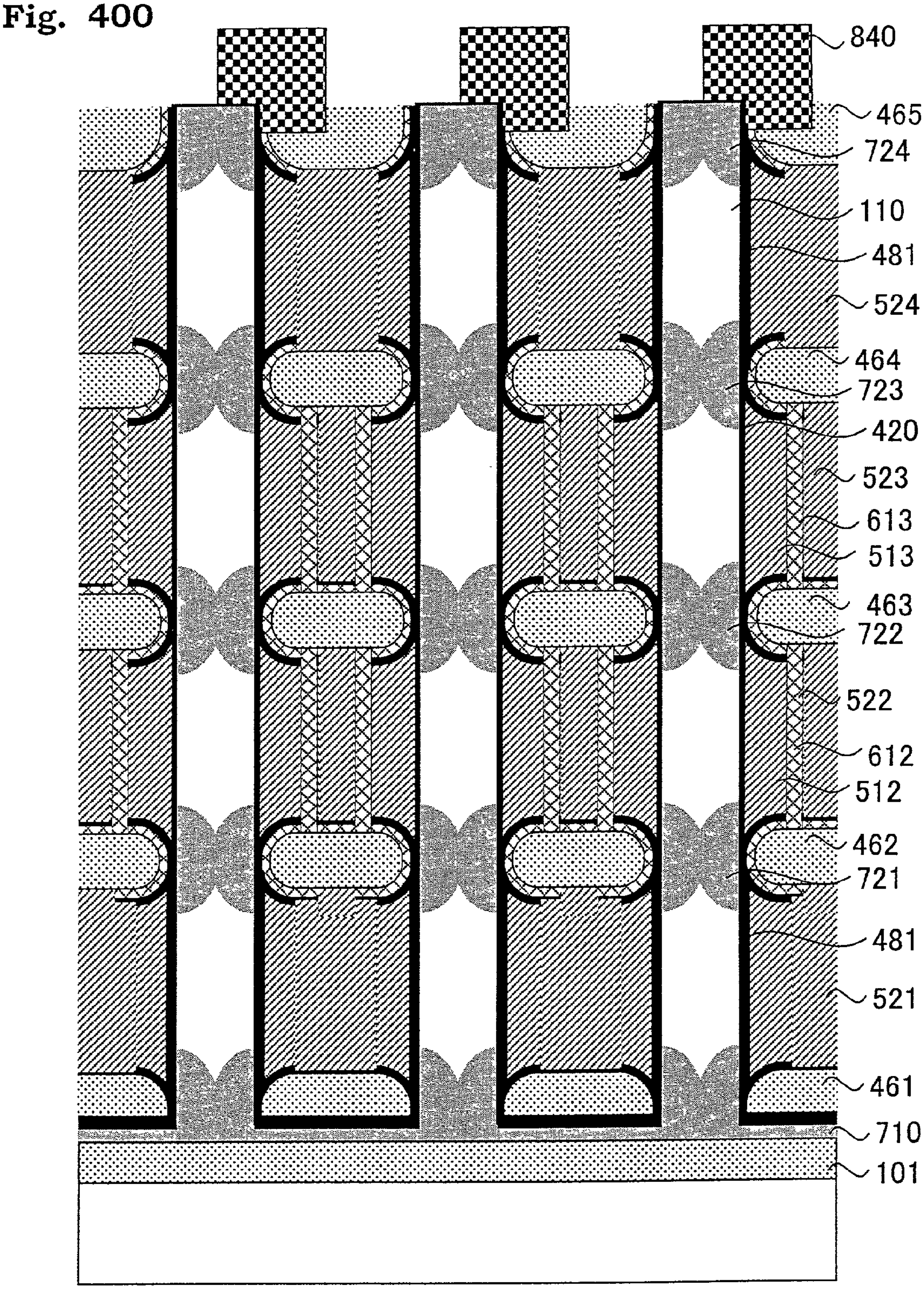
FIG. 400 to FIG. 403 are sectional views (taken on line A–A' in FIG. 1) illustrating production steps of Production Example 5 for producing a semiconductor memory in accordance with the present invention.
Figure 401:
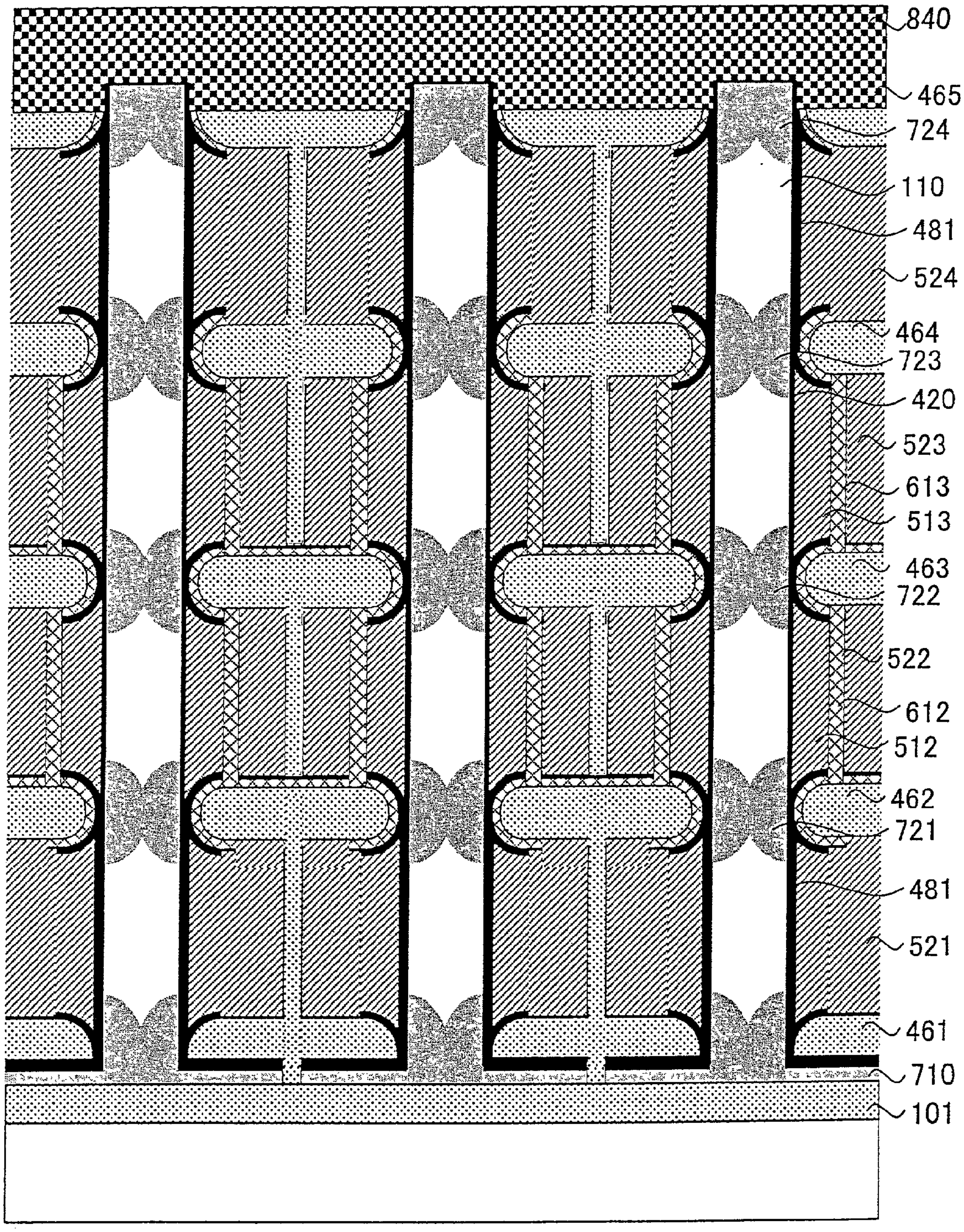

The production process shown in FIGS. 400 and 401 is substantially the same as Production Example 4 (FIGS. 391 to 394 and FIGS. 396 to 399) except that an SOI substrate is used as the substrate.

According to this example, the same effect as obtained by Production Example 1 can be obtained, and furthermore, the junction capacitance of the impurity diffusion layer 710 which functions as the first wiring is suppressed or removed.

Figure 402:
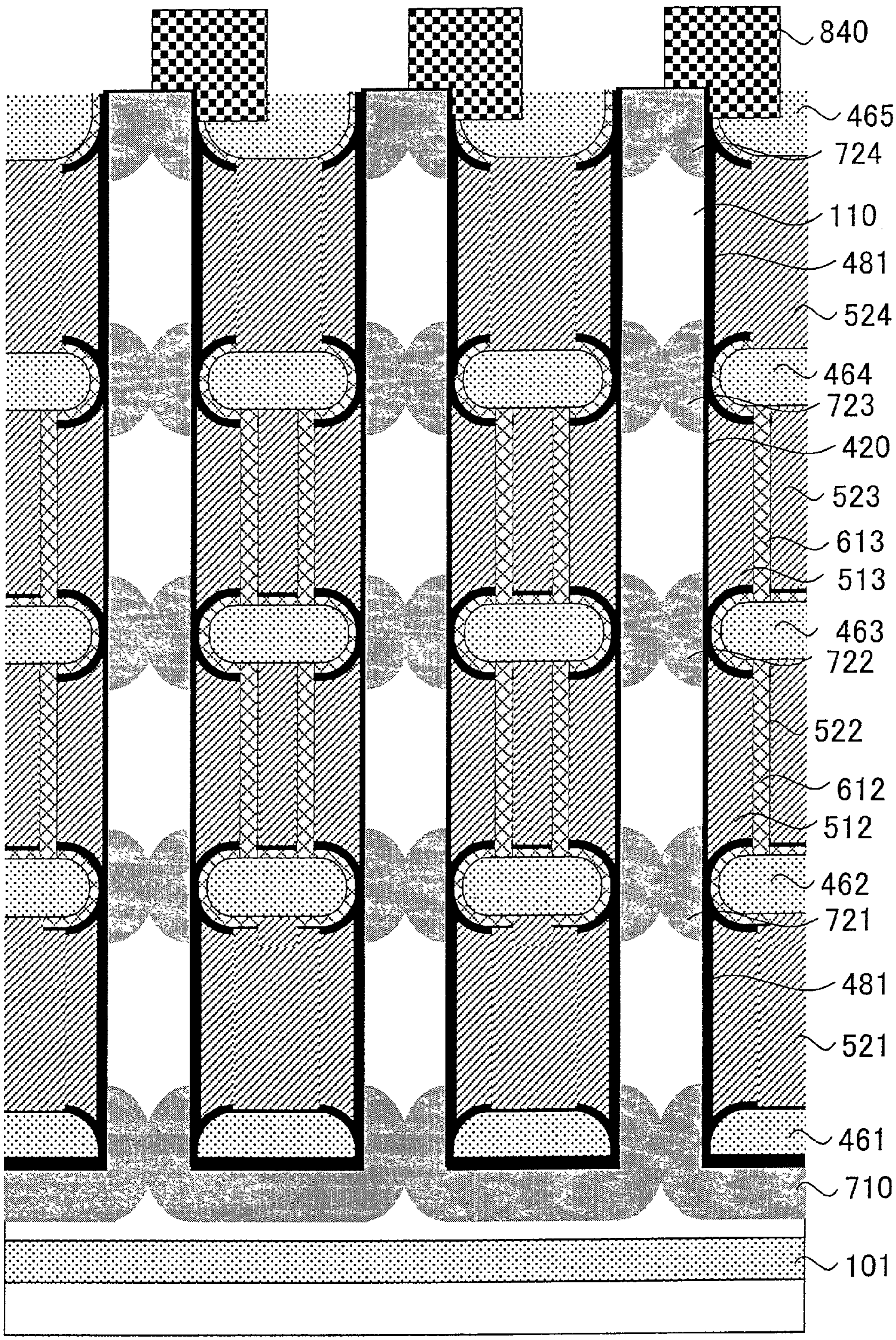
Figure 403:
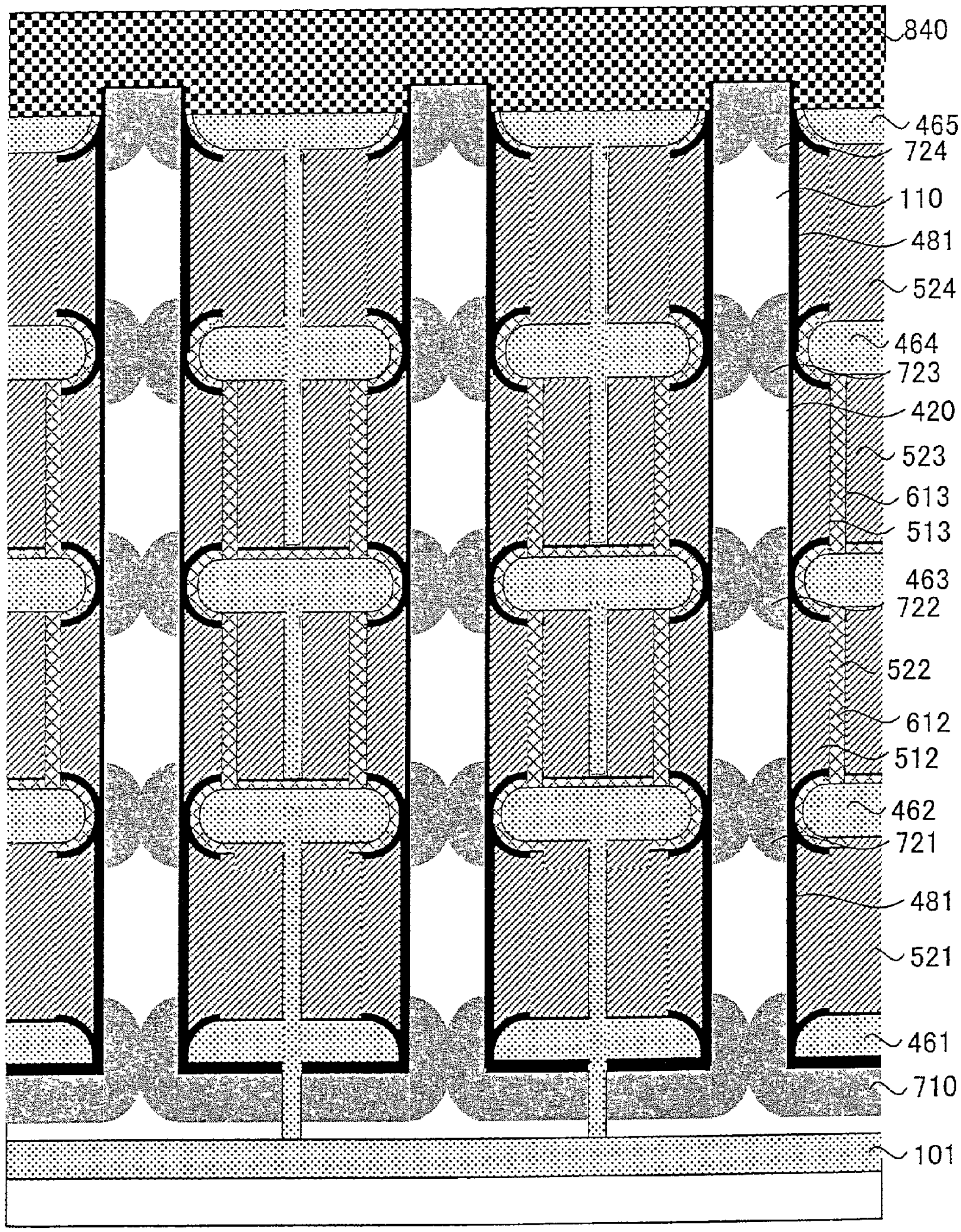
Figure 404:
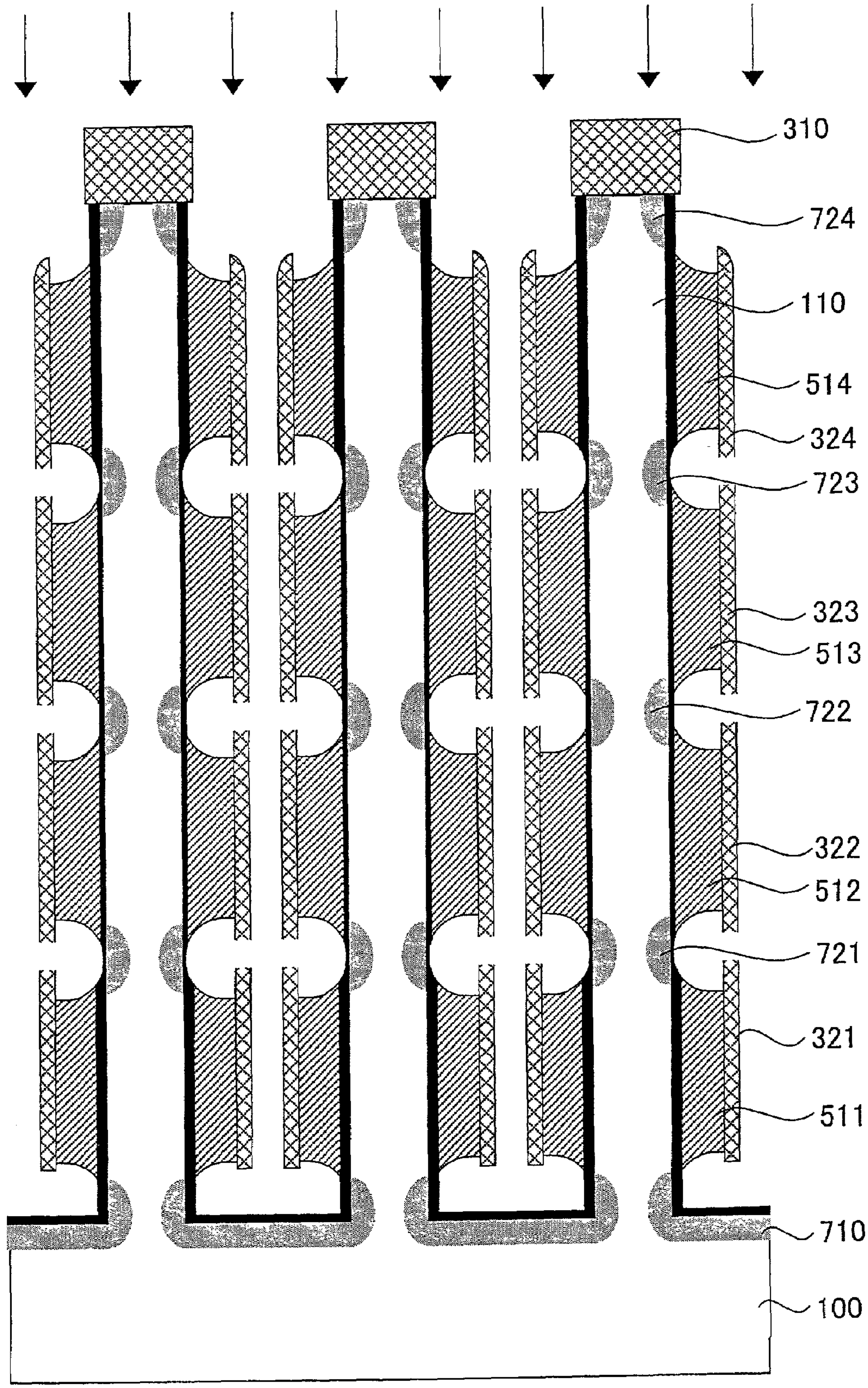
FIG. 404 to FIG. 412 are sectional views (taken on line A–A' in FIG. 1) illustrating production steps of Production Example 6 for producing a semiconductor memory in accordance with the present invention.
Figure 405:
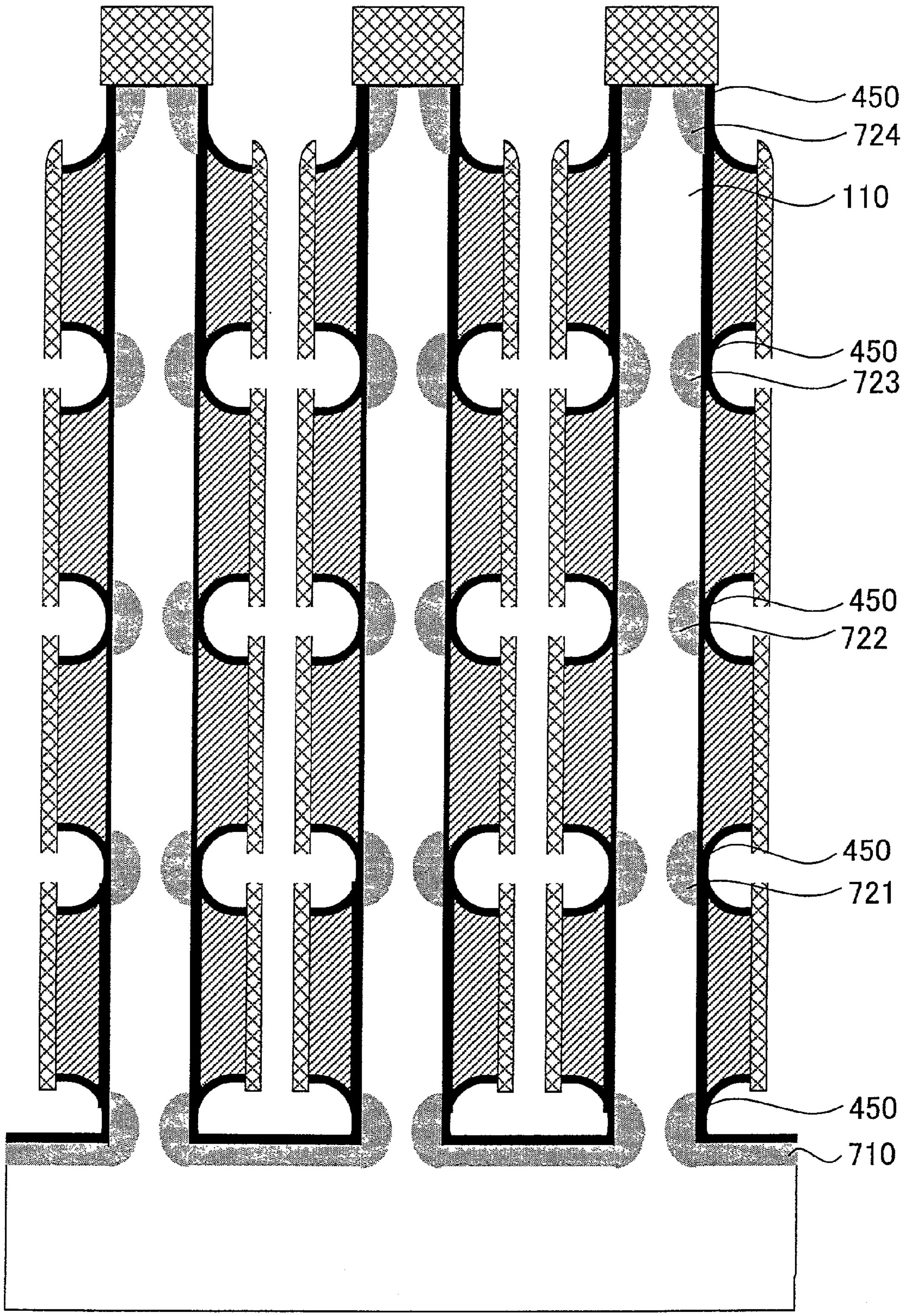
Figure 406:
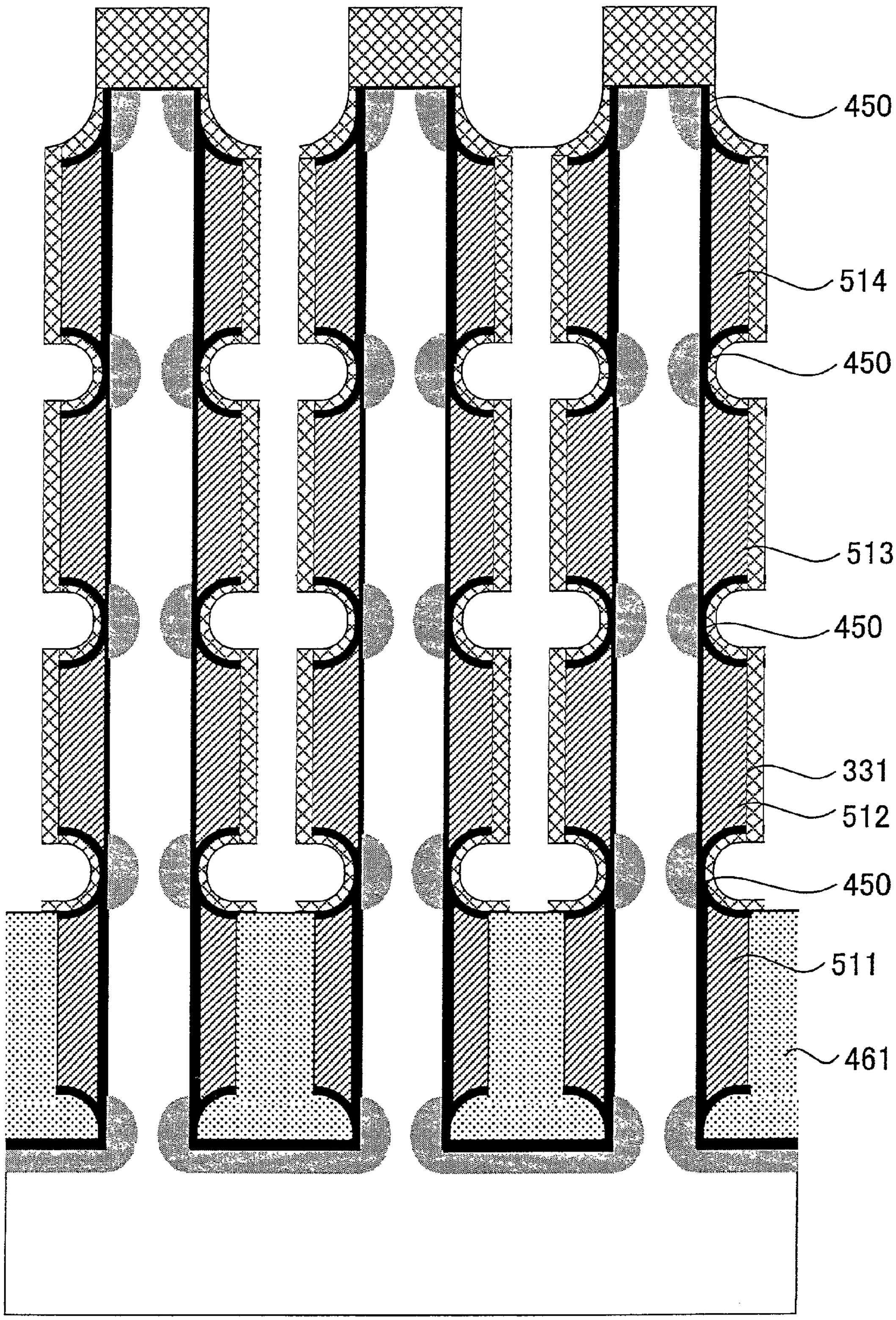
Figure 407:
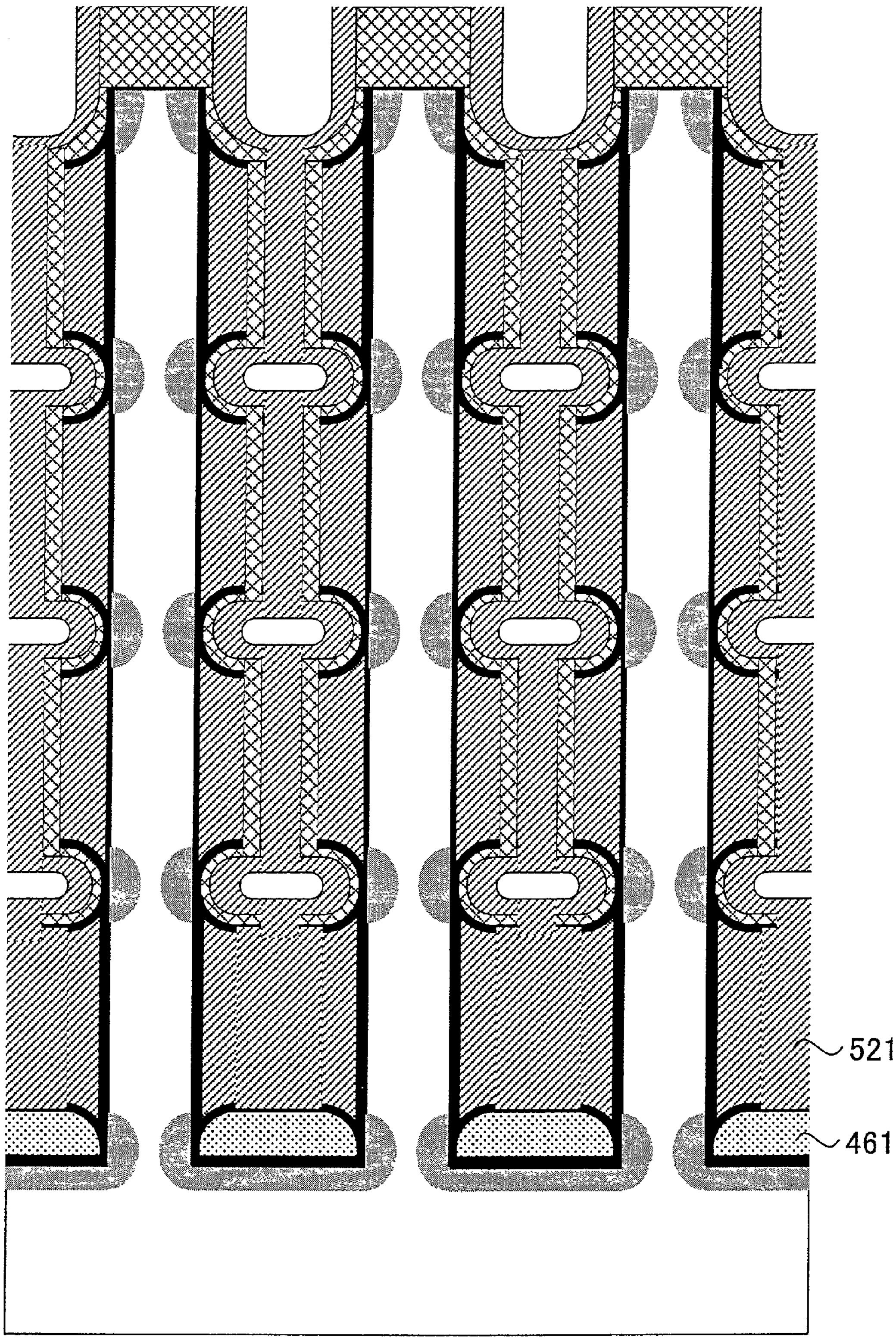
Figure 408:
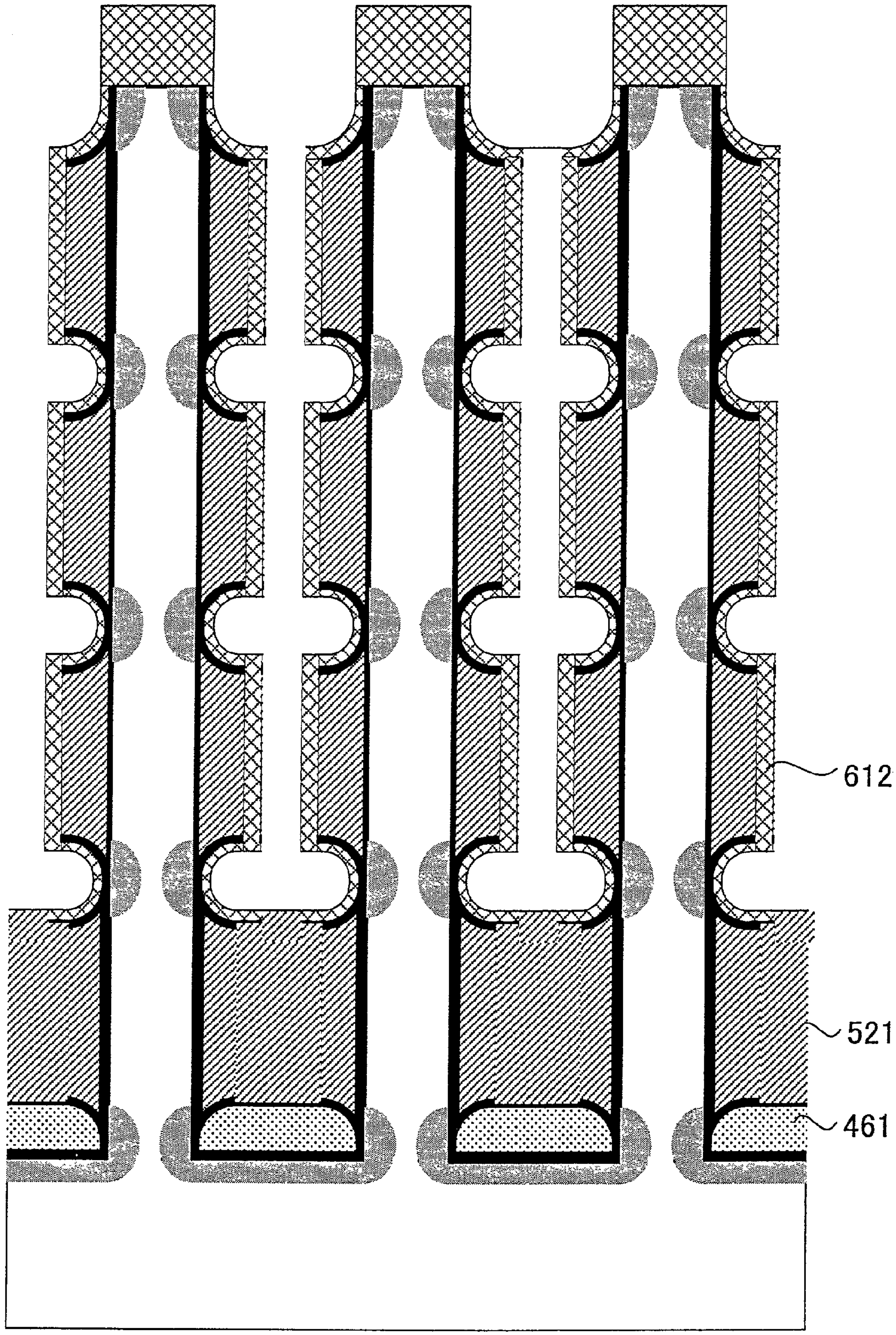
Figure 409:
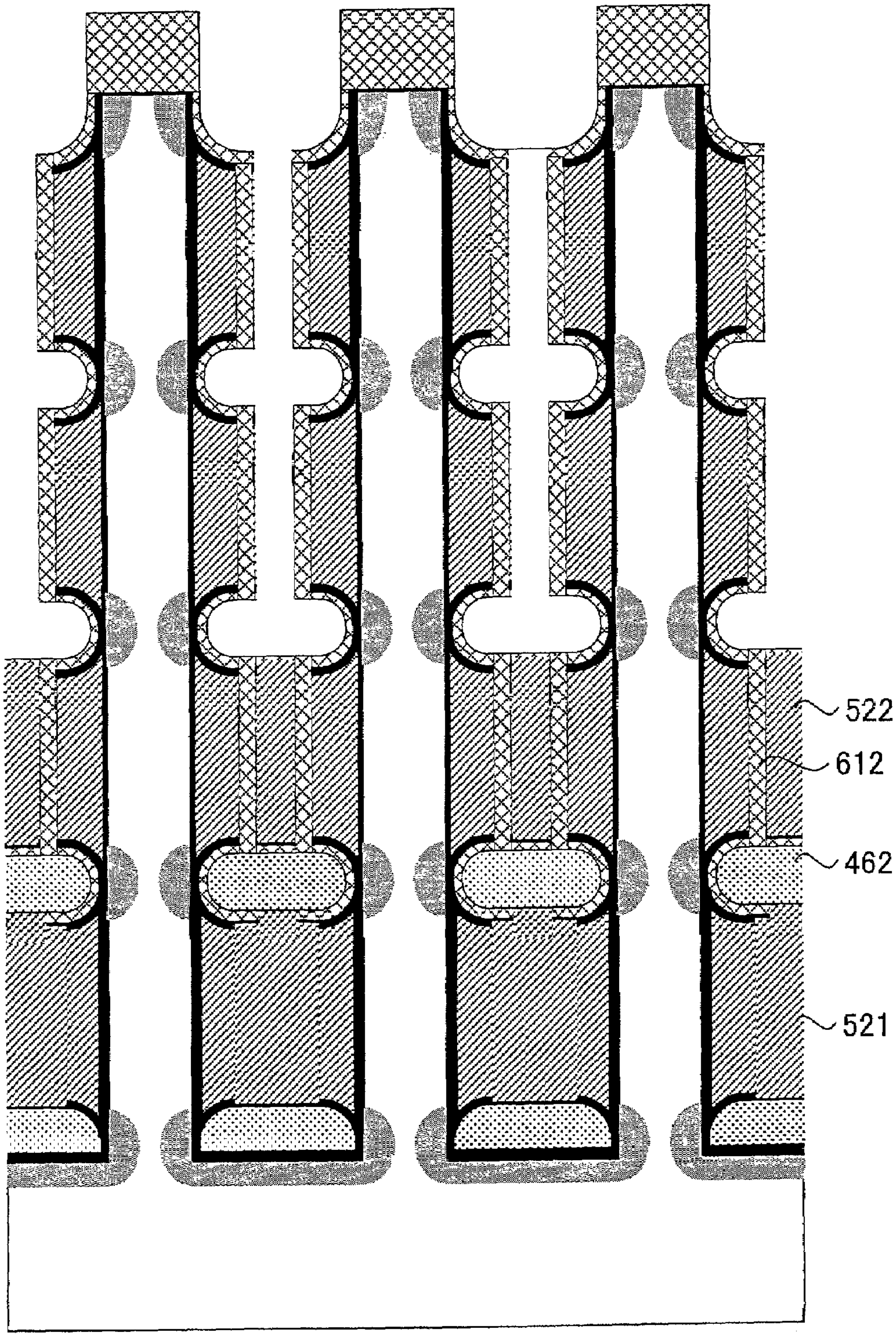
Figure 410:
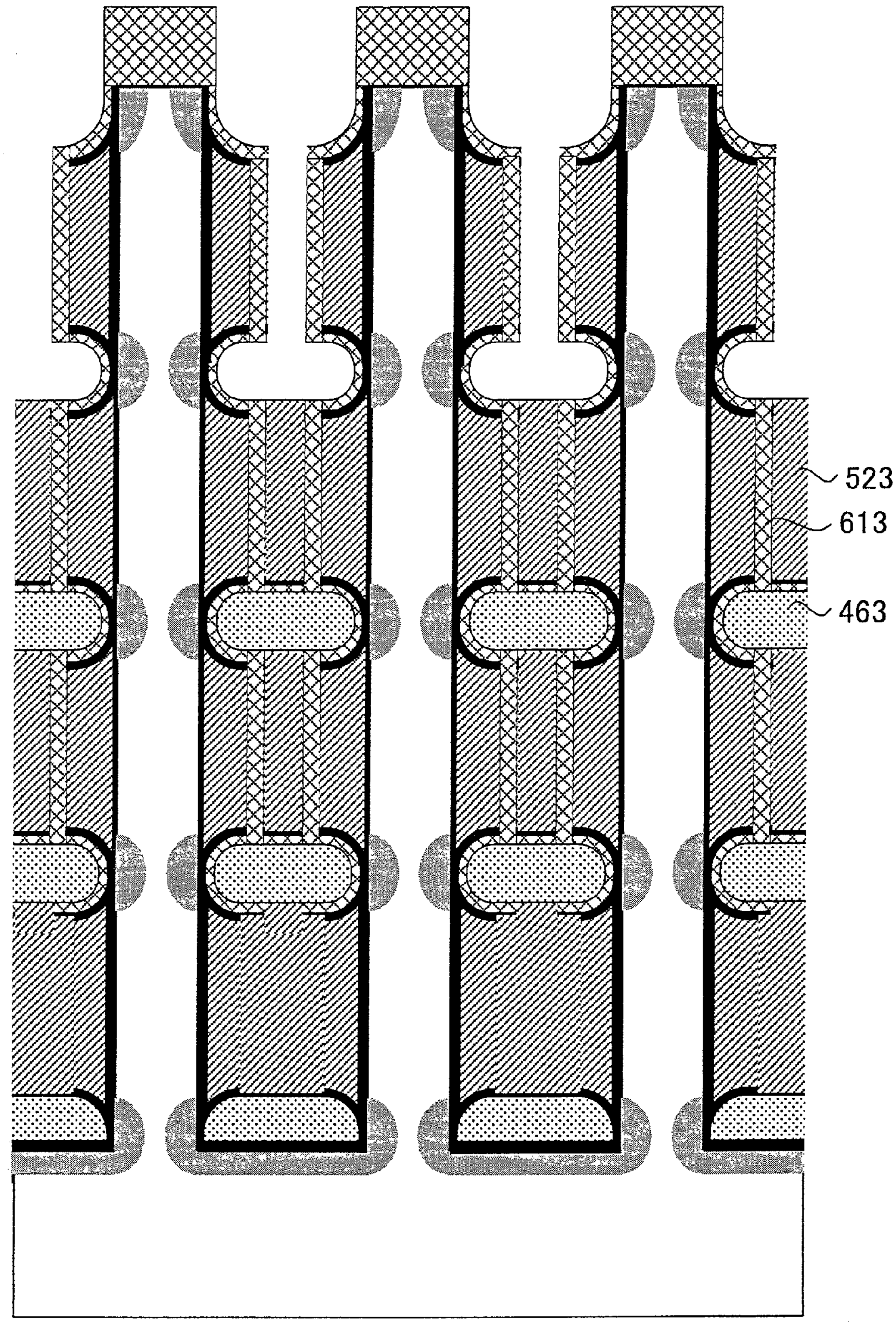

FIGS. 402 and 403 are substantially the same as FIGS. 400 and 401 except that the impurity diffusion layer (the first wiring layer) 710 does not reach the oxide film of the SOI substrate. This example uses the SOI substrate with the oxide film inserted therein as the insulating film, but the insulating film may be a nitride film. The kind of the insulating film is not limited.

PRODUCTION EXAMPLE 6

In a semiconductor memory to be produced in this example, a semiconductor substrate is patterned in the form of pillars to form island-like semiconductor layers. Sides of the island-like semiconductor layers make active regions. A plurality of tunnel oxide films and floating gates as charge storage layers are formed on the active regions. The island-like semiconductor layers are electrically common to the semiconductor substrate. Selection gate transistors are disposed at the top and the bottom of the island-like semiconductor layer. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. In this production example, the selection gate and the floating gate of the transistors are formed at the same time.

Such a semiconductor memory may be produced by the following production process. FIGS. 404 to 412 and FIGS. 413 to 421 are sectional views taken on line A–A' and line B–B', respectively, in FIG. 1 which is a plan view illustrating a memory cell array of an EEPROM.

In this example, production steps until the impurity is introduced into the island-like semiconductor layer 110 in self-alignment with the divided polysilicon films (the first conductive films) 511 to 514 and the silicon nitride film (the first insulating film) 310 (FIG. 404 and FIG. 413) are the same as those in Production Example 4 (FIGS. 350 to 362 and FIGS. 370 to 382).

Thereafter, exposed portions of the polysilicon films (the first conductive films) 511 to 514 are selectively formed into an oxide film 450 of 5 to 50 nm thickness which is the seventh insulating film, for example, by thermal oxidation. At this time, diffusion from the impurity diffusion layers 710 to 724 is suppressed by adjusting the amount of the impurity introduced or thermal treatment so that a P-type region of the island-like semiconductor layer 110 is electrically connected to the substrate.

Production steps thereafter follow Production Example 4 (FIGS. 405 to 412 and FIGS. 414 to 421).

Figure 411:
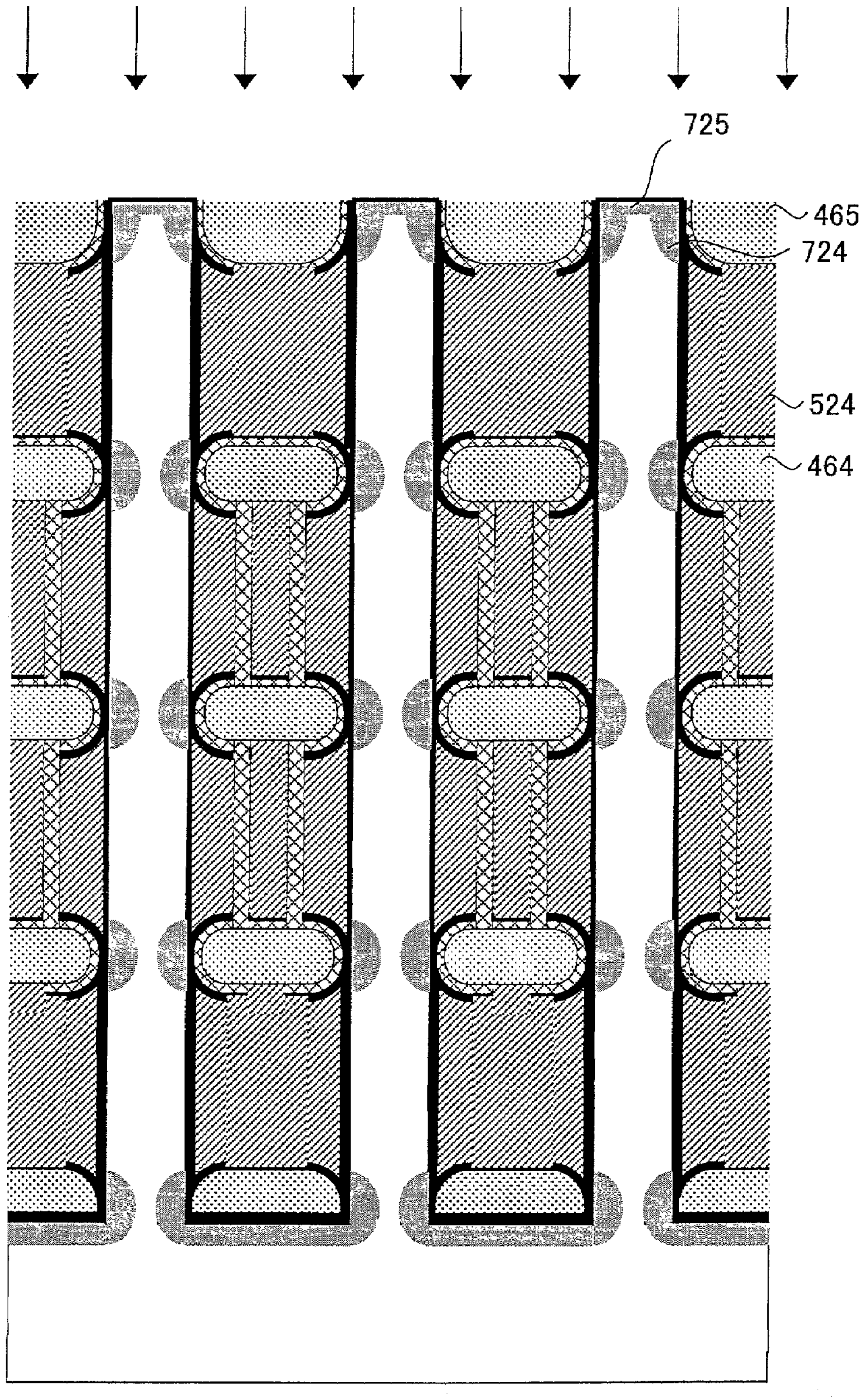
Figure 412:
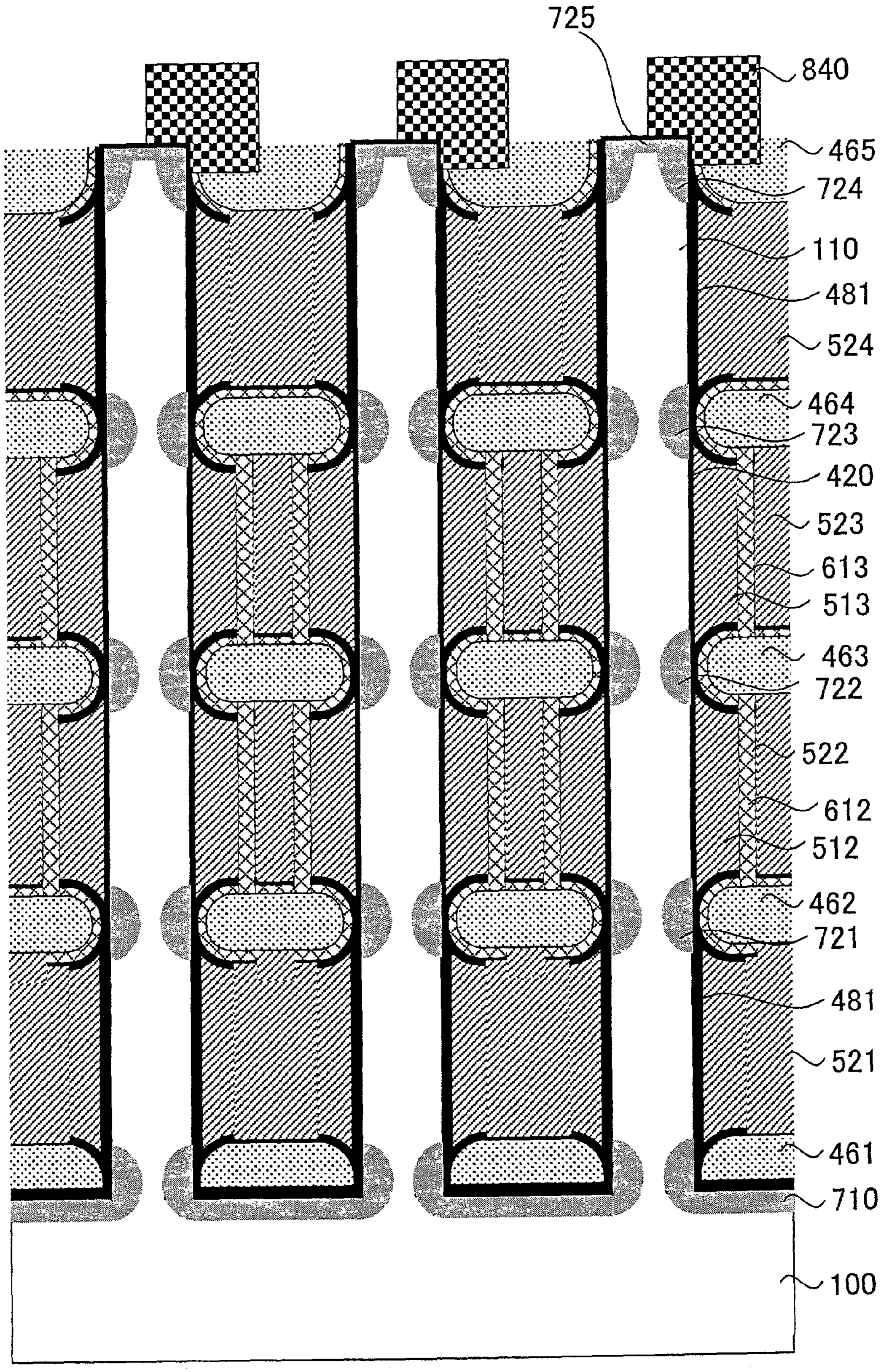
Figure 413:
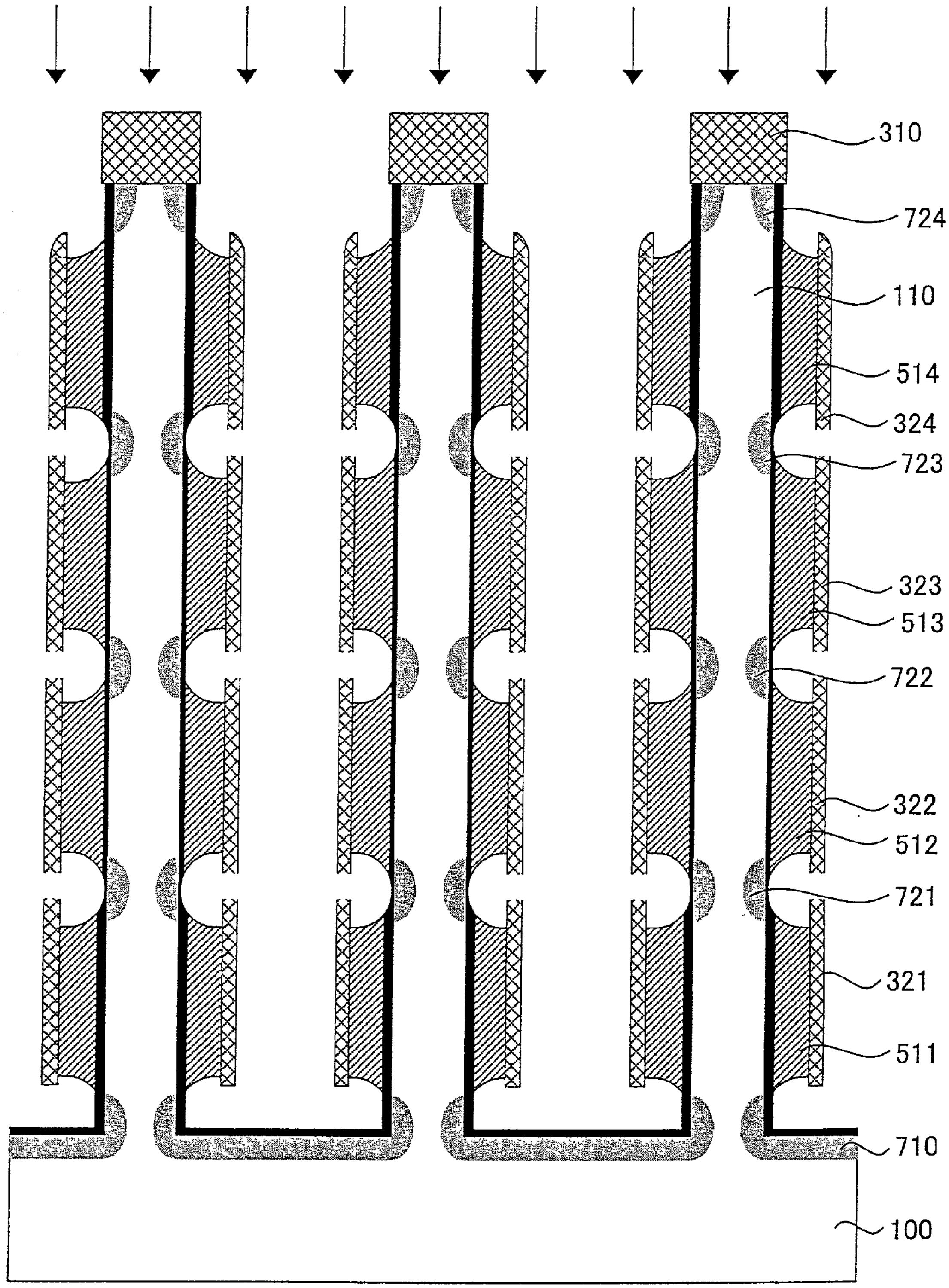
FIG. 413 to FIG. 421 are sectional views (taken on line B–B' in FIG. 1) illustrating production steps of Production Example 6 for producing a semiconductor memory in accordance with the present invention.
Figure 414:
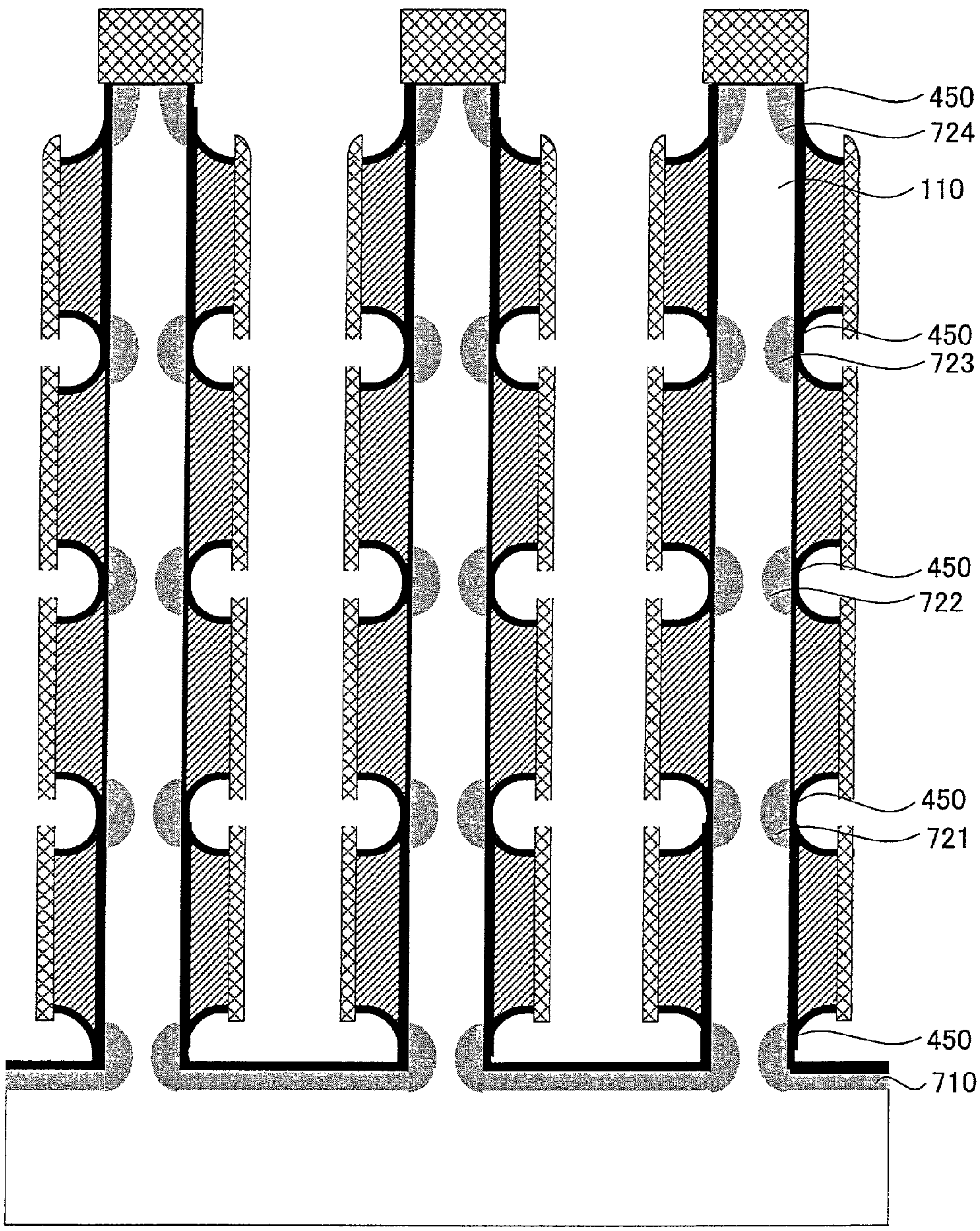
Figure 415:
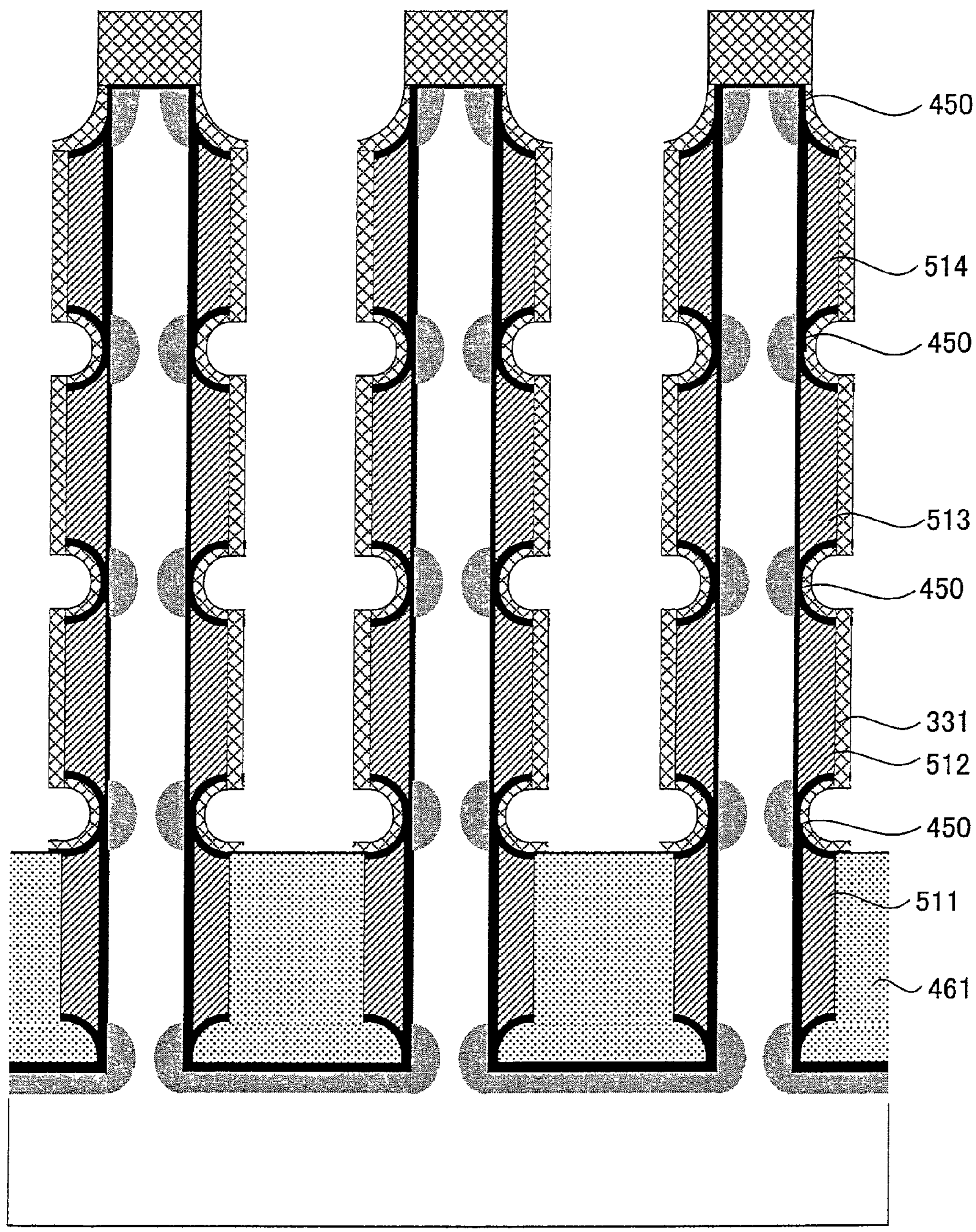
Figure 416:
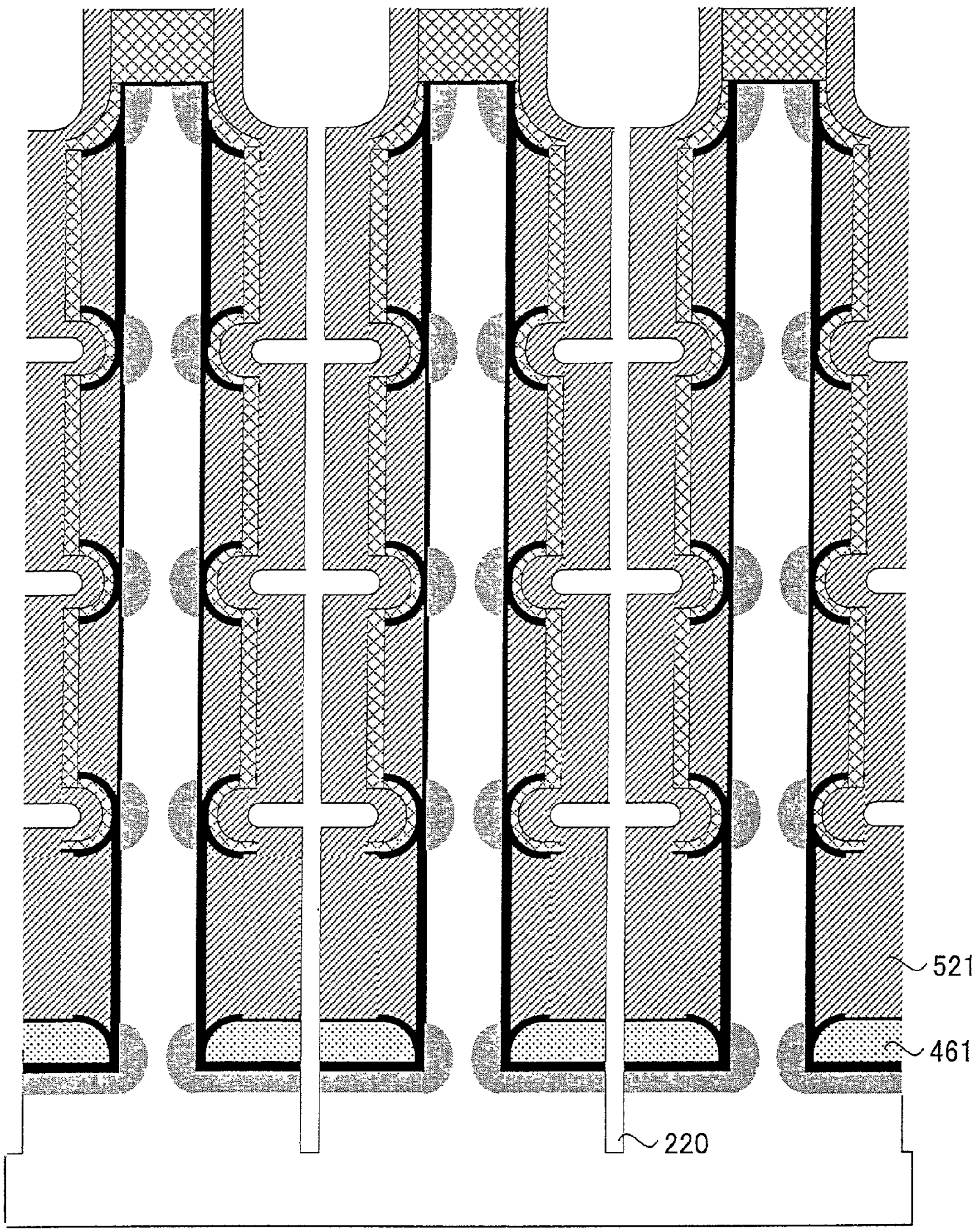
Figure 417:
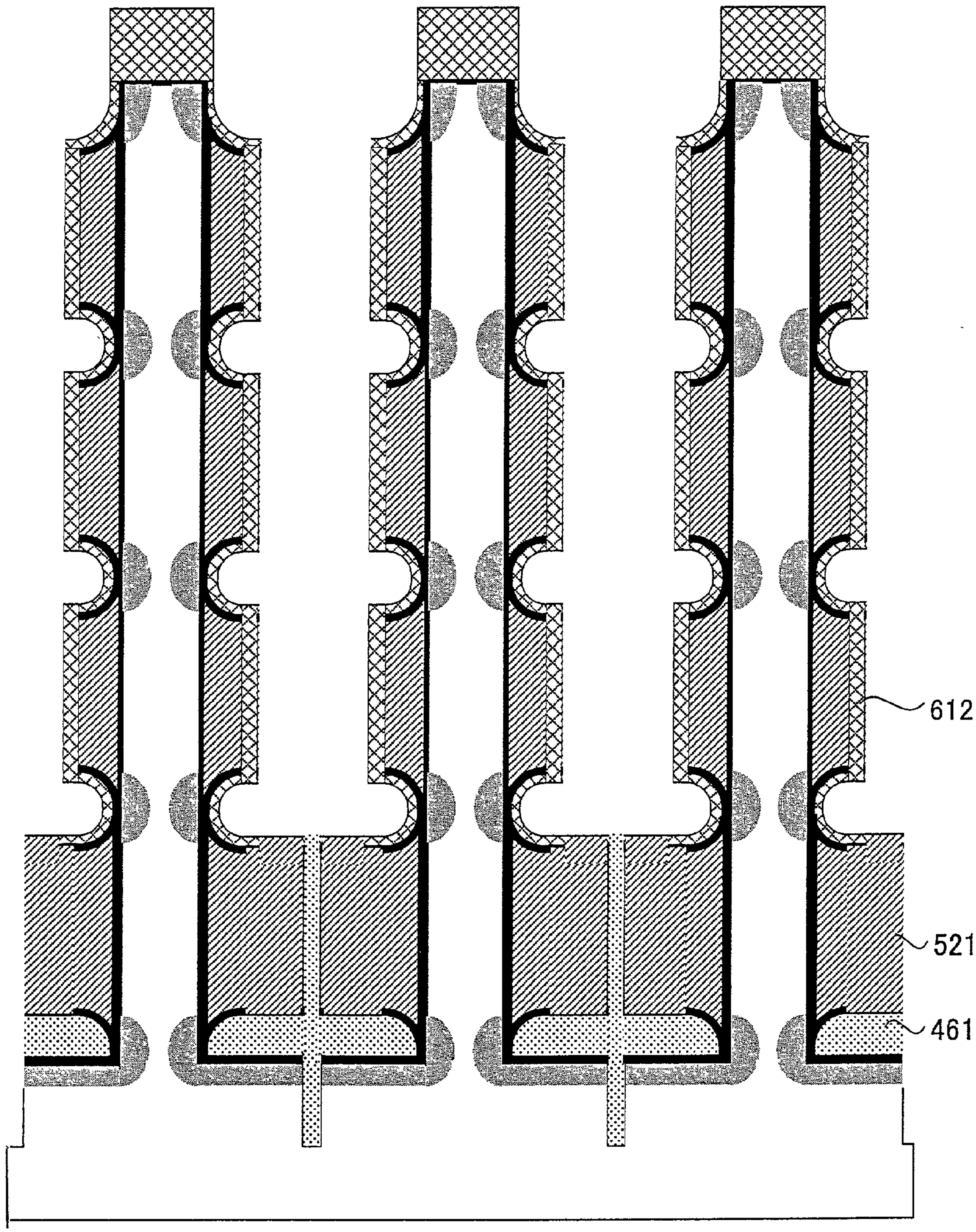
Figure 418:
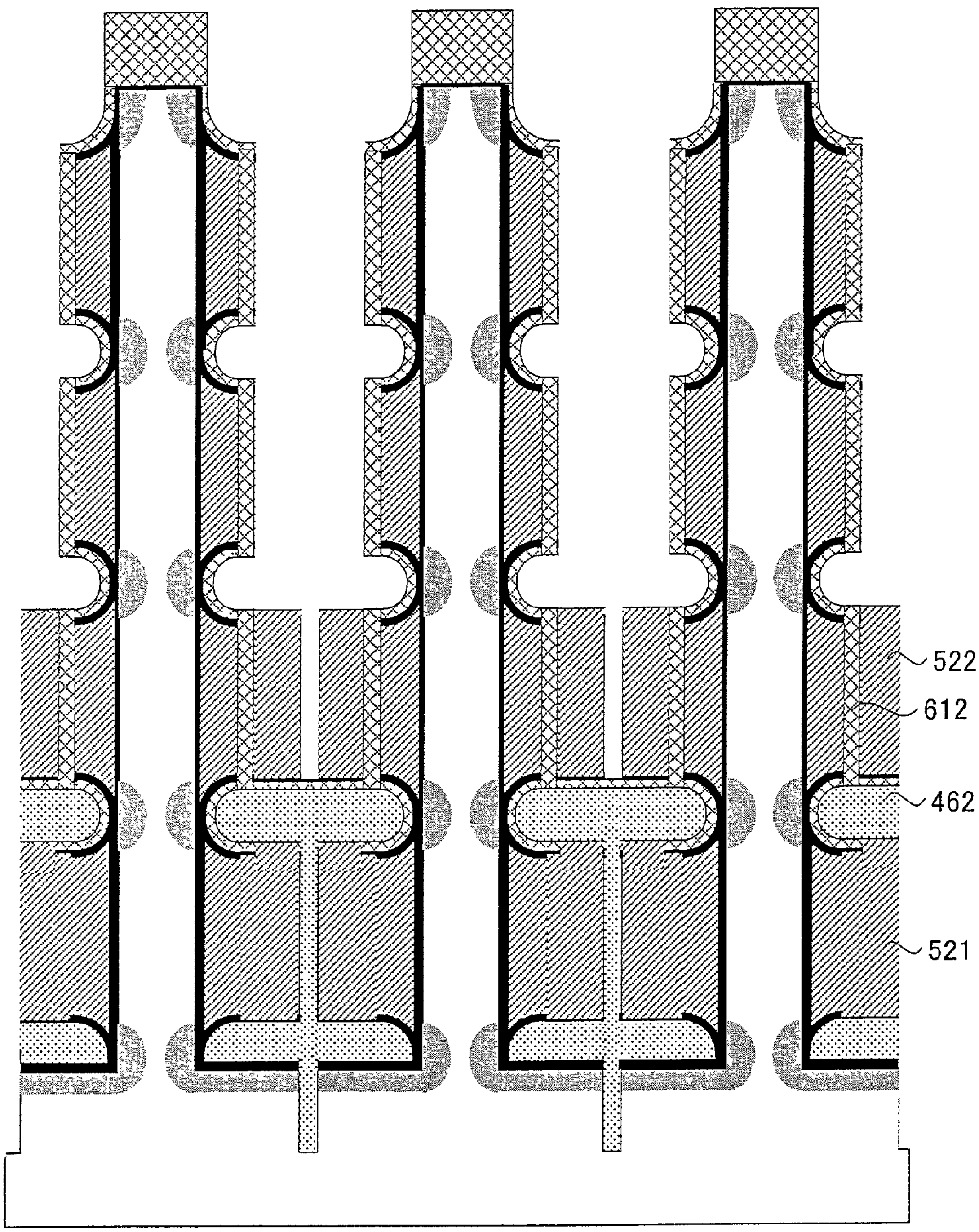
Figure 419:
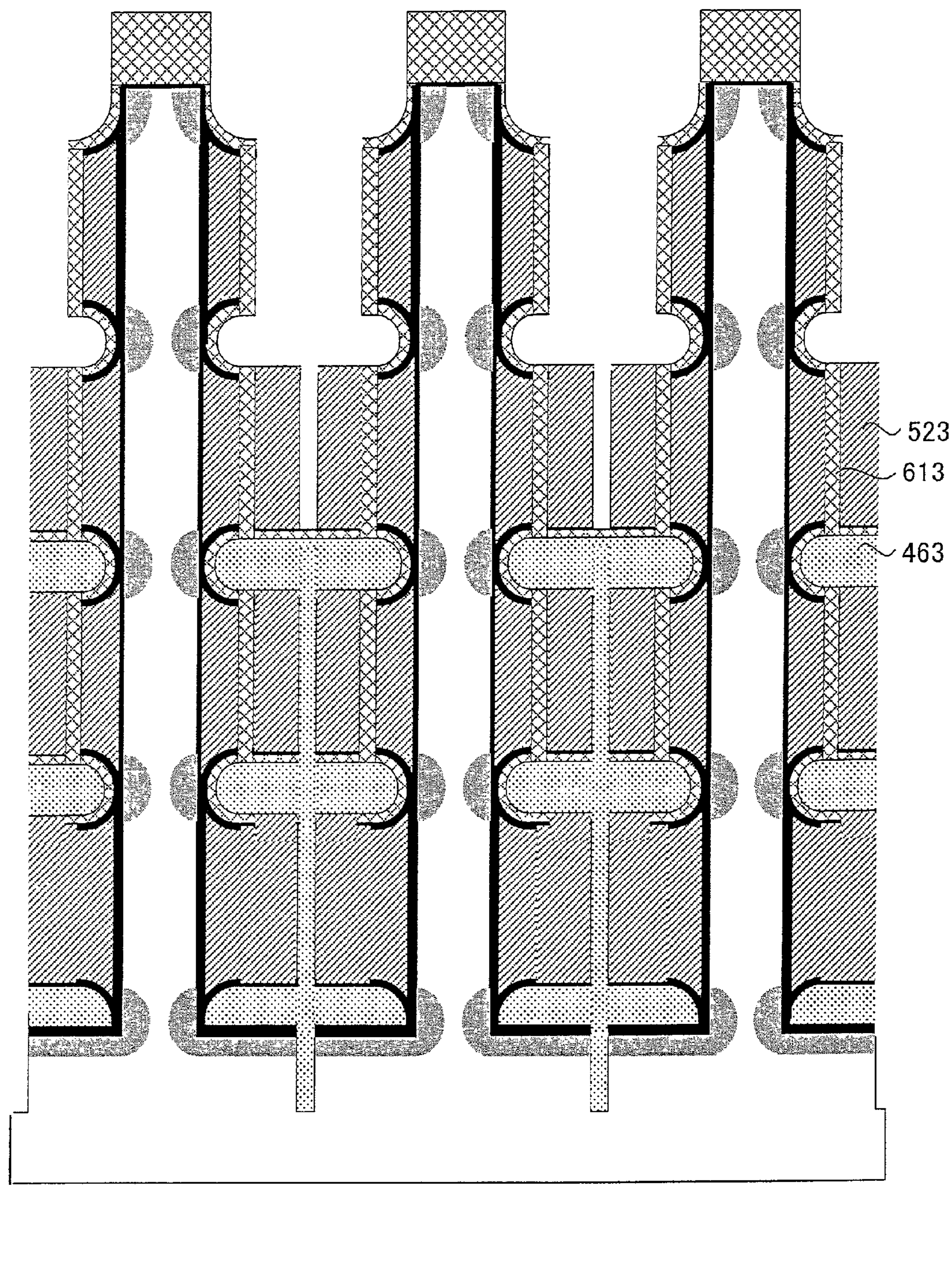
Figure 420:
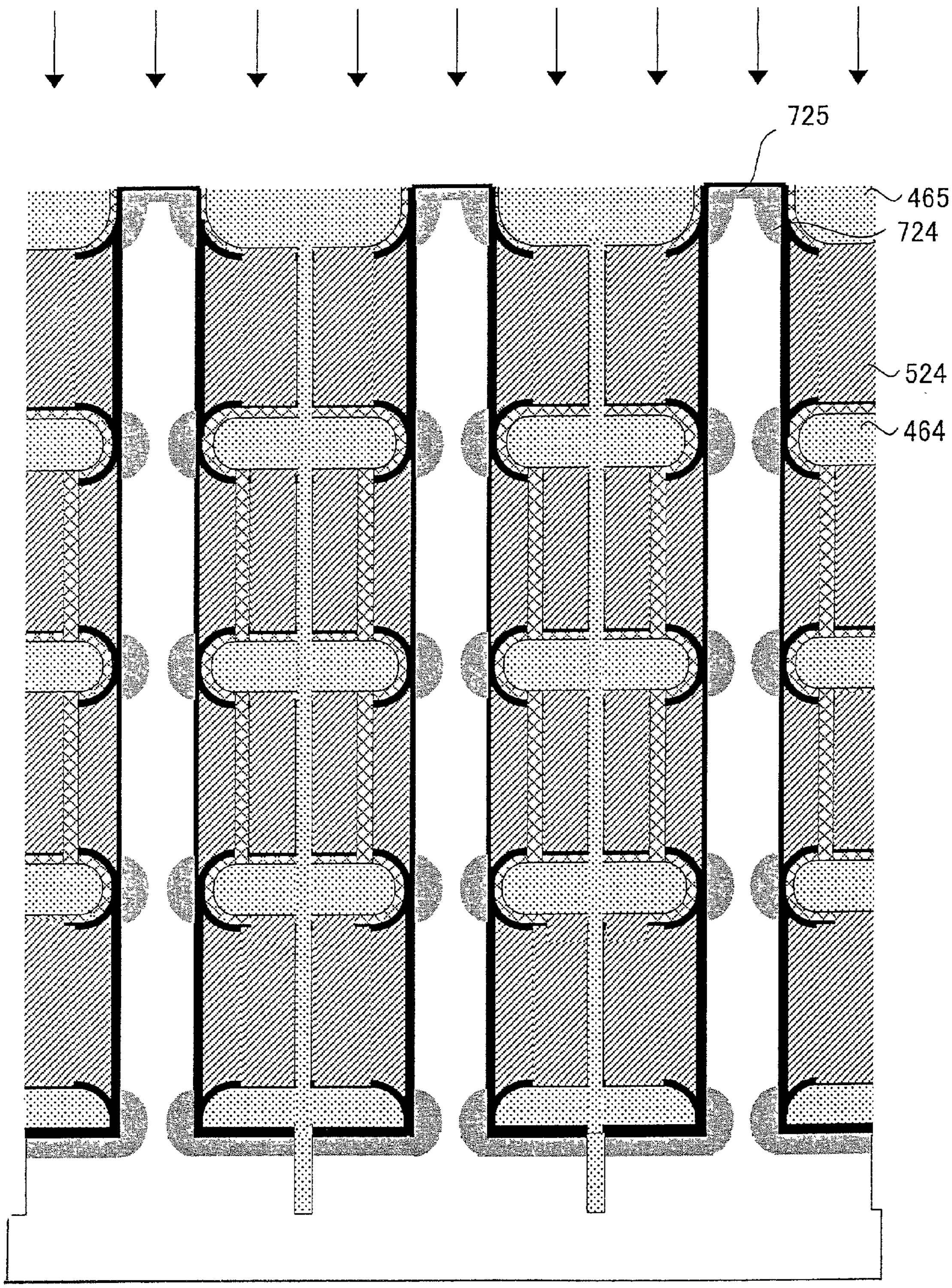
Figure 421:
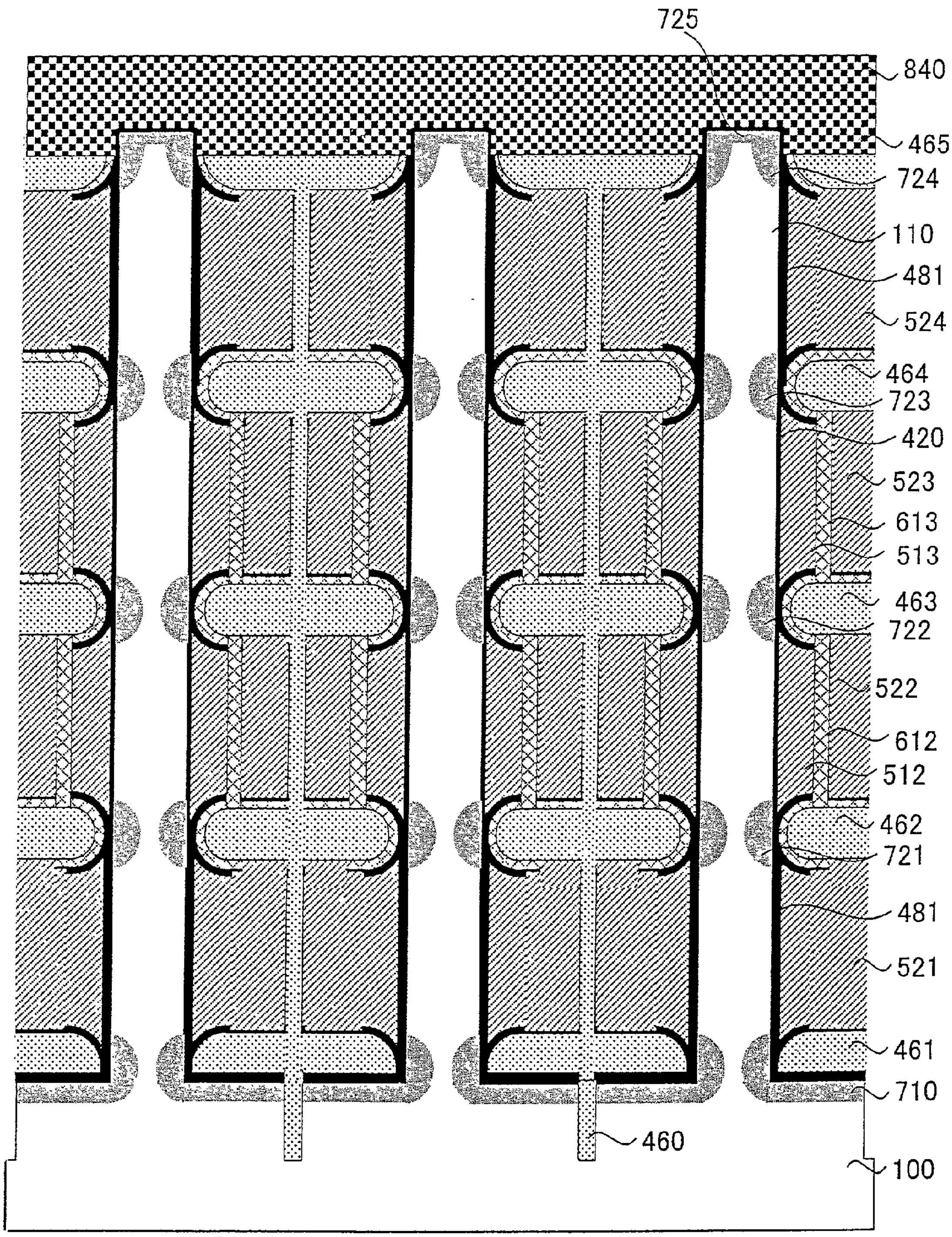

In this example, as shown in FIGS. 411 and 420, an impurity diffusion layer 725 of the same type as that of the impurity diffusion layer 724 is introduced at the top of the island-like semiconductor layer before the fourth wiring is formed. Thereby the fourth wiring is connected only to the impurity diffusion layers 724 and 725.

According to this example, by adjustment of the amount of the impurity introduced or the thermal treatment, the diffusion from the impurity diffusion layers 710 to 724 can be suppressed and the length of the impurity diffusion layers in a direction of the height of the island-like semiconductor layer 110 can be set shorter, which contributes reduction in costs and reduction in variations occurring during the production process. The same effect as obtained by Production Example 1 can be obtained except that, at reading the memory cells connected in series in the island-like semiconductor layer 110, the threshold is decreased by a back-bias effect of the substrate.

Taking into consideration the decrease of the threshold by the back-bias effect of the substrate at reading the memory cells connected in series in the island-like semiconductor layer 110, the gate length of the transistors may be varied. For this, since the height of the first conductive film, which is the gate length, can be controlled stage by stage, the gate length of the memory cells can be controlled easily. Instead of varying the gate length, other means may be taken so long as they can change the threshold of the memory cells.

The active regions of the selection transistors alone may be electrically connected in the semiconductor substrate.

PRODUCTION EXAMPLE 7

In a semiconductor memory to be produced in this example, a semiconductor substrate is patterned in the form of pillars to form island-like semiconductor layers. Sides of the island-like semiconductor layers make active regions. A plurality of tunnel oxide films and floating gates as charge storage layers are formed on the active regions. The island-like semiconductor layers are each in an electrically floating state with respect to the semiconductor substrate. The active region of each memory cell is in the electrically floating state. Selection gate transistors are disposed at the top and the bottom of the island-like semiconductor layer. Two memory transistors are placed on the island-like semiconductor layer and are connected in series along the island-like semiconductor layer. In this production example, the selection gate and the floating gate of the transistors are formed at the same time.

Such a semiconductor memory may be produced by the following production process. FIGS. 422 to 439 and FIGS. 440 to 457 are sectional views taken on line A–A' and line B–B', respectively, in FIG. 50 which is a plan view illustrating a memory cell array of an EEPROM.

Figure 422:
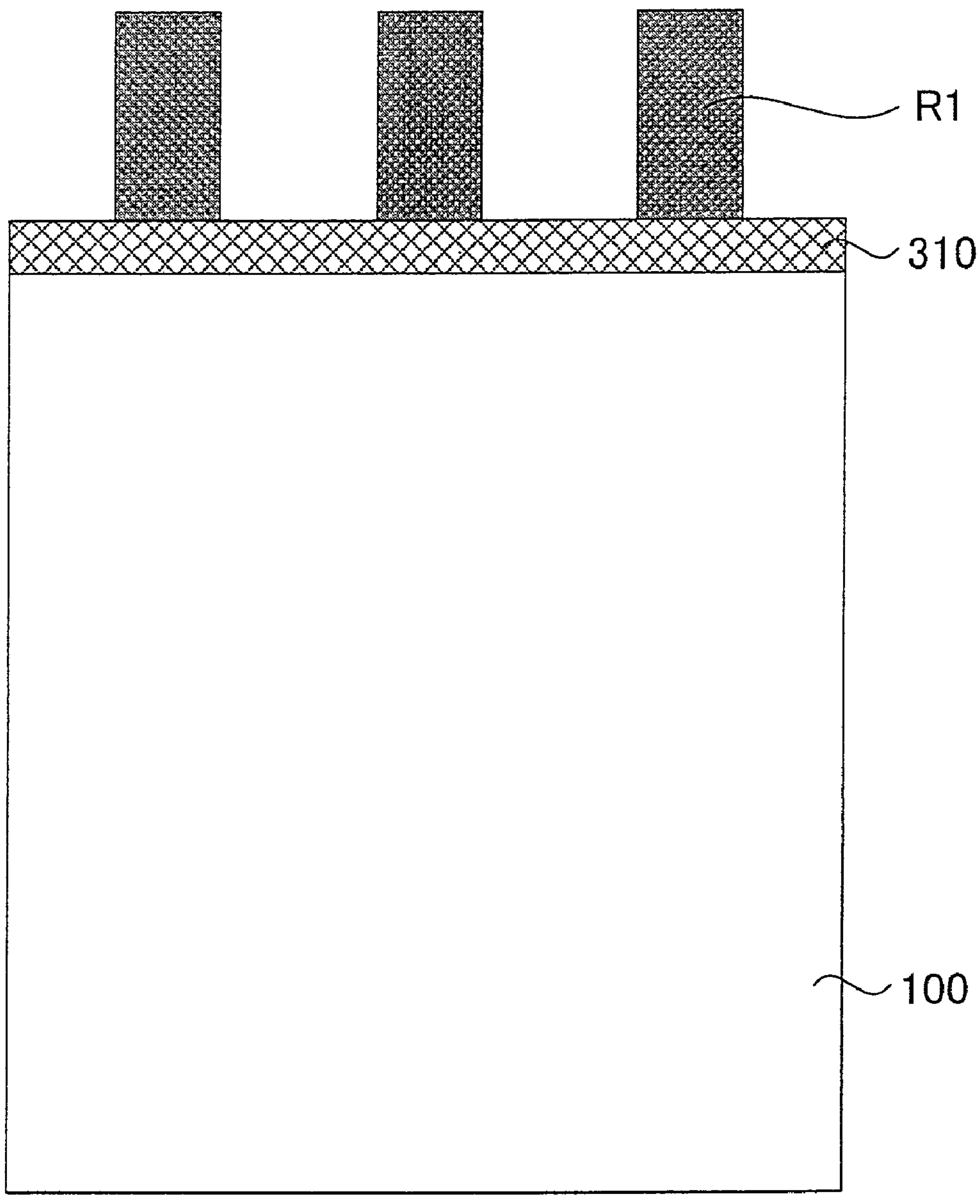
FIG. 422 to FIG. 439 are sectional views (taken on line A–A' in FIG. 50) illustrating production steps of Production Example 7 for producing a semiconductor memory in accordance with the present invention.
Figure 440:
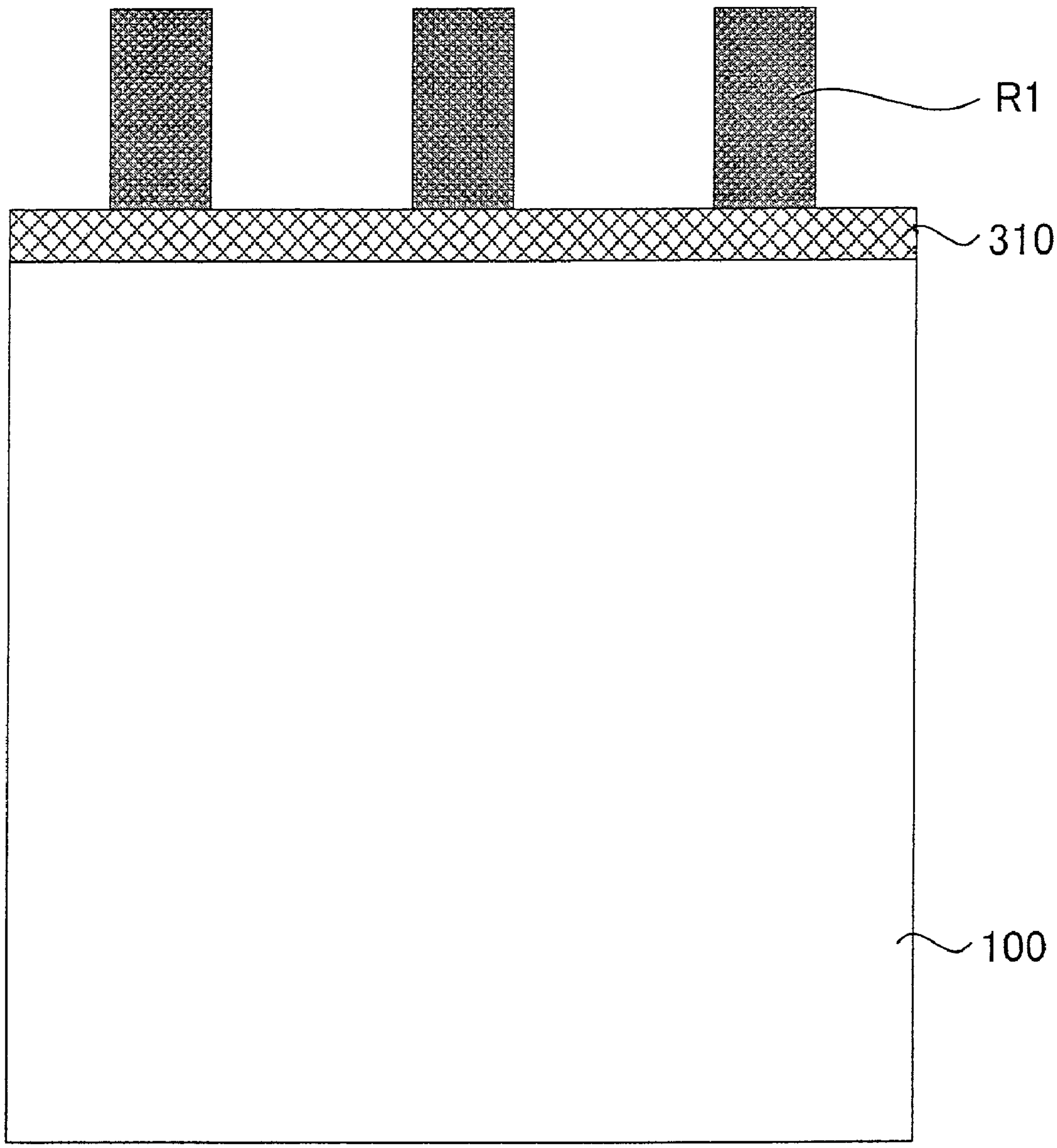
FIG. 440 to FIG. 457 are sectional views (taken on line B–B' in FIG. 50) illustrating production steps of Production Example 7 for producing a semiconductor memory in accordance with the present invention.

In this example, a silicon nitride film 310 to be a mask layer is deposited to a thickness of 200 to 2,000 nm as a first insulating film on a P-type silicon substrate 100 and etched into a mask film 310 by reactive ion etching using a resist film R1 patterned by known photolithography (FIG. 422 and FIG. 440). The P-type semiconductor substrate 100 is etched 1,000 to 2,000 nm by reactive ion etching using the mask layer 310 to form a first trench 210 in a lattice form. Thereby, the P-type semiconductor substrate 100 is divided into a plurality of columnar island-like semiconductor layers 110.

Figure 423:
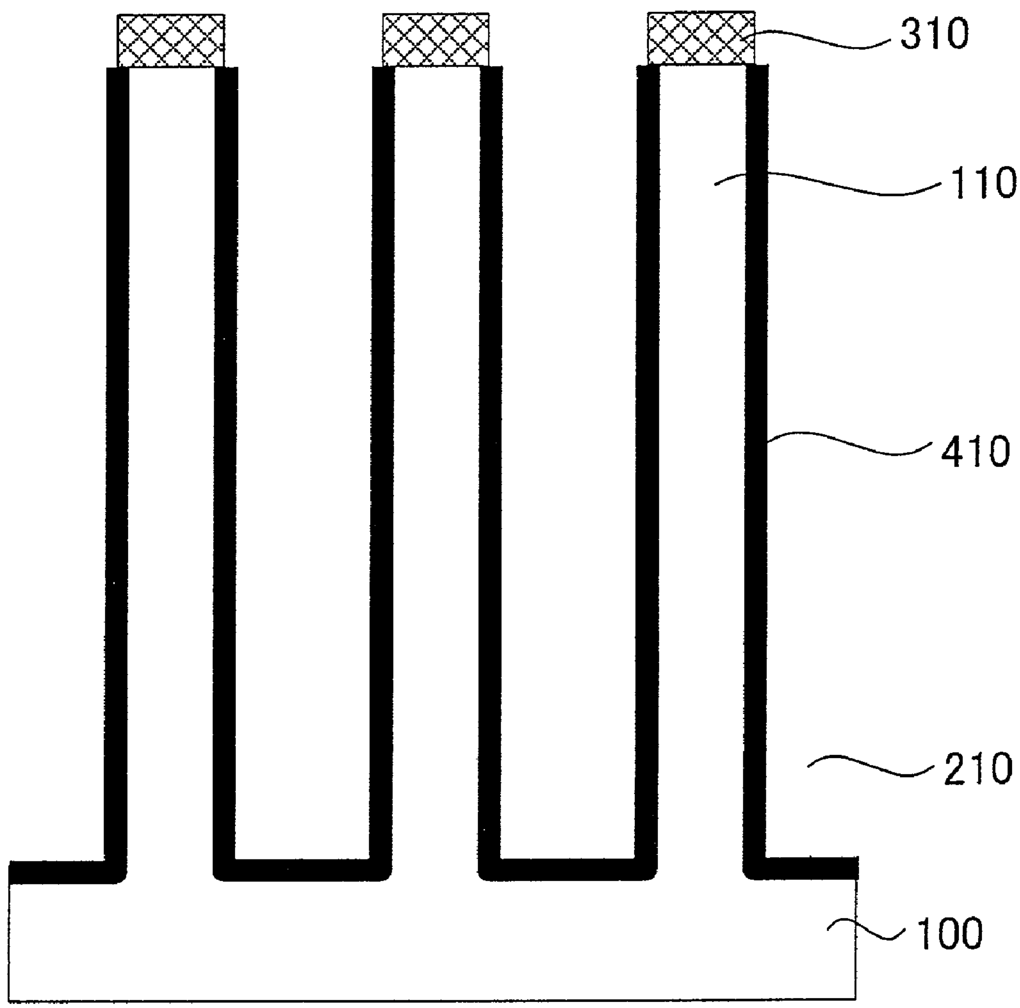
Figure 441:
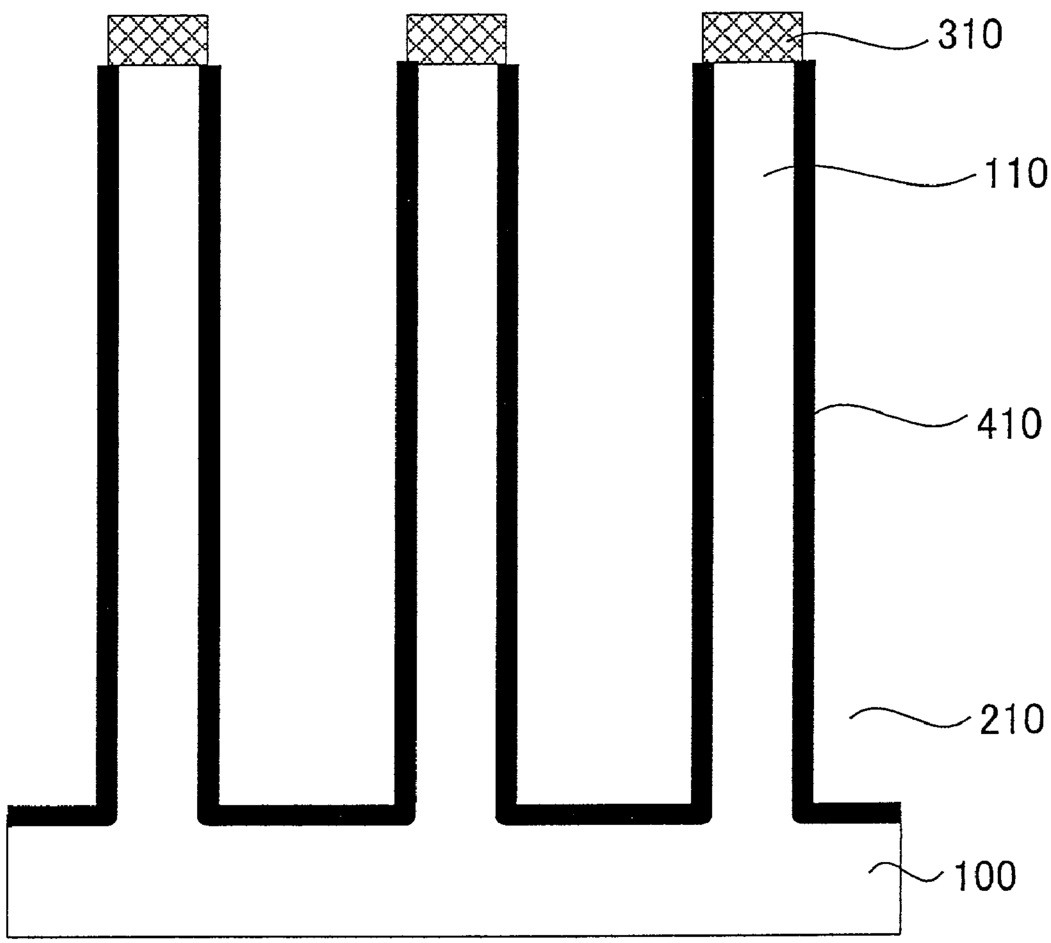

Thereafter, the surface of the island-like semiconductor layer 110 is oxidized to form a thermally oxidized film 410 in a thickness of 10 to 100 nm as the second insulating film. At this time, if the island-like semiconductor layer 110 has been formed in the minimum photoetching dimension, the dimension of the island-like semiconductor layer 110 is decreased by the formation of the thermally oxidized film 410, that is, the island-like semiconductor layer 110 is formed to have a dimension smaller than the minimum photoetching dimension (FIG. 423 and FIG. 441).

Next, the thermally oxidized film 410 is etched away from the periphery of each island-like semiconductor layer 110 by isotropic etching. Then, as required, channel ion implantation is carried out into the sidewall of the island semiconductor layer 110 by utilizing slant ion implantation. For example, the ion implantation may be performed at an implantation energy of 5 to 100 keV at a boron dose of about $1\times10^{11}$ to $1\times10^{13}/cm^2$ at an angle of 5 to 45° with respect to the normal line of the surface of the substrate. Preferably the channel ion implantation is performed from various directions to the island-like semiconductor layers 110 because a surface impurity concentration becomes more uniform. Alternatively, instead of the channel ion implantation, an oxide film containing boron may be deposited by CVD with a view to utilizing diffusion of boron from the oxide film. The impurity introduction from the surface of the island-like semiconductor layers 110 may be carried out before the island-like semiconductor layers are covered with the thermally oxidized film 410 or the introduction may be finished before the island-like semiconductor layers 110 are formed. Means for introducing the impurity are not particularly limited so long as an impurity concentration distribution is almost equal over the island-like semiconductor layers 110.

Figure 424:
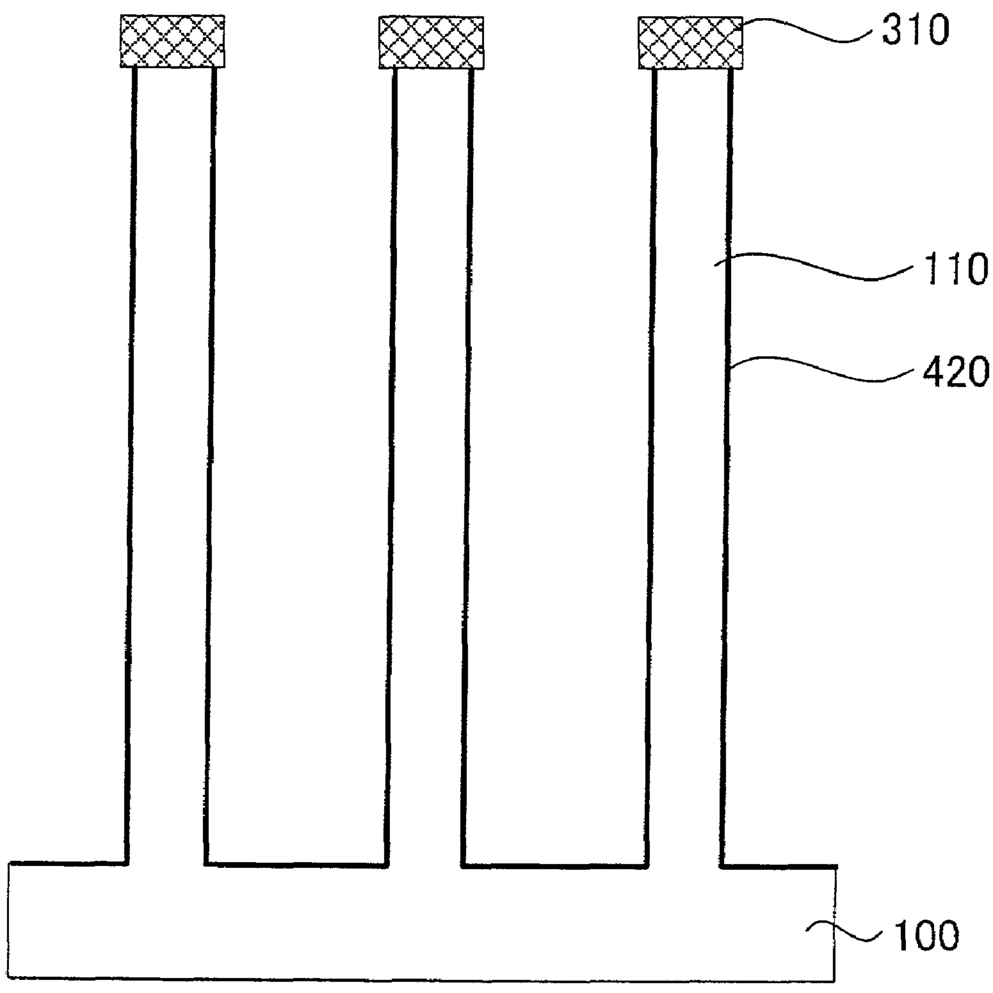
Figure 442:
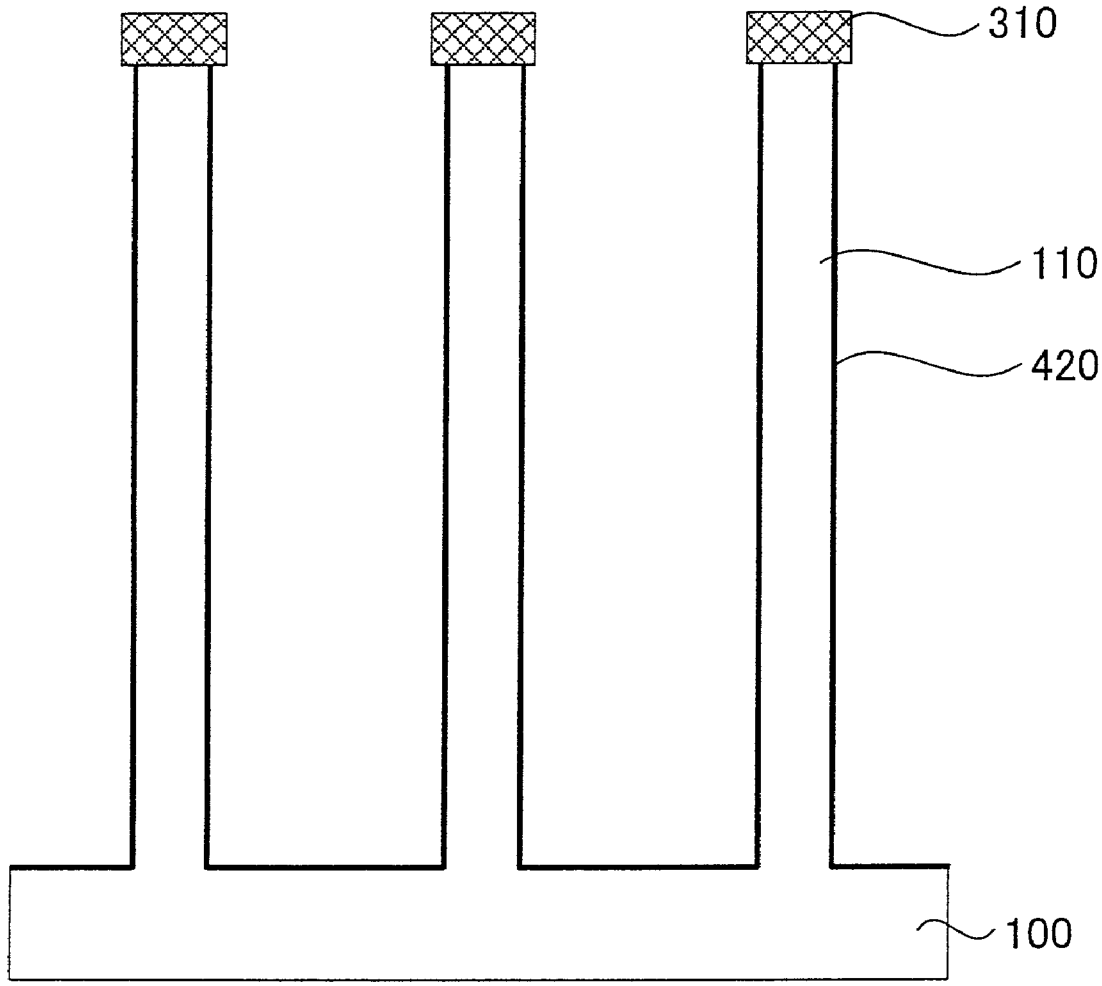

An oxide film 420 is formed as a third insulating film to be a tunnel oxide film in a thickness of about 10 nm around each island-like semiconductor layer 110, for example, by thermal oxidization (FIG. 424 and FIG. 442). The third oxide film, however, may be formed of not only a thermally oxidized film but also a CVD oxide film or a nitrogen oxide film.

Figure 425:
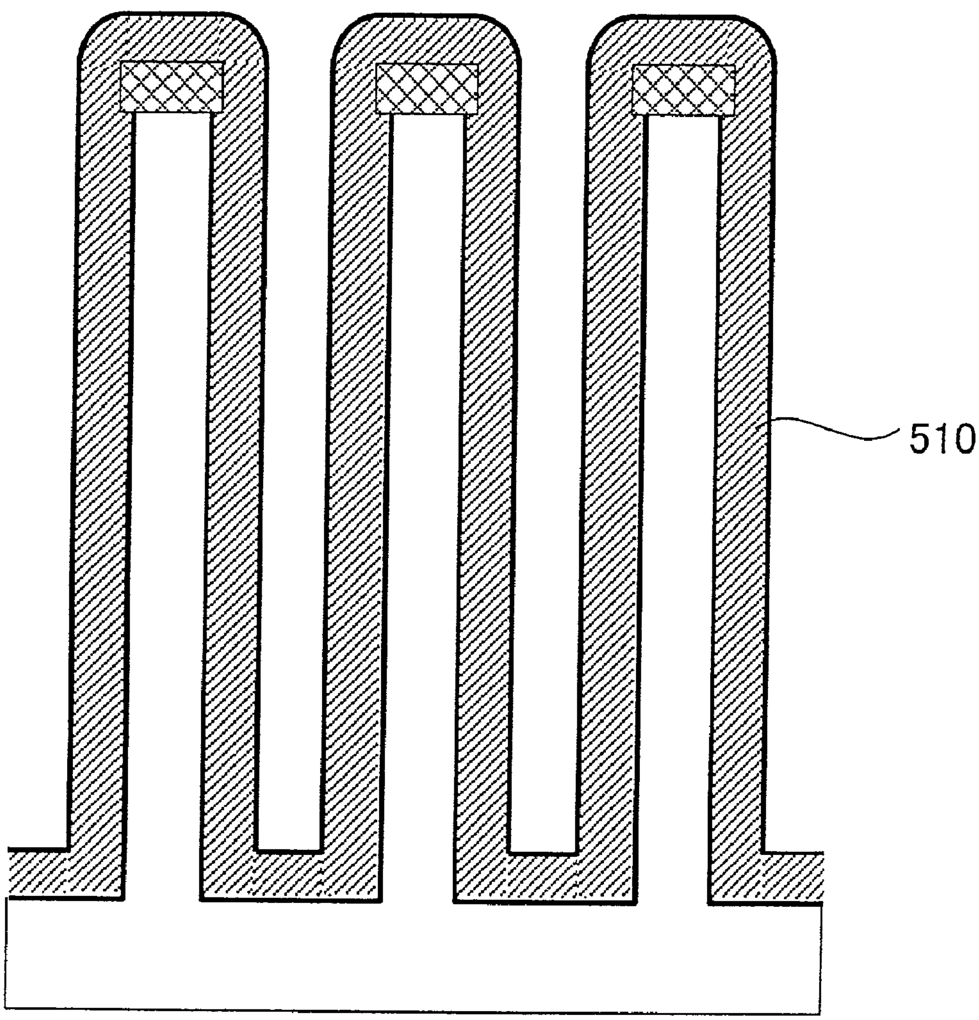
Figure 443:
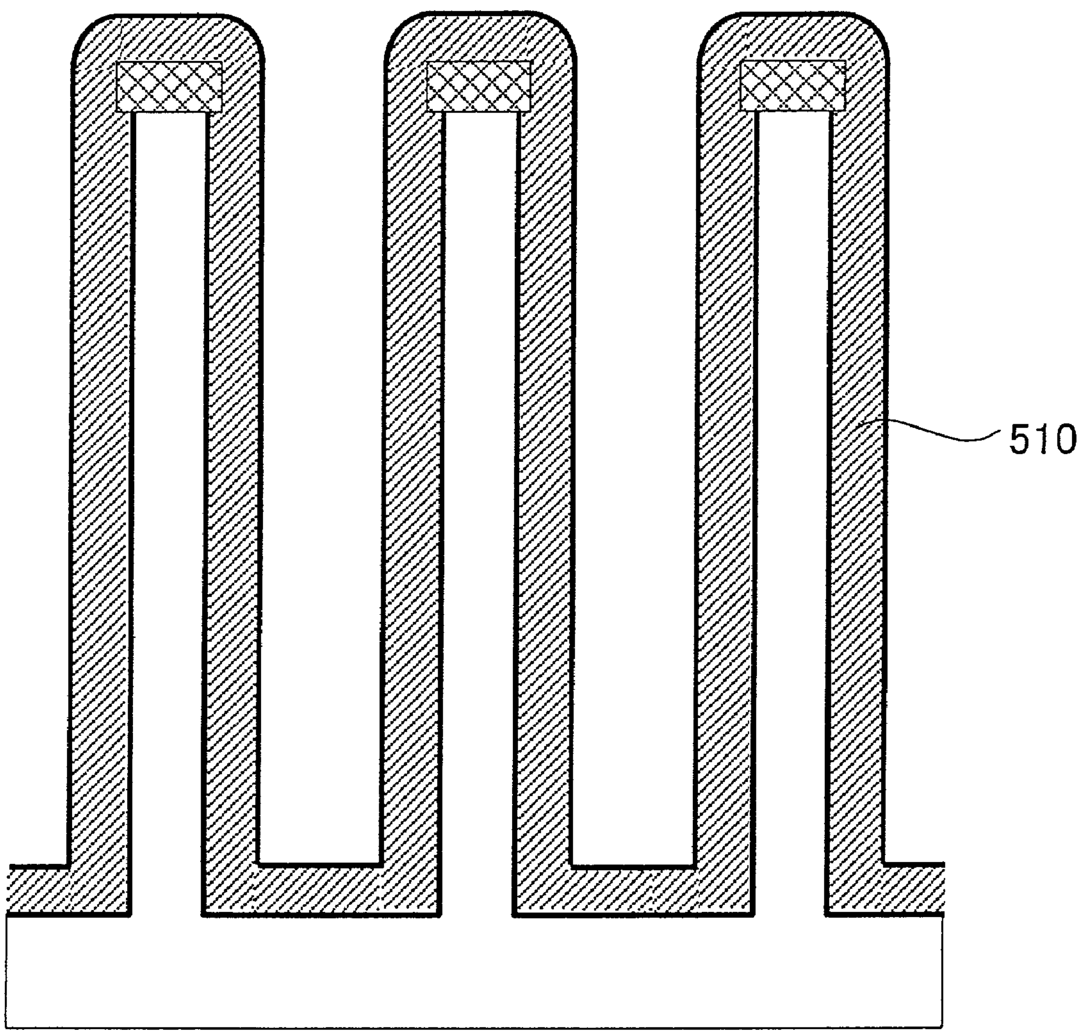

A first conductive film, for example, a polysilicon film 510, is deposited to about 50 to 200 nm thickness (FIG. 425 and FIG. 443).

Figure 426:
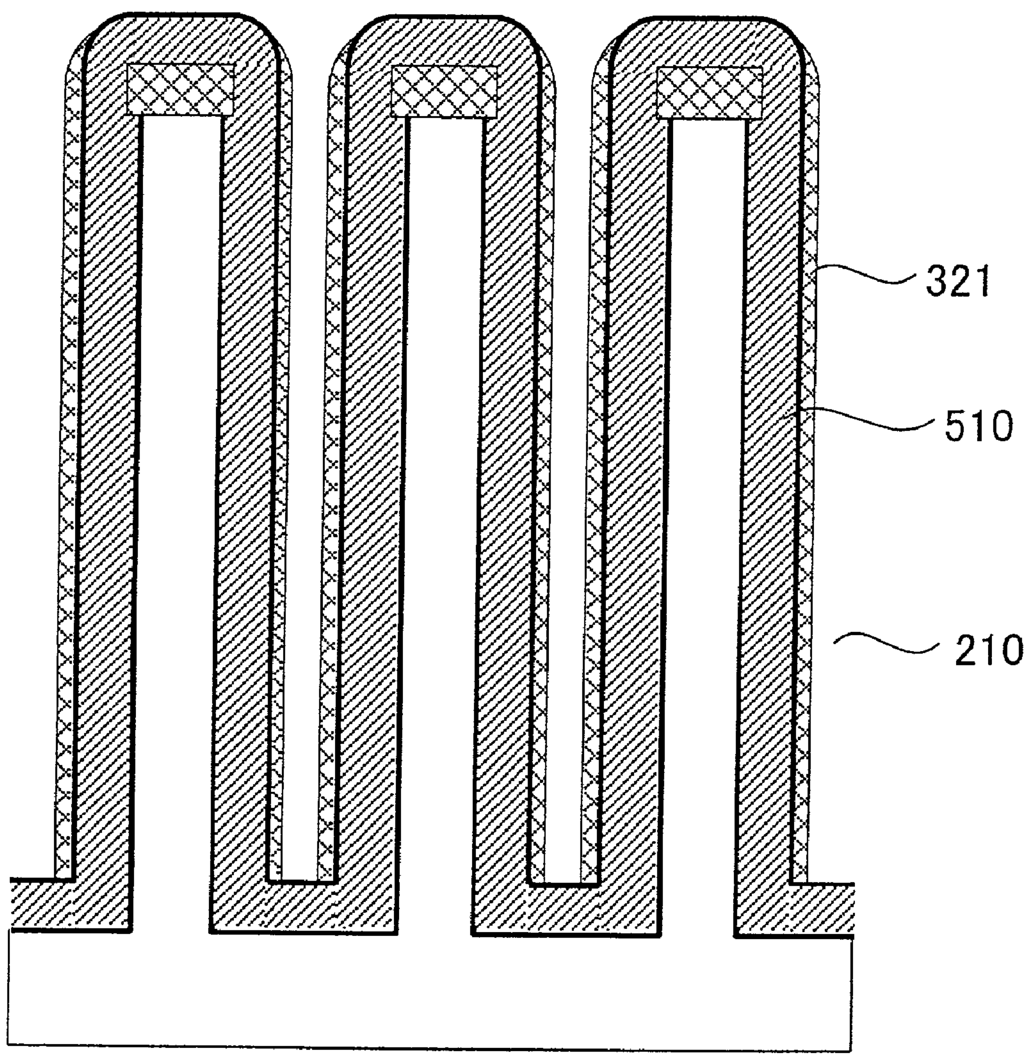
Figure 444:
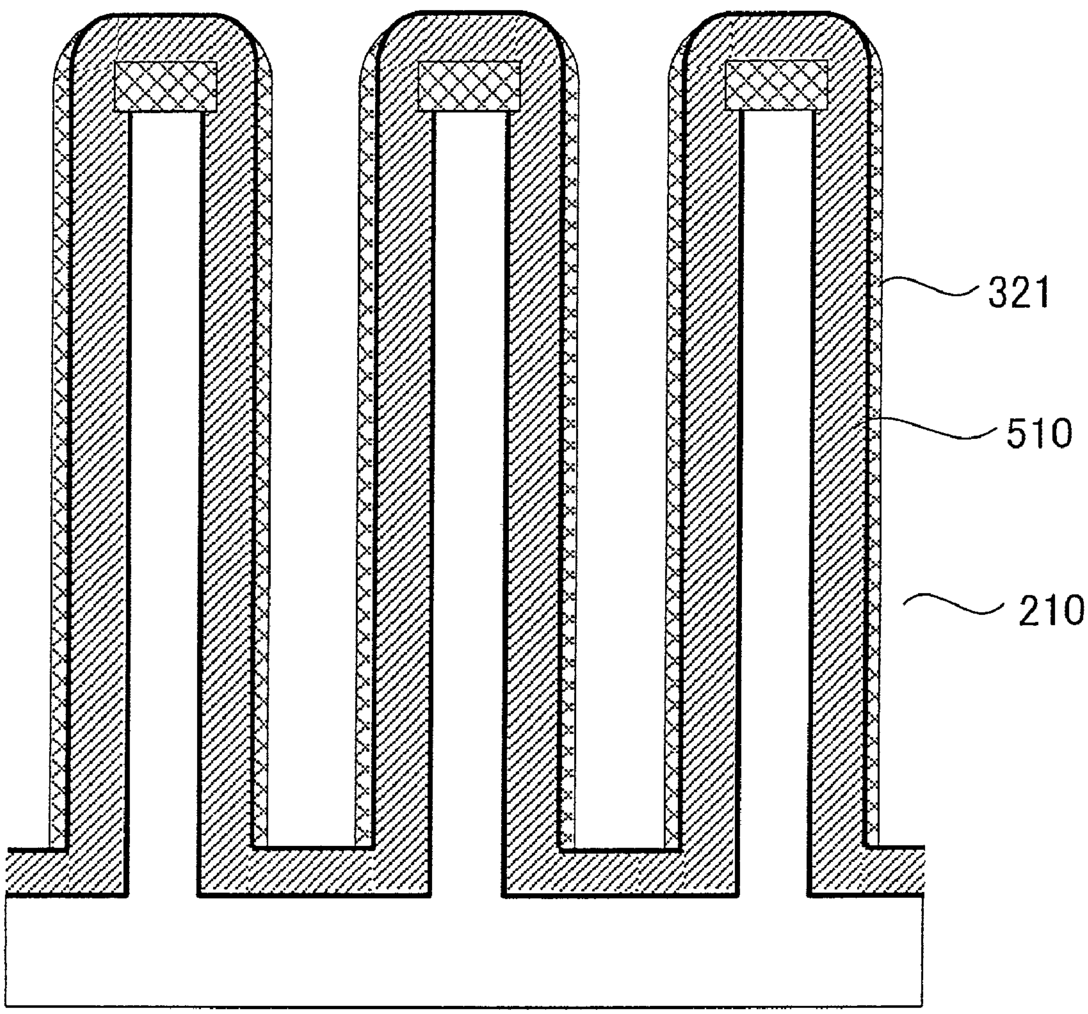

A fourth insulating film, for example, a silicon nitride film 321, is deposited to a thickness of 5 to 50 nm by CVD. The silicon nitride film 321 is etched by reactive ion etching to remain in the form of a sidewall spacer on the sidewall of the polysilicon film 510 (FIG. 426 and FIG. 444).

Figure 427:
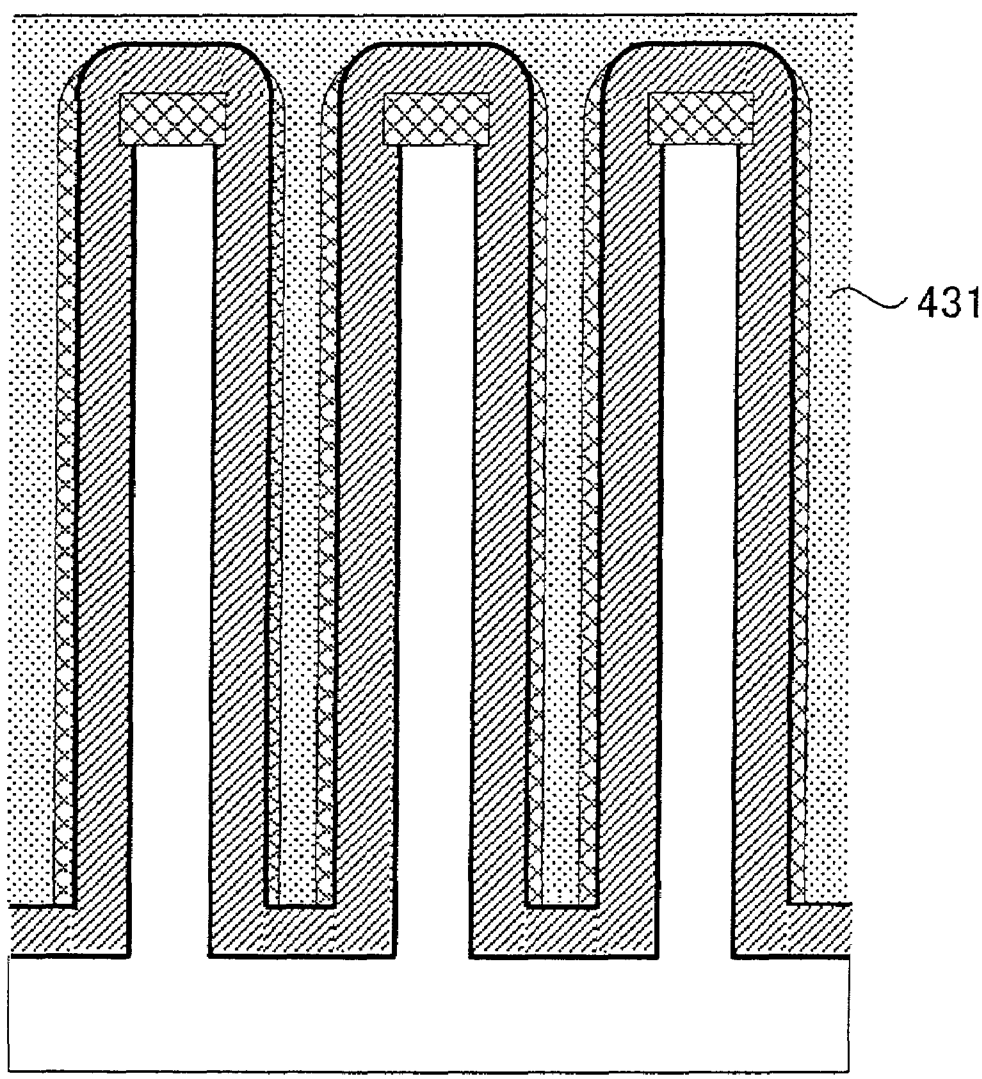
Figure 445:
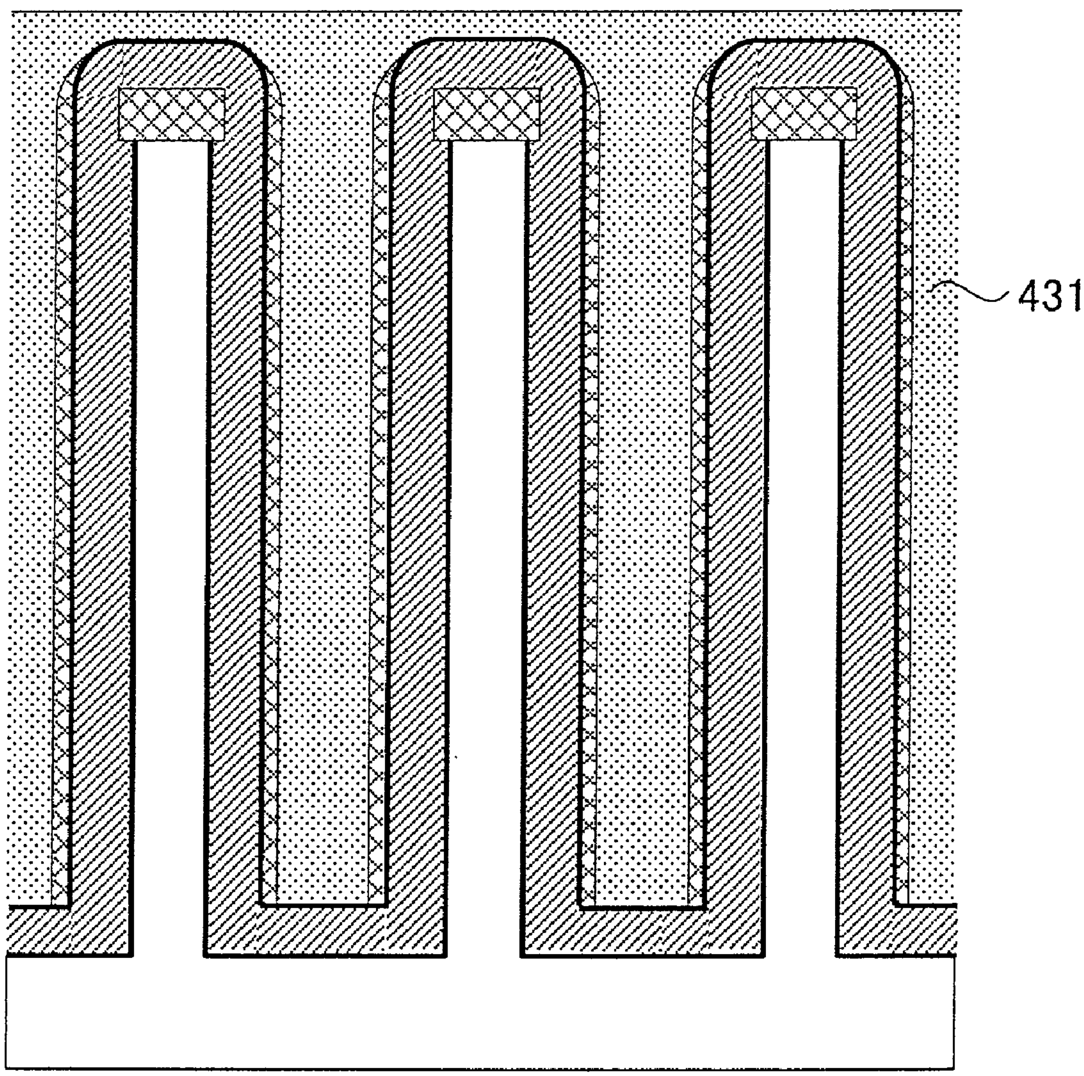

A fifth insulating film, for example, a silicon oxide film 431, is deposited to a thickness of 50 to 500 nm in the first lattice-form trench 210 (FIG. 427 and FIG. 445).

Figure 428:
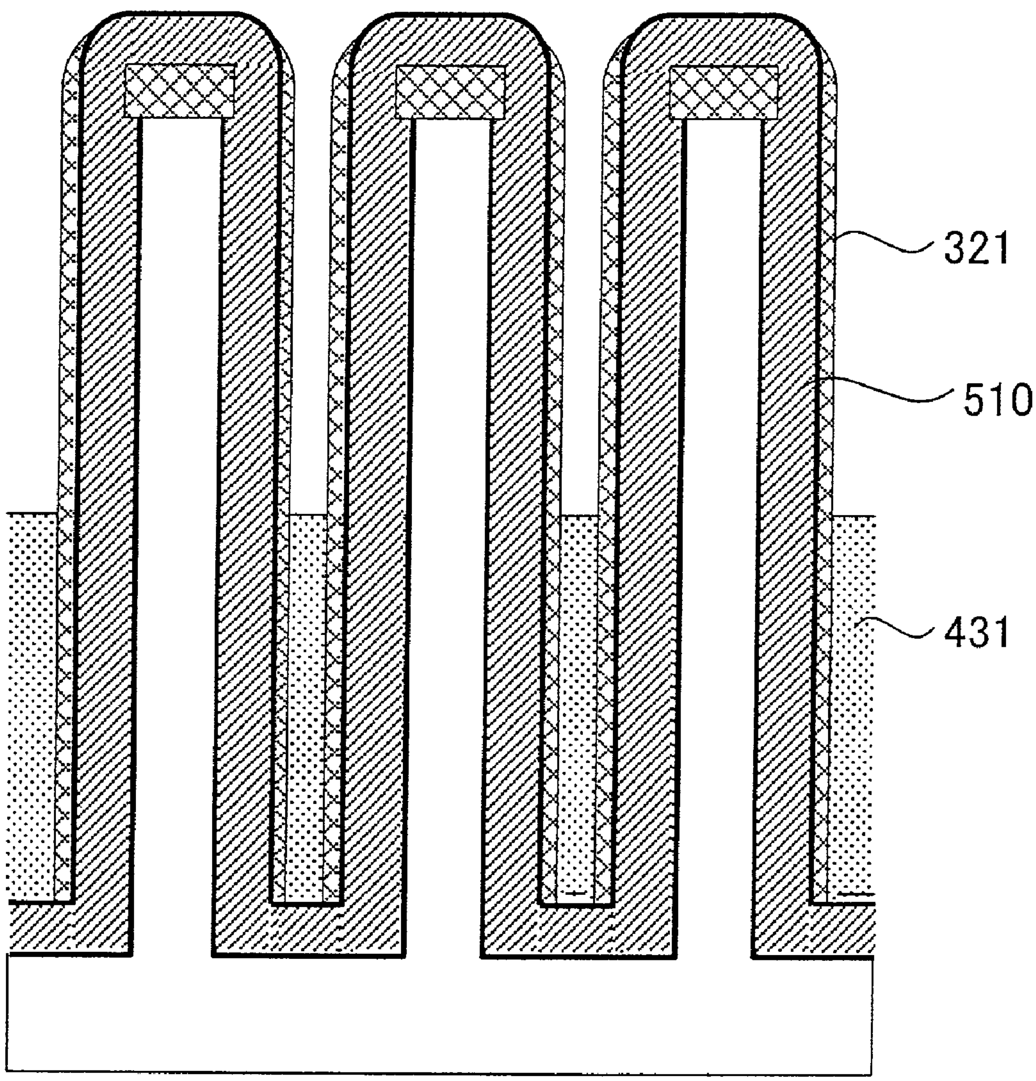
Figure 446:
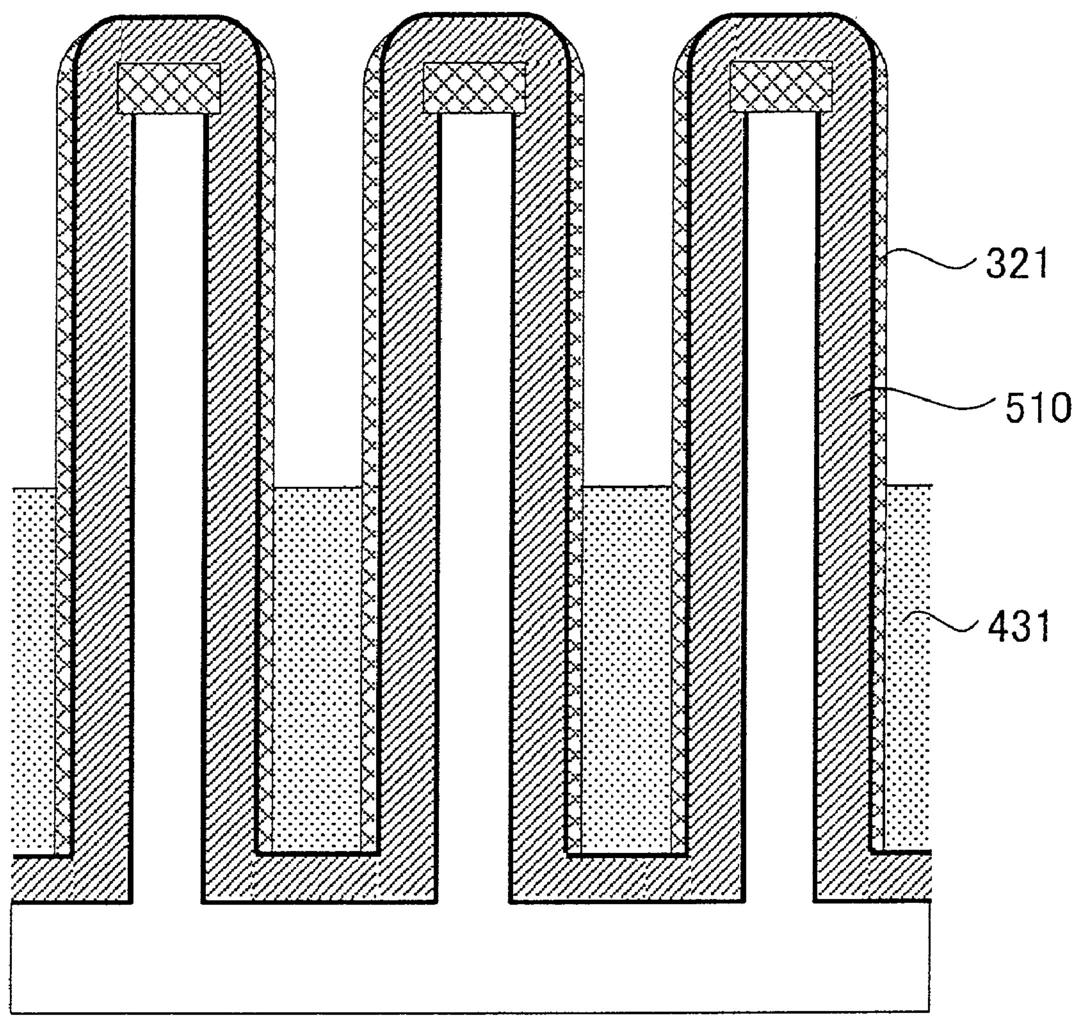

The silicon oxide film 431 is buried to a desired depth in the first lattice-form trench 210 (FIG. 428 and FIG. 446).

Figure 429:
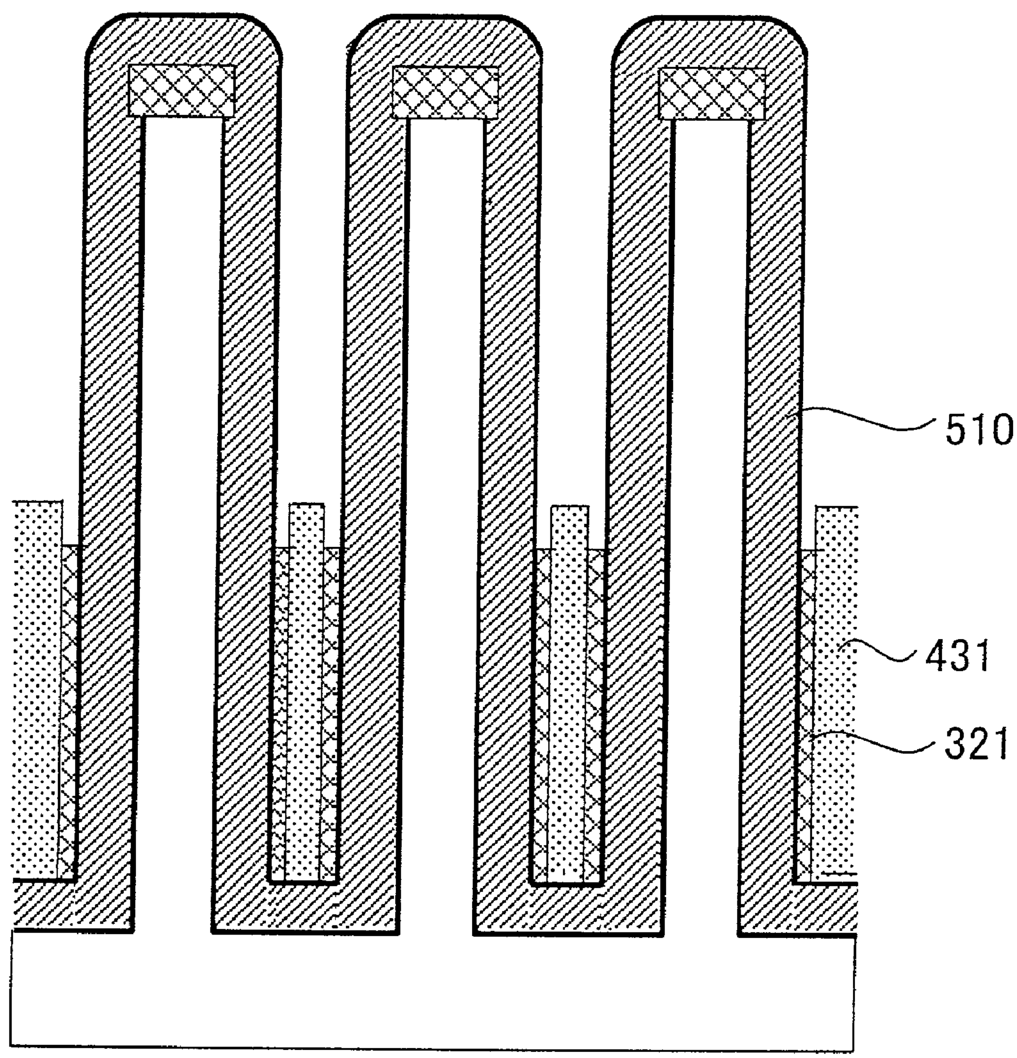
Figure 447:
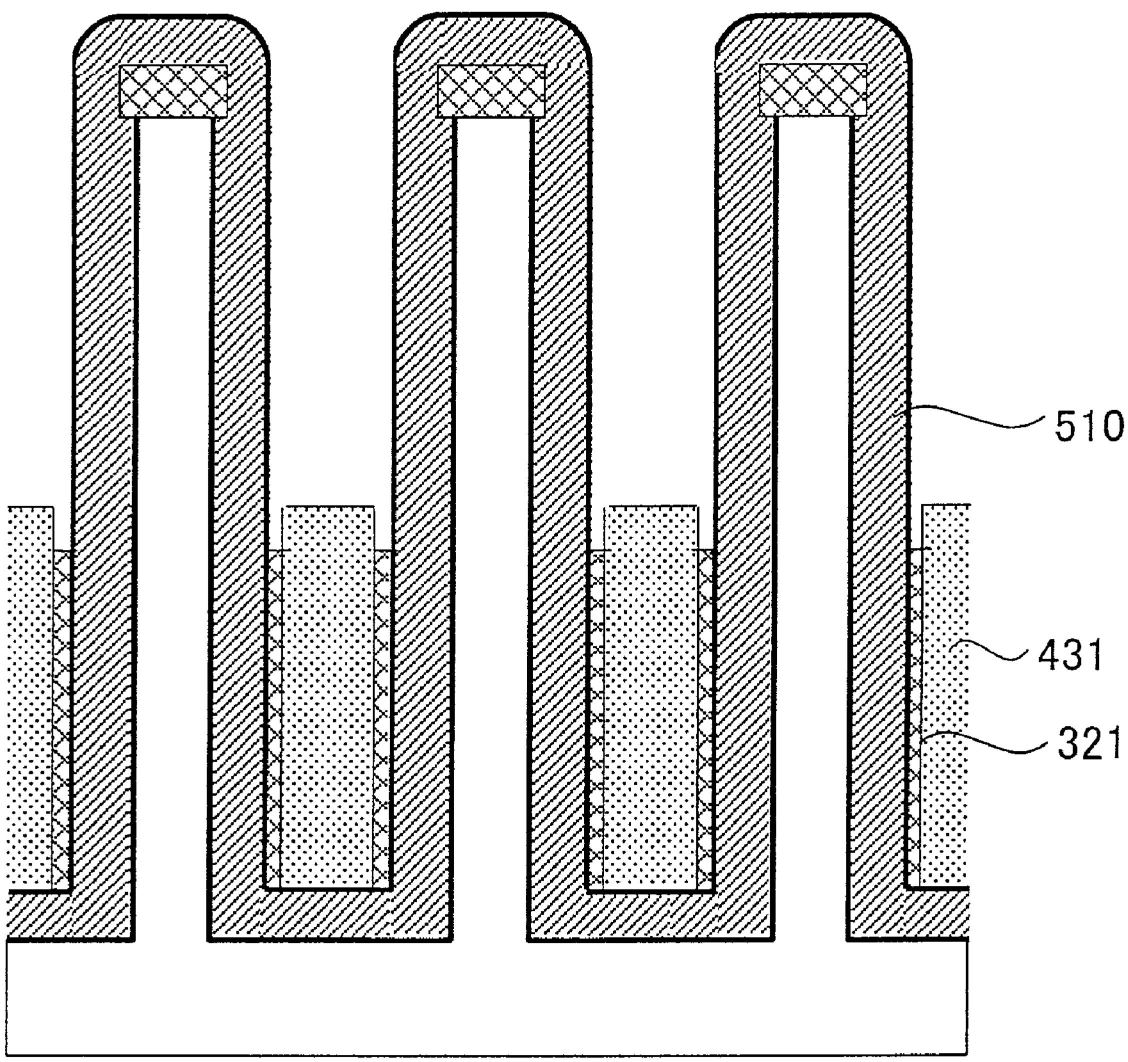

Using the silicon oxide film 431 as a mask, the silicon nitride film 321 is isotropically etched so that the silicon nitride 321 remains only between the silicon oxide film 431 and the polysilicon film 510 (FIG. 429 and FIG. 447).

Figure 430:
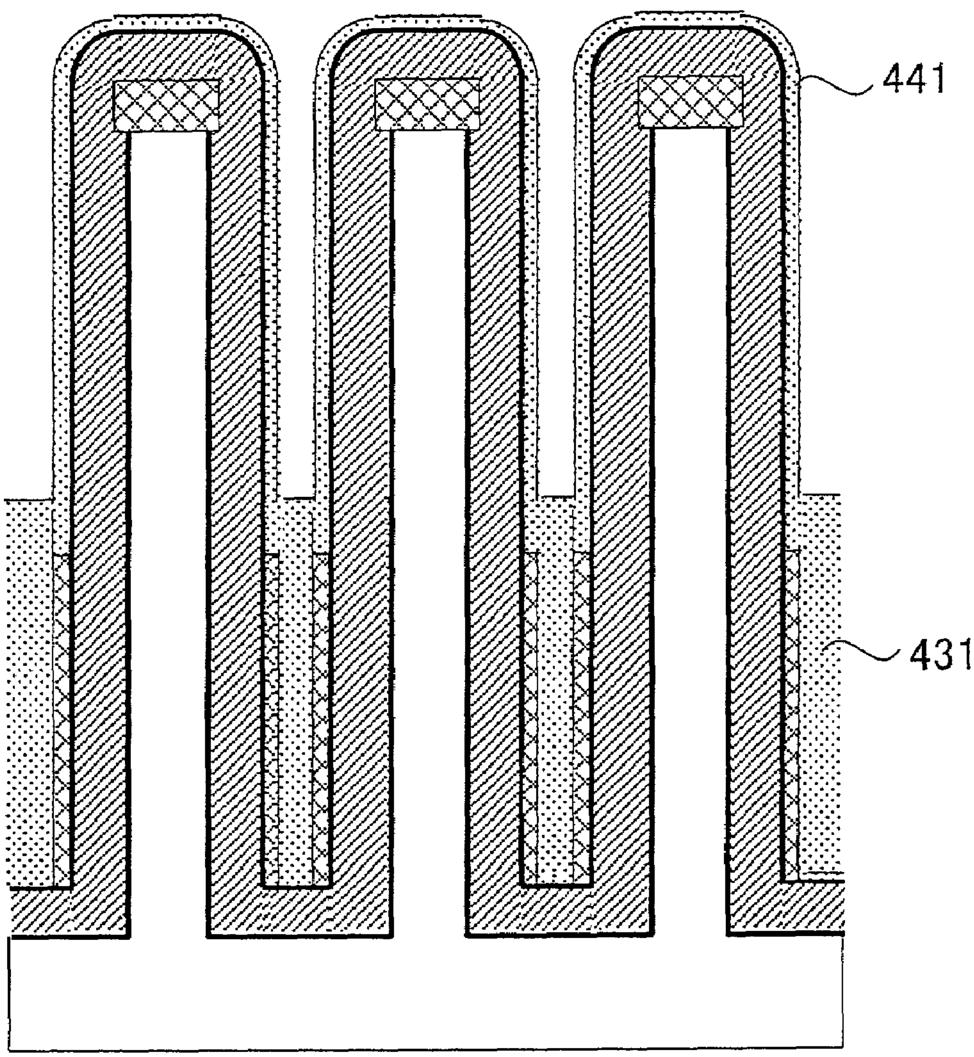
Figure 448:
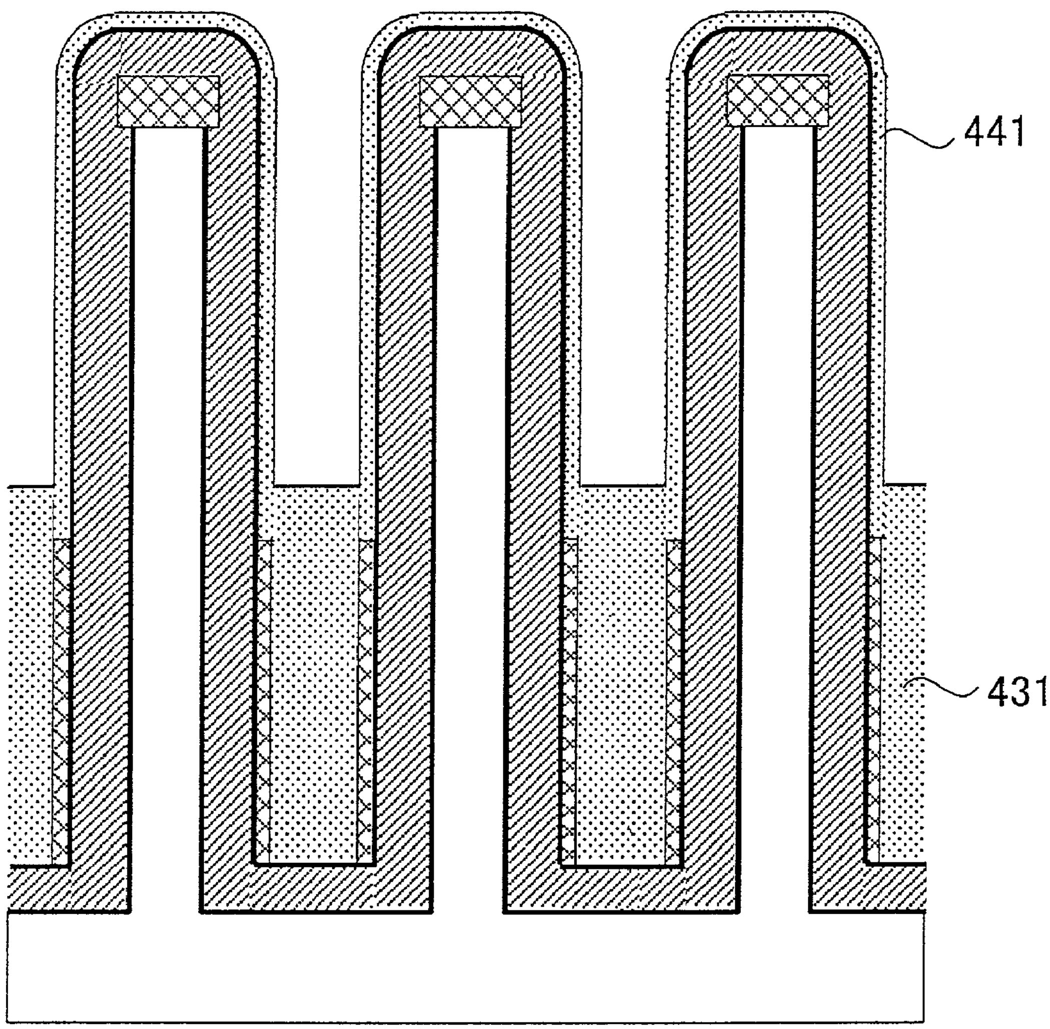

At this time, the silicon nitride film (the fourth insulating film) 321 is lower than the top surface of the silicon oxide film (the fifth insulating film) 431 to form a recess. In this recess, a silicon oxide film 441 is deposited as a sixth insulating film to a thickness of about 3 to 30 nm (FIG. 430 and FIG. 448). The above recess is filled if the thickness of the silicon oxide film 441 is about half or more of the thickness of the silicon nitride film 321. Since the silicon oxide film 441 deposits on the sidewall of the polysilicon film 510, the oxide film 441 is removed from the sidewall of the polysilicon film 510 by isotropic etching. The silicon oxide film 441 remains in the recess, and the silicon nitride film 321 is buried by the silicon oxide film 431 and the silicon oxide film 441.

Figure 431:
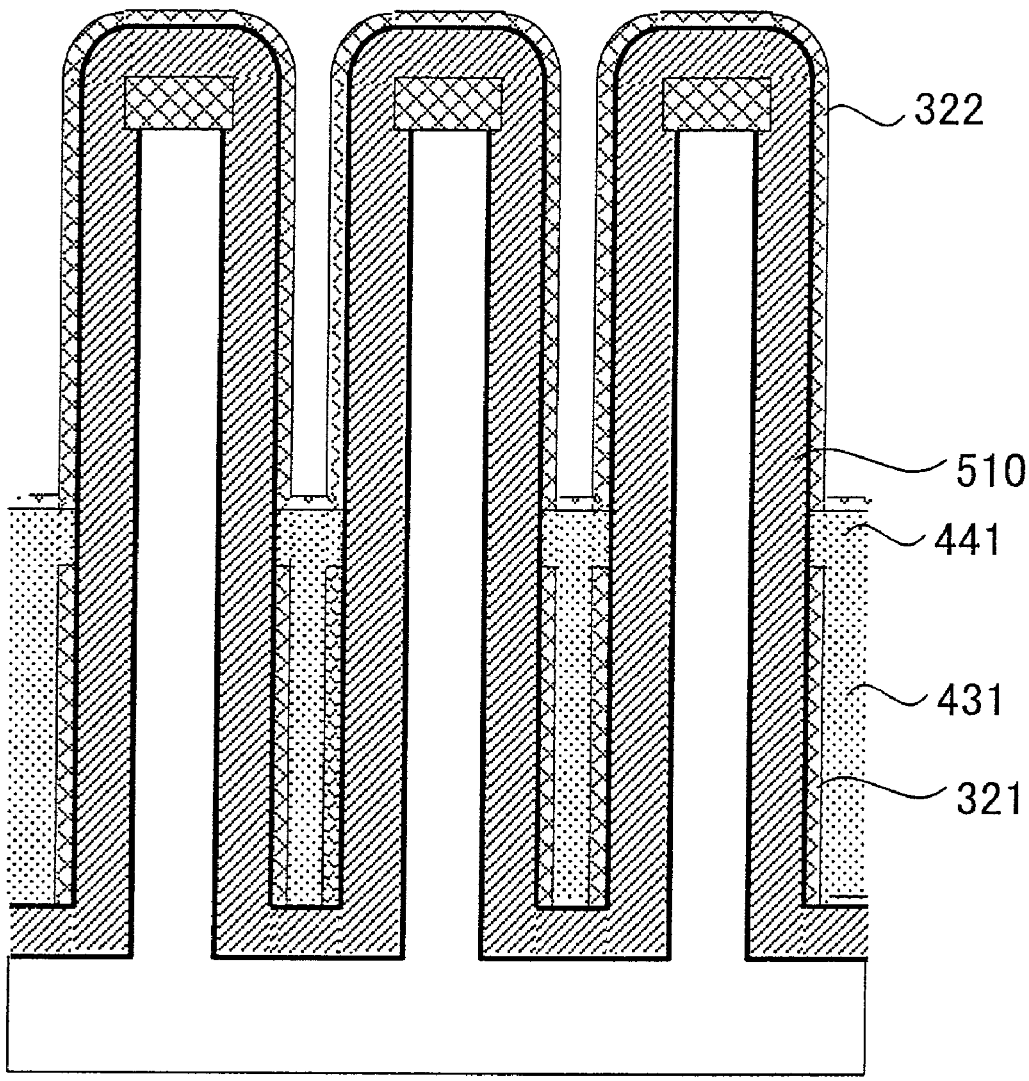
Figure 449:
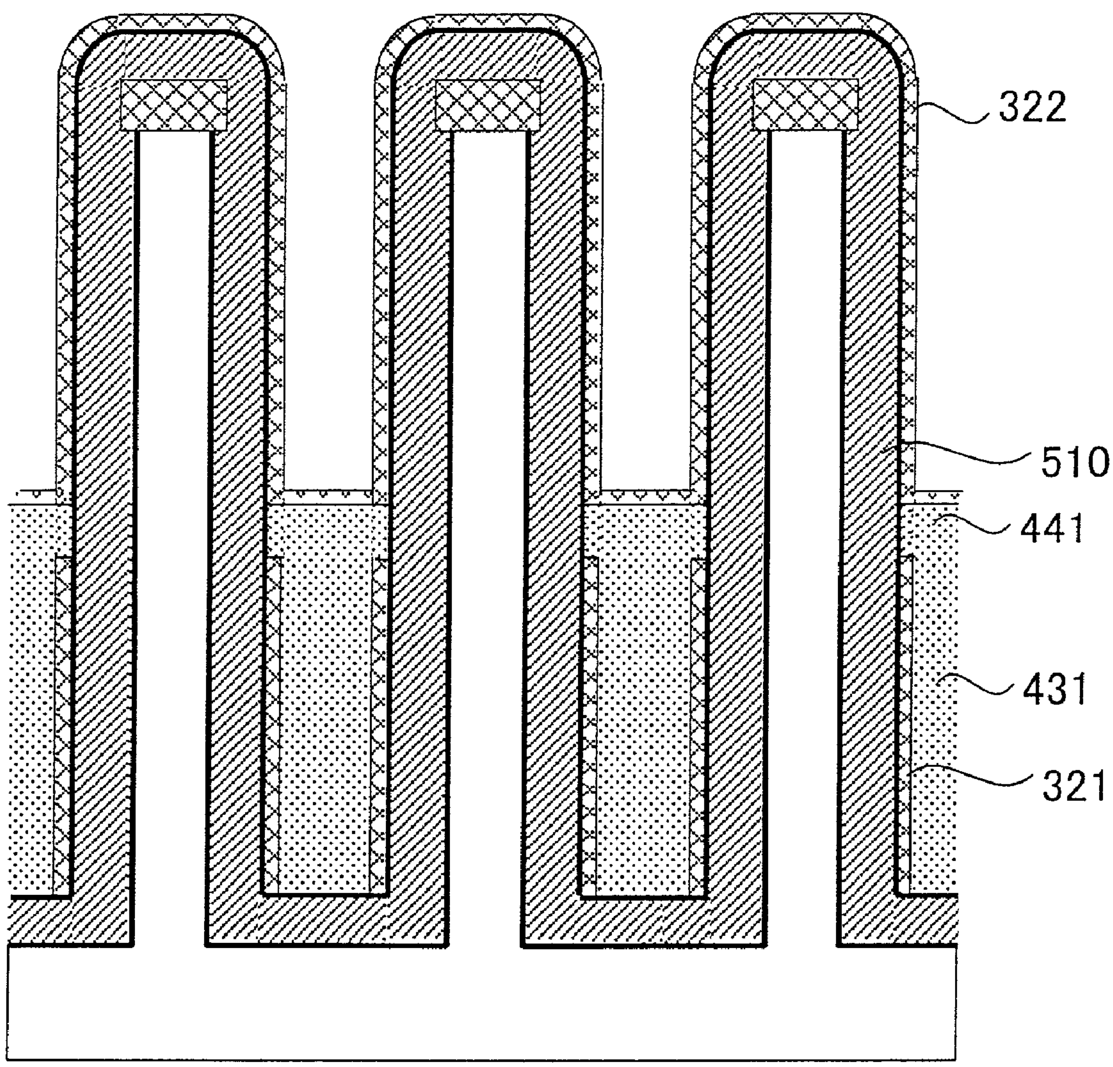

In the same manner, a silicon nitride film (a fourth insulating film) 322 is deposited to a thickness of about 5 to 50 nm by CVD (FIG. 431 and FIG. 449).

Figure 432:
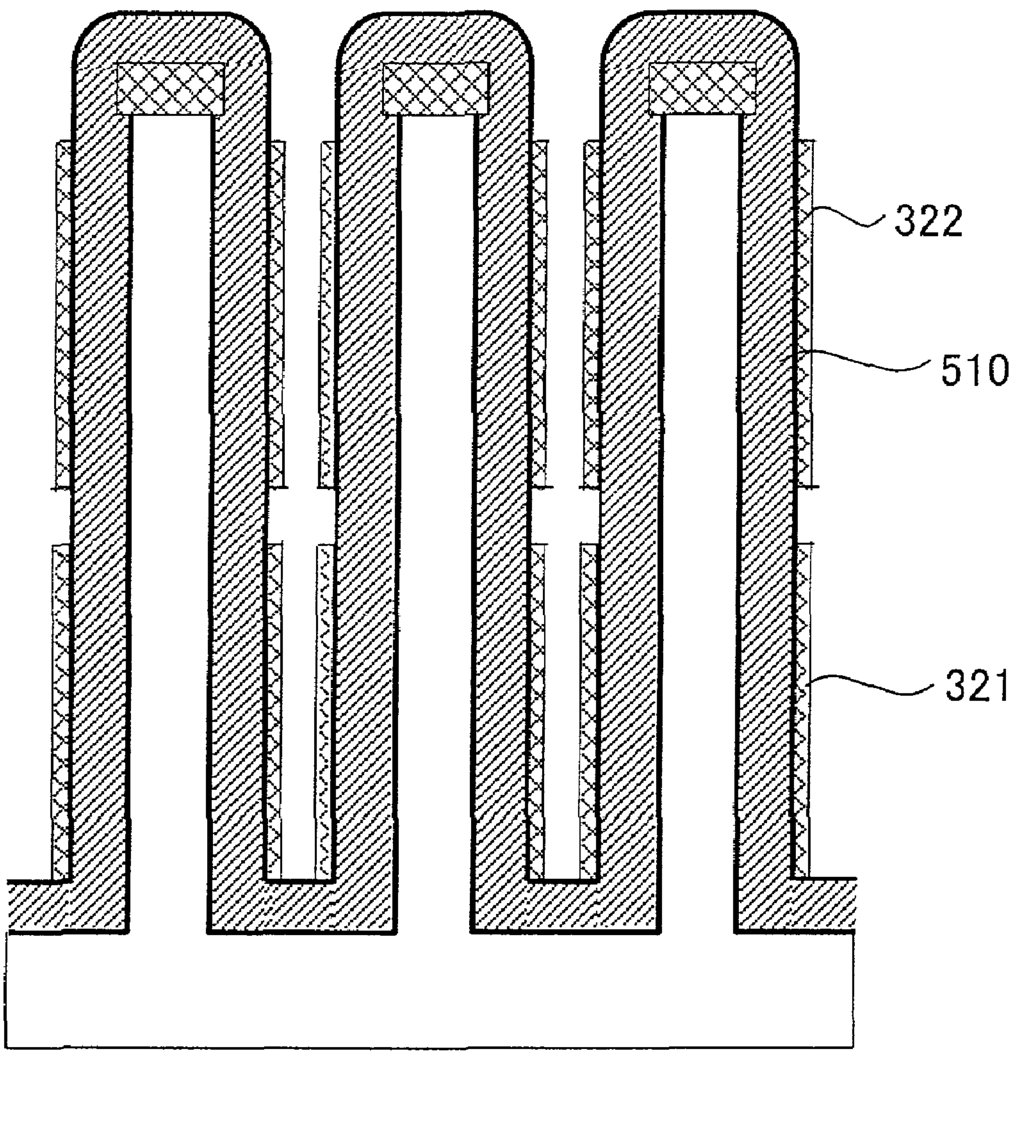
Figure 450:
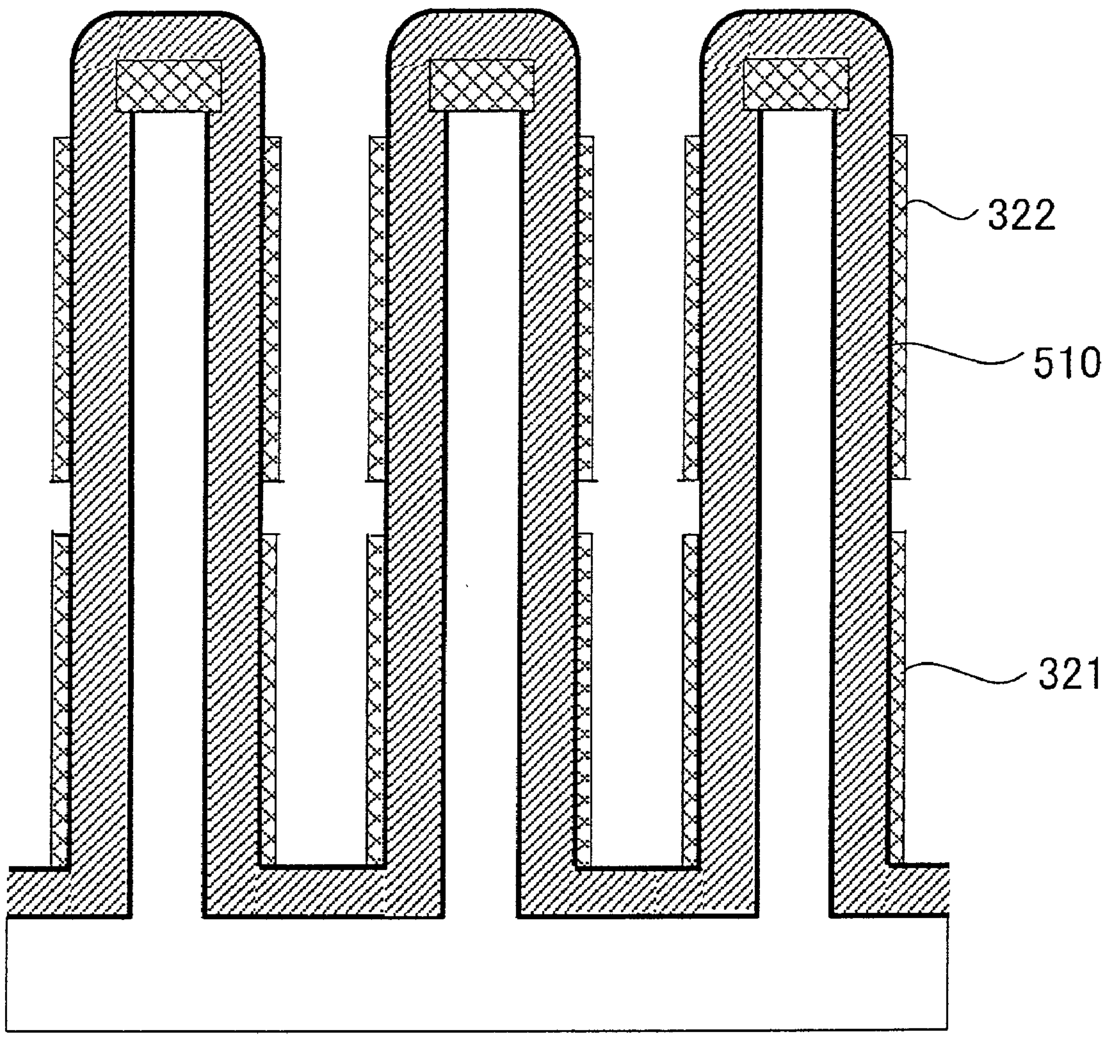

The silicon nitride film 322 is etched by reactive ion etching to remain in the form of a sidewall spacer on the sidewall of the polysilicon film 510 (FIG. 432 and FIG. 450).

Figure 433:
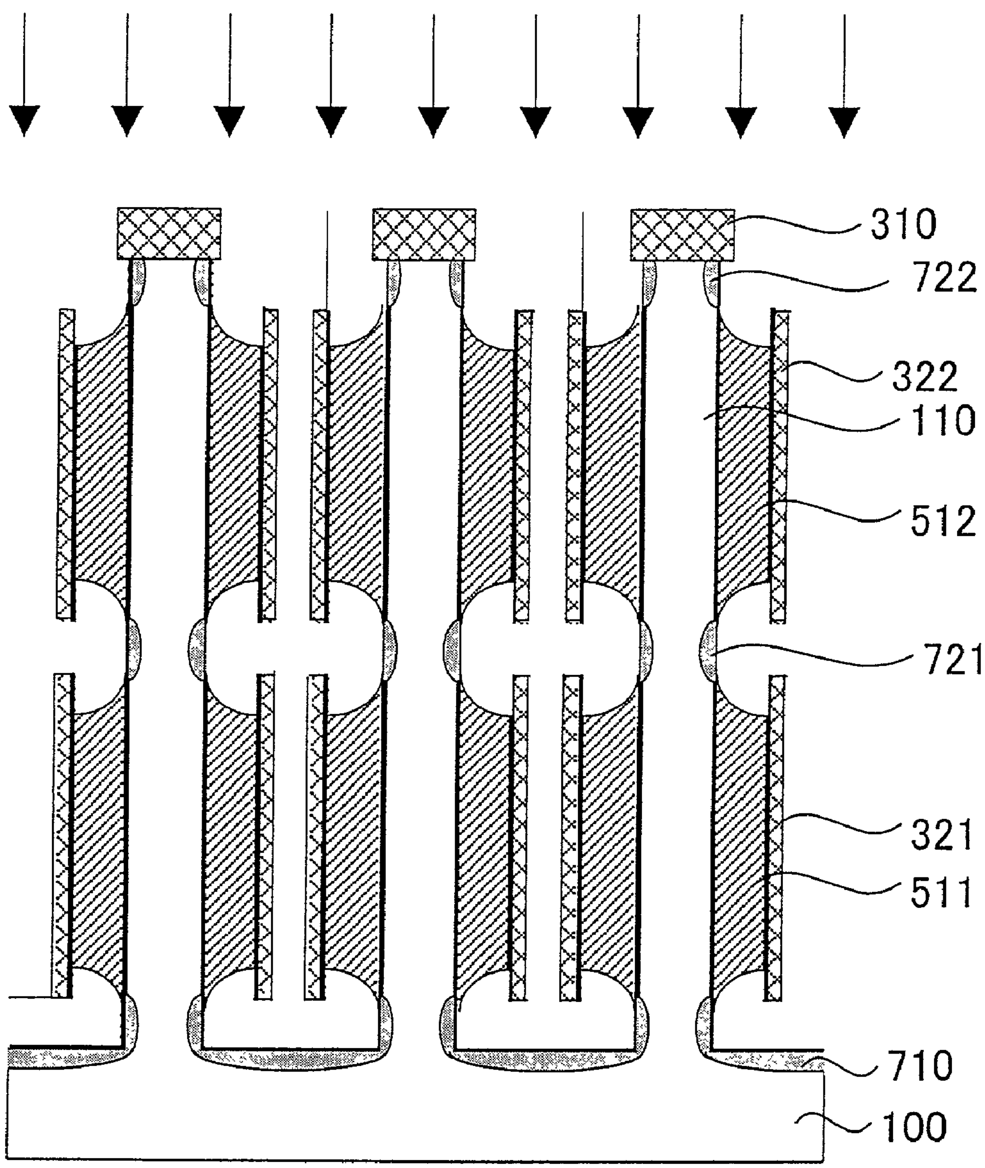
Figure 451:
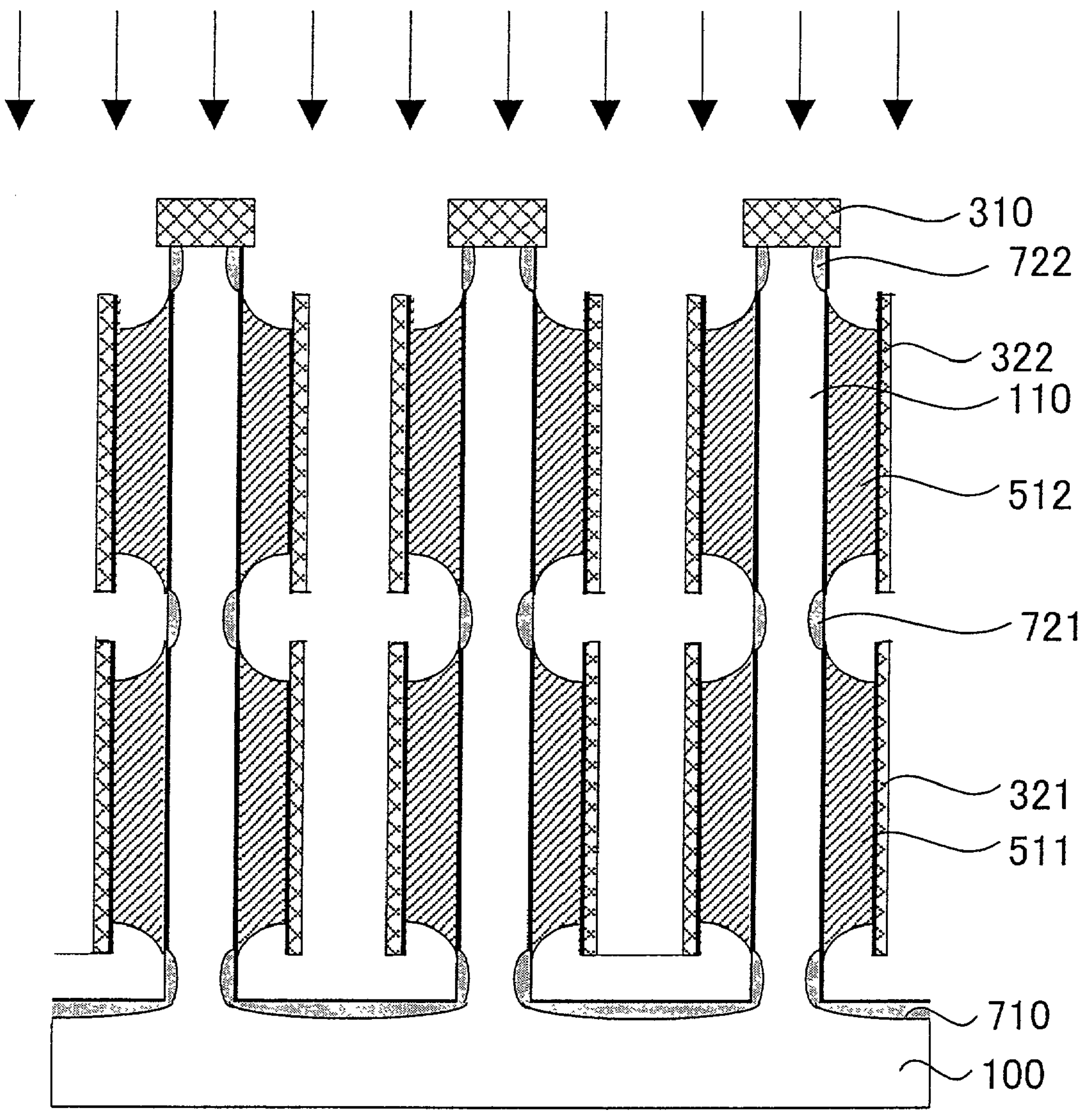

After a plurality of sidewall spacers are thus formed of the silicon nitride film on the sidewall of the polysilicon film 510, the polysilicon film 510 is divided by isotropic etching. Impurity introduction is carried out into the island-like semiconductor layers 110 and the semiconductor substrate 100 in self-alignment with the divided polysilicon films 511 to 514 and the silicon nitride film (the first insulating film) 310. For example, N-type impurity diffusion layers 710 to 724 are formed at an arsenic concentration of about $1\times10^{18}$ to $1\times10^{21}/cm^3$ using a diffusion process (e.g., solid phase diffusion process, vapor phase diffusion process, etc.). At this time, the impurity diffusion layer 710 to be a first wiring layer may be adjusted about its impurity concentration by ion implantation (FIG. 433 and FIG. 451). For example, the ion implantation may be performed at an implantation energy of 5 to 100 keV at a phosphorus dose of about $1\times10^{13}$ to $1\times10^{15}/cm^2$ in a direction inclined by about 0 to 7°.

Figure 434:
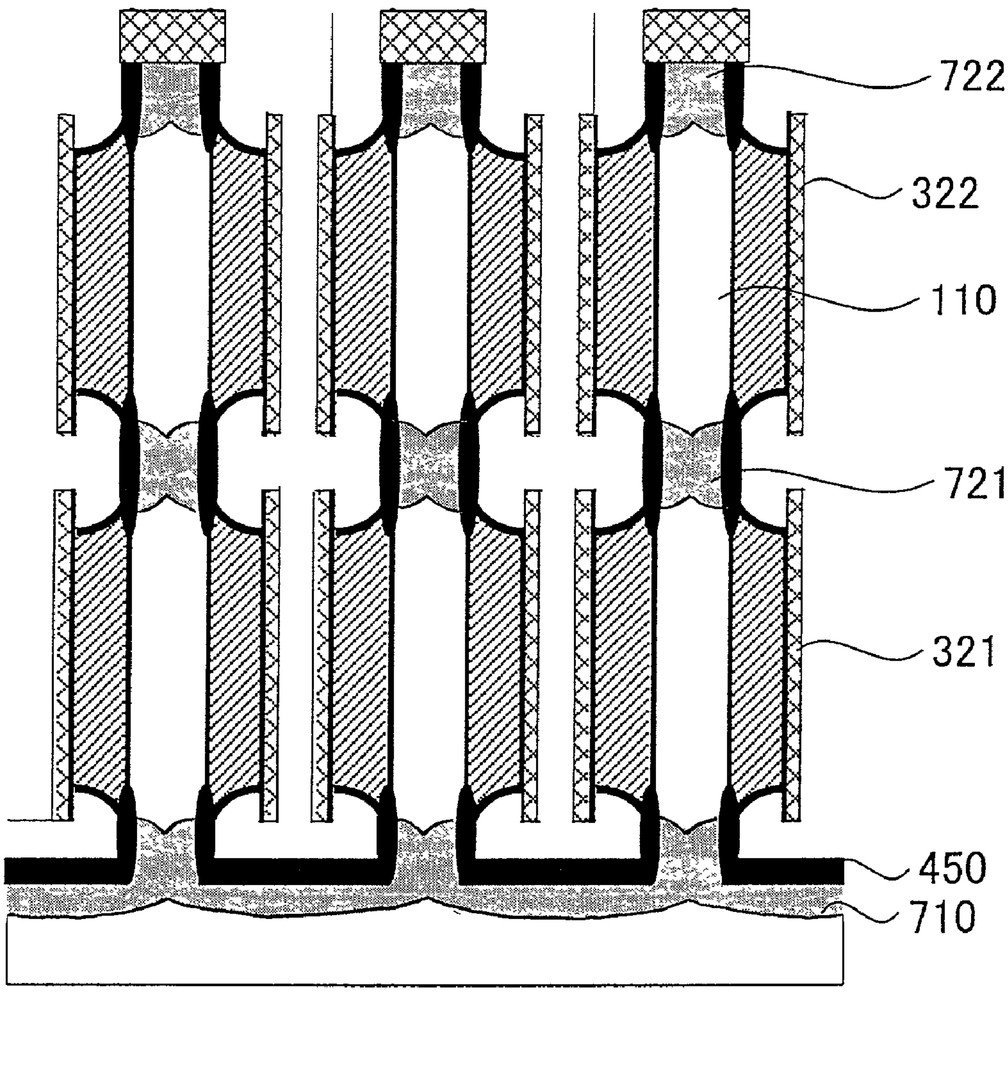
Figure 452:
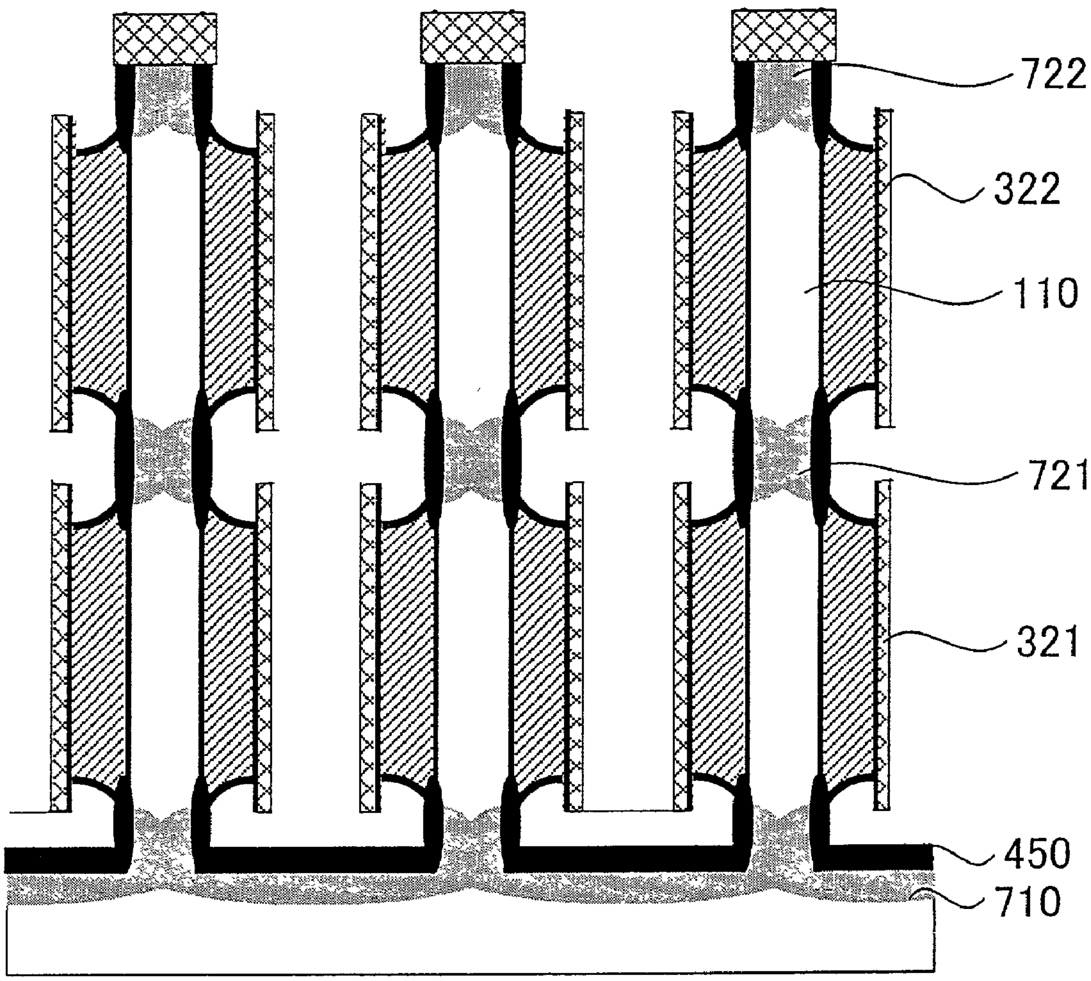

Exposed portions of the polysilicon films 511 to 512 are thermally oxidized selectively to form silicon oxide films 450 of 5 to 50 nm thickness which are seventh insulating films, for example. At this time, the impurity is diffused from the impurity diffusion layers 710 to 722 by thermal treatment to electrically float a P-type region of the island-like semiconductor layer 110 (FIG. 434 and FIG. 452). The timing of the impurity introduction to the polysilicon films 511 and 512 is not particularly limited so long as these films become conductive films. For example, the impurity introduction may be performed during the formation of the polysilicon film 510 or during the impurity introduction into the island-like semiconductor layers 110.

Figure 435:
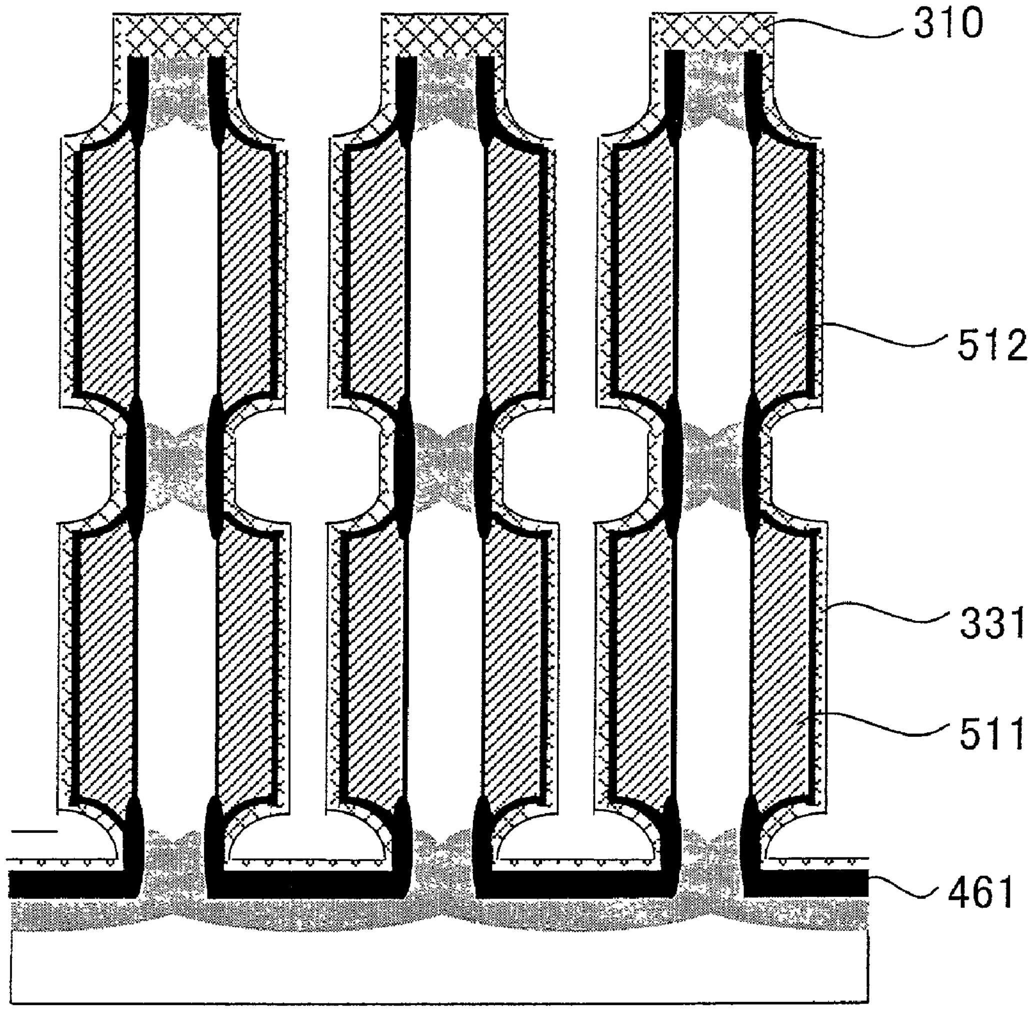
Figure 453:
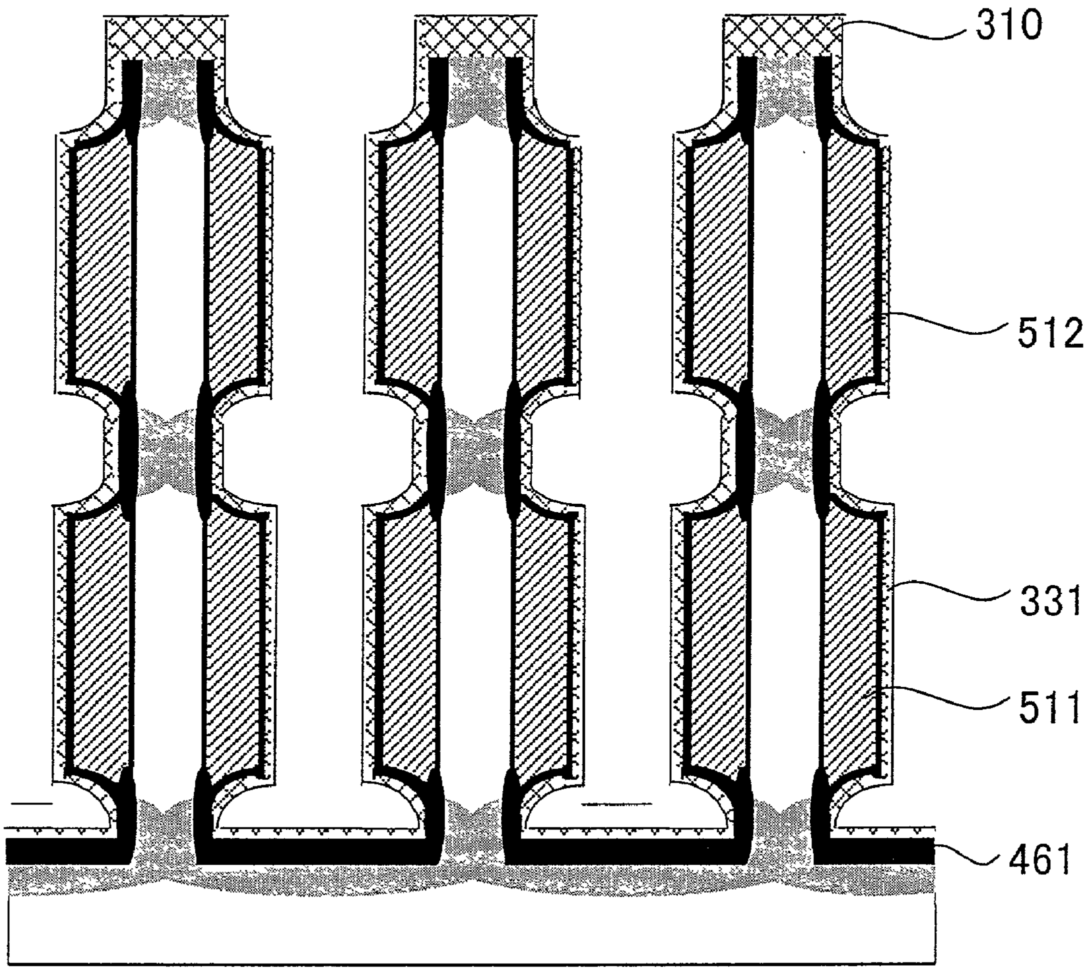

A silicon nitride film 331 which is a ninth insulating film is deposited to a thickness of 5 to 50 nm on the polysilicon films (the first conductive films) 511 and 512 and the silicon oxide film (the seventh insulating film) 450 (FIG. 435 and FIG. 453).

Figure 436:
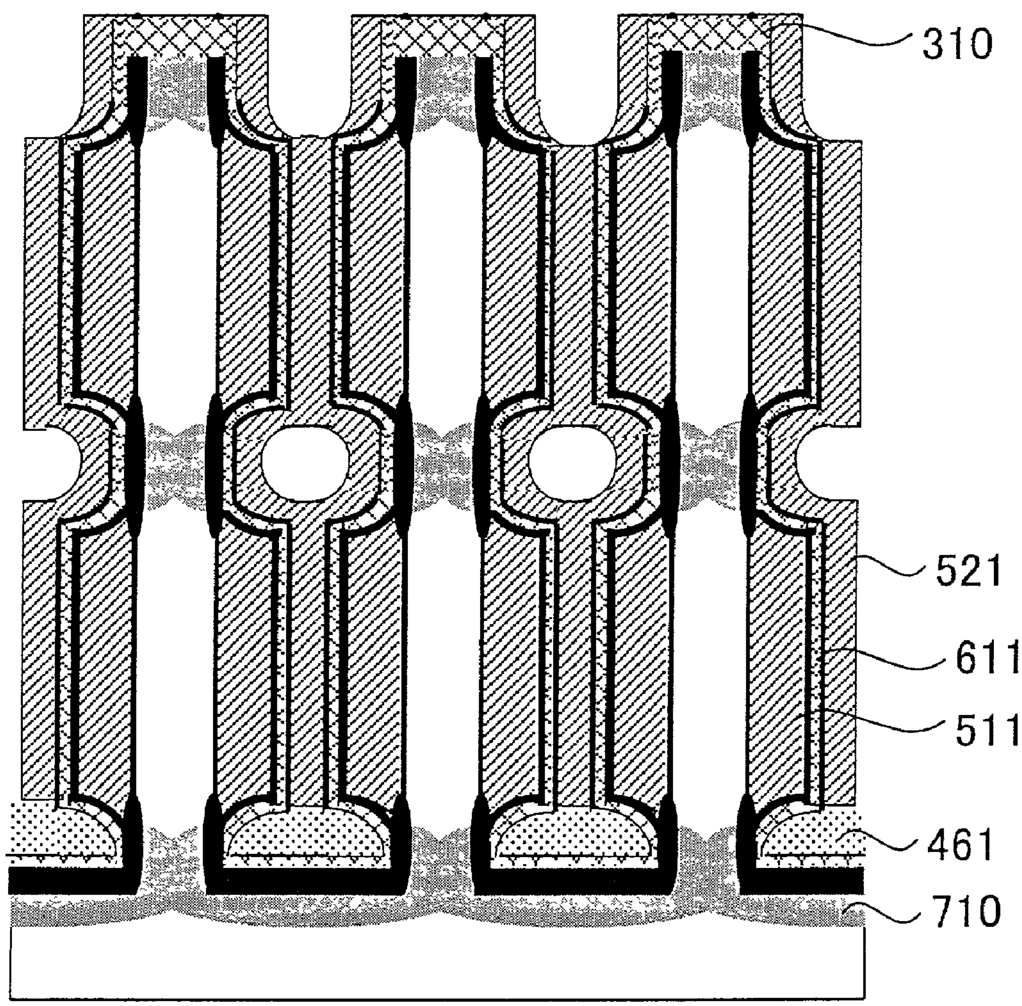
Figure 454:
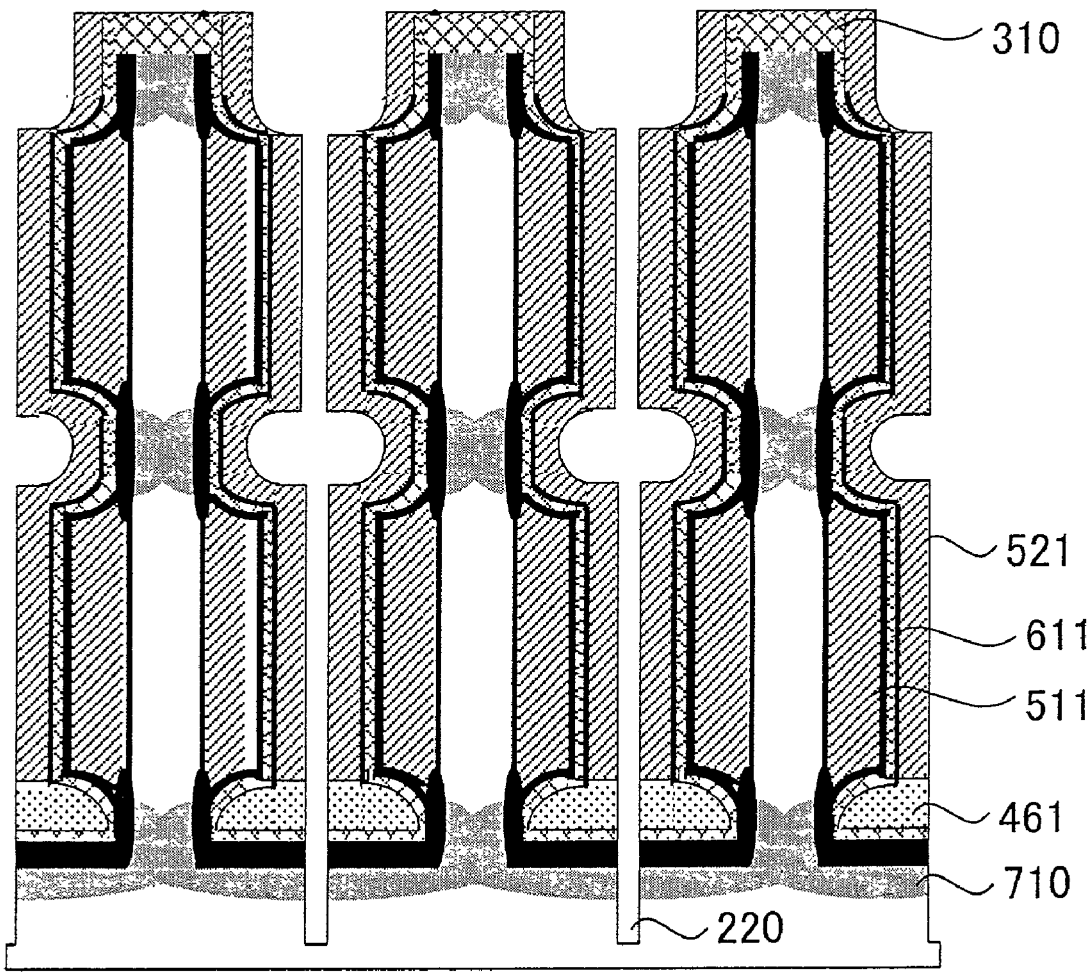

A silicon oxide film 461 which is an eighth insulating film is deposited to a thickness of 50 to 500 nm by CVD and is anisotropically and isotropically etched so that the silicon oxide film 461 is buried to expose the side of the polysilicon 511. The sidewall spacers of the silicon nitride film 331 are removed by isotropic etching, and an interlayer insulating film 611 is formed on exposed surfaces of the polysilicon films 511 and 512 (FIG. 436 and FIG. 454). The interlayer insulating film 611 may be formed of an ONO film, for example. More particularly, a silicon oxide film of 5 to 10 nm thickness is formed on the surface of the polysilicon film by thermal oxidization, and then, a silicon nitride film of 5 to 10 nm thickness and a silicon oxide film of 5 to 10 nm thickness are formed sequentially by CVD.

Figure 437:
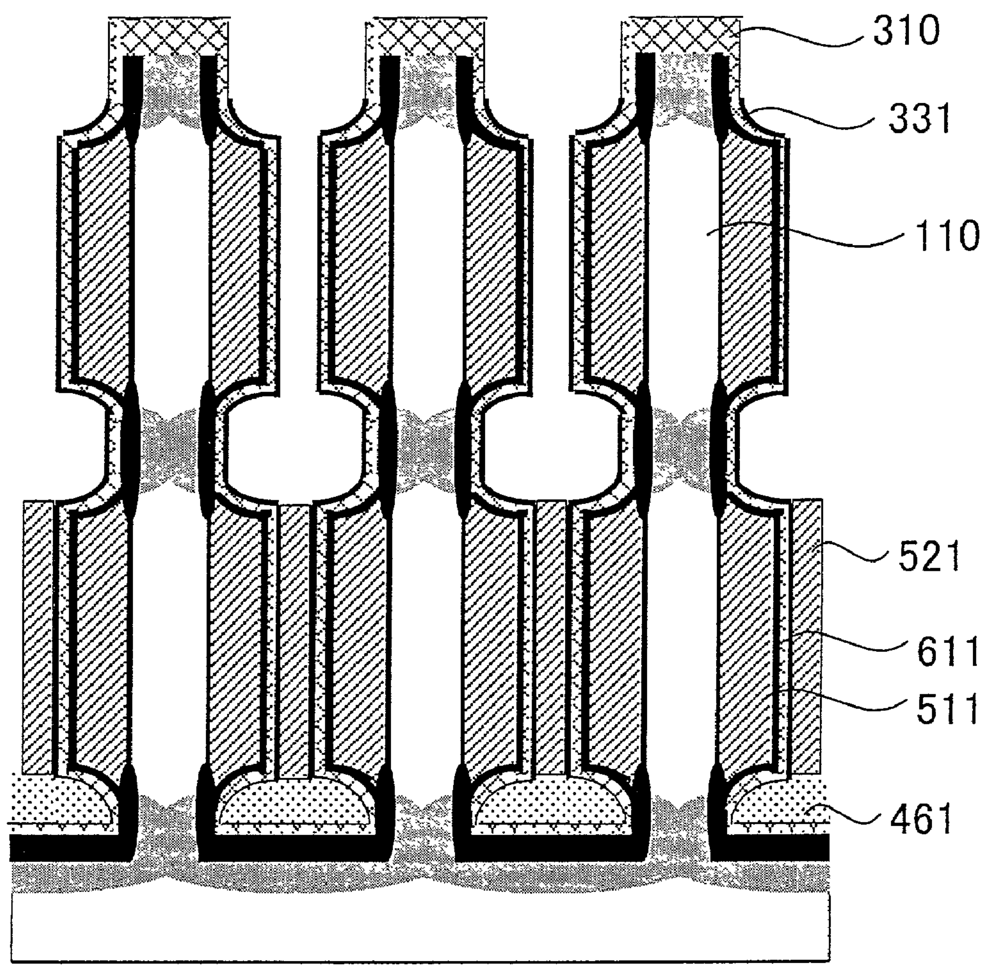
Figure 438:
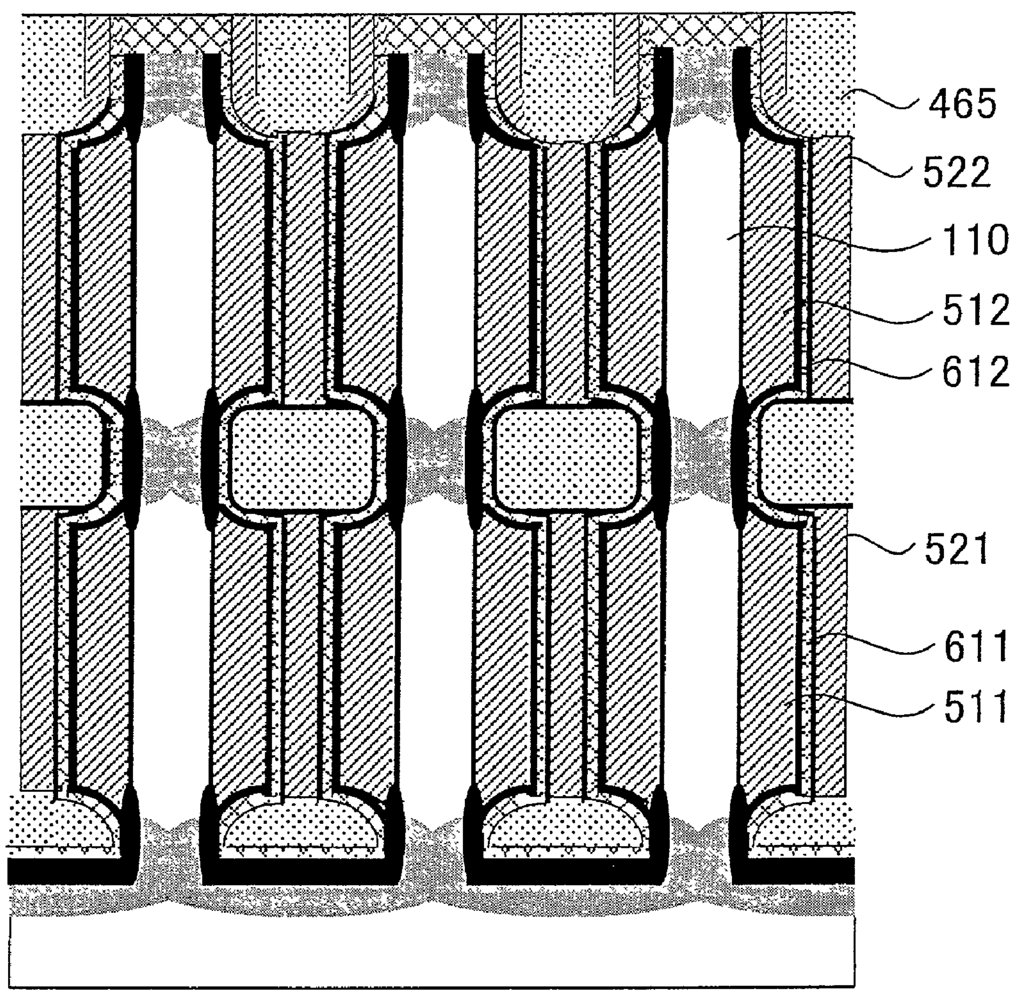
Figure 455:
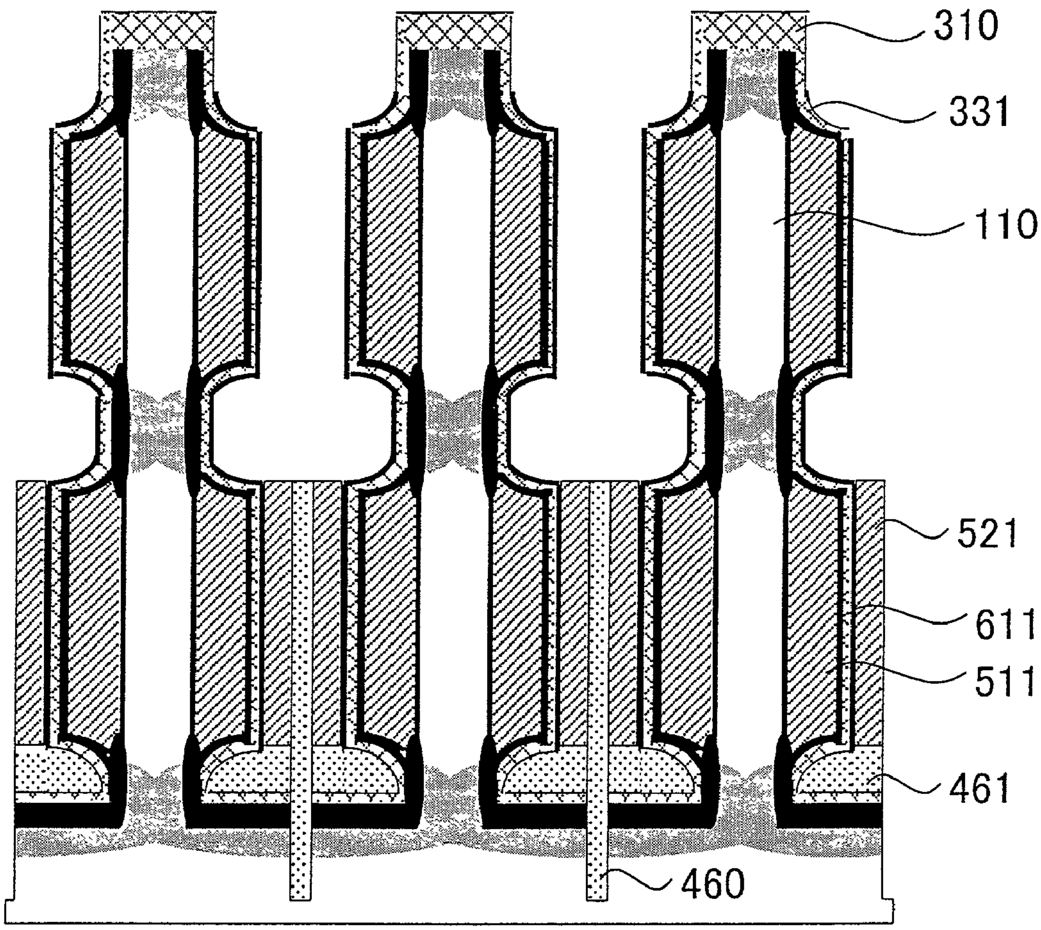
Figure 456:
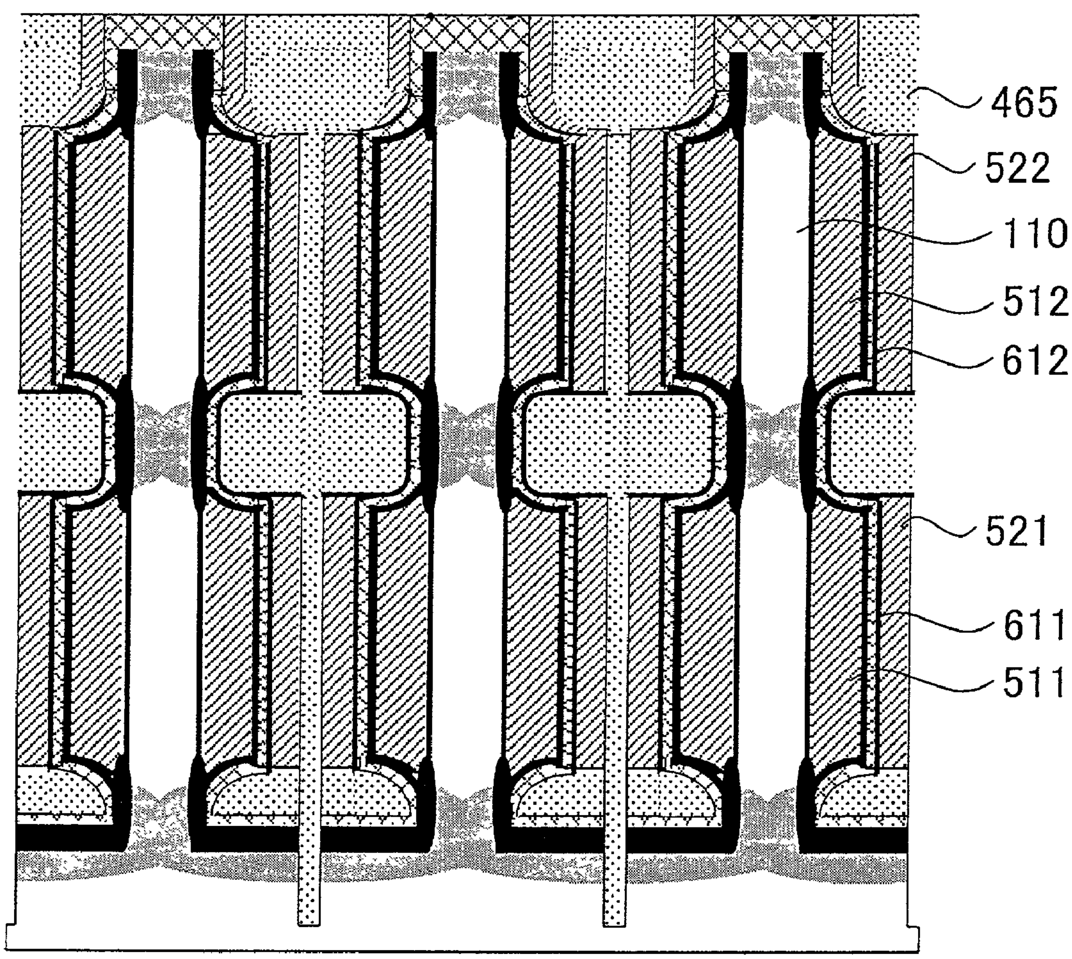

Subsequently, likewise, a polysilicon film 521 which is a second conductive film is deposited to a thickness of 15 to 150 nm and etched back so that the polysilicon film 521 is disposed on the side of the polysilicon film (the first conductive film) 511 with intervention of the interlayer insulating film 611 (FIG. 437 and FIG. 455). At this time, as shown in FIG. 455, a second trench 220 is formed in the semiconductor substrate 100 in self-alignment with the polysilicon film 521. A silicon oxide film 460 is buried in the second trench 220 to separate the impurity diffusion layer 710. That is, a separation portion of the first wiring layer is formed in self-alignment with a separation portion of the second conductive film. At this time, by setting the intervals between the island-like semiconductor layers 110 in the direction of A–A' in FIG. 50 to a predetermined value or smaller, the polysilicon film 521 is formed into a third wiring layer to be a control gate line continuous in the direction without need to use a masking process. By repeating these steps, a polysilicon film (a second conductive film) 522 is disposed on the side wall of the polysilicon film (the first conductive film) 512 with intervention of the interlayer insulating film 612. An oxide film 465 which is a tenth insulating film is deposited to a thickness of 100 to 500 nm on the top of the polysilicon film (the second conductive film) 522 (FIG. 438 and FIG. 456).

Figure 439:
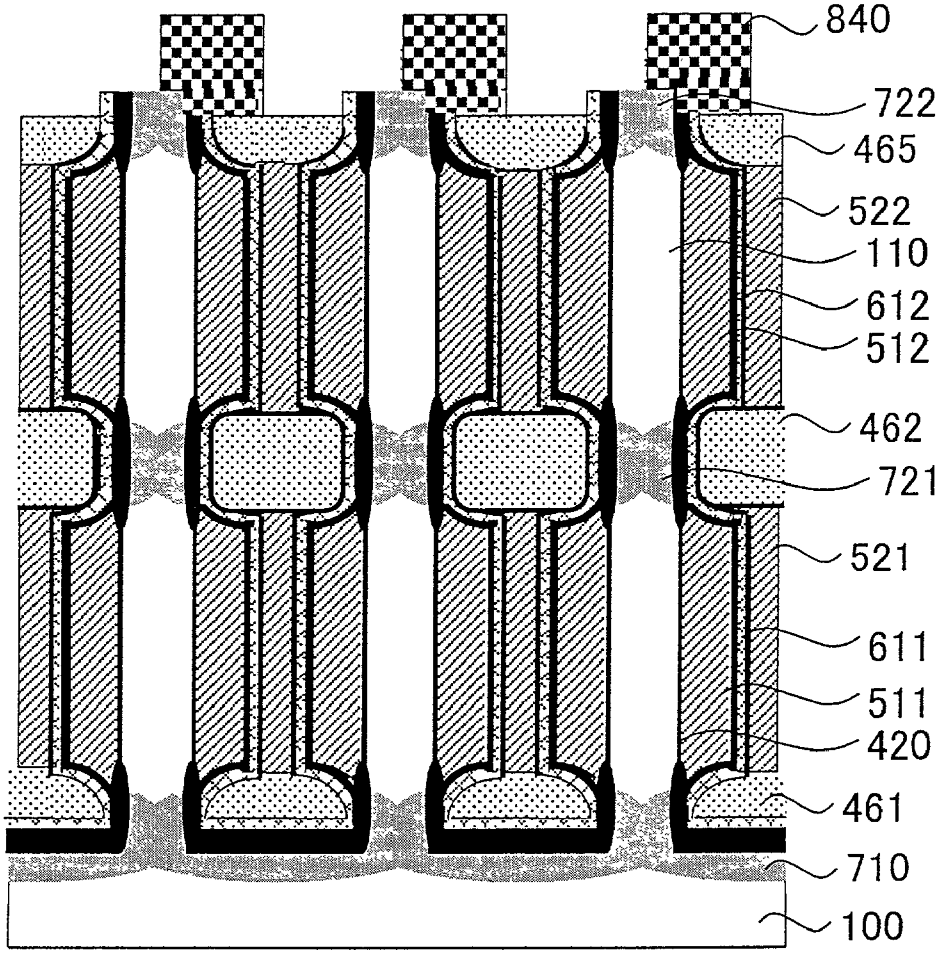
Figure 457:
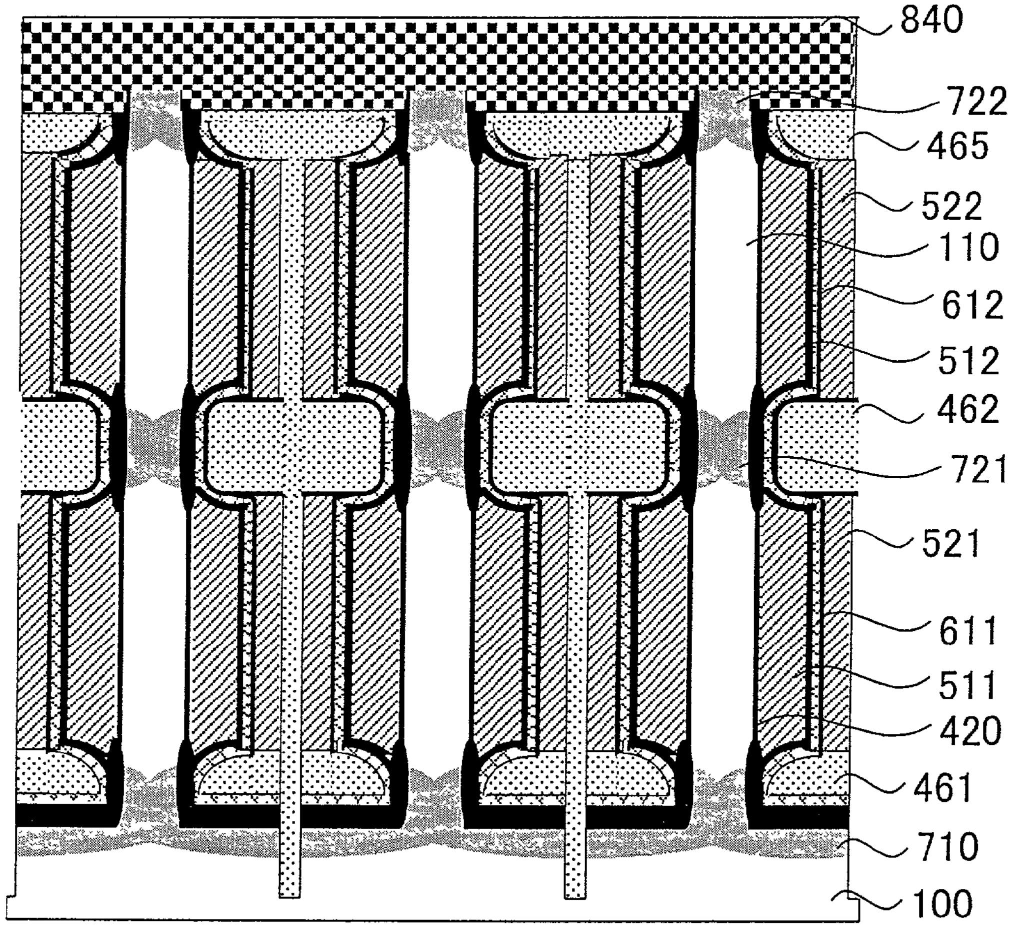

The top of the island-like semiconductor layer 110 provided with the impurity diffusion layer 722 is exposed by etch-back or by CMP. A fourth wiring layer 840 is formed as a bit line in such a manner that its direction crosses the direction of the second and third wiring layers and is connected to the top of the island-like semiconductor layer 110 (FIG. 439 and FIG. 457).

Thereafter, by known techniques, an interlayer insulating film is formed, and a contact hole and metal wiring are formed. Thereby, a semiconductor memory is realized which has a memory function according to the state of a charge in the charge storage layer which is the floating gate made of the polysilicon film (the first conductive film).

In this example, films formed on the surface of the semiconductor substrate or the polysilicon film such as the silicon nitride film (the first insulating film) 310, the silicon nitride films (the fourth insulating films) 321 and 322 and the silicon nitride film (the ninth insulating film) 331 may be formed of a layered film of a silicon oxide film/a silicon nitride film from the silicon surface.

In the example, the control gates of the memory cells are formed continuously in one direction without using a mask. However, that is possible only where the island-like semiconductor layers are not disposed symmetrically to a diagonal. More particularly, by setting smaller the intervals between adjacent island-like semiconductor layers in the direction of the third wiring layers than those in the direction of the fourth wiring layer, it is possible to automatically obtain the wiring layers which are discontinuous in the direction of the fourth wiring layer and are continuous in the direction of the third wiring layers without using a mask. In contrast, if the island-like semiconductor layers are disposed symmetrically to a diagonal, for example, the wiring layers may be separated through patterning with use of resist films by photolithography.

The charge storage layer may be in a form other than the floating gate.

PRODUCTION EXAMPLE 8

In a semiconductor memory to be produced in this example, a semiconductor substrate is patterned in the form of pillars to form island-like semiconductor layers. Sides of the island-like semiconductor layers make active regions. A plurality of tunnel oxide films and floating gates as charge storage layers are formed on the active regions. The island-like semiconductor layers are each in an electrically floating state with respect to the semiconductor substrate. The active regions of memory cells are electrically common. Selection gate transistors are disposed at the top and the bottom of the island-like semiconductor layer. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. In this production example, the selection gate and the floating gate of the transistors are formed at the same time.

Such a semiconductor memory may be produced by the following production process. FIGS. 458 to 462 and FIGS. 463 to 467 are sectional views taken on line A–A' and line B–B', respectively, in FIG. 1 which is a plan view illustrating a memory cell array of an EEPROM.

Figure 460:
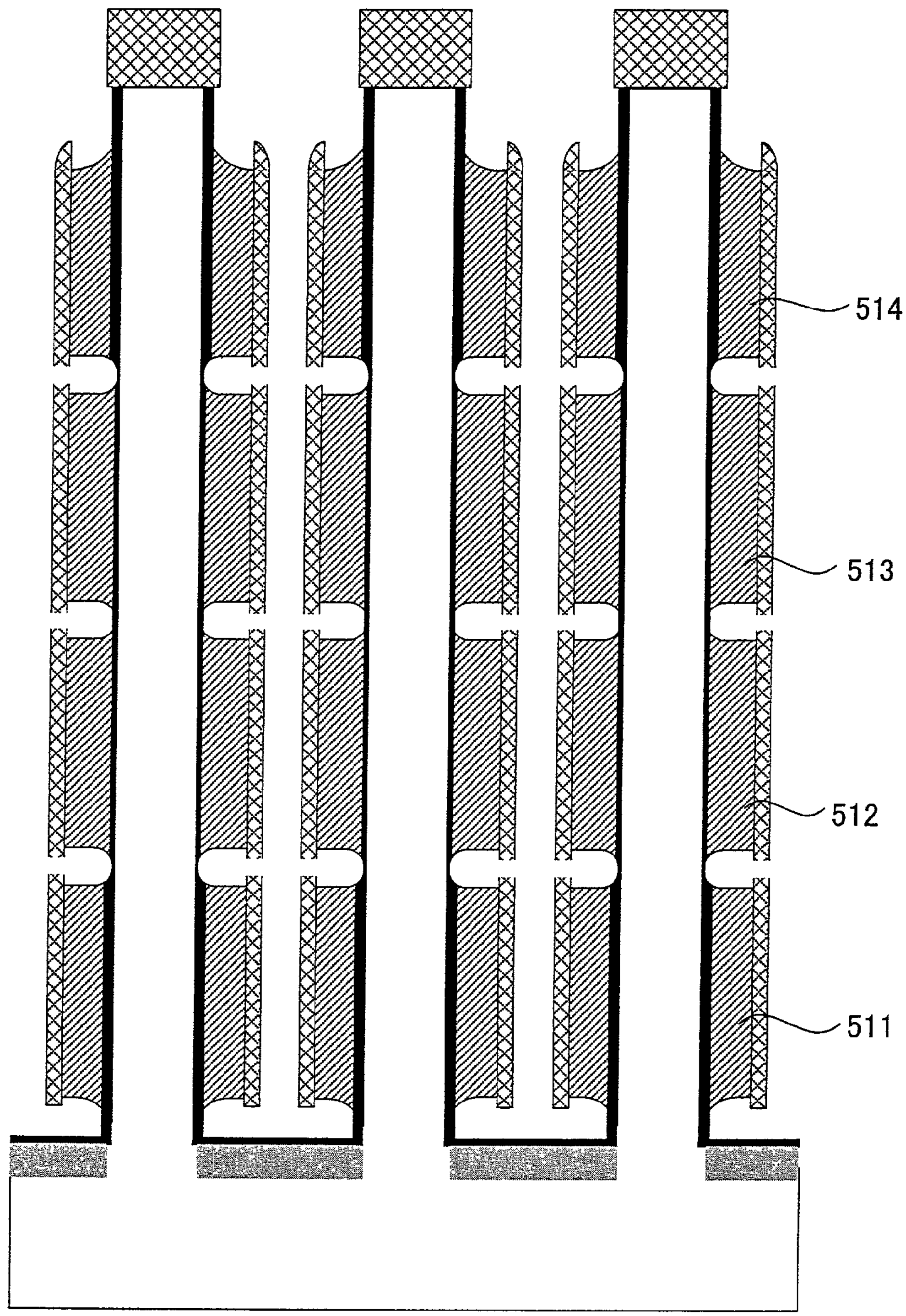
Figure 465:
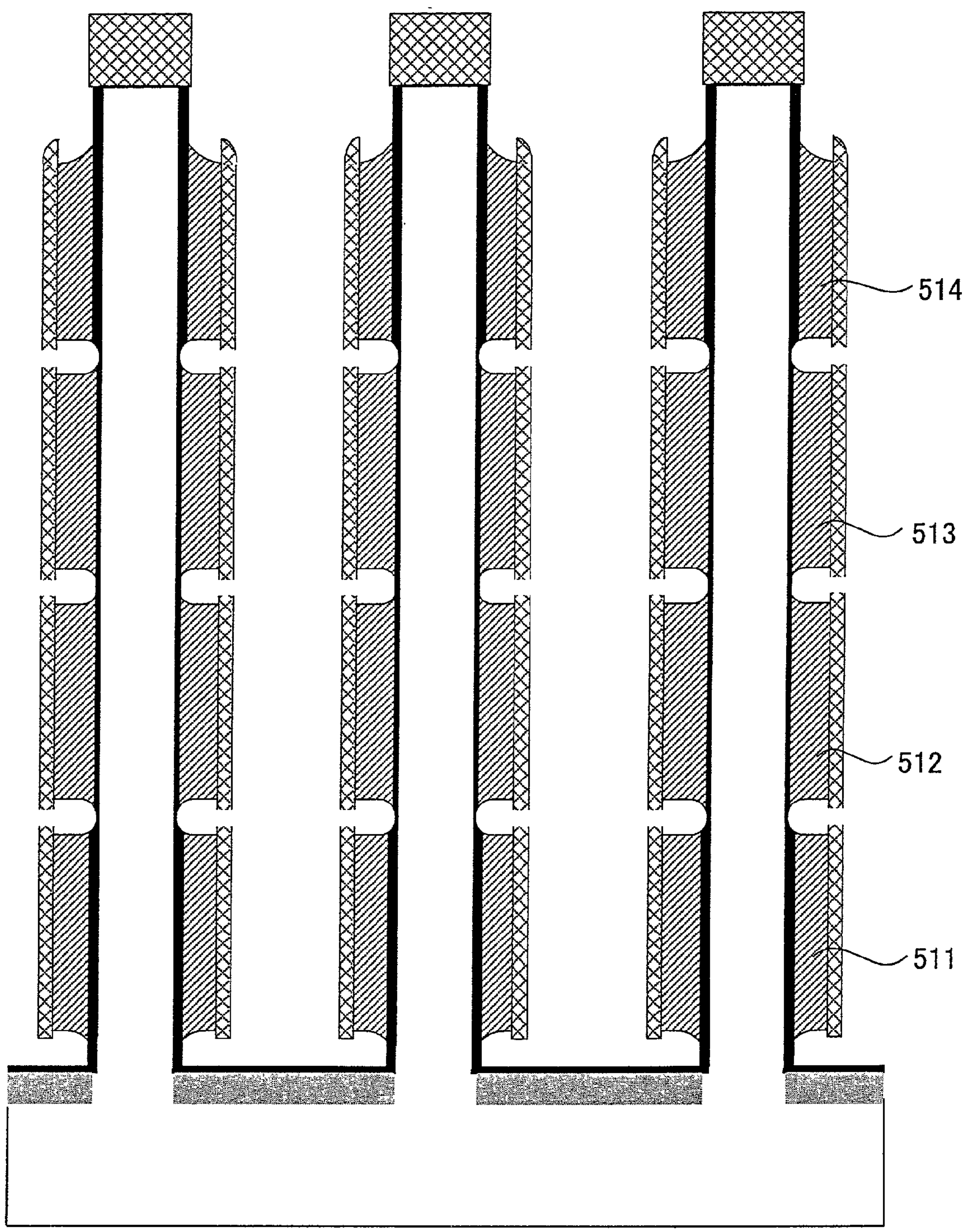

This example is the same as Production Example 4 as shown in FIGS. 461 and 462 and FIGS. 466 and 467. However, in this example, a plurality of sidewall spacers are formed of a silicon nitride film on the sidewall of the polysilicon film (the first conductive film) 510 (FIG. 459 and FIG. 464); when the polysilicon film 510 is divided by isotropic etching, the intervals between the divided polysilicon films 511, 512, 513 and 514 is set to 20 to 30 nm or less; and impurity diffusion layers 721, 722, 723 and 724 are not introduced (FIG. 460 and FIG. 465).

Figure 458:
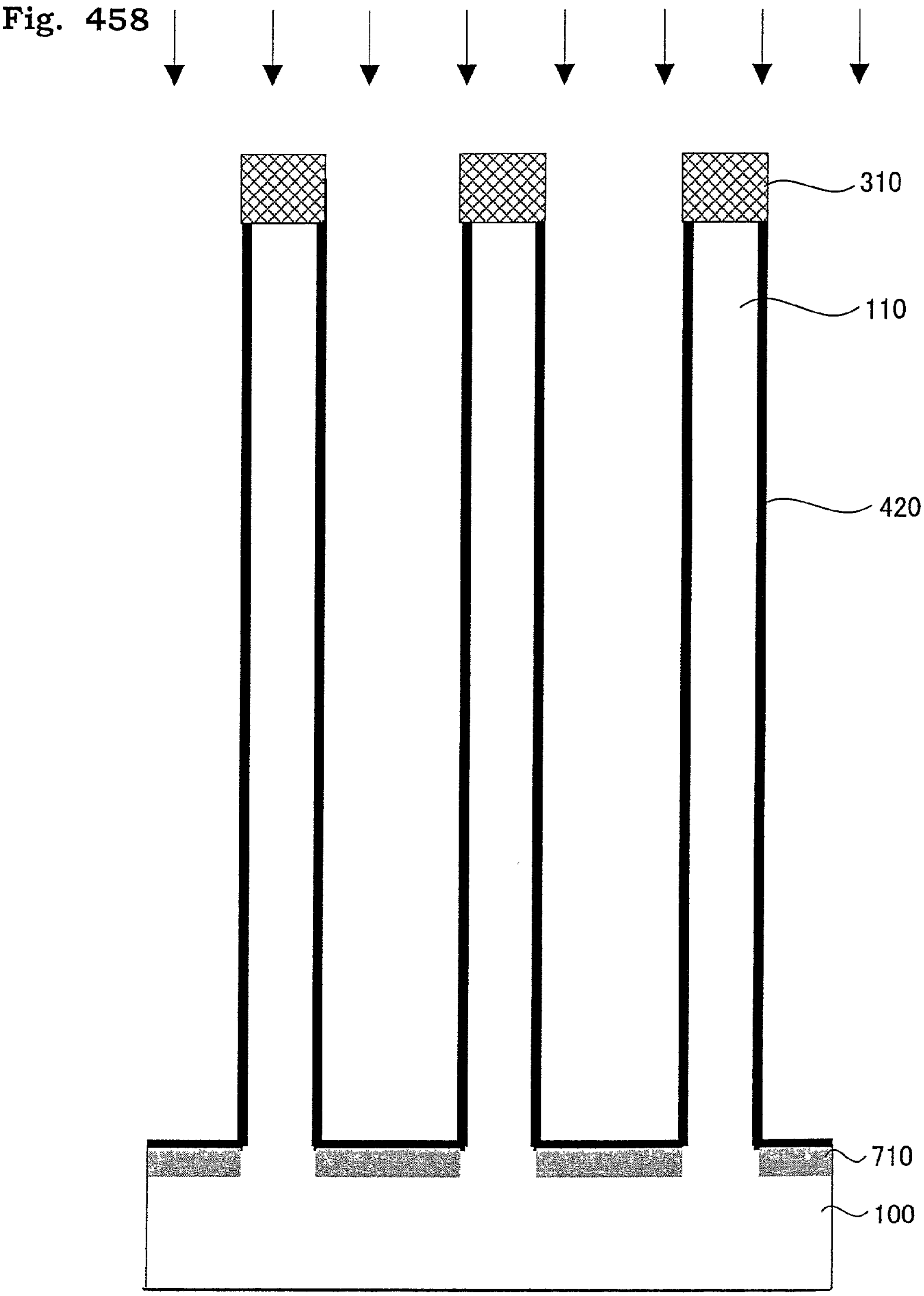
FIG. 458 to FIG. 462 are sectional views (taken on line A–A' in FIG. 1) illustrating production steps of Production Example 8 for producing a semiconductor memory in accordance with the present invention.
Figure 459:
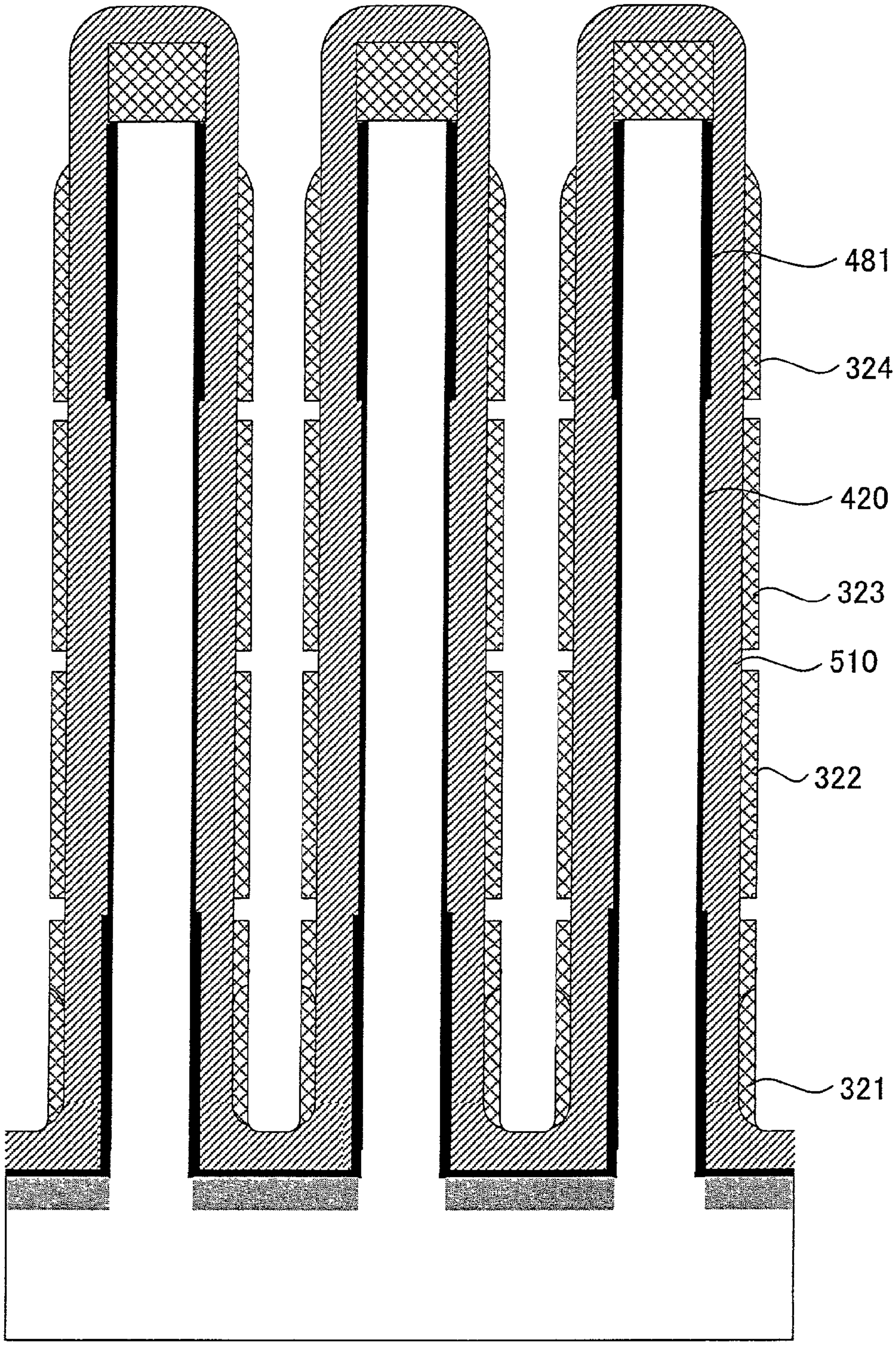
Figure 461:
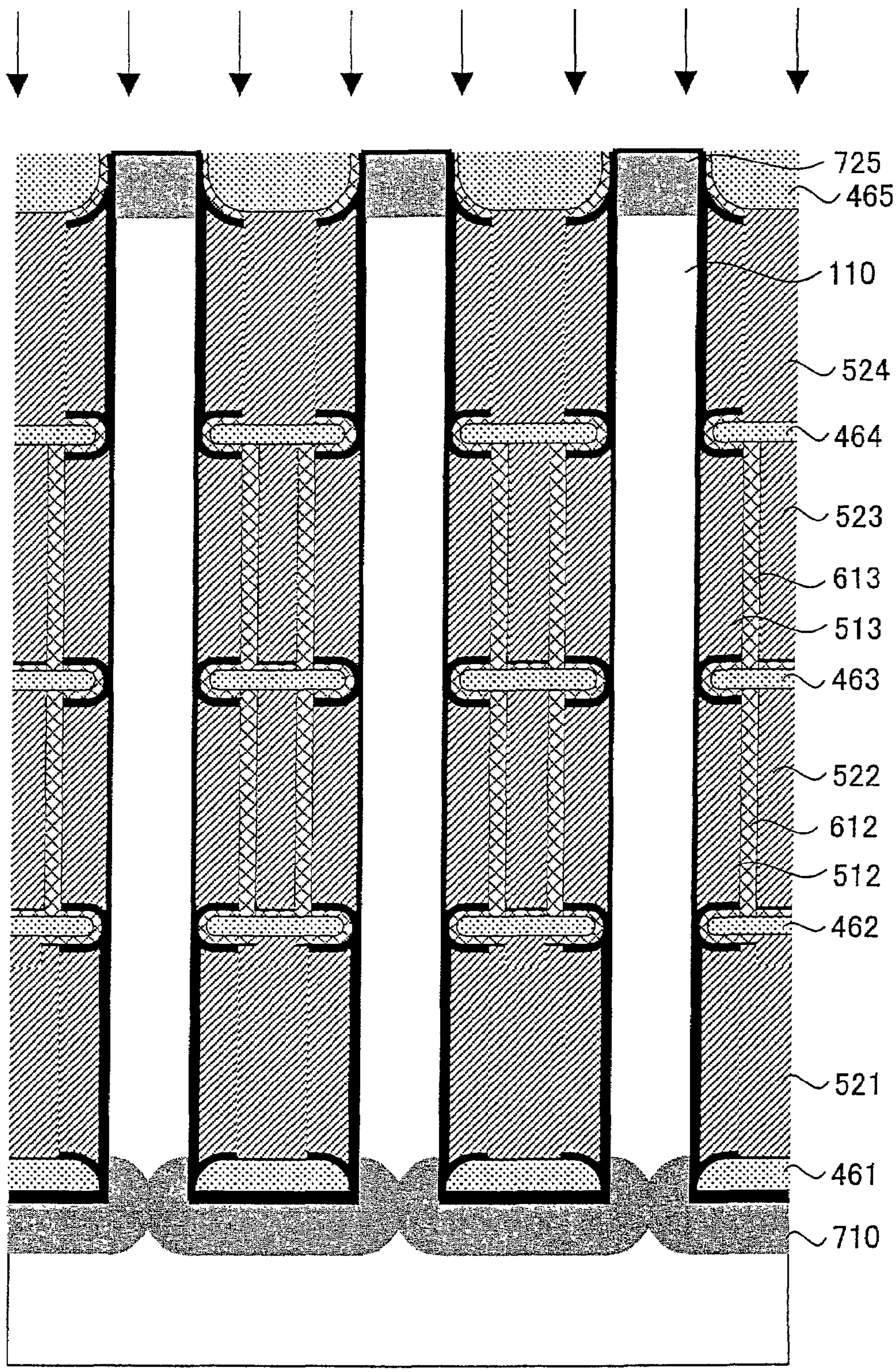
Figure 463:
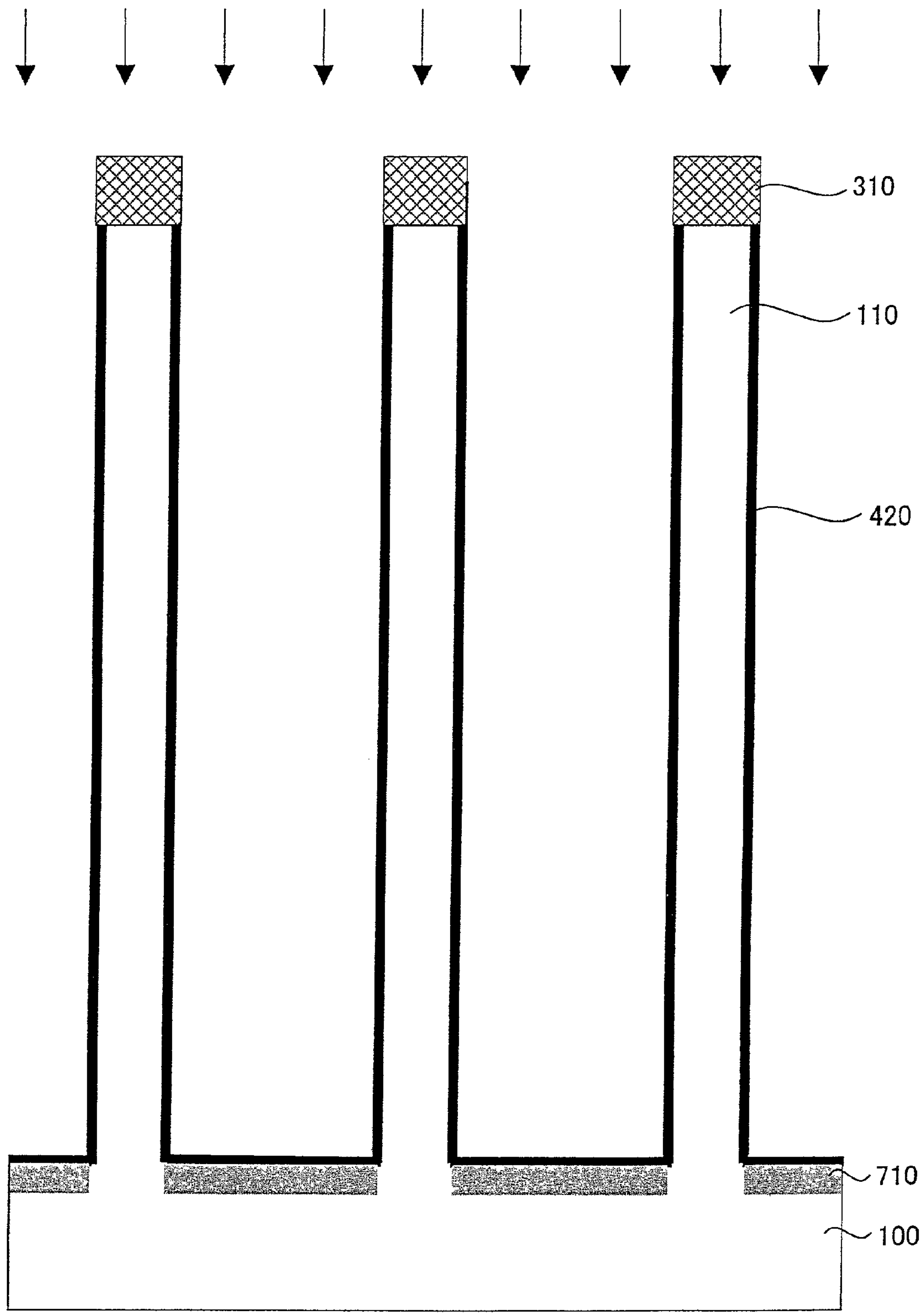
FIG. 463 to FIG. 467 are sectional views (taken on line B–B' in FIG. 1) illustrating production steps of Production Example 8 for producing a semiconductor memory in accordance with the present invention.
Figure 464:
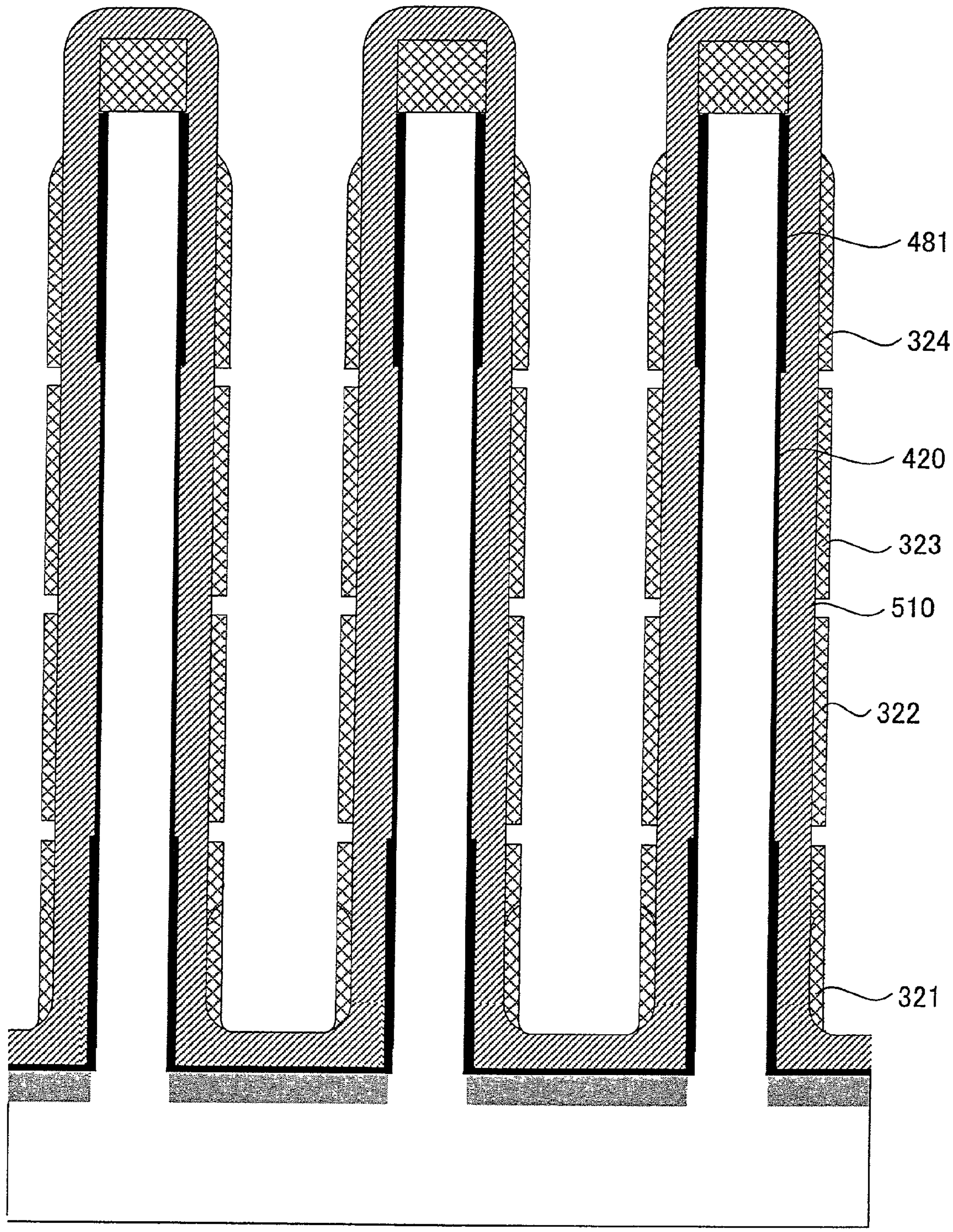
Figure 466:
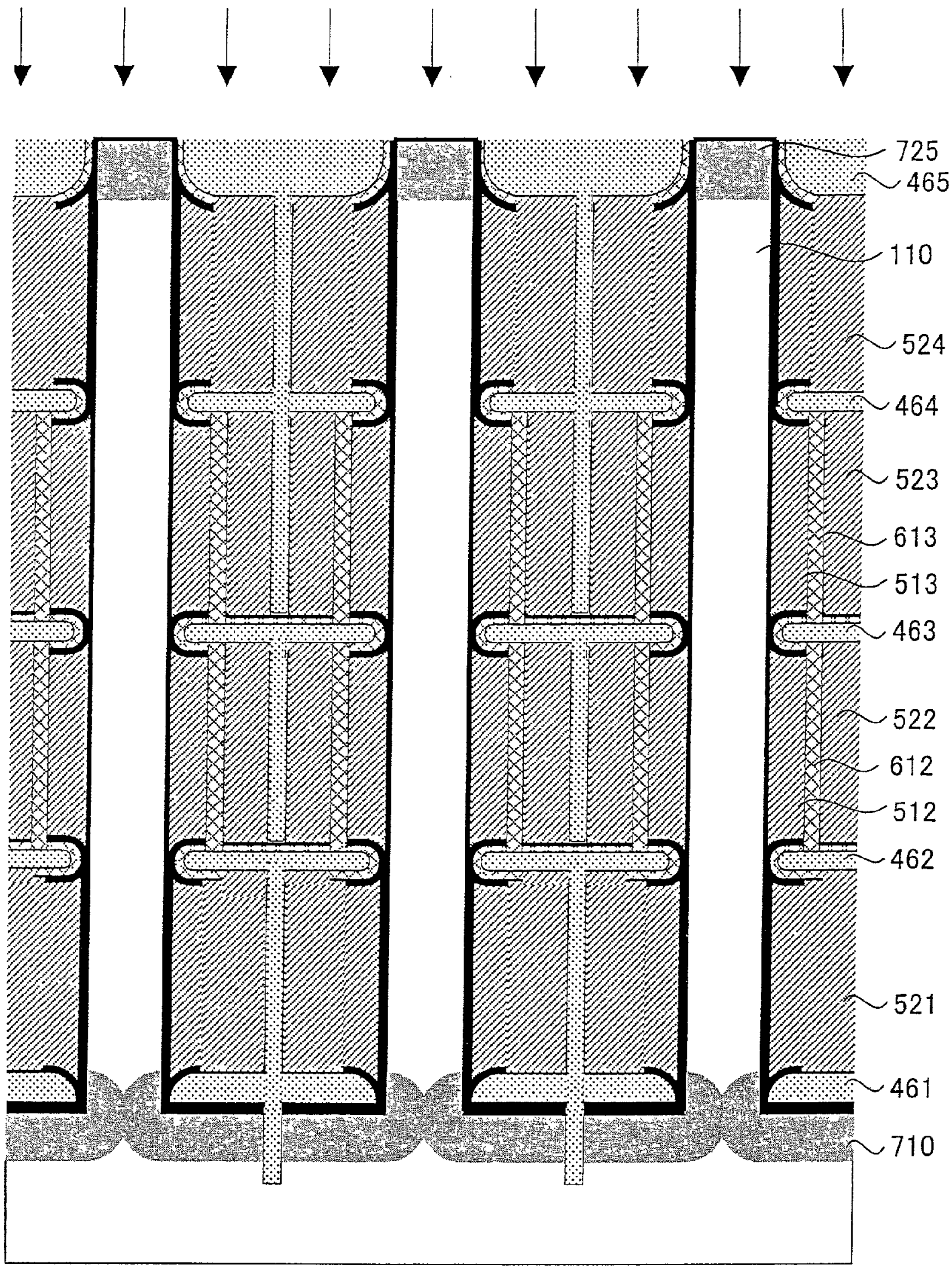
Figure 467:
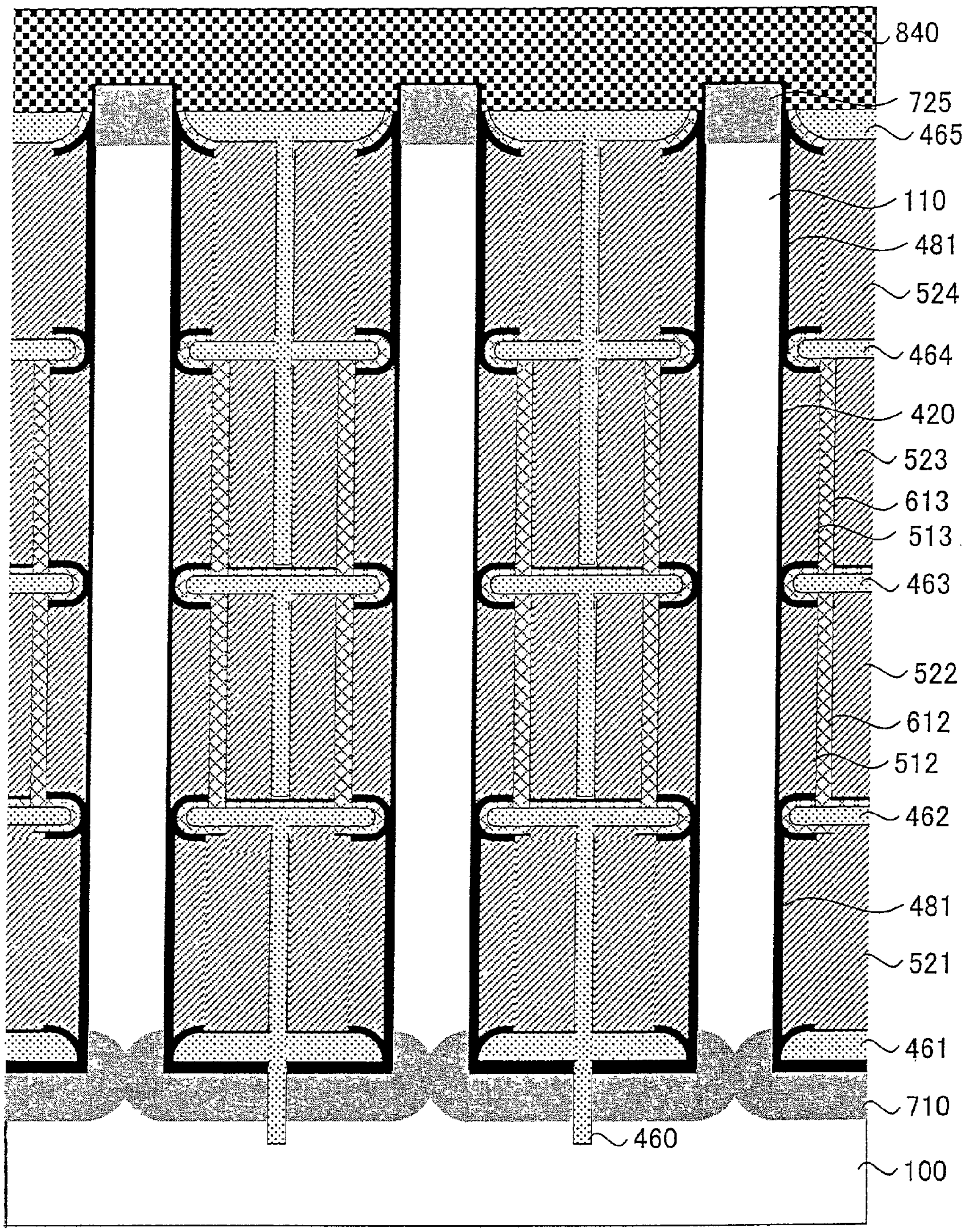
Figure 468:
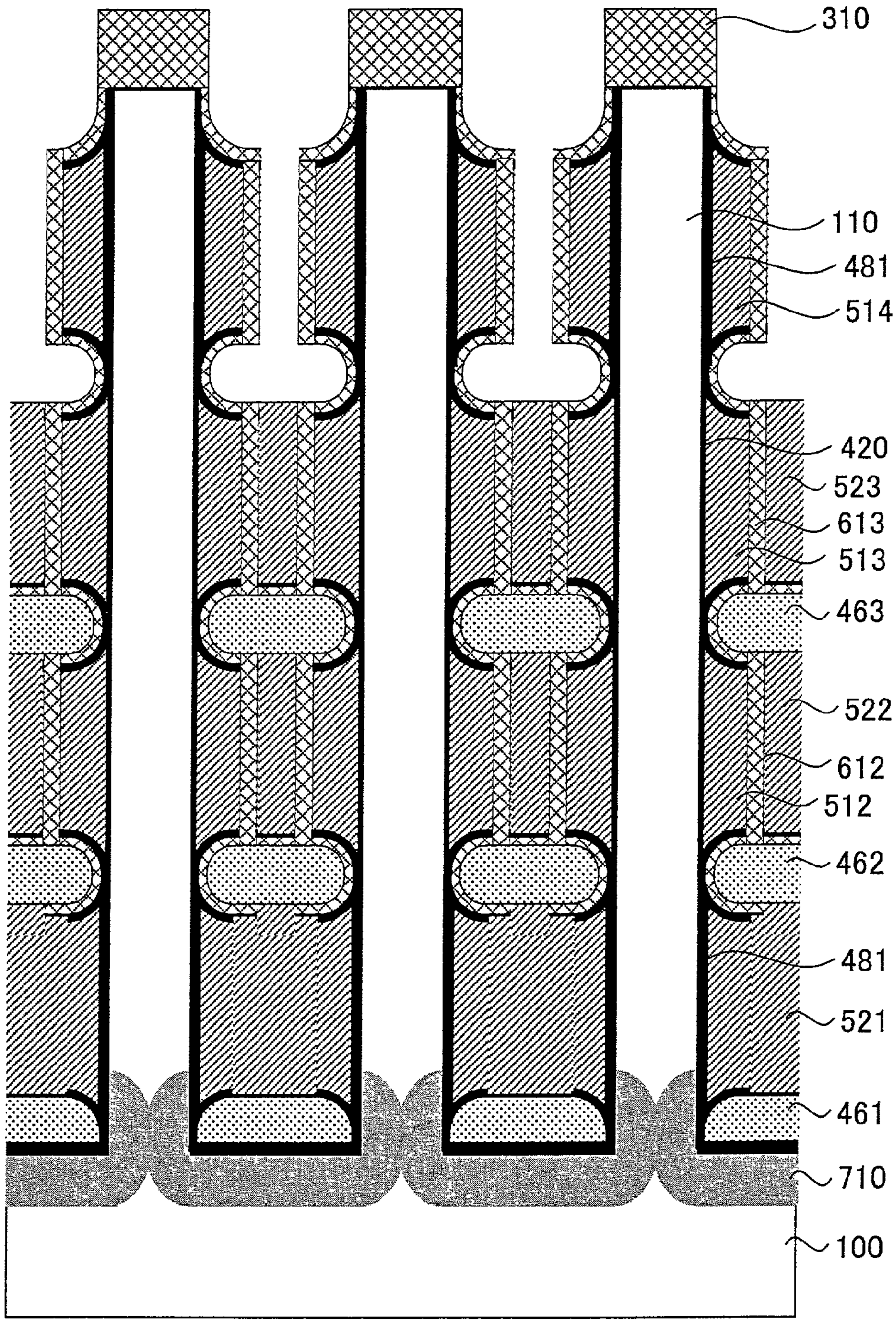
FIG. 468 to FIG. 472 are sectional views (taken on line A–A' in FIG. 1) illustrating production steps of Production Example 9 for producing a semiconductor memory in accordance with the present invention.
Figure 469:
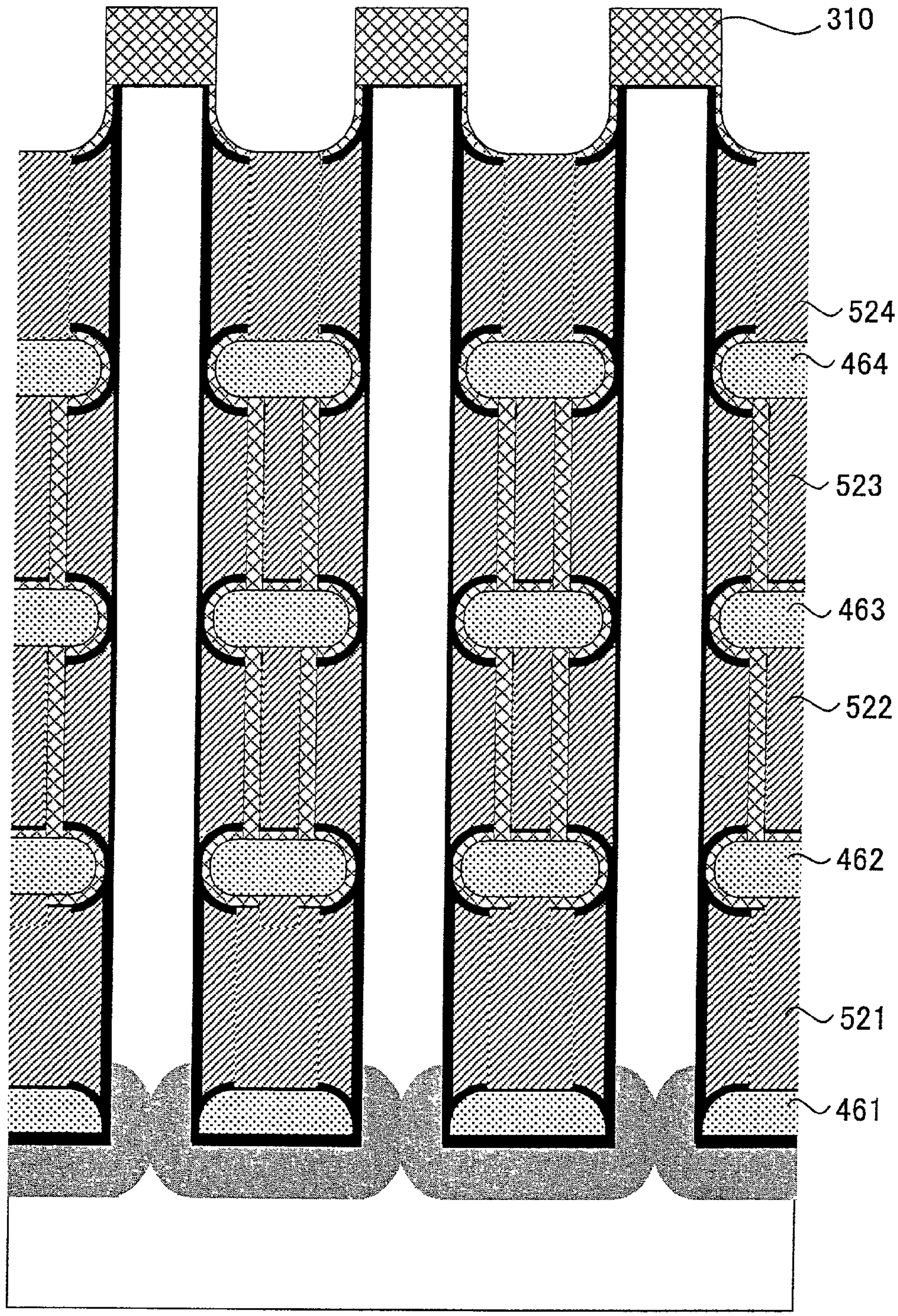
Figure 470:
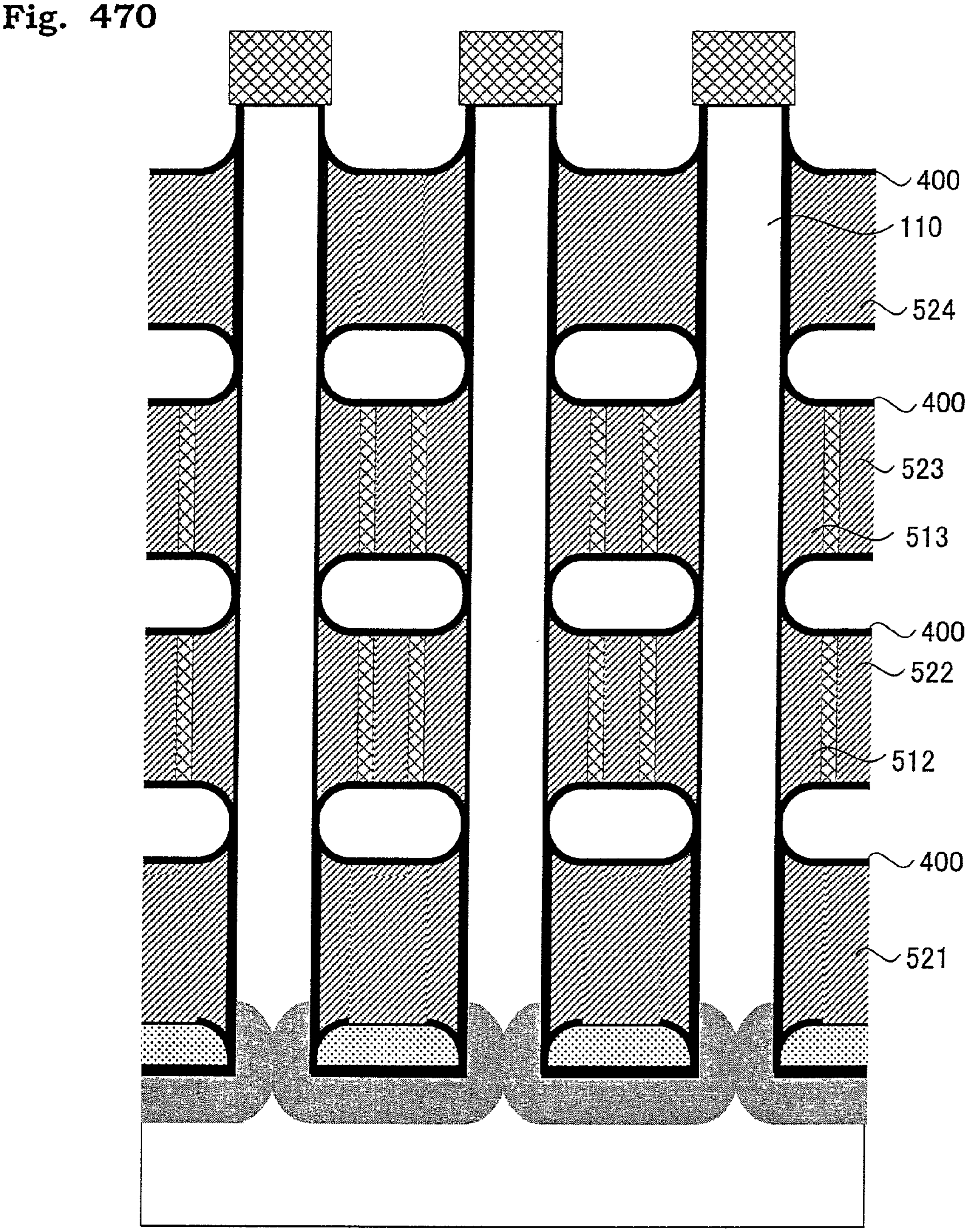
Figure 471:
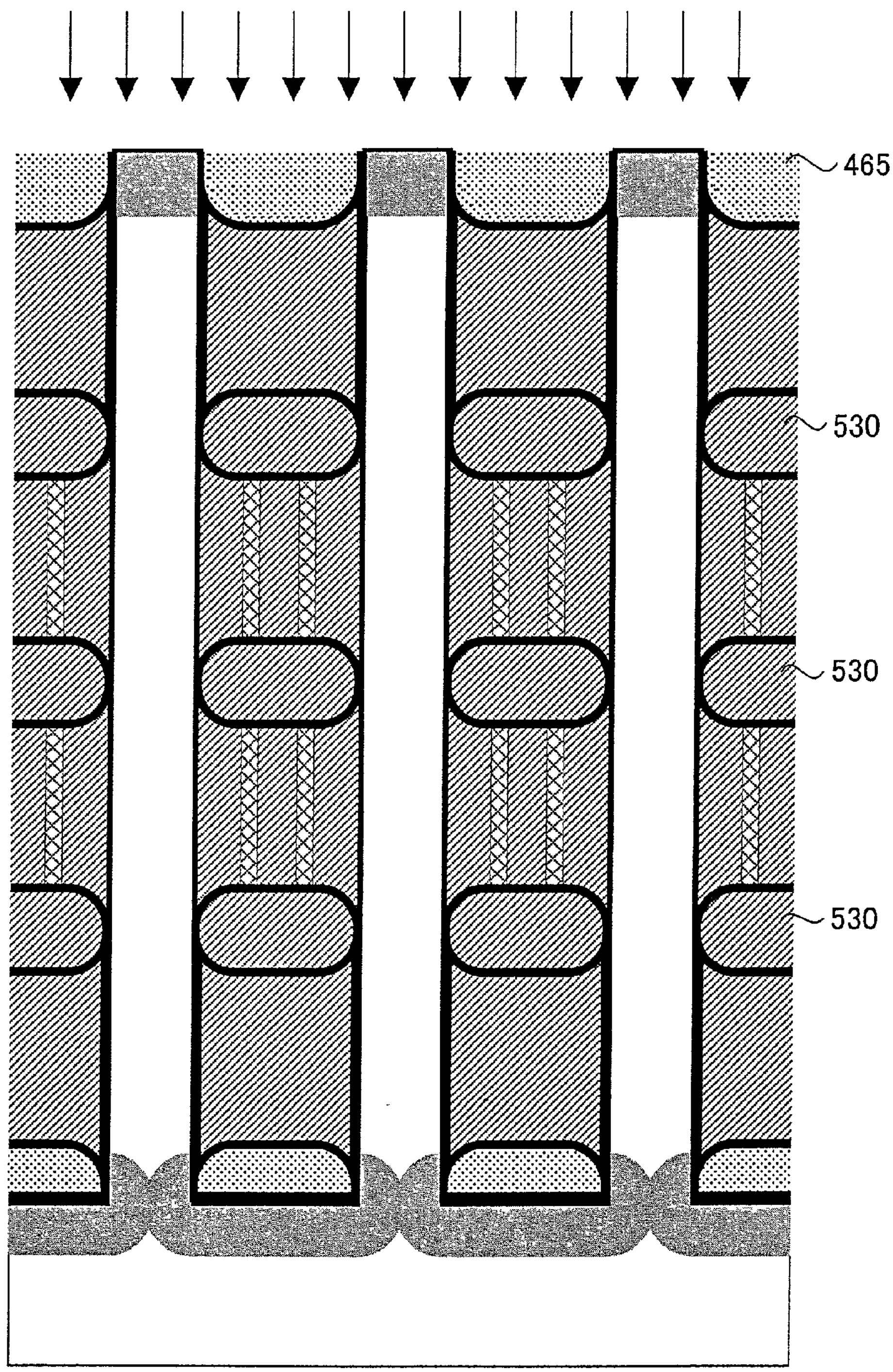

Also, in this example, as shown in FIGS. 458 and 463, an impurity diffusion layer 710 to be a first wiring layer is introduced at the bottom of the island-like semiconductor layer. For example, in the case of ion implantation, the impurity introduction may be performed at an implantation energy of 5 to 100 keV at an arsenic dose of about $1\times10^{13}$ to $1\times10^{15}/cm^2$ in a direction inclined by about 0 to 7°. Further, as shown in FIGS. 461 and 466, an impurity diffusion layer 725 is introduced at the top of the island-like semiconductor layer before the fourth wiring layer is formed. For example, in the case of ion implantation, the impurity introduction may be performed at an implantation energy of 5 to 100 keV at an arsenic dose of about $1\times10^{13}$ to $1\times10^{15}/cm^2$ in a direction inclined by about 0 to 7°. The impurity diffusion layer 725 is activated by thermal treatment. Alternatively, the impurity diffusion layer 725 may be introduced in the entire surface of the semiconductor substrate before the silicon nitride film (the first insulating film) 310 is deposited.

Figure 462:
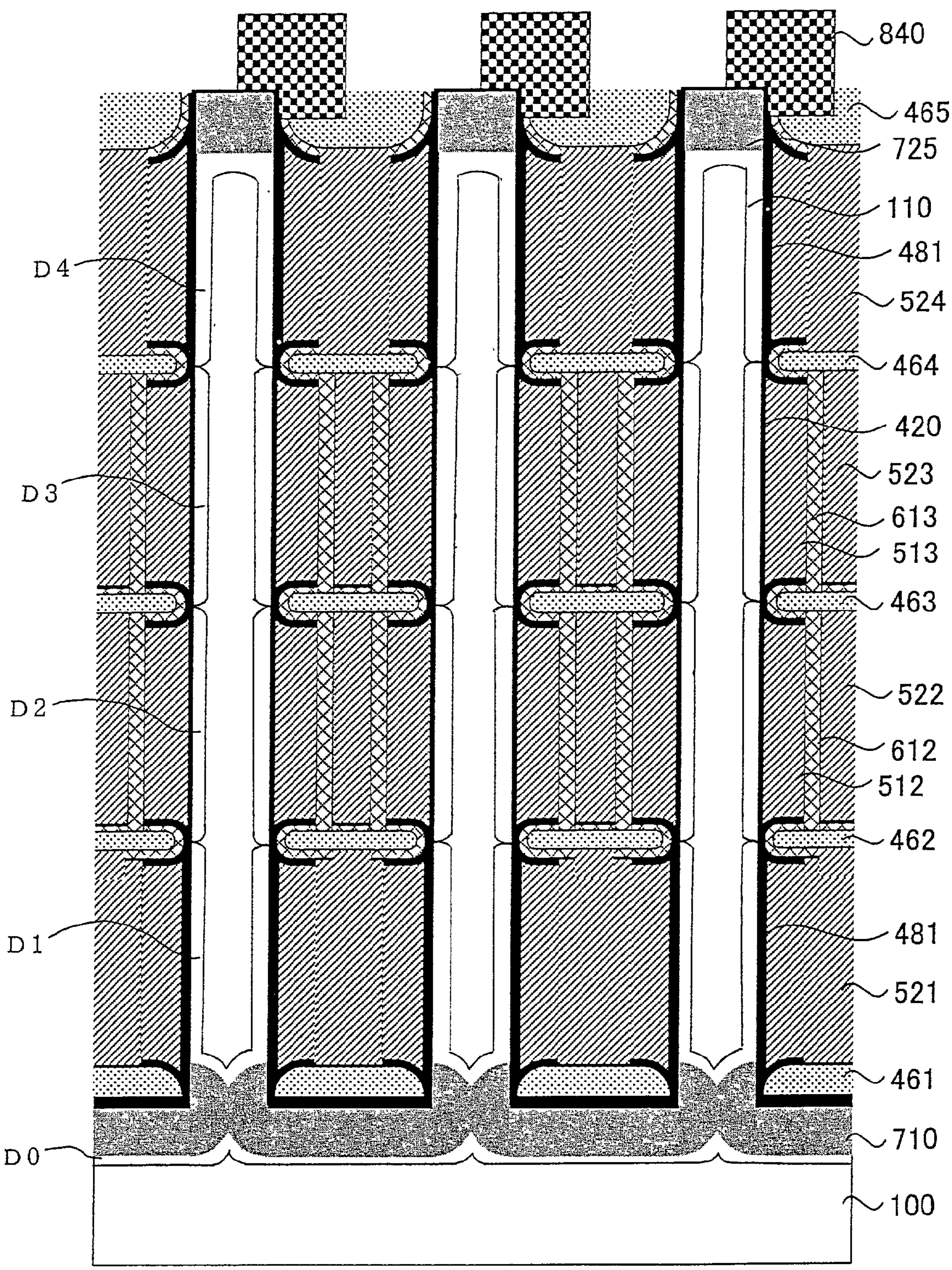
Figure 472:
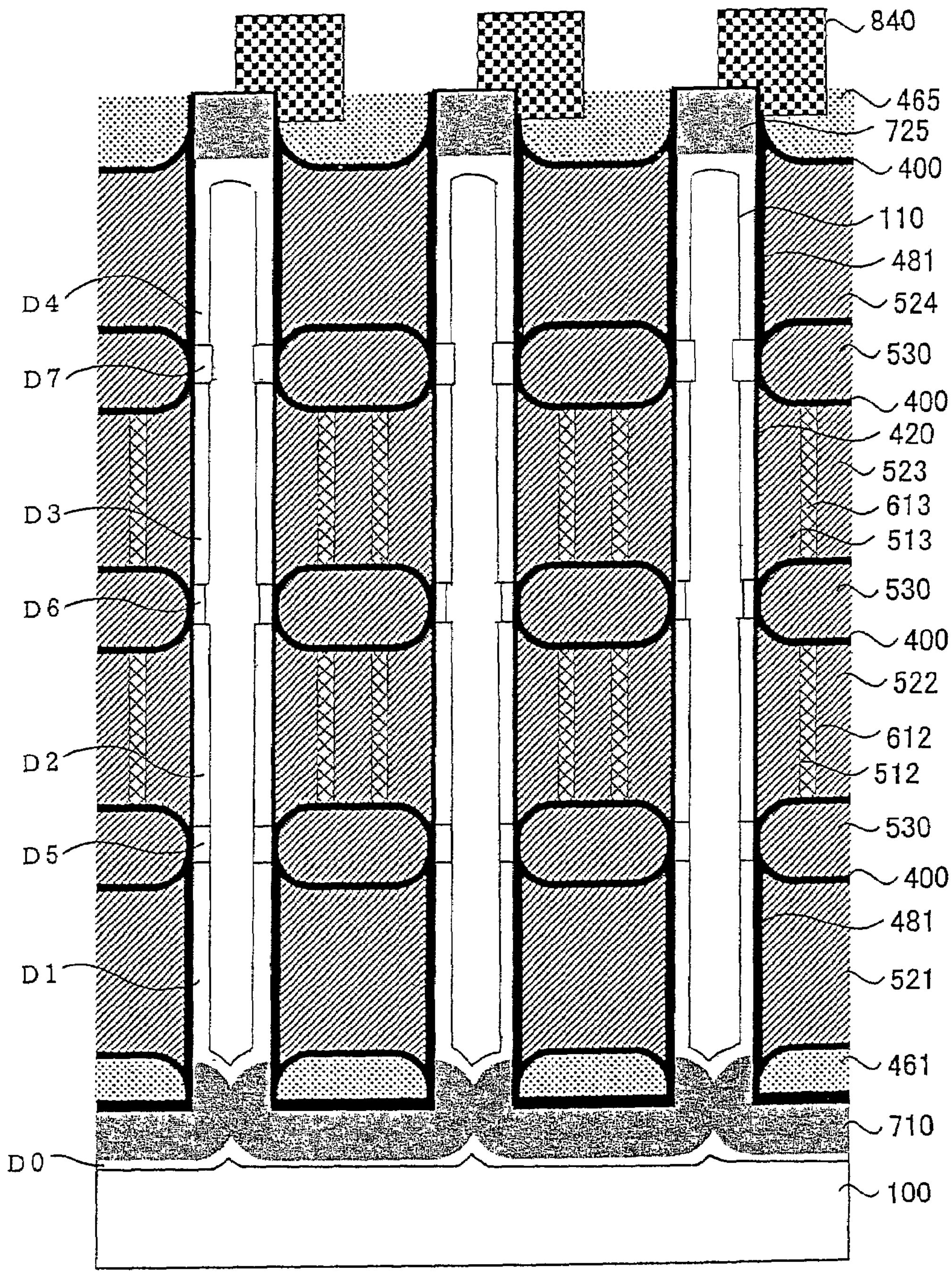
Figure 473:
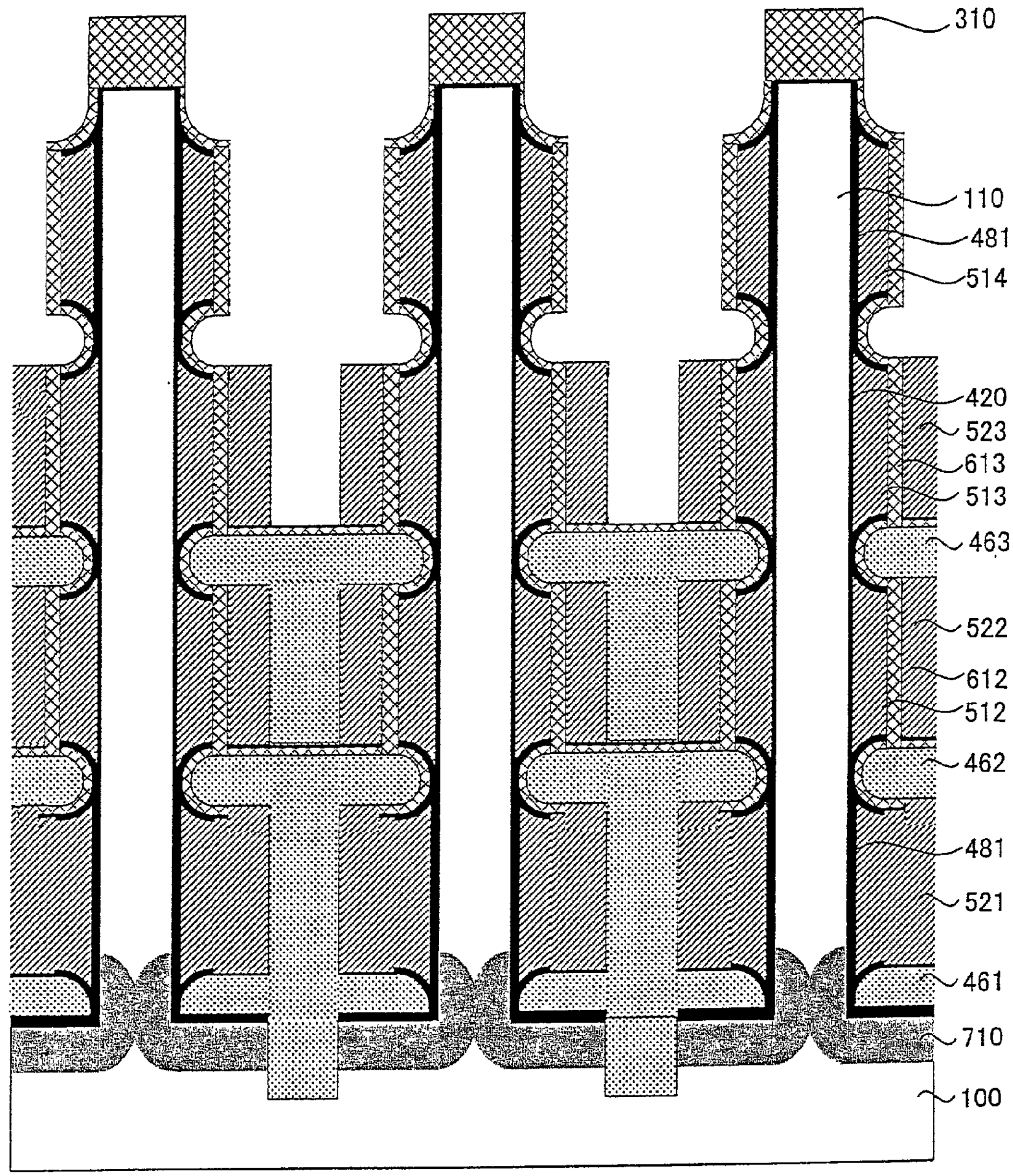
FIG. 473 to FIG. 477 are sectional views (taken on line B–B' in FIG. 1) illustrating production steps of Production Example 9 for producing a semiconductor memory in accordance with the present invention.
Figure 474:
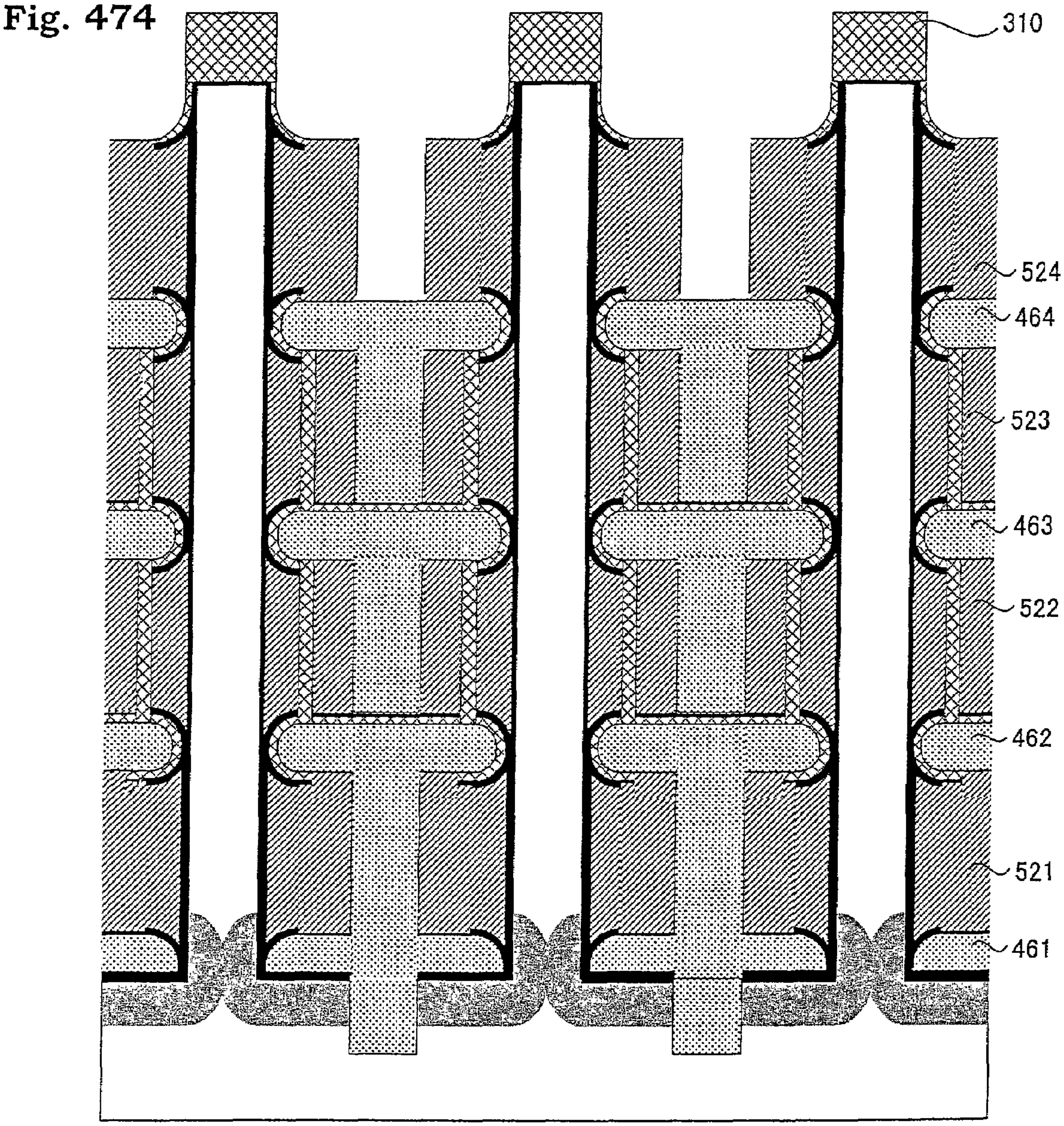
Figure 475:
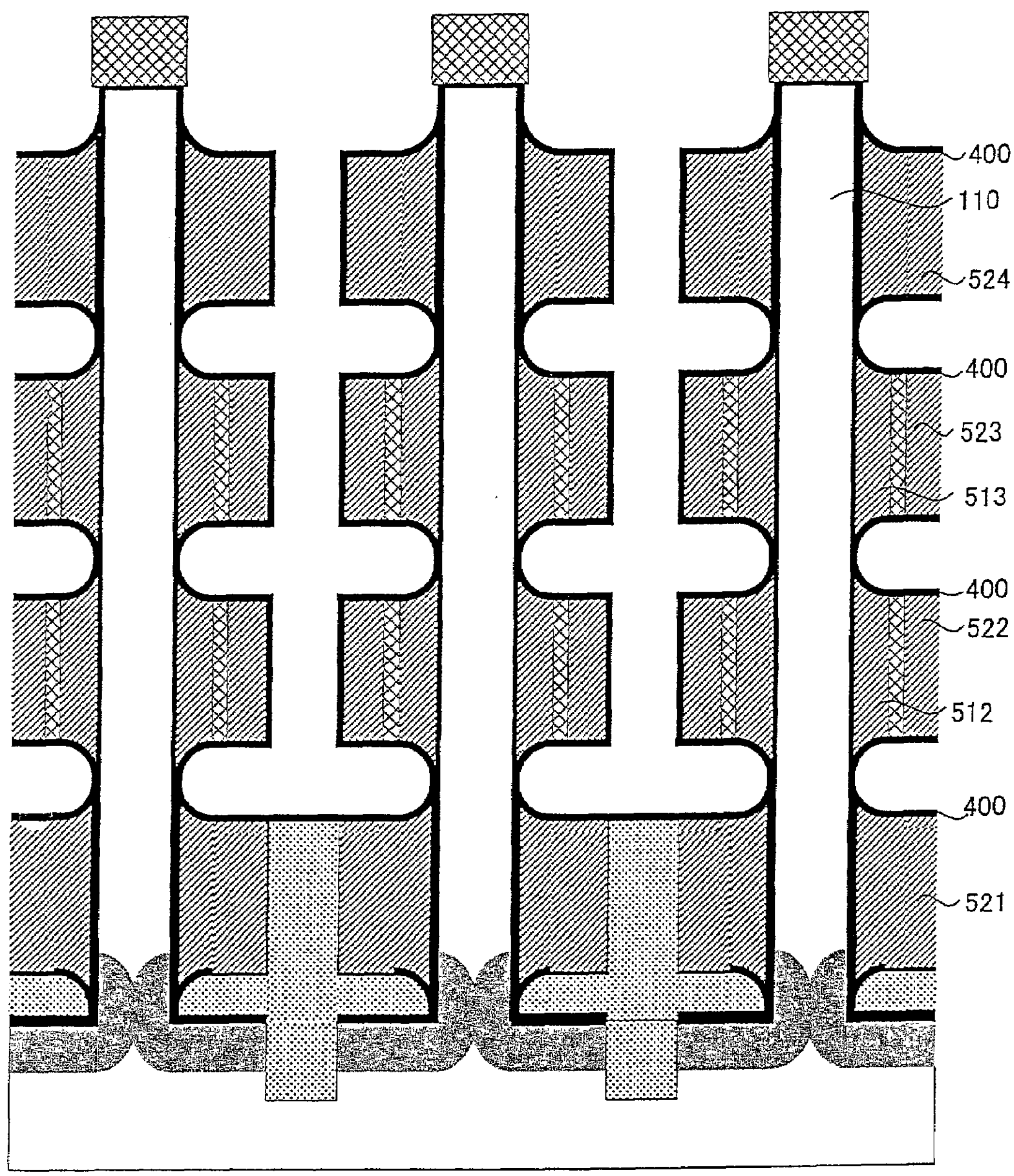
Figure 476:
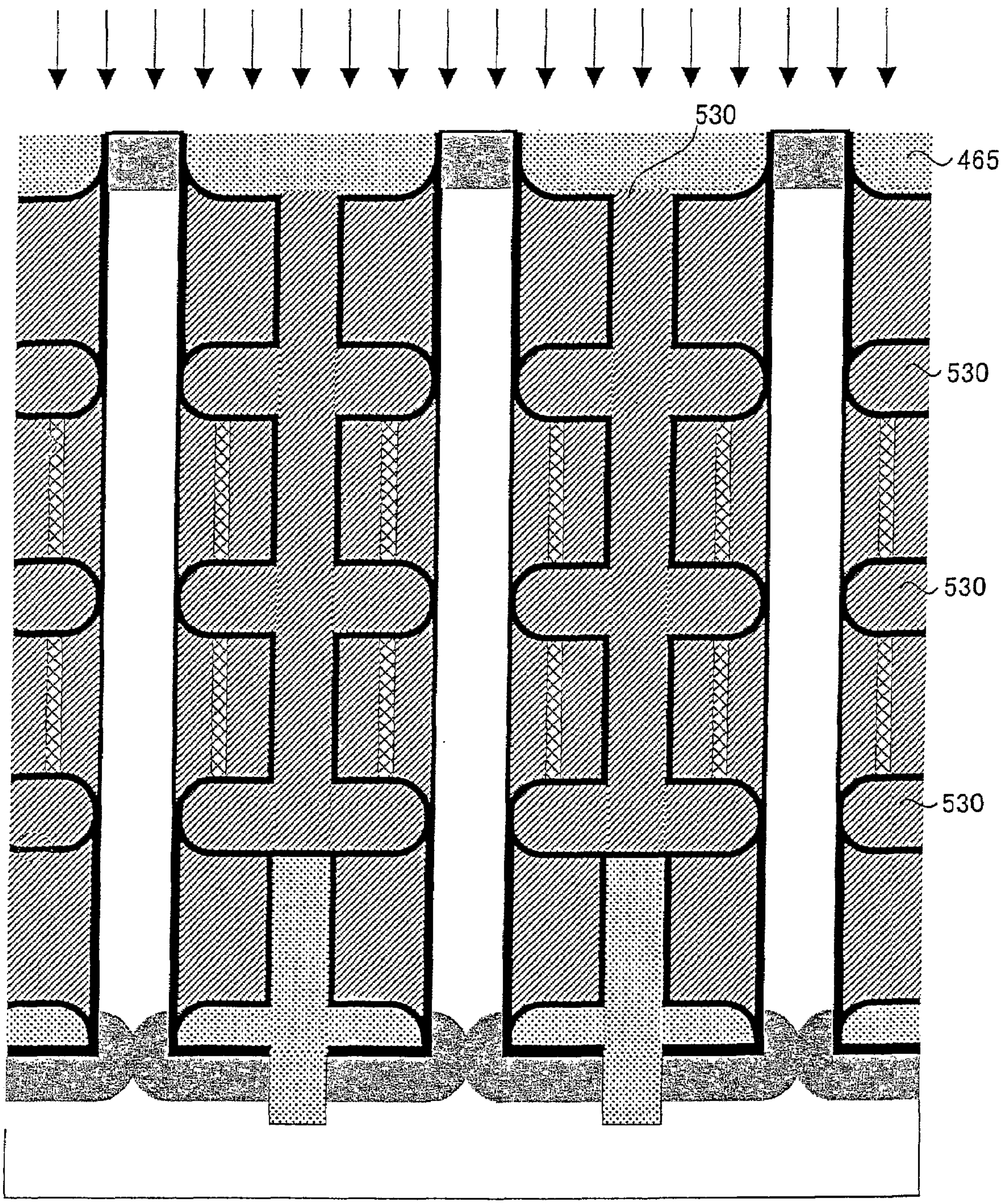
Figure 477:
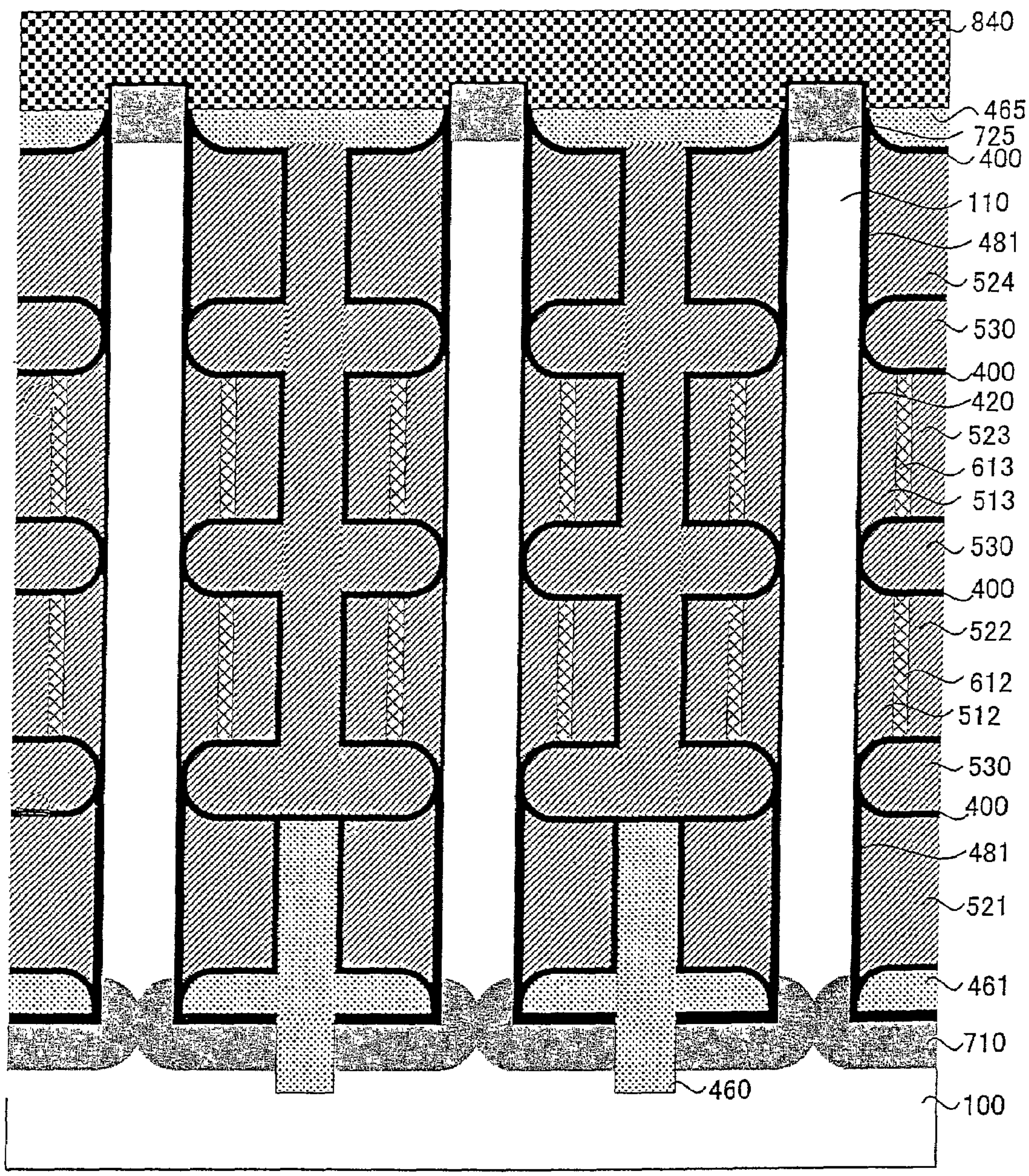

The impurity diffusion layer 710 may be activated simultaneously when it is introduced or after it is introduced. At reading data, as shown in FIG. 462 or 472, gate electrodes 521, 522, 523 and 524 or 521, 522, 523, 524 and 530 are electrically connected to depletion layers and reverse layers indicated by D1 to D4 or D1 to D7, and thereby, a path allowing an electric current to run from the impurity diffusion layer 710 to the impurity diffusion layer 725 is established. By setting voltages applied to gate electrodes 521, 522, 523 and 524 or 521, 522, 523, 524 and 530 for selecting whether or not, in this state, the reverse layers are formed at D2 and D3 according to the state of the charge storage layer 512 and 513, data in the memory cells can be read.

As regards relationship between the depletion layers and the reverse layers shown in FIG. 472, the reverse layer may be wider like D4 or D3 and D7, may be narrower like D3 or D3 and D6 or may have the same width like D2 or D1 and D5, so long as the data in the memory cells can be read.

The same effect as obtained by Production Example 4 can be obtained in this example. According to this example, the number of production steps is decreased, the necessary height of the island-like semiconductor layers can be reduced and variations in the production process can be reduced.

PRODUCTION EXAMPLE 9

In a semiconductor memory to be produced in this example, a semiconductor substrate is patterned in the form of pillars to form island-like semiconductor layers. Sides of the island-like semiconductor layers make active regions. A plurality of tunnel oxide films and floating gates as charge storage layers are formed on the active regions. The island-like semiconductor layers are each in an electrically floating state with respect to the semiconductor substrate. The active regions of memory cells are in common. Selection gate transistors are disposed at the top and the bottom of the island-like semiconductor layer. A plurality of memory transistors, for example, two memory transistors, are placed between the selection gate transistors and are connected in series along the island-like semiconductor layer. The thickness of gate insulating films of the selection gate transistors is equal to the thickness of gate insulating films of the memory transistors. Transmission gates are disposed between the transistors for transmitting potentials to the active regions of the memory cell transistors. In this production example, the selection gate and the floating gate of the transistors are formed at the same time.

Such a semiconductor memory may be produced by the following production process. FIGS. 468 to 472 and FIGS. 473 to 477 are sectional views taken on line A–A' and line B–B', respectively, in FIG. 1 which is a plan view illustrating a memory cell array of an EEPROM.

This example is the same as Production Example 4 except that the step of forming gate electrodes of a third polysilicon film 530 is added after the polysilicon films (second conductive films) 521, 522, 523 and 524 are formed (FIGS. 468 and 469 and FIGS. 473 and 474).

That is, after the polysilicon films 521, 522, 523 and 524 are formed (after FIG. 469 and FIG. 474), the silicon oxide films (the eighth insulating films) 464 to 462 and the interlayer insulating films 612 and 613 are removed by isotropic etching to such an extent that the island-like semiconductor layer 110 is exposed between the polysilicon films 521 and 522. A silicon oxide film 400 is formed as a sixteenth insulating film by thermal oxidization on the surface of island-like semiconductor layer 110 between the selection gates and the memory cells and in exposed portions of polysilicon films 511, 512, 513, 514, 521, 522, 523 and 524. A polysilicon film 530 which is a third conductive film is formed on the entire surface. The polysilicon film 530 is anisotropically etched back to such an extent that a space between the polysilicon films 523 and 524 is not exposed.

Production steps thereafter follow Production Example 4 as shown in FIGS. 470 to 472 and FIGS. 475 to 477.

PRODUCTION EXAMPLE 10

In the above Production Examples 1 to 9, the selection gates and the floating gates of the transistors of a semiconductor memory are formed at the same time, and the direction of the first wiring layer crosses that of the fourth wiring layer. In this example, however, explanation is given of an example of production process for obtaining a structure in which the direction of the first wiring layer is parallel to the direction of the fourth wiring layer.

Such a semiconductor memory may be produced by the following production process. FIGS. 478 to 483 and FIGS. 484 to 489 are sectional views taken on line A–A' and line B–B', respectively, in FIG. 1 which is a plan view illustrating a memory cell array of an EEPROM.

Figure 478:
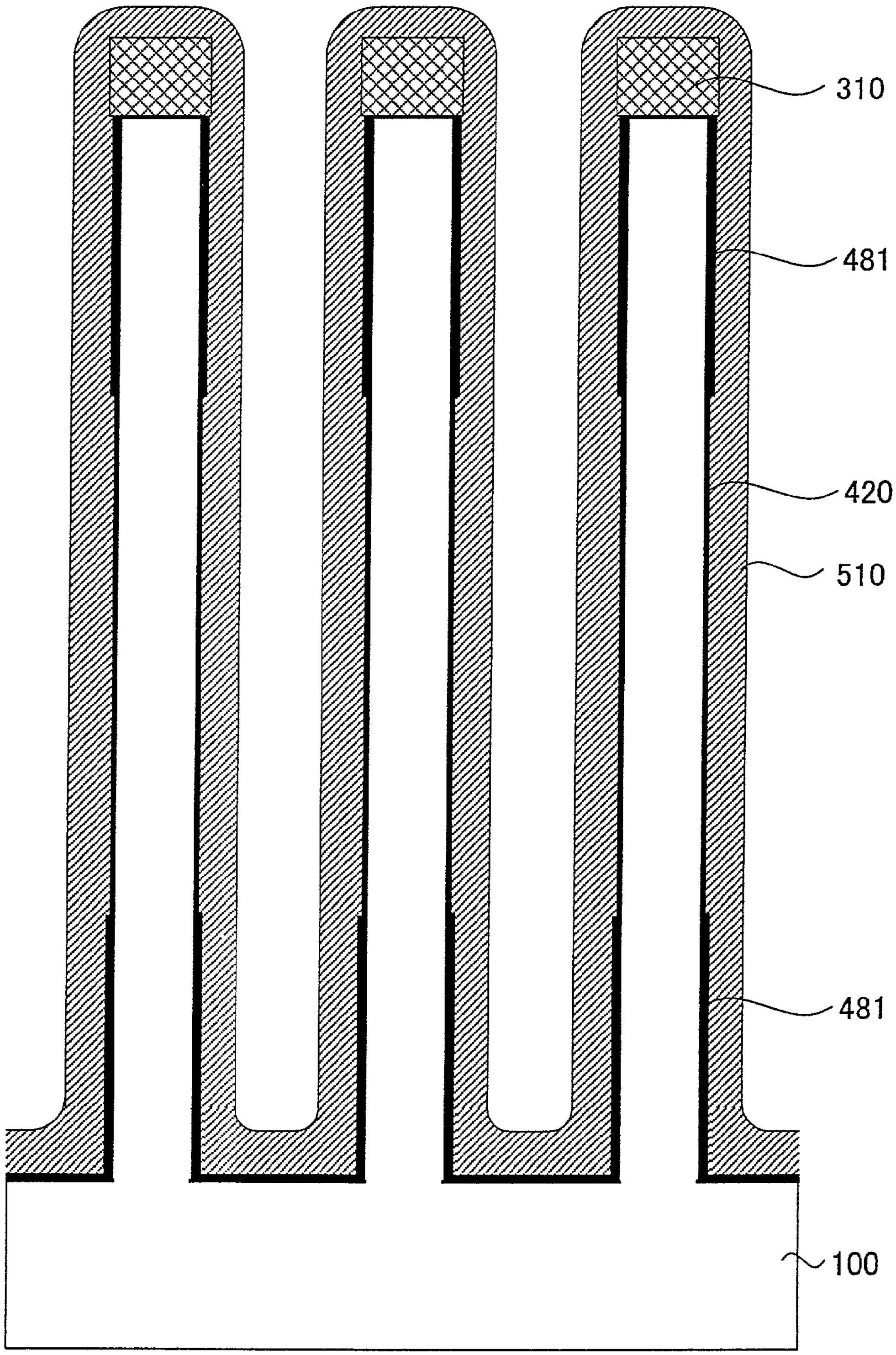
FIG. 478 to FIG. 483 are sectional views (taken on line A–A' in FIG. 1) illustrating production steps of Production Example 10 for producing a semiconductor memory in accordance with the present invention.
Figure 484:
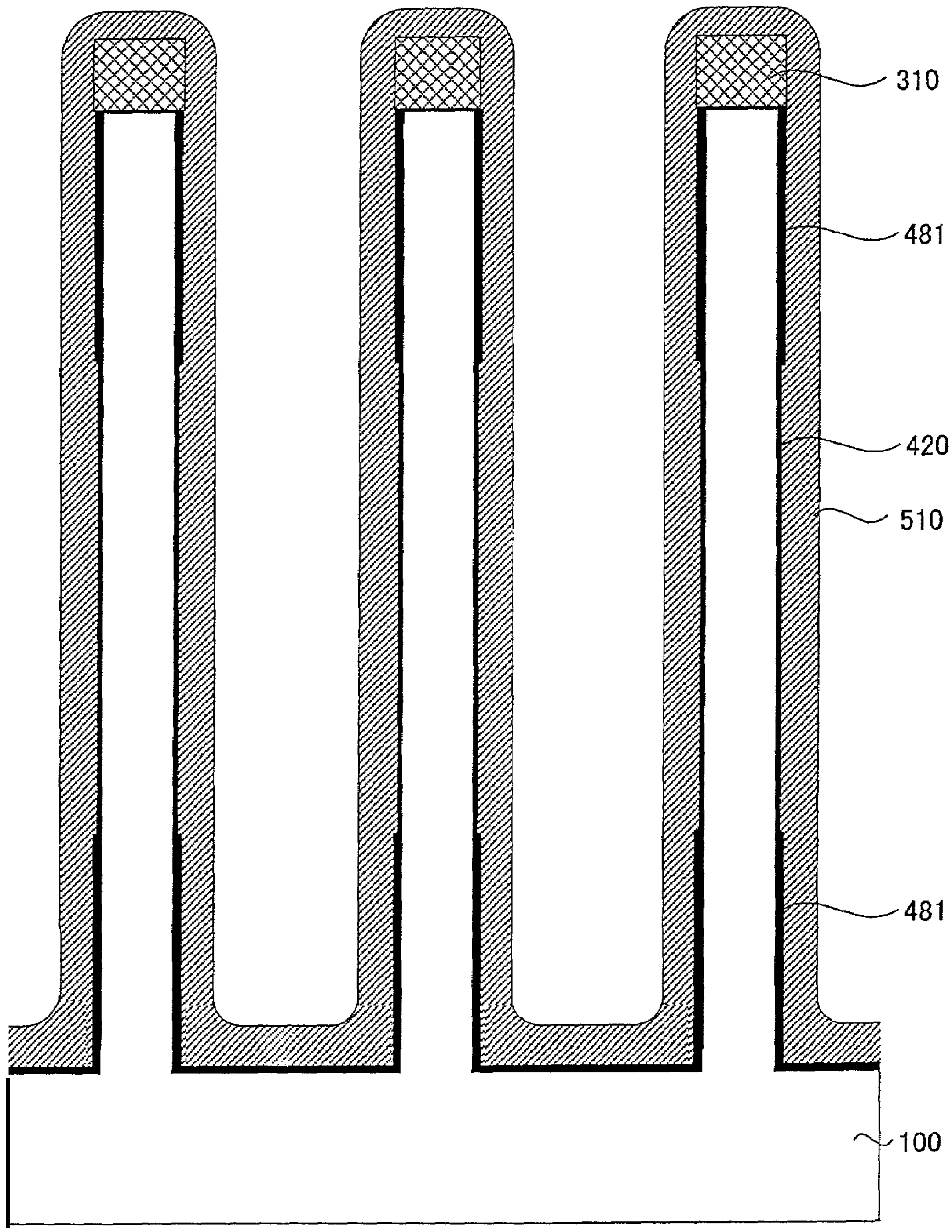
FIG. 484 to FIG. 489 are sectional views (taken on line B–B' in FIG. 1) illustrating production steps of Production Example 10 for producing a semiconductor memory in accordance with the present invention.

This example is the same as Production Example 4 until the polysilicon film 510 is deposited to 50 to 200 nm (FIG. 478 and FIG. 484).

Figure 479:
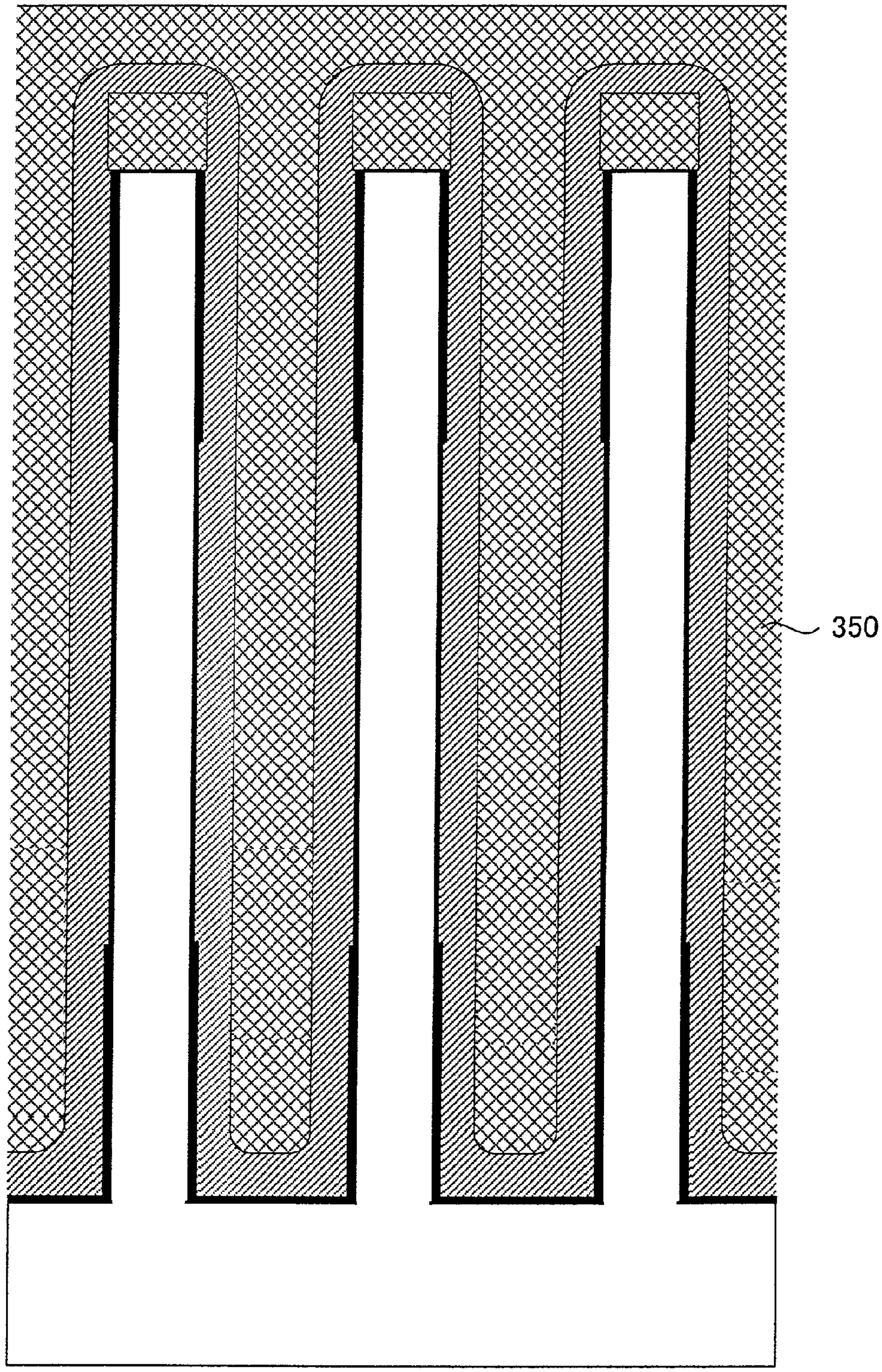
Figure 485:
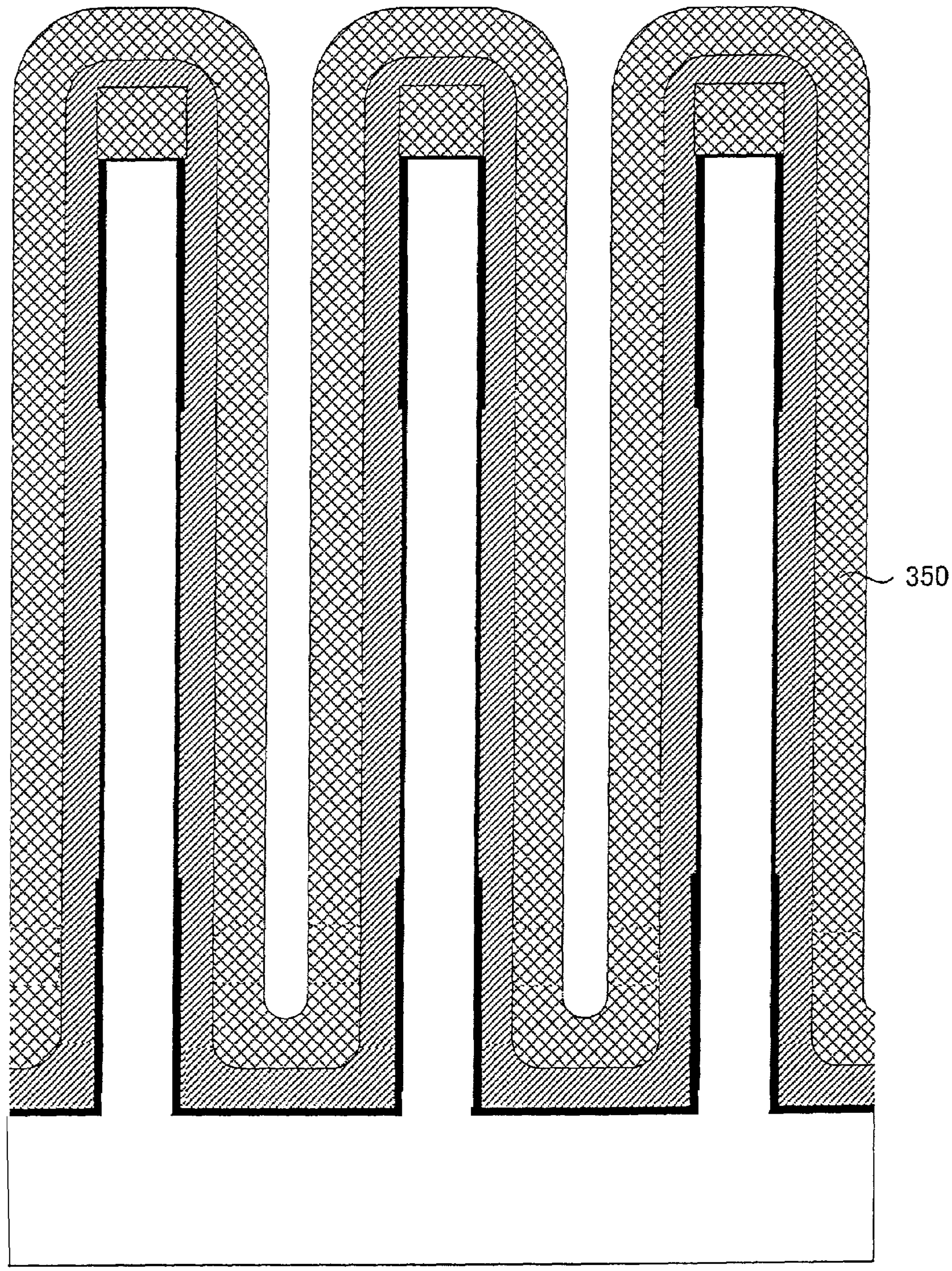

Thereafter, a fourteenth insulating film, for example, a silicon nitride film 350, is deposited to 100 to 300 nm by CVD (FIG. 479 and FIG. 485). At this time, as shown in FIG. 479, the thickness of the silicon nitride film 350 is so set that the silicon nitride film 350 fills the first trench 210 only in a direction in which the intervals between the island-like semiconductor layers is smaller.

Figure 480:
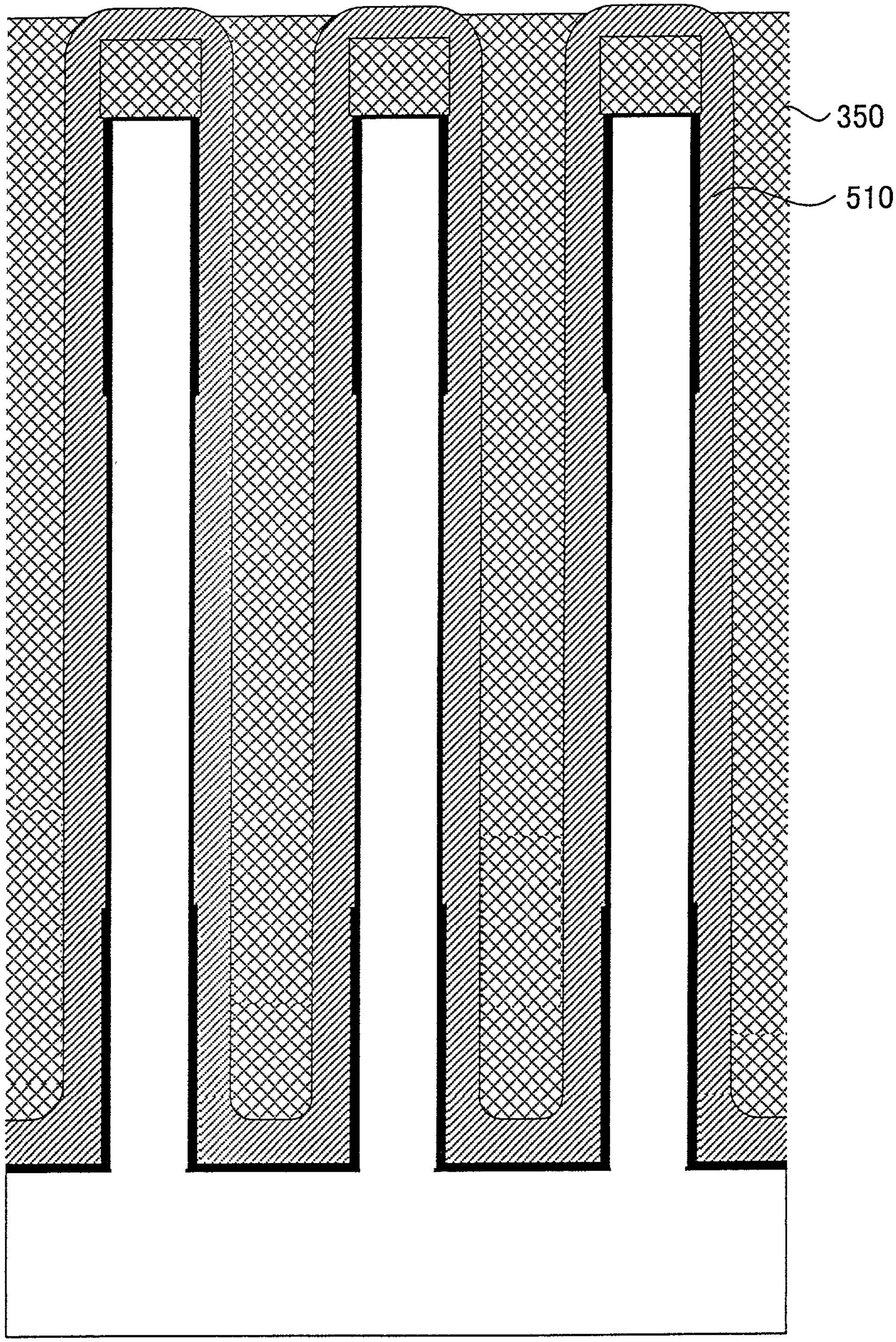
Figure 486:
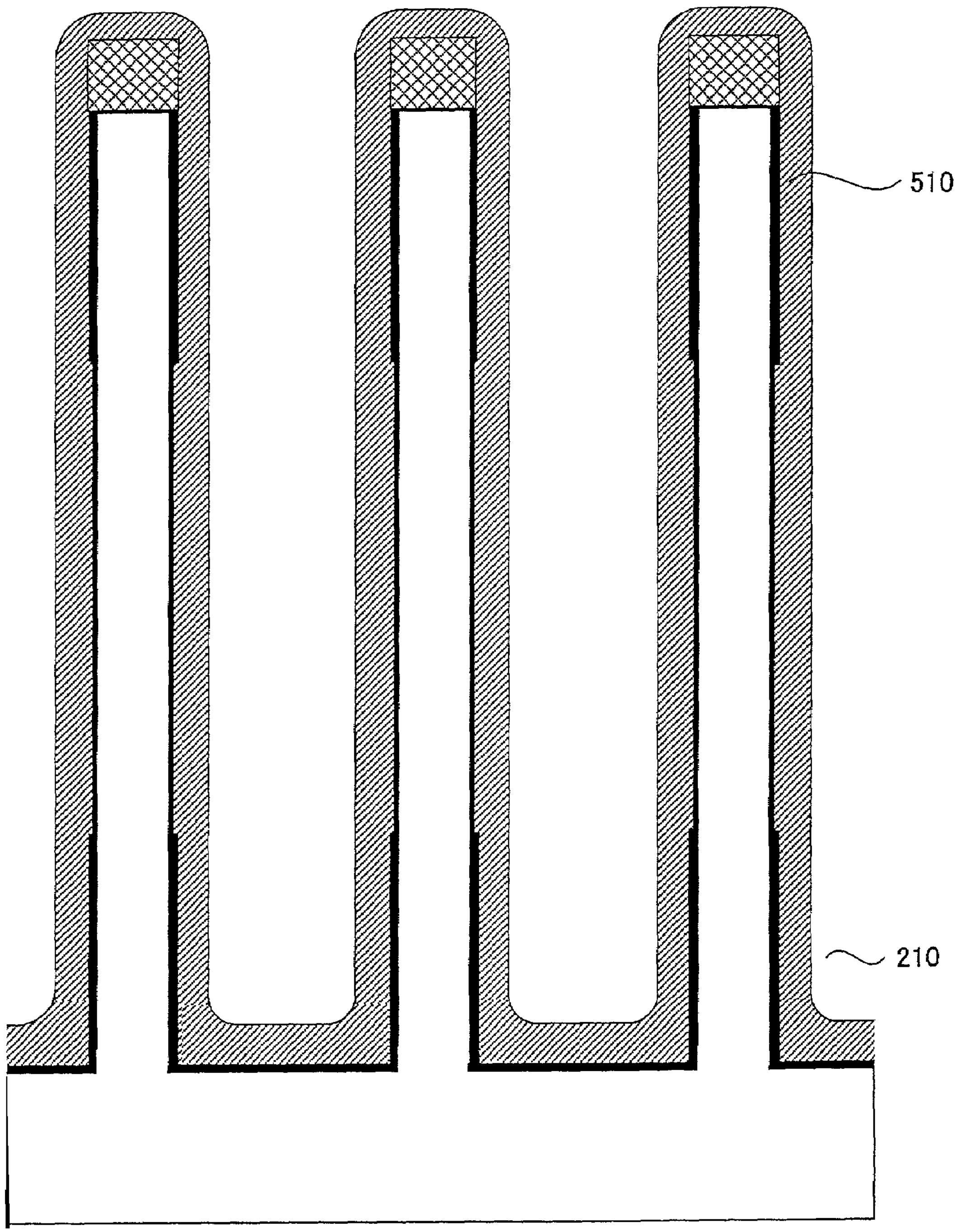

The silicon nitride film 350 is isotropically etched back by a deposited thickness (FIG. 480 and FIG. 486). At this time, as shown in FIG. 480, the top of the polysilicon film (the first conductive film) 510 is exposed but the first trench 210 in the direction in which the intervals between the island-like semiconductor layers is smaller is buried with the silicon nitride film 350.

Figure 481:
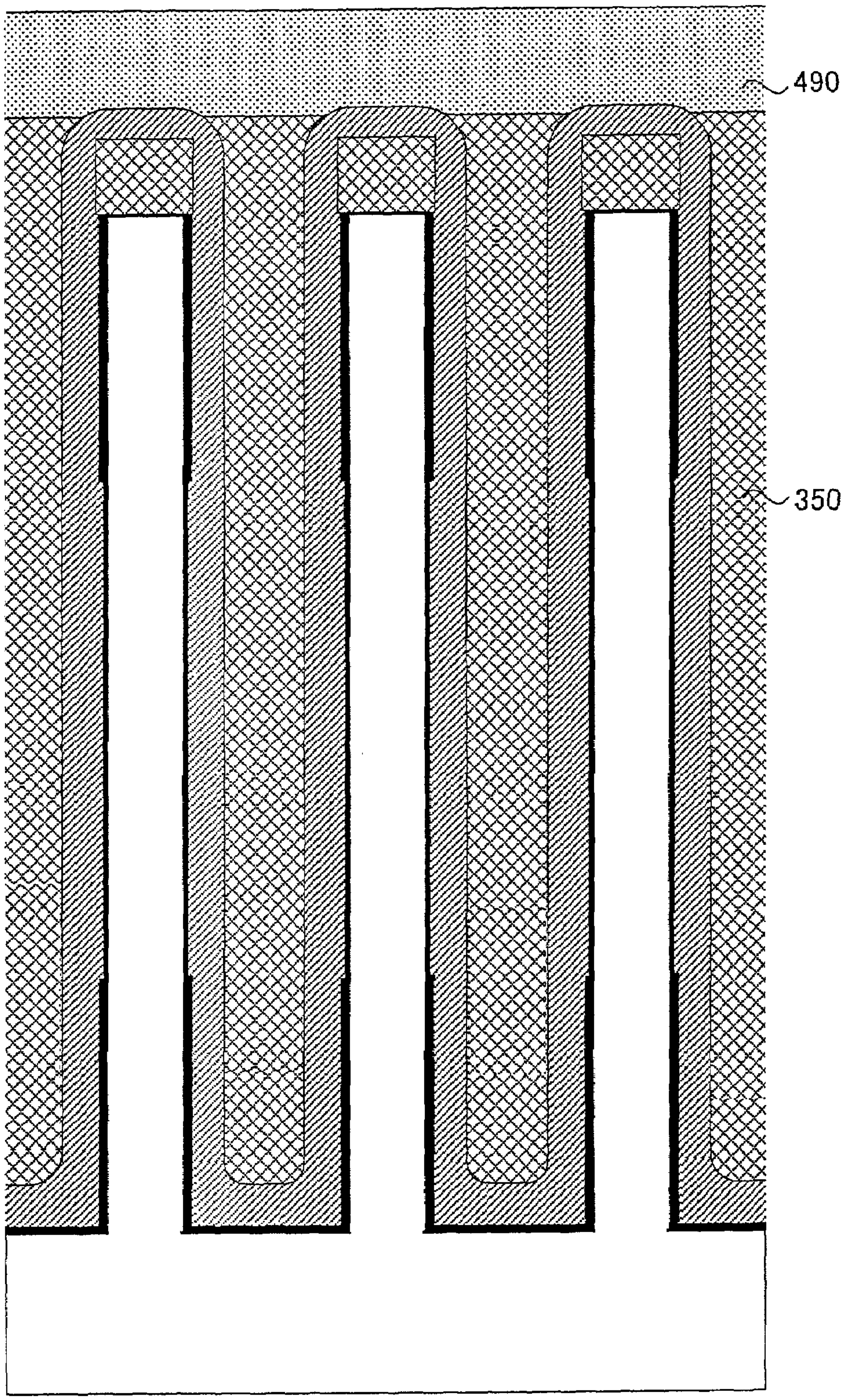
Figure 487:
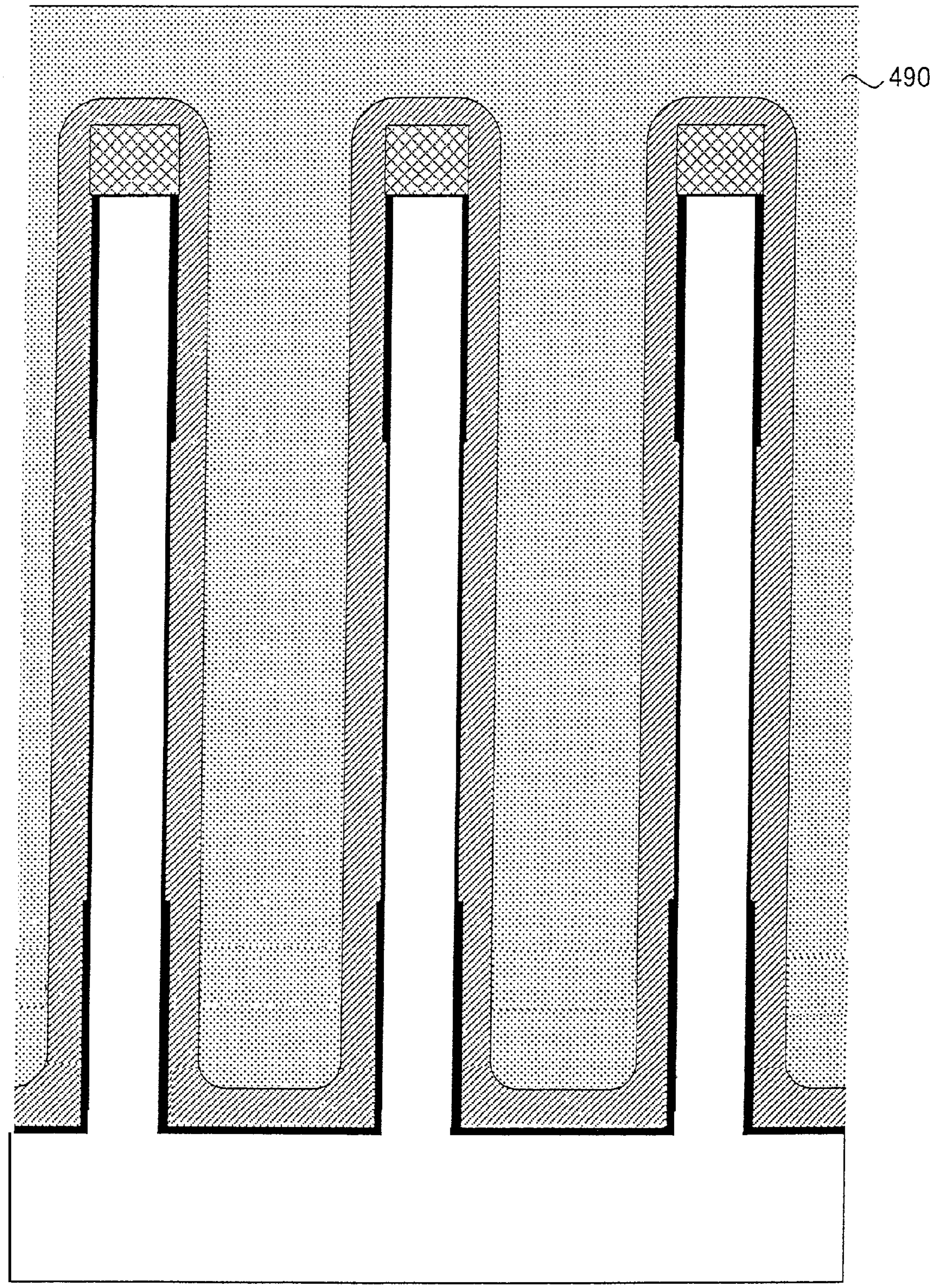

A fifteenth insulating film, for example, a silicon oxide film 490, is deposited to a thickness of about 50 to 200 nm (FIG. 481 and FIG. 487). At this time, as shown in FIG. 487, the thickness of the silicon oxide film 490 is so set that the silicon oxide film 490 fills the first trench 210 only in a direction in which the intervals between the island-like semiconductor layers is larger.

Figure 482:
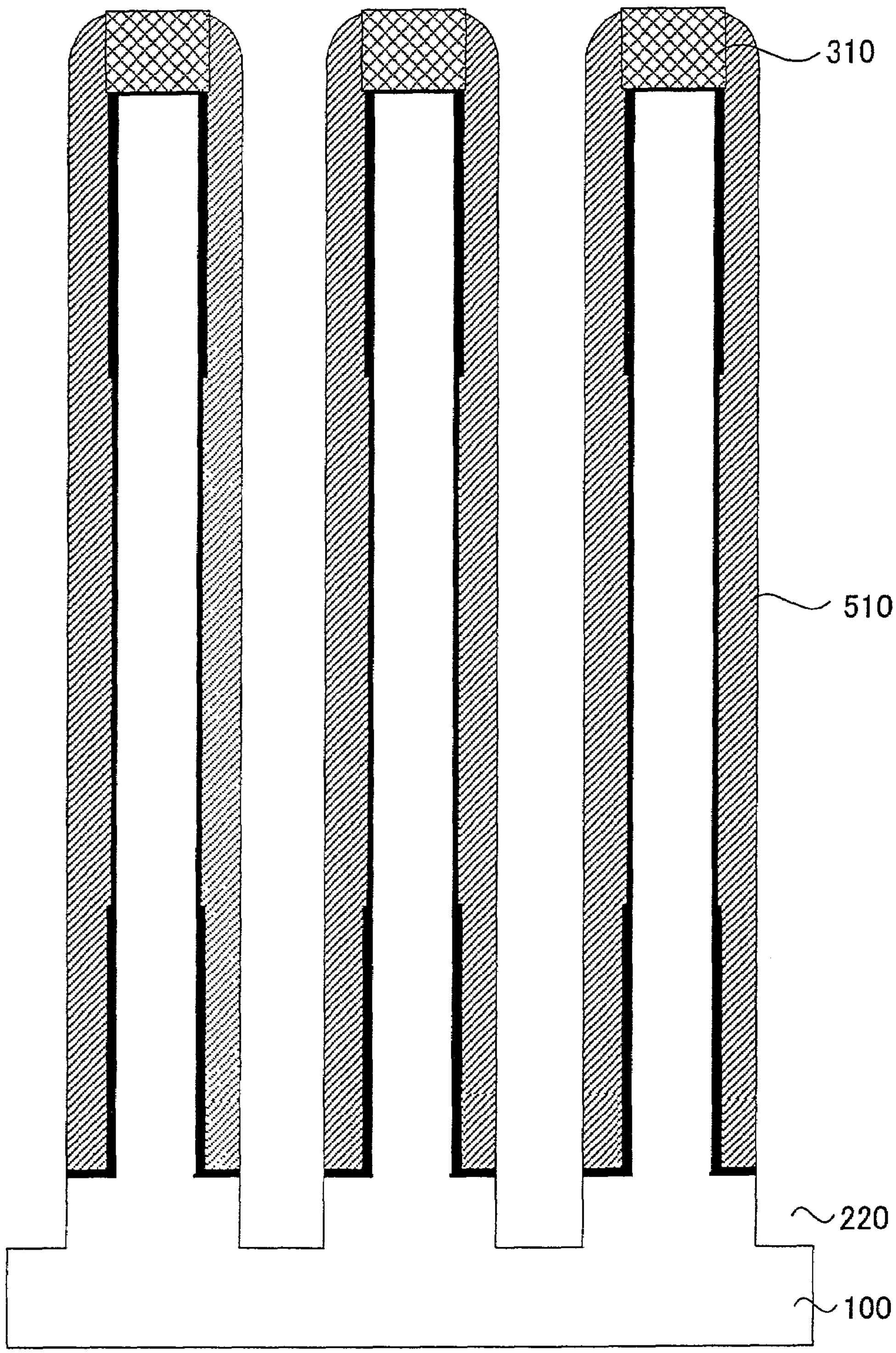
Figure 488:
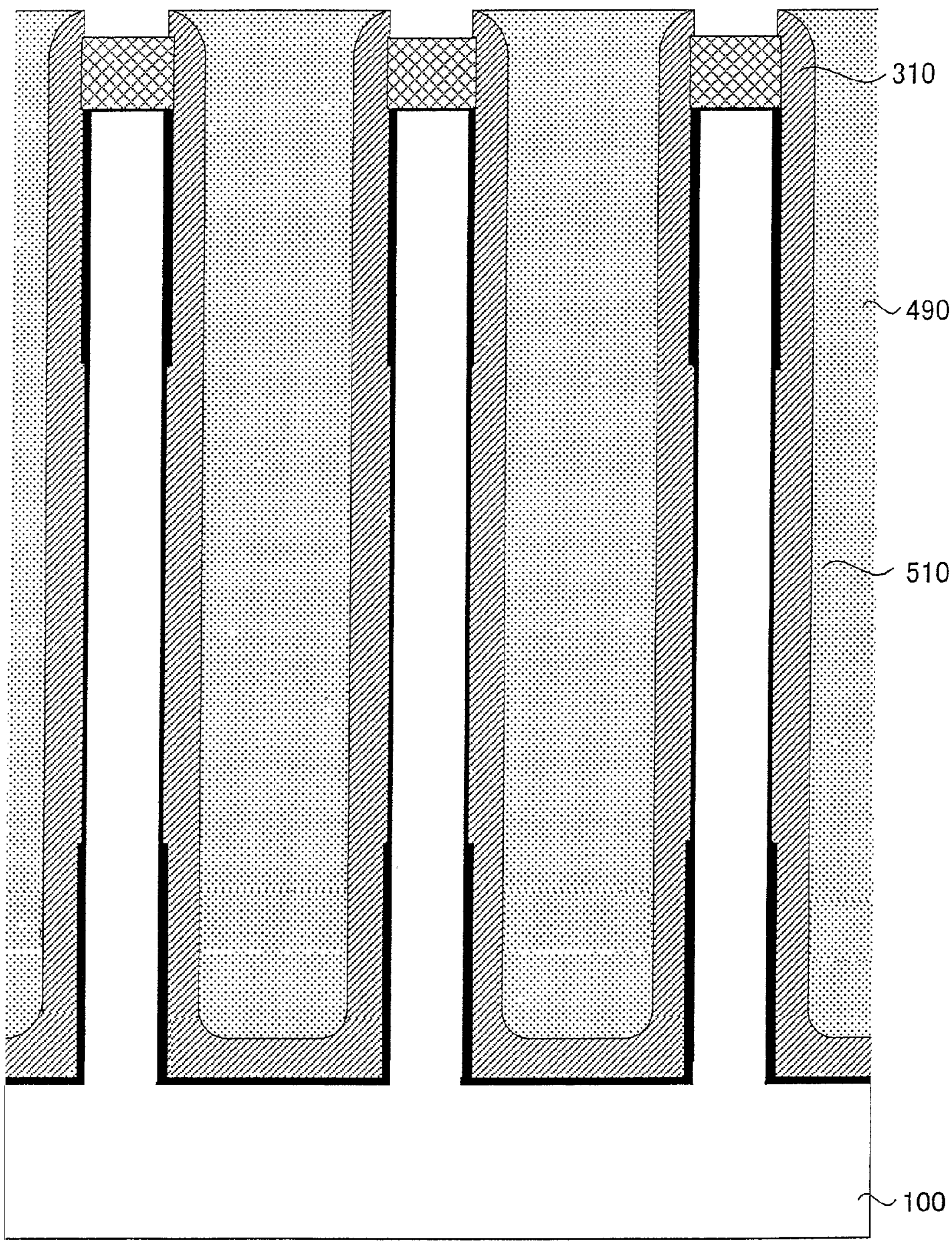

The silicon oxide film 490 is etched back by a deposited thickness, the silicon nitride film 350 remaining in the first trench 210 in FIG. 482 is removed by isotropic etching, and the polysilicon film 510 is anisotropically etched back. At this time, as shown in FIG. 488, the top of the polysilicon film 510 only in the direction in which the intervals between the island-like semiconductor layers is larger is exposed, while the bottom of the polysilicon film 510 is not removed since the first trench is buried with the silicon oxide film 490. A second trench 220 is formed in the semiconductor substrate 100 using as a mask the polysilicon film 510 having been formed into sidewall spacers (FIG. 482 and FIG. 488).

A silicon oxide film 460 which is an eighth insulating film is buried in the second trench 220, and a silicon nitride 321 is deposited to a thickness of 5 to 50 nm as a fourth insulating film to be a mask material for dividing the polysilicon film 510.

Figure 483:
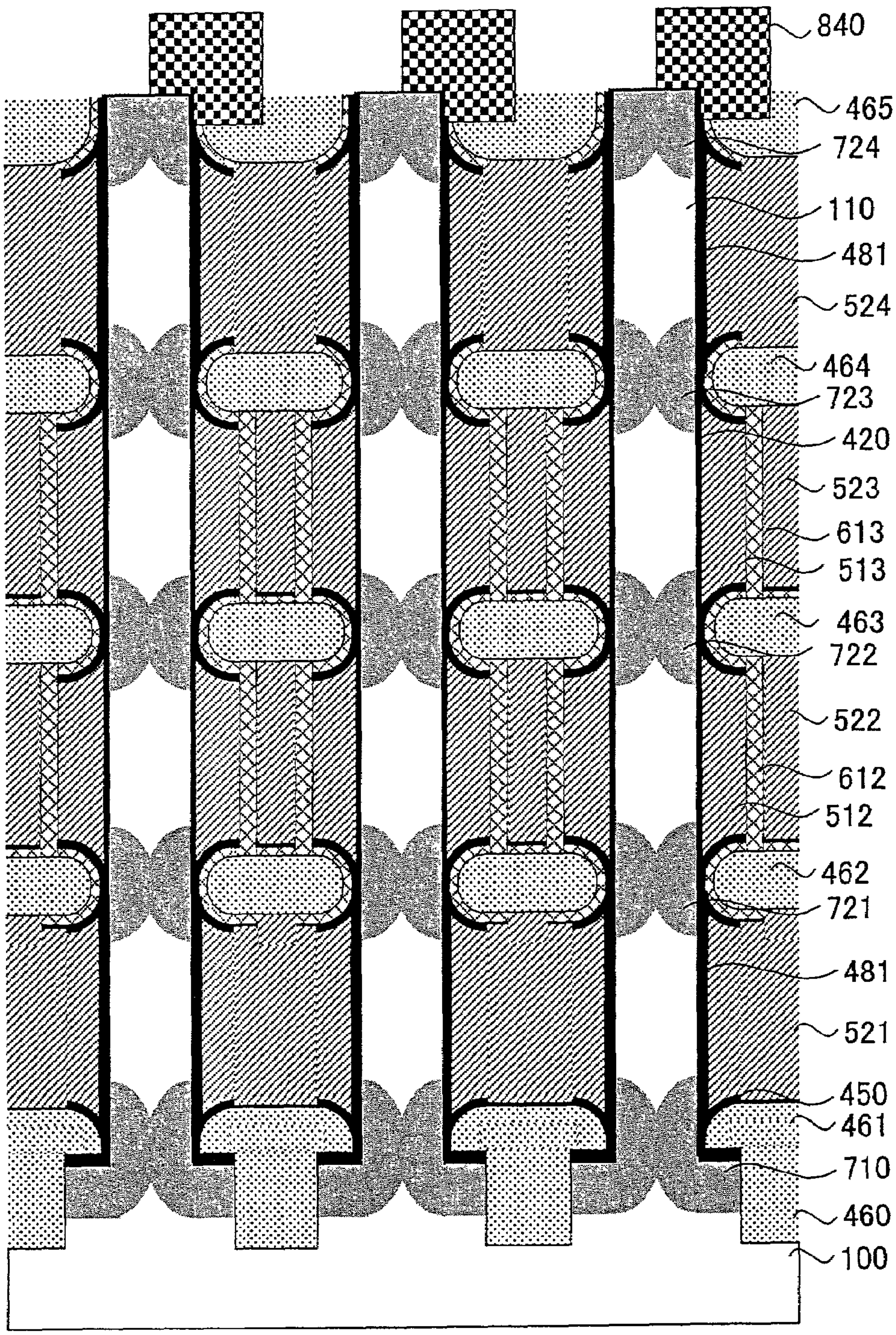
Figure 489:
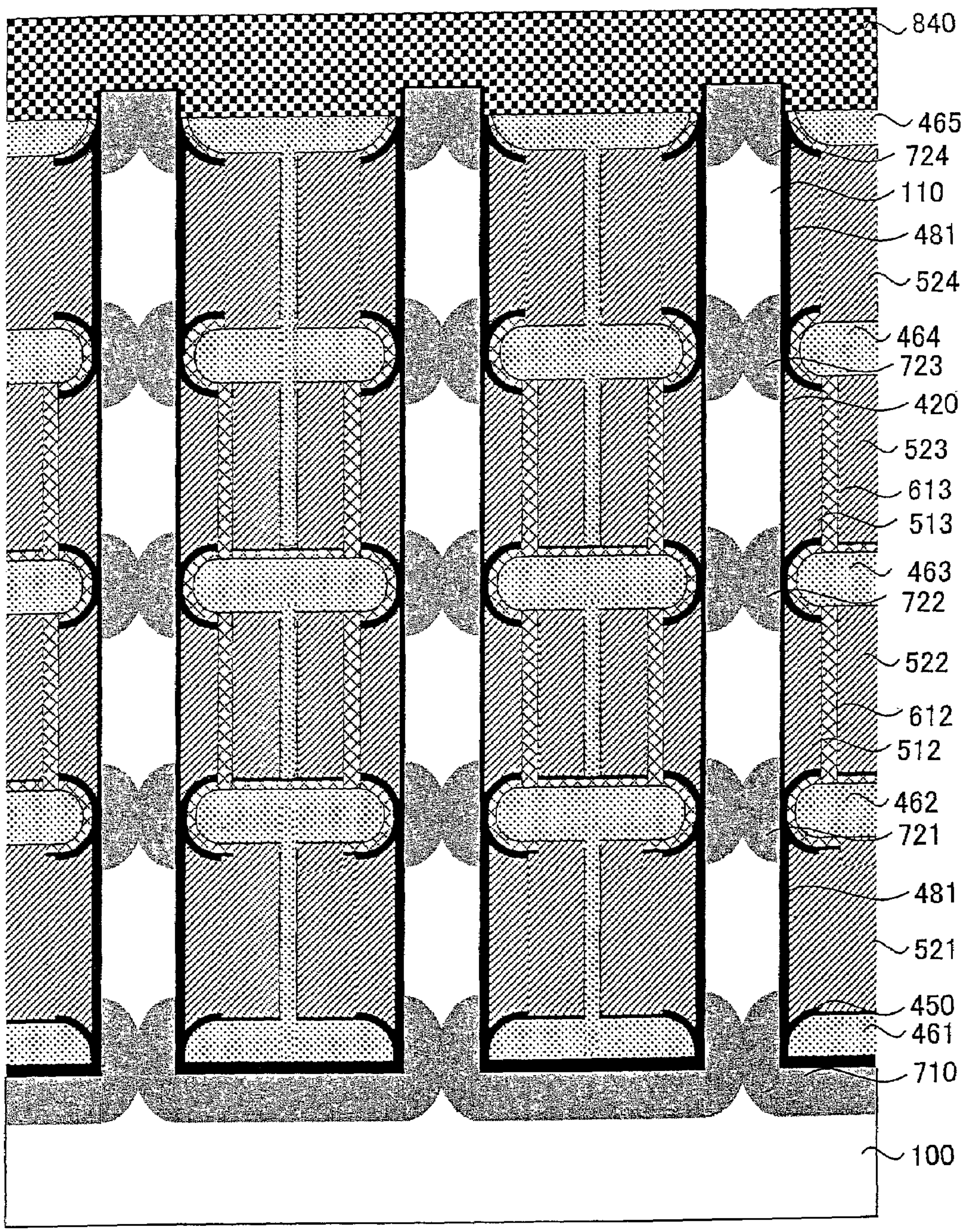

Production steps thereafter follow Production Example 4 as shown in FIG. 483 and FIG. 489.

Thereby, a semiconductor memory is realized in which the first wiring layer is parallel to the fourth wiring layer and which has a memory function according to the state of a charge in the charge storage layer which is the floating gate made of the polysilicon film (the first conductive film).

In this example, films formed on the surface of the semiconductor substrate or the polysilicon film such as the silicon nitride film (the first insulating film) 310, the silicon nitride films (the twelfth insulating films) 341, 342 and 343, the silicon nitride films (the fourth insulating films) 321, 322, 323 and 324 and the silicon nitride film (the fourteenth insulating film) 350 may be formed of a layered film of a silicon oxide film/a silicon nitride film from the silicon surface.

PRODUCTION EXAMPLE 11

In the above Production Examples 1 to 9, the selection gates and the floating gates of the transistors of a semiconductor memory are formed at the same time, and the direction of the first wiring layer crosses that of the fourth wiring layer. In Production Example 10, for obtaining a structure in which the direction of the first wiring layer is parallel to the direction of the fourth wiring layer, the first trench 210 is opened only in the direction in which the intervals between the island-like semiconductor layers are smaller, without using a mask to form the separation trench of the first wiring layer in the semiconductor substrate 100. In Example 11, however, the separation trench of the first wiring layer is formed by patterning with use of a resist film by photolithography.

Such a semiconductor memory may be produced by the following production process. FIGS. 490 to 495 and FIGS. 496 to 501 are sectional views taken on line A–A' and line B–B', respectively, in FIG. 1 which is a plan view illustrating a memory cell array of an EEPROM.

Figure 490:
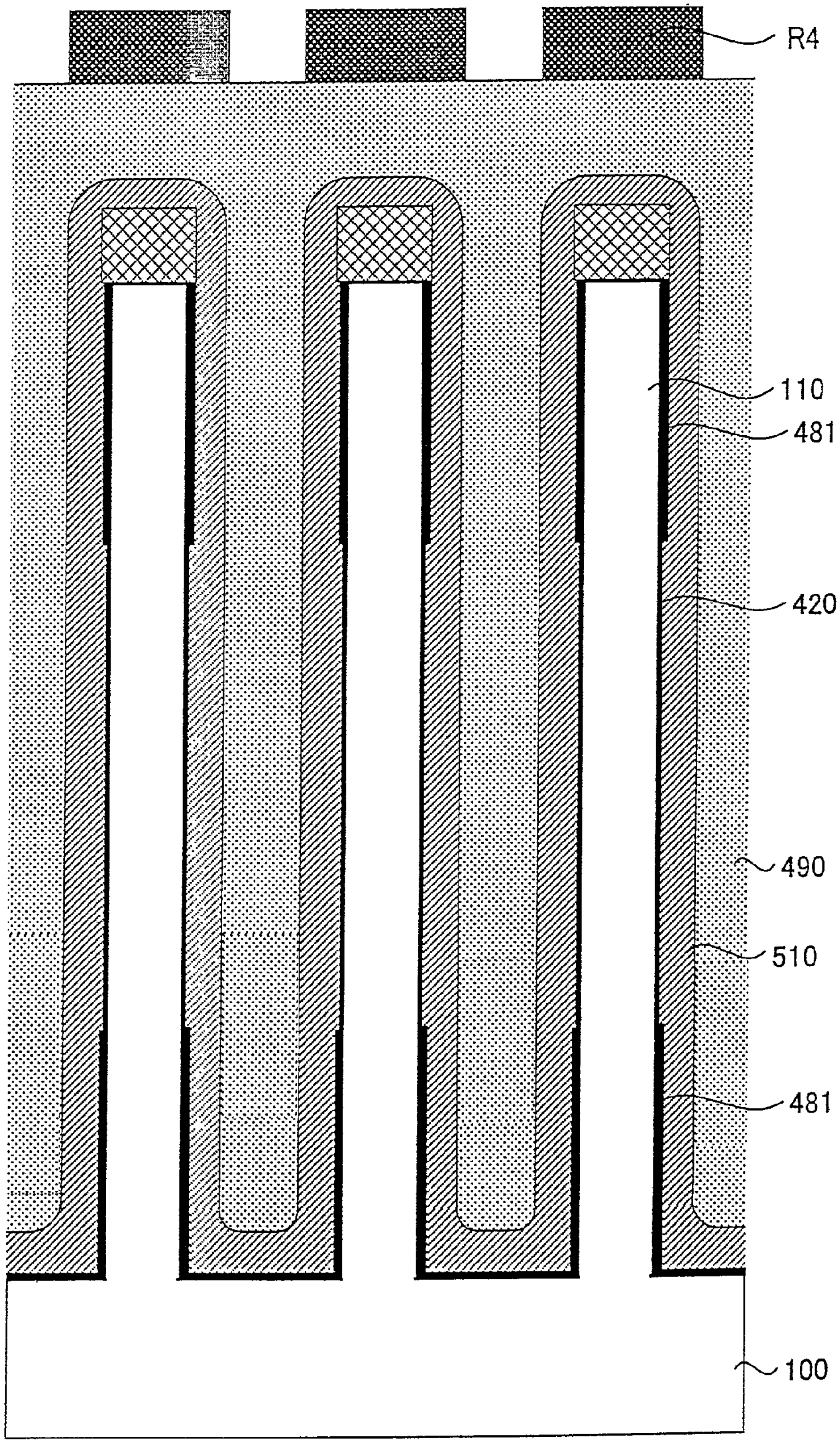
FIG. 490 to FIG. 495 are sectional views (taken on line A–A' in FIG. 1) illustrating production steps of Production Example 11 for producing a semiconductor memory in accordance with the present invention.
Figure 496:
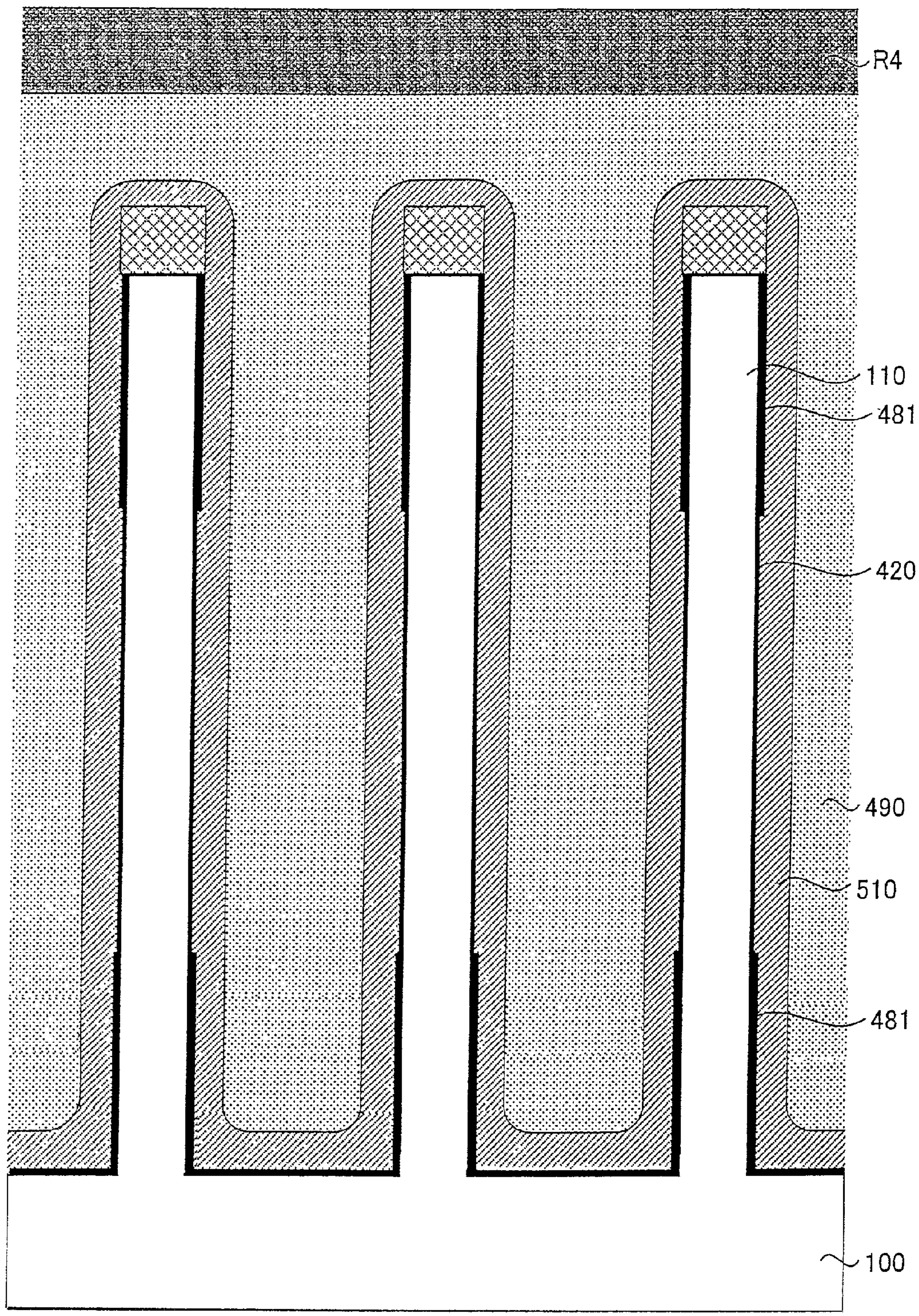
FIG. 496 to FIG. 501 are sectional views (taken on line B–B' in FIG. 1) illustrating production steps of Production Example 11 for producing a semiconductor memory in accordance with the present invention.

This example is the same as Production Example 4 until the polysilicon film 510 is deposited to 50 to 200 nm (FIG. 490 and FIG. 496).

Figure 491:
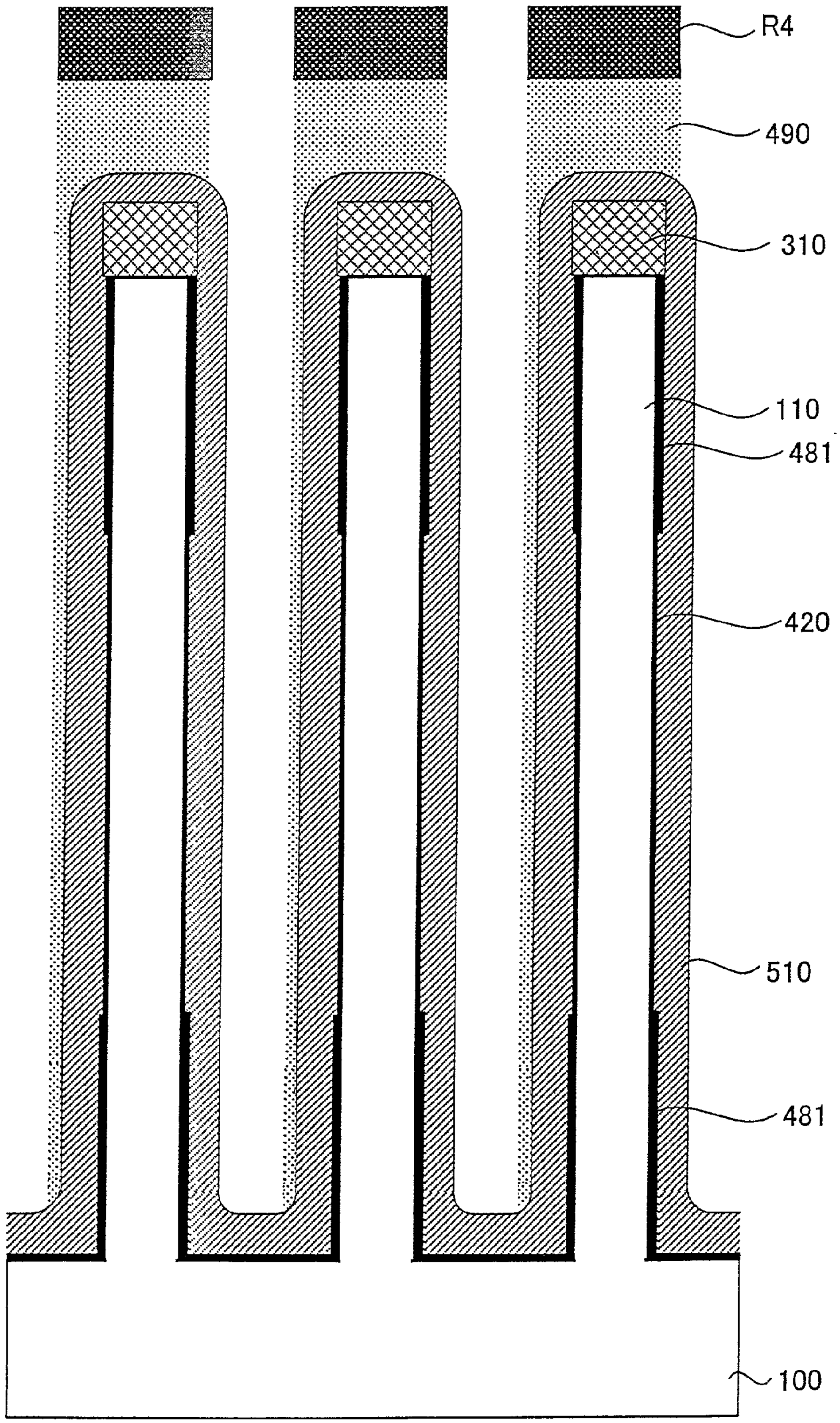
Figure 497:
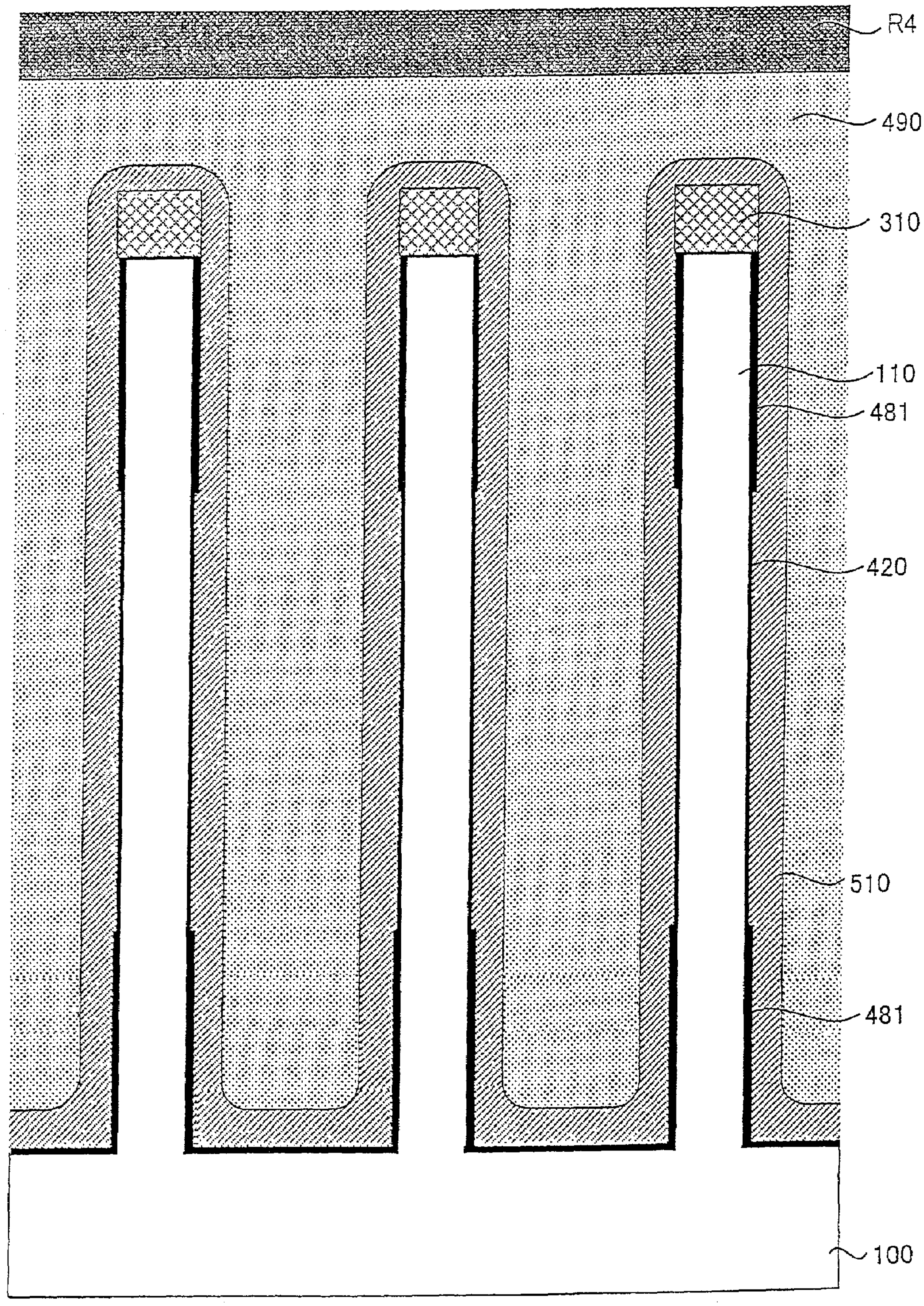

Thereafter, a fifteenth insulating film, for example, a silicon oxide film 490, is deposited to 100 to 300 nm by CVD. The silicon oxide film 490 is etched by reactive ion etching using a resist film R4 patterned by a known photolithographic technique and the polysilicon film (the first conductive film) 510 as a mask (FIG. 491 and FIG. 497).

Figure 492:
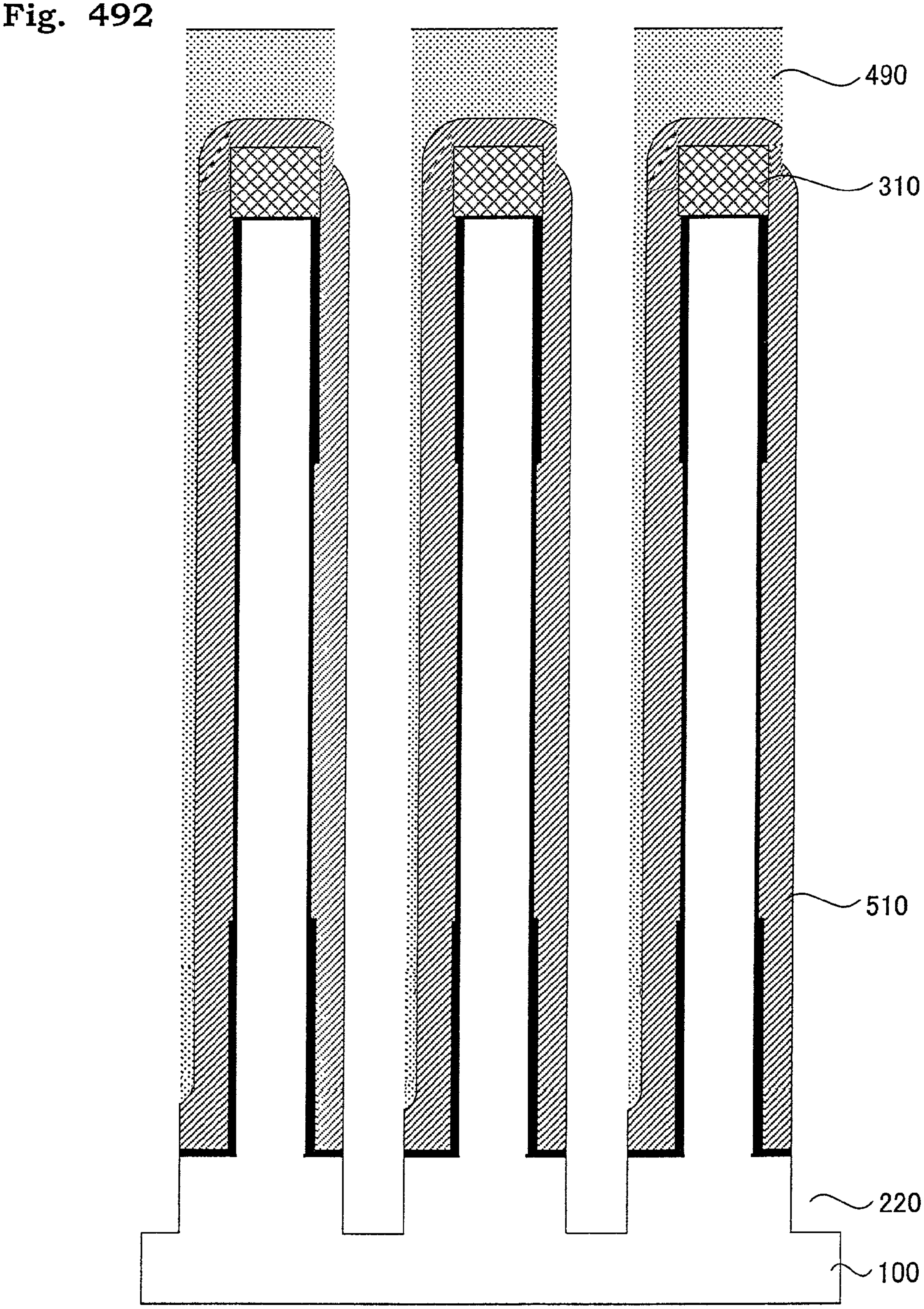
Figure 493:
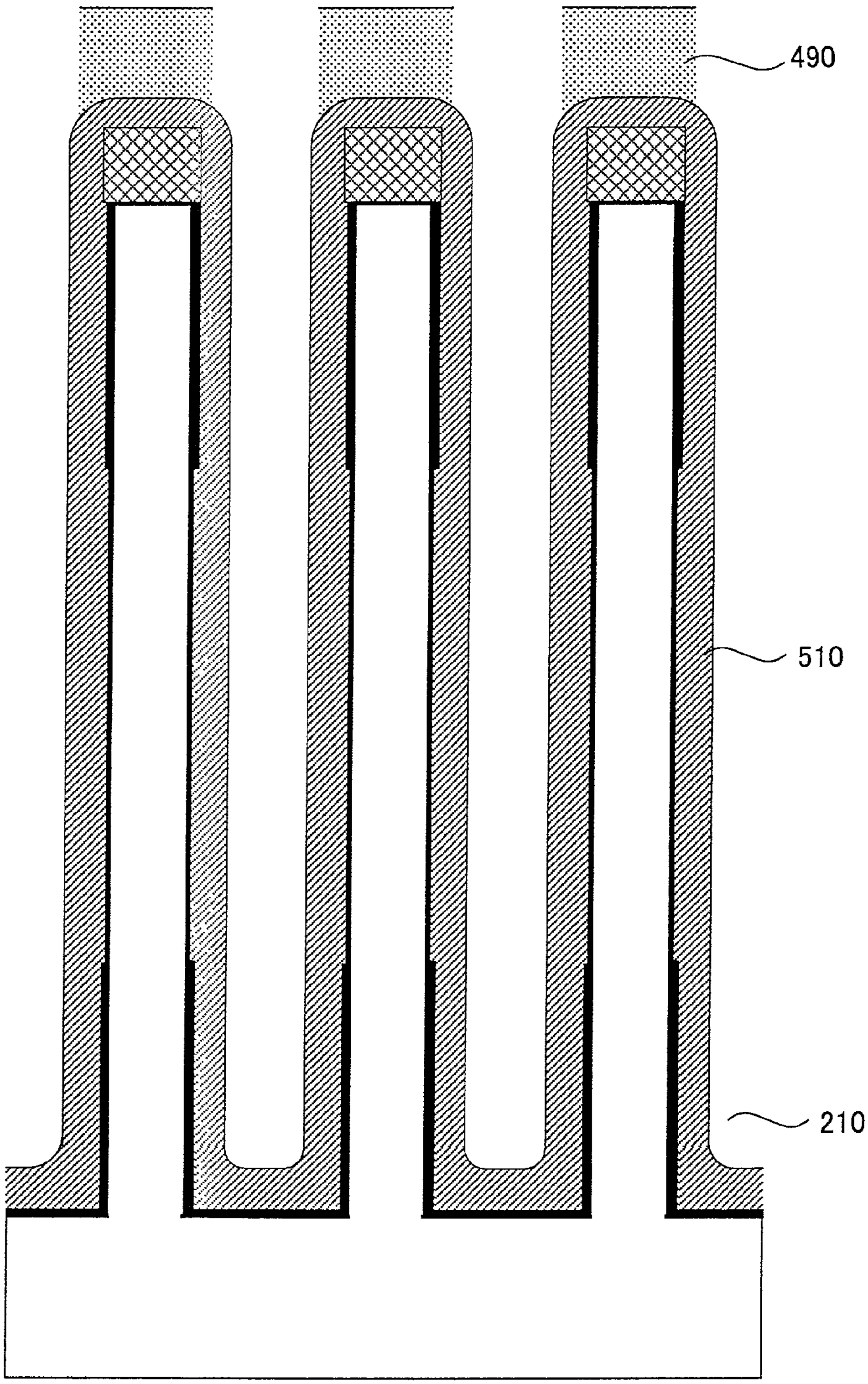
Figure 494:
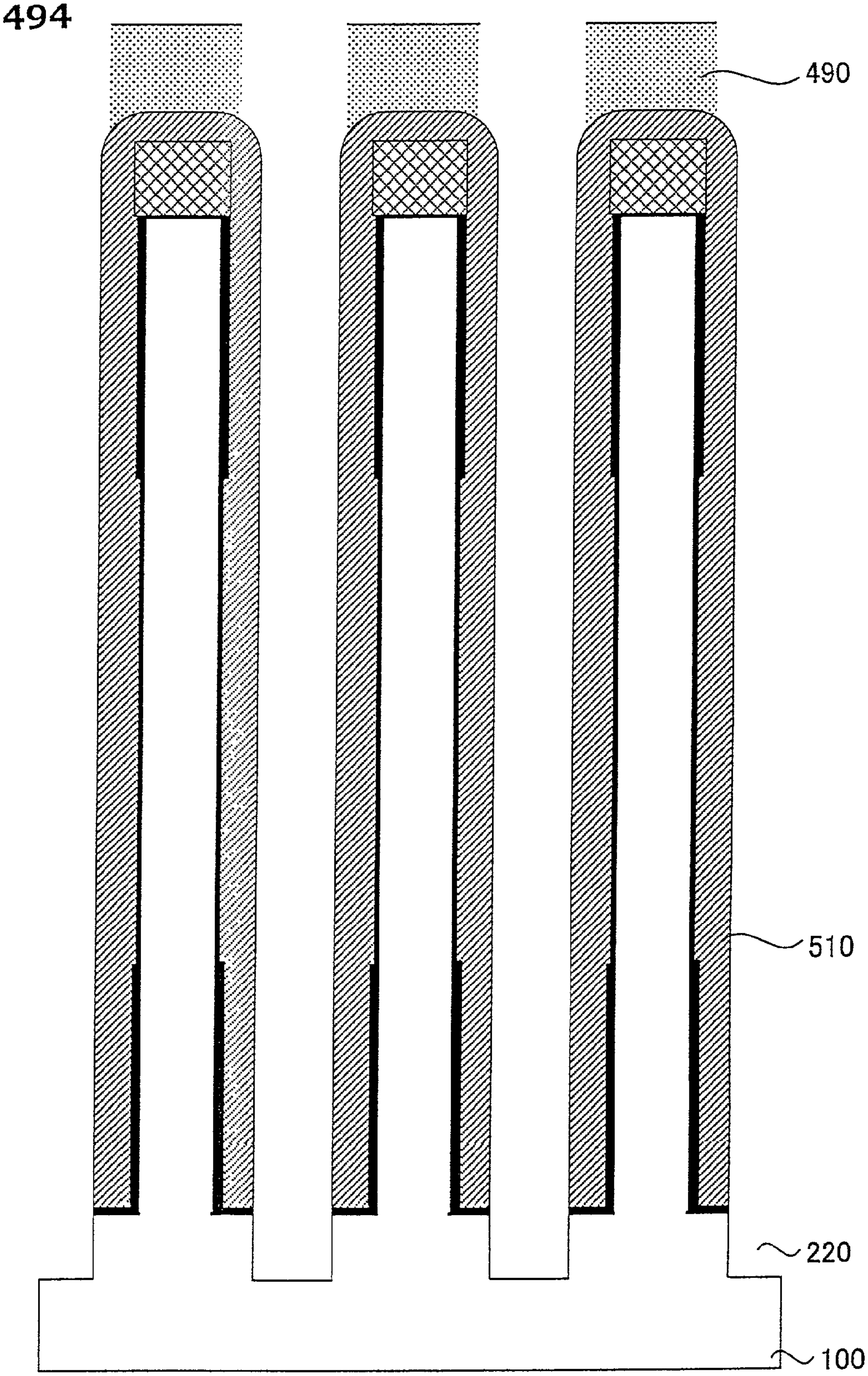
Figure 498:
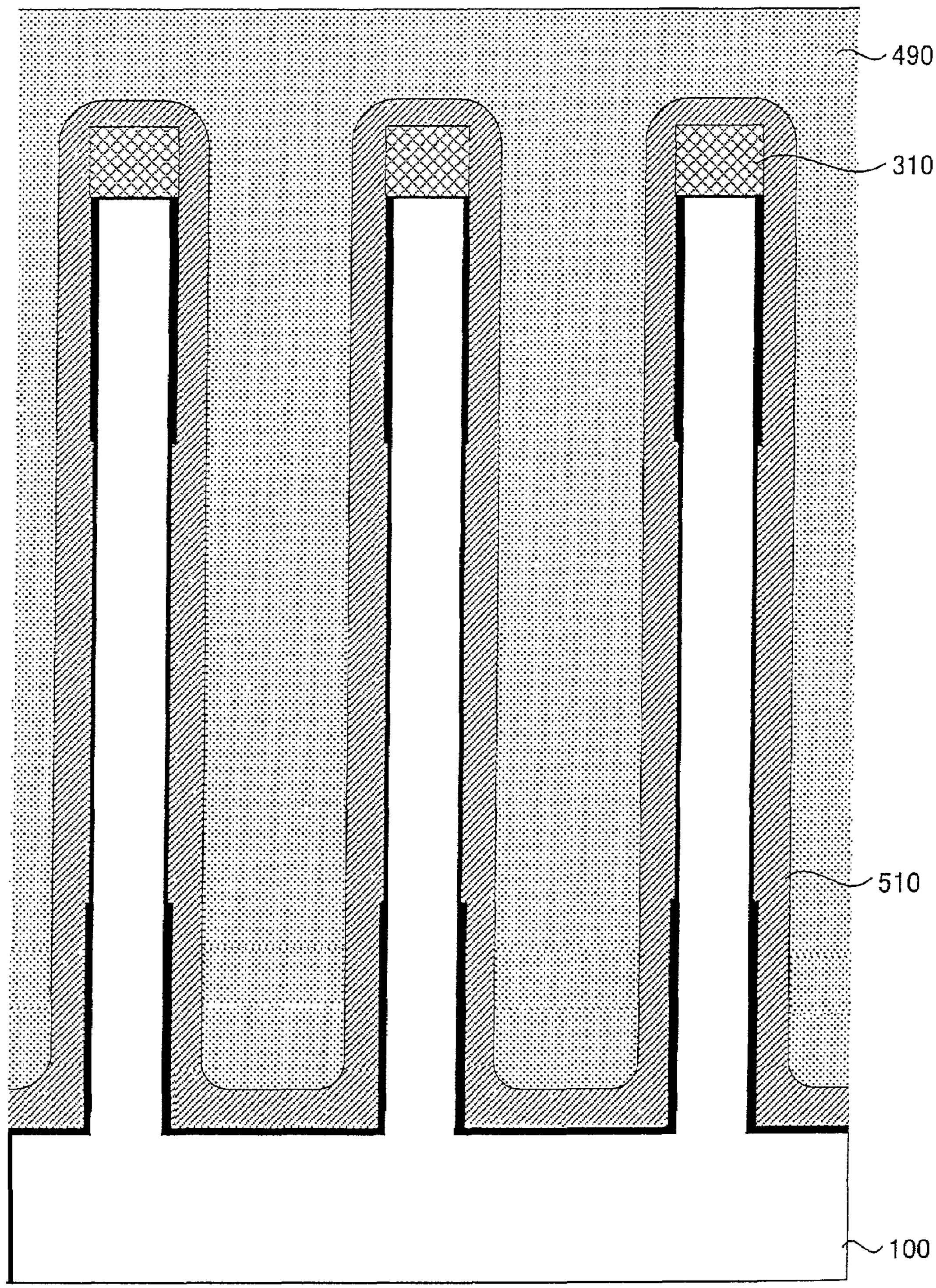
Figure 499:
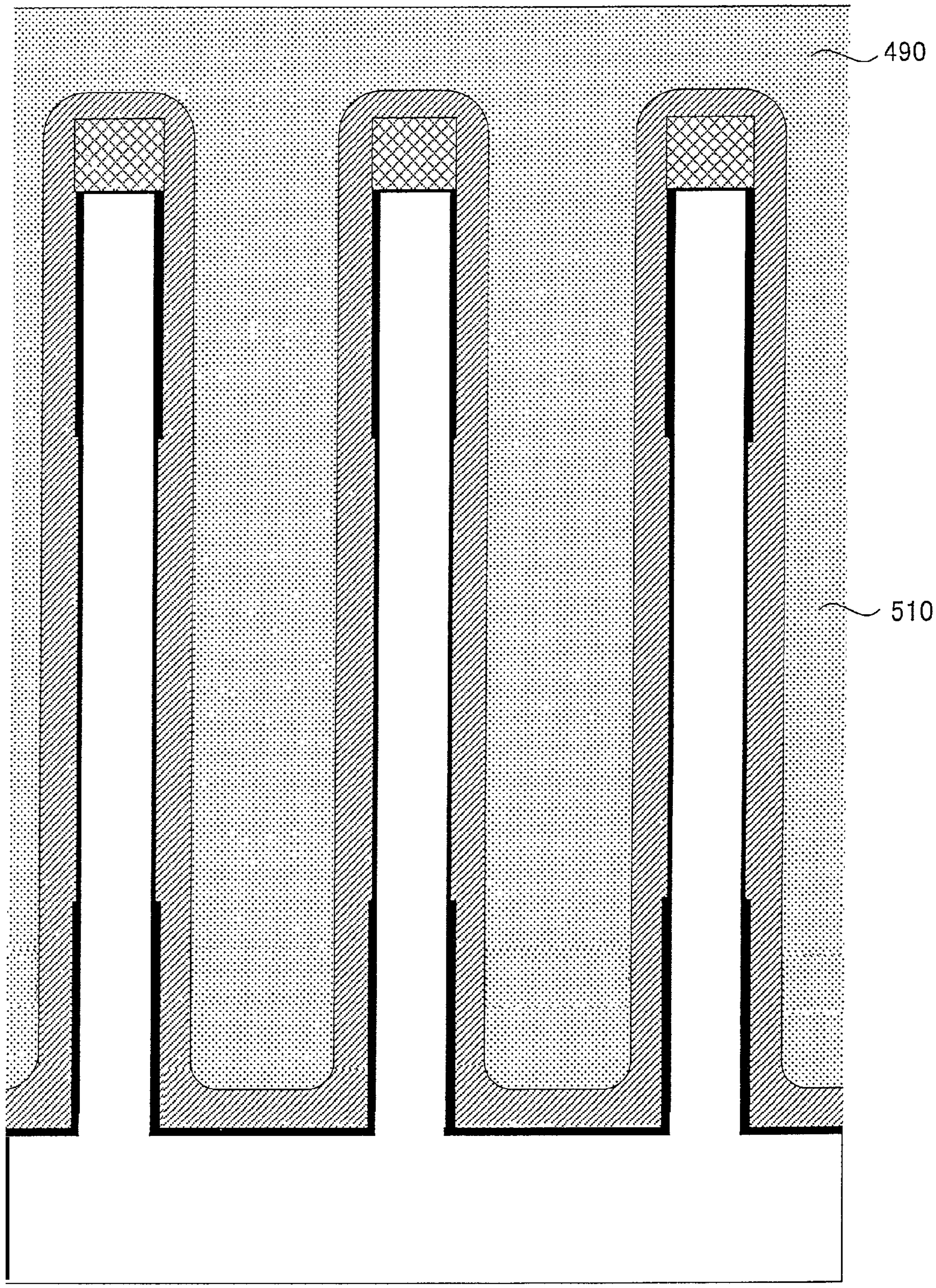
Figure 500:
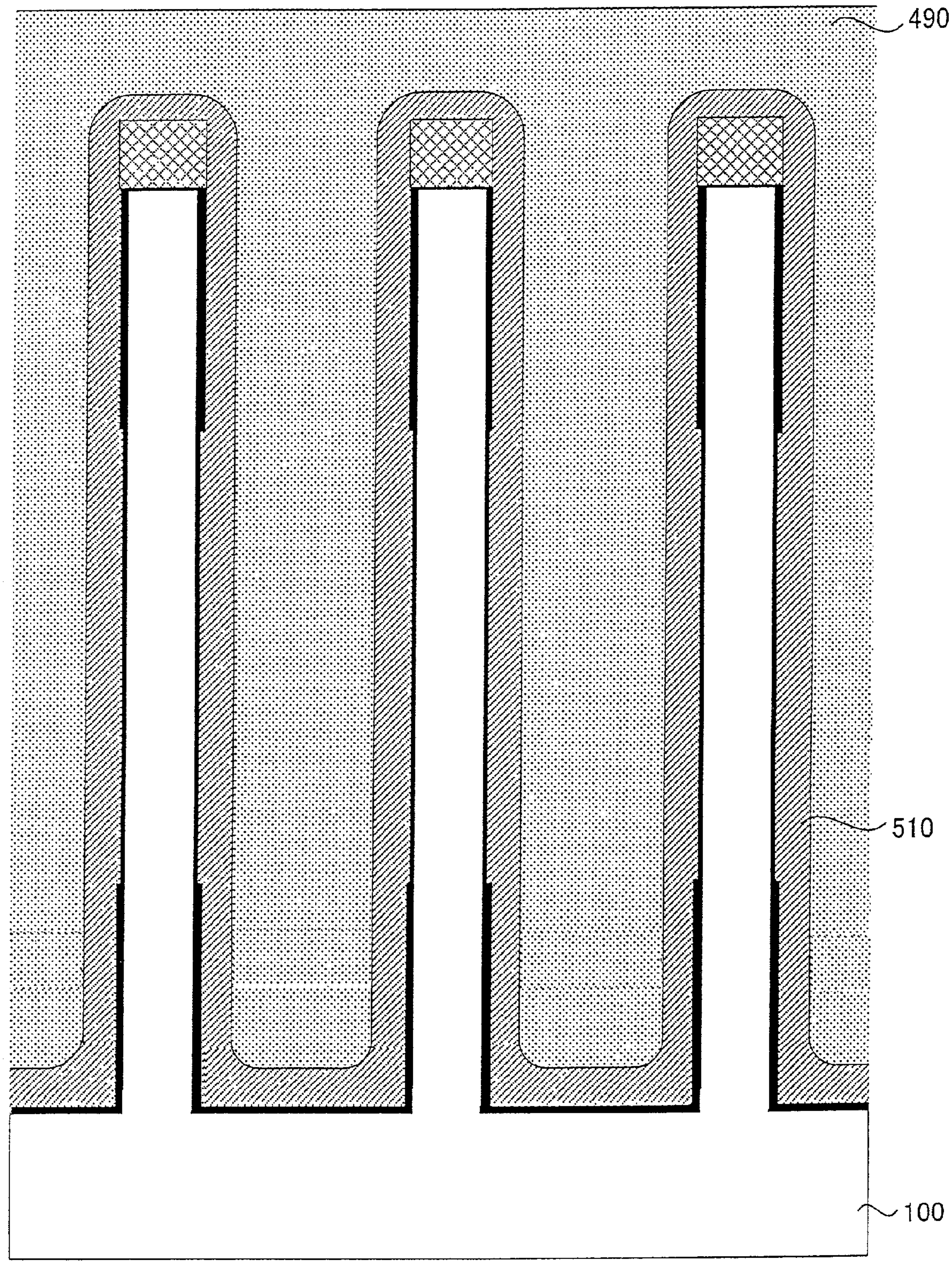

The polysilicon film 510 is anisotropically etched back using the silicon oxide film 490 as a mask to remove the polysilicon film 510 partially from the bottom of the first trench 210. A second trench 220 is formed in the semiconductor substrate 100 using the polysilicon film 510 having been formed in sidewall spacers and the partially remaining silicon oxide film 490 as a mask (FIG. 492 and FIG. 498). Alternatively, the silicon oxide film 490 partially remaining in the first trench 210 is removed by isotropic etching so that the silicon oxide film 490 does not remain in the first trench 210 in one direction as shown in FIG. 493 but remains in the first trench 210 in another direction (FIG. 493 and FIG. 499). A second trench 220 is formed in the semiconductor substrate 100 using the polysilicon film 510 as a mask (FIG. 494 and FIG. 500).

An eighth insulating film, for example, a silicon oxide film 460, is buried in the second trench 220, and a silicon nitride film 321 is deposited to a thickness of 5 to 50 nm as a fourth insulating film to be a mask material for dividing the polysilicon film 510.

Figure 495:
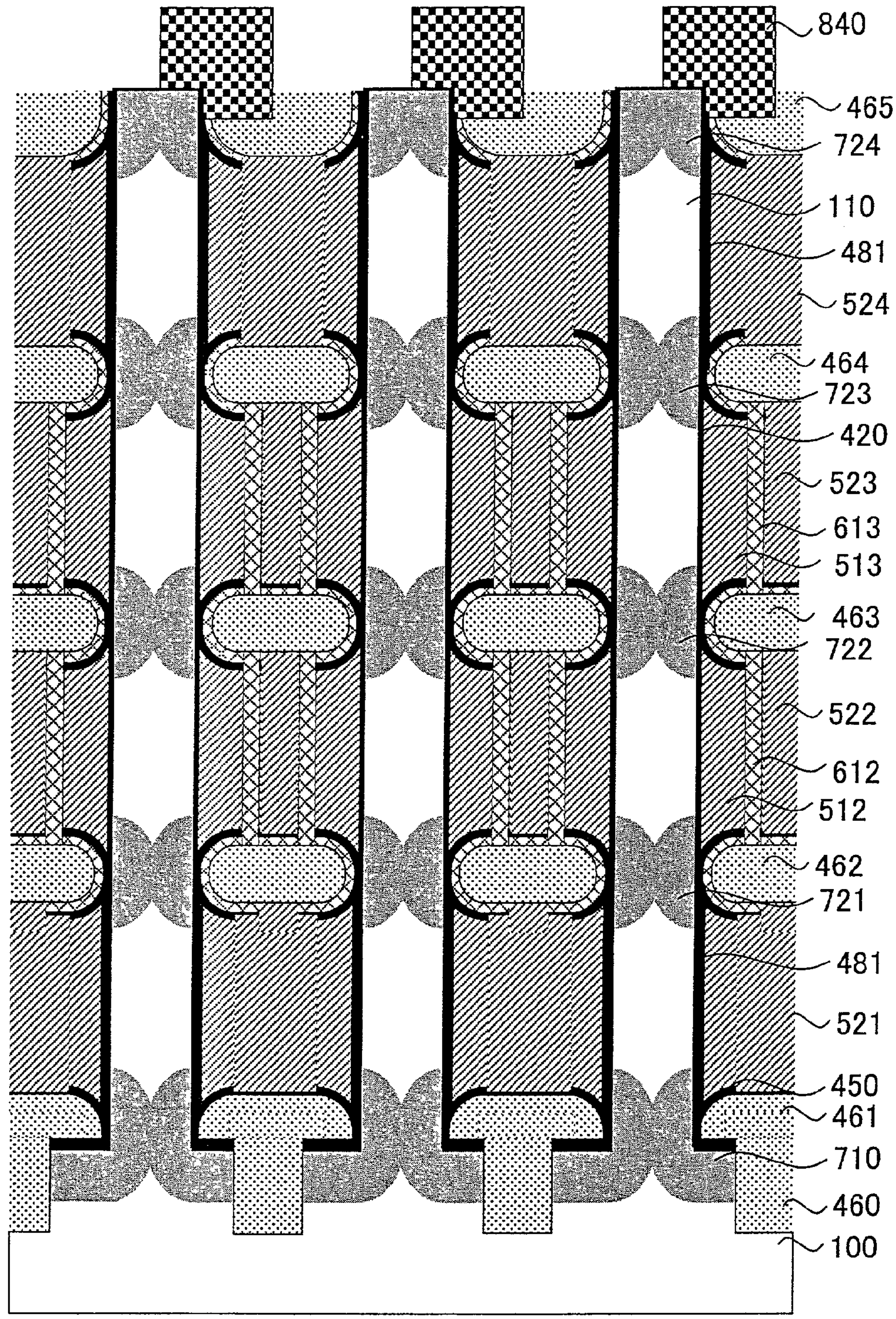
Figure 501:
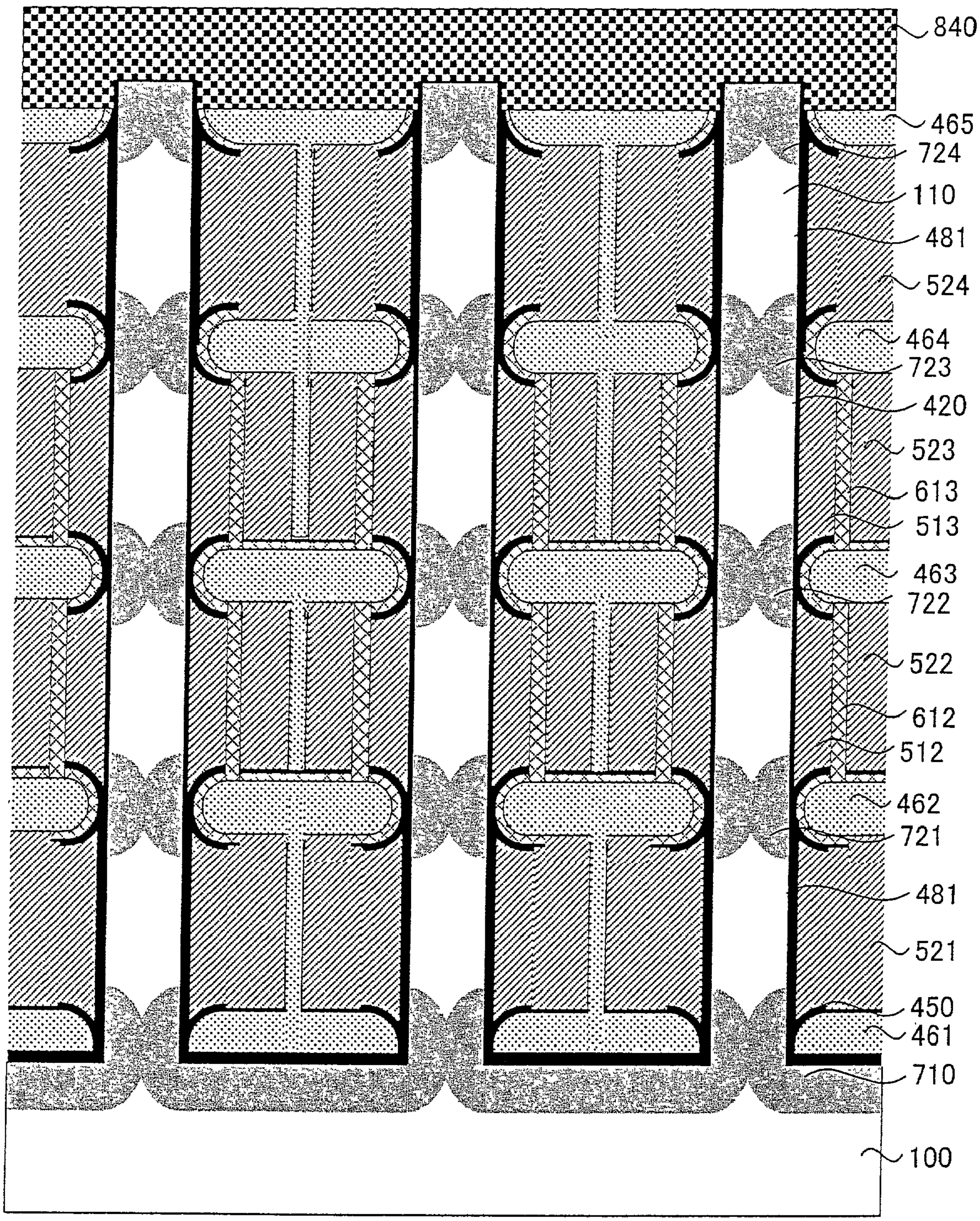

Production steps thereafter follow Production Example 4 as shown in FIG. 495 and FIG. 501.

Thereby, a semiconductor memory is realized which has a memory function according to the state of a charge in the charge storage layer which is the floating gate made of the polysilicon film (the first conductive film) and in which the first wiring layer is parallel to the fourth wiring layer.

PRODUCTION EXAMPLE 12

In Production Examples 1 to 9, the selection gates and the floating gates of the transistors of a semiconductor memory are formed at the same time, and the direction of the first wiring layer crosses that of the fourth wiring layer. In this example, however, explanation is given of an example of production process for obtaining a structure in which the first wiring layer is electrically common to the memory cell array.

Figure 502:
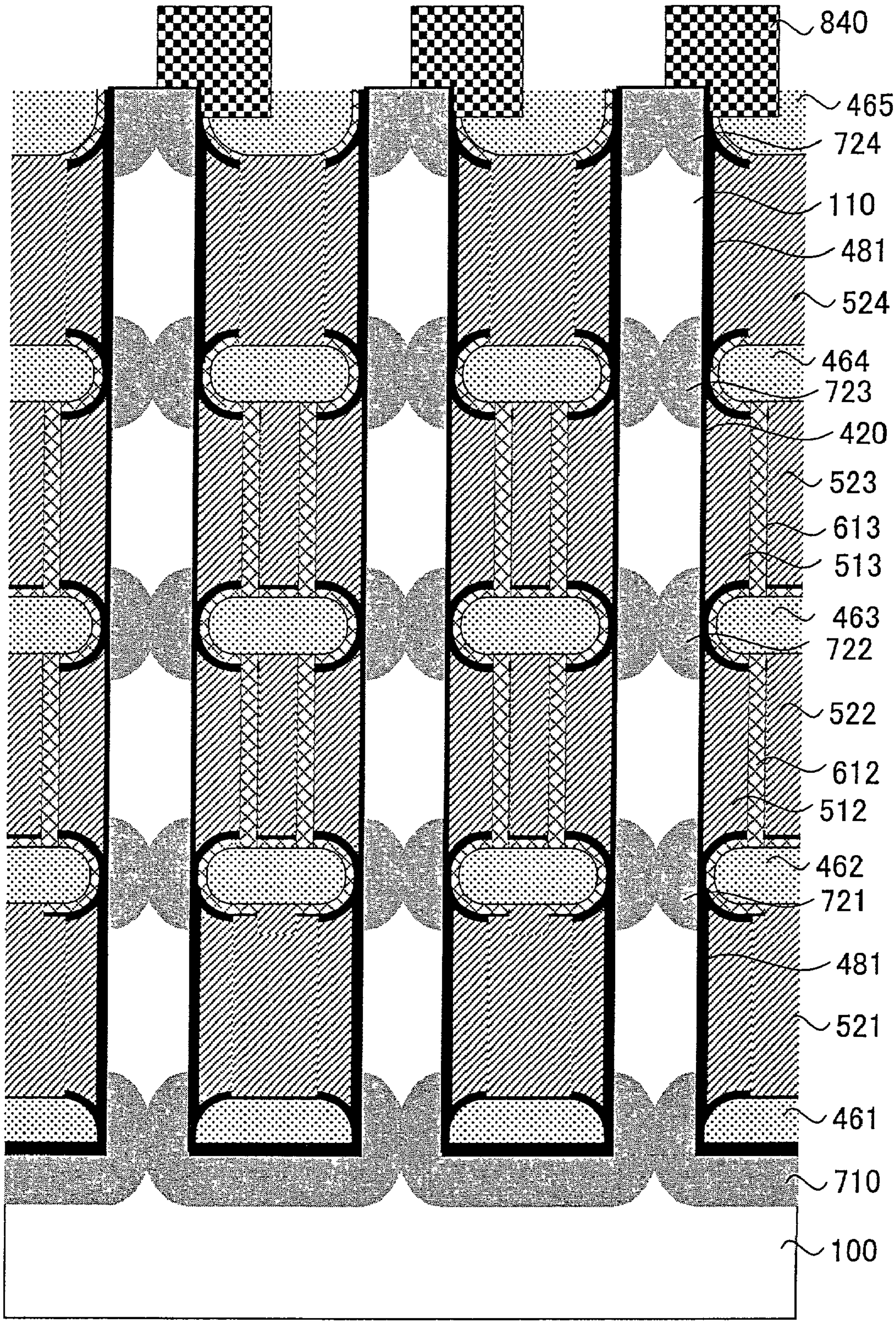
FIG. 502 is a sectional view (taken on line A–A' in FIG. 1) illustrating a production step of Production Example 12 for producing a semiconductor memory in accordance with the present invention.
Figure 503:
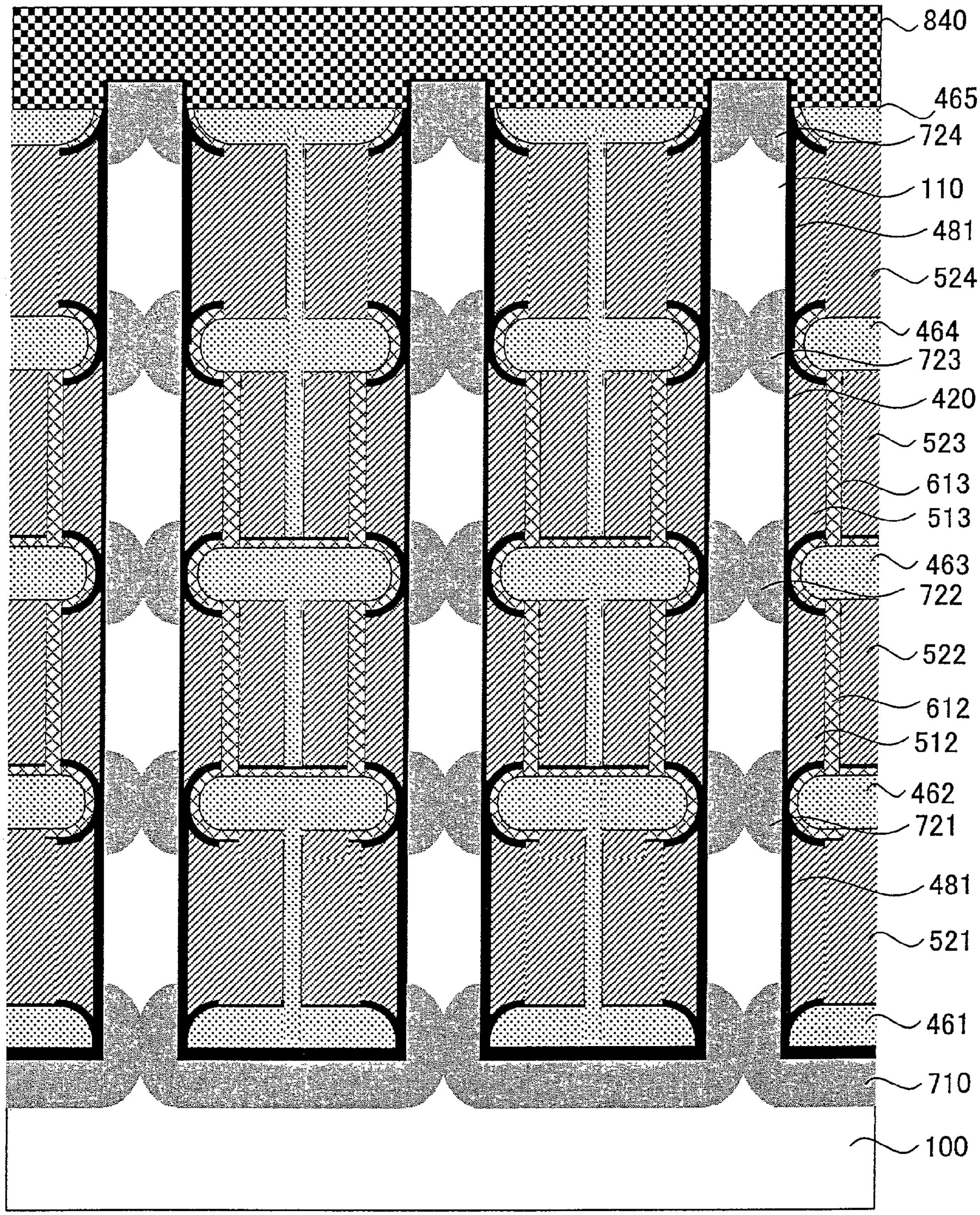
FIG. 503 is a sectional view (taken on line B–B' in FIG. 1) illustrating a production step of Production Example 12 for producing a semiconductor memory in accordance with the present invention.

Such a semiconductor memory may be produced by the following production process. FIG. 502 and FIG. 503 are sectional views taken on line A–A' and line B–B', respectively, in FIG. 1 which is a plan view illustrating a memory cell array of an EEPROM.

In this example, as shown in FIG. 502 and FIG. 503, the second trench 220 is not formed in the semiconductor substrate 100. This example is the same as Production Example 4 from which the steps regarding the formation of the second trench 220 is omitted.

Thereby, a semiconductor memory is realized which has a memory function according to the state of a charge in the charge storage layer which is the floating gate made of the polysilicon film (the first conductive film) and in which the first wiring layer in the array is not divided but is common.

PRODUCTION EXAMPLE 13

Figure 504:
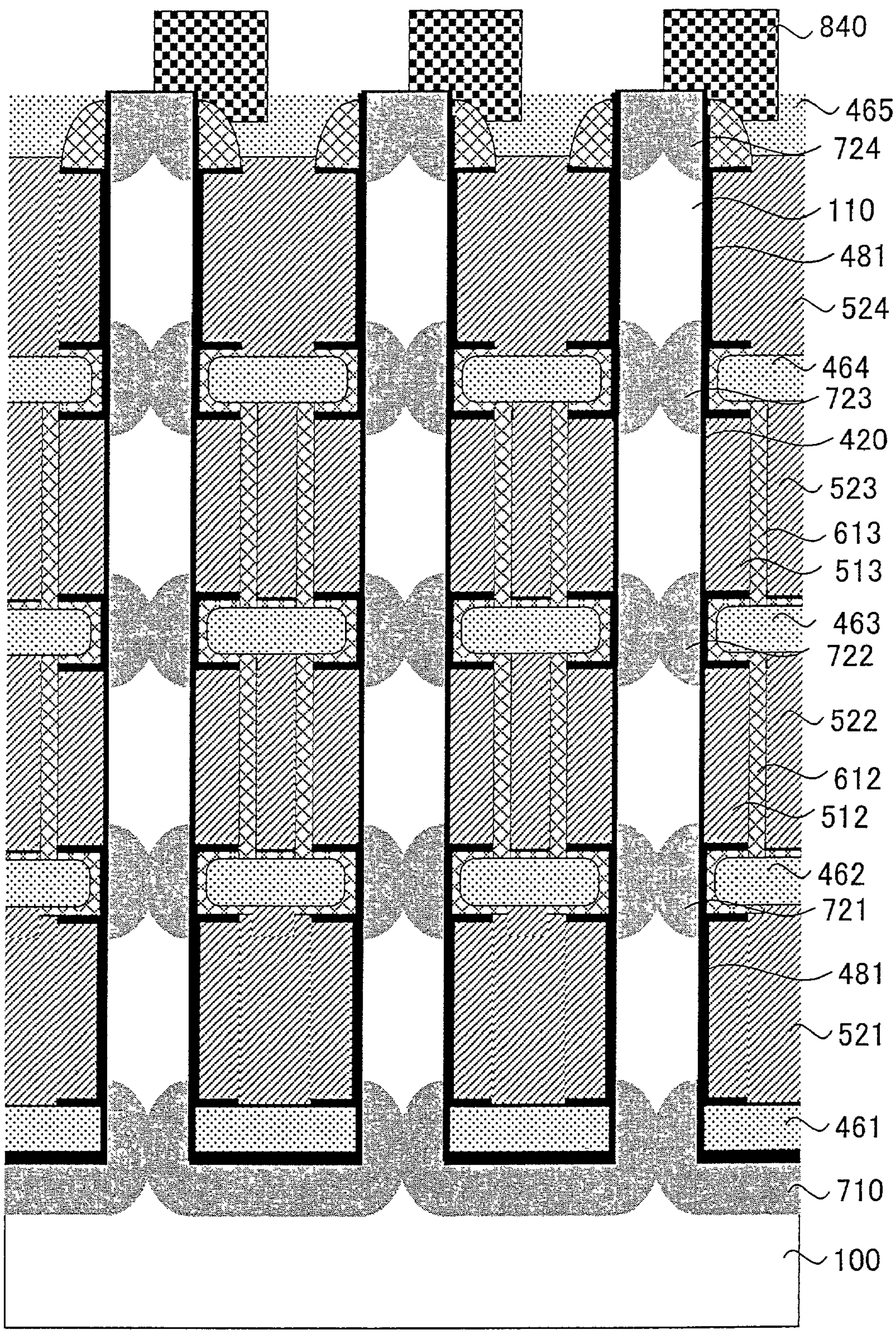
FIG. 504 is a sectional view (taken on line A–A' in FIG. 1) illustrating a production step of Production Example 13 for producing a semiconductor memory in accordance with the present invention.
Figure 505:
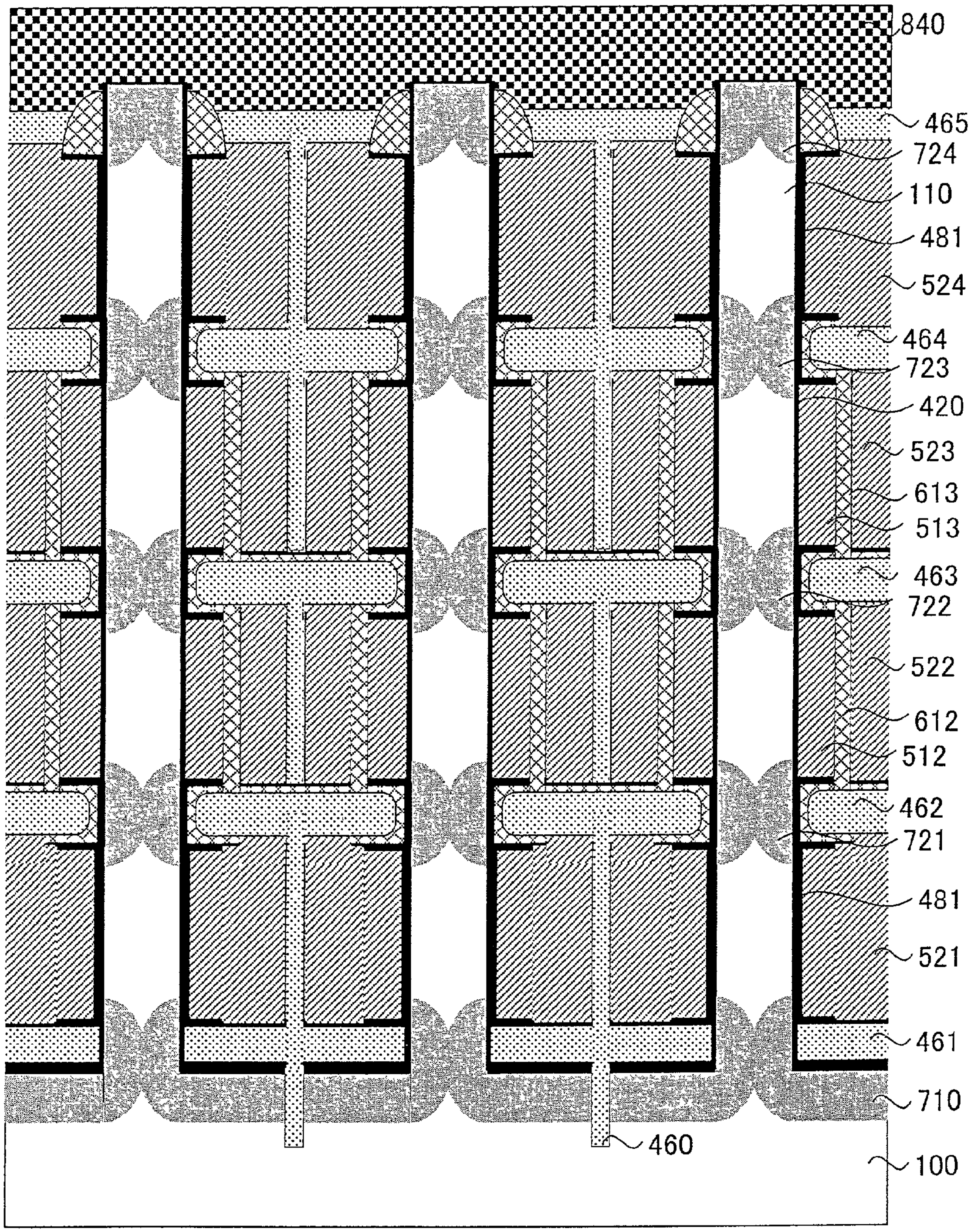
FIG. 505 is a sectional view (taken on line B–B' in FIG. 1) illustrating a production step of Production Example 13 for producing a semiconductor memory in accordance with the present invention.

In Production Examples 1 to 9, the selection gates and the floating gates of the transistors of a semiconductor memory are formed at the same time by isotropic etching. In this example, however, explanation is given of an example of production process by which the selection gates and the floating gates of the transistors are formed by anisotropic etching. FIG. 504 and FIG. 505 are sectional views taken on line A–A' and line B–B', respectively, in FIG. 1 which is a plan view illustrating a memory cell array of an EEPROM.

As shown in FIG. 504 and FIG. 505, the polysilicon films (the first conductive film) 511 to 514 may be formed by anisotropic etching.

PRODUCTION EXAMPLE 14

This example shows an example of production process for producing a semiconductor memory as formed in Production Examples 1 to 9 in which the selection gates and the floating gates of the transistors are formed at the same time and have different lengths in a vertical direction. FIGS. 506 and 508 and FIGS. 507 and 509 are sectional views taken on line A–A' and line B–B', respectively, in FIG. 1 which is a plan view illustrating a memory cell array of an EEPROM.

The polysilicon films (the first conductive films) 511 to 514 need not have the same vertical lengths.

Figure 506:
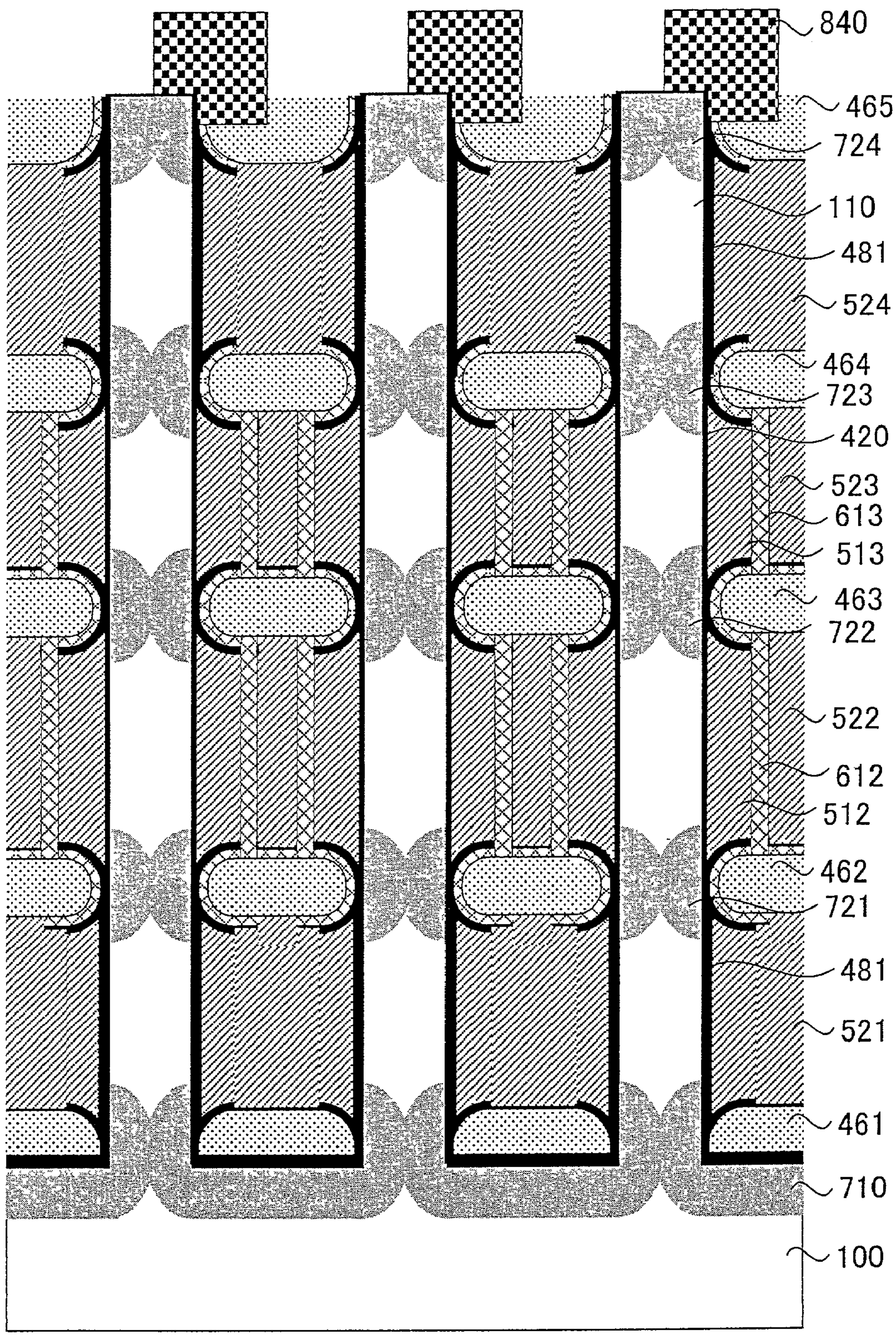
FIG. 506 is a sectional view (taken on line A–A' in FIG. 1) illustrating a production step of Production Example 14 for producing a semiconductor memory in accordance with the present invention.
Figure 507:
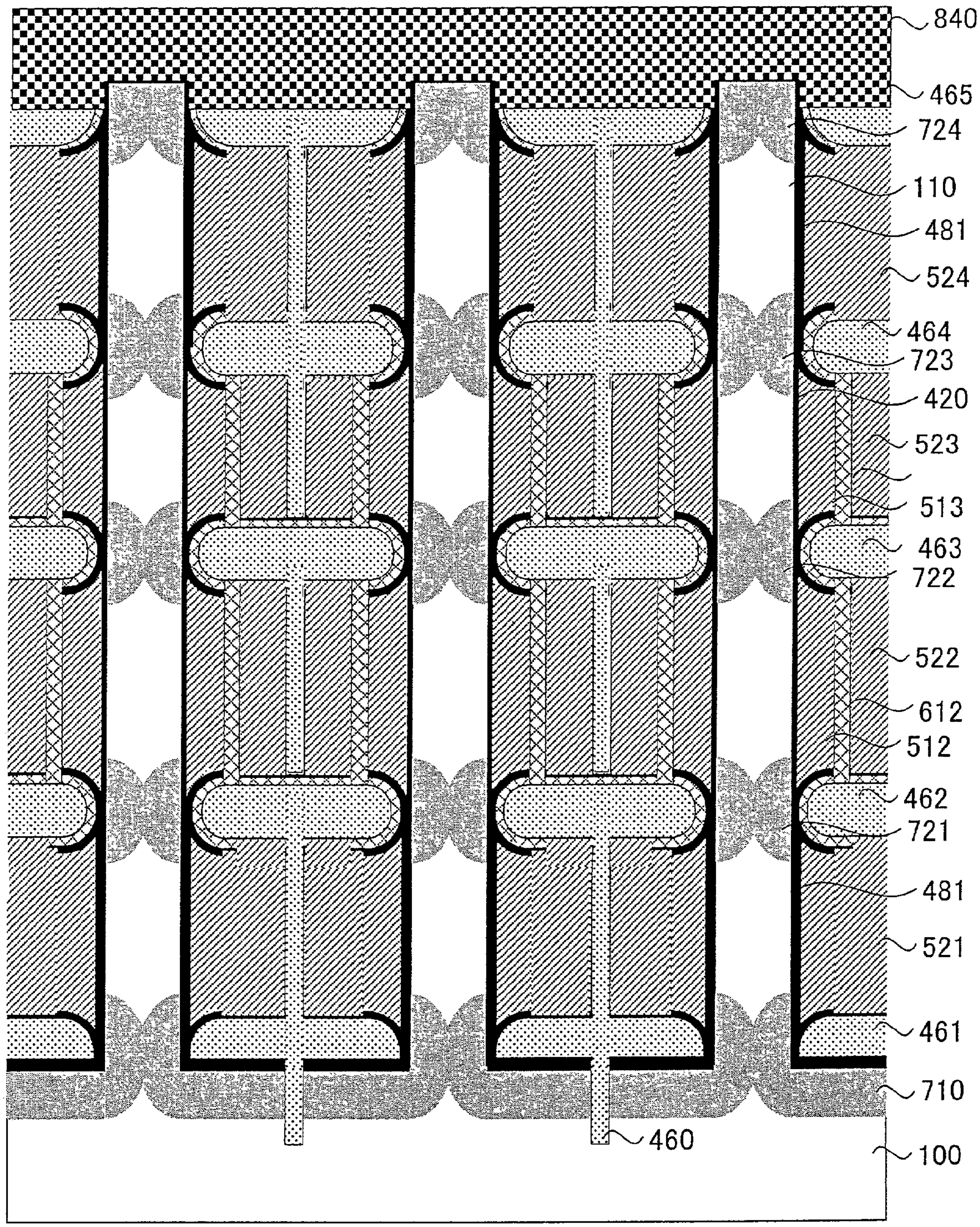
FIG. 507 is a sectional view (taken on line B–B' in FIG. 1) illustrating a production step of Production Example 14 for producing a semiconductor memory in accordance with the present invention.
Figure 508:
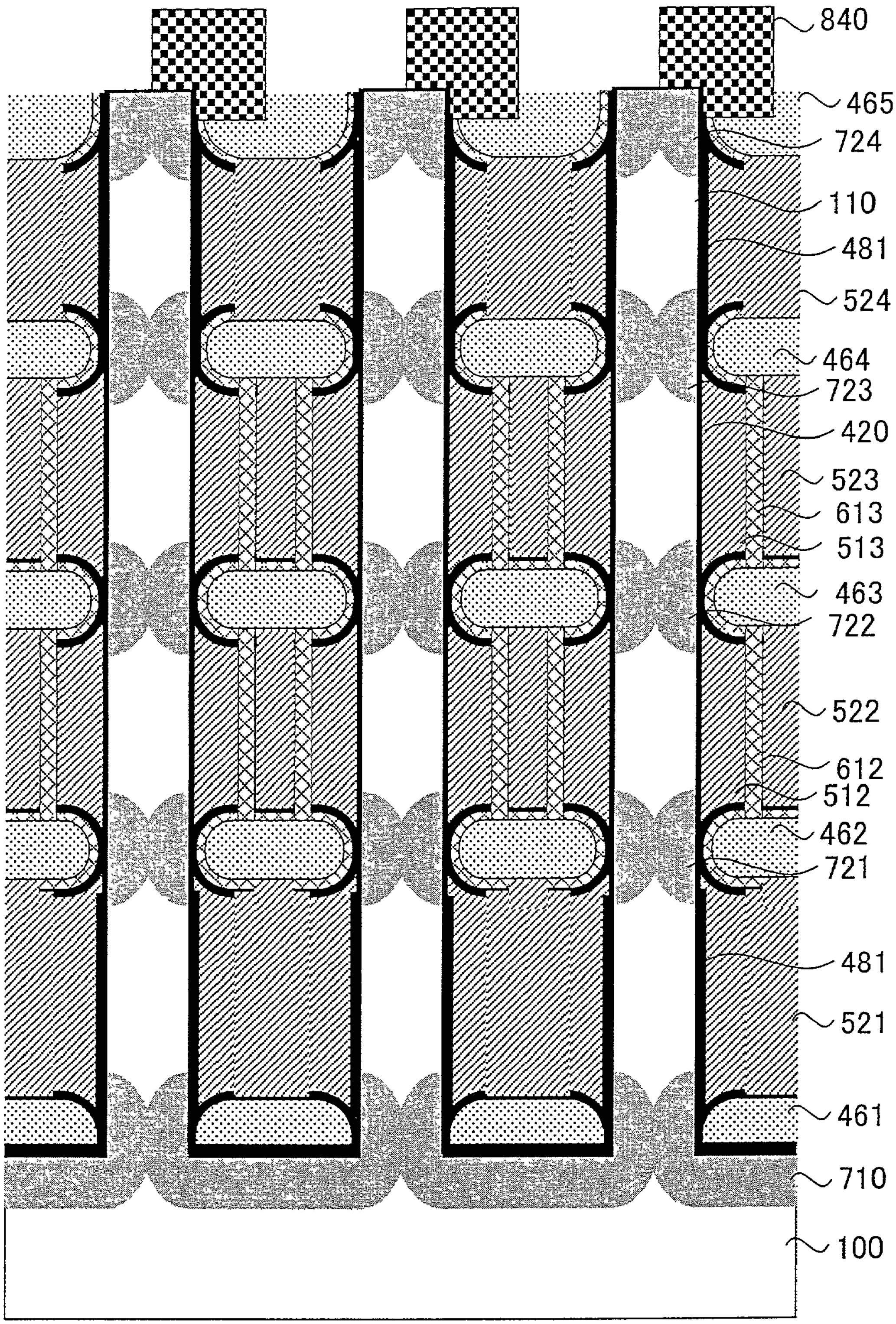
FIG. 508 is a sectional view (taken on line A–A' in FIG. 1) illustrating a production step of Production Example 14 for producing a semiconductor memory in accordance with the present invention.
Figure 509:
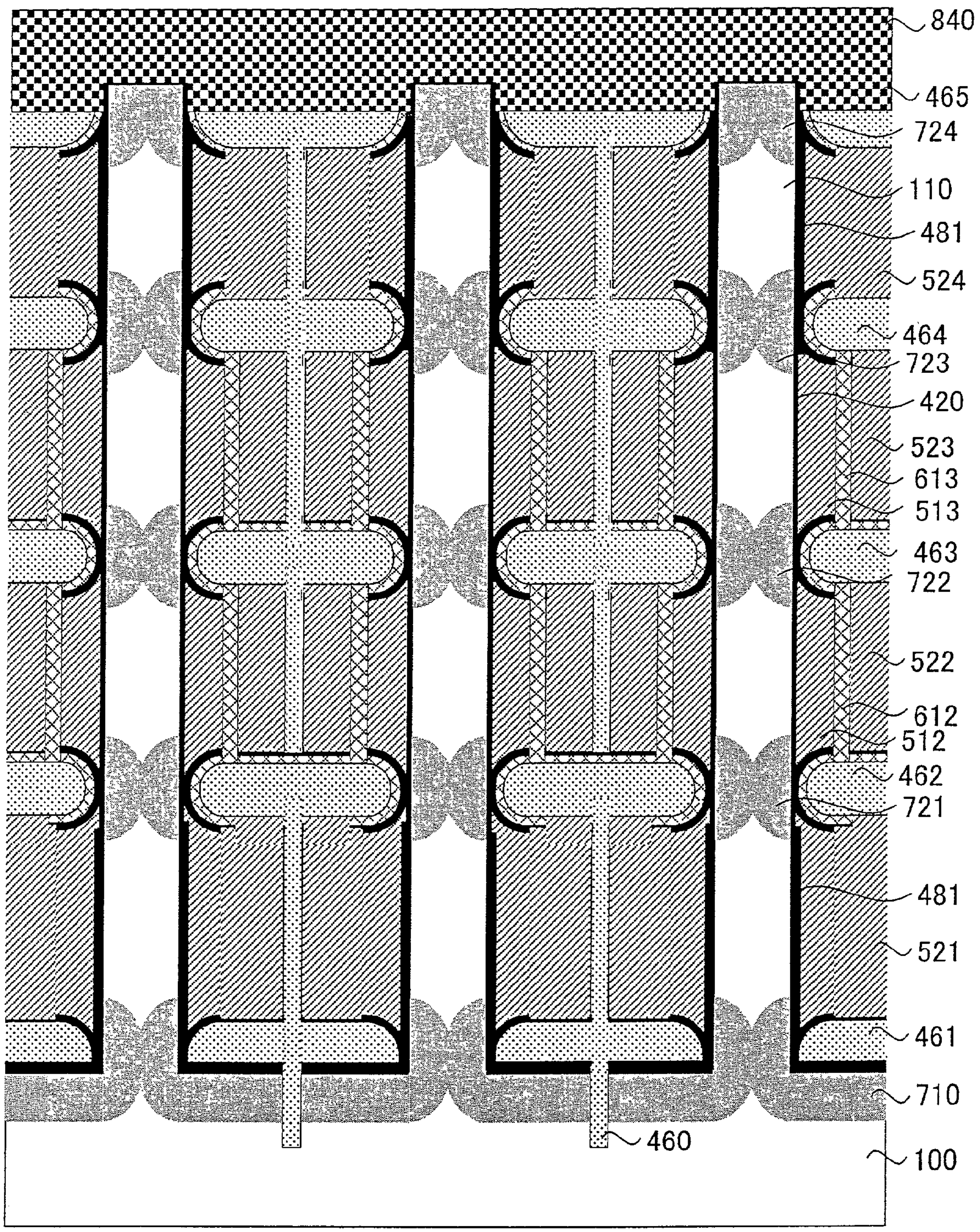
FIG. 509 is a sectional view (taken on line B–B' in FIG. 1) illustrating a production step of Production Example 14 for producing a semiconductor memory in accordance with the present invention.

That is, as regards the lengths of the polysilicon films 511 to 514 to be the memory cell gates or the selection gates in the direction vertical to the semiconductor substrate 100, the memory cell gates may have different lengths as indicated by 512 and 513 in FIG. 506 and FIG. 507, and selection gates may have different lengths as indicated by 511 and 514 in FIG. 508 and FIG. 509.

PRODUCTION EXAMPLE 15

Figure 510:
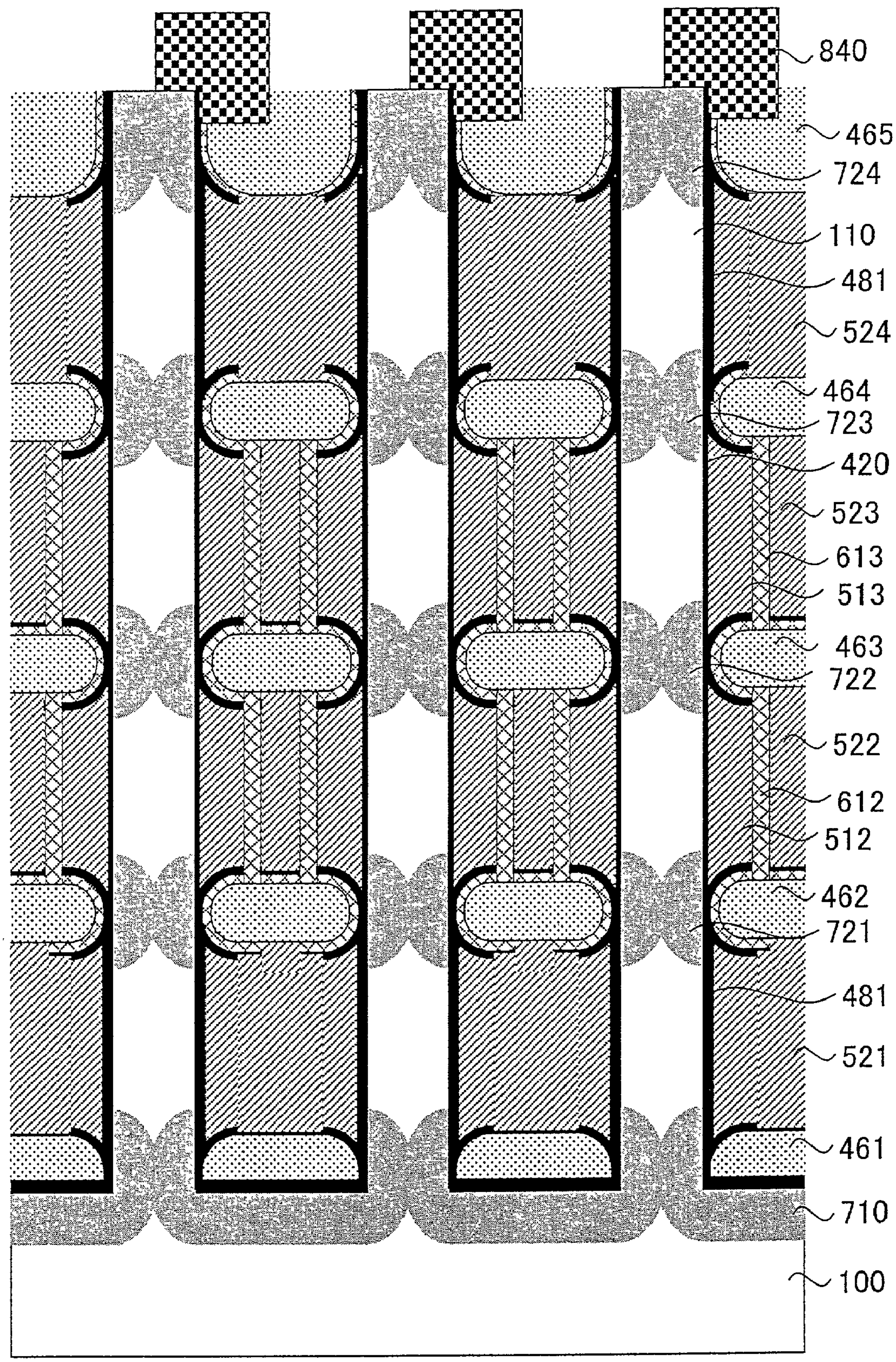
FIG. 510 is a sectional view (taken on line A–A' in FIG. 1) illustrating a production step of Production Example 15 for producing a semiconductor memory in accordance with the present invention.
Figure 511:
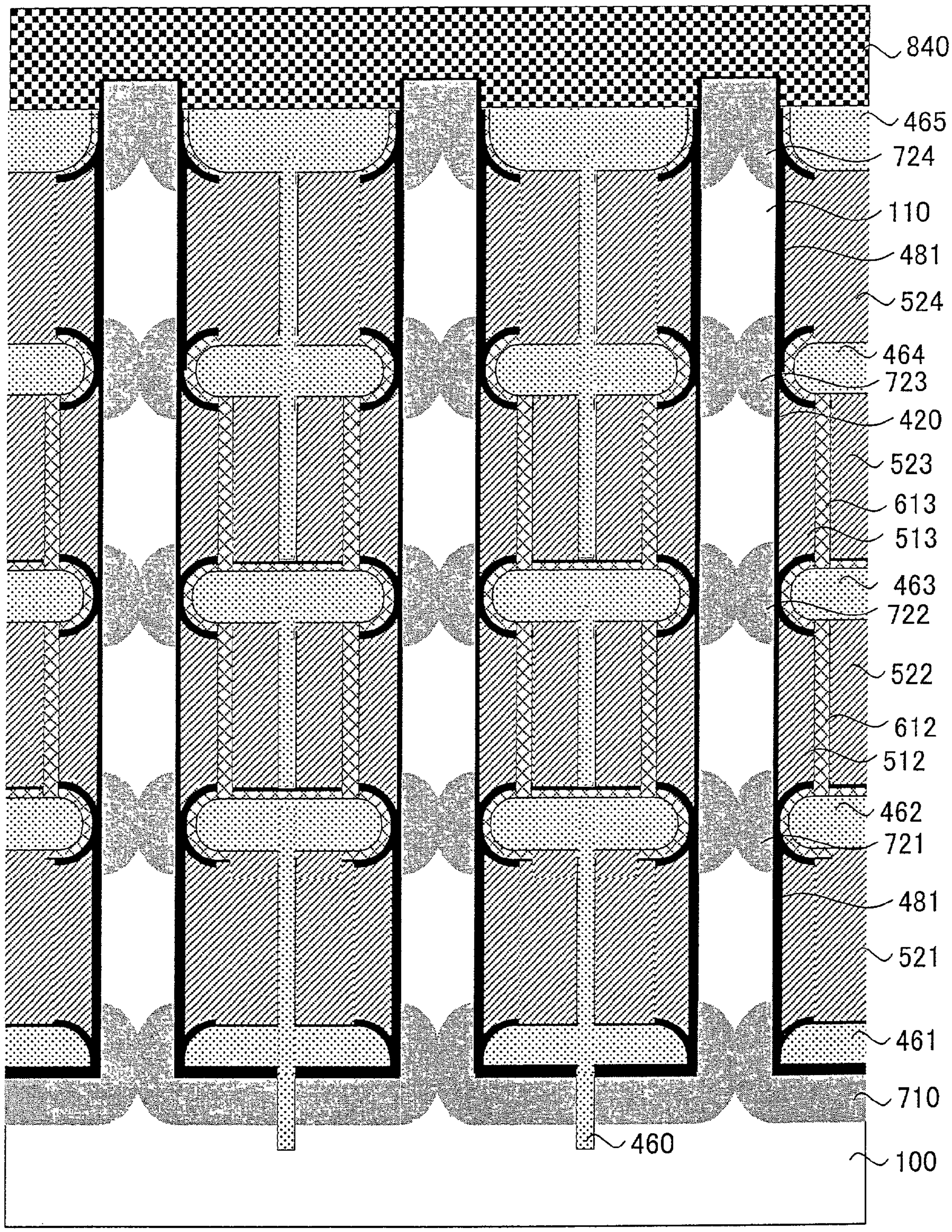
FIG. 511 is a sectional view (taken on line B–B' in FIG. 1) illustrating a production step of Production Example 15 for producing a semiconductor memory in accordance with the present invention.

This example shows an example of production process for producing a semiconductor memory as formed in Production Examples 1 to 9 in which the selection gates and the floating gates of the transistors are located at the same time and the impurity diffusion layer 724 formed on the top of the island-like semiconductor layer 110 and connected to the fourth wiring layer 840 has a large height. FIG. 510 and FIG. 511 are sectional views taken on line A–A' and line B–B', respectively, in FIG. 1 which is a plan view illustrating a memory cell array of an EEPROM.

As shown in FIG. 510 and FIG. 511, the impurity diffusion layer 724 formed on the top of the island-like semiconductor layer 110 and connected to the fourth wiring layer 840 may have a large height. At this time, the silicon oxide film (the tenth insulating film) 465 may be designed to have a large thickness and the insulating properties improve between the polysilicon film (the second conductive film) 524 and the fourth wiring layer 840. Or, since an increased area of the impurity diffusion layer 724 can be exposed, better connection is obtained between the impurity diffusion layer 724 and the fourth wiring layer 840.

PRODUCTION EXAMPLE 16

This example shows an example of production process for producing a semiconductor memory as formed in Production Examples 1 to 9 in which the selection gates and the floating gates of the transistors are formed at the same time and the island-like semiconductor layer 100 has an altered outward shape. FIGS. 512 and 513 and FIGS. 514 and 515 are sectional views taken on line A–A' and line B–B', respectively, in FIG. 1 which is a plan view illustrating a memory cell array of an EEPROM.

Figure 512:
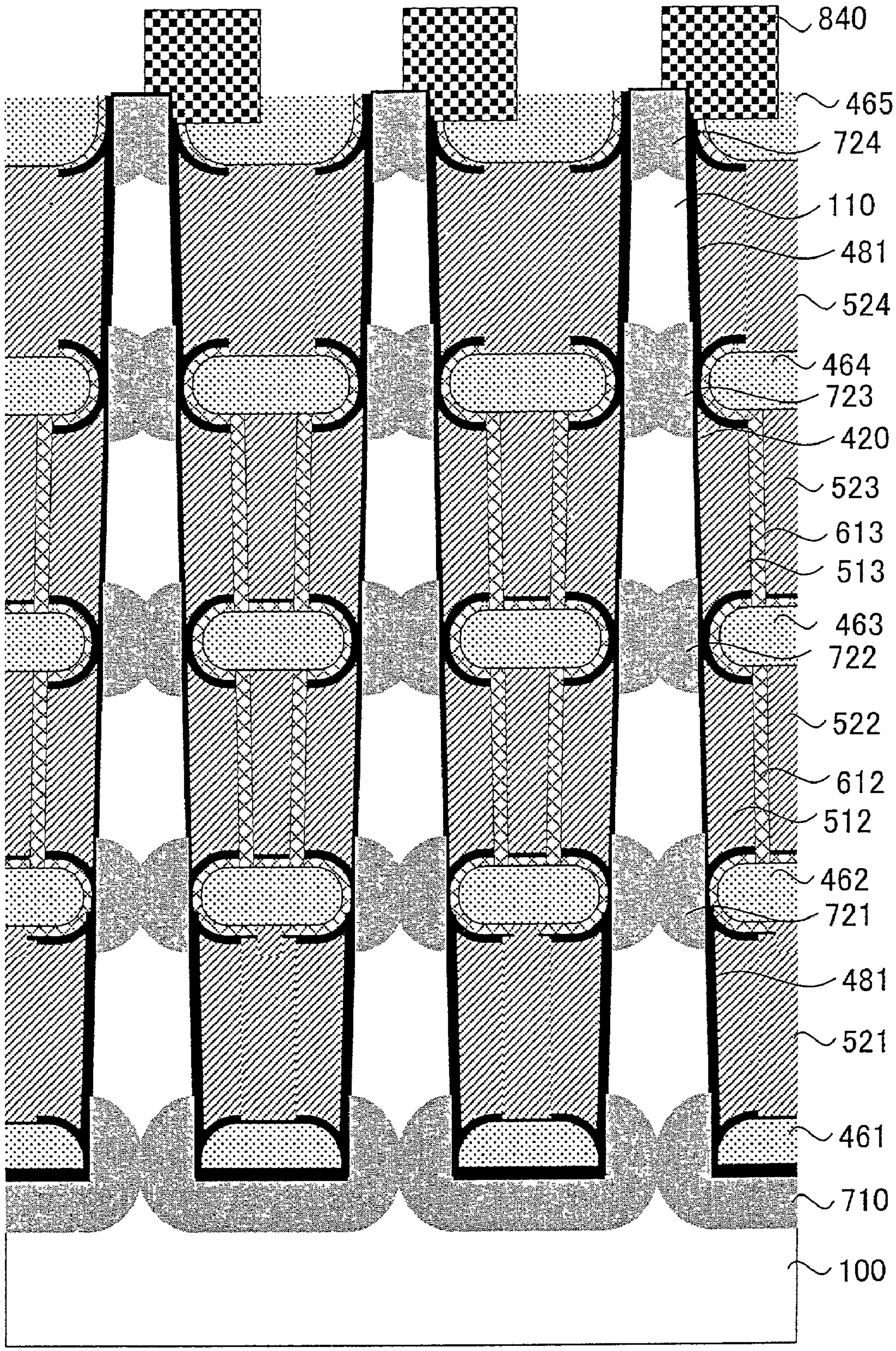
FIG. 512 and FIG. 513 are sectional views (taken on line A–A' in FIG. 1) illustrating production steps of Production Example 16 for producing a semiconductor memory in accordance with the present invention.
Figure 514:
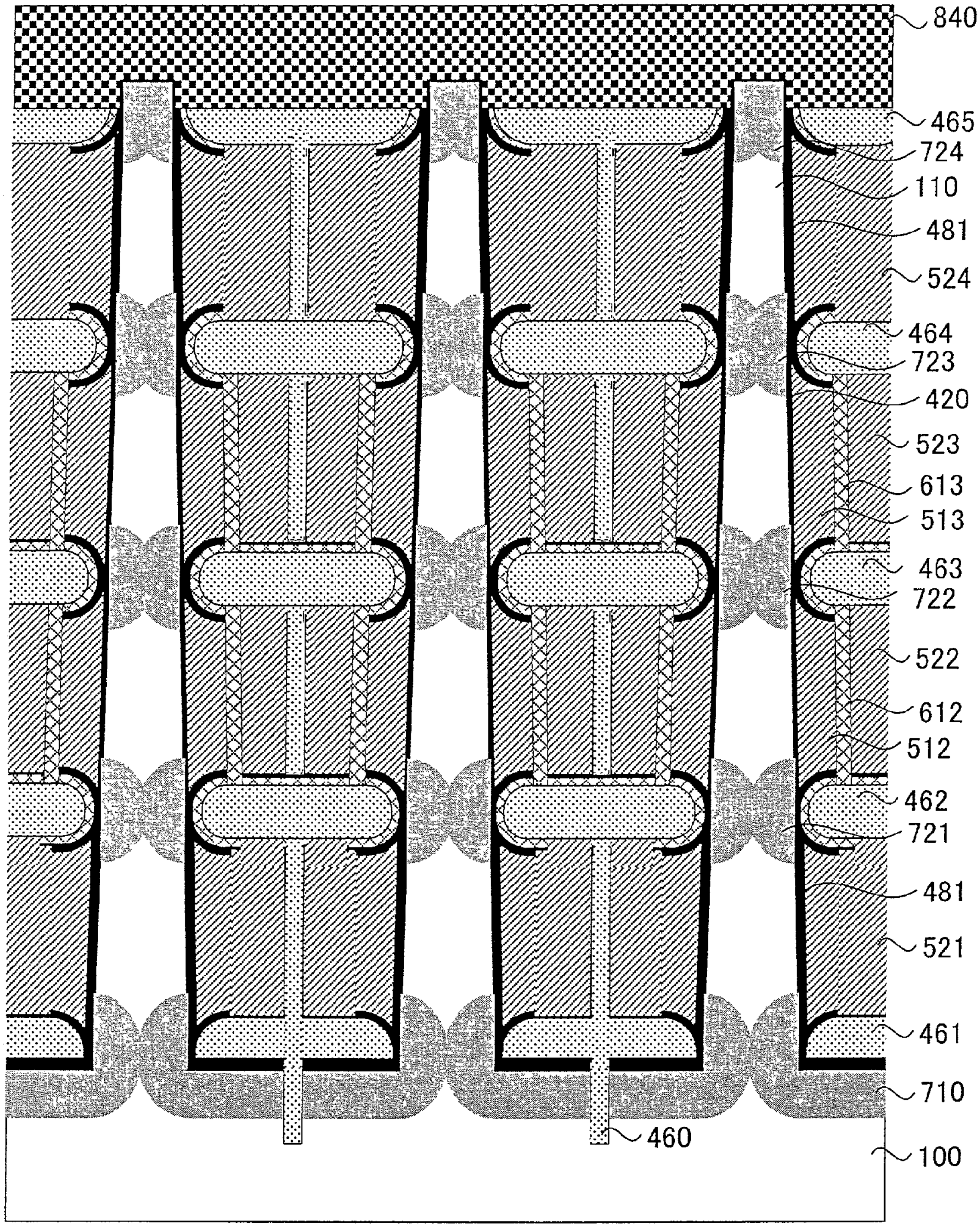
FIG. 514 and FIG. 515 are sectional views (taken on line B–B' in FIG. 1) illustrating production steps of Production Example 16 for producing a semiconductor memory in accordance with the present invention.

The first trench 210 may be formed by reactive ion etching so that the top and the bottom of the island-like semiconductor layer 110 have different cross-sections as shown in FIG. 512 and 514.

Figure 513:
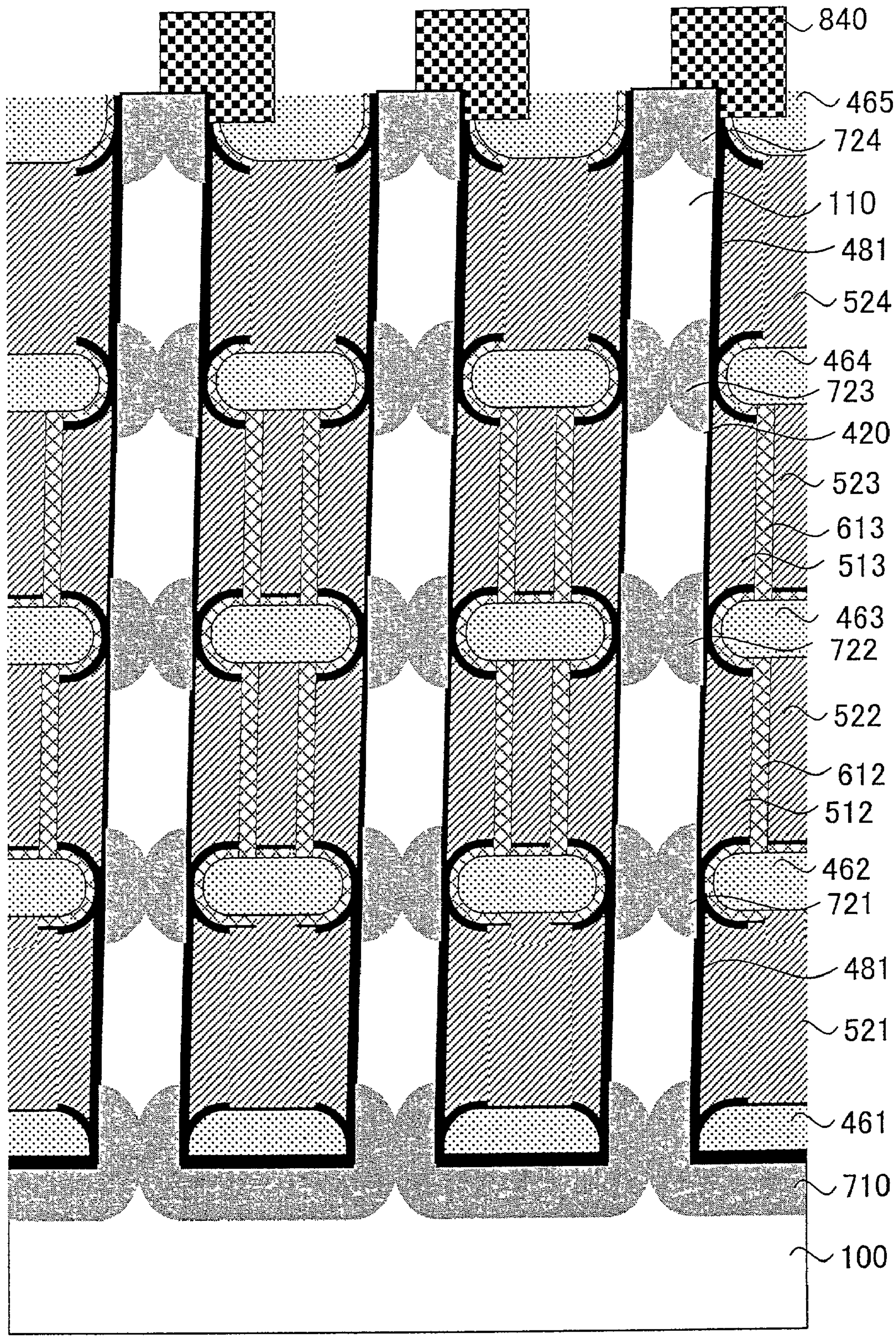
Figure 515:
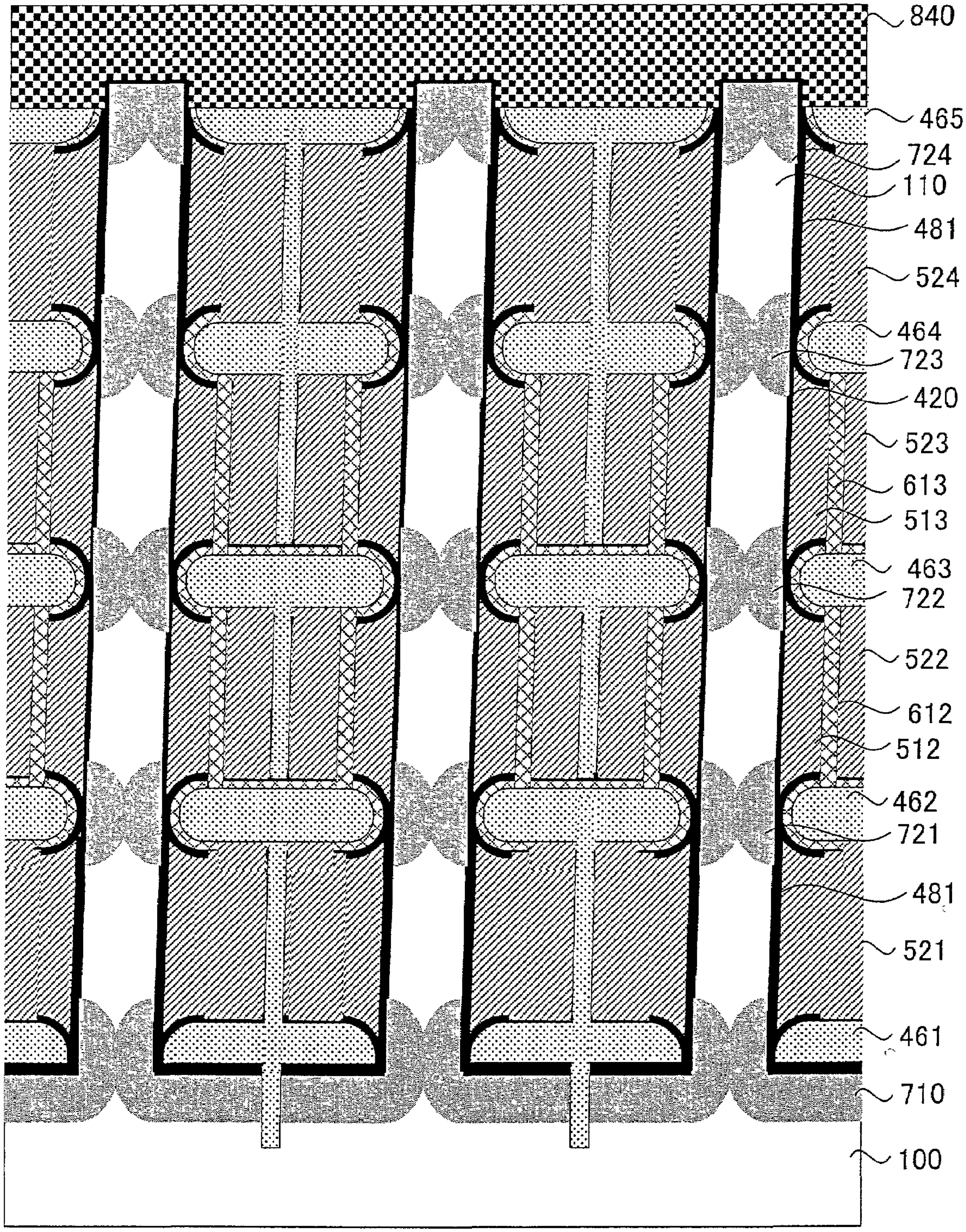
Figure 516:
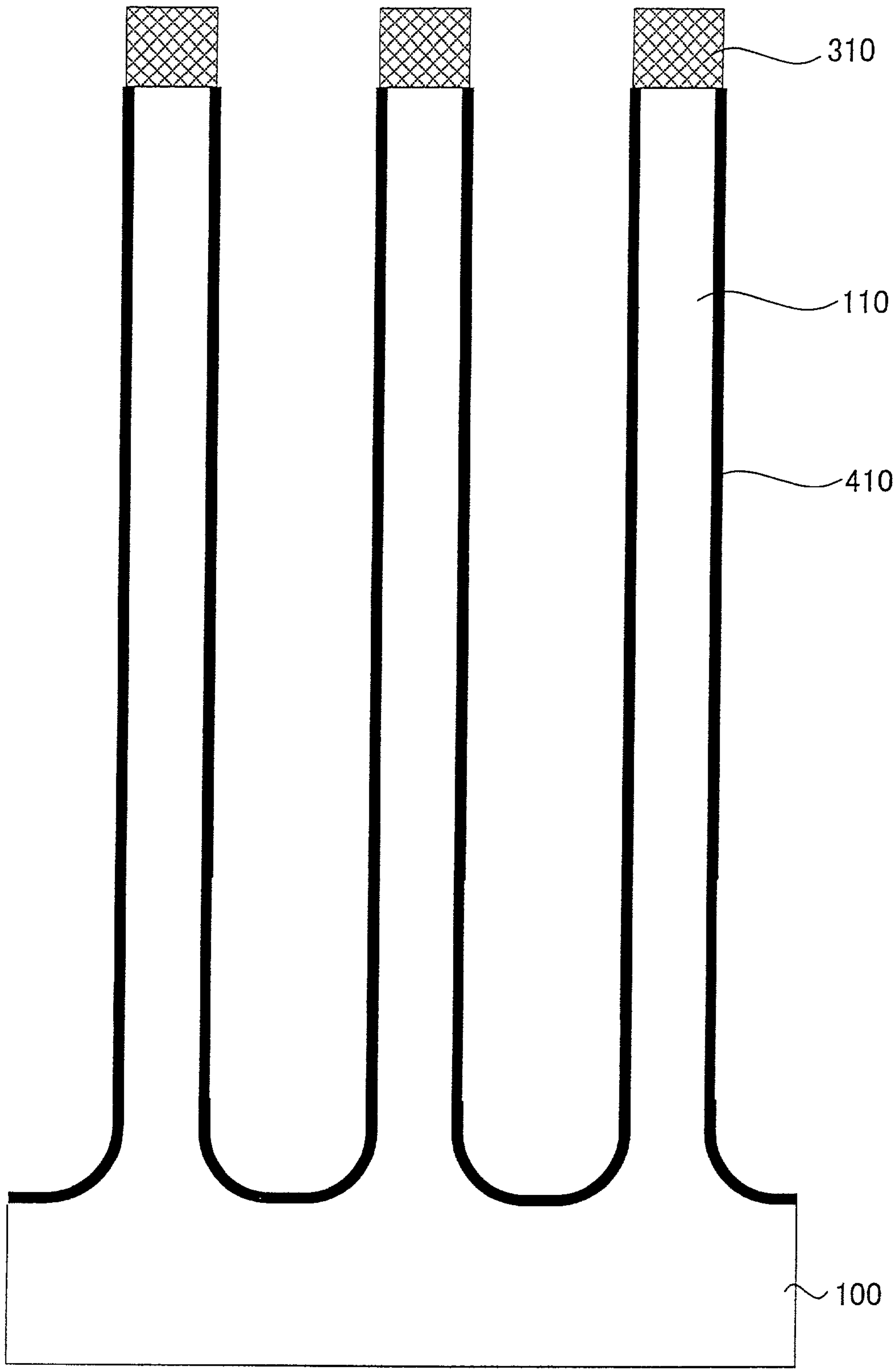
FIG. 516 to FIG. 523 are sectional views (taken on line A–A' in FIG. 1) illustrating production steps of Production Example 17 for producing a semiconductor memory in accordance with the present invention.
Figure 517:
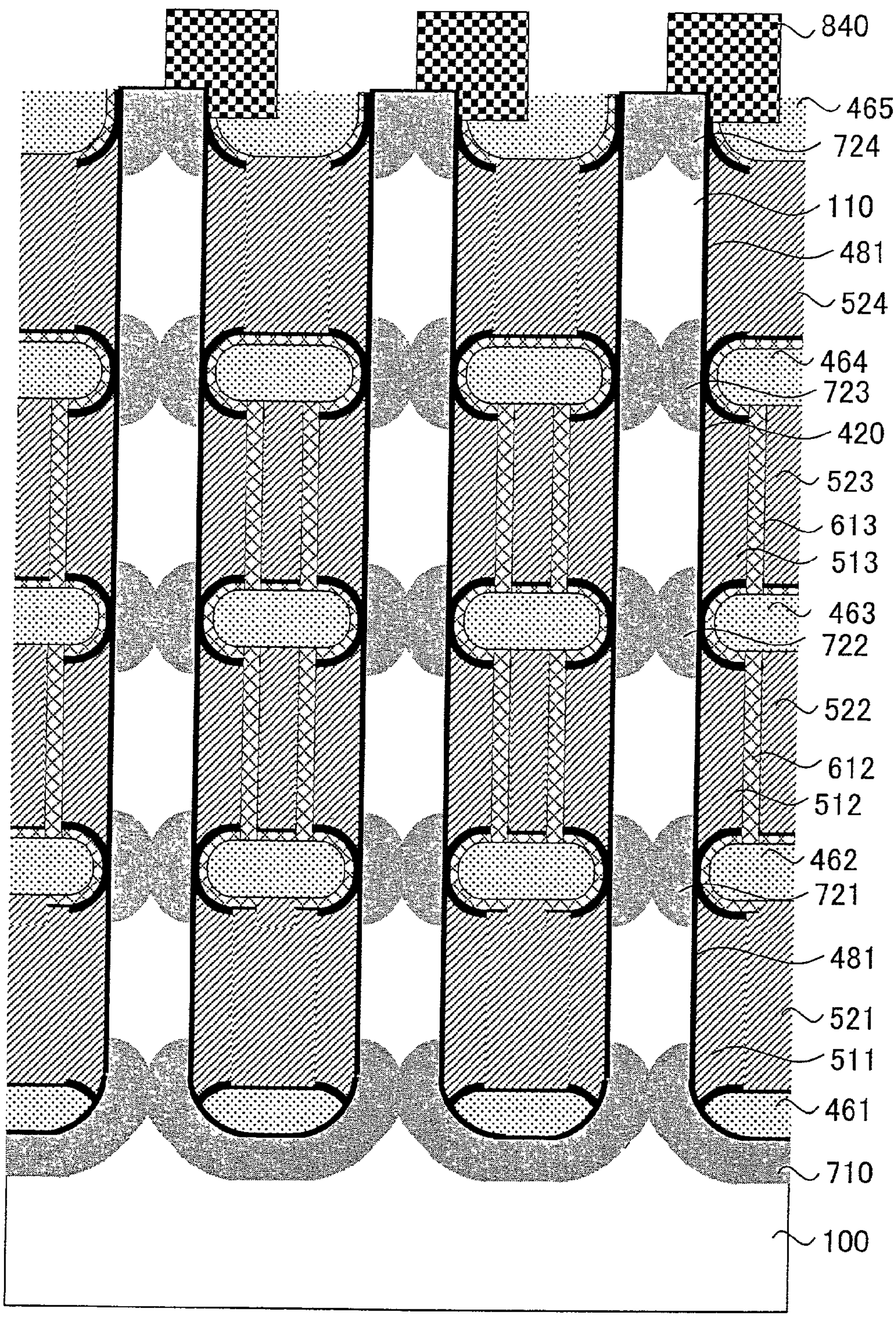
Figure 518:
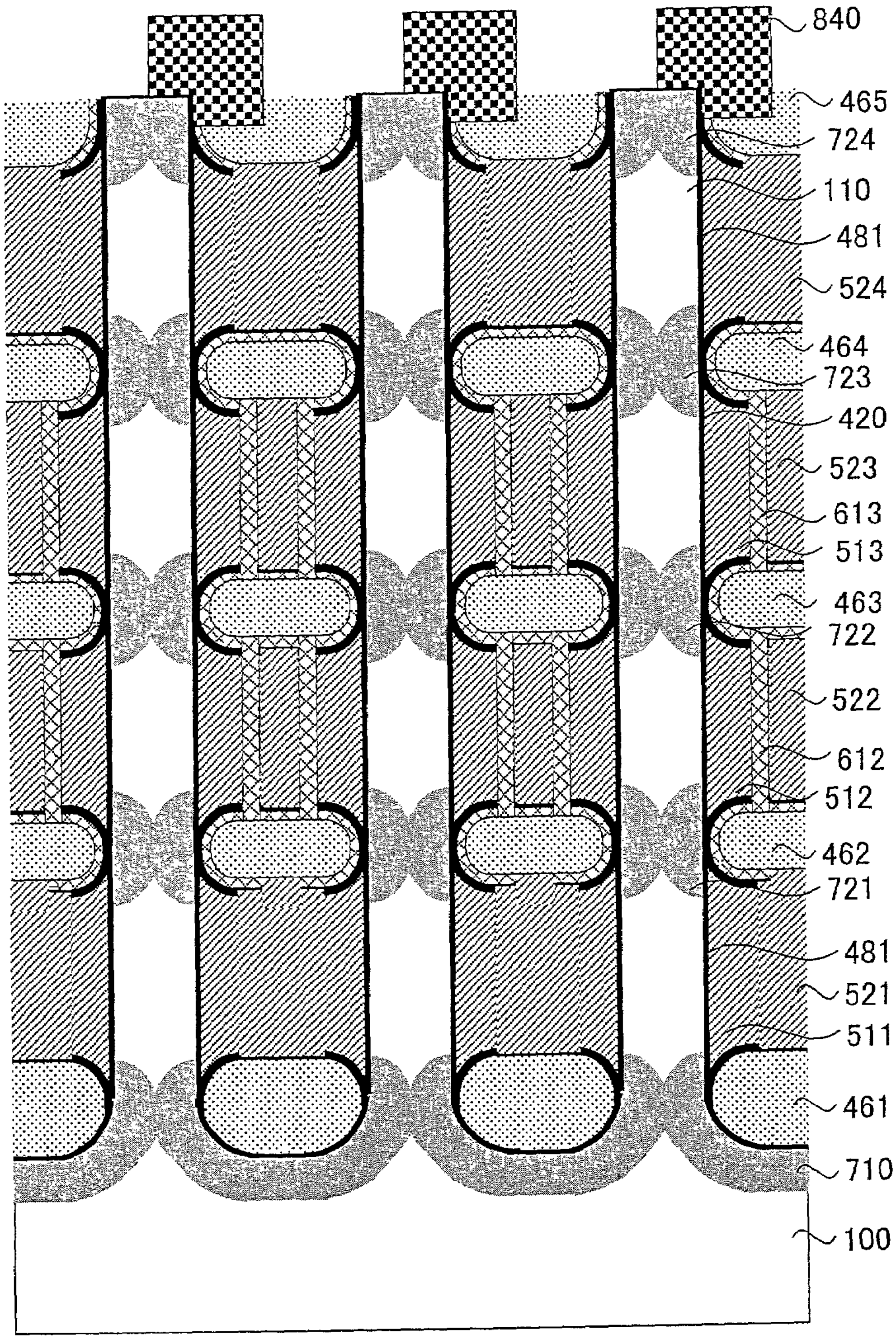
Figure 519:
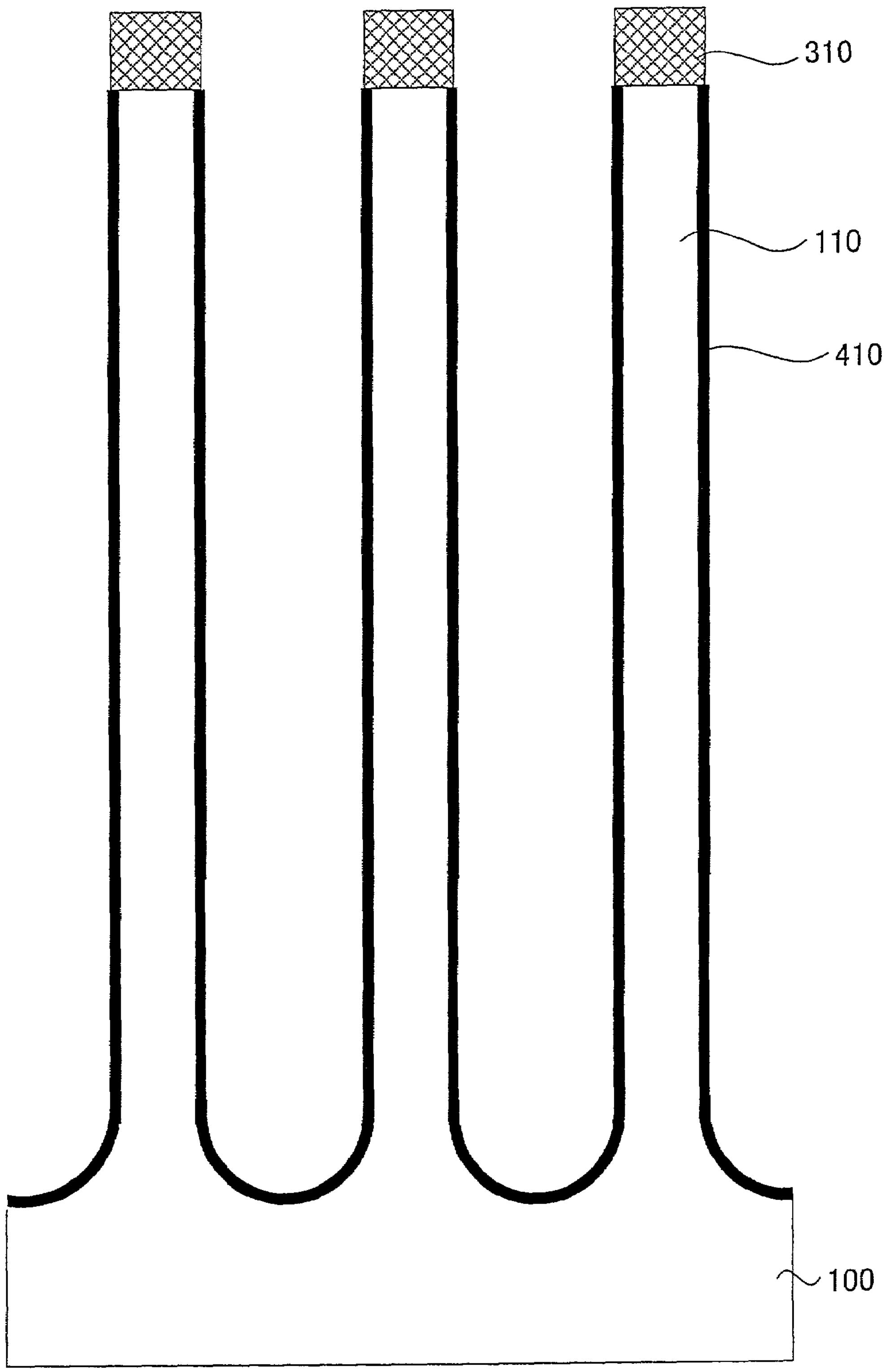
Figure 520:
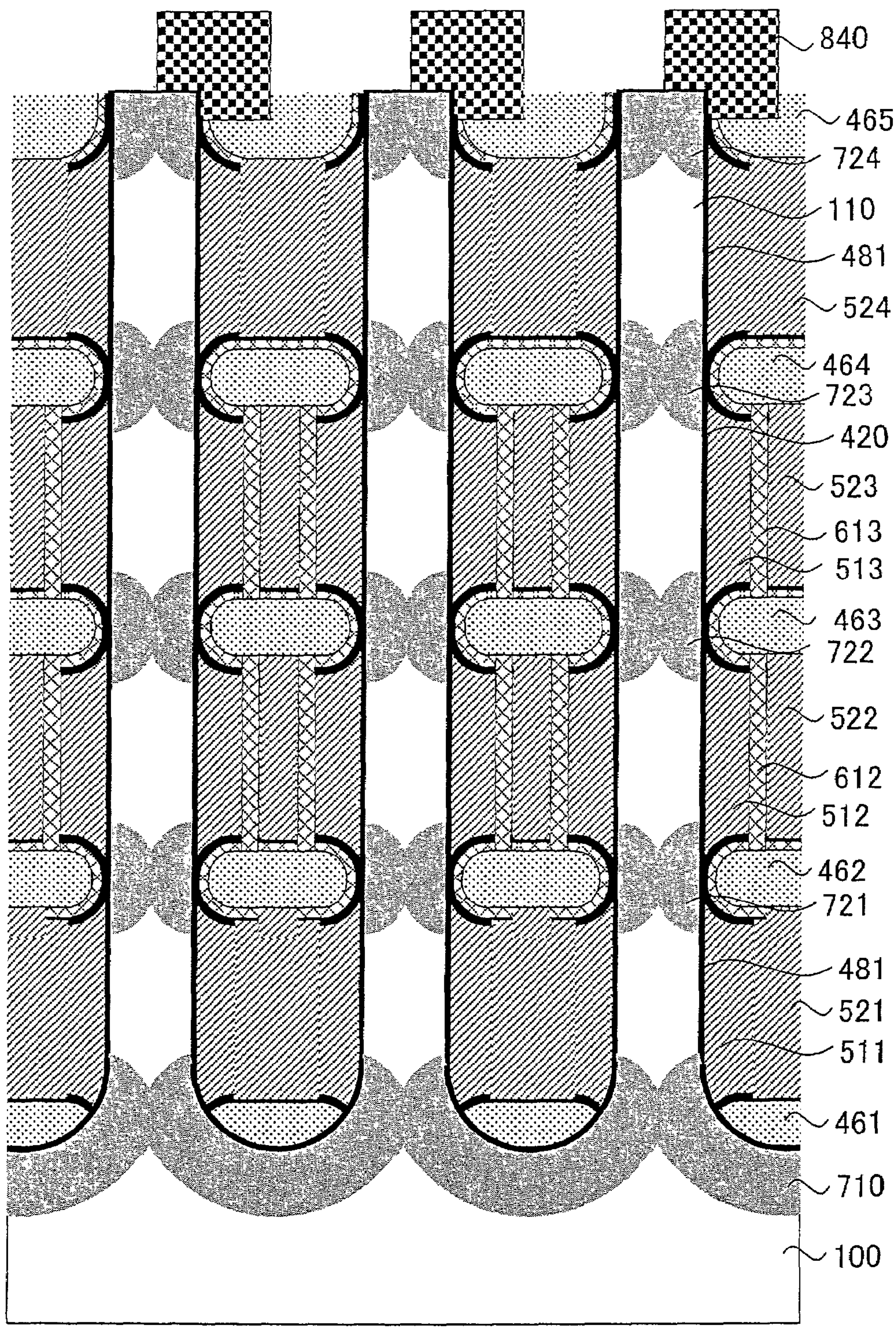
Figure 521:
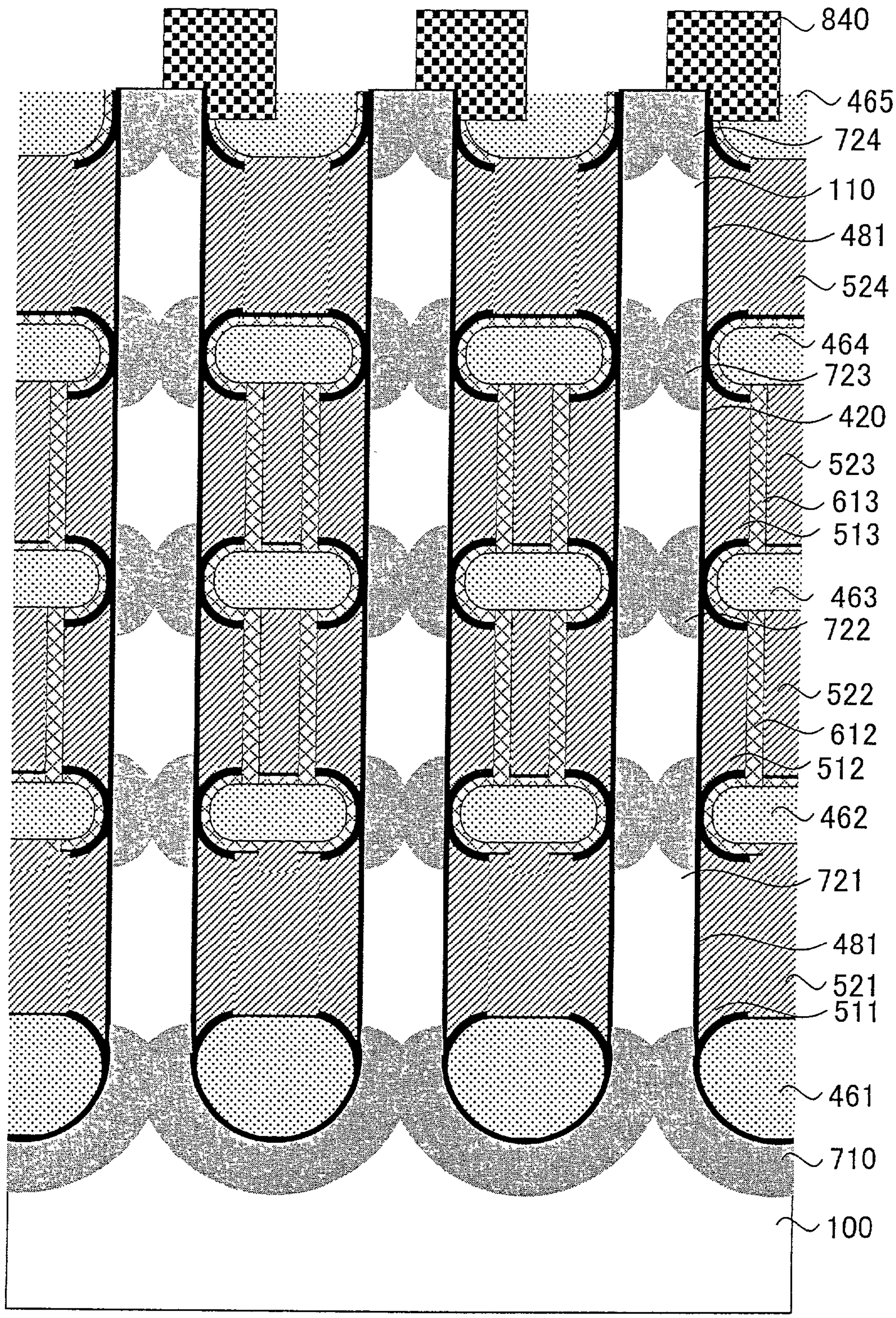
Figure 522:
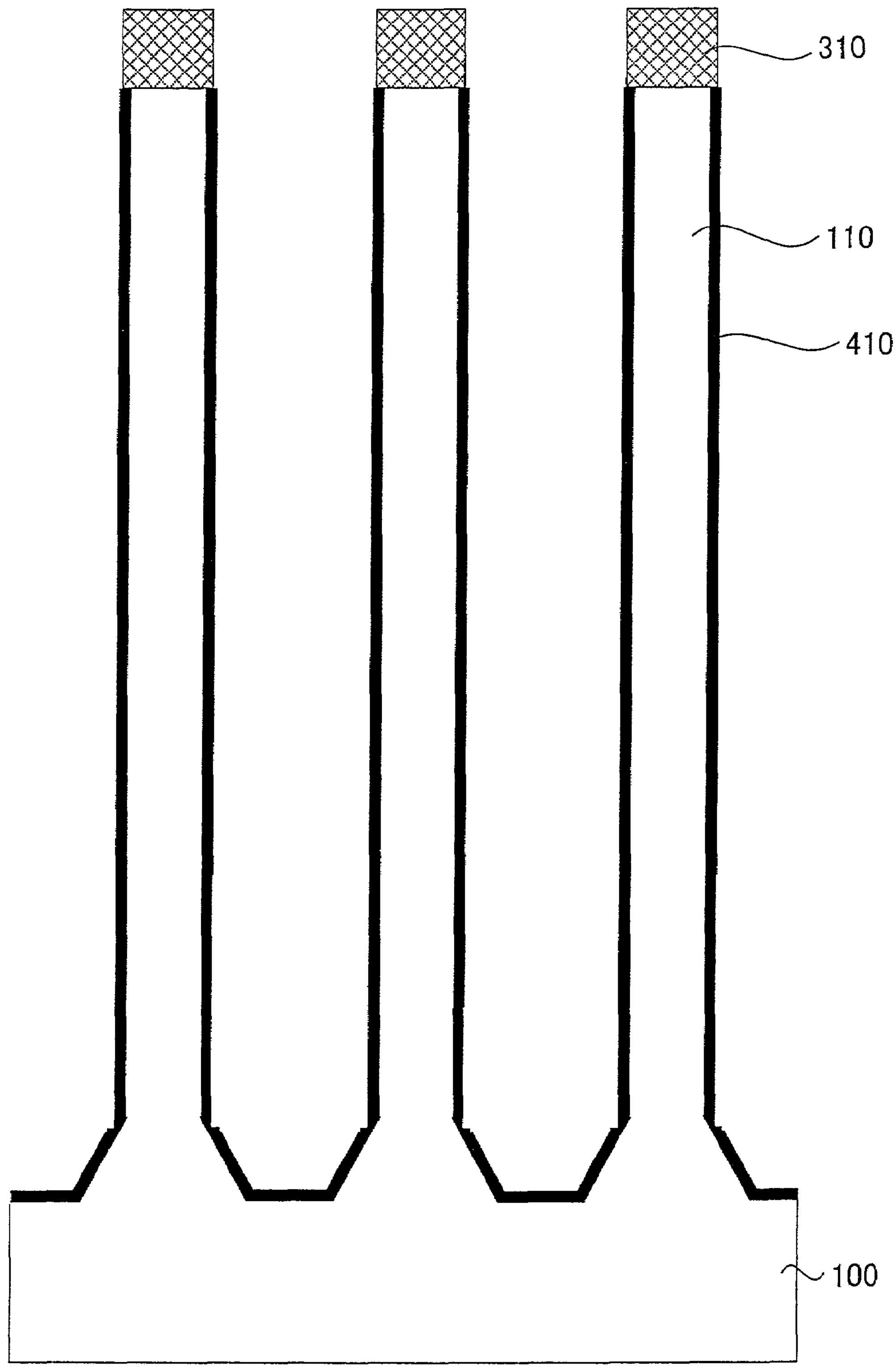
Figure 523:
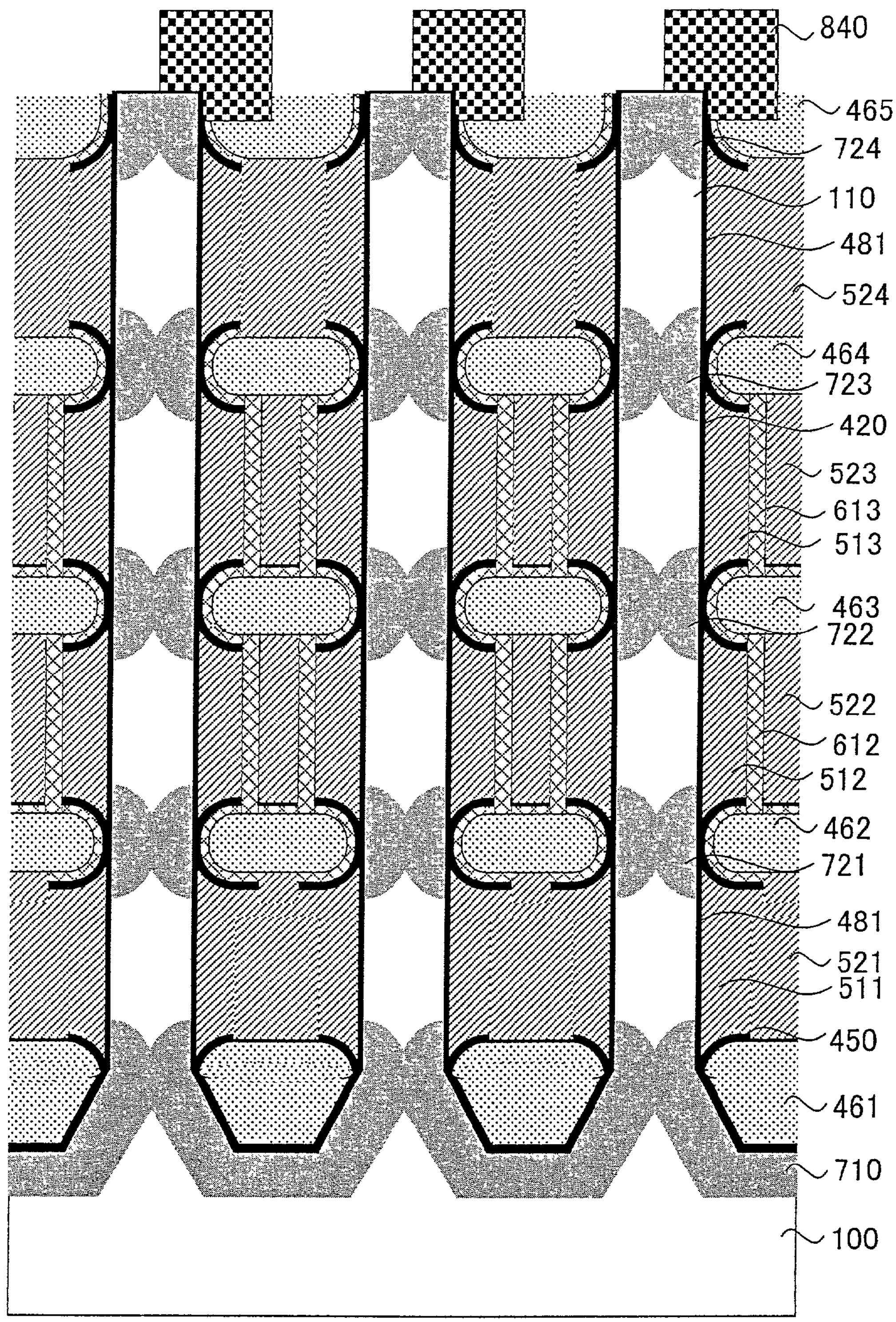
Figure 524:
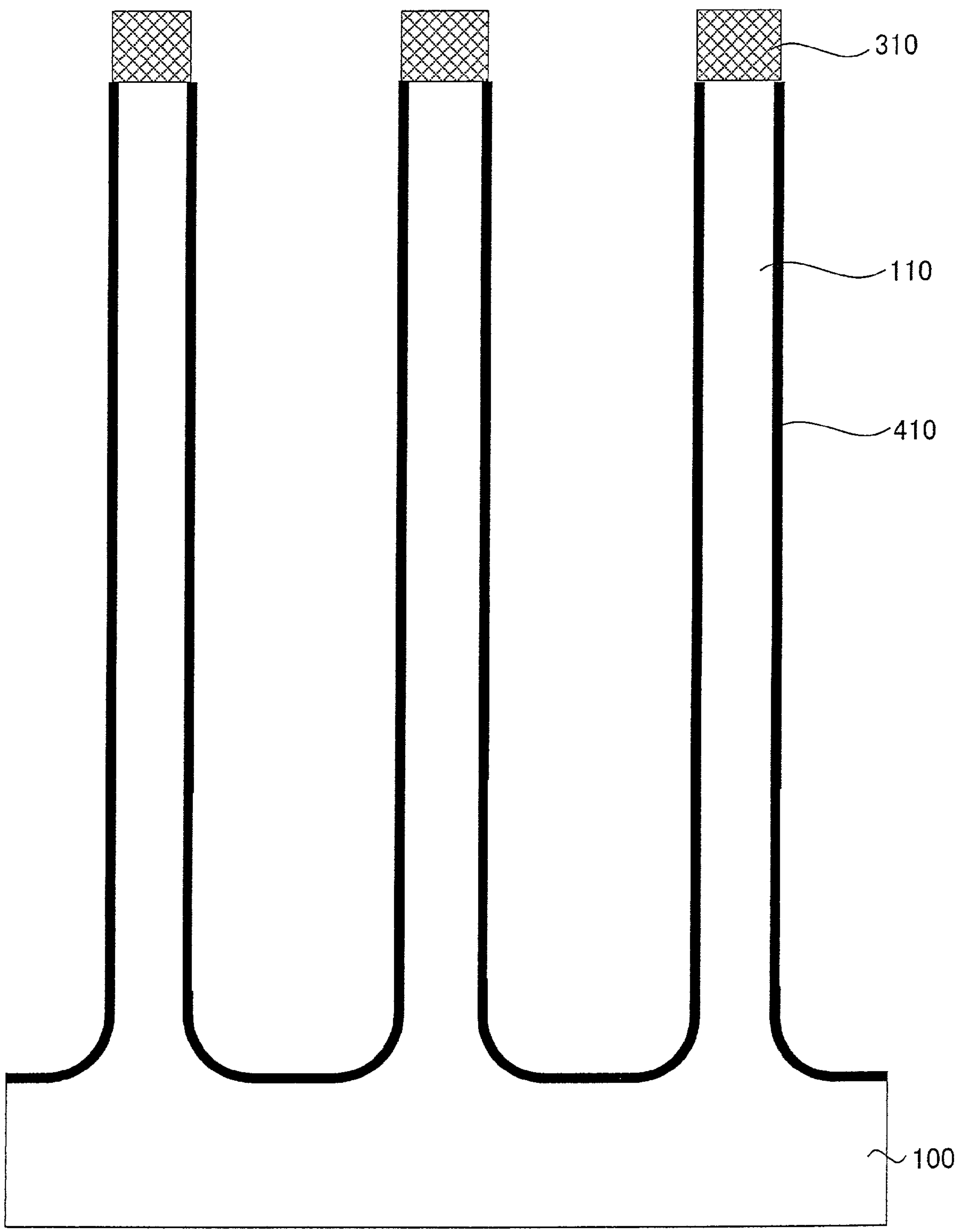
FIG. 524 to FIG. 531 are sectional views (taken on line B–B' in FIG. 1) illustrating production steps of Production Example 17 for producing a semiconductor memory in accordance with the present invention.
Figure 525:
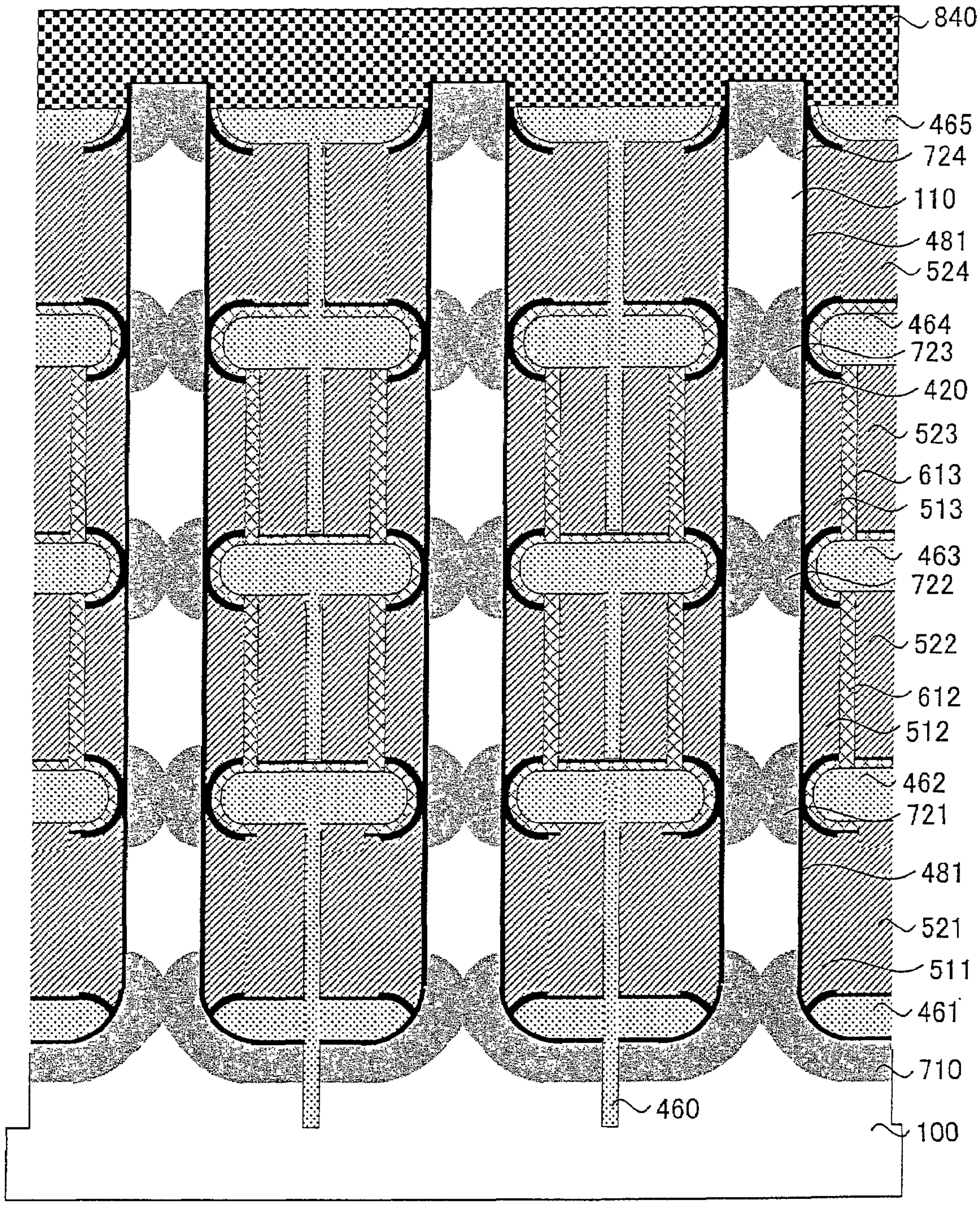
Figure 526:
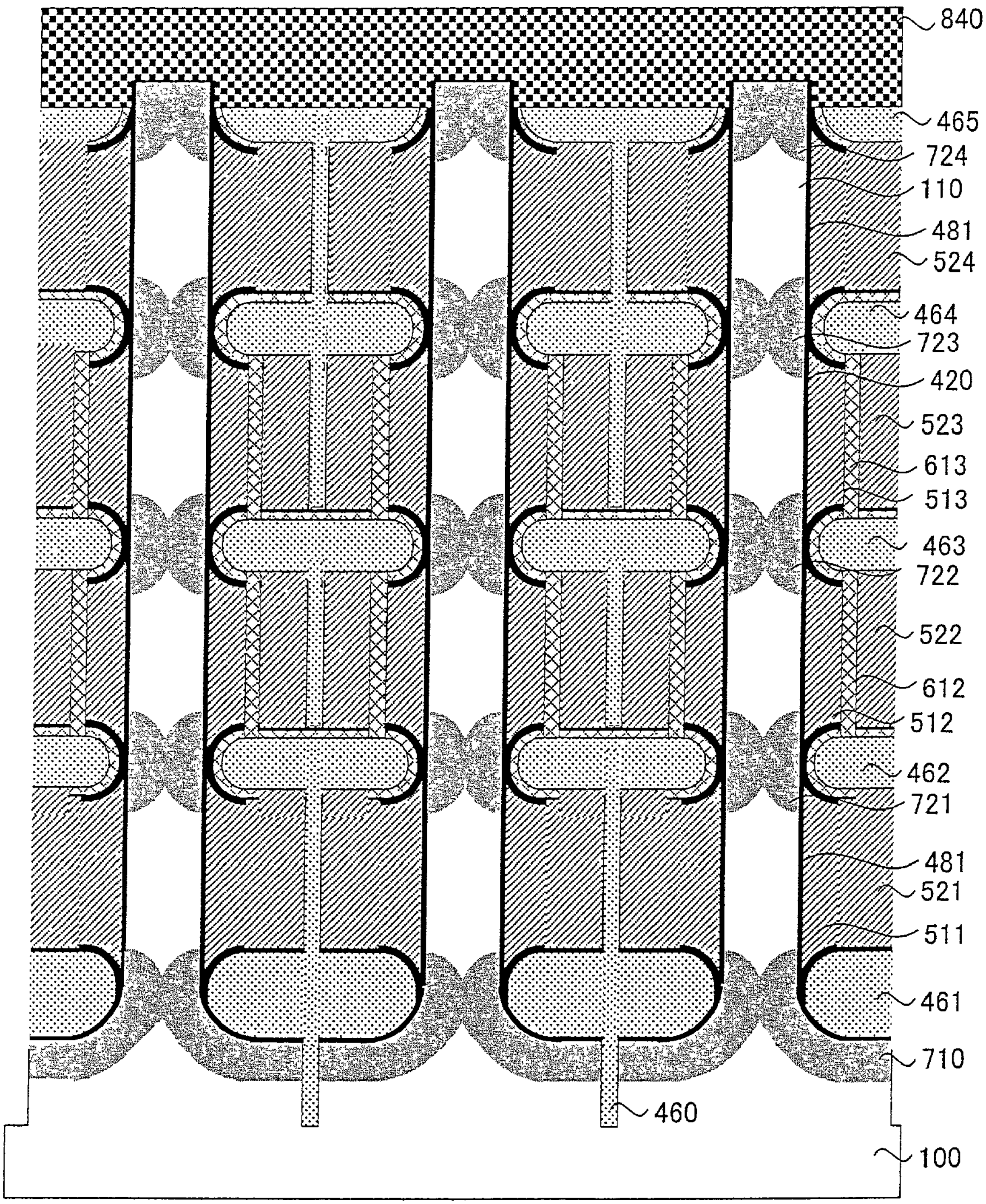
Figure 527:
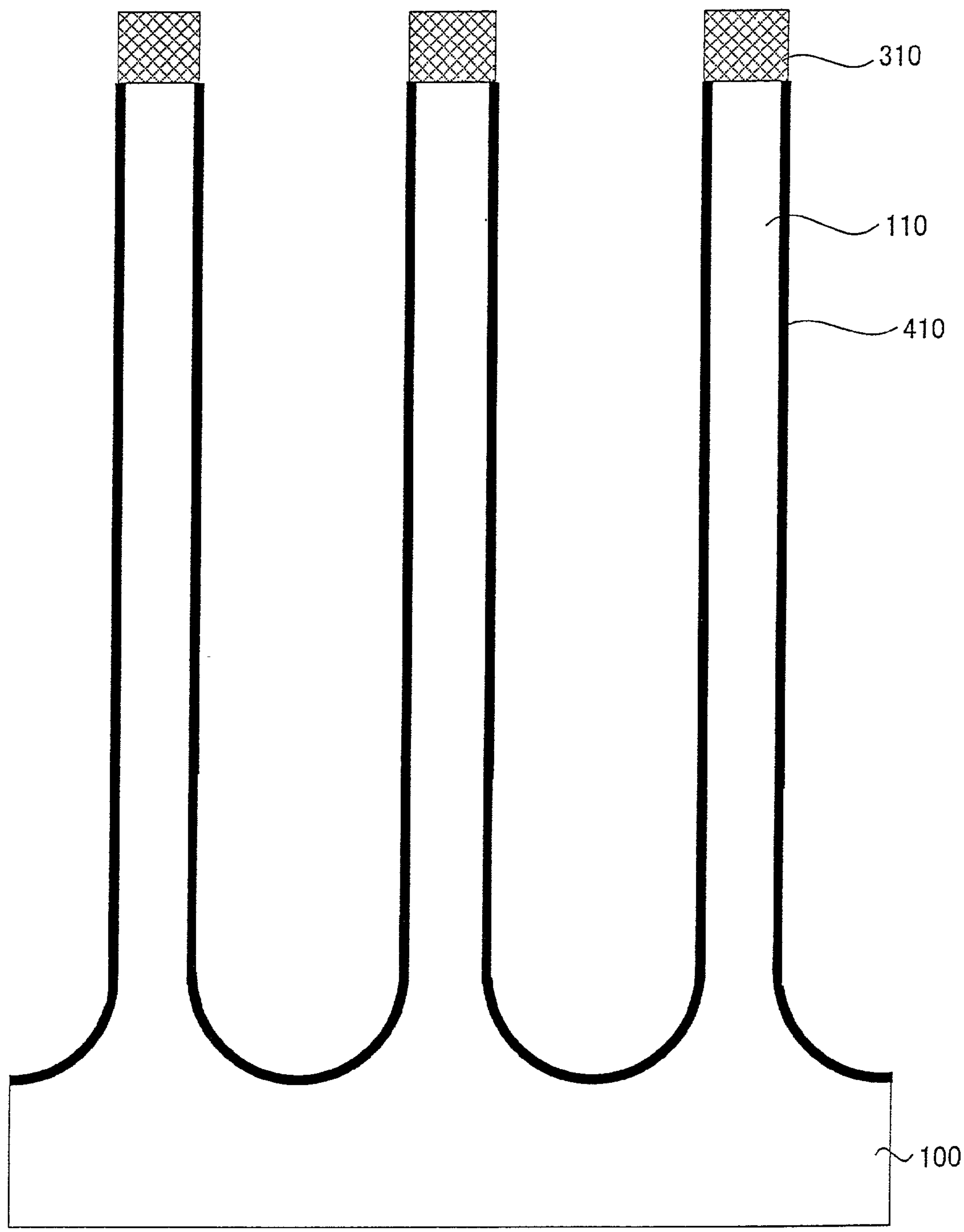
Figure 528:
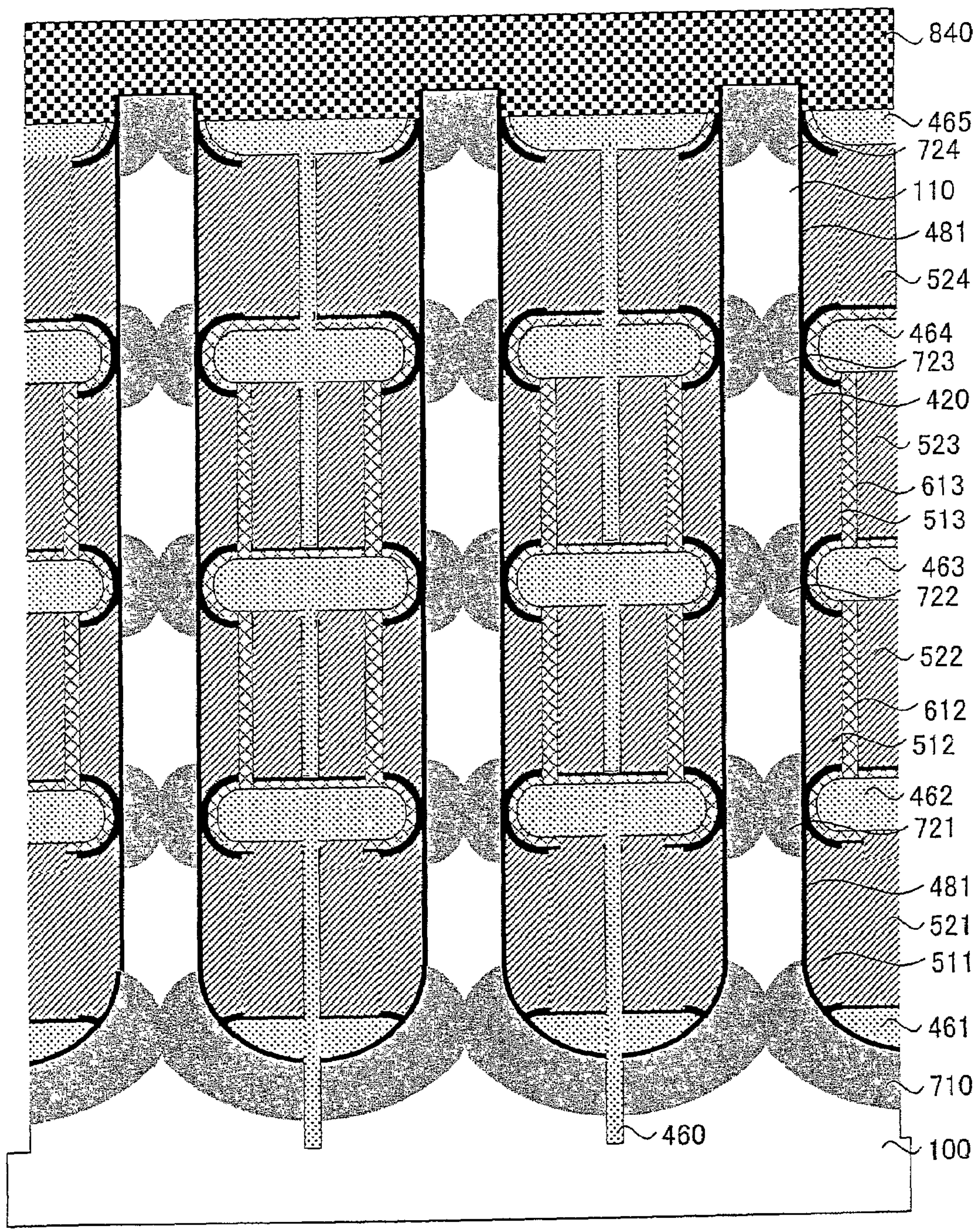
Figure 529:
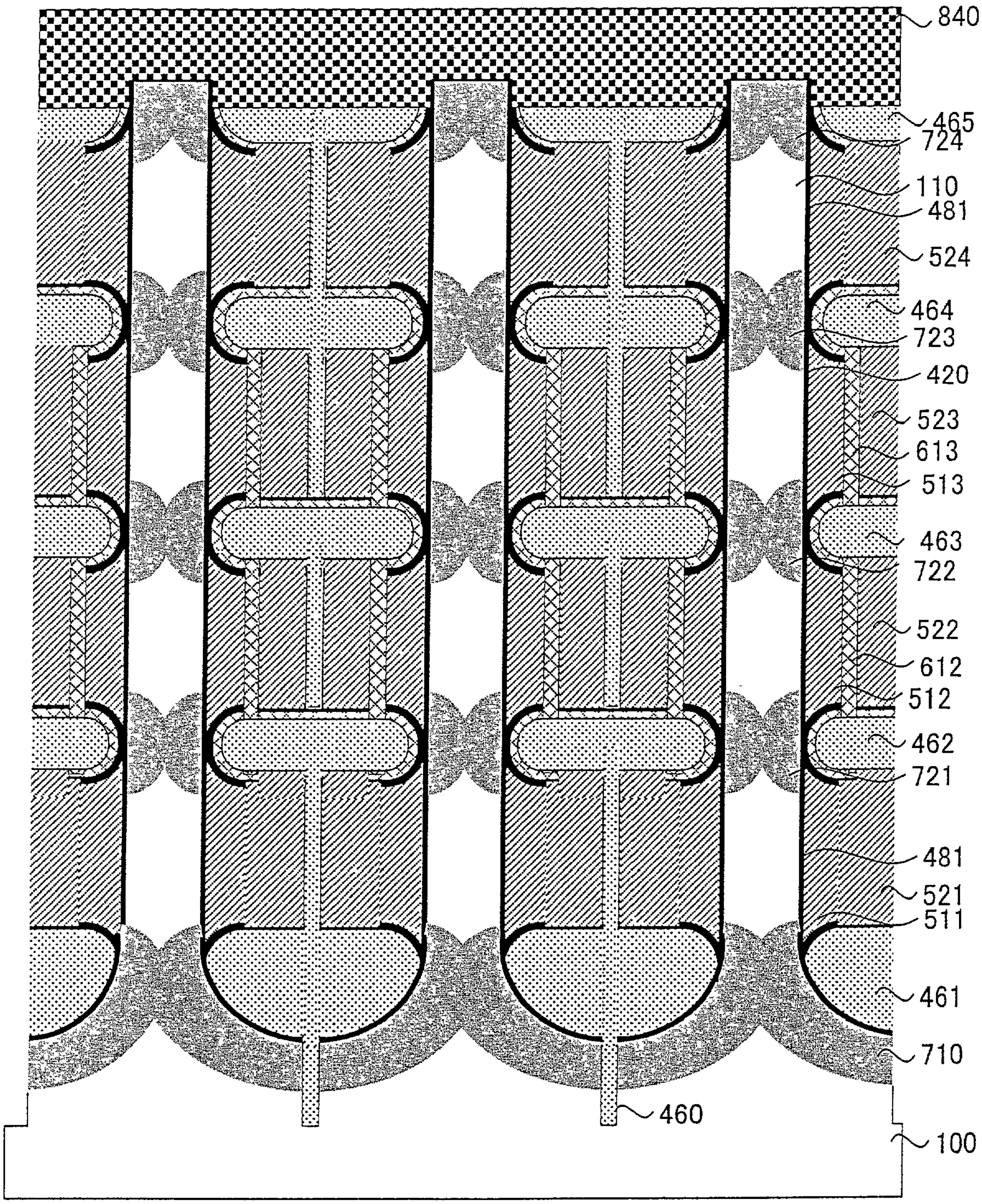
Figure 530:
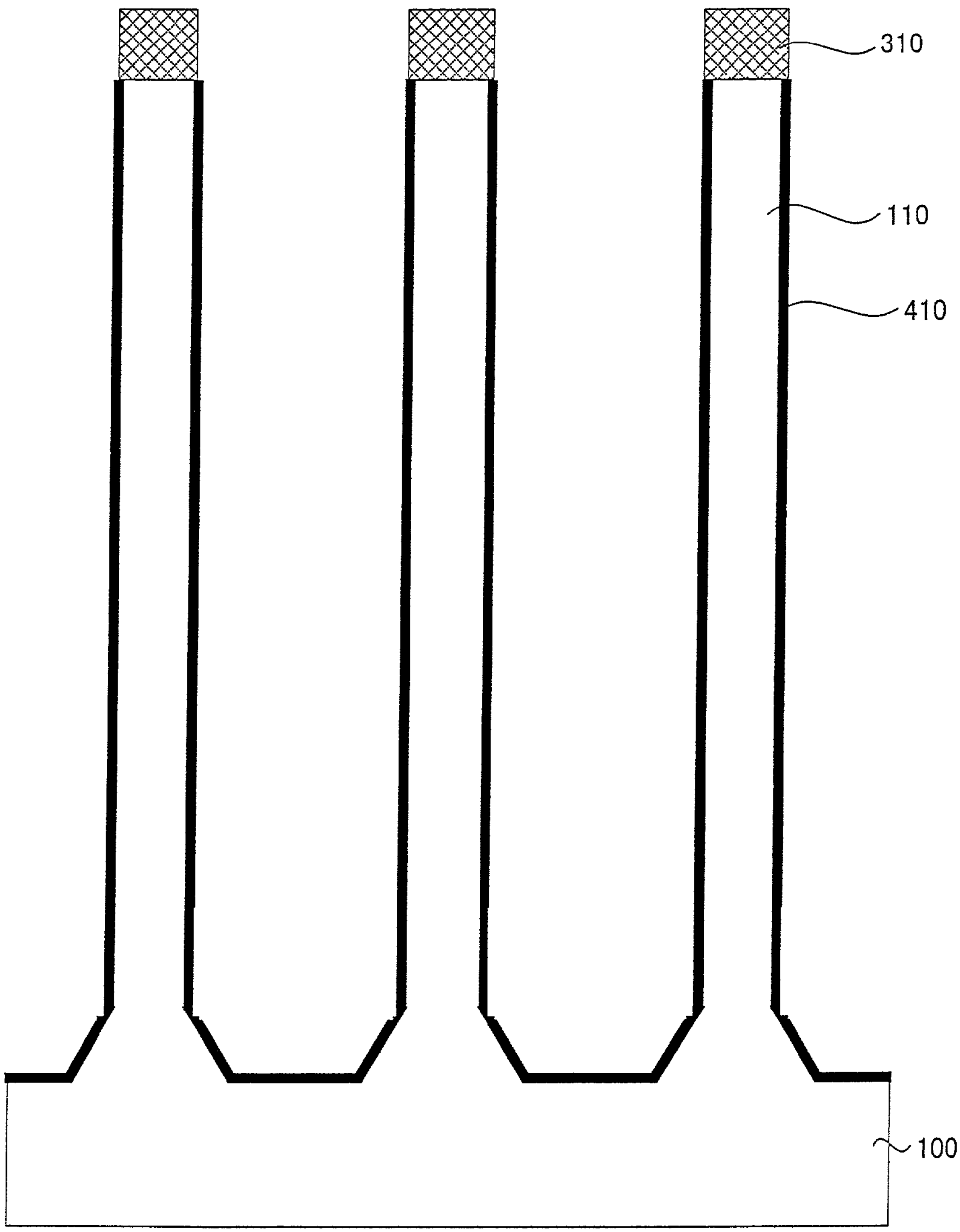
Figure 531:
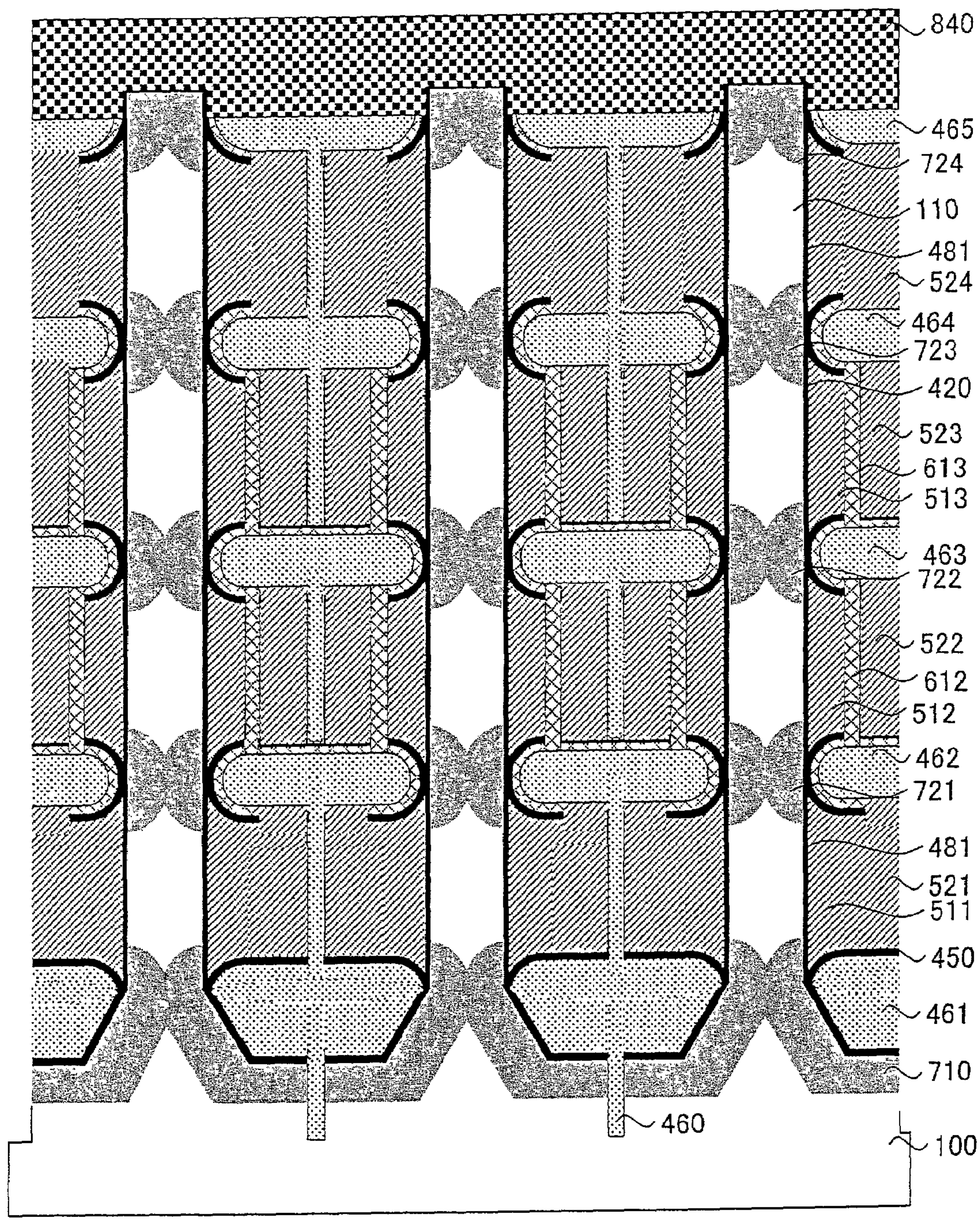
Figure 532:
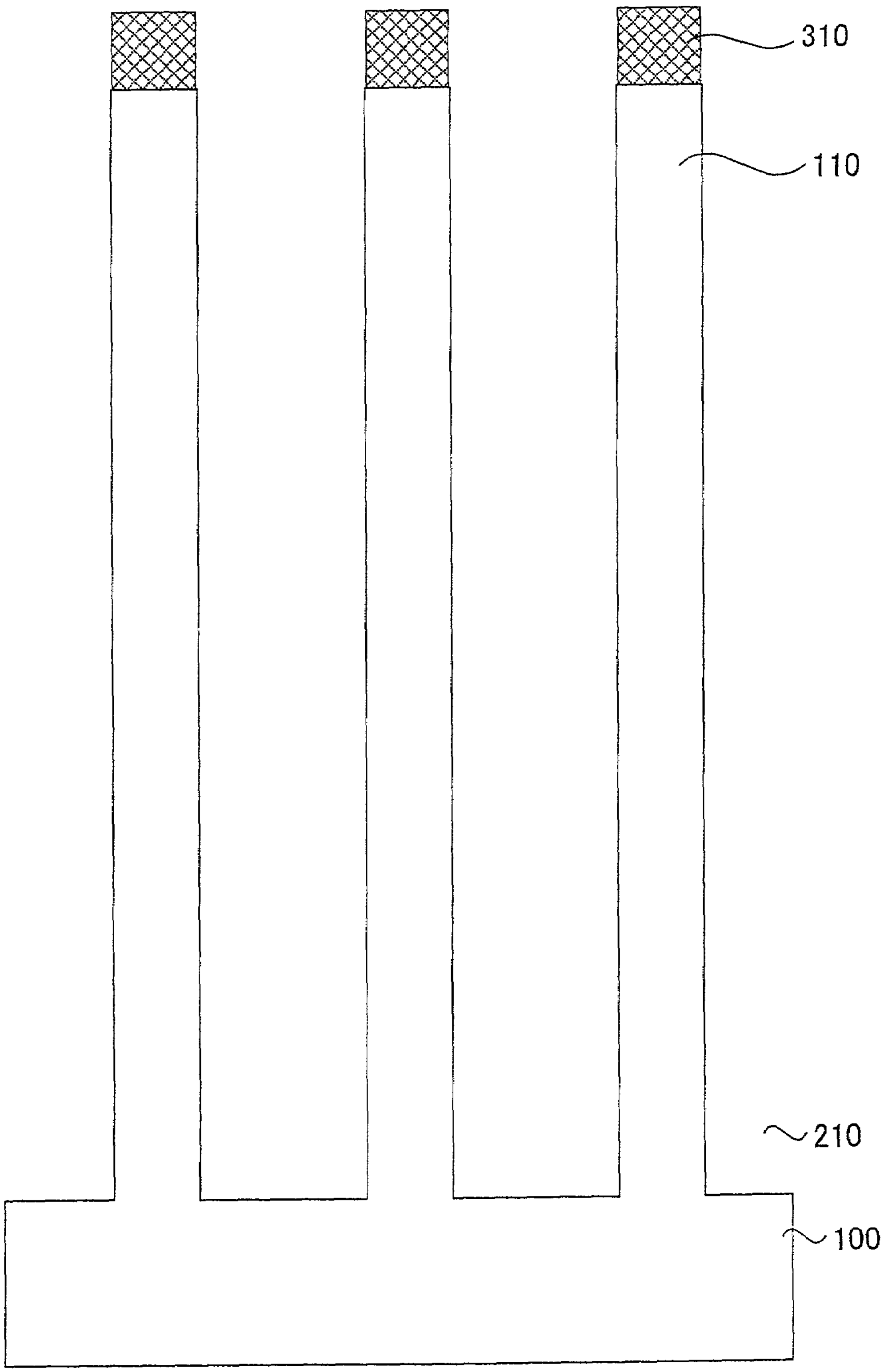
FIG. 532 and FIG. 533 are sectional views (taken on line A–A' in FIG. 1) illustrating production steps of Production Example 18 for producing a semiconductor memory in accordance with the present invention.
Figure 533:
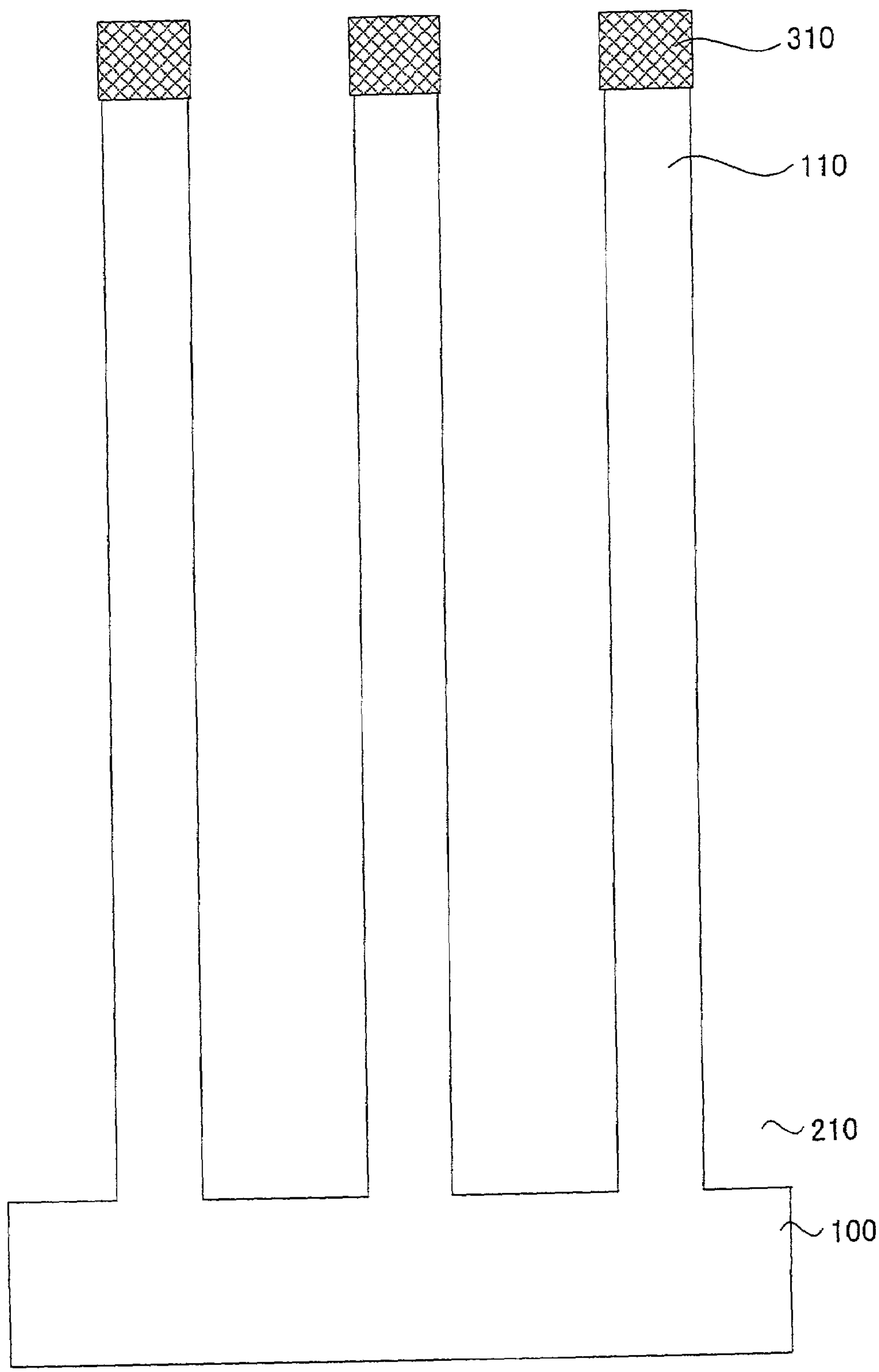
Figure 534:
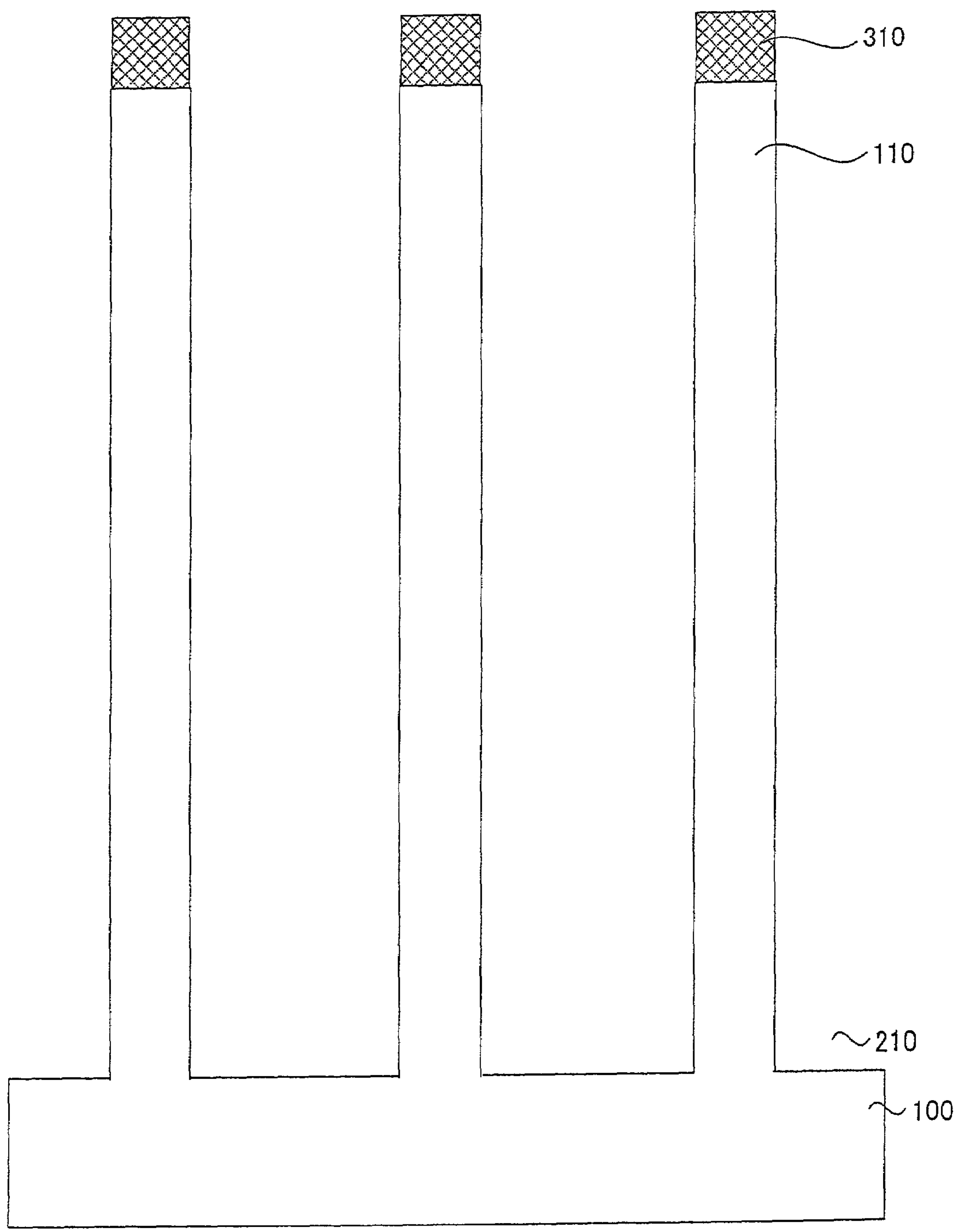
FIG. 534 and FIG. 535 are sectional views (taken on line B–B' in FIG. 1) illustrating production steps of Production Example 18 for producing a semiconductor memory in accordance with the present invention.
Figure 535:
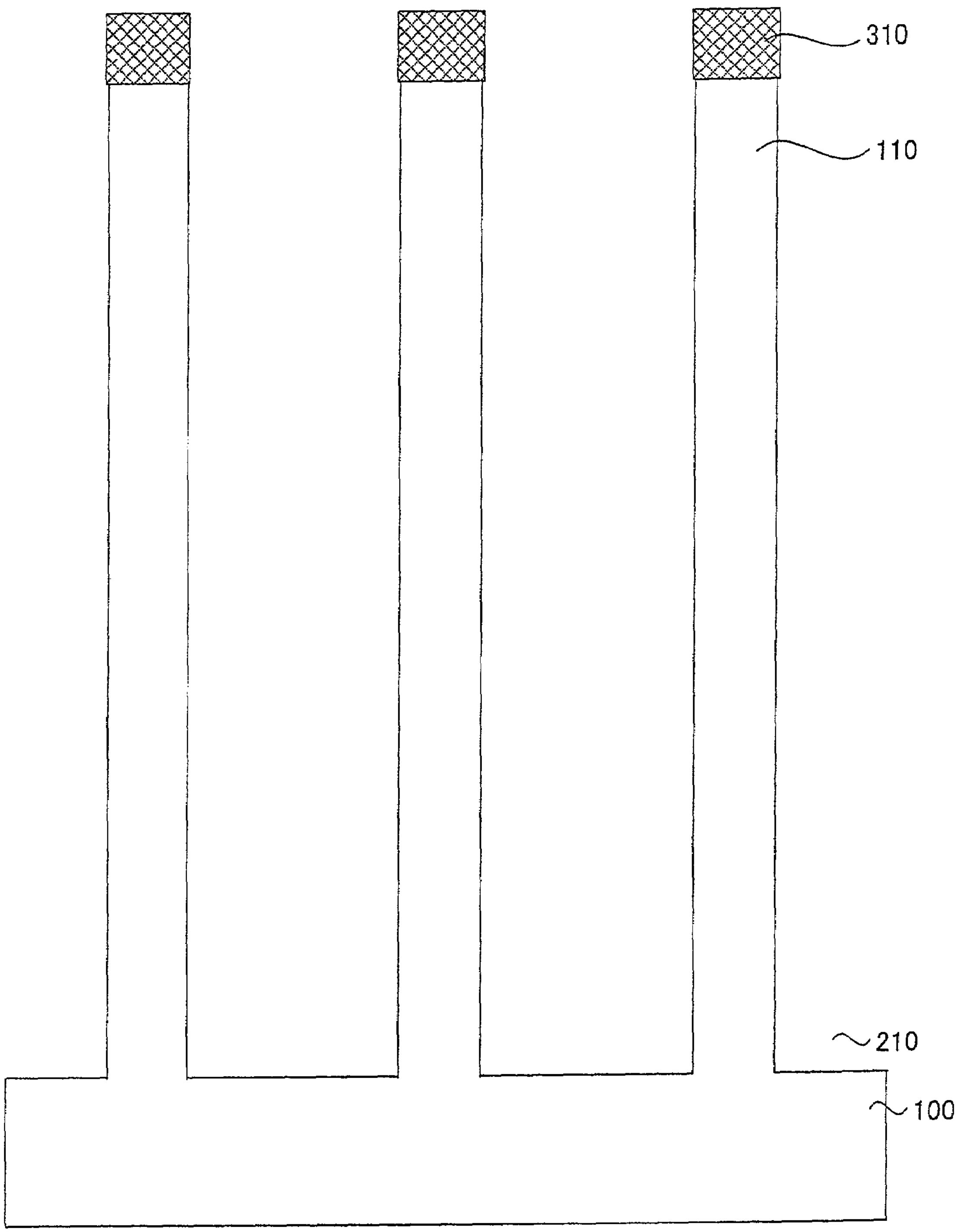
Figure 536:
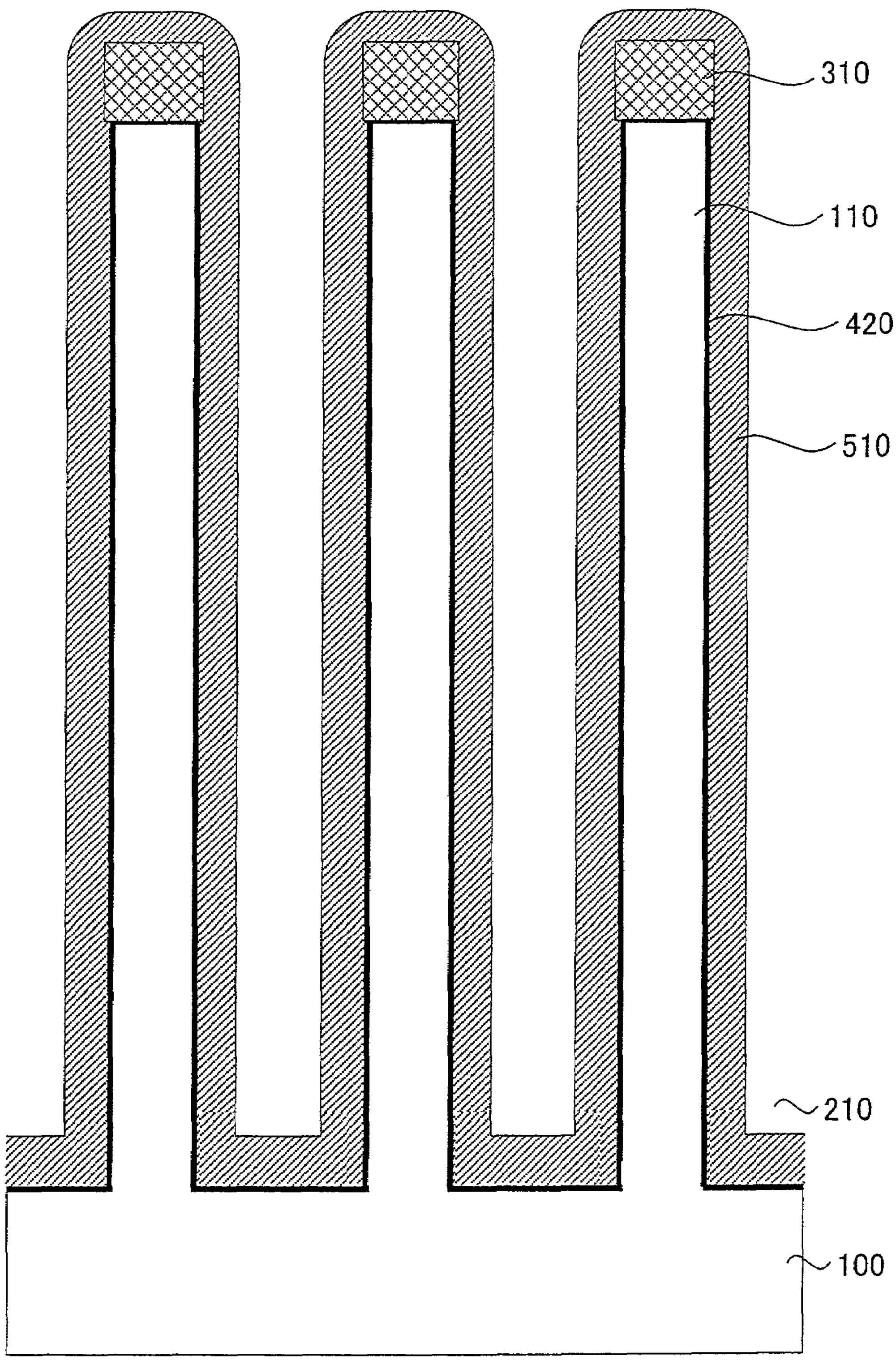
FIG. 536 and FIG. 537 are sectional views (taken on line A–A' in FIG. 1) illustrating production steps of Production Example 19 for producing a semiconductor memory in accordance with the present invention.
Figure 537:
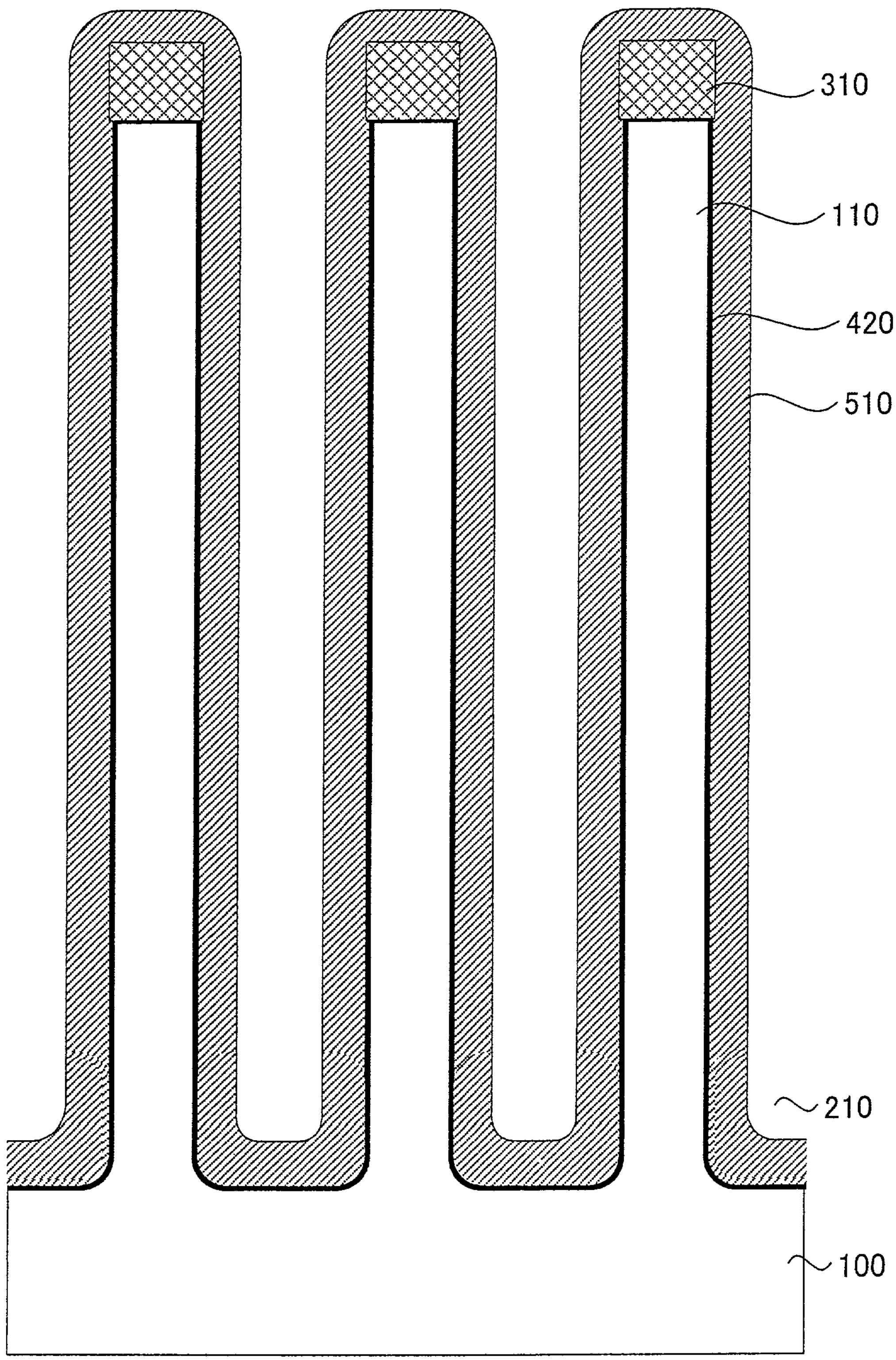
Figure 538:
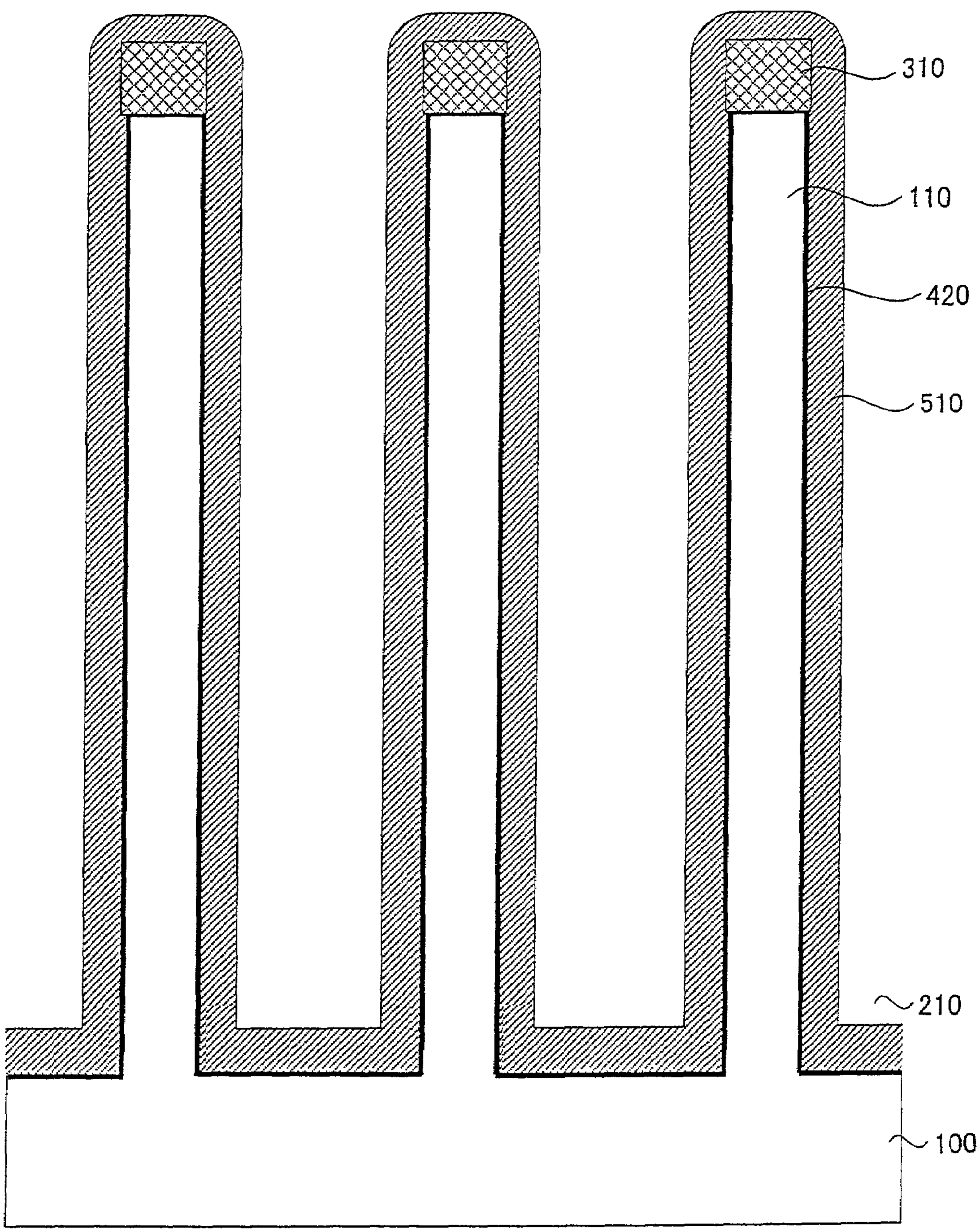
FIG. 538 and FIG. 539 are sectional views (taken on line B–B' in FIG. 1) illustrating production steps of Production Example 19 for producing a semiconductor memory in accordance with the present invention.
Figure 539:
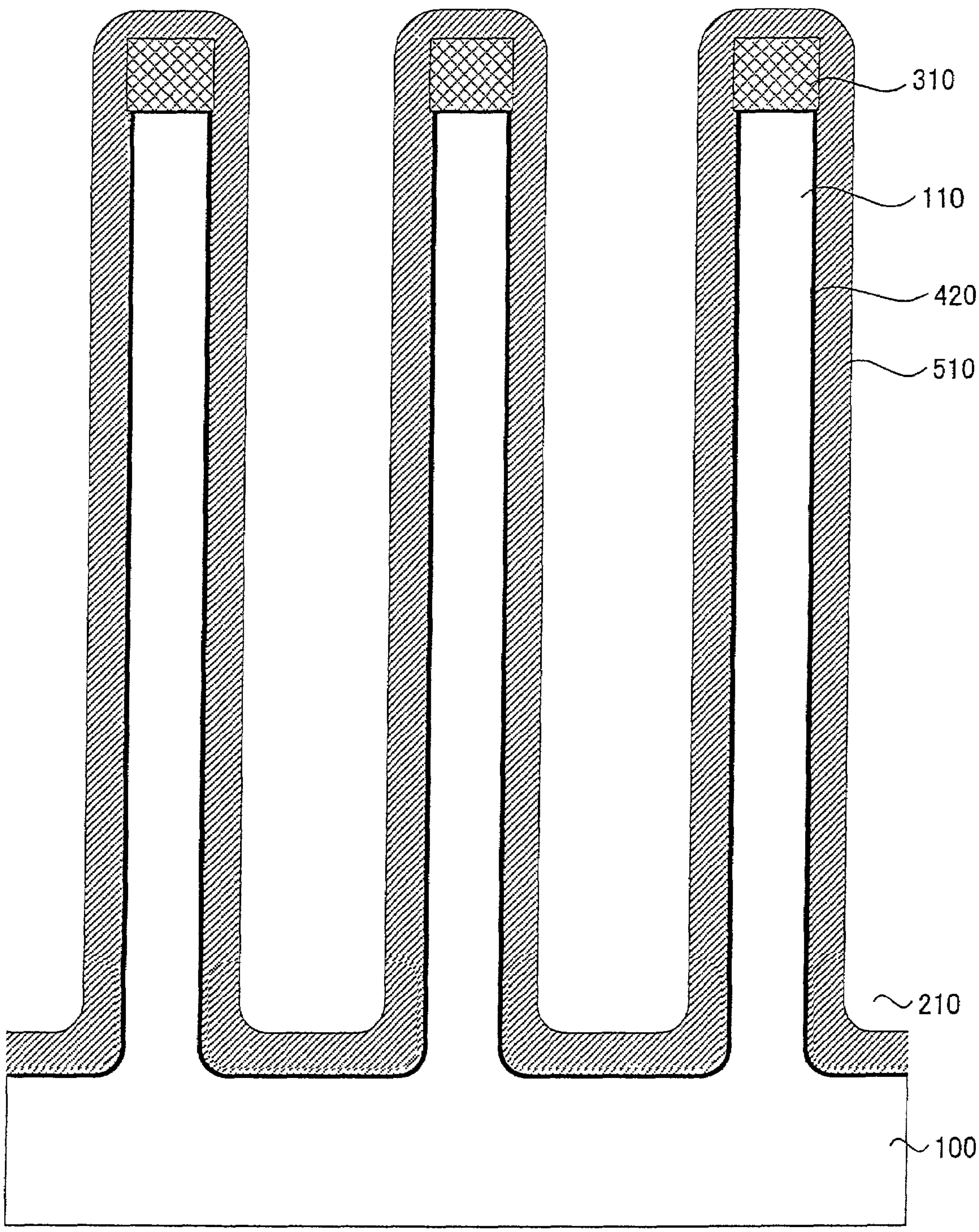

Also the top and the bottom of the island-like semiconductor layer 110 may be shifted in a horizontal direction as shown in FIG. 513 and FIG. 515.

For example, in the case where the island-like semiconductor layer 110 is circular in plan view as shown in FIG. 1, the island-like semiconductor layer 110 is a truncated cone in FIG. 512 and is an inclined column in FIG. 513. The shape of the island-like semiconductor layer 110 is not particularly limited so long as the memory cells can be disposed in series in the direction almost vertical to the semiconductor substrate 100.

PRODUCTION EXAMPLE 17

This example shows an example of production process for producing a semiconductor memory as formed in Production Examples 1 to 9 in which the selection gates and the floating gates of the transistors are formed at the same time and the island-like semiconductor layer 100 has an altered shape at its bottom. FIGS. 516 to 523 and FIGS. 524 to 531 are sectional views taken on line A–A' and line B–B', respectively, in FIG. 1 which is a plan view illustrating a memory cell array of an EEPROM.

As shown in FIGS. 516 and 524 and FIGS. 519 and 527, the first lattice-form trench may have a partially or entirely rounded slant shape at its bottom.

The sectional views of this memory after production steps according to Production Example 4 are shown in FIGS. 517 and 525, FIGS. 518 and 526, FIGS. 520 and 528, and FIGS. 521 and 529. Here, as shown in FIGS. 517 and 525 and FIGS. 520 and 528, the bottom of the polysilicon film (the first conductive film) 511 may reach the slant bottom of the first trench 210.

Alternatively, as shown in FIGS. 518 and 526 and FIGS. 521 and 529, the bottom of the polysilicon film 511 may not reach the slant bottom of the first trench 210.

The first trench 210 may have slant shapes as shown in FIGS. 522 and 530 and FIGS. 523 and 531.

PRODUCTION EXAMPLE 18

This example shows an example of production process for producing a semiconductor memory as formed in Production Examples 1 to 9 in which the selection gates and the floating gates of the transistors are formed at the same time and the silicon nitride film (the first insulating film) 310 has an altered shape after the formation of the island-like semiconductor layer 110. FIGS. 532 and 533 and FIGS. 534 and 535 are sectional views taken on line A–A' and line B–B', respectively, in FIG. 1 which is a plan view illustrating a memory cell array of an EEPROM.

When the first lattice-form trench 210 is formed by etching the mask layer 310 by reactive ion etching using as a mask a resist film R1 patterned by a known photolithographic technique and then etching 2,000 to 20,000 nm of the P-type semiconductor substrate 100 by reactive ion etching using the mask layer 310 in Production Example 1 (FIG. 279 and FIG. 299), the mask layer 310 may have a shape smaller (FIG. 532 and FIG. 534) or larger (FIG. 533 and FIG. 535) than the outward shape of the island-like semiconductor 110. The shape of the mask layer 310 is not particularly limited.

PRODUCTION EXAMPLE 19

This example shows an example of production process for producing a semiconductor memory as formed in Production Examples 1 to 9 in which the selection gates and the floating gates of the transistors are formed at the same time and the polysilicon film covering the island-like semiconductor layer 110 has an altered shape. FIGS. 536 and 537 and FIGS. 538 and 539 are sectional views taken on line A–A' and line B–B', respectively, in FIG. 1 which is a plan view illustrating a memory cell array of an EEPROM.

As shown in FIGS. 536 and 538 and FIGS. 537 and 539, the polysilicon film (the first conductive film) 510 covering the island-like semiconductor layer 110 may have a shape such that it is uniformly deposited along the bottom shape of the first trench 210.

Alternatively, as shown in FIGS. 282 and 302 and FIGS. 354 and 374, the polysilicon film 510 may have a shape such that it is deposited partially ununiformly according to the bottom shape of the first trench 210.

PRODUCTION EXAMPLE 20

This example shows an example of production process for producing a semiconductor memory as formed in Production Examples 1 to 9 in which the selection gates and the floating gates of the transistors are formed at the same time. In this example, is shown a production process for forming a terminal which electrically connects the impurity diffusion layer (the first wiring layer) 710 to a peripheral circuit.

Such a semiconductor memory may be produced by the following production process. FIGS. 540 to 562 and FIGS.

563 to 585 are sectional views taken on line C–C' and line D–D', respectively, in FIG. 1 which is a plan view illustrating a memory cell array of EEPROM.

Figure 540:
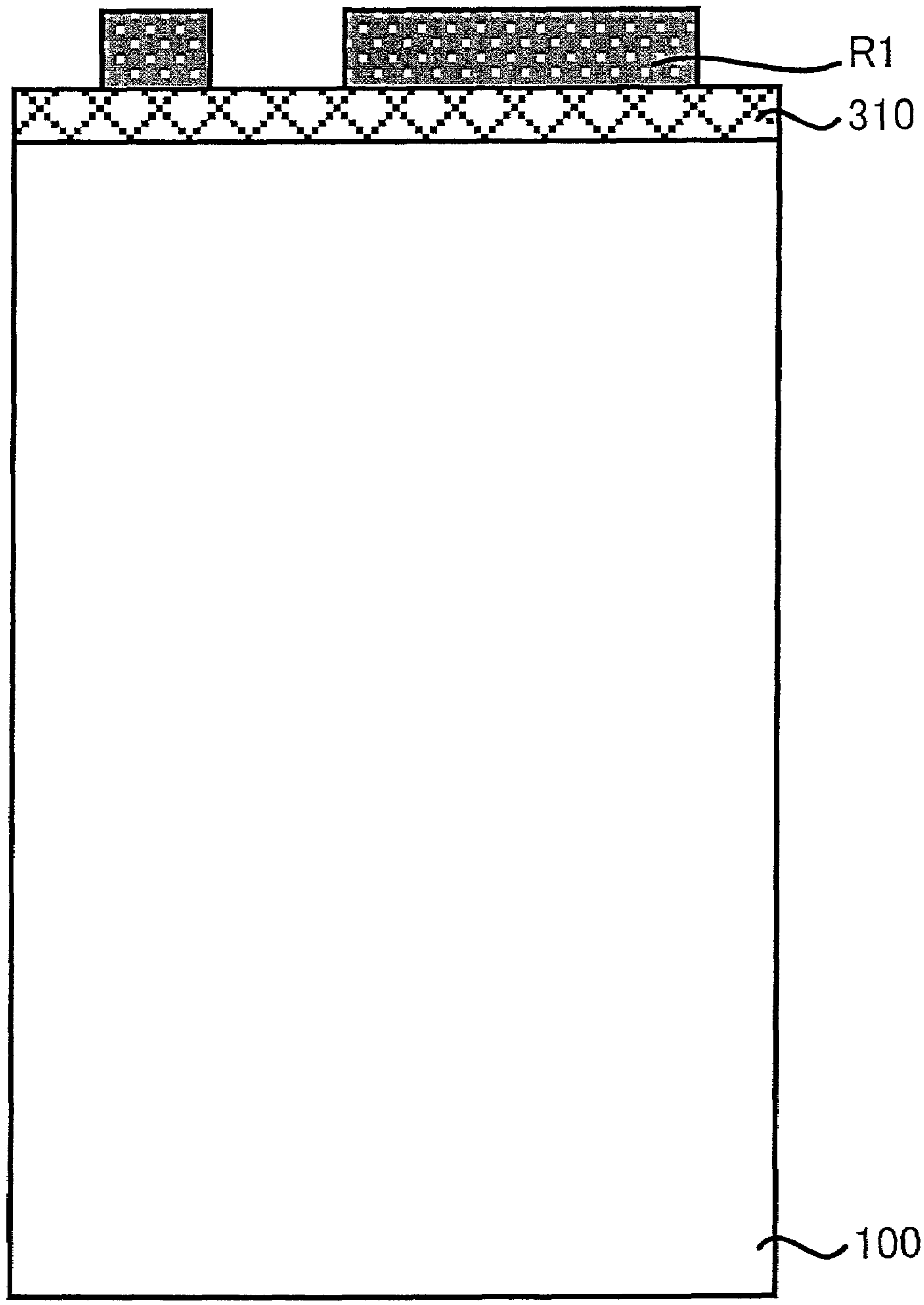
FIG. 540 to FIG. 562 are sectional views (taken on line A–A' in FIG. 1) illustrating production steps of Production Example 20 for producing a semiconductor memory in accordance with the present invention.
Figure 541:
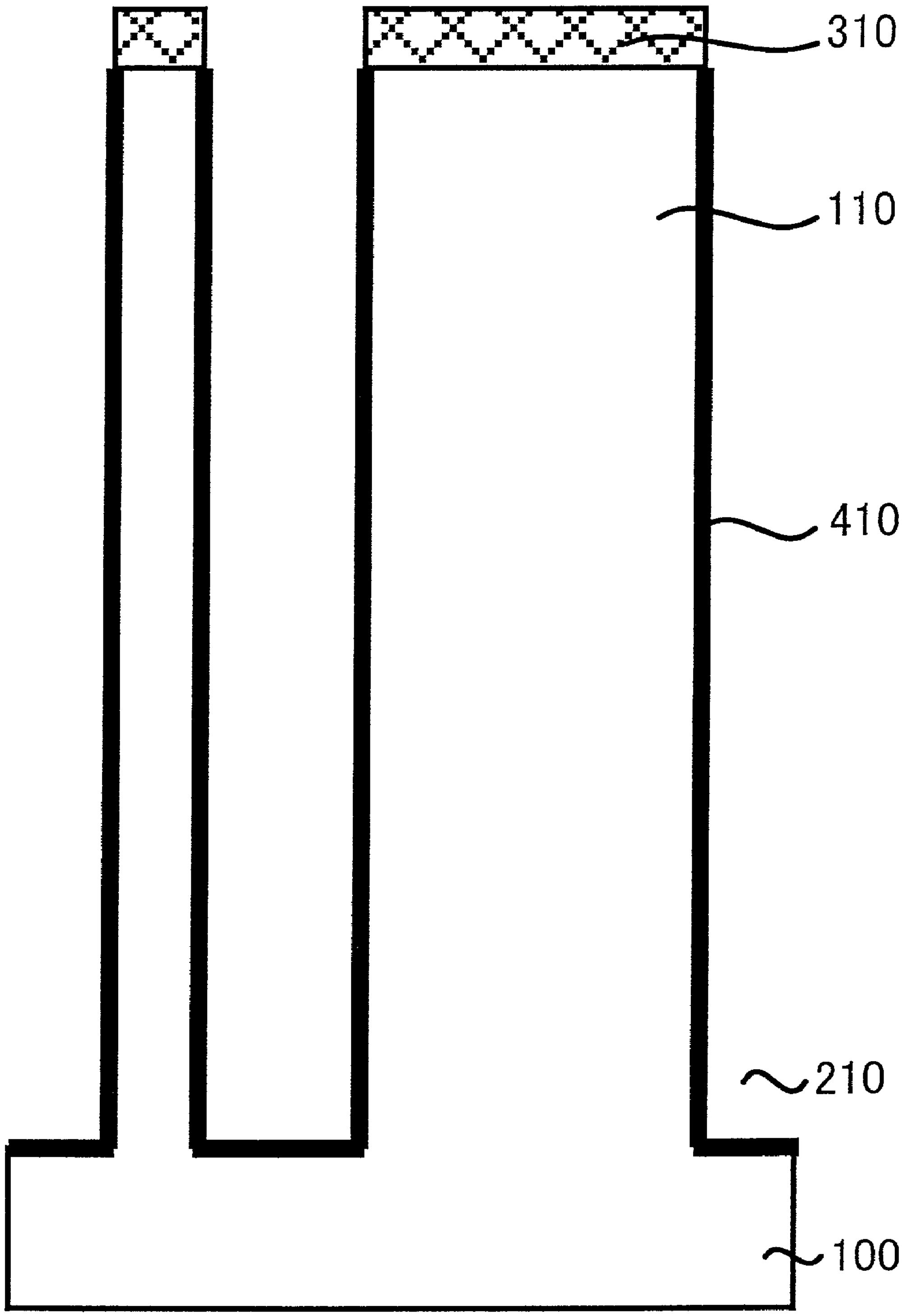
Figure 563:
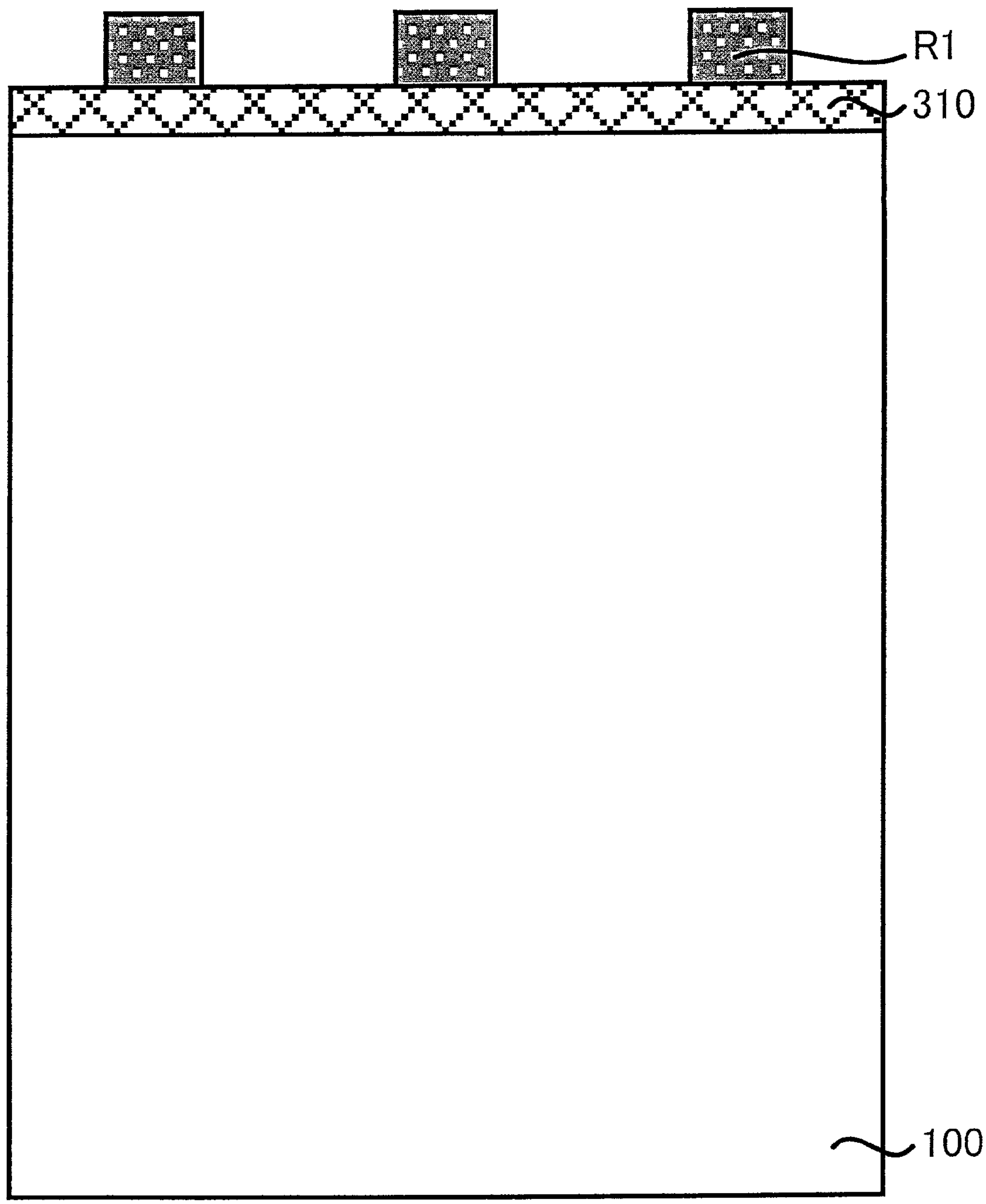
FIG. 563 to FIG. 585 are sectional views (taken on line B–B' in FIG. 1) illustrating production steps of Production Example 20 for producing a semiconductor memory in accordance with the present invention.
Figure 564:
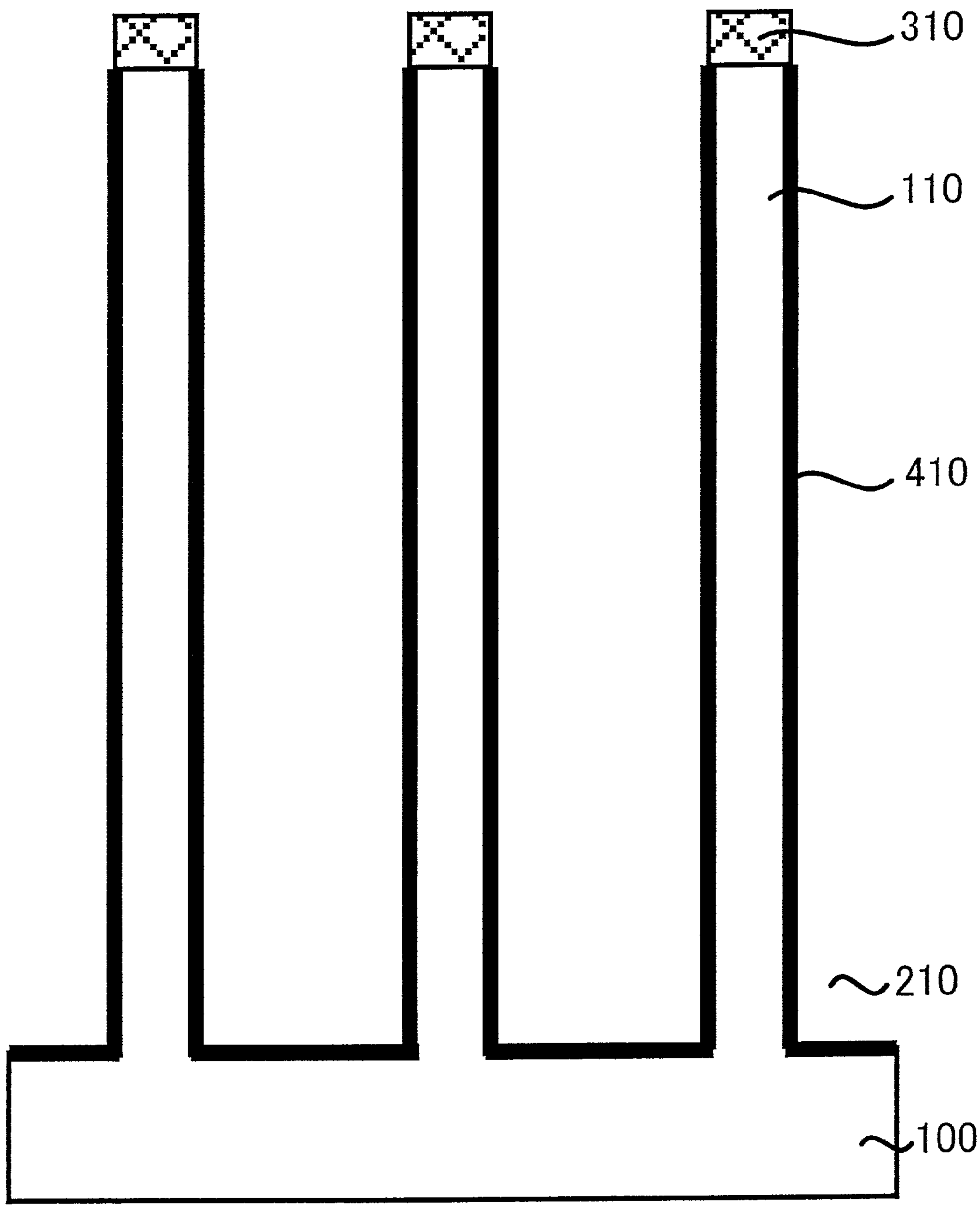

In this example, a first insulating film to be a mask layer, for example, a silicon nitride film 310 is deposited to 200 to 2,000 nm on the surface of a semiconductor substrate, for example, a P-type silicon substrate 100, and is etched by reactive ion etching using as a mask a resist film R1 patterned by known photolithography (FIG. 540 and FIG. 563). The P-type silicon substrate 100 is etched about 2,000 to 20,000 nm by reactive ion etching using the silicon nitride film 310 as a mask to form a first trench 210 in a lattice form. Thereby, the P-type silicon substrate 100 is divided into a plurality of island-like pillar form semiconductor layers 110. The surface of each island-like semiconductor layer 110 is oxidized to form a thermally oxidized film 410 as a second insulating film, to a thickness of 10 nm to 100 nm. At this time, if the island-like semiconductor layer 110 has been formed in the minimum photoetching dimension, the dimension of the island-like semiconductor layer 110 is decreased by the formation of the thermally oxidized film 410, that is, the island-like semiconductor layer 110 is formed to have a dimension smaller than the minimum photoetching dimension (FIG. 541 and FIG. 564).

Next, the thermally oxidized film (the second insulating film) 410 is etched away from the periphery of each island-like semiconductor layer 110, for example, by isotropic etching. Then, as required, channel ion implantation is carried out into the sidewall of the island semiconductor layer 110 by utilizing slant ion implantation. For example, the ion implantation may be performed at an implantation energy of 5 to 100 keV at a boron dose of about $1\times10^{11}$ to $1\times10^{13}/cm^2$ at an angle of 5 to 45° with respect to the normal line of the surface of the substrate. Preferably the channel ion implantation is performed from various directions to the island-like semiconductor layers 110 because a surface impurity concentration becomes more uniform. Alternatively, instead of the channel ion implantation, an oxide film containing boron may be deposited by CVD with a view to utilizing diffusion of boron from the oxide film. The impurity implantation from the surface of the island-like semiconductor layers 110 may be carried out before the island-like semiconductor layers are covered with the thermally oxidized film 410 or the implantation may be finished before the island-like semiconductor layers 110 are formed. Means for the implantation are not particularly limited so long as an impurity concentration distribution is almost equal over the island-like semiconductor layers 110.

Figure 542:
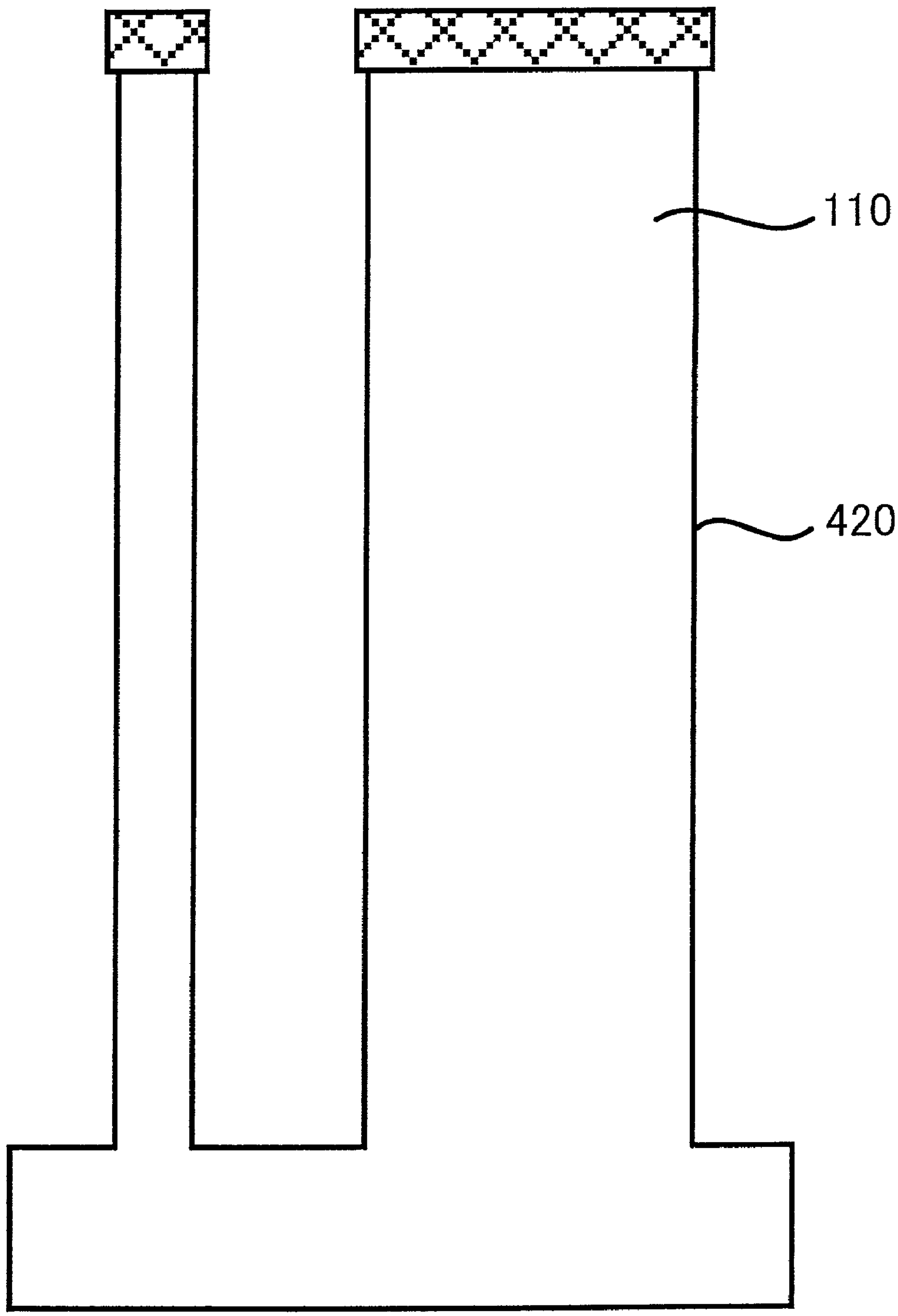
Figure 565:
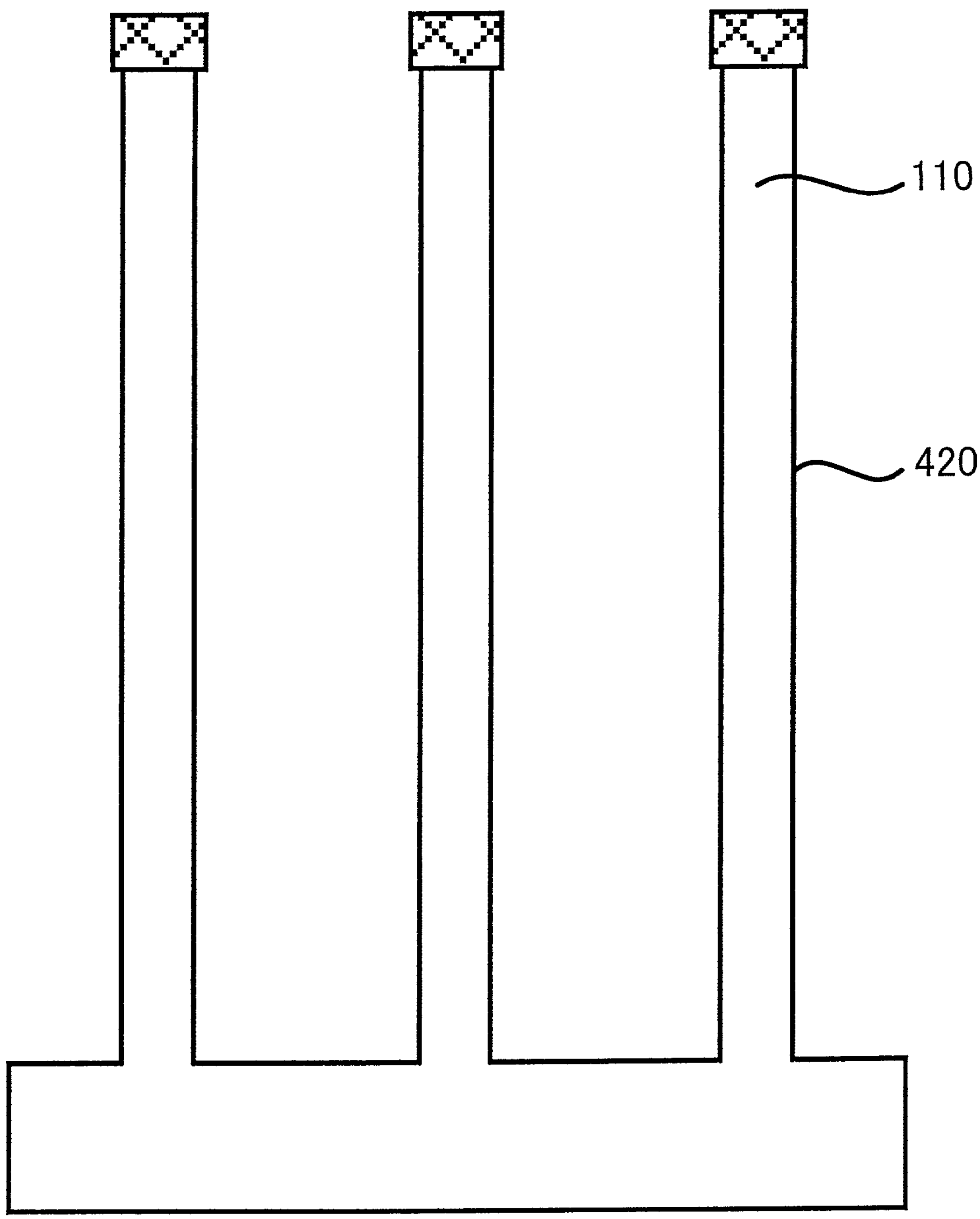

Subsequently, a third insulating film to be a tunnel oxide film, for example, a silicon oxide film 420 is formed to a thickness of about 10 nm around each island-like semiconductor layer 110, for example, by thermal oxidization (FIG. 542 and FIG. 565). The tunnel oxide film, however, may be formed of not only a thermally oxidized film but also a CVD oxide film or a nitrogen oxide film.

Figure 543:
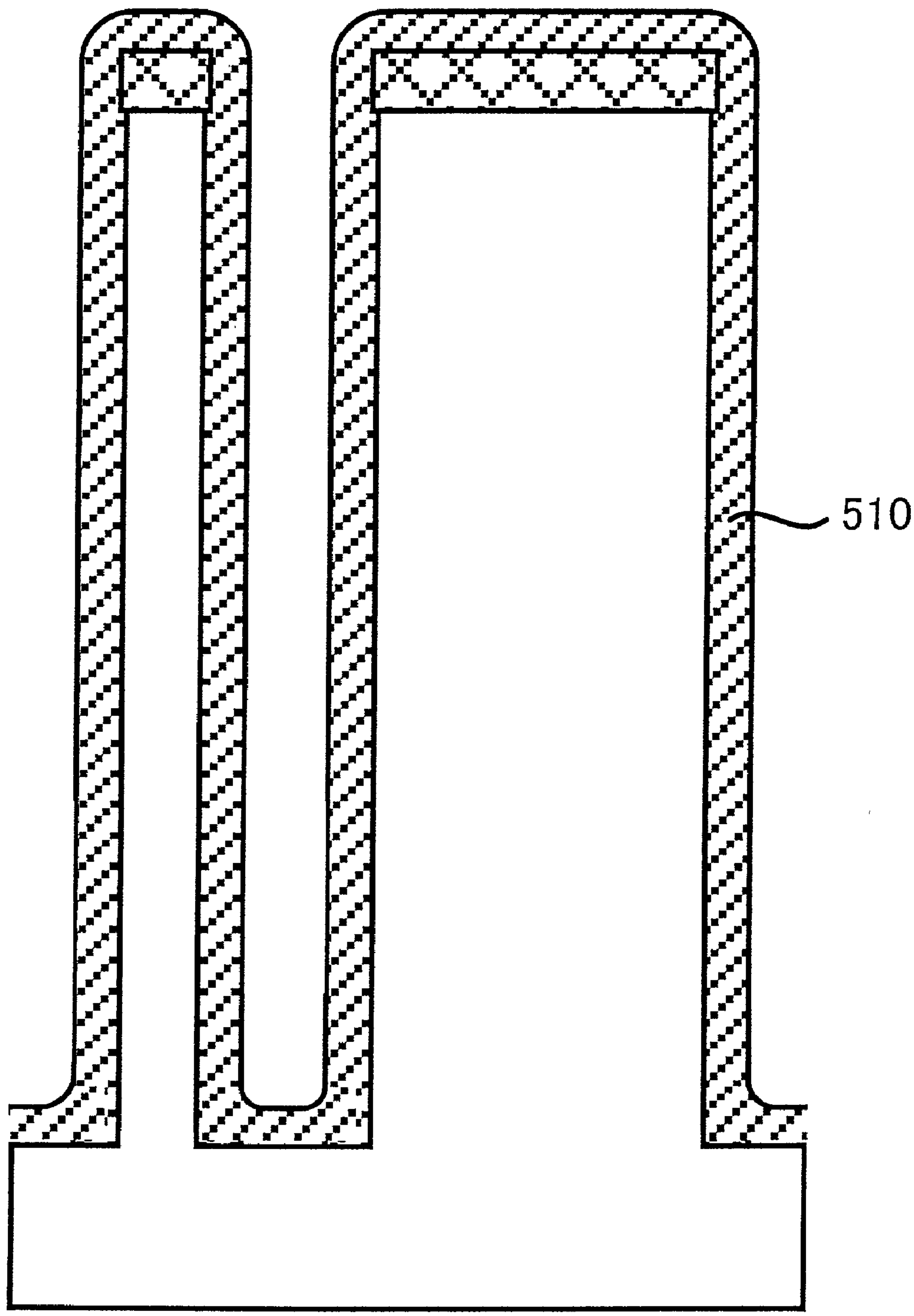
Figure 566:
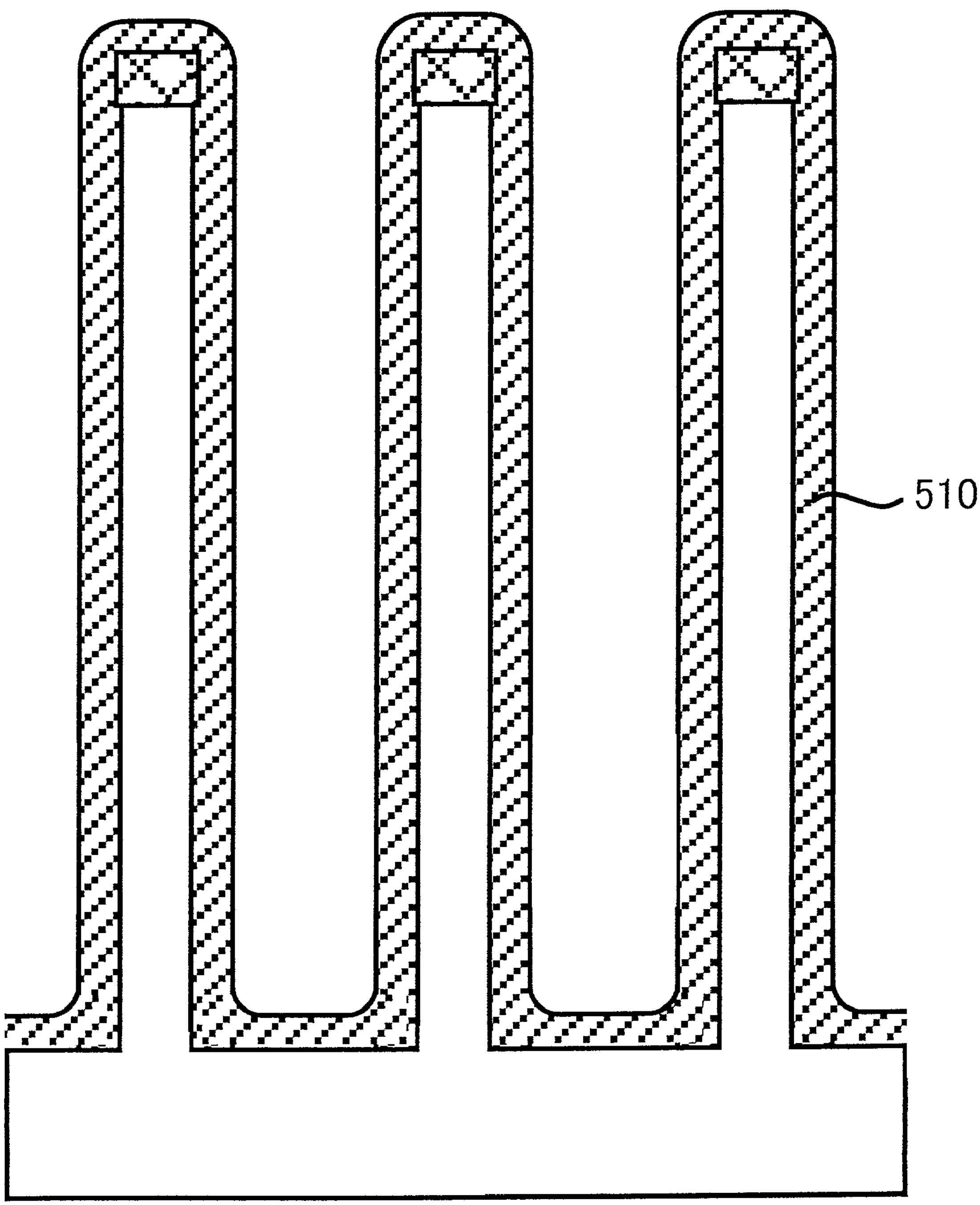

A first conductive film, for example, a polysilicon film 510, is deposited to a thickness of about 50 to 200 nm (FIG. 543 and FIG. 566).

Figure 544:
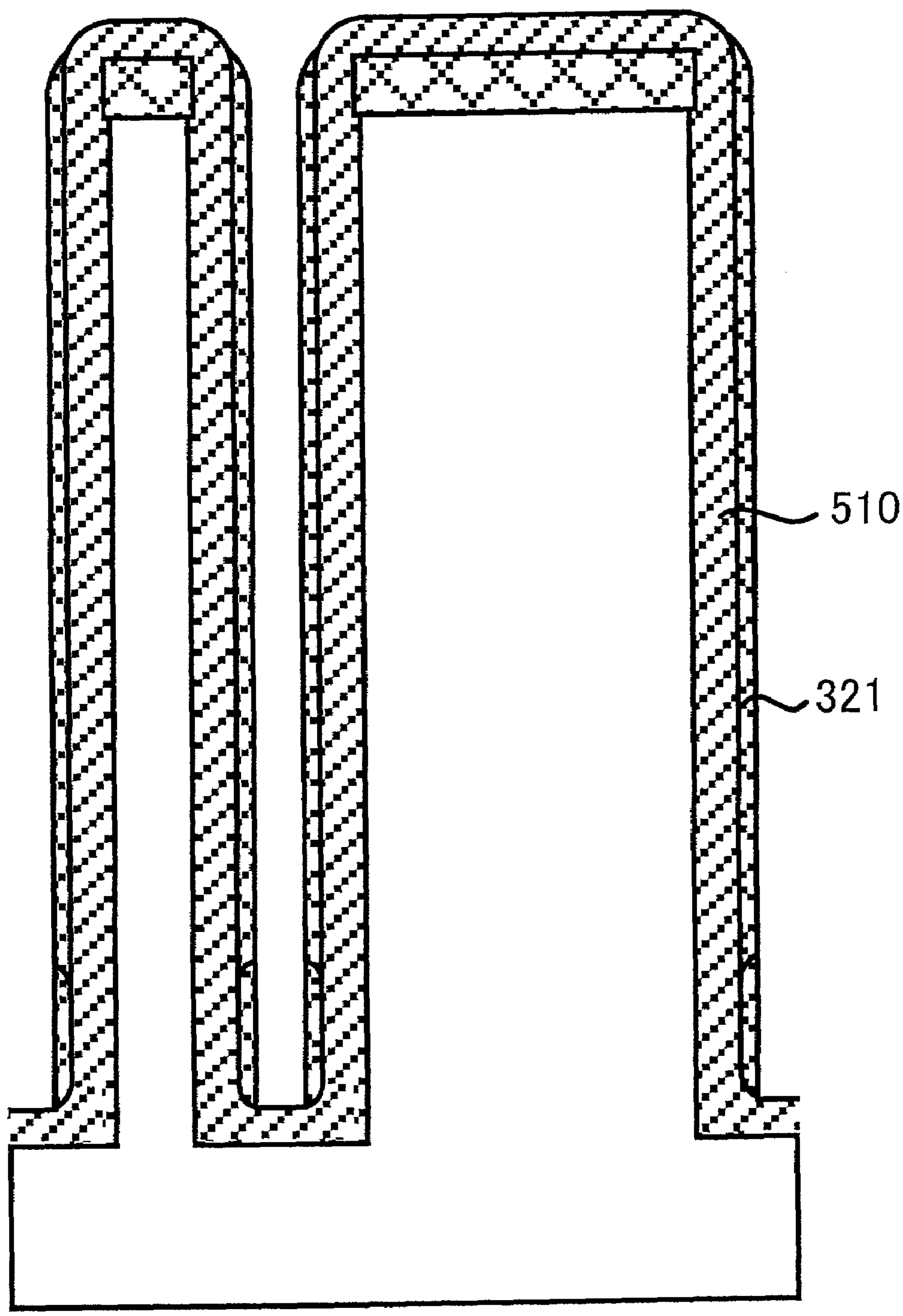
Figure 567:
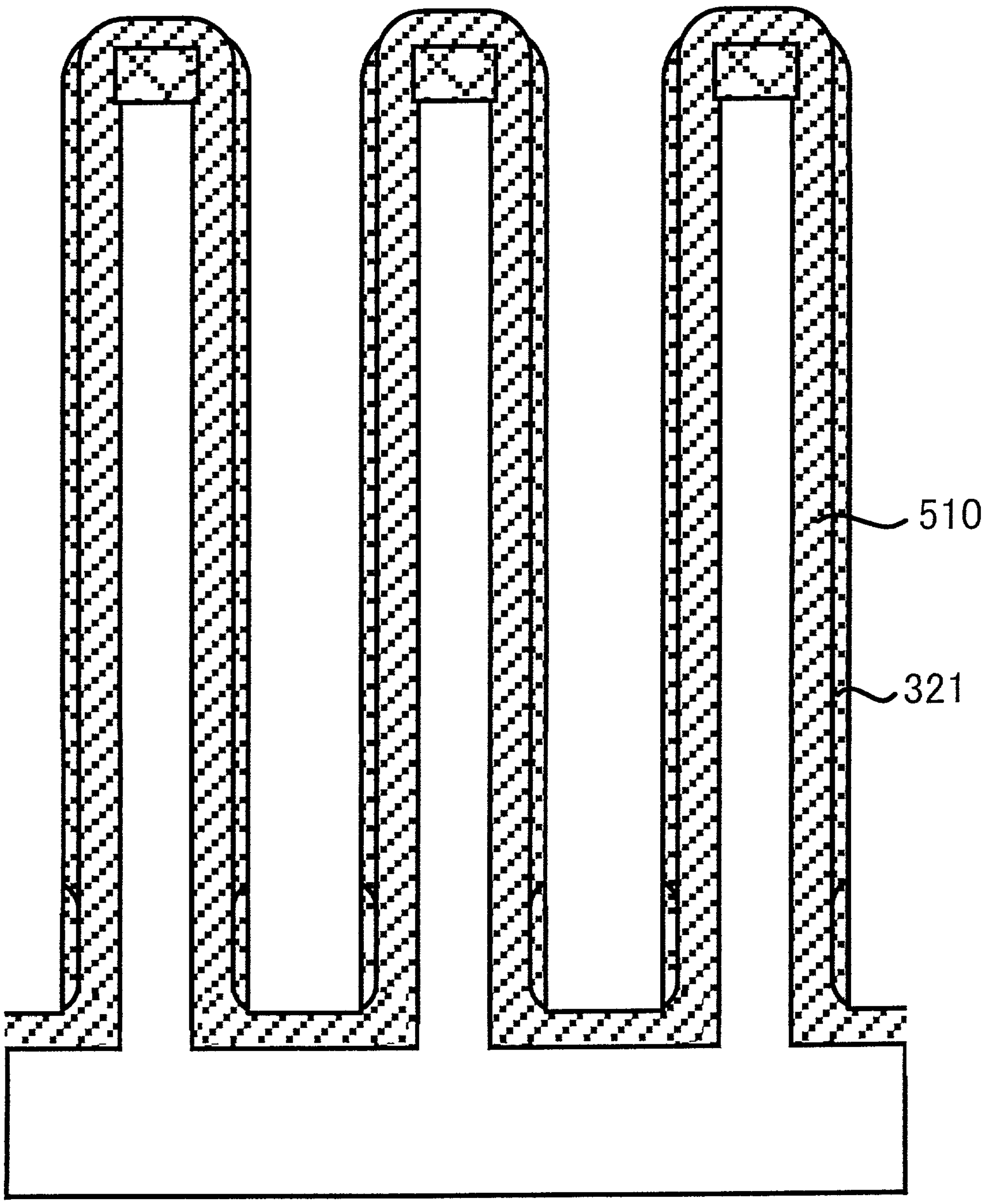

A fourth insulating film, for example, a silicon nitride film 321 is deposited to a thickness of about 5 to 50 nm by CVD. The silicon nitride film (the fourth insulating film) 321 is etched by reactive ion etching to remain in the form of a sidewall spacer on the sidewall of the polysilicon film (the first conductive film) 510 (FIG. 544 and FIG. 567).

Figure 545:
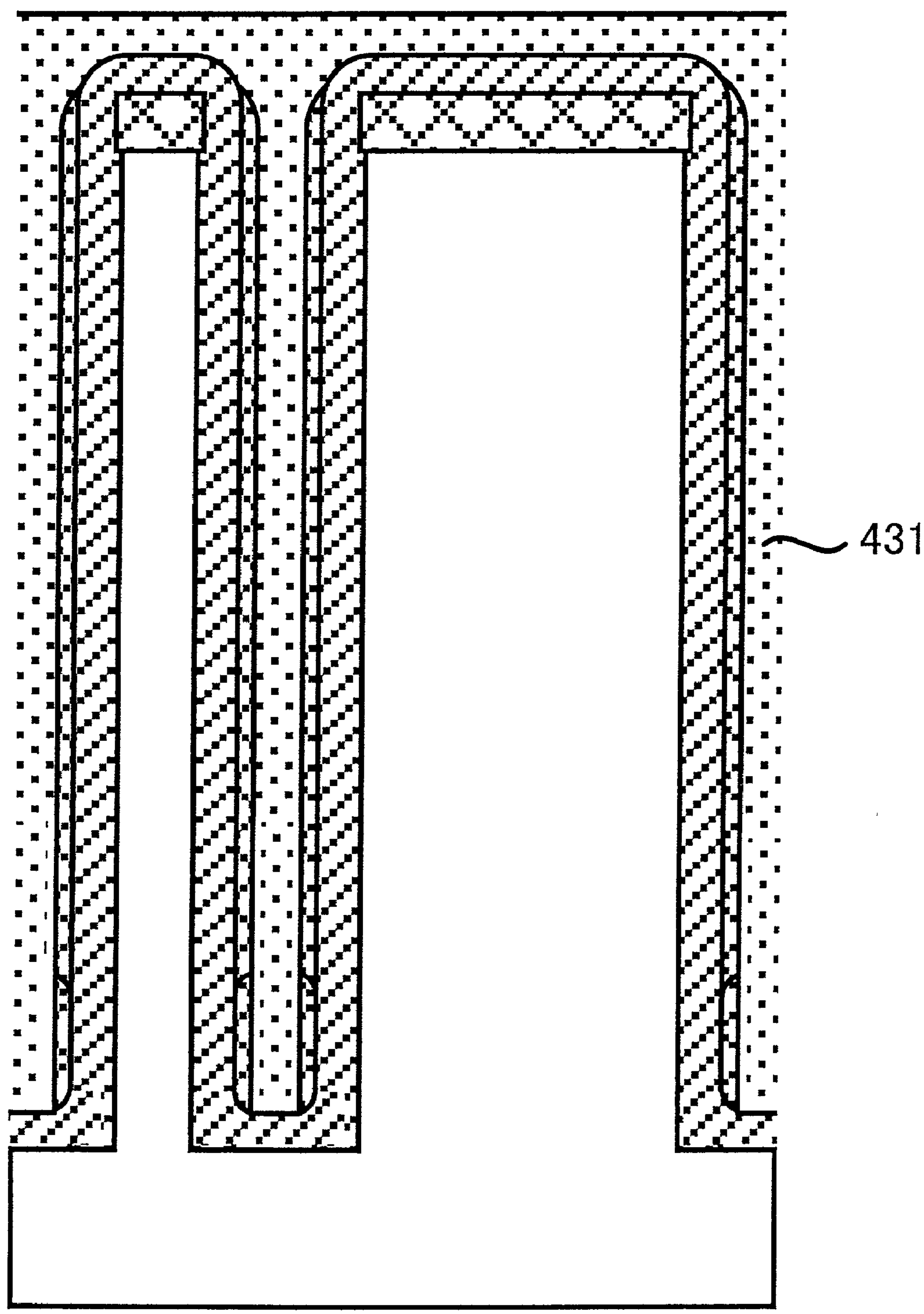
Figure 568:
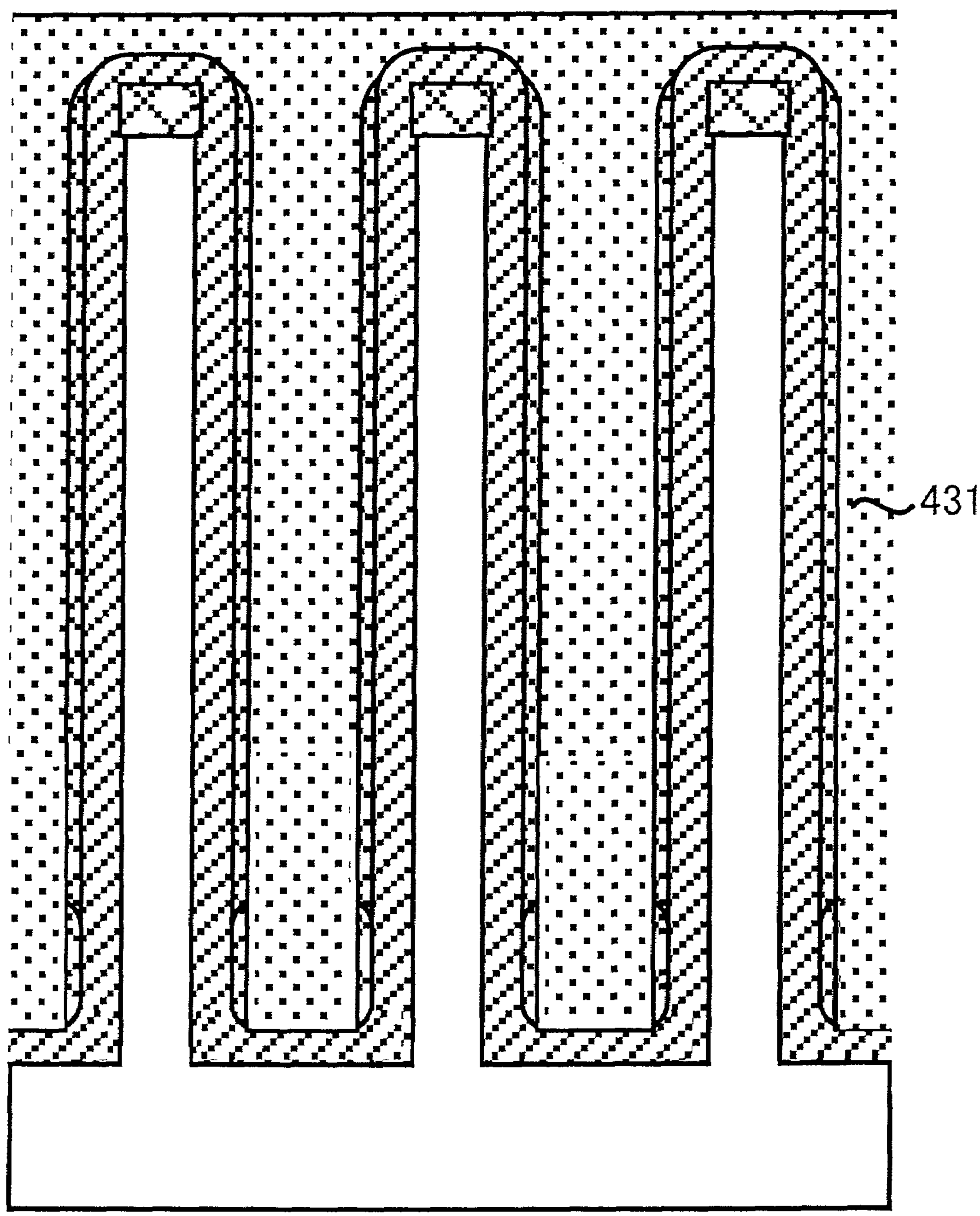

A fifth insulating film, for example, a silicon oxide film 431 is deposited to a thickness of 50 to 500 nm in the first trench 210 in the lattice form by CVD (FIG. 545 and FIG. 568).

Figure 546:
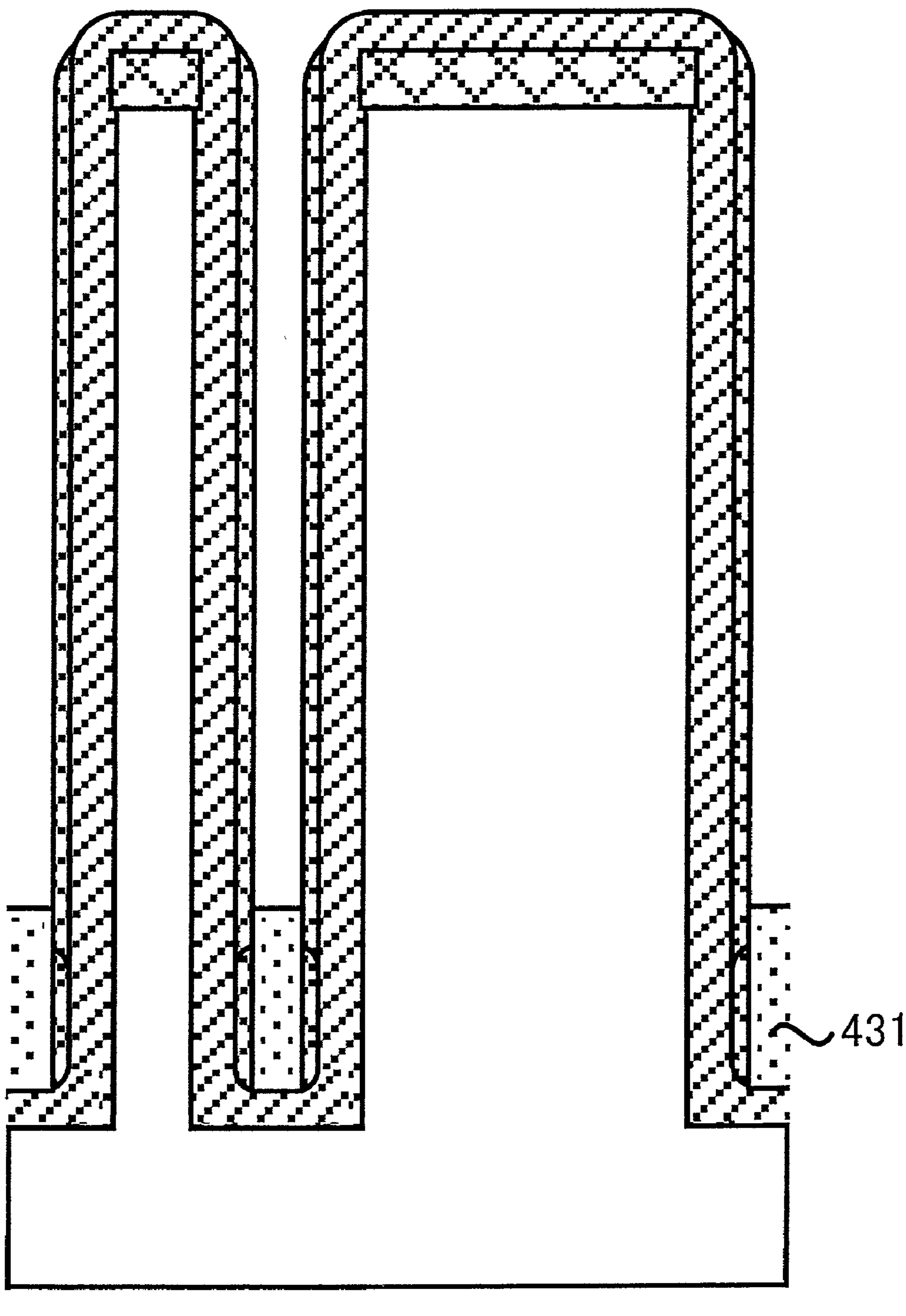
Figure 569:
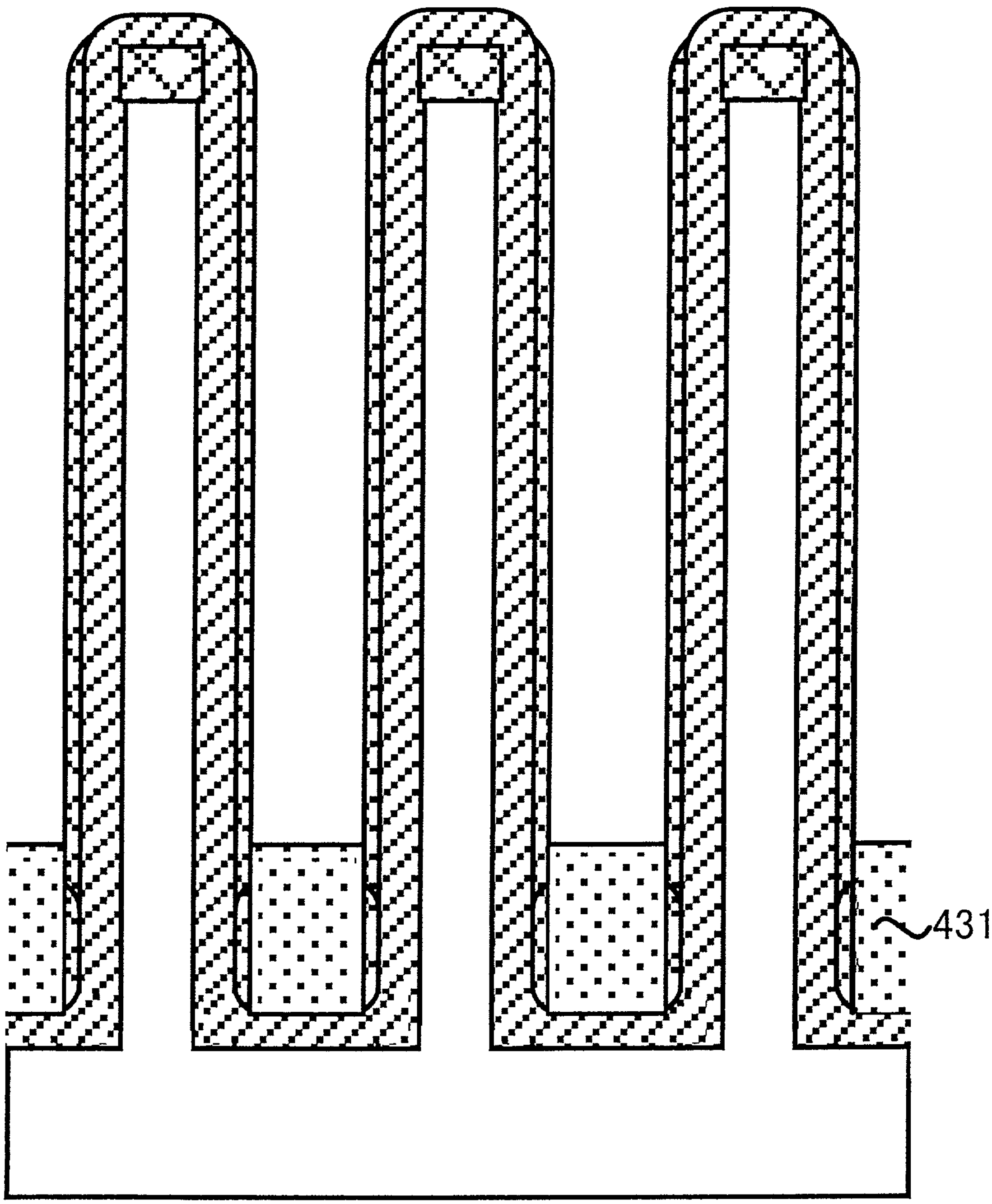

The silicon oxide film (the fifth insulating film) 431 is buried to a desired depth in the first trench 210 in the lattice form (FIG. 546 and FIG. 569).

Figure 547:
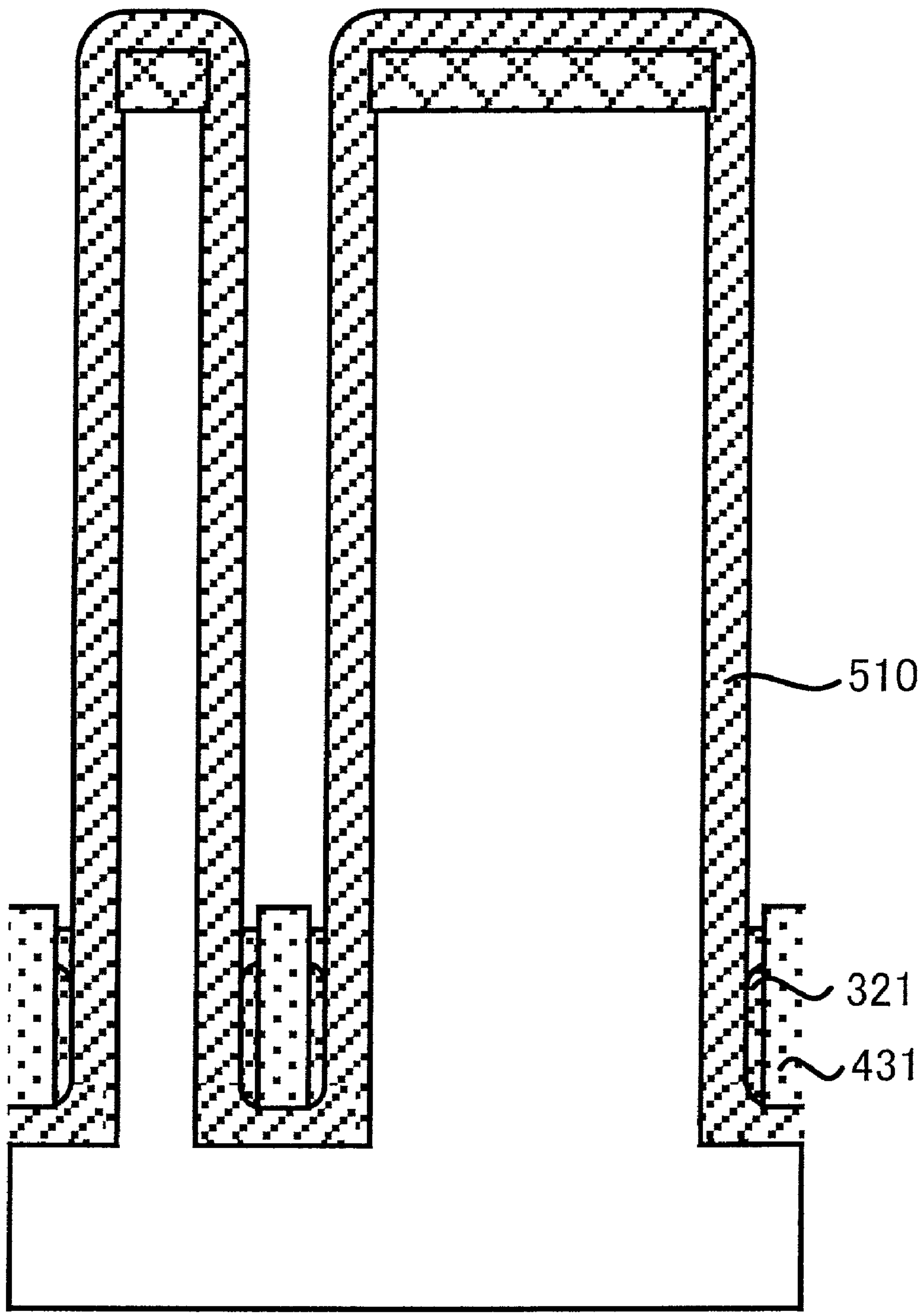
Figure 570:
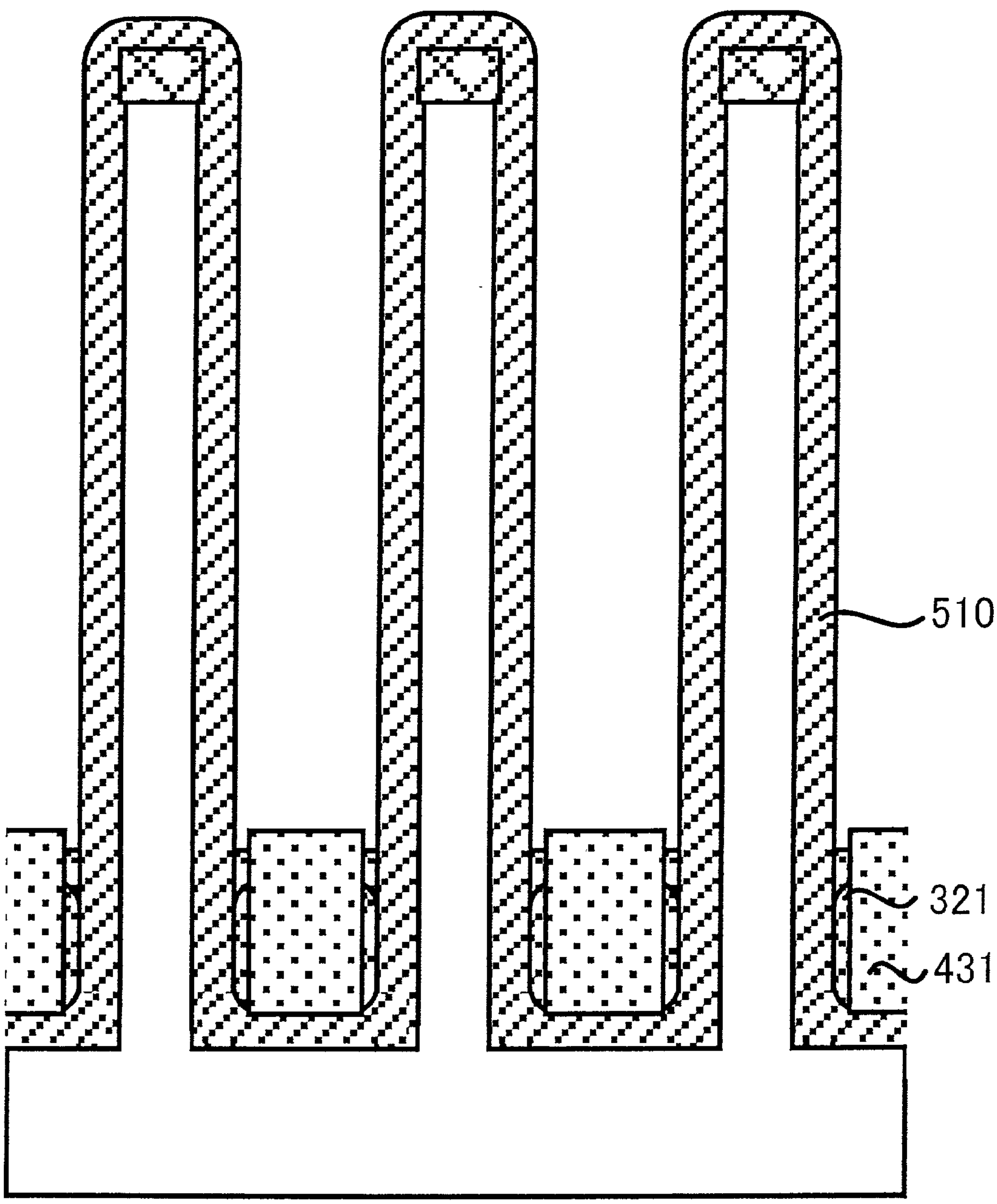

The silicon nitride film (the fourth insulating film) 321 is isotropically etched using the silicon oxide film 431 as a mask so that the silicon nitride film 321 remains only between the silicon oxide film 431 and the polysilicon film (the first conductive film) 510 (FIG. 547 and FIG. 570). At this time, the silicon nitride film 321 is lower than the top surface of the silicon oxide film 431 to form a recess. In this recess, a silicon oxide film 441 is deposited as a sixth insulating film to a thickness of about 3 to 30 nm. The above recess is filled if the thickness of the silicon oxide film 441 is about half or more of the thickness of the silicon nitride film 321. Since the oxide film 441 deposits also on the sidewall of the polysilicon film 510, the oxide film 441 is removed from the sidewall of the polysilicon film 510, for example, by isotropic etching. The silicon oxide film 441 remains in the recess, and the silicon nitride film (the fourth insulating film) 321 is buried by the silicon oxide film (the fifth insulating film) 431 and the silicon oxide film (the sixth insulating film) 441.

Figure 548:
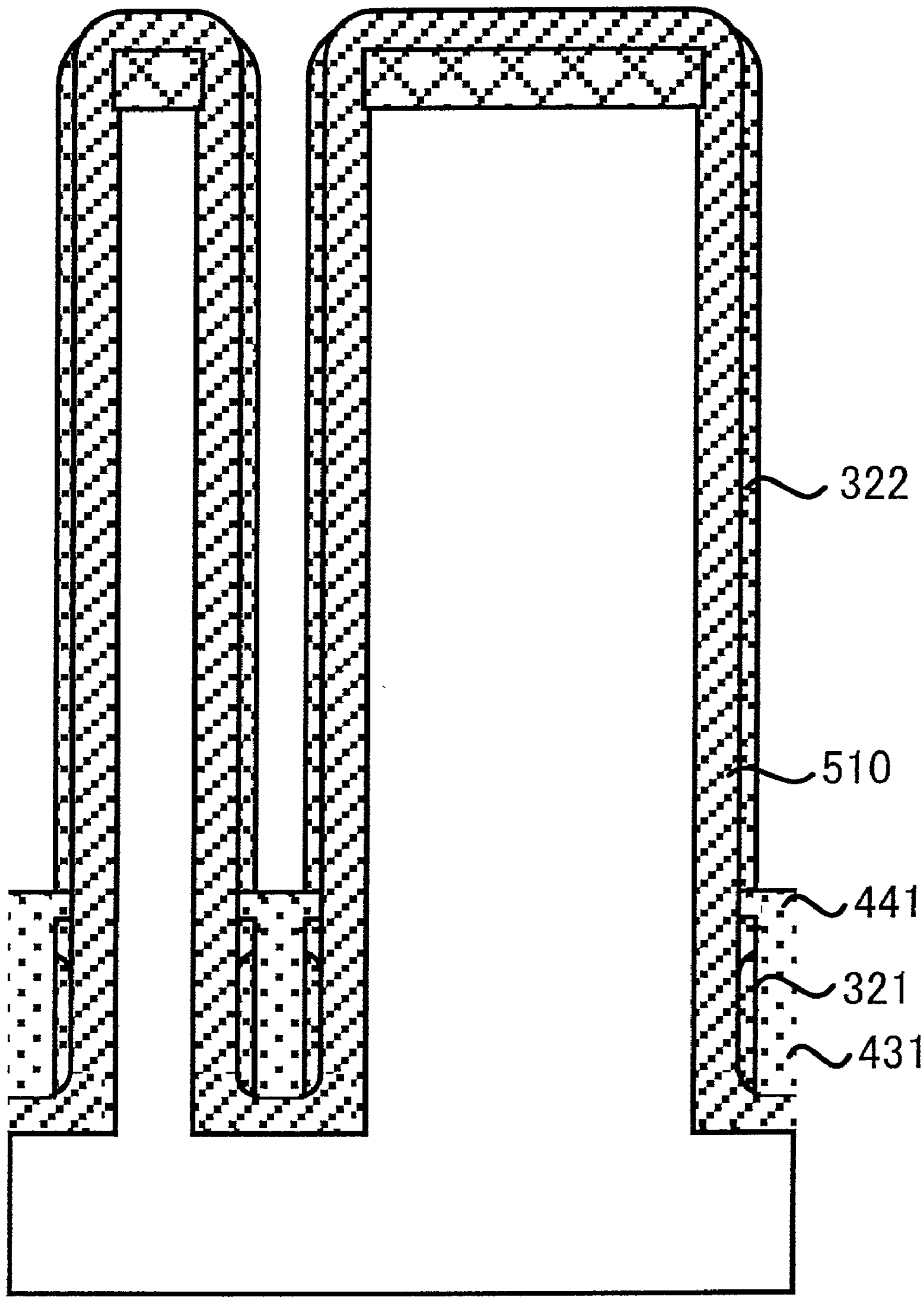
Figure 549:
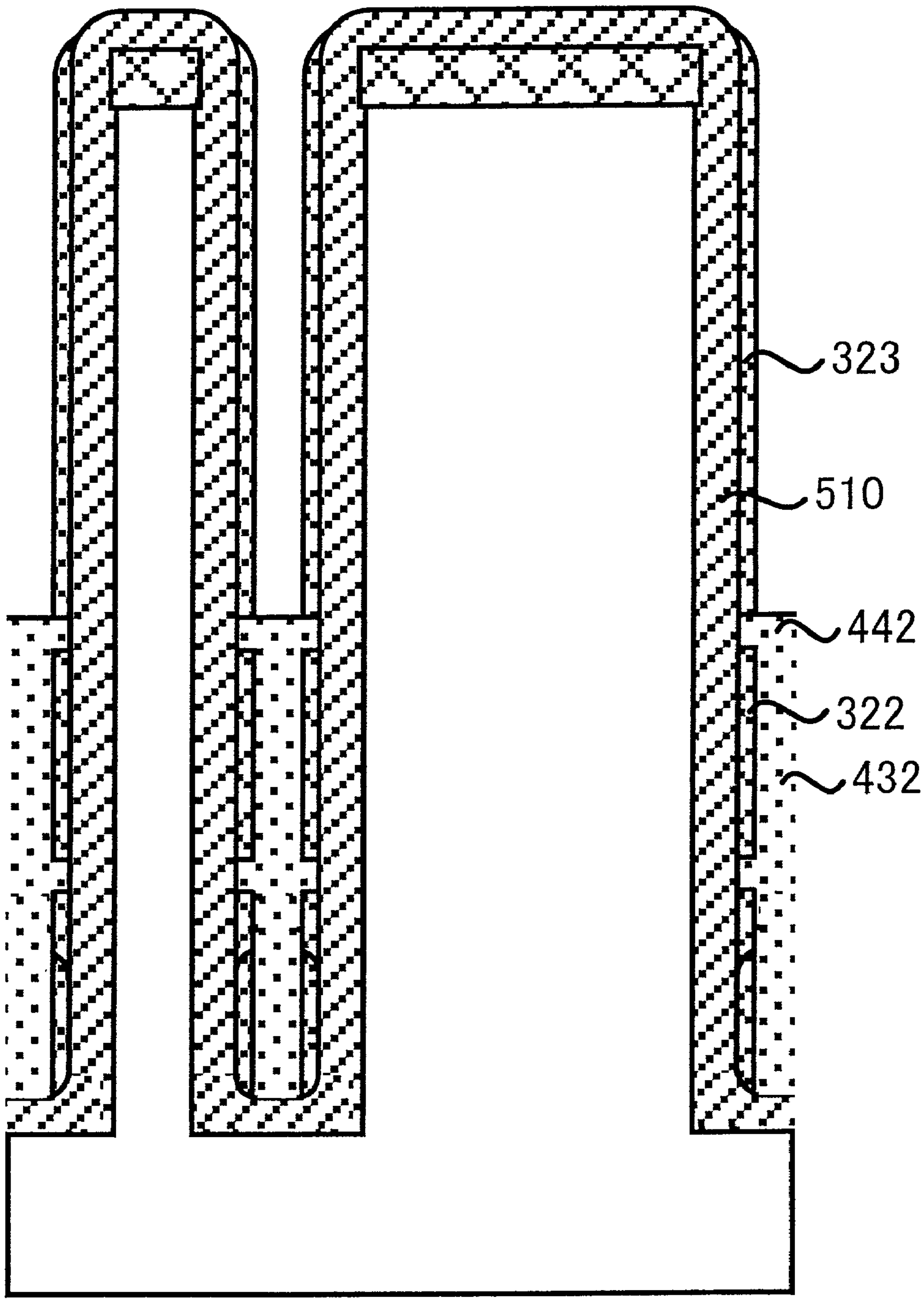
Figure 571:
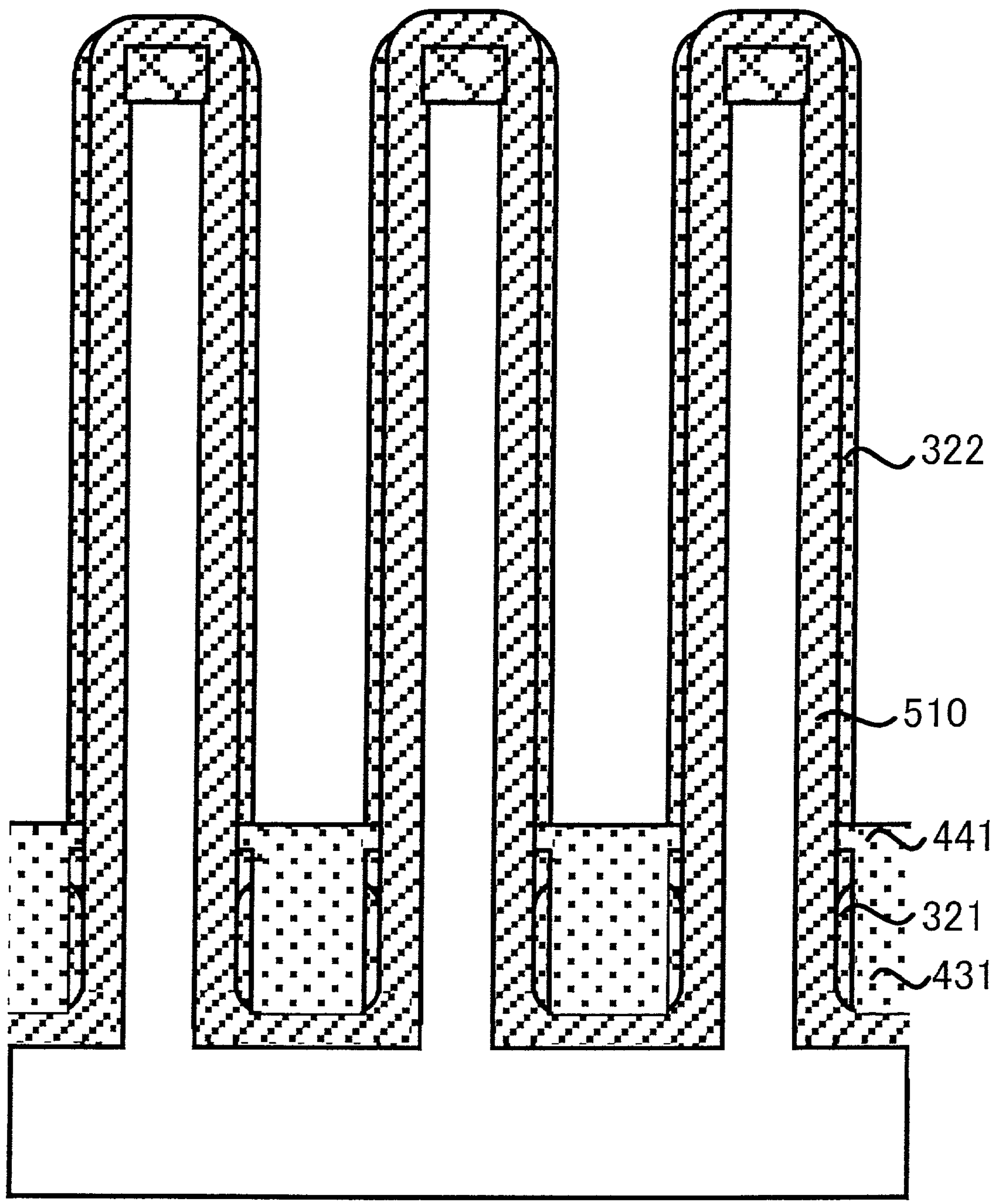

Likewise, a silicon nitride film (a fourth insulating film) 322 is deposited to a thickness of 5 to 50 nm by CVD. The silicon nitride film 322 is etched by reactive ion etching to remain in the form of a sidewall spacer on the sidewall of the polysilicon film 510 (FIG. 548 and FIG. 571).

Figure 572:
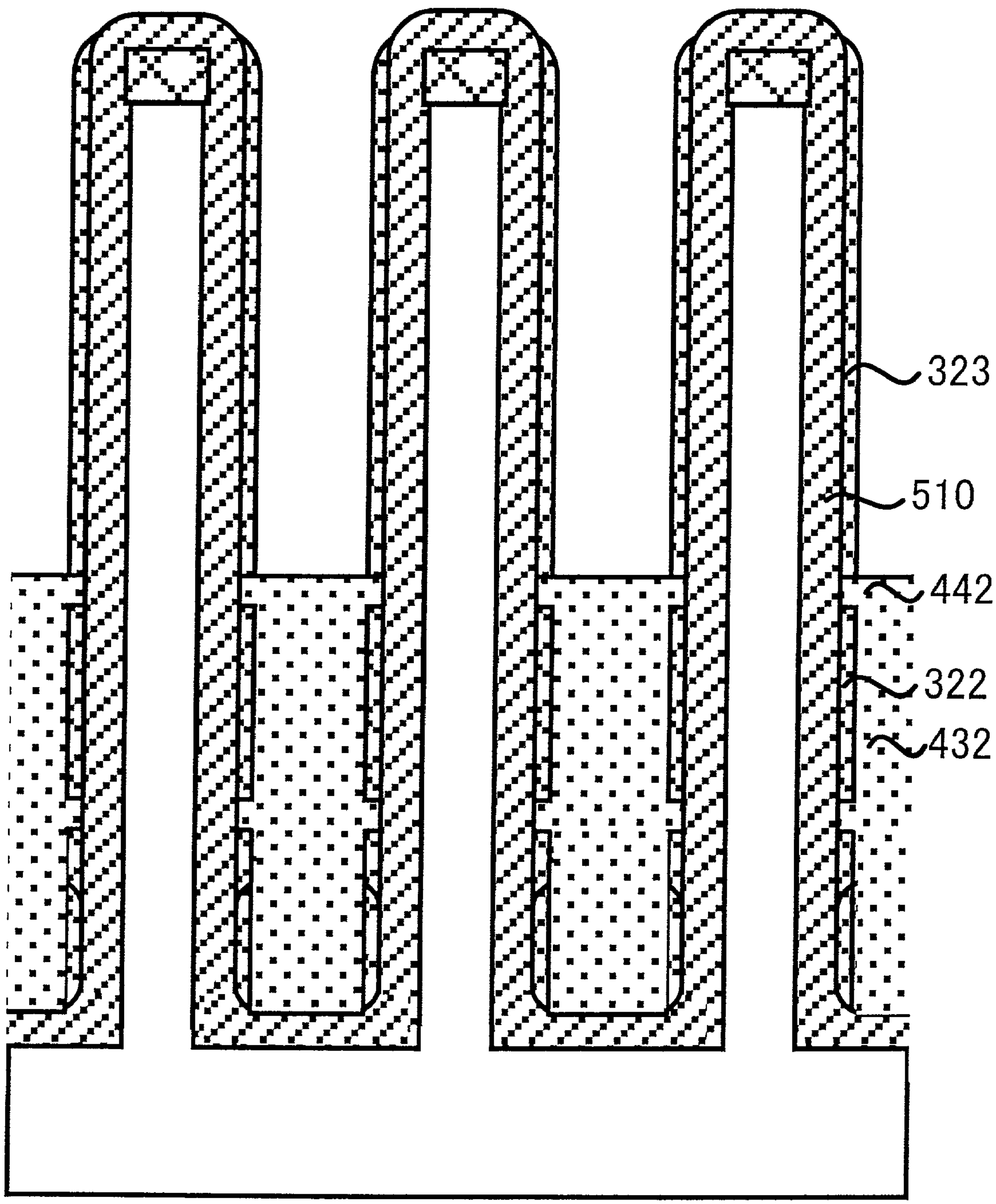

In the same manner as described above, a silicon oxide film (a fifth insulating film) 432 is buried and a silicon oxide film (a sixth insulating film) 442 is disposed on the top of the silicon nitride film 322 in the sidewall spacer form. Then, a silicon nitride film (a fourth insulating film) 323 is formed in the form of a sidewall spacer on the sidewall of the polysilicon film 510 in the same manner as described above (FIG. 549 and FIG. 572).

Figure 550:
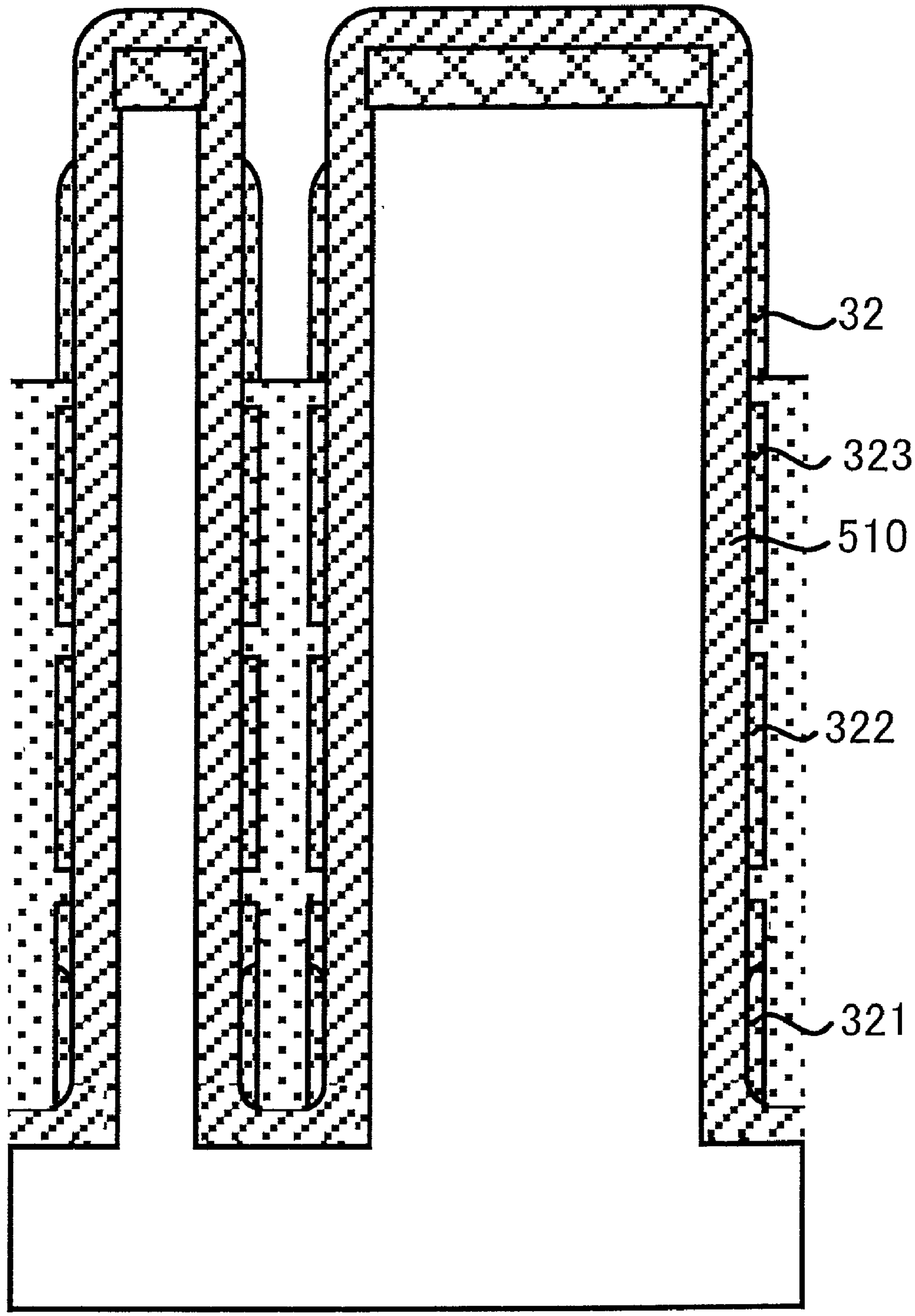
Figure 573:
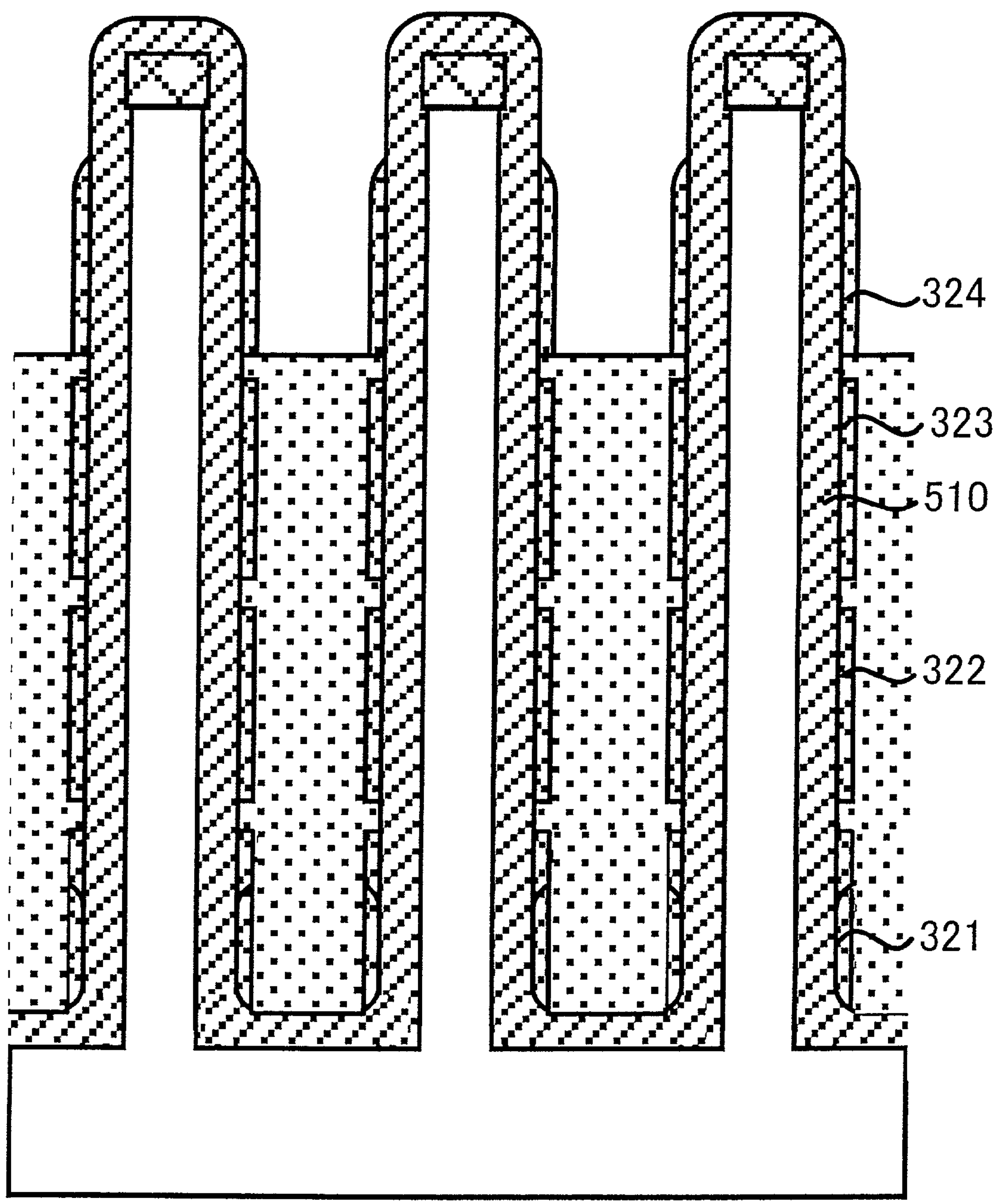

By repeating these steps, a plurality of sidewall spacers are formed of the silicon nitride film (the fourth insulating film) 321 to 324 on the sidewall of the polysilicon film (the first conductive film) 510 (FIG. 550 and FIG. 573).

Figure 551:
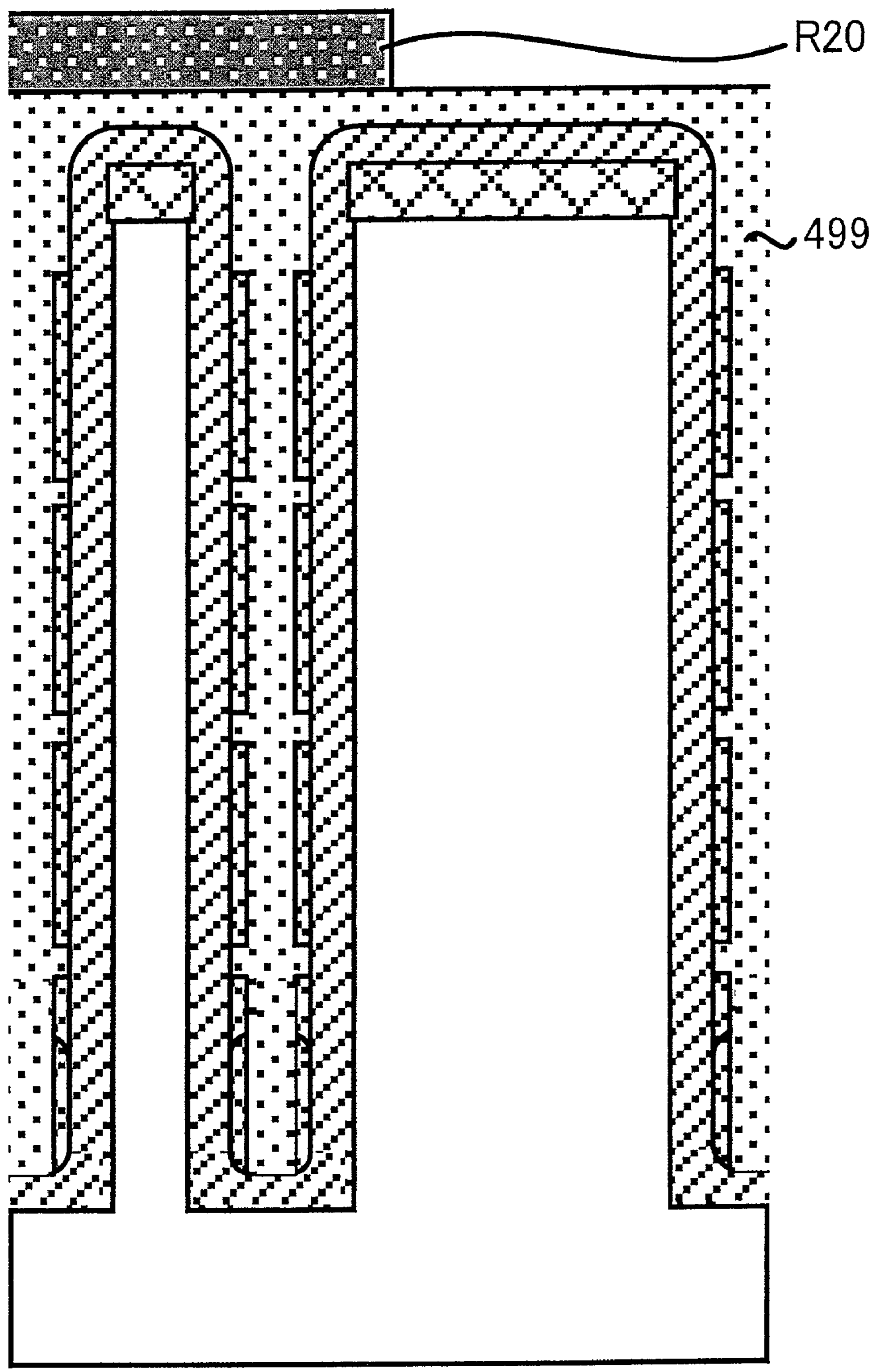
Figure 574:
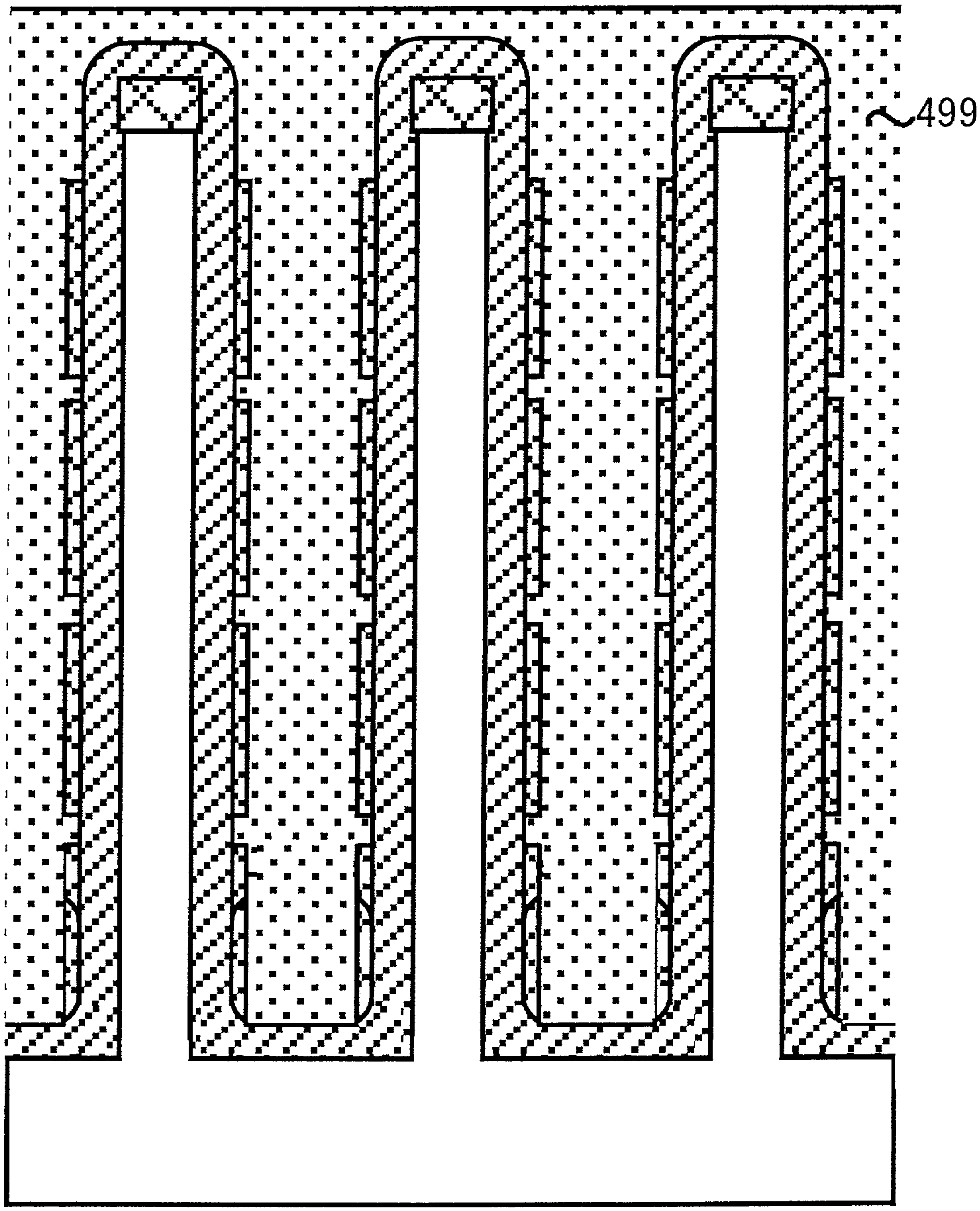

A fifteenth insulating film, for example, a silicon oxide film 449, is deposited to a thickness of 50 to 500 nm. A resist film R20 is formed by patterning by known photolithography (FIG. 551 and FIG. 574).

Figure 552:
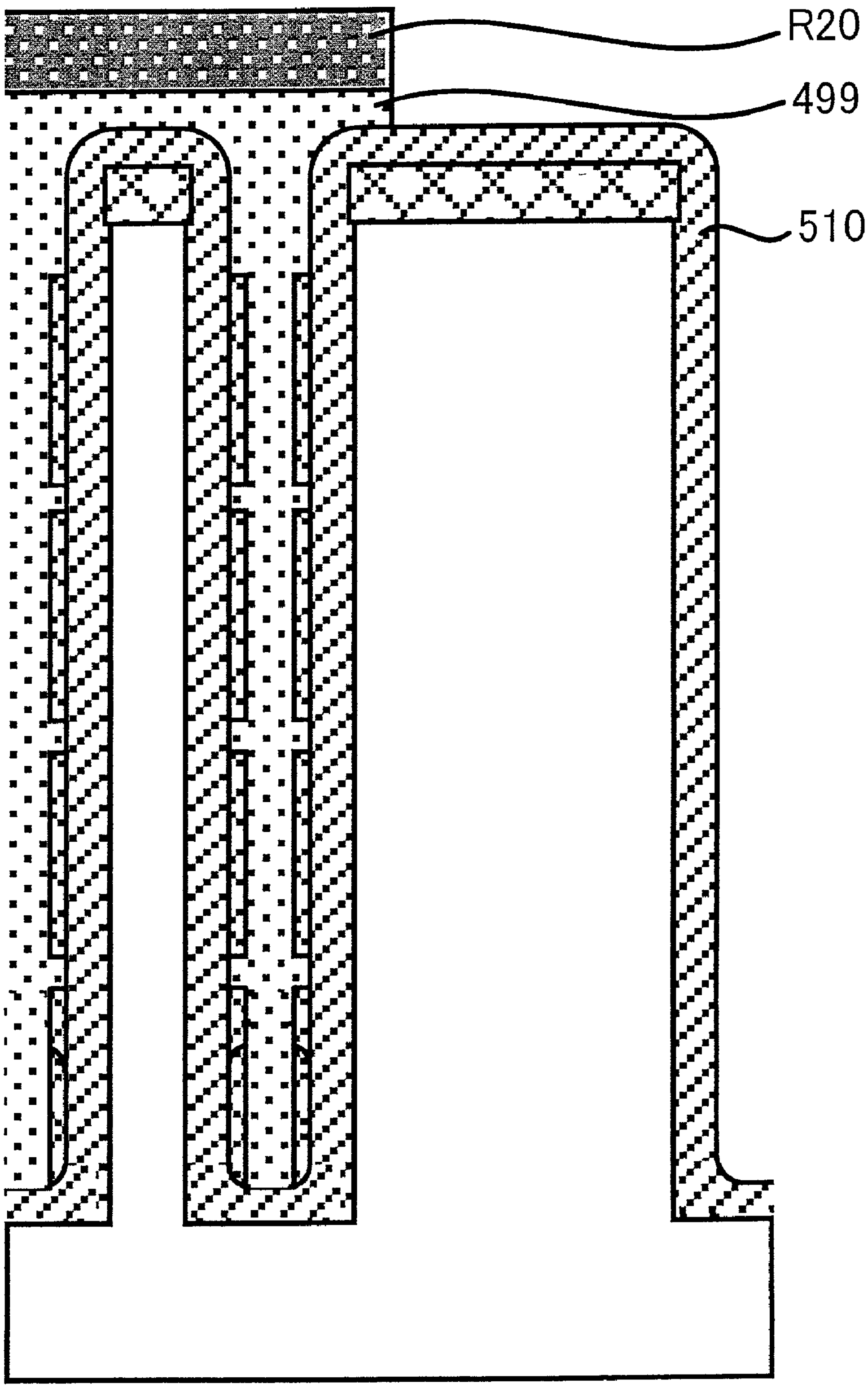
Figure 575:
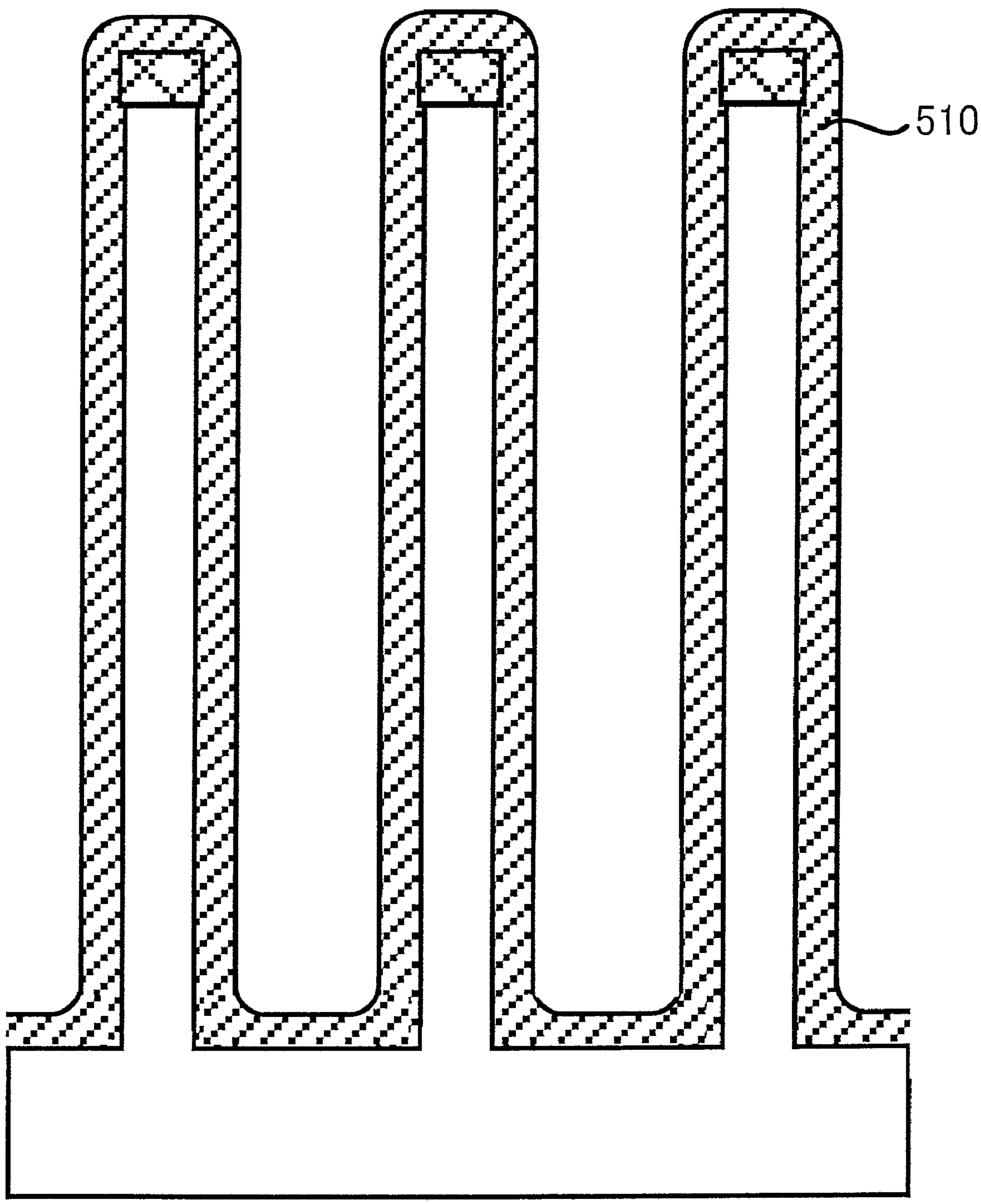

The silicon oxide film (fifteenth insulating film) 449 is etched away from a part of a lead-out portion of a first wiring layer which part does not face the array by reactive ion etching using the resist film R20 as a mask (FIG. 552 and FIG. 575).

Subsequently, the polysilicon film (the first conductive film) 510 is etched away.

The silicon oxide film 499 is etched away and the polysilicon film 510 is divided by isotropic etching. By this isotropic etching, a floating gate of the polysilicon film 510 is left on the part of the lead-out portion of the first wiring layer on the array side and the surface of the island-like semiconductor layer 110 is exposed on a side opposite to the array side.

Figure 553:
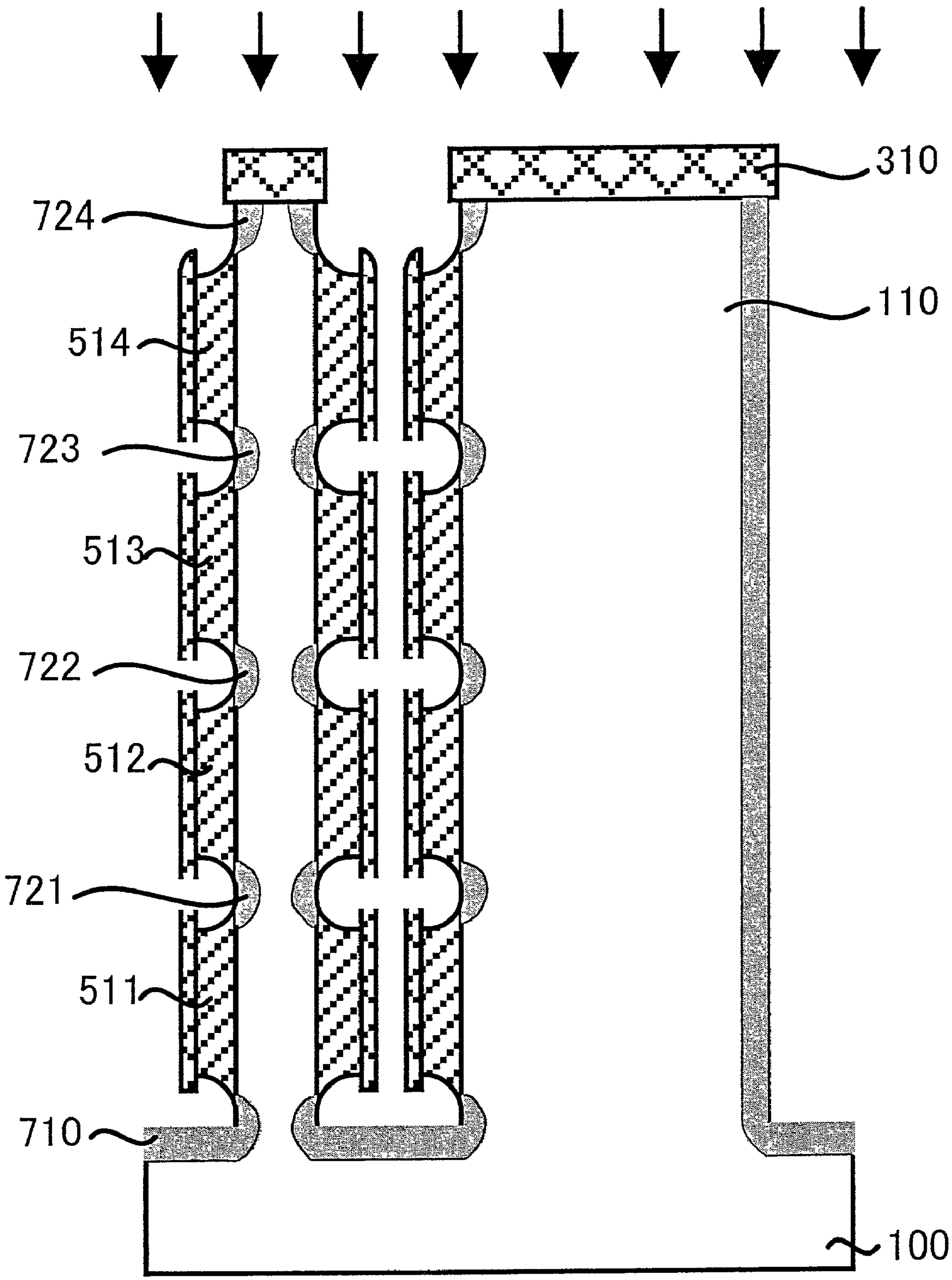
Figure 576:
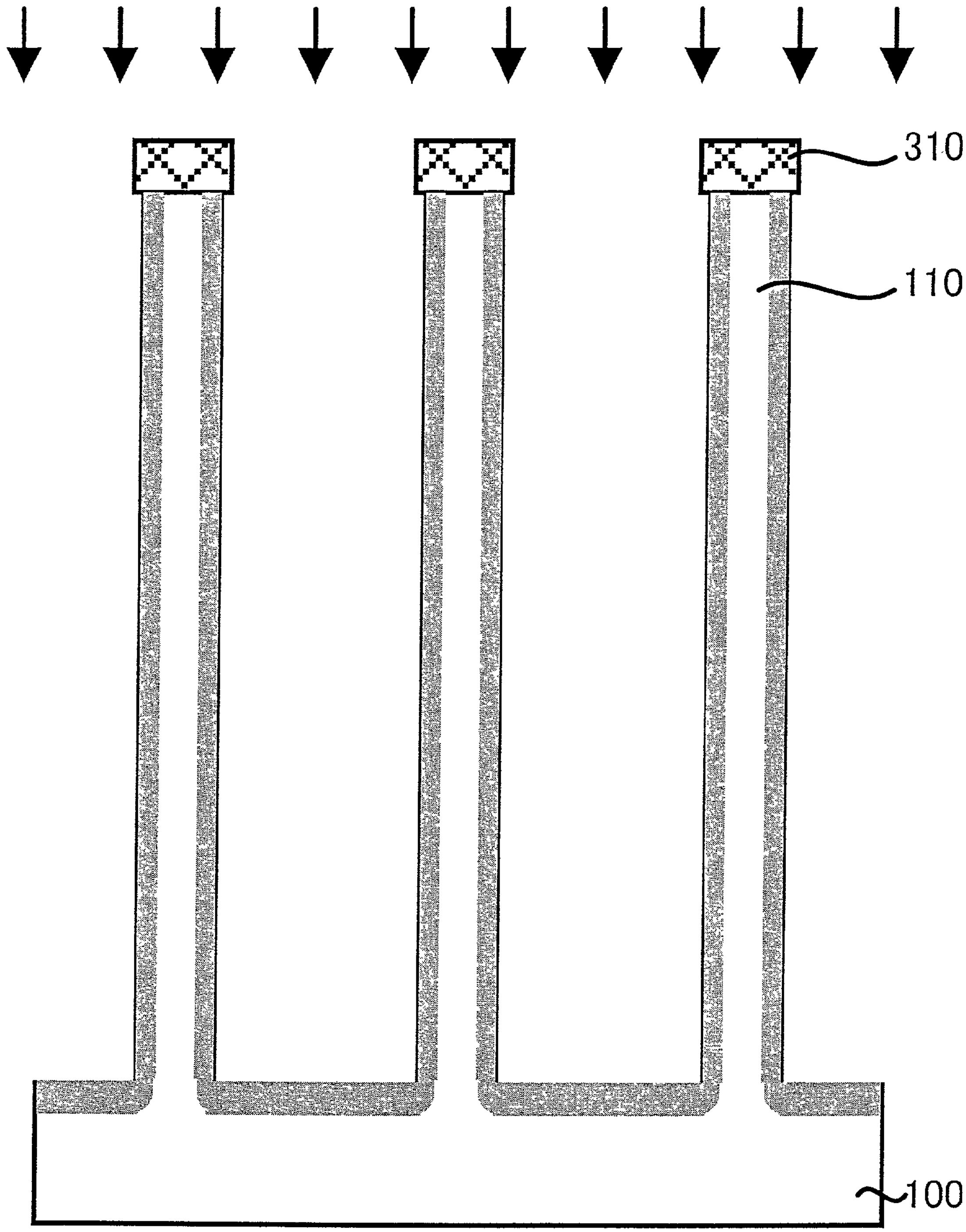

Impurity introduction is carried out into the island-like semiconductor layers 110 and the semiconductor substrate 100 in self-alignment with the divided polysilicon films 511 to 514 and the silicon nitride film (the first insulating film) 310. For example, N-type impurity diffusion layers 710 to 724 are formed at an arsenic concentration of about $1\times10^{18}$ to $1\times10^{21}/cm^3$ using a diffusion process (e.g., solid phase diffusion process, vapor phase diffusion process, etc.). At this time, the impurity diffusion layer 710 to be a first wiring layer may be adjusted about its impurity concentration by ion implantation (FIG. 553 and FIG. 576). For example, the ion implantation may be performed at an implantation energy of 5 to 100 keV at a phosphorus dose of about $1\times10^{13}$ to $1\times10^{15}/cm^2$ in a direction inclined by about 0 to 7°.

Figure 554:
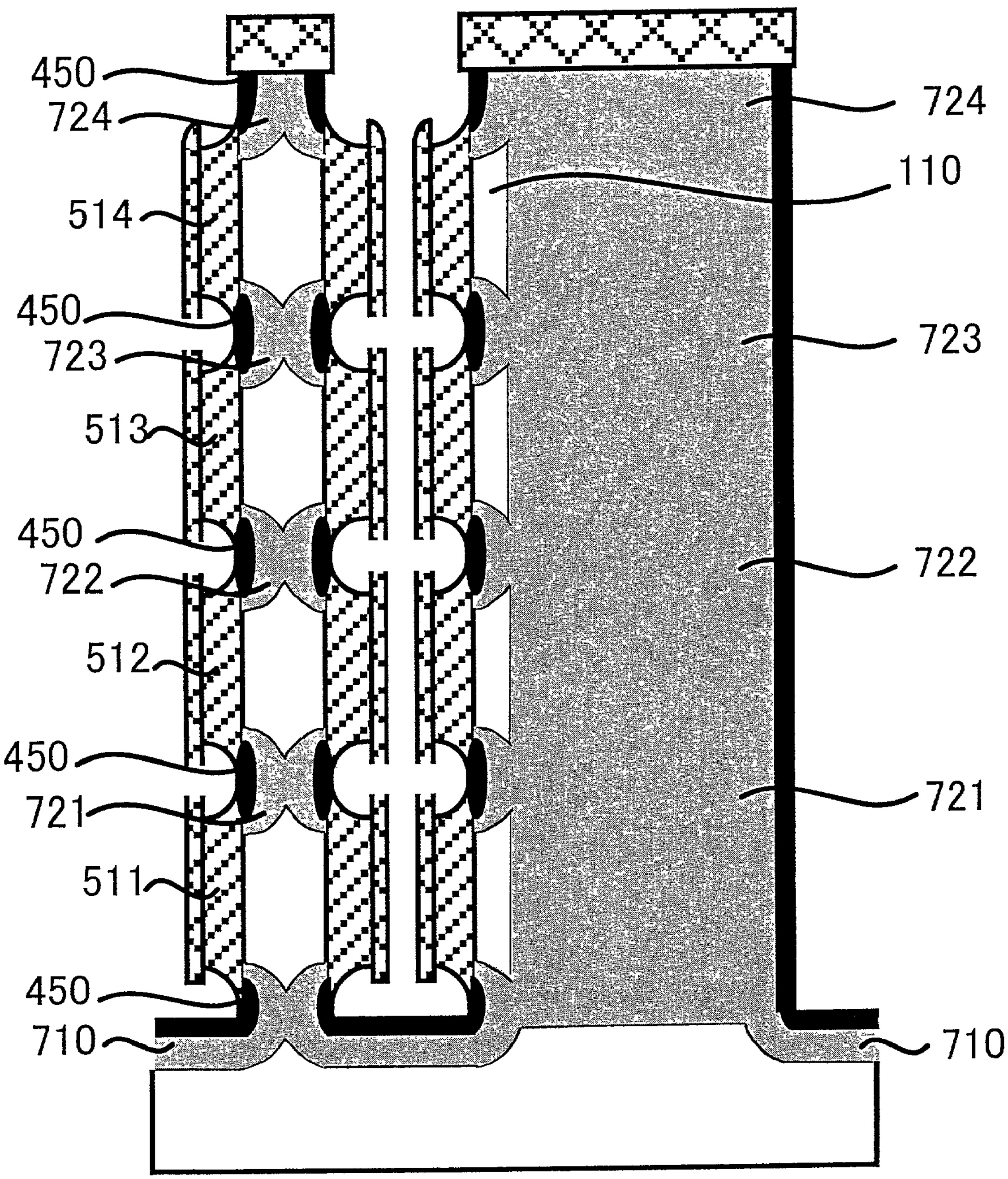
Figure 577:
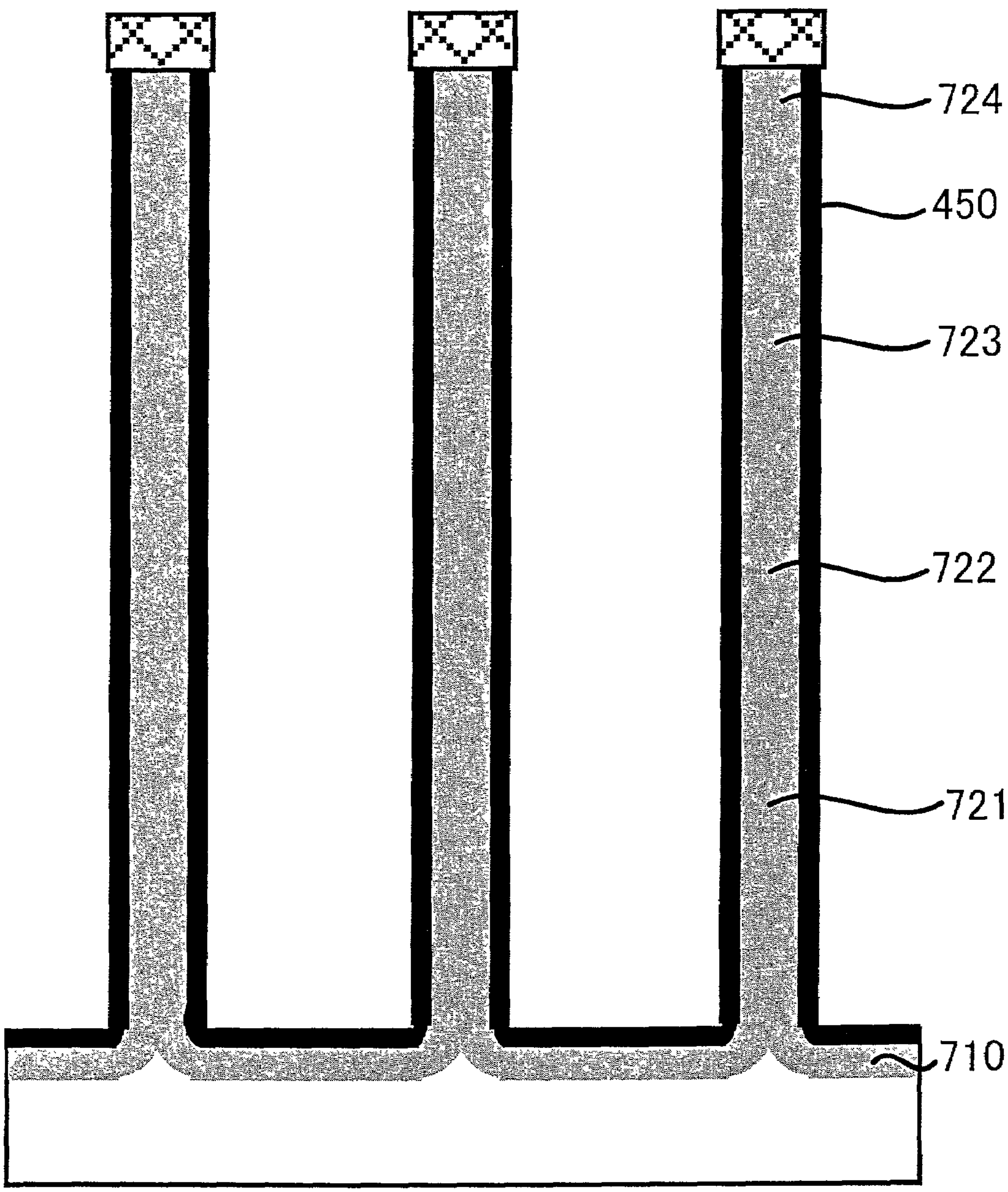

Thereafter, exposed portions of the polysilicon films 511 to 514 are thermally oxidized selectively to form silicon oxide films 450 of 5 to 50 nm thickness which are seventh insulating films, for example. At this time, the impurity is diffused from the impurity diffusion layers 710 to 724 by thermal treatment to electrically float a P-type region of the island-like semiconductor layer 110 and connect all the impurity diffusion layers 710 to 724 together in the lead-out portion of the first wiring layer (FIG. 554 and FIG. 577).

The timing of the impurity introduction to the polysilicon films 511 to 514 is not particularly limited so long as these films become conductive films. For example, the impurity introduction may be performed during the formation of the polysilicon film 510 or during the impurity introduction into the island-like semiconductor layers 110. Thereafter, the sidewall spacers 321 to 324 of the silicon nitride film (the fourth Insulating film) are removed, for example, by isotropic etching. Then, a silicon oxide film (eighth insulating film) 461 is deposited to a thickness of 50 to 500 nm and isotropically and anisotropically etched so that the silicon oxide film 461 is embedded to bury a side portion of the polysilicon 511.

Figure 555:
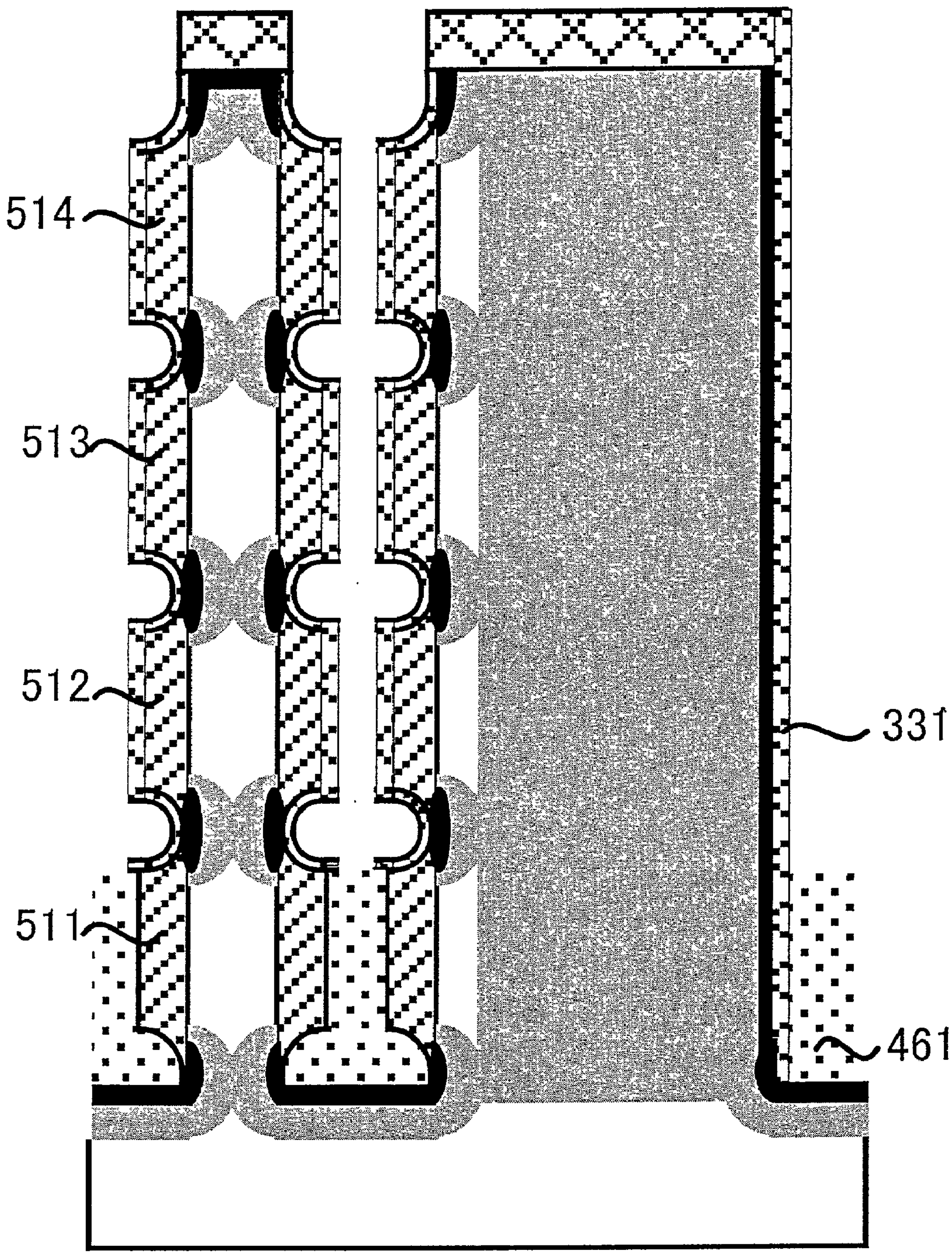
Figure 578:
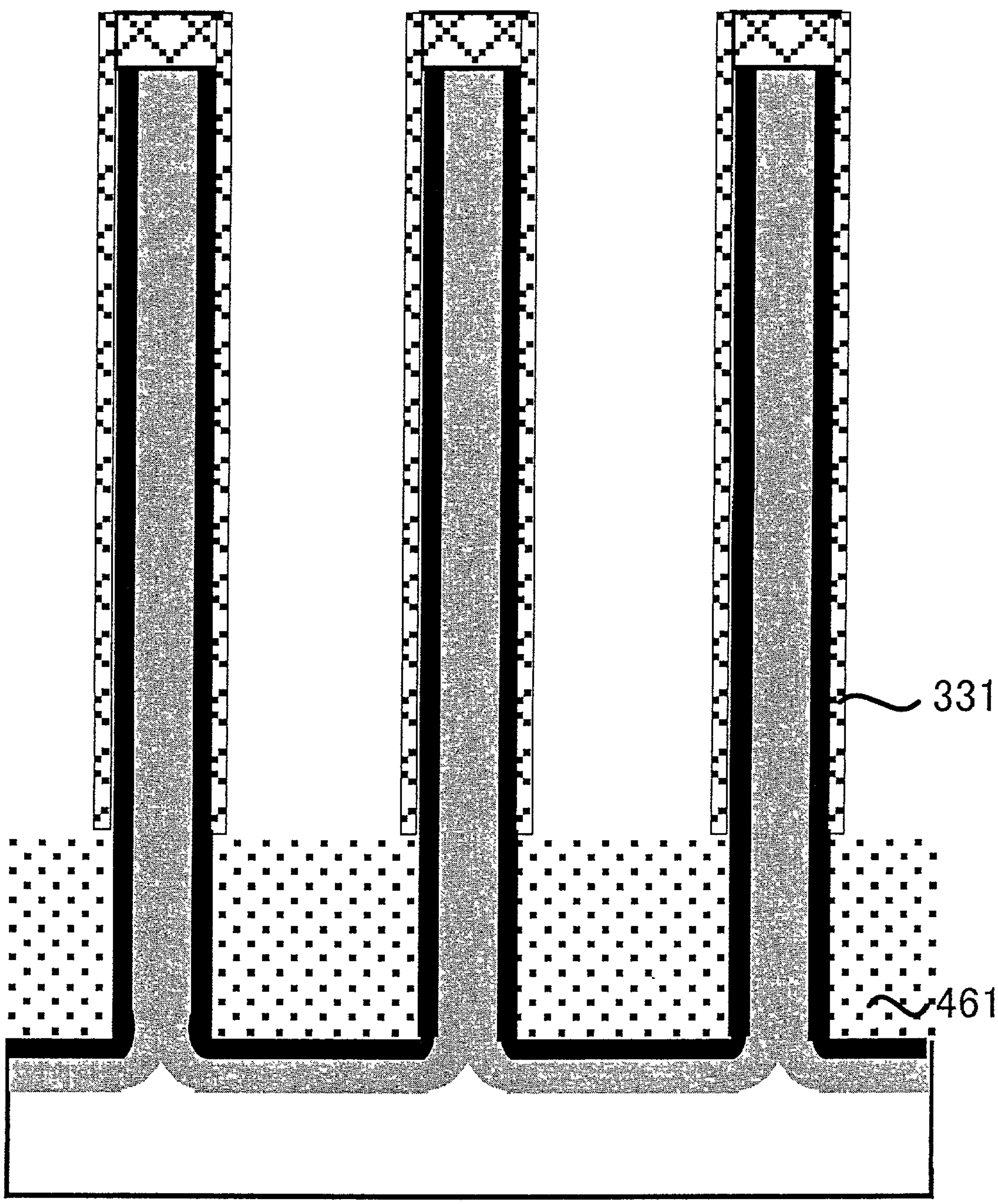

Subsequently, a ninth insulating film, for example, a silicon nitride film 331, is deposited to a thickness of 5 to 50 nm on the polysilicon films (the first conductive films) 512 to 514 and the silicon oxide film (the seventh insulating film) 450 to form sidewall spacers (FIG. 555 and FIG. 578).

Figure 556:
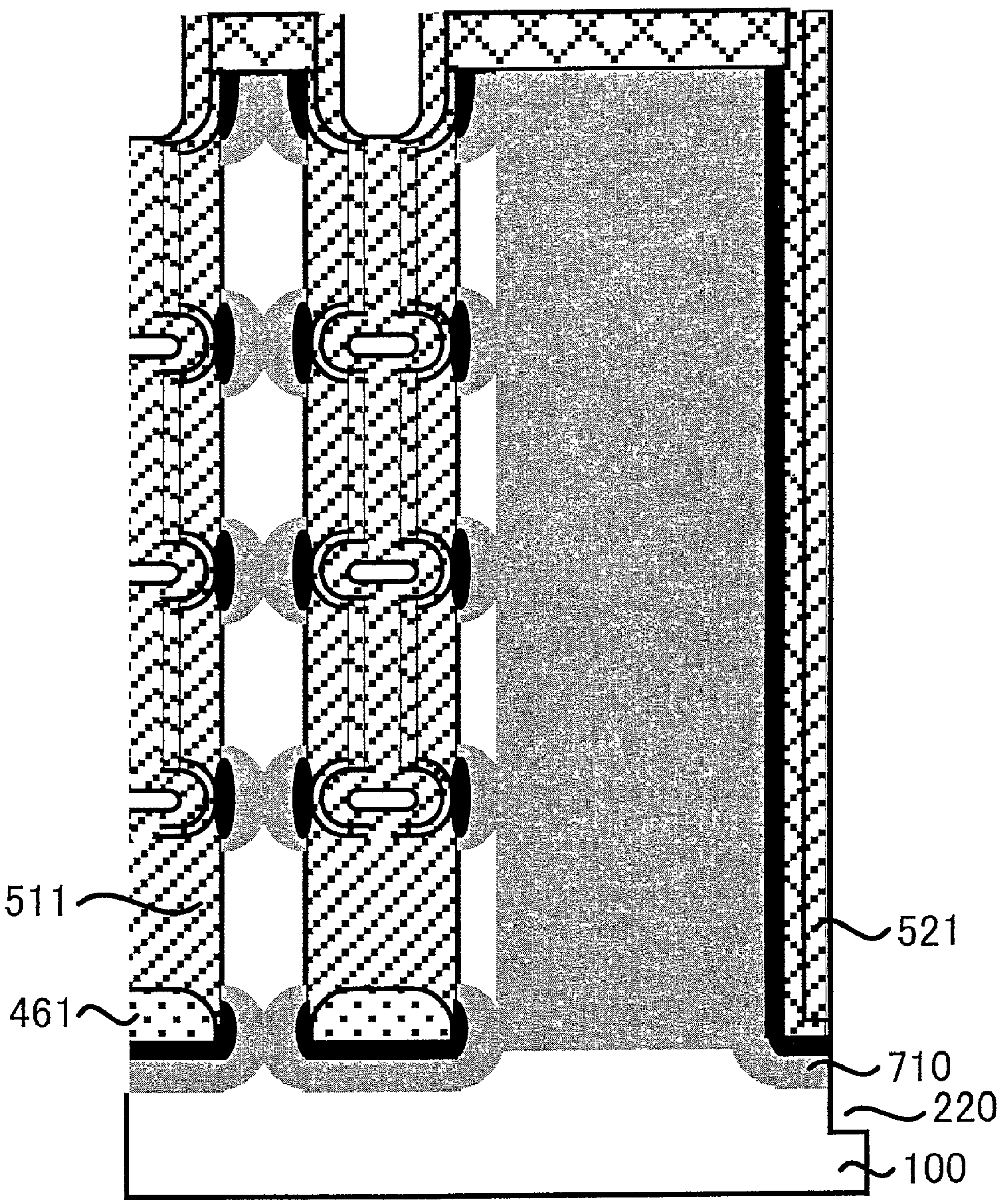
Figure 579:
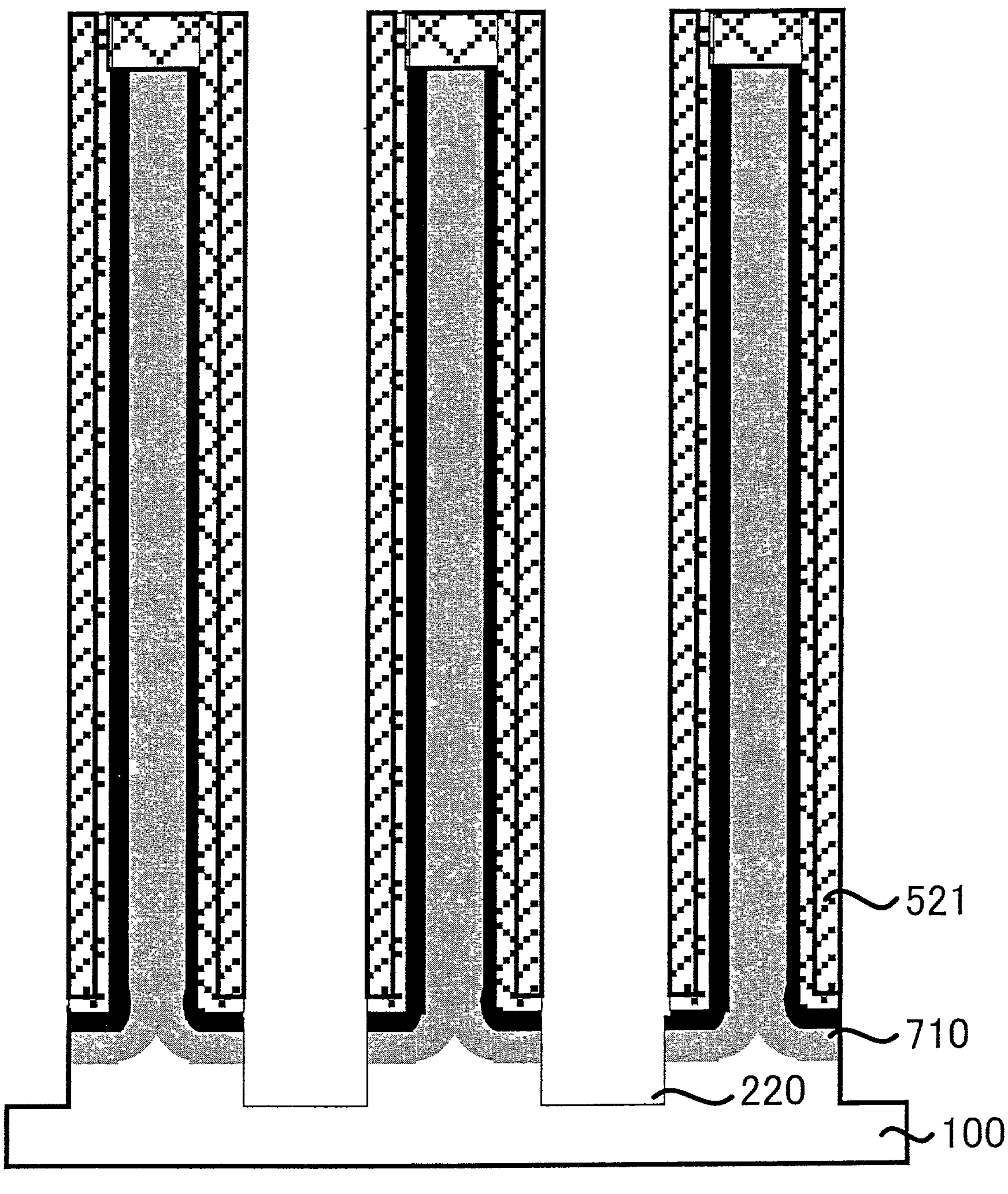

Subsequently, the silicon oxide film 461 is etched back to such a degree that the side portion of the polysilicon film 511 is exposed, and a second conductive film, for example, a polysilicon film 521, is deposited to a thickness of 15 to 150 nm. Then, a second trench 220 is formed in the P-type silicon substrate 100 in self-alignment with the polysilicon film 521 to separate the impurity diffusion layer 710. That is, a separation of the first wiring layer is realized in self-alignment with a separation of the second conductive film (FIG. 556 and FIG. 579).

At this time, the diffusion layer of the lead-out portion of the first wiring layer is not separated from and is electrically connected to the first wiring layer because the lead-out portion of the first wiring layer has a width corresponding to the floating gate left on the array side. For avoiding the separation of the diffusion layer of the lead-out portion of the first wiring layer from the first wiring layer, for example, in FIG. 1, the interval between the array and the lead-out portion of the first wiring layer in a C–C' direction may be set shorter than the interval between the island-like semiconductor layers of the array in the C–C' direction for electric connection.

Figure 557:
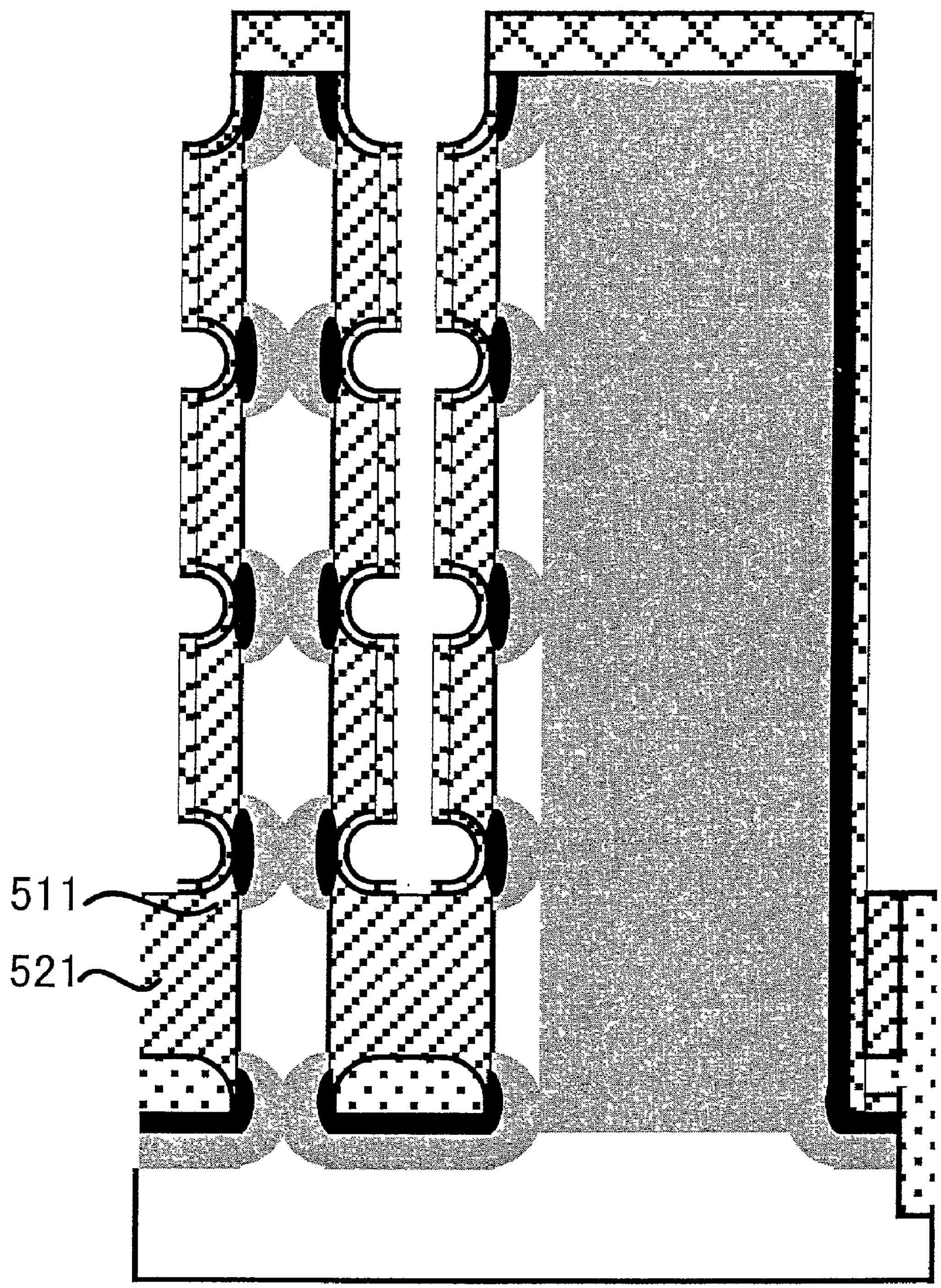
Figure 580:
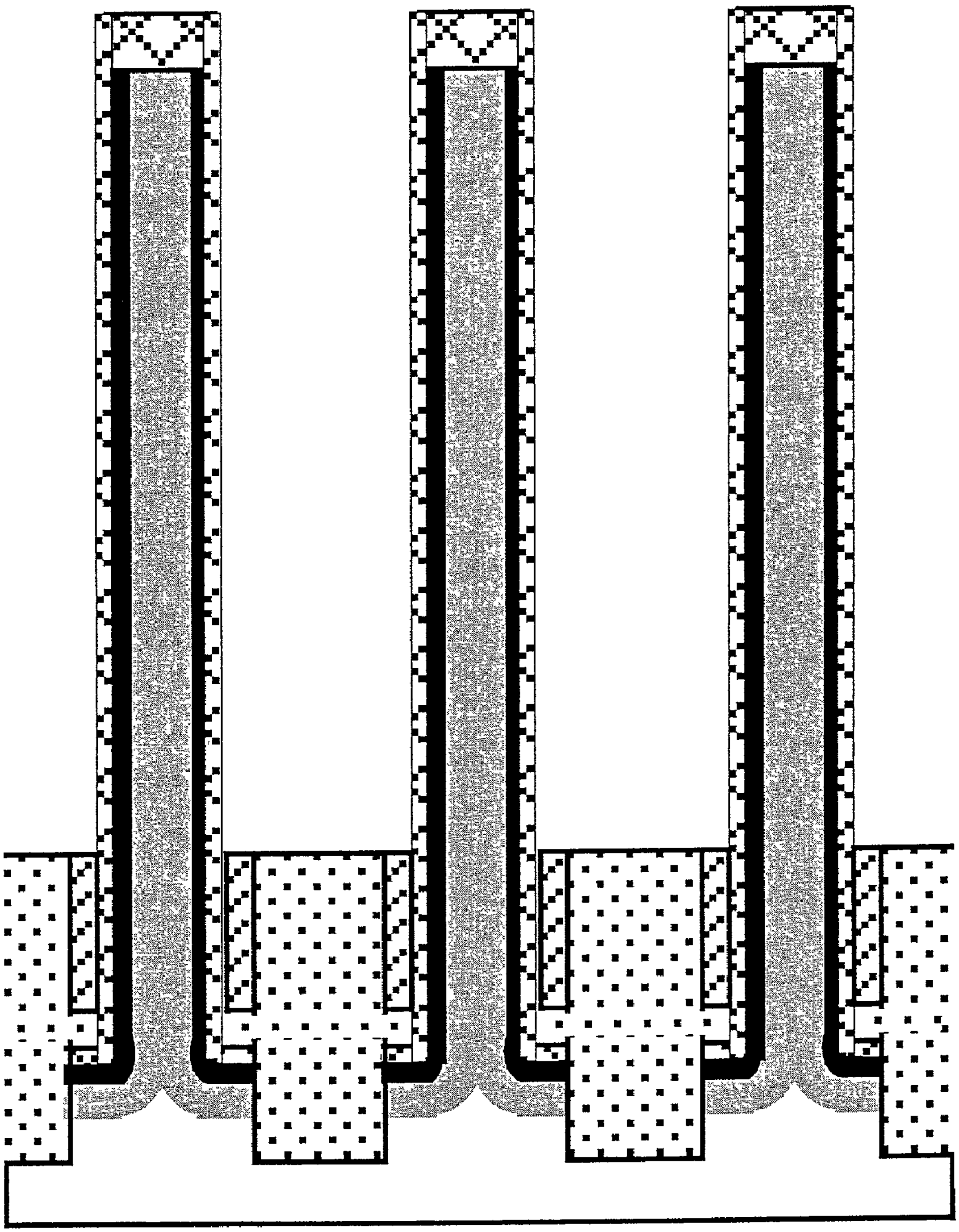

Subsequently, the polysilicon film 521 is etched back to such a degree that the polysilicon film 521 is able to contact the polysilicon film 511 to form a selection gate (FIG. 557 and FIG. 580). At this time, by setting the interval between the island-like semiconductor layers 110 in the C–C' direction in FIG. 1 to a predetermined value or smaller, the polysilicon film 521 is formed into a second wiring layer to be a selection gate line continuous in the direction without need to use a masking process.

The sidewall spacer of the silicon nitride film (the ninth insulating film) 331 is removed by isotropic etching and an interlayer insulating film 612 is formed on exposed surfaces of the polysilicon films 512 to 514. This interlayer insulating film 612 may be formed of an ONO film, for example. More particularly, a silicon oxide film of 5 to 10 nm thickness is formed on the surface of the polysilicon film by thermal oxidization, and then, a silicon nitride film of 5 to 10 nm thickness and a silicon oxide film of 5 to 10 nm thickness are formed sequentially by CVD.

Figure 558:
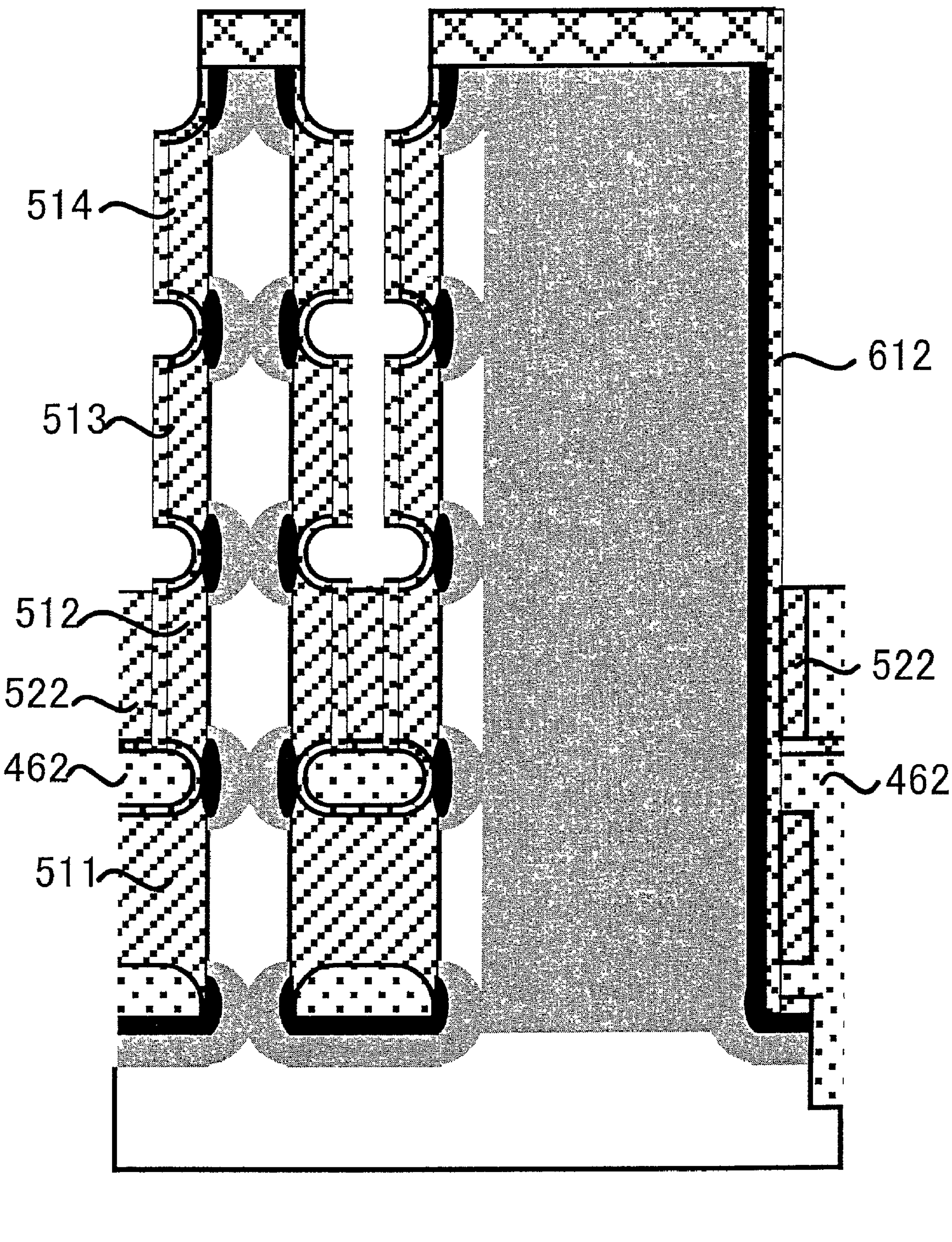
Figure 581:
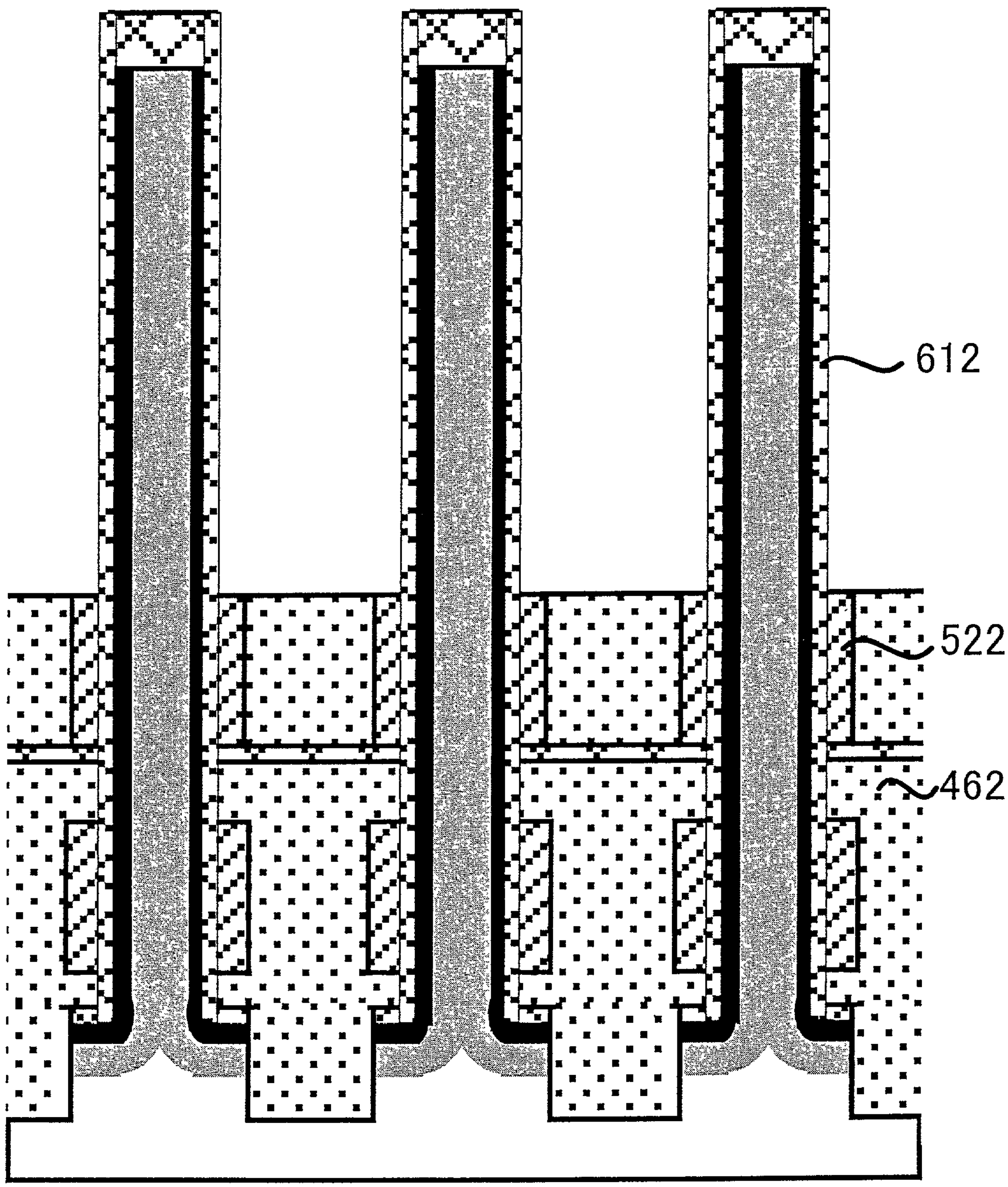

Subsequently, likewise, a polysilicon film (a second conductive film) 522 is deposited to a thickness of 15 to 150 nm and etched back so that the polysilicon film 522 is disposed on a side portion of the polysilicon film (the first conductive film) 512 with intervention of the interlayer insulating film 612 (FIG. 558 and FIG. 581). At this time, by setting the interval between the island-like semiconductor layers 110 in the C–C' direction in FIG. 1 to a predetermined value or smaller, the polysilicon film 522 is formed into a third wiring layer to be a control gate line continuous in the direction without need to use a masking process.

Figure 559:
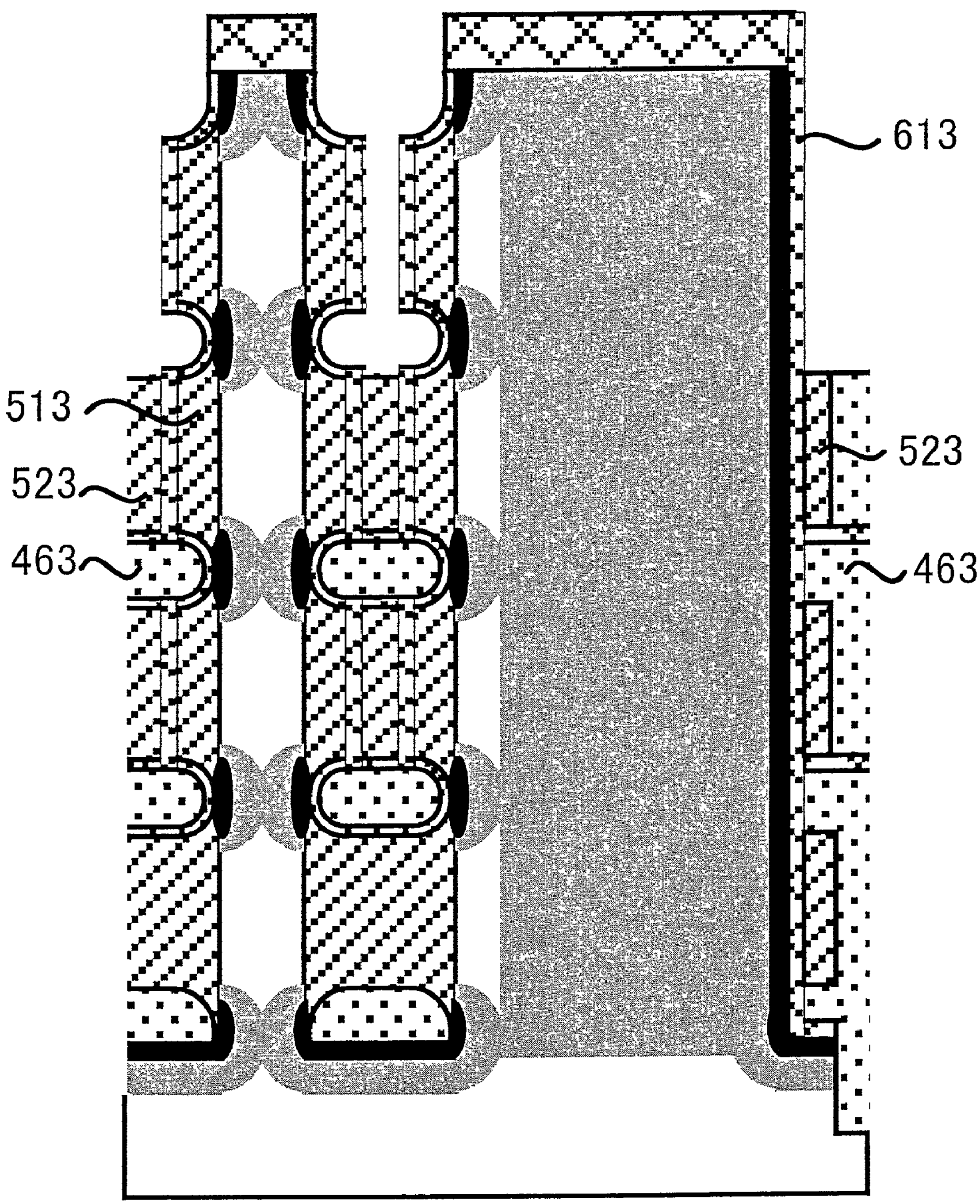
Figure 582:
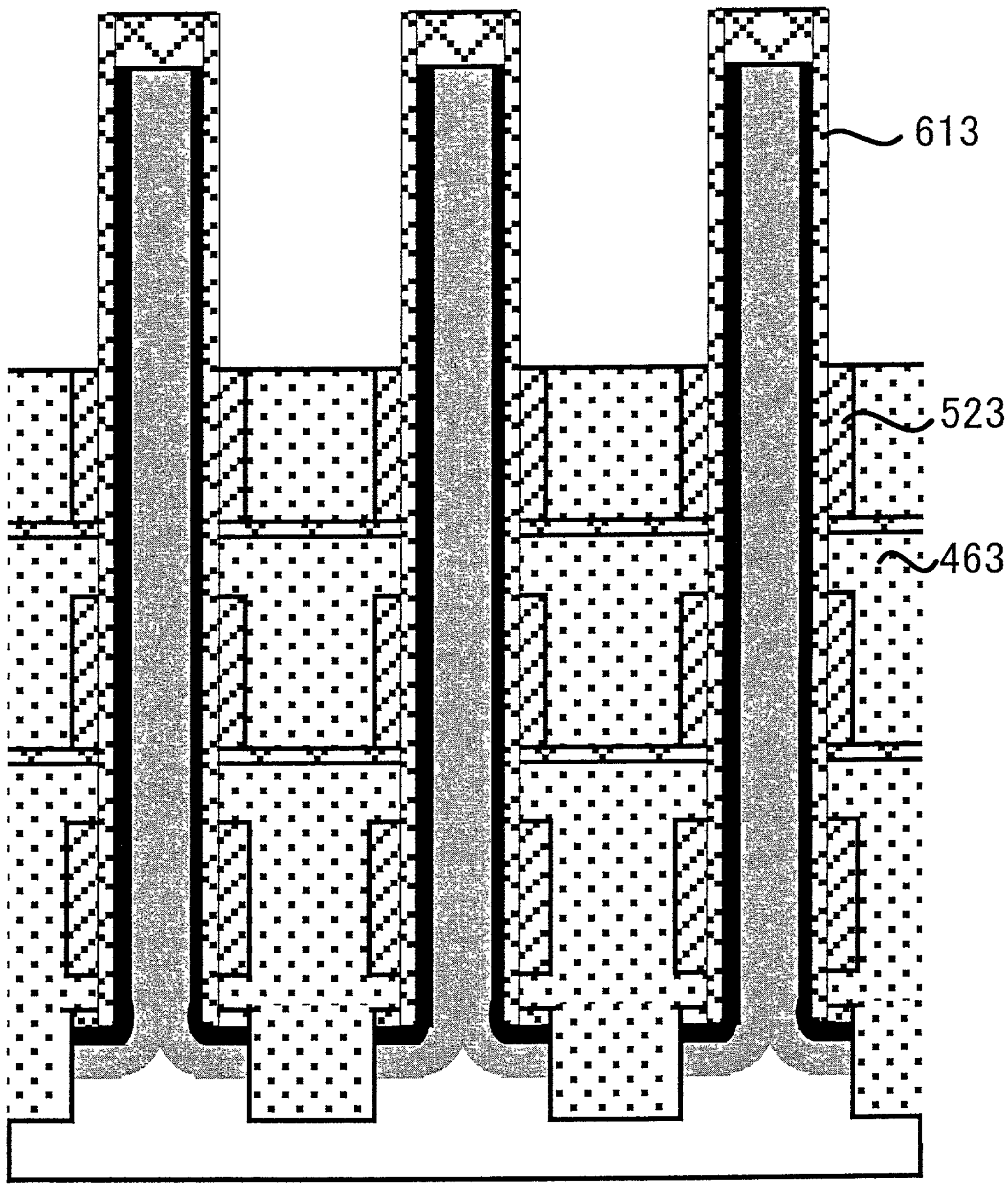

By repeating likewise, a polysilicon film (a second conductive film) 523 is disposed on the side portion of the polysilicon film (the first conductive film) 513 with intervention of an interlayer insulating film 613 (FIG. 559 and FIG. 582).

With regard to the polysilicon film 514 which is the topmost first conductive film, a polysilicon film (a second conductive film) 524 is etched back to such a degree that the polysilicon film 524 is able to contact the polysilicon film 514, in the same manner as the polysilicon film 511 which is the bottommost first conductive film is formed.

A tenth insulating film, for example, a silicon oxide film 465 is deposited to a thickness of 100 to 500 nm on the top of the polysilicon film 524. The top of the island-like semiconductor layer 110 provided with the impurity diffusion layer 724 and the top of the lead-out portion of the first wiring layer are exposed by etch-back or CMP. A fourth wiring layer 840 is connected as a bit line to the top of the island-like semiconductor layer 110 so that its direction crosses the direction of the second or third wiring layer (FIG. 560 and FIG. 583).

Thereafter, by known techniques, an interlayer insulating film is formed, and a contact hole and metal wiring are formed. Further, in contrast to the structure shown in FIG. 583, metal wiring may be formed in which the first wiring layer is lead out one by one.

Thereby, a semiconductor memory is realized which has a memory function according to a charged state in the charge storage layer which is the floating gate made of the polysilicon film (the first conductive film) and in which the first wiring layer is lead out to the upper face of the island-like semiconductor layer without electrically contacting other wiring layers.

Figure 561:
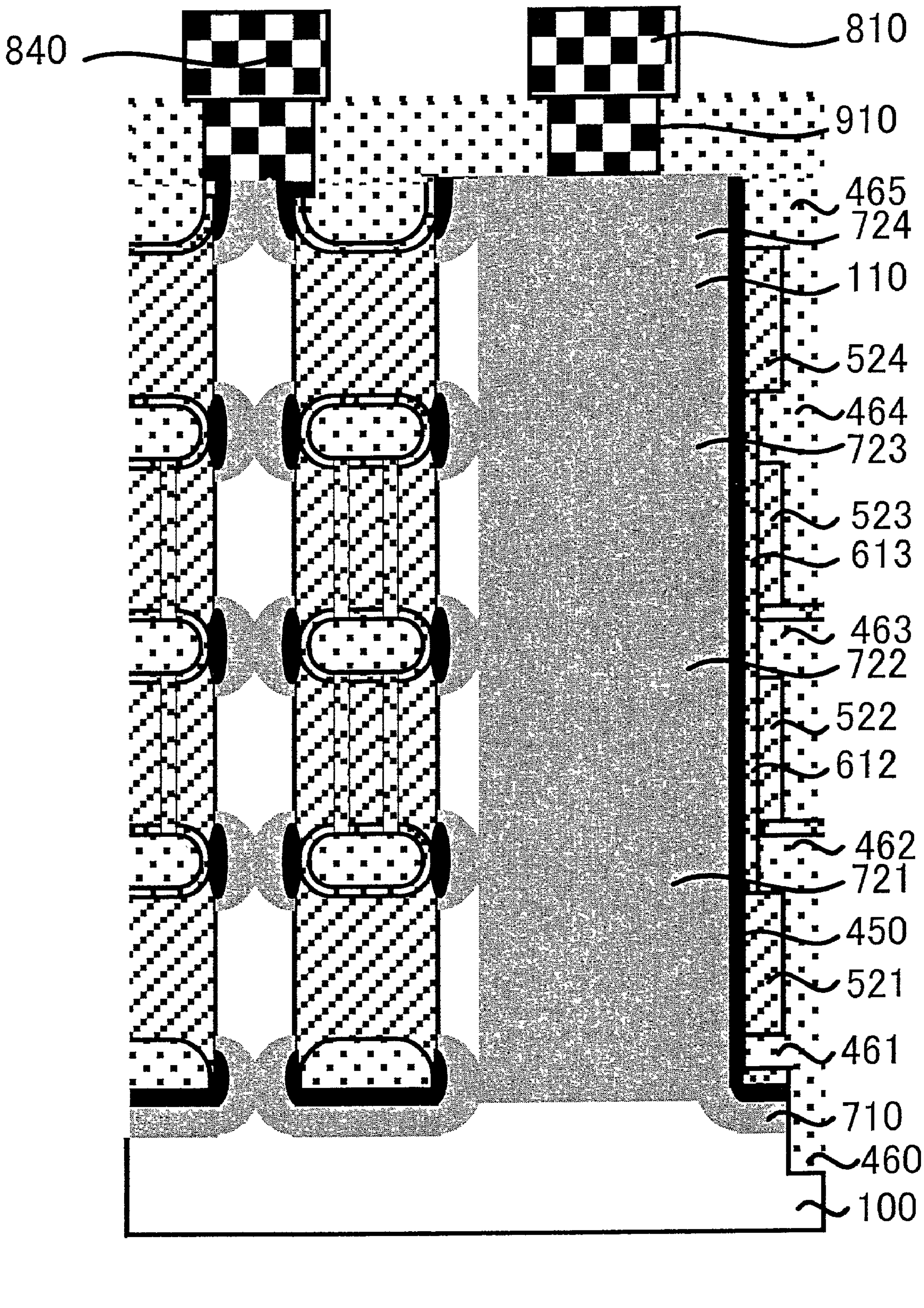
Figure 562:
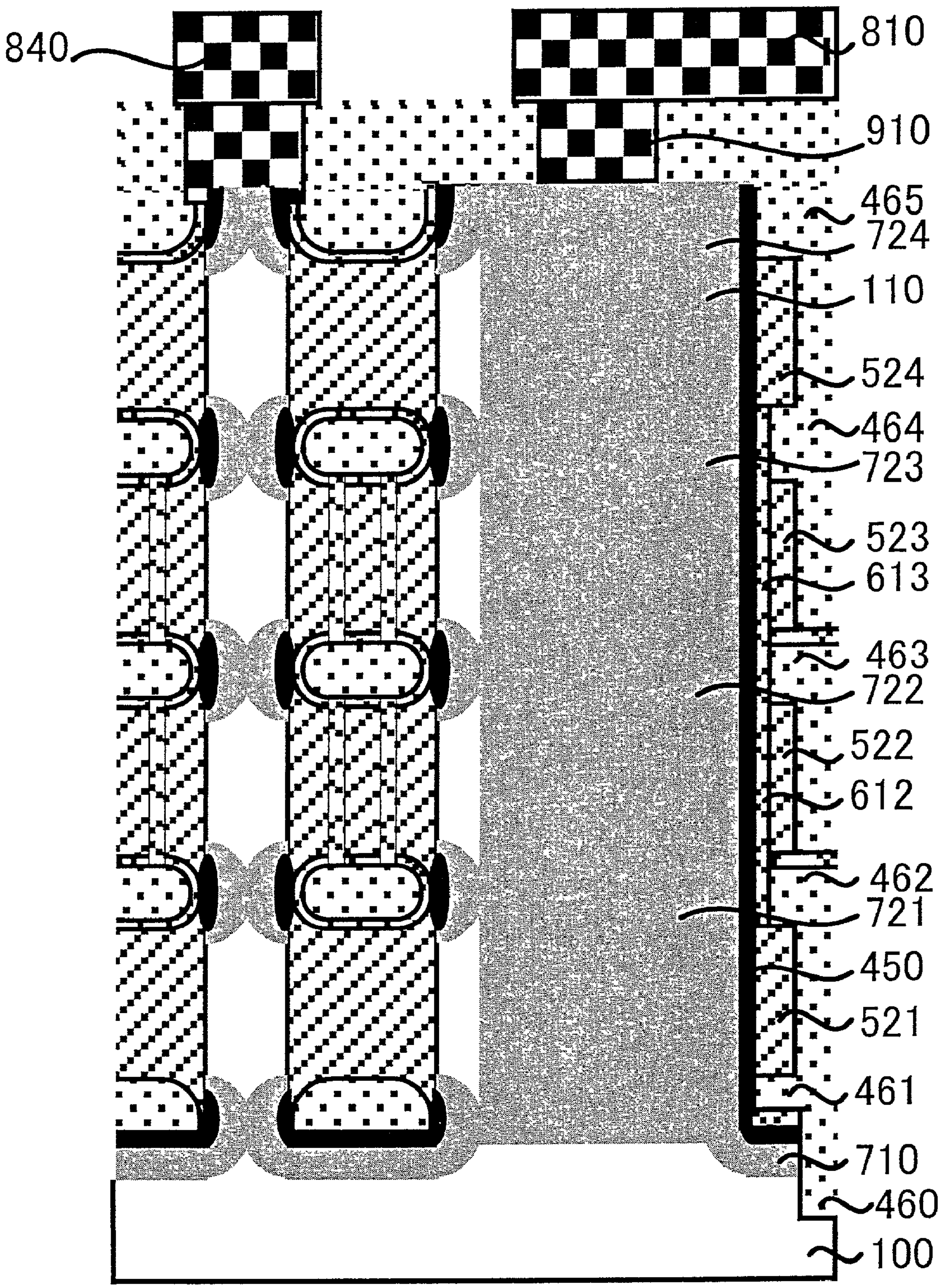
Figure 584:
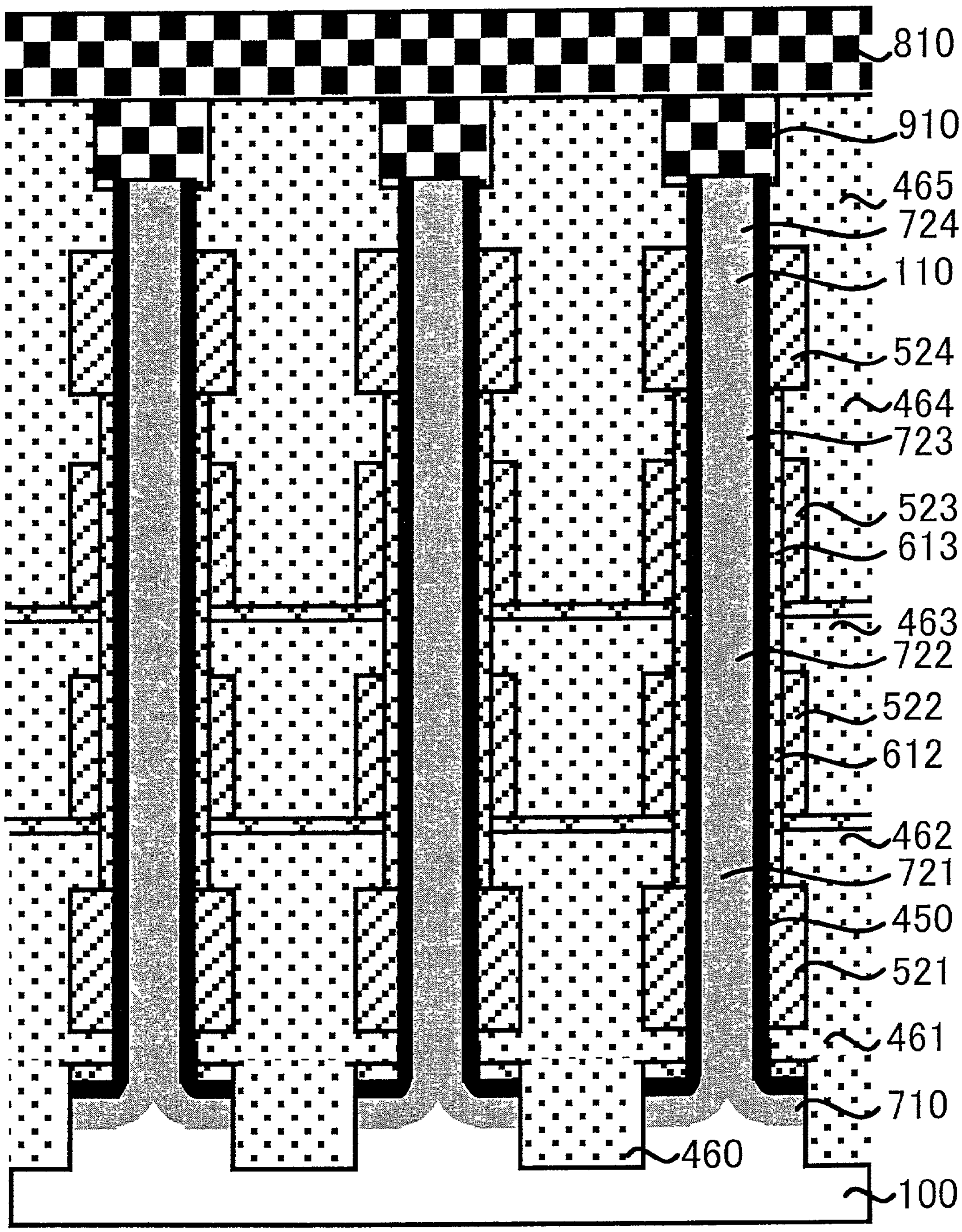
Figure 585:
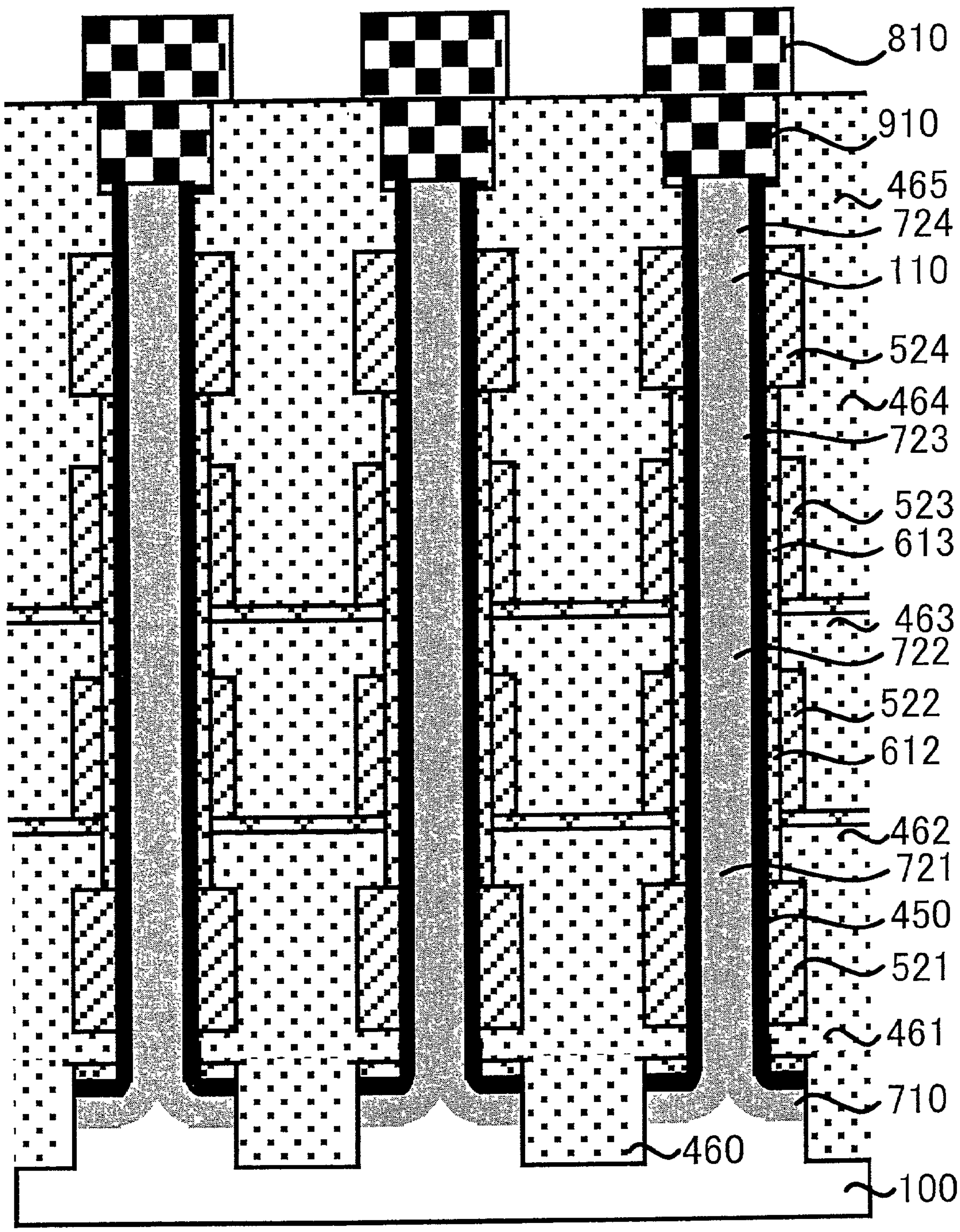

Before the formation of the fourth wiring layer, the interlayer insulating film may be formed by a known technique, etch-back or CMP may be performed as required, a first contact 910 may be formed and then the fourth wiring layer may be formed (FIG. 561 and FIG. 584). Further, in contrast to the structure shown in FIG. 561 and FIG. 584, metal wiring may be formed in which the first wiring layer is lead out one by one (FIG. 562 and FIG. 585).

PRODUCTION EXAMPLE 21

This example shows an example of production process for producing a semiconductor memory as formed in Production Examples 1 to 9 in which the selection gates and the floating gates of the transistors are formed at the same time. In this example, is shown a production process for forming terminals which electrically connect the second and third wiring layers to a peripheral circuit, respectively.

Such a semiconductor memory may be produced by the following production process. FIGS. 586 to 605, FIGS. 606 to 613 and FIGS. 614 to 636 are sectional views taken on line E–E', line F–F' and G–G', respectively, in FIG. 1 which is a plan view illustrating a memory cell array of EEPROM.

Figure 586:
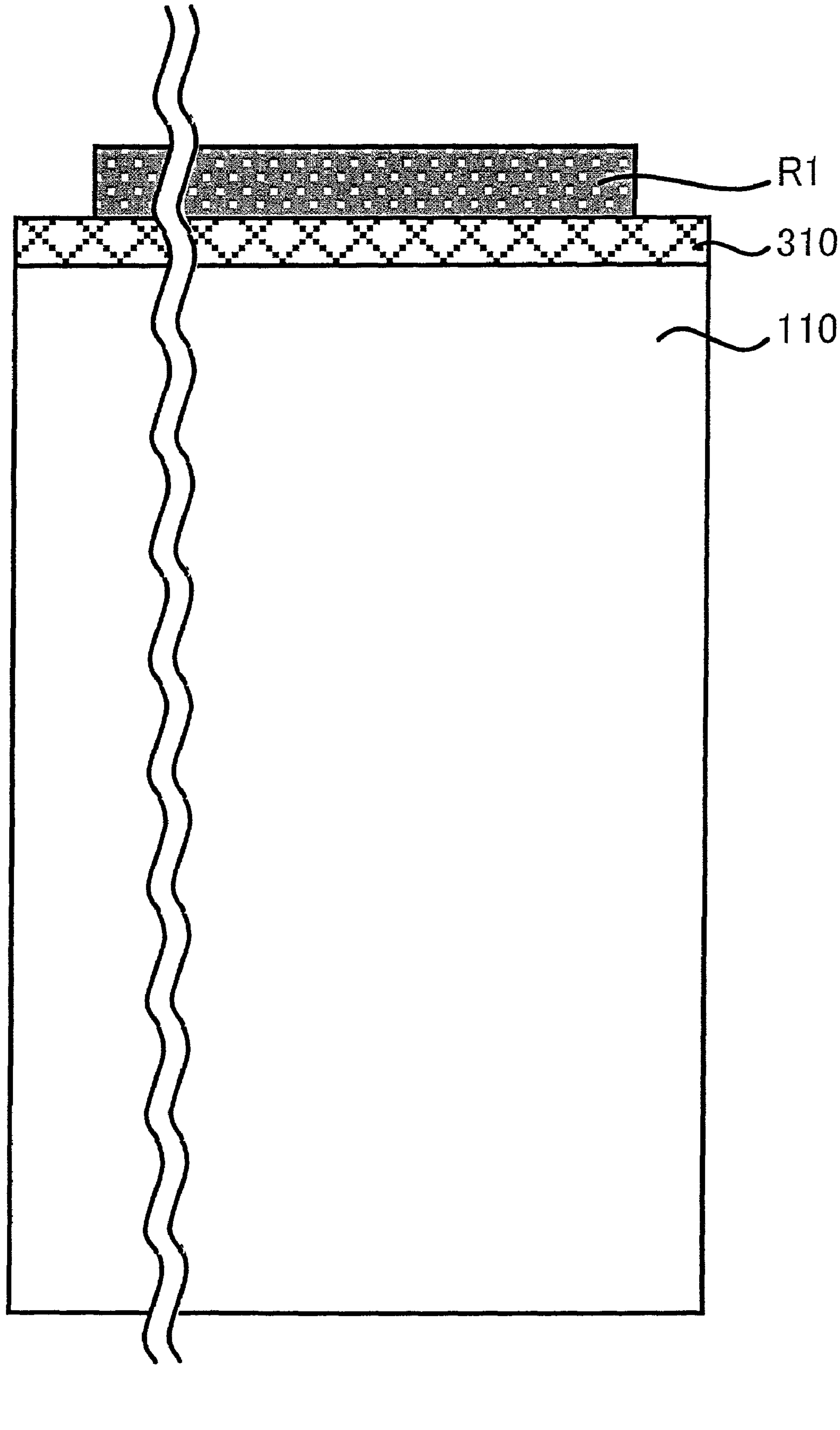
FIG. 586 to FIG. 605 are sectional views (taken on line E–E' in FIG. 1) illustrating production steps of Production Example 21 for producing a semiconductor memory in accordance with the present invention.
Figure 614:
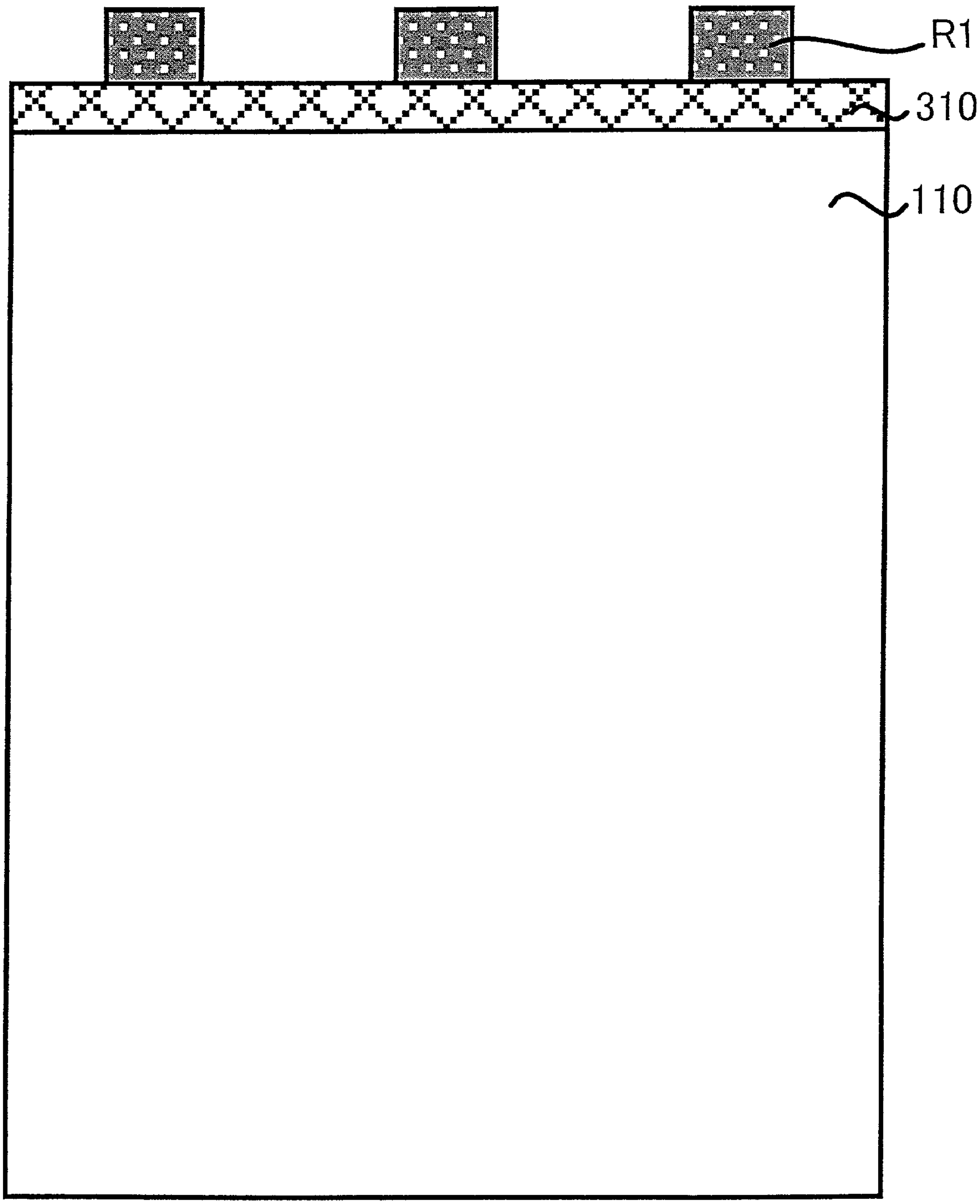
FIG. 614 to FIG. 636 are sectional views (taken on line G–G' in FIG. 1) illustrating production steps of Production Example 21 for producing a semiconductor memory in accordance with the present invention.

In this example, a first insulating film to be a mask layer, for example, a silicon nitride film 310 is deposited to 200 to 2,000 nm on the surface of a semiconductor substrate, for example, a P-type silicon substrate 100, and is etched by reactive ion etching using as a mask a resist film R1 patterned by known photolithography (FIG. 586 and FIG. 614).

Figure 587:
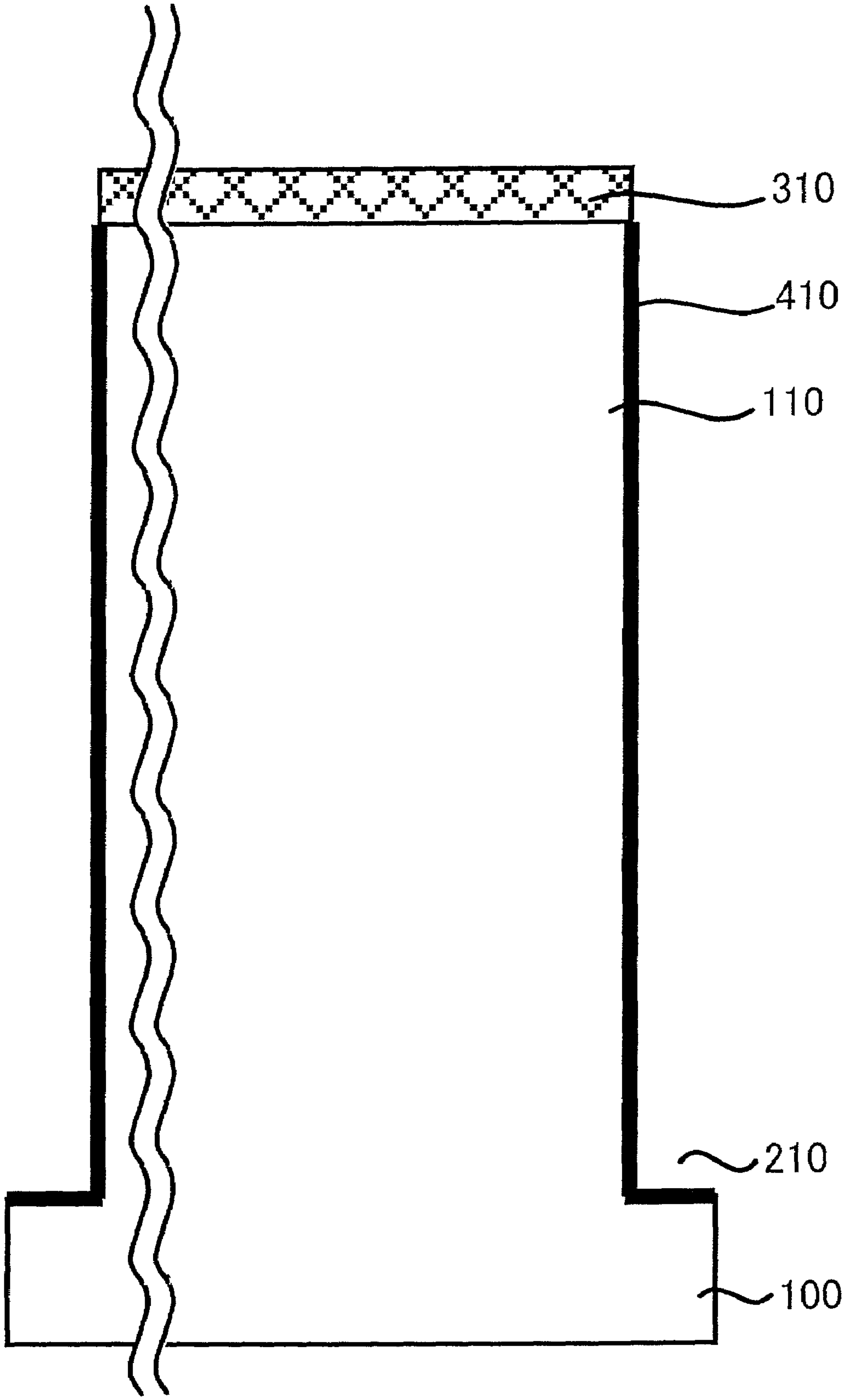
Figure 615:
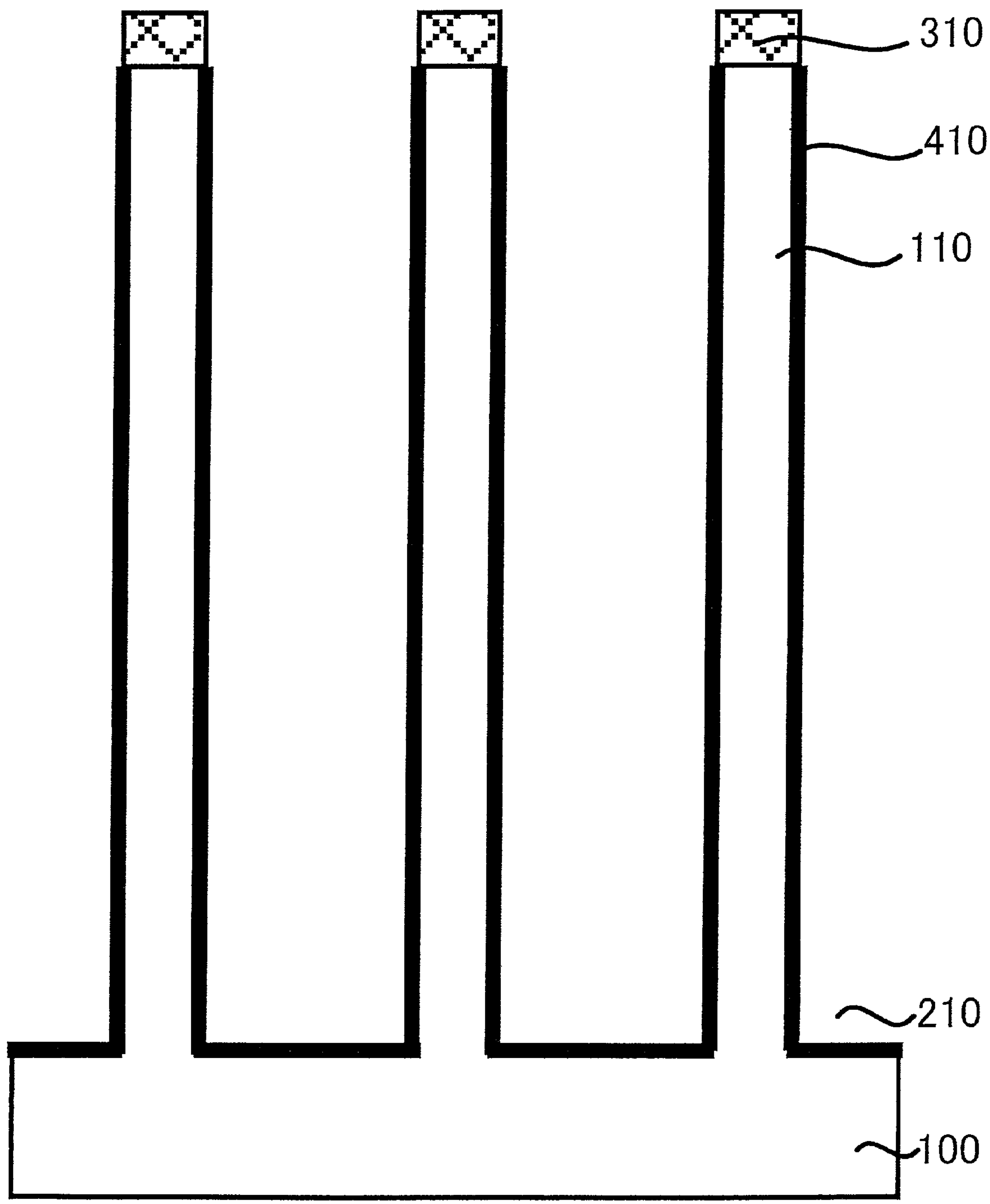

The P-type silicon substrate 100 is etched about 2,000 to 20,000 nm by reactive ion etching using the silicon nitride film 310 as a mask to form a first trench 210 in a lattice form. Thereby, the P-type silicon substrate 100 is divided into a plurality of island-like semiconductor layers 110 in a columnar form. The surface of each island-like semiconductor layer 110 is oxidized to form a thermally oxidized film 410, as a second insulating film, to a thickness of 10 nm to 100 nm. At this time, if the island-like semiconductor layer 110 has been formed in the minimum photoetching dimension, the dimension of the island-like semiconductor layer 110 is decreased by the formation of the thermally oxidized film 410, that is, the island-like semiconductor layer 110 is formed to have a dimension smaller than the minimum photoetching dimension (FIG. 587 and FIG. 615).

Next, the thermally oxidized film (the second insulating film) 410 is etched away from the periphery of each island-like semiconductor layer 110, for example, by isotropic etching. Then, as required, channel ion implantation is carried out into the sidewall of the island semiconductor layer 110 by utilizing slant ion implantation. For example, the ion implantation may be performed at an implantation energy of 5 to 100 keV at a boron dose of about $1\times10^{11}$ to $1\times10^{13}$/cm$^2$at an angle of 5 to 45° with respect to the normal line of the surface of the substrate. Preferably the channel ion implantation is performed from various directions to the island-like semiconductor layers 110 because a surface impurity concentration becomes more uniform. Alternatively, instead of the channel ion implantation, an oxide film containing boron may be deposited by CVD with a view to utilizing diffusion of boron from the oxide film. The impurity implantation from the surface of the island-like semiconductor layers 110 may be carried out before the island-like semiconductor layers are covered with the thermally oxidized film 410 or the implantation may be finished before the island-like semiconductor layers 110 are formed. Means for the implantation are not particularly limited so long as an impurity concentration distribution is almost equal over the island-like semiconductor layers 110.

Figure 588:
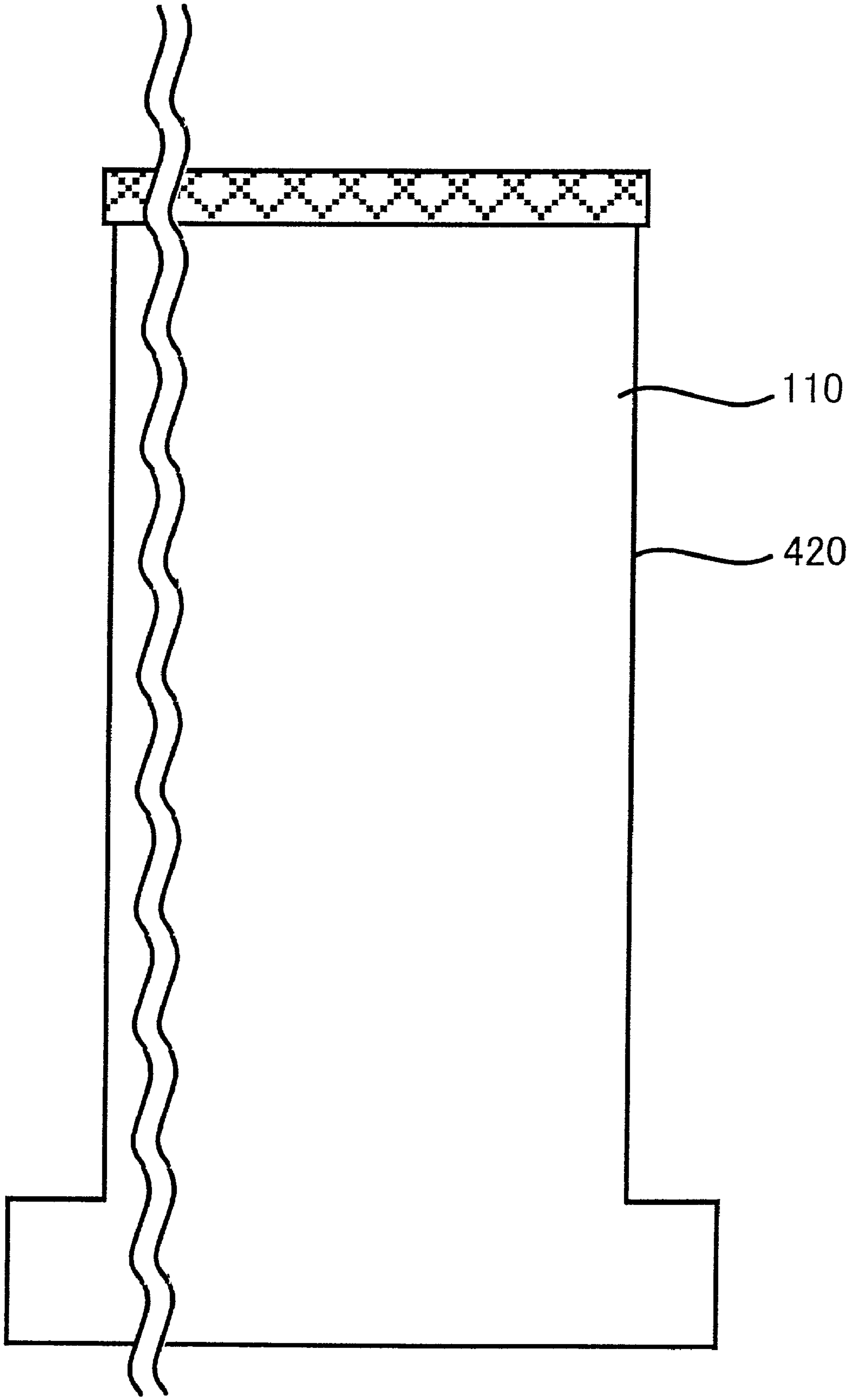
Figure 616:
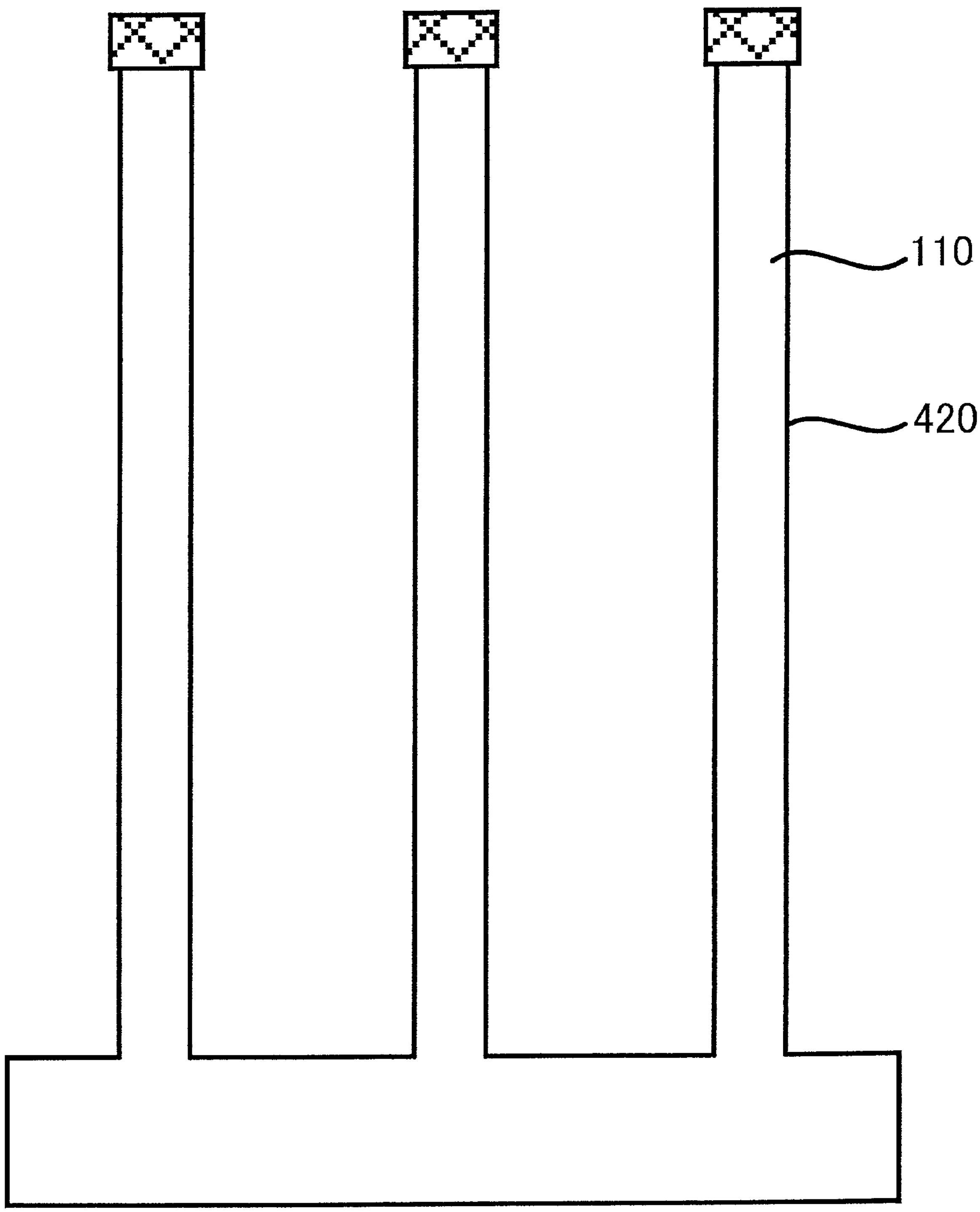

Subsequently, a third insulating film to be a tunnel oxide film, for example, a silicon oxide film 420 is formed to a thickness of about 10 nm around each island-like semiconductor layer 110, for example, by thermal oxidization (FIG. 588 and FIG. 616). The tunnel oxide film, however, may be formed of not only a thermally oxidized film but also a CVD oxide film or a nitrogen oxide film.

Figure 589:
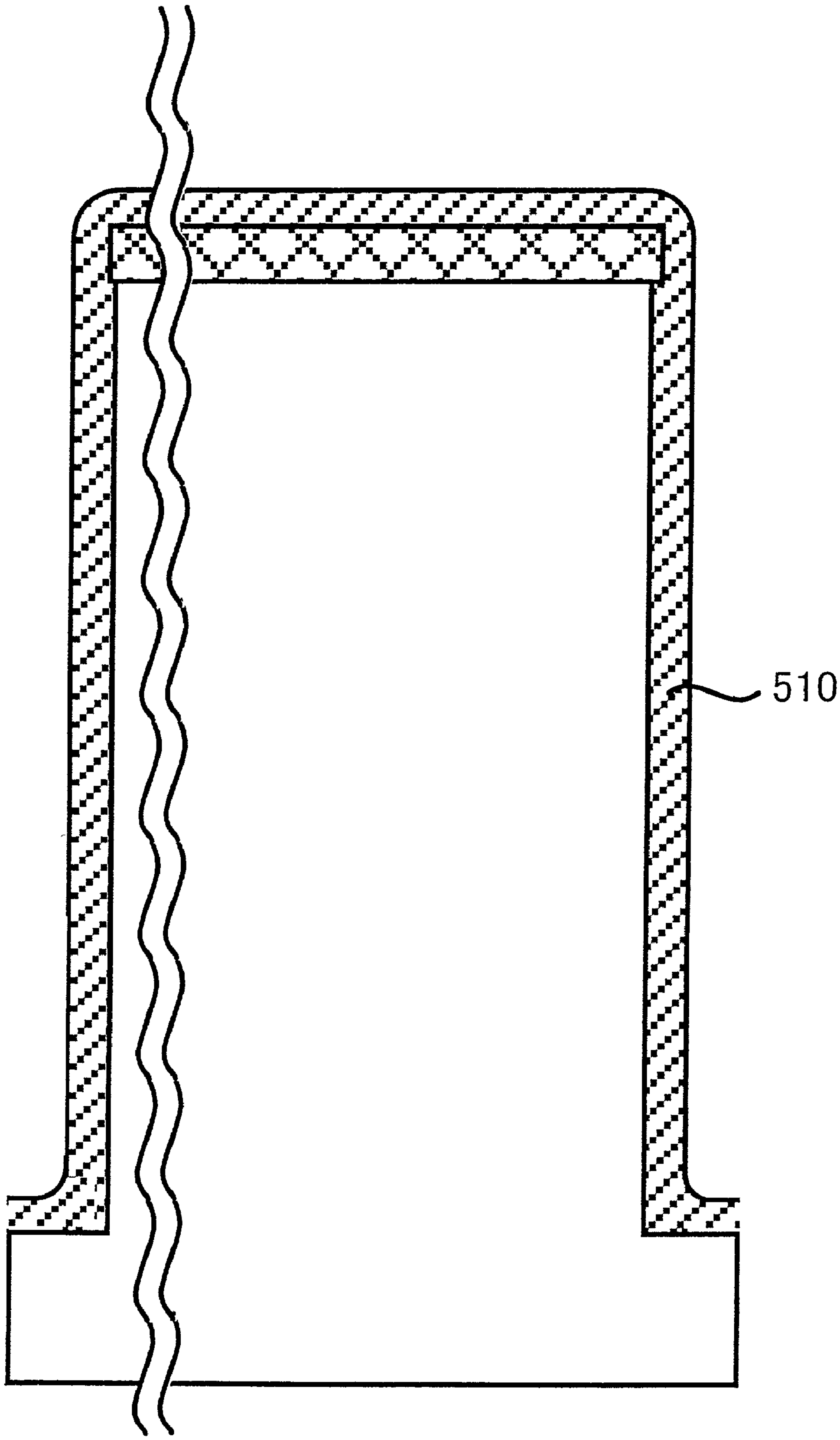
Figure 617:
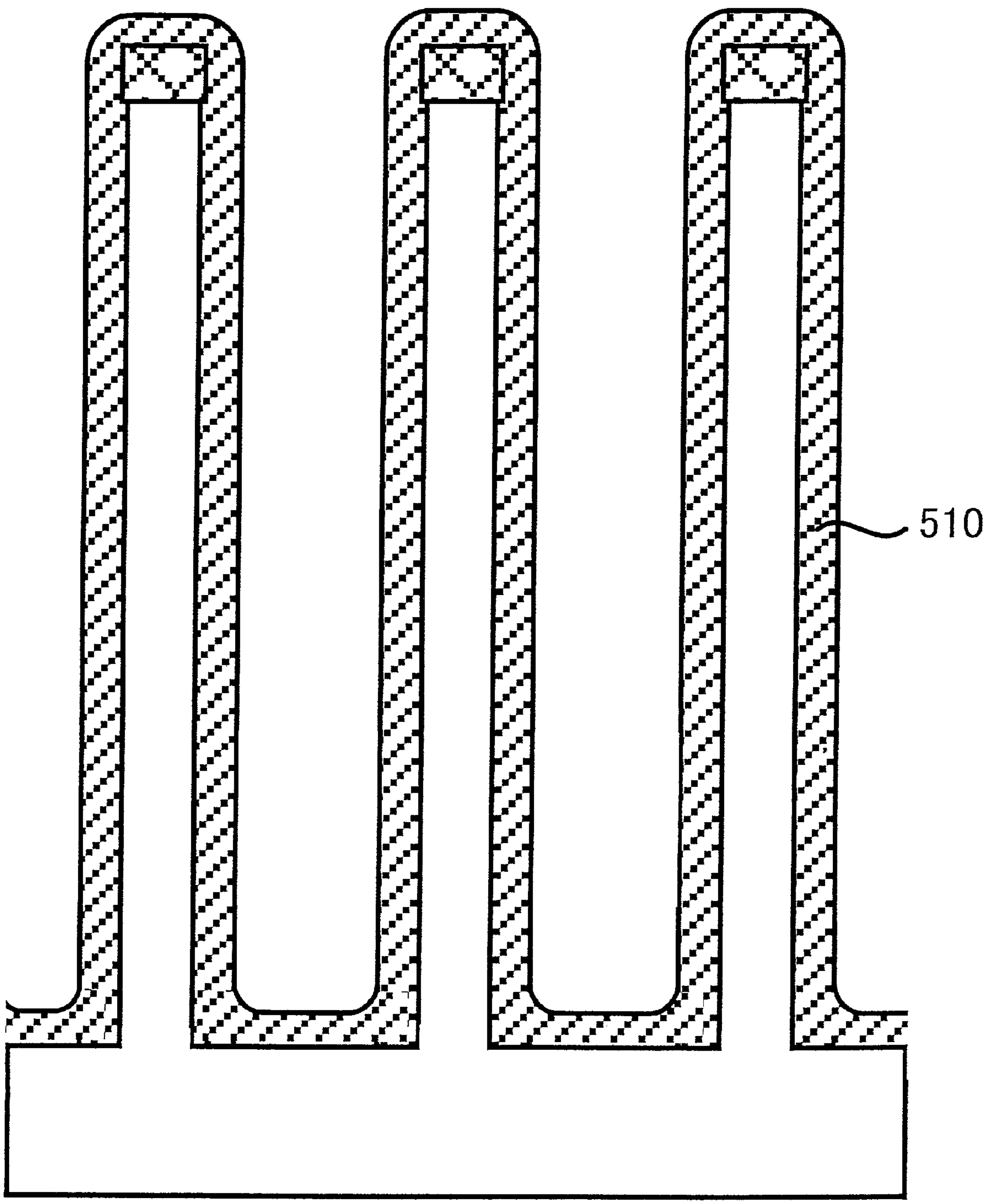

A first conductive film, for example, a polysilicon film 510 is deposited to a thickness of about 50 to 200 nm (FIG. 589 and FIG. 617).

Figure 590:
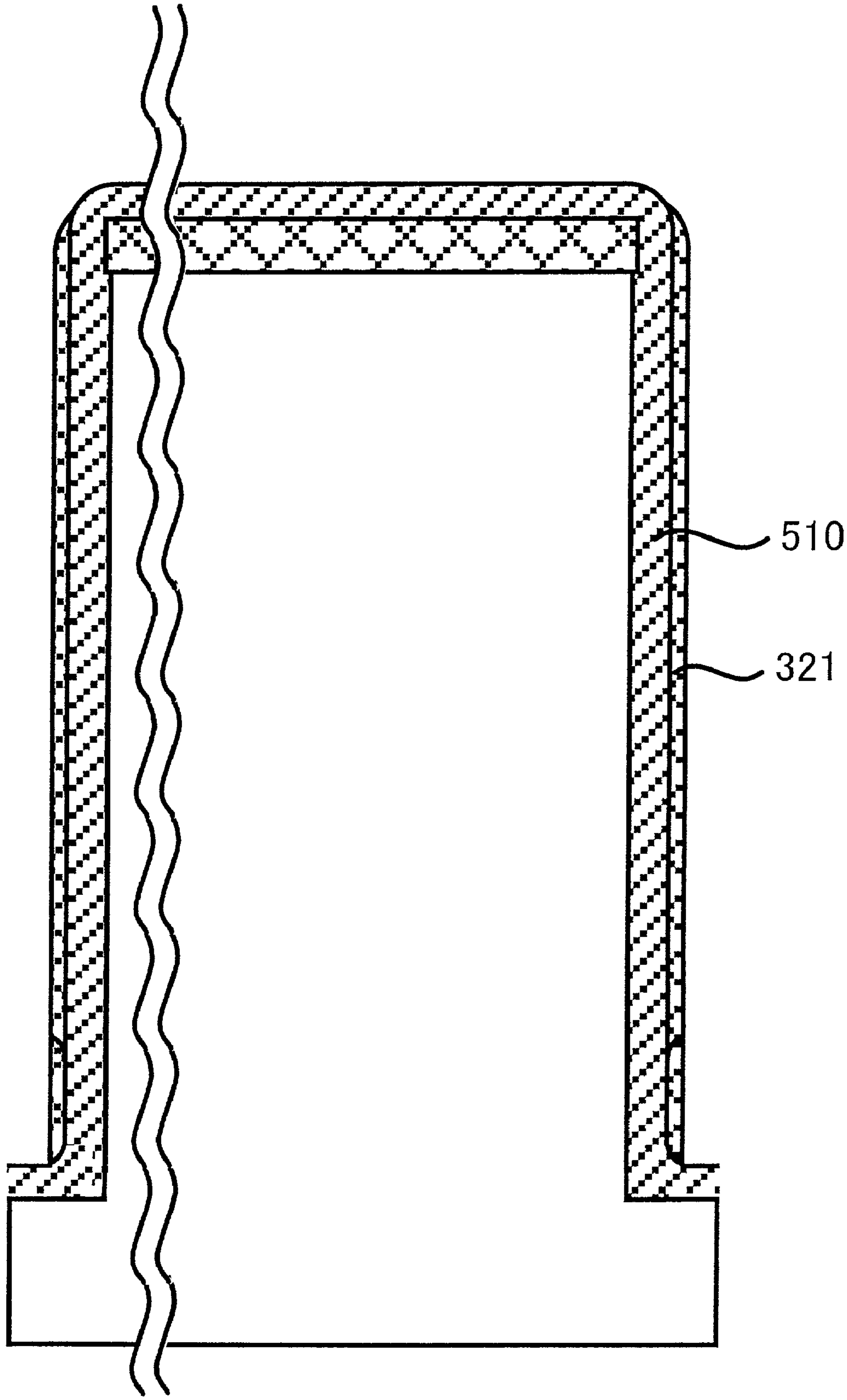
Figure 591:
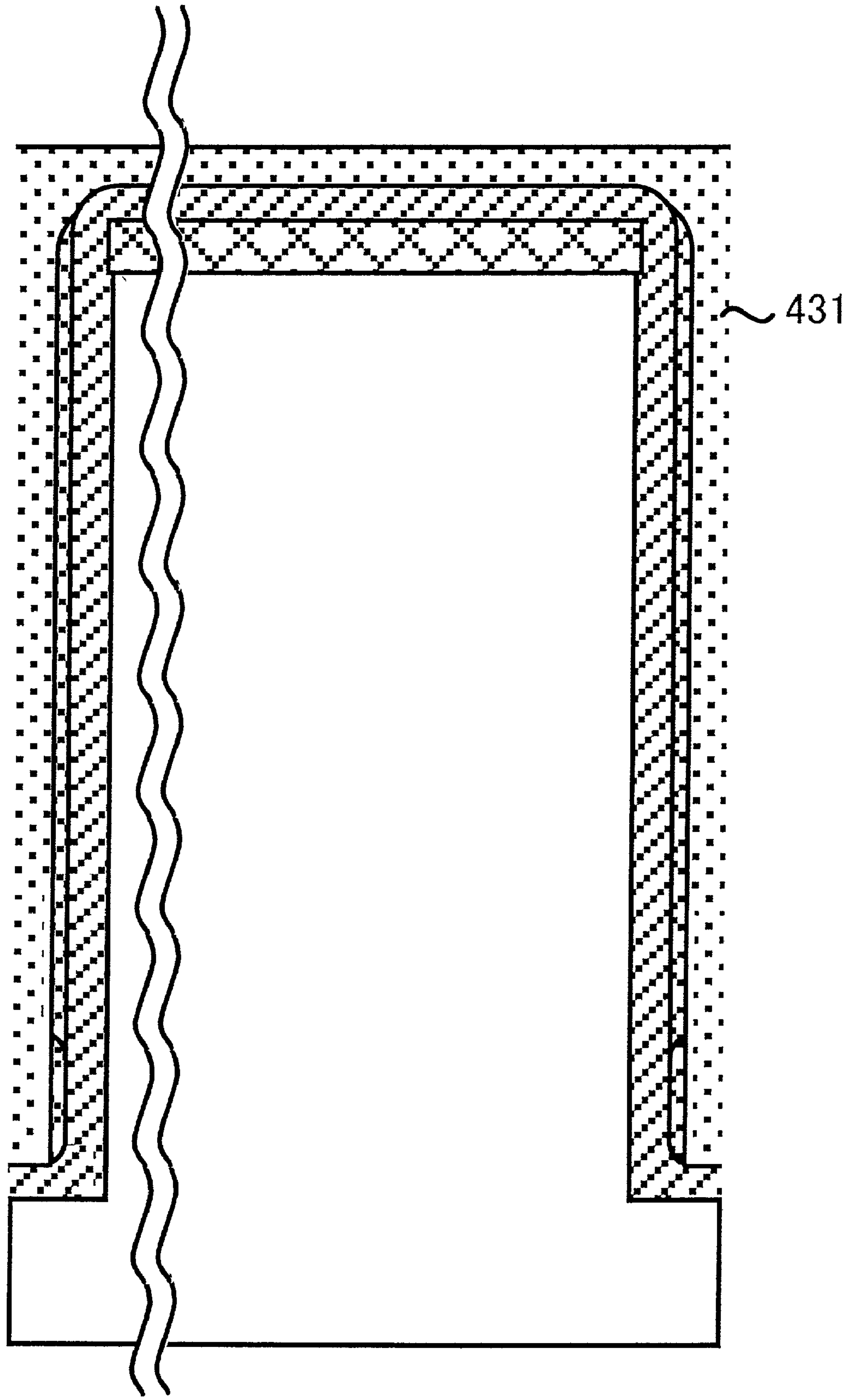
Figure 618:
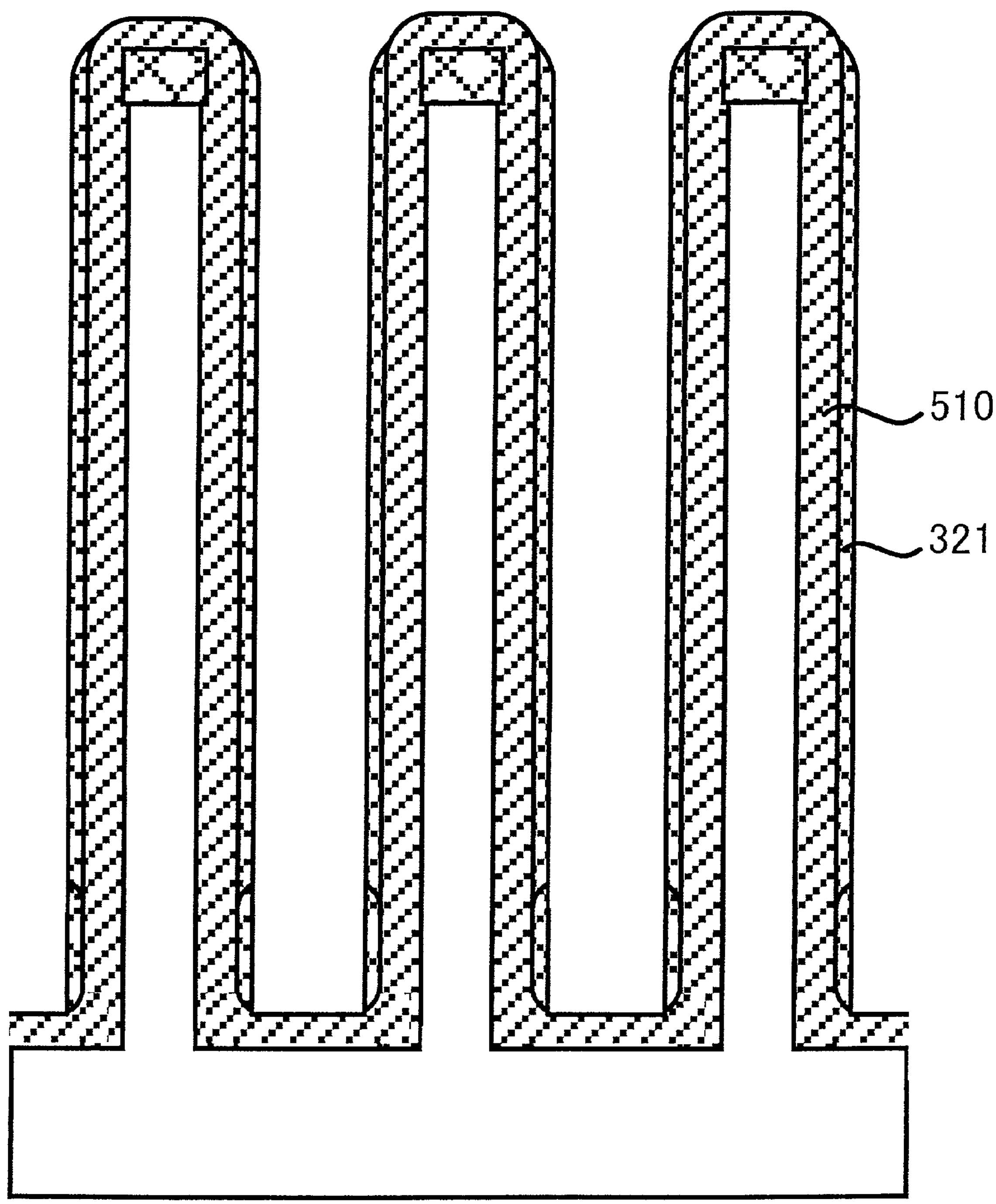
Figure 619:
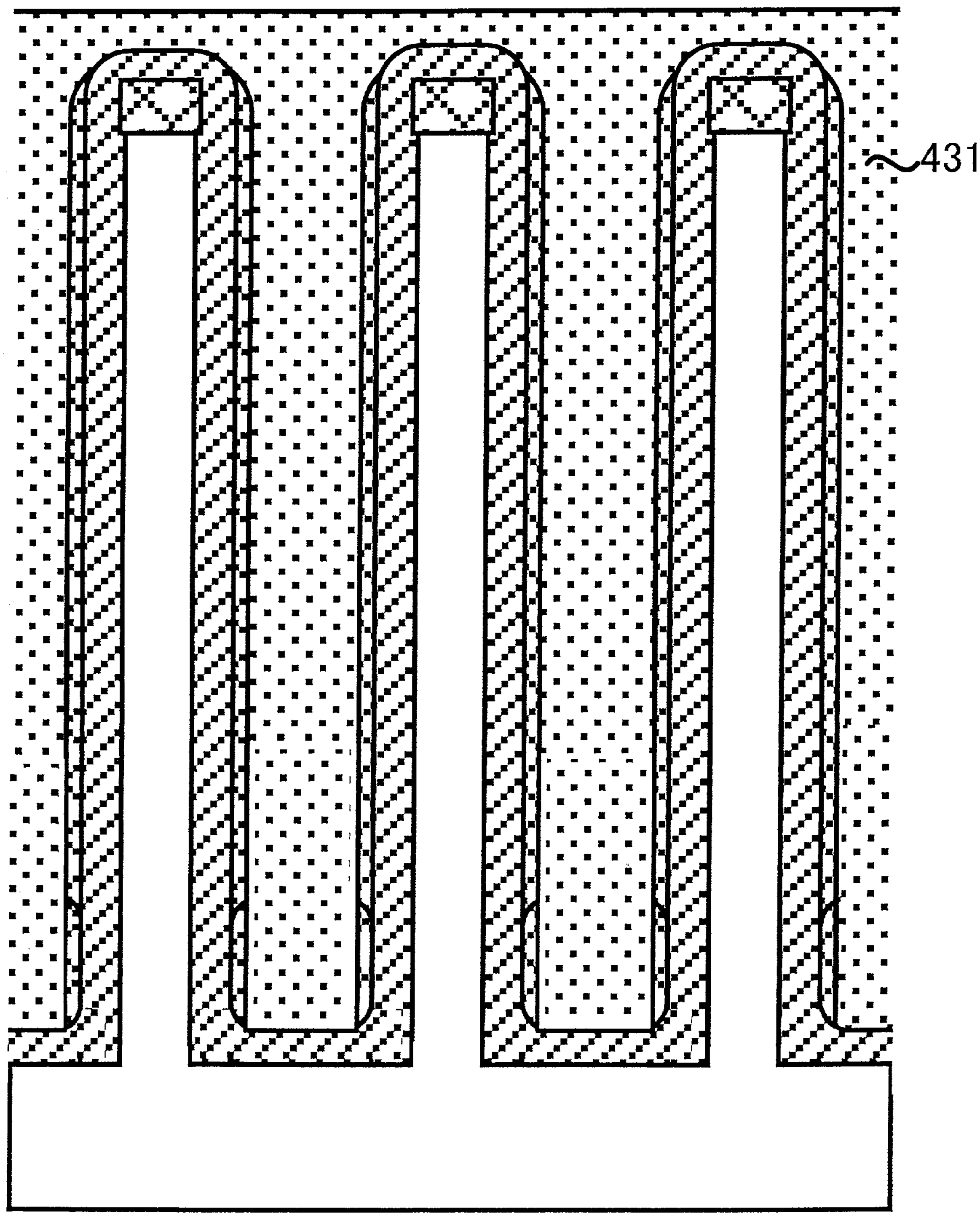

A fourth insulating film, for example, a silicon nitride film 321 is deposited to a thickness of about 5 to 50 nm by CVD. The silicon nitride film (the fourth insulating film) 321 is etched by reactive ion etching to remain in the form of a sidewall spacer on the sidewall of the polysilicon film (the first conductive film) 510 (FIG. 590 and FIG. 618). A fifth insulating film, for example, silicon oxide film 431, is deposited to a thickness of 50 to 500 nm in the first trench 210 in the lattice form by CVD (FIG. 591 and FIG. 619).

Figure 592:
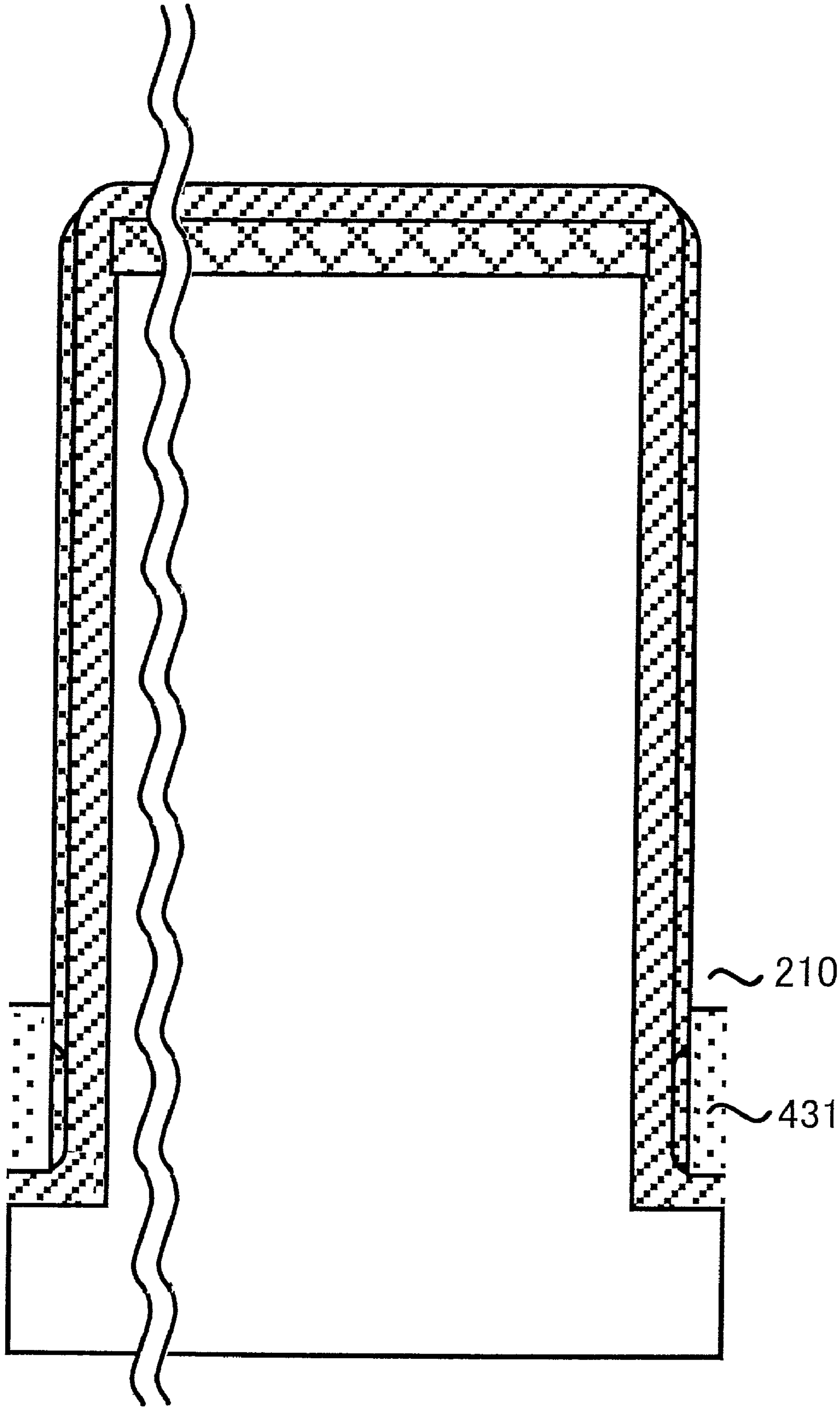
Figure 620:
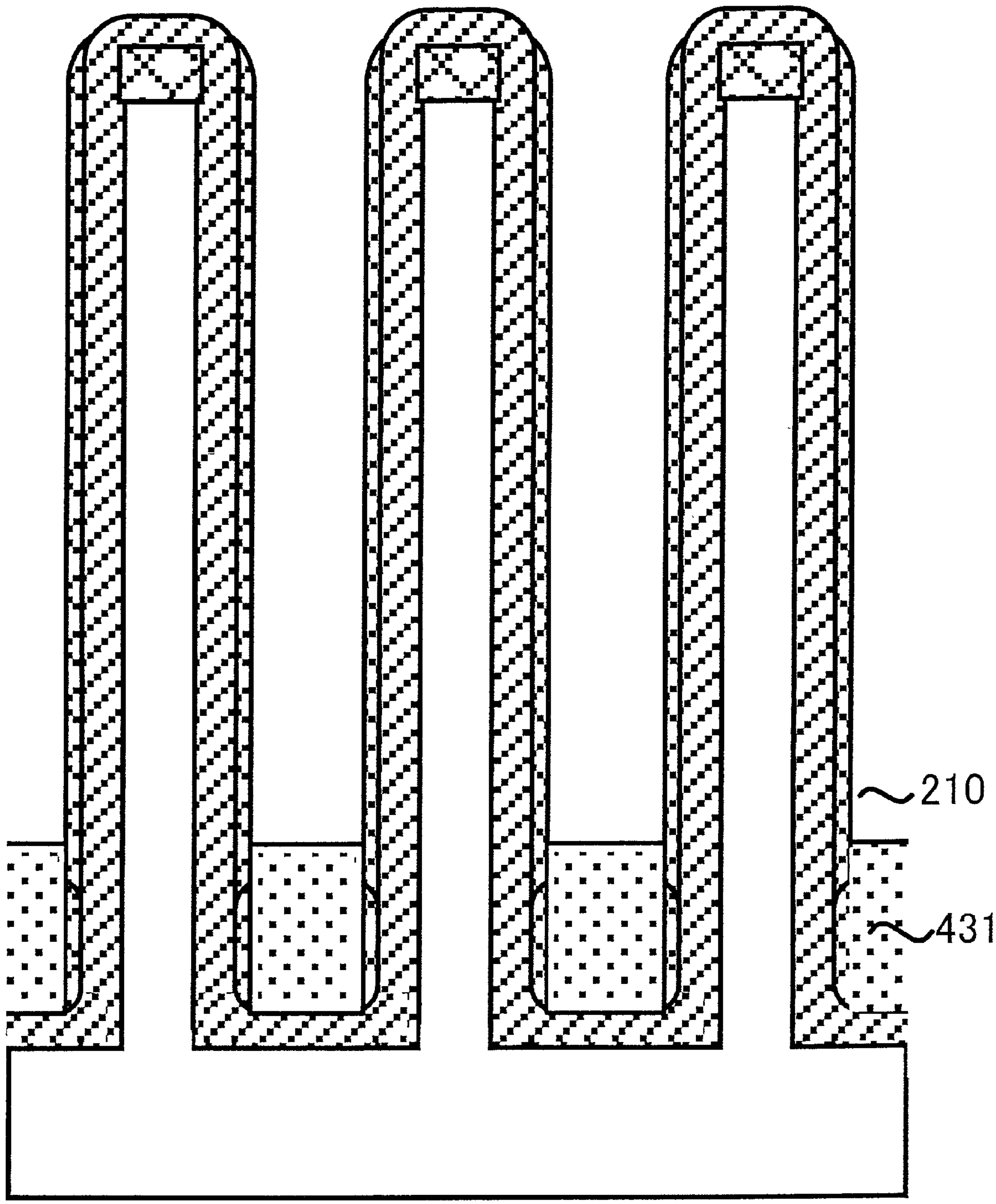

The silicon oxide film (the fifth insulating film) 431 is buried to a desired depth in the first trench 210 in the lattice form (FIG. 592 and FIG. 620).

Figure 593:
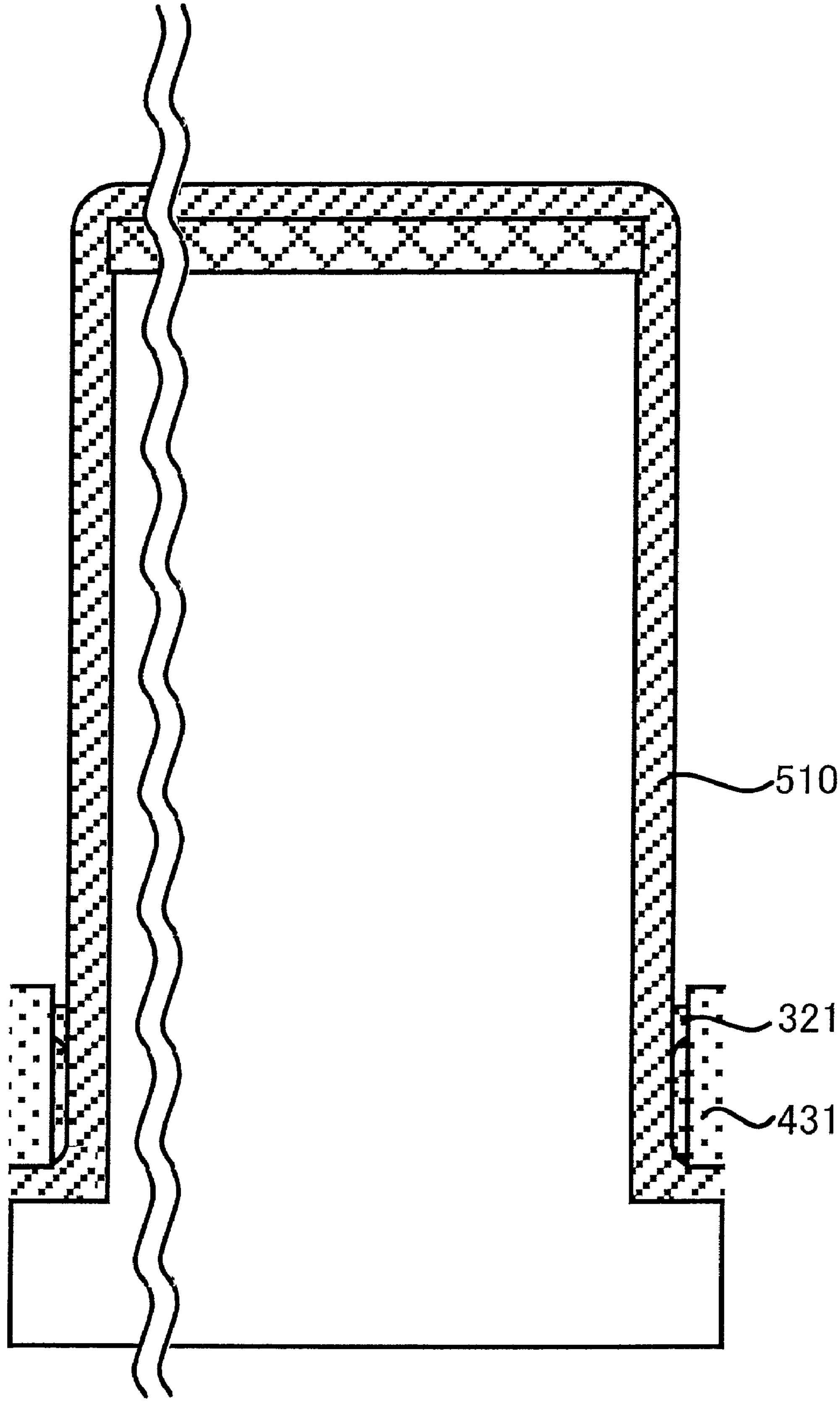
Figure 621:
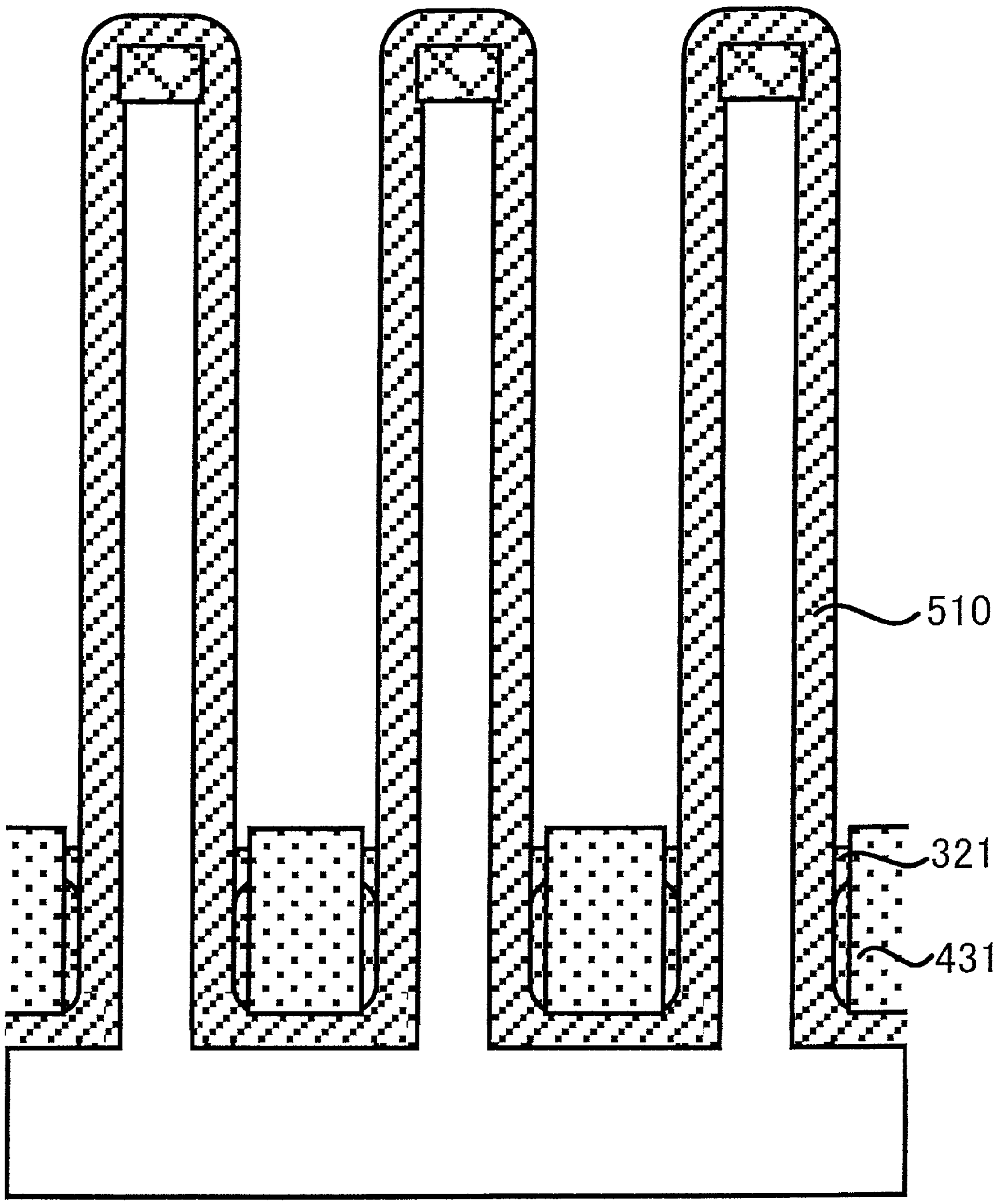

The silicon nitride film (the fourth insulating film) 321 is isotropically etched using the silicon oxide film 431 as a mask so that the silicon nitride film 321 remains only between the silicon oxide film 431 and the polysilicon film (the first conductive film) 510 (FIG. 593 and FIG. 621). At this time, the silicon nitride film 321 is lower than the top surface of the silicon oxide film 431 to form a recess. In this recess, a silicon oxide film 441 is deposited as a sixth insulating film to a thickness of about 3 to 30 nm. The above recess is filled if the thickness of the silicon oxide film 441 is about half or more of the thickness of the silicon nitride film 321. Since the oxide film 441 deposits also on the sidewall of the polysilicon film 510, the oxide film 441 is removed from the sidewall of the polysilicon film 510, for example, by isotropic etching. The silicon oxide film 441 remains in the recess, and the silicon nitride film (the fourth insulating film) 321 is buried by the silicon oxide film (the fifth insulating film) 431 and the silicon oxide film (the sixth insulating film) 441.

Figure 594:
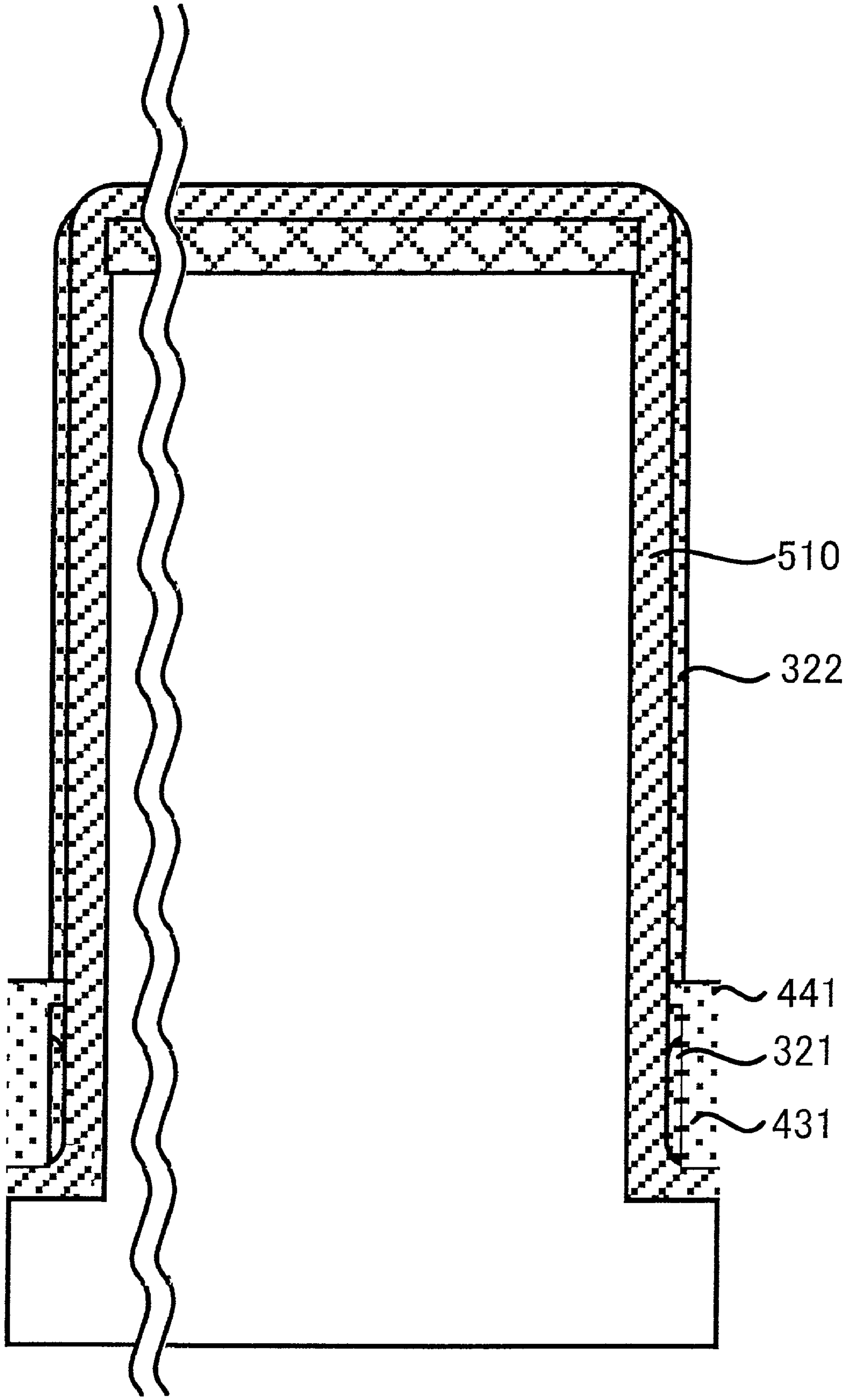
Figure 595:
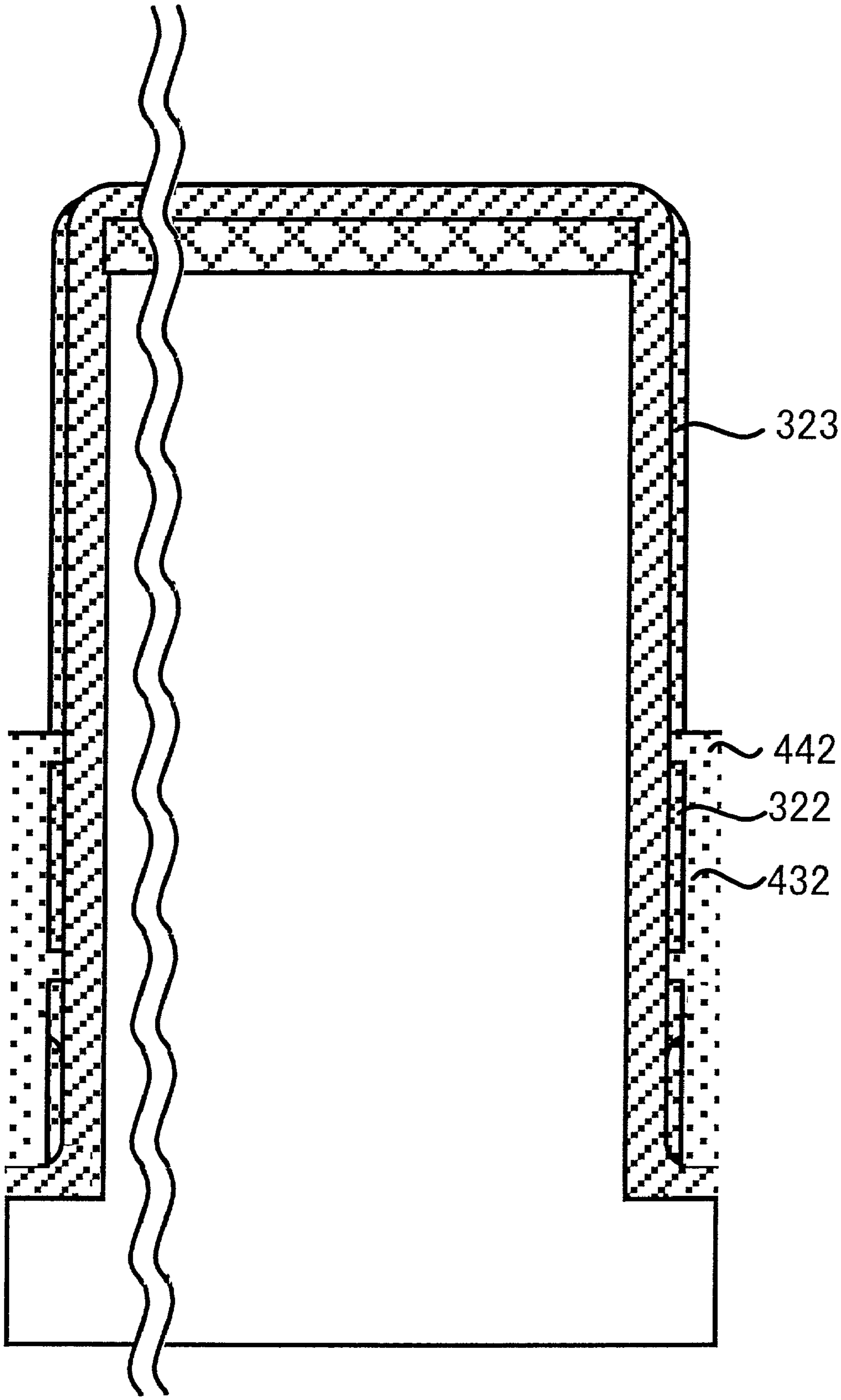
Figure 622:
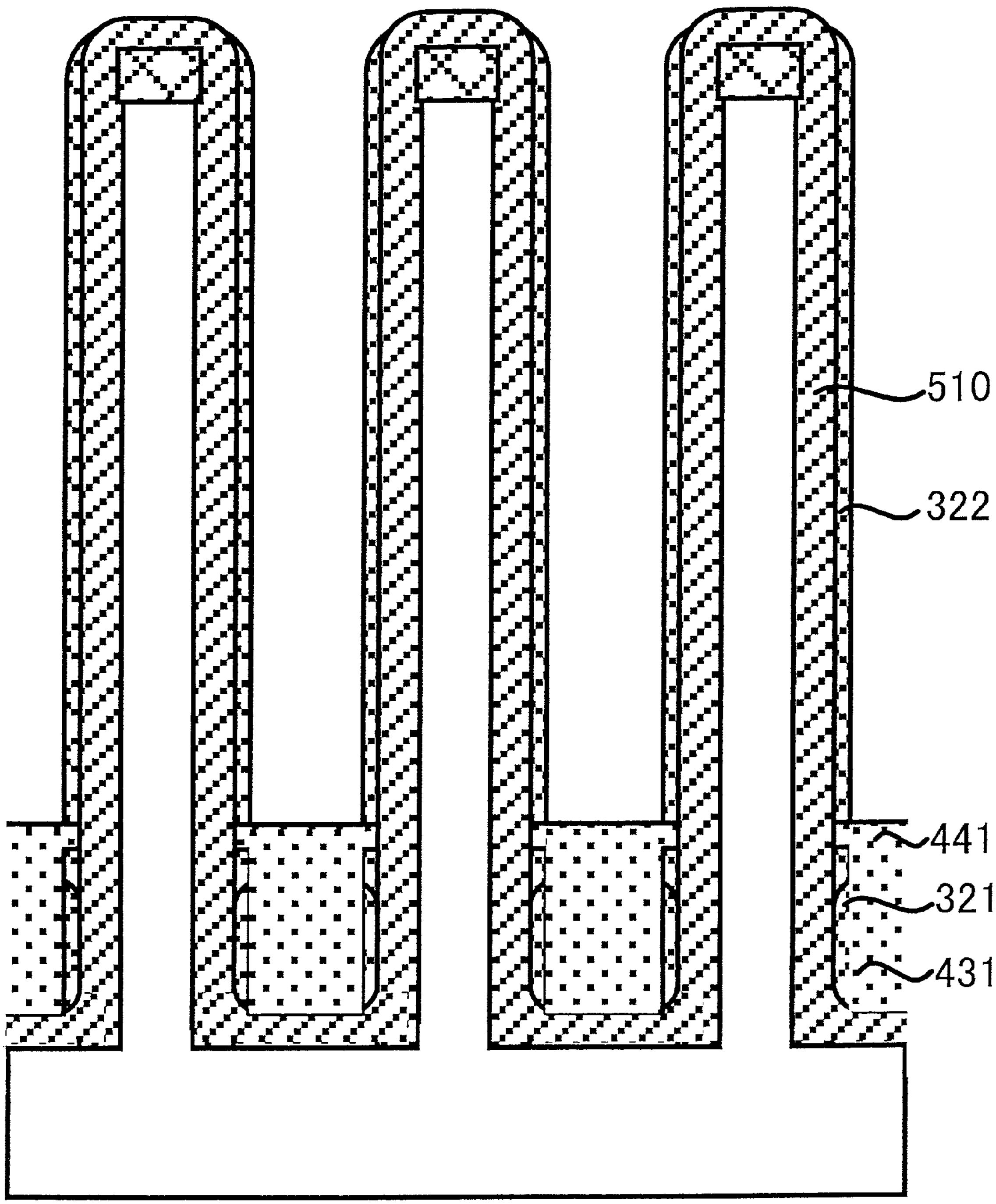
Figure 623:
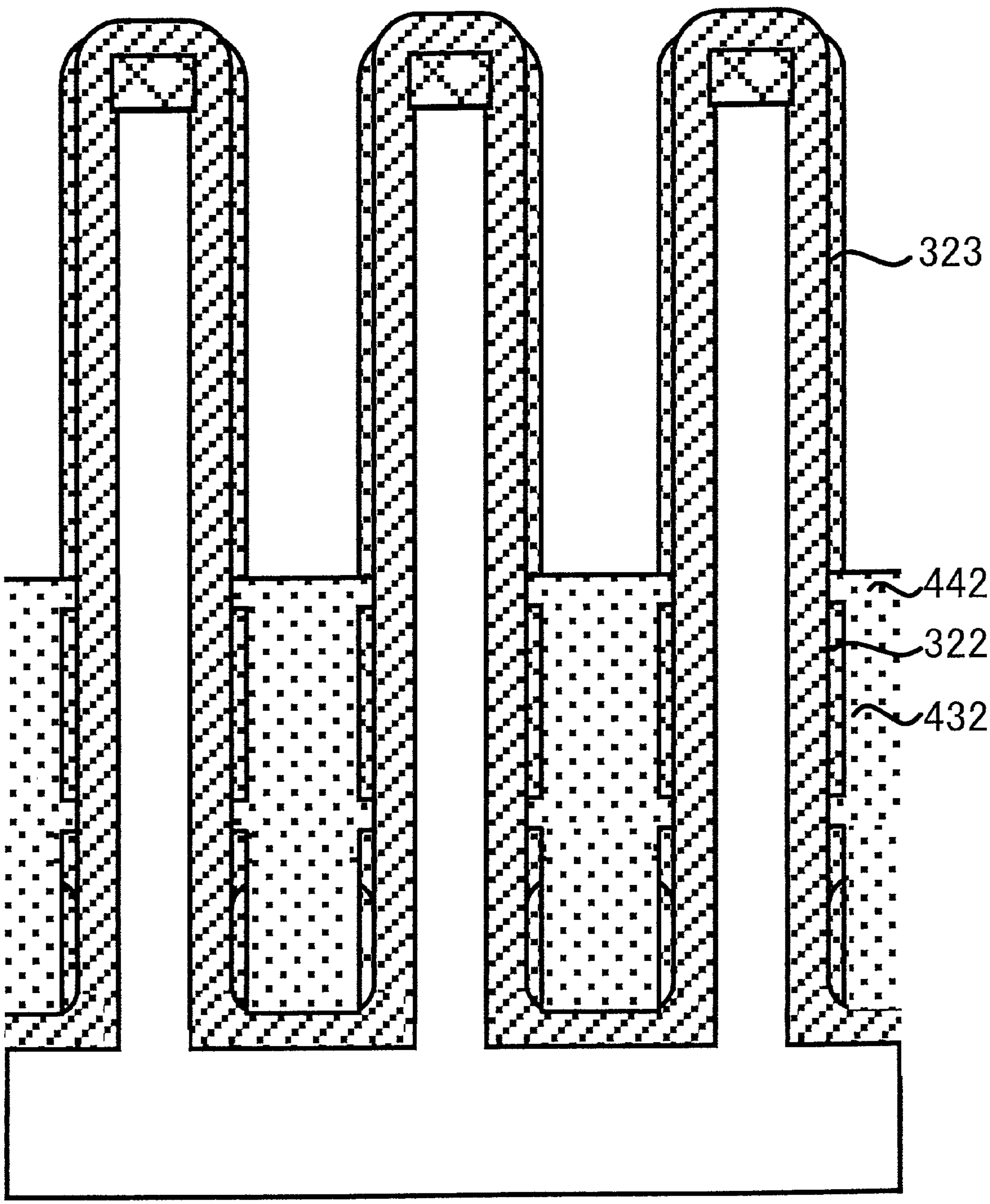

Likewise, a silicon nitride film (a fourth insulating film) 322 is deposited to a thickness of 5 to 50 nm by CVD. The silicon nitride film 322 is etched by reactive ion etching to remain in the form of a sidewall spacer on the sidewall of the polysilicon film 510 (FIG. 594 and FIG. 622).

In the same manner as described above, a silicon oxide film (a fifth insulating film) 432 is buried and a silicon oxide film (a sixth insulating film) 442 is disposed on the top of the silicon nitride film 322 in the sidewall spacer form. Then, a silicon nitride film (a fourth insulating film) 323 is formed in the form of a sidewall spacer on the sidewall of the polysilicon film 510 in the same manner as described above (FIG. 595 and FIG. 623).

Figure 596:
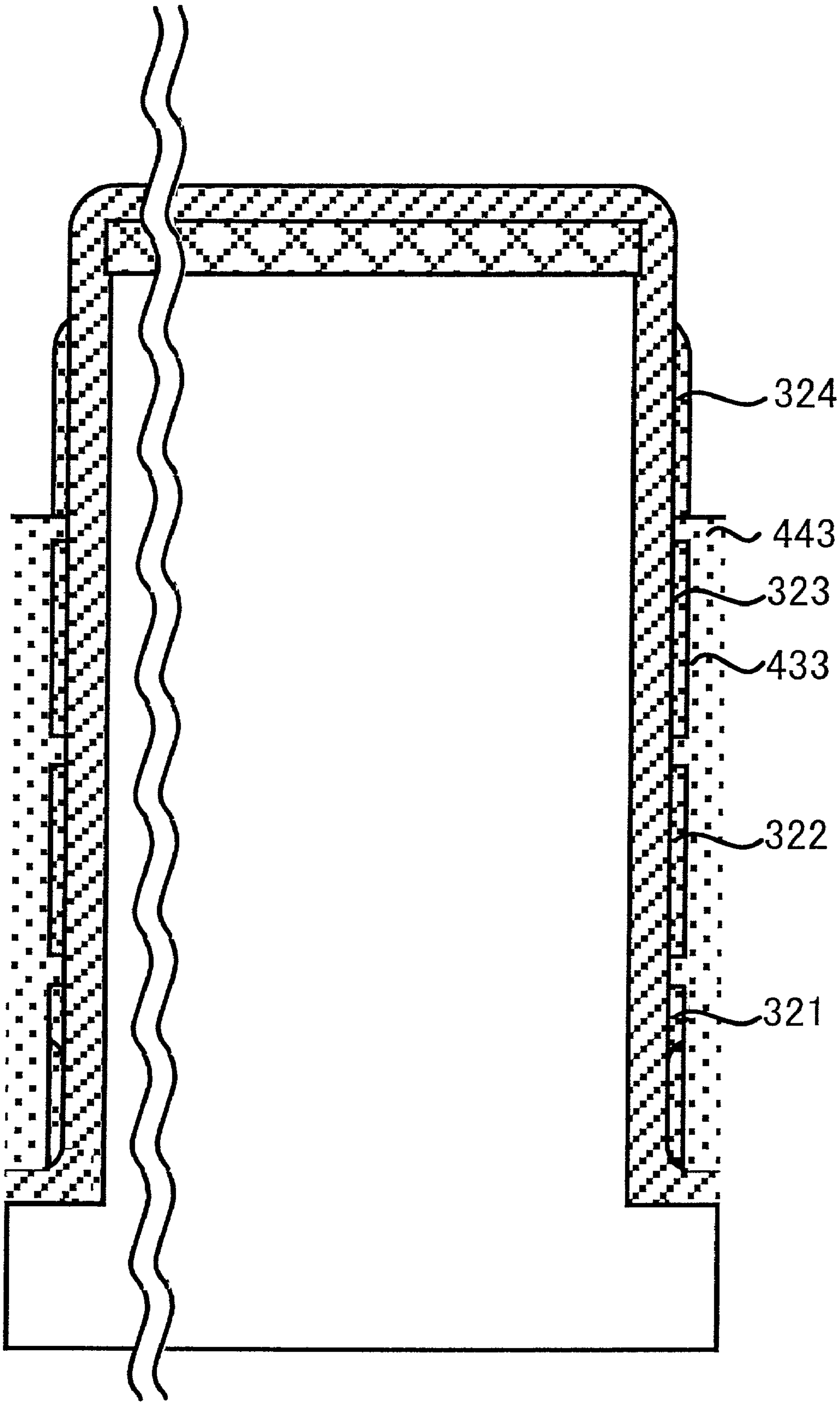
Figure 624:
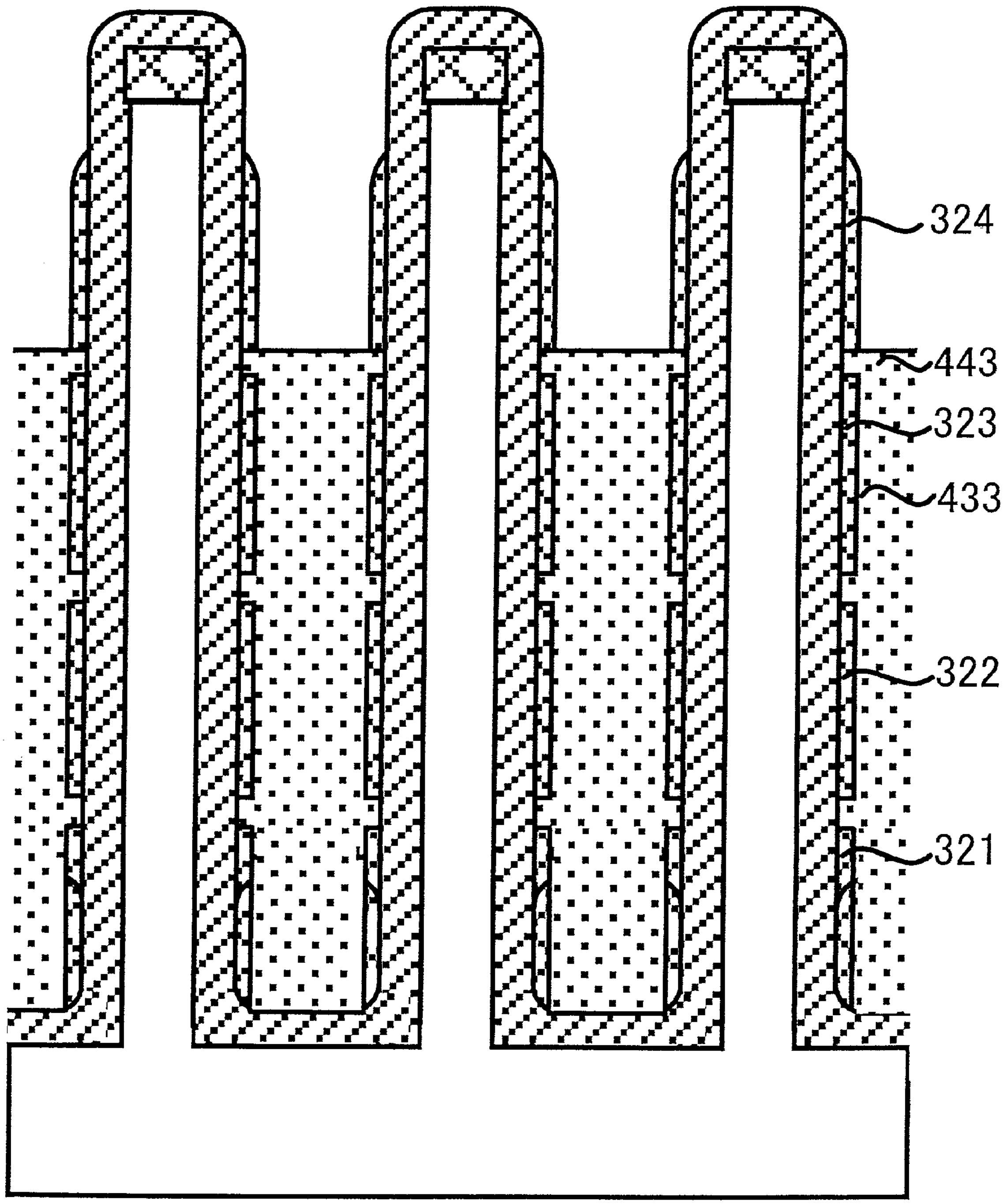

By repeating these steps, a plurality of sidewall spacers are formed of the silicon nitride film (the fourth insulating film) 321 to 324 on the sidewall of the polysilicon film (the first conductive film) 510 (FIG. 596 and FIG. 624).

Figure 597:
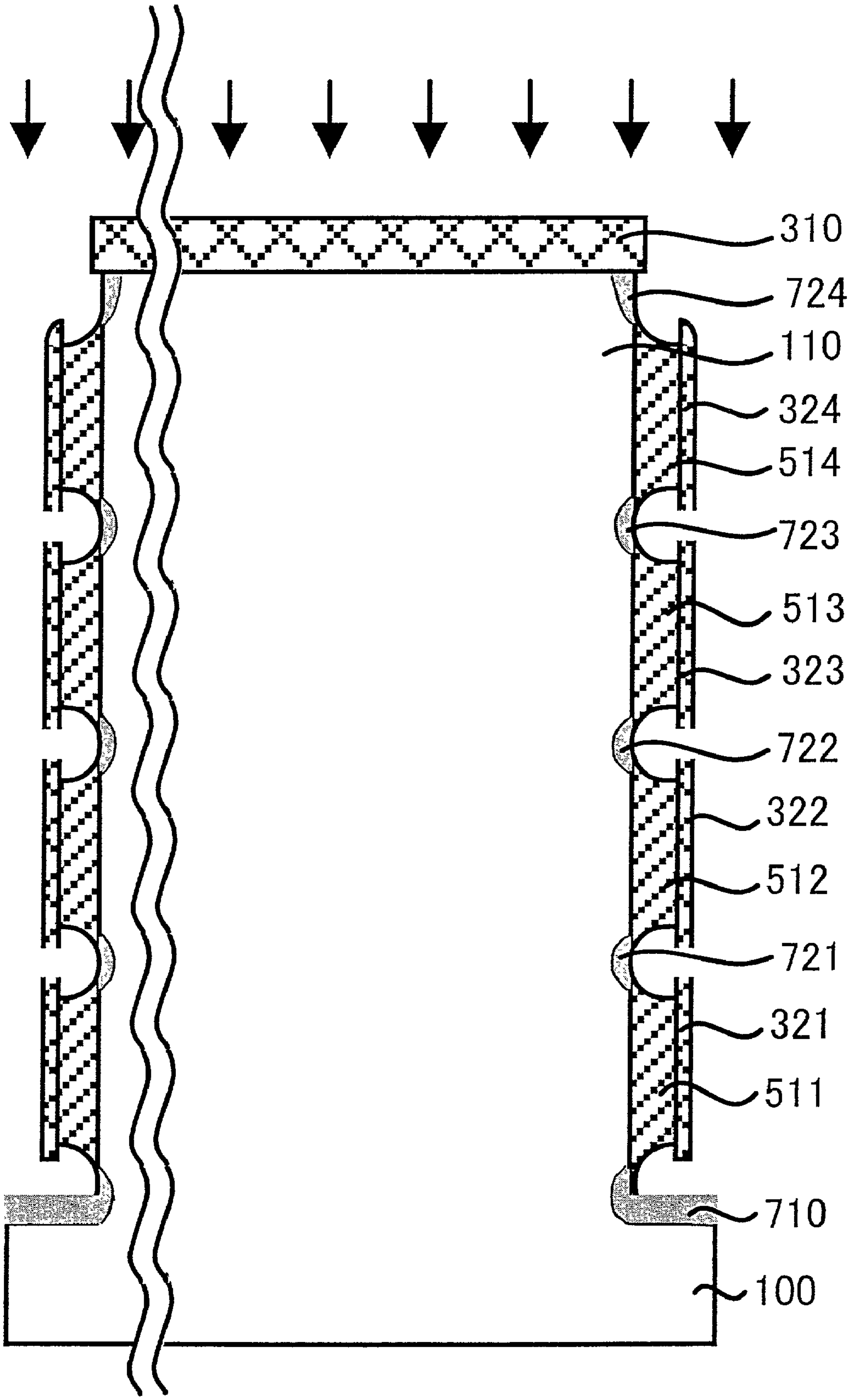
Figure 625:
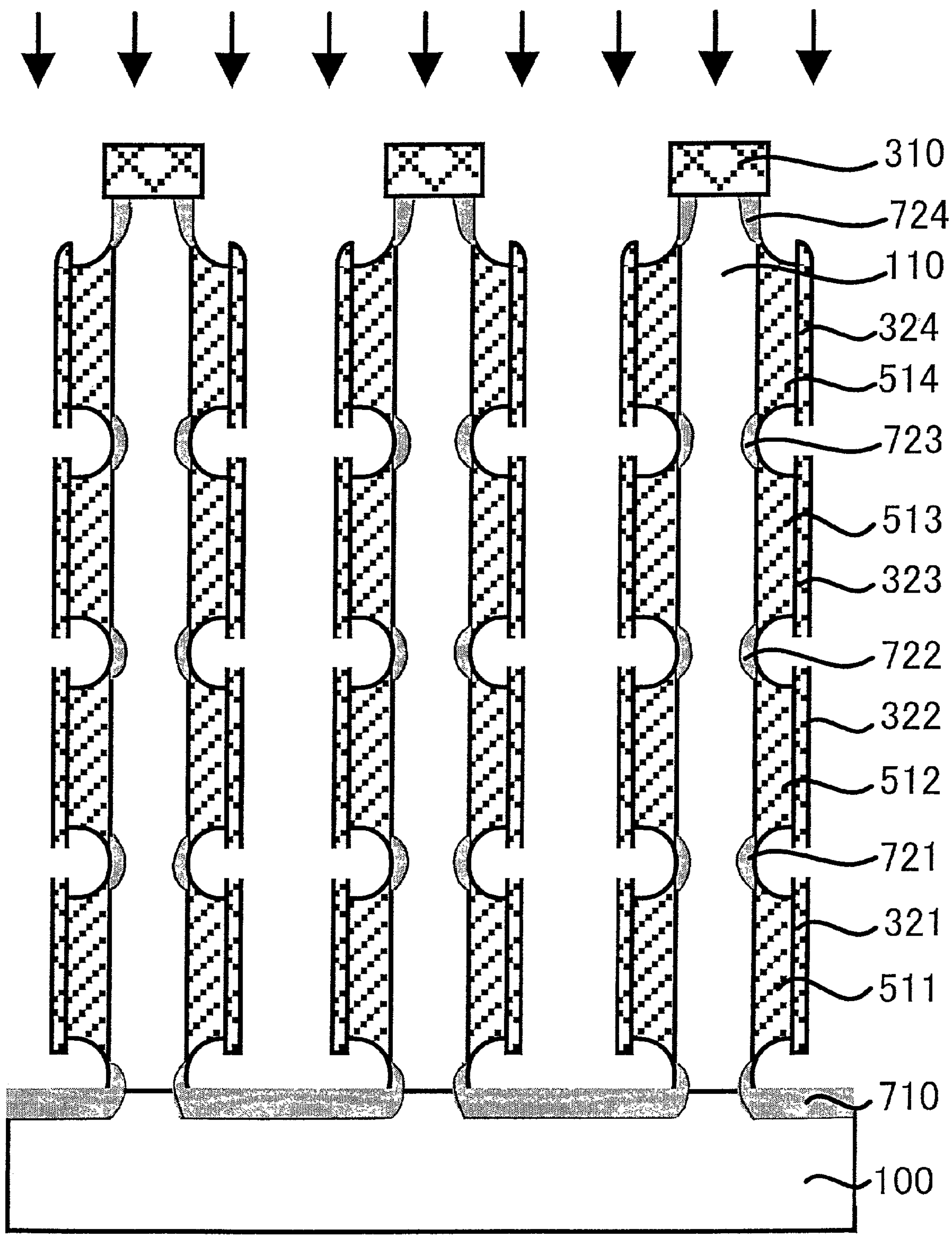

The polysilicon film 510 is divided by isotropic etching. Impurity introduction is carried out into the island-like semiconductor layers 110 and the semiconductor substrate 100 in self-alignment with the divided polysilicon films 511 to 514 and the silicon nitride film (the first insulating film) 310. For example, N-type impurity diffusion layers 710 to 724 are formed at an arsenic concentration of about $1\times10^{18}$ to $1\times10^{21}$/cm$^3$ using a diffusion process (e.g., solid phase diffusion process, vapor phase diffusion process, etc.). At this time, the impurity diffusion layer 710 to be a first wiring layer may be adjusted about its impurity concentration by ion implantation (FIG. 597 and FIG. 625). For example, the ion implantation may be performed at an implantation energy of 5 to 100 keV at a phosphorus dose of about $1\times10^{13}$ to $1\times10^{15}$/cm$^2$ in a direction inclined by about 0 to 7°.

Figure 598:
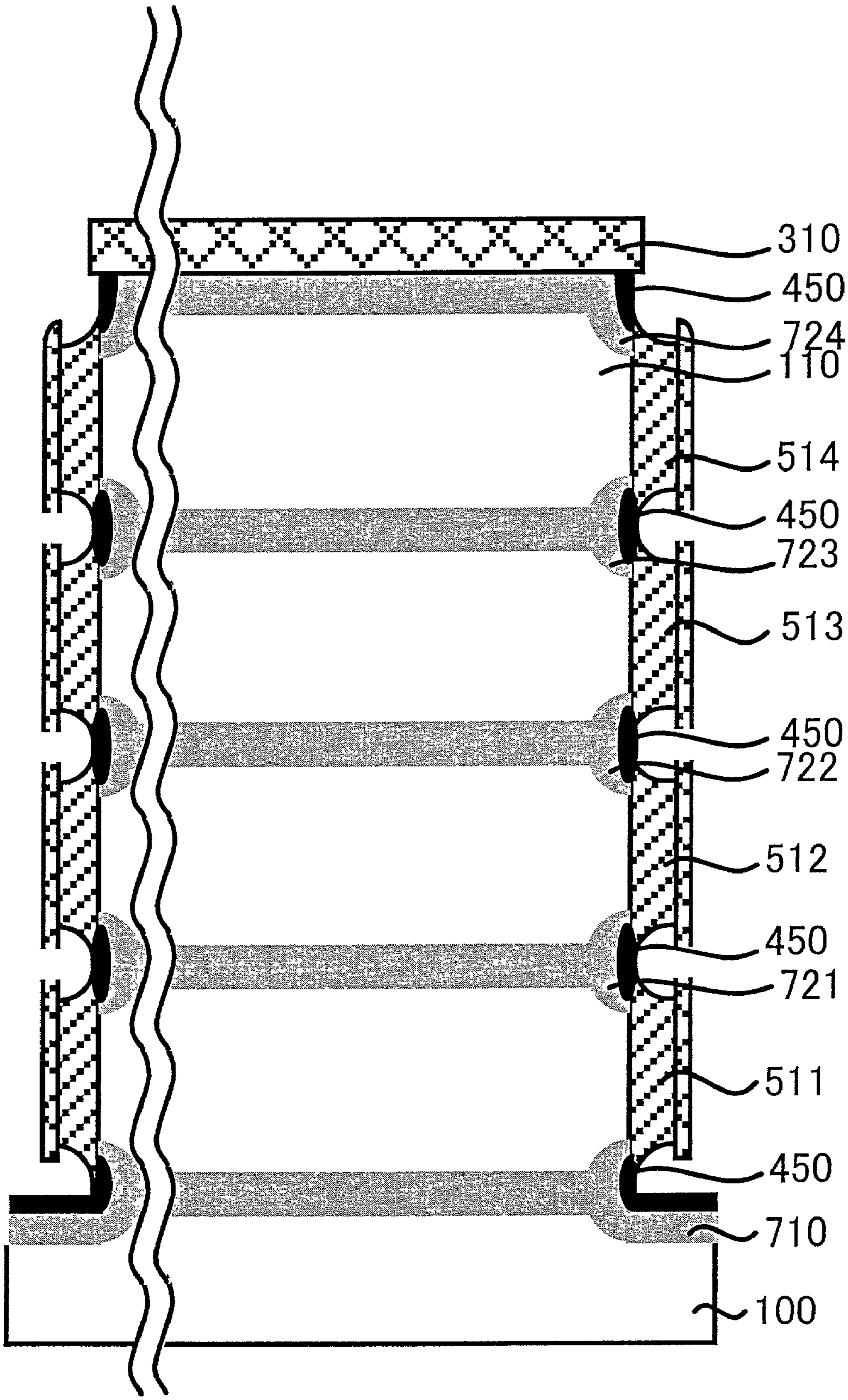
Figure 626:
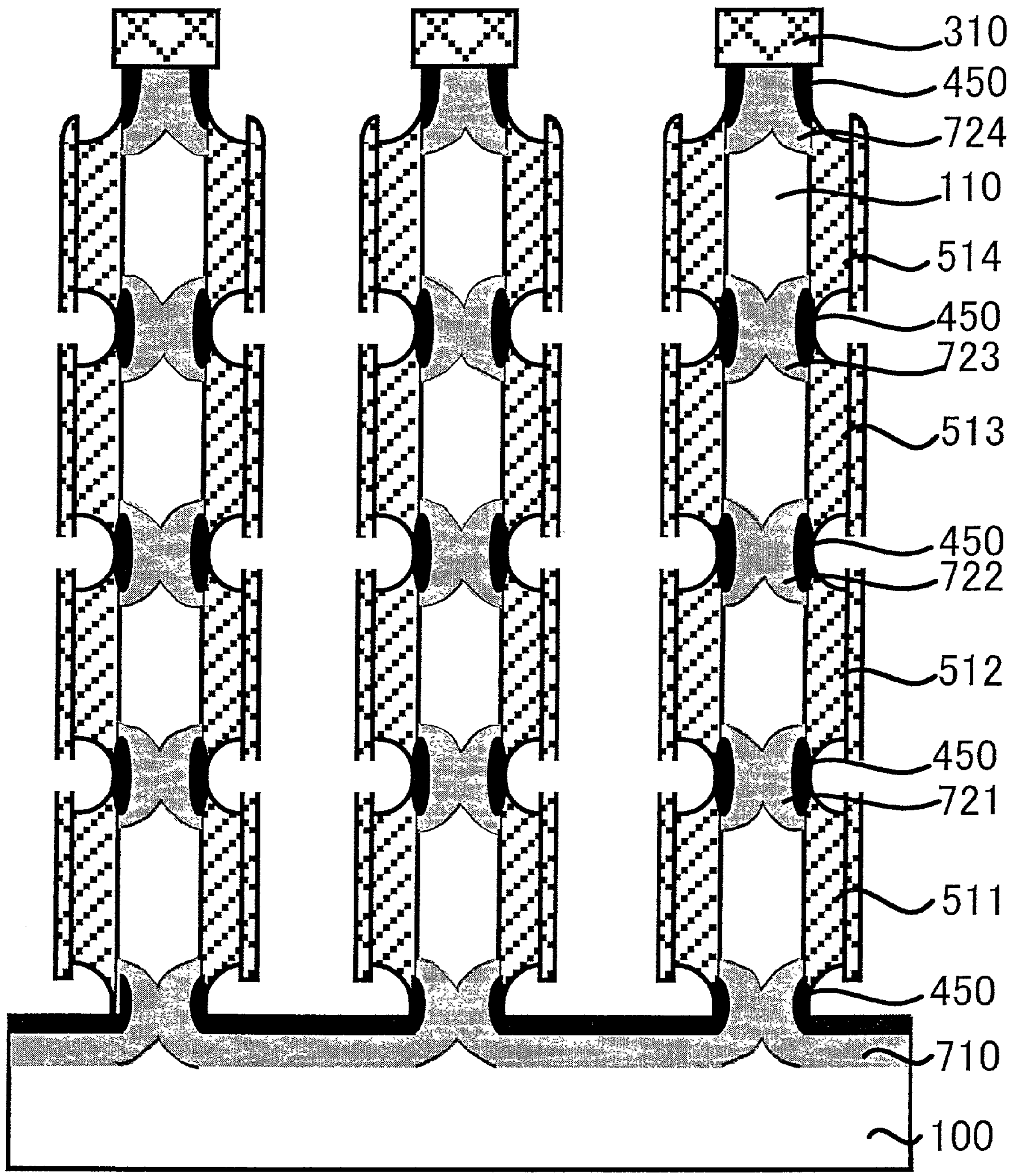

Thereafter, exposed portions of the polysilicon films 511 to 514 are thermally oxidized selectively to form silicon oxide films 450 of 5 to 50 nm thickness which are seventh insulating films, for example. At this time, the impurity is diffused from the impurity diffusion layers 710 to 724 by thermal treatment to electrically float a P-type region of the island-like semiconductor layer 110 (FIG. 598 and FIG. 626). The timing of the impurity introduction to the polysilicon films 511 to 514 is not particularly limited so long as these films become conductive films. For example, the impurity introduction may be performed during the formation of the polysilicon film 510 or during the impurity introduction into the island-like semiconductor layers 110.

Figure 599:
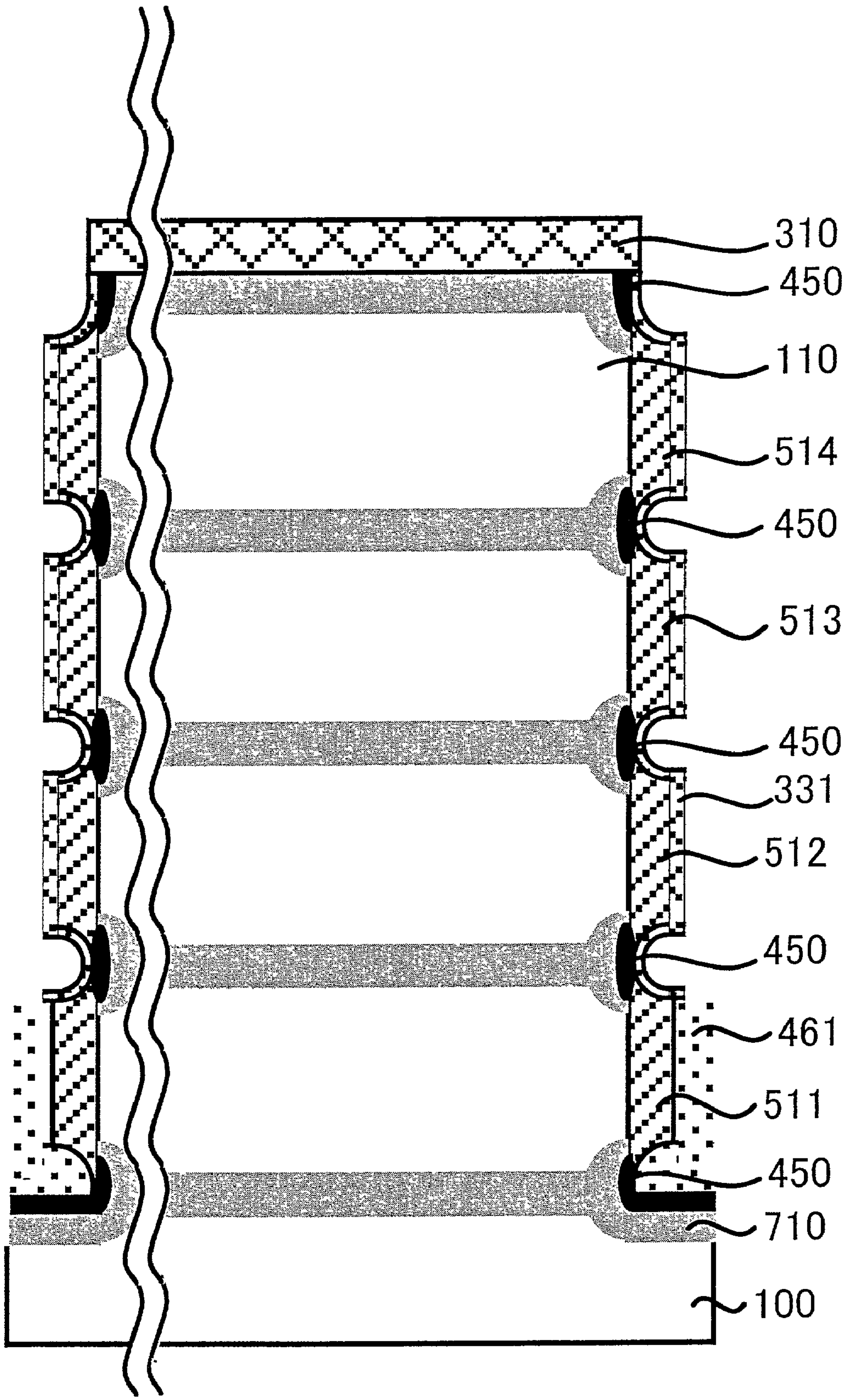
Figure 627:
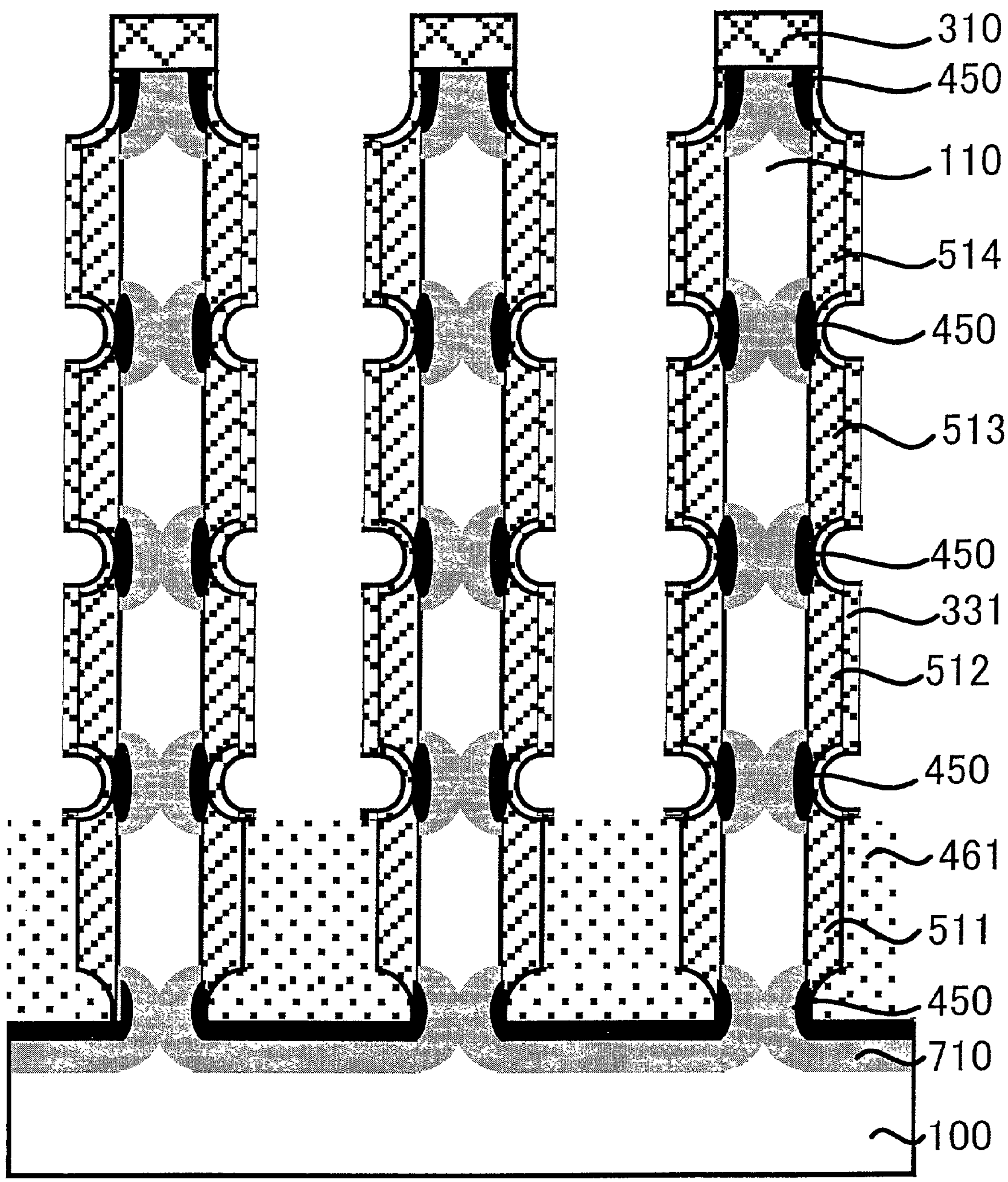

Thereafter, the sidewall spacers 321 to 324 of the silicon nitride film (the fourth insulating film) are removed, for example, by isotropic etching. Then, a silicon oxide film (eighth insulating film) 461 is deposited to a thickness of 50 to 500 nm and isotropically and anisotropically etched so that the silicon oxide film 461 is embedded to bury a side portion of the polysilicon 511. A ninth insulating film, for example, a silicon nitride film 331, is deposited to a thickness of 5 to 50 nm on the polysilicon films (the first conductive films) 512 to 514 and the silicon oxide film (the seventh insulating film) 450 to form sidewall spacers (FIG. 599 and FIG. 627).

Figure 600:
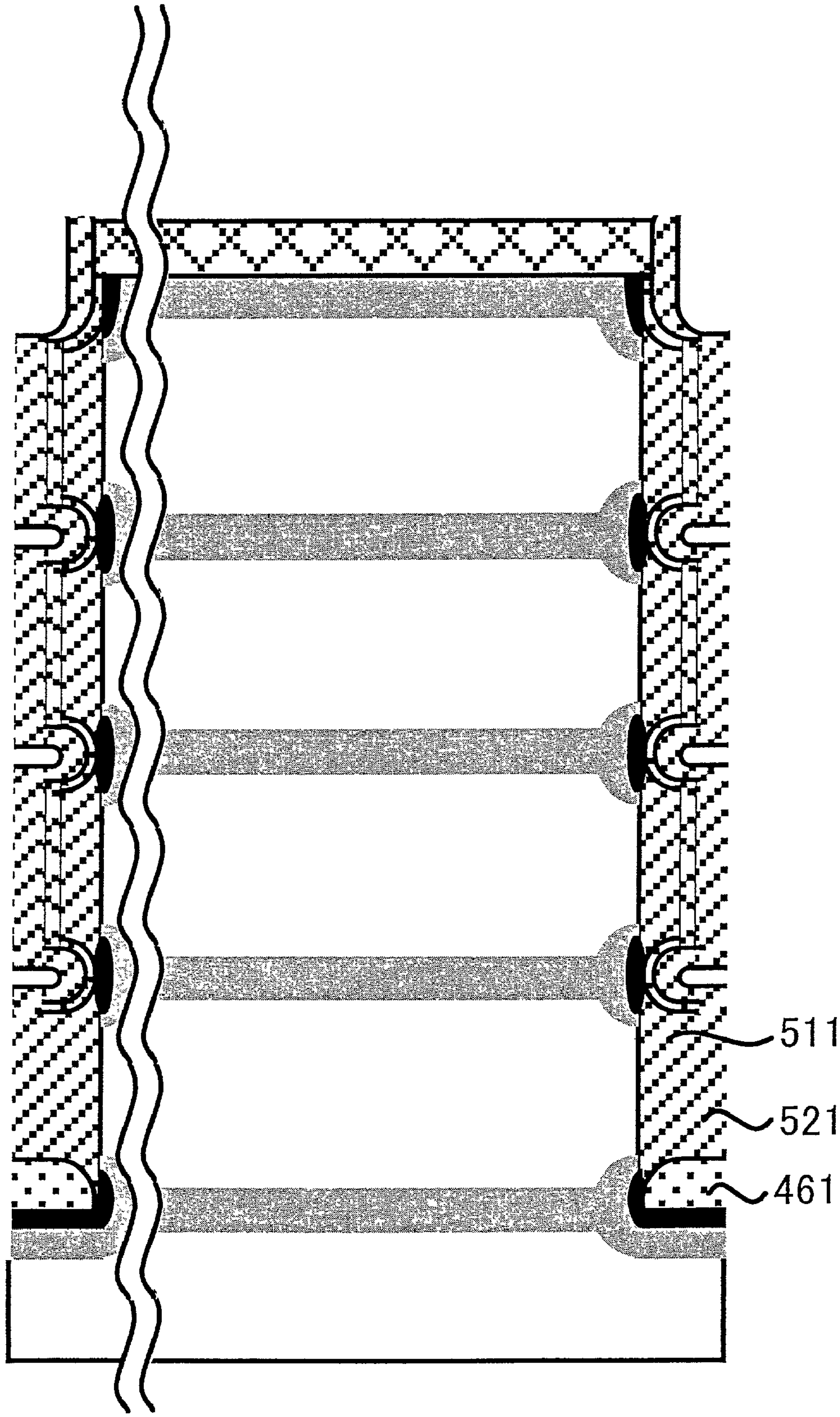
Figure 628:
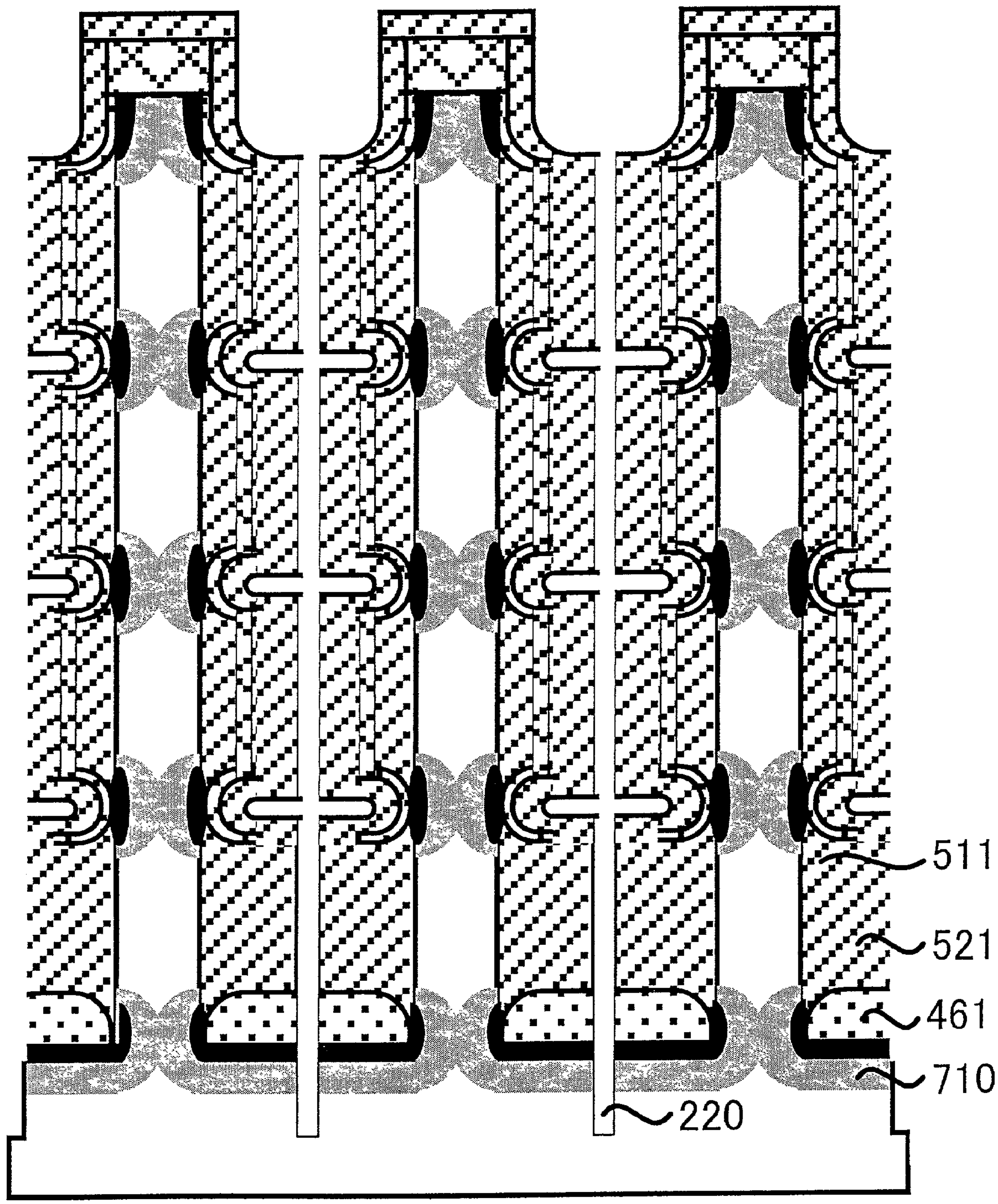

Subsequently, the silicon oxide film 461 is etched back to such a degree that the side portion of the polysilicon film 511 is exposed, and a second conductive film, for example, a polysilicon film 521, is deposited to a thickness of 15 to 150 nm (FIG. 600). Then, as shown in FIG. 628, a second trench 220 is formed in the P-type silicon substrate 100 in self-alignment with the polysilicon film 521 to separate the impurity diffusion layer 710. That is, a separation of the first wiring layer is realized in self-alignment with a separation of the second conductive film.

Figure 601:
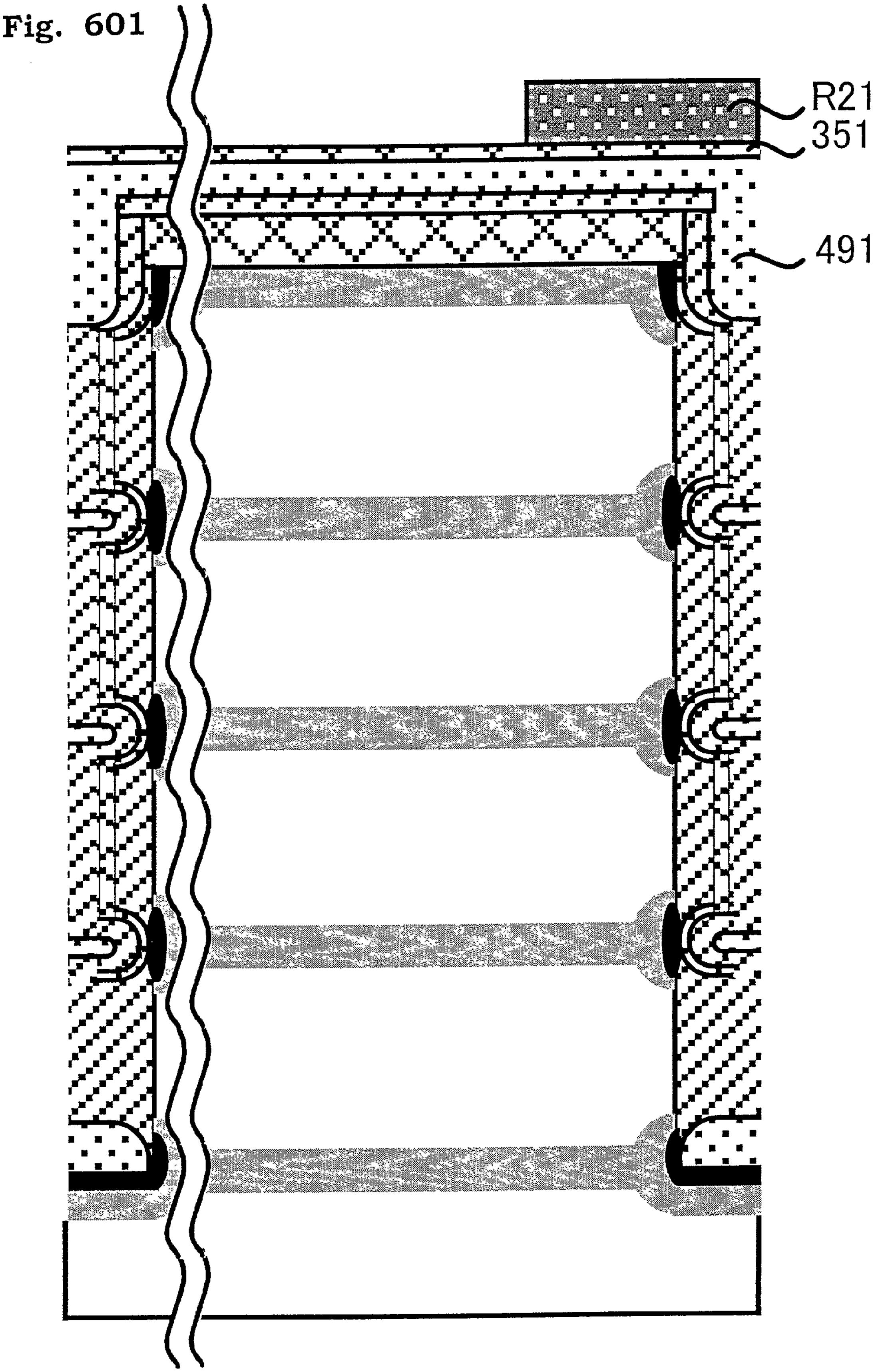
Figure 606:
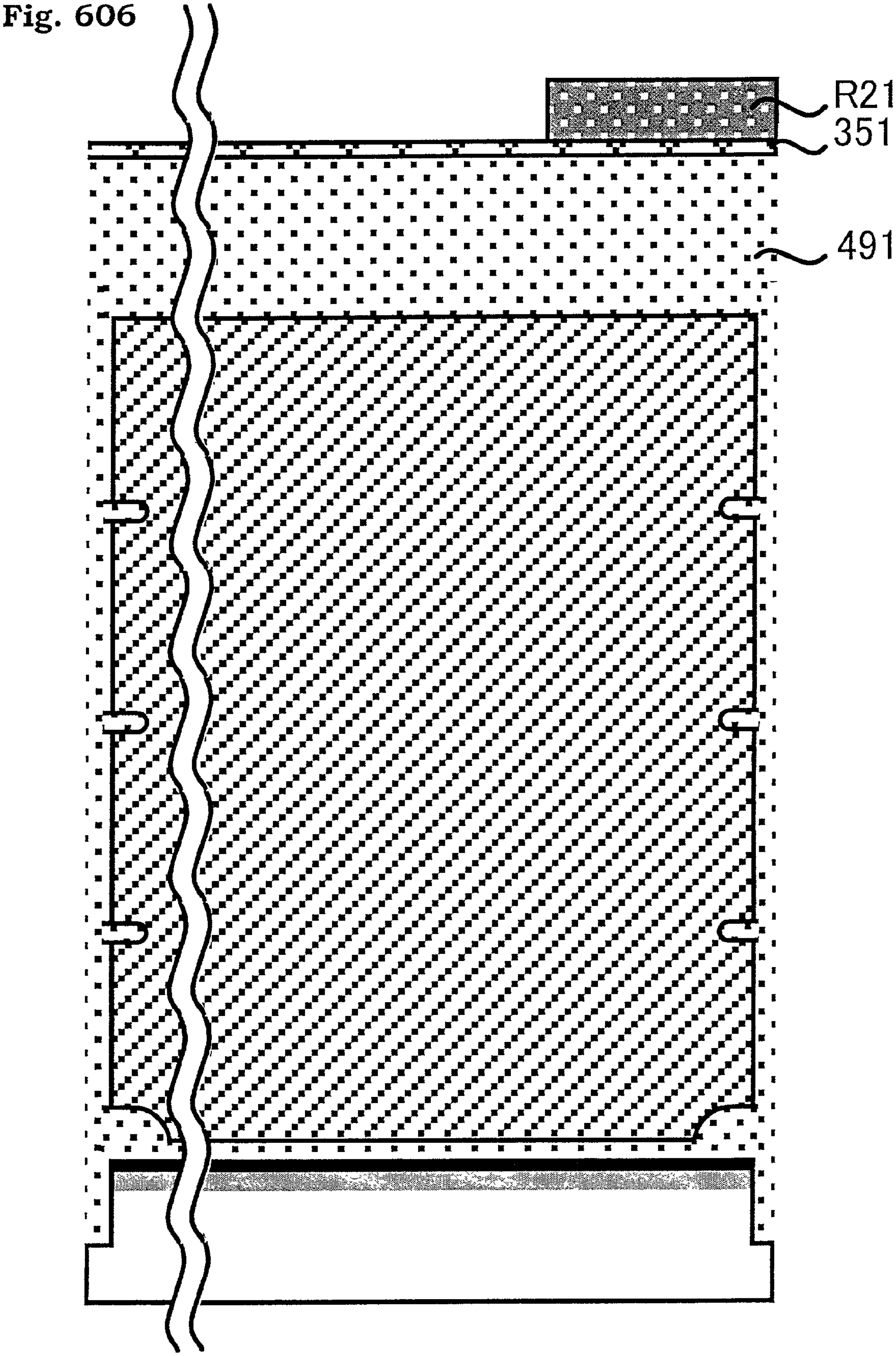
FIG. 606 to FIG. 613 are sectional views (taken on line F–F' in FIG. 1) illustrating production steps of Production Example 21 for producing a semiconductor memory in accordance with the present invention.
Figure 629:
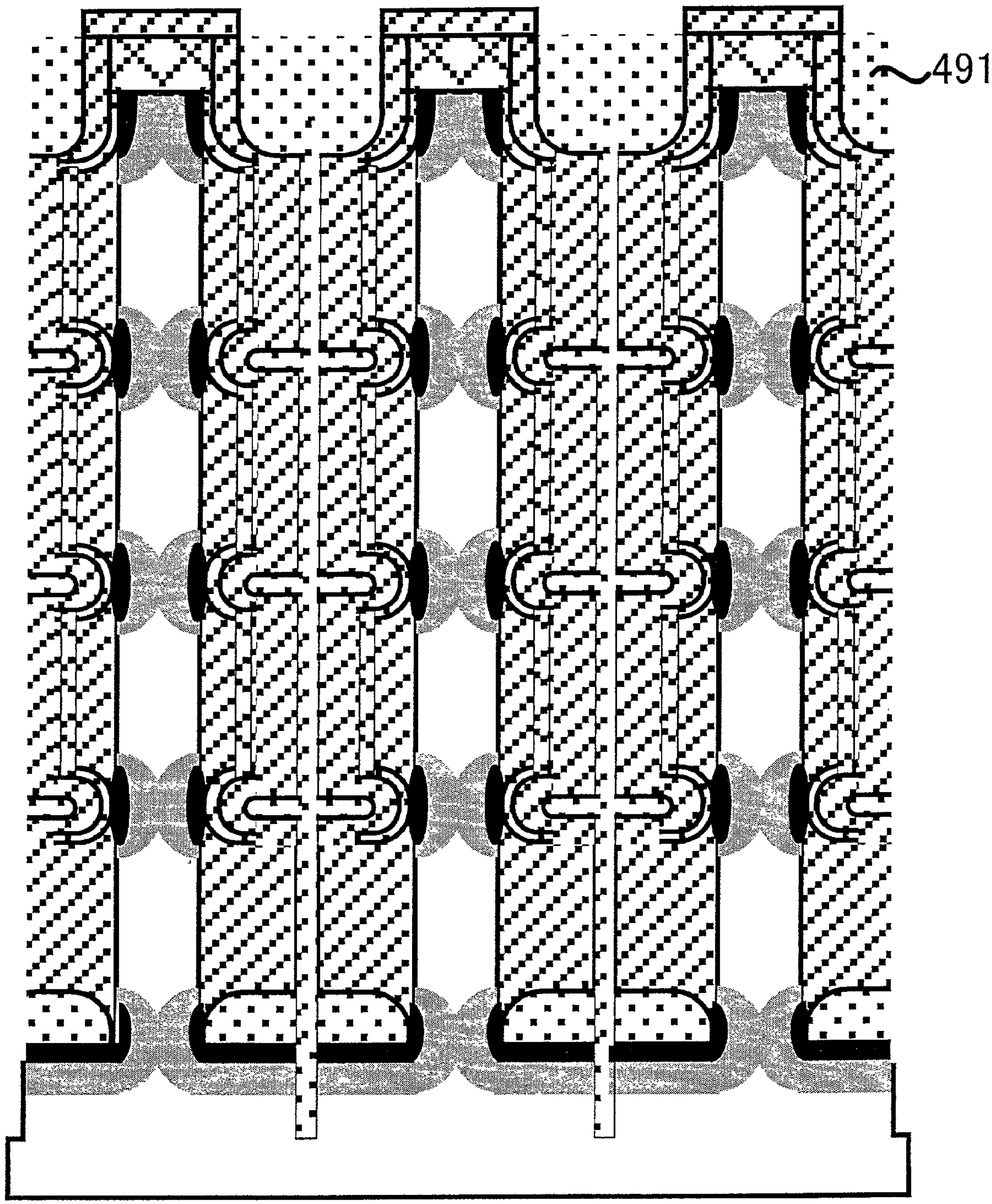

Thereafter, a fifteenth film, for example, a silicon oxide film 491 is deposited to a thickness of 50 to 500 nm and is embedded to bury the second trench 220. A fourteenth insulating film, for example, a silicon nitride film 351 is deposited to a thickness of 5 to 50 nm and is etched by reactive ion etching using a resist film R21 patterned by photolithography (FIG. 601, FIG. 606 and FIG. 629).

Figure 602:
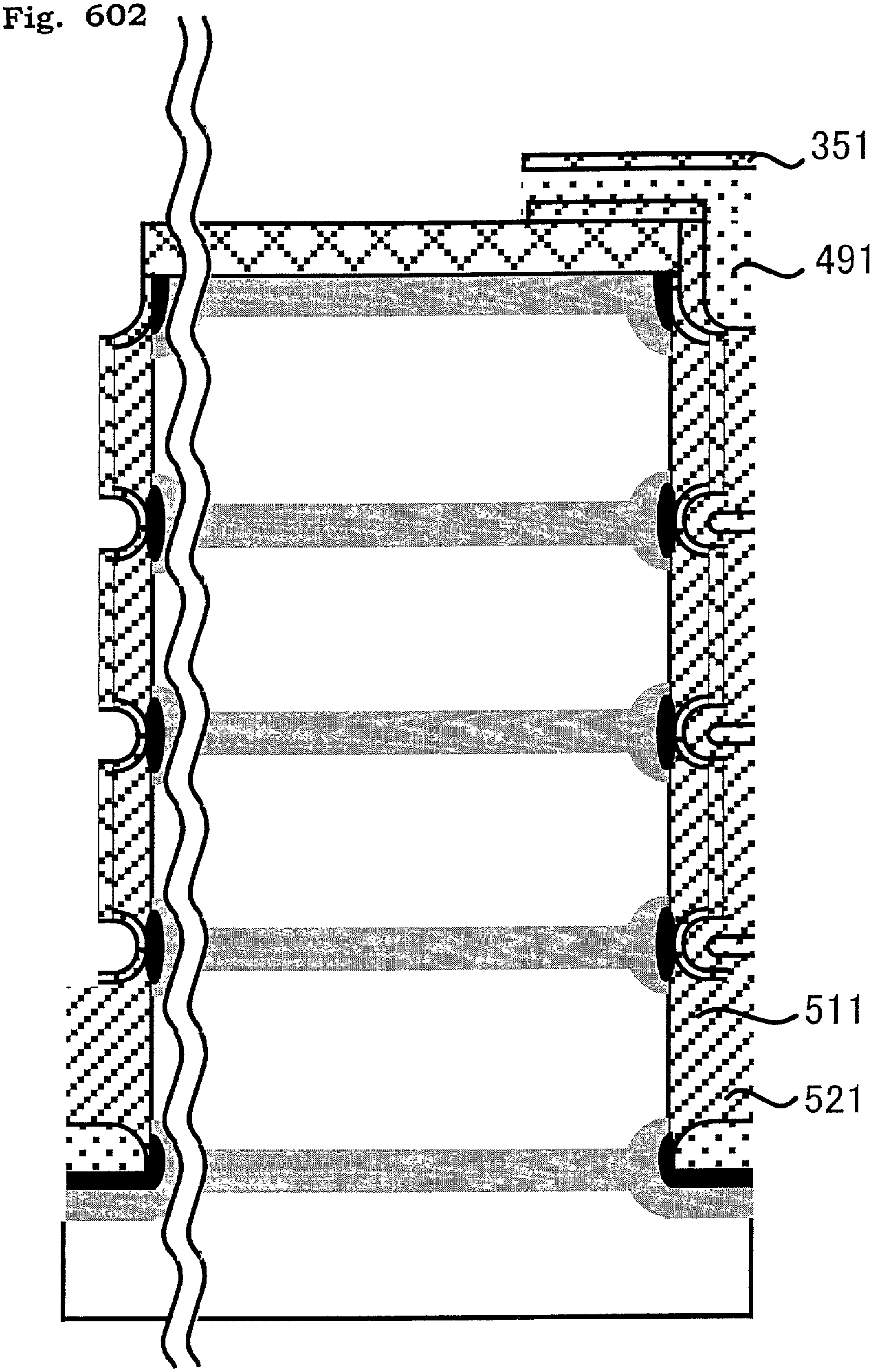
Figure 607:
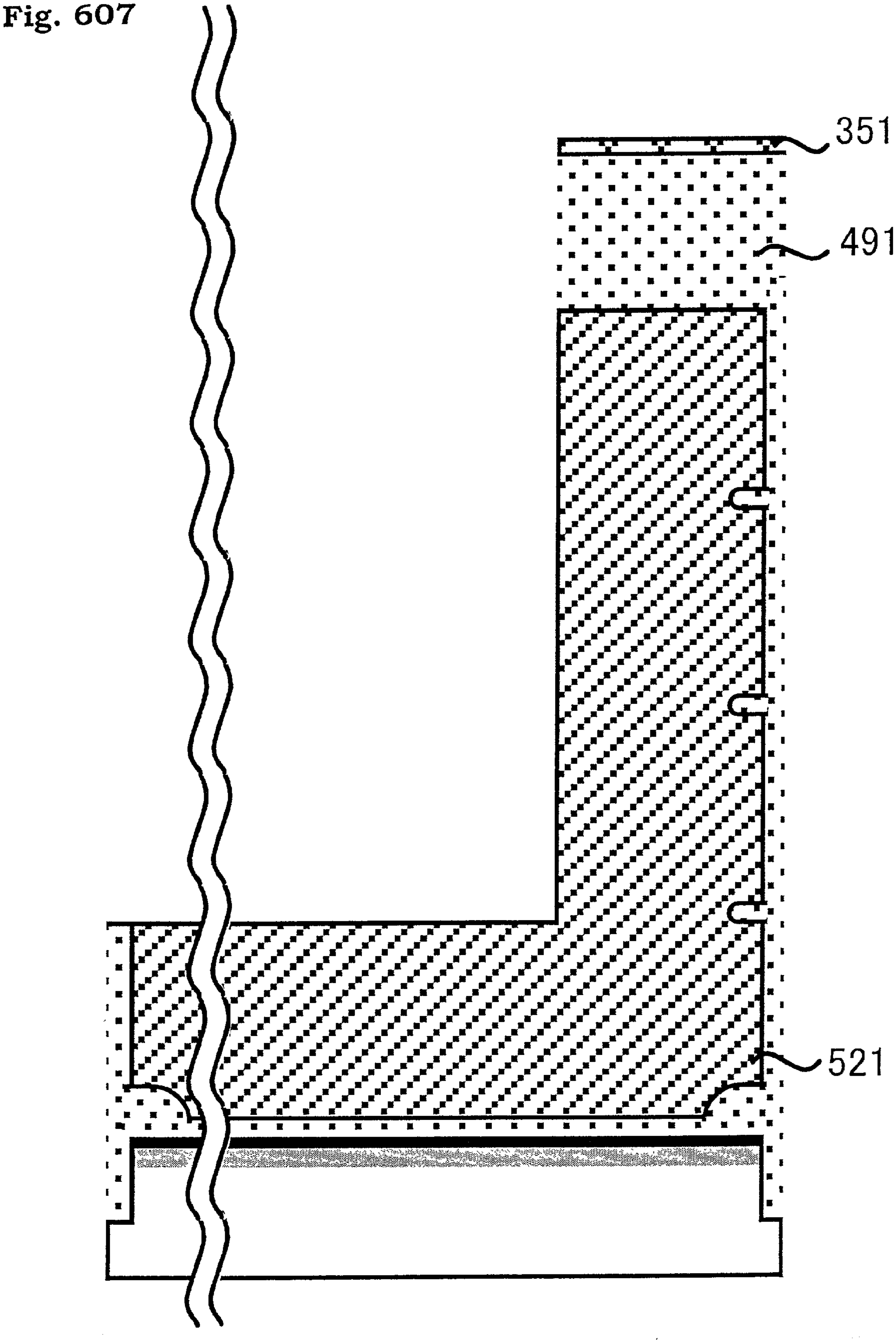
Figure 630:
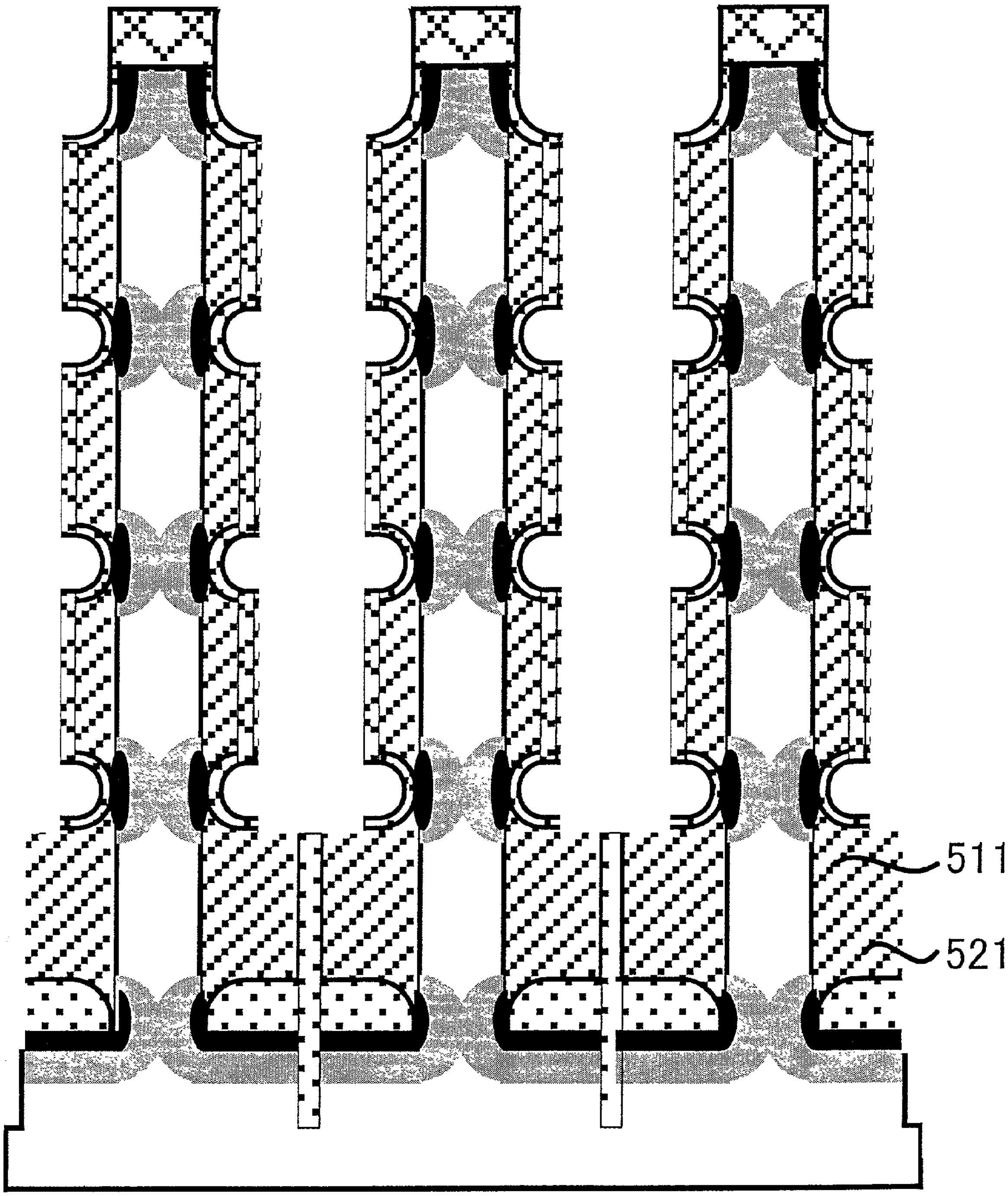

Using the silicon nitride film (the fourteenth insulating film) 351 as a mask, the silicon oxide film (the fifteenth insulating film) 491 and the polysilicon film (the second conductive film) 521 may be etched back to a level almost the same as the top of the polysilicon film (the first conductive film) 511. Alternatively, they may be etched back using the resist film R21 as a mask continually instead of using the silicon nitride film 351 as a mask (FIG. 602, FIG. 607 and FIG. 630). At this time, by setting the interval between the island-like semiconductor layers 110 in an E–E' direction in FIG. 1 to a predetermined value or smaller, the polysilicon film 521 is formed into a second wiring layer to be a selection gate line continuous in the direction.

Figure 603:
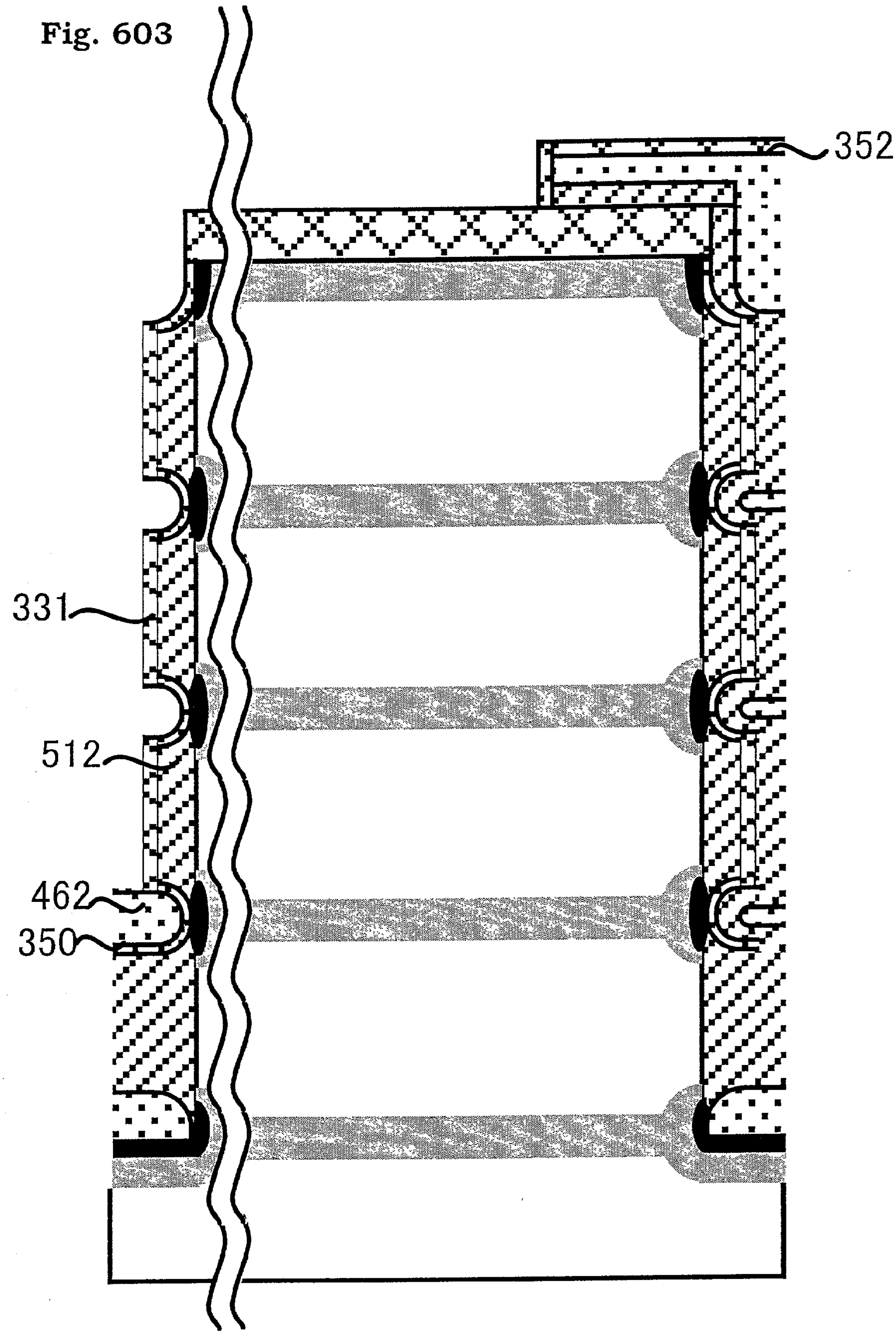
Figure 608:
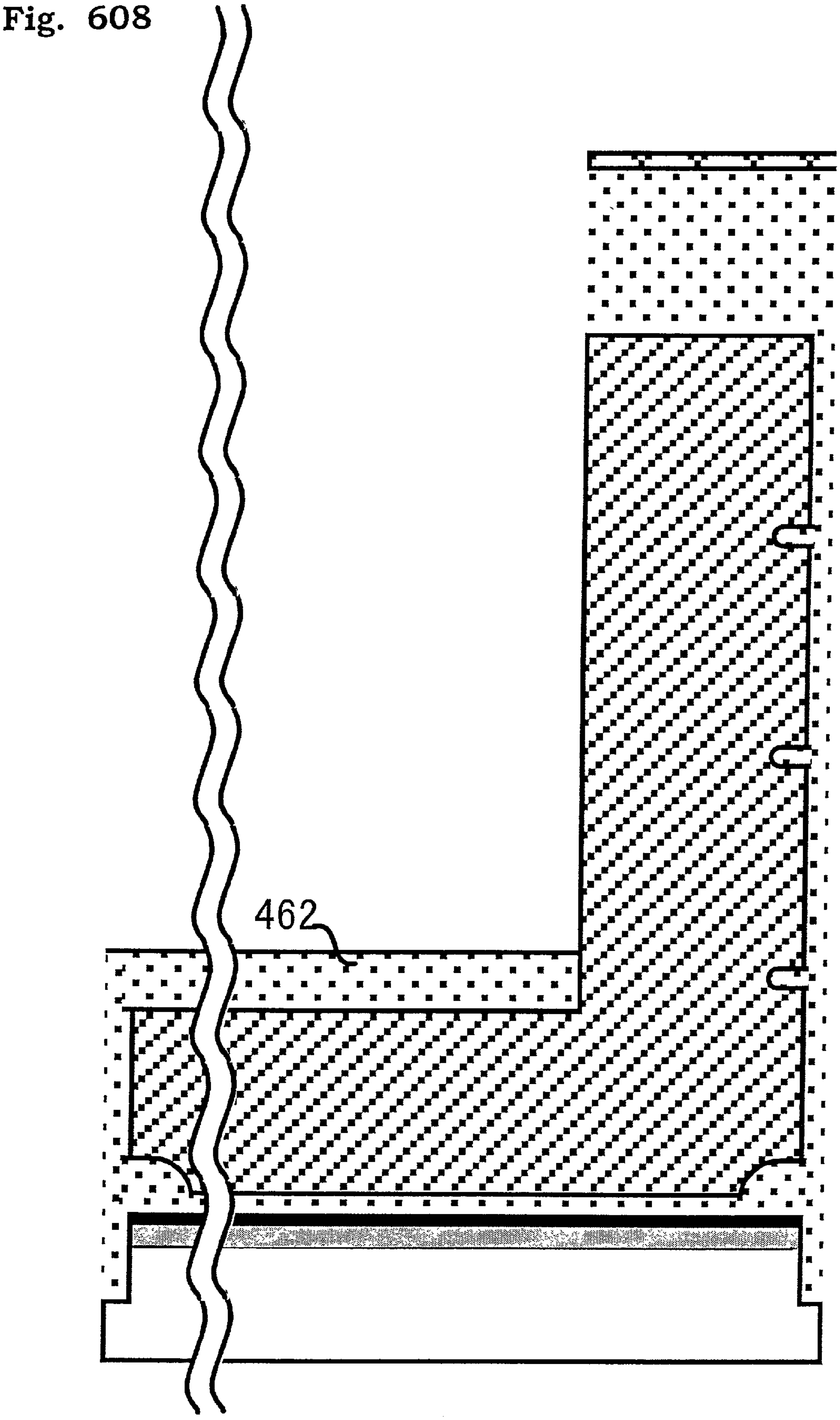
Figure 631:
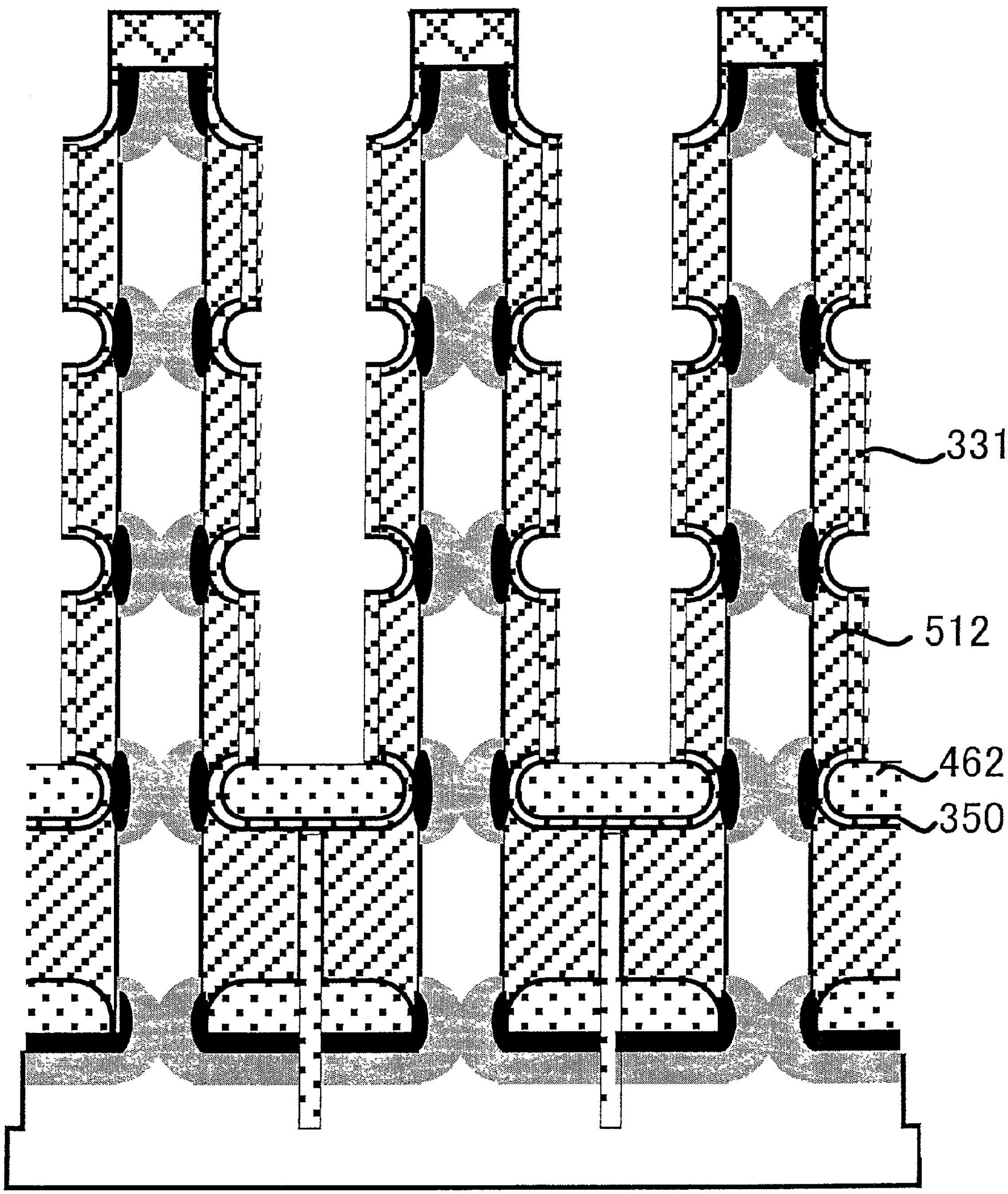

A silicon nitride film 352 is deposited to a thickness of 5 to 50 nm as a fourteenth insulating film by CVD and a silicon oxide film 462 which is an eighth insulating film is deposited to a thickness of 50 to 500 nm. The silicon oxide film 462 is etched back to a level almost the same as the bottom of the polysilicon film (the first conductive film) 512 by anisotropic and isotropic etching (FIG. 603, FIG. 608 and FIG. 631).

Thereafter, the sidewall spacer of the silicon nitride film (the fifth insulating film) 331 is removed by isotropic etching, and an interlayer insulating film 612 is formed on exposed surfaces of the polysilicon films 512 to 514. This interlayer insulating film 612 may be formed of an ONO film, for example. More particularly, a silicon oxide film of 5 to 10 nm thickness is formed on the surface of the polysilicon film by thermal oxidization, and then, a silicon nitride film of 5 to 10 nm thickness and a silicon oxide film of 5 to 10 nm thickness are formed sequentially by CVD.

Figure 604:
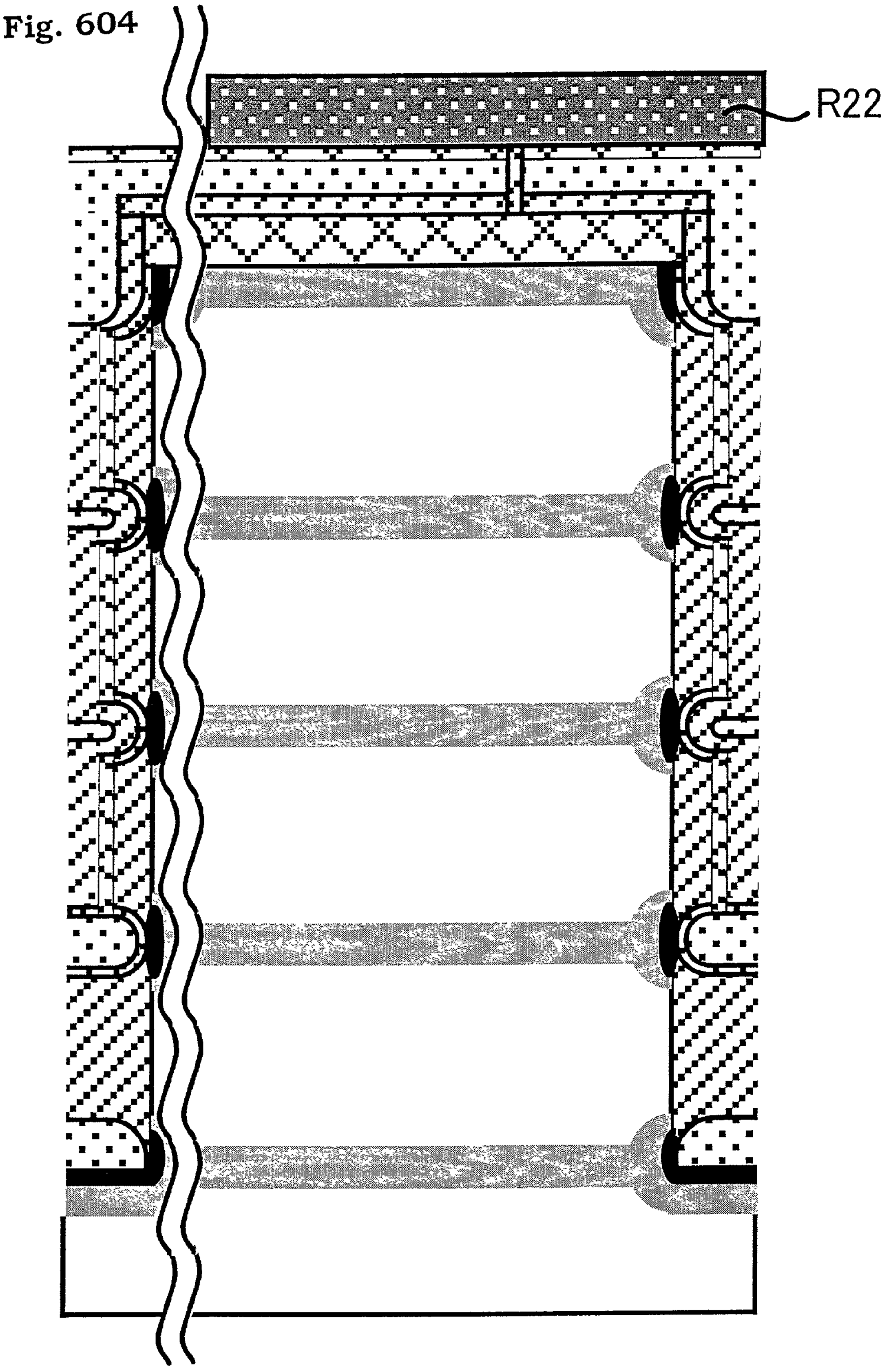
Figure 609:
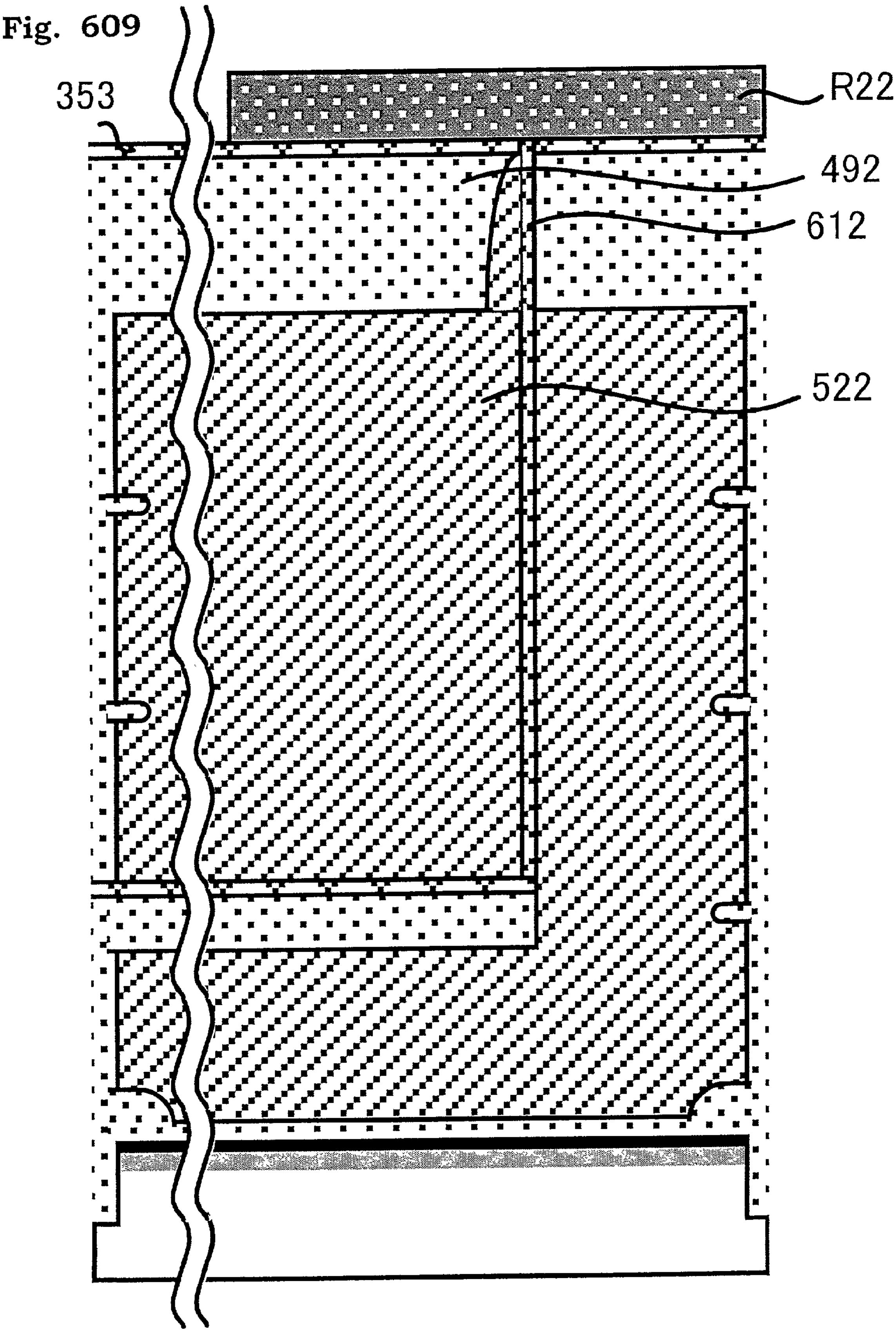
Figure 632:
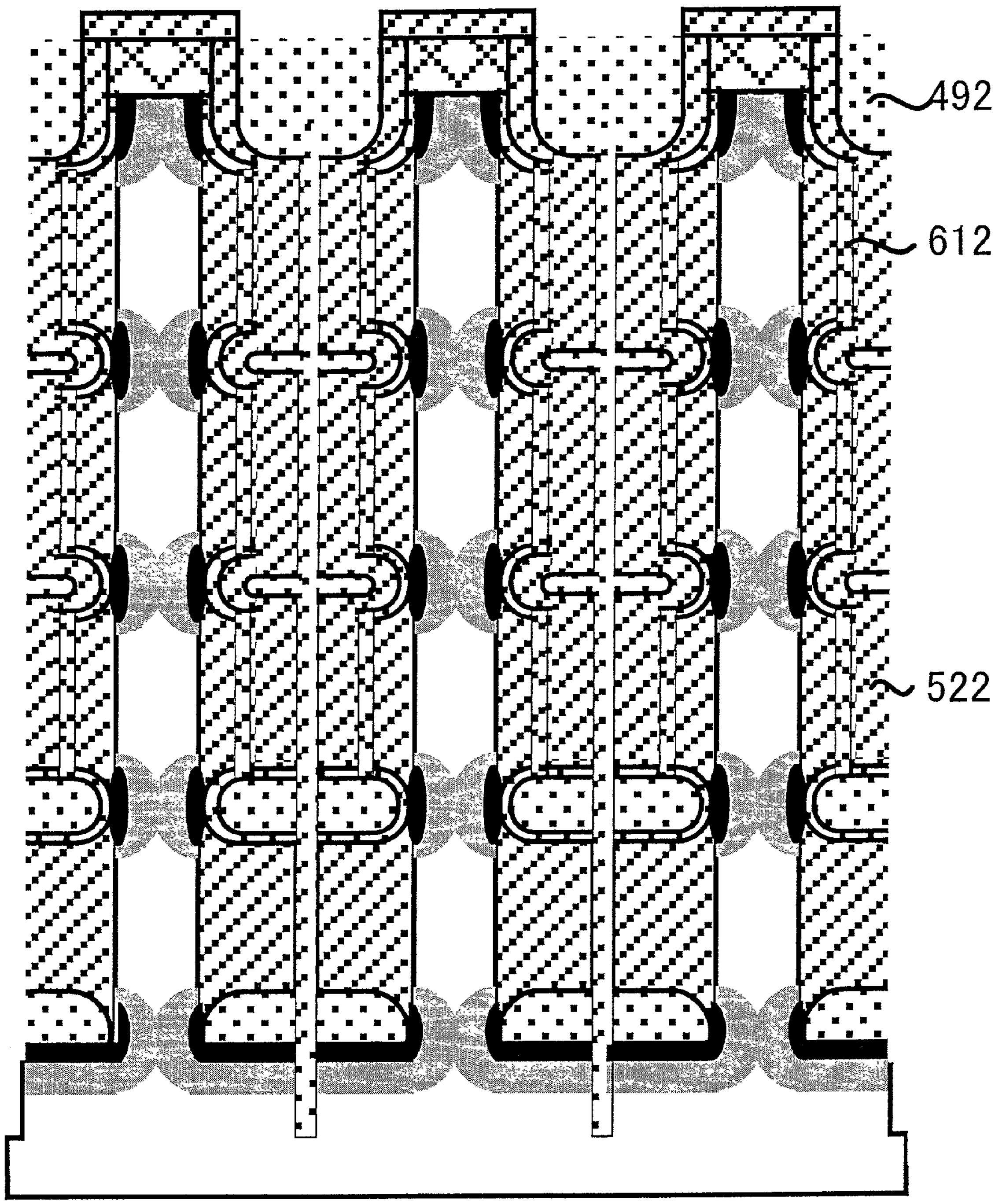

Subsequently, likewise, a polysilicon film 522 to be a second conductive film is deposited to a thickness of 15 to 150 nm, a silicon oxide film 492 which is a fifteenth insulating film is deposited to a thickness of 50 to 500 nm, and a fourteenth insulating film, for example, a silicon nitride film 353, is deposited to a thickness of 5 to 50 nm. The silicon nitride film (the fourteenth insulating film) 353 is etched by reactive ion etching using as a mask a resist film R22 patterned by photolithography (FIG. 604, FIG. 609 and FIG. 632). Here, a region masked by the resist film R22 includes at least part of a region masked by the resist film R21.

Figure 605:
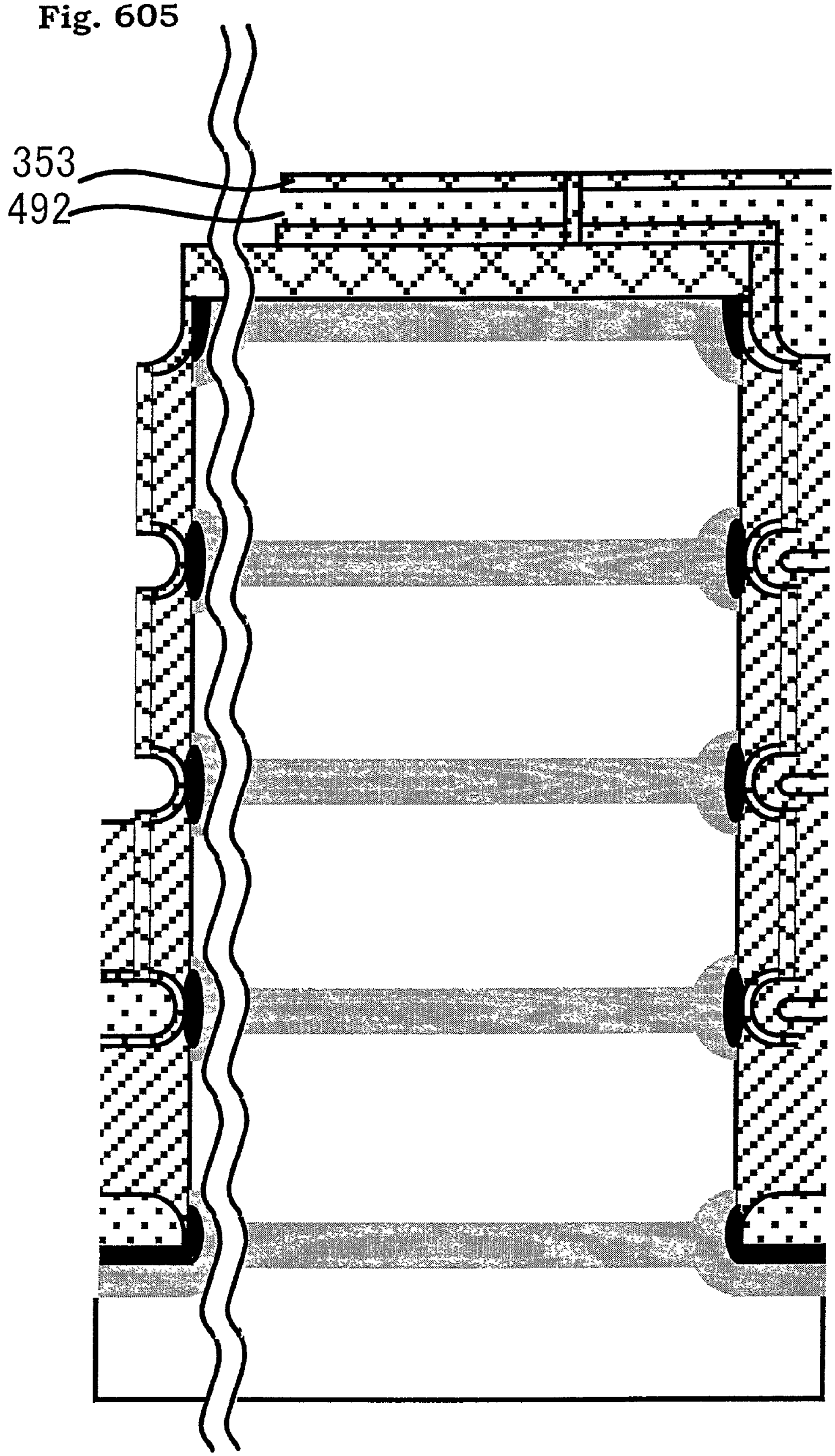
Figure 633:
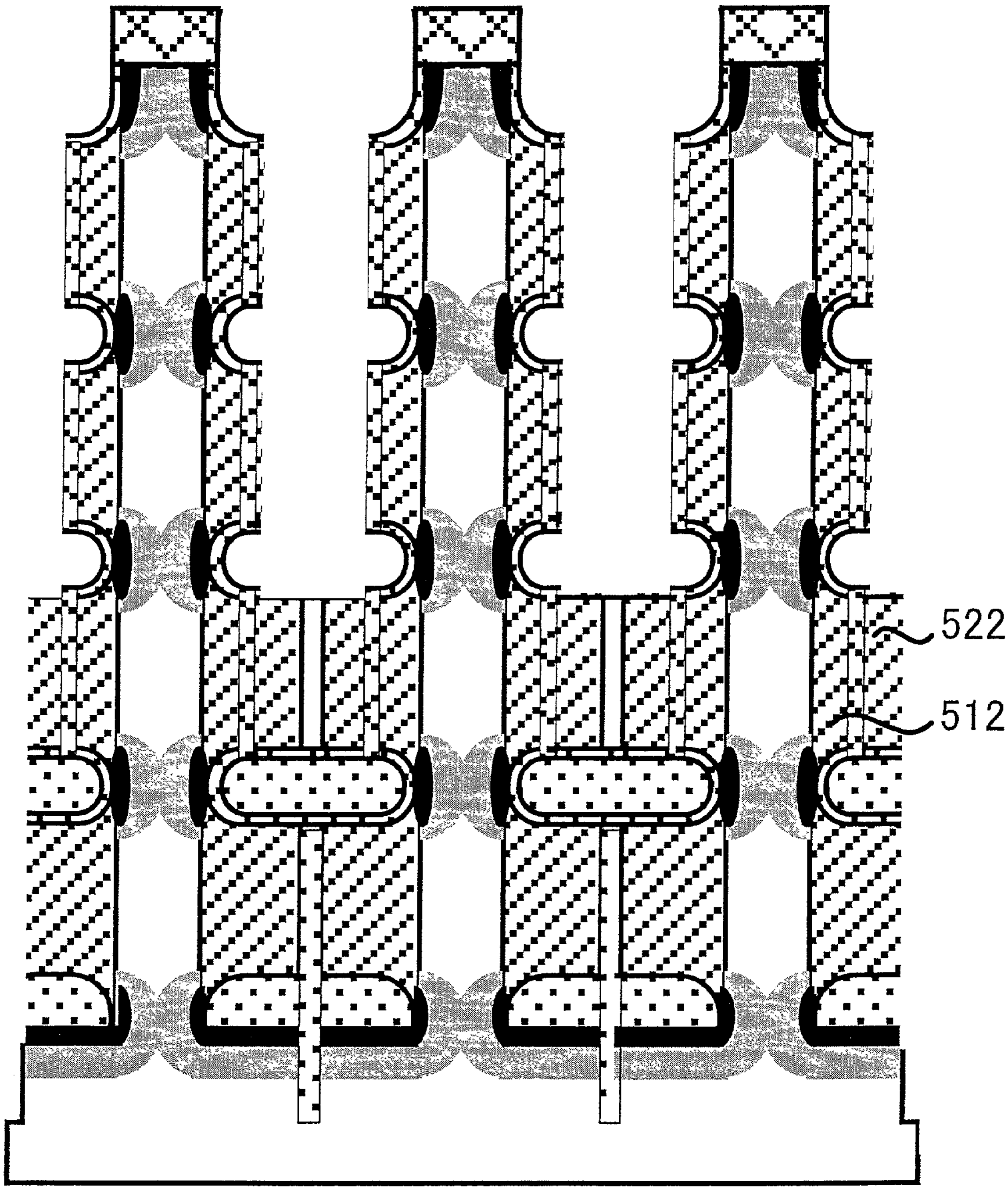
Figure 634:
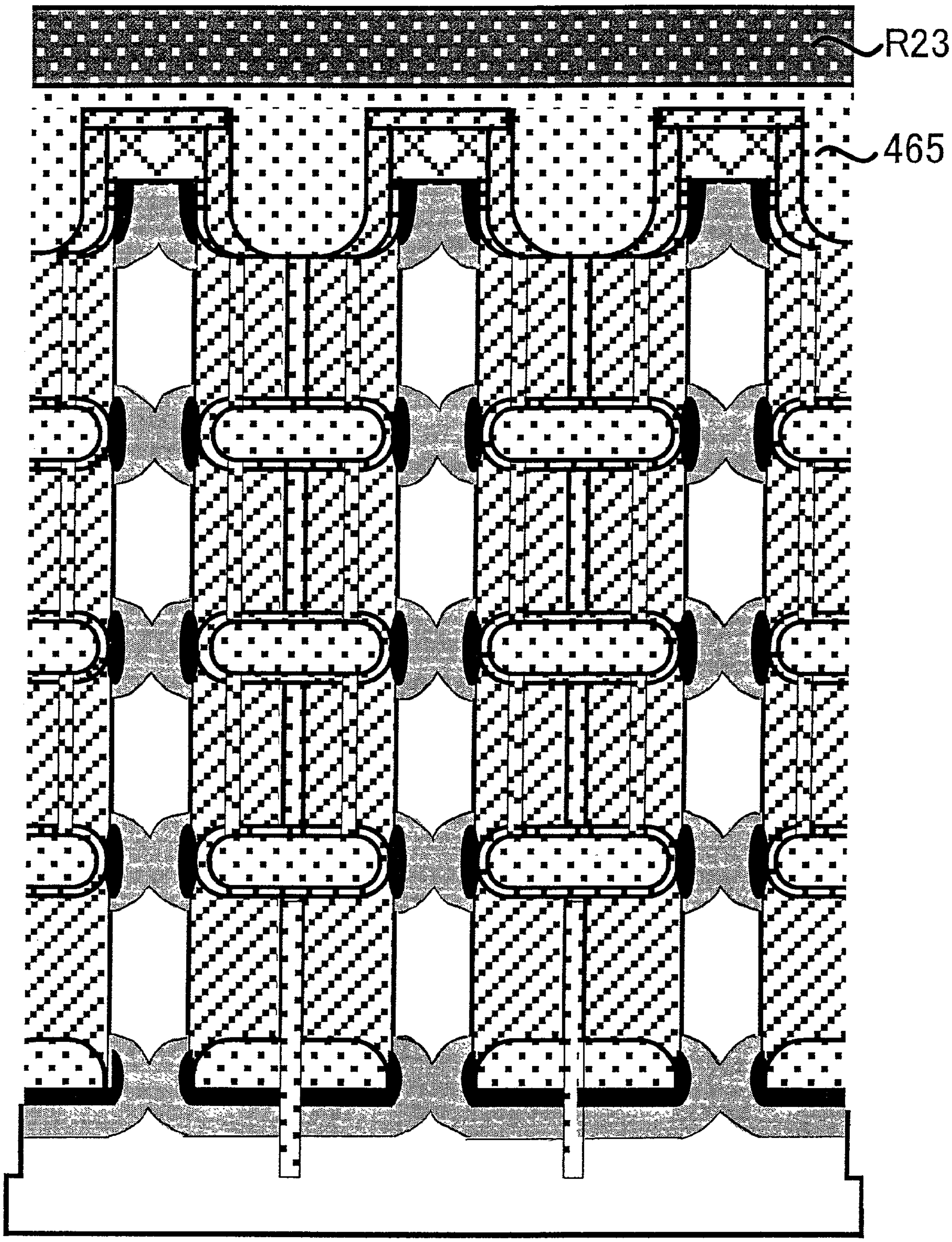
Figure 635:
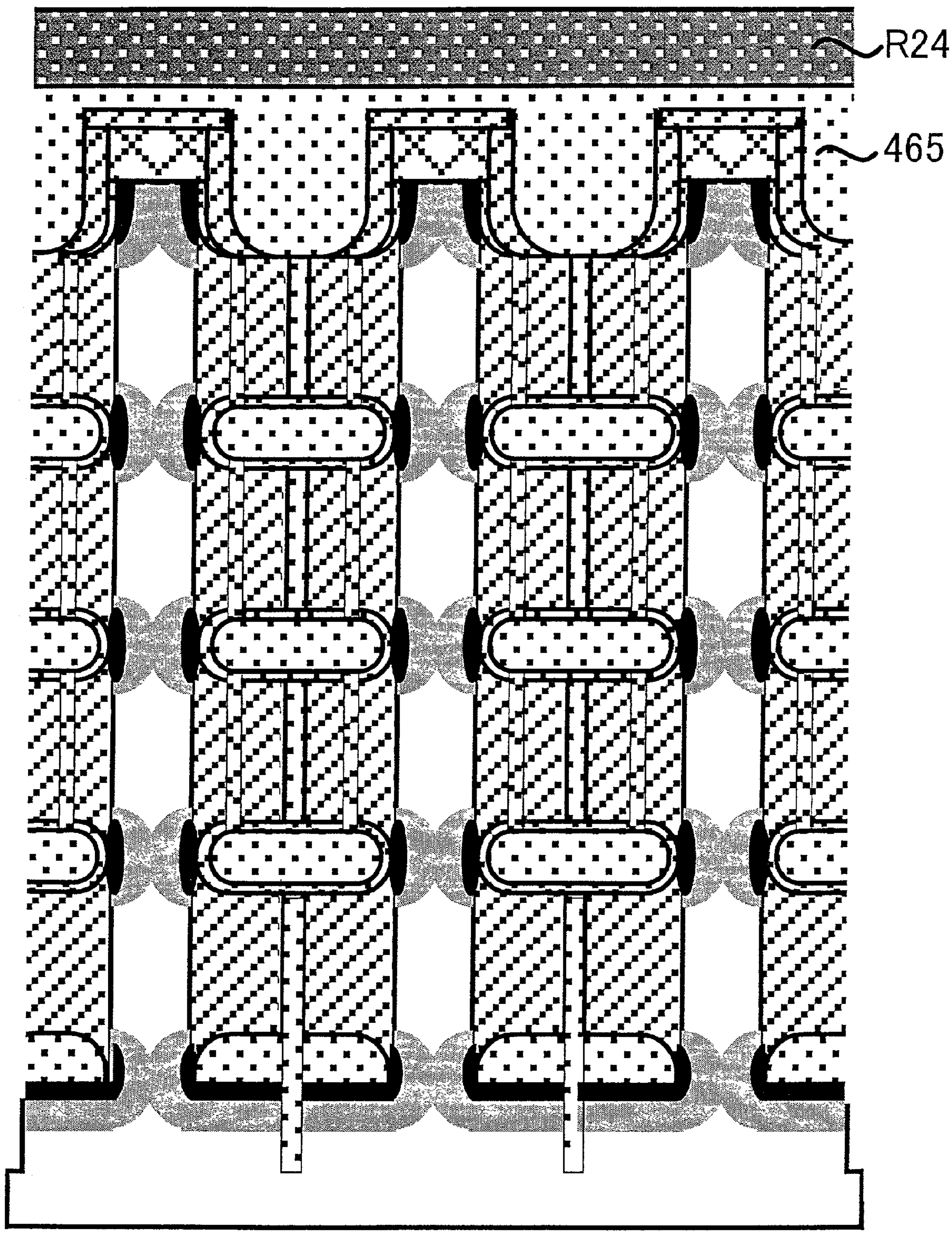

Using the silicon nitride film (the fourteenth insulating film) 353 as a mask, the silicon oxide film (the fifteenth insulating film) 492 and the polysilicon film (the second conductive film) 522 may be etched back to a level almost the same as the top of the polysilicon film (the first conductive film) 512. Alternatively, they may be etched back using the resist film R22 as a mask continually instead of using the silicon nitride film 353 as a mask (FIG. 605, FIG. 610 and FIG. 633).

At this time, by setting the interval between the island-like semiconductor layers 110 in the E–E' direction in FIG. 1 to a predetermined value or smaller, the polysilicon film 522 is formed into a third wiring layer to be a selection gate line continuous in the direction.

Figure 610:
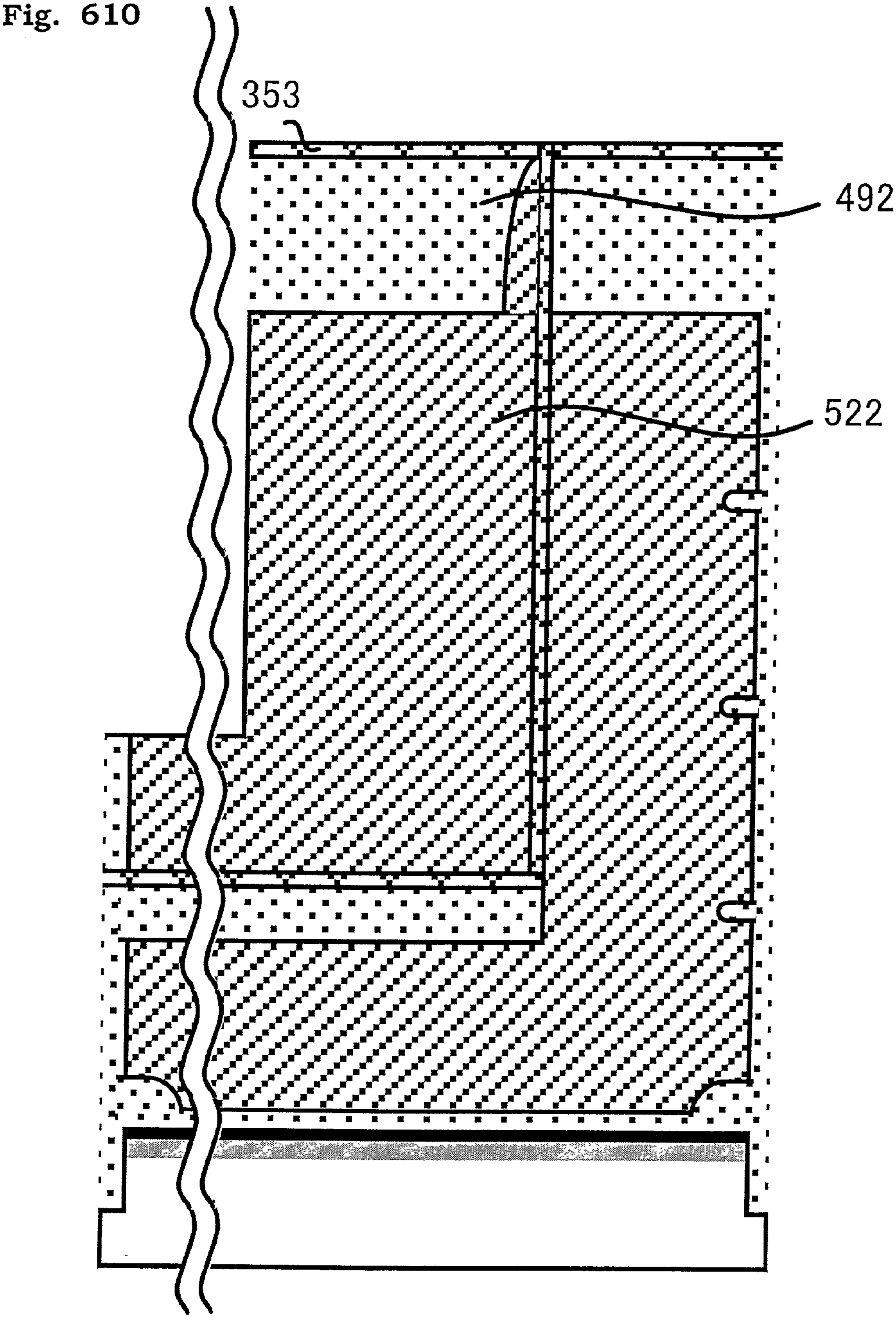
Figure 611:
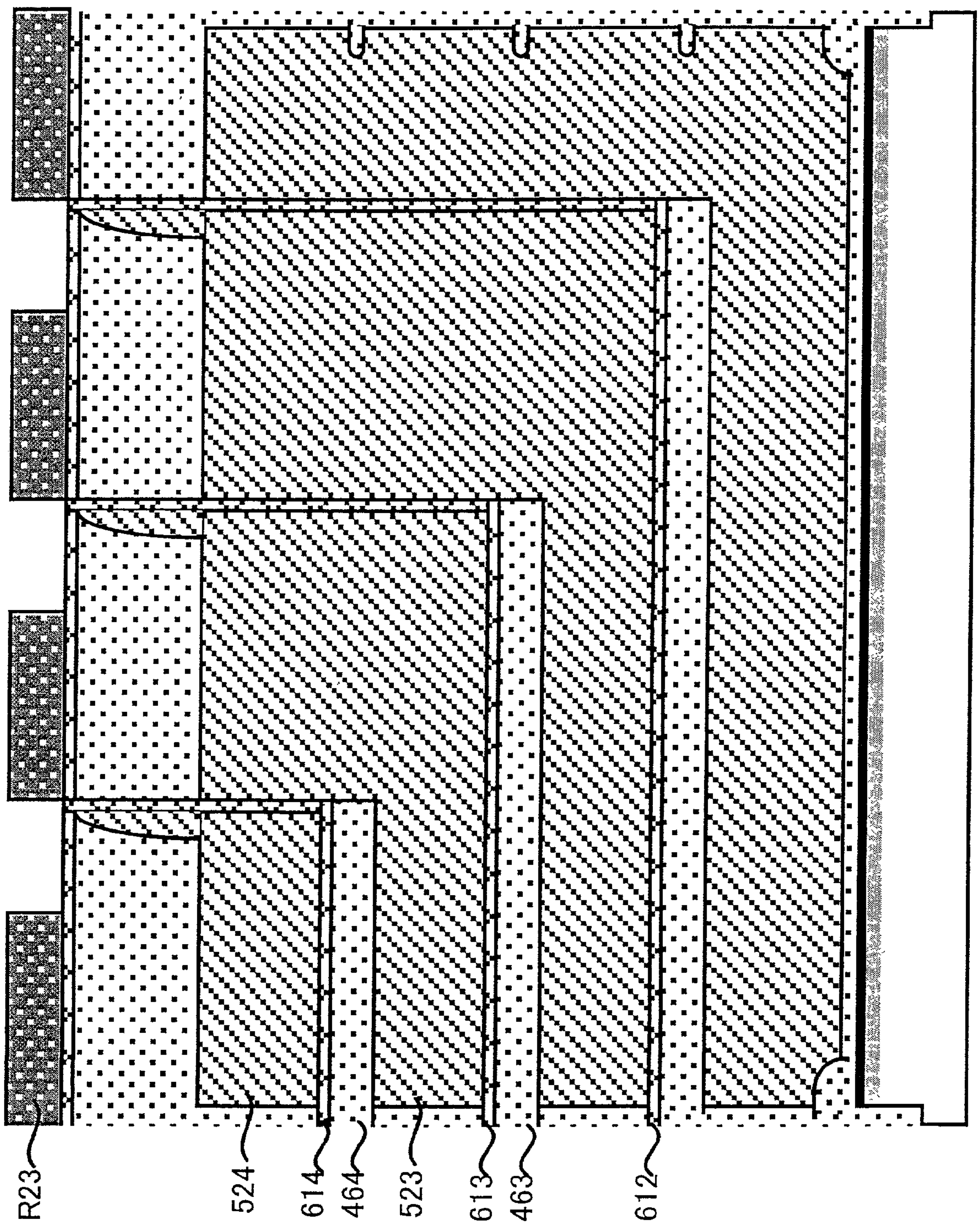
Figure 612:
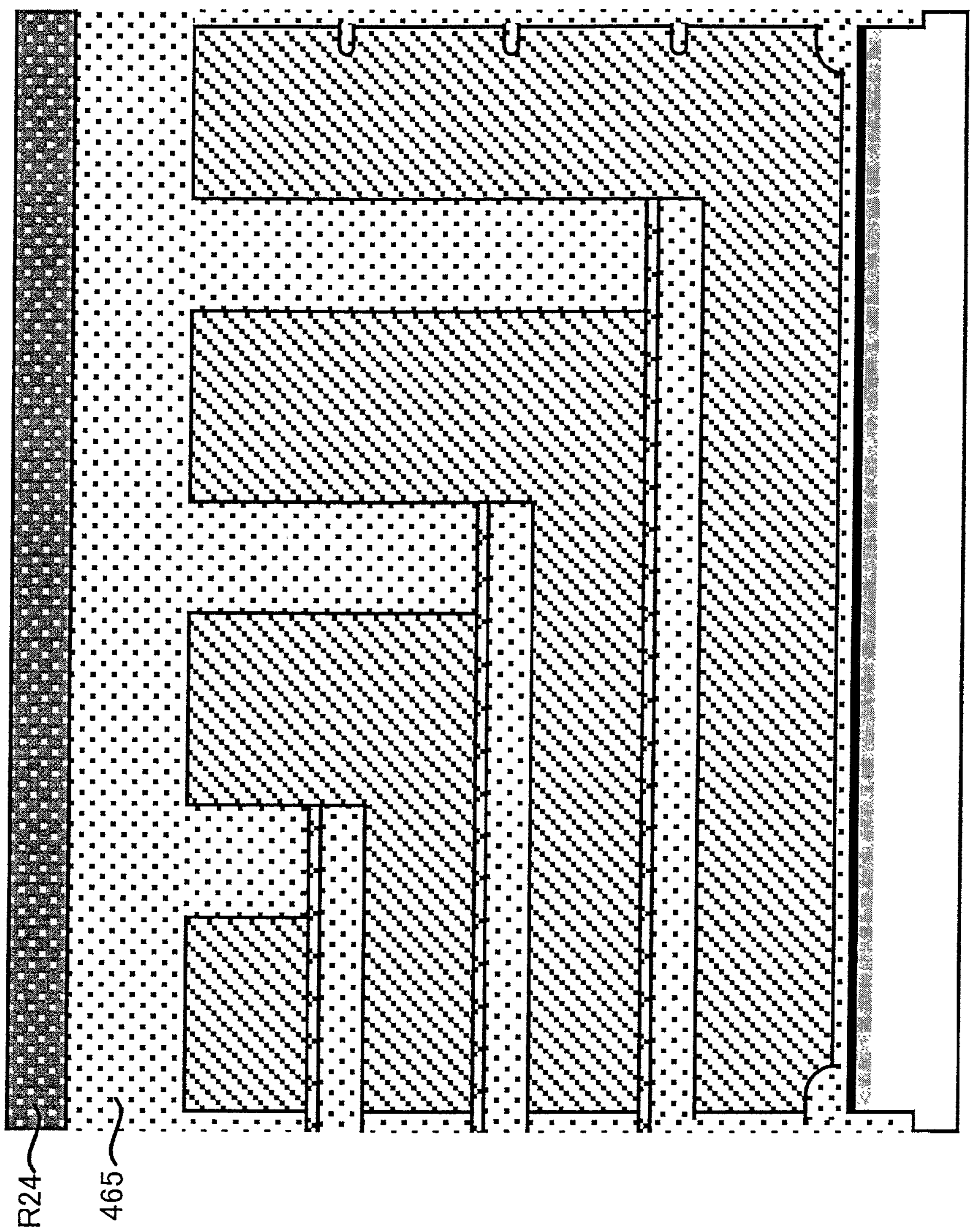

By the above-described process, as shown in FIG. 610, a region where the polysilicon film (the second conductive film) 521 is located as an conductive film the nearest to the upper face of the island-like semiconductor layer and a region where the polysilicon film (the second conductive film) 522 is located as an conductive film the nearest to the upper face of the island-like semiconductor layer are formed with intervention of an interlayer insulating film 612 and a silicon oxide film (the eighth insulating film) 462, respectively.

By repeating likewise, a polysilicon film (a second conductive film) 523 is disposed on the side portion of the polysilicon film (the first conductive film) 513 with intervention of an interlayer insulating film 613, and a region where the polysilicon film (the second conductive film) 523 is located as an conductive film the nearest to the upper face of the sialnd-like semiconductor layer in the lead-out portions of the second and third wiring layers is formed with intervention of the interlayer insulating film 613 and a silicon oxide film (the eighth insulating film) 463.

Subsequently, a polysilicon film 524 which is a second conductive film is formed on the side portion of the polysilicon film (the first conductive film) 514 with intervention of an interlayer insulating film 614, and a region where the polysilicon film (the second conductive film) 524 is located as an conductive film the nearest to the upper face of the island-like semiconductor layer in the lead-out portions of the second and third wiring layers is formed with intervention of the interlayer insulating film 614 and a silicon oxide film (the eighth insulating film) 464. Using a resist film R23 patterned by photolithography (FIG. 611 and FIG. 634), the polysilicon films 522 to 524 are etched to reach the interlayer insulating films 614, 613 and 612, respectively, by reactive ion etching so that the wiring layers are located at intervals.

Figure 613:
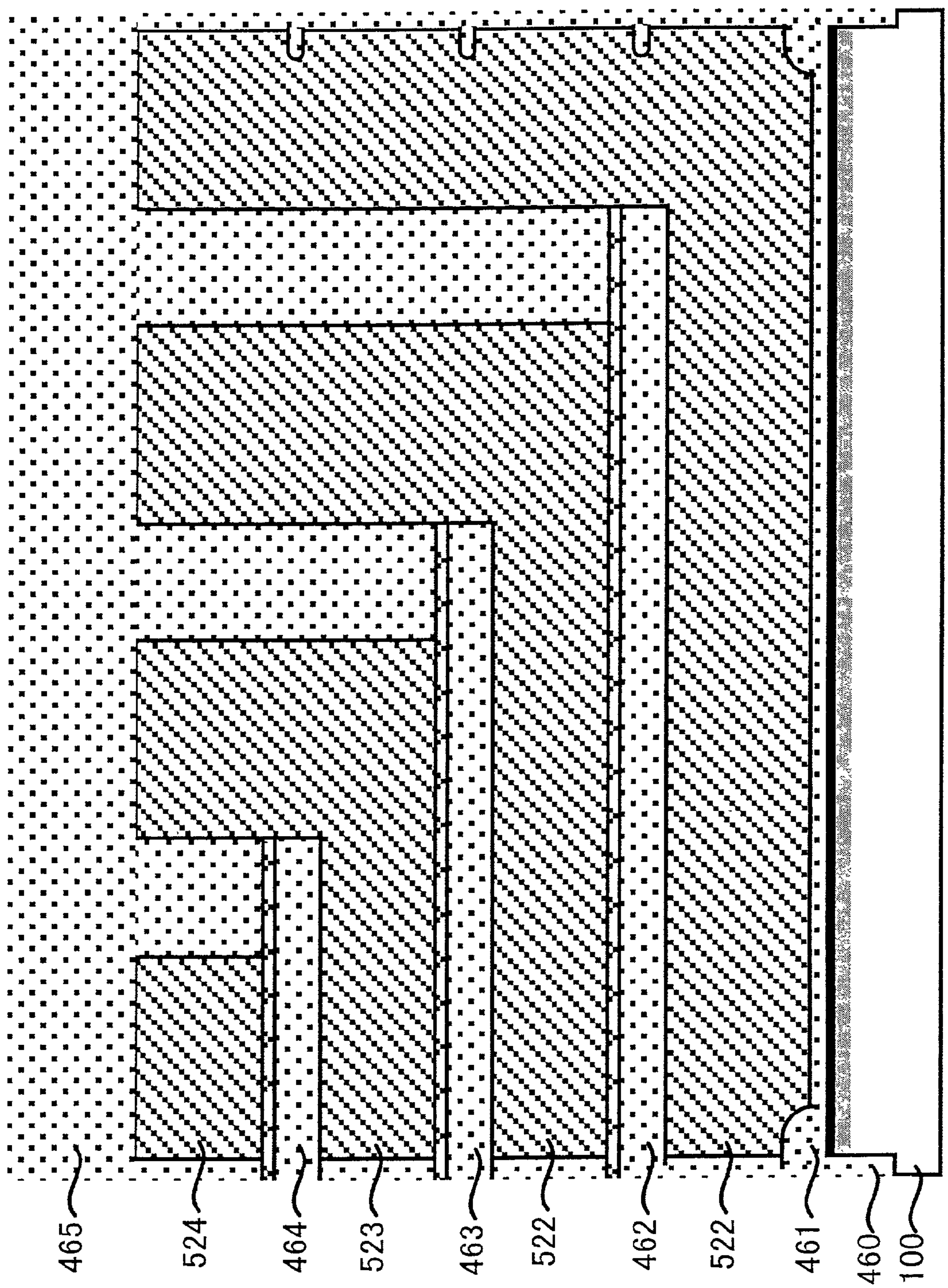
Figure 636:
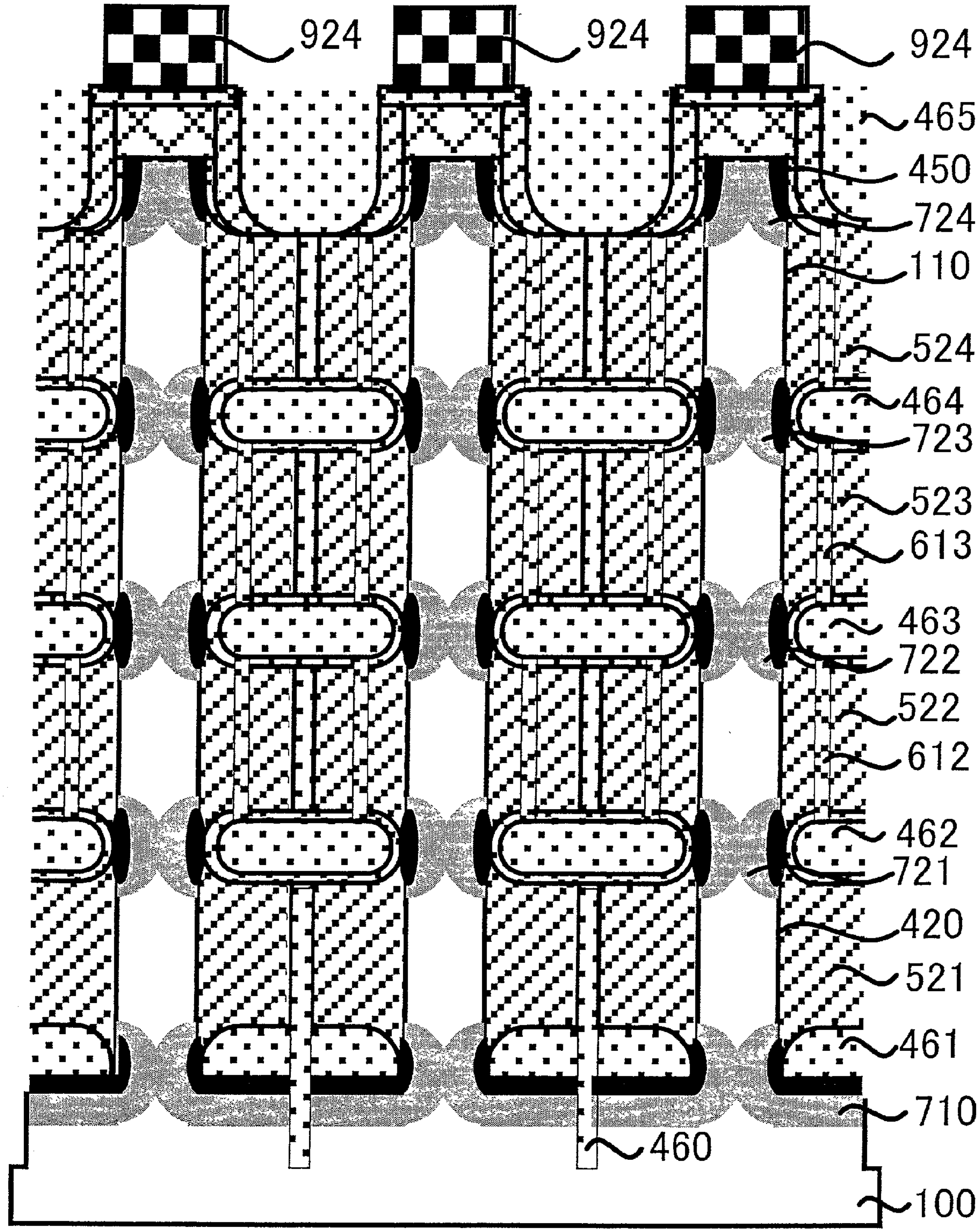
Figure 637:
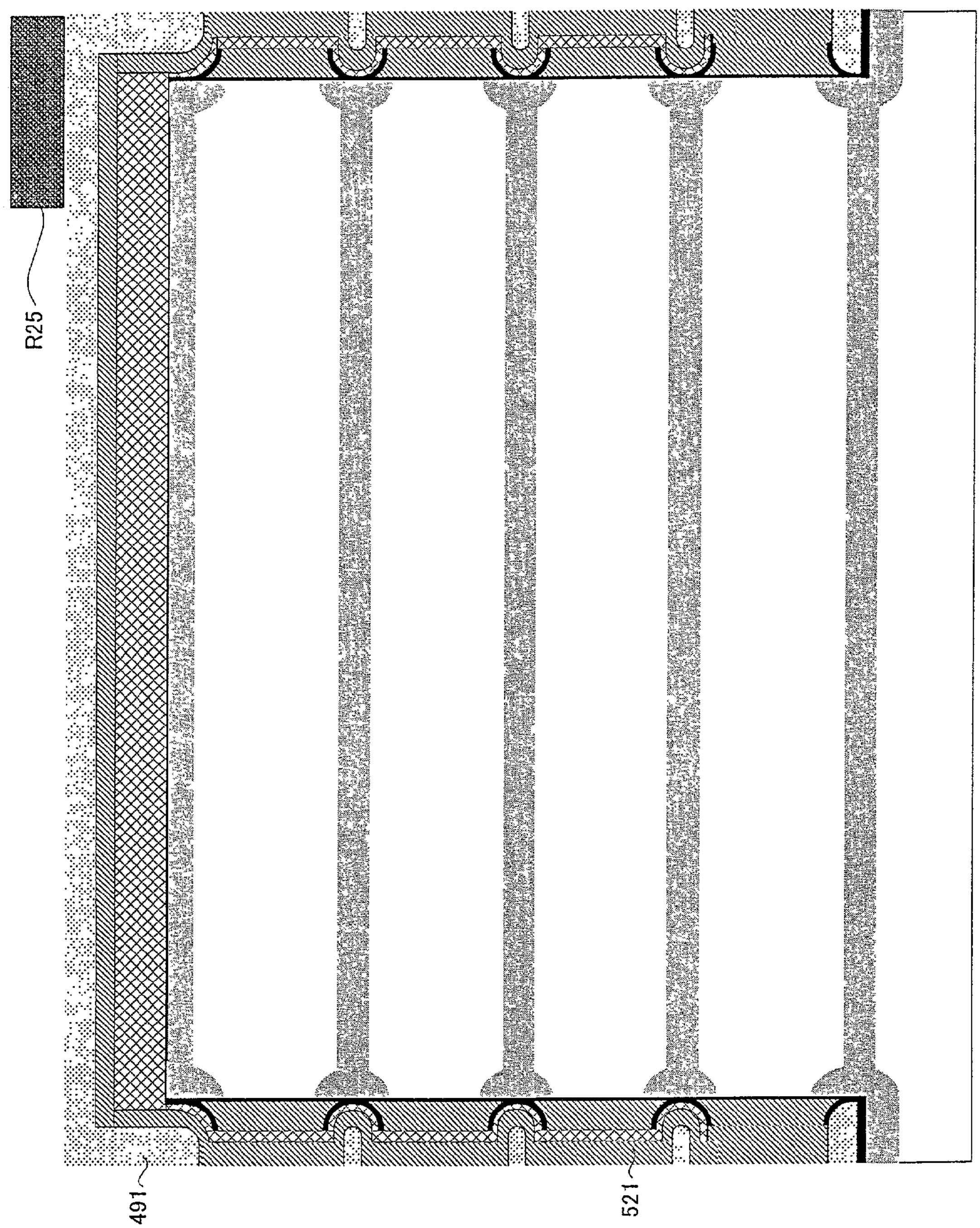
FIG. 637 to FIG. 647 are sectional views (taken on line E–E' in FIG. 1) illustrating production steps of Production Example 22 for producing a semiconductor memory in accordance with the present invention.

Thereafter, a tenth insulating film, for example, a silicon oxide film 465 is deposited to a thickness of 50 to 500 nm by CVD and is etched back to a desired level. The silicon nitride film on the surface is removed. Using a resist film R24 patterned by photolithography (FIG. 612 and FIG. 635), a contact hole and metal wiring are formed by known techniques (FIG. 613 and FIG. 636).

Thereby, a semiconductor memory is realized which has a memory function according to a charged state in the charge storage layer which is the floating gate made of the polysilicon film (the first conductive film) and in which the second and third wiring layers are lead out to the upper face of the island-like semiconductor layer without electrically contacting each other.

PRODUCTION EXAMPLE 22

This example shows an example of production process for producing a semiconductor memory as formed in Production Examples 1 to 9 in which the selection gates and the floating gates of the transistors are formed at the same time. In this example, is shown a production process for forming terminals which electrically connect the second and third wiring layers to a peripheral circuit, respectively.

Such a semiconductor memory may be produced by the following production process. FIGS. 637 to 647, FIGS. 648 to 658 and FIGS. 659 to 669 are sectional views taken on line E–E', line F–F' and G–G', respectively, in FIG. 1 which is a plan view illustrating a memory cell array of EEPROM.

In this example, production steps until the second trench 220 is formed in the P-type silicon substrate 100 to separate the impurity diffusion layer 710 (FIG. 600 and FIG. 628) are the same as those in Production Example 21.

Figure 638:
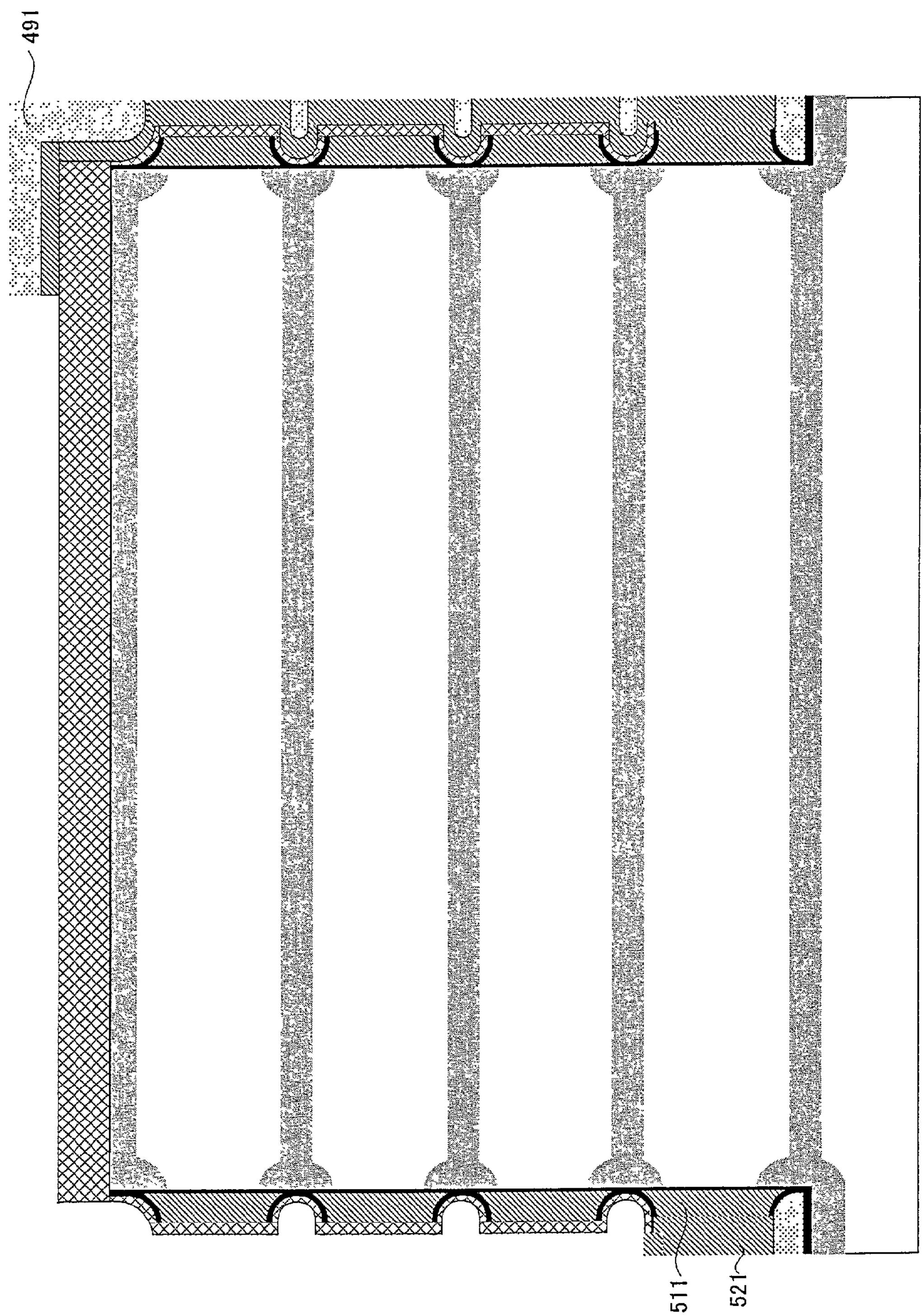
Figure 639:
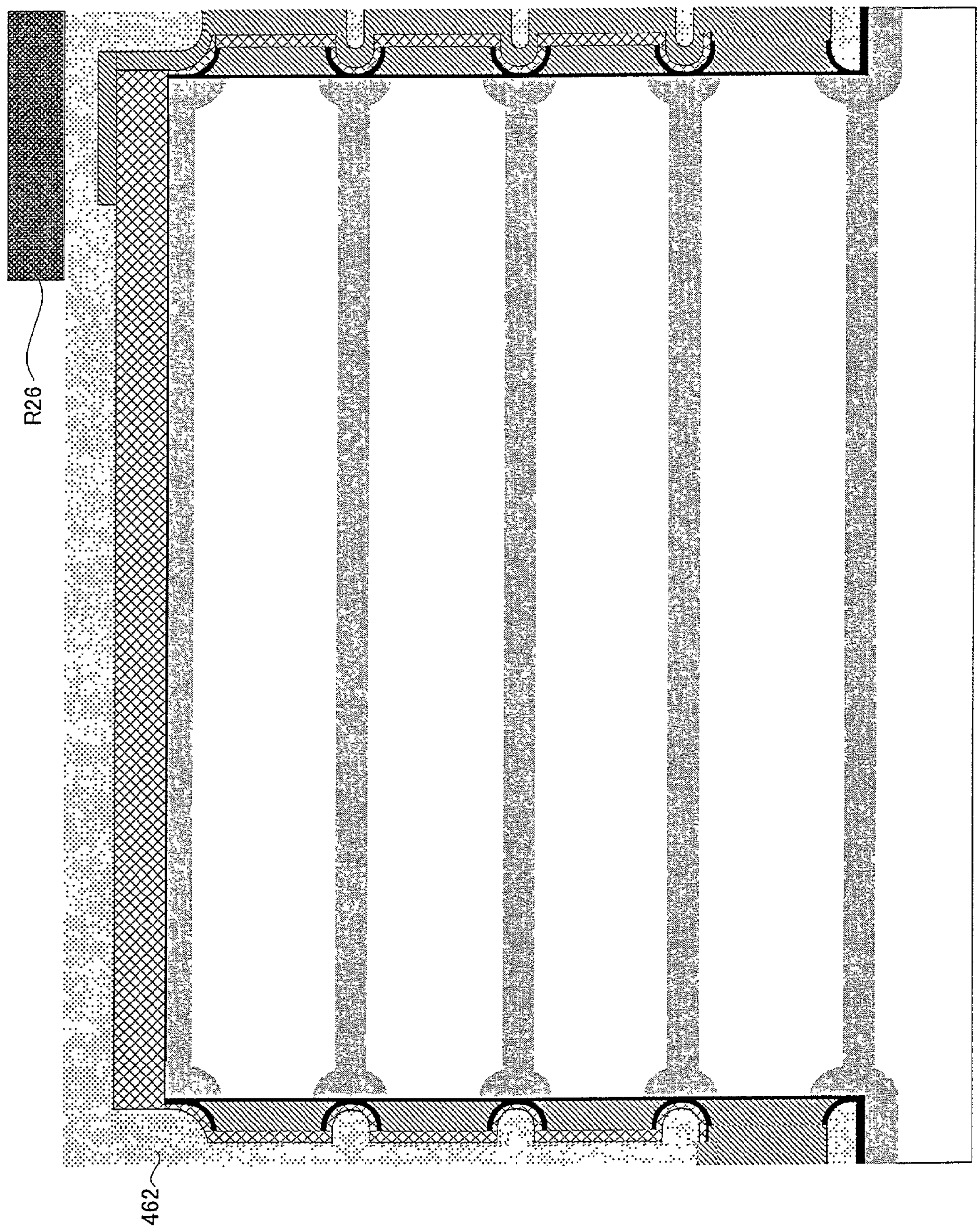
Figure 649:
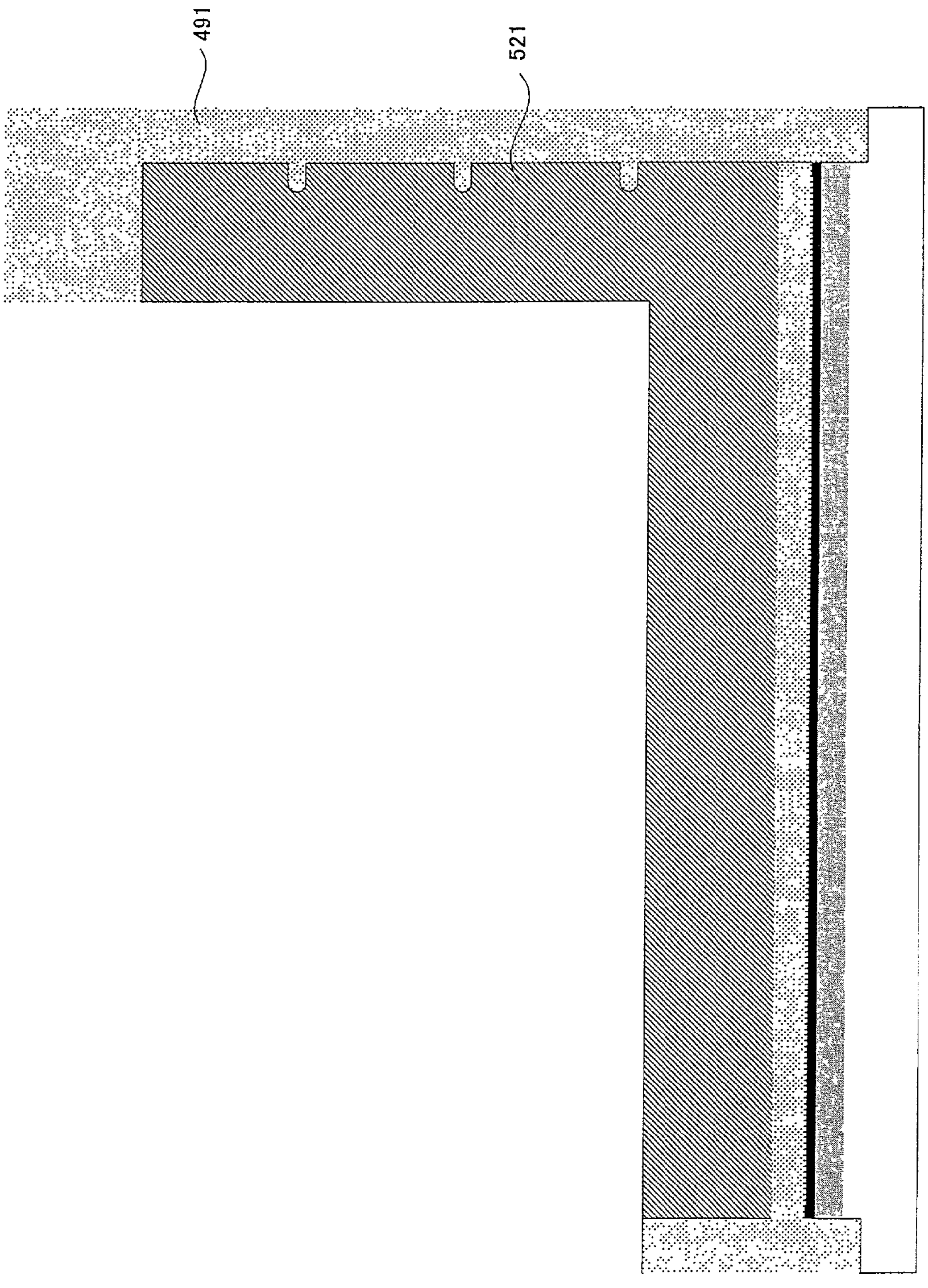
Figure 650:
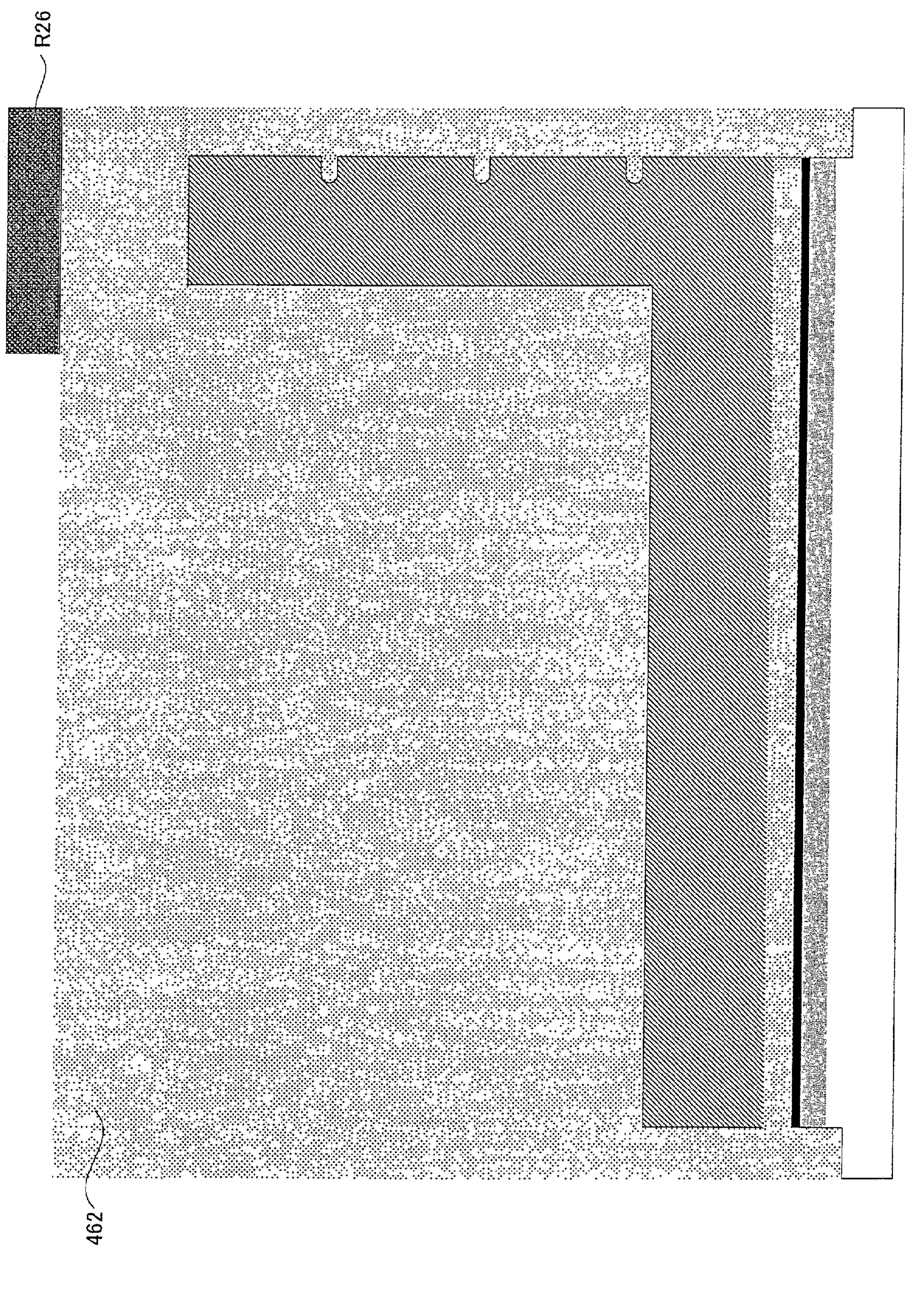
Figure 660:
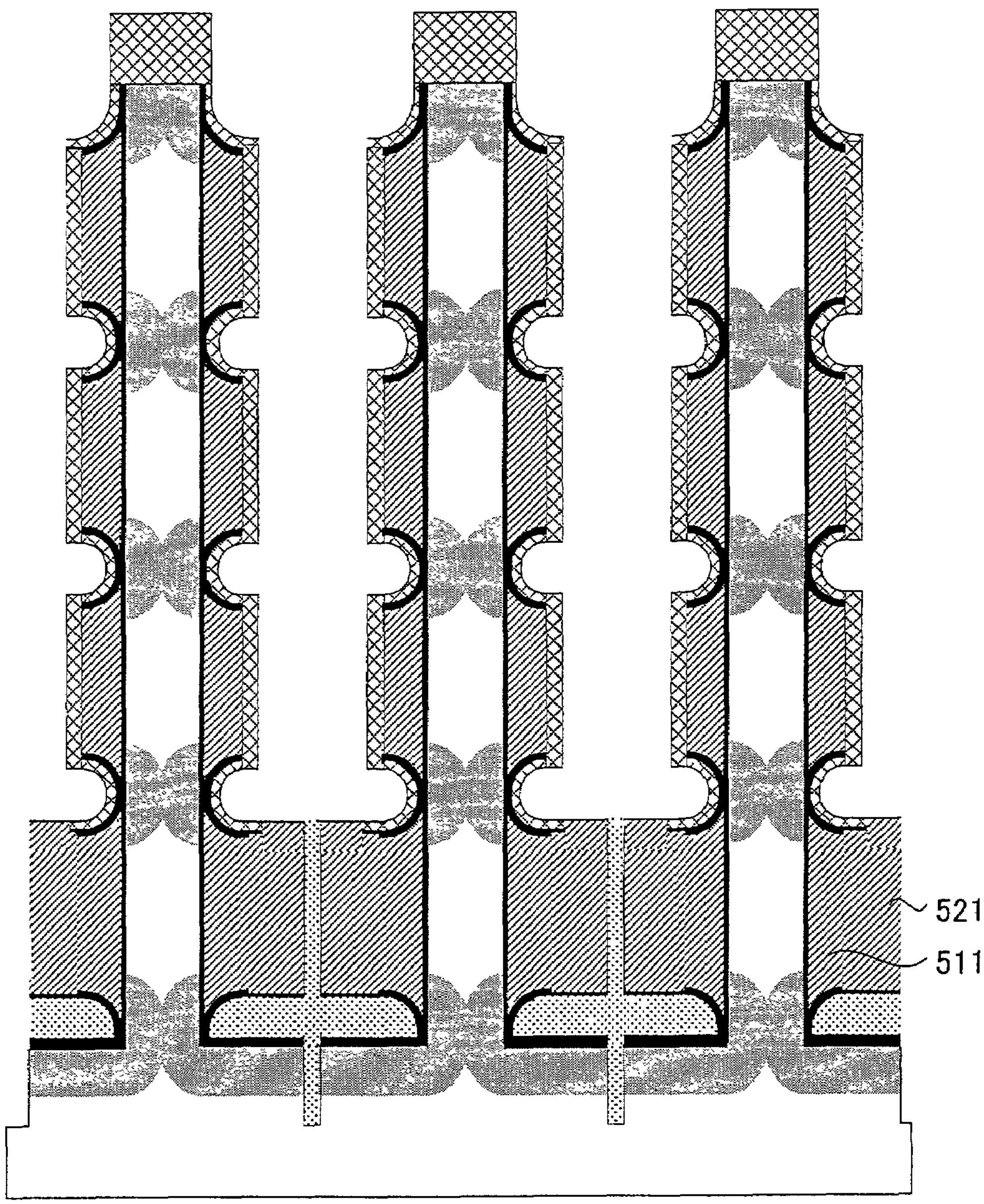
Figure 661:
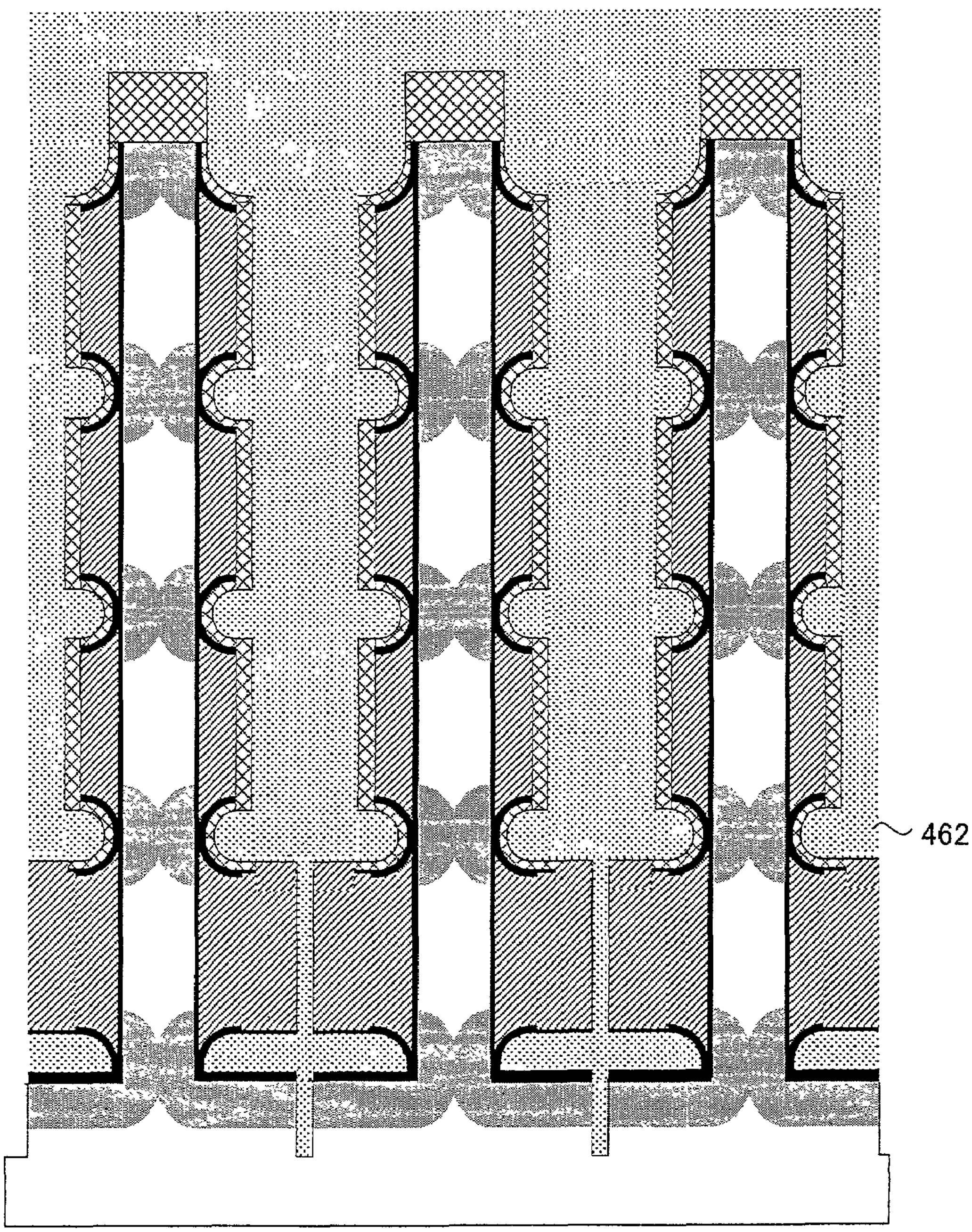

Thereafter, a fifteenth insulating film, for example, a silicon oxide 491 is deposited to a thickness of 50 to 500 nm by CVD. The silicon oxide film (the fifteenth insulating film) 491 is embedded to bury the second trench 220. Using a resist film R25 patterned by photolithography (FIG. 637, FIG. 648 and FIG. 659), the silicon oxide film 491 and the polysilicon film (the second conductive film) 521 are etched back by reactive ion etching to the level almost the same as the top of the polysilicon film (the first conductive film) 511 (FIG. 638, FIG. 649 and FIG. 660).

Figure 640:
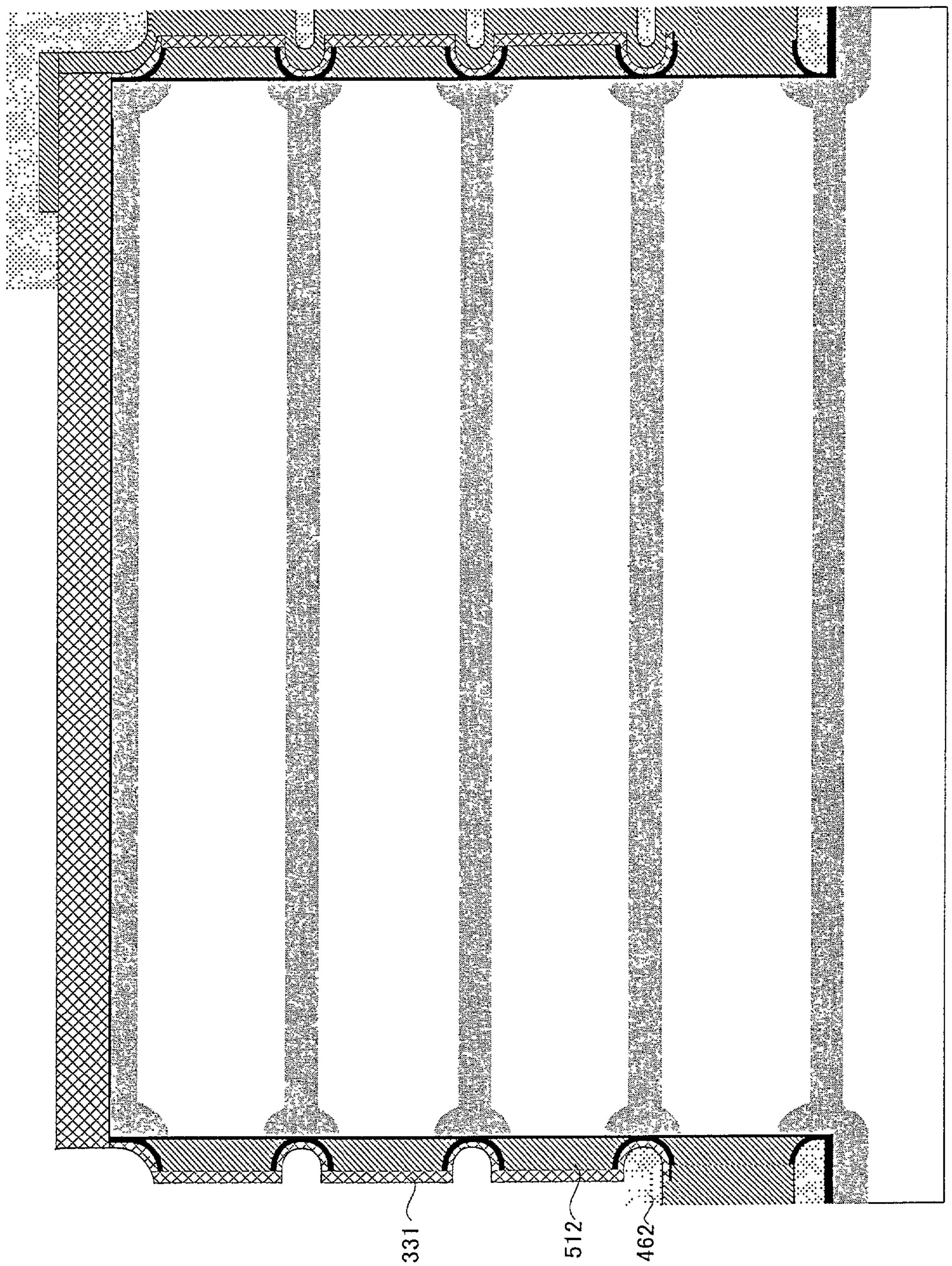
Figure 641:
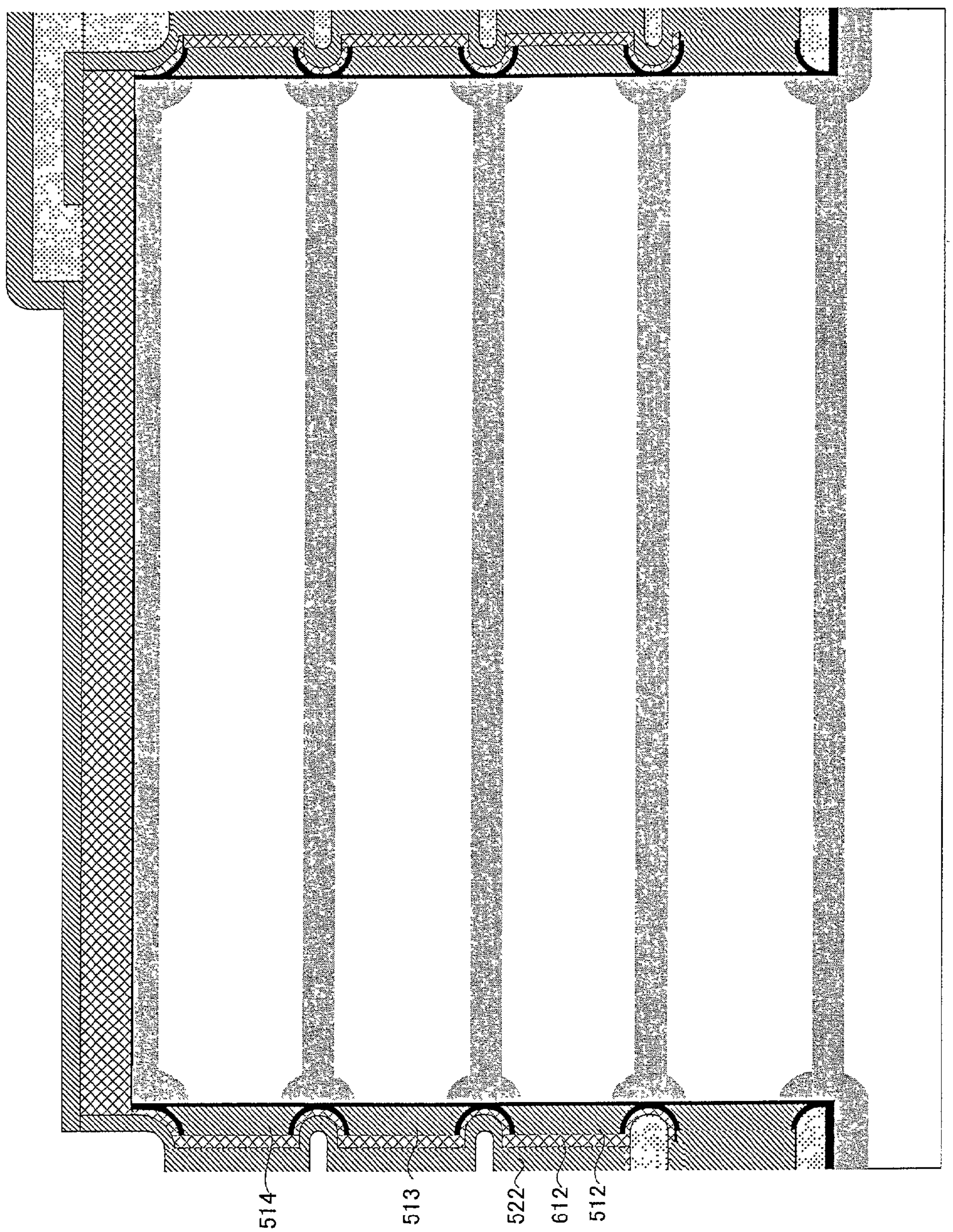
Figure 642:
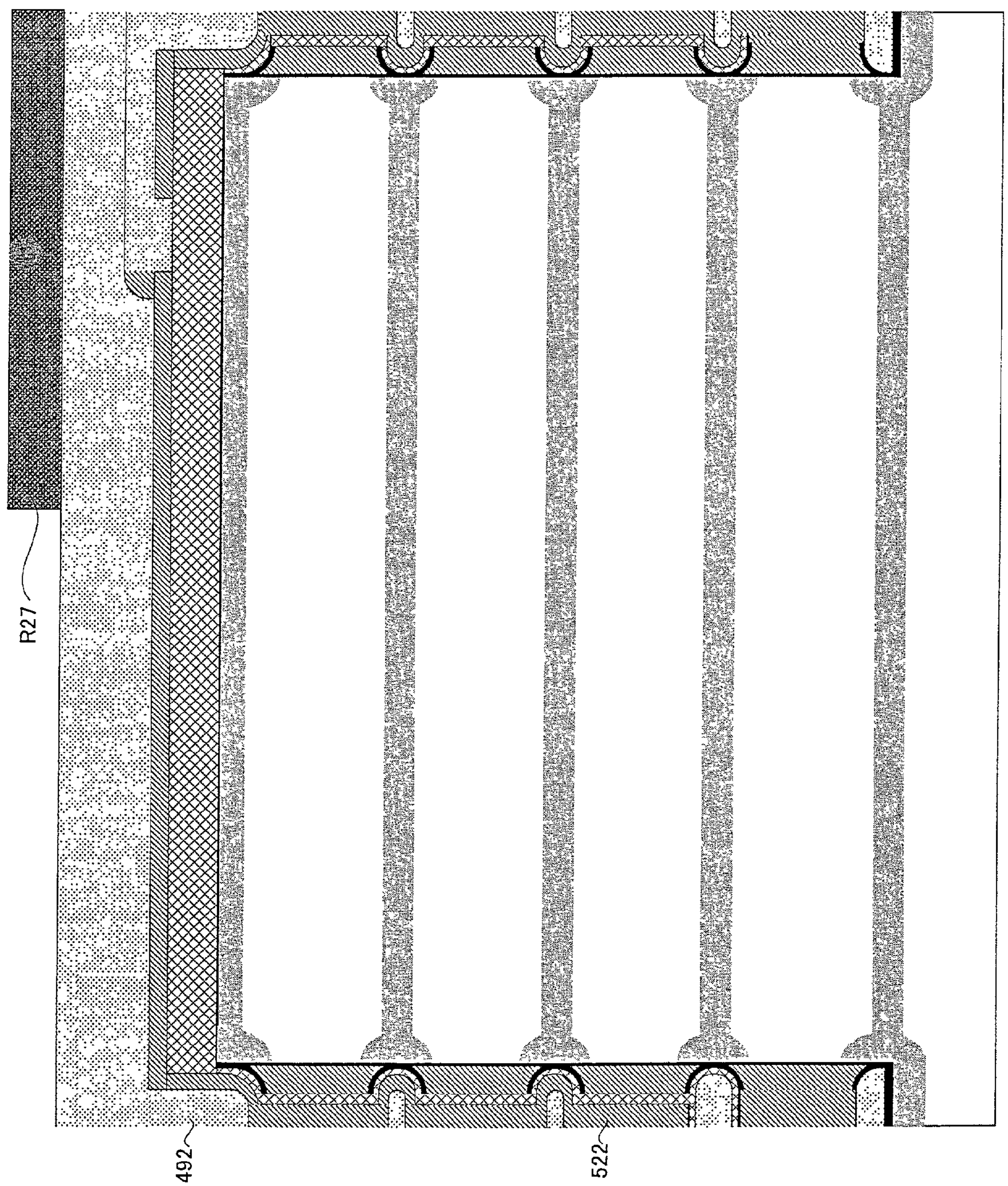
Figure 651:
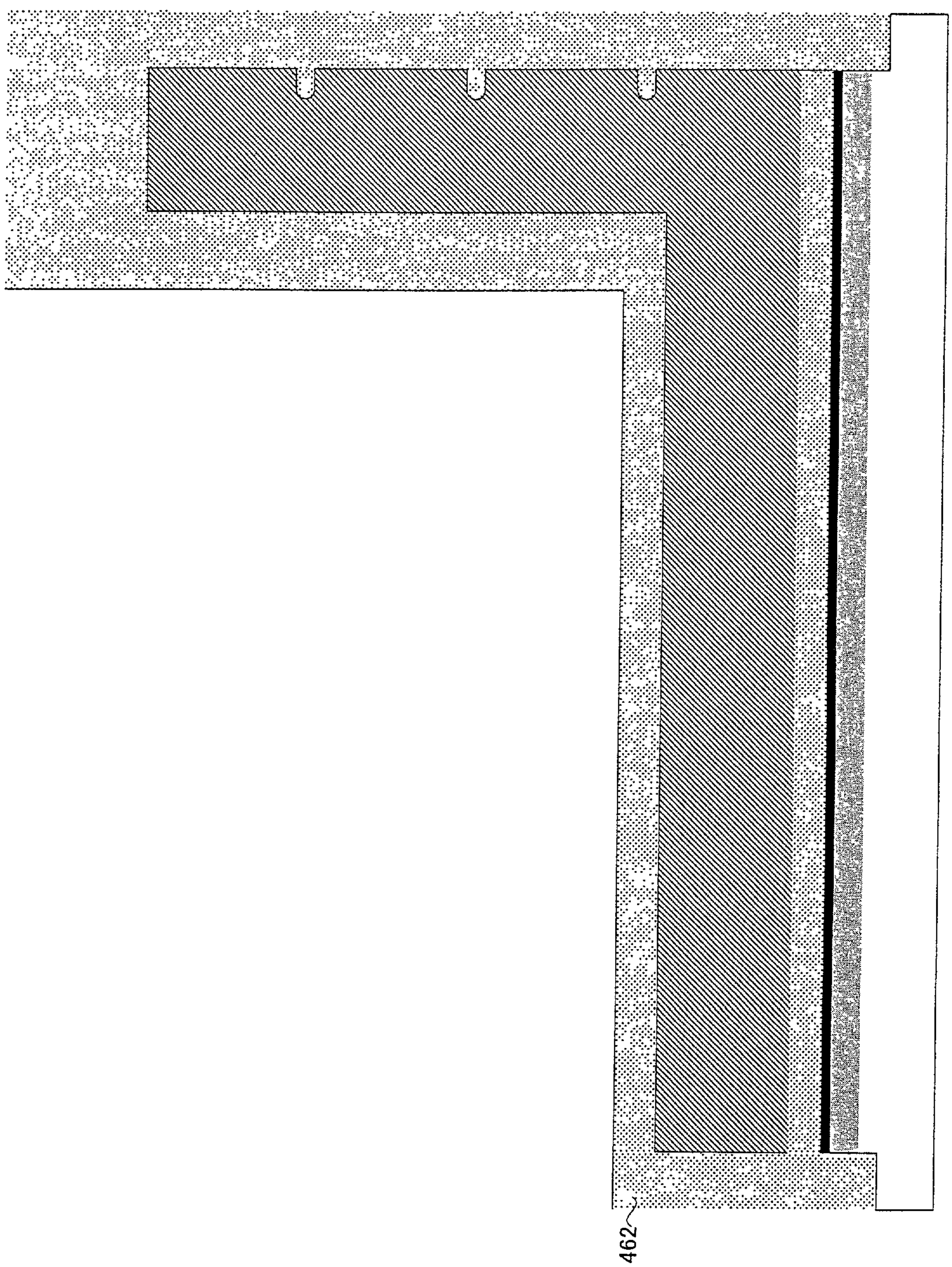
Figure 652:
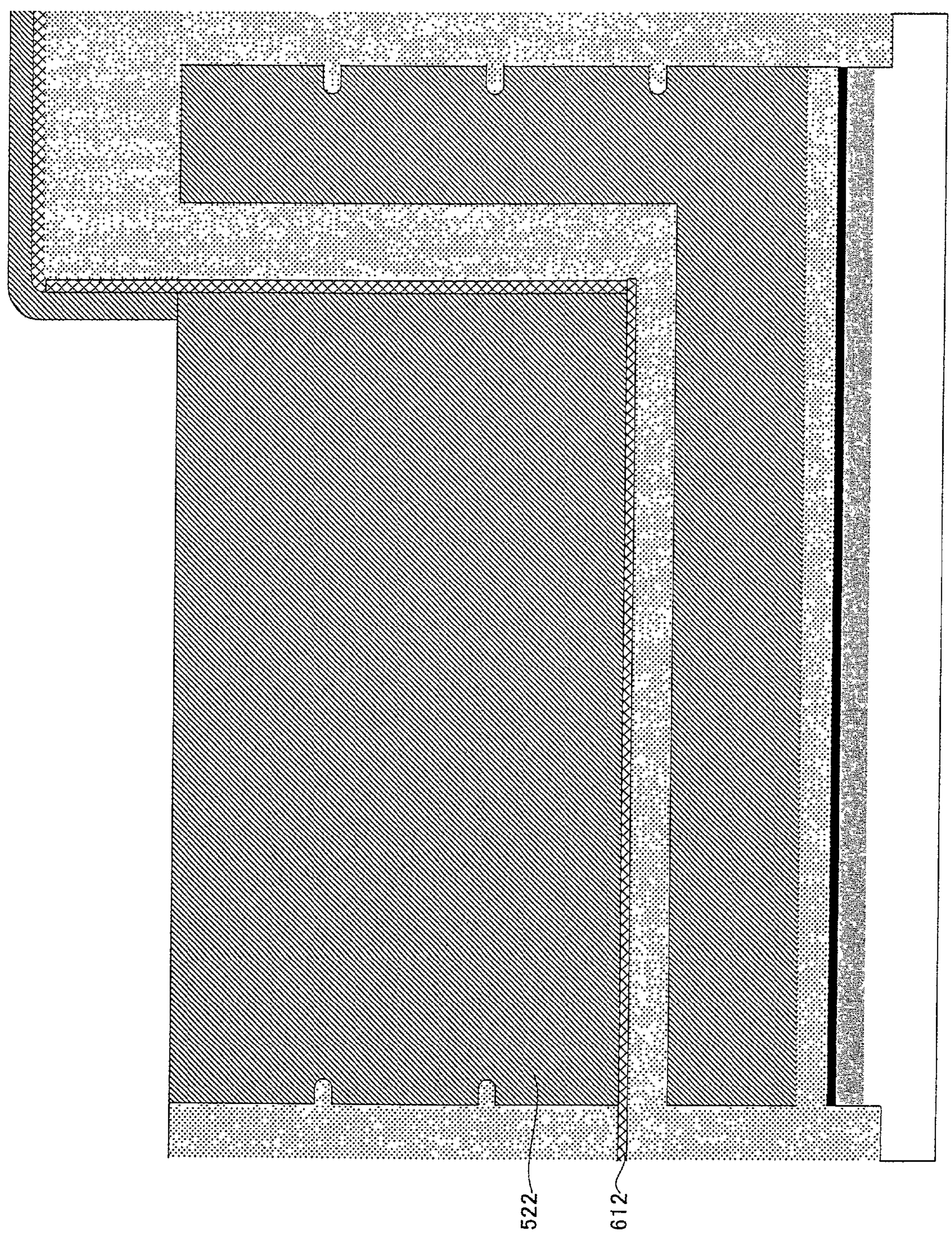
Figure 653:
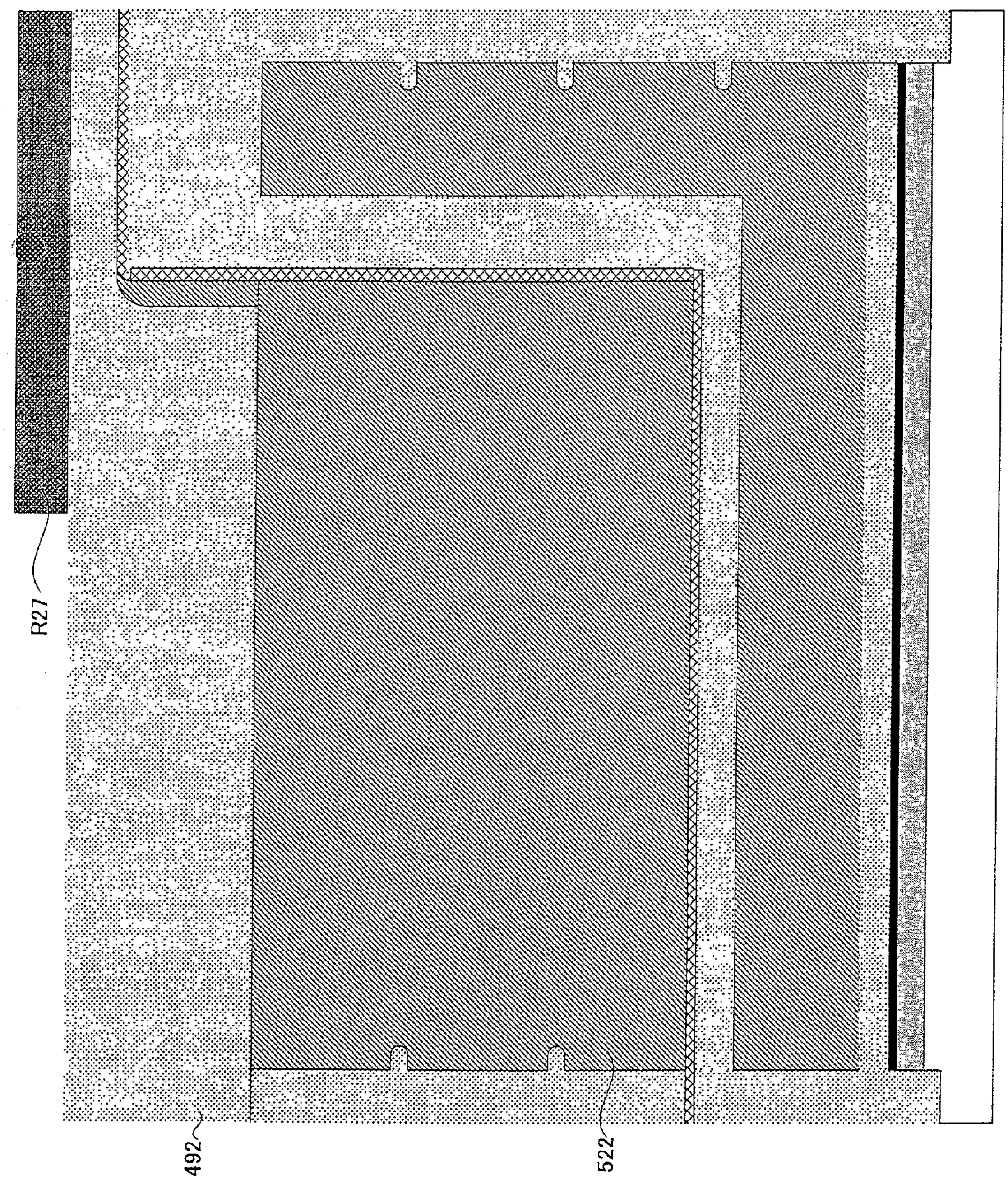
Figure 662:
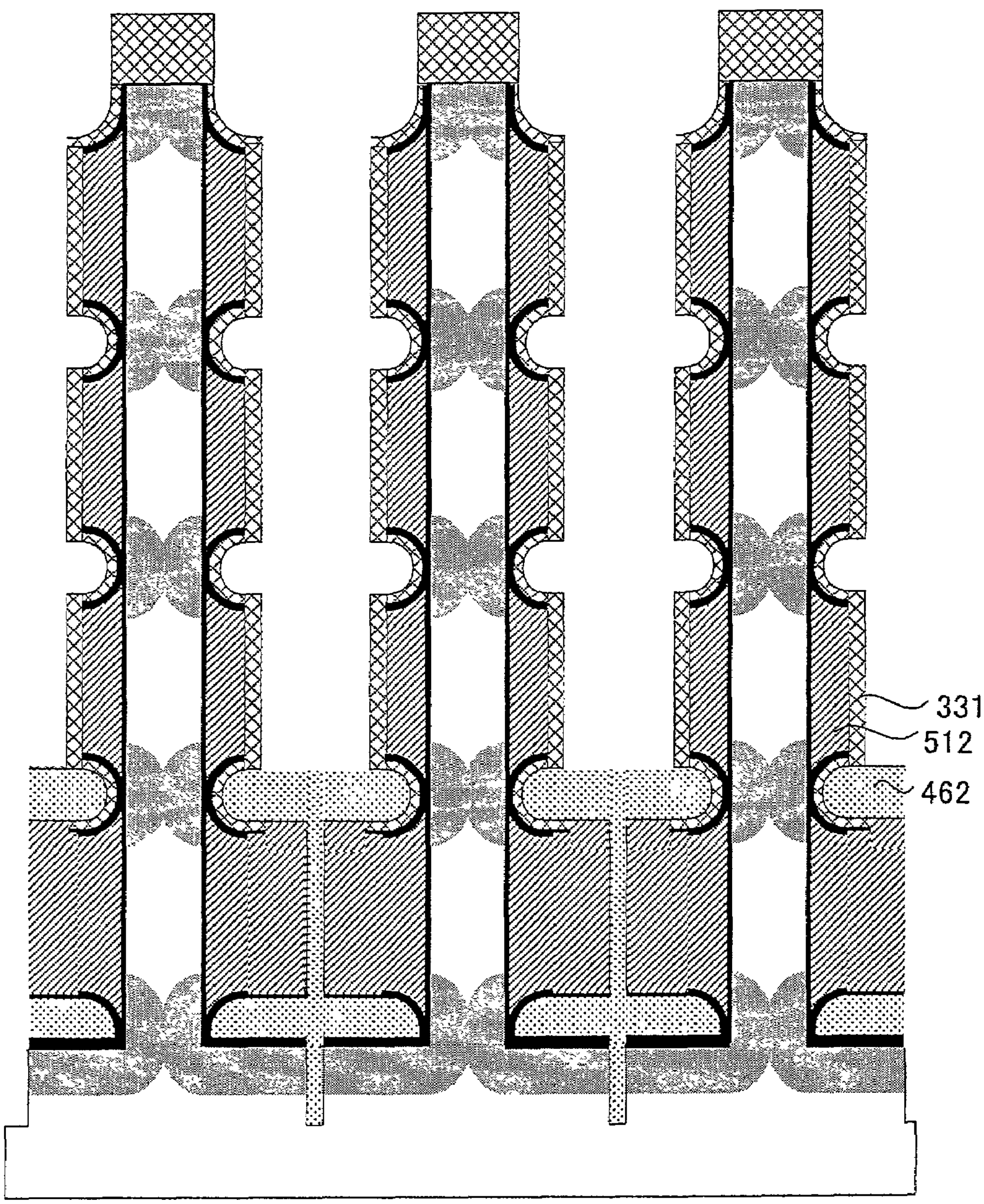
Figure 663:
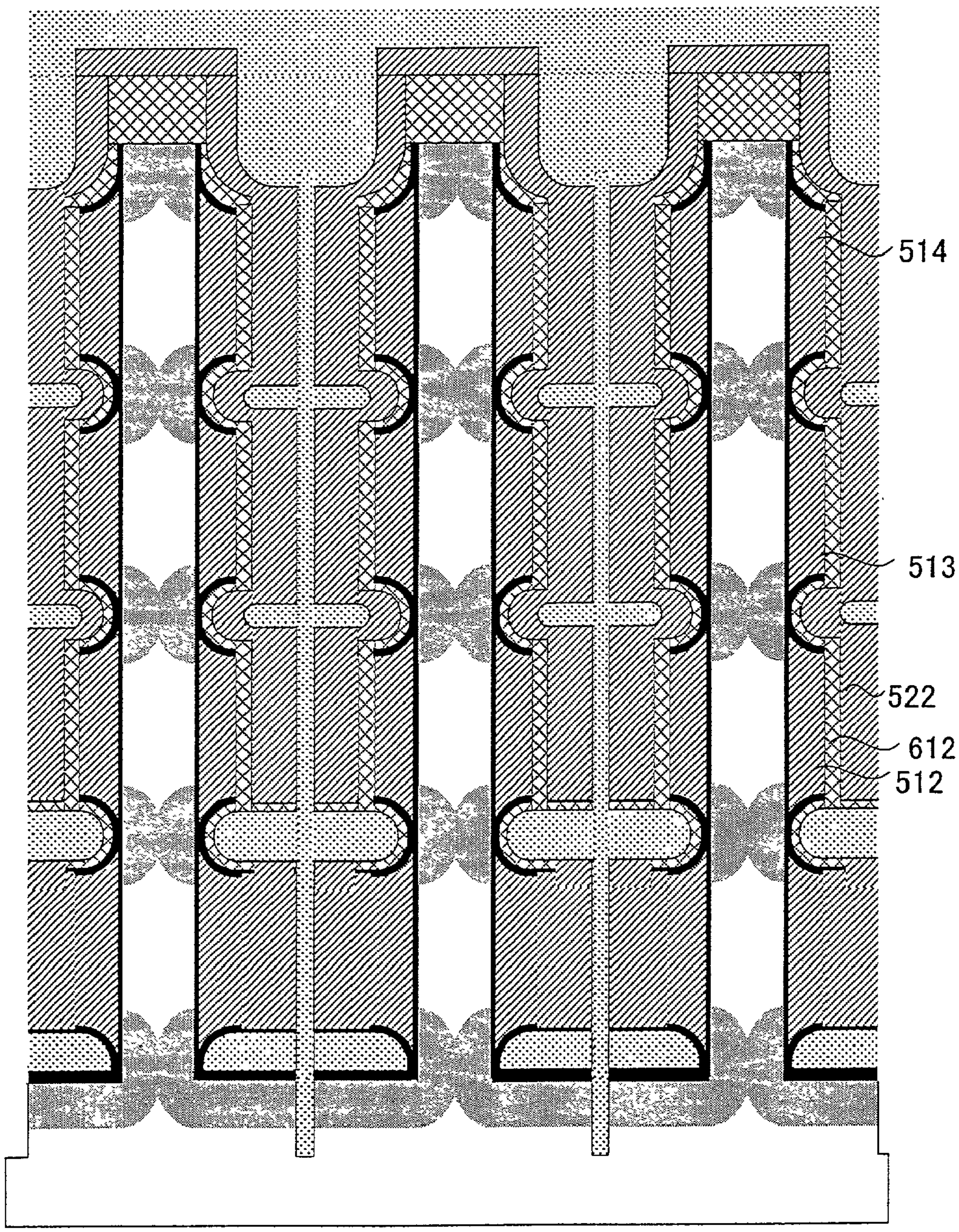
Figure 664:
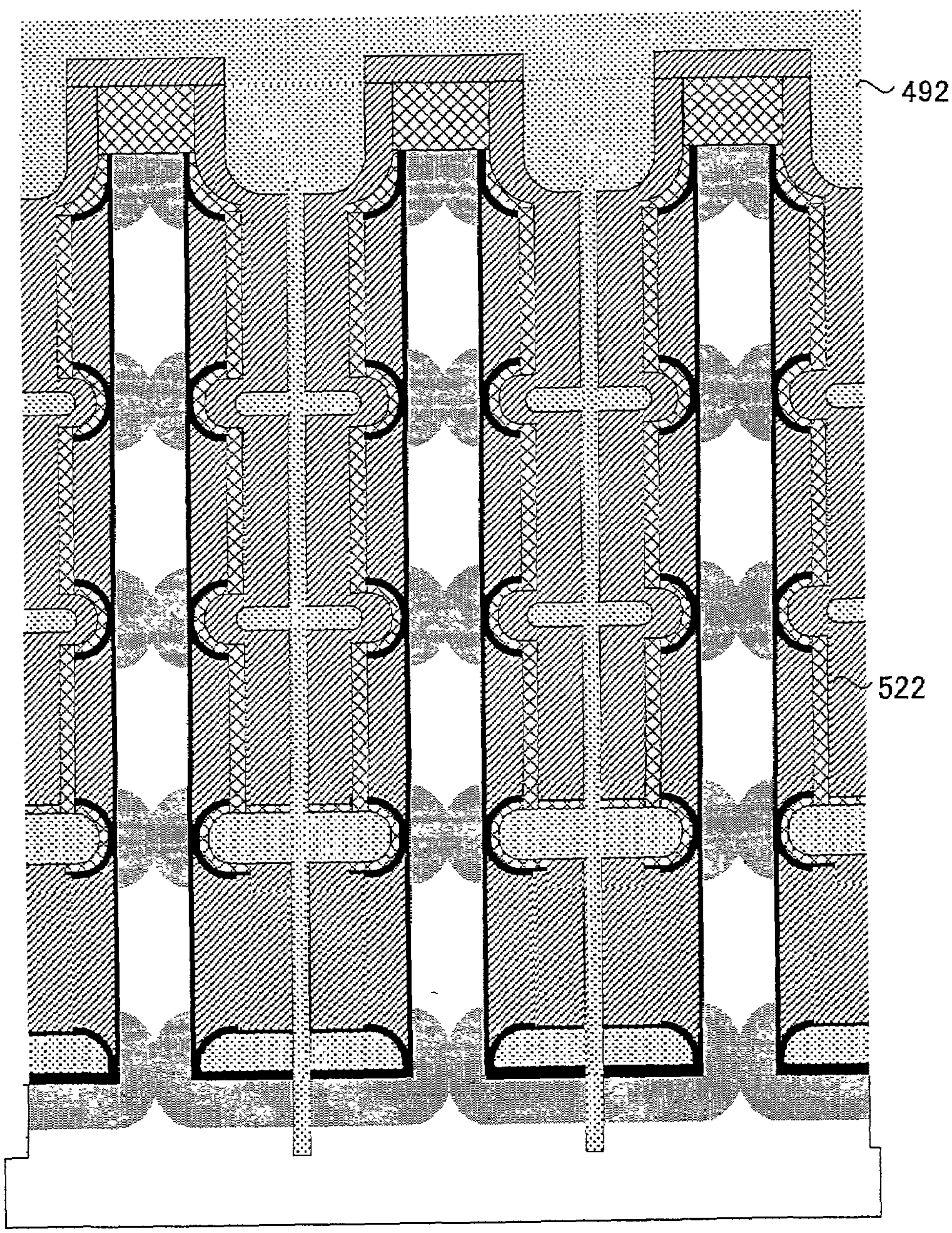

A silicon nitride film 331 is deposited as a ninth insulating film to a thickness of 5 to 50 nm to form a sidewall spacer. A silicon oxide film 462 which is an eighth insulating film is deposited to a thickness of 50 to 500 nm. Using a resist film R26 patterned by photolithography (FIG. 639, FIG. 650 and FIG. 661), the silicon oxide film (the eighth insulating film) 462 is etched back to a level almost the same as the bottom of the polysilicon film 512 (FIG. 640, FIG. 651 and FIG. 662).

A region masked by the resist film R26 includes a region masked by the resist film R25.

The sidewall spacer of the silicon nitride film (the ninth insulating film) 331 is removed by isotropic etching, and an interlayer insulating film 612 is formed on exposed surfaces of the polysilicon films 512 to 514. This interlayer insulating film 612 may be formed of an ONO film, for example. More particularly, a silicon oxide film of 5 to 10 nm thickness is formed on the surface of the polysilicon film by thermal oxidization, and then, a silicon nitride film of 5 to 10 nm thickness and a silicon oxide film of 5 to 10 nm thickness are formed sequentially by CVD.

Figure 643:
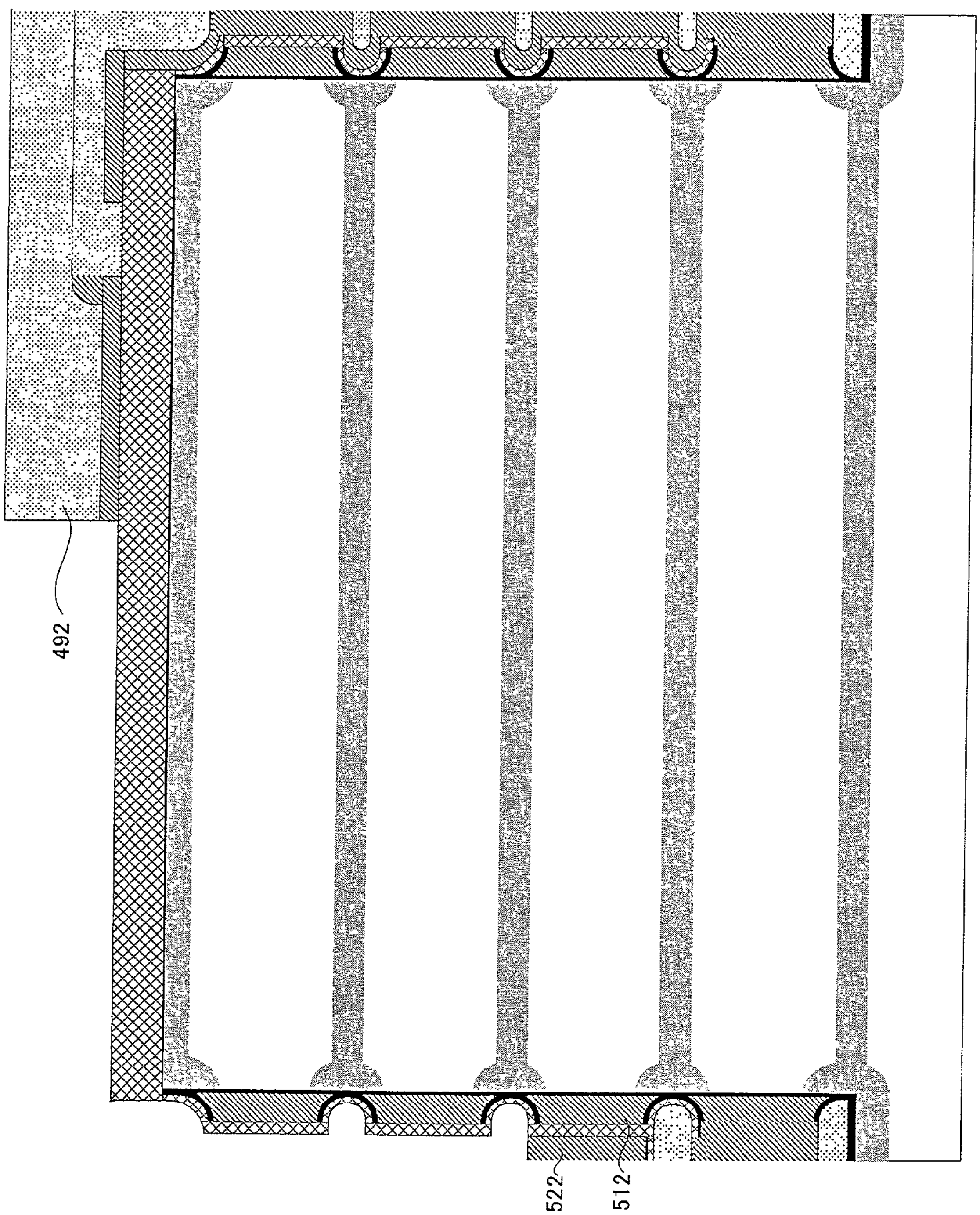
Figure 654:
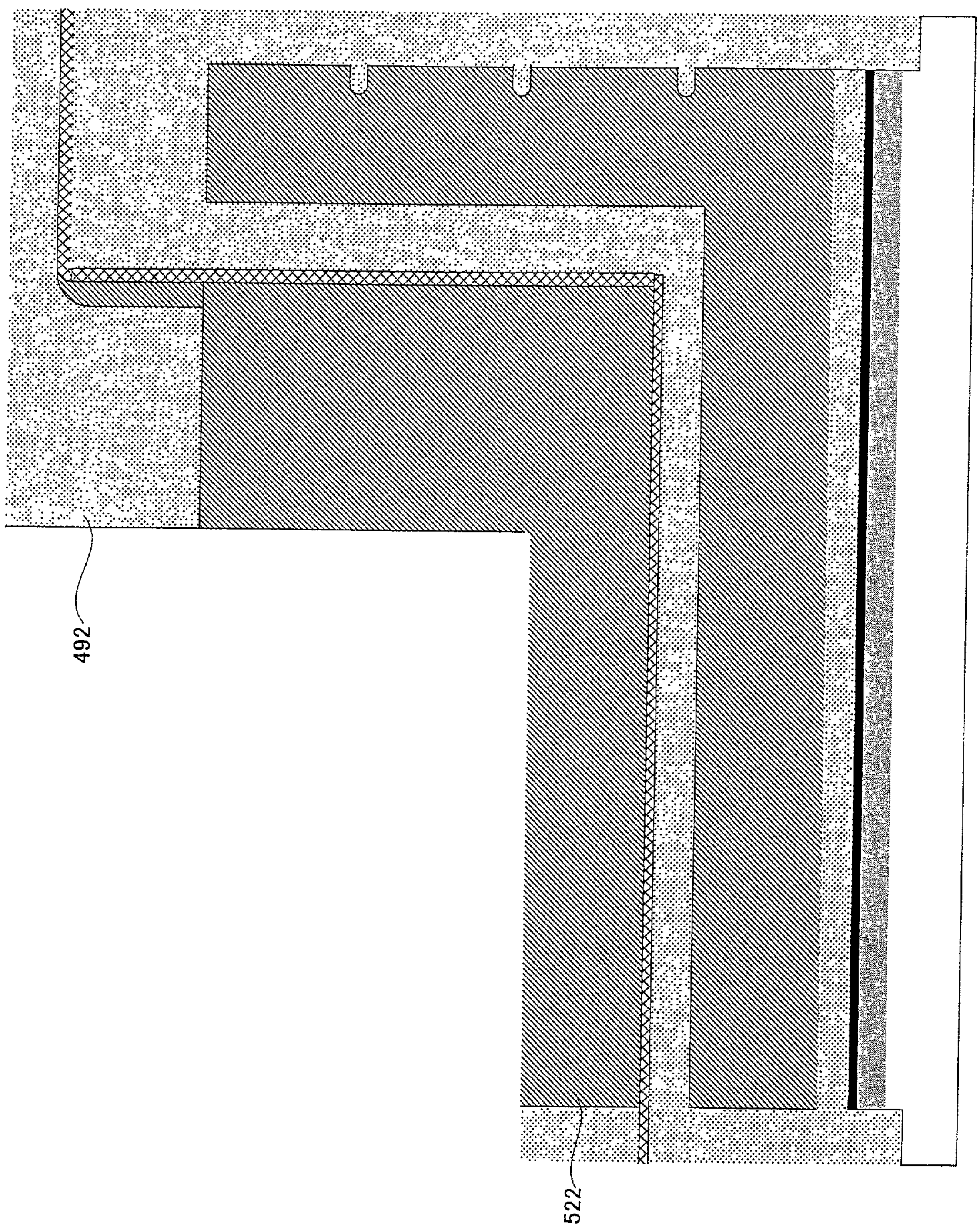
Figure 665:
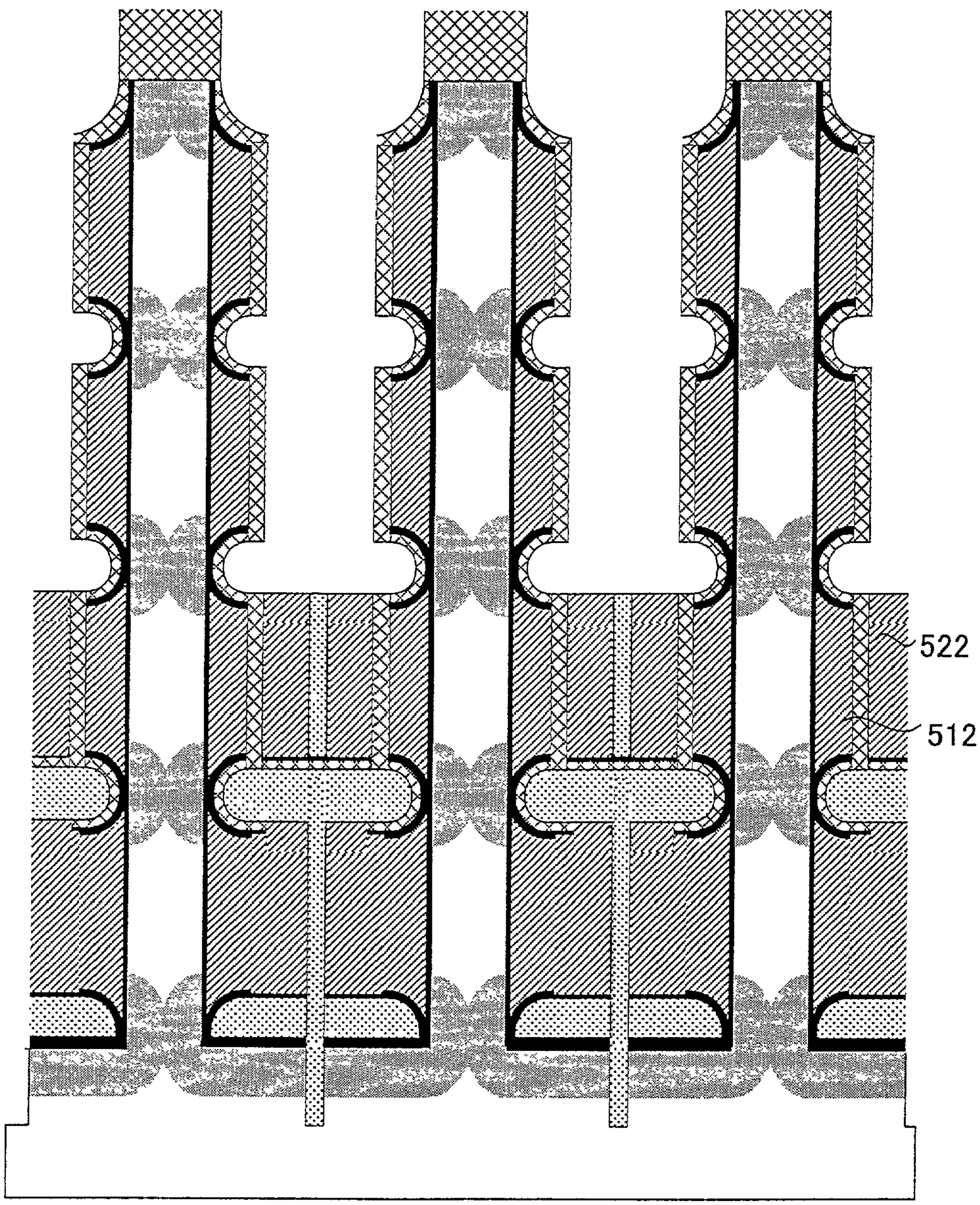

Likewise, a polysilicon film 522 which is a second conductive film is deposited to a thickness of 15 to 150 nm (FIG. 641, FIG. 652 and FIG. 663) and is etched back by anisotropic etching. A silicon nitride film 492 which is a fifteenth insulating film is deposited to a thickness of 50 to 500 nm on the polysilicon film (the second conductive film) 522 of a sidewall spacer form by CVD. Using a resist film R27 patterned by photolithography (FIG. 642, FIG. 653 and FIG. 664), the silicon oxide film 492 and the polysilicon film 522 are etched back to a level almost the same as the top of the polysilicon film 512 by reactive ion etching (FIG. 643, FIG. 654 and FIG. 665). A region masked by the resist film R27 includes the region masked by the resist film R26.

By the above-described process, as shown in FIG. 654, a region where the polysilicon film (the first conductive film) 521 is located as an conductive film the nearest to the upper face of the island-like semiconductor layer and a region where the polysilicon film (the second conductive film) 522 is located as an conductive film the nearest to the upper face of the island-like semiconductor layer are formed with intervention of the interlayer insulating film 612 and the silicon oxide film (the eighth insulating film) 462.

Figure 644:
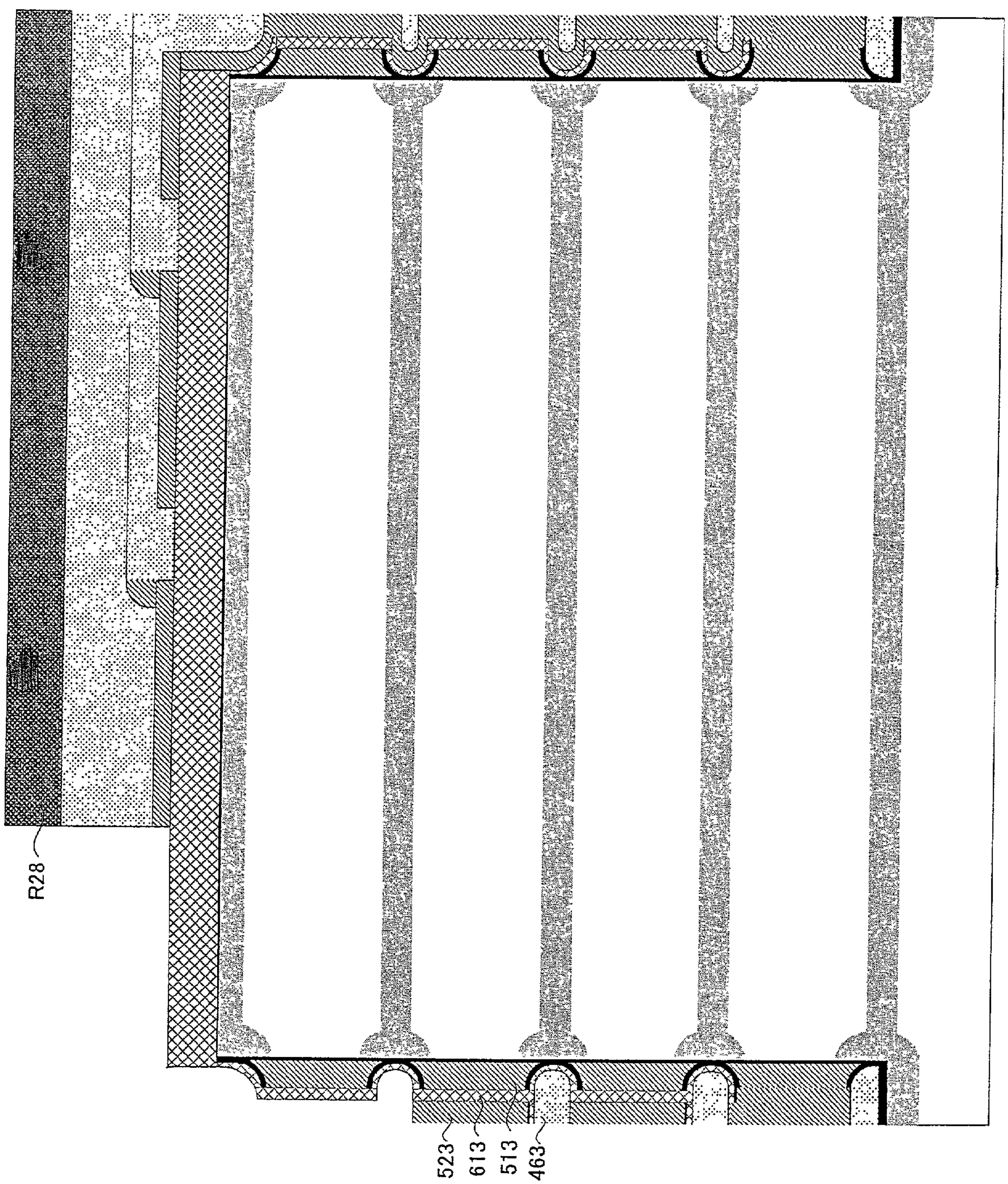
Figure 645:
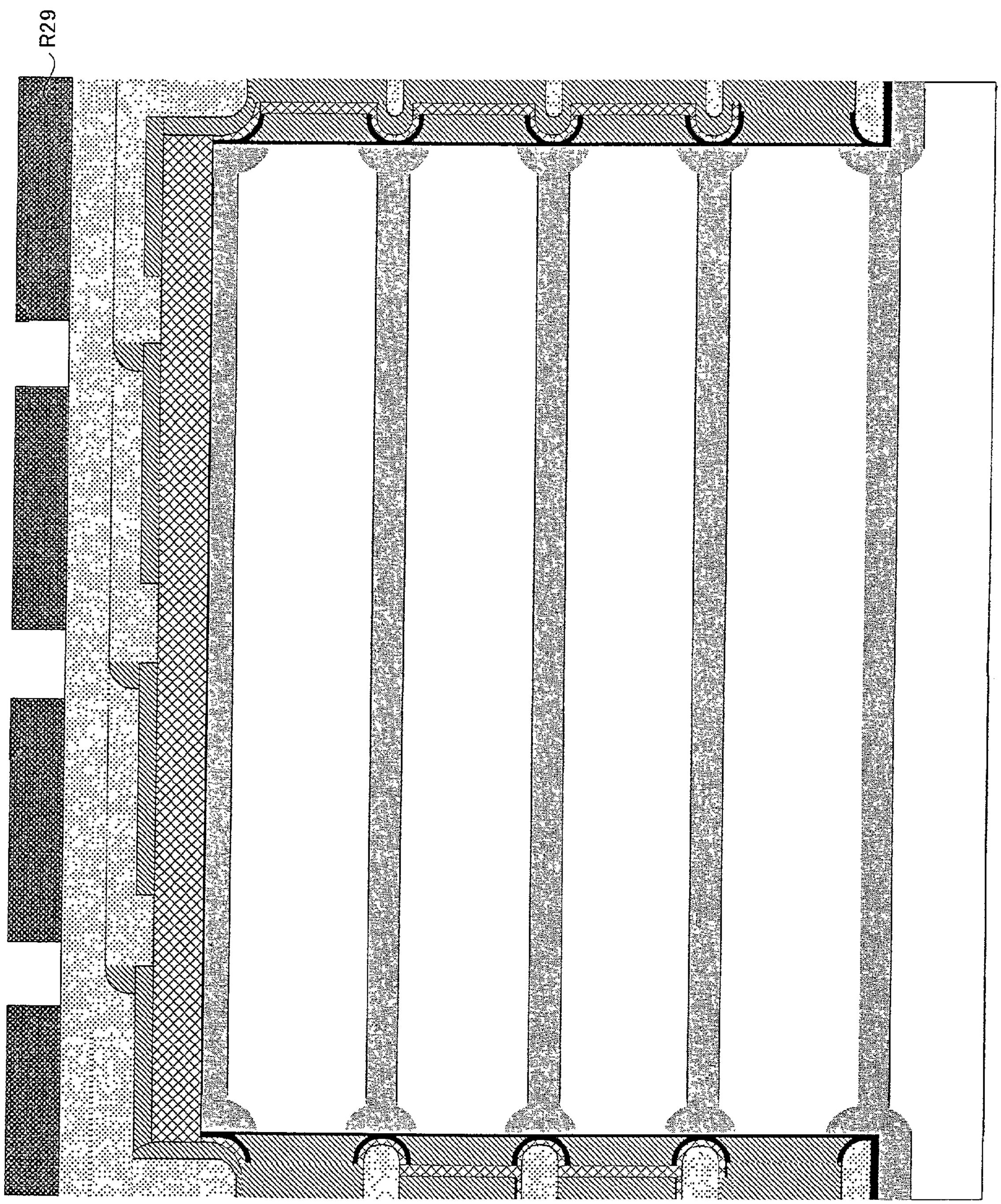
Figure 655:
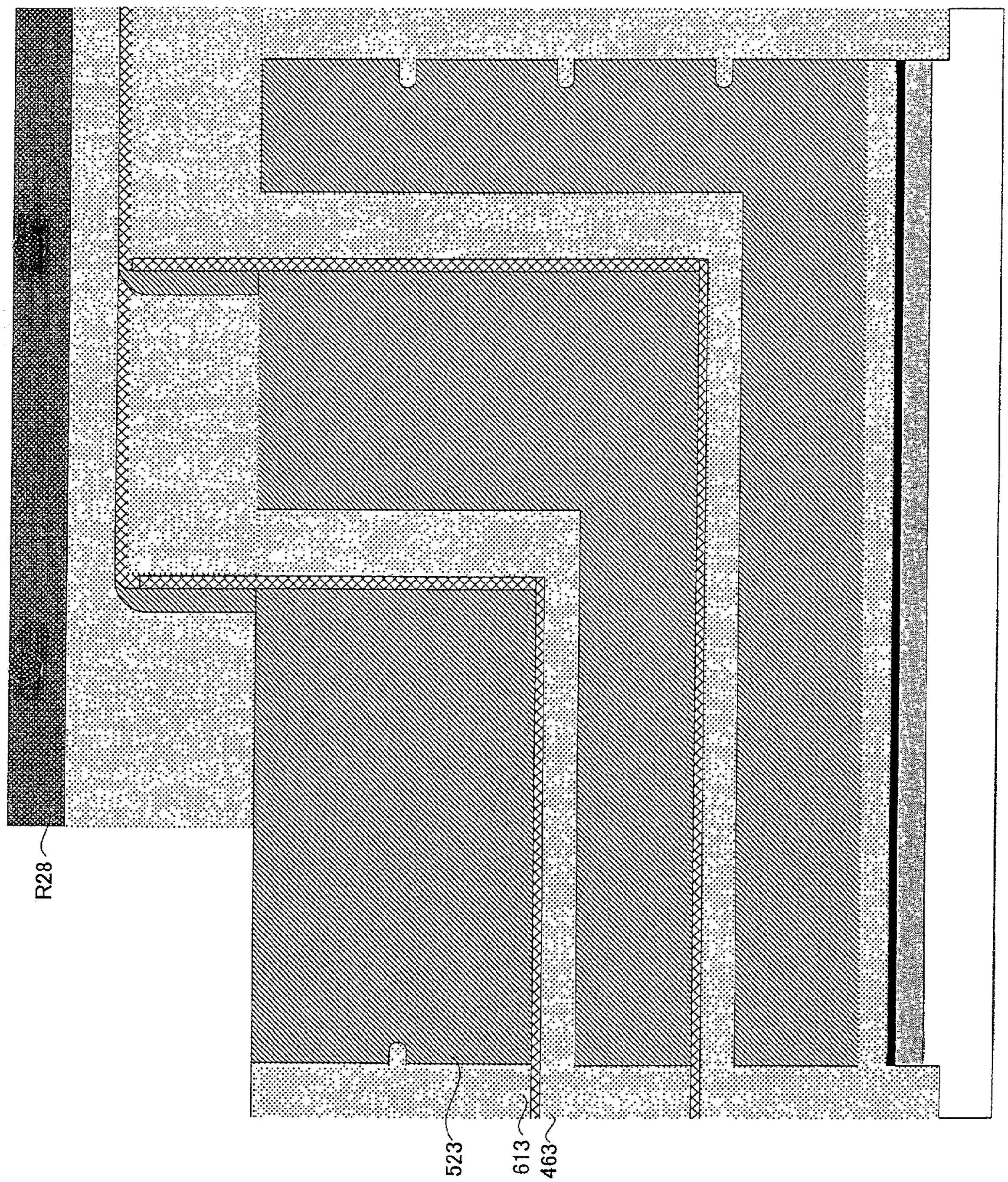
Figure 656:
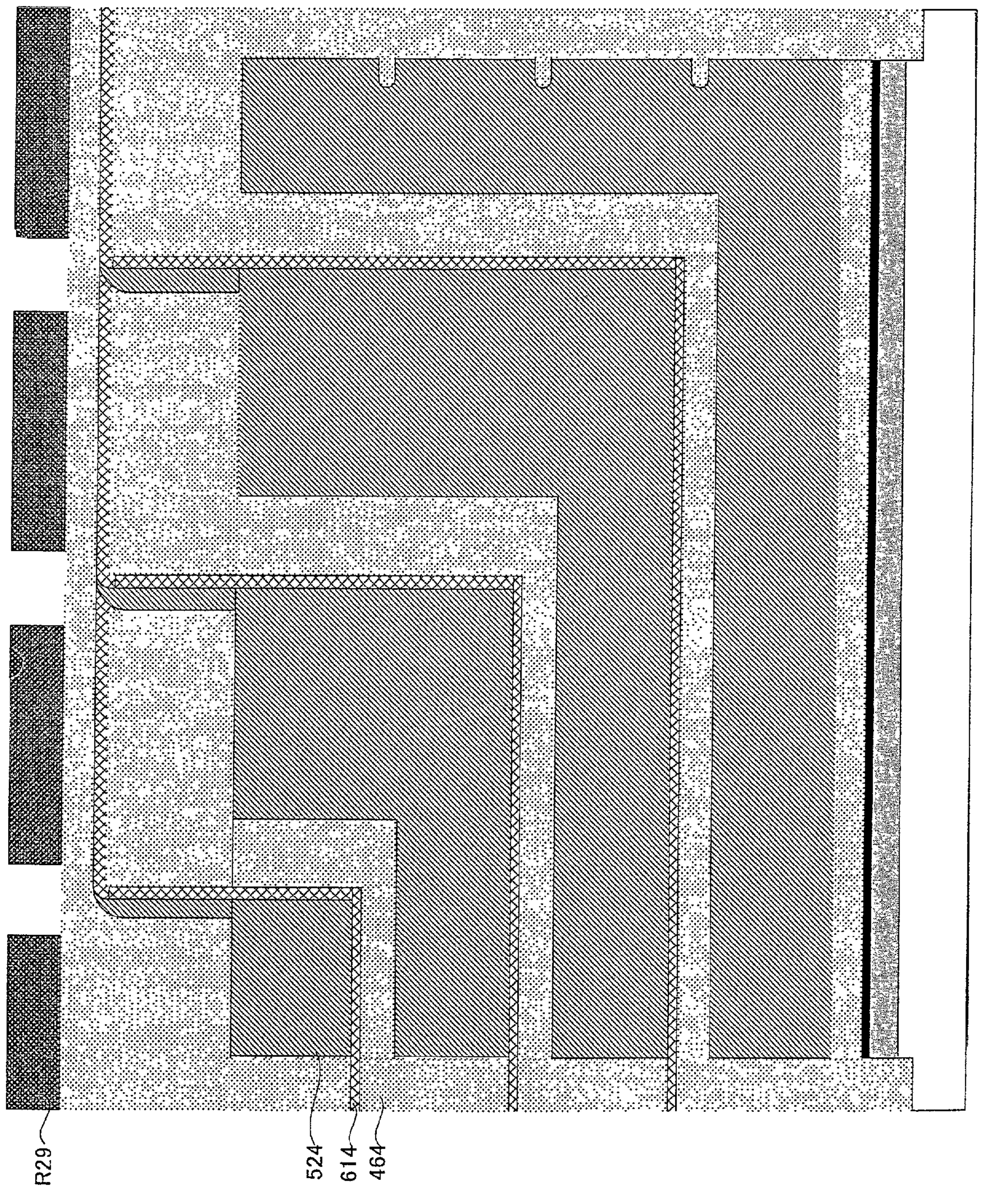
Figure 666:
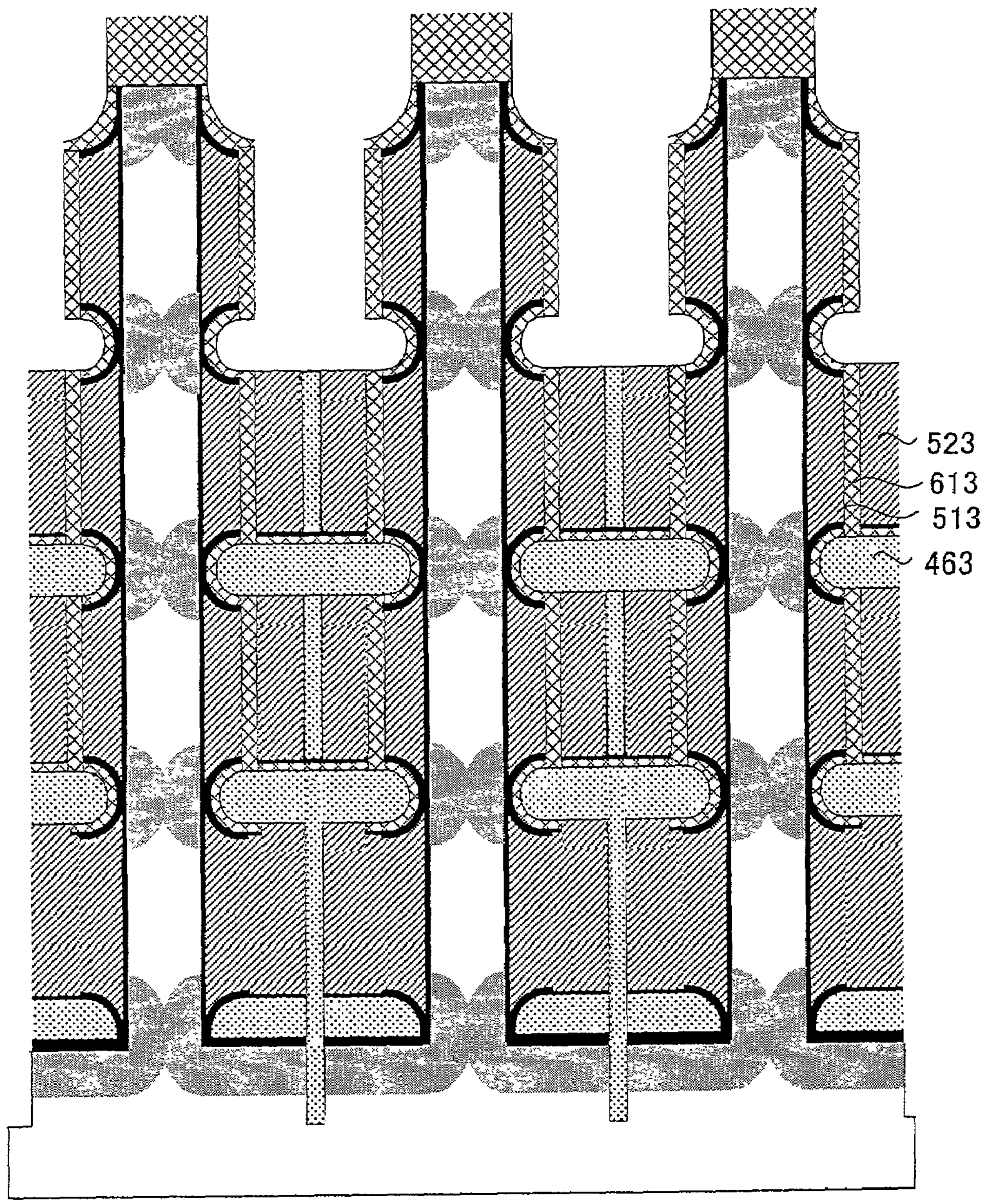
Figure 667:
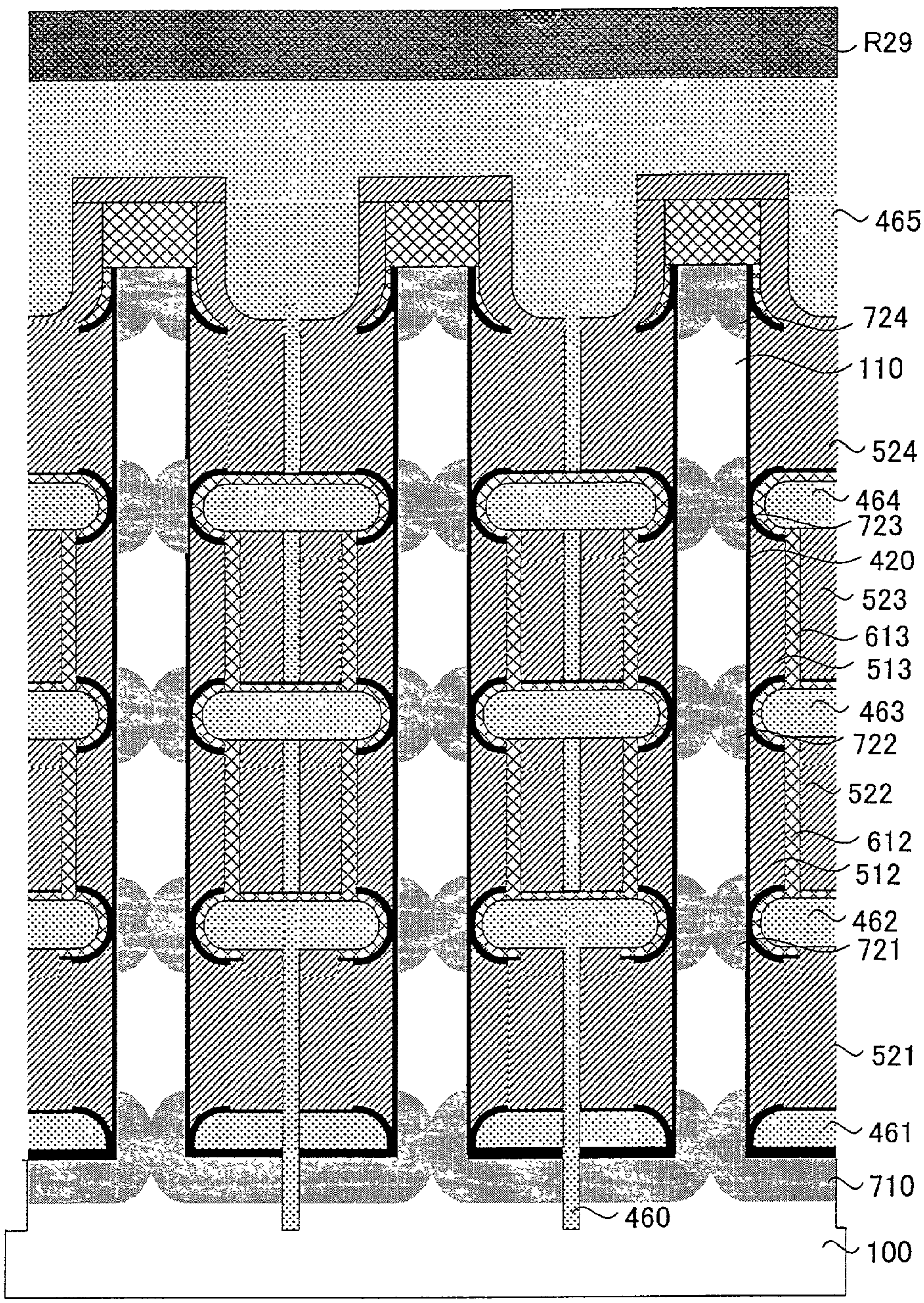

By repeating likewise, a polysilicon film (a second conductive film) 523 is disposed on the side portion of a polysilicon film (a first conductive film) 513 with intervention of an interlayer insulating film 613, and a region where the polysilicon film 523 is located as an conductive film the nearest to the upper face of the island-like semiconductor layer in the lead-out portions of the second and third wiring layers is formed with intervention of the interlayer insulating film 613 and a silicon oxide film (an eighth insulating film) 463 (FIG. 644, FIG. 655 and FIG. 666).

Figure 646:
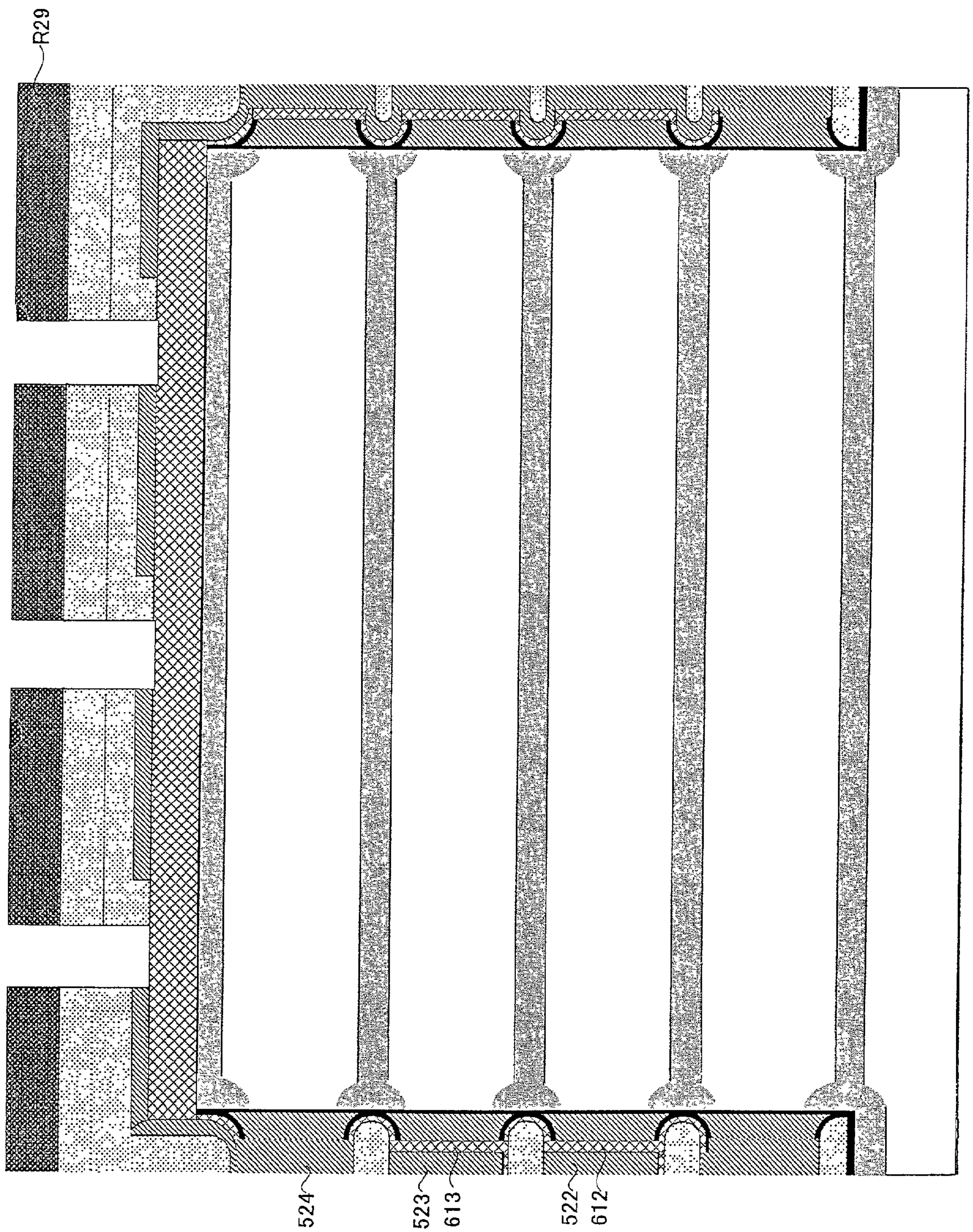
Figure 657:
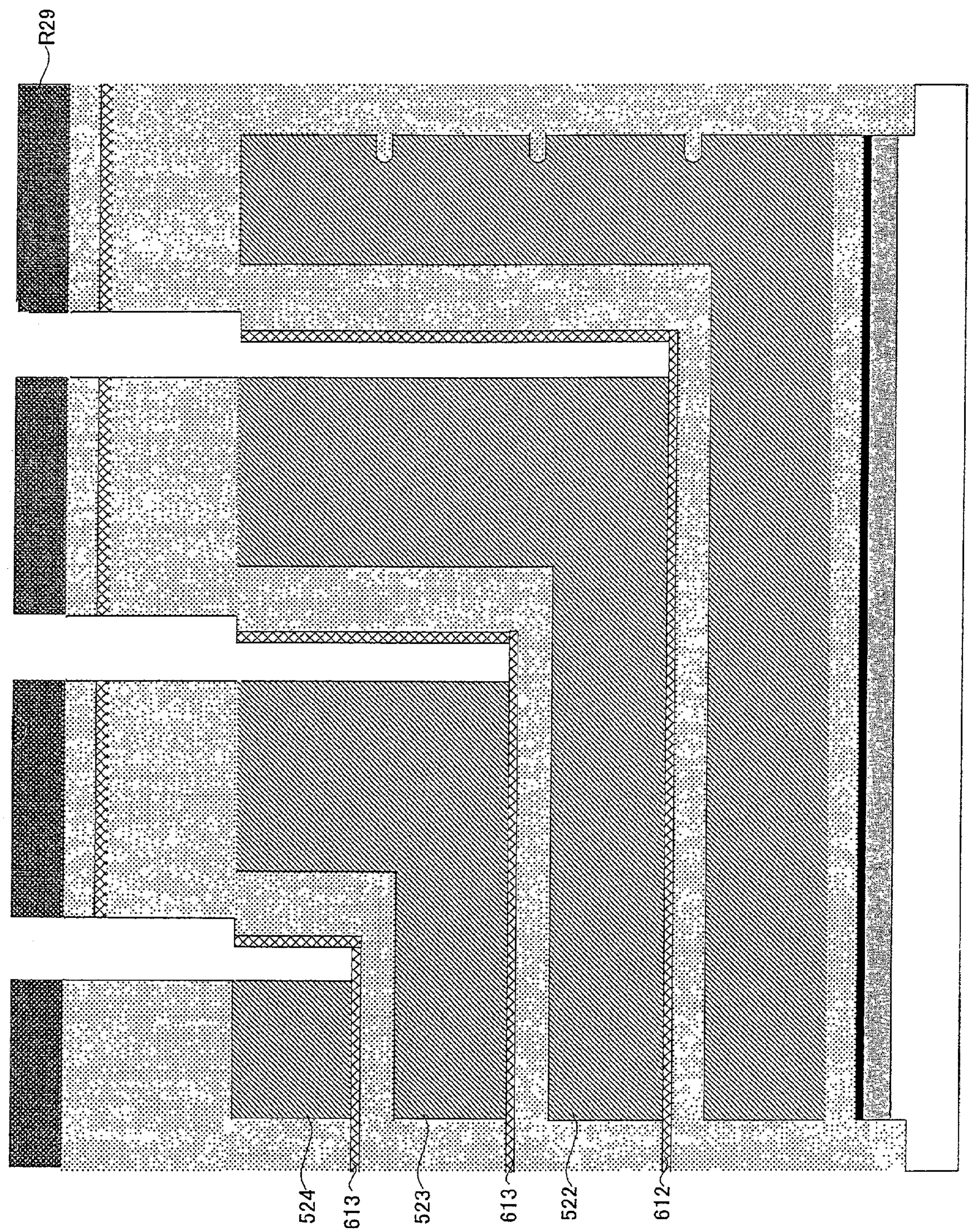
Figure 668:
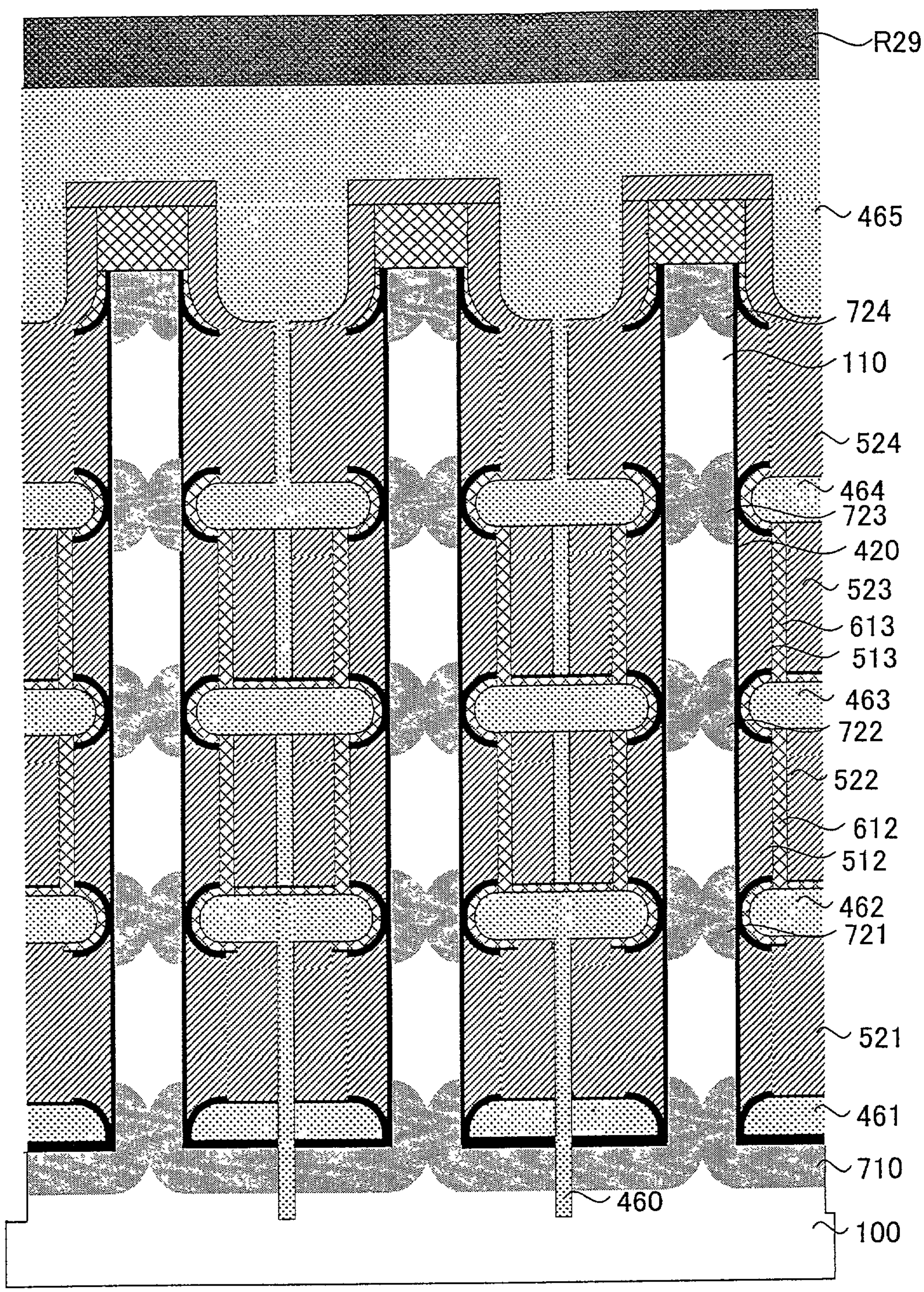

Subsequently, a polysilicon film 524 which is a second conductive film is formed on the side portion of a polysilicon film (a first conductive film) 514 with intervention of an interlayer insulating film 614, and a region where the polysilicon film (the second conductive film) 524 is located as an conductive film the nearest to the upper face of the island-like semiconductor layer in the lead-out portions of the second and third wiring layers is formed with intervention of the interlayer insulating film 614 and a silicon oxide film (the eighth insulating film) 464. Using a resist film R28 patterned by photolithography (FIG. 645, FIG. 656 and FIG. 667), the polysilicon films 522 to 524 are etched to reach the interlayer insulating films 614, 613 or 612 by reactive ion etching (FIG. 646, FIG. 657 and FIG. 668).

A silicon oxide film 495 which is a fifteenth insulating film is deposited to a thickness of 50 to 500 nm by CVD so that the polysilicon films 521, 522, 523 and 524 are prevented from electrically connecting each other.

Figure 647:
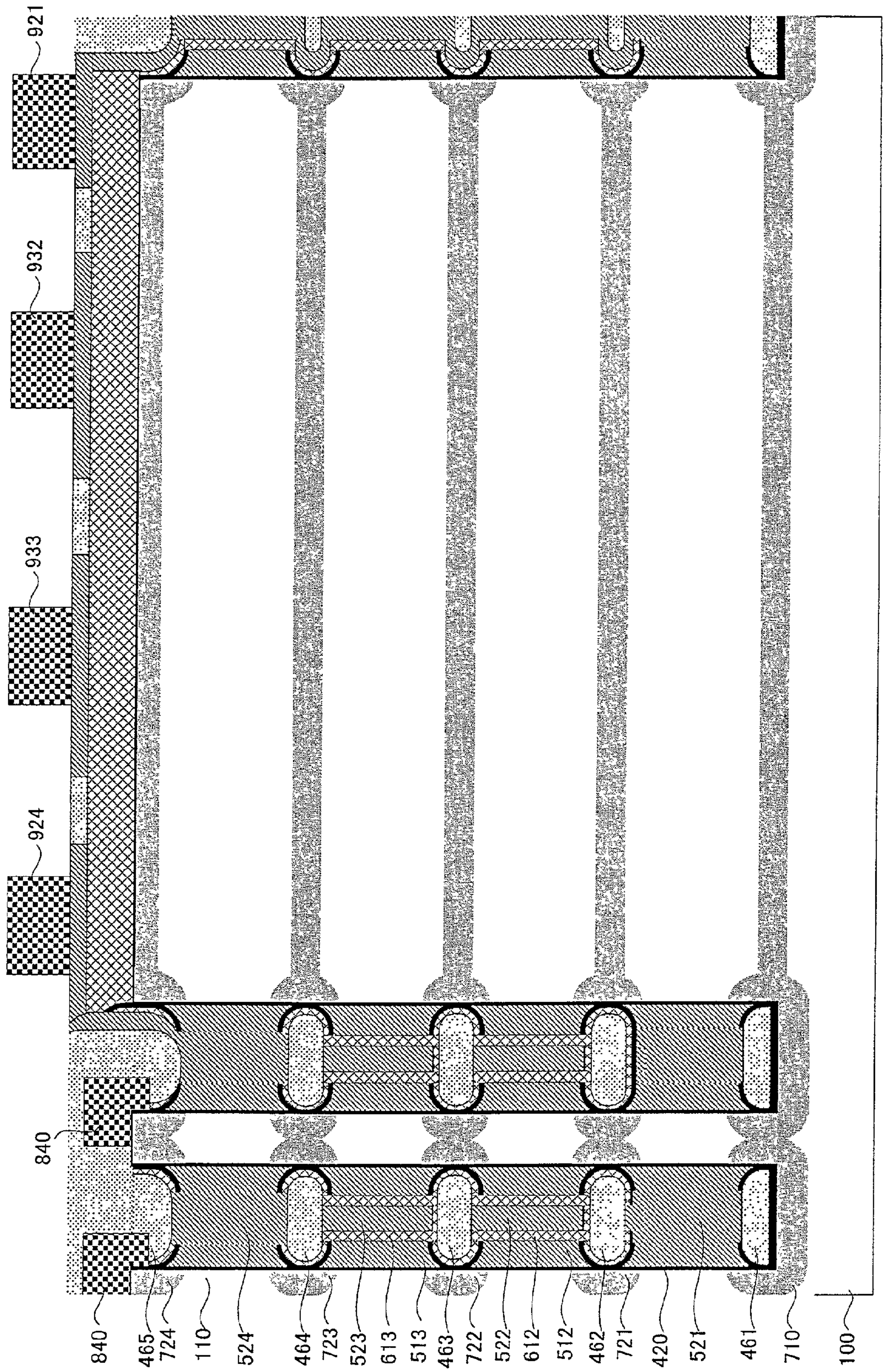
Figure 648:
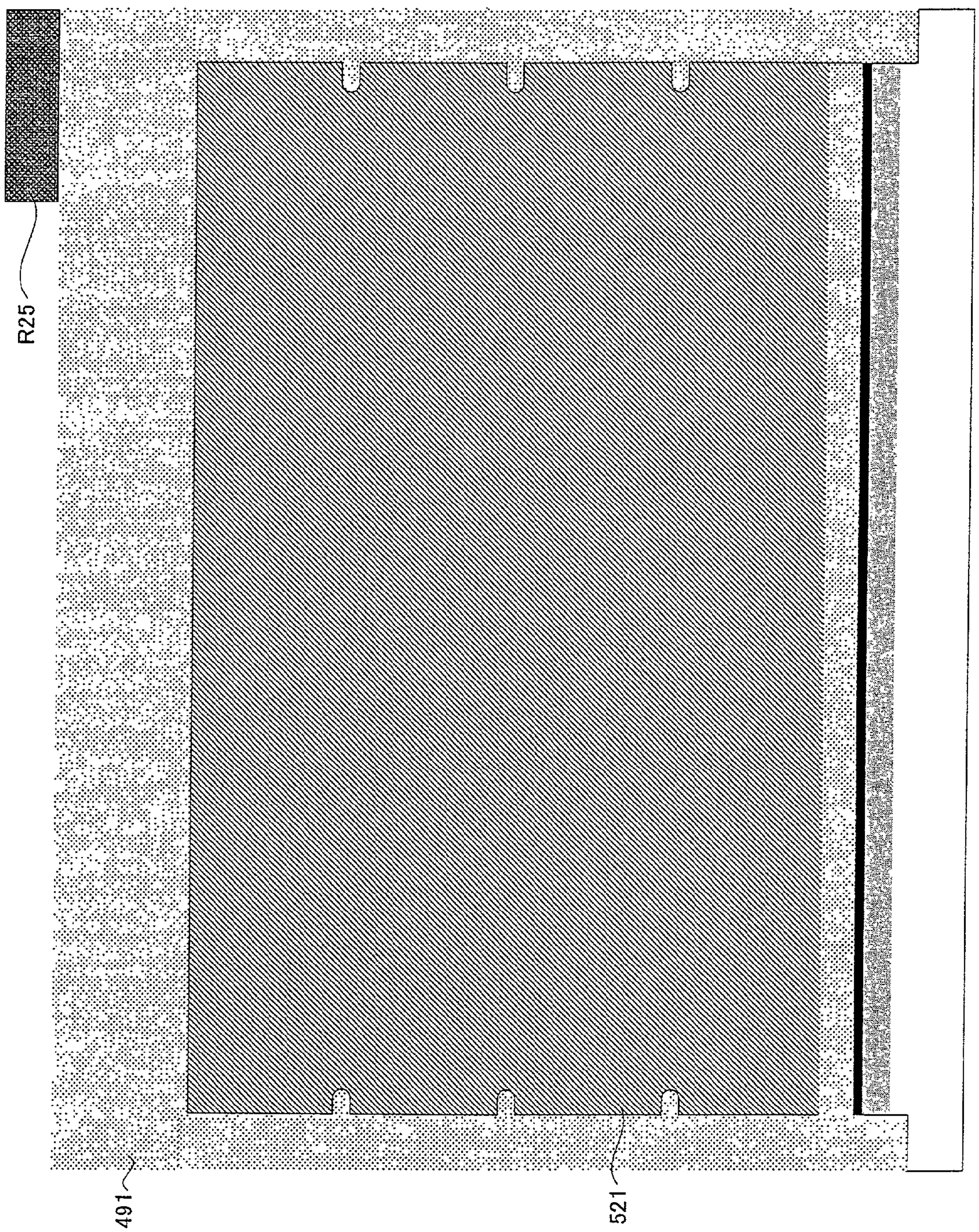
FIG. 648 to FIG. 658 are sectional views (taken on line F–F' in FIG. 1) illustrating production steps of Production Example 22 for producing a semiconductor memory in accordance with the present invention.

The top of the island-like semiconductor layer 110 provided with an impurity diffusion layer 724 is exposed by etch-back or CMP, and a fourth wiring layer is connected to the top of the island-like semiconductor layer 110 so that the direction of the fourth wiring layer crosses the direction of the second or third wiring layer. Thereafter, a silicon oxide film is deposited, CMP or etch-back is performed as required, and the second and third wiring layers 921, 932, 933 and 924 are formed in the lead-out portions (FIG. 647, FIG. 658 and FIG. 669).

Thereby, a semiconductor memory is realized which has a memory function according to a charged state in the charge storage layer which is the floating gate made of the polysilicon film (the first conductive film) and in which the second and third wiring layers are lead out to the top face of the island-like semiconductor layer without electrically contacting each other. The fourth wiring layer 840 and the second and third wiring layers 921, 932, 933 and 924 may be formed at the same time.

PRODUCTION EXAMPLE 23

This example shows an example of production process for producing a semiconductor memory as formed in Production Examples 1 to 9 in which the selection gates and the floating gates of the transistors are formed at the same time. In this example, is shown a production process for forming terminals which electrically connect the first, the second and third wiring layers to a peripheral circuit, respectively.

Such a semiconductor memory may be produced by the following production process. FIGS. 670 to 675 are sectional views taken on line H–H', line I1–I1', line I2–I2', line I3–I3', line I4–I4', and line I5–I5', respectively, in FIG. 60 which is a plan view illustrating a memory cell array of EEPROM, and FIGS. 676 to 681 are sectional views taken on line H–H', line Il-Il', line I2–I2', line I3–I3', line I4–I4', and line I5–I5', respectively, in FIG. 60 which is a plan view illustrating a memory cell array of EEPROM. These sectional views are taken at locations showing sites 921, 932, 933, 934 and 910 where terminals mounted on the top face of the semiconductor device are electrically connected to the buried wiring layers 521, 522, 523, 524 and 710 for the application of voltage to the buried wiring layers from outside. FIGS. 682 to 687, FIGS. 688 to FIG. 693 and FIG. 694 to 699 correspond to FIG. 676 to FIG. 681, respectively.

In this example, production steps until the silicon oxide film (the tenth insulating film) 465 is deposited to a thickness of 100 to 500 nm are the same as those in Production Example 1.

Thereafter, the surface of the silicon nitride film 465 is flattened by etch-back or CMP as required, as required. Using as a mask a resist film patterned by know photolithography, the silicon nitride film 465 is etched by reactive ion etching to reach a wiring layer intended to be lead out. This step is repeated as many times as the number of wiring layers to be lead out.

More particularly, for leading out the first wiring layer, using as a mask a resist film patterned by know photolithography, reactive ion etching is performed from the top surface of the silicon oxide film (the tenth insulating film) 465 to reach the impurity diffusion layer 710 only in a region where the lead-out portion of the wiring layer exists.

Subsequently, for leading out a wiring layer which is the second from the bottom, for example, using as a mask a resist film patterned by know photolithography, reactive ion etching is performed from the top surface of the silicon oxide film 465 to reach the polysilicon film (the second conductive film) 521 in a region of the lead-out portion of the wiring layer other than the region where the etching has been performed previously.

The arrangement of 921, 932, 933, 924 and 910 is not particularly limited so long as the terminals disposed on the top face of the semiconductor device are electrically connected to the buried wiring layers 521, 522, 523, 524 and 710. The order of etching for leading out the wiring layers is not particularly limited, either. For example, two trenches may be simultaneously formed to reach a wiring layer in the lead-out portion of the wiring layers. One of the trenches may be masked by a resist film and the other may be further etched to reach a lower wiring layer. Means for forming trenches for leading out the wiring layers are not particularly limited so long as the trenches are separately formed in the lead-out portion of the wiring layers to reach the wiring layers in a number equal to the number of the wiring layers to be lead out.

Thereafter, a silicon oxide film 492 is deposited as a twenty-second insulating film to a thickness of 10 to 100 nm and is etched back by about a thickness deposited so that a sidewall spacer is formed of the silicon oxide film 492 on an inner wall of the trenches formed in the lead-out portion of the wiring layers. The twenty-second insulating film is not particularly limited to a silicon oxide film but may be silicon nitride film or any other insulating film.

Production steps thereafter follow Production Example 1. When the fourth wiring layer is formed, a metal or a conductive film is buried in the trenches formed in the lead-out portion of the wiring layers with intervention of the sidewall spacer of the silicon oxide film 492. Thereby the first, second, third wiring layers are lead out to the top face of the semiconductor (FIG. 670 to FIG. 675).

Alternatively, the second and third wiring layers may be arranged in the lead-out portion of the wiring layers as shown in FIGS. 676 to 681, and the trench formed in the lead-out portion may have some distance from other wiring layers unintended to be lead out with intervention of an insulating film. In this case, the sidewall spacer of the silicon oxide film 492 need not be formed. As a further effect, parasitic capacity between the wiring layers is expected to decrease because unrelated wiring layers do not exist around the trench.

The lead-out of the first, second and third wiring layers to the top face of the semiconductor by the above-described process is applicable to all examples of the present invention.

FIG. 682 to FIG. 687, in contrast to FIG. 676 to FIG. 681, show a process in which the above-described lead-out is carried out only on the first wiring layer, which is lead out at the formation of the fourth wiring layer 840, a silicon oxide film is deposited and subjected to CMP or etch-back as required, and trenches are formed in the lead-out portion for leading out the second and third wiring layers.

FIG. 688 to FIG. 693, in contrast to FIG. 676 to FIG. 681, show a process in which the fourth wiring layer 840 is formed in the memory cell portion, a silicon oxide film is deposited and subjected to CMP or etch-back as required, and trenches are formed in the lead-out portion for leading out the first, second and third wiring layers.

FIG. 694 to FIG. 699, in contrast to FIG. 676 to FIG. 681, show a process in which, as an example in which a first contact 910 and second and third contacts 821, 832, 833 and 824 have different diameters, a contact connected to a wiring layer deeper from the top face of the semiconductor device has a larger diameter.

More particularly, in FIG. 694 to FIG. 699, the first contact 910, a second contact 921, a third contact 932, a third contact 933 and a second contact 924 may have a large diameter in this order. Thereby, even in the case where a contact needs to be formed by etching deeper, the contact is ensured to have a sufficient opening for exposing a buried wiring layer intended to be connected and have a sufficient contact area with the intended wiring layer.

PRODUCTION EXAMPLE 24

In contrast to Production Example 1, this example shows an example of production process which uses a resist film instead of the silicon oxide film 431 to 433 which are the fifth insulating films. FIGS. 700 to 706 and FIGS. 707 to 713 are sectional views taken on line A–A' and line B–B', respectively, in FIG. 1.

In this example, production steps until the silicon nitride film (the fourth insulating film) 321 is made to remain in the sidewall spacer form on the sidewall of the polysilicon film (the first conductive films) 510 by reactive ion etching (FIG. 700 and FIG. 707) are the same as those in Production Example 1.

Figure 701:
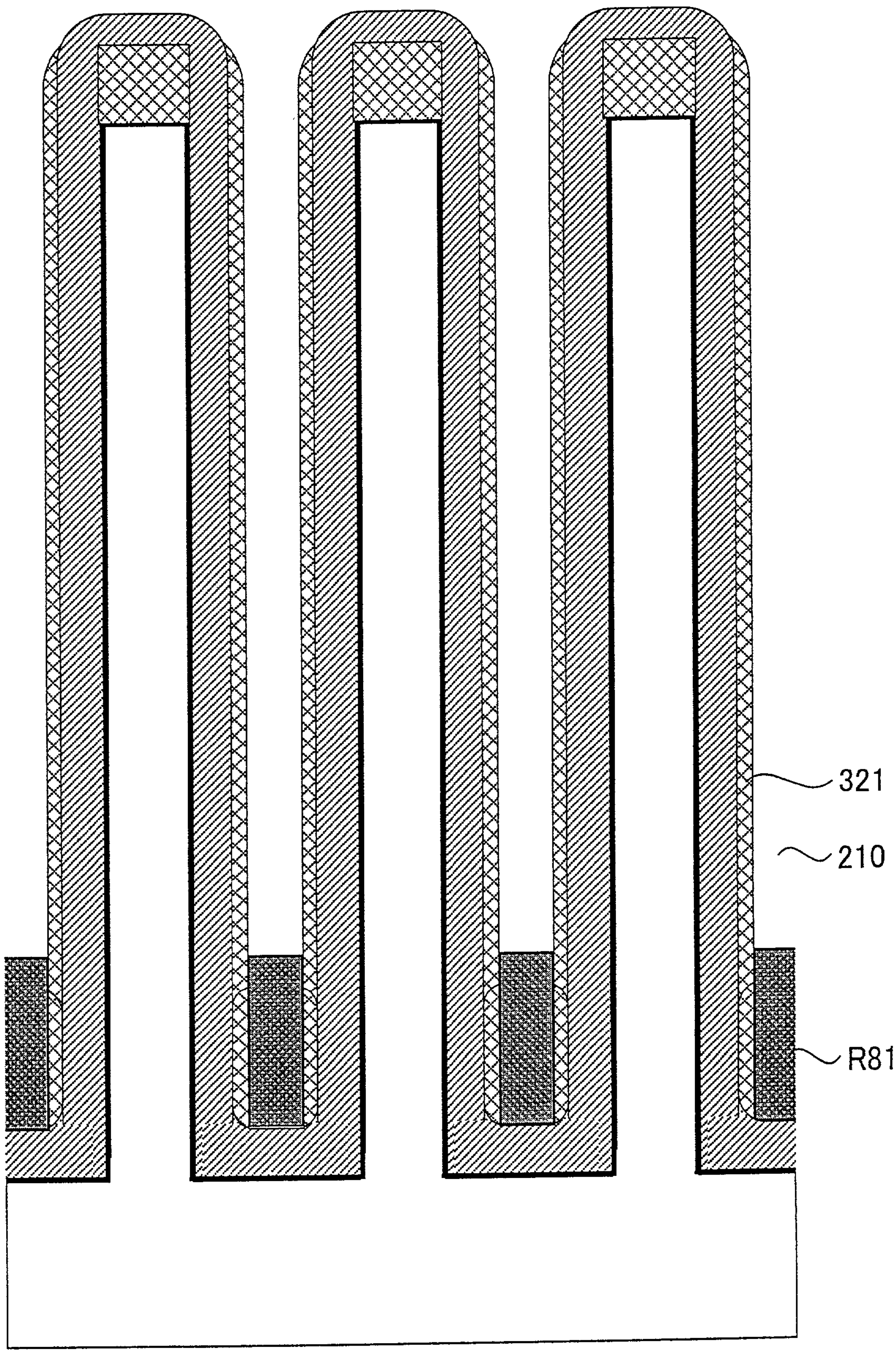
Figure 708:
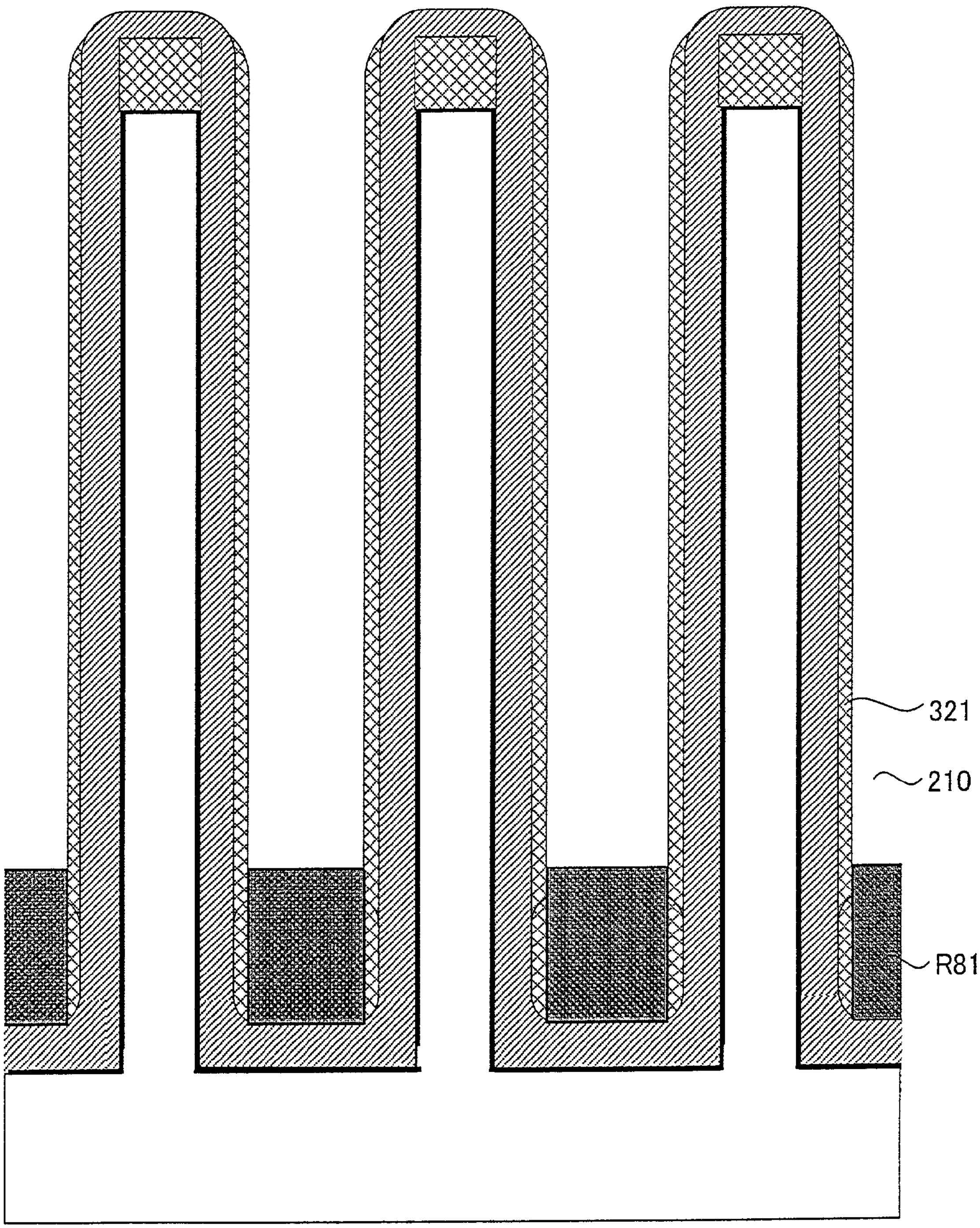

Thereafter, a resist film R81 is applied and is etched back so that the resist film R81 is buried to a desired depth in the trench 210 in the lattice form (FIG. 701 and FIG. 708).

Figure 702:
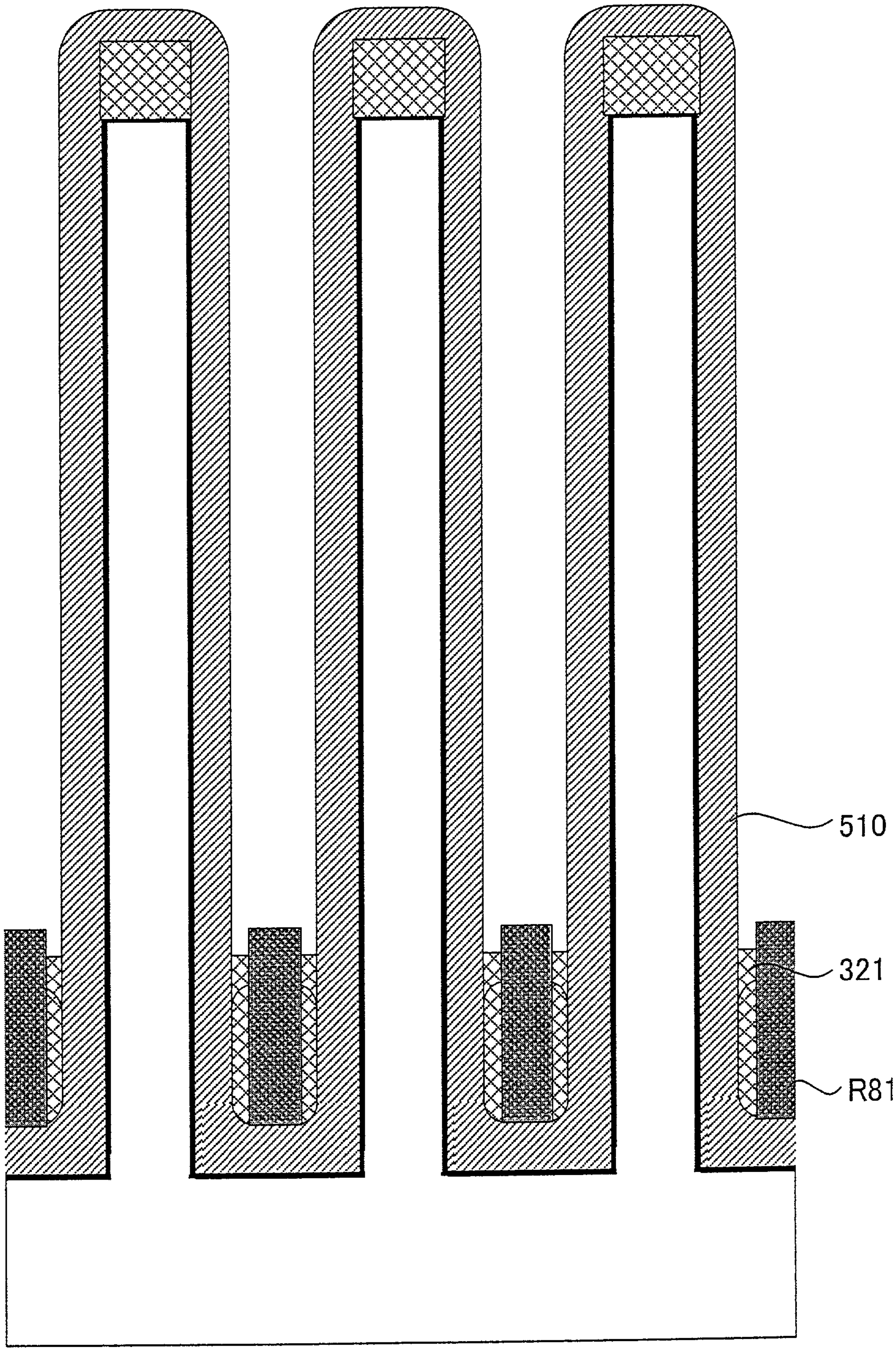
Figure 703:
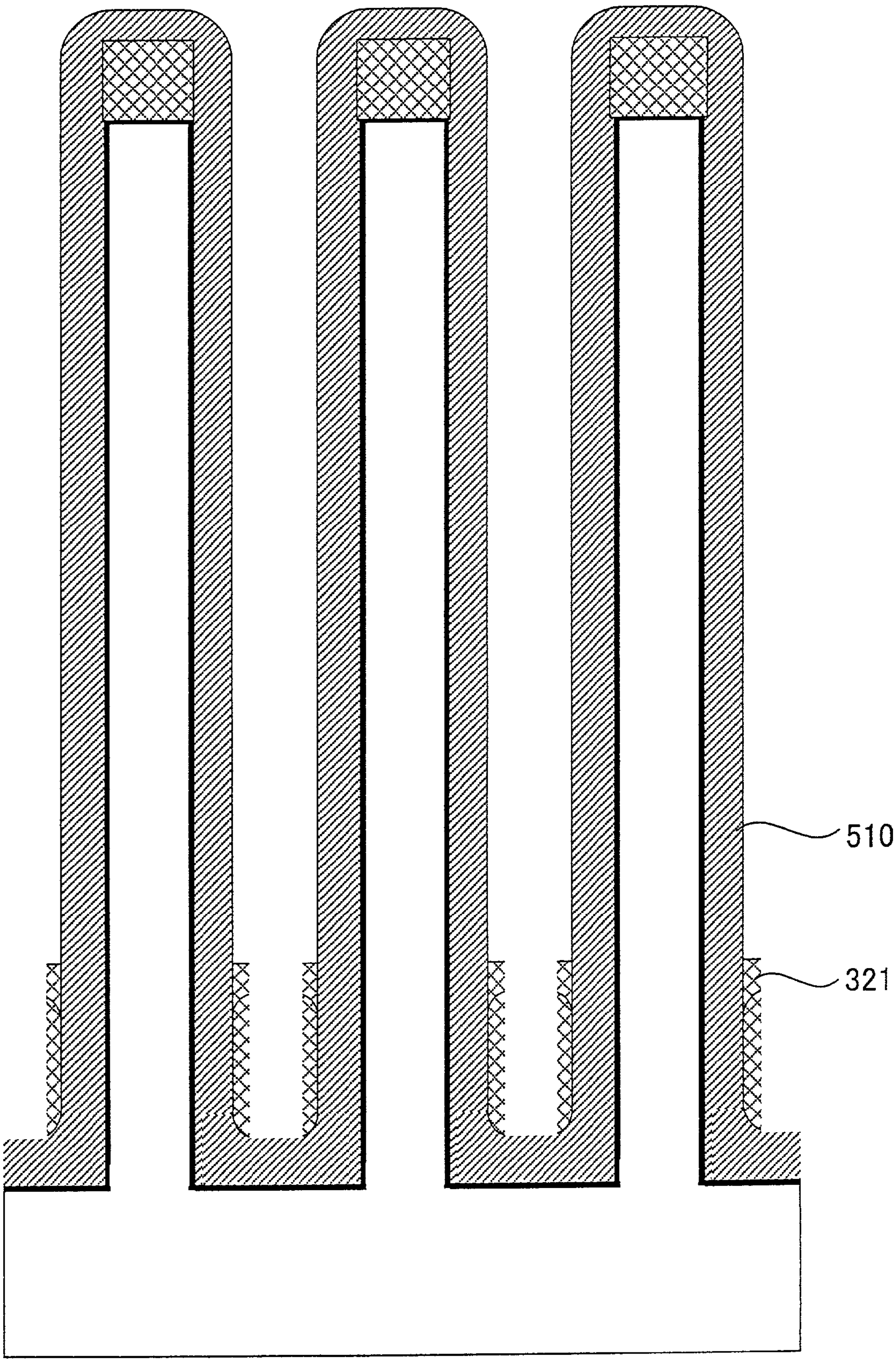
Figure 709:
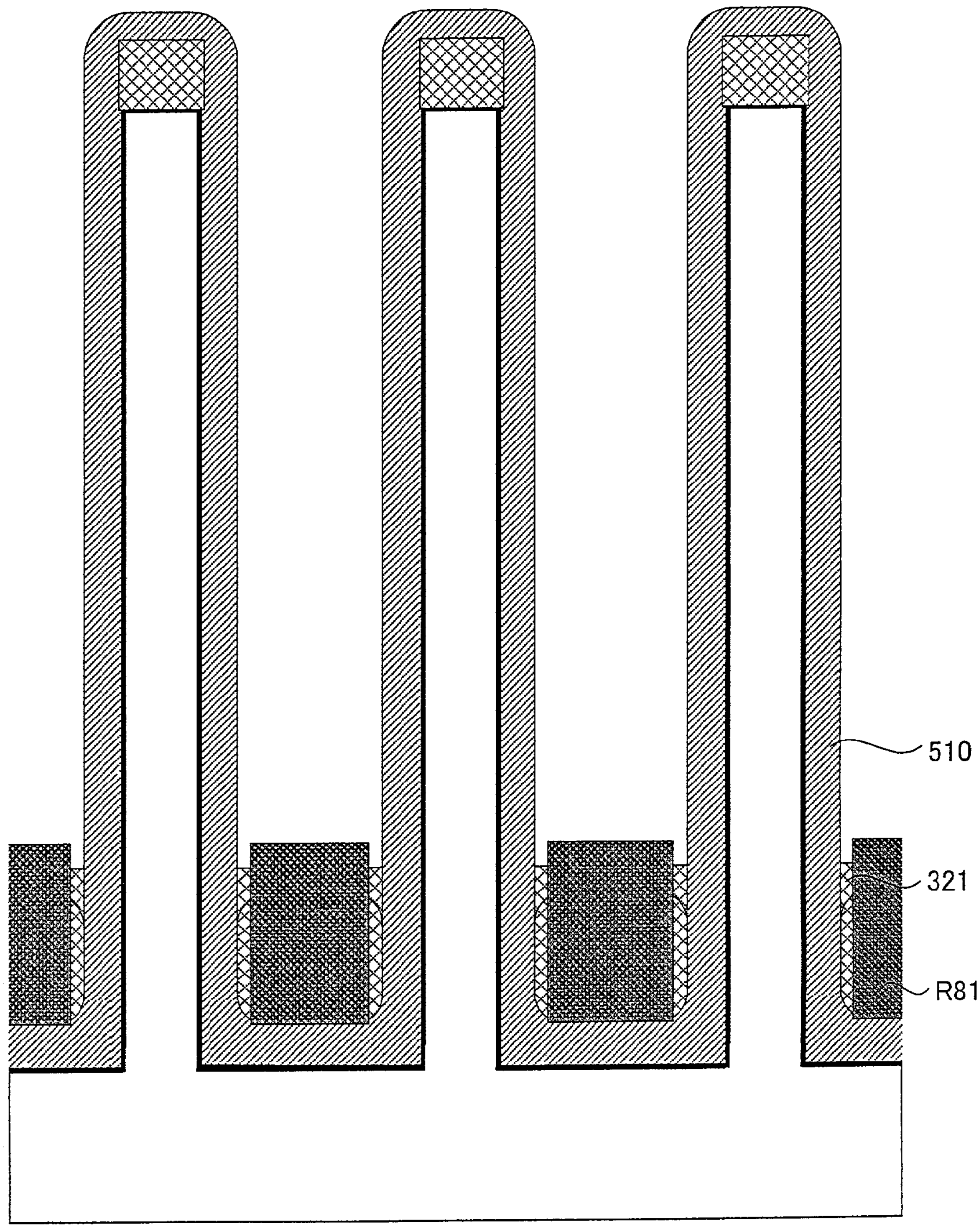
Figure 710:
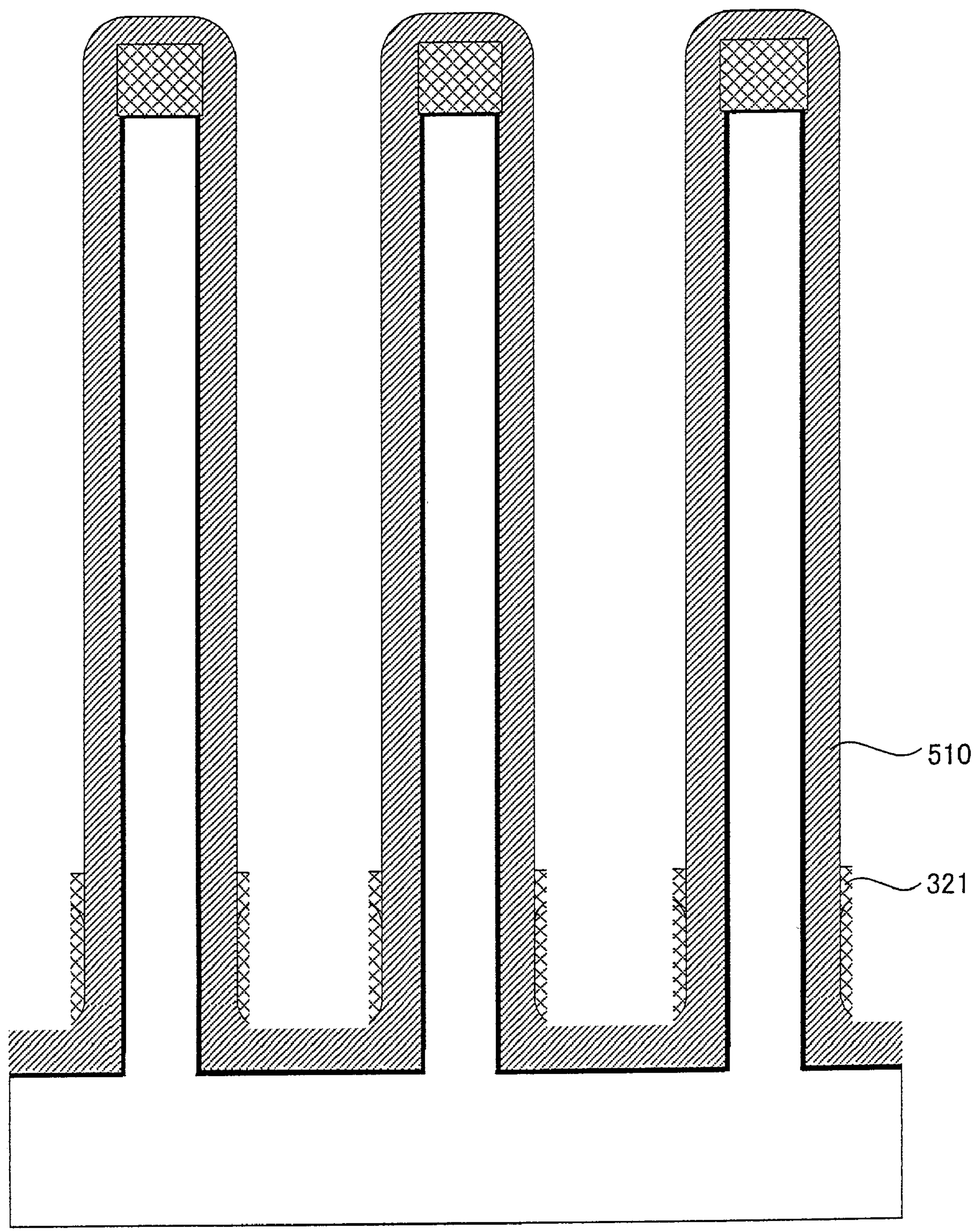

The silicon nitride film 321 is isotropically etched using the resist film R81 as a mask so that the silicon nitride film 321 remains only between the resist film R81 and the polysilicon film 510 (FIG. 702 and FIG. 709).

After removing the resist film R81 (FIG. 703 and FIG. 710), a sixth insulating film, for example, a silicon oxide film 441 is deposited to a thickness of 50 to 500 nm to bury the silicon nitride film 321. The silicon oxide film 441 is etched back to a desired depth by anisotropic or isotropic etching.

Likewise, a silicon nitride film 322 which is a fourth insulating film is deposited to a thickness of 5 to 50 nm by CVD and etched by reactive ion etching so that the silicon nitride film 322 remains in a sidewall spacer form on the sidewall of the polysilicon film 510.

Figure 704:
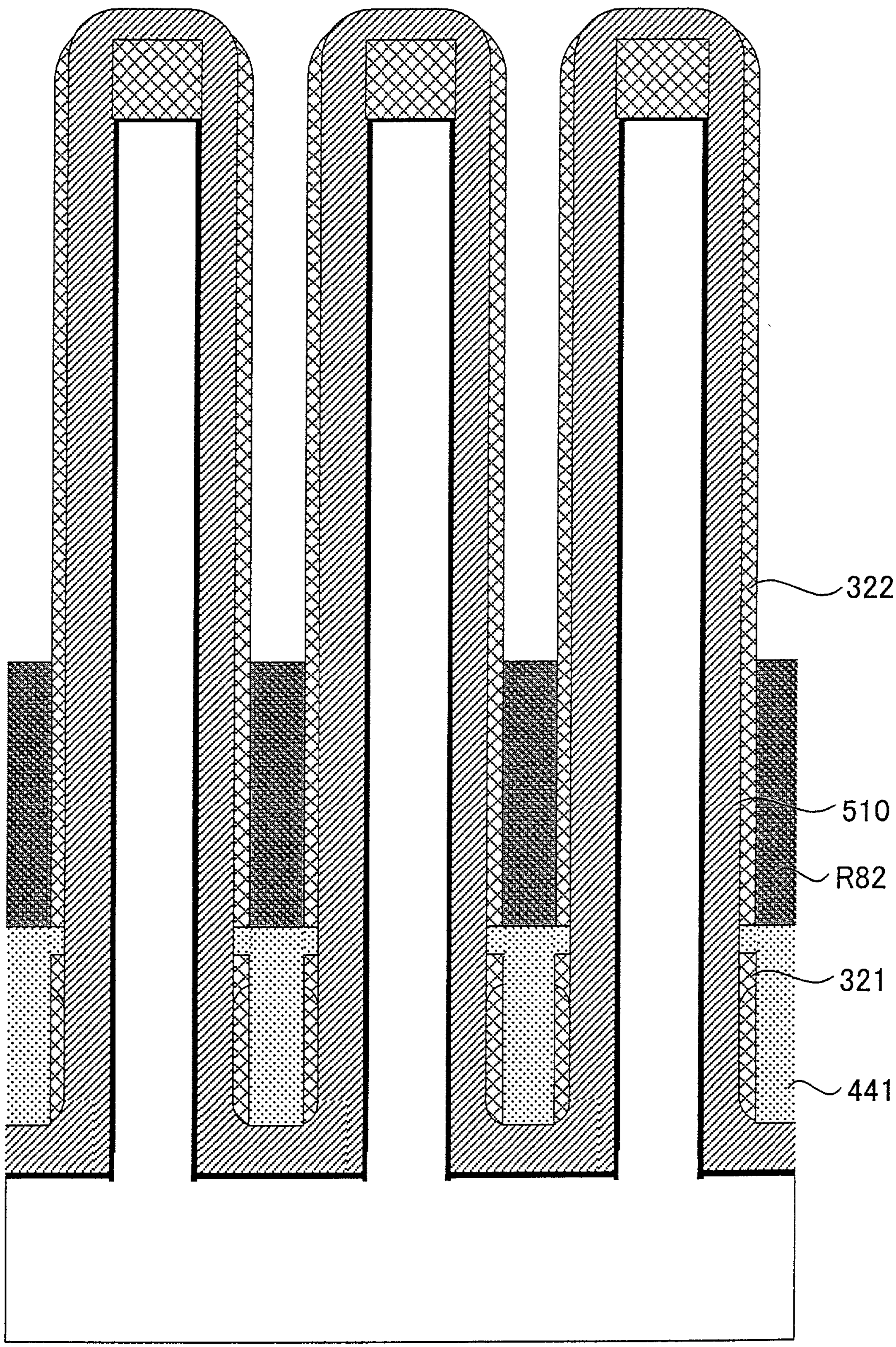
Figure 711:
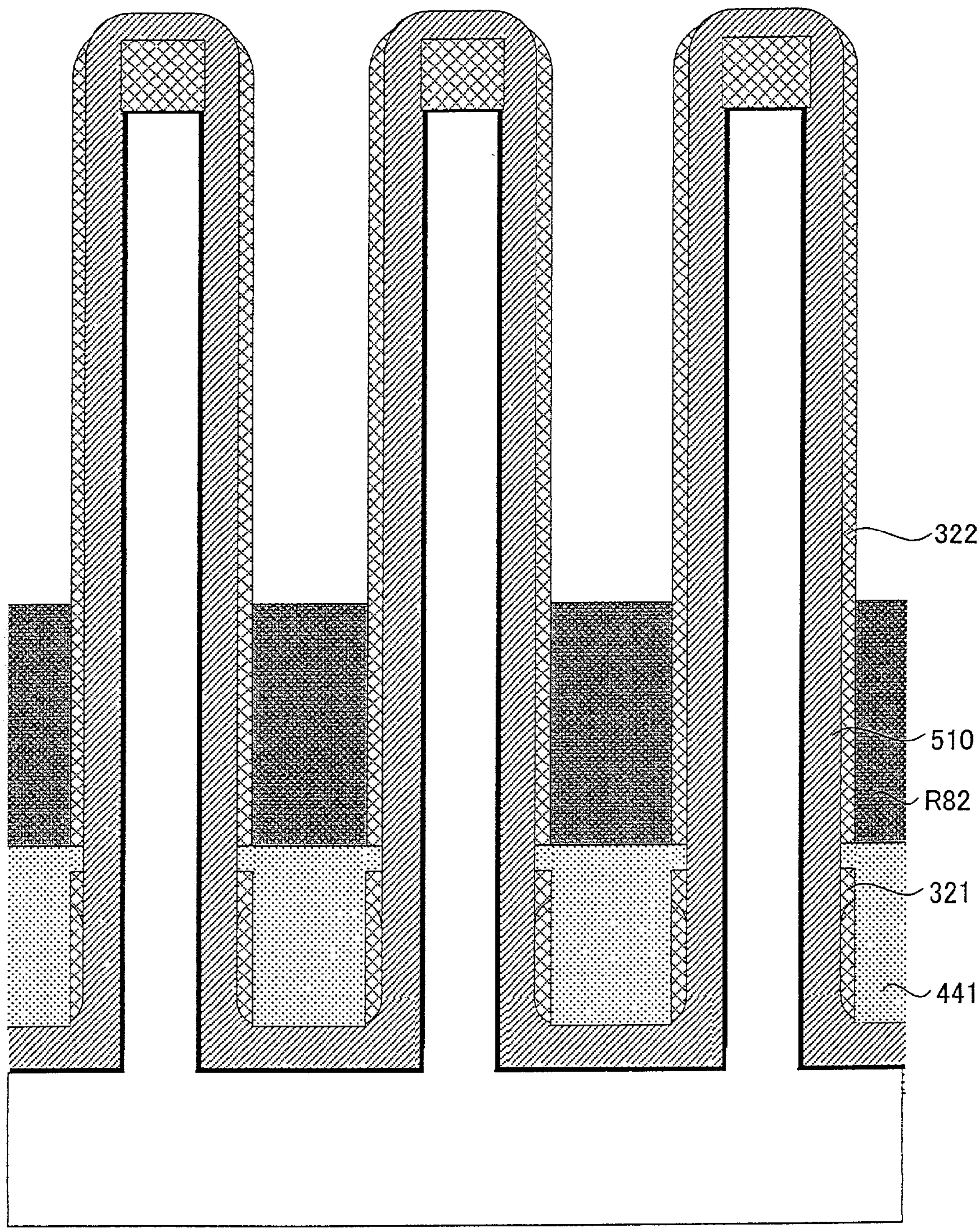

A resist film R82 is applied and is etched back so that the resist film R82 is buried to a desired depth in the trench 210 in the lattice form (FIG. 704 and FIG. 711).

The silicon nitride film 322 is isotropically etched using the resist film R82 as a mask so that the silicon nitride film 322 remains only between the resist film R82 and the polysilicon film 510. After removing the resist film R82, a sixth insulating film, for example, a silicon oxide film 442 is deposited to a thickness of 50 to 500 nm to bury the silicon nitride film 322. The silicon oxide film 442 is etched back to a desired depth by anisotropic or isotropic etching.

Figure 705:
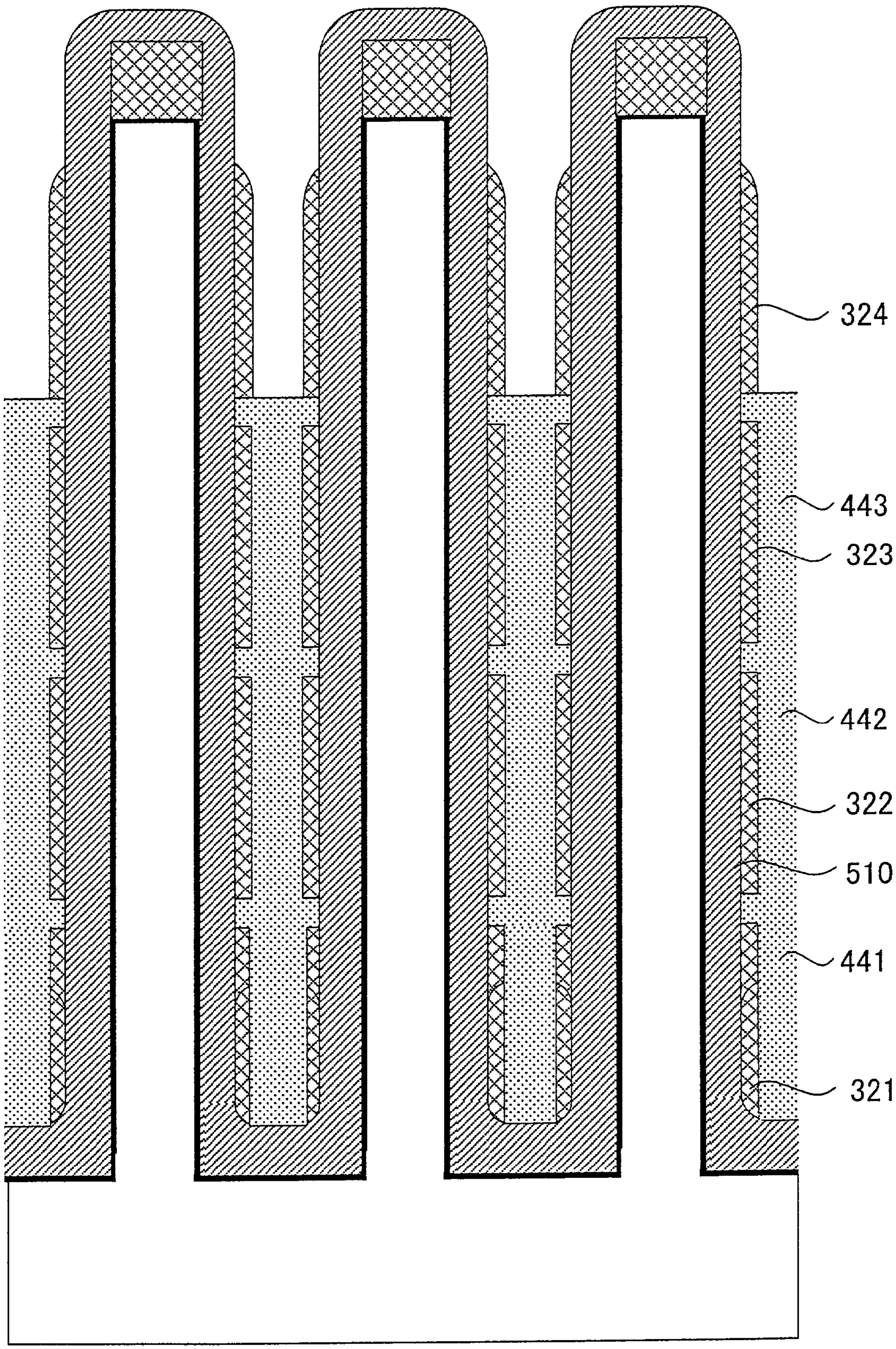
Figure 712:
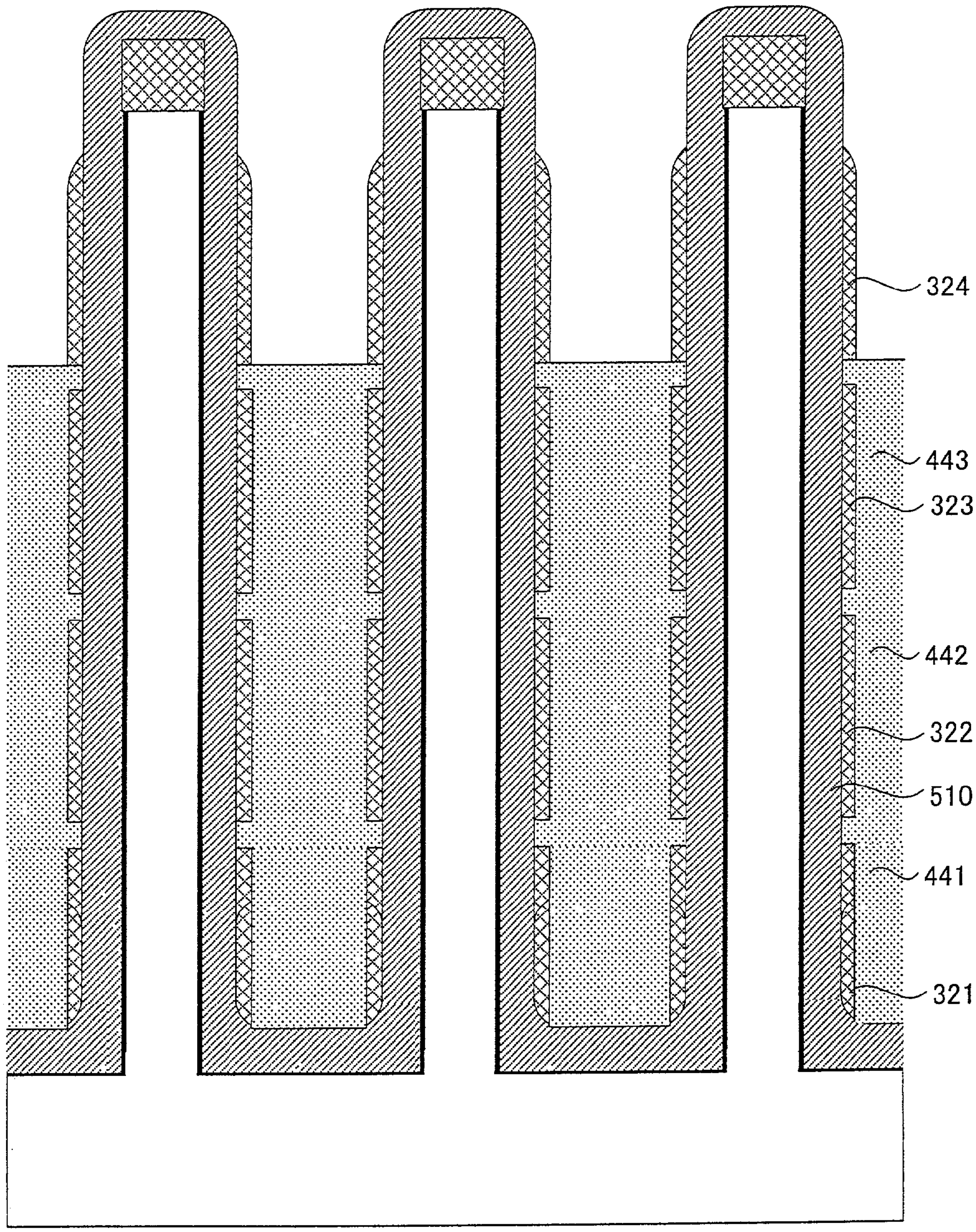

By repeating these steps, a plurality of sidewall spacers are formed of the silicon nitride film on the sidewall of the polysilicon film 510 (FIG. 705 and FIG. 712).

Production steps after the division of the polysilicon film 510 by isotropic etching follow those of the previous production examples.

Figure 706:
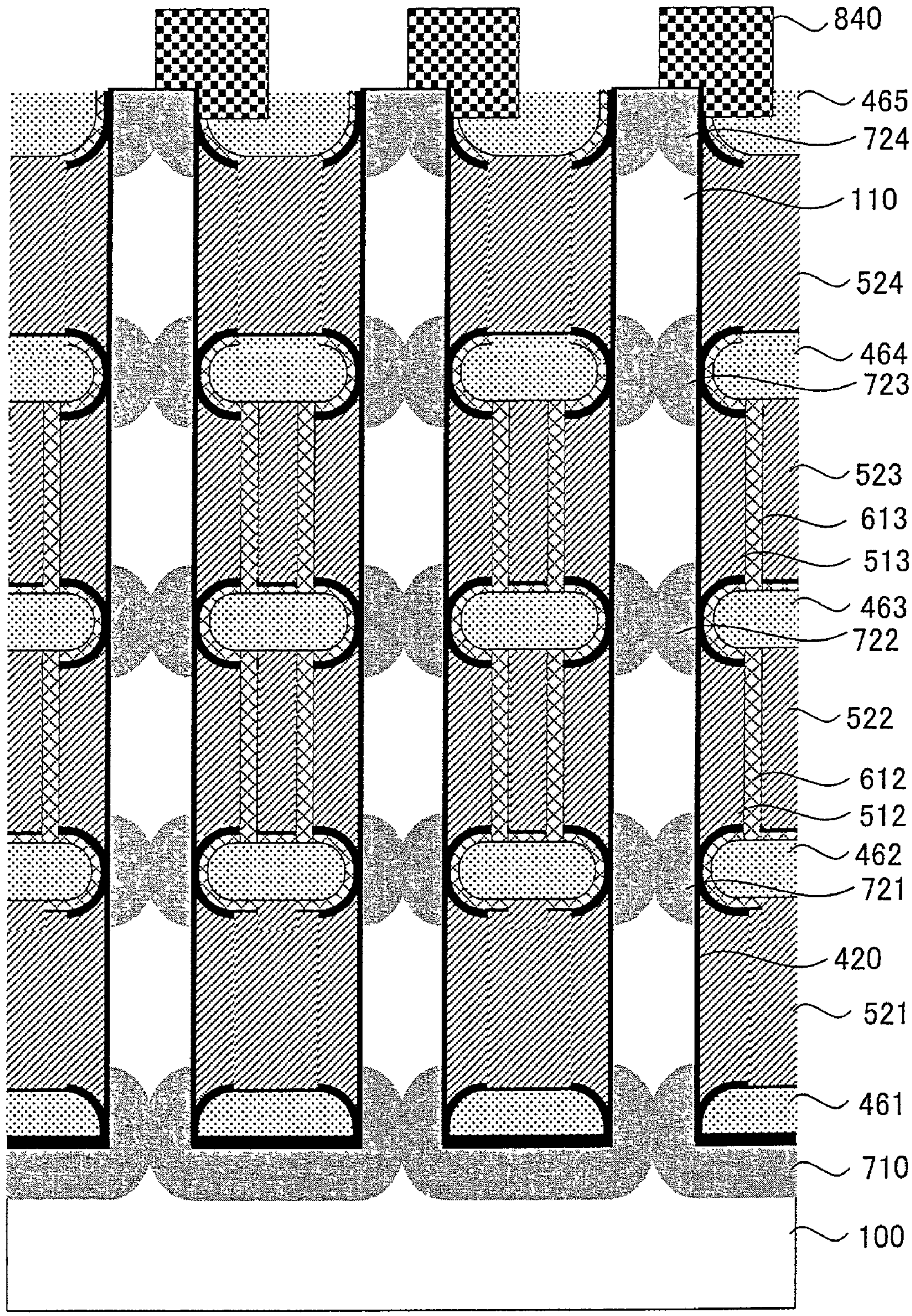
Figure 707:
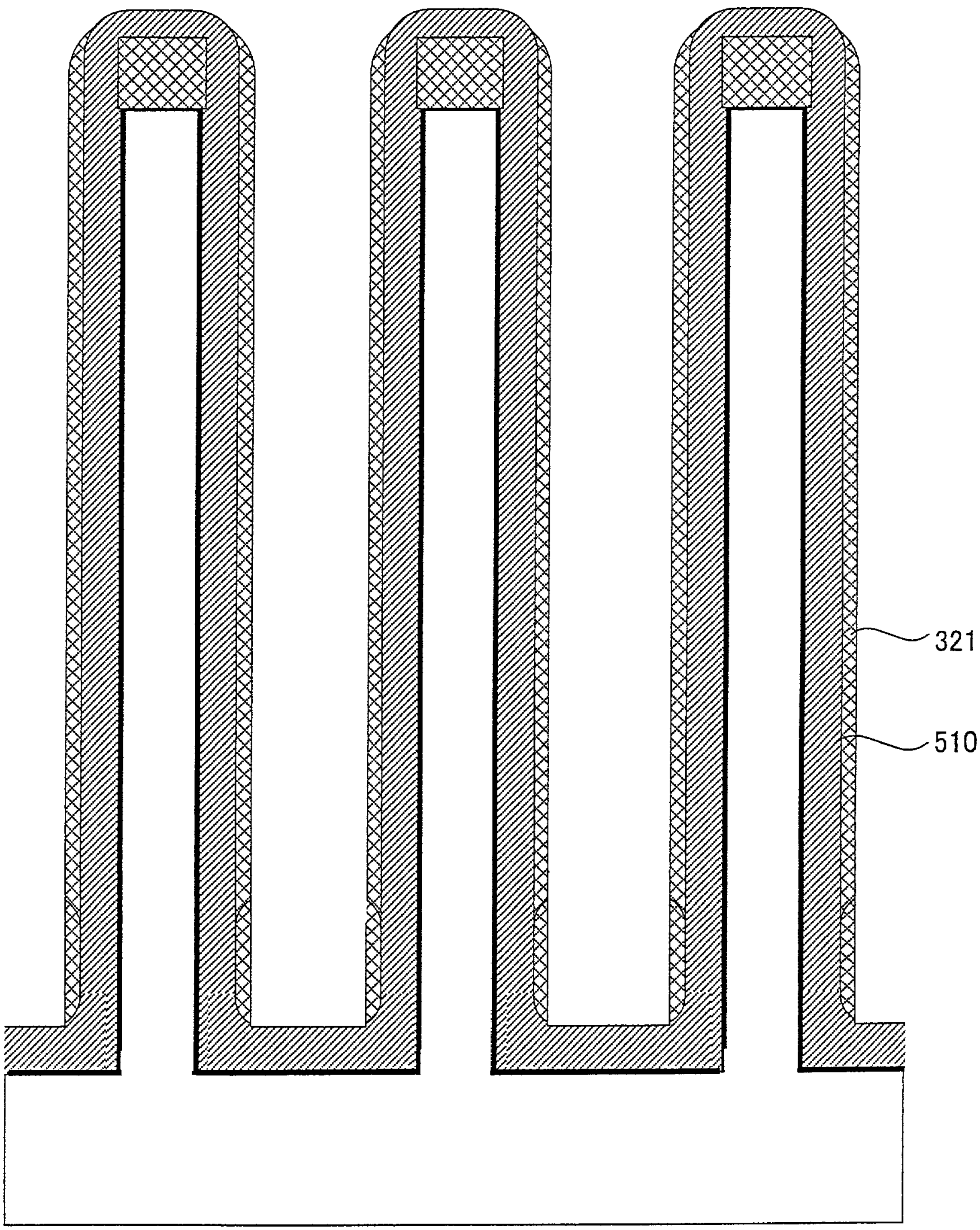
Figure 713:
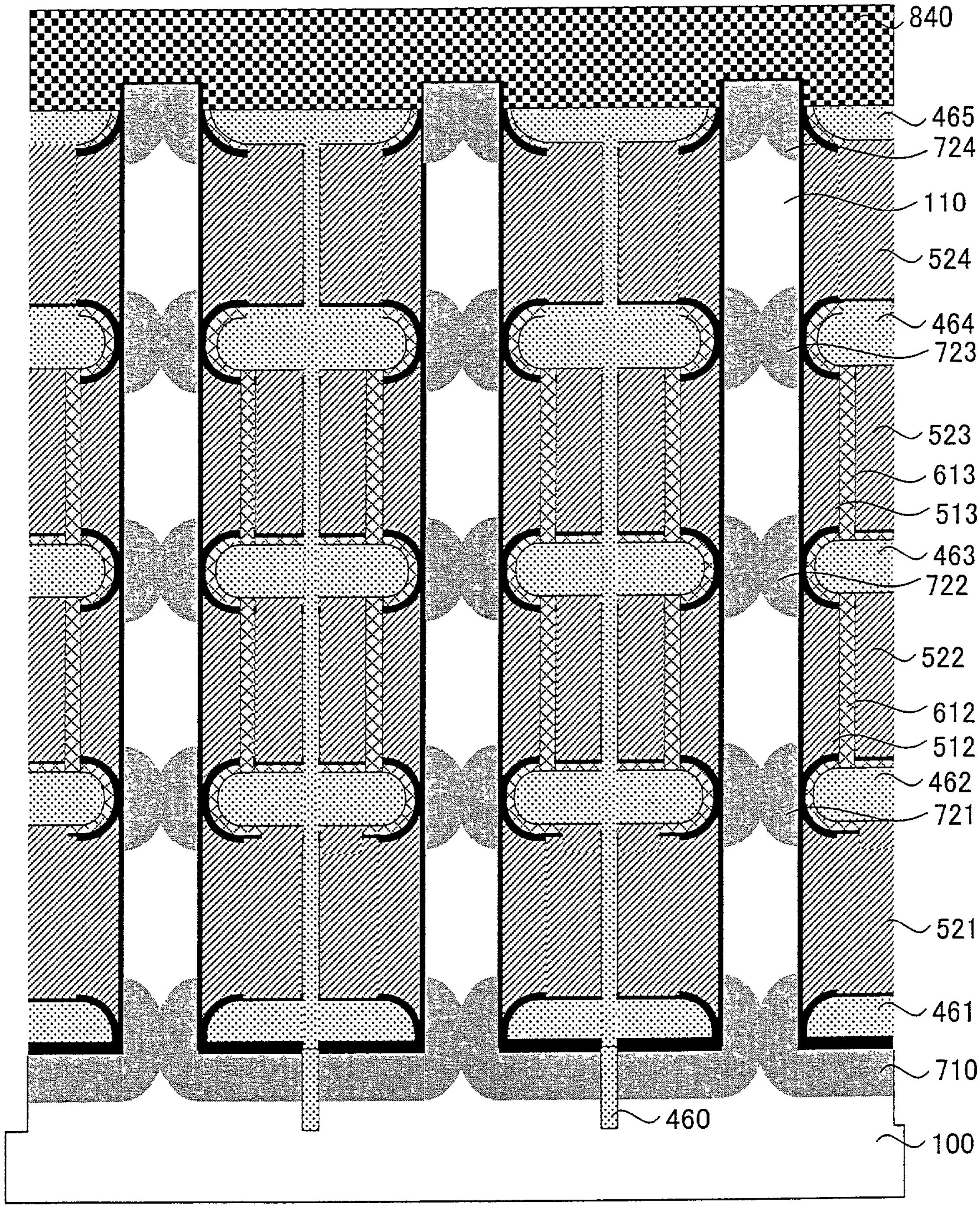

Thereby, a semiconductor memory is realized which has the same effect as that of the previous production examples (FIG. 706 and FIG. 713). Since the deposition process for the silicon oxide films 431 to 433 by CVD is not performed, this example has an advantage in that thermal history can be reduced.

The formation of a plurality of sidewall spacers of silicon nitride for dividing the polysilicon film (the first conductive film) 510 and the polysilicon film (the second conductive film) 520 as described above is applicable to all the examples of the present invention. Further, not only for dividing the polysilicon film 510 and the polysilicon film 520 as in this example, but also for removing a silicon nitride film, a silicon oxide film or a polysilicon film higher than a desired height, the burying of the resist film is applicable to all the examples of the present invention.

PRODUCTION EXAMPLE 25

In contrast to Production Example 1, this example shows an example of production process in which the control gates of the memory cells are formed to be discontinuous in any direction, a hole-form trench is formed later for an island-like semiconductor layer separation and an conductive film is buried in the hole-form trench thereby to form the second and third wiring layers. FIGS. 714 to 720 and FIGS. 721 to 727 are sectional views taken on line A–A' and line B–B', respectively, in FIG. 64.

In this example, production steps until a tenth insulating film, for example, a silicon oxide film 465, is deposited to a thickness of 100 to 500 nm on the top of the polysilicon film (the second conductive film) 524 are the same as those in Production Example 1, except that the control gates of the memory cells are formed to be discontinuous both in the A–A' direction and in the B–B' direction in FIG. 64 by varying the intervals between the island-like semiconductor layers in the A–A' direction and in the B–B' direction and the thicknesses of the second conductive films deposited and that the separation of the first wiring layer is not realized in self-alignment with the separation of the second conductive film.

Figure 714:
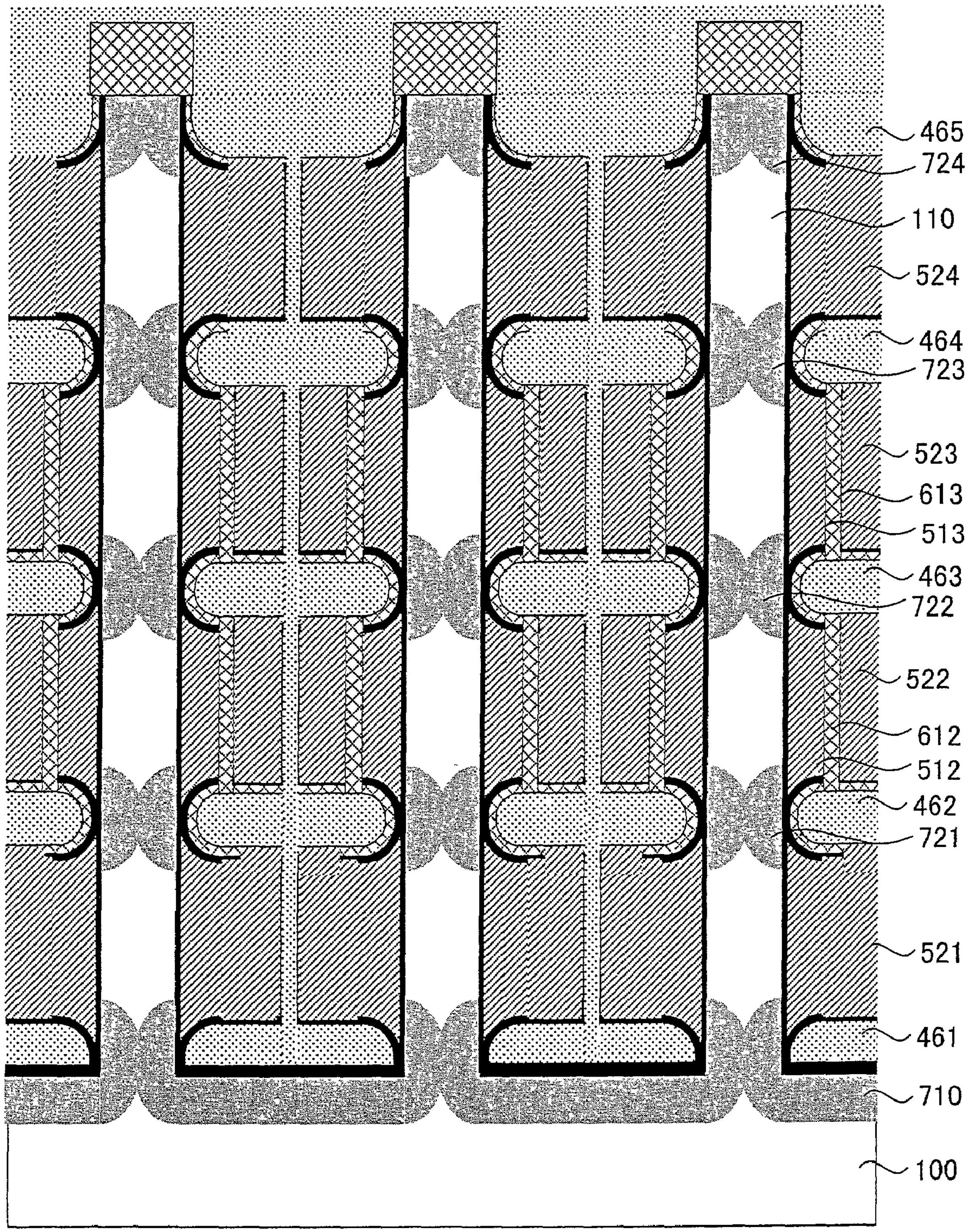
Figure 715:
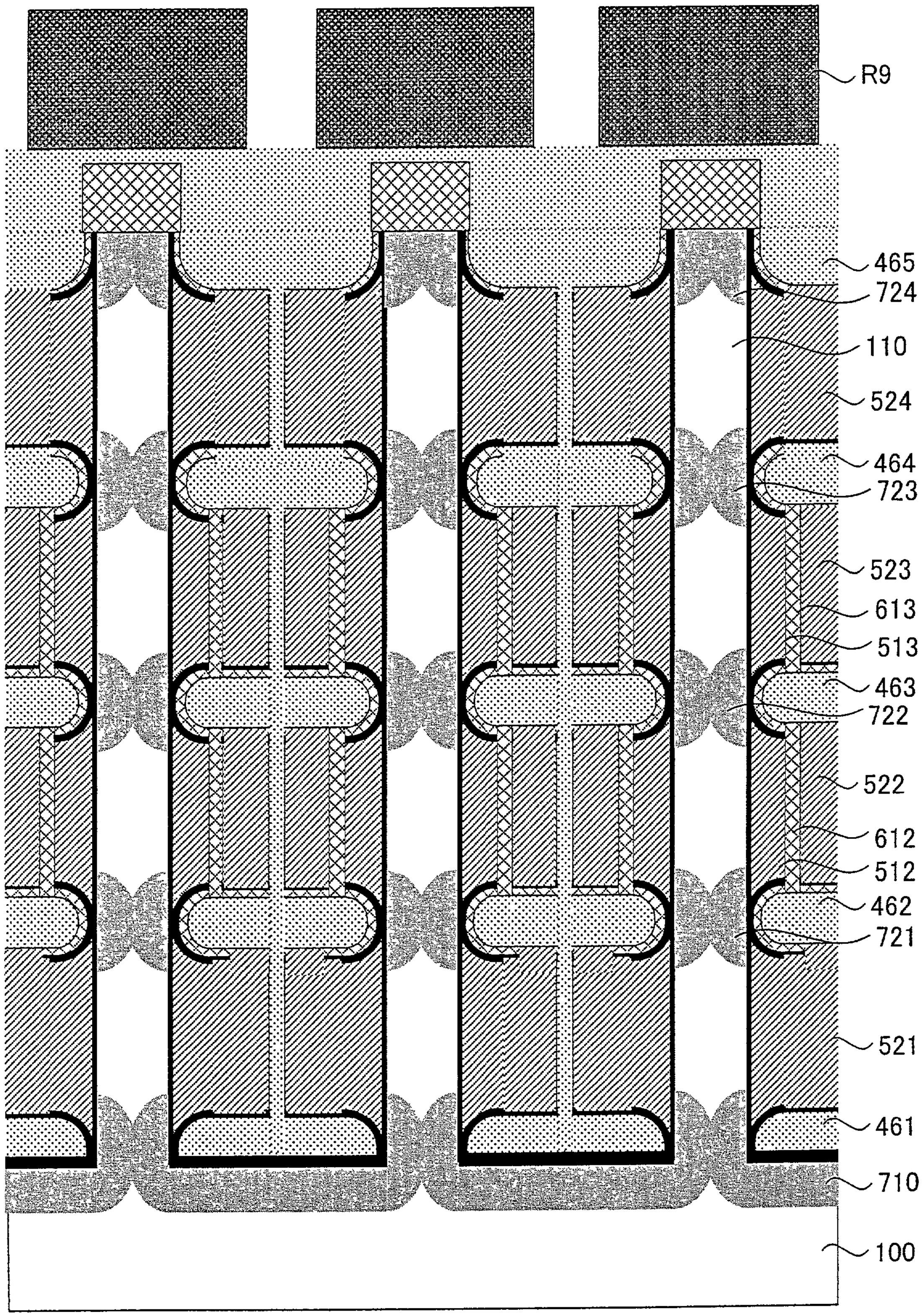
Figure 721:
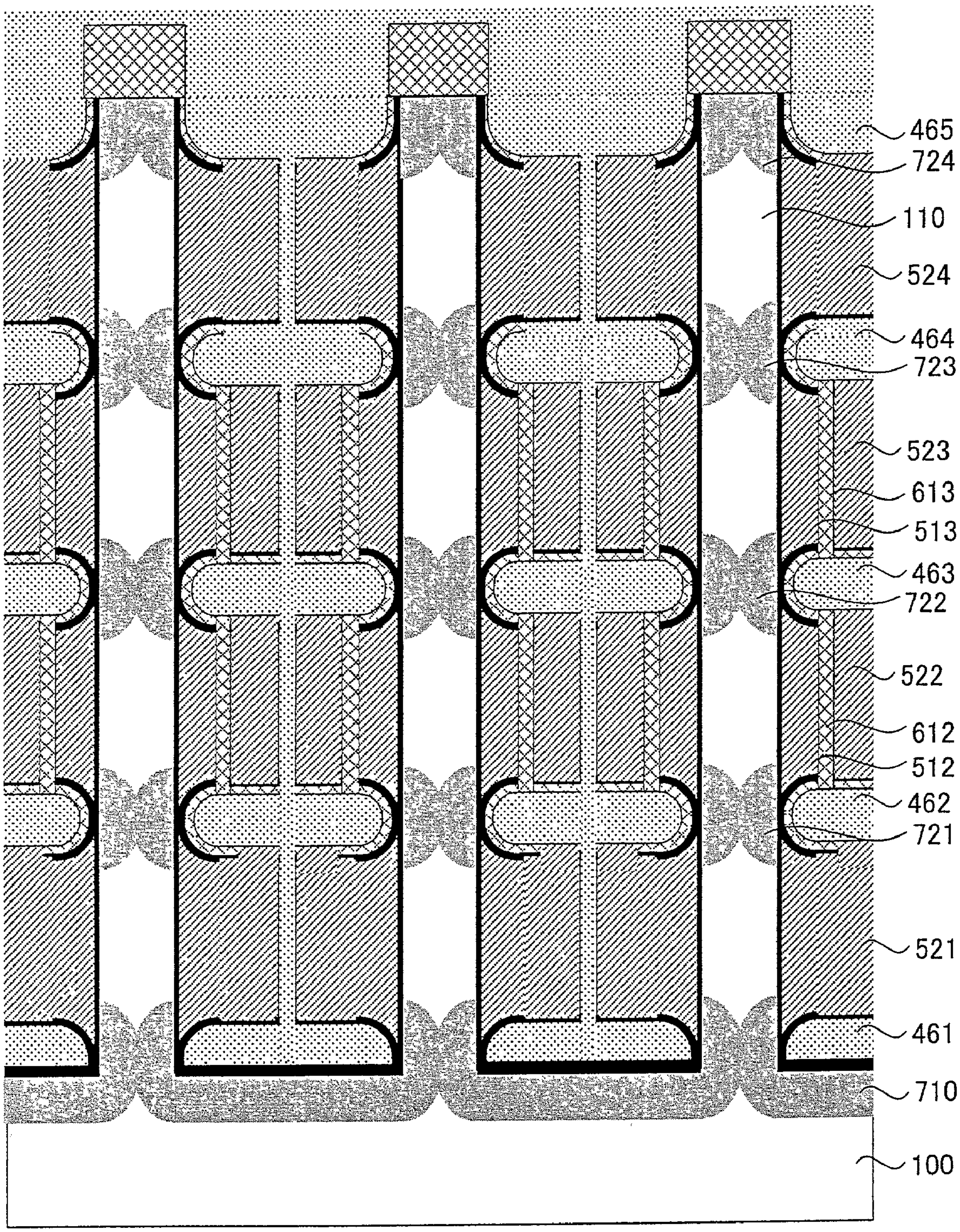
Figure 722:
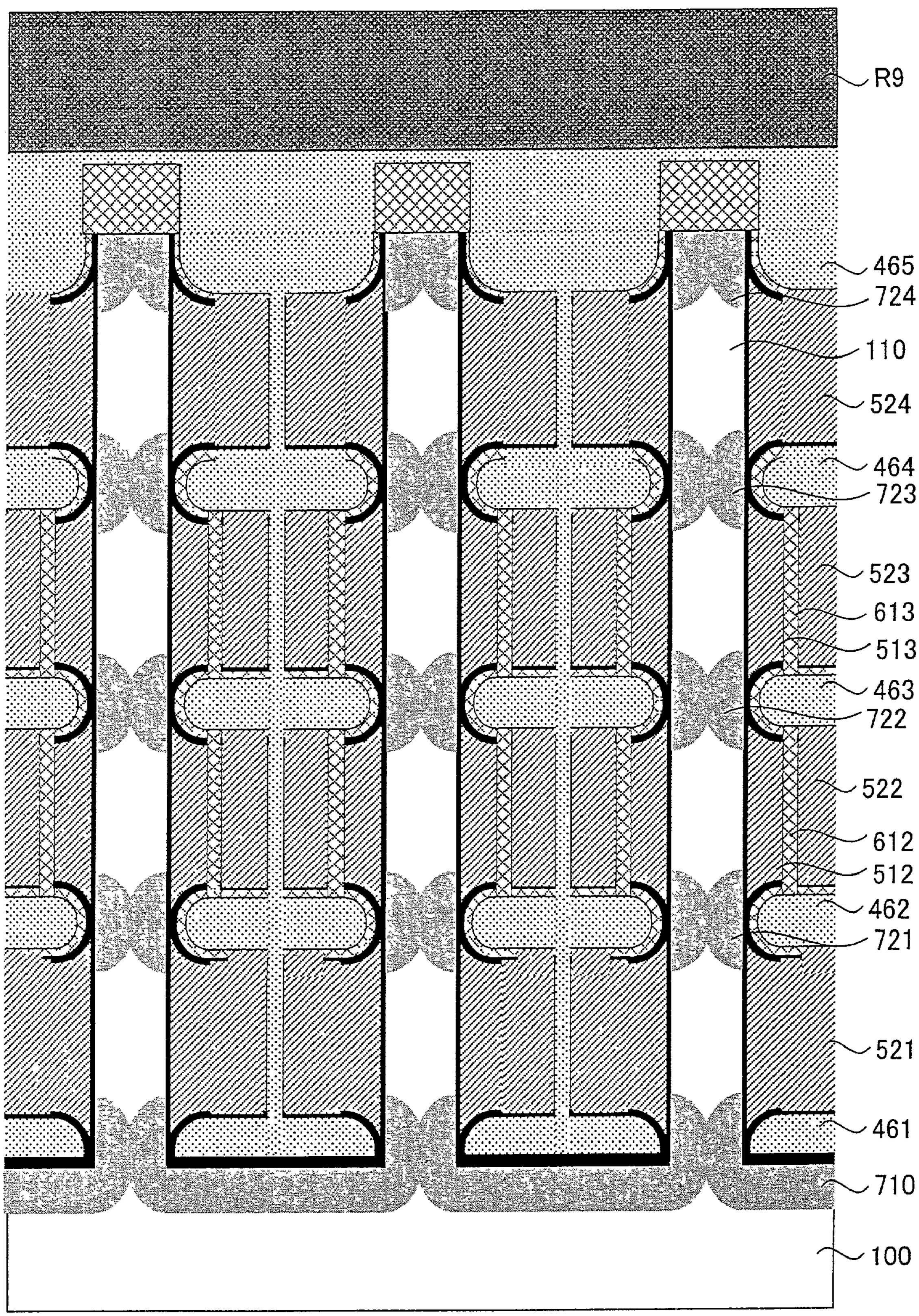

The silicon oxide film (the tenth conductive film) 465 is flattened by etch-back or CMP as required (FIG. 714 and FIG. 721).

Figure 716:
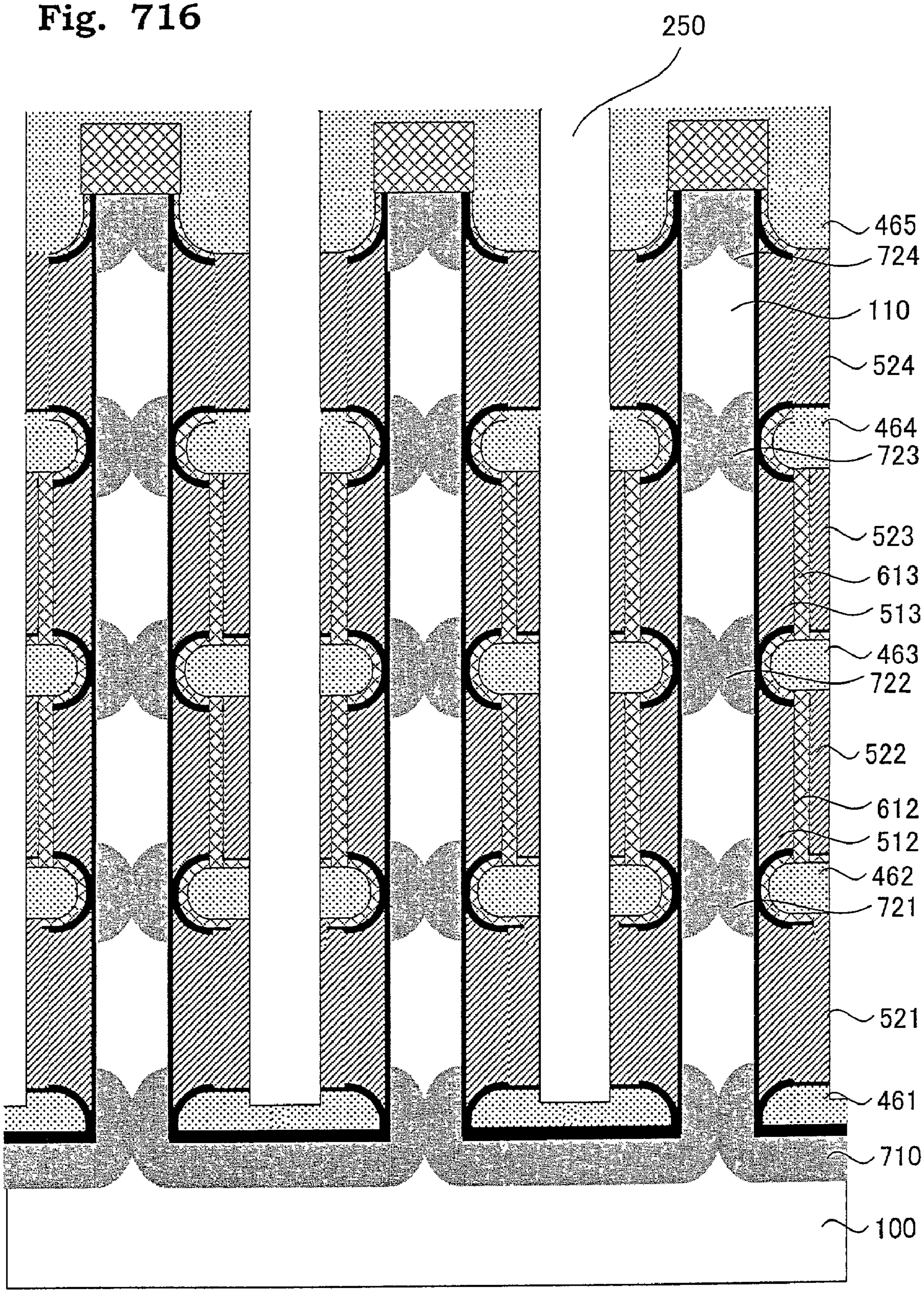
Figure 723:
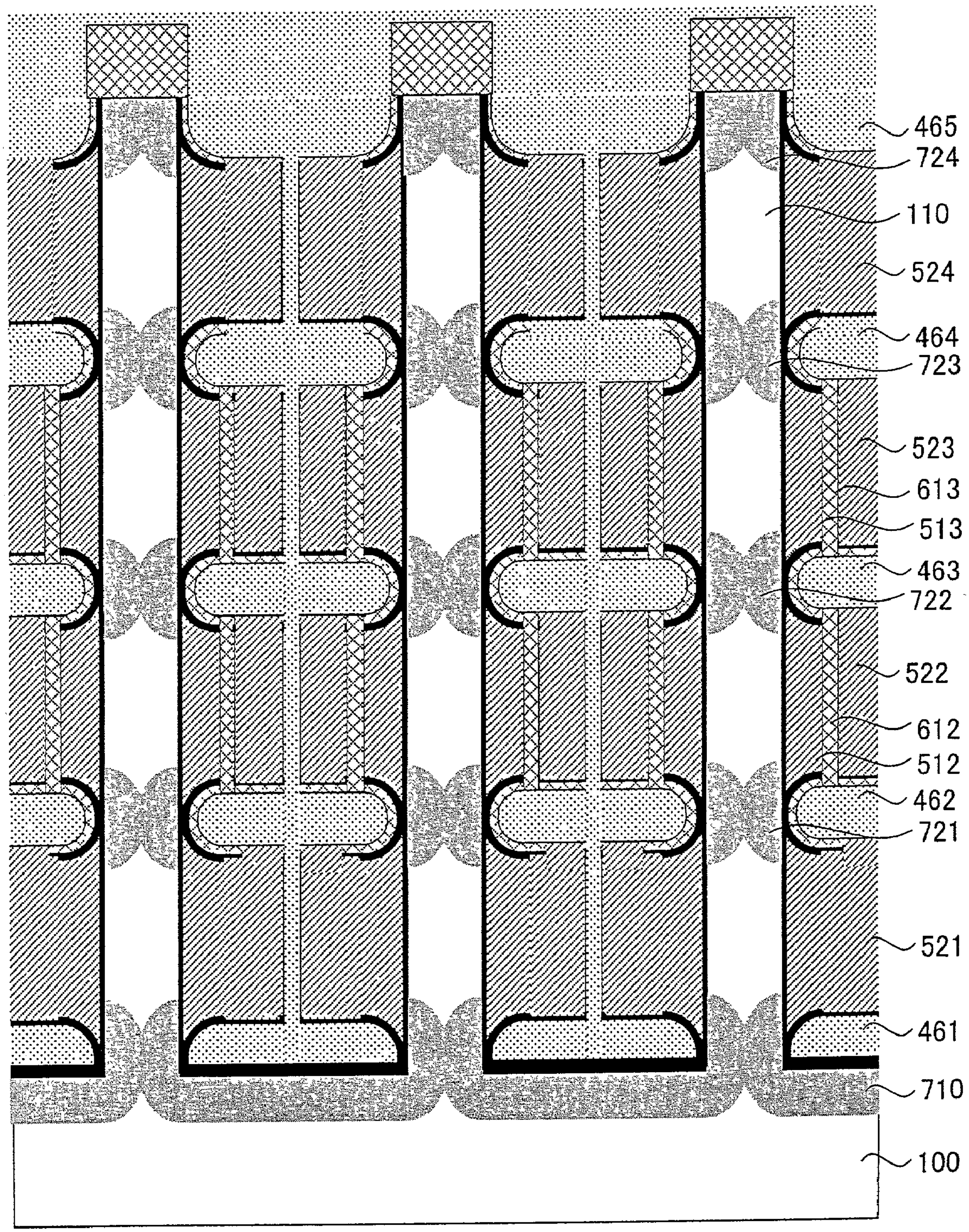

Using as a mask a resist film R8 patterned b known photolithography (FIG. 715 and FIG. 722), reactive ion etching is conducted to a depth such that at least the polysilicon film (the second conductive film) 521 is reached by the impurity diffusion layer 710 is not separated, to form a fifth trench 250 (FIG. 716 and FIG. 723). More particularly, it is desirable that the etching is performed to reach the silicon oxide film 461 for reducing the resistance of the second wiring layer to be connected later. For forming the fifth trench 250, the polysilicon films (the second conductive films) 521 to 524 may not be etched by only the silicon oxide film may be etched.

Figure 717:
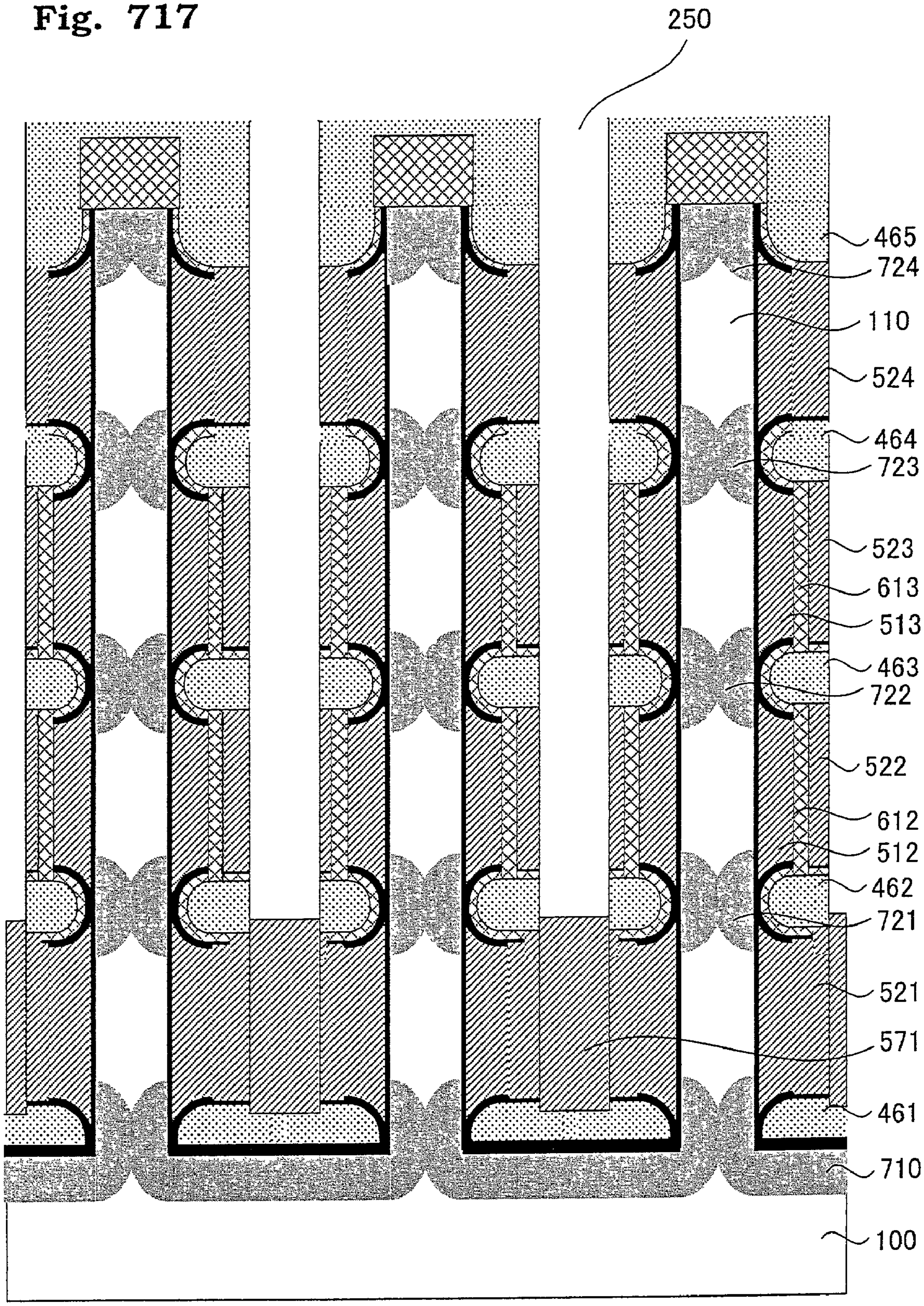
Figure 718:
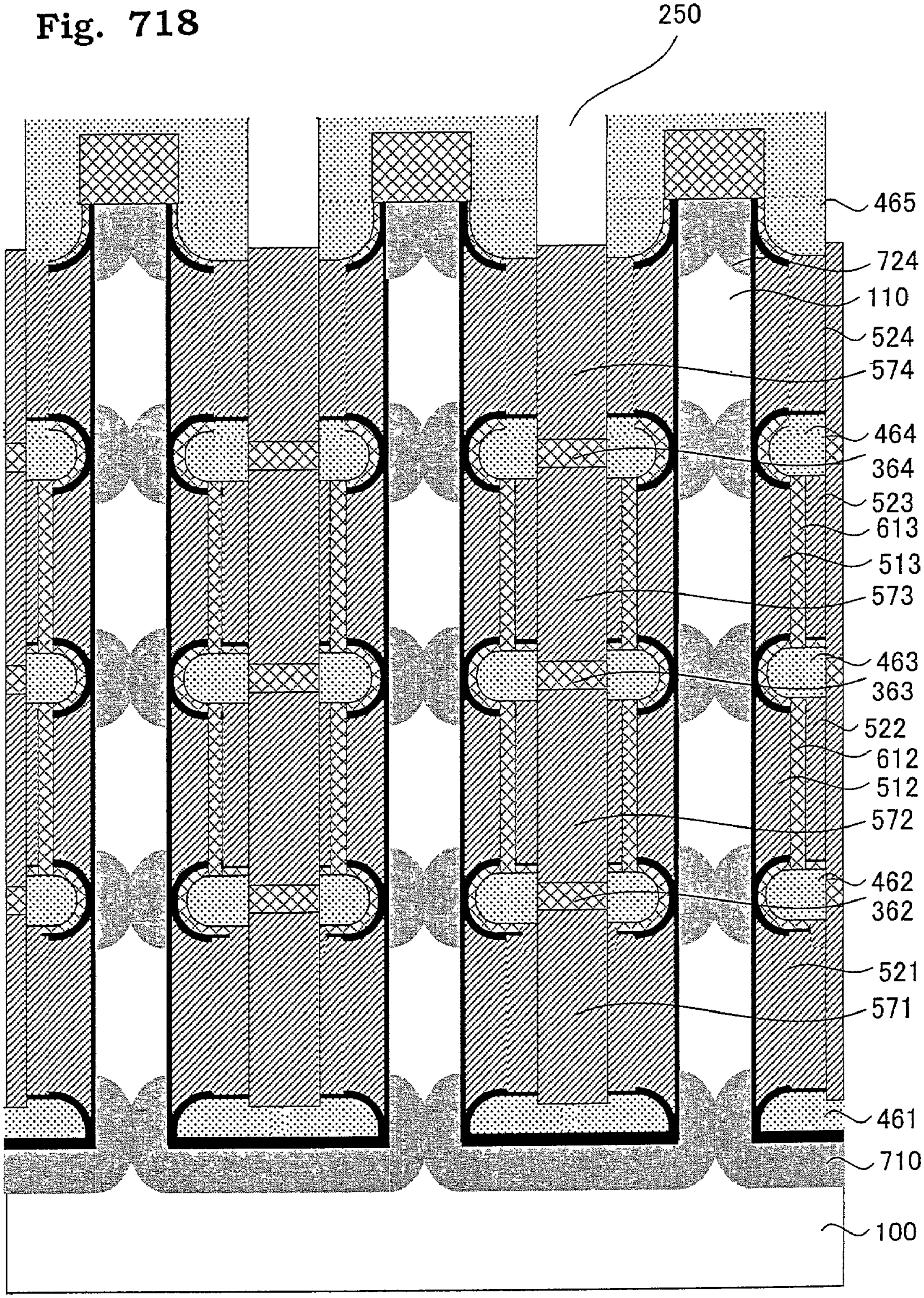
Figure 724:
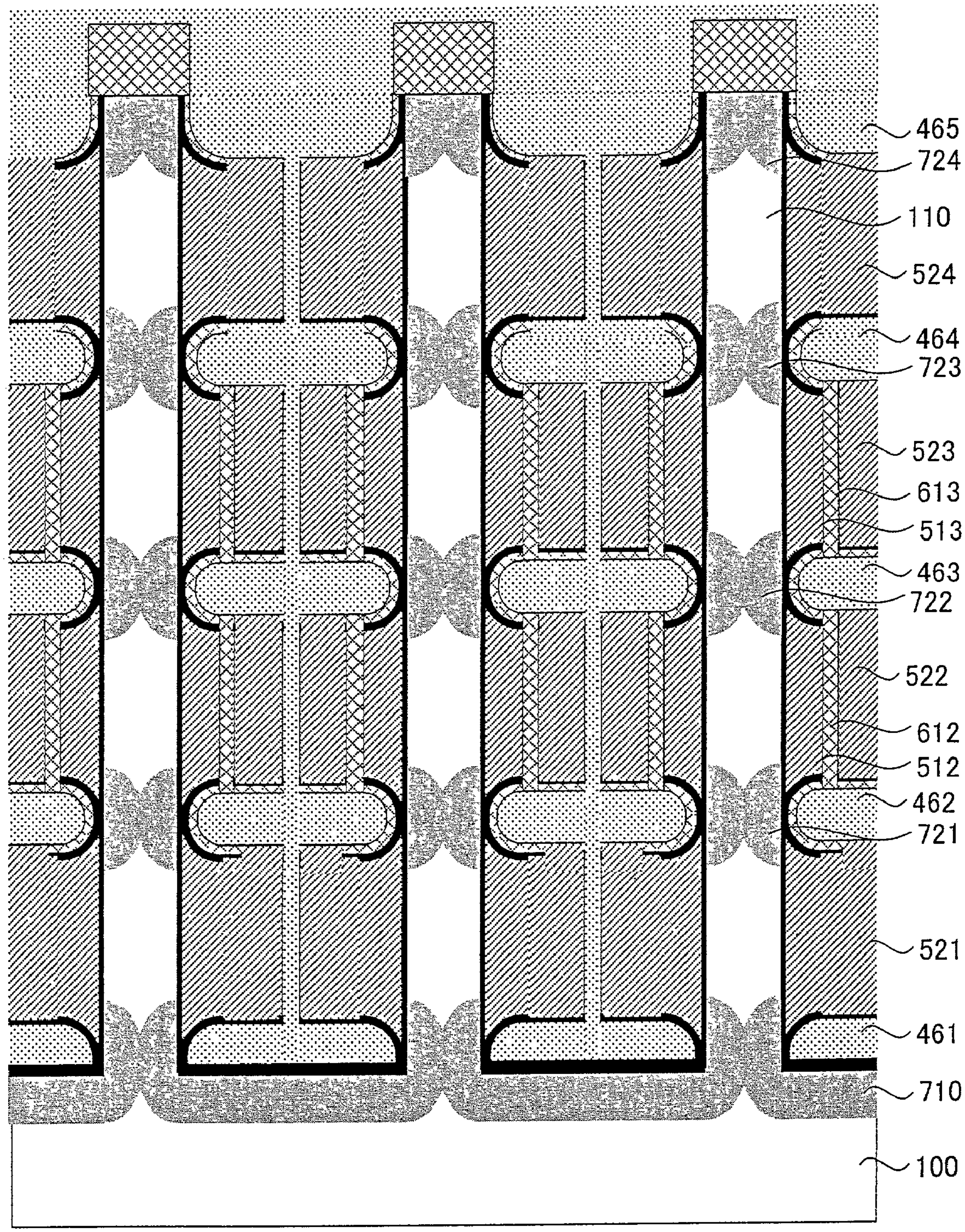
Figure 725:
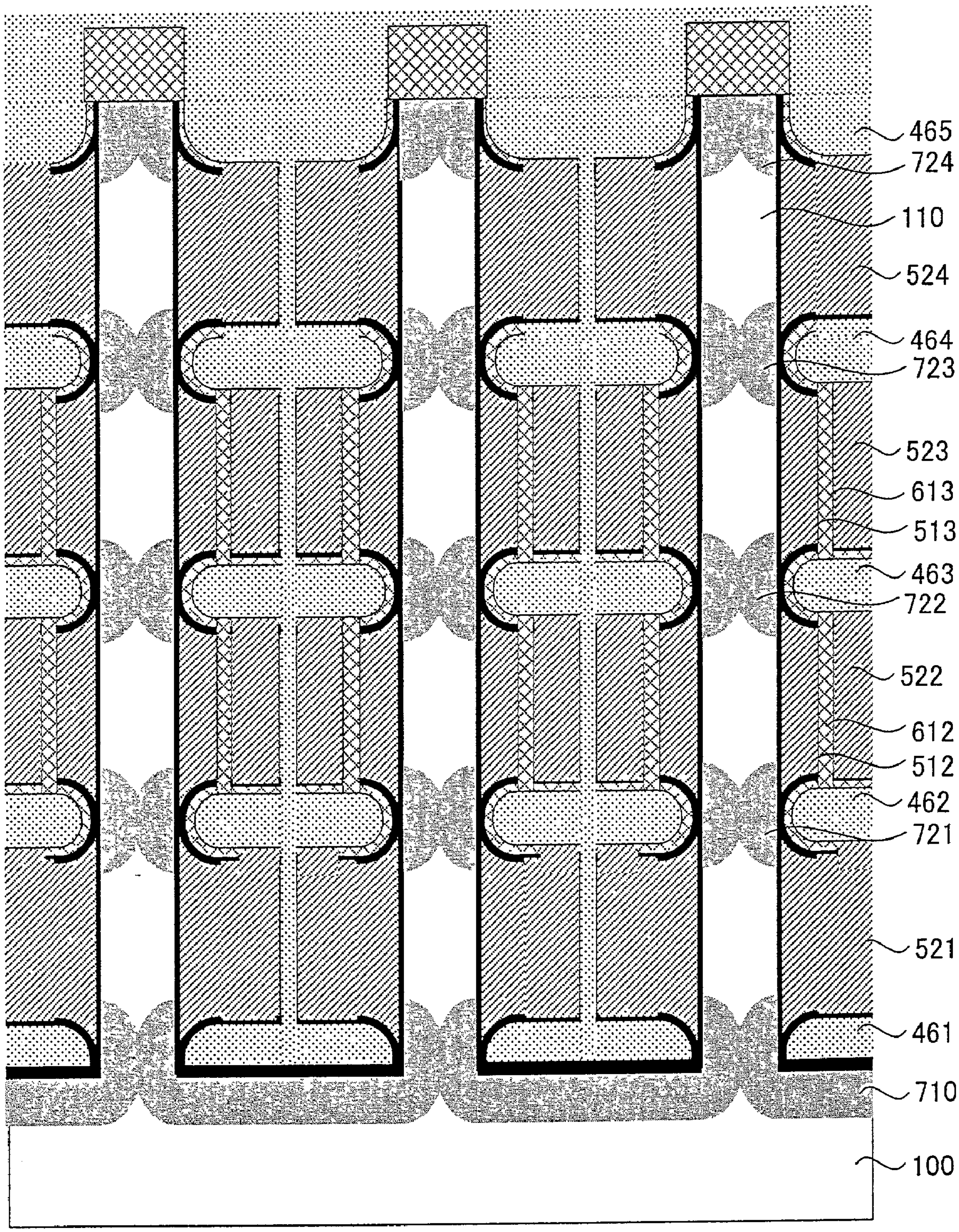

A seventh conductive, for example, a polysilicon film 571 is buried in the fifth trench 250 (FIG. 717 and FIG. 724). At this time, the polysilicon film (the seventh conductive film) 571 is etched back to contact the polysilicon film (the second conductive film) 521 but not to contact the polysilicon film (the second conductive film) 522.

Are sequentially buried a silicon nitride film (a twenty-fourth insulating film) 361, a polysilicon film (the seventh conductive film) 572, a silicon nitride film (a twenty-fourth insulating film) 362, a polysilicon film (the seventh conductive film) 573, a silicon nitride film (a twenty-fourth insulating film) 363 and a polysilicon film (the seventh conductive film) 574.

The polysilicon film 572 is buried to contact the polysilicon film (the second conductive film) 522 but not to contact other conductive films, the polysilicon film 573 is buried to contact the polysilicon film (the second conductive film) 523 but not to contact other conductive films, and the polysilicon film 574 is buried to contact the polysilicon film (the second conductive film) 524 but not to contact other conductive films. The polysilicon film 574 is etched back to a level lower than the island-like semiconductor layer 110.

Figure 719:
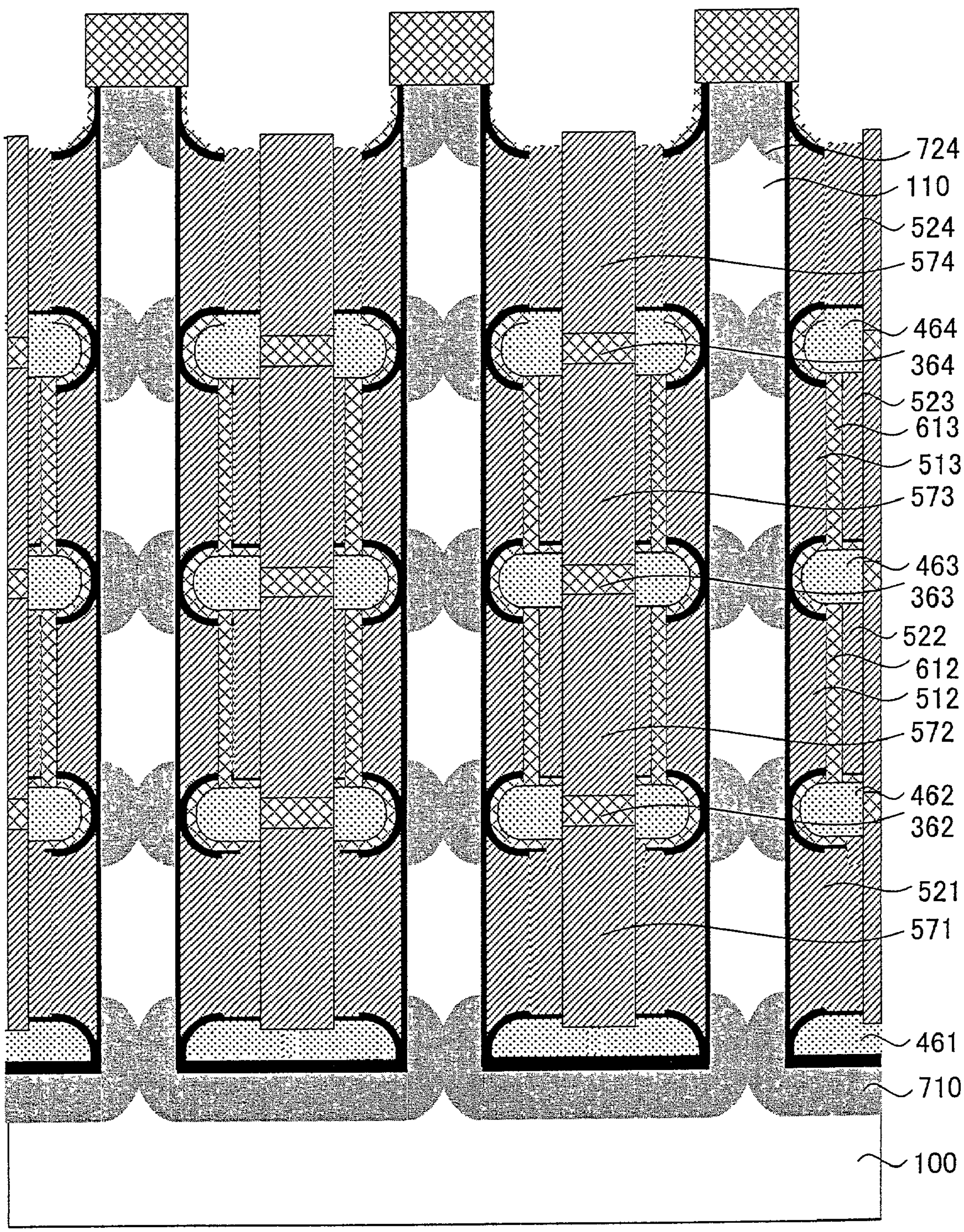
Figure 726:
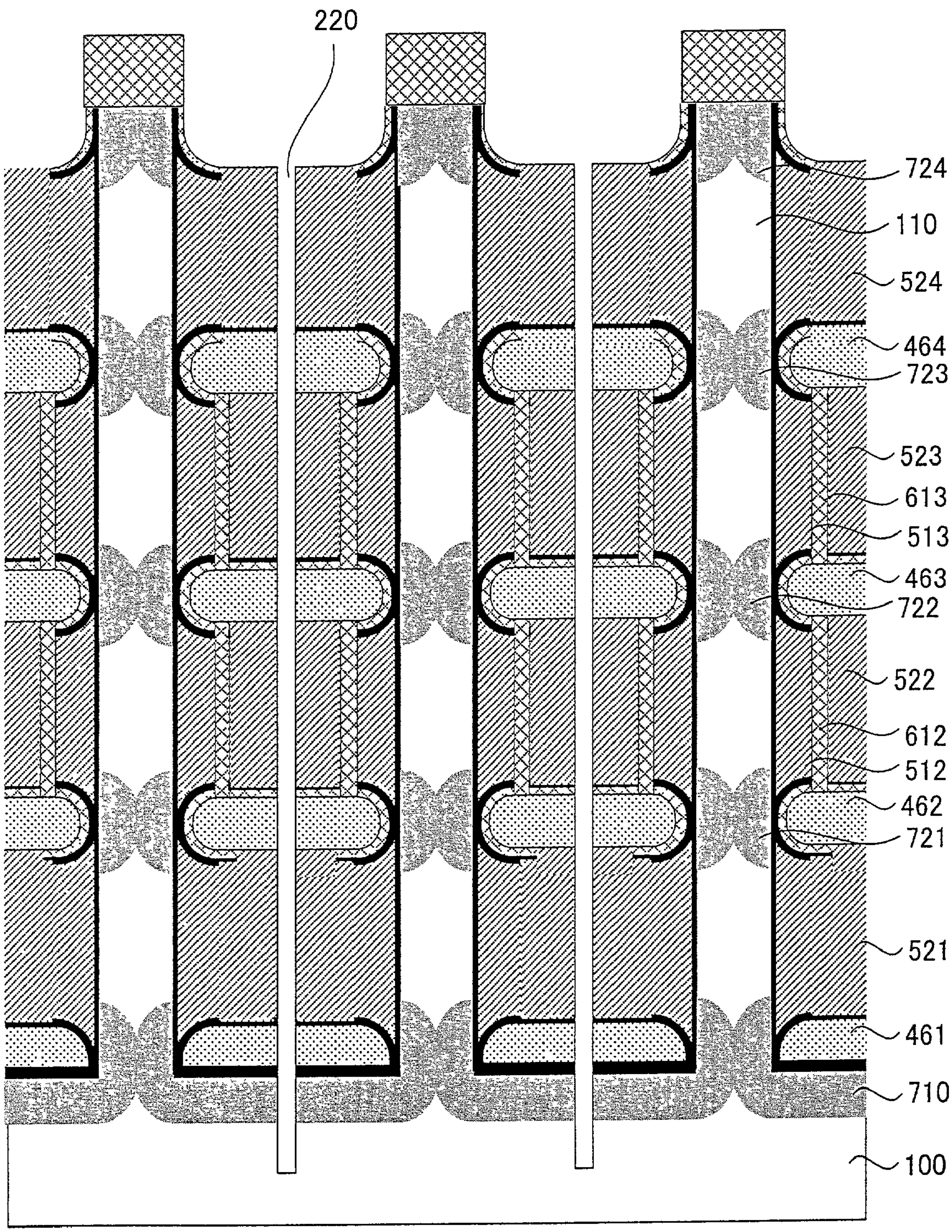

The silicon oxide film 465 is etched back by isotropic etching or the like to a level almost the same as the sidewall of the polysilicon film 524. Etching is performed to reach the P-type silicon substrate 100 by anisotropic etching using the polysilicon film 524 as a mask. The trench 220 is formed in the P-type silicon (semiconductor) substrate 100 in self-alignment with the polysilicon film (the second conductive film) to separate the impurity diffusion layer 710 (FIG. 719 and FIG. 726). That is, a separation portion of the second conductive film is formed in self-alignment with a separation portion of the second conductive film.

Figure 720:
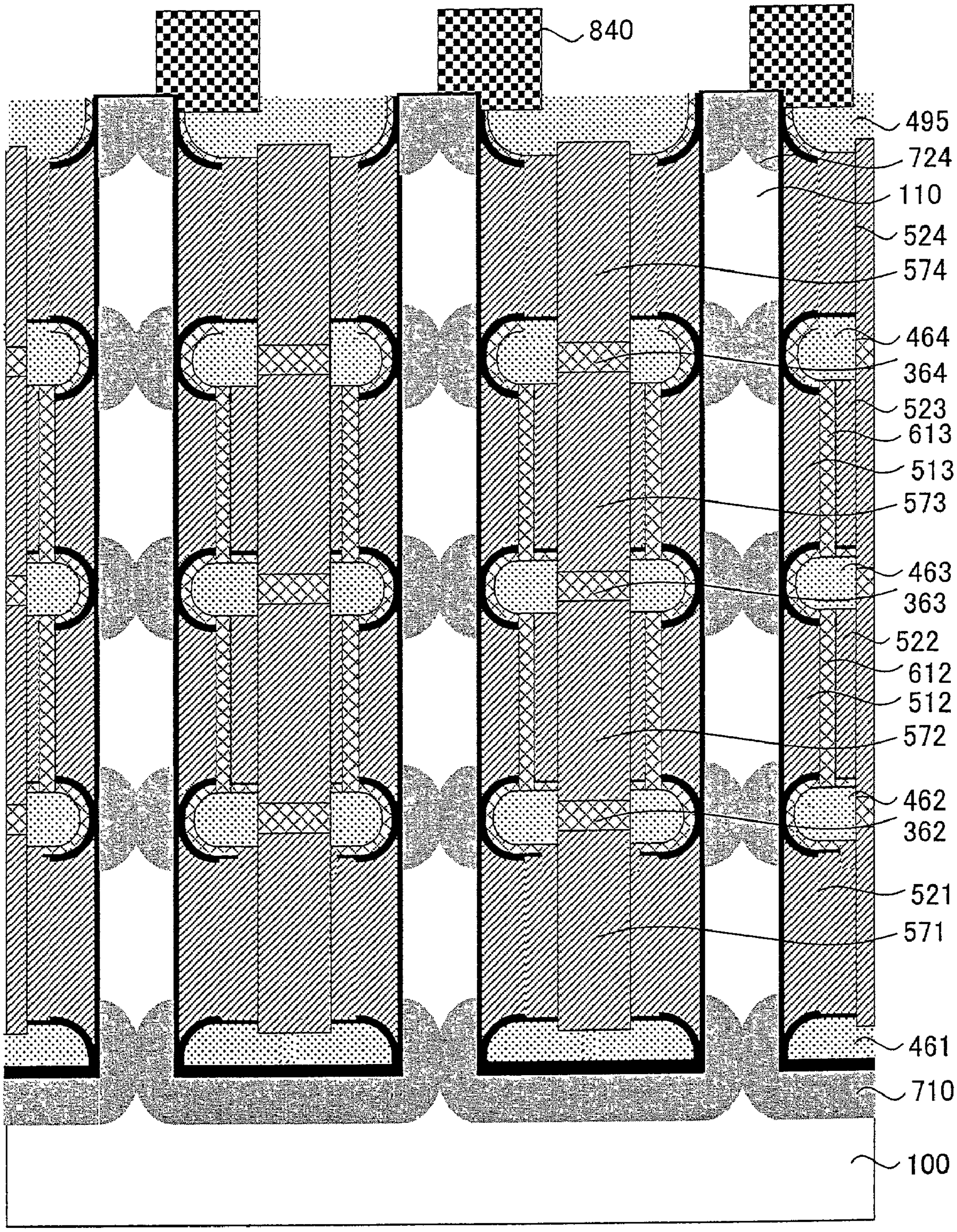
Figure 727:
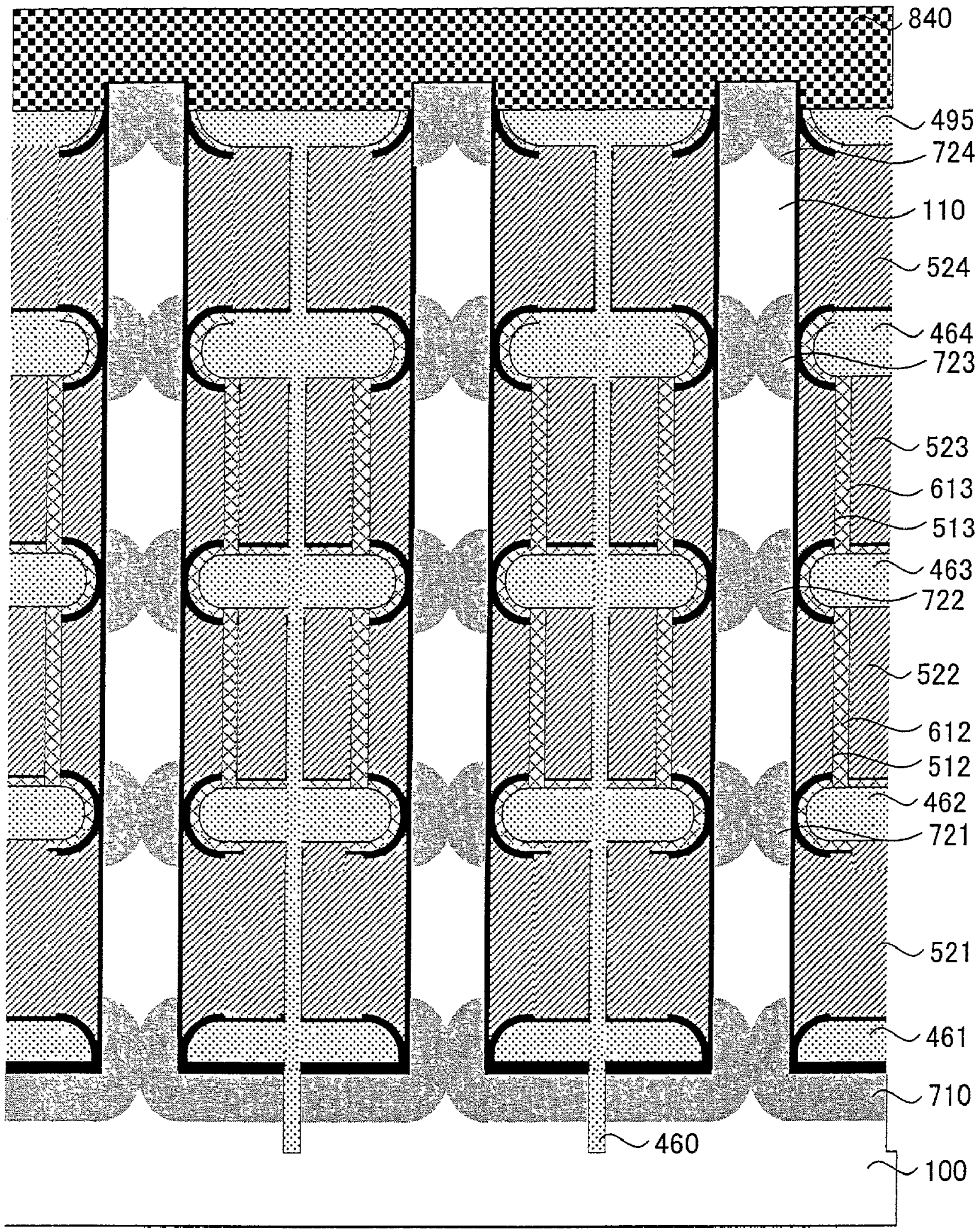

A fifth insulating film, for example, a silicon oxide film 495, is deposited to a thickness of 100 to 500 nm. The top of the island-like semiconductor layer 110 provided with the impurity diffusion layer 724 is exposed by etch-back or CMP. A fourth wiring layer is connected to the top of the island-like semiconductor layer 110 so that its direction crosses the direction of the second or third wiring layer. By known techniques, an interlayer insulating film is formed and a contact hole and metal wiring are formed (FIG. 720 and FIG. 727).

Thereby, a semiconductor memory is realized which has the same effect as that of the previous production examples. Furthermore, this example has an advantage in that the semiconductor memory can be produced even in the case where the island-like semiconductor layers are arranged symmetrically to a diagonal.

The separation portion of the first wiring layer may be formed by patterning a resist film by photolithography instead of forming it in self-alignment with the separation portion of the second conductive film. The formation of the second and third wiring layer by the above-described process is applicable to all the examples of the present invention.

PRODUCTION EXAMPLE 26

This example shows an example of production process for producing a semiconductor memory as formed in Production Examples 1 to 9 in which the selection gates and the floating gates of the transistors are formed at the same time. In this example, is shown a production process for forming terminals which electrically connect the second and third wiring layers to a peripheral circuit, respectively.

Such a semiconductor memory may be produced by the following production process. FIGS. 728 to 736 are sectional views taken on line H–H', line I1–I1', line I2–I2', line I3–I3', line I4–I4', line J1–J1', line J2–J2', line J3–J3' and line J4–J4', respectively, in FIG. 70 which is a plan view illustrating a memory cell array of an EEPROM. These sectional views are taken at locations showing sites 921, 932, 933 and 934 where terminals mounted on the top of the semiconductor device are electrically connected to the buried wiring layers 521, 522, 523 and 524, for the application of voltage to the buried wiring layers from outside.

In this example, production steps until the polysilicon film (the second conductive film) 521 is deposited to a thickness of 15 to 150 nm and the second trench 220 is formed are the same as those in Production Example 1.

Using as a mask a resist film patterned by a known photolithographic technique, patterning is carried out by reactive ion etching for a wiring layer to be lead out. This step is repeated as many times as the number of wiring layers to be lead out.

More particularly, for leading out the bottommost second wiring layer, for example, the polysilicon film (the second conductive film) 521 is etched back by reactive ion etching to remain in a region and so as to contact the polysilicon film (the first conductive film) 511 using a resist film patterned by a known photolithographic technique as a mask. This step is carried out on the conductive films which form the wiring layers. By known techniques, an interlayer insulating film is formed and a contact hole and metal wiring are formed.

Thereby, as shown in FIG. 728 to FIG. 736, a semiconductor memory is realized which has a memory function according to the state of a charge in the charge storage layer which is the floating gate made of the polysilicon film (the first conductive film) and in which the second and third wiring layers are lead out to the top of the semiconductor device without electrically contacting each other.

PRODUCTION EXAMPLE 27

This example shows an example of production process for producing a semiconductor memory as formed in Production Examples 1 to 9 in which the selection gates and the floating gates of the transistors are formed at the same time. In this example, is shown a production process for forming terminals which electrically connect the second and third wiring layers to a peripheral circuit, respectively.

Such a semiconductor memory may be produced by the following production process. FIGS. 737 to 741 are sectional views taken on line H–H', line I1–I1', line I2–I2', line I3–I3' and line I4–I4', respectively, in FIG. 71 which is a plan view illustrating a memory cell array of an EEPROM. These sectional views are taken at locations showing sites 921, 932, 933 and 934 where terminals mounted on the top of the semiconductor device are electrically connected to the buried wiring layers 521, 522, 523 and 524, for the application of voltage to the buried wiring layers from outside.

In this example, the polysilicon films (the second conductive films) 521, 522, 523 and 524 electrically contact the impurity diffusion layers formed in the island-like semiconductor layers 110. Thereby the resistance of the wiring layers 521, 522, 523 and 524 decreases. The formation of second and third contact portions 921, 932, 933 and 924 becomes easier because they only need to contact at least either of the island-like semiconductor layers or the wiring layers.

As shown in FIG. 737 to FIG. 741, a semiconductor memory is realized which has a memory function according to the state of a charge in the charge storage layer which is the floating gate made of the polysilicon film (the first conductive film) and in which the second and third wiring layers are lead out to the top of-the semiconductor device without electrically contacting each other.

PRODUCTION EXAMPLE 28

This example shows an example of production process for producing a semiconductor memory as formed in Production Examples 1 to 9 in which the selection gates and the floating gates of the transistors are formed at the same time. In this example, is shown a production process for forming terminals which electrically connect the second and third wiring layers to a peripheral circuit, respectively.

Such a semiconductor memory may be produced by the following production process. FIGS. 742 to 747 are sectional views taken on line H–H', line I1–I1', line I2–I2', line I3–I3', line I4–I4', and line I5–I5', respectively, in FIG. 72 which is a plan view illustrating a memory cell array of an EEPROM. These sectional views are taken at locations showing sites 921, 932, 933, 924 and 910 where terminals mounted on the top of the semiconductor device are electrically connected to the buried wiring layers 521, 522, 523, 524 and 710, for the application of voltage to the buried wiring layers from outside.

In this example, production steps until the polysilicon film (the second conductive film) 524 is deposited to a thickness of 15 to 150 nm and is etched back are the same as those in Production Example 1.

Thereafter, the island-like semiconductor layer formed at a place where a second contact portion 924 is to be formed is etched back to a level almost the same as the bottom of the wiring layer 524 by anisotropic etching. A silicon nitride film 354 which is a fourteenth insulating film is deposited to a thickness of about 20 to 200 nm and is etched back to a level almost the same as the top of the wiring layer 524. A silicon oxide film 494 which is a fifteenth insulating film is deposited to a thickness of about 10 to 100 nm to form a sidewall spacer. The silicon nitride film 354 is etched back, for example, by isotropic etching, to such an extent that the island-like semiconductor layer 110 is not exposed. The polysilicon film (the first conductive film) 514 is exposed by isotropic etching, and the second contact portion 924 is formed. The contact portion may be formed of any conductive material.

The above-described process is repeated as many times as the number of wiring layers to be lead out.

By known techniques, an interlayer insulating film is formed and a contact hole and metal wiring are formed. As regards contact portions, the second contact portion 924 need not necessarily be formed first. They may be formed in any order in any arrangement.

Thereby, as shown in FIG. 742 to FIG. 747, a semiconductor memory is realized which has a memory function according to the state of a charge in the charge storage layer which is the floating gate made of the polysilicon film (the first conductive film) and in which the second and third wiring layers are lead out to the top of the semiconductor device without electrically contacting each other.

PRODUCTION EXAMPLE 29

In contrast to Production Example 1, this example shows an example of production process for forming lead-out portions of wiring layers for electrically connecting the first, second and third wiring layers to a peripheral circuit. FIGS. 748 is a sectional view taken on line H–H' in FIG. 68, and FIG. 749 to FIG. 753 are sectional view taken on line I–I' in FIG. 68 shifted in an H–H' direction to show the lead-out portions of the wiring layer. These sectional views are taken at positions showing sites 921, 932, 933, 934 and 910 where terminals mounted on the top of the semiconductor device are electrically connected to the buried wiring layers 521, 522, 523, 524 and 710, for the application of voltage to the buried wiring layers from outside.

In this example, production steps until the exposed portions of the polysilicon films (the first conductive films) 511 to 514 are thermally oxidized selectively to form the silicon oxide film (the seventh insulating films) 450 of 5 to 50 nm thickness are the same as those in Production Example 1.

Thereafter, a silicon oxide film 480 which is a sixth insulating film is deposited to a thickness of 50 to 500 nm and is subjected to etch-back or CMP as required to bury the memory cell portion. In the lead-out portions of the wiring layers, using as a mask a resist film patterned by a known photolithographic technique, the p-type silicon substrate 100 is etched by reactive ion etching to a depth such that the impurity diffusion layer 710 is exposed. The portion etched away at this time may form a slit-form trench having a width two or less times as large as the deposit thickness of the polysilicon films (the second conductive films) 520 to 524 and a depth almost equal to the height of the island-like semiconductor device 110. The positional relation between the slit-form trench and the island-like semiconductor layer 110 the nearest to a wiring layer lead-out portion is such that the polysilicon buried in the slit-form trench at the deposition of the polysilicon films 521 to 524 is electrically connected to the second or third wiring layer.

An N-type impurity is introduced into the bottom of the slit-form trench to form an N-type impurity diffusion layer 710. This impurity introduction is performed from a direction substantially vertical to the substrate at an implantation energy of 5 to 100 keV at a boron dose of about $1\times10^{11}$ to $1\times10^{13}/cm^2$, for example.

A fifteenth insulating film, for example, a silicon oxide film 490, is deposited to a thickness of 20 to 100 nm and is etched back by a deposited thickness to form a sidewall spacer of the silicon oxide film 490 on the inner wall of the trench formed in the wiring layer lead-out portion.

A polysilicon film (the second conductive film) 520 is deposited to a thickness of 15 to 150 nm. At this time, since the width of the slit-form trench is two or less times as large as the deposit thickness of the polysilicon films 520 to 524, the inside of the slit-form trench is filled with the polysilicon film 520 even if the deposit thickness of the polysilicon film 520 is smaller than the depth of the slit-form trench. Thus the first wiring layer is lead out onto the top of the semiconductor device. The polysilicon film 520 is reduced by etch-back or the like as required.

Using as a mask a resist film patterned by a known photolithographic technique, the polysilicon film 520 is removed from the wiring layer lead-out portion nearer to the island-like semiconductor layer 110. A silicon oxide film 461 which is an eighth insulating film is deposited to a thickness of 50 to 500 nm in a slit-form trench formed again. Using as a mask a resist film patterned by a known photolithographic technique, the wiring layer lead out portion alone is etched back to an extent such that the silicon oxide film 461 remains to keep insulation between the polysilicon film 520 buried in the wiring layer lead-out portion and a polysilicon film (a fourth conductive film) 541 to be formed, for example, in a thickness of about 50 to 500 nm.

A fifteenth insulating film, for example, a silicon oxide film 491, is deposited to a thickness of 20 to 100 nm. A fourth conductive film, for example, a polysilicon film 541, is buried in the slit-form trench. The silicon oxide film 491 and the silicon oxide film 461 in the memory cell portion are etched back to a level almost equal to the bottom of the polysilicon film (the first conductive film) 511. The polysilicon film 541 is removed.

A polysilicon film 521 which is a second conductive film is deposited to a thickness of 15 to 150 nm. At this time, since the width of the slit-form trench is two or less times as large as the deposit thickness of the polysilicon films 520 to 524, the inside of the slit-form trench is filled with the polysilicon film 521 even if the deposit thickness of the polysilicon film 521 is smaller than the depth of the slit-form trench. Thus the second wiring layer is lead out onto the top of the semiconductor device. The polysilicon film 521 and the silicon oxide film 491 are reduced by etch-back or the like as required.

Using as a mask a resist film patterned by a known photolithographic technique, the polysilicon film 521 is removed from the wiring layer lead-out portion on a side near to the island-like semiconductor layer 110. A silicon oxide film 462 which is an eighth insulating film is deposited to a thickness of 50 to 500 nm in a slit-form trench formed again.

Using as a mask a resist film patterned by a known photolithographic technique, the wiring layer lead out portion alone is etched back to an extent such that the silicon oxide film 462 remains to keep insulation between the polysilicon film 520 buried in the wiring layer lead-out portion and a polysilicon film (a fourth conductive film) 542 to be formed, for example, in a thickness of about 50 to 500 nm.

A fifteenth insulating film, for example, a silicon oxide film 492, is deposited to a thickness of 20 to 100 nm. A fourth conductive film, for example, a polysilicon film 542, is buried in the slit-form trench. The silicon oxide film 492 and the silicon oxide film 462 in the memory cell portion are etched back to a level almost equal to the bottom of the polysilicon film (the first conductive film) 512. The polysilicon film 542 is removed.

An interlayer insulating film 612 is deposited and a polysilicon film 522 which is a second conductive film is deposited to a thickness of 15 to 150 nm. At this time, since the width of the slit-form trench is two or less times as large as the deposit thickness of the polysilicon films 520 to 524, the inside of the slit-form trench is filled with the polysilicon film 522 even if the deposit thickness of the polysilicon film 522 is smaller than the depth of the slit-form trench. Thus the third wiring layer is lead out onto the top of the semiconductor device. The interlayer insulating film 612, the polysilicon film 522 and the silicon oxide film 492 are reduced by etch-back or the like as required.

By repeating the above-mentioned process, the second and third wiring layers are lead out onto the top of the semiconductor device. Thus the lead-out portions of the wiring layers are realized (FIG. 748 to FIG. 753).

In FIG. 748 to FIG. 753, after the fourth wiring layer 840 is formed, the interlayer insulating film is deposited by a known technique and is subjected to CMP or etch-back. Then the first, second and third contacts 910, 921, 932, 933 and 924 are formed. Thereafter, the first, second and third wiring layers 810, 821, 832, 833 and 824 are formed. However, the first, second and third wiring layers 810, 821, 832, 833 and 824 may be formed without intervention of the interlayer insulating film and without forming the first, second and third contacts 910, 921, 932, 933 or 924. Or the first, second and third wiring layers 810, 821, 832, 833 and 824 may be formed simultaneously when the fourth wiring layer 840 is formed. The shape and size of the contacts are not particularly limited so long as electrical contact with a desired wiring layer is established. Further, as shown in FIG. 69, a plurality of slit-form trenches may be formed and the wiring layers may be lead out from the trenches. In this case, the length of the slit-form trenches can be reduced, which leads to a reduction in area necessary for the lead-out portion. As shown in FIG. 69, the slit-form trenches may have different lengths. The locations of the sites 921, 932, 933, 934 and 910 electrically connecting with the wiring layers 521, 522, 523, 524 and 710 are not limited to those shown in FIG. 69. Any site electrically connecting with a wiring layer may be located in any trench. For example, it may be possible to use one slit-form trench only for leading the first wiring layer, allot other trenches for leading the second and third wiring layers and form the slit-form trench only for the first wiring layer before N-type impurity diffusion layers 710, 721 to 724 are formed, thereby cutting the step of forming an N-type impurity diffusion layer at the bottom of the slit-form trench. This case is more advantageous for leading out the first wiring layer because the N-type impurity diffusion layer 710 is formed on the inner face of the slit-form trench.

The leading-out of the first, second and third wiring layers onto the top of the semiconductor device by the above-described process is applicable to all examples of the present invention.

PRODUCTION EXAMPLE 30

In Production Examples 1 to 9, the semiconductor substrate 100 is electrically insulated from the island-like semiconductor layers 110 by the impurity diffusion layer. In this example, however, the semiconductor substrate 100 is electrically insulated from the island-like semiconductor layers 110 not by the impurity diffusion layer alone but by a impurity diffusion layer and a depletion layer existing at junction of the impurity diffusion layer with the semiconductor substrate 100 or the island-like semiconductor layer 110.

FIG. 754 and FIG. 755 are sectional views taken on line A–A' and line B–B', respectively, in FIG. 1 which is a plan view illustrating a memory cell array of an EEPROM.

In FIG. 754 and FIG. 755, the island-like semiconductor layer 110 and the semiconductor substrate 100 are structurally connected. In this example, the island-like semiconductor layer 110 and the semiconductor substrate 100 are electrically insulated by a depletion layer formed on an island-like semiconductor layer 110 side or a semiconductor substrate 100 side of a PN junction between the impurity diffusion layer 710 as the first wiring layer and the island-like semiconductor layer 110 or the semiconductor substrate 100 owing to a potential difference between a potential given to the impurity diffusion layer (the first wiring layer) 710 and a potential given to the island-like semiconductor layer 110 or the semiconductor substrate 100 at reading or at erasing. More particularly, supposing that the depletion layer formed on the island-like semiconductor layer 110 side or the semiconductor substrate 100 side has a width W, the electrical insulation can be produced if at least either a space Sa1 or Sb1 of the impurity diffusion layer 710 shown in FIG. 754 and FIG. 755 is two or less times as large as W. Also, as regards the N-type impurity diffusion layers 721 to 723, like the impurity diffusion layer 710, the active region of each transistor is electrically insulated if at least either one of Sa2 and Sb2, Sa3 and Sb3, or Sa4 and Sb4 is two or less times as large as W.

The above described state may be produced both at reading and at erasing, only at erasing or only at reading. The above dimensional relationships may be combined in any way so long as the electrical insulation can be obtained.

This example may apply to any example of the present invention.

PRODUCTION EXAMPLE 31

In a semiconductor memory to be produced in this example, a semiconductor substrate is patterned in the form of pillars to form island-like semiconductor layers. Sides of the island-like semiconductor layers make active regions. A plurality of MIS capacitors as charge storage layers are formed on the active regions. The island-like semiconductor layers are each in an electrically floating state with respect to the semiconductor substrate. The active region of each memory cell is in the electrically floating state. One memory cell is constituted of one transistor and one capacitor. A plurality of memory transistors, for example, two memory transistors, are placed on the island-like semiconductor layer and are connected in series along the island-like semiconductor layer. The thickness of the gate insulating film of the transistor of the memory cell is equal to the thickness of the capacitor insulating film of the capacitor of the memory cell. In this production example, the MIS capacitor and the transistor of the memory cell are formed at the same time.

Such a semiconductor memory may be produced by the following production process. FIGS. 756 to 764 and FIGS. 765 to 773 are sectional views taken on line A–A' and line B–B', respectively, in FIG. 66 which is a plan view illustrating a memory cell array of a DRAM.

Figure 756:
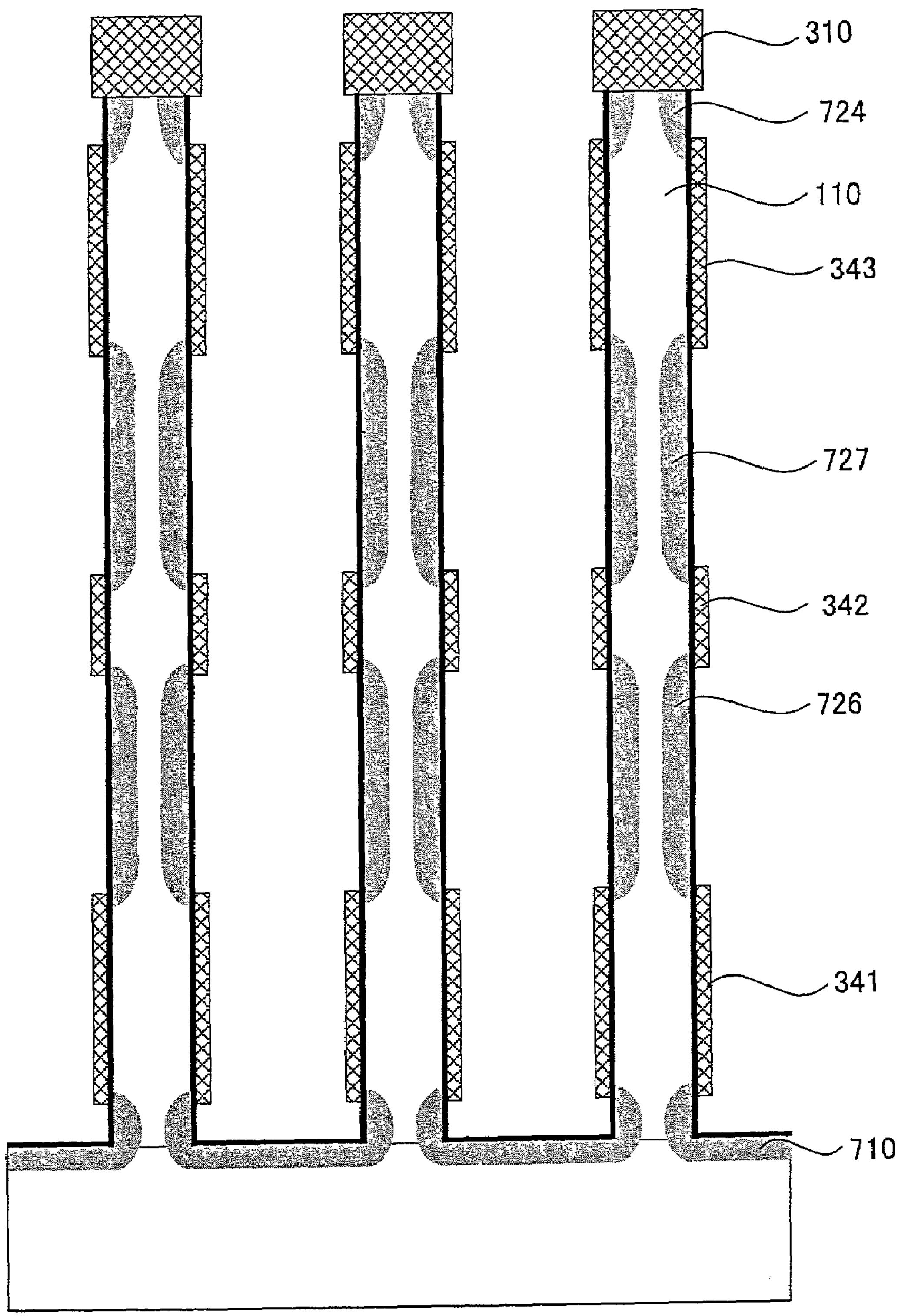
Figure 765:
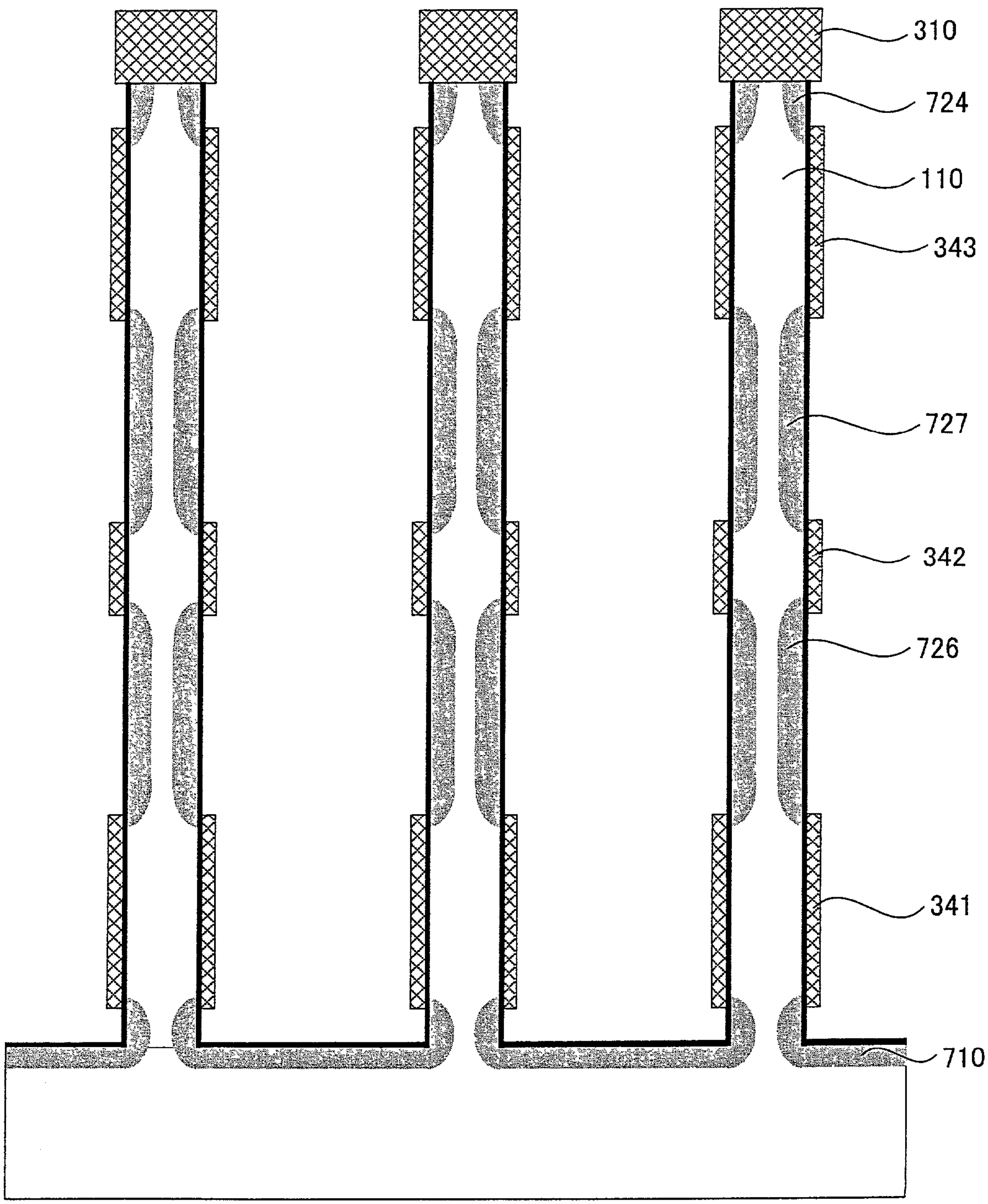

In this example, a silicon nitride film 340 which is a twelfth insulating film is deposited to a thickness of 5 to 50 nm and, using a technique as described in Production Example 4 (FIGS. 350 to 352 and FIGS. 370 to 372), sidewall spacers 341, 342 and 343 are formed of the silicon nitride film on the sidewall of the island-like semiconductor layer 110 in a region other than a region to be an impurity diffusion layer. Impurity introduction is carried out using the silicon nitride films (twelfth insulating films) 341, 342 and 343 as a mask to form impurity diffusion layers. For example, N-type impurity diffusion layers 710, 724, 726 and 727 are formed at an arsenic concentration of about $1\times10^{18}$ to $1\times10^{21}/cm^3$ using a diffusion process (e.g., solid phase diffusion process, vapor phase diffusion process, etc.). Alternatively, the impurity diffusion layers may be introduced in the sidewall of the island-like semiconductor layer 110 by utilizing slant ion implantation. For example, the ion implantation may be performed at an implantation energy of 5 to 100 keV at an arsenic dose of about $1\times10^{14}$ to $1\times10^{16}/cm^2$ at an angle of 5 to 45° with respect to the normal line of the surface of the substrate. Preferably the slant ion implantation is performed from various directions to the island-like semiconductor layer 110 because the surface impurity concentration becomes more uniform. Alternatively, an oxide film containing arsenic may be deposited by CVD with a view to utilizing diffusion of arsenic from the oxide film. At this time, the impurity diffusion layer 710 to be a first wiring layer may be adjusted about its impurity concentration by ion implantation (FIG. 756 and FIG. 765).

Figure 757:
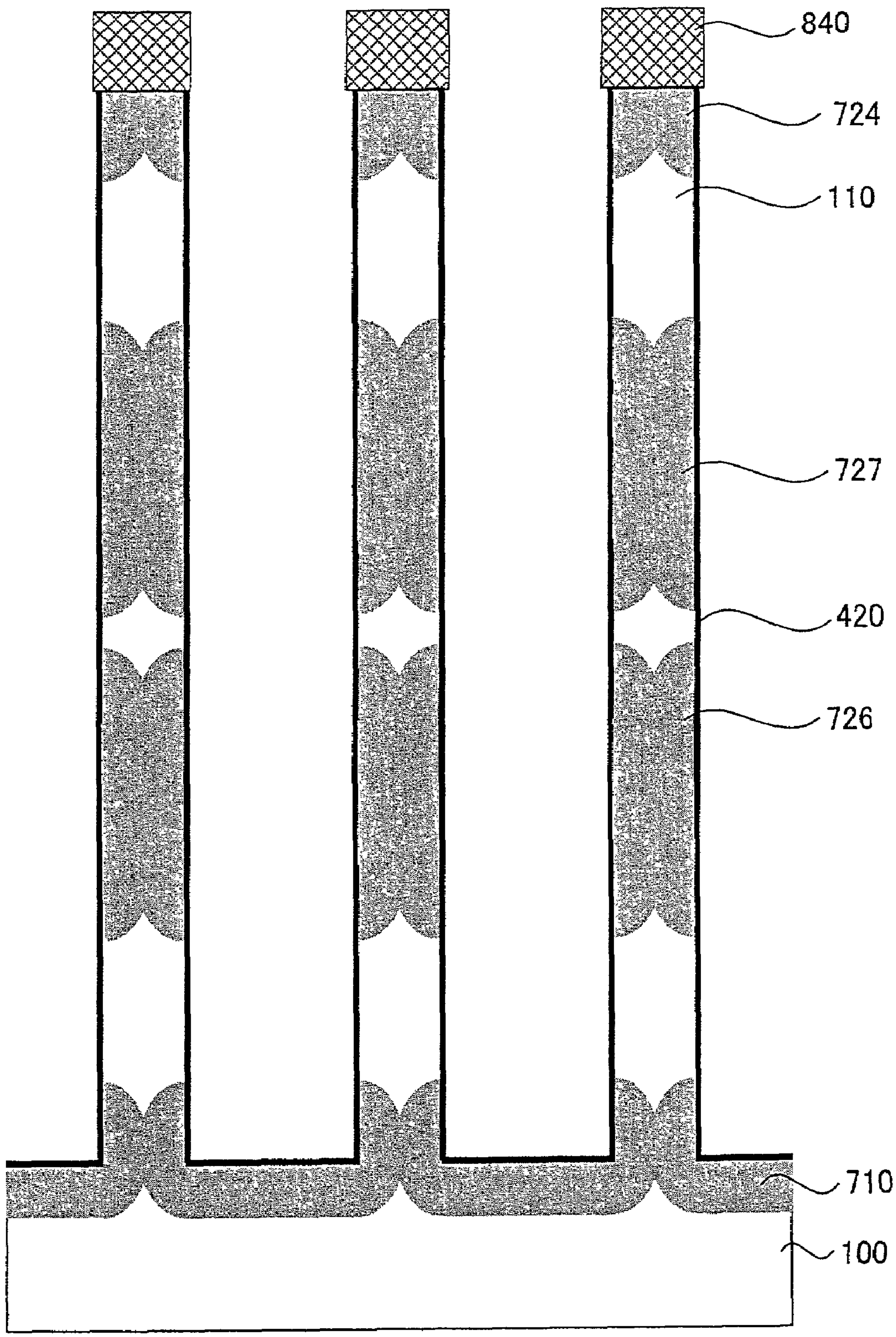
Figure 766:
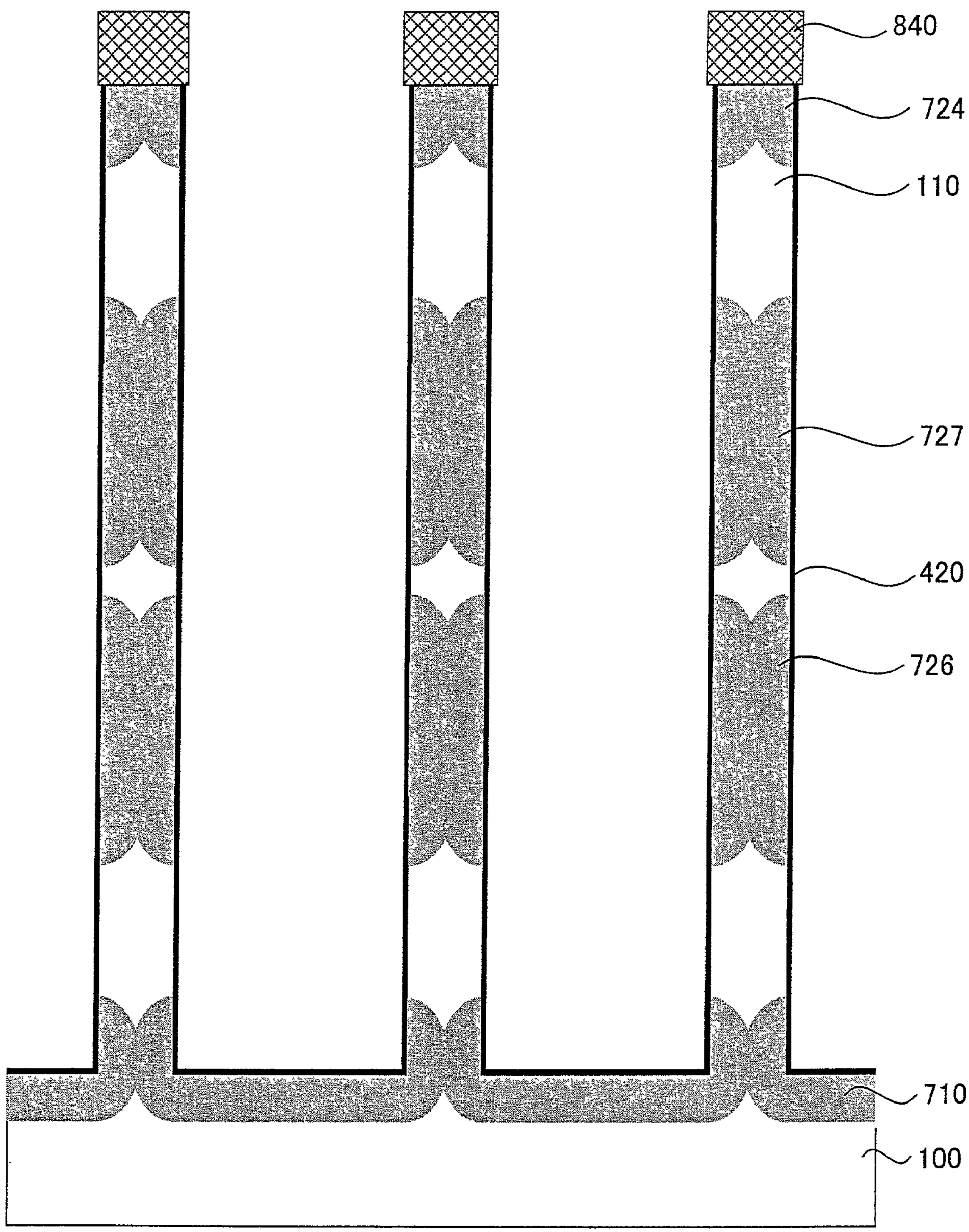

The silicon nitride films 341, 342 and 343 are removed by isotropic etching. Subsequently, an oxide film 420 is formed as a third insulating film to be a gate oxide film in a thickness of about 10 nm around each island-like semiconductor layer 110, for example, by thermal oxidization (FIG. 757 and FIG. 766). The gate oxide film may be formed not only of a thermally oxidized film but also of a CVD oxide film or a nitrogen oxide film.

Figure 758:
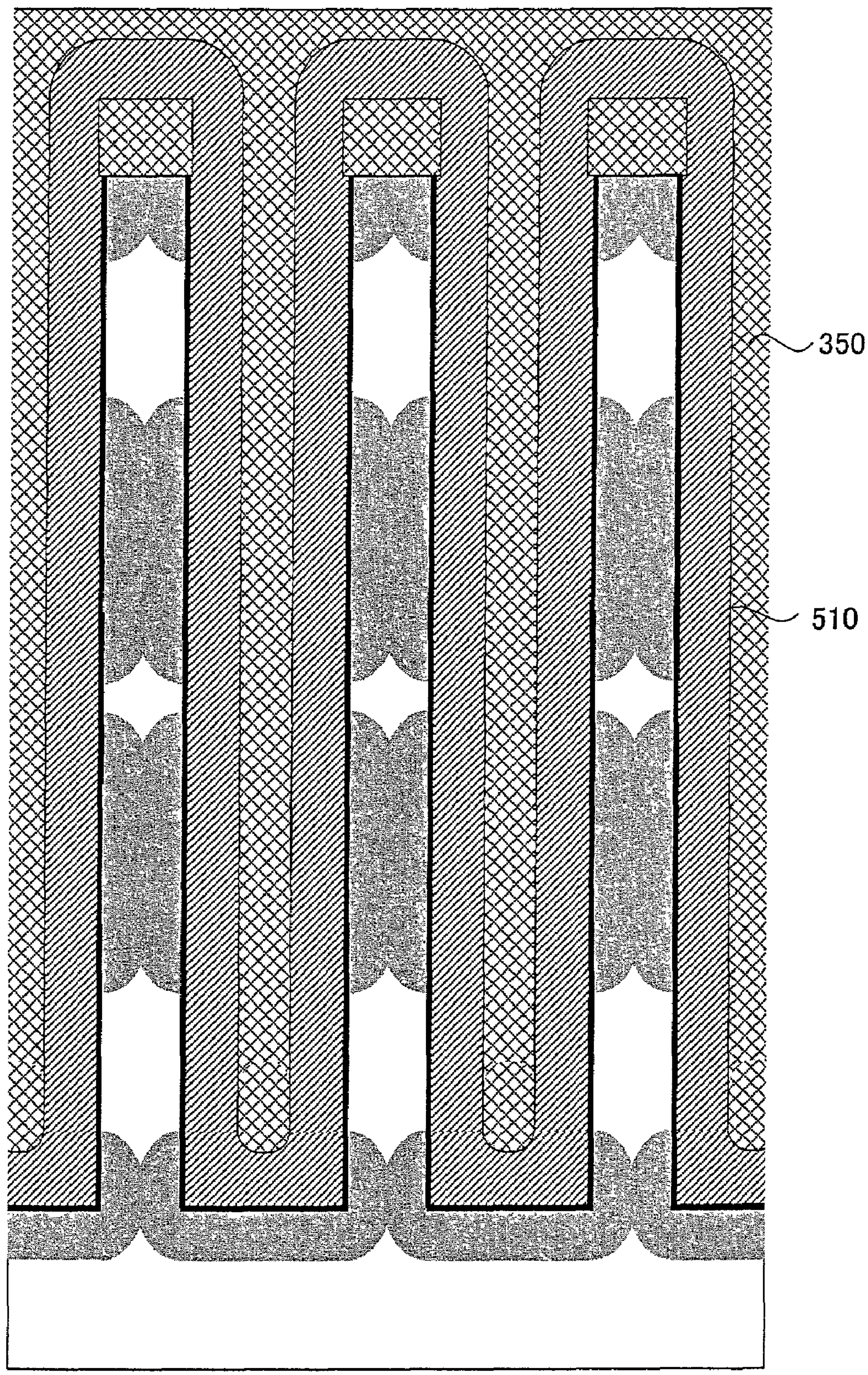
Figure 767:
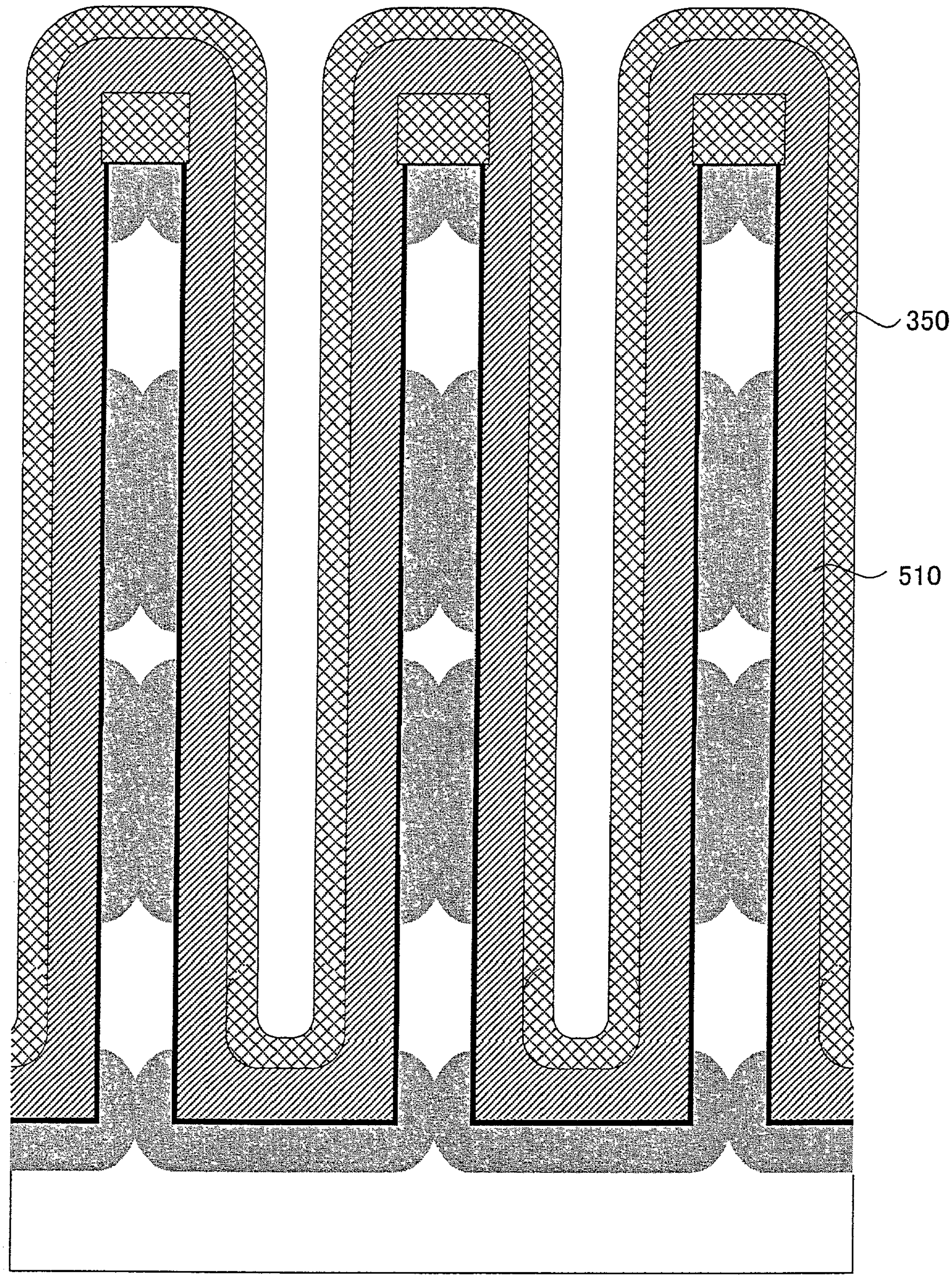

A first conductive film, for example, a polysilicon film 510, is deposited to a thickness of about 50 to 200 nm. A fourteenth insulating film, for example, a silicon nitride film 350, is deposited to a thickness of 20 to 100 nm by CVD (FIG. 758 and FIG. 767). At this time, the thickness of the silicon nitride film 350 is such that the first trench 210 only in a direction in which the intervals between the island-like semiconductor layers 110 is smaller is filled with the silicon nitride film 350, as shown in FIG. 758.

Figure 759:
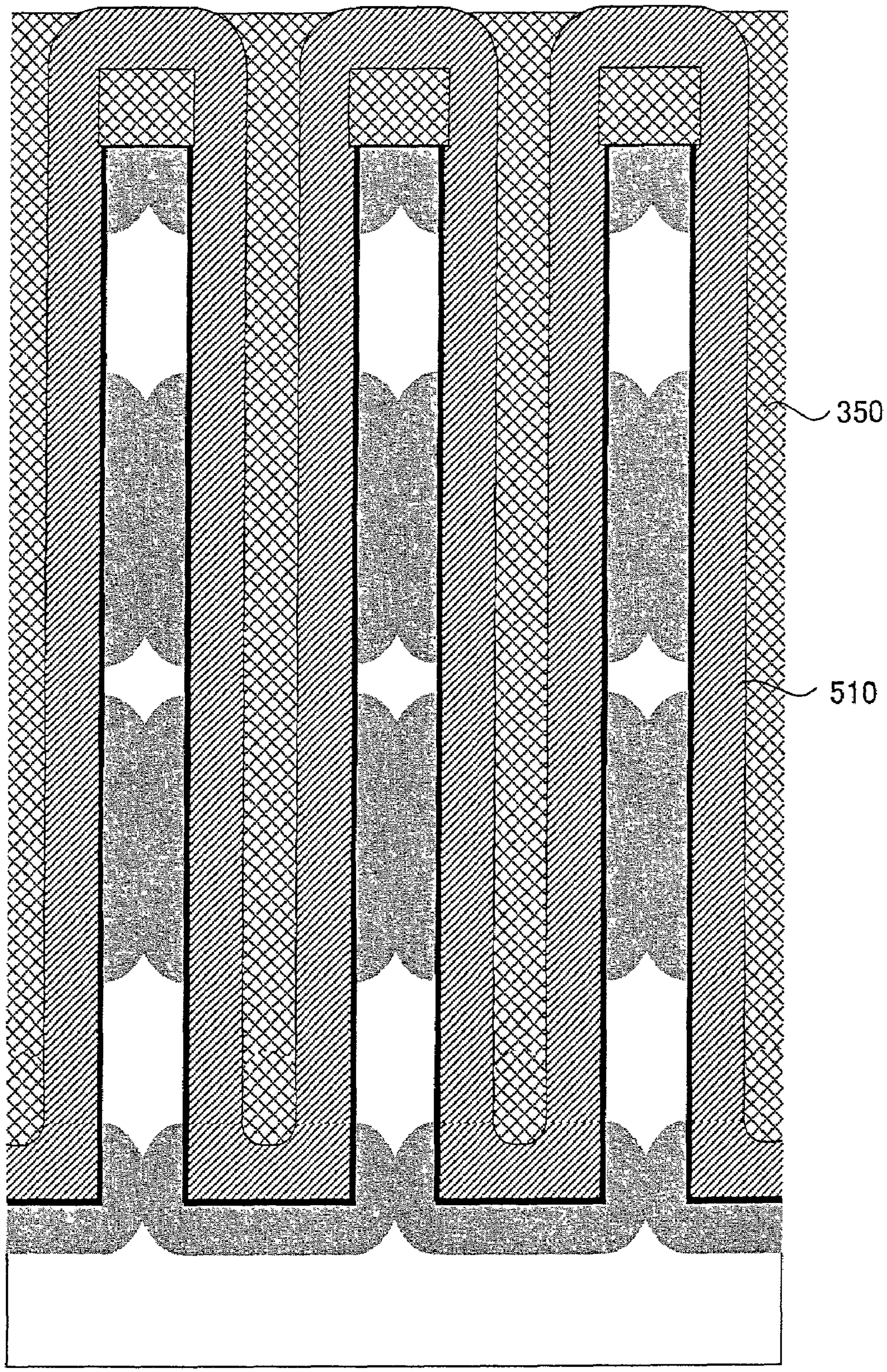
Figure 768:
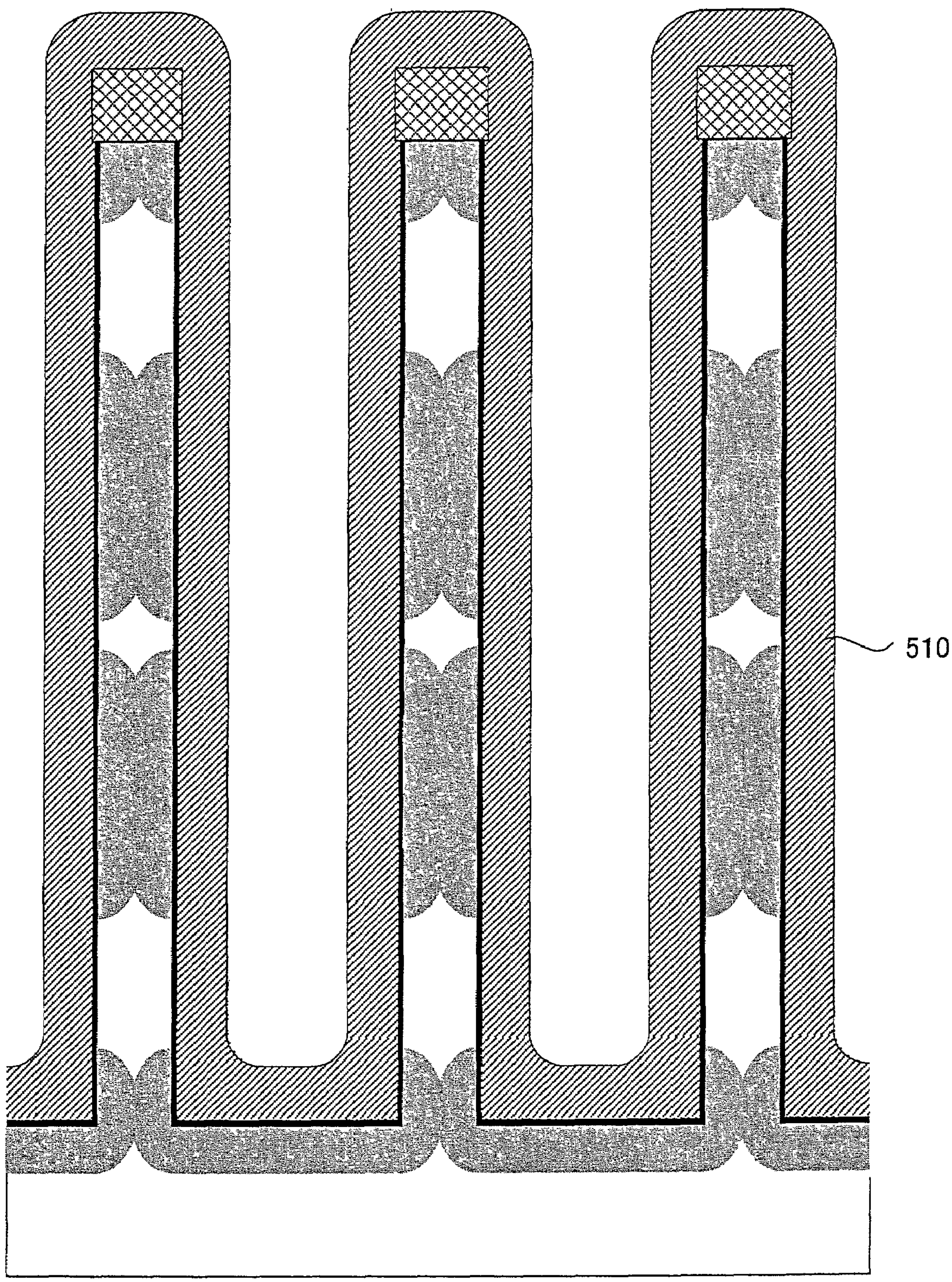

The silicon nitride film 350 is etched back to a depth corresponding to the deposit thickness by isotropic etching (FIG. 759 and FIG. 768). At this time, the top of the polysilicon film 510 is exposed but the first trench 210 only in the direction in which the intervals between the island-like semiconductor layers 110 is smaller is filled with the silicon nitride film 350, as shown in FIG. 759.

Figure 760:
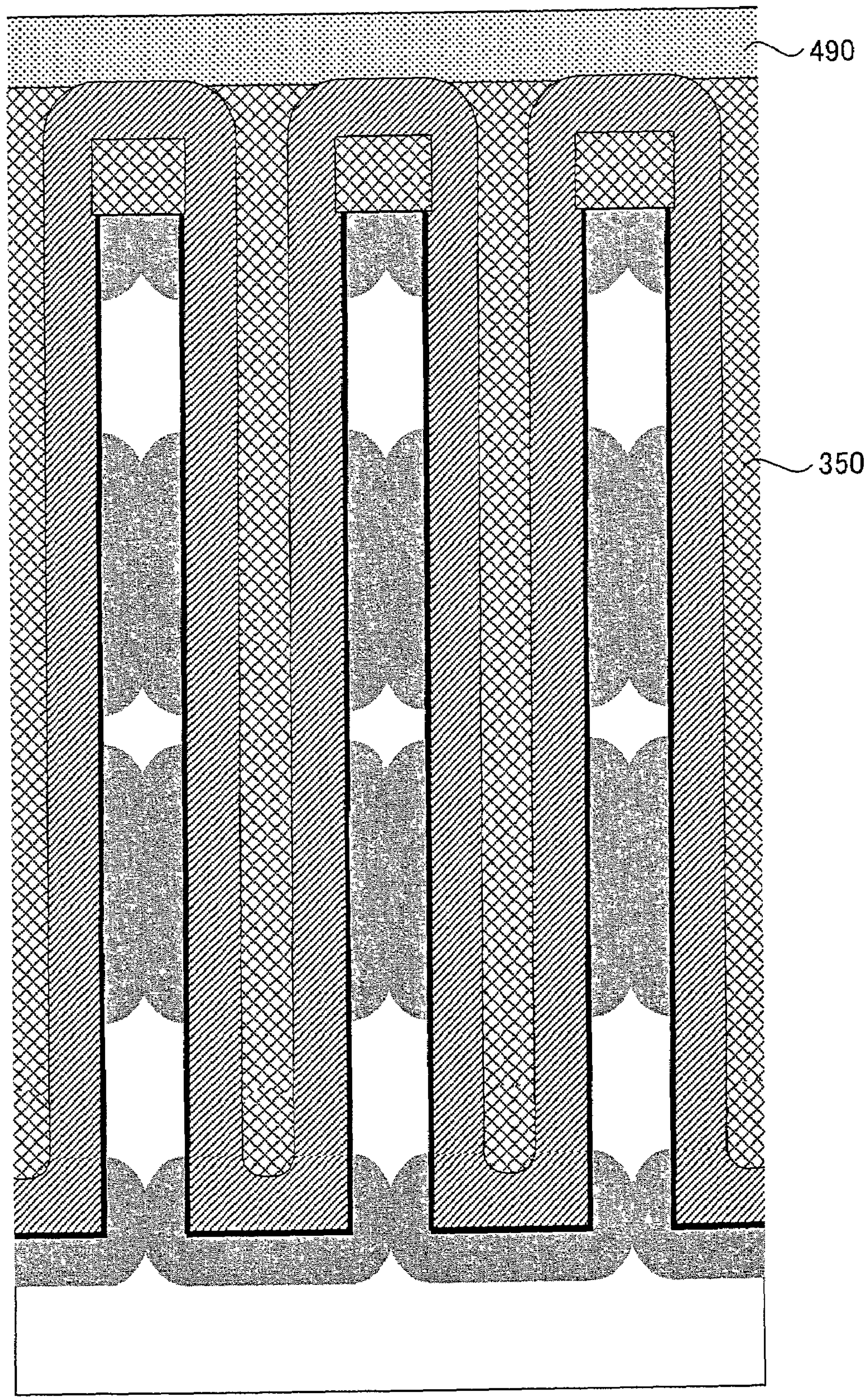
Figure 769:
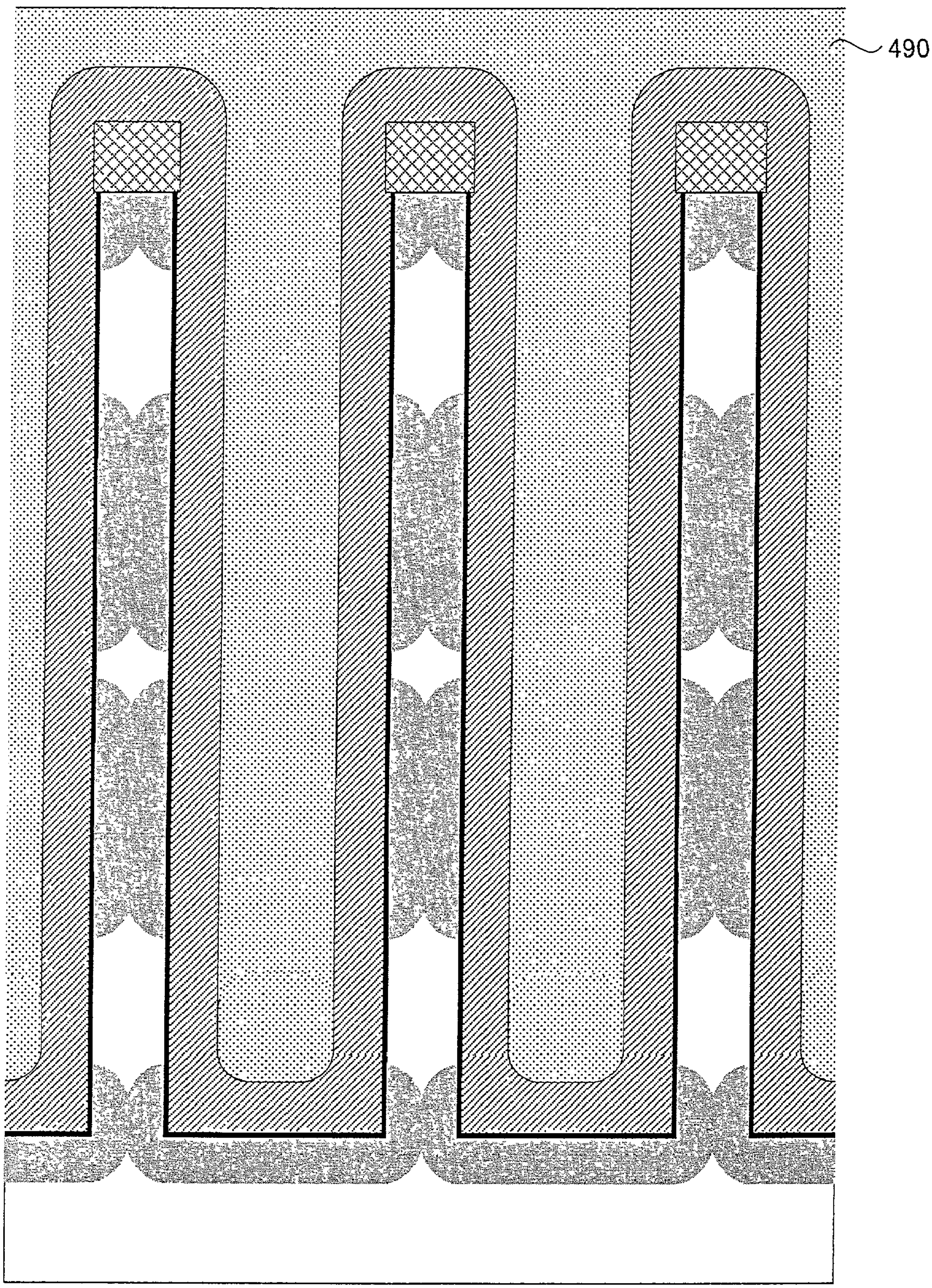

A silicon oxide film 490 is deposited as a fifteenth insulating film to a thickness of about 50 to 200 nm (FIG. 760 and FIG. 769). At this time, the thickness of the silicon oxide film 490 is such that the first trench 210 only in a direction in which the intervals between the island-like semiconductor layers 110 is larger is filled with the silicon oxide film 490, as shown in FIG. 769.

Figure 761:
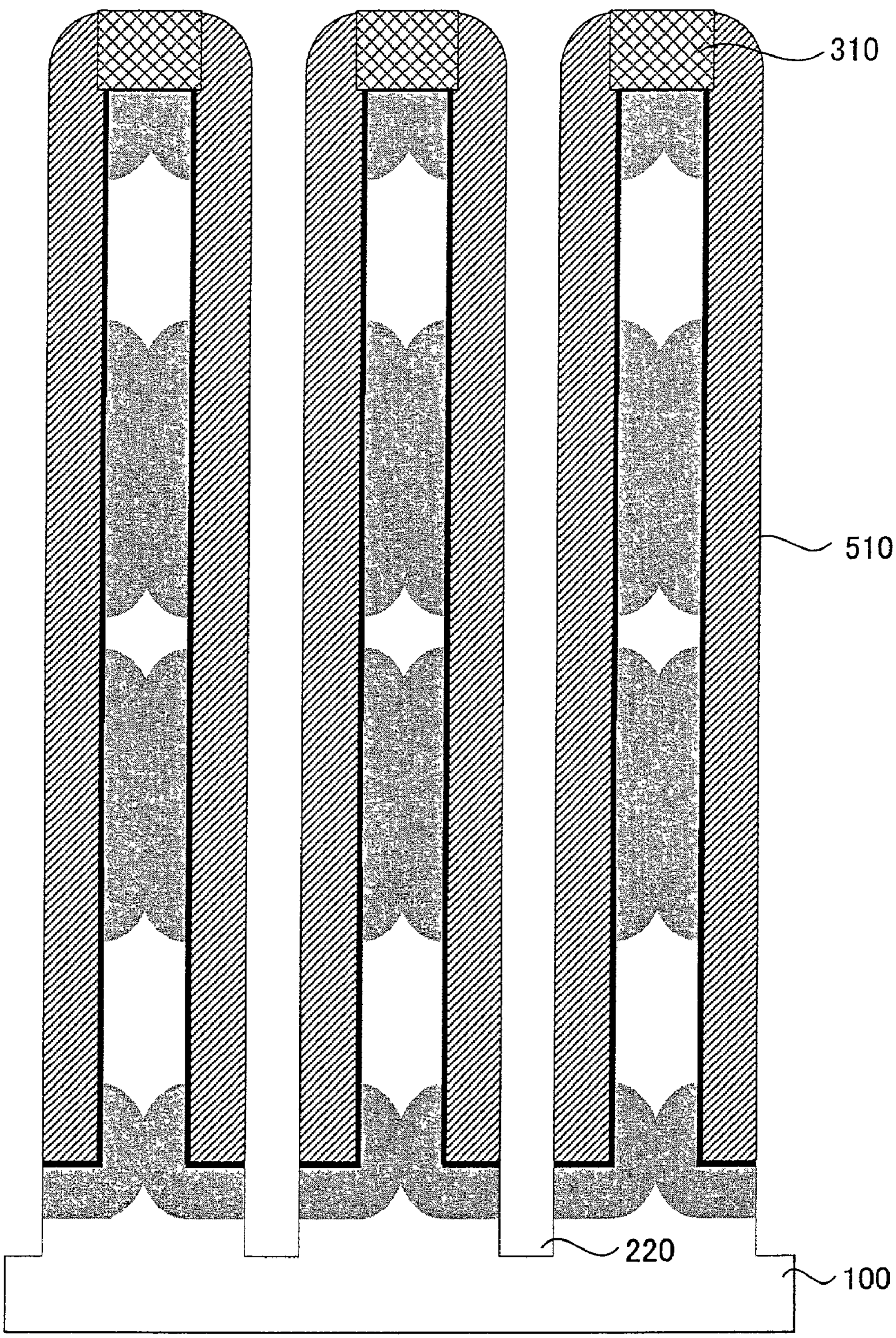

The silicon oxide film 490 is etched back by the deposit thickness. The silicon nitride film 350 remaining in the first trench 210 in FIG. 761 is removed by isotropic etching. The polysilicon film 510 is etched back by anisotropic etching. At this time, as shown in FIG. 770, the top of the polysilicon film 510 only in the direction in which the intervals between the island-like semiconductor layers 110 is larger is exposed, but since the first trench 210 is buried with the silicon oxide film 510, the bottom of the polysilicon film 510 is not removed.

Figure 770:
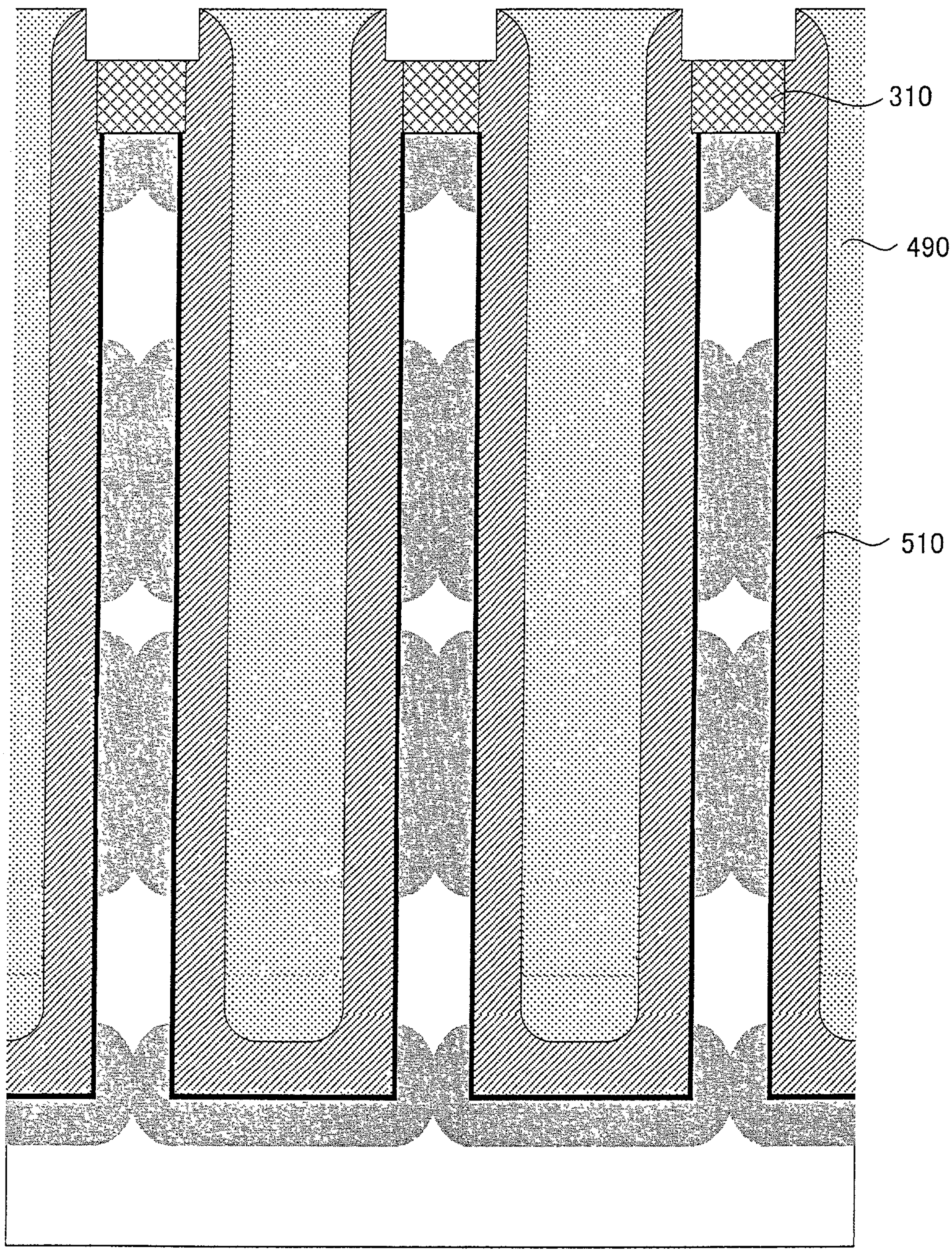

A second trench 220 is formed in the semiconductor substrate 100, using as a mask the poly silicon film 510 in the sidewall spacer form, to separate the impurity diffusion layer 710 to be a first wiring layer (FIG. 761 and FIG. 770).

A oxide film 460 which is an eighth insulating film is buried in the second trench 220 and a polysilicon film 520 which is a second conductive film is deposited. At this time, the polysilicon film (the first conductive film) 510 and the second conductive film 520 are electrically connected.

Figure 762:
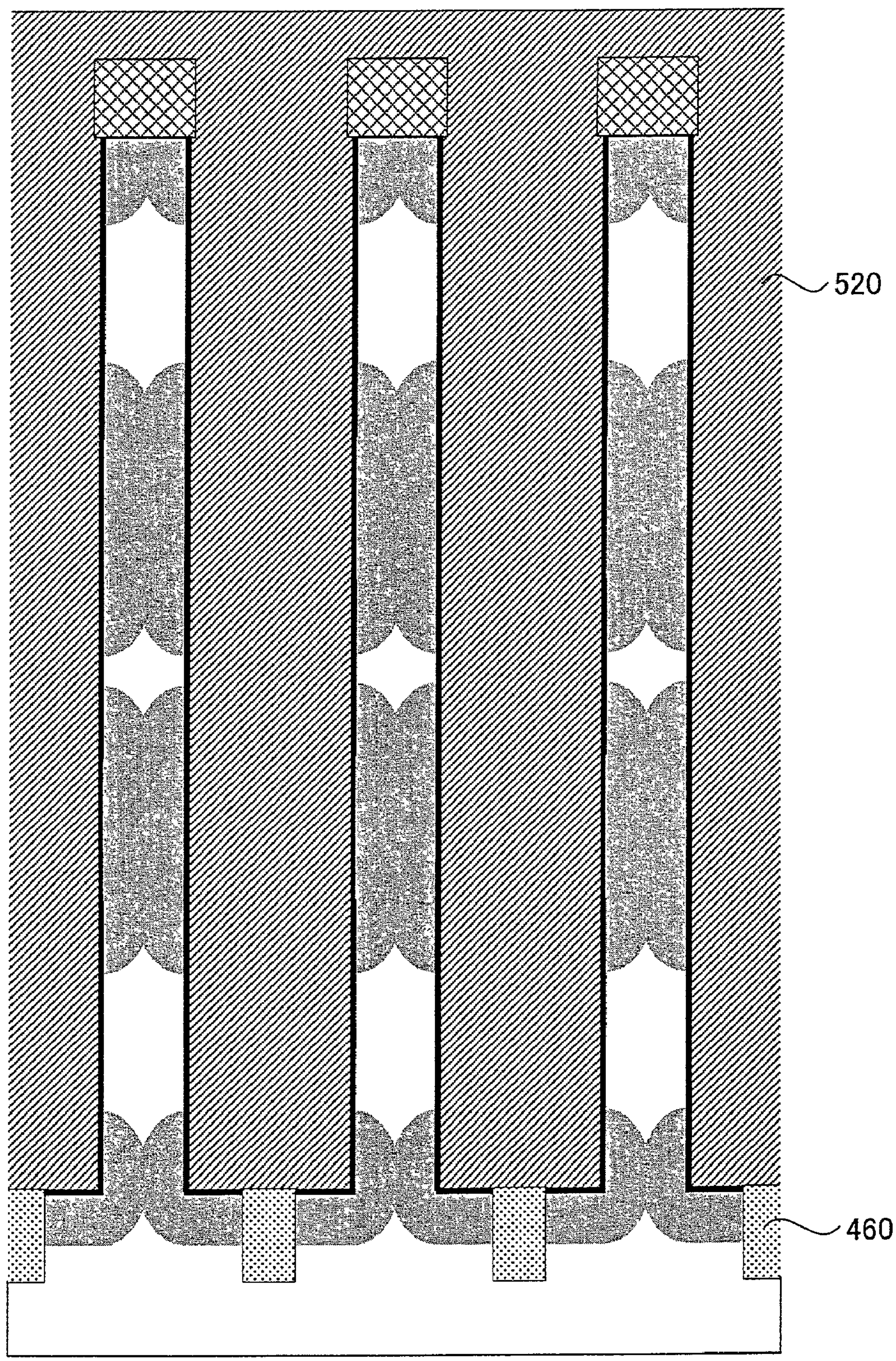
Figure 771:
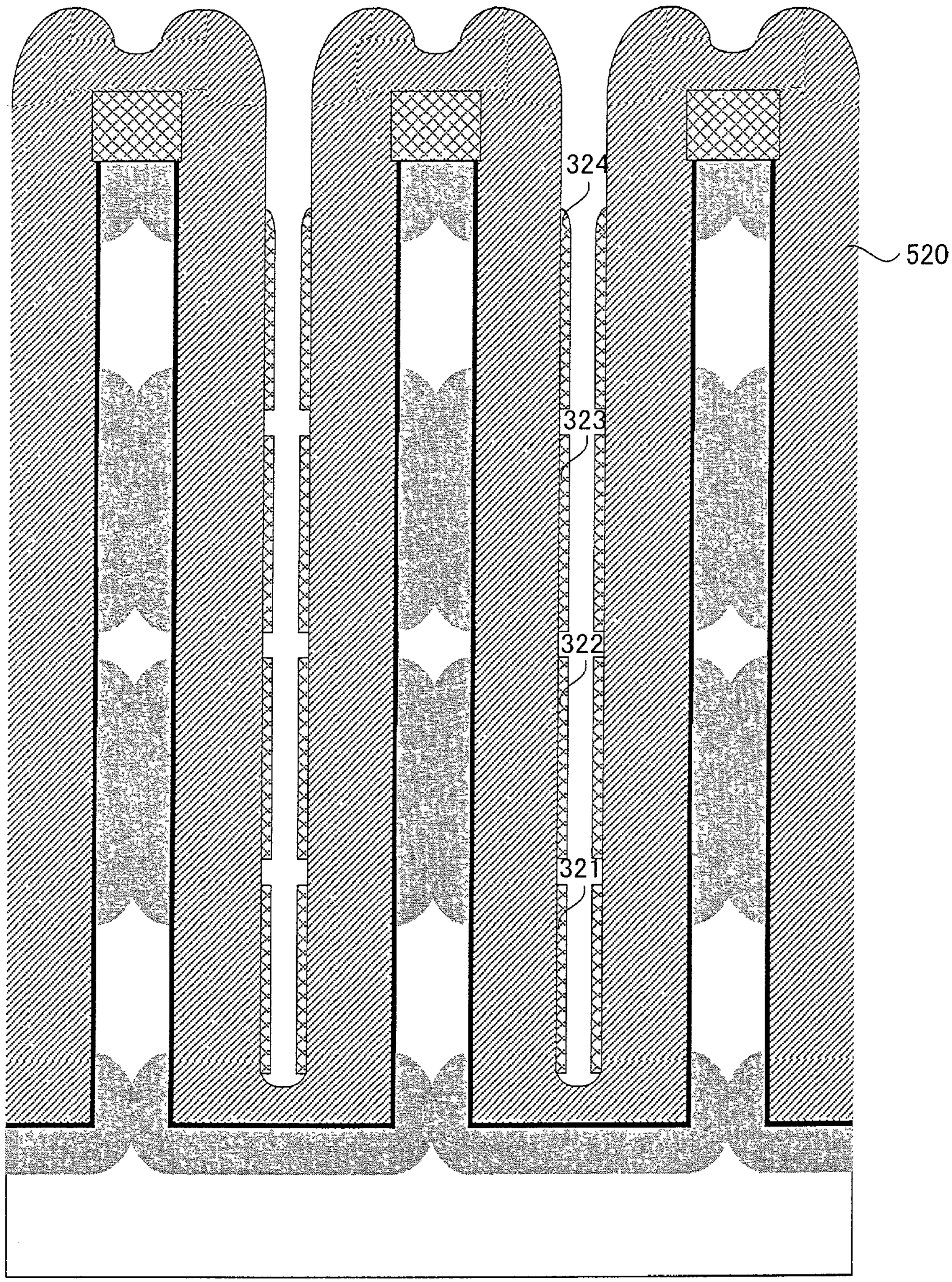

Using a technique as described in Production Example 4 (FIGS. 355 to FIG. 361 and FIG. 375 to FIG. 381), sidewall spacers 321, 322, 323 and 324 are formed of a silicon nitride film (a fourth insulating film) on the sidewall of the polysilicon film 520 (FIG. 762 and FIG. 771).

The polysilicon film 510 and the second conductive film 520 are divided by isotropic etching. Exposed portions of the polysilicon films 521 to 524 are selectively formed into oxide films 450 of 5 to 50 nm thickness which are seventh insulating films, for example, by thermal oxidation. The timing of impurity introduction to the polysilicon films 521 to 524 is not particularly limited so long as these films become conductive films. For example, the impurity introduction may be performed during or after the formation of the polysilicon film 510 or during or after the formation of the polysilicon silicon film 520.

Figure 763:
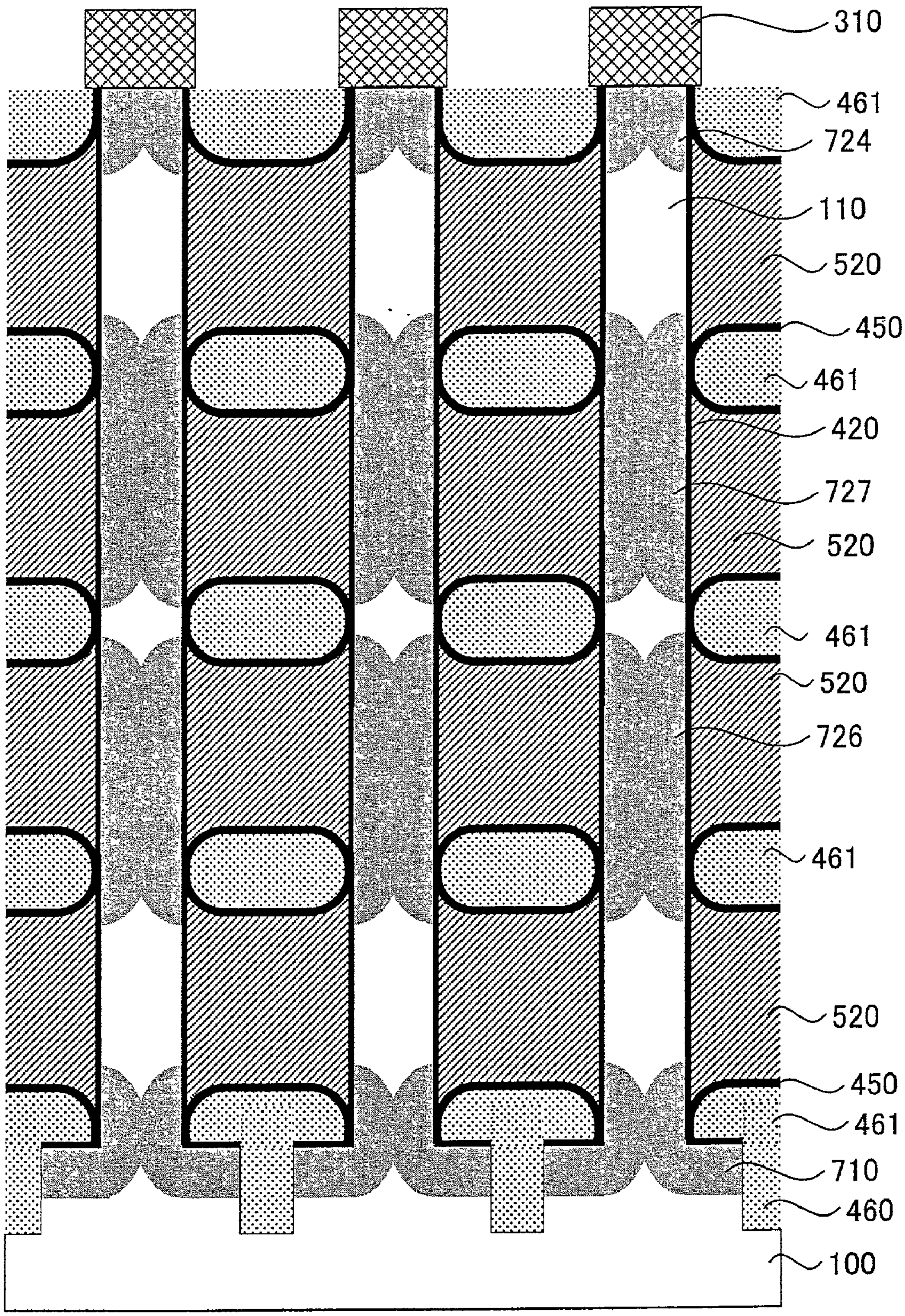
Figure 772:
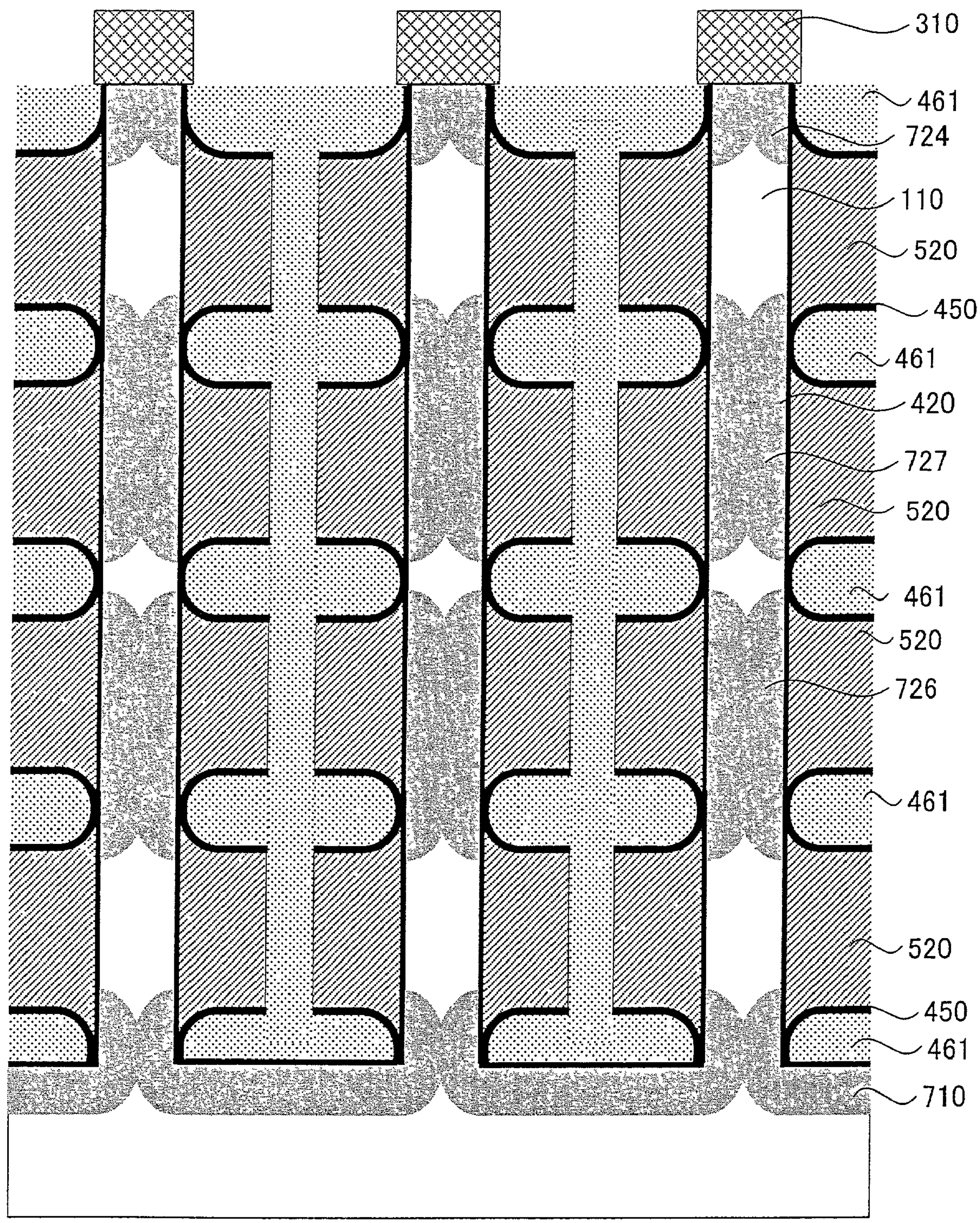

The sidewall spacers 321 to 324 of the silicon nitride film are removed by isotropic etching. An oxide film 461 which is an eighth insulating film is deposited to a thickness of 50 to 500 nm by CVD and etched back so that the oxide film 461 is buried in the first trench 210 (FIG. 763 and FIG. 772).

Figure 764:
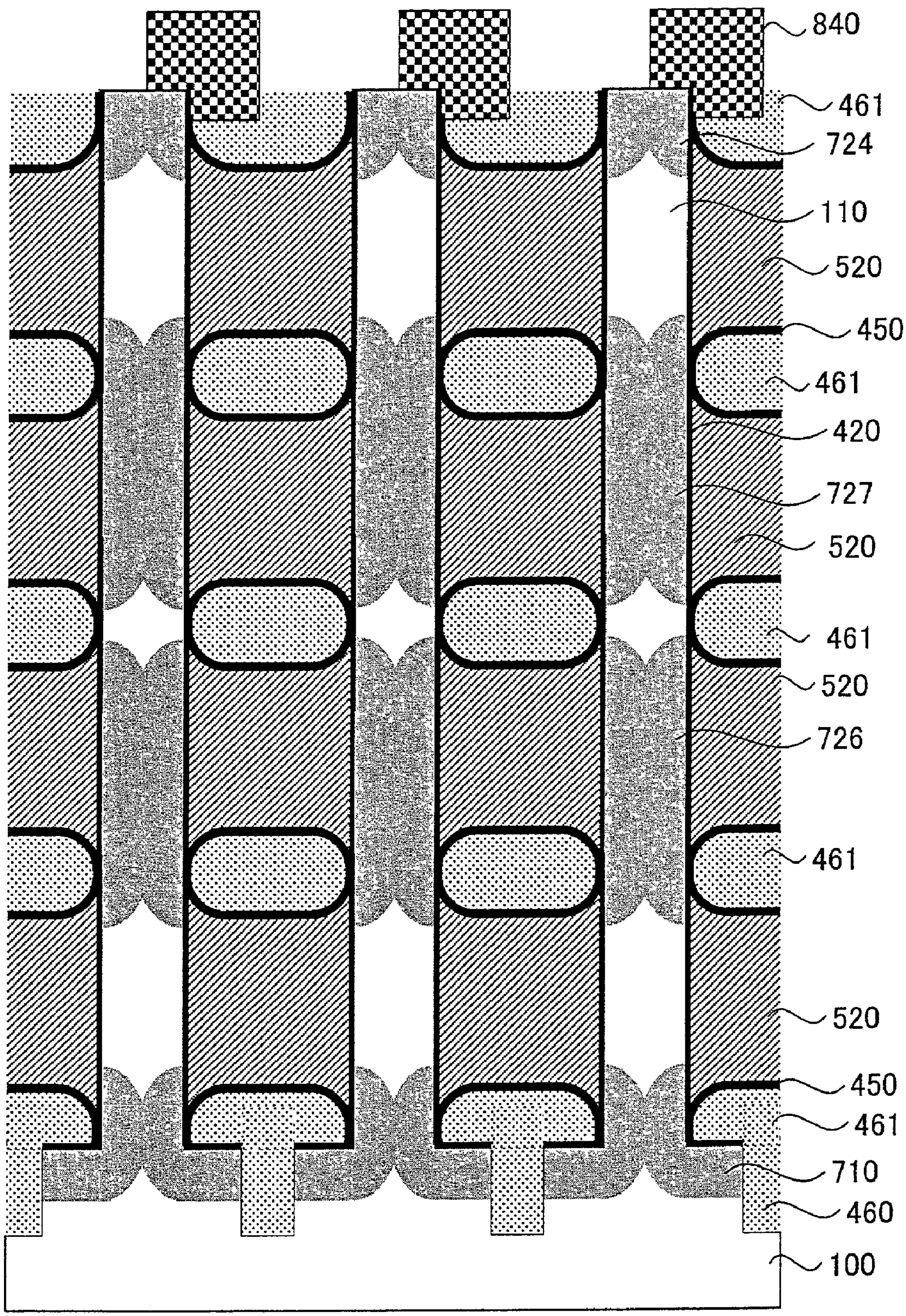
Figure 773:
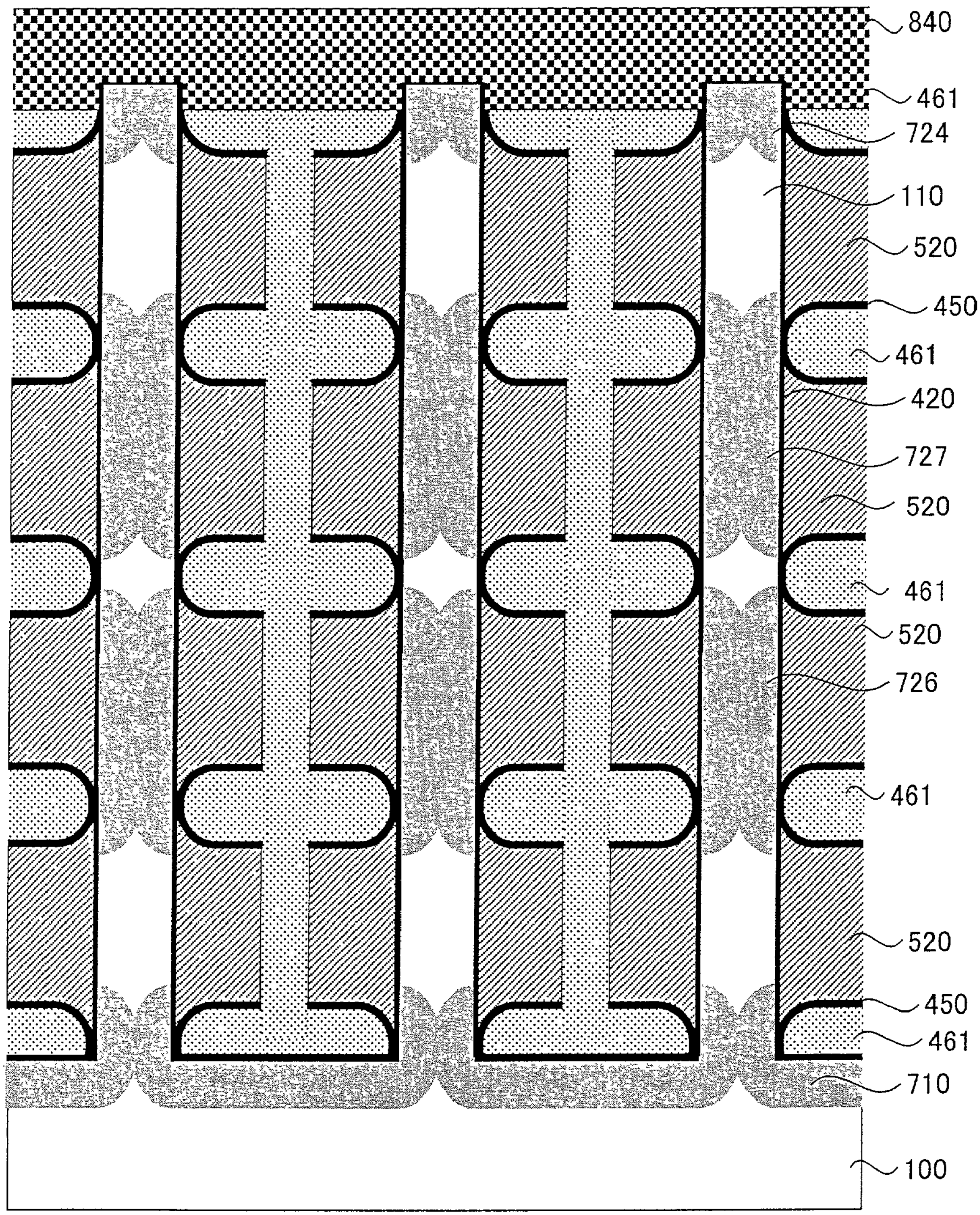

The silicon nitride film 310 is removed by isotropic etching, and the top of the island-like semiconductor layer 110 provided with the impurity diffusion layer 724 is exposed. A fourth wiring layer 840 is connected as a bit line to the top of the island-like semiconductor layer 110 in such a manner its direction crosses the direction of the second and third wiring layers (FIG. 764 and FIG. 773).

By known techniques, an interlayer insulating film is formed, and a contact hole and metal wiring are formed.

Thereby, two pairs of DRAM elements of the one-transistor one-capacitor structure are formed in the island semiconductor layer. The DRAM element has the MIS capacitor as the charge storage layer.

The semiconductor memory formed in this example may be formed in a semiconductor portion on an oxide film of a semiconductor substrate with the oxide film inserted therein, for example an SOI substrate (FIG. 774 and FIG. 775).

The same effect as obtained by the previous examples can be obtained by this example. This example has a further effect of reducing or eliminating the junction capacity in the impurity diffusion layer 710.

In this example, the films formed on the surface of the semiconductor substrate or the polysilicon film such as the silicon nitride film (the first insulating film) 310, the silicon nitride films (the twelfth insulating films) 341, 342 and 343, the silicon nitride films (the fourth insulating films) 321, 322, 323 and 324 and the silicon nitride film (the fourteenth insulating film) 350 may be formed of a layered film of a silicon oxide film/a silicon nitride film from the silicon surface.

In the example, the control gates of the memory cells are formed continuously in one direction without using a mask. However, that is possible only where the island-like semiconductor layers are not disposed symmetrically to a diagonal. More particularly, by setting smaller the intervals between adjacent island-like semiconductor layers in the direction of the second and third wiring layers than those in the direction of the fourth wiring layer, it is possible to automatically obtain the wiring layers which are discontinuous in the direction of the fourth wiring layer and are continuous in the direction of the second and third wiring layers without using a mask. In contrast, if the island-like semiconductor layers are disposed symmetrically to a diagonal, for example, the wiring layers may be separated through patterning with use of resist films by photolithography. The second trenches 220 may be formed in the semiconductor substrate 100 through patterning with use of resist films by photolithography.

PRODUCTION EXAMPLE 32

This example shows an example of production process for producing a semiconductor memory as formed in Production Examples 1 to 9 in which the selection gates and the floating gates of the transistors are formed at the same time and a terminal is provided for electrically connecting the second and third wiring layers to a peripheral circuit.

Such a semiconductor memory may be produced by the following production process. FIGS. 776 to 781 are sectional views taken on line H–H', line I1–I1', line I2–I2', line I3–I3', line I4–I4', and line I5–I5', respectively, in FIG. 62 which is a plan view illustrating a memory cell array of an EEPROM. These sectional views are taken at locations showing sites 921, 932, 933, 934 and 910 where terminals mounted on the top face of the semiconductor device are electrically connected to the buried wiring layers 521, 522, 523, 524 and 710, for the application of voltage to the buried wiring layers from outside. FIGS. 782 to 787, FIGS. 788 to FIG. 793 and FIG. 794 to 799 correspond to FIG. 776 to FIG. 781, respectively.

In this example, production steps until the silicon oxide film (the tenth insulating film) 465 is deposited to a thickness of 100 to 500 nm are the same as those in Production Example 1. Thereafter, the surface of the silicon oxide film 465 is flattened by etch-back or CMP as required. Using as a mask a resist film patterned by a know photolithographic technique, the silicon oxide film 465 is etched by reactive ion etching to reach a wiring layer intended to be lead out. This step is repeated as many times as the number of wiring layers to be lead out.

More particularly, for leading out the first wiring layer, for example, using as a mask a resist film patterned by a know photolithographic technique, reactive ion etching is performed from the top surface of the silicon oxide film (the tenth insulating film) 465 to reach the impurity diffusion layer 710 only in a region where the lead-out portion of the wiring layer exists. Subsequently, for leading out the bottommost second wiring layer, for example, using as a mask a resist film patterned by a know photolithographic technique, reactive ion etching is performed from the top surface of the silicon oxide film 465 to reach the polysilicon film (the second conductive film) 521 in a region of the lead-out portion of the wiring layer other than the region where the etching has been performed previously.

The location of 921, 932, 933, 924 and 910 is not particularly limited so long as the terminals disposed on the top face of the semiconductor device are electrically connected to the buried wiring layers 521, 522, 523, 524 and 710. The order of etching for leading out the wiring layers is not particularly limited, either. For example, two trenches may be simultaneously formed to reach a wiring layer in the lead-out portion of the wiring layers. One of the trenches may be masked by a resist film and the other may be further etched to reach a lower wiring layer. Means for forming trenches for leading out the wiring layers are not particularly limited so long as separate trenches are formed in the lead-out portion of the wiring layers to reach the wiring layers in a number equal to the number of the wiring layers to be lead out.

Thereafter, a silicon oxide film 492 is deposited as a twenty-second insulating film to a thickness of 10 to 100 nm and is etched back by about the deposit thickness so that a sidewall spacer is formed of the silicon oxide film 492 on an inner wall of the trenches formed in the lead-out portion of the wiring layers. The twenty-second insulating film is not particularly limited to a silicon oxide film but may be silicon nitride film or any other insulating film.

The silicon oxide films 460 to 465 and the silicon oxide film 492 are anisotropically etched to increase an exposed area of a wiring layer to be lead out. At this time, etching is so performed not to expose other wiring layers. In the trench for leading out the first wiring layer, etching is so performed not to reach the semiconductor substrate 100. As mentioned previously, the steps of depositing the silicon oxide film 492, forming the sidewall spacers of the silicon oxide film and anisotropically etching the silicon oxide film may be carried out simultaneously on all trenches or trench by trench.

Production steps thereafter follow Production Example 1. When the fourth wiring layer is formed, a metal or an conductive film is buried in the trenches formed in the lead-out portion of the wiring layers with intervention of the sidewall spacer of the silicon oxide film 492. Thereby the first, second, third wiring layers are lead out onto the top of the semiconductor device (FIG. 776 to FIG. 781).

By thus increasing the contact area of the buried wiring layer and the metal or conductive film buried in the trench in the lead-out portion, their contact resistance can be reduced advantageously.

FIG. 782 to FIG. 787, in contrast to FIG. 776 to FIG. 781, show a process in which the above-described lead-out is carried out only on the first wiring layer, which is lead out at the formation of the fourth wiring layer 840, a silicon oxide film is deposited and subjected to CMP or etch-back as required, and trenches are formed in the lead-out portion for leading out the second and third wiring layers.

FIG. 788 to FIG. 793, in contrast to FIG. 776 to FIG. 781, show a process in which the fourth wiring layer 840 is formed in the memory cell portion, a silicon oxide film is deposited and subjected to CMP or etch-back as required, and trenches are formed in the lead-out portion for leading out the first, second and third wiring layers.

FIG. 794 to FIG. 799, in contrast to FIG. 776 to FIG. 781, show a process in which, as an example of changing the arrangement of the sites 921, 932, 933, 924 and 910 for electric contact of the terminals mounted on the top face of the semiconductor device with the buried wiring layers 521, 522, 523, 524 and 710, the sites are located in order of 924, 933, 932, 921 and 910 from the memory cell.

The leading-out of the first, second and third wiring layers onto the top of the semiconductor device by the above-described process can apply to all examples of the present invention.

In the above-described production examples, the charge storage layers are formed together by patterning on sidewalls of the island-like semiconductor layers 110 formed by patterning the semiconductor substrates. The production steps in the examples may be combined in various ways.

Further, in the above production examples, a plurality of memory cells having a charge storage layer and a control gate are connected in series in the direction vertical to the semiconductor substrate. The memory cells are formed on the sidewalls of the island-like semiconductor layers arranged in matrix and separated by the lattice-form trench on the semiconductor substrate. The impurity diffusion layers formed in the island-like semiconductor layers function as sources or drains of the memory cells. The semiconductor substrate is electrically insulated from the island-like semiconductor layers by the impurity diffusion layers. The control gates have a control gate line which is continuous with regard to a plurality of island-like semiconductor layers in one direction and is disposed in a direction horizontal to the surface of the semiconductor substrate. The bit line is electrically connected to impurity diffusion layers in a direction crossing the control gate line and is disposed in a direction horizontal to the surface of the semiconductor substrate. The production steps in the examples may be combined in various ways.

The present invention provides a semiconductor memory has at least one memory cell constituted of a semiconductor substrate, at least one island-like semiconductor layer, a charge storage layer formed on the sidewall of the island-like semiconductor layer and a control gate. Since at least one memory cell in the island-like semiconductor layer is electrically insulated from the semiconductor substrate, it is possible to avoid the back-bias effect of the substrate or prevent variations in the back-bias effect in the vertical direction in the island-like semiconductor layer and to form a plurality of memory cells in series between the bit line and the source line. Thereby, the occurrence of variations is prevented with regard to the characteristics of the memory cells owing to decrease of the threshold of the memory cells at reading data. The decrease of the threshold is caused by the back-bias effect from the substrate. Also the capacity can be increased. Further, since the cell area per bit is reduced, the size and costs of semiconductor chips can be reduced. Furthermore, the device performance is determined by the dimensions in the vertical direction, which are independent of the minimum photoetching dimension. Therefore, the device performance can be maintained. Since the memory cells are formed to surround the island-like semiconductor layers, the driving current improves and the S value increases.

In the production process for the semiconductor memory of the present invention, the sidewall spacers are formed of an insulating film to be divided in the direction of height on the sidewall of the island-like semiconductor layers. Thereby, the floating gates and the like functioning as the charge storage layers can be formed at the same time, and also the insulating films functioning as the tunnel oxide films and the gate oxide films can be formed by the same process with respect to the memory cells. Therefore, they are formed homogeneously by easy control of the process. The semiconductor memory can be produced simply at low costs with reduced variations in the performance among the memory cells.

The sacrificial oxidization of the side of the island-like semiconductor layers after their formation, especially, eliminates damage, defect and unevenness on the surface of the substrate, and good active regions can be obtained. Furthermore, the width of the island-like semiconductor layers can be controlled by the simple process of controlling the thickness of oxide films, and therefore, it is possible to increase the capacitance between the floating gate and the control gate which is determined by the surface area of the tunnel oxide film and the surface area of interlayer capacitance film between the floating gate and the control gate.

What is claimed is:

1. A semiconductor memory comprising:

a first conductivity type semiconductor substrate;

one or more memory cells comprising an island-like semiconductor layer, a charge storage layer and a control gate, the charge storage layer and the control gate being formed to entirely or partially encircle a sidewall of the island-like semiconductor layer, wherein an active region of at least one of said memory cells is electrically insulated from the semiconductor substrate by:

a second conductivity type impurity diffusion layer formed in the semiconductor substrate or in the island-like semiconductor layer, and means for forming a depletion layer formed at a junction between the second conductivity type impurity diffusion layer and the semiconductor substrate or the island-like semiconductor layer; and wherein a lower gate electrode of a first selection transistor, the control gate of the memory cell, and an upper gate electrode of a second selection transistor are arranged in an upward order in a direction vertical to the semiconductor substrate, so that the first and second selection transistors are located on opposite vertical sides of the memory cell in a vertical direction.

2. A semiconductor memory according to claim 1, wherein a plurality of memory cells are formed with regard to one island-like semiconductor layer.

3. A semiconductor memory according to claim 1, wherein a plurality of memory cells are formed with regard to one island-like semiconductor layer and the memory cells are arranged in series.

4. A semiconductor memory according to claim 1, wherein a plurality of island-like semiconductor layers are formed in matrix, impurity diffusion layers for reading a state of a charge stored in a memory cell are formed in the island-like semiconductor layers, a plurality of control gates are provided continuously in a direction to form a control gate line and a plurality of the impurity diffusion layers in a direction crossing the control gate line are connected to form a bit line.

5. A semiconductor memory according to claim 1, wherein a plurality of memory cells are formed with regard to one island-like semiconductor layer and control gates constituting the memory cell are arranged so closely that channel layers of memory cells are electrically connected.

6. A semiconductor memory according to claim 1, wherein a plurality of memory cells are formed with regard to one island-like semiconductor layer, and an electrode for electrically connecting channel layers of memory cells is further formed between control gates.

7. A semiconductor memory according to claim 1, wherein a plurality of island-like semiconductor layers are formed in matrix, and the width of the island-like semiconductor layers in one direction is smaller than a distance between adjacent island-like semiconductor layers in the same direction.

8. A semiconductor memory according to claim 1, wherein a plurality of island-like semiconductor layers are formed in matrix, and a distance between the island-like semiconductor layers in one direction is smaller than a distance between the island-like semiconductor layers in another direction.

9. The semiconductor memory of claim 1, wherein the control gate and the charge store layer each laterally surround a portion of the sidewall of the island-like semiconductor layer on all lateral sides thereof.

10. The semiconductor memory of claim 1, wherein the impurity diffusion layer is formed in a top portion of the semiconductor substrate immediately under the island-like semiconductor layer.

11. The semiconductor memory of claim 1, wherein the island-like semiconductor layer is pillar-shaped so as to have a height dimension greater than a width dimension.

12. The semiconductor memory of claim 11, wherein the island-like semiconductor layer has a circular cross section when viewed from above.

13. The semiconductor memory of claim 1, wherein the semiconductor memory is an EEPROM.

14. The semiconductor memory of claim 1, wherein said sidewall of the island-like semiconductor layer is vertically extending relative to a surface of the semiconductor substrate.

15. The semiconductor memory of claim 1, wherein the semiconductor substrate is an SOI board.

16. A semiconductor memory comprising:

a first conductivity type semiconductor substrate;

one or more memory cells comprising an island-like semiconductor layer, a charge storage layer and a control gate, the charge storage layer and the control gate being formed to entirely or partially encircle a sidewall of the island-like semiconductor layer, wherein an active region of at least one of said memory cells is electrically insulated from the semiconductor substrate; and wherein a plurality of memory cells are formed with regard to one island-like semiconductor layer, and the active region of at least one of the memory cells is electrically insulated from another memory cell by:

a second conductivity type impurity diffusion layer formed in the semiconductor substrate or the island-like semiconductor layer, and means for forming a depletion layer formed at a junction between the second conductivity type impurity diffusion layer and the semiconductor substrate or the island-like semiconductor layer; and wherein the plurality of memory cells are stacked on top of one another over the semiconductor substrate and each use the island-like semiconductor layer, and wherein respective active regions of each of the memory cells are electrically insulated from the semiconductor substrate.

17. A semiconductor memory comprising:

a first conductivity type semiconductor substrate;

one or more memory cells comprising an island-like semiconductor layer, a charge storage layer and a control gate, the charge storage layer and the control gate being formed to entirely or partially encircle a sidewall of the island-like semiconductor layer, wherein an active region of at least one of said memory cells is electrically insulated from the semiconductor substrate by:

a second conductivity type impurity diffusion layer formed in the semiconductor substrate or in the island-like semiconductor layer, and means for forming a depletion layer formed at a junction between the second conductivity type impurity diffusion layer and the semiconductor substrate or the island-like semiconductor layer; and wherein a gate electrode for selecting a memory cell is formed at least at an end of the memory cell formed on the island-like semiconductor layer so as to partially or entirely encircle the sidewall of the island-like semiconductor layer and the gate electrode is arranged in series with the memory cell.

18. A semiconductor memory according to claim 17, wherein the control gate and the gate electrode are disposed so closely that a channel layer located in a part of the island-like semiconductor layer opposed to the gate electrode is electrically connected to a channel layer of the memory cell.

19. A semiconductor memory according to claim 17, wherein a plurality of memory cells are formed with regard to one island-like semiconductor layer, and an electrode for electrically connecting a channel layer located in a part of the island-like semiconductor layer opposed to the gate electrode to a channel layer of the memory cell is further formed between the control gate and the gate electrode.

20. A semiconductor memory according to claim 17, wherein all, some or one control gate(s) are formed of the same material as all, some or one gate electrode(s).

21. A semiconductor memory according to claim 17, wherein the charge storage layer and the gate electrode are formed of the same material.

22. A semiconductor memory comprising:

a first conductivity type semiconductor substrate;

one or more memory cells comprising an island-like semiconductor layer, a charge storage layer and a control gate, the charge storage layer and the control gate being formed to entirely or partially encircle a sidewall of the island-like semiconductor layer, wherein an active region of at least one of said memory cells is electrically insulated from the semiconductor substrate; and wherein a lower gate electrode of a first selection transistor, the control gate of the memory cell, and an upper gate electrode of a second selection transistor are arranged in an upward order in a direction vertical to the semiconductor substrate, so that the first and second selection transistors are located on opposite vertical sides of the memory cell in a vertical direction so as to sandwich the memory cell therebetween.

23. A semiconductor memory according to claim 22, wherein said active region of said memory cell is electrically insulated from the semiconductor substrate by at least a second conductivity type impurity diffusion layer formed in the semiconductor substrate or in the island-like semiconductor layer.

24. A semiconductor memory according to claim 22, wherein the active region of said memory cell is electrically insulated from the semiconductor substrate by:

a second conductivity type impurity diffusion layer formed in the semiconductor substrate or in the island-like semiconductor layer, and a depletion layer formed at a junction between the second conductivity type impurity diffusion layer and the semiconductor substrate or the island-like semiconductor layer.

25. A semiconductor memory comprising:

a first conductivity type semiconductor substrate;

at least one memory cell comprising an island-like semiconductor layer, a charge storage layer and a control gate, wherein the charge storage layer and the control gate entirely or partially laterally surround at least a portion of a sidewall of the island-like semiconductor layer;

wherein the active region of said memory cell is electrically insulated from the semiconductor substrate by:

a second conductivity type impurity diffusion layer formed in the semiconductor substrate or in the island-like semiconductor layer, and means for forming a depletion layer formed at a junction between the second conductivity type impurity diffusion layer and the semiconductor substrate or the island-like semiconductor layer; and wherein a plurality of memory cells are stacked on top of one another over the semiconductor substrate and each use the island-like semiconductor layer, and wherein respective active regions of each of the memory cells are electrically insulated from the semiconductor substrate.

26. The semiconductor memory of claim 25, wherein the control gate and the charge store layer each laterally surround at least said portion of the sidewall of the island-like semiconductor layer on all lateral sides thereof.

27. The semiconductor memory of claim 25, wherein the diffusion layer is formed at a bottom portion of the island-like semiconductor layer.

28. The semiconductor memory of claim 25, wherein the island-like semiconductor layer is pillar-shaped so as to have a height dimension greater than a width dimension.

29. The semiconductor memory of claim 28, wherein the island-like semiconductor layer has a circular cross section when viewed from above.

30. The semiconductor memory of claim 25, wherein the semiconductor memory is an EEPROM.

31. The semiconductor memory of claim 25, wherein said sidewall of the island-like semiconductor layer is vertically extending relative to a surface of the semiconductor substrate.

32. A semiconductor memory comprising:

a first conductivity type semiconductor substrate;

at least one memory cell comprising a pillar-shaped semiconductor layer having a height dimension greater than a width dimension, a charge storage layer and a control gate, wherein the charge storage layer and the control gate entirely or partially laterally surround at least a portion of a sidewall of the pillar-shaped semiconductor layer, wherein the sidewall of the pillar-shaped semiconductor layer extends vertically relative to the semiconductor substrate;

wherein at least a portion of the pillar-shaped semiconductor layer of the memory cell is electrically insulated from the semiconductor substrate by:

a second conductivity type impurity diffusion layer formed in the semiconductor substrate or in the pillar-shaped semiconductor layer, and means for forming a depletion layer formed at a junction between the second conductivity type impurity diffusion layer and the semiconductor substrate or the pillar-shaped semiconductor layer; and wherein a plurality of memory cells are stacked on top of one another over the semiconductor substrate and each use the pillar-shaped semiconductor layer, and wherein respective active regions of each of the memory cells are electrically insulated from the semiconductor substrate.

33. The semiconductor memory of claim 32, wherein the control gate and the charge store layer each laterally surround at least said portion of the sidewall of the pillar-shaped semiconductor layer on all lateral sides thereof.

34. The semiconductor memory of claim 32, wherein the pillar-shaped semiconductor layer has a circular cross section when viewed from above.

35. The semiconductor memory of claim 32, wherein the semiconductor memory is an EEPROM.

36. A semiconductor memory comprising:

a first conductivity type semiconductor substrate;

a plurality of stacked memory cells, on top of each other, each memory cell comprising an island-like semiconductor layer, a charge storage layer and a control gate, the charge storage layer and the control gate being formed to entirely or partially encircle a sidewall of the island-like semiconductor layer, wherein an active region of at least one of said memory cells is electrically insulated from the semiconductor substrate; and wherein a lower gate electrode of a first selection transistor, the control gates of the plurality of memory cells, and an upper gate electrode of a second selection transistor are arranged in an upward order in a direction vertical to the semiconductor substrate, so that the first and second selection transistors are located on opposite vertical sides of the plurality of memory cells in a vertical direction so as to sandwich the plurality of memory cells therebetween.

37. A semiconductor memory according to claim 36, wherein said active region of at least one of said memory cells is electrically insulated from the semiconductor substrate by:

at least a second conductivity type impurity diffusion layer formed in the semiconductor substrate or in the island-like semiconductor layer, and a depletion layer formed at a junction between the second conductivity type impurity diffusion layer and the semiconductor substrate or the pillar-shaped semiconductor layer.

38. A semiconductor memory comprising:

a first conductivity type semiconductor substrate;

at least one memory cell comprising a pillar-shaped semiconductor layer having a height dimension greater than a width dimension, a charge storage layer and a control gate, wherein the charge storage layer and the control gate entirely or partially laterally surround at least a portion of a sidewall of the pillar-shaped semiconductor layer, wherein the sidewall of the pillar-shaped semiconductor layer extends vertically relative to the semiconductor substrate;

wherein at least a portion of the pillar-shaped semiconductor layer of the memory cell is electrically insulated from the semiconductor substrate by:

a second conductivity type impurity diffusion layer formed in the semiconductor substrate or in the pillar-shaped semiconductor layer, and means for forming a depletion layer formed at a junction between the second conductivity type impurity diffusion layer and the semiconductor substrate or the pillar-shaped semiconductor layer; and wherein a lower gate electrode of a first selection transistor, control gates of a plurality of memory cells, and an upper gate electrode of a second selection transistor are arranged in an upward order in a direction vertical to the semiconductor substrate, so that the first and second selection transistors are located on opposite vertical sides of the plurality of memory cells in a vertical direction so as to sandwich the plurality of memory cells therebetween.

* * * * *